US010204684B2

(12) United States Patent
Widjaja

(10) Patent No.: US 10,204,684 B2
(45) Date of Patent: Feb. 12, 2019

(54) SEMICONDUCTOR DEVICE HAVING ELECTRICALLY FLOATING BODY TRANSISTOR, SEMICONDUCTOR DEVICE HAVING BOTH VOLATILE AND NON-VOLATILE FUNCTIONALITY AND METHOD OF OPERATING

(71) Applicant: Zeno Semiconductor, Inc., Sunnyvale, CA (US)

(72) Inventor: Yuniarto Widjaja, Cupertino, CA (US)

(*) Notice: Subject to any disclaimer, the term of this patent is extended or adjusted under 35 U.S.C. 154(b) by 0 days.

(21) Appl. No.: 16/003,350

(22) Filed: Jun. 8, 2018

(65) Prior Publication Data

US 2018/0301191 A1 Oct. 18, 2018

Related U.S. Application Data

(60) Continuation of application No. 15/654,606, filed on Jul. 19, 2017, now Pat. No. 10,008,266, which is a (Continued)

(51) Int. Cl.
*G11C 14/00* (2006.01)
*H01L 29/423* (2006.01)
(Continued)

(52) U.S. Cl.
CPC ........ *G11C 14/0018* (2013.01); *G11C 11/404* (2013.01); *G11C 11/565* (2013.01); *G11C 16/06* (2013.01); *H01L 27/108* (2013.01); *H01L 27/10802* (2013.01); *H01L 27/11521* (2013.01); *H01L 27/11524* (2013.01); *H01L 29/0649* (2013.01); *H01L 29/42328* (2013.01); *H01L 29/4916* (2013.01); *H01L 29/66825* (2013.01);
(Continued)

(58) Field of Classification Search
CPC .............. G11C 11/404; G11C 14/0018; G11C 16/0408; G11C 16/0466; G11C 11/40
See application file for complete search history.

(56) References Cited

U.S. PATENT DOCUMENTS

| | | | |
|---|---|---|---|
| 4,003,076 | A | 1/1977 | Polata et al. |
| 4,126,899 | A | 11/1978 | Lohstroh et al. |

(Continued)

FOREIGN PATENT DOCUMENTS

| | | |
|---|---|---|
| WO | WO2008103198 | 8/2008 |

OTHER PUBLICATIONS

Lin, et al., A new 1T DRAM Cell with enhanced Floating Body Effect, pp. 1-5, 2006.

(Continued)

*Primary Examiner* — Tuan T Nguyen
(74) *Attorney, Agent, or Firm* — Law Office of Alan W. Cannon

(57) ABSTRACT

A semiconductor memory cell includes a floating body region configured to be charged to a level indicative of a state of the memory cell; a first region in electrical contact with said floating body region; a second region in electrical contact with said floating body region and spaced apart from said first region; and a gate positioned between said first and second regions. The cell may be a multi-level cell. Arrays of memory cells are disclosed for making a memory device. Methods of operating memory cells are also provided.

17 Claims, 391 Drawing Sheets

Related U.S. Application Data continuation of application No. 15/436,641, filed on Feb. 17, 2017, now Pat. No. 9,747,983, which is a continuation of application No. 15/237,441, filed on Aug. 15, 2016, now Pat. No. 9,614,080, which is a continuation of application No. 14/834,695, filed on Aug. 25, 2015, now Pat. No. 9,455,262, which is a division of application No. 13/577,282, filed as application No. PCT/US2011/023947 on Feb. 7, 2011, now Pat. No. 9,153,309, which is a continuation of application No. 12/897,538, filed on Oct. 4, 2010, now Pat. No. 8,264,875, and a continuation of application No. 12/897,516, filed on Oct. 4, 2010, now Pat. No. 8,547,756, and a continuation of application No. 12/797,334, filed on Jun. 9, 2010, now Pat. No. 8,130,547, and a continuation of application No. 12/797,320, filed on Jun. 9, 2010, now Pat. No. 8,130,548, and a continuation of application No. 12/897,528, filed on Oct. 4, 2010, now Pat. No. 8,514,622.

(60) Provisional application No. 61/309,589, filed on Mar. 2, 2010, provisional application No. 61/425,820, filed on Dec. 22, 2010, provisional application No. 61/302,129, filed on Feb. 7, 2010.

(51) Int. Cl.

| | |
|---|---|
| ***G11C 16/06*** | (2006.01) |
| ***H01L 29/78*** | (2006.01) |
| ***H01L 27/108*** | (2006.01) |
| ***G11C 11/56*** | (2006.01) |
| ***G11C 11/404*** | (2006.01) |
| ***H01L 29/788*** | (2006.01) |
| ***H01L 29/49*** | (2006.01) |
| ***H01L 29/06*** | (2006.01) |
| ***H01L 27/11524*** | (2017.01) |
| ***H01L 27/11521*** | (2017.01) |
| ***H01L 29/66*** | (2006.01) |
| *G11C 16/04* | (2006.01) |

(52) U.S. Cl.

CPC ...... *H01L 29/66833* (2013.01); *H01L 29/788* (2013.01); *H01L 29/7841* (2013.01); *H01L 29/7881* (2013.01); *G11C 16/0416* (2013.01); *G11C 16/0433* (2013.01); *G11C 2211/4016* (2013.01)

(56) References Cited

U.S. PATENT DOCUMENTS 4,300,212 A 11/1981 Simko
4,408,304 A * 10/1983 Nishizawa ............ G11C 11/402 365/174
4,959,812 A 9/1990 Momodomi et al.
5,097,446 A 3/1992 Shoji et al.
5,357,465 A 10/1994 Challa
5,383,162 A 1/1995 Shirai et al.
5,519,831 A 5/1996 Holzhammer
5,581,504 A 12/1996 Chang et al.
5,619,471 A 4/1997 Nunziata
5,638,320 A 6/1997 Wong et al.
5,745,417 A 4/1998 Kobayashi et al.
5,760,437 A * 6/1998 Shimoji ............. G11C 16/0491 365/185.01
5,767,549 A 6/1998 Chen et al.
5,999,444 A 12/1999 Fujiwara et al.
6,005,818 A 12/1999 Ferrant et al.
6,141,248 A 10/2000 Forbes et al.
6,163,048 A 12/2000 Hirose et al.
6,166,407 A 12/2000 Ohta
6,341,087 B1 1/2002 Kunikiyo et al.
6,356,485 B1 3/2002 Proebsting et al.
6,376,876 B1 4/2002 Shin et al.
6,542,411 B2 4/2003 Tanikawa et al.
6,614,684 B1 9/2003 Shukuri et al.
6,661,042 B2 12/2003 Hsu
6,686,624 B2 2/2004 Hsu
6,724,657 B2 4/2004 Shukuri
6,771,538 B2 8/2004 Shukuri et al.
6,791,882 B2 9/2004 Seki et al.
6,801,452 B2 10/2004 Miwa et al.
6,809,985 B2 10/2004 Forbes et al.
6,810,449 B1 10/2004 Barth et al.
6,885,581 B2 4/2005 Nemati et al.
6,913,964 B2 7/2005 Hsu
6,925,006 B2 8/2005 Fazan et al.
6,954,377 B2 10/2005 Choi et al.
6,969,662 B2 11/2005 Fazan et al.
7,085,156 B2 8/2006 Ferrant et al.
7,118,986 B2 10/2006 Steigerwalt et al.
7,170,807 B2 1/2007 Fazan et al.
7,171,321 B2 1/2007 Best
7,224,019 B2 5/2007 Hieda et al.
7,259,420 B2 8/2007 Anderson et al.
7,259,992 B2 8/2007 Shirota
7,285,820 B2 10/2007 Park et al.
7,301,803 B2 11/2007 Okhonin et al.
7,329,580 B2 2/2008 Cho et al.
7,348,621 B2 3/2008 Moore
7,369,438 B2 5/2008 Lee
7,439,572 B2 10/2008 Chen et al.
7,440,333 B2 10/2008 Hsia et al.
7,447,068 B2 11/2008 Tsai et al.
7,450,423 B2 11/2008 Lai et al.
7,473,611 B2 1/2009 Cho et al.
7,480,197 B2 1/2009 Carnevale et al.
7,504,302 B2 3/2009 Mathew et al.
7,541,636 B2 6/2009 Ranica et al.
7,542,345 B2 6/2009 Okhonin et al.
7,579,241 B2 8/2009 Hieda et al.
7,609,551 B2 10/2009 Shino et al.
7,622,761 B2 11/2009 Park et al.
7,701,763 B2 4/2010 Roohparvar
7,733,693 B2 6/2010 Ferrant et al.
7,759,715 B2 7/2010 Bhattacharyya
7,760,548 B2 7/2010 Widjaja
7,847,338 B2 12/2010 Widjaja
7,924,630 B2 4/2011 Carman
7,933,140 B2 4/2011 Wang et al.
7,983,100 B2 7/2011 Shan et al.
8,014,200 B2 9/2011 Widjaja
8,036,033 B2 10/2011 Widjaja
8,059,459 B2 11/2011 Widjaja
8,077,536 B2 12/2011 Widjaja
8,130,547 B2 3/2012 Widjaja et al.
8,130,548 B2 3/2012 Widjaja et al.
8,159,878 B2 4/2012 Widjaja
8,174,886 B2 5/2012 Widjaja et al.
8,194,451 B2 6/2012 Widjaja
8,208,302 B2 6/2012 Widjaja
8,243,499 B2 8/2012 Widjaja
8,264,875 B2 9/2012 Widjaja et al.
8,294,193 B2 10/2012 Widjaja
8,379,458 B1 2/2013 Or-Bach et al.
8,391,066 B2 3/2013 Widjaja
8,472,249 B2 6/2013 Widjaja
8,514,622 B2 8/2013 Widjaja
8,514,623 B2 8/2013 Widjaja et al.
8,531,881 B2 9/2013 Widjaja
8,559,257 B2 10/2013 Widjaja
8,570,803 B2 10/2013 Widjaja
8,625,371 B2 1/2014 Ware et al.
8,654,583 B2 2/2014 Widjaja
8,711,622 B2 4/2014 Widjaja
8,787,085 B2 7/2014 Widjaja
8,837,247 B2 9/2014 Widjaja
8,902,663 B1 12/2014 Or-Bach et al.
8,923,052 B2 12/2014 Widjaja

(56) References Cited

U.S. PATENT DOCUMENTS

| | | | |
|---|---|---|---|
| 8,937,834 B2 | 1/2015 | Widjaja et al. | |
| 8,947,932 B2* | 2/2015 | Lee | H01L 27/108 365/185.08 |
| 8,995,186 B2 | 3/2015 | Widjaja | |
| 9,001,581 B2 | 4/2015 | Widjaja | |
| 9,007,855 B2 | 4/2015 | Kumar et al. | |
| 9,025,399 B1 | 5/2015 | Morris et al. | |
| 9,030,872 B2 | 5/2015 | Widjaja et al. | |
| 9,087,580 B2 | 7/2015 | Widjaja | |
| 9,153,309 B2 | 10/2015 | Widjaja et al. | |
| 9,153,333 B2 | 10/2015 | Widjaja | |
| 9,208,840 B2 | 12/2015 | Widjaja et al. | |
| 9,230,965 B2 | 1/2016 | Widjaja | |
| 9,257,179 B2 | 2/2016 | Widjaja | |
| 9,460,790 B2 | 10/2016 | Widjaja | |
| 9,484,082 B2 | 11/2016 | Widjaja | |
| 9,490,012 B2 | 11/2016 | Widjaja | |
| 9,614,080 B2 | 4/2017 | Widjaja | |
| 9,646,693 B2 | 5/2017 | Widjaja | |
| 9,679,648 B2 | 6/2017 | Widjaja | |
| 9,715,932 B2 | 7/2017 | Widjaja | |
| 9,747,983 B2 | 8/2017 | Widjaja | |
| 9,761,311 B2 | 9/2017 | Widjaja | |
| 9,761,589 B2 | 9/2017 | Widjaja | |
| 9,812,203 B2 | 11/2017 | Widjaja | |
| 9,847,131 B2 | 12/2017 | Widjaja | |
| 9,928,910 B2 | 3/2018 | Widjaja | |
| 9,960,166 B2 | 5/2018 | Widjaja | |
| 9,978,450 B2 | 5/2018 | Widjaja | |
| 10,008,266 B1 | 6/2018 | Widjaja | |
| 2001/0019508 A1* | 9/2001 | Shimizu | H01L 27/115 365/203 |
| 2002/0018366 A1 | 2/2002 | Von Schwerin et al. | |
| 2002/0048193 A1 | 4/2002 | Tanikawa et al. | |
| 2002/0109138 A1 | 8/2002 | Forbes | |
| 2005/0024968 A1 | 2/2005 | Lee et al. | |
| 2005/0032313 A1 | 2/2005 | Forbes | |
| 2005/0041503 A1 | 2/2005 | Chindalore et al. | |
| 2005/0124120 A1 | 6/2005 | Du et al. | |
| 2006/0044915 A1 | 3/2006 | Park et al. | |
| 2006/0125010 A1 | 6/2006 | Bhattacharyya | |
| 2006/0157679 A1 | 7/2006 | Scheuerlein | |
| 2006/0227601 A1 | 10/2006 | Bhattacharyya | |
| 2006/0237770 A1 | 10/2006 | Huang et al. | |
| 2006/0278915 A1 | 12/2006 | Lee et al. | |
| 2007/0004149 A1 | 1/2007 | Tews | |
| 2007/0064494 A1 | 3/2007 | Morton et al. | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0284648 A1 | 12/2007 | Park et al. | |
| 2008/0048239 A1 | 2/2008 | Huo et al. | |
| 2008/0080248 A1 | 4/2008 | Lue et al. | |
| 2008/0123418 A1 | 5/2008 | Widjaja | |
| 2008/0224202 A1 | 9/2008 | Young et al. | |
| 2008/0265305 A1 | 10/2008 | He et al. | |
| 2008/0303079 A1 | 12/2008 | Cho et al. | |
| 2009/0016113 A1 | 1/2009 | Chen et al. | |
| 2009/0034320 A1 | 2/2009 | Ueda | |
| 2009/0065853 A1 | 3/2009 | Hanafi | |
| 2009/0081835 A1 | 3/2009 | Kim et al. | |
| 2009/0085089 A1 | 4/2009 | Chang et al. | |
| 2009/0108322 A1 | 4/2009 | Widjaja | |
| 2009/0108351 A1 | 4/2009 | Yang et al. | |
| 2009/0109750 A1 | 4/2009 | Widjaja | |
| 2009/0173985 A1 | 7/2009 | Lee et al. | |
| 2009/0190402 A1 | 7/2009 | Hsu et al. | |
| 2009/0251966 A1 | 10/2009 | Widjaja | |
| 2009/0316492 A1 | 12/2009 | Widjaja | |
| 2010/0008139 A1 | 1/2010 | Bae | |
| 2010/0034041 A1 | 2/2010 | Widjaja | |
| 2010/0046287 A1 | 2/2010 | Widjaja | |
| 2010/0102372 A1* | 4/2010 | Lee | G11C 11/404 257/298 |
| 2010/0246277 A1 | 9/2010 | Widjaja | |
| 2010/0246284 A1 | 9/2010 | Widjaja | |
| 2010/0290292 A1 | 11/2010 | Tanizaki et al. | |
| 2011/0032756 A1 | 2/2011 | Widjaja | |
| 2011/0042736 A1 | 2/2011 | Widjaja | |
| 2011/0044110 A1 | 2/2011 | Widjaja | |
| 2011/0228591 A1 | 9/2011 | Widjaja | |
| 2011/0305085 A1 | 12/2011 | Widjaja | |
| 2012/0012915 A1 | 1/2012 | Widjaja et al. | |
| 2012/0014180 A1 | 1/2012 | Widjaja | |
| 2012/0014188 A1 | 1/2012 | Widjaja et al. | |
| 2012/0069652 A1 | 3/2012 | Widjaja | |
| 2012/0106234 A1 | 5/2012 | Widjaja | |
| 2012/0113712 A1 | 5/2012 | Widjaja | |
| 2012/0120752 A1 | 5/2012 | Widjaja | |
| 2012/0217549 A1 | 8/2012 | Widjaja | |
| 2012/0230123 A1 | 9/2012 | Widjaja et al. | |
| 2013/0015517 A1 | 1/2013 | Widjaja et al. | |
| 2013/0148422 A1 | 6/2013 | Widjaja | |
| 2013/0250685 A1 | 9/2013 | Widjaja | |
| 2013/0292635 A1 | 11/2013 | Widjaja | |
| 2013/0301349 A1 | 11/2013 | Widjaja | |
| 2013/0343128 A1 | 12/2013 | Torricelli et al. | |
| 2014/0021549 A1 | 1/2014 | Widjaja | |
| 2014/0159156 A1 | 6/2014 | Widjaja | |
| 2014/0160868 A1 | 6/2014 | Widjaja et al. | |
| 2014/0332899 A1 | 11/2014 | Widjaja | |
| 2014/0340972 A1 | 11/2014 | Widjaja et al. | |
| 2014/0355343 A1 | 12/2014 | Widjaja | |
| 2015/0091073 A1 | 4/2015 | Li et al. | |
| 2015/0109860 A1 | 4/2015 | Widjaja | |
| 2015/0170743 A1 | 6/2015 | Widjaja | |
| 2015/0187776 A1 | 7/2015 | Widjaja | |
| 2015/0221650 A1 | 8/2015 | Widjaja et al. | |
| 2015/0310917 A1 | 10/2015 | Widjaja | |
| 2015/0371707 A1 | 12/2015 | Widjaja | |
| 2016/0005750 A1 | 1/2016 | Widjaja | |
| 2016/0086655 A1 | 3/2016 | Widjaja | |
| 2016/0111158 A1 | 4/2016 | Widjaja | |
| 2016/0365444 A1 | 12/2016 | Widjaja | |
| 2017/0025534 A1 | 1/2017 | Widjaja | |
| 2017/0032842 A1 | 2/2017 | Widjaja | |
| 2017/0040326 A1 | 2/2017 | Widjaja | |
| 2017/0133091 A1 | 5/2017 | Widjaja | |
| 2017/0169887 A1 | 6/2017 | Widjaja | |
| 2017/0213593 A1 | 7/2017 | Widjaja | |
| 2017/0294230 A1 | 10/2017 | Widjaja | |
| 2017/0365340 A1 | 12/2017 | Widjaja | |
| 2017/0365607 A1 | 12/2017 | Widjaja | |
| 2018/0025780 A1 | 1/2018 | Widjaja | |
| 2018/0075907 A1 | 3/2018 | Widjaja | |
| 2018/0174654 A1 | 6/2018 | Widjaja | |
| 2018/0182458 A1 | 6/2018 | Widjaja | |

OTHER PUBLICATIONS

Lanyon, et al., "Bandgap Narrowing in Moderately to Heavily Doped Silicon", ppl 1014-1018, No. 7, vol. ED-26, 1979.

Rodriguez, et al. "A-RAM memory cell: concept and operation." Electron Device Letters, IEEE, vol. 31, No. 9 (2010), pp. 972-974.

Rodriguez, et al. "Novel capacitorless 1T-DRAM cell for 22-nm node compatible with bulk and SOI substrates." Electron Devices, IEEE Transactions on, vol. 58, No. 8 (2011), pp. 2371-2377.

Rodriguez, et al. "A-RAM: Novel capacitor-less DRAM memory" in SOI Conference, 2009 IEEE International, pp. 1-2. IEEE, 2009.

Romanjek, et al., "Compact (Wg/Lg=80/85nm) FDSOI 1T-DRAM programmed by Meta Stable Dip", Ultimate Integration on Silicon (ULIS), 2012 13th International Conference on, Mar. 6, 2012, pp. 199-202.

Rothemund, et al., The importance of being modular, vol. 485, May 2012 pp. 584-585.

Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.

(56) References Cited

OTHER PUBLICATIONS

Sakui, K., et al. "A new static memory cell based on the reverse base current effect of bipolar transistors." Electron Devices, IEEE Transactions on 36.6 (1989): 1215-1217.
Shim, Kyung-Suk, In-Young Chung, and Young June Park. "A BJT-Based Heterostructure 1T-DRAM for Low-Voltage Operation." Electron Device Letters, vol. 33, No. 1, 2012, pp. 14-16.
Shin, et al. "Vertical-Gate Si/SiGe Double-HBT-Based Capacitor-less 1T DRAM Cell for Extended Retention Time at Low Latch Voltage." Electron Device Letters, vol. 33, No. 2, 2012, pp. 134-136.
Shin, et al. "A novel double HBT-based capacitorless 1T DRAM cell with Si/SiGe heterojunctions." Electron Device Letters, vol. 32, No. 7, 2011, pp. 850-852.
Sze, et al. Physics of Semiconductor Devices, 2007, pp. 1-4.
Terada, et al. "A new VLSI memory cell using capacitance coupling (CC cell)." Electron Devices, IEEE Transactions on 31.9 (1984): pp. 319-1324.
Oh, et al., a 4-Bit Double SONOS memory (DSM) with 4 Storage Nodes Per Cell for Ultimate Multi-Bit Operation, pp. 1-2, 2006.
Ventrice, et al. "Analytical model of deeply-scaled thyristors for memory applications." Microelectronics and Electron Devices (WMED), 2012 IEEE Workshop on. IEEE, 2012, pp. 1-4.
Villaret, et al. "Further insight into the physics and modeling of floating-body capacitorless DRAMs." Electron Devices, IEEE Transactions on 52.11 (2005): pp. 2447-2454.
Wu, et al. "Experimental Demonstration of the High-Performance Floating-Body/Gate DRAM Cell for Embedded Memories", IEEE Elec. Dev. Letter, vol. 33, No. 6, Jun. 2012, pp. 743-745.
Zhang, et al. "Total Ionizing Dose Effects on FinFET-Based Capacitor-Less 1T-DRAMs." Nuclear Science, IEEE Transactions on, vol. 57, No. 6, 2010, pp. 3298-3304.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.
Campardo G. et al., VLSI Design of Non-Volatile Memories, 2005.
Han et al. Programming/Erasing Characteristics of 45 nm NOR-Type Flash Memory Based on SOI FinFET Structure. vol. 47, Nov. 2005, pp. S564-S567.
Headland. Hot electron injection, Feb. 19, 2004.
Pellizzer et al., A 90nm Phase Change Memory Technology for Stand-Alone Non-Volatile Memory Applications, pp. 1-1, 2006.
Ranica et al. Scaled 1T-Bulk devices built with CMOS 90nm technology for low-cost eDRAM applications. Pascale. mazoyer@st.com, 2004, pp. 1-2.
Robert F. Pierret. Semiconductor Device Fundamentals, ISBN: 0-201-54393-1, 1996, by Addison-Wesley Publishing Company, Inc. PNPN Devices 463-476.
Tack et al., The Multistable Charge-Controlled Memory Effect in SOI Transistors at Low Temperatures, IEEE Transactions on Electron Devices, vol. 37, May 1990, pp. 1373-1382.
Okhonin, et al., Principles of Transient Charge Pumping on Partially Depleted SOI MOSFETs, IEEE Electron Device Letters, vol. 23, No. 5, May 2002, pp. 279-281.
Okhonin et al. A SOI Capacitor-less 1T-DRAM Concept. 2001, pp. 153-154.
Okhonin et al., A Capacitor-less 1T-DRAM Cell, IEEE Electron Device Letters, vol. 23, No. 2, Feb. 2002, pp. 85-87.
Ohsawa et al., An 18.5ns 128Mb SOI DRAM with a Floating body Cell, IEEE International Solid-State Circuits Conference, 2005, pp. 458-459, 609.
Ohsawa et al., Memory Design Using One-Transistor Gain Cell on SOI, Tech. Digest, IEEE International Solid-State Circuits, vol. 37, No. 11, 2002, pp. 1510-1522.
Yoshida et al., A Design of a Capacitorless 1T-DRAM Cell Using Gate-Induced Drain Leakage (GIDL) Current for Low-power and High-speed Embedded Memory , International Electron Devices Meeting, 2003, pp. 1-4.
Ohsawa et al., "Autonomous refresh of floating body cell (FBC)", 1-4244-2377-4/08/$20.00 © 2008 IEEE, pp. 801-804.
Ohsawa et al., "Autonomous refresh of floating-body cell due to current anomaly of impact ionization", IEEE Transactions on Electron Devices, vol. 56, No. 10, Oct. 2009, pp. 2301-2311.
Villaret et al., "Mechanisms of charge modulation in the floating body of triple-well nMOSFET capacitor-less DRAMs", Microelectronic Engineering 72 (2004) 434-439.
Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.
Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.
Aoulaiche, et al. "Junction Field Effect on the Retention Time for One-Transistor Floating-Body RAM." Electron Devices, IEEE Transactions on, vol. 59, No. 8, 2012, pp. 2167-2172.
Aoulaiche, et al. "Hot hole induced damage in 1T-FBRAM on bulk FinFET." Reliability Physics Symposium (IRPS), 2011 IEEE International. IEEE, 2011, pp. 99-104.
Avci, et al. "Floating-Body Diode—A Novel DRAM Device." Electron Device Letters, IEEE, vol. 33, No. 2, 2012, pp. 161-163.
Bawedin, et al., "Floating-Body SOI Memory: Concepts, Physics, and Challenges", ECS Transactions 19.4 (2009), pp. 243-256.
Ban, et al. "Integration of Back-Gate doping for 15-nm node floating body cell (FBC) memory." VLSI Technology (VLSIT), 2010 Symposium on. IEEE, 2010, pp. 159-160.
Cho, et al. "Variation-aware study of BJT-based capacitorless DRAM cell scaling limit." Silicon Nanoelectronics Workshop (SNW), 2012 IEEE. IEEE, 2012, pp. 1-2.
Cho, et al. "Variation Study and Implications for BJT-Based Thin-Body Capacitorless DRAM." Electron Device Letters, IEEE, vol. 33, No. 3, 2012, pp. 312-314.
Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.
Chiu, et al. "A simple process of thin-film transistor using the trench-oxide layer for improving 1T-DRAM performance." Next-Generation Electronics (ISNE), 2010 International Symposium on. IEEE, 2010, pp. 254-257.
Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.
Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.
Cao, et al. "A Novel 1T-1D Dram Cell for Embedded Application." Electron Devices, IEEE Transactions on, vol. 59, No. 5, 2012, pp. 1304-1310.
Collaert, et al. "Substrate bias dependency of sense margin and retention in bulk FinFET 1T-DRAM cells." Solid-State Electronics 65 (2011, pp. 205-210.
Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.
Chatterjee, et al. "Taper isolated dynamic gain RAM cell." Electron Devices Meeting, 1978 International. vol. 24. IEEE, 1978, pp. 698-699.
Chatterjee, et al. Circuit Optimization of the Paper Isolated Dynamic Gain RAM Cell for VLSI Memories, pp. 22-23, 1979.
Chatterjee, et al. "a survey of high-density dynamic RAM cell concepts." Electron Devices, IEEE Transactions on 26.6 (1979): 827-839.

(56) References Cited

OTHER PUBLICATIONS

Erb, D. "Stratified charge memory." Solid-State Circuits Conference. Digest of Technical Papers. 1978 IEEE International. vol. 21. IEEE, 1978, pp. 24-25.
Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.
Gamiz, et al. "3D Trigate 1T-DRAM Memory Cell for 2x nm Nodes." Memory Workshop (IMW), 2012 4th IEEE International. IEEE, 2012, pp. 1-4.
Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International. IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Vertical double gate Z-RAM technology with remarkable low voltage operation for DRAM application." VLSI Technology (VLSIT), 2010 Symposium on, 2010, pp. 163-164.
Kim, et al. "Silicon on replacement insulator (SRI) floating body cell (FBC) memory." VLSI Technology (VLSIT), 2010 Symposium on. IEEE, 2010, pp. 165-166.
Kim, et al. "Optical charge-pumping: A universal trap characterization technique for nanoscale floating body devices." VLSI Technology (VLSIT), 2011 Symposium on. IEEE, 2011, pp. 190-191.
Kim, et al. "Investigation of 1T DRAM cell with non-overlap structure and recessed channel." Silicon Nanoelectronics Workshop (SNW), 2010. IEEE, 2010, pp. 1-2.
Lu, et al., "A Simplified Superior Floating-Body/Gate DRAM Cell", IEEE Elec. Dev. Letters, vol. 30, No. 3, Mar. 2009, pp. 282-284.
Lu, et al., "A Floating-Body/Gate DRAM Cell Upgraded for Long Retention Time", IEEE Elec. Dev. Letters, vol. 32, No. 3, pp. 731-733, Jun. 2011.
Liu, Xuelian, et al."A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Lee, et al. "A Novel Capacitorless 1T DRAM Cell for Data Retention Time Improvement." Nanotechnology, IEEE Transactions on, vol. 10, No. 3, 2011, pp. 462-466.
Leiss, et al, "dRAM Design Using the Taper-Isolated Dynamic RAM Cell." Solid-State Circuits, IEEE Journal of 17.2 (1982): 337-344.
Mahatme, et al. "Total ionizing dose effects on ultra thin buried oxide floating body memories." Reliability Physics Symposium (IRPS), 2012 IEEE International, 2012, pp. 1-5.
Moon, et al. "Fin-width dependence of BJT-based 1T-DRAM implemented on FinFET." Electron Device Letters, vol. 31, No. 9 (2010): 909-911.
Moon, et al. "An optically assisted program method for capacitorless 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24-26.
Moon, et al. "Ultimately scaled 20nm unified-RAM." Electron Devices Meeting (IEDM), 2010 IEEE International. IEEE, 2010, pp. 12-2.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Ohsawa, et al, "A Novel Capacitor-less DRAM Cell: Floating Body Cell", CRC Press, Taylor & Francis Group, 2012, pp. 1-7.
Ohsawa, et al. "Autonomous refresh of floating body cell (FBC)" Electron Devices Meeting, 2008. IEDM 2008. IEEE International. IEEE, 2008.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.
Reisch, "On bistable behavior and open-base breakdown of bipolar transistors in the avalanche regime-modeling and applications." Electron Devices, IEEE Transactions on 39.6 (1992): 1398-1409.
Taiwan IPO Search Report dated Jun. 13, 2018 re Taiwan Patent Application No. 106139016.

* cited by examiner

Floating Body 24 is positively charged and V(BL 16) = 0.0V

FB is neutrally charged: and V(BL 16) = V(FB 24) = 0V

Exemplary Memory Array 280 with
Representative Memory Cells 250a, 250b, 250c and 250d Row Write Logic-0 Operation
(Memory Cells 250a and 250b)

Column Write Logic-0 Operation
(Memory Cells 250a and 250c)

Write Logic-0 Operation
(Single Memory Cell 250a)

Exemplary Memory Array 380 with Representative Memory Cells 350a, 350b, 350c and 350d Array Write Logic-0 Operation
(All Memory Cells 350)

Column Write Logic-0 Operation
(Memory Cells 350a and 350c)

Write Logic-1 Operation – GIDL
(Single Memory Cell 350a)

Read Operation (Single Memory Cell 450a)

Two Row Write Logic-0 Operation
(Memory Cells 450a, 450c, 450d and 450f)

Write Logic-0 Operation
(Single Memory Cell 450a)

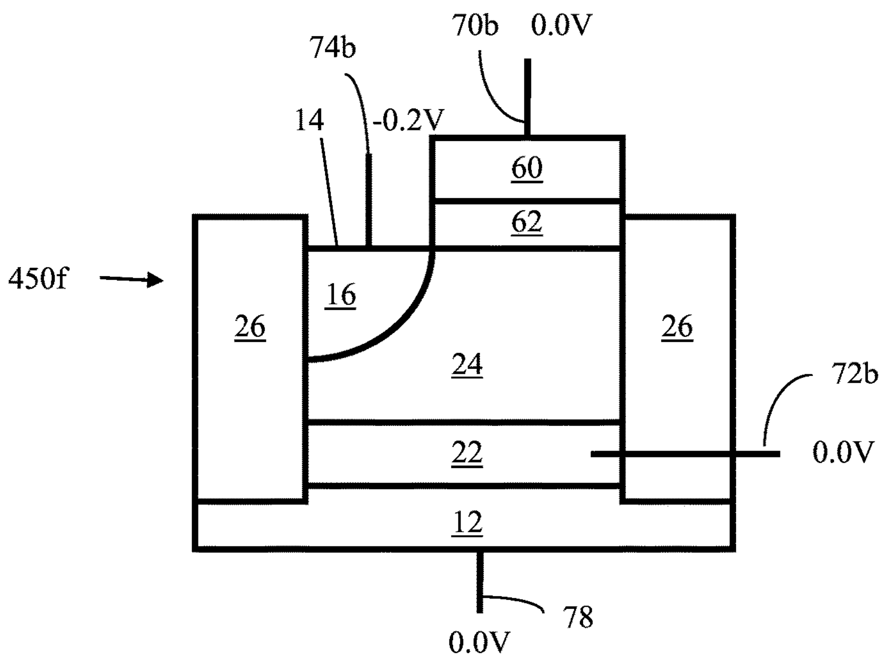
FIG. 69K
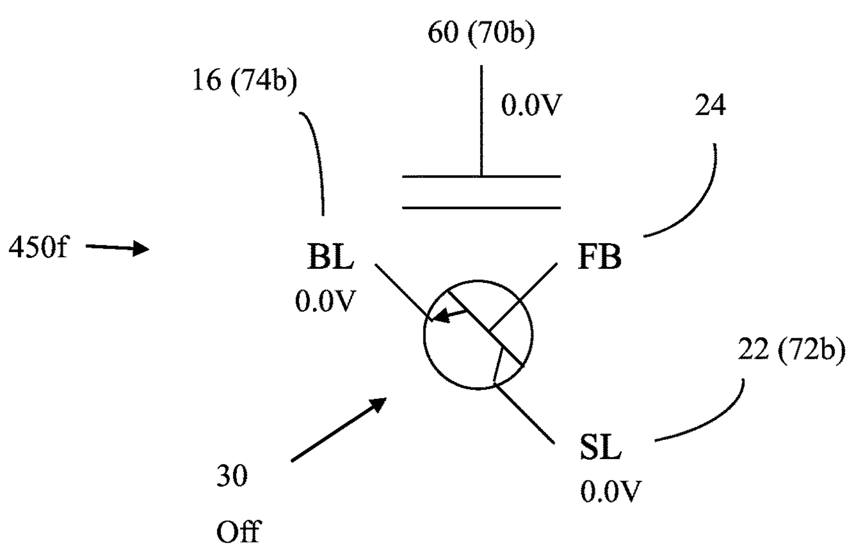

Write Logic-1 Operation – Impact Ionization
(Single Memory Cell 450a)

Write Logic-1 Operation – Impact Ionization
(Single Memory Cell 450a)

Array Hold Operation
(Memory Cells 550a, 550b, 550c and 550d)

Row Hold Operation
(Memory Cells 550a and 550b)

Read Operation
(Single Memory Cell 550a)

Singe Row Write Logic-0 Operation
(Memory Cells 550a and 550b)

Write Logic-1 Operation – Impact Ionization
(Single Memory Cell 550a)

Floating Body 24 is positively charged

FB is neutrally charged: V(BL 16) = V(FB 24) = 0V

Floating Body 24 is positively charged

FB is neutrally charged: V(BL 16) = V(FB 24) = 0V

Exemplary Memory Array 1380 with Representative Memory Cells 1350a, 1350b, 1350c and 1350d Floating Body 24 is positively charged and V(BL 16) = 0.0V FB is neutrally charged: and V(BL 16) = V(FB 24) = 0V Read Operation, Active Bit Line High
(Memory Cell 1350a)

Read Operation, Active Source Line High
(Memory Cell 1350a)

Exemplary Memory Array 1480 with Representative Memory Cells 1450a, 1450b, 1450c and 1450d Read Operation
(Memory Cell 1450a)

Write Logic-0 Operation
(Memory Cell 1450a)

Write Logic-1 Operation
(Memory Cell 1450a)

Exemplary Memory Array 1580 with Representative Memory Cells 1550a, 1550b, 1550c and 1550d Array Hold Operation
(All Memory Cells 1550)

Read Operation
(Memory Cell 1550a)

Write Logic-1 Operation
(Memory Cell 1550a)

Restore Operation
(All Memory Cells 1550)

Write Logic-1 Operation
(Memory Cell 1550a)

SEMICONDUCTOR DEVICE HAVING ELECTRICALLY FLOATING BODY TRANSISTOR, SEMICONDUCTOR DEVICE HAVING BOTH VOLATILE AND NON-VOLATILE FUNCTIONALITY AND METHOD OF OPERATING

CROSS-REFERENCE

This application is a continuation application of U.S. application Ser. No. 15/654,606, filed on Jul. 19, 2017, which is a continuation application of U.S. application Ser. No. 15/436,641, filed on Feb. 17, 2017, now U.S. Pat. No. 9,747,983, which is a continuation of U.S. application Ser. No. 15/237,441, filed on Aug. 15, 2016, now U.S. Pat. No. 9,614,080, which is a continuation application of U.S. application Ser. No. 14/834,695, filed on Aug. 25, 2015, now U.S. Pat. No. 9,455,262, which is a divisional application of U.S. application Ser. No. 13/577,282, having a filing or 371(c) date of Oct. 5, 2012, now U.S. Pat. No. 9,153,309, which claims the benefit under 35 USC 371(c) of PCT Application No. PCT/US2011/023947, which claims the benefit of U.S. Provisional Application No. 61/302,129, filed Feb. 7, 2010, and U.S. Provisional Application No. 61/425,820, filed Dec. 22, 2010, which applications and patents are each hereby incorporated herein, in their entireties, by reference thereto and to which applications we claim priority under 35 U.S.C. Sections 120, 371 and 119, respectively.

This application also hereby incorporates, in its entirety by reference thereto, application Ser. No. 12/797,320, filed on Jun. 9, 2010, titled "Semiconductor Memory Having Electrically Floating Body Transistor", application Ser. No. 12/797,334 filed on Jun. 9, 2010, titled "Method of Maintaining the State of Semiconductor Memory Having Electrically Floating Body Transistor", application Ser. No. 12/897,528, titled "Compact Semiconductor Device Having Reduced Number of Contacts, Methods of Operating and Method of Making", application Ser. No. 12/897,516, titled "Semiconductor Memory Device Having An Electrically Floating Body Transistor", application Ser. No. 12/897,538, titled "Semiconductor Memory Device Having An Electrically Floating Body Transistor".

FIELD OF THE INVENTION

The present invention relates to semiconductor memory technology. More specifically, the present invention relates to a semiconductor memory device having an electrically floating body transistor and a semiconductor memory device having both volatile and non-volatile functionality.

BACKGROUND OF THE INVENTION

Semiconductor memory devices are used extensively to store data. Static and Dynamic Random Access Memory (SRAM and DRAM, respectively) are widely used in many applications. SRAM typically consists of six transistors and hence has a large cell size. However, unlike DRAM, it does not require periodic refresh operations to maintain its memory state. Conventional DRAM cells consist of a one-transistor and one-capacitor (1T/1C) structure. As the 1T/1C memory cell feature is being scaled, difficulties arise due to the necessity of maintaining the capacitance value.

DRAM based on the electrically floating body effect has been proposed (see for example "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002). Such memory eliminates the capacitor used in the conventional 1T/1C memory cell, and thus is easier to scale to smaller feature size. In addition, such memory allows for a smaller cell size compared to the conventional 1T/1C memory cell. However, unlike SRAM, such DRAM memory cell still requires refresh operation, since the stored charge leaks over time.

A conventional 1T/1C DRAM refresh operation involves first reading the state of the memory cell, followed by re-writing the memory cell with the same data. Thus this read-then-write refresh requires two operations: read and write. The memory cell cannot be accessed while being refreshed. An "automatic refresh" method", which does not require first reading the memory cell state, has been described in Fazan et al., U.S. Pat. No. 7,170,807. However, such operation still interrupts access to the memory cells being refreshed.

In addition, the charge in a floating body DRAM memory cell decreases over repeated read operations. This reduction in floating body charge is due to charge pumping, where the floating body charge is attracted to the surface and trapped at the interface (see for example "Principles of Transient Charge Pumping on Partially Depleted SOI MOSFETs", S. Okhonin, et al., pp. 279-281, IEEE Electron Device Letters, vol. 23, no. 5, May 2002).

Thus there is a continuing need for semiconductor memory devices and methods of operating such devices such that the states of the memory cells of the semiconductor memory device are maintained without interrupting the memory cell access.

There is also a need for semiconductor memory devices and methods of operating the same such that the states of the memory cells are maintained upon repeated read operations.

Non-volatile memory devices, such as flash erasable programmable read only memory (Flash EPROM) devices, retain stored data even in the absence of power supplied thereto. Unfortunately, non-volatile memory devices typically operate more slowly than volatile memory devices.

Flash memory device typically employs a floating gate polysilicon as the non-volatile data storage. This introduces additional process steps from the standard complementary metal-oxide-semiconductor (CMOS) process. US 2010/0172184 "Asymmetric Single Poly NMOS Non-volatile Memory Cell" to Roizin et al. ("Roizin"), describes a method of forming a single poly non-volatile memory device. Similar to many non-volatile memory devices, it operates more slowly than volatile memory devices. In addition, non-volatile memory devices can only perform limited number of cycles, often referred to as endurance cycle limitation.

Accordingly, it would be desirable to provide a universal type memory device that includes the advantages of both volatile and non-volatile memory devices, i.e., fast operation on par with volatile memories, while having the ability to retain stored data when power is discontinued to the memory device. It would further be desirable to provide such a universal type memory device having a size that is not prohibitively larger than comparable volatile or non-volatile devices and which has comparable storage capacity to the same.

The present invention meets the above needs and more as described in detail below.

SUMMARY OF THE INVENTION

In one aspect of the present invention, a method of maintaining a state of a memory cell without interrupting access to the memory cell is provided, including: applying a back bias to the cell to offset charge leakage out of a floating body of the cell, wherein a charge level of the floating body indicates a state of the memory cell; and accessing the cell.

In at least one embodiment, the applying comprises applying the back bias to a terminal of the cell that is not used for address selection of the cell.

In at least one embodiment, the back bias is applied as a constant positive voltage bias.

In at least one embodiment, the back bias is applied as a periodic pulse of positive voltage.

In at least one embodiment, a maximum potential that can be stored in the floating body is increased by the application of back bias to the cell, resulting in a relatively larger memory window.

In at least one embodiment, the application of back bias performs a holding operation on the cell, and the method further comprises simultaneously performing a read operation on the cell at the same time that the holding operation is being performed.

In at least one embodiment, the cell is a multi-level cell, wherein the floating body is configured to indicate more than one state by storing multi-bits, and the method further includes monitoring cell current of the cell to determine a state of the cell.

In another aspect of the present invention, a method of operating a memory array having rows and columns of memory cells assembled into an array of the memory cells is provided, wherein each memory cell has a floating body region for storing data; the method including: performing a holding operation on at least all of the cells not aligned in a row or column of a selected cell; and accessing the selected cell and performing a read or write operation on the selected cell while performing the hold operation on the at least all of the cells not aligned in a row or column of the selected cell.

In at least one embodiment, the performance of a holding operation comprises performing the holding operation on all of the cells and the performing a read or write operation comprises performing a read operation on the selected cell.

In at least one embodiment, the holding operation is performed by applying back bias to a terminal not used for memory address selection.

In at least one embodiment, the terminal is segmented to allow independent control of the applied back bias to a selected portion of the memory array.

In at least one embodiment, the performance of a holding operation comprises performing the holding operation on all of the cells except for the selected cell, and the performing a read or write operation comprises performing a write "0" operation on the selected cell, wherein a write "0" operation is also performed on all of the cells sharing a common source line terminal with the selected cell during the performing a write"0" operation.

In at least one embodiment, an individual bit write "0" operation is performed, wherein the performing a holding operation comprises performing the holding operation on all of the cells except for the selected cell, while the performing a read or write operation comprises performing a write "0" operation on the selected cell.

In at least one embodiment, the performance of a holding operation comprises performing the holding operation on all of the cells except for the selected cell while the performing a read or write operation comprises performing a write "1" operation on the selected cell.

In at least one embodiment, the performance of a holding operation comprises performing the holding operation on all of the cells except for the selected cell while the performing a read or write operation comprises performing a multi-level write operation on the selected cell, using an alternating write and verify algorithm.

In at least one embodiment, the performance of a holding operation comprises performing the holding operation on all of the cells except for the selected cell while the performing a read or write operation comprises performing a multi-level write operation on the selected cell, wherein the multi-level write operation includes: ramping a voltage applied to the selected cell to perform the write operation; reading the state of the selected cell by monitoring a change in current through the selected cell; and removing the ramped voltage applied once the change in cell current reaches a predetermined value.

In at least one embodiment, the performance of a holding operation comprises performing the holding operation on all of the cells except for the selected cell while the performing a read or write operation comprises performing a multi-level write operation on the selected cell, wherein the multi-level write operation includes: ramping a current applied to the selected cell to perform the write operation; reading the state of the selected cell by monitoring a change in voltage across a bit line and a source line of the selected cell; and removing the ramped current applied once the change in cell voltage reaches a predetermined value.

In at least one embodiment, the multi-level write operation permits bit-level selection of a bit portion of memory of the selected cell.

In at least one embodiment, the performance of a holding operation comprises performing the holding operation on all of the cells except for the selected cell while the performing a read or write operation comprises performing a single-level or multi-level write operation on the selected cell, wherein the single-level and each level of the multi-level write operation includes: ramping a voltage applied to the selected cell to perform the write operation; reading the state of the selected cell by monitoring a change in current toward an addressable terminal of the selected cell; and verifying a state of the write operation using a reference memory cell.

In at least one embodiment, the method further includes configuring a state of the reference memory cell using a write-then-verify operation, prior to performing the write operation.

In at least one embodiment, configuring a state of the reference memory cell comprises configuring the state upon power up of the memory array.

In another aspect of the present invention, a method of operating a memory array having rows and columns of memory cells assembled into an array of the memory cells is provided, wherein each memory cell has a floating body region for storing data; and wherein the method includes: refreshing a state of at least one of the memory cells; and accessing at least one other of the memory cells, wherein access of the at least one other of the memory cells in not interrupted by the refreshing, and wherein the refreshing is performed without alternating read and write operations.

In at least one embodiment, at least one of the memory cells is a multi-level memory cell.

In another aspect of the present invention, a method of operating a memory array having rows and columns of memory cells assembled into an array of the memory cells is provided, wherein each memory cell has a floating body region for storing data; and wherein the method includes: accessing a selected memory cell from the memory cells;

and performing a simultaneous write and verify operation on the selected memory cell without performing an alternating write and read operation.

In at least one embodiment, the selected memory cell is a multi-level memory cell.

In at least one embodiment, a verification portion of the write and verify operation is performed by sensing a current change in the column direction of the array in a column that the selected cell is connected to.

In at least one embodiment, a verification portion of the write and verify operation is performed by sensing a current change in the row direction of the array in a row that the selected cell is connected to.

In at least one embodiment, a write portion of the write and verify operation employs use of a drain or gate voltage ramp.

In at least one embodiment, a write portion of the write and verify operation employs use of a drain current ramp.

In one aspect of the present invention, an integrated circuit is provided that includes a link or string of semiconductor memory cells, wherein each memory cell comprises a floating body region for storing data; and the link or string comprises at least one contact configured to electrically connect the memory cells to at least one control line, wherein the number of contacts is the same as or less than the number of the memory cells.

In at least one embodiment, the number of contacts is less than the number of memory cells.

In at least one embodiment, the semiconductor memory cells are connected in series and form the string.

In at least one embodiment, the semiconductor memory cells are connected in parallel and form the link.

In at least one embodiment, the integrated circuit is fabricated on a silicon-on-insulator (SOI) substrate.

In at least one embodiment, the integrated circuit is fabricated on a bulk silicon substrate.

In at least one embodiment, the number of contacts is two, and the number of semiconductor memory cells is greater than two.

In at least one embodiment, the memory cells further comprise first and second conductive regions interfacing with the floating body region.

In at least one embodiment, the first and second conductive regions are shared by adjacent ones of the memory cells for each the memory cell having the adjacent memory cells.

In at least one embodiment, each memory cell further comprises first, second, and third conductive regions interfacing with the floating body region.

In at least one embodiment, each memory cell further comprises a gate insulated from the floating body region.

In at least one embodiment, at least one of the memory cells is a contactless memory cell.

In at least one embodiment, a majority of the memory cells are contactless memory cells.

In at least one embodiment, the memory cells store multi-bit data.

In another aspect of the present invention, an integrated circuit is provided that includes a plurality of contactless semiconductor memory cells, each semiconductor memory cell including: a floating body region for storing data; first and second conductive regions interfacing with the floating body region; a gate above a surface of the floating body region; and an insulating region insulating the gate from the floating body region.

In at least one embodiment, the contactless memory cells are connected in series.

In at least one embodiment, the contactless memory cells are connected in parallel.

In at least one embodiment, the integrated circuit comprises at least one semiconductor memory cell having at least one contact, a total number of the contacts being less than a total number of memory cells that includes a total number of the memory cells having at least one contact and a total number of the contactless memory cells.

In another aspect of the present invention, an integrated circuit is provided that includes: a plurality of semiconductor memory cells connected in series, each semiconductor memory cell comprising: a floating body region for storing data; first and second conductive regions interfacing with the floating body region; a gate above a surface of the floating body region; and an insulating region insulating the gate and the floating body region.

In at least one embodiment, at least one of the semiconductor memory cells is a contactless semiconductor memory cell.

In at least one embodiment, the at least one contactless semiconductor memory cell comprises a third conductive region interfacing with the floating body region.

In another aspect of the present invention, an integrated circuit is provided that includes a plurality of semiconductor memory cells connected in parallel, each semiconductor memory cell comprising: a floating body region for storing data; a conductive region interfacing with the floating body region; a gate above a surface of the floating body region; and an insulating region insulating the gate from the floating substrate region; wherein at least one of the semiconductor memory cells is a contactless semiconductor memory cell.

In at least one embodiment, a majority of the semiconductor memory cells are contactless semiconductor memory cells.

In at least one embodiment, the integrated circuit comprises a number of contacts, the number being less than or equal to a number of the memory cells.

In at least one embodiment, the memory cells each further comprise a second conductive region interfacing with the floating body region.

In at least one embodiment, the memory cells each further comprise second and third conductive regions interfacing with the floating body region.

In another aspect of the present invention, an integrated circuit is provided that includes a plurality of contactless semiconductor memory cells connected in parallel, each semiconductor memory cell comprising: a floating body region for storing data; first and second conductive regions interfacing with the floating body region; a gate above a surface of the floating region; and an insulating region insulating the gate and the floating body region.

In another aspect of the present invention, an integrated circuit is provided that includes: a memory string or link comprising a set of contactless semiconductor memory cells; and a first contact contacting a first additional semiconductor memory cell; wherein the contactless semiconductor memory cells are accessible via the first contact.

In at least one embodiment, the integrated circuit further includes a second contact contacting a second additional semiconductor memory cell; wherein the contactless semiconductor memory cells are accessible via the second contact.

In at least one embodiment, the contactless semiconductor memory cells and the additional semiconductor memory cell are connected in series.

In at least one embodiment, the memory string or link comprises a first memory string or link and the set comprises a first set, the integrated circuit further comprising: a second memory string or link comprising a second set of contactless semiconductor memory cells; and a second contact contacting a second additional semiconductor memory cell; wherein the second set of contactless semiconductor memory cells are accessible via the second contact.

In at least one embodiment, the memory string or link comprises a first memory string and the set comprises a first set, the integrated circuit further comprising: a second memory string comprising a second set of contactless semiconductor memory cells; a third contact contacting a third additional semiconductor memory cell; and a fourth contact contacting a fourth additional semiconductor memory cell; wherein the second set of contactless semiconductor memory cells are accessible via the third and fourth contacts; wherein the first set of contactless semiconductor memory cells, the first additional semiconductor memory cell and the second additional semiconductor memory cell are connected in series, and wherein the second set of contactless semiconductor memory cells, the third additional semiconductor memory cell and the fourth additional semiconductor memory cell are connected in series in the second string.

In at least one embodiment, the integrated circuit further includes a first terminal connected to the first contact and the third contact; a second terminal connected to the second contact; and a third terminal connected to the fourth contact.

In at least one embodiment, the semiconductor memory cells comprise substantially planar semiconductor memory cells.

In at least one embodiment, the semiconductor memory cells comprise fin-type, three-dimensional semiconductor memory cells.

In at least one embodiment, the first set of contactless semiconductor memory cells are aligned side-by side of the second set of contactless semiconductor memory cells; the first string comprises a first set of insulation portions that insulate adjacent memory cells in the first string, and a second set of insulation portions that insulate the memory cells in the first string from adjacent memory cells in the second string; and the second string comprises a third set of insulation portions that insulate adjacent memory cells in the second string, and a fourth set of insulation portions that insulate the memory cells in the second string from adjacent memory cells in the first string.

In at least one embodiment, the first and second contacts are located at first and second ends of the memory string.

In at least one embodiment, each semiconductor memory cell comprises: a floating body region for storing data; first and second conductive regions interfacing with the floating body region; a gate above a surface of the floating region; an insulating region insulating the gate from the floating body region; and a word line terminal electrically connected to the gate.

In another aspect of the present invention an integrated circuit includes a plurality of floating body memory cells which are linked either in series or in parallel. The connections between the memory cells are made to reduce the number of contacts for the overall circuit. Because several memory cells are connected either in series or in parallel, a compact memory array is provided.

These and other features of the invention will become apparent to those persons skilled in the art upon reading the details of the integrated circuits, strings, links memory cells and methods as more fully described below.

In one aspect of the present invention, a semiconductor memory cell includes: a substrate having a first conductivity type; a substrate terminal connected to the substrate; a first region embedded in the substrate at a first location of the substrate and having a second conductivity type; one of a bit line terminal and a source line terminal connected to the first region; a second region embedded in the substrate at a second location of the substrate and have the second conductivity type, such that at least a portion of the substrate having the first conductivity type is located between the first and second locations and functions as a floating body to store data in volatile memory; the other of the bit line terminal and the source line terminal connected to the second region; a trapping layer positioned in between the first and second locations and above a surface of the substrate; the trapping layer comprising first and second storage locations being configured to store data as nonvolatile memory independently of one another, wherein the first and second storage locations are each configured to receive transfer of data stored by the volatile memory; and a control gate positioned above the trapping layer.

In at least one embodiment, the surface comprises a top surface, the cell further comprising a buried layer at a bottom portion of the substrate, the buried layer having the second conductivity type; and a buried well terminal connected to the buried layer.

In at least one embodiment, the floating body is completely bounded by the top surface, the first and second regions and the buried layer.

In at least one embodiment, the first conductivity type is "p" type and the second conductivity type is "n" type.

In at least one embodiment, the semiconductor memory cell further comprises insulating layers bounding the side surfaces of the substrate.

In at least one embodiment, the cell functions as a multi-level cell.

In at least one embodiment, at least one of the first and second storage locations is configured so that more than one bit of data can be stored in the at least one of the first and second storage locations, respectively.

In at least one embodiment, the floating body is configured so that more than one bit of data can be stored therein.

In another aspect of the present invention, a method of operating a memory cell device having a plurality of memory cells each having a floating body for storing data as volatile memory, and a trapping layer having first and second storage locations for storing data as non-volatile memory is provided, including: operating the memory cell as a volatile memory cell when power is supplied to the memory cell; upon discontinuation of power to the memory cell, resetting non-volatile memory of the memory cell to a predetermined state; and performing a shadowing operation wherein content of the volatile memory cell is loaded into the non-volatile memory.

In at least one embodiment, the method further includes shutting down the memory cell device, wherein the memory cell device, upon the shutting down, operates as a flash, erasable, programmable read-only memory.

In at least one embodiment, the method further includes restoring power to the memory cell, wherein upon the restoring power, carrying out a restore process wherein content of the non-volatile memory is loaded into the volatile memory.

In another aspect of the present invention, a method of operating a memory cell device includes: providing a memory cell device having a plurality of memory cells, each the memory cell having a floating body for storing data as volatile memory and a trapping layer for storing data as non-volatile memory; and operating at least one of the memory cells as a volatile memory cell, independently of the non-volatile memory of the respective memory cell.

In at least one embodiment, the operating comprises applying a voltage to a region at a surface of the cell adjacent to a non-volatile storage location of the non-volatile memory.

In at least one embodiment, the applying a voltage comprises applying a positive voltage and the floating body of the cell has a p-type conductivity type.

In at least one embodiment, the operating comprises operating the volatile memory to perform at least one of a reading operation, a writing operation, and or a holding operation.

In at least one embodiment, the method further includes performing a reset operation to initialize a state of the non-volatile memory.

In at least one embodiment, the method further includes performing a shadowing operation to load a content of the volatile memory into the non-volatile memory.

In another aspect of the present invention, a semiconductor memory cell is provided that includes a floating body region for storing data as volatile memory; and a trapping layer for storing data as non-volatile memory; wherein the data stored as volatile memory and the data stored as non-volatile memory are independent of one another, as the floating body region can be operated independently of the trapping layer and the trapping layer can be operated independently of the floating body region.

In at least one embodiment, the floating body region has a first conductivity type and is bounded by a buried layer have a second conductivity type different from the first conductivity type.

In at least one embodiment, the first conductivity type is "p" type and the second conductivity type is "n" type.

In at least one embodiment, the floating body region is bounded by a buried insulator.

In at least one embodiment, the floating body region is formed in a substrate, the cell further comprises insulating layers bounding side surfaces of the substrate.

In at least one embodiment, the cell functions as a multi-level cell.

In at least one embodiment, the trapping layer comprises first and second storage locations, the first and second storage locations each being configured to store data independently of the other, as non-volatile memory.

In one aspect of the present invention, a single polysilicon floating gate semiconductor memory cell is provided that includes: a substrate; a floating body region exposed at a surface of the substrate and configured to store volatile memory; a single polysilicon floating gate configured to store nonvolatile data; an insulating region insulating the floating body region from the single polysilicon floating gate; and first and second regions exposed at the surface at locations other than where the floating body region is exposed; wherein the floating gate is configured to receive transfer of data stored by the volatile memory.

In at least one embodiment, the first and second regions are asymmetric, wherein a first area defines an area over which the first region is exposed at the surface and a second area defines an area over which the second region is exposed at the surface, and wherein the first area is unequal to the second area.

In at least one embodiment, one of the first and second regions at the surface has a higher coupling to the floating gate relative to coupling of the other of the first and second regions to the floating gate.

In at least one embodiment, the cell includes a buried layer at a bottom portion of the substrate, the buried layer having a conductivity type that is different from a conductivity type of the floating body region.

In at least one embodiment, the floating body is bounded by the surface, the first and second regions and the buried layer.

In at least one embodiment, insulating layers bound side surfaces of the substrate.

In at least one embodiment, a buried insulator layer is buried in a bottom portion of the substrate In at least one embodiment, the floating body is bounded by the surface, the first and second regions and the buried insulator layer.

In at least one embodiment, the floating gate overlies an area of the floating body exposed at the surface, and a gap is located between the area overlaid and one of the first and second regions.

In at least one embodiment, a select gate is positioned adjacent to the single polysilicon floating gate.

In at least one embodiment, the first and second regions are asymmetric, wherein a first area defines an area over which the first region is exposed at the surface and a second area defines an area over which the second region is exposed at the surface, and wherein the first area is unequal to the second area.

In at least one embodiment, the select gate overlaps the floating gate.

In another aspect of the present invention, a semiconductor memory cell is provided that includes: a substrate; a floating body region configured to store volatile memory; a stacked gate nonvolatile memory comprising a floating gate adjacent the substrate and a control gate adjacent the floating gate such that the floating gate is positioned between the control gate and the substrate; and a select gate positioned adjacent the substrate and the floating gate.

In at least one embodiment, the floating body is exposed at a surface of the substrate, and the cell further includes: first and second regions each exposed at the surface at locations other than where the floating body region is exposed; wherein the first and second regions are asymmetric, wherein a first area defines an area over which the first region is exposed at the surface and a second area defines an area over which the second region is exposed at the surface, and wherein the first area is unequal to the second area.

In at least one embodiment, one of the first and second regions at the surface has a higher coupling to the floating gate relative to coupling of the other of the first and second regions to the floating gate.

In at least one embodiment, a buried layer is buried in a bottom portion of the substrate, the buried layer having a conductivity type different from a conductivity type of the floating body region.

In at least one embodiment, the floating body is bounded by the surface, the first and second regions and the buried layer.

In at least one embodiment, insulating layers bound side surfaces of the substrate.

In at least one embodiment, a buried insulator layer is buried in a bottom portion of the substrate.

In at least one embodiment, the floating body is bounded by the surface, the first and second regions and the buried insulator layer.

In another aspect of the present invention, a single polysilicon floating gate semiconductor memory cell is provided that includes: a substrate; a floating body region for storing data as volatile memory, and a single polysilicon floating gate for storing data as non-volatile memory; wherein the floating body region stores the data stored as volatile memory independently of the data stored as non-volatile memory, and the single polysilicon floating gate stores the data stored as volatile memory independently of the data stored as volatile memory.

In at least one embodiment, the floating body region has a first conductivity type and is bounded by a buried layer having a second conductivity type different from the first conductivity type.

In at least one embodiment, the floating body region is bounded a buried insulator.

In at least one embodiment, the first conductivity type is "p" type and the second conductivity type is "n" type.

In at least one embodiment, insulating layers bound side surfaces of the substrate.

In another aspect of the present invention, a method of operating a memory cell device having a plurality of memory cells each having a floating body for storing data as volatile memory, and a floating gate for storing data as non-volatile memory is provided, including: operating the memory cell as a volatile memory cell when power is supplied to the memory cell; upon discontinuation of power to the memory cell, resetting non-volatile memory of the memory cell to a predetermined state; and performing a shadowing operation wherein content of the volatile memory cell is loaded into the non-volatile memory.

In at least one embodiment, the method further includes shutting down the memory cell device, wherein the memory cell device, upon the shutting down, operates as a flash, erasable, programmable read-only memory.

In at least one embodiment, the method further includes restoring power to the memory cell, wherein upon the restoring power, carrying out a restore process wherein content of the non-volatile memory is loaded into the volatile memory.

In another aspect of the present invention, a method of operating a memory cell device includes: providing a memory cell device having a plurality of memory cells each having a floating body for storing data as volatile memory, a floating gate for storing data as non-volatile memory, and a control gate; and operating the memory cell as a volatile memory cell independent of the non-volatile memory data.

In at least one embodiment, the method further includes applying a voltage to the control gate to invert a channel region underneath the floating gate, regardless of charge stored in the floating gate.

In at least one embodiment, the method further includes applying a positive voltage to a region of the substrate coupled to the floating gate, and wherein the floating body has a "p" type conductivity type.

In at least one embodiment, the operation the memory cell as a volatile memory comprises performing at least one of reading, writing, and holding operations.

In at least one embodiment, the method further includes performing a reset operation to initialize a state of the non-volatile memory.

In at least one embodiment, the method further includes performing a shadowing operation to load content of the volatile memory into the non-volatile memory.

These and other features of the invention will become apparent to those persons skilled in the art upon reading the details of the methods, devices and arrays as more fully described below.

BRIEF DESCRIPTION OF THE DRAWINGS

FIGS. 85A through 85F illustrate a fifth exemplary memory cell according to the present invention.

FIG. 86 illustrates the hold operation when using memory cells of the present invention in SCR mode.

FIG. 87 illustrates the single cell read operation when using memory cells of the present invention in SCR mode.

FIG. 88 illustrates the single cell write logic-1 operation when using memory cells of the present invention in SCR mode.

FIG. 89 illustrates the single cell write logic-0 operation when using memory cells of the present invention in SCR mode.

FIGS. 90A through 90C illustrate standard MOSFET transistors of the prior art.

Figure 91:
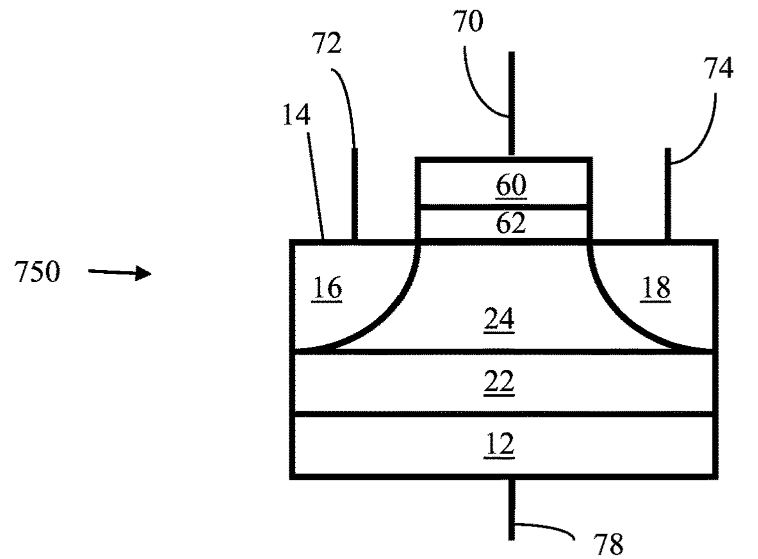

FIG. 91 schematically illustrates a memory cell in accordance with an embodiment of the present invention.

Figure 92A:
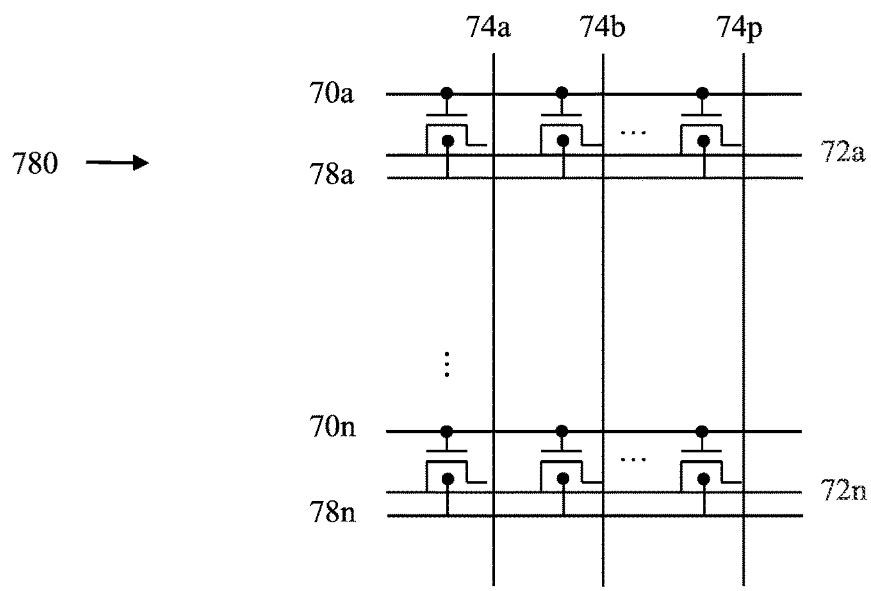

FIG. 92A schematically illustrates a memory array having a plurality of memory cells according to an embodiment of the present invention.

Figure 92B:
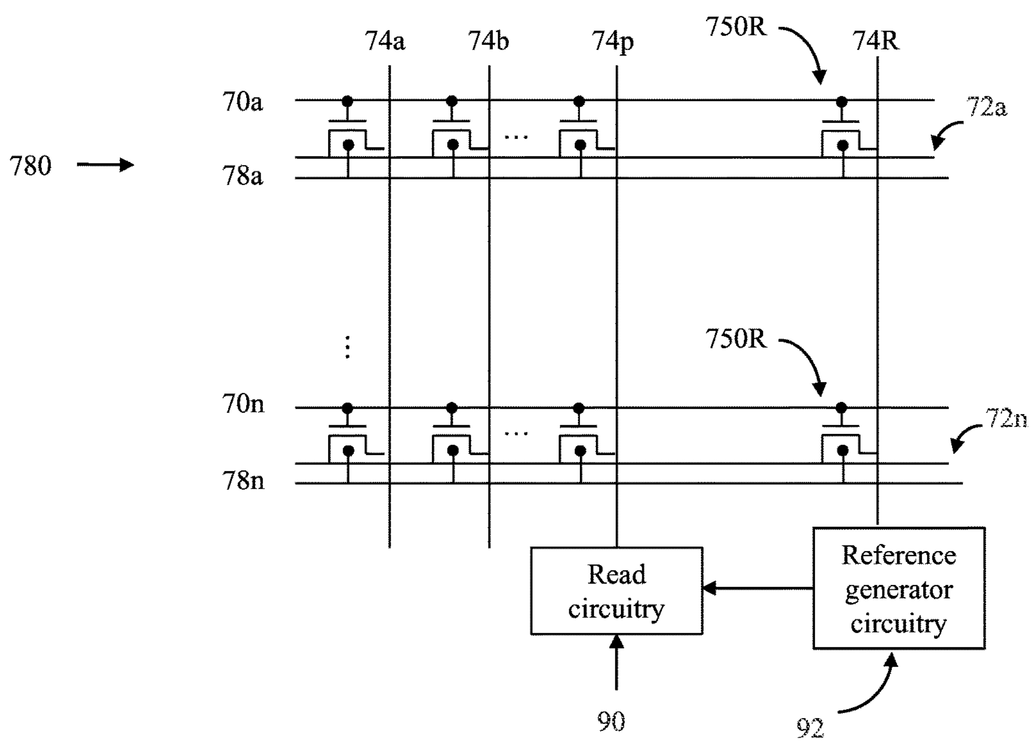
Figure 93:
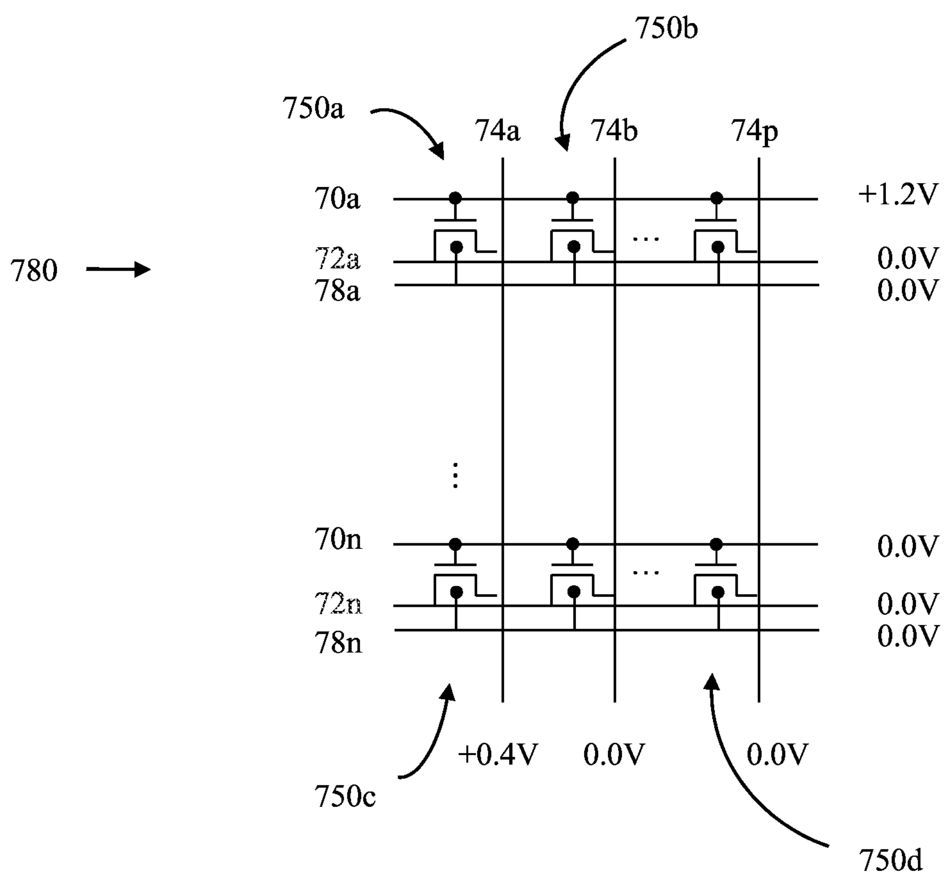

FIG. 92B schematically illustrates a memory array having a plurality of memory cells, with read circuitry connected thereto that can be used to determine data states, according to an embodiment of the present invention FIG. 93 shows exemplary bias conditions for reading a selected memory cell, as wells as bias conditions of unselected memory cells in a memory array according to an embodiment of the present invention.

Figure 94A:
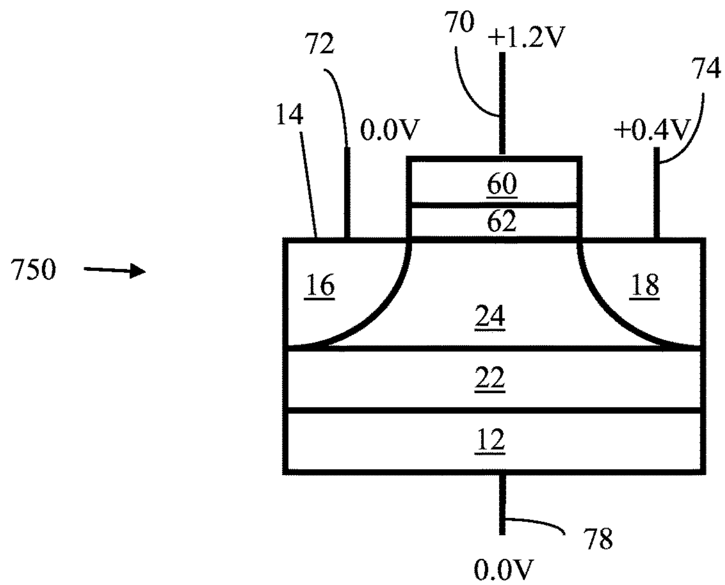

FIG. 94A shows exemplary bias conditions for reading a selected memory cell according to an embodiment of the present invention.

Figure 94B:
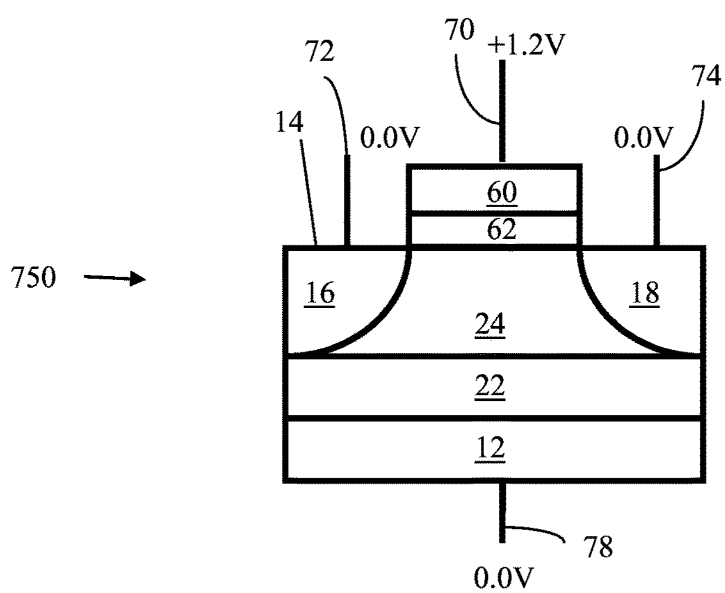
Figure 94C:
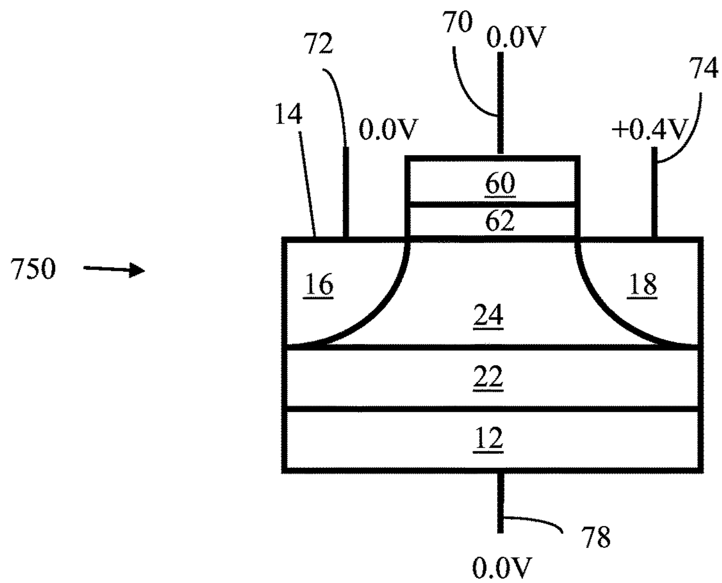
Figure 94D:
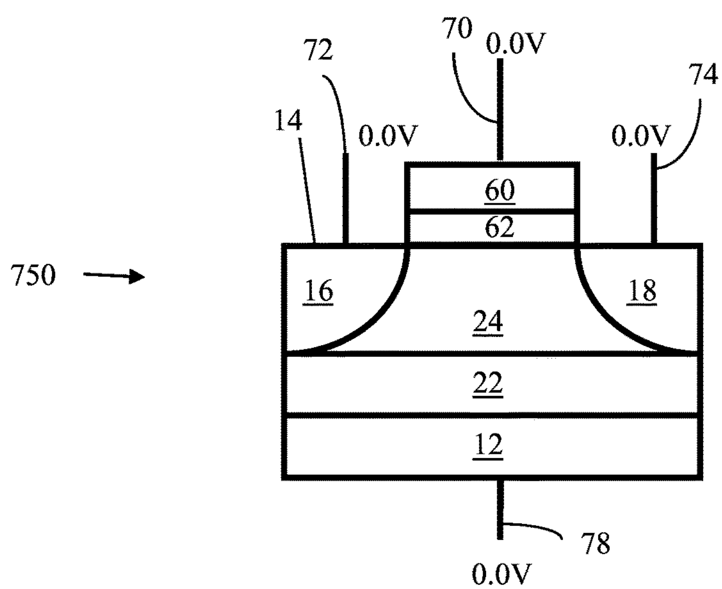

FIGS. 94B-94D illustrate bias conditions on unselected memory cells during the exemplary read operation described with regard to FIG. 93, according to an embodiment of the present invention.

Figure 95:
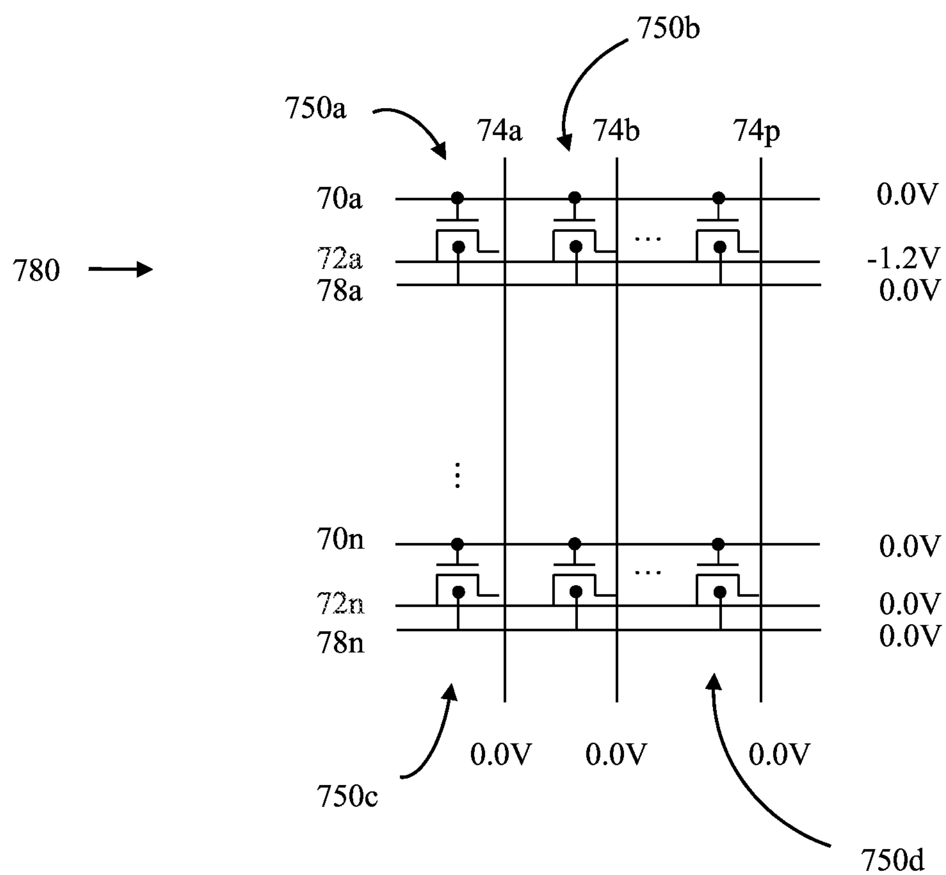

FIG. 95 schematically illustrates and example of a write "0" operation of a cell according to an embodiment of the present invention.

Figure 96A:
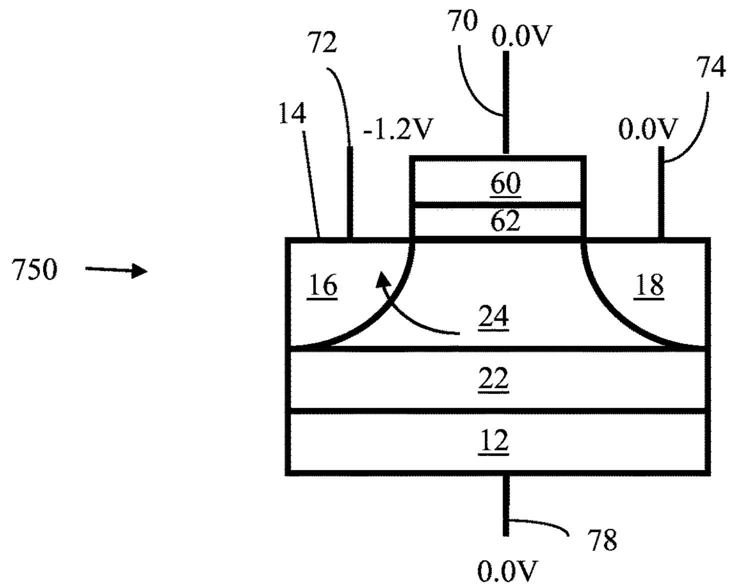
Figure 96B:
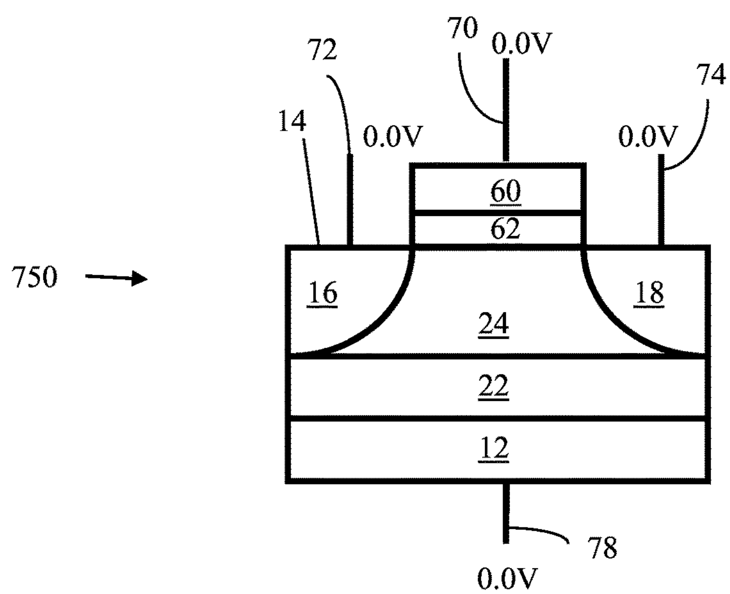

FIGS. 96A-96B show an example of bias conditions of selected and unselected memory cells during a write "0" operation according to an embodiment of the present invention.

Figure 97:
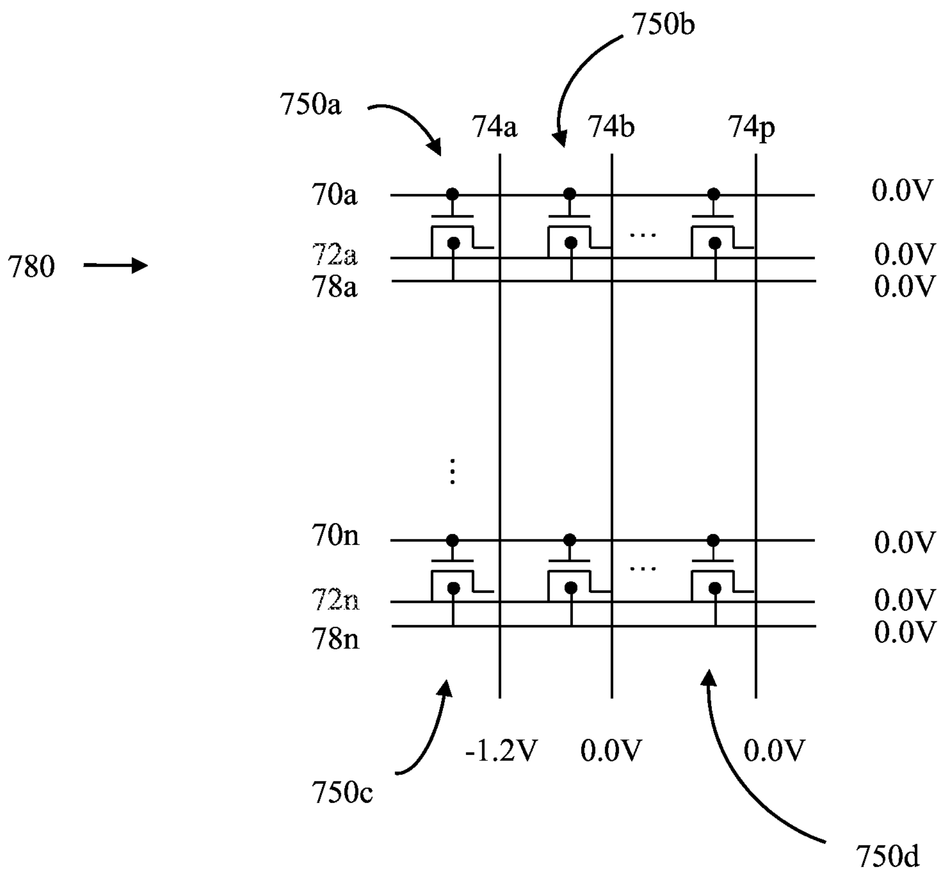

FIG. 97 illustrates bias conditions for cells in an array during a write "0" operation in which all memory cells sharing the same BL terminal are written into state "0" according to an embodiment of the present invention.

Figure 98:
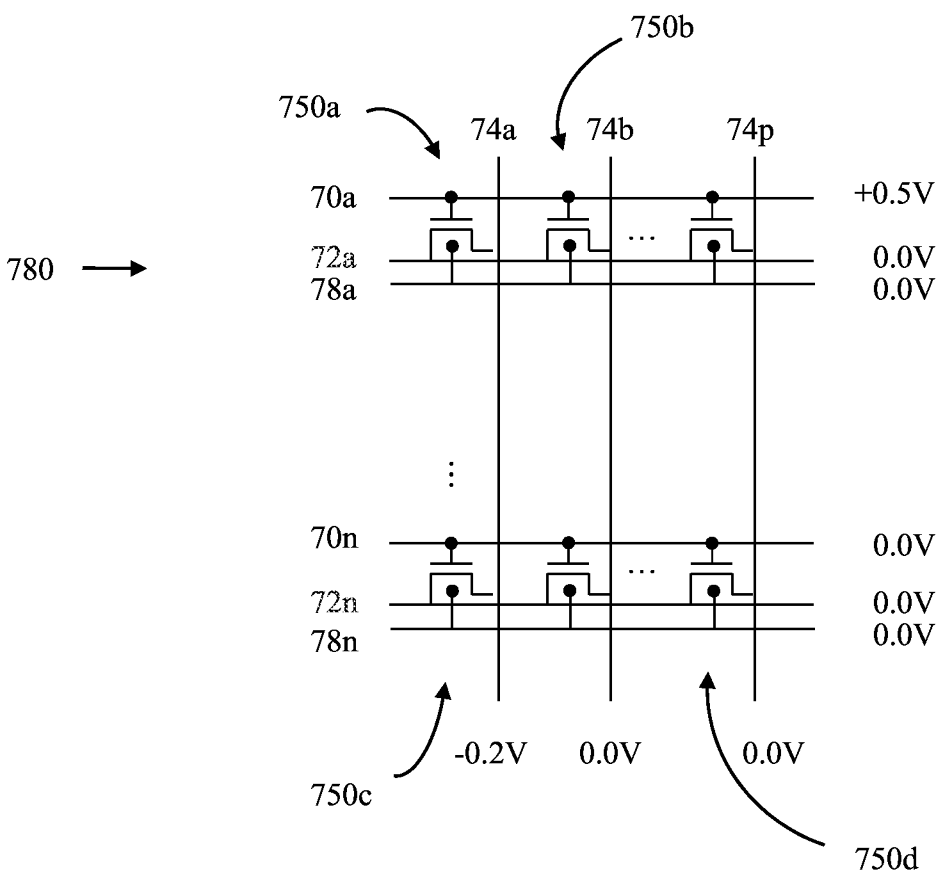

FIG. 98 illustrates bias conditions for selected and unselected memory cells of a memory array for a write "0" operation according to an alternative embodiment of the present invention.

Figure 99A:
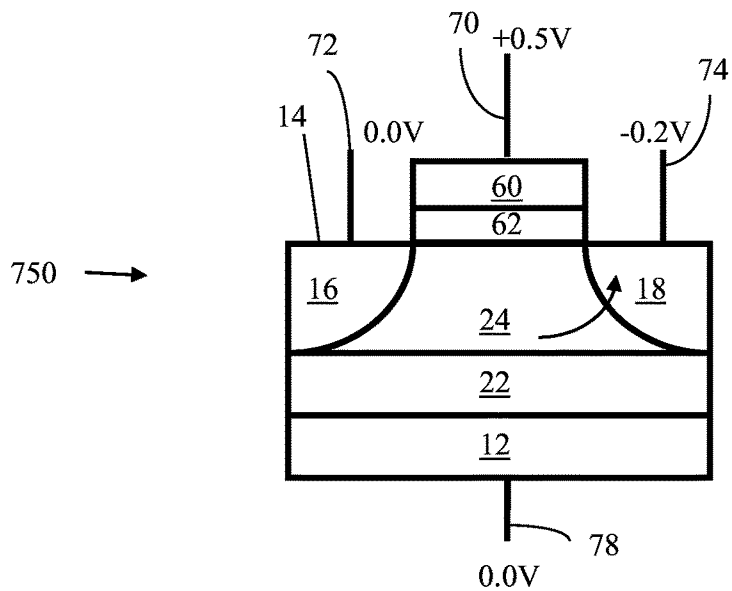

FIG. 99A illustrates bias conditions of the selected memory cell under the write "0" operation described with regard to the example of FIG. 98.

Figure 99B:
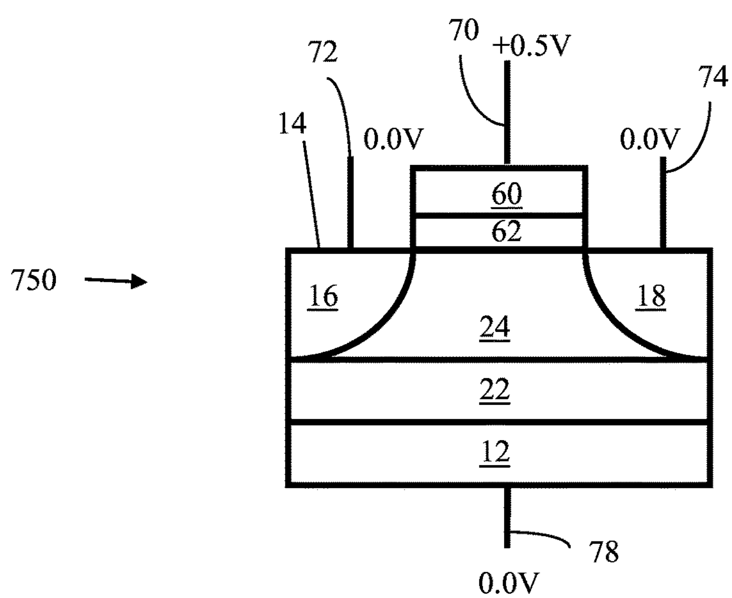
Figure 99C:
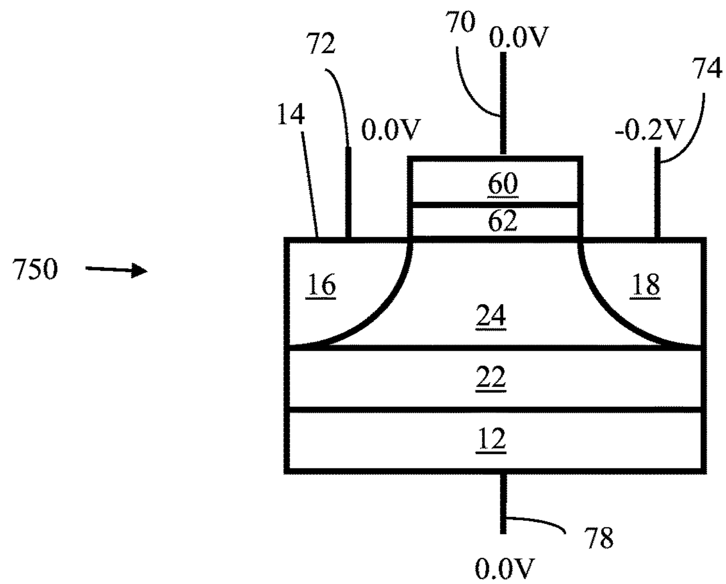
Figure 99D:
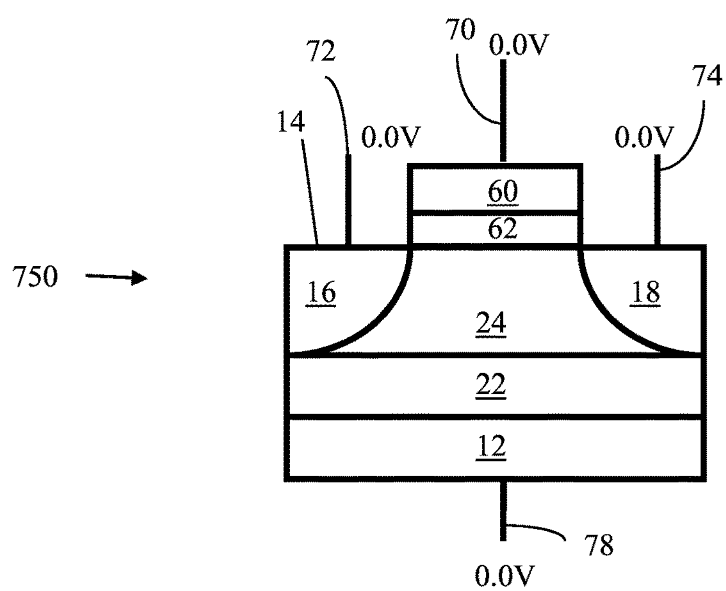

FIGS. 99B-99D illustrate examples of bias conditions on the unselected memory cells during write "0" operations described with regard to the example shown in FIG. 98.

Figure 100:
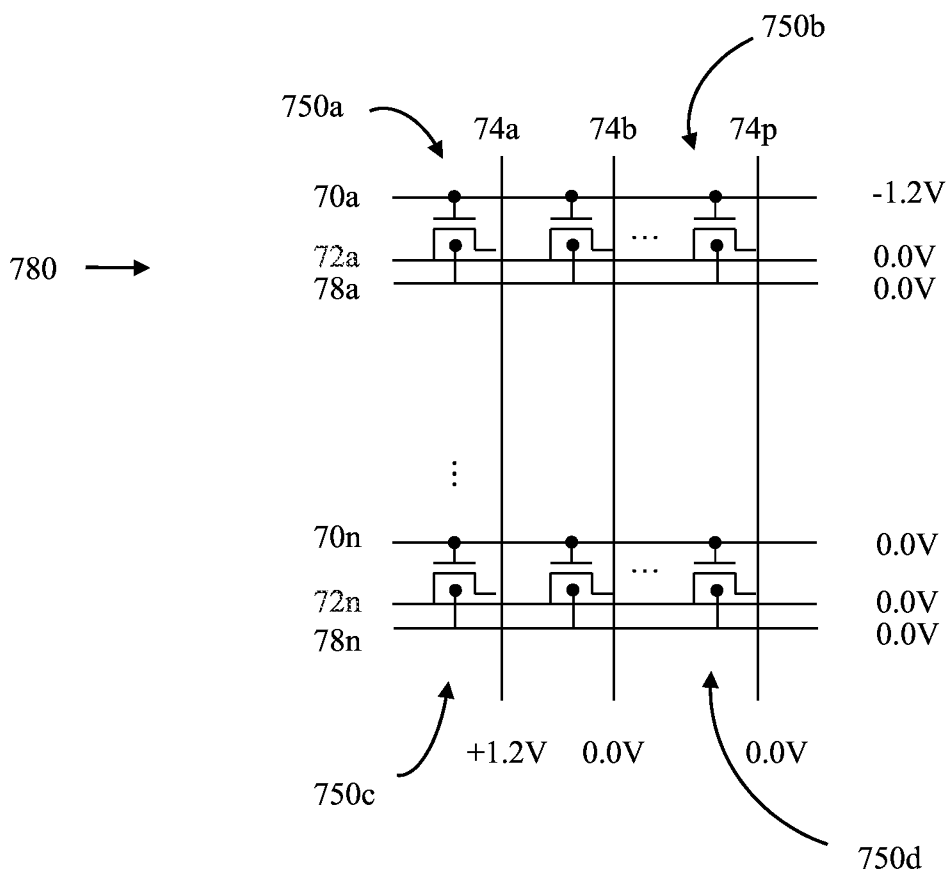
Figure 101A:
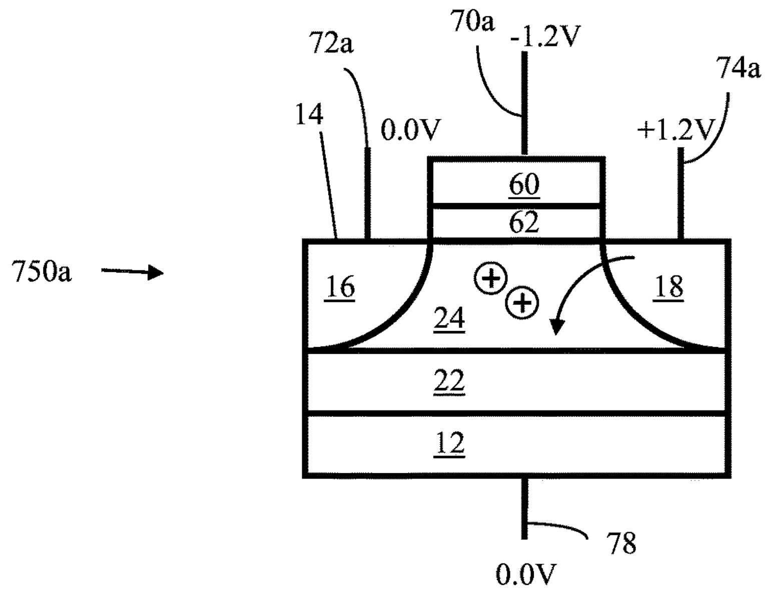

FIGS. 100 and 101A illustrate an example of the bias conditions of a selected memory cell under a write "1" operation using band-to-band tunneling according to an embodiment of the present invention.

Figure 101B:
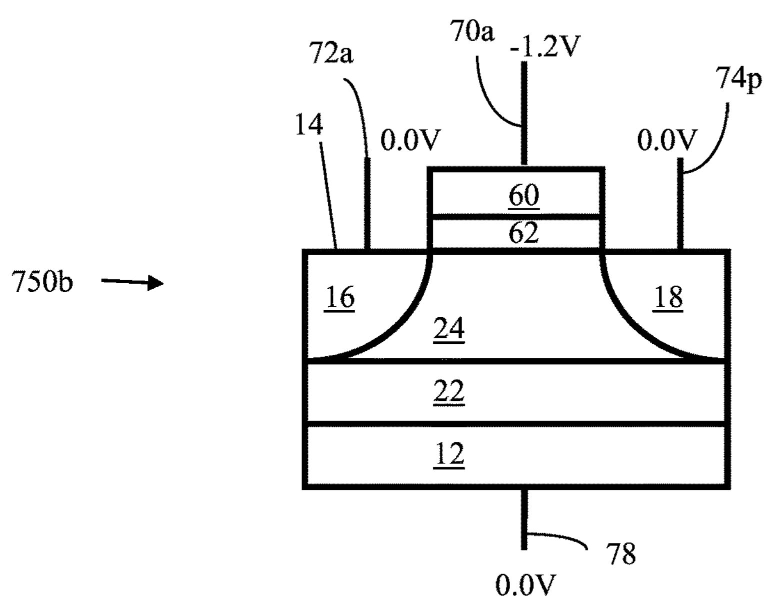
Figure 101C:
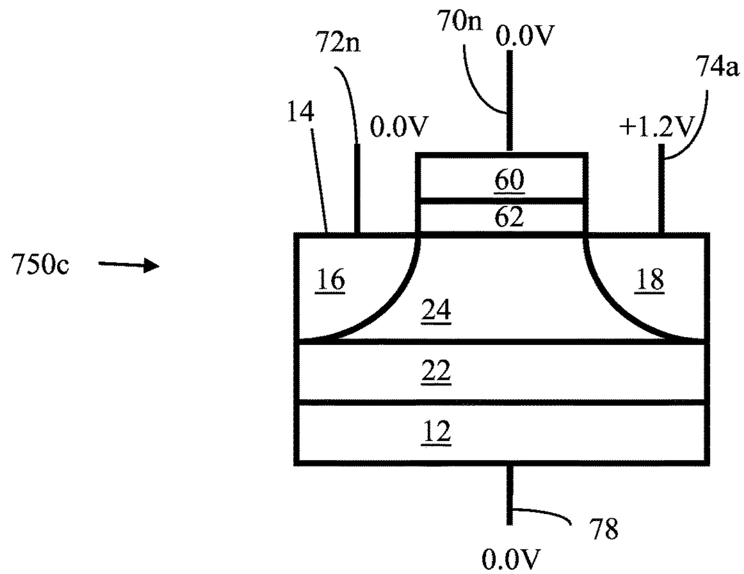
Figure 101D:
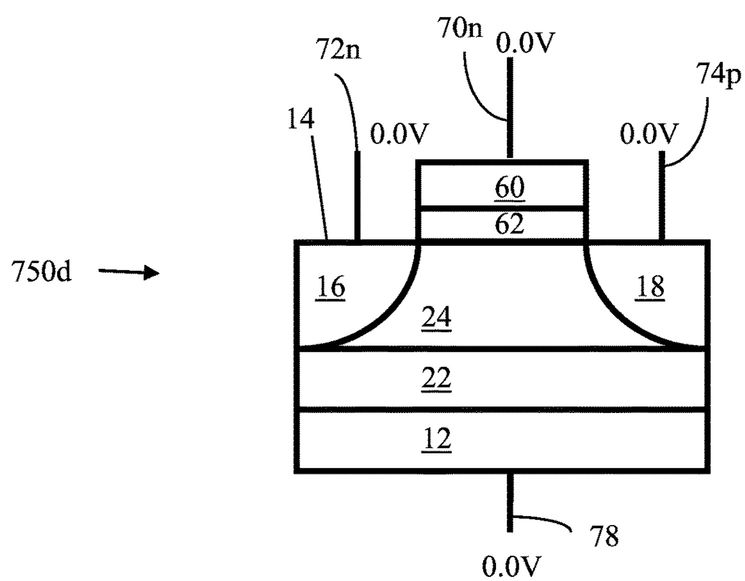

FIGS. 101B-101D show examples of bias conditions of the unselected memory cells during write "1" operations of the type described with regard to FIG. 100.

Figure 102:
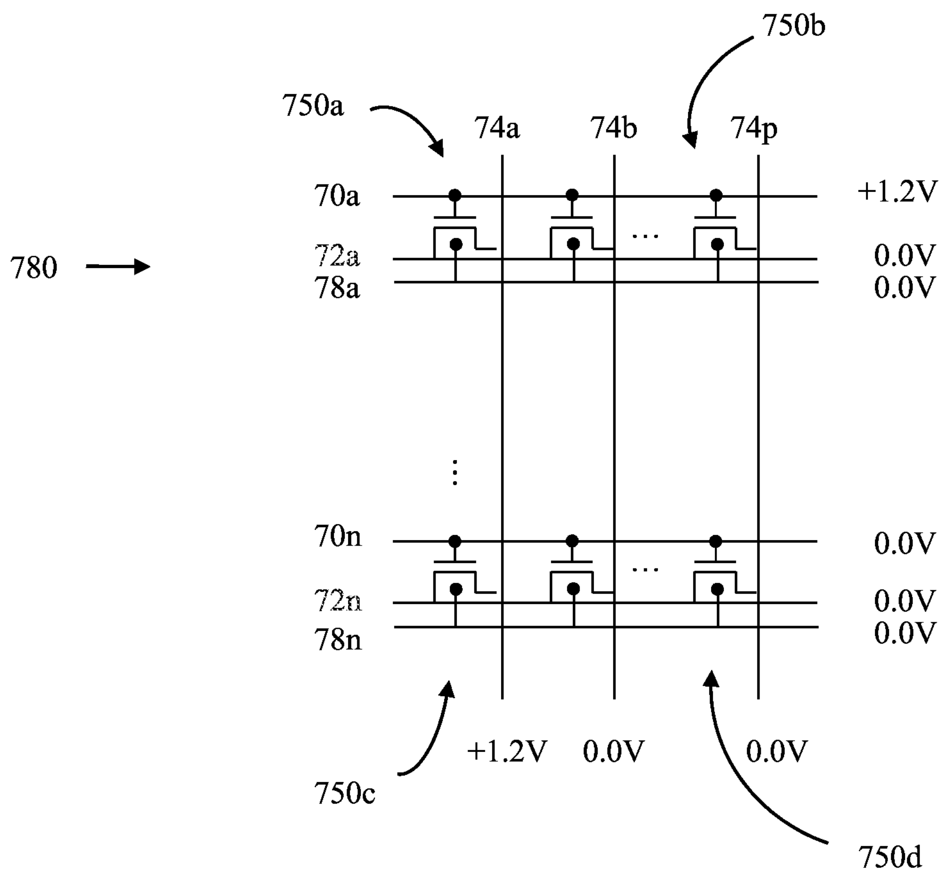

FIG. 102 schematically illustrates bias conditions on memory cells during a write "1" operation using impact ionization according to and embodiment of the present invention.

FIGS. 103A-103D and 104 illustrate an example of the bias conditions of the selected memory cell 750 under a write "1" operation using an impact ionization write "1" operation according to an embodiment of the present invention.

Figure 105:
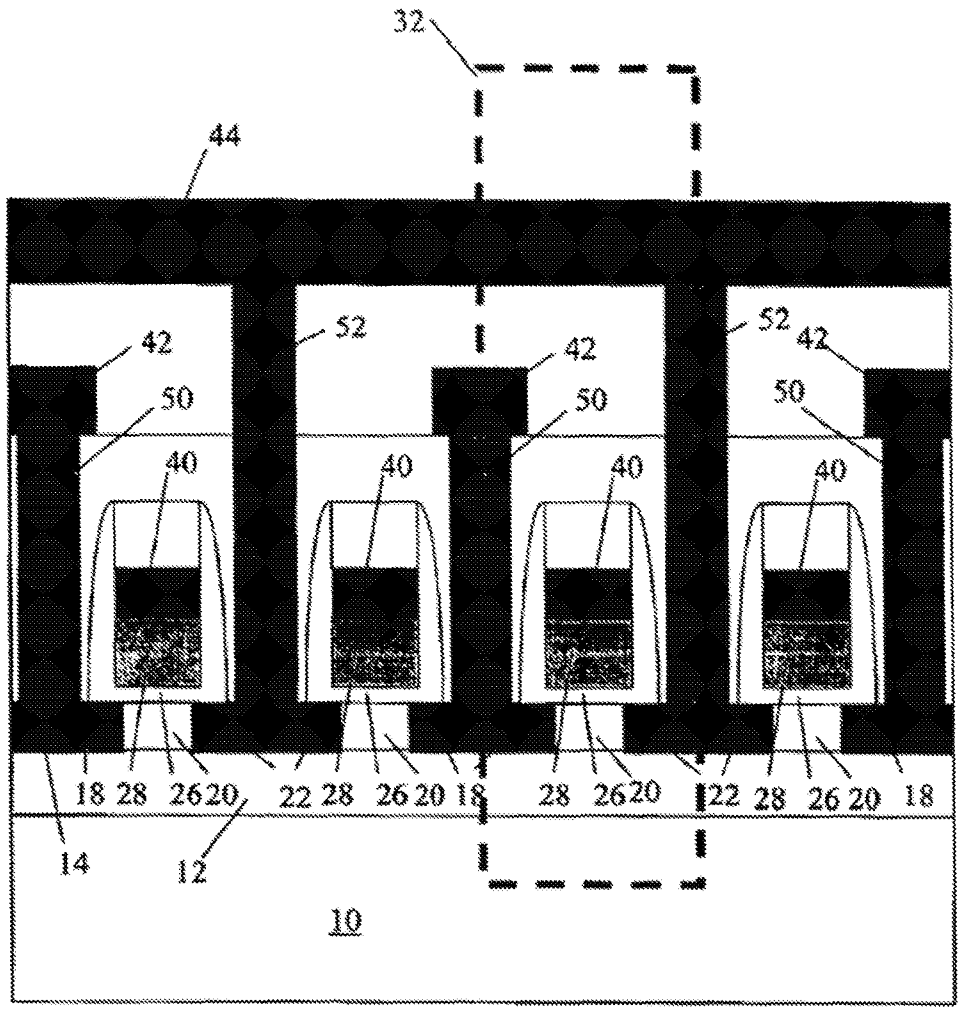

FIG. 105 illustrates a prior art arrangement in which adjacent memory cells share common contacts.

Figure 106A:
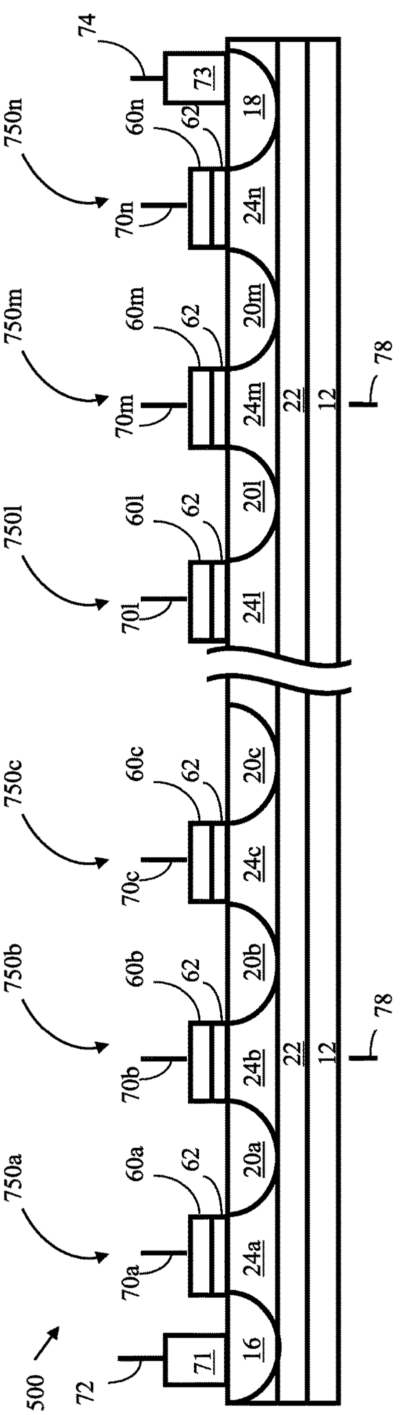

FIG. 106A shows a cross-sectional schematic illustration of a memory string according to an embodiment of the present invention.

Figure 106B:
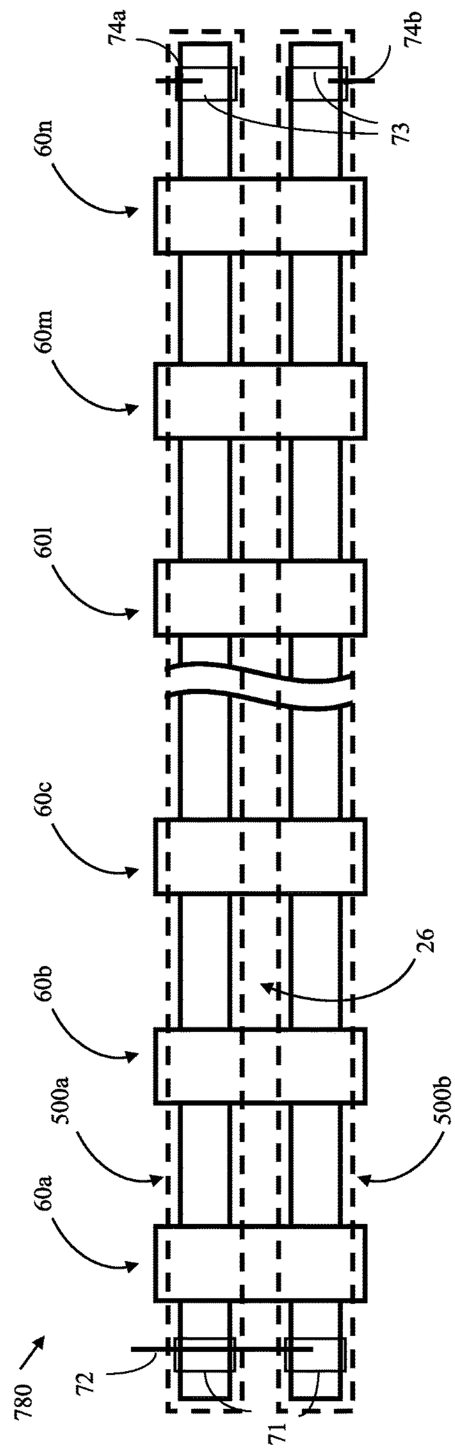

FIG. 106B shows a top view schematic illustration of a memory cell array including two strings of memory cells between the SL terminal and BL terminal according to an embodiment of the present invention.

Figure 107:
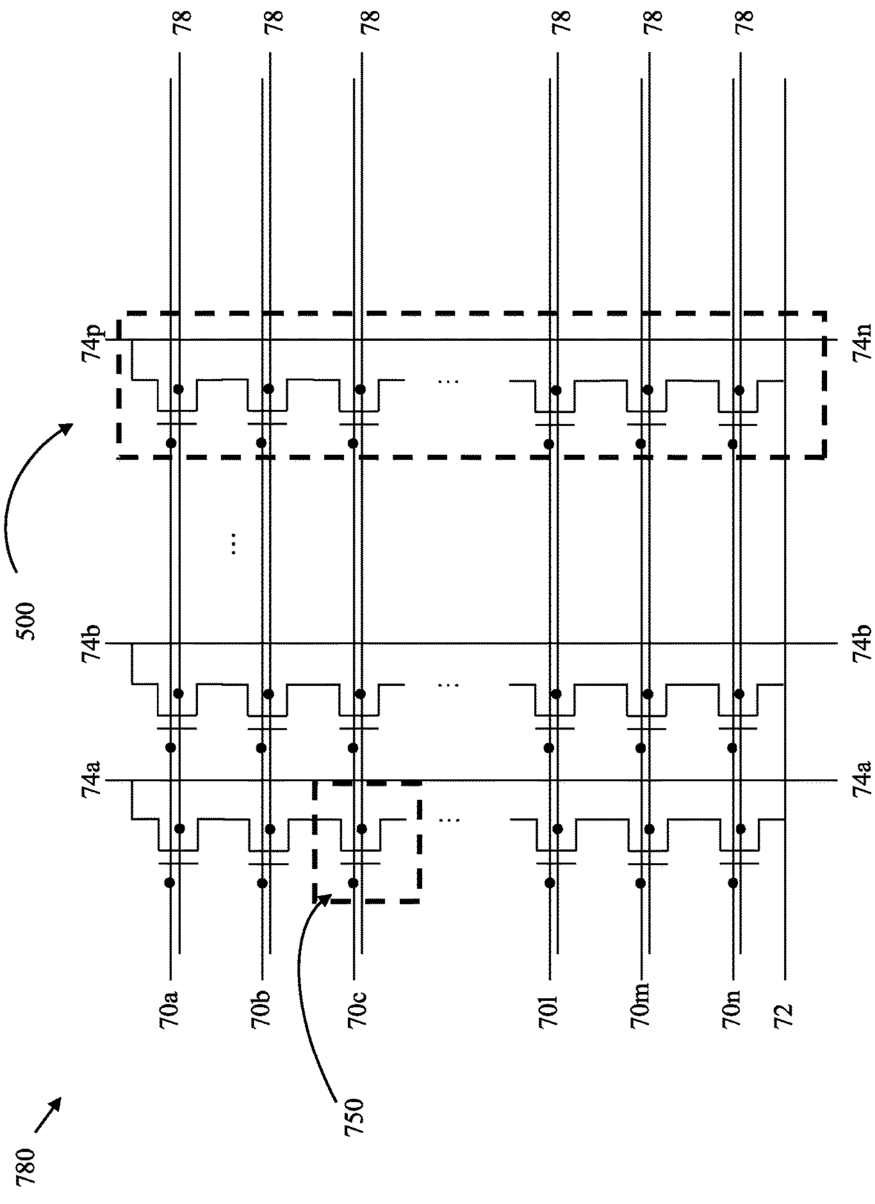

FIG. 107 shows an equivalent circuit representation of the memory array of FIG. 106B.

Figure 108:
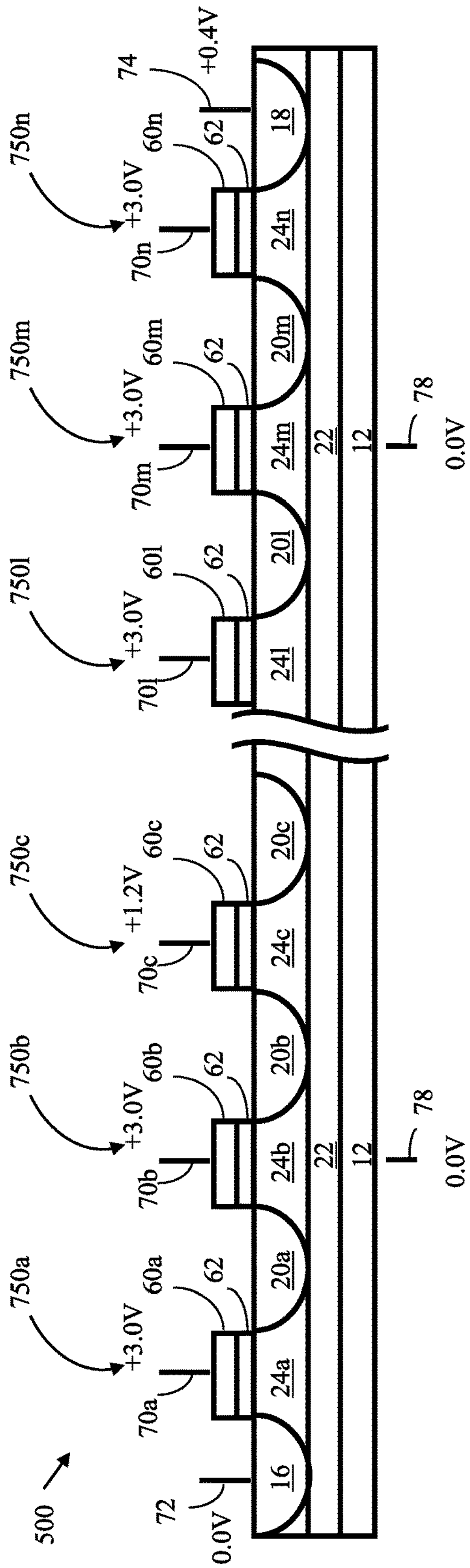
Figure 109A:
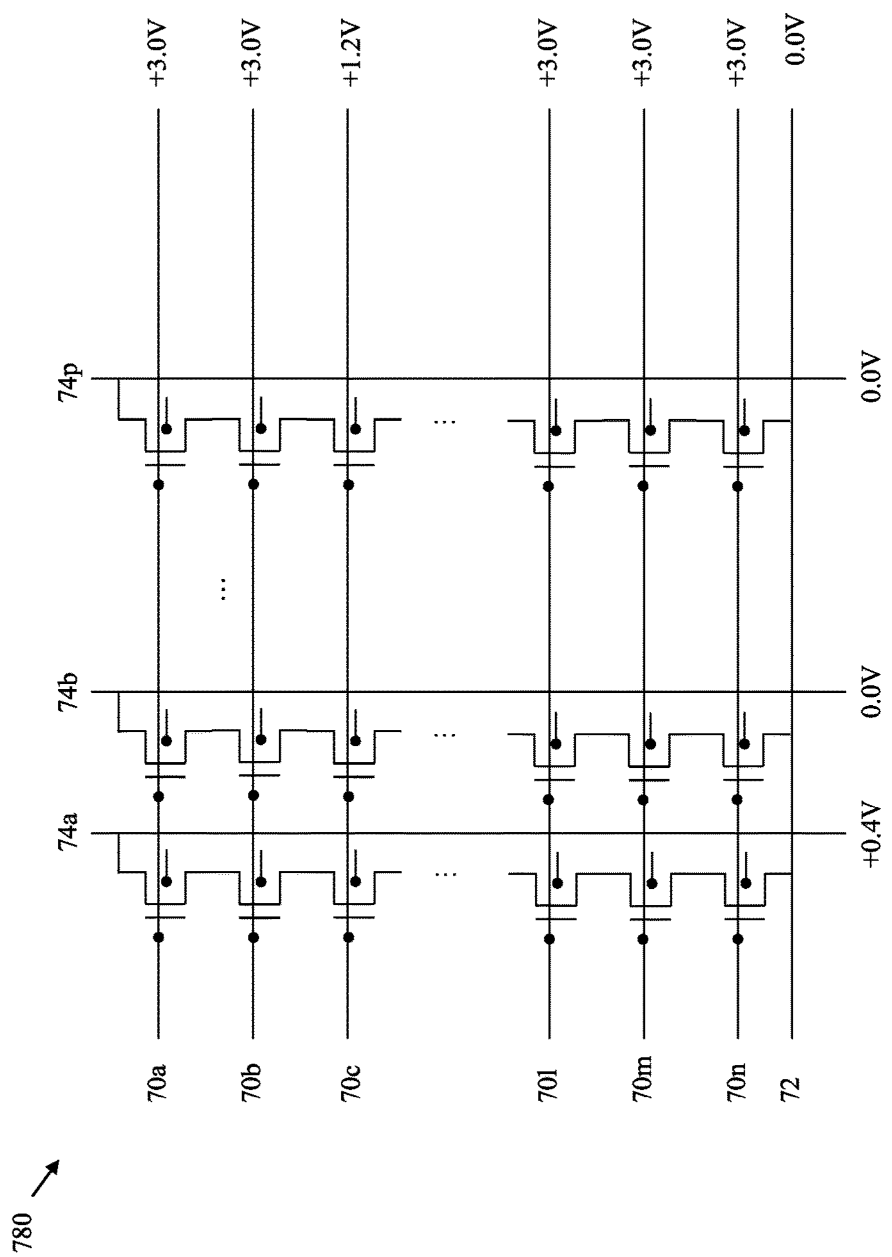
Figure 109B:
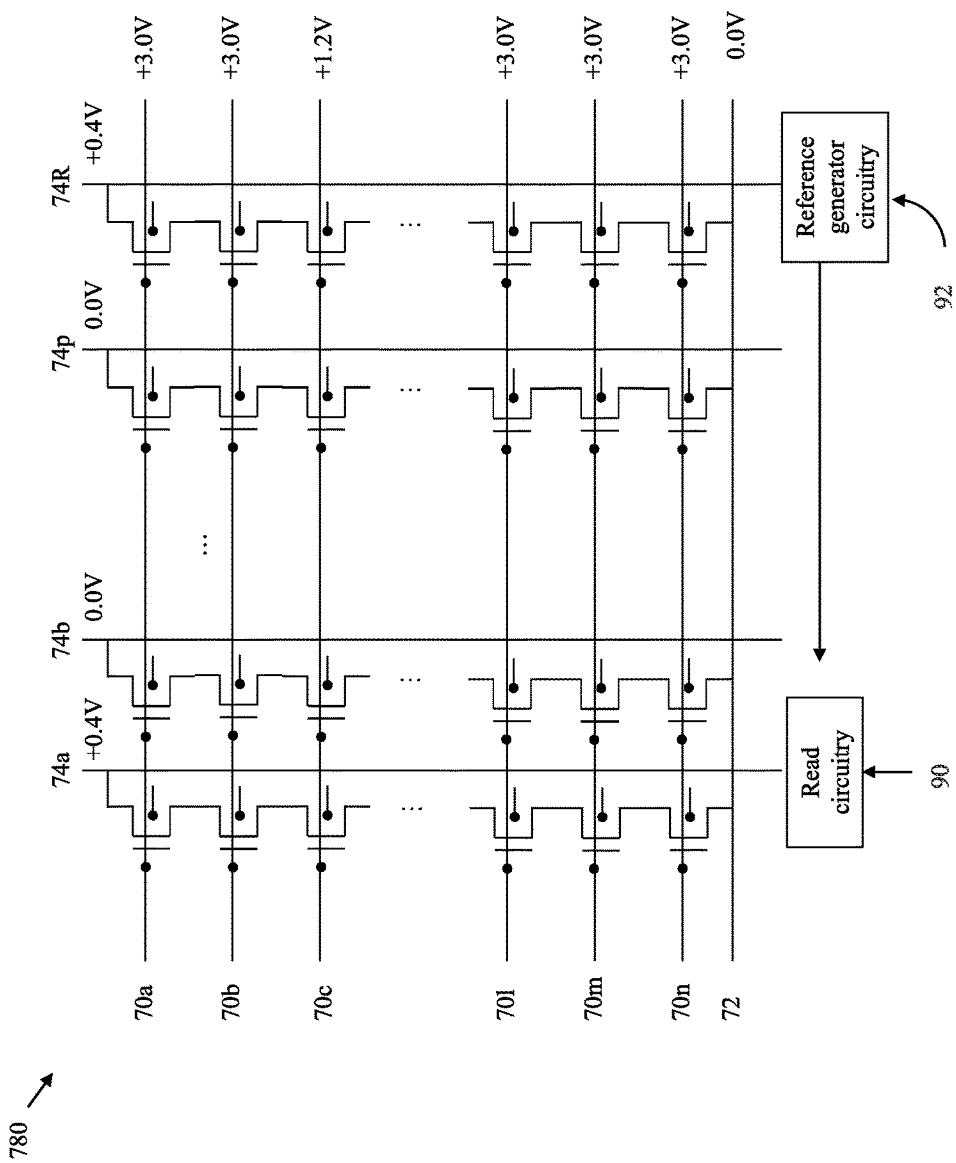

FIGS. 108 and 109A-109B illustrate bias conditions during a read operation according to an embodiment of the present invention.

Figure 110:
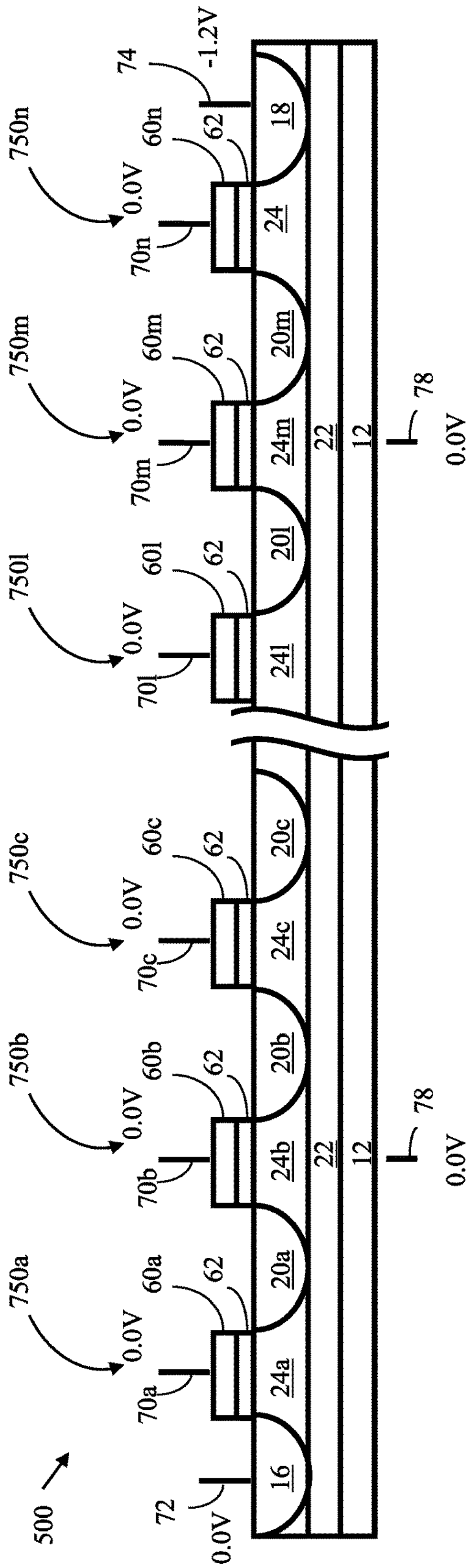
Figure 111:
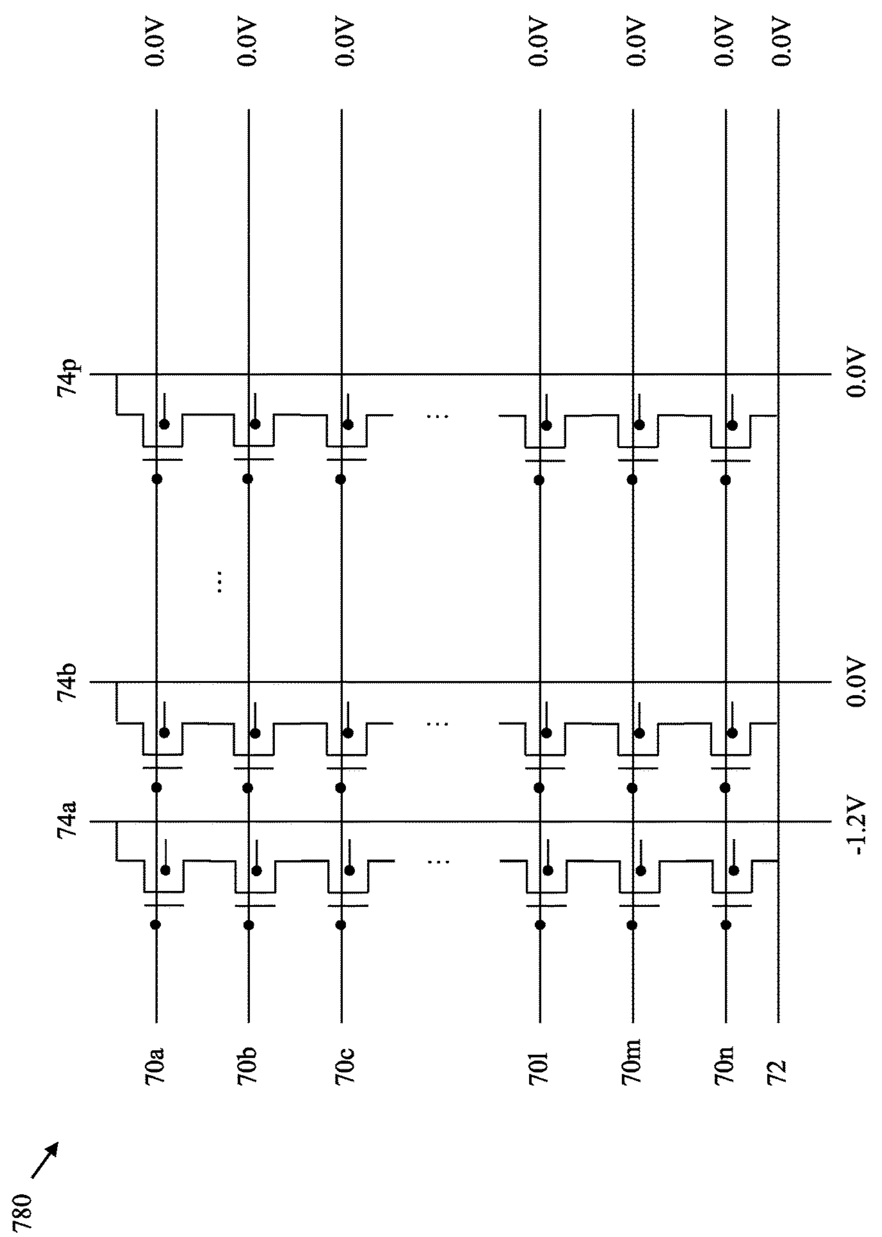

FIGS. 110-111 illustrate bias conditions during a write "0" operation according to an embodiment of the present invention.

Figure 112A:
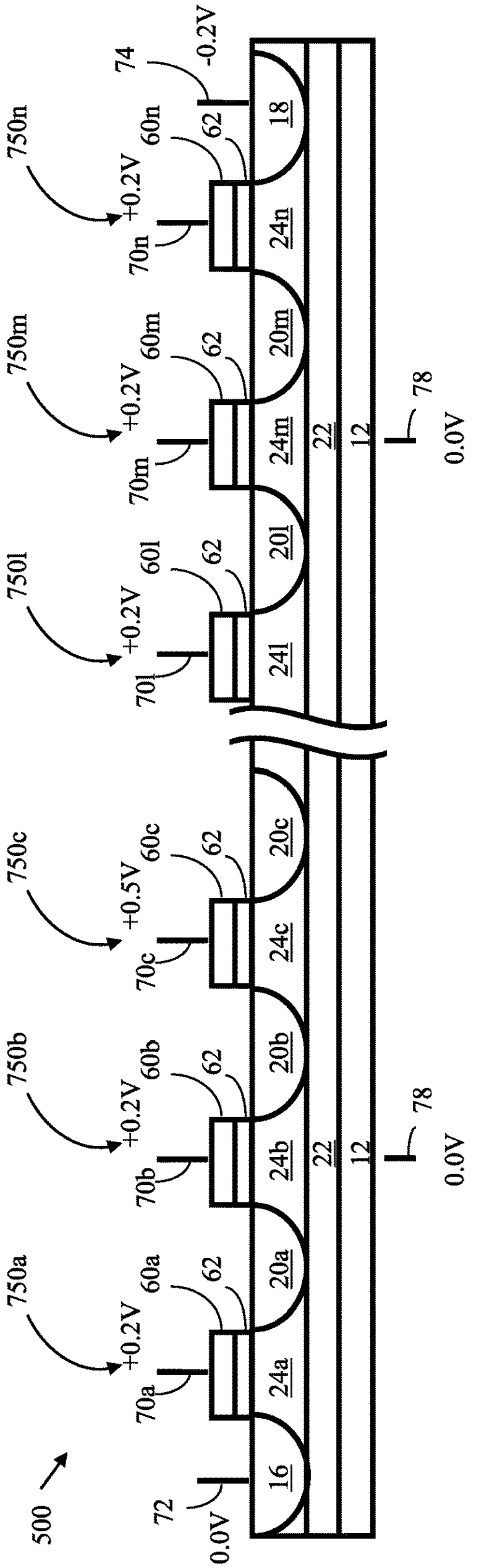
Figure 112B:
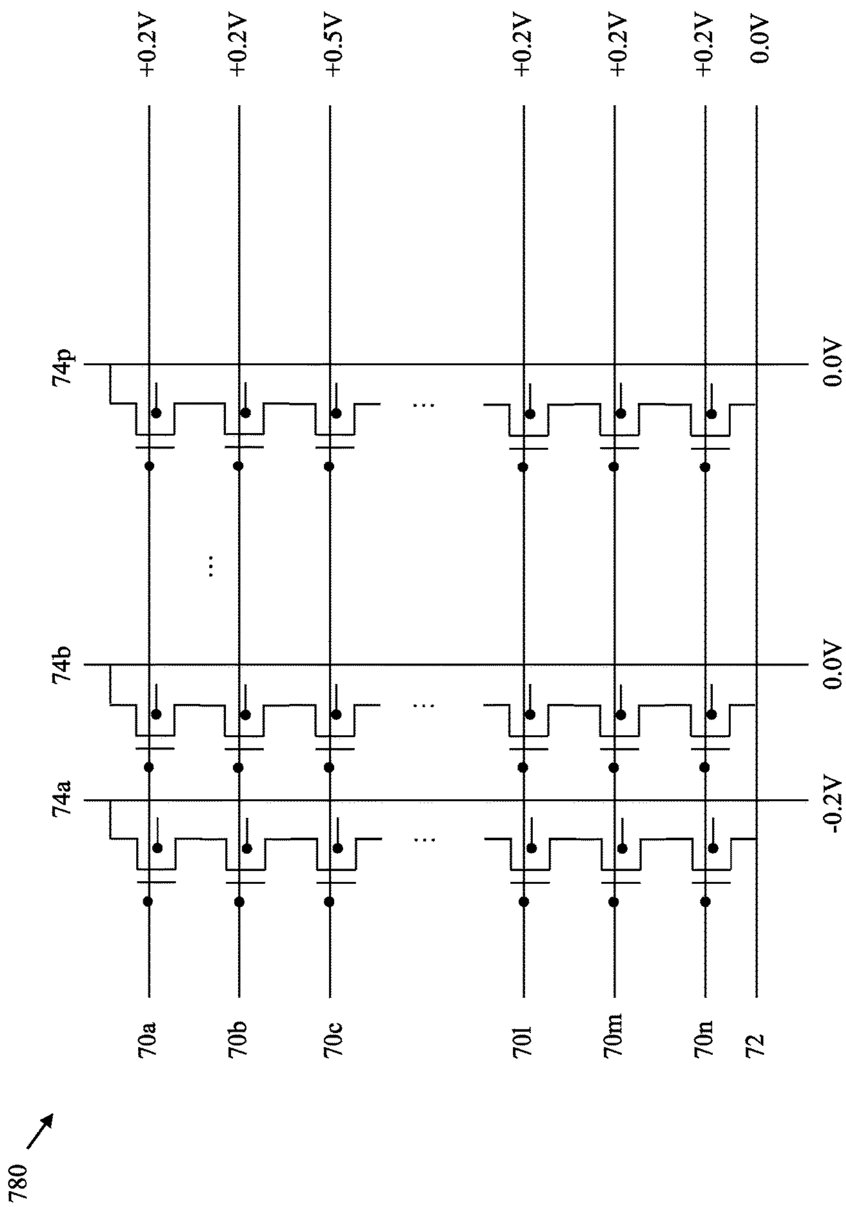

FIGS. 112A-112B illustrate bias conditions during a write "0" operation that allows for individual bit writing according to an embodiment of the present invention.

Figure 113A:
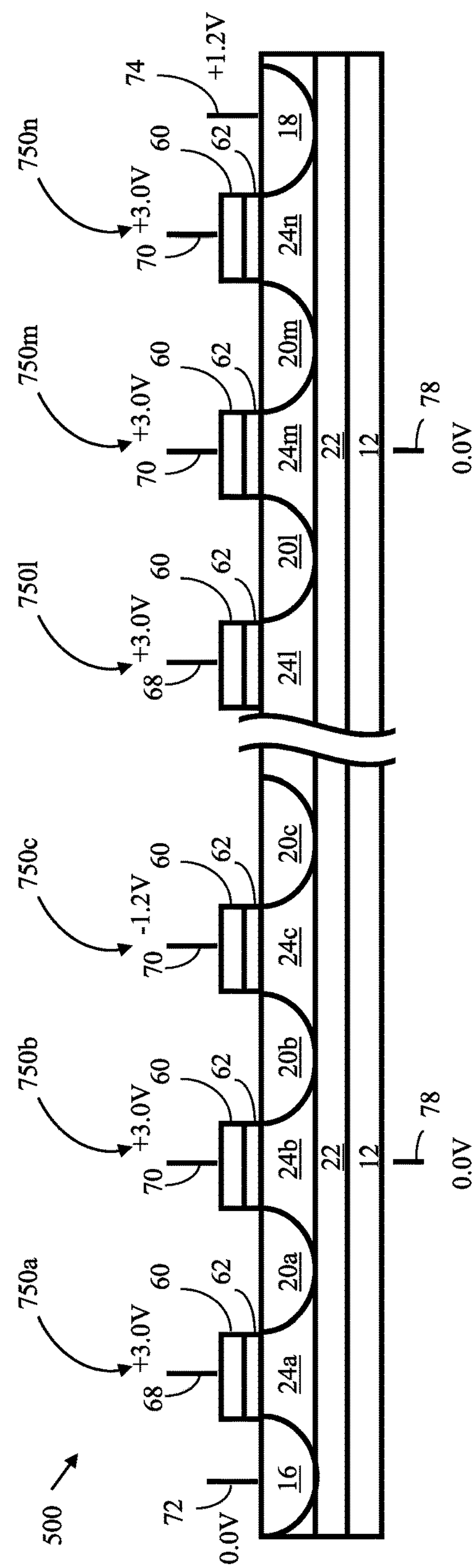
Figure 113B:
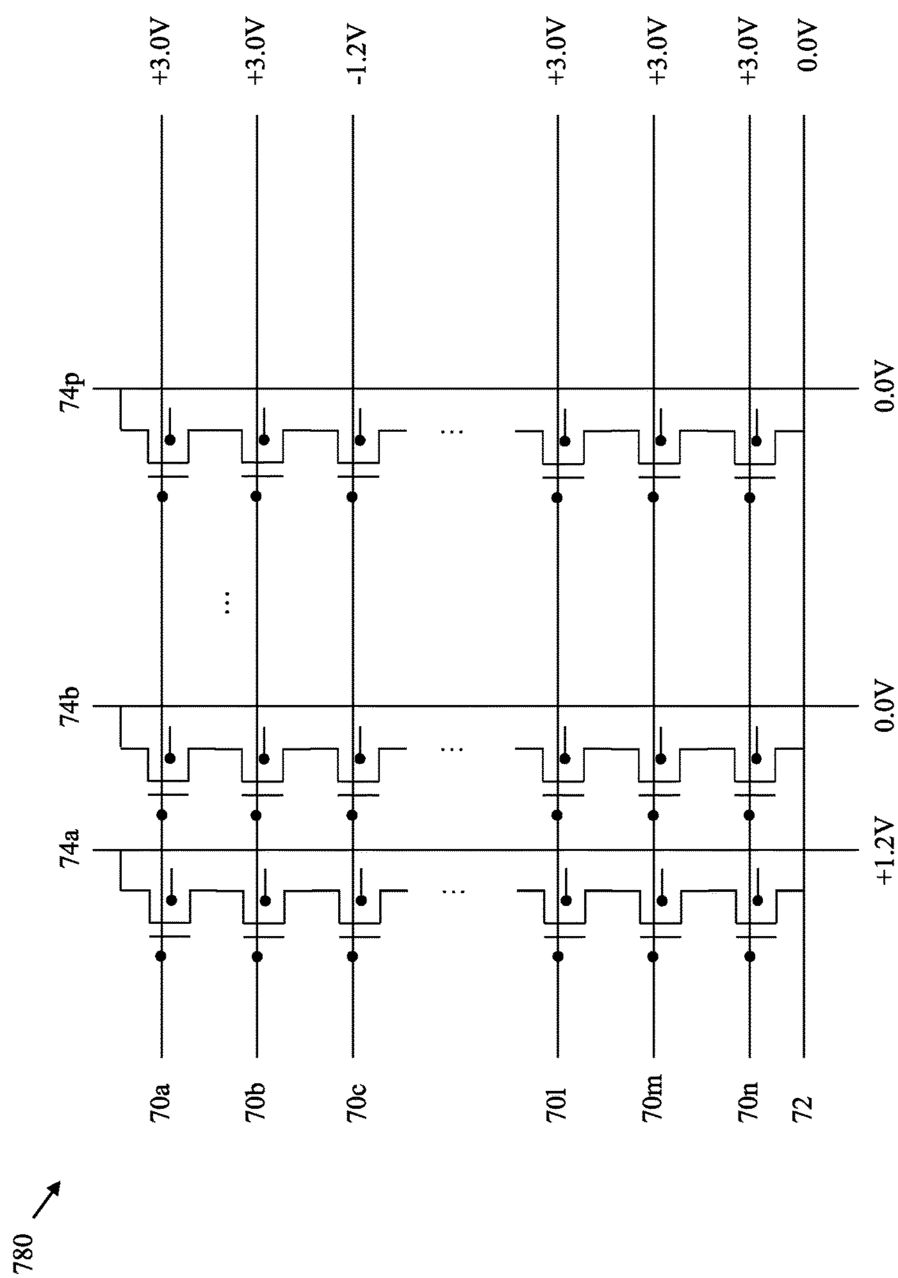

FIGS. 113A-113B illustrate bias conditions during a band-to-band tunneling write "1" operation according to an embodiment of the present invention.

Figure 114A:
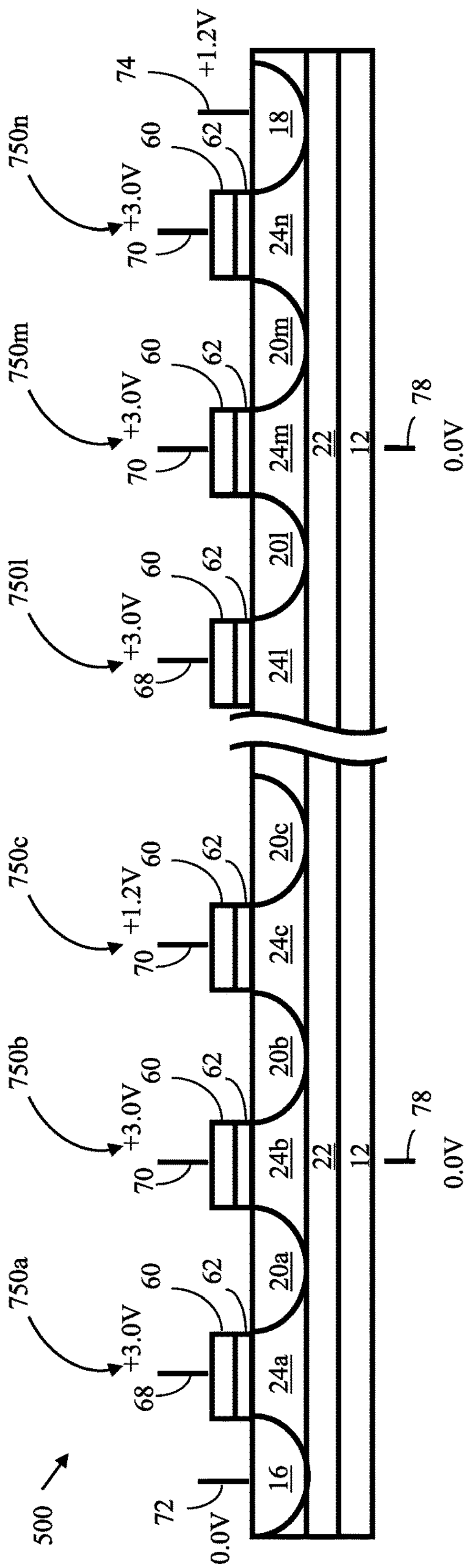
Figure 114B:
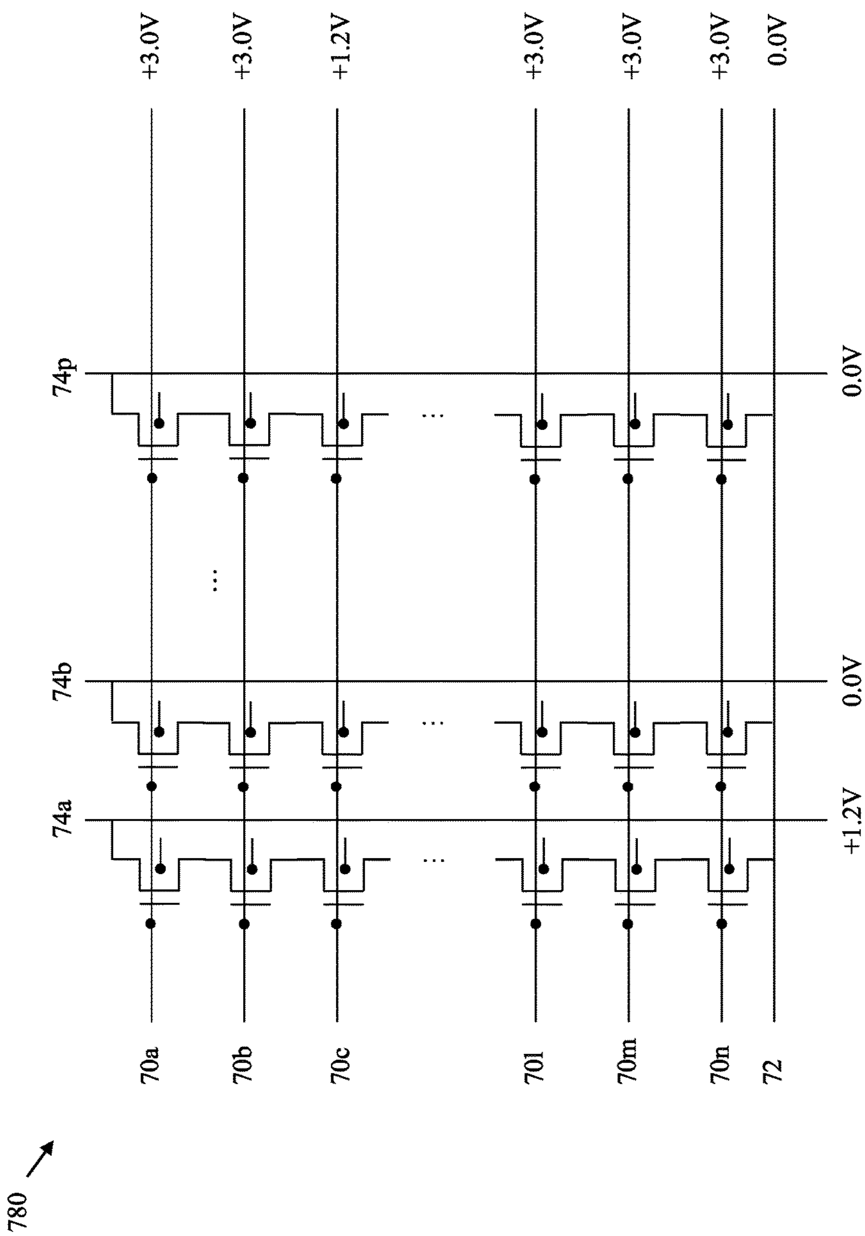

FIGS. 114A-114B illustrate bias conditions during an impact ionization write "1" operation according to an embodiment of the present invention.

Figure 115A:
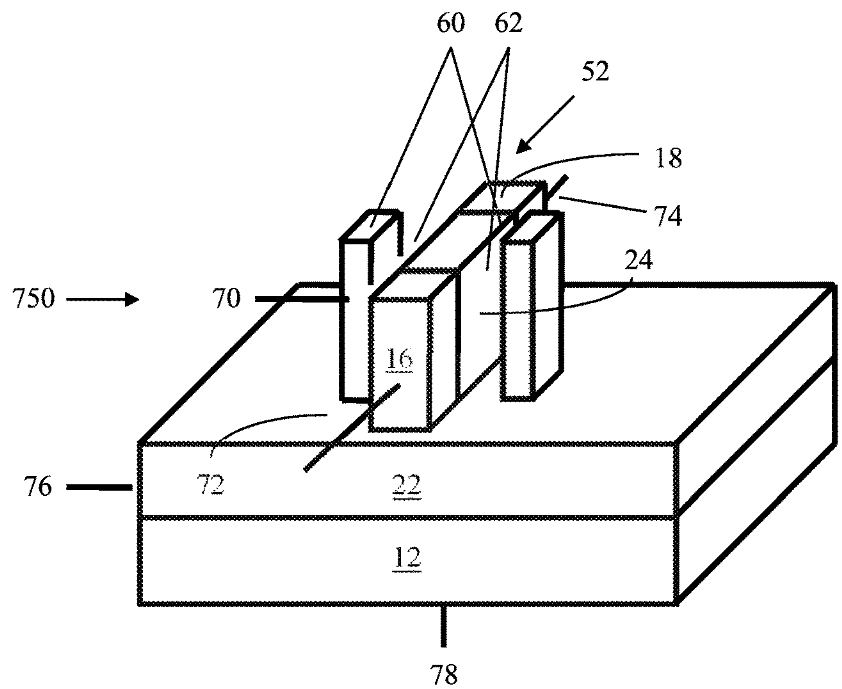

FIG. 115A schematically illustrates a fin-type, three-dimensional memory cell according to an embodiment of the present invention.

Figure 115B:
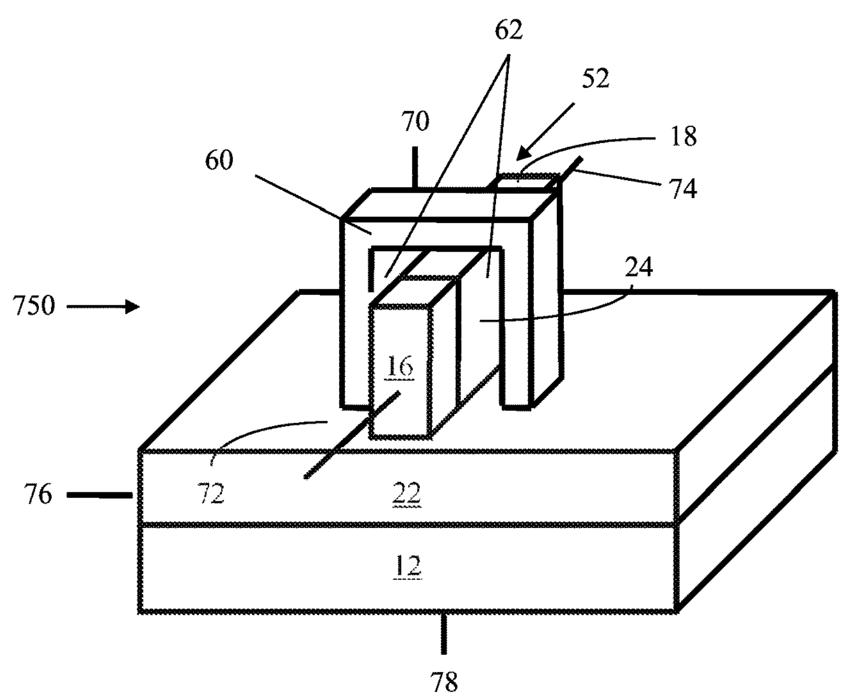

FIG. 115B schematically illustrates a fin-type, three-dimensional memory cell according to another embodiment of the present invention.

Figure 116A:
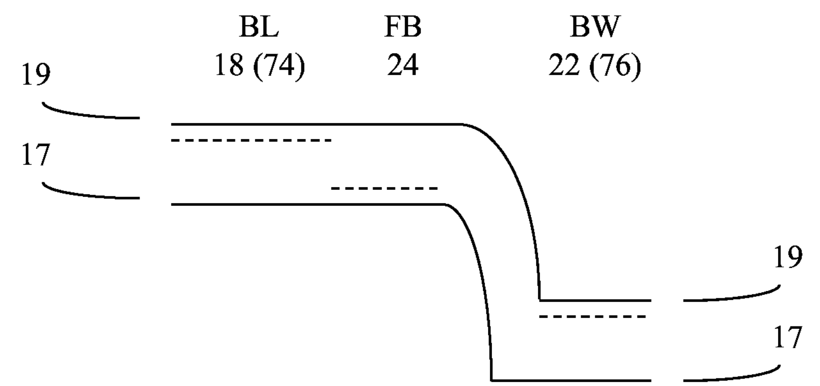

FIG. 116A shows an energy band diagram of the intrinsic n-p-n bipolar device of the cell of FIG. 23 when the floating body region is positively charged and a positive bias voltage is applied to the buried well region according to an embodiment of the present invention.

Figure 116B:
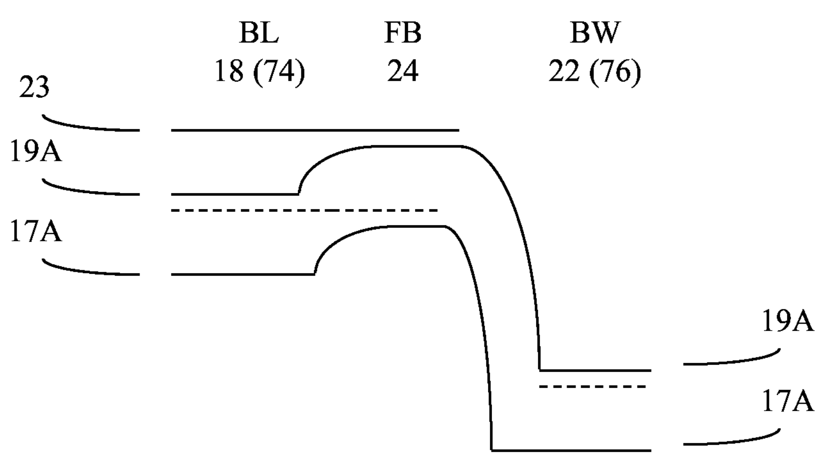

FIG. 116B shows an energy band diagram of the intrinsic n-p-n bipolar device of the cell of FIG. 23 when the floating body region 24 is neutrally charged and a bias voltage is applied to the buried well region according to an embodiment of the present invention.

Figure 117:
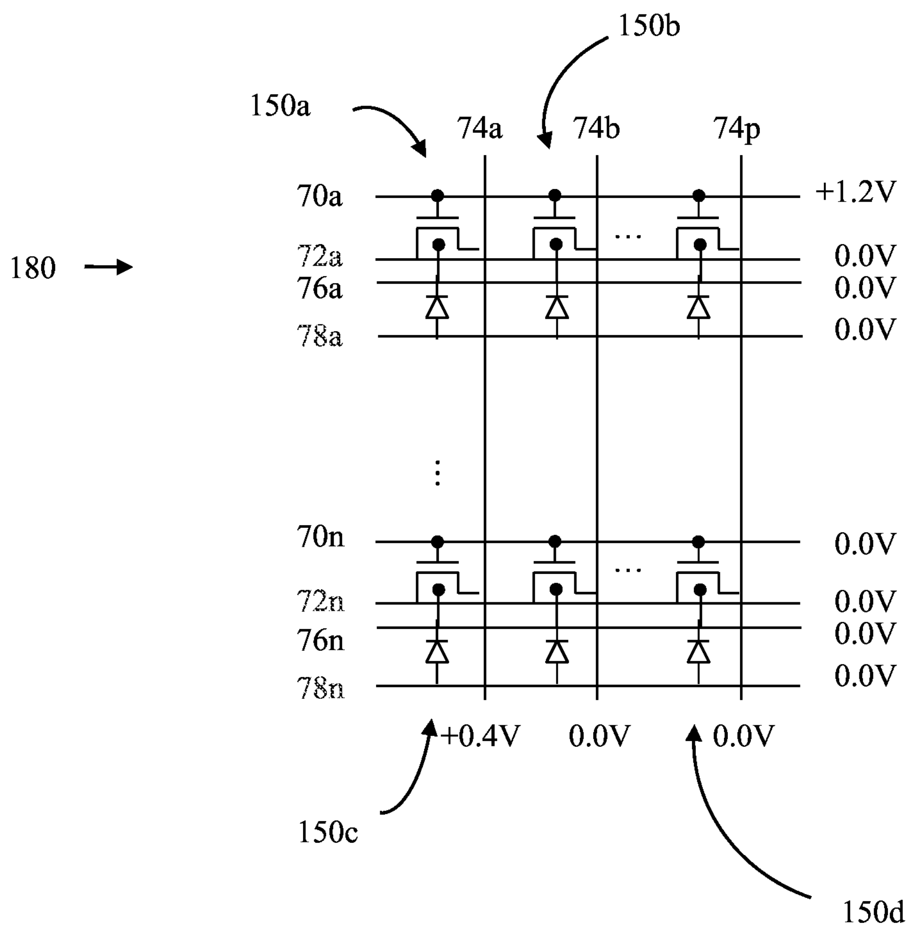

FIG. 117 schematically illustrates bias conditions on memory cells during a read operation of a selected memory cell according to an embodiment of the present invention.

Figure 118:
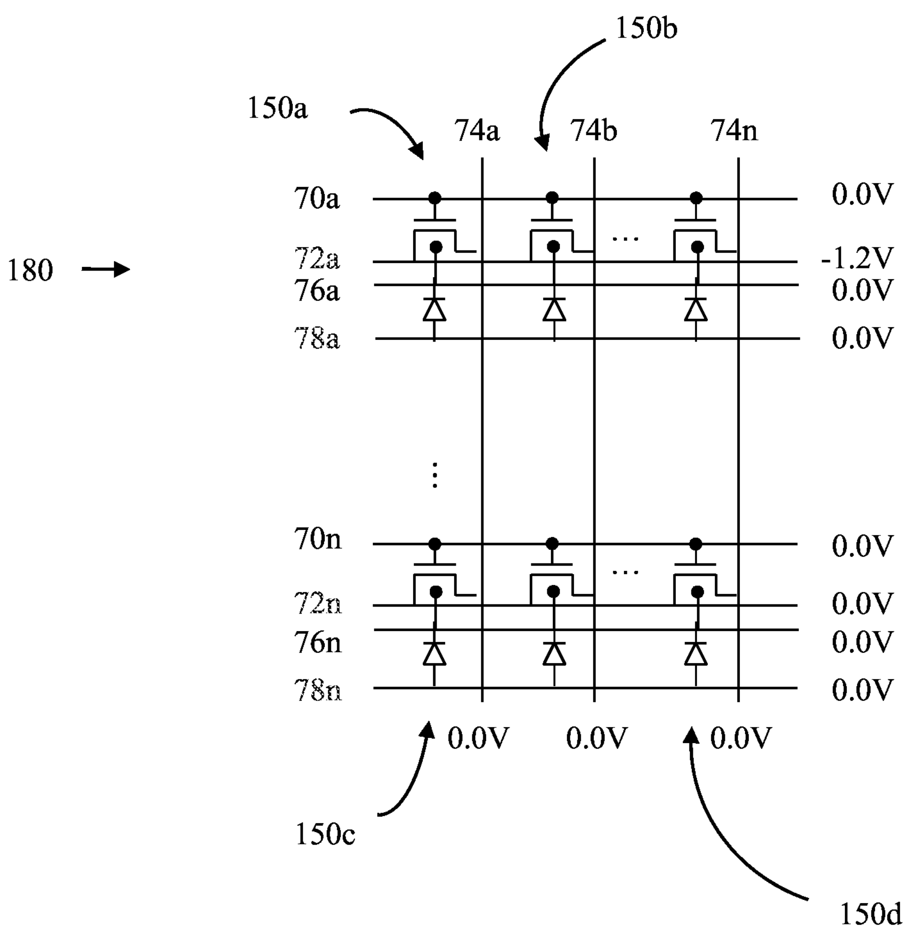

FIG. 118 schematically illustrates bias conditions on memory cells during a write "0" operation according to an embodiment of the present invention.

Figure 119:
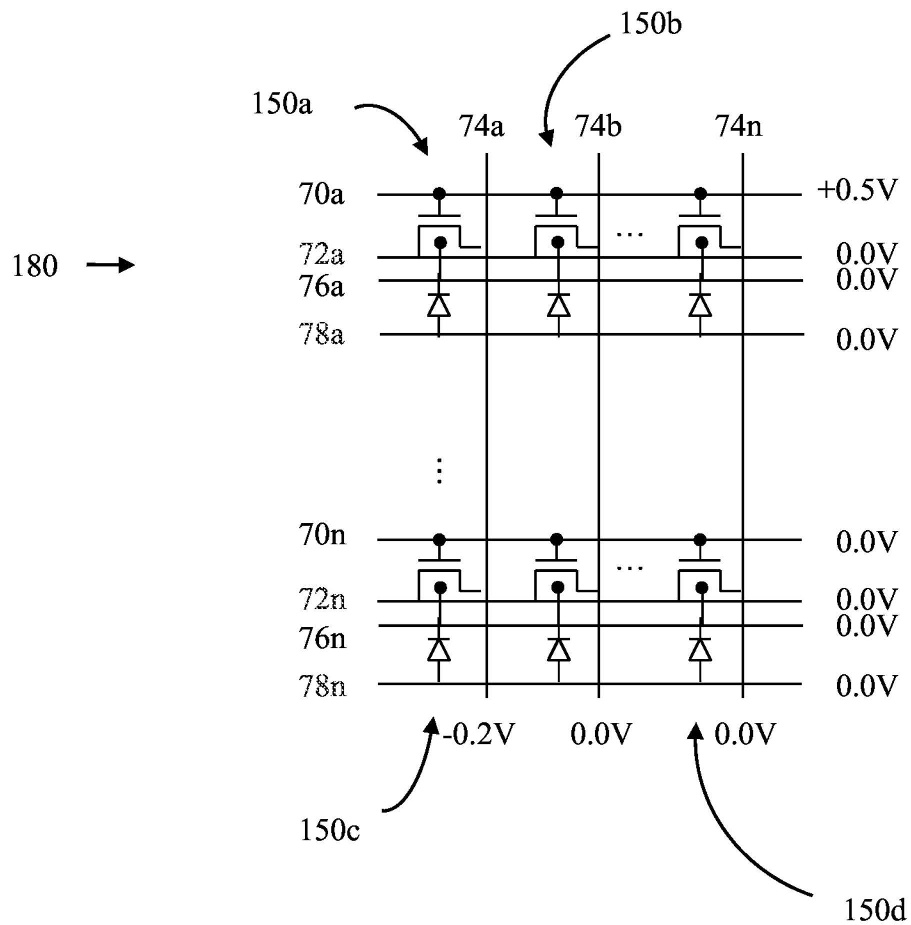

FIG. 119 schematically illustrates bias conditions on memory cells during a write "0" operation according to another embodiment of the present invention.

Figure 120A:
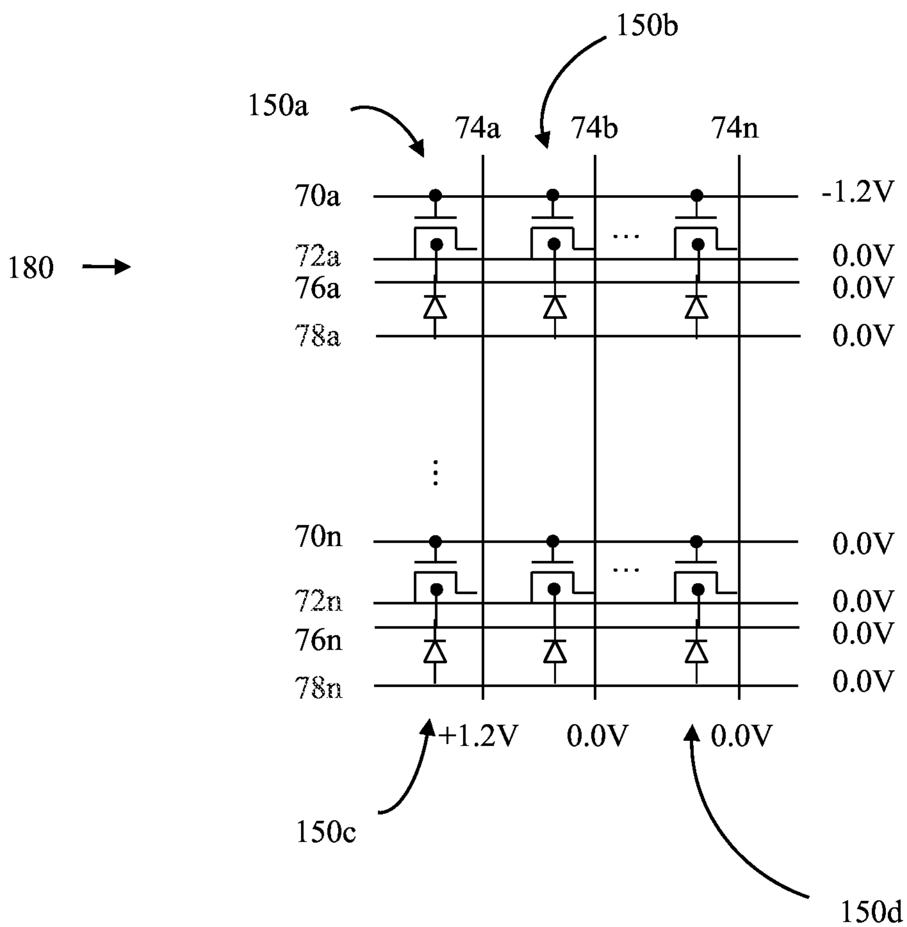

FIG. 120A schematically illustrates an example of bias conditions of a selected memory cell under a band-to-band tunneling write "1" operation according to an embodiment of the present invention.

Figure 120B:
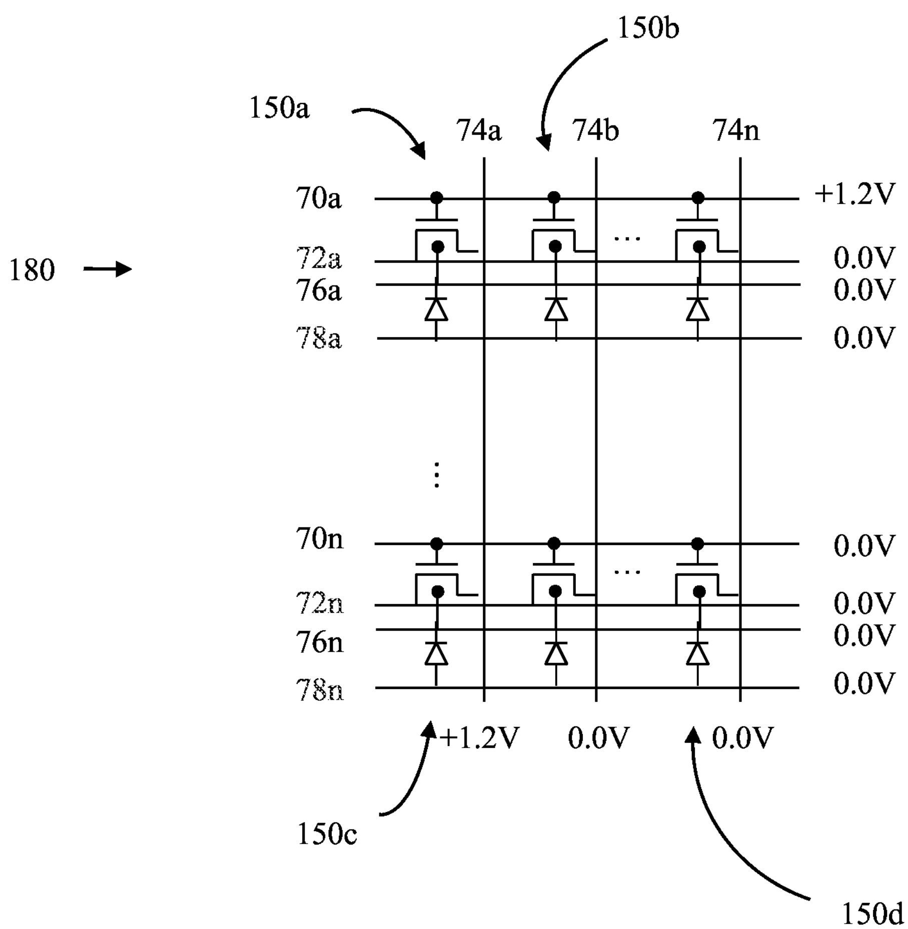

FIG. 120B shows bias conditions of selected and unselected memory cells 150 during an impact ionization write "1" operation according to an embodiment of the present invention.

Figure 121A:
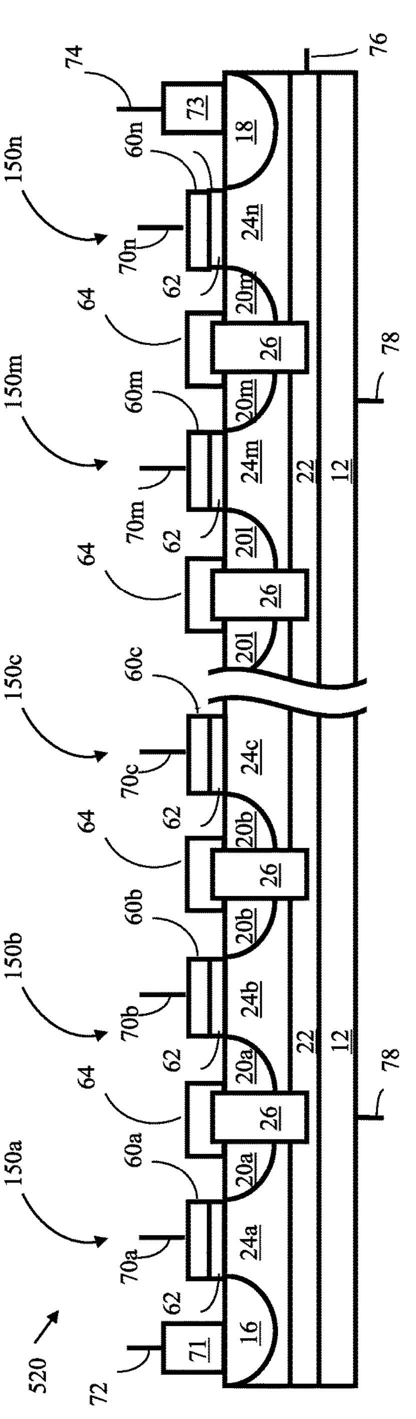

FIG. 121A shows a cross-sectional schematic illustration of a memory string according to an embodiment of the present invention.

Figure 121B:
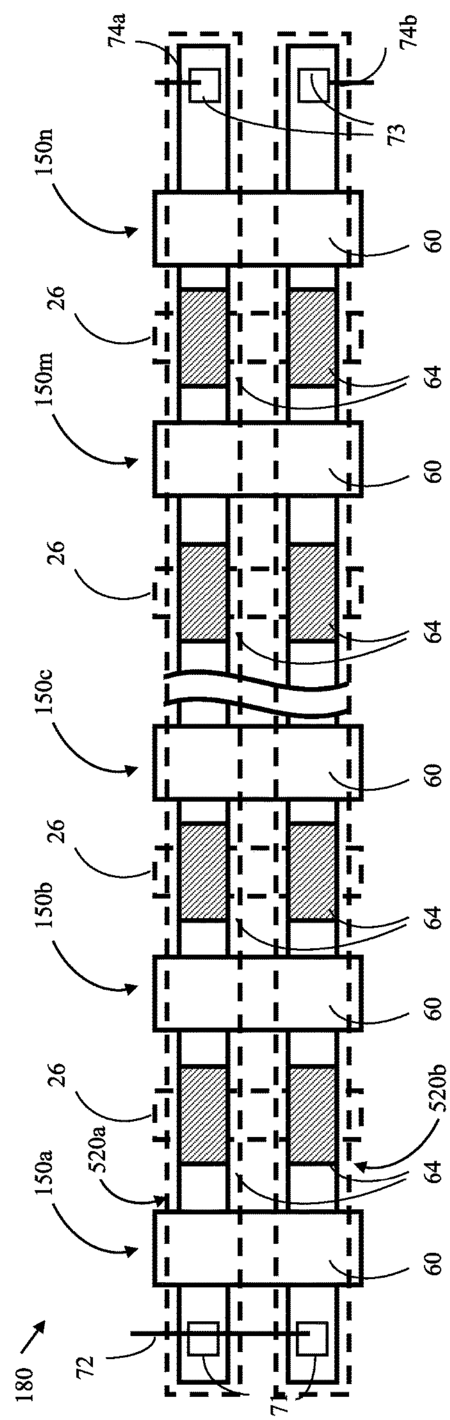

FIG. 121B shows a top view schematic illustration of a memory cell array including two strings of memory cells between the SL terminal and BL terminal according to an embodiment of the present invention.

Figure 121C:
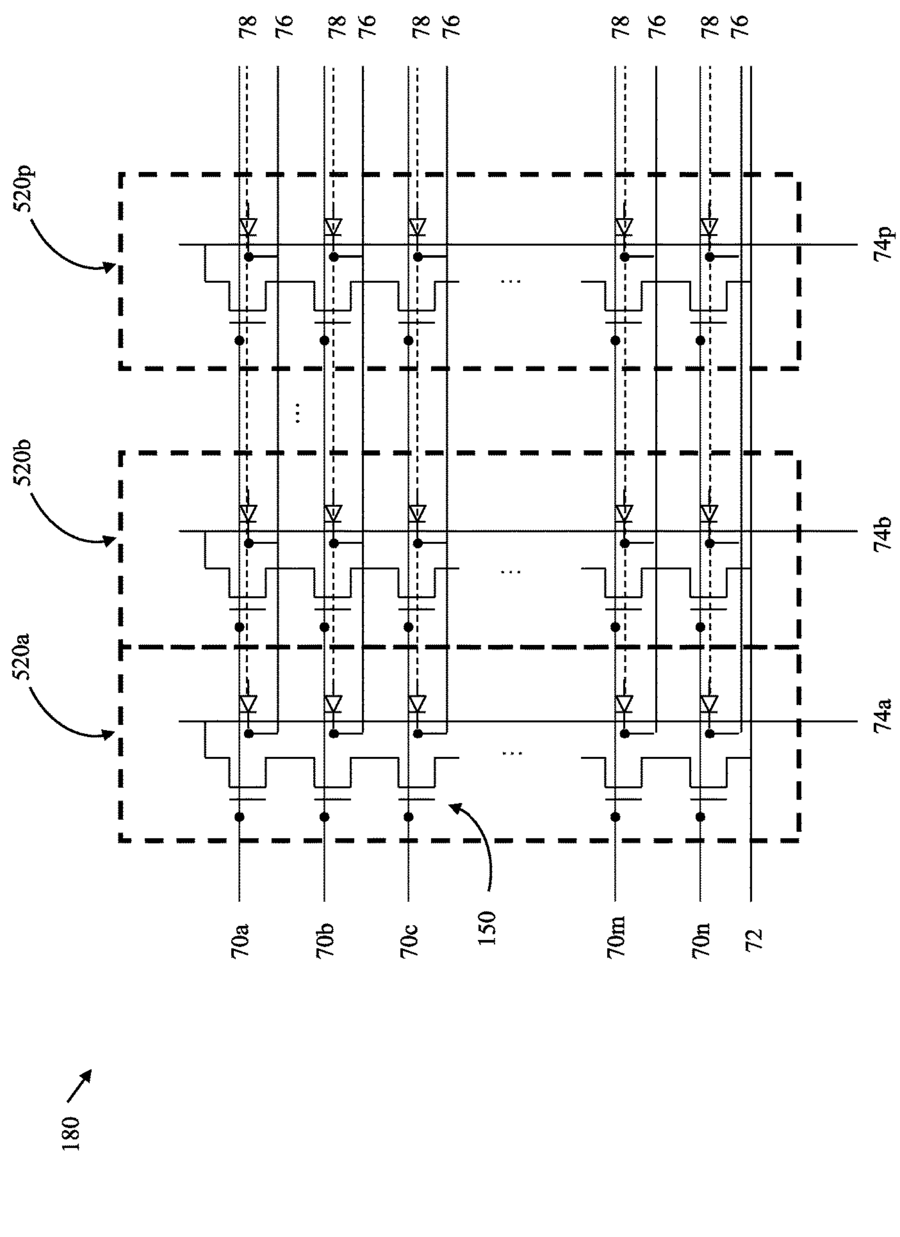

FIG. 121C shows an equivalent circuit representation of a memory array that includes strings shown in FIG. 121B as well as additional strings, in accordance with an embodiment of the present invention.

Figure 122:
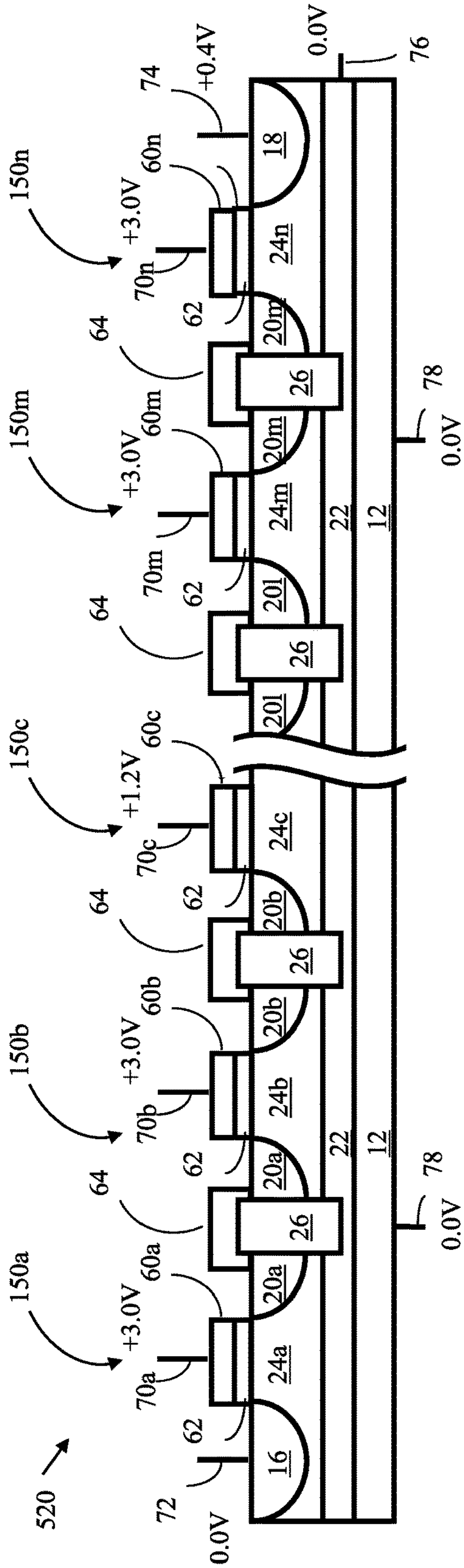

FIG. 122 shows bias conditions on a memory string during a read operation according to an embodiment of the present invention.

Figure 123A:
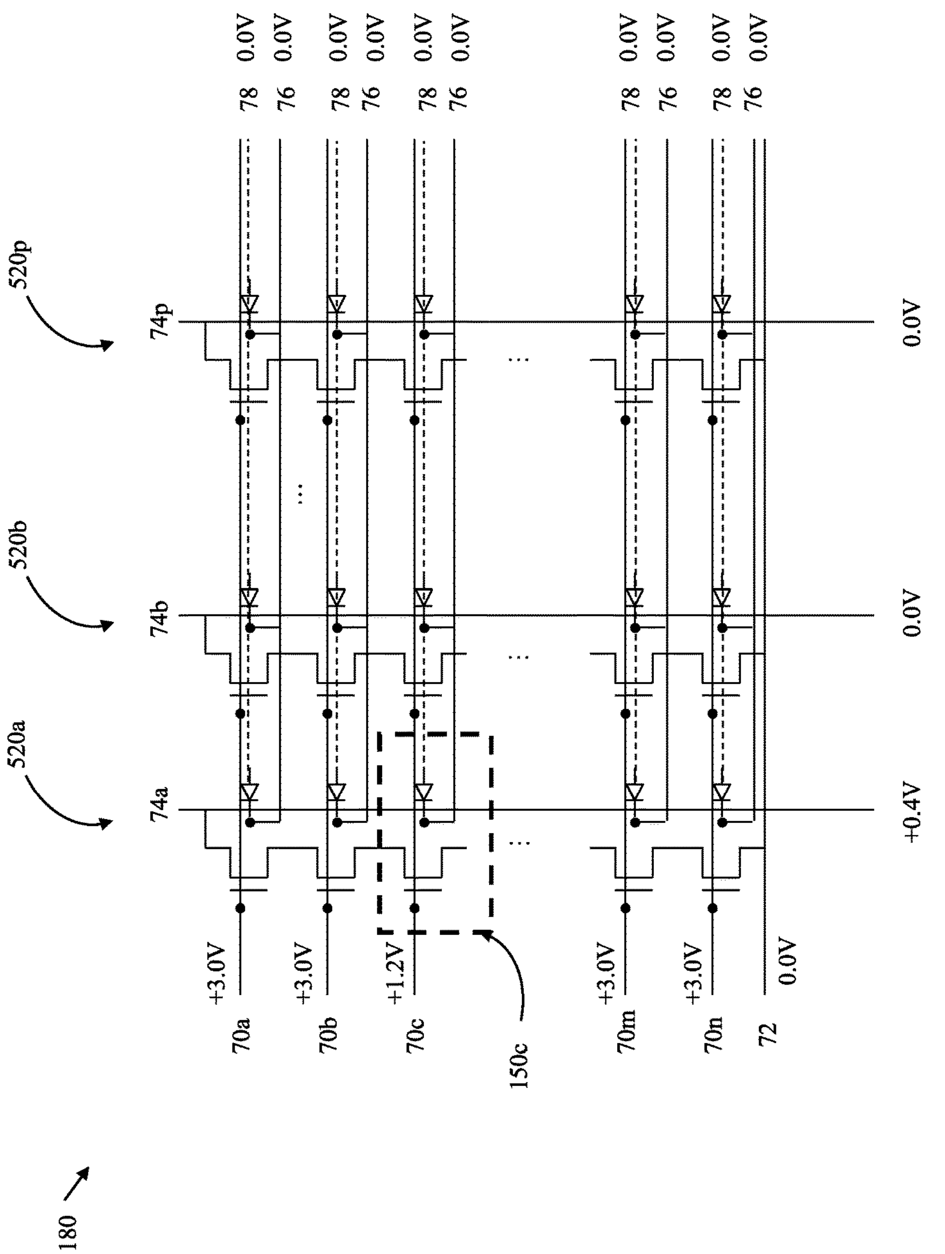

FIG. 123A illustrates bias conditions on a selected memory cell as well as unselected memory cells in the same and in other strings, during a read operation according to an embodiment of the present invention.

Figure 123B:
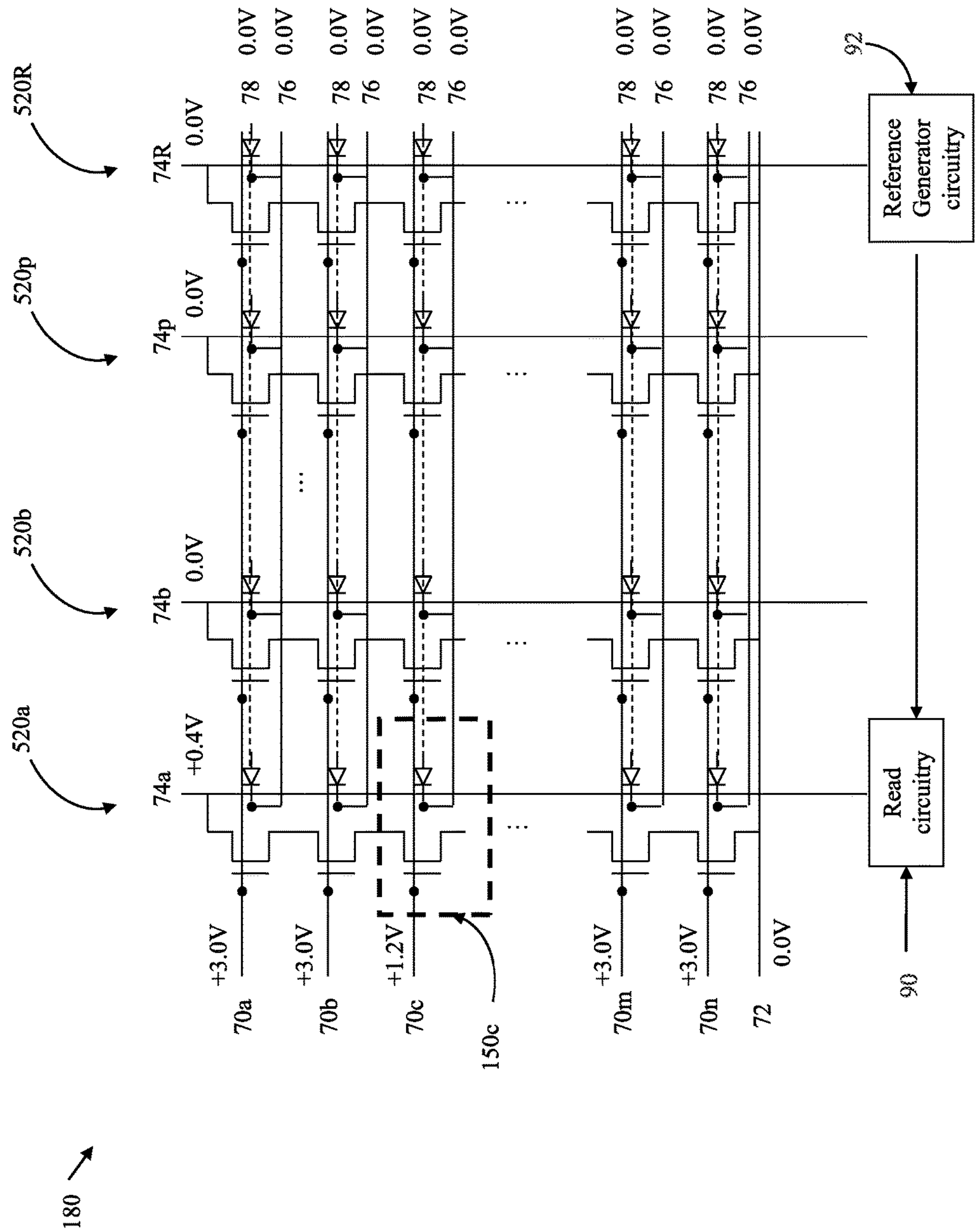

FIG. 123B illustrates the array of FIG. 123A with read circuitry attached to measure or sense the current flow from the BL terminal to the SL terminal in regard to the selected cell, according to an embodiment of the present invention.

Figure 124:
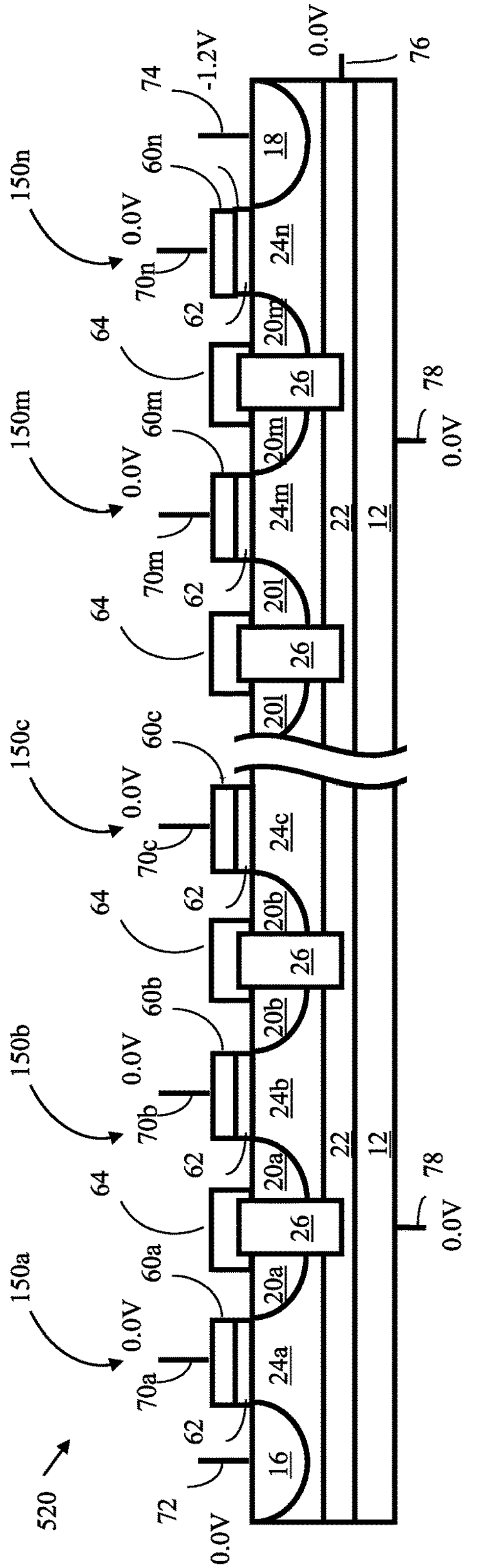

FIG. 124 shows bias conditions on a memory string during a write "0" operation according to an embodiment of the present invention.

Figure 125:
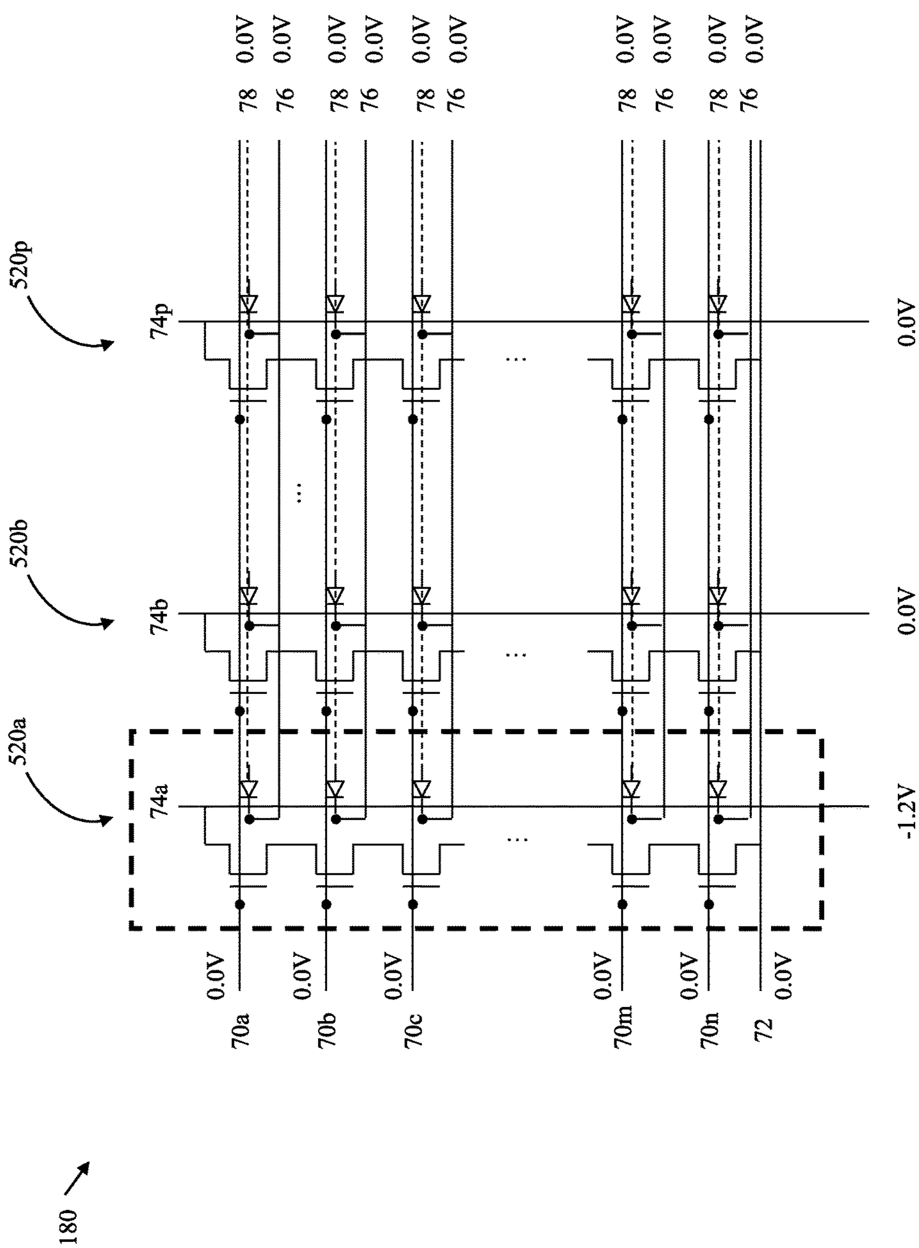

FIG. 125 illustrates bias conditions on a selected memory cell as well as unselected memory cells in the same and in other strings, during a write "0" operation according to an embodiment of the present invention.

Figure 126:
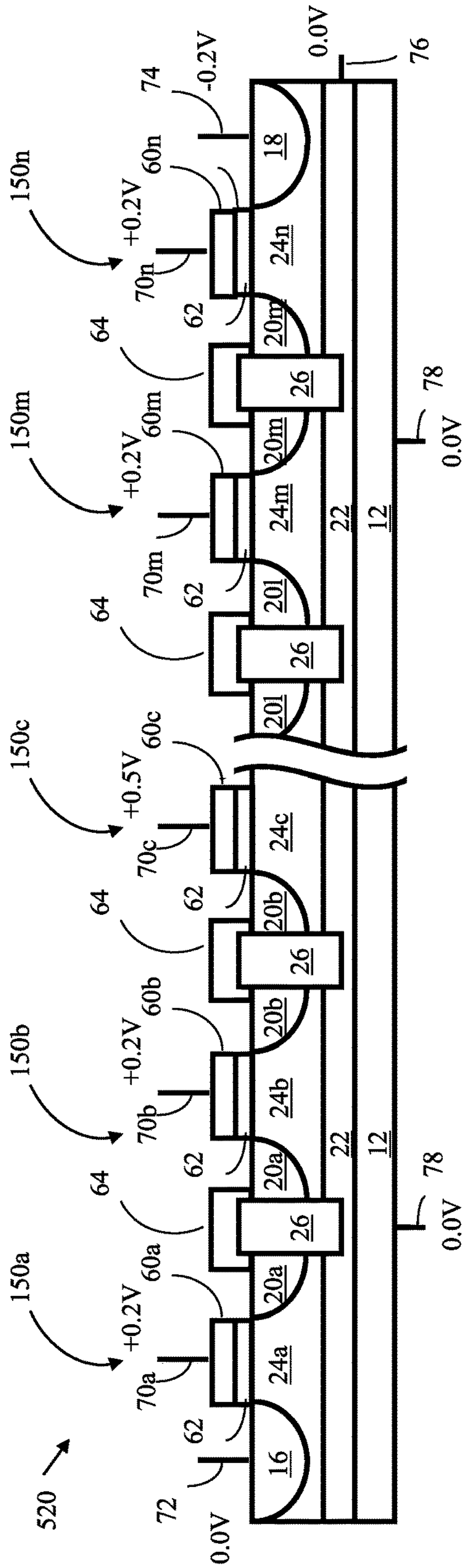

FIG. 126 shows bias conditions on a memory string during a write "0" operation that allows for individual bit writing according to an embodiment of the present invention.

Figure 127:
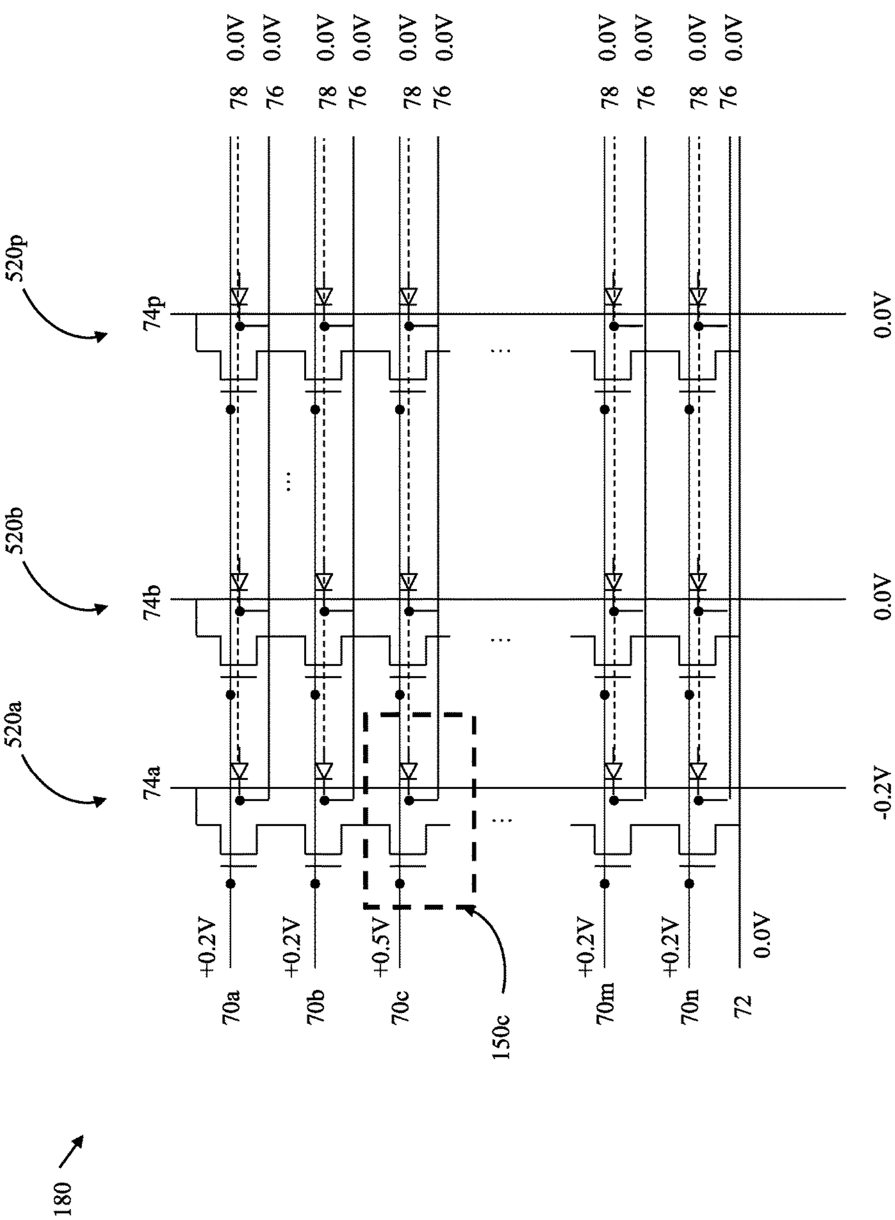

FIG. 127 illustrates bias conditions on a selected memory cell as well as unselected memory cells in the same and in other strings, during a write "0" operation that allows for individual bit writing according to an embodiment of the present invention.

Figure 128:
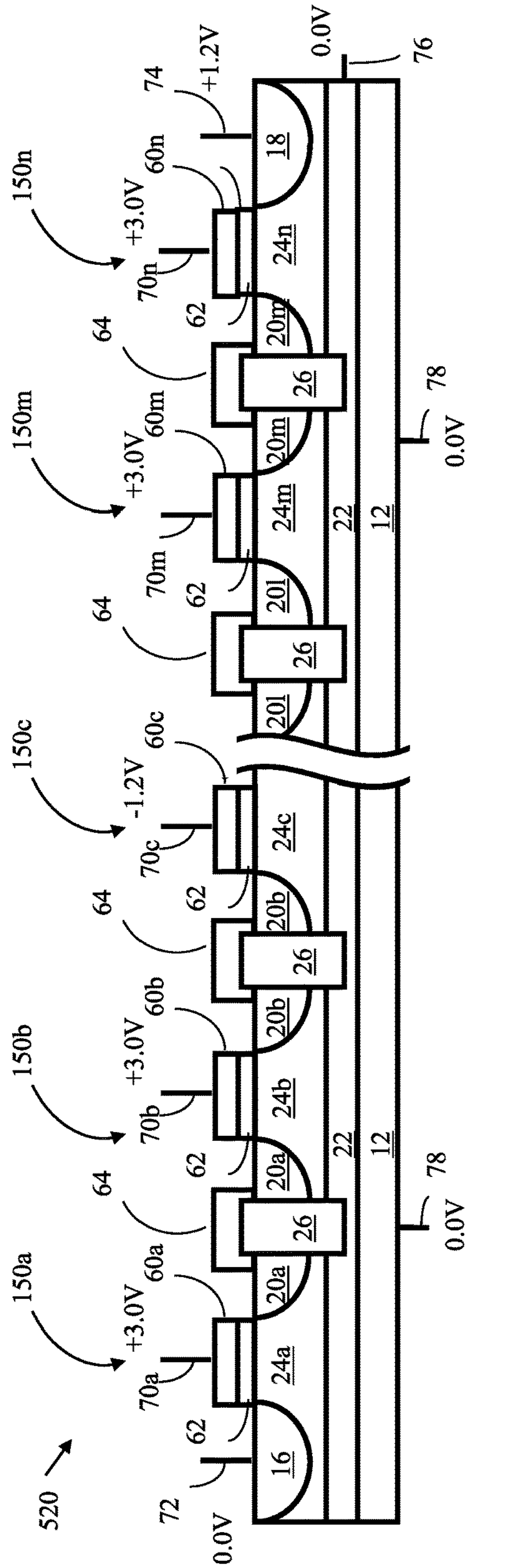

FIG. 128 shows bias conditions on a memory string during a band-to-band tunneling write "1" operation according to an embodiment of the present invention.

Figure 129:
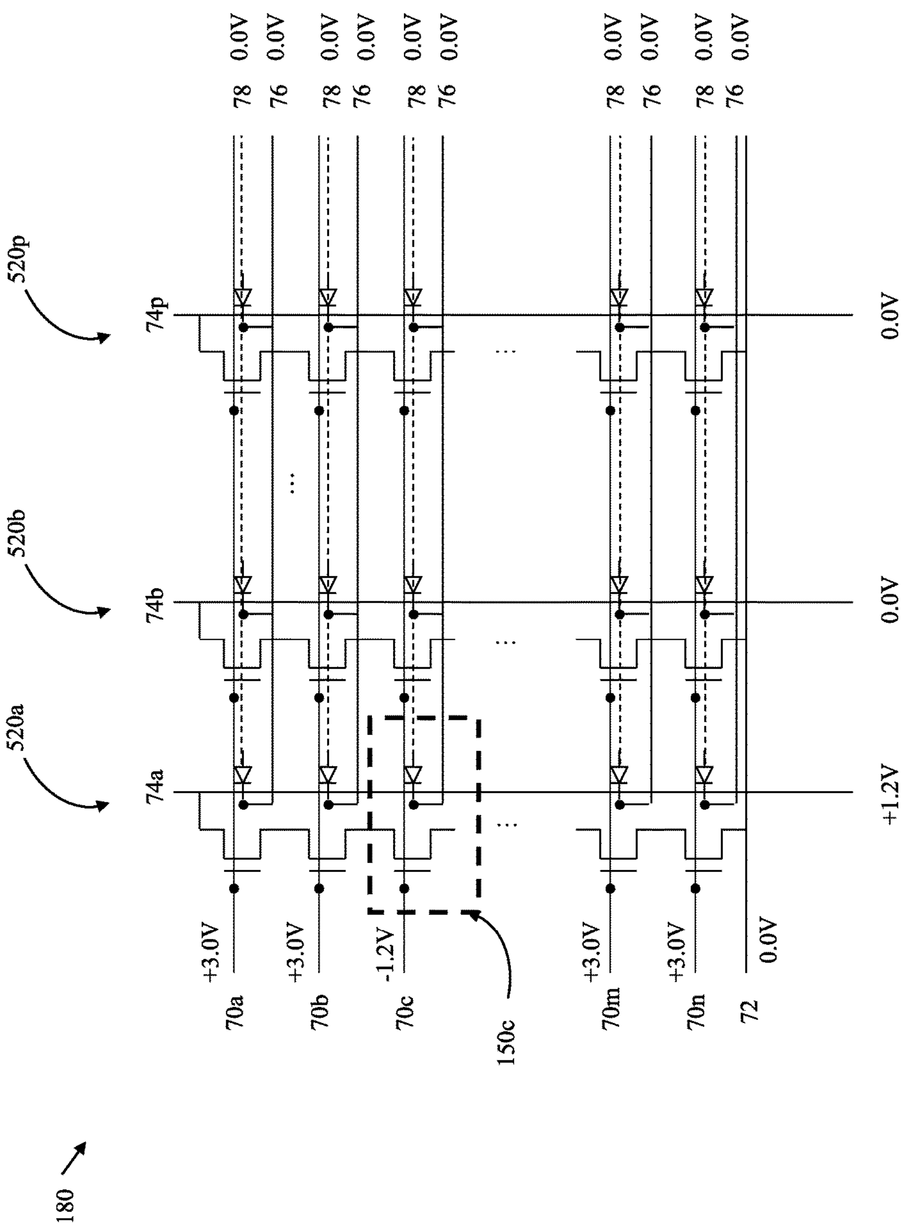

FIG. 129 illustrates bias conditions on a selected memory cell as well as unselected memory cells in the same and in other strings, during a band-to-band tunneling write "1" operation according to an embodiment of the present invention.

Figure 130A:
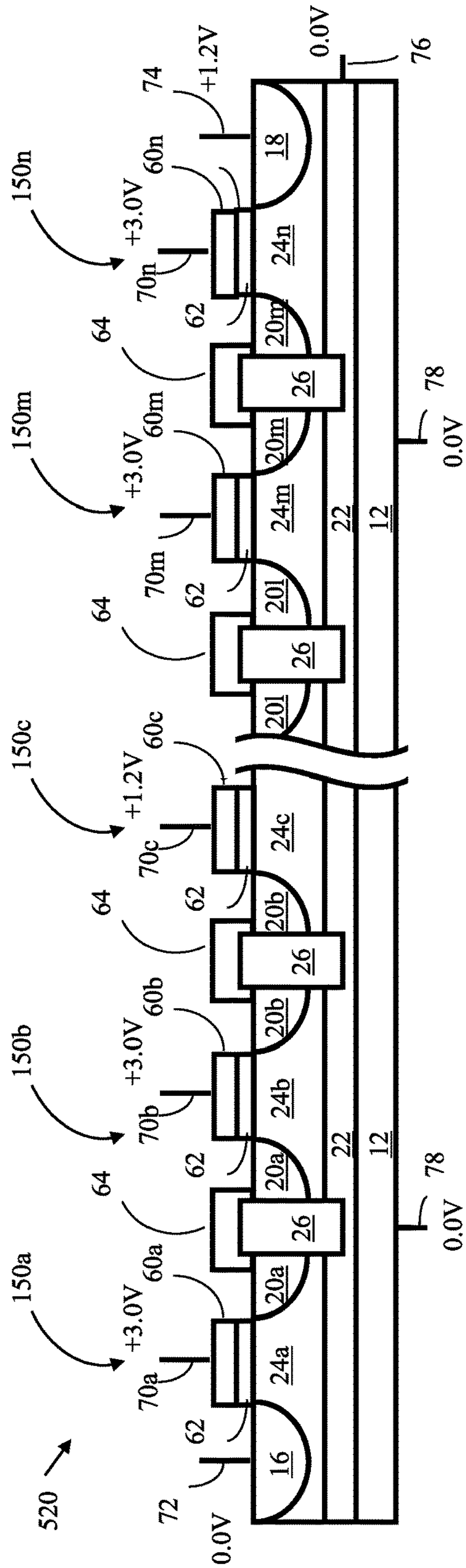

FIG. 130A shows bias conditions on a memory string during an impact ionization write "1" operation according to an embodiment of the present invention.

Figure 130B:
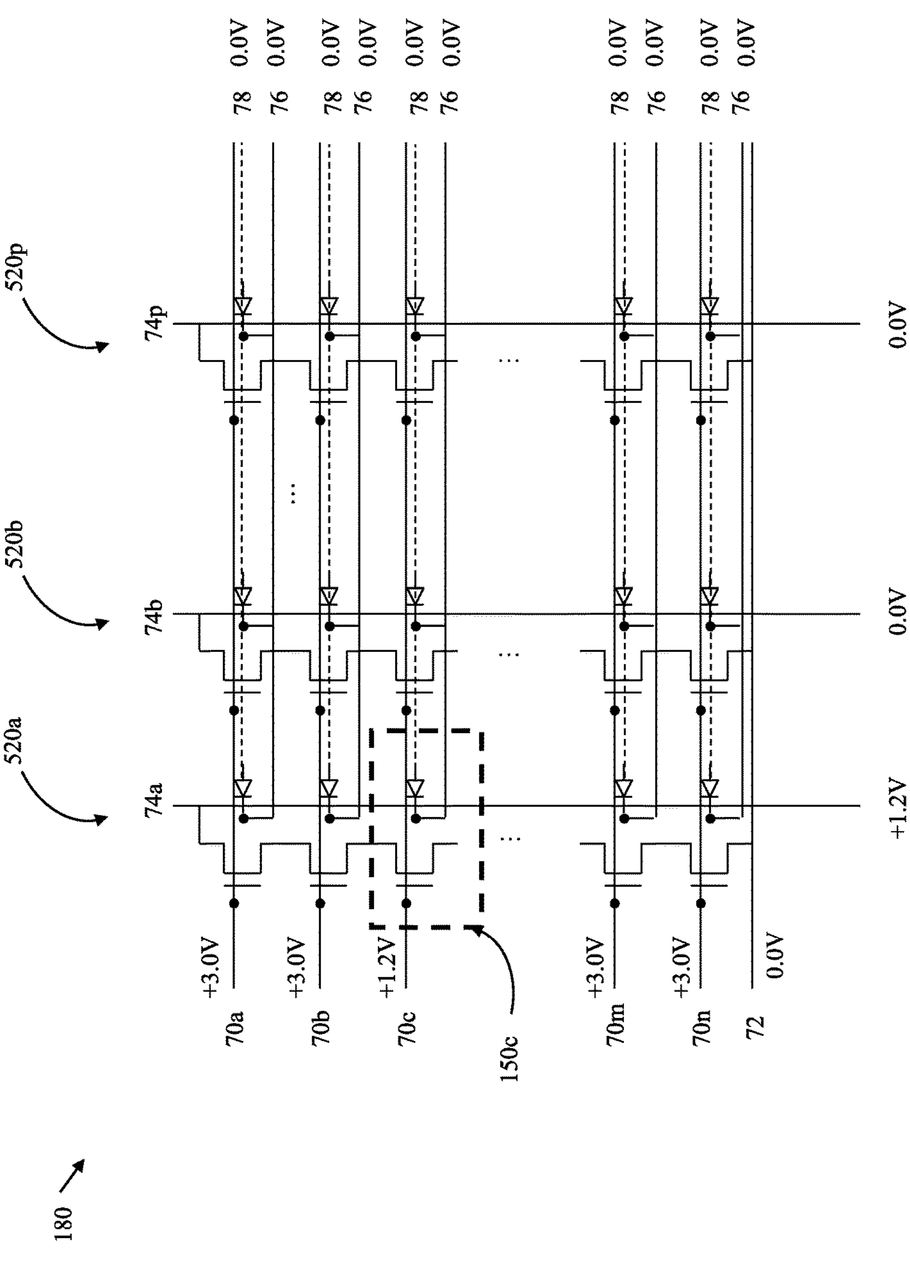

FIG. 130B illustrates bias conditions on a selected memory cell as well as unselected memory cells in the same and in other strings, during an impact ionization write "1" operation according to an embodiment of the present invention.

Figure 131A:
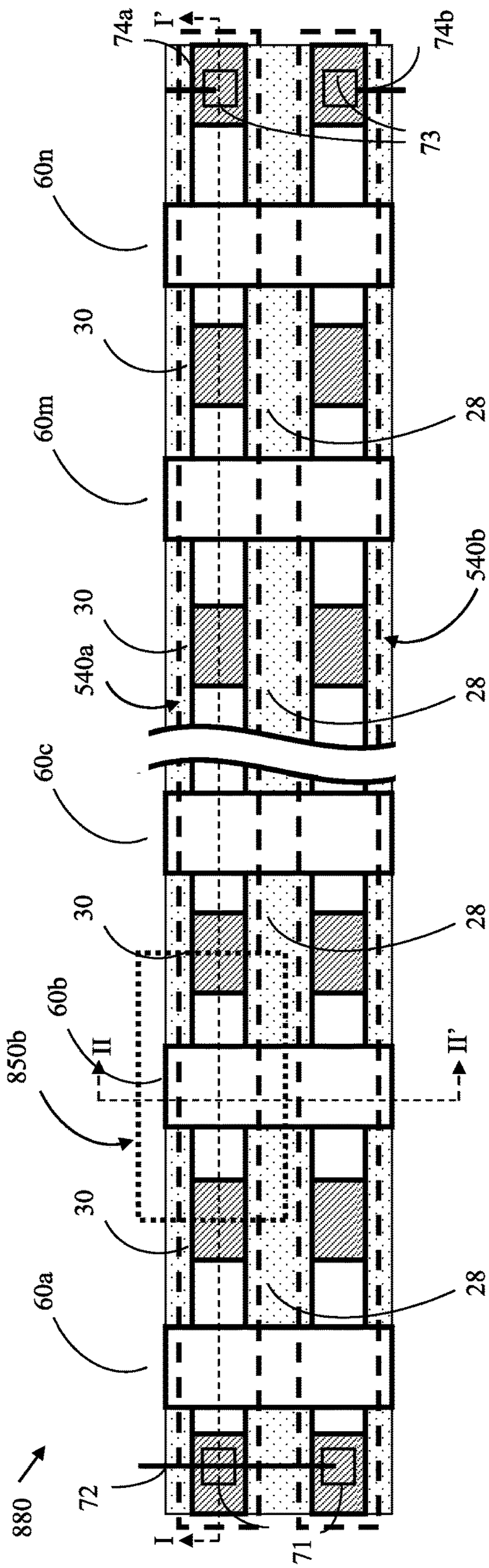

FIG. 131A schematically illustrates a top view of two strings of memory cells in a memory array according to an embodiment of the present invention.

Figure 131B:
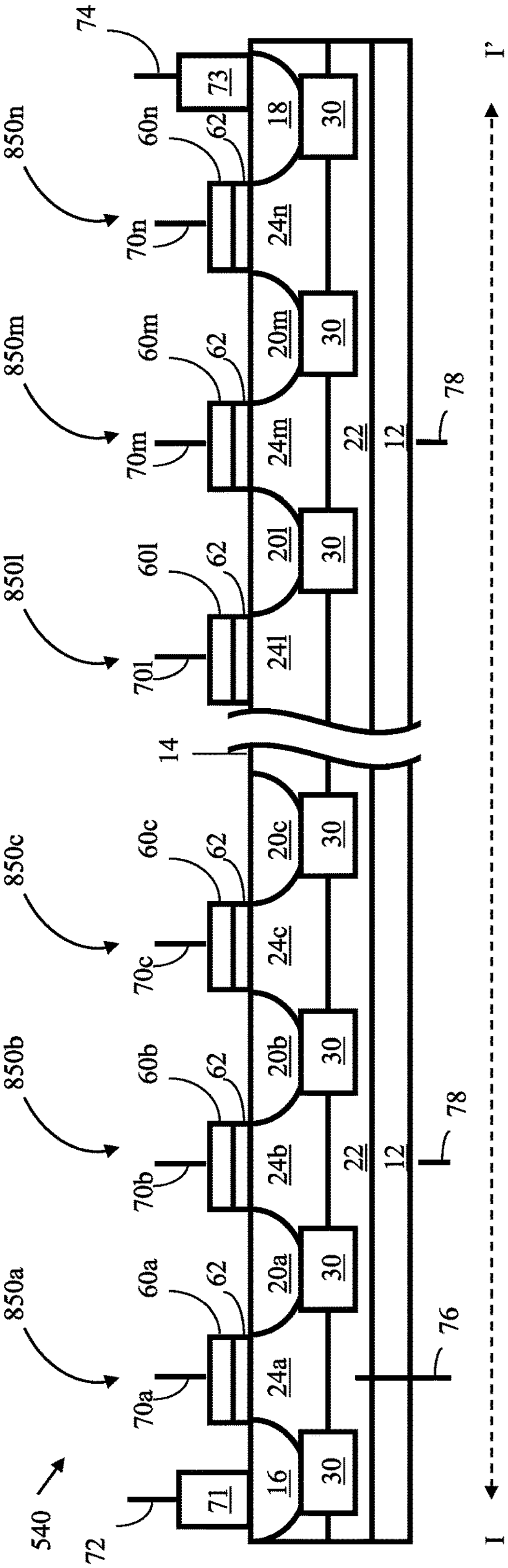

FIG. 131B is a cross-sectional view of a string from the array illustrated in FIG. 131A.

Figure 132A:
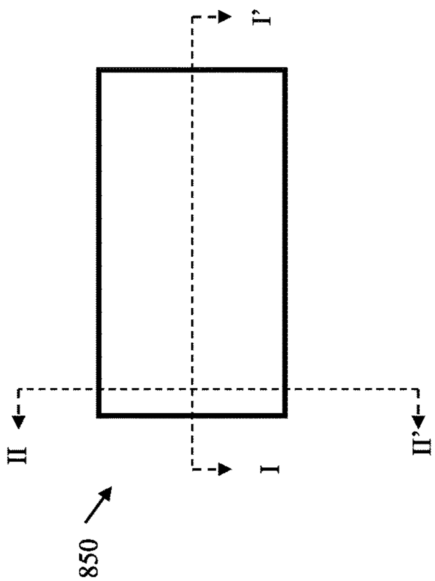
Figure 132B:
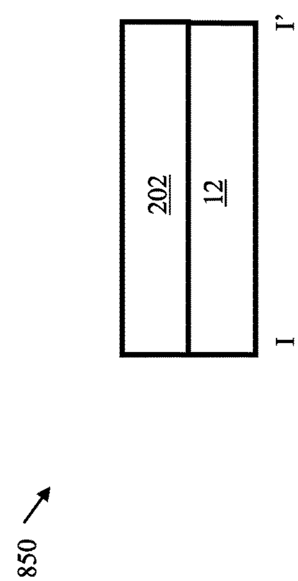
Figure 132C:
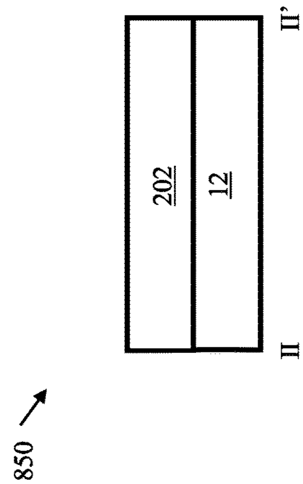
Figure 132D:
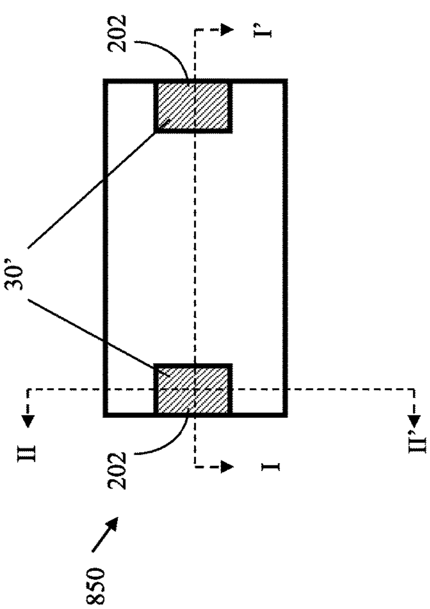
Figure 132F:
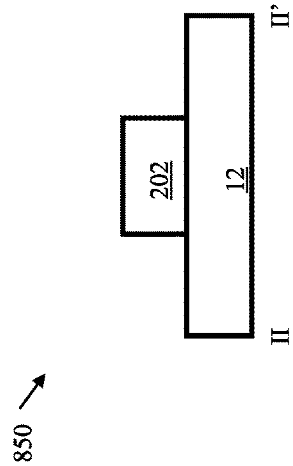
Figure 132E:
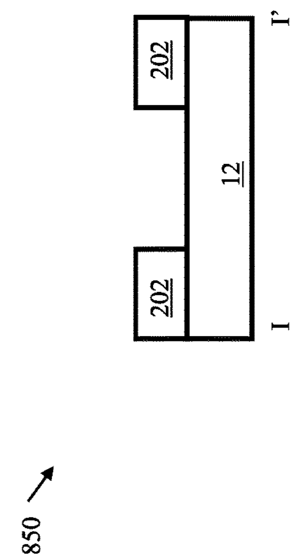
Figure 132G:
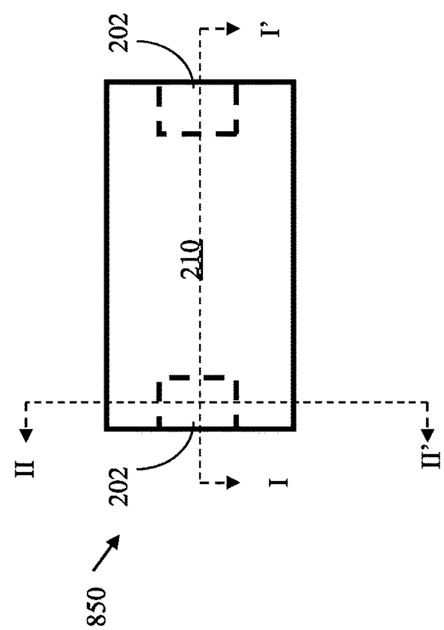
Figure 132H:
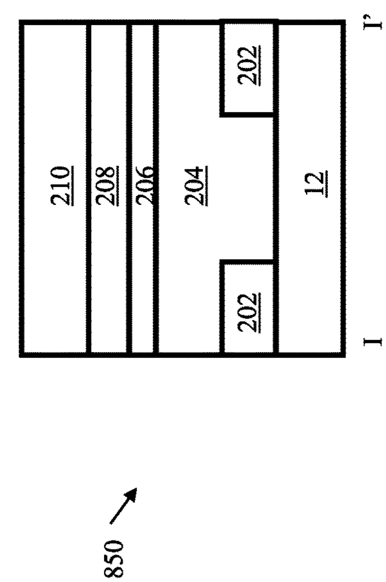
Figure 132I:
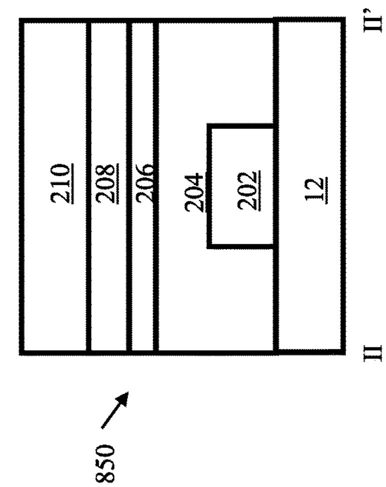
Figure 132J:
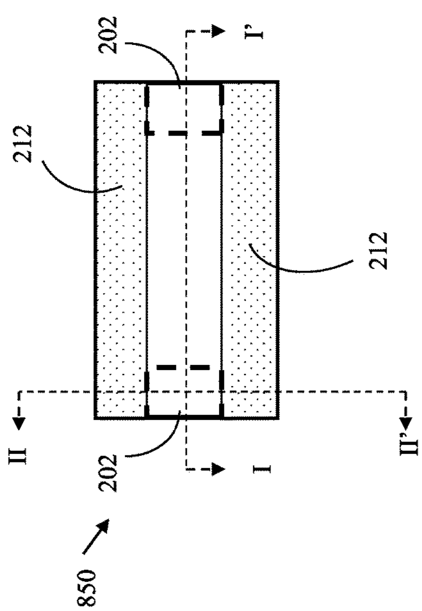
Figure 132L:
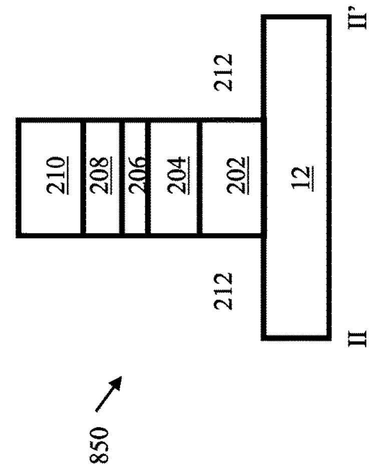
Figure 132K:
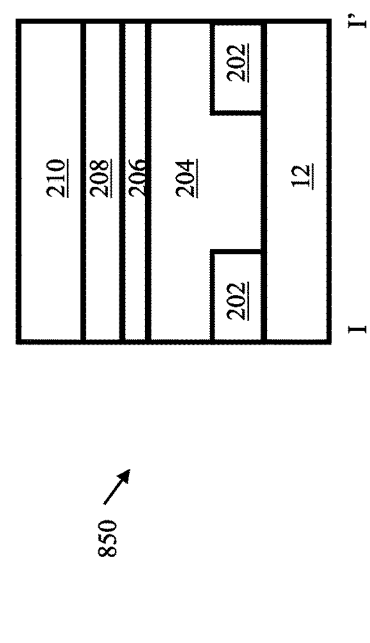
Figure 132M:
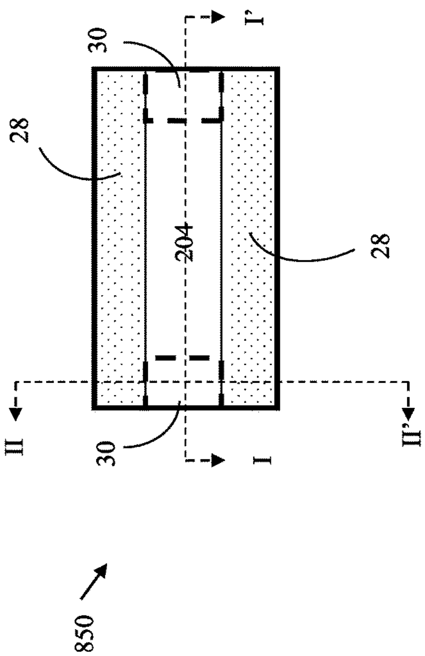
Figure 132N:
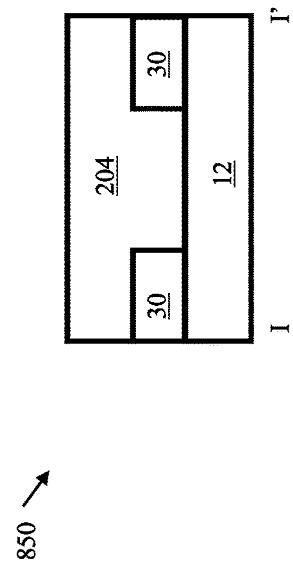
Figure 132O:
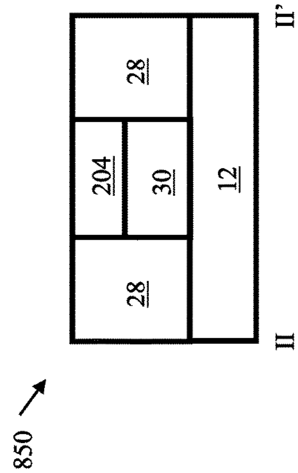
Figure 132P:
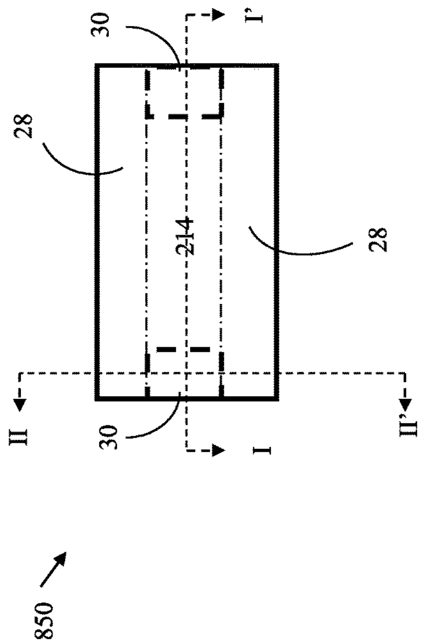
Figure 132Q:
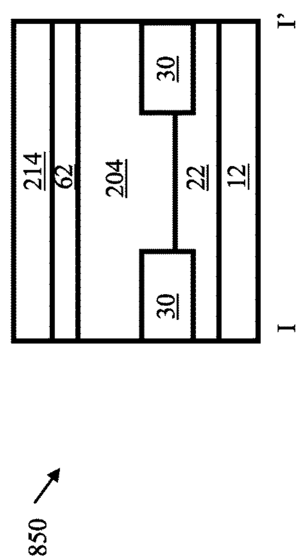
Figure 132R:
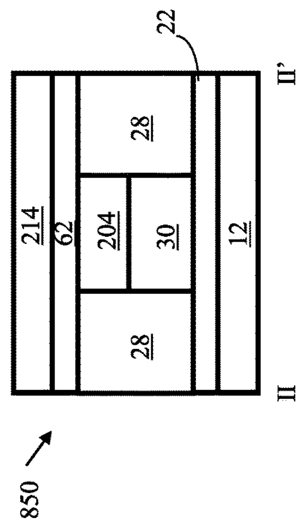
Figure 132S:
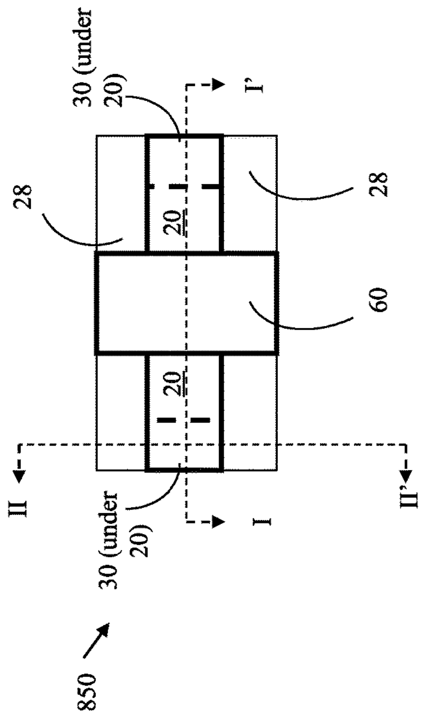
Figure 132T:
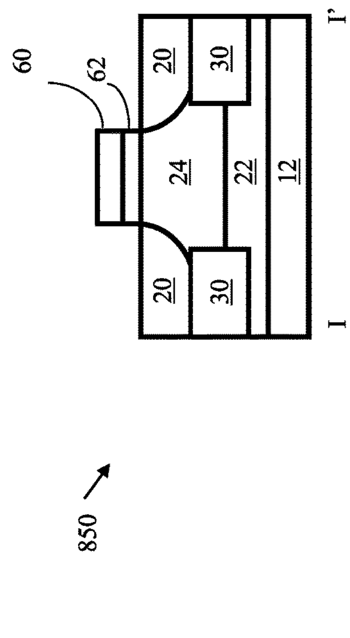
Figure 132U:
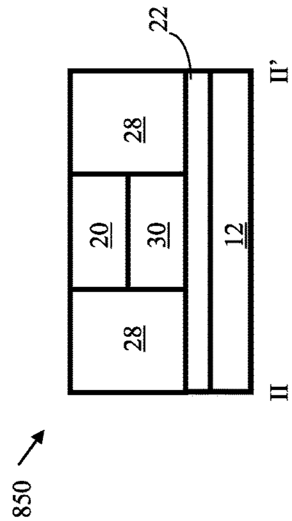

FIGS. 132A-132U illustrates various stages during manufacture of a memory array according to an embodiment of the present invention.

Figure 133:
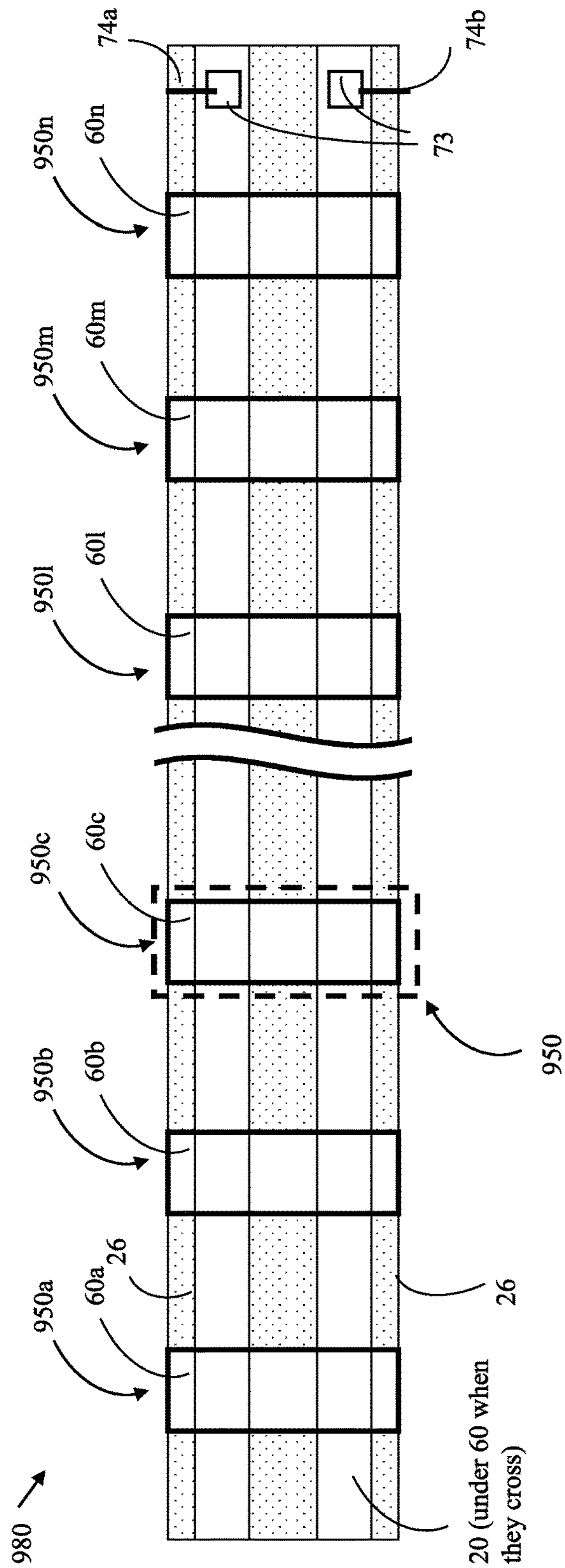

FIG. 133 schematically illustrates a link of memory cells connected in parallel according to an embodiment of the present invention.

Figure 134A:
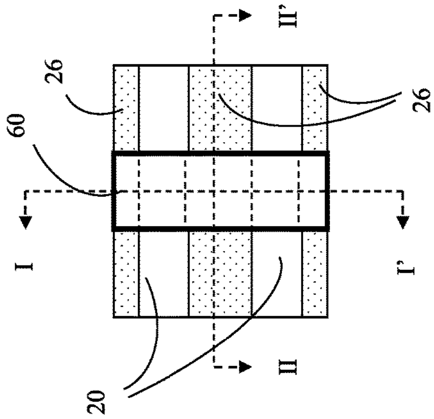

FIG. 134A schematically illustrates a top view of a memory cell of the link of FIG. 133.

Figure 48A:
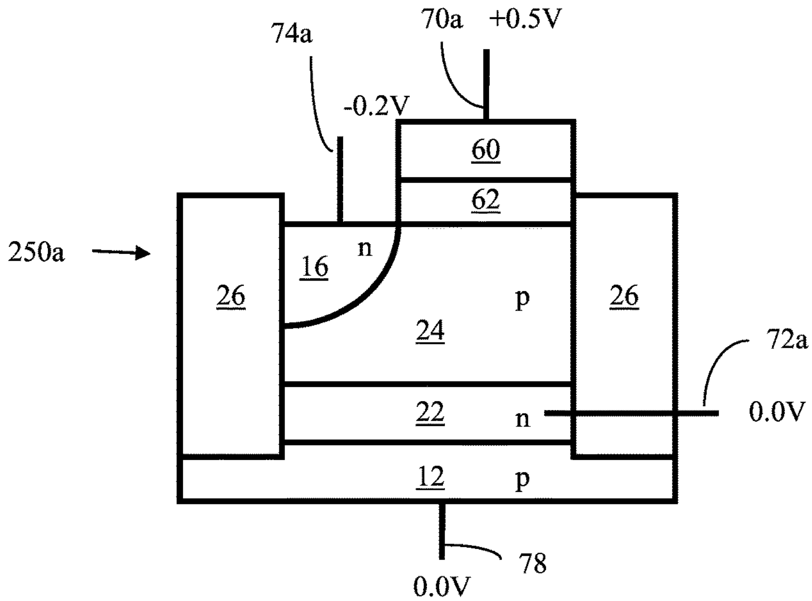
FIGS. 48A through 48H illustrate the operation of four representative memory cells of the array of FIG. 47 during the third type of logic operation.
Figure 134B:
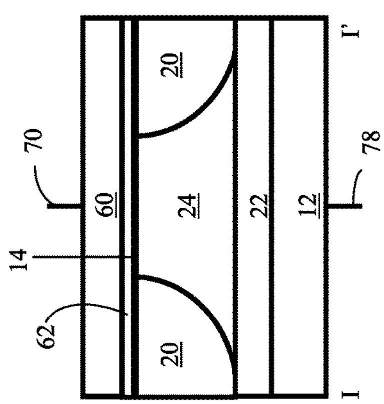

FIG. 134B is a sectional view of the memory cell of FIG. 48A taken along line I-I' of FIG. 134A.

Figure 134C:
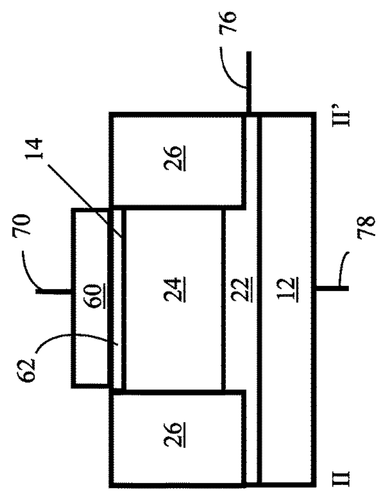

FIG. 134C is a sectional view of the memory cell of FIG. 48A taken along line II-II' of FIG. 134A.

Figure 135:
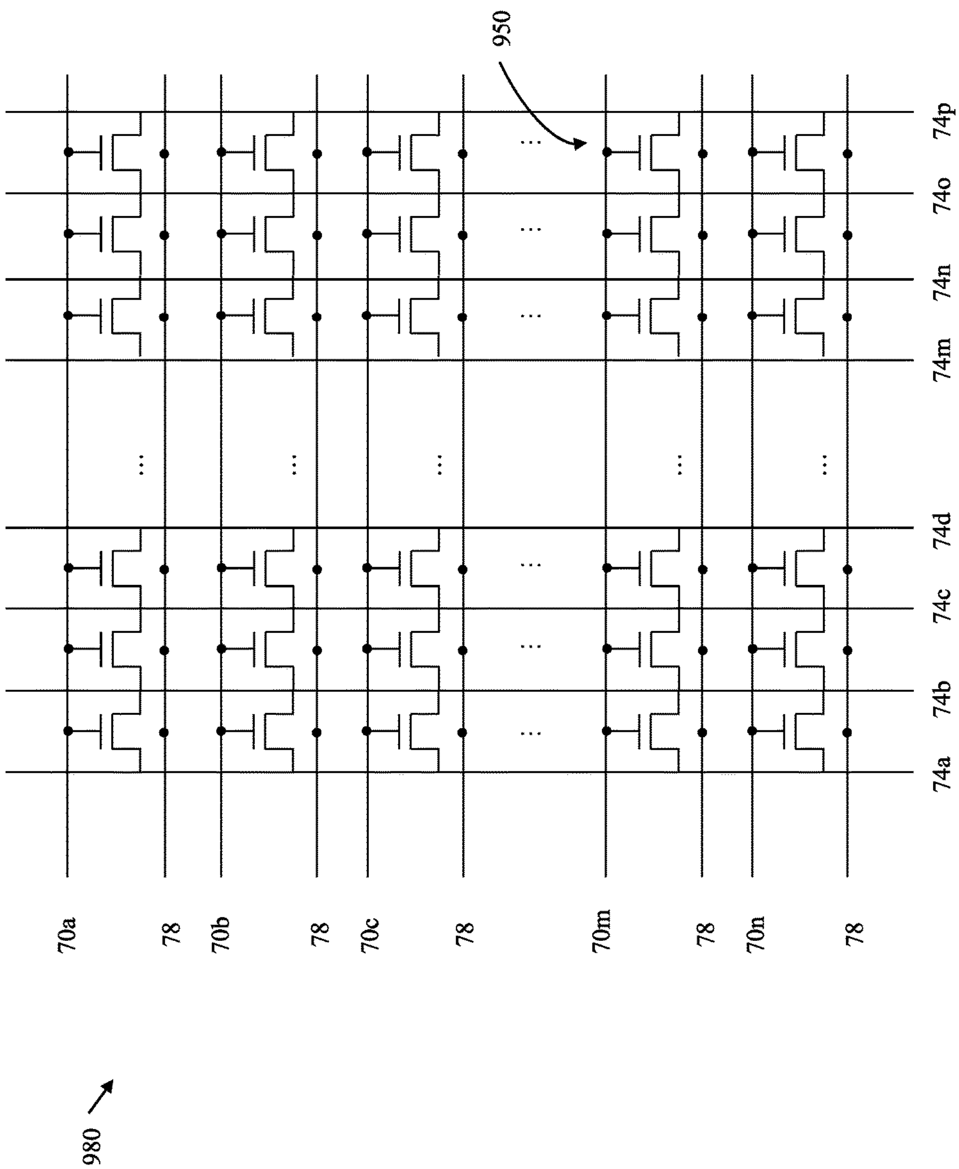

FIG. 135 shows an equivalent circuit representation of a memory array that includes the link of FIG. 133, according to an embodiment of the present invention.

Figure 136:
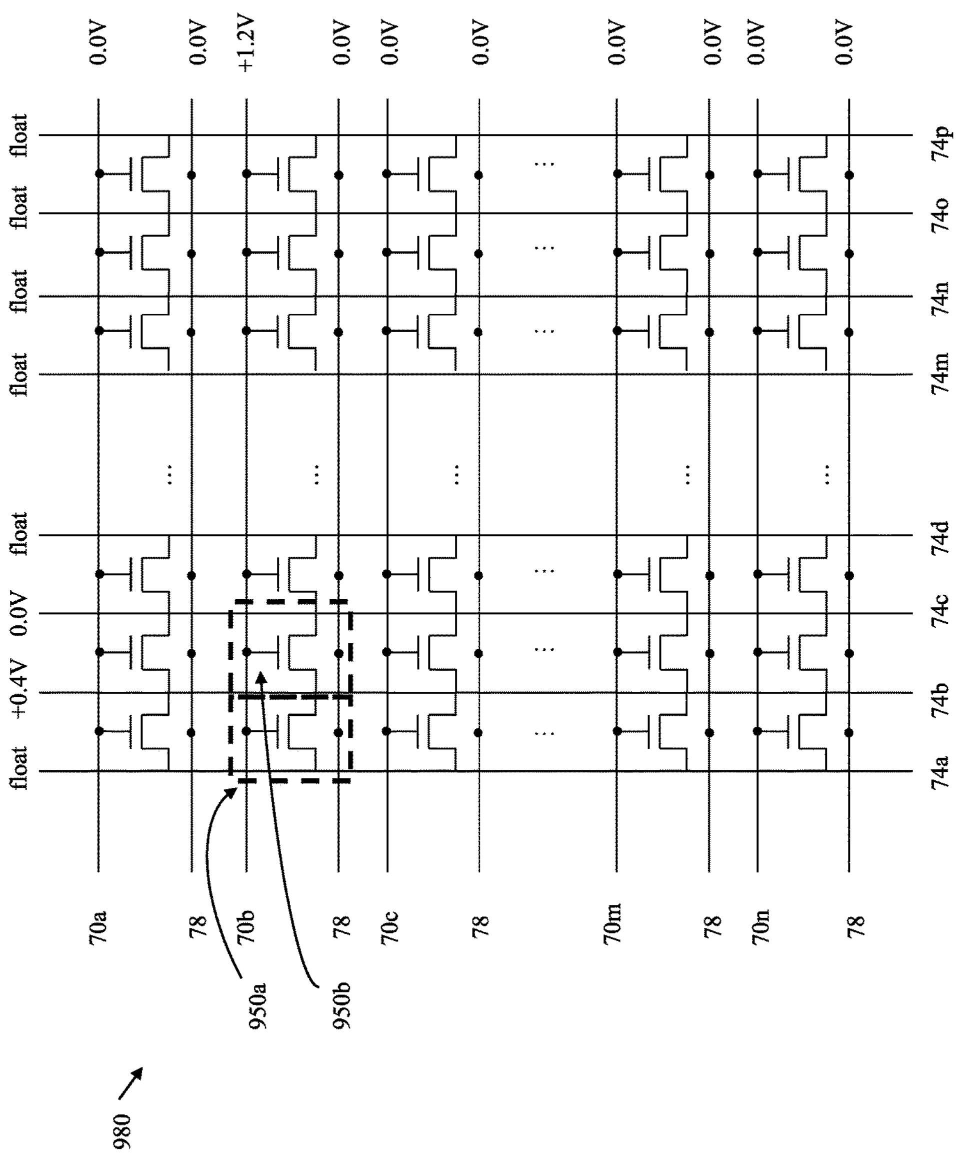

FIG. 136 is a schematic illustration of an equivalent circuit of a memory array of links in which a read operation is being performed on a selected memory cell of one of the links according to an embodiment of the present invention.

Figure 137:
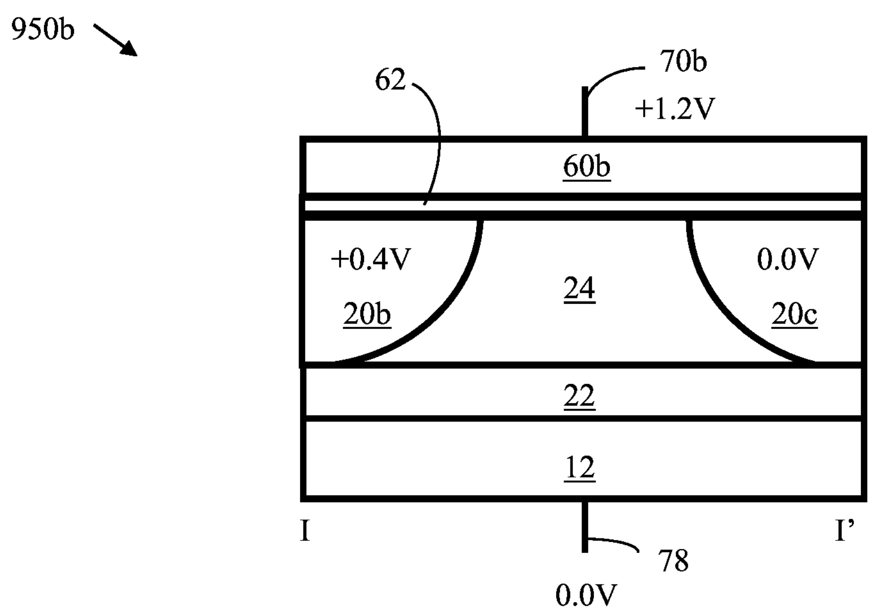

FIG. 137 schematically illustrates the selected memory cell of the array represented in FIG. 135 and bias conditions thereon during the read operation.

Figure 138:
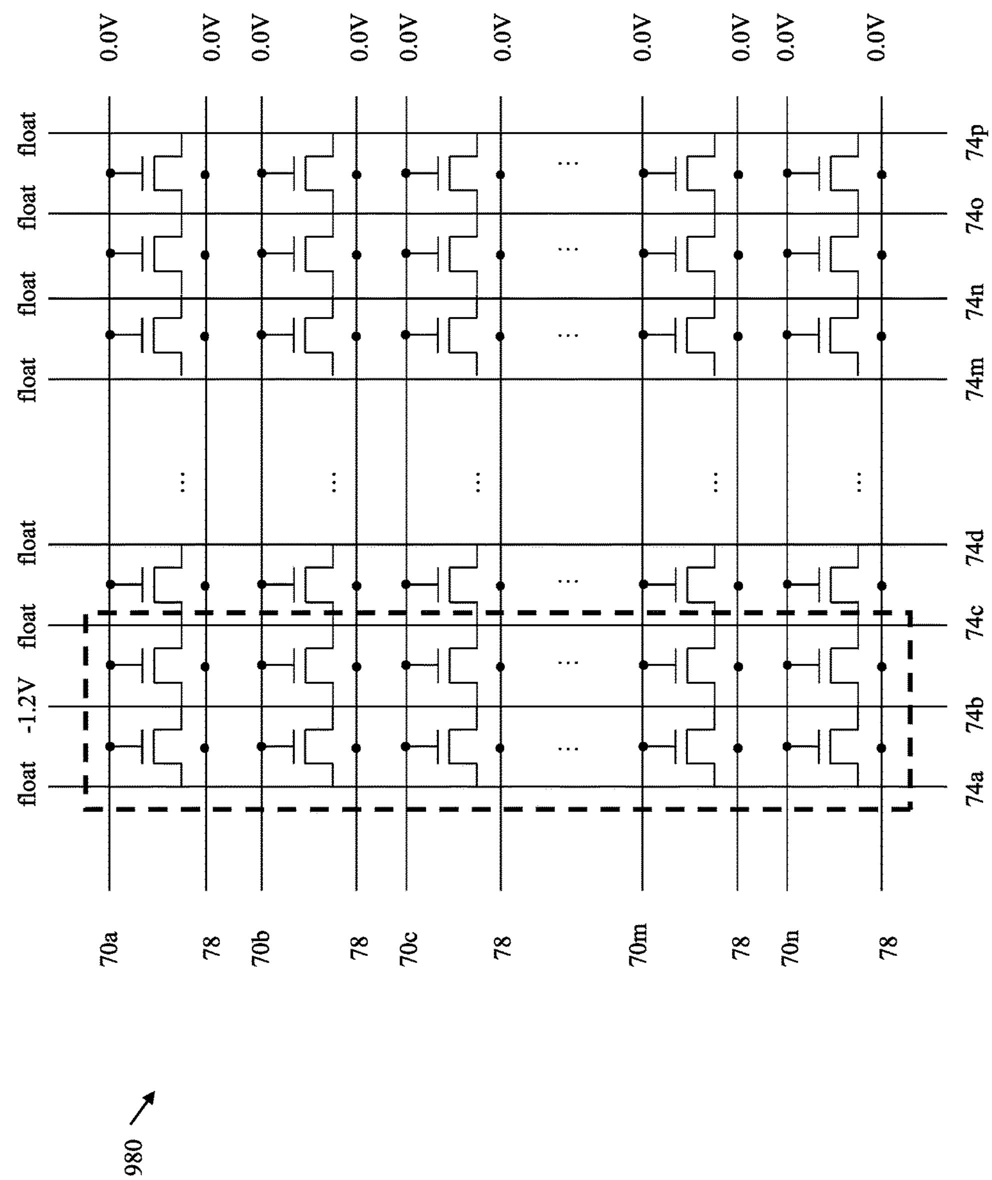

FIG. 138 is a schematic illustration of an equivalent circuit of a memory array in which a write "0" operation is being performed on a selected link of the array according to an embodiment of the present invention.

Figure 139:
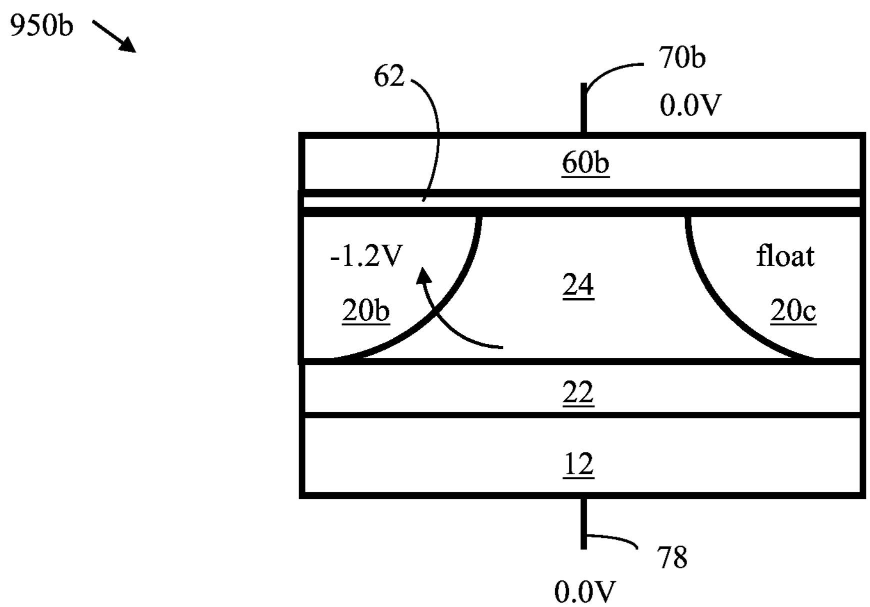

FIG. 139 schematically illustrates a memory cell of the link represented in FIG. 138 that is having a write "0" operation performed thereon according to an embodiment of the present invention.

Figure 140:
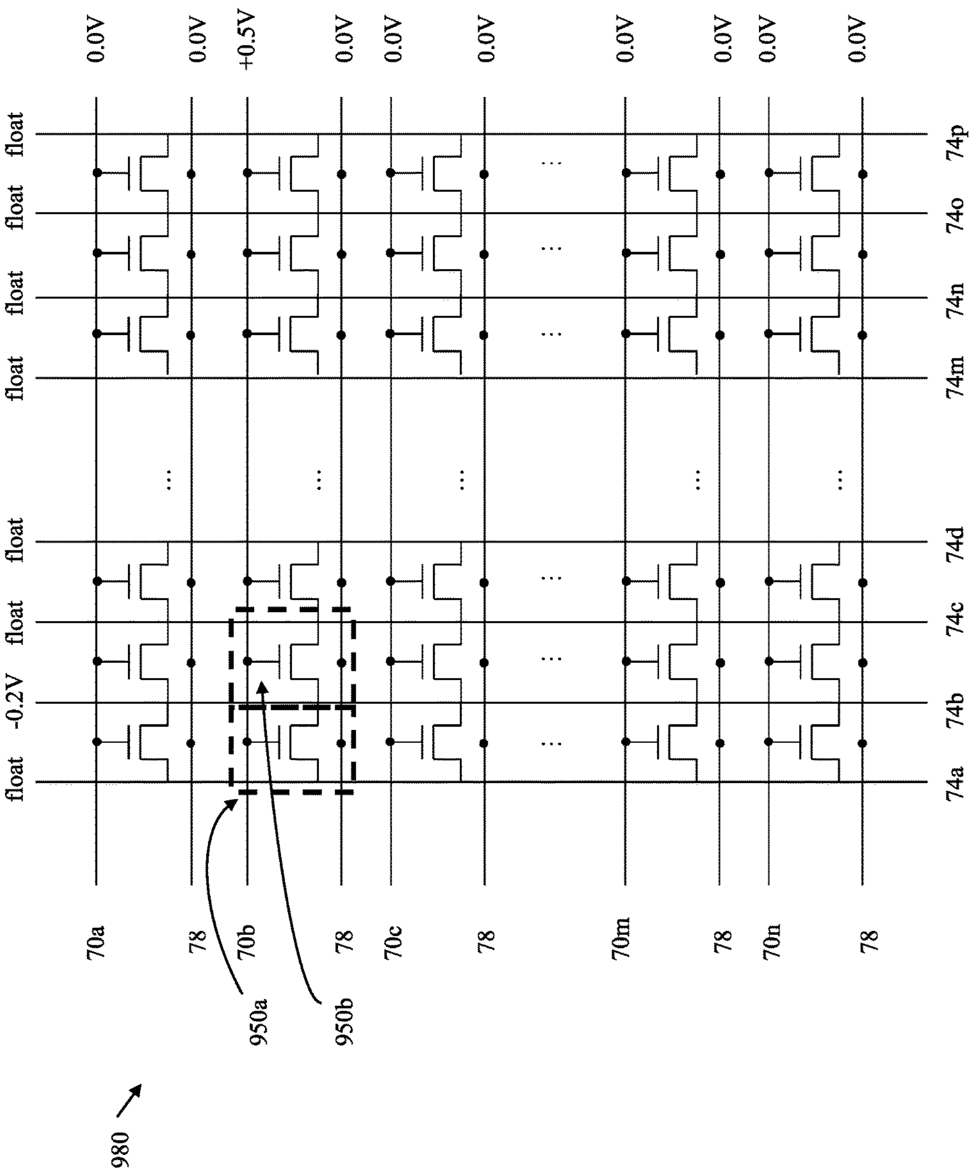

FIG. 140 is a schematic illustration of an equivalent circuit of a memory array in which a write "0" operation is being performed according to an alternative embodiment of the present invention.

Figure 141:
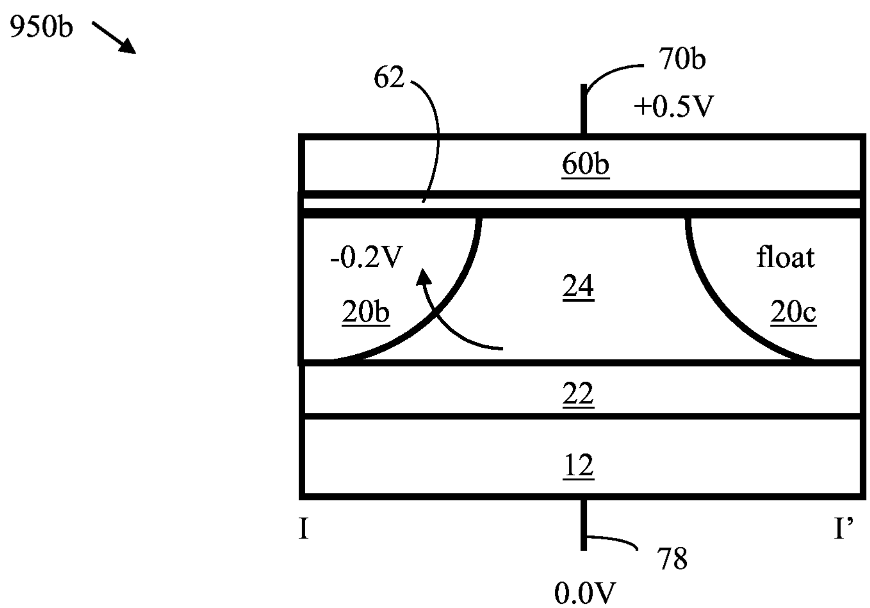

FIG. 141 schematically illustrates a memory cell of the array represented in FIG. 140 that is having a write "0" operation performed thereon according to the alternative embodiment described with regard to FIG. 140.

Figure 142:
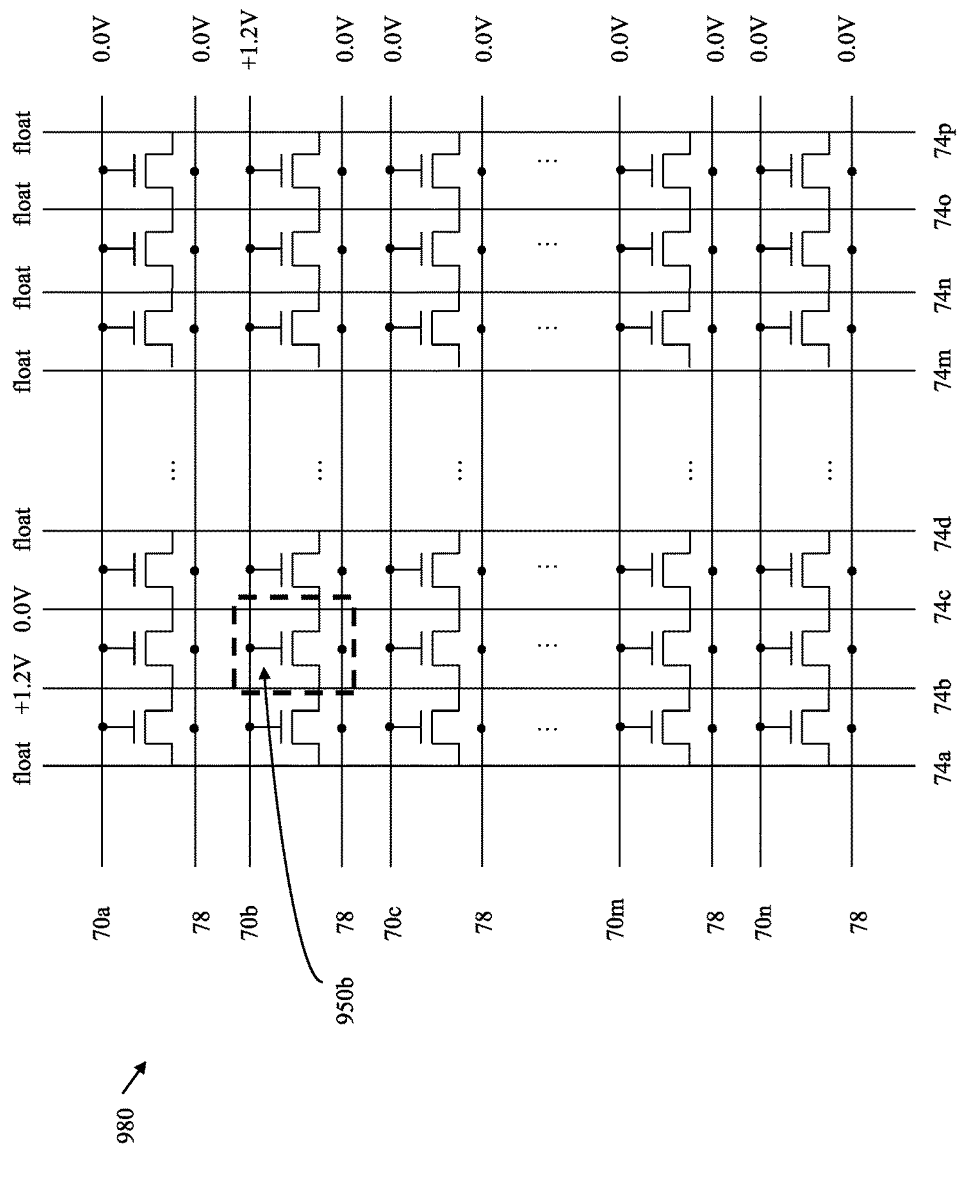

FIG. 142 is a schematic illustration of an equivalent circuit of a memory array in which a write "1" operation is being performed by impact ionization according to an embodiment of the present invention.

Figure 143:
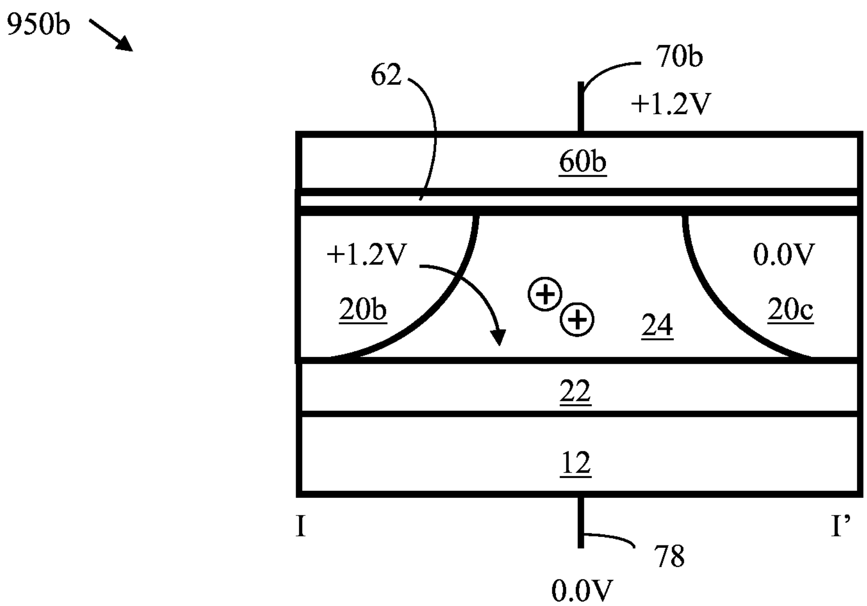

FIG. 143 schematically illustrates a selected memory cell of the array of

FIG. 142 on which the write "1" operation is being performed, and the bias conditions thereon.

Figure 144:
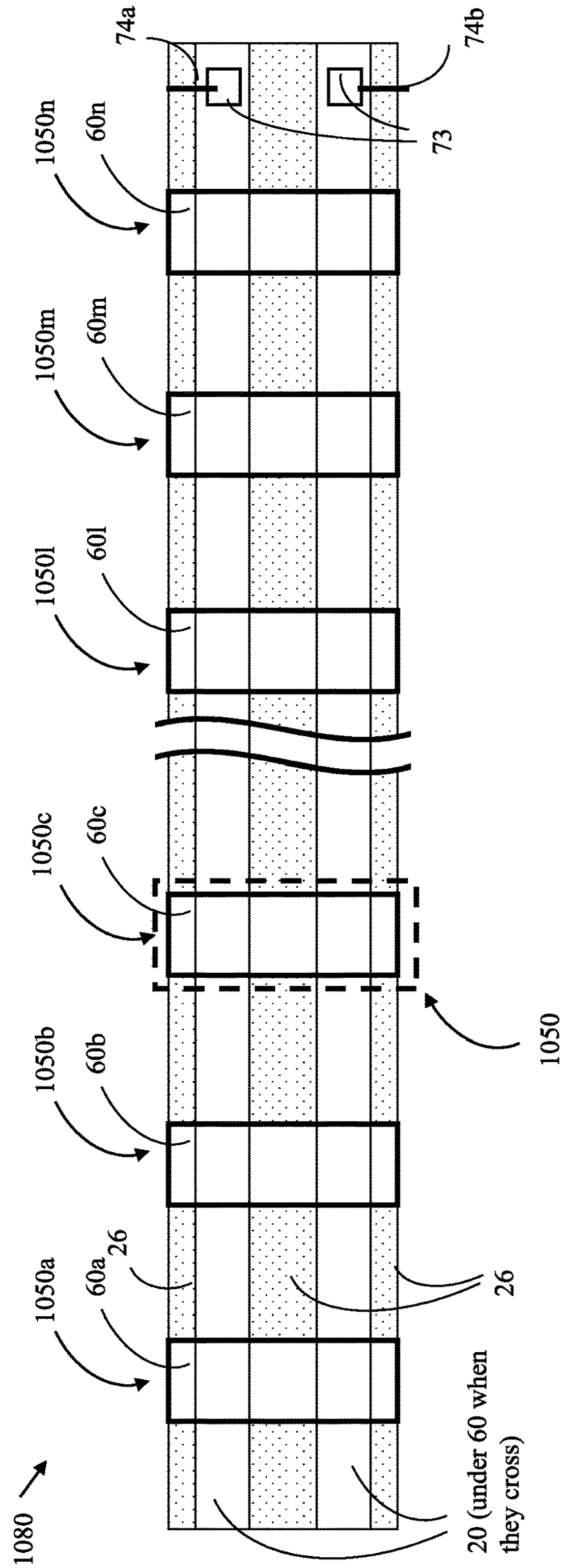

FIG. 144 schematically illustrates a link according to another embodiment of the present invention.

Figure 145A:
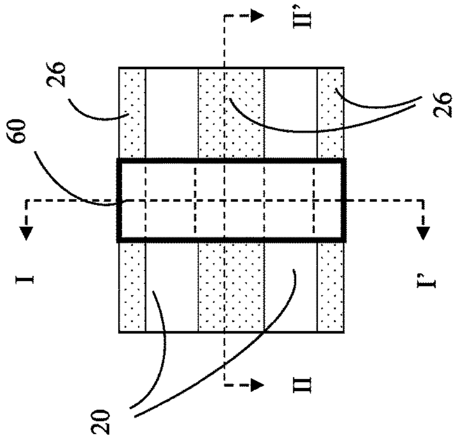

FIG. 145A schematically illustrates a top view of a memory cell of the memory array of FIG. 144.

Figure 145C:
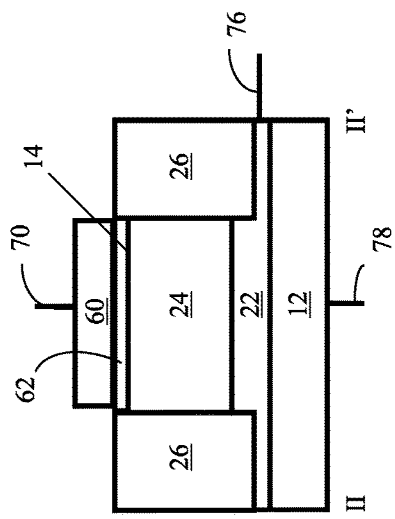
Figure 145B:
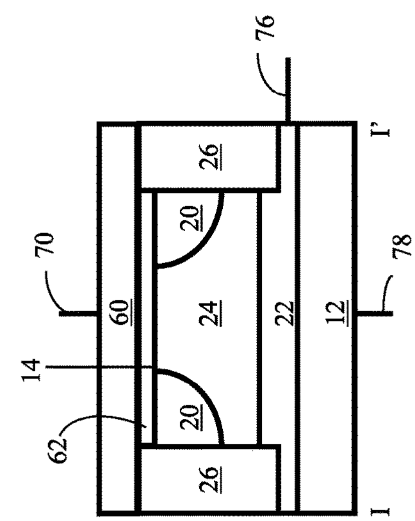

FIG. 145B is a sectional view of the memory cell of FIG. 145A taken along line I-I' of FIG. 145A.

FIG. 145C is a sectional view of the memory cell of FIG. 145A taken along line II-II' of FIG. 145A.

Figure 146:
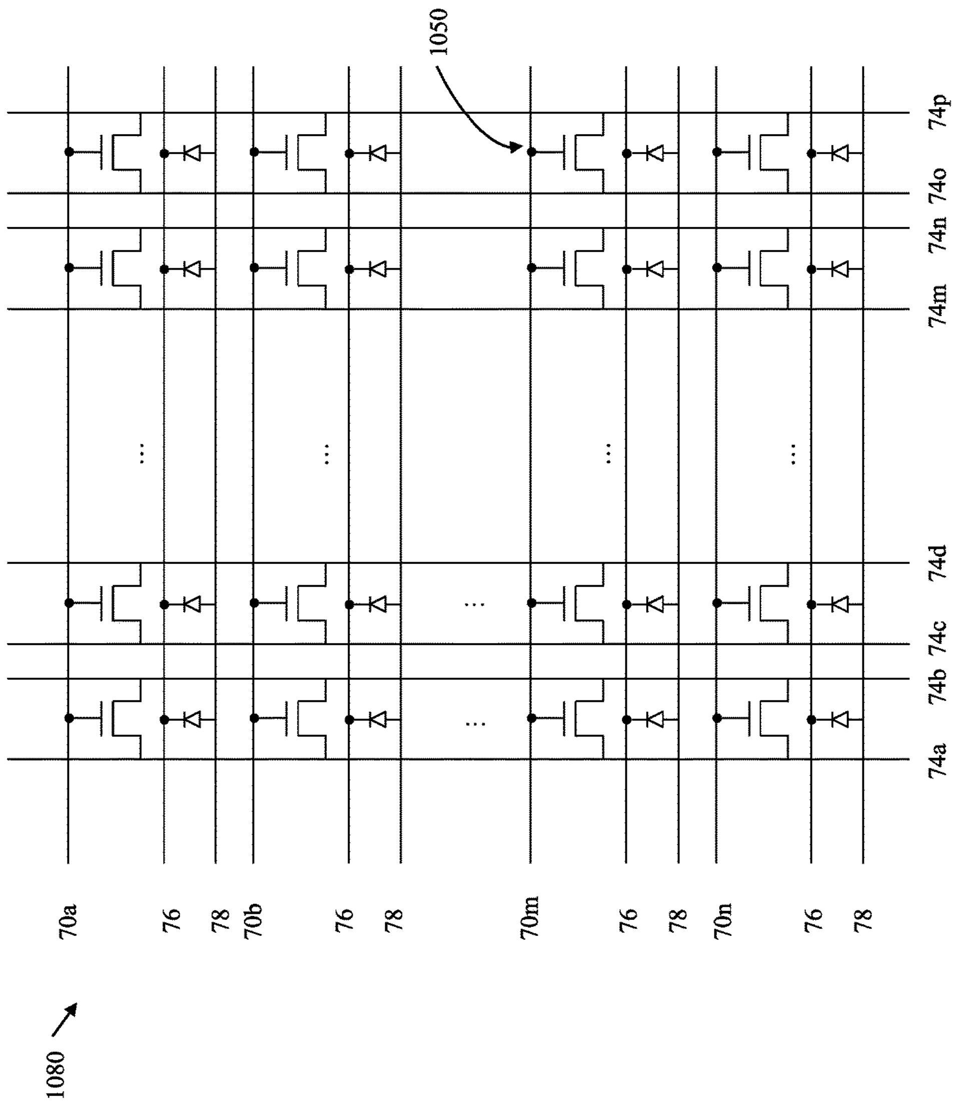

FIG. 146 shows an equivalent circuit representation of a memory array of links, including the link of FIG. 144.

Figure 147:
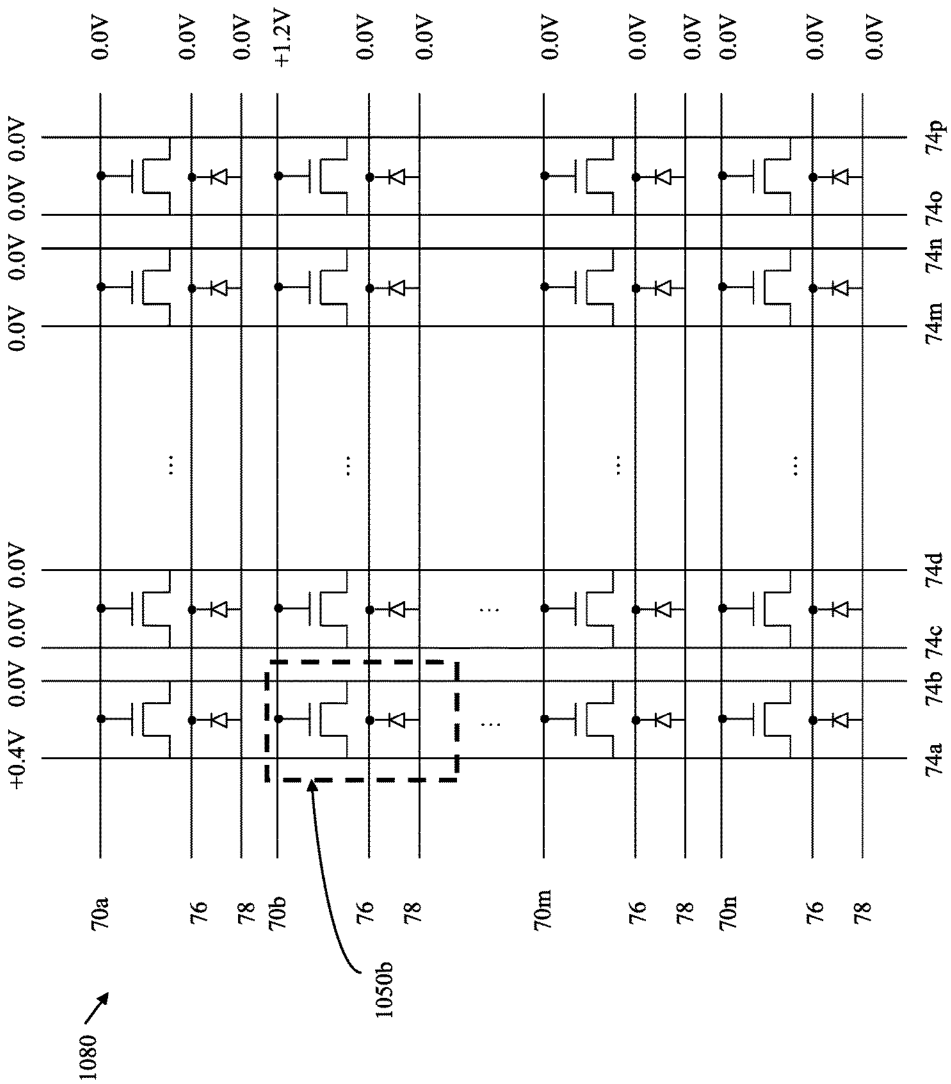

FIG. 147 is a schematic illustration of an equivalent circuit of a memory array in which a read operation is being performed on a selected memory cell according to an embodiment of the present invention.

Figure 148:
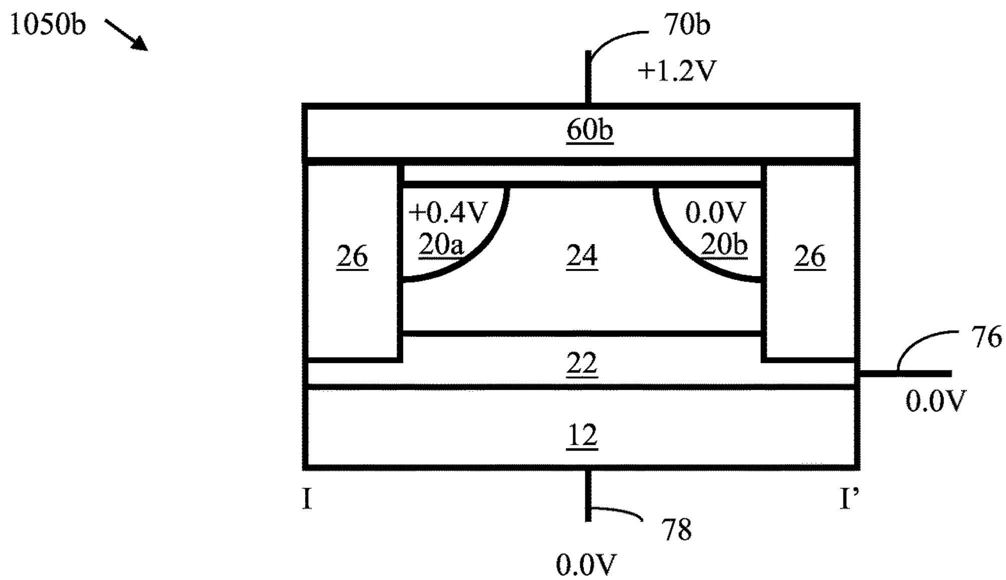

FIG. 148 schematically illustrates the selected memory cell of the array represented in FIG. 147 and bias conditions thereon during the read operation.

Figure 149:
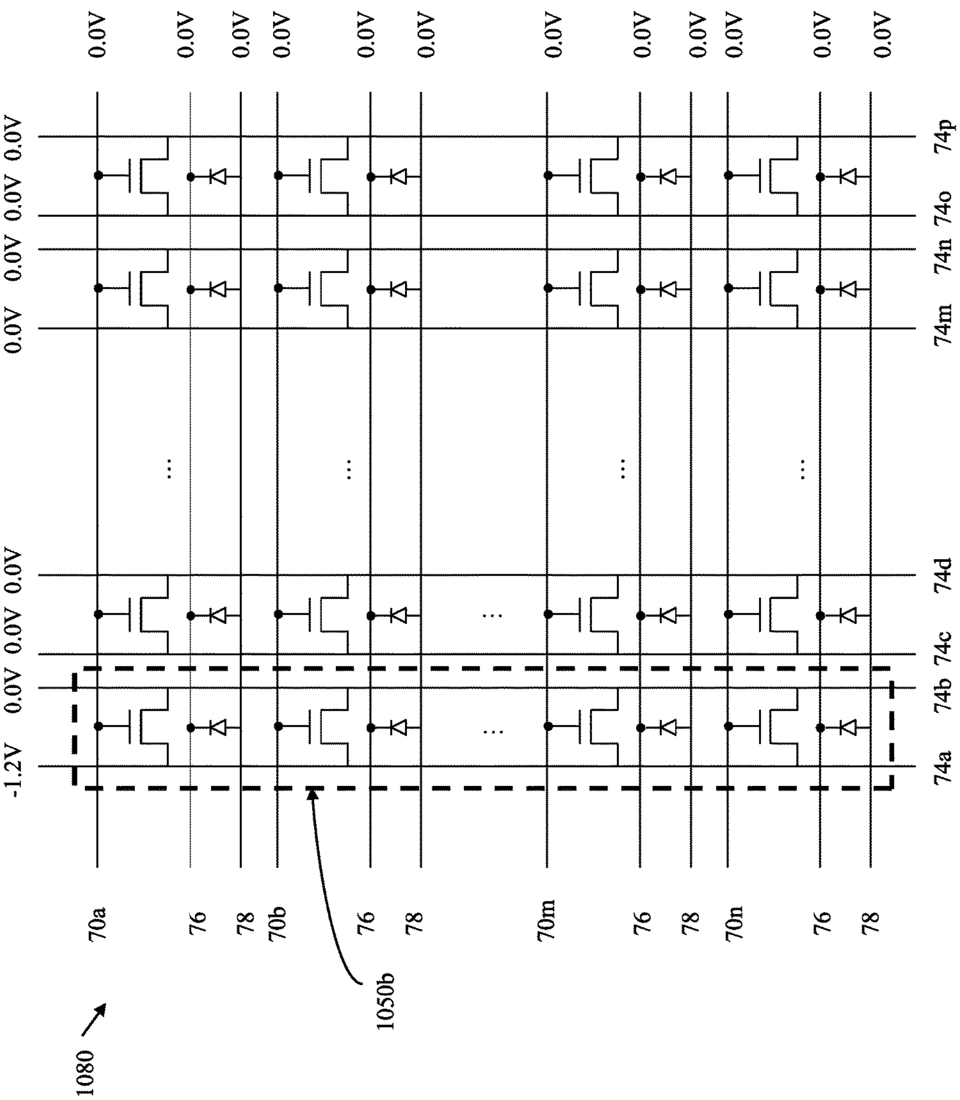

FIG. 149 is a schematic illustration of an equivalent circuit of a memory array in which a write "0" operation is being performed according to an embodiment of the present invention.

Figure 150:
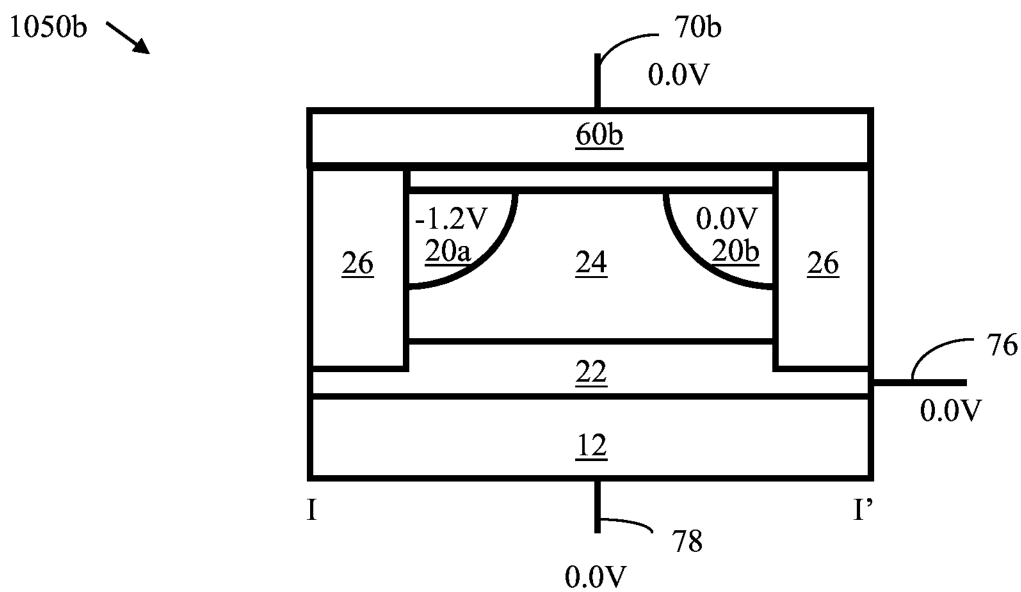

FIG. 150 schematically illustrates a memory cell of the array represented in FIG. 149 that is having a write "0" operation performed thereon according to an embodiment of the present invention.

Figure 151:
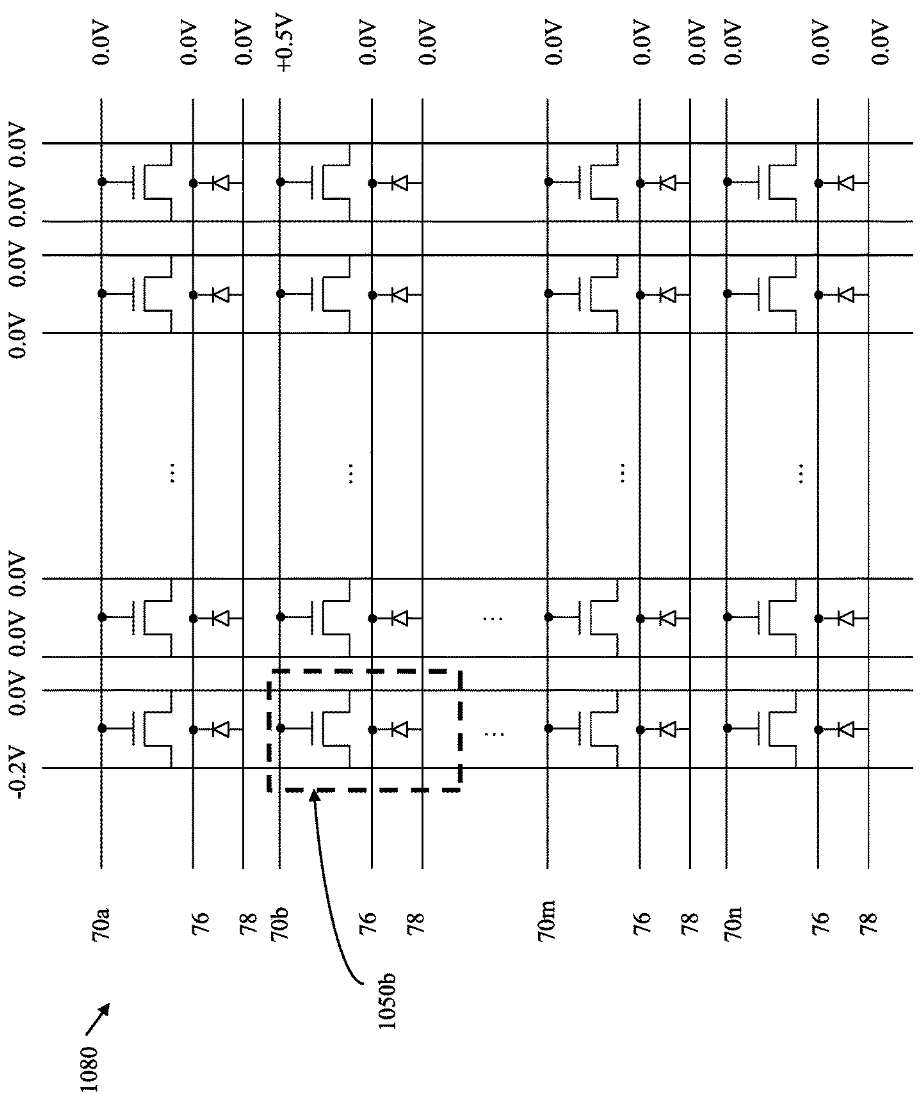

FIG. 151 is a schematic illustration of an equivalent circuit of a memory array in which a write "0" operation is being performed according to an alternative embodiment of the present invention that allows for individual bit writing.

Figure 152:
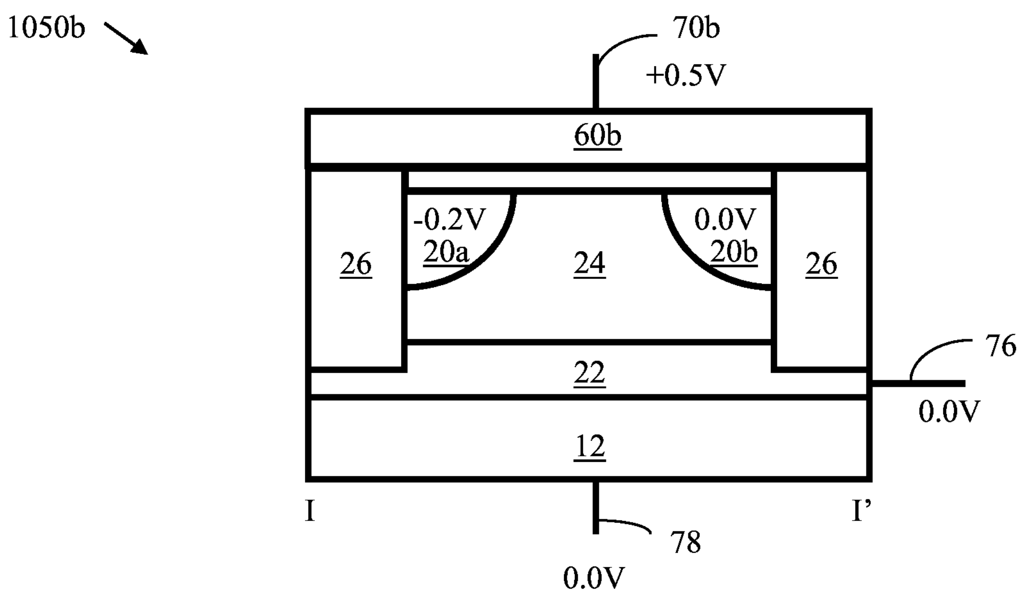

FIG. 152 schematically illustrates a selected memory cell of the array represented in FIG. 151 that is being written to by the write "038 operation according to the alternative embodiment described with regard to FIG. 151.

Figure 153:
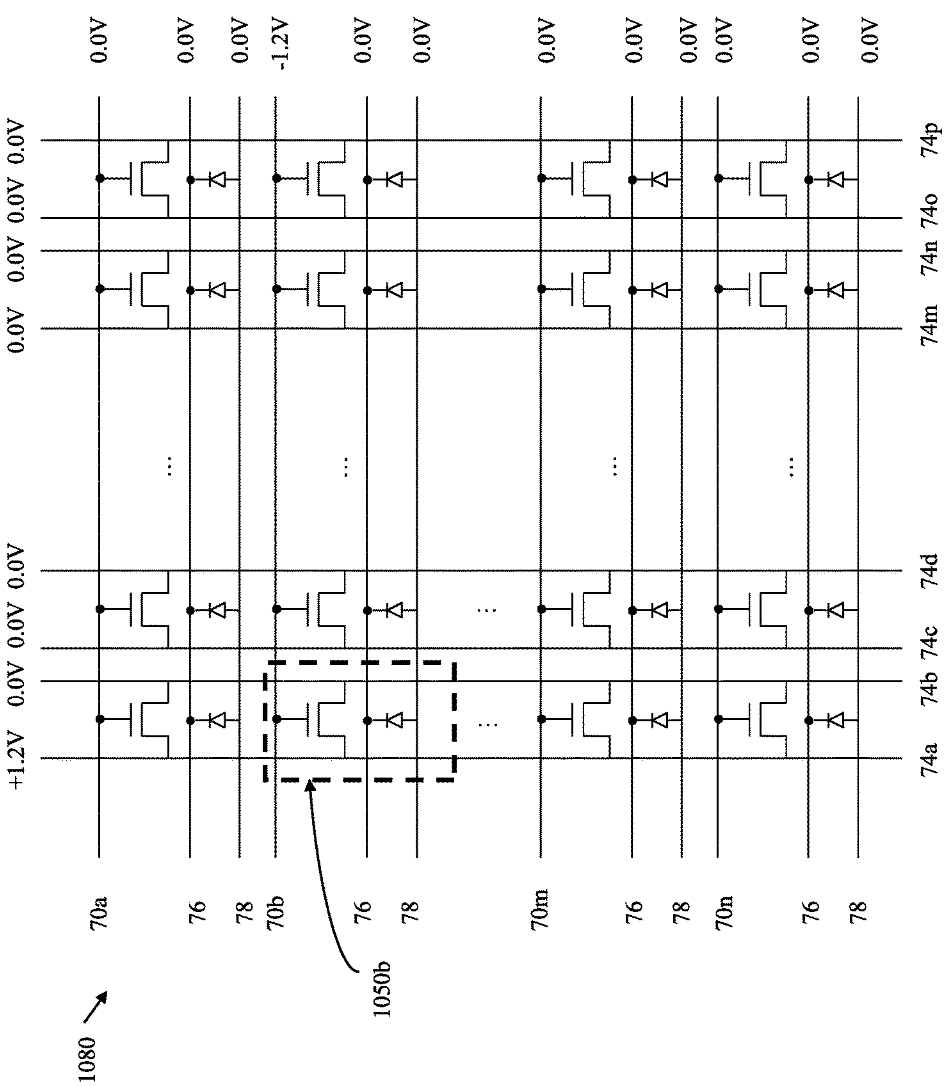

FIG. 153 is a schematic illustration of an equivalent circuit of a memory array in which a write "1" operation is being performed by impact ionization according to an embodiment of the present invention.

Figure 154:
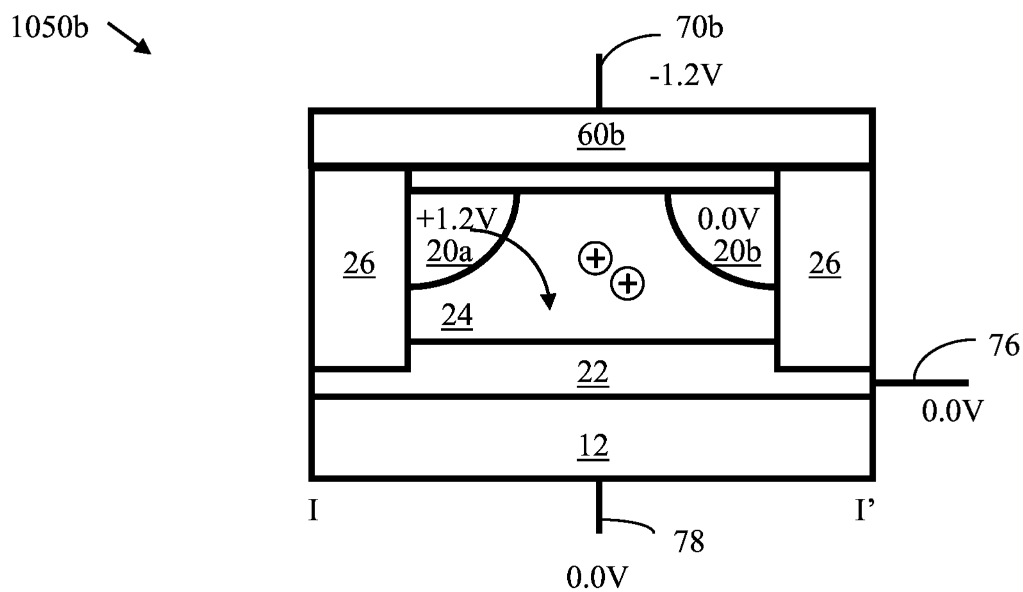

FIG. 154 schematically illustrates a selected memory cell of the array of

FIG. 153 on which the write "1" operation is being performed, and the bias conditions thereon.

Figure 155:
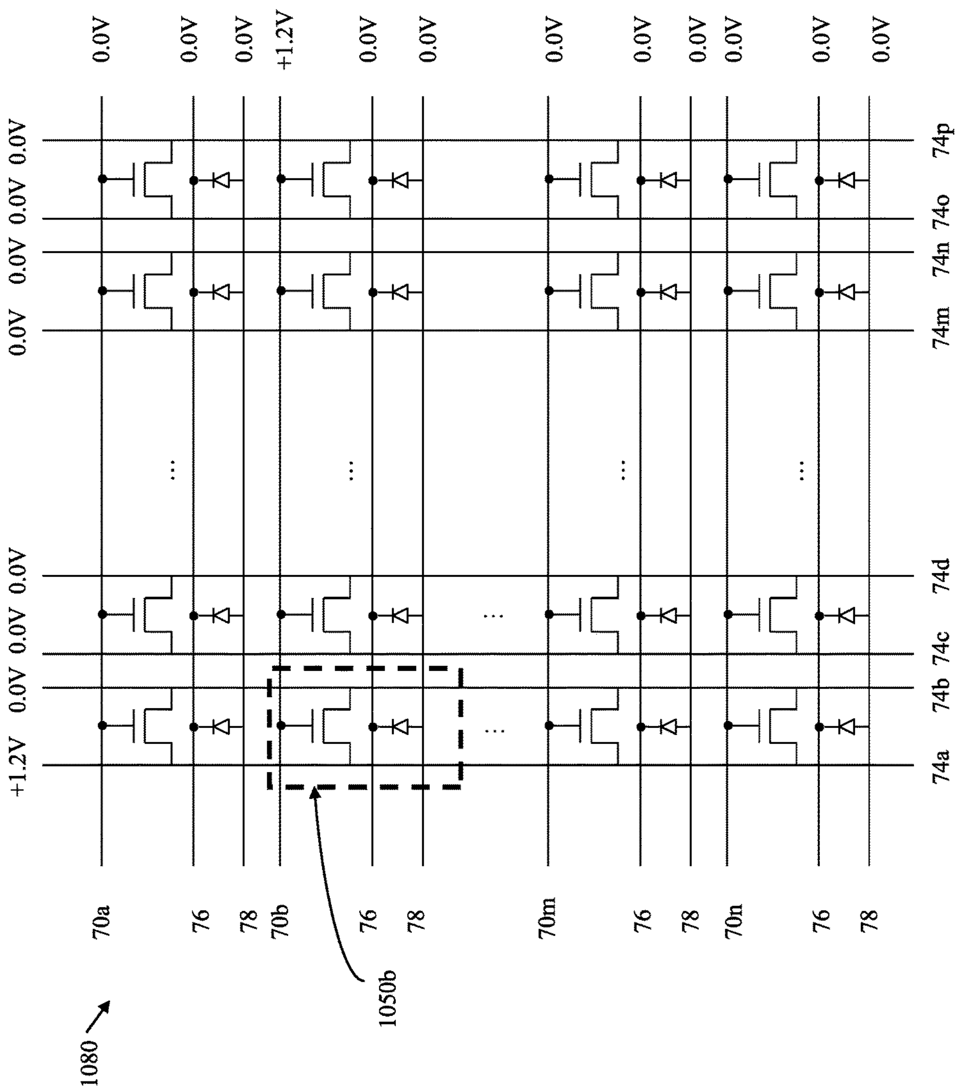

FIG. 155 is a schematic illustration of an equivalent circuit of a memory array in which a write "1" operation is being performed by impact ionization according to an embodiment of the present invention.

Figure 156:
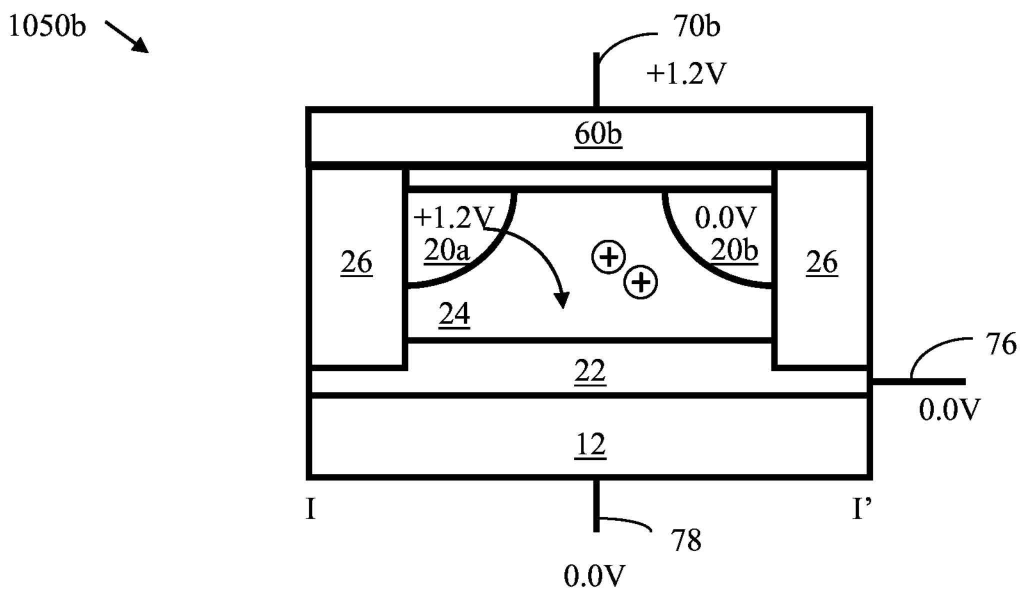

FIG. 156 schematically illustrates a selected memory cell of the array of

FIG. 155 on which the write "1" operation is being performed, and the bias conditions thereon.

Figure 157:
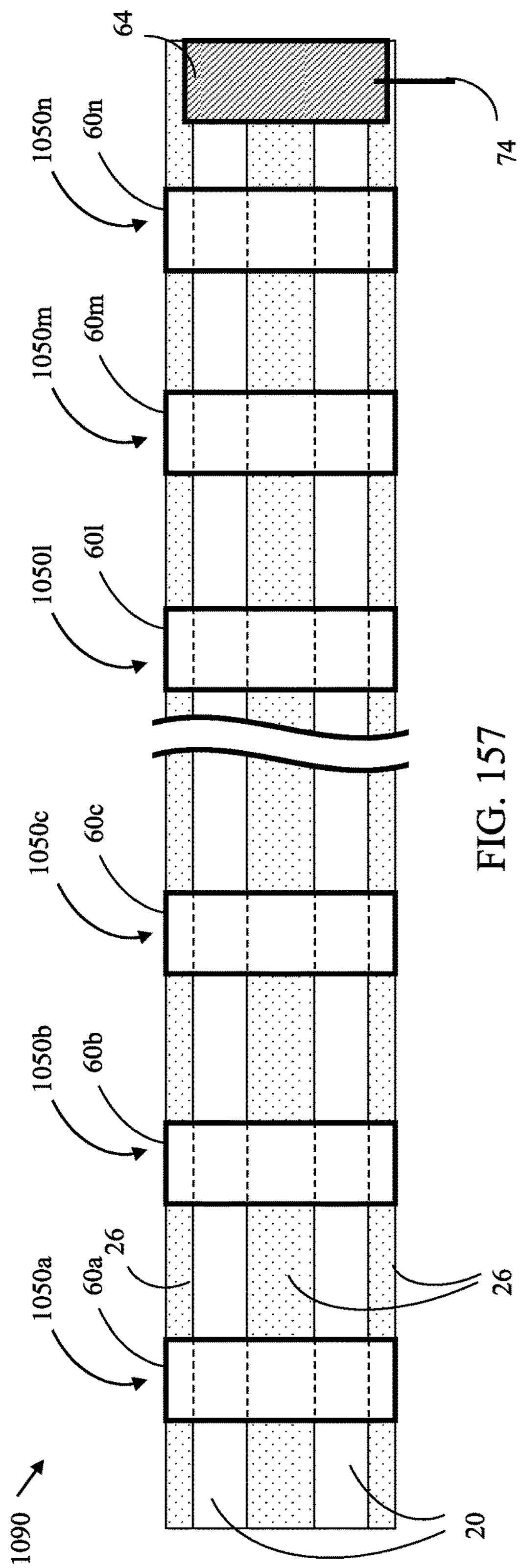

FIG. 157 shows a memory array where adjacent regions are connected a common BL terminal through a conductive region according to an alternative embodiment of the present invention.

Figure 158A:
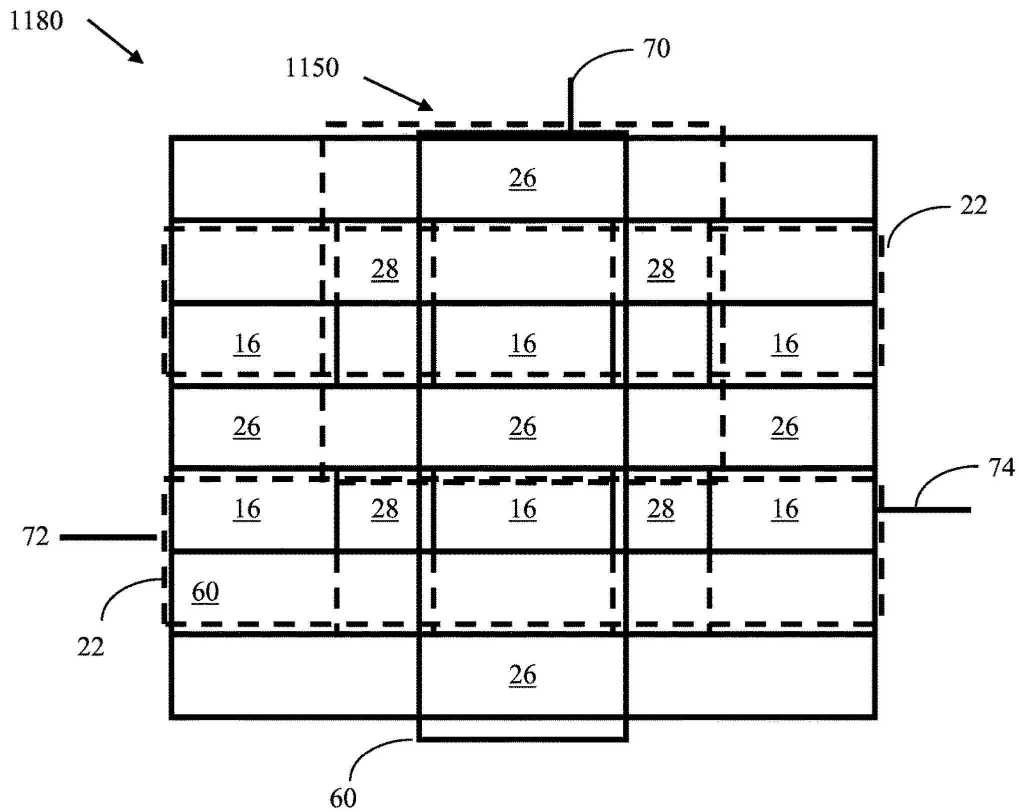

FIG. 158A shows a memory array according to another embodiment of the present invention.

Figure 158B:
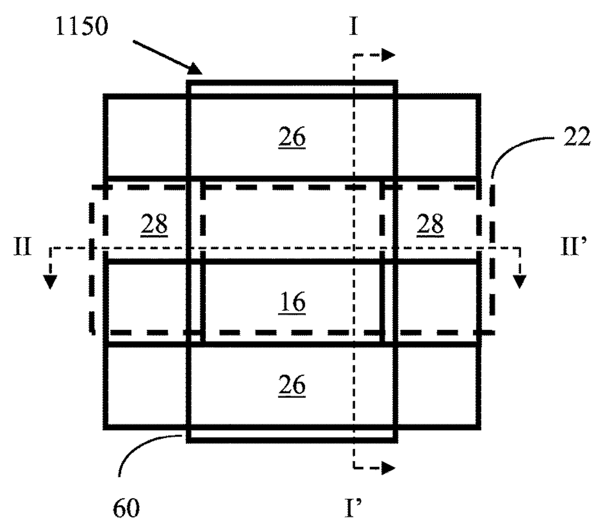

FIG. 158B shows, in isolation, a memory cell from the memory array of FIG. 158A.

Figure 158C:
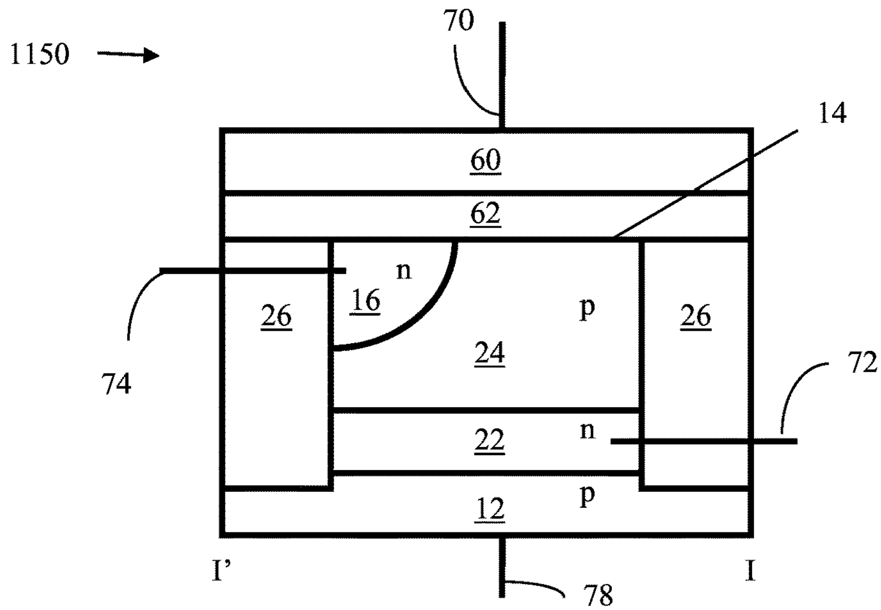
Figure 158D:
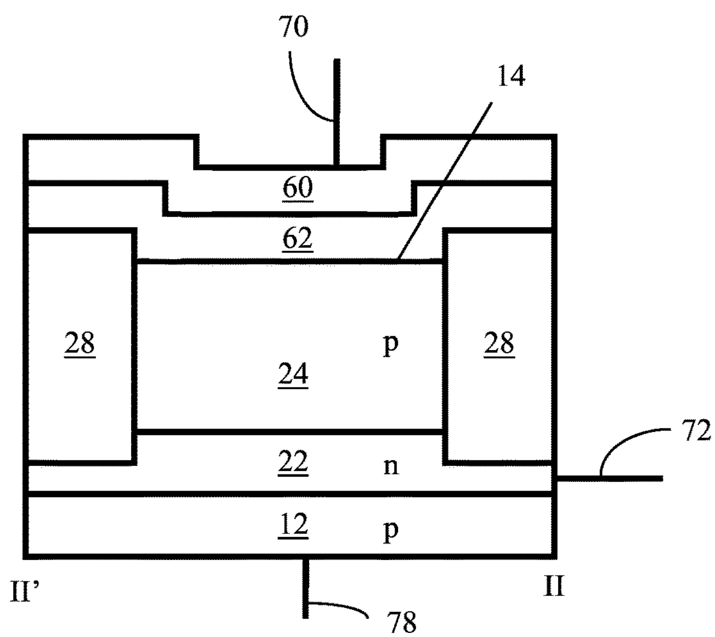

FIGS. 158C and 158D show sectional views of the memory cell of FIG. 158B taken along lines I-I' and II-II' of FIG. 158B, respectively.

Figure 159:
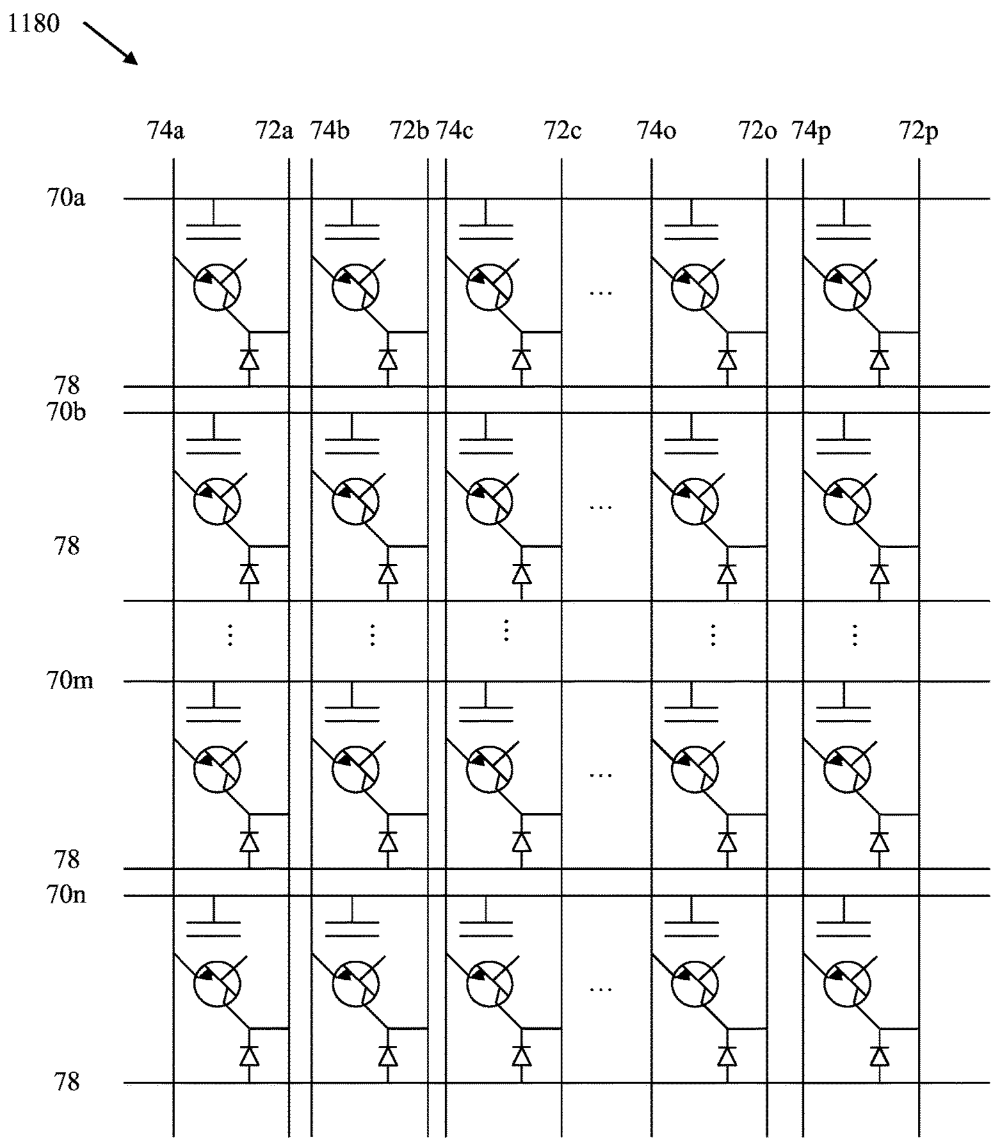

FIG. 159 is an equivalent circuit representation of a memory array of the type shown in FIG. 158A according to an embodiment of the present invention.

Figure 160A:
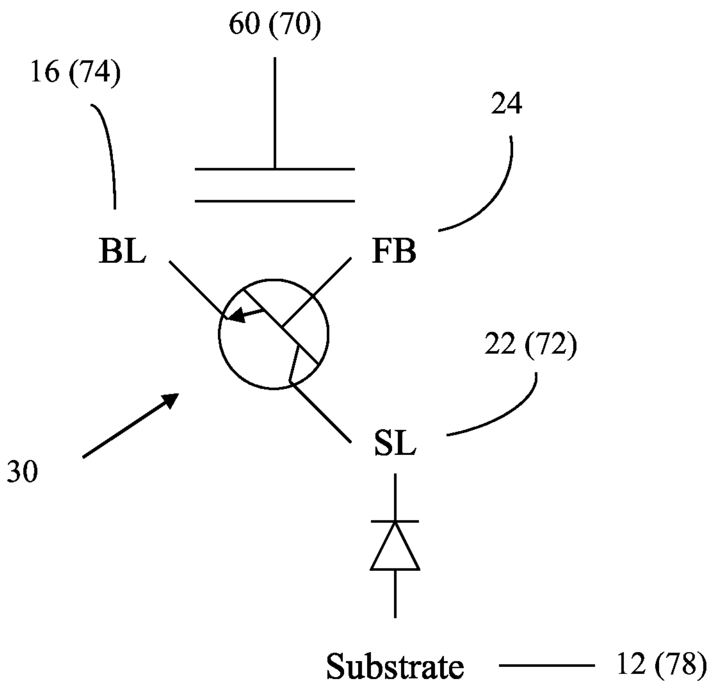

FIG. 160A shows an equivalent circuit representation of the memory cell of FIGS. 158B-158D according to an embodiment of the present invention.

Figure 160B:
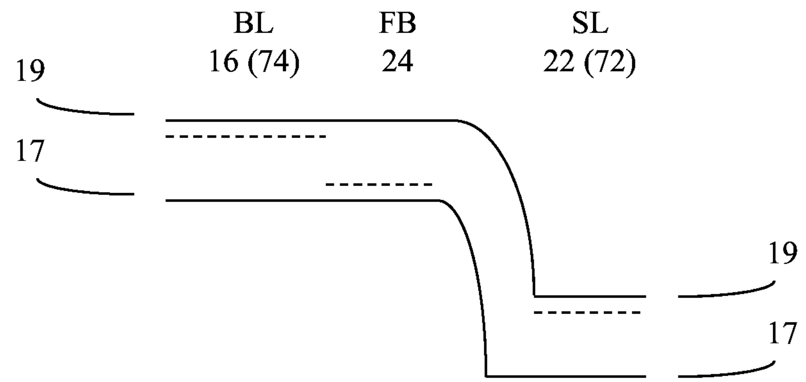

FIG. 160B shows an energy band diagram of the intrinsic n-p-n bipolar device of FIG. 160A when the floating body region is positively charged and a positive bias voltage is applied to the buried well region, according to an embodiment of the present invention.

Figure 160C:
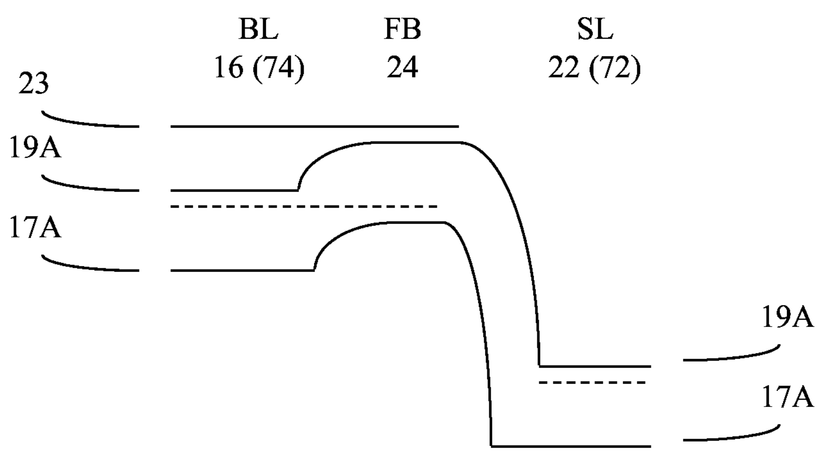

FIG. 160C shows an energy band diagram of the intrinsic n-p-n bipolar device 30 of FIG. 160A when the floating body region is neutrally charged and a bias voltage is applied to the buried well region, according to an embodiment of the present invention.

Figure 161:
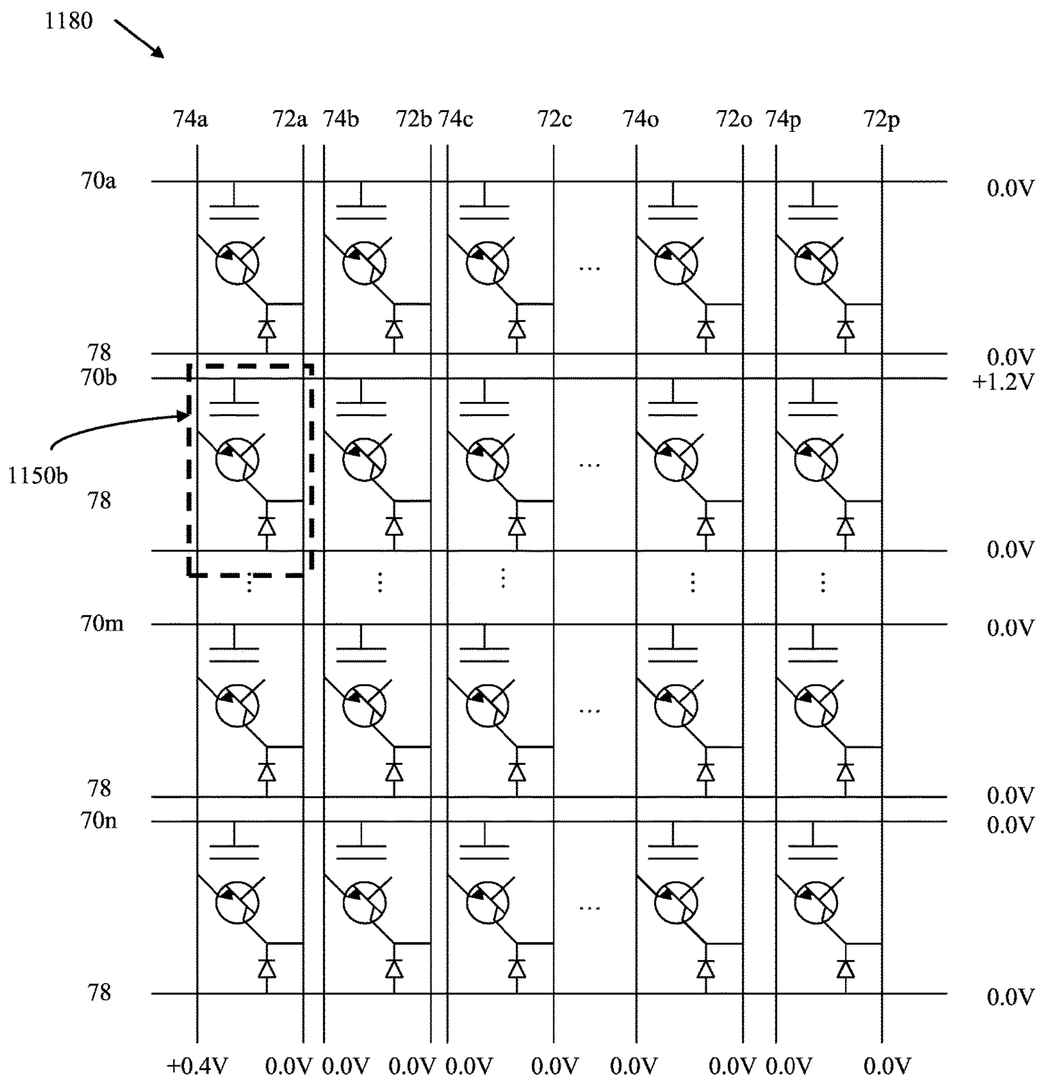

FIG. 161 is a schematic illustration of a memory array in which a read operation is being performed on a selected memory cell according to an embodiment of the present invention.

Figure 162:
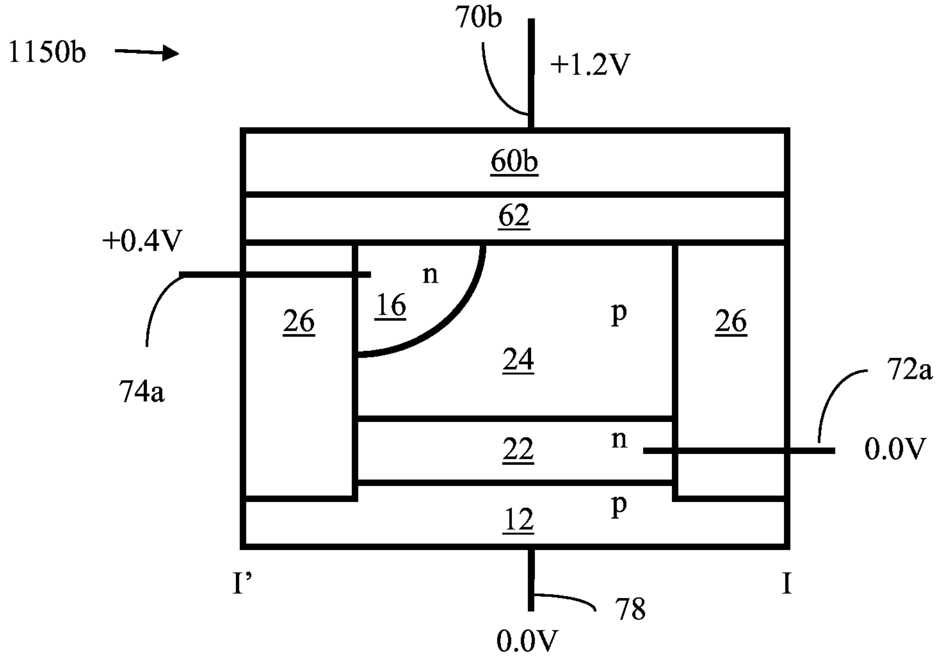

FIG. 162 is a schematic illustration of the selected memory cell in FIG. 161 that is being read, and bias conditions thereon during the read operation.

Figure 163:
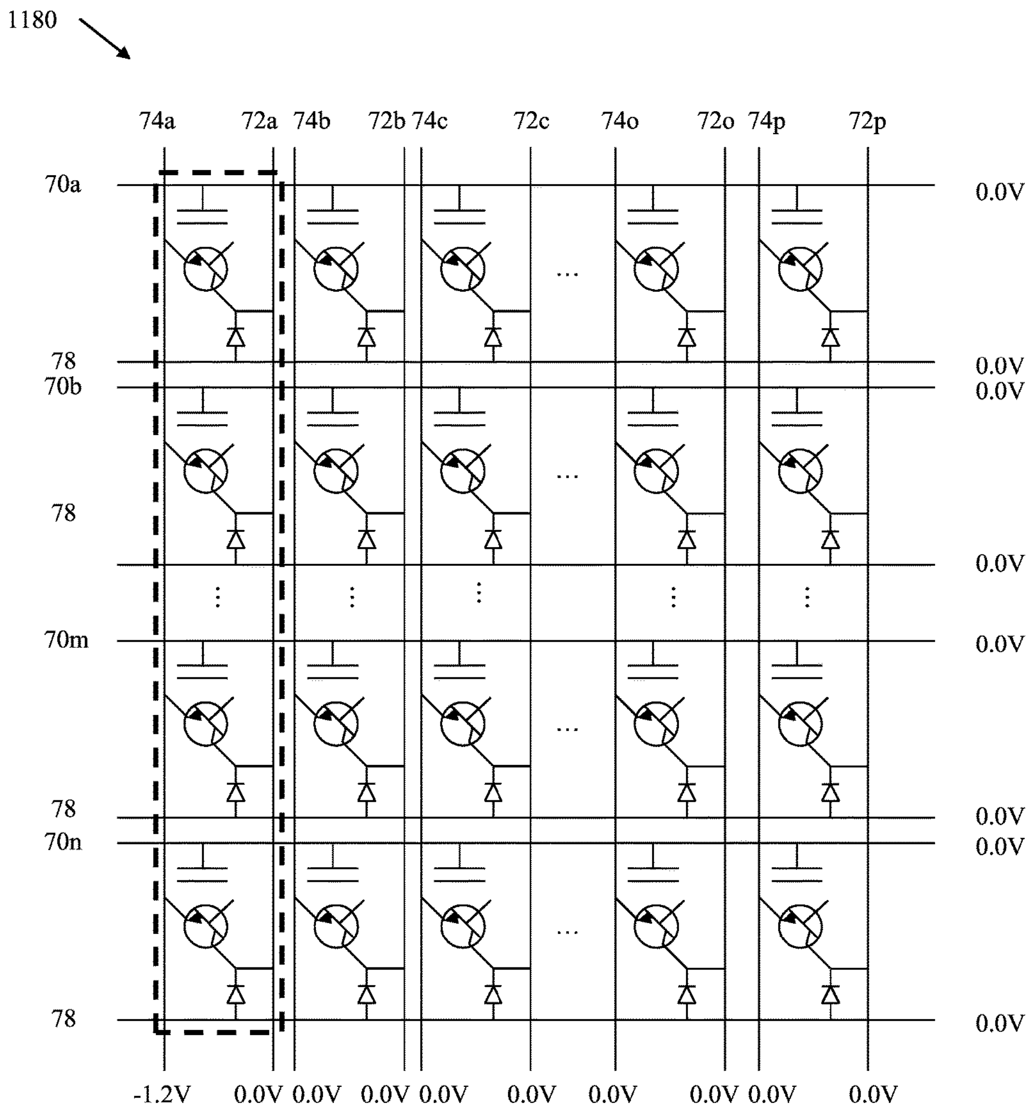

FIG. 163 is a schematic illustration of a memory array in which a write "0" operation is being performed according to an embodiment of the present invention.

Figure 164:
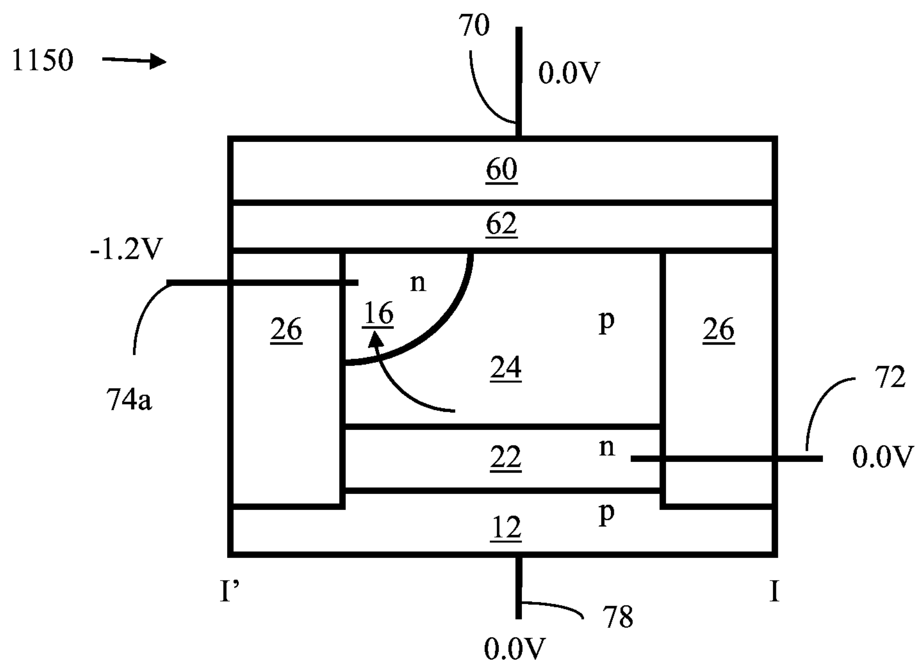

FIG. 164 schematically illustrates a memory cell of the array represented in FIG. 163 that is having a write "0" operation performed thereon according to an embodiment of the present invention.

Figure 165:
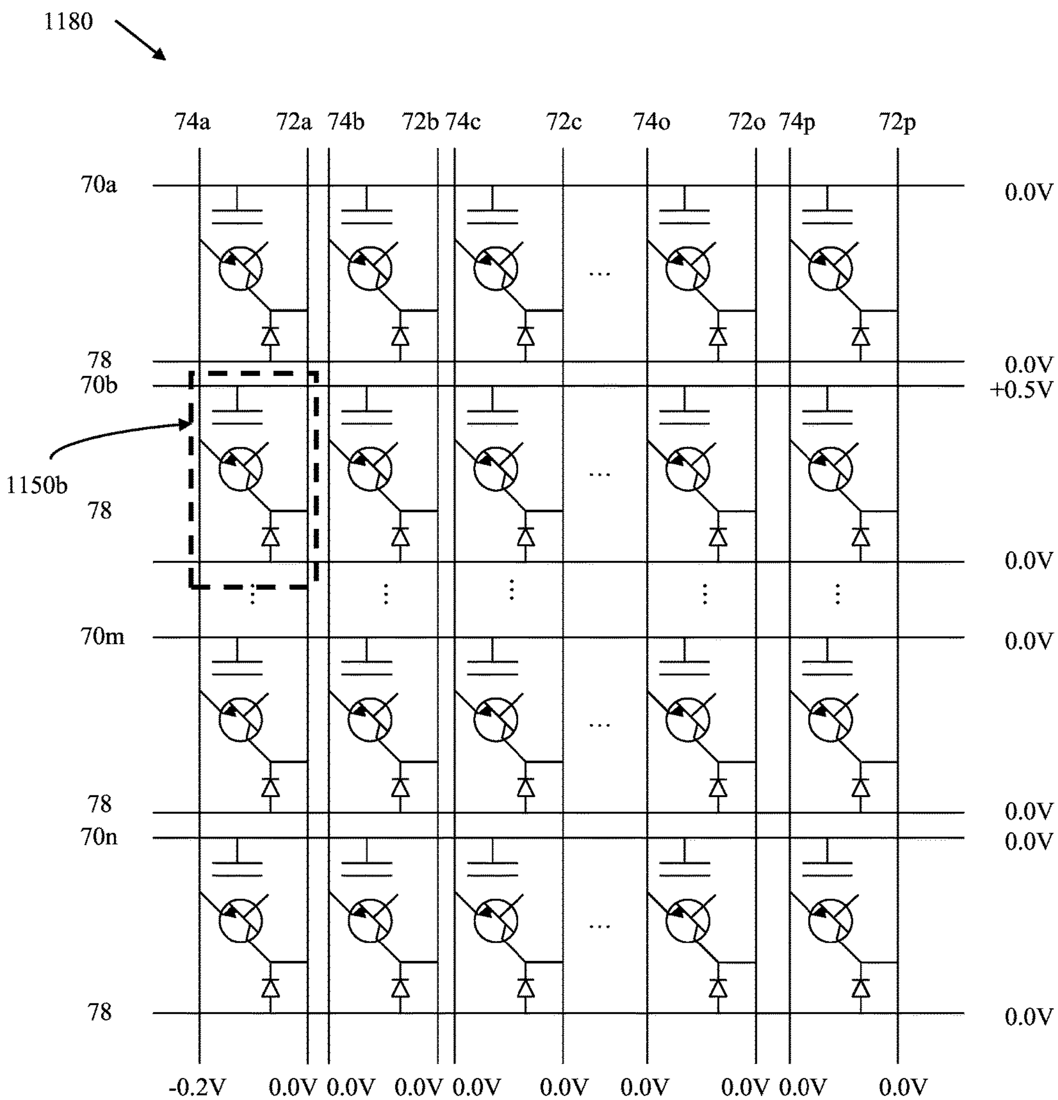

FIG. 165 is a schematic illustration of a memory array in which a write "0" operation is being performed according to an alternative embodiment of the present invention.

Figure 166:
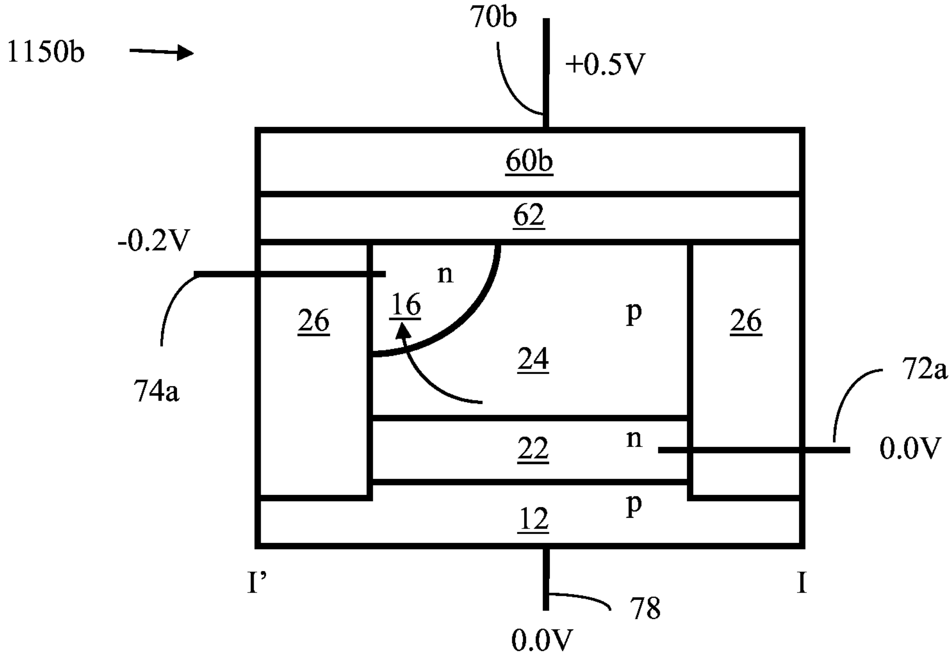

FIG. 166 schematically illustrates a memory cell of the array represented in FIG. 165 that is having a write "0" operation performed thereon according to the alternative embodiment described with regard to FIG. 165.

Figure 167:
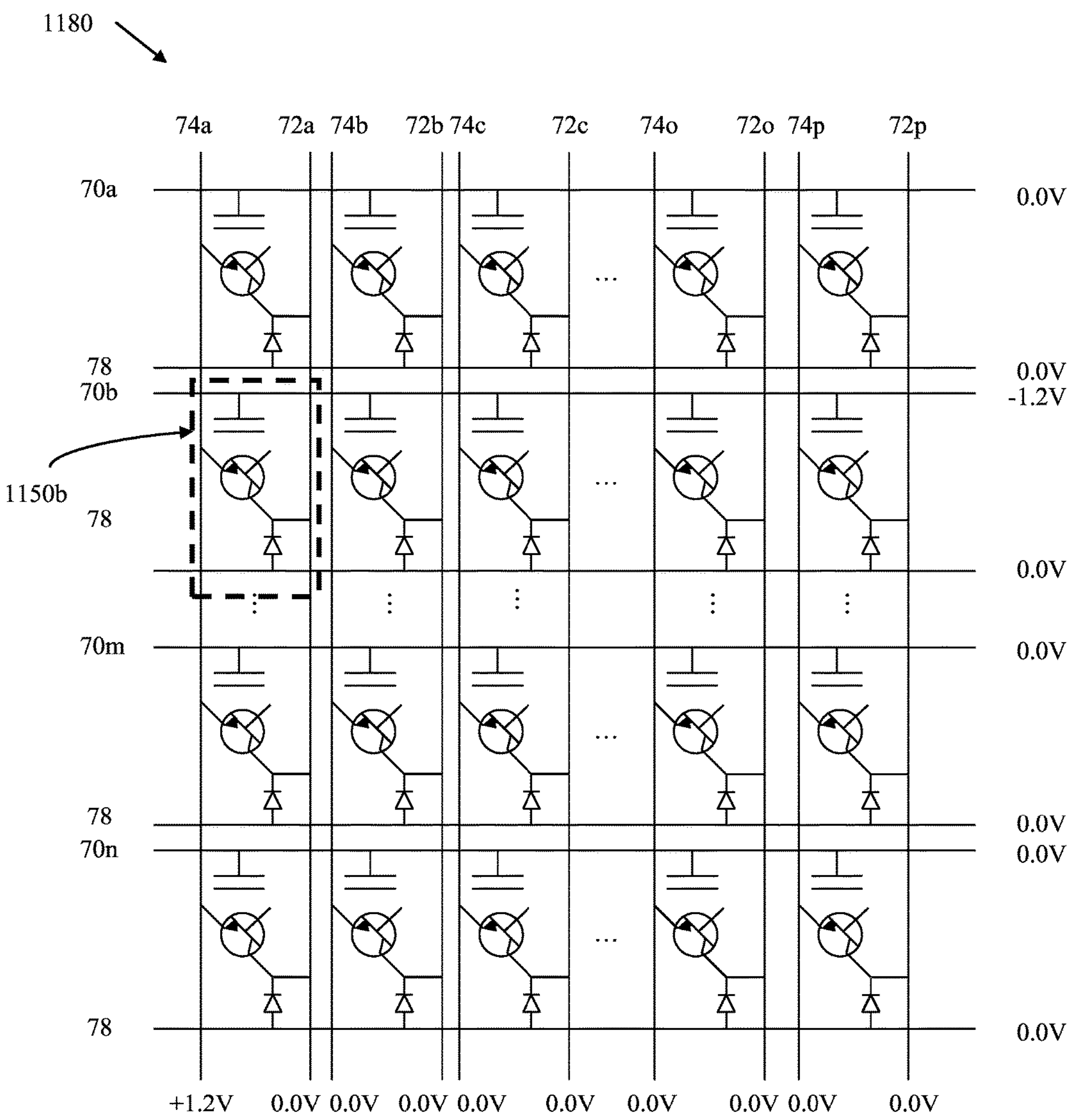

FIG. 167 is a schematic illustration of a memory array in which a write "1" operation is being performed by band-to-band tunneling according to an embodiment of the present invention.

Figure 168:
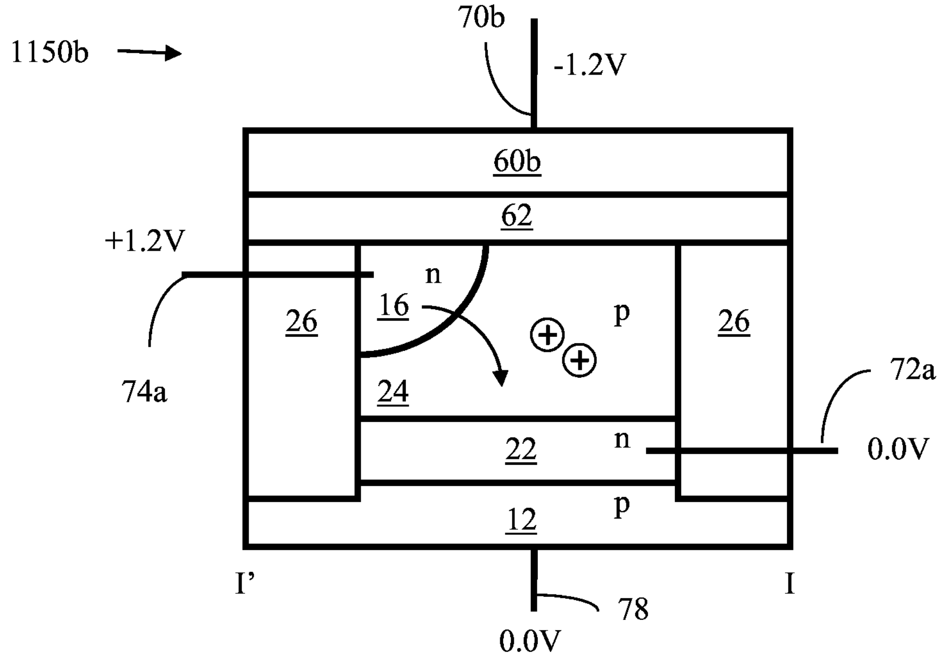

FIG. 168 schematically illustrates a selected memory cell of the array of

FIG. 167 on which the write "1" operation is being performed, and the bias conditions thereon.

Figure 169:
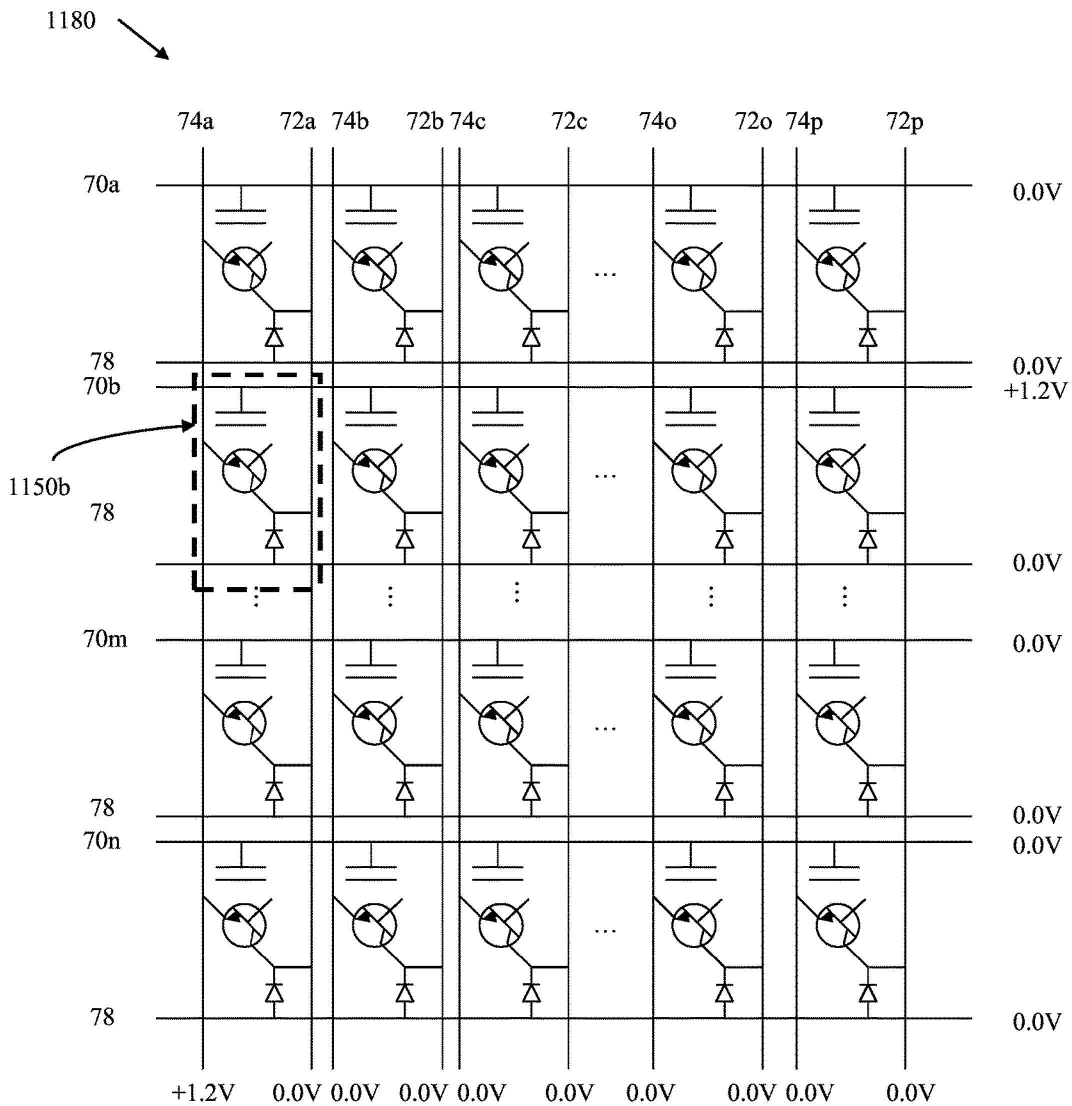

FIG. 169 is a schematic illustration of a memory array in which a write "1" operation is being performed by impact ionization according to an embodiment of the present invention.

Figure 170:
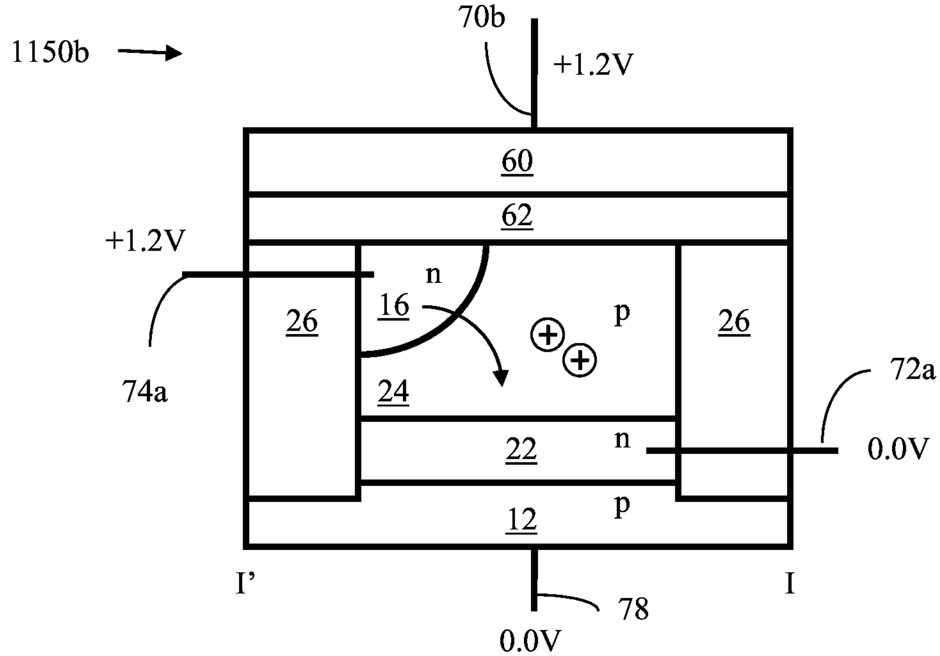

FIG. 170 schematically illustrates a selected memory cell of the array of FIG. 169 on which the write "1" operation is being performed, and the bias conditions thereon.

Figure 171:
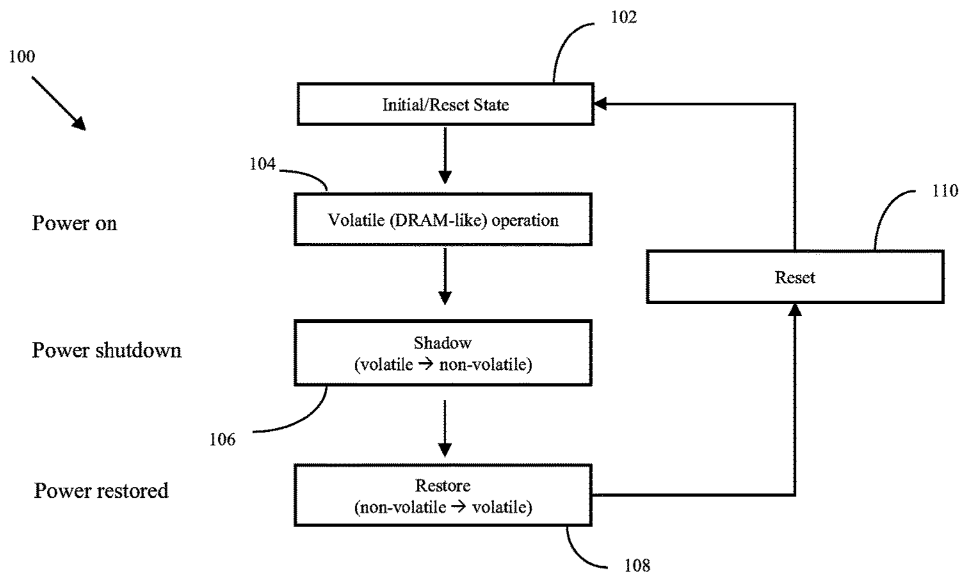

FIG. 171 is a flow chart illustrating the operation of a memory cell according to an embodiment of the present invention.

Figure 172:
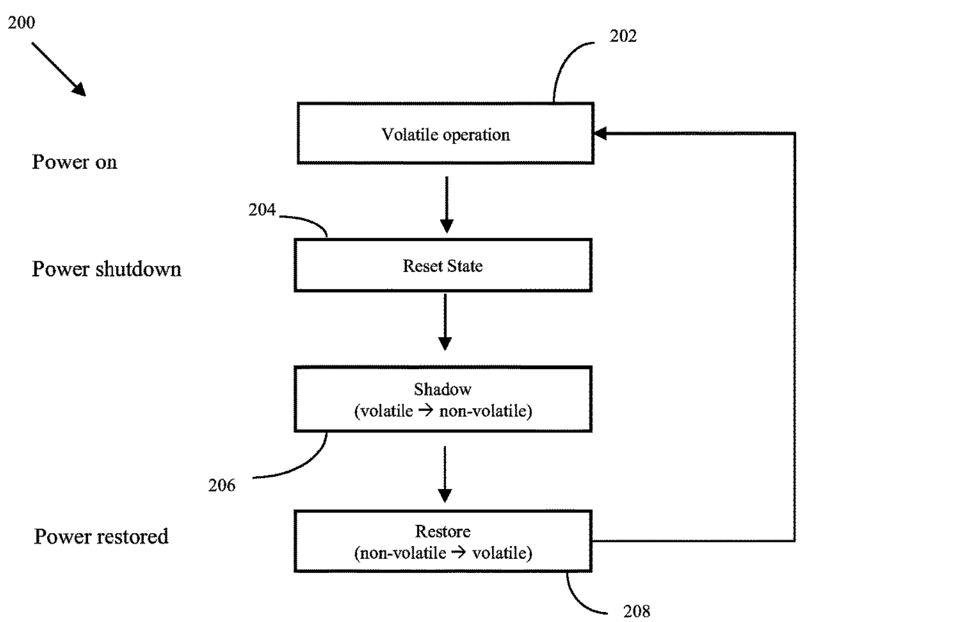

FIG. 172 is a flow chart illustrating operation of a memory cell according to another embodiment of the present invention.

Figure 173A:
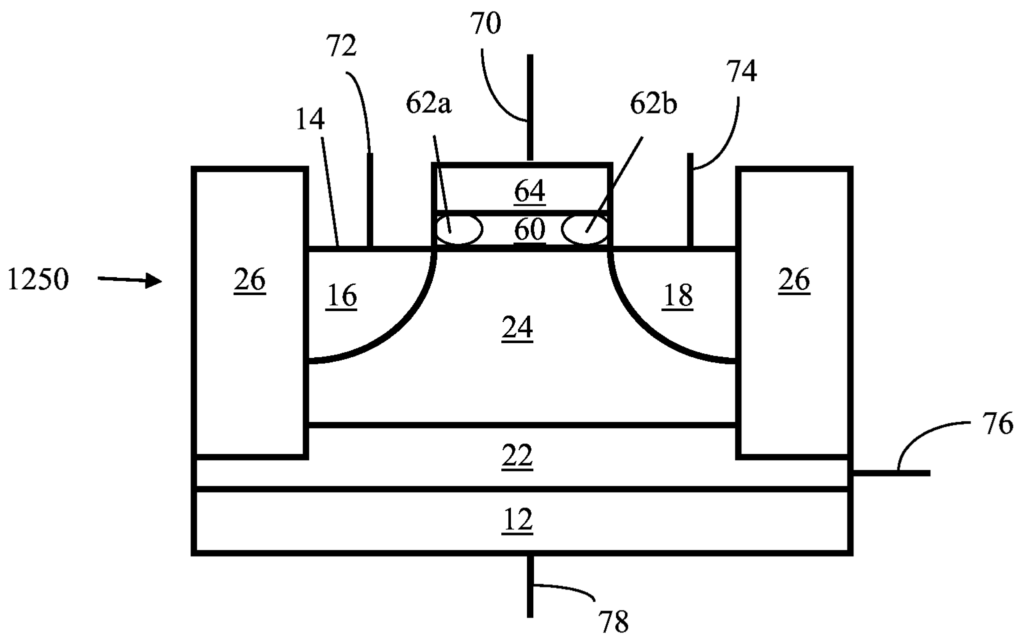

FIG. 173A is a cross-section, schematic illustration of a memory cell according to an embodiment of the present invention.

Figure 173B:
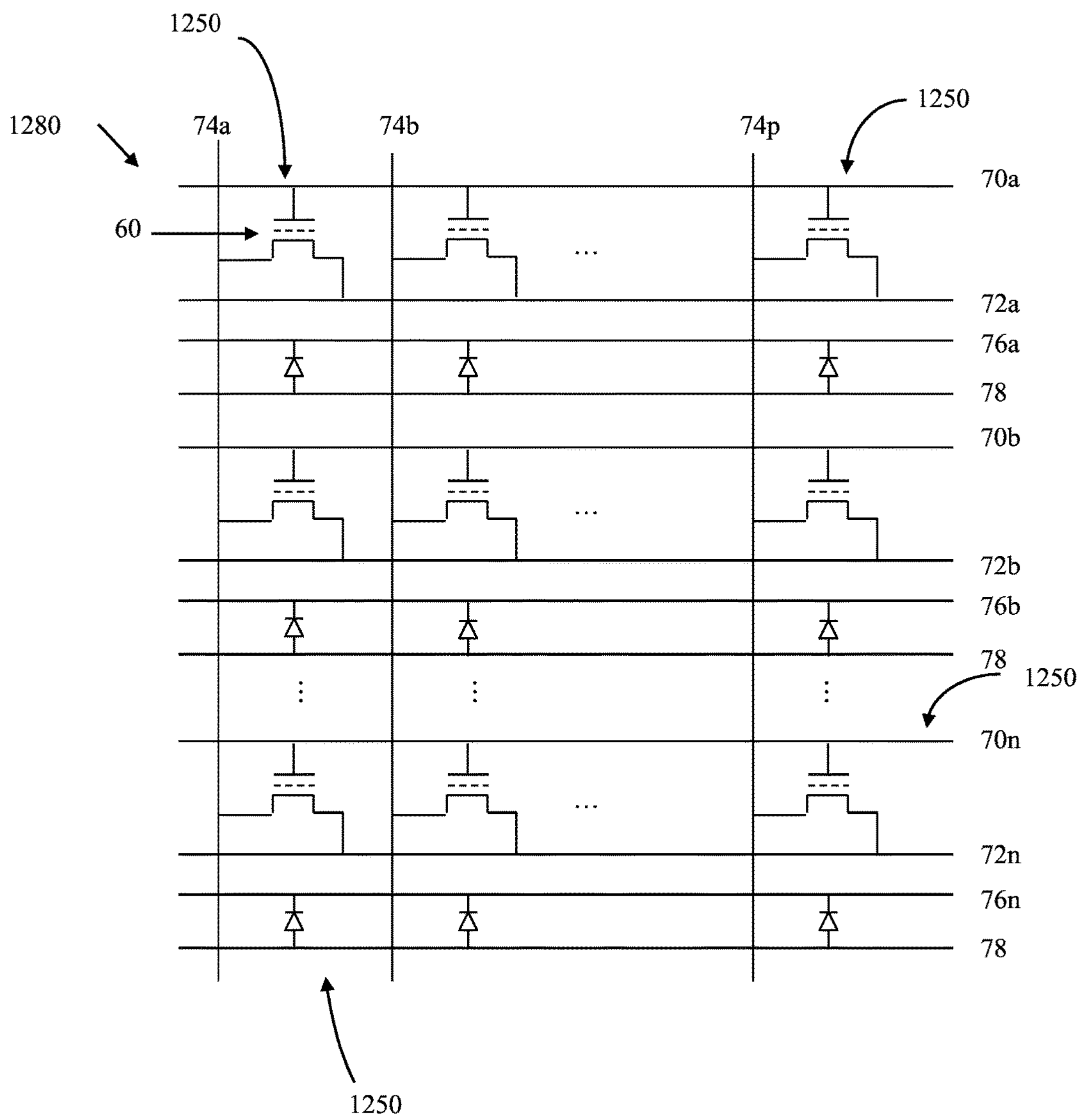

FIG. 173B shows an exemplary array of memory cells arranged in rows and columns according to an embodiment of the present invention.

Figure 173C:
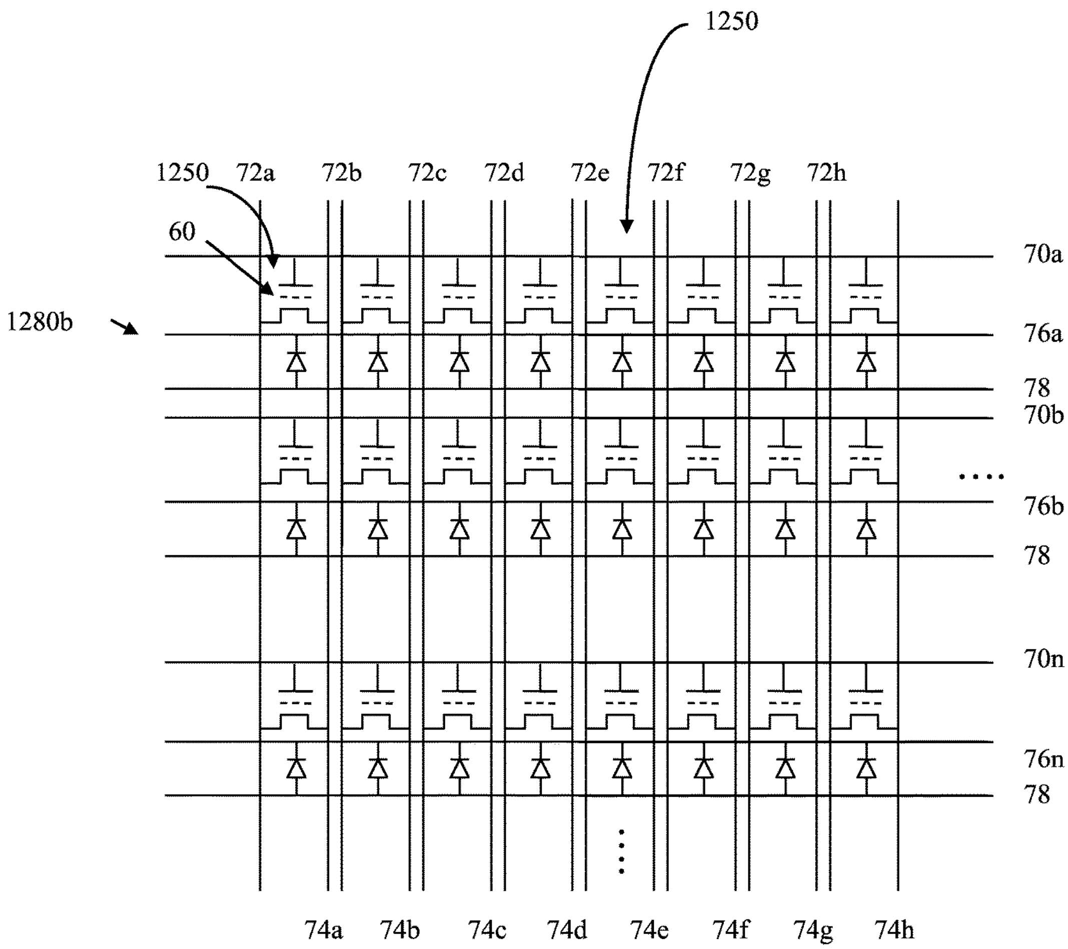

FIG. 173C shows an array architecture of a memory cell device according to another embodiment of the present invention.

Figure 174:
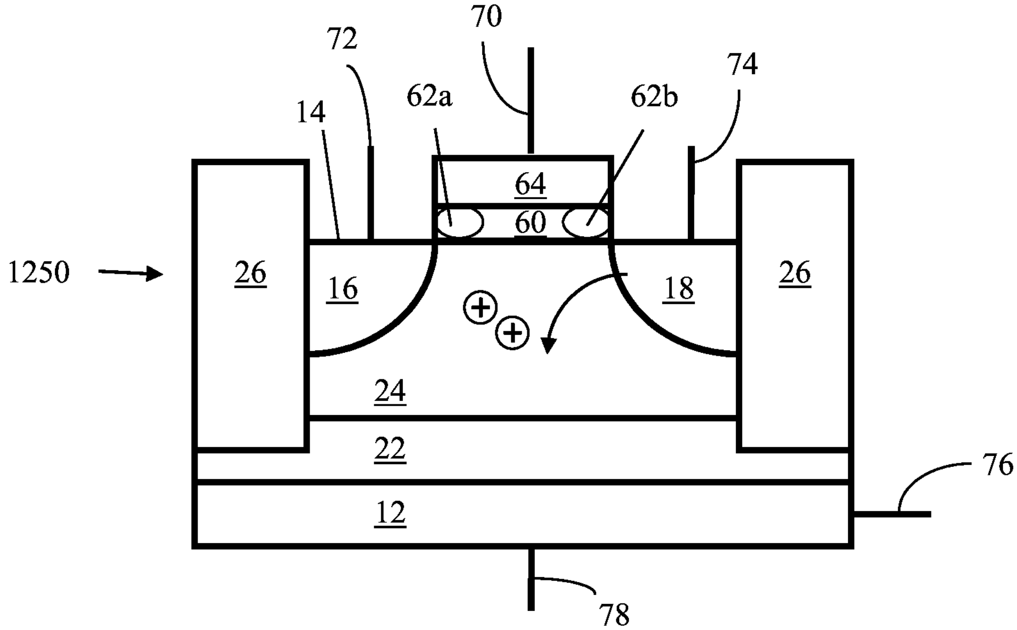

FIG. 174 illustrates an operating condition for a write state "1" operation that can be carried out on a memory cell according to an embodiment of the present invention.

Figure 175:
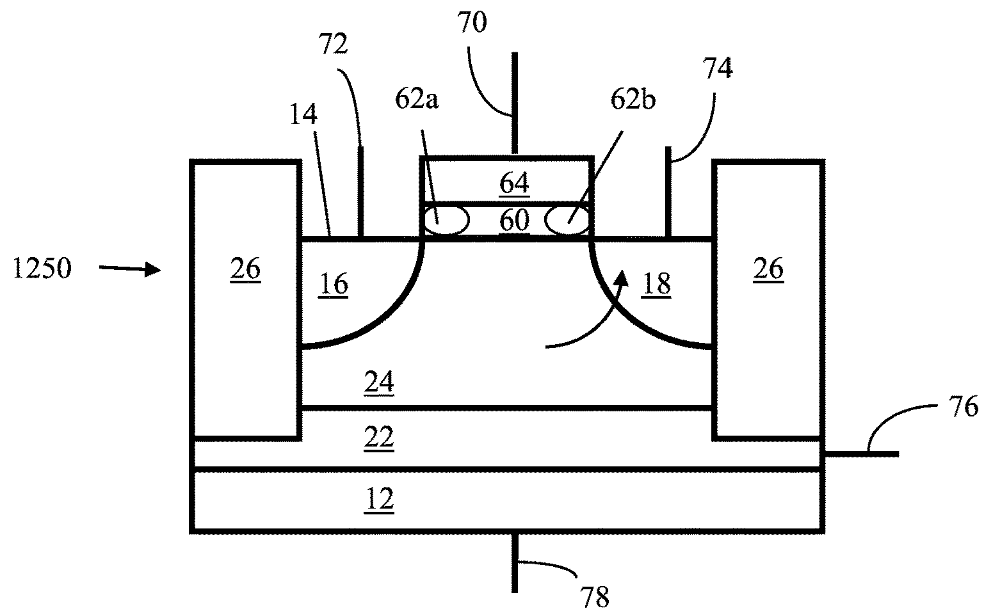

FIG. 175 illustrates an operating condition for a write state "0" operation that can be carried out on a memory cell according to an embodiment of the present invention.

Figure 176:
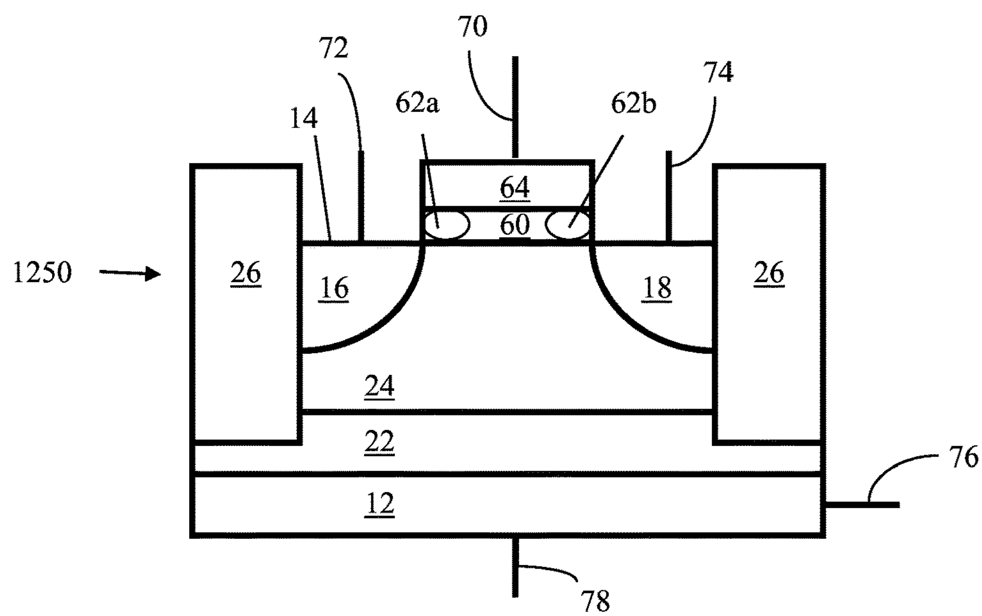
Figure 177:
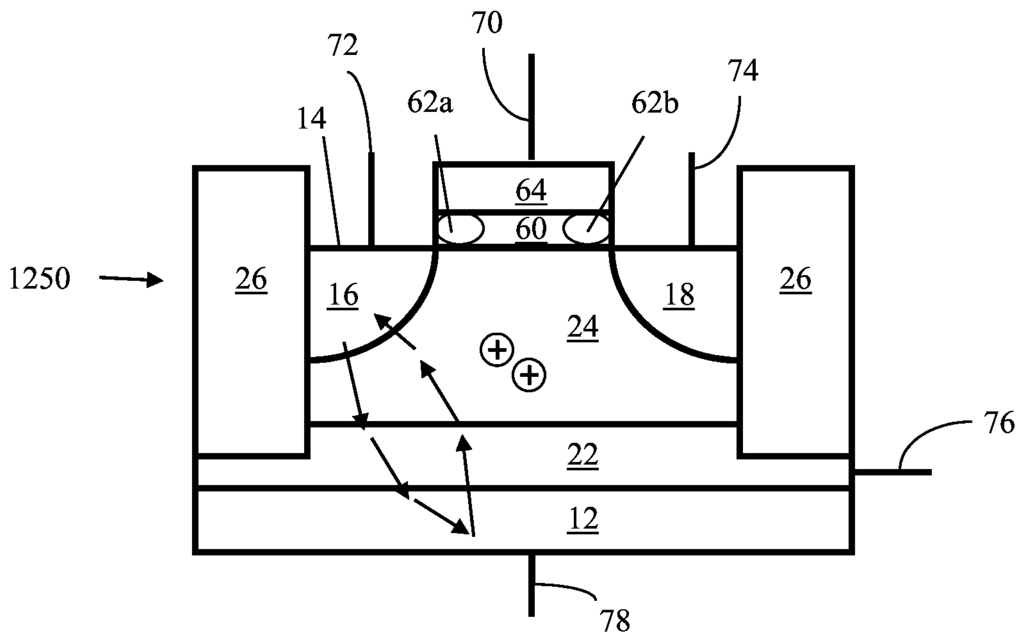
Figure 178A:
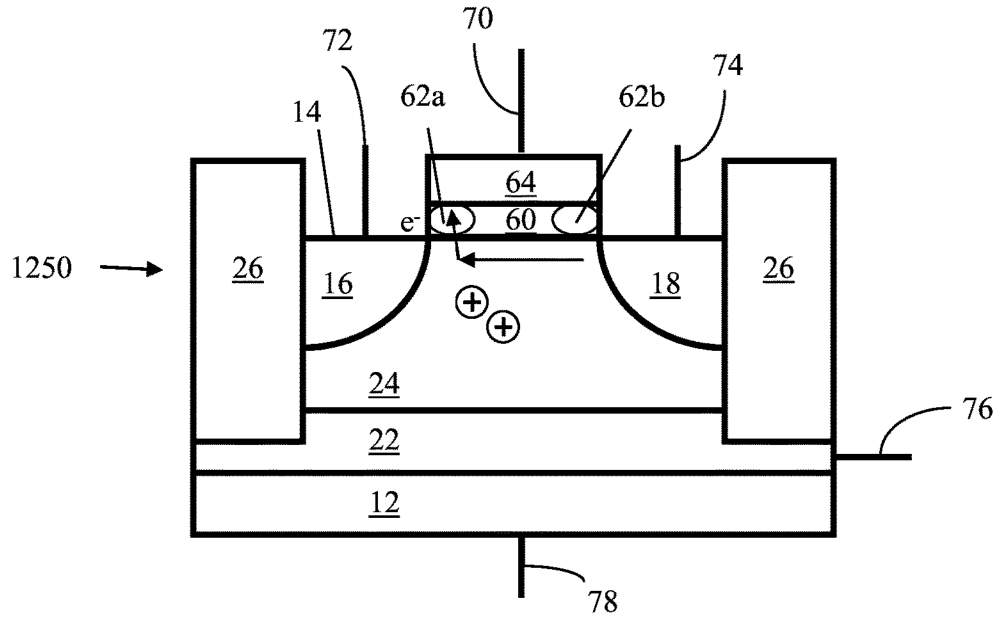
Figure 178B:
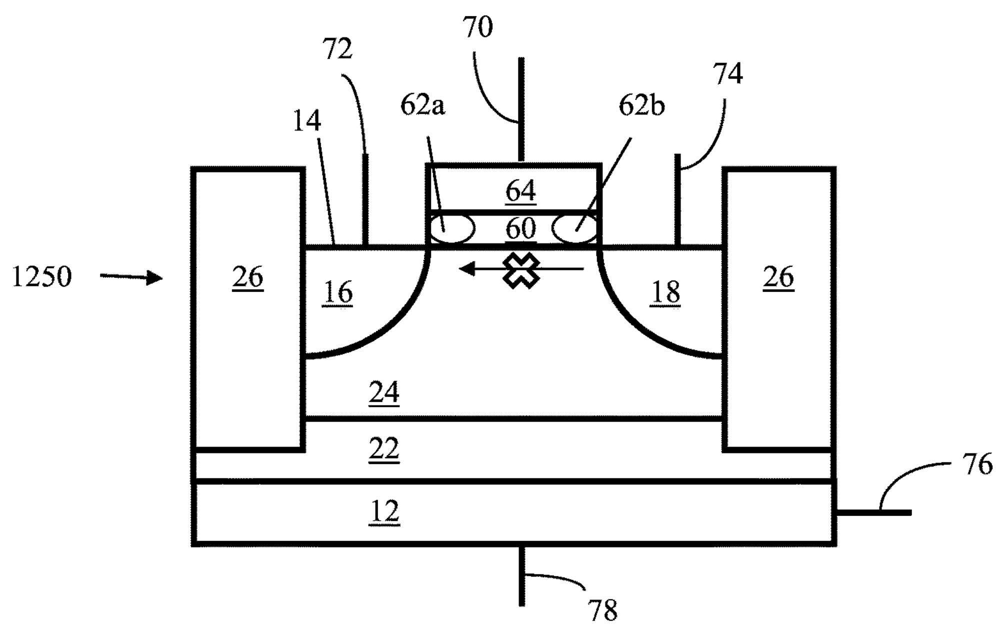

FIG. 176 illustrates a read operation that can be carried out on a memory cell according to an embodiment of the present invention FIG. 177 illustrates a holding or refresh operation that can be carried out on a memory cell according to an embodiment of the present invention FIGS. 178A-178B illustrate shadowing operations that can be carried out according to an embodiment of the present invention.

Figure 179A:
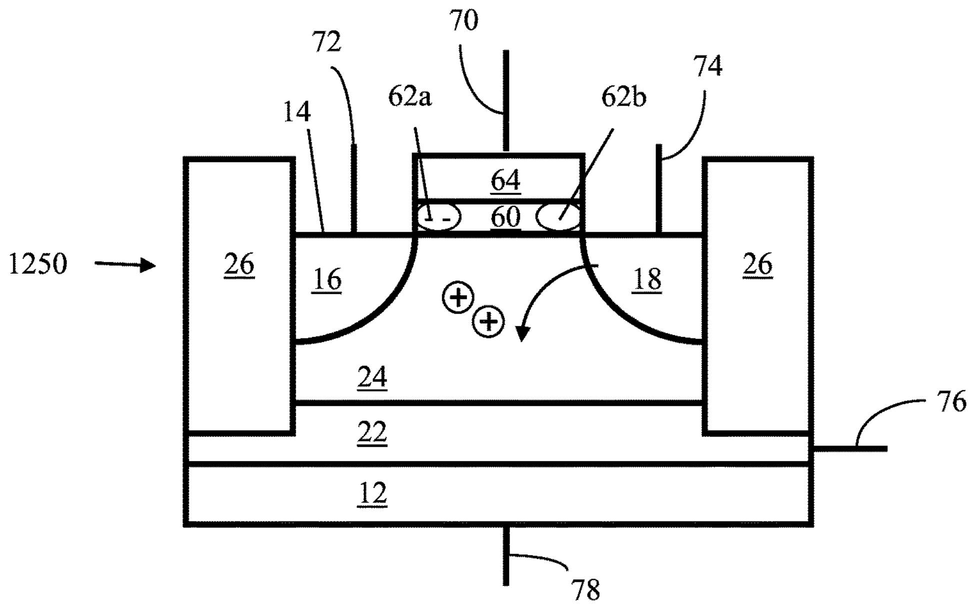
Figure 179B:
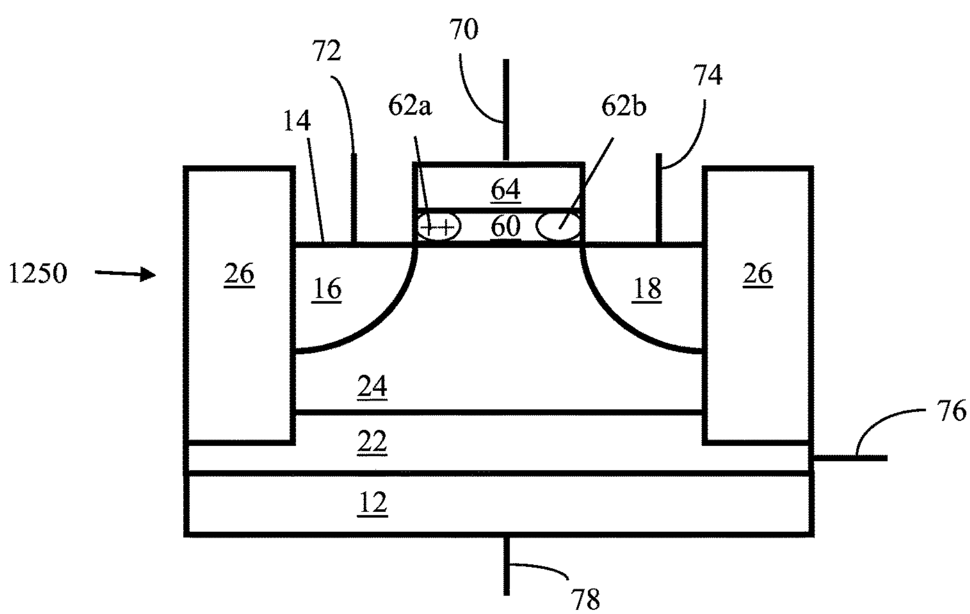

FIGS. 179A-179B illustrate restore operations that can be carried out according to an embodiment of the present invention.

Figure 180:
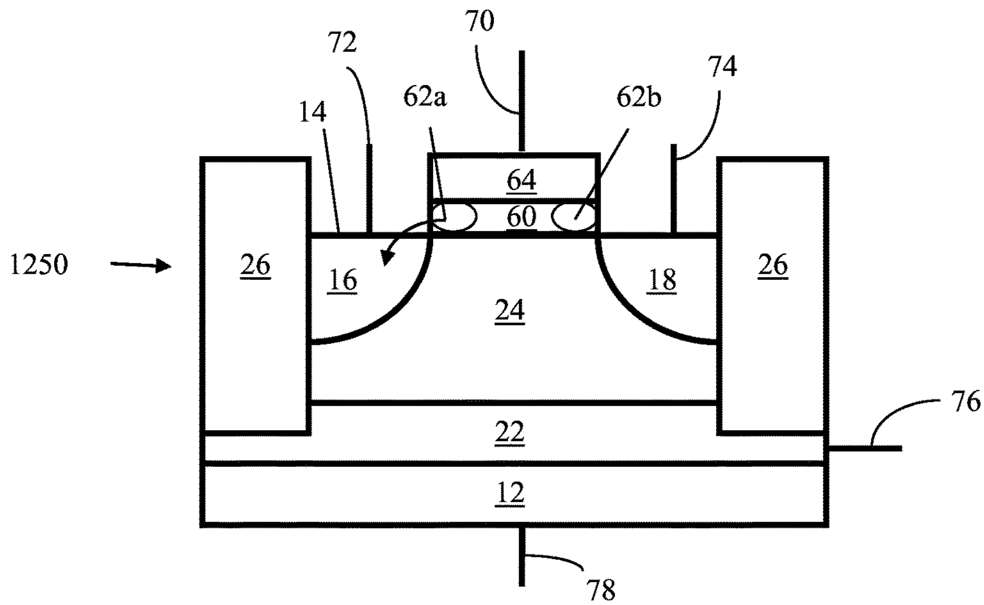

FIG. 180 illustrates resetting the trapping layer(s) of a memory cell to a predetermined state, according to an embodiment of the present invention.

Figure 181A:
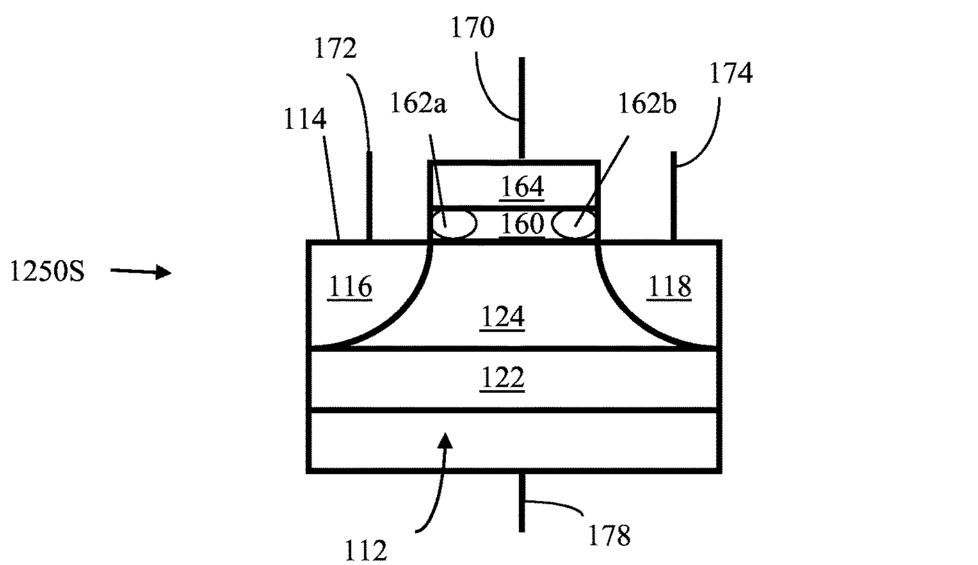

FIG. 181A is a schematic, cross-sectional illustration of a memory cell according to another embodiment of the present invention.

Figure 181B:
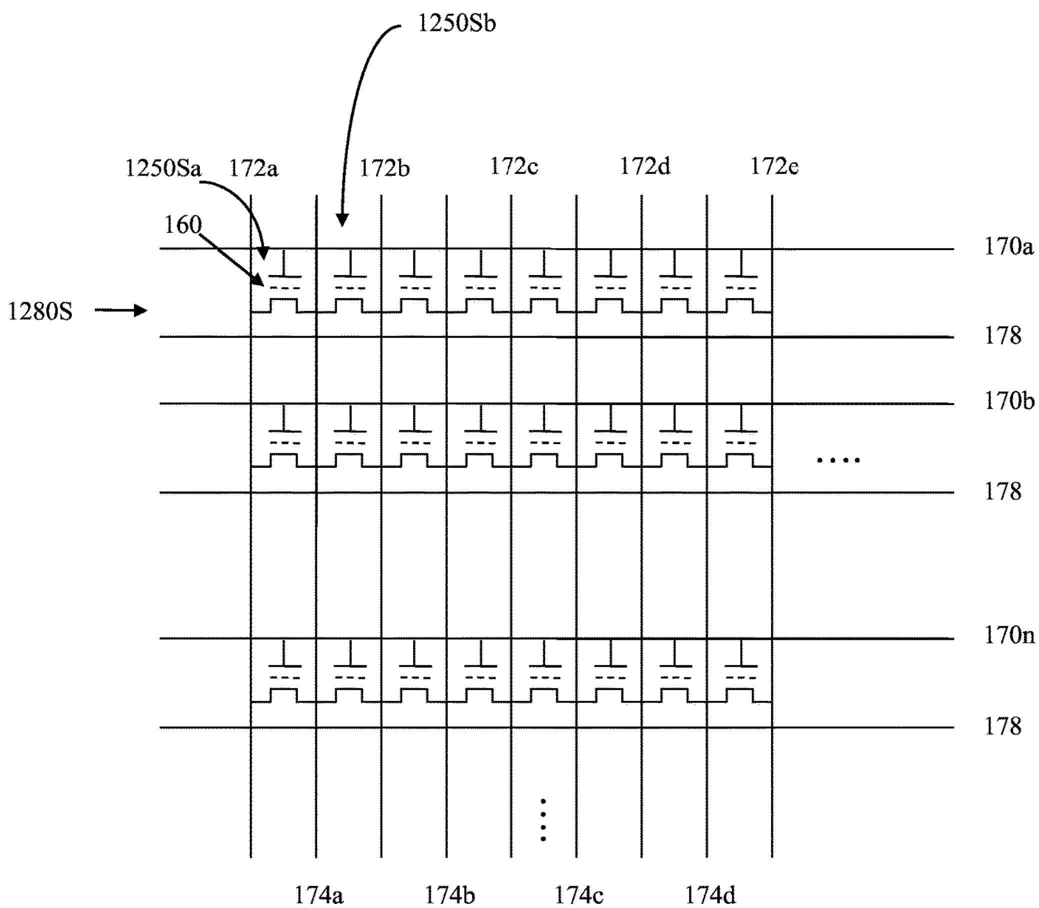

FIG. 181B shows an array architecture of a memory cell device according to an embodiment of the present invention.

Figure 182:
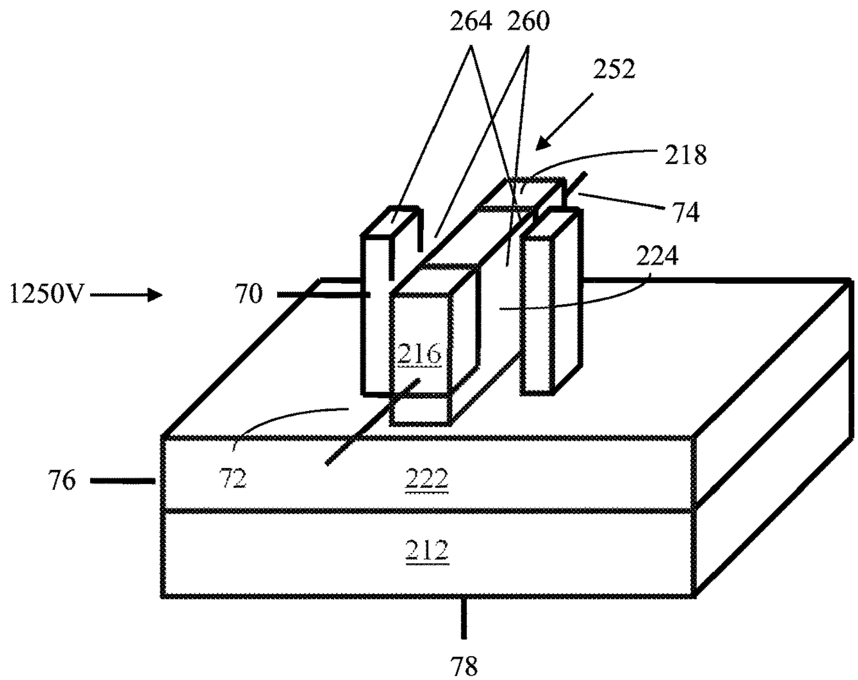
Figure 183:
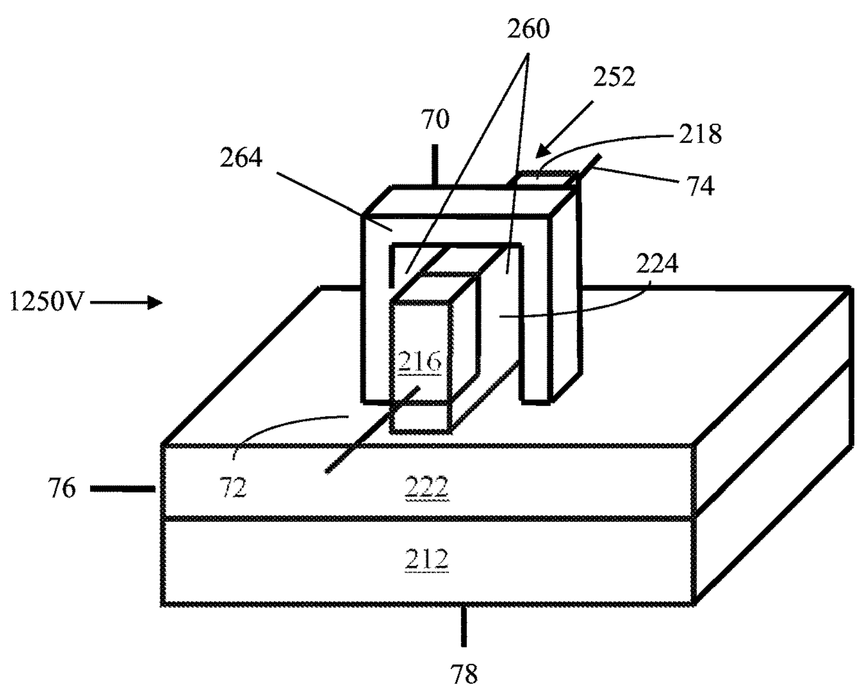
Figure 184:
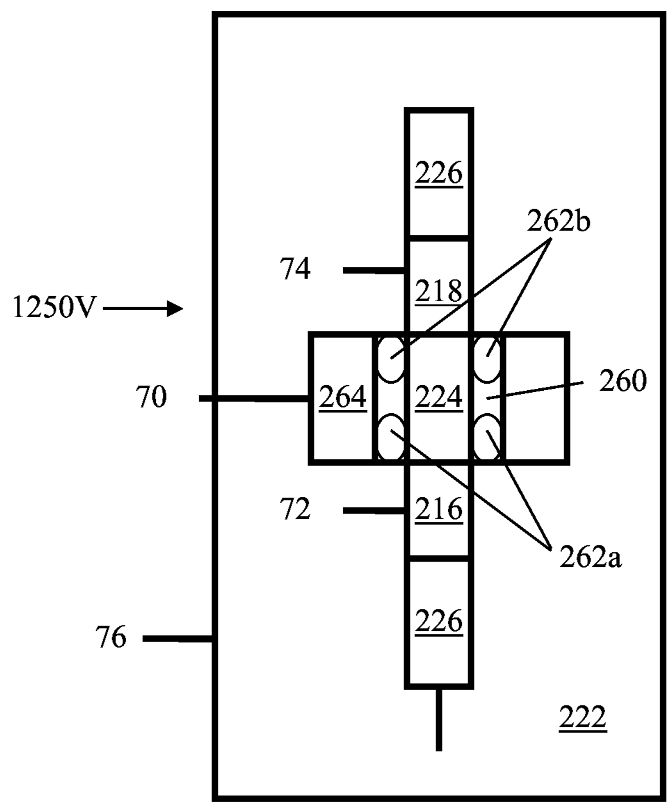

FIGS. 182-183 illustrate cross-sectional schematic illustrations of fin-type semiconductor memory cell devices according to embodiments of the present invention FIG. 184 illustrates a top view of a fin-type semiconductor memory cell device according to the embodiment shown in FIG. 182.

Figure 185A:
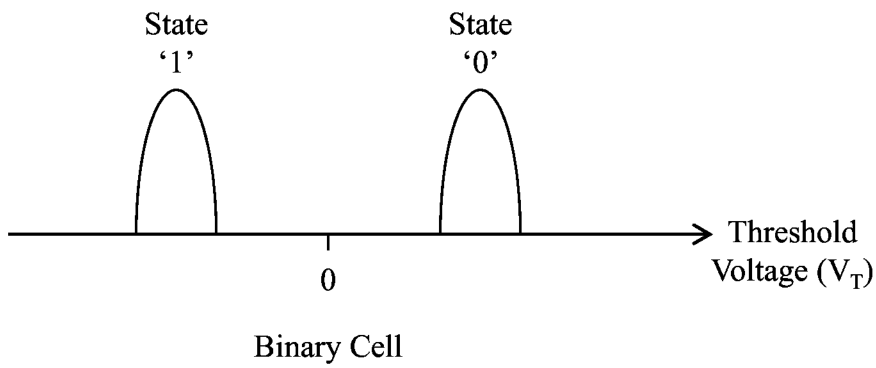

FIG. 185A illustrates states of a bi-level memory cell.

Figure 185B:
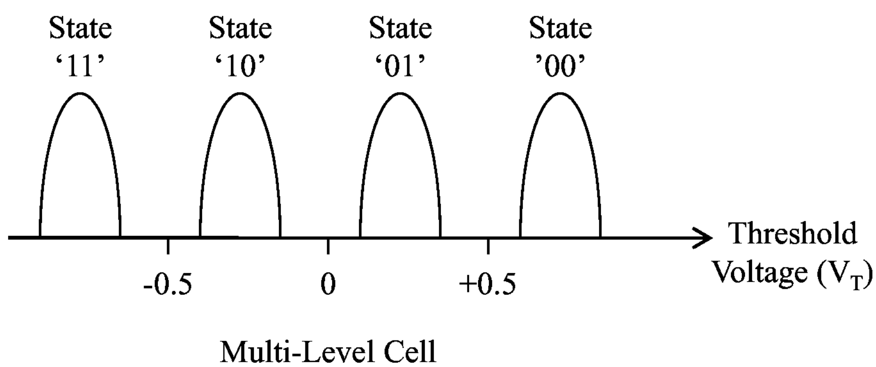

FIG. 185B illustrates states of a multi-level memory cell.

FIGS. 186A through 186E illustrate an array and details of a first exemplary memory cell according to the present invention.

Figure 187:
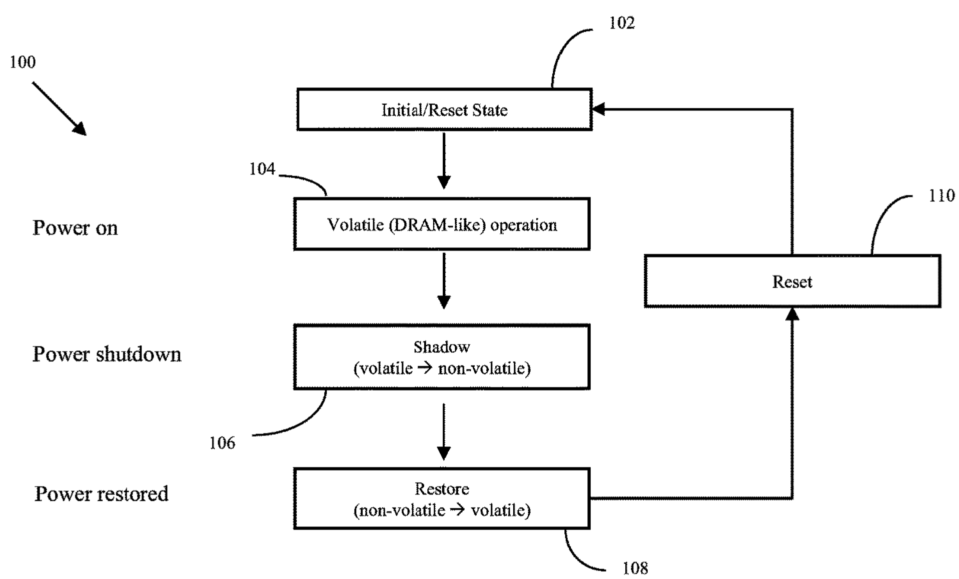

FIG. 187 is a flowchart illustrating operation of a memory device according to the present invention.

Figure 188:
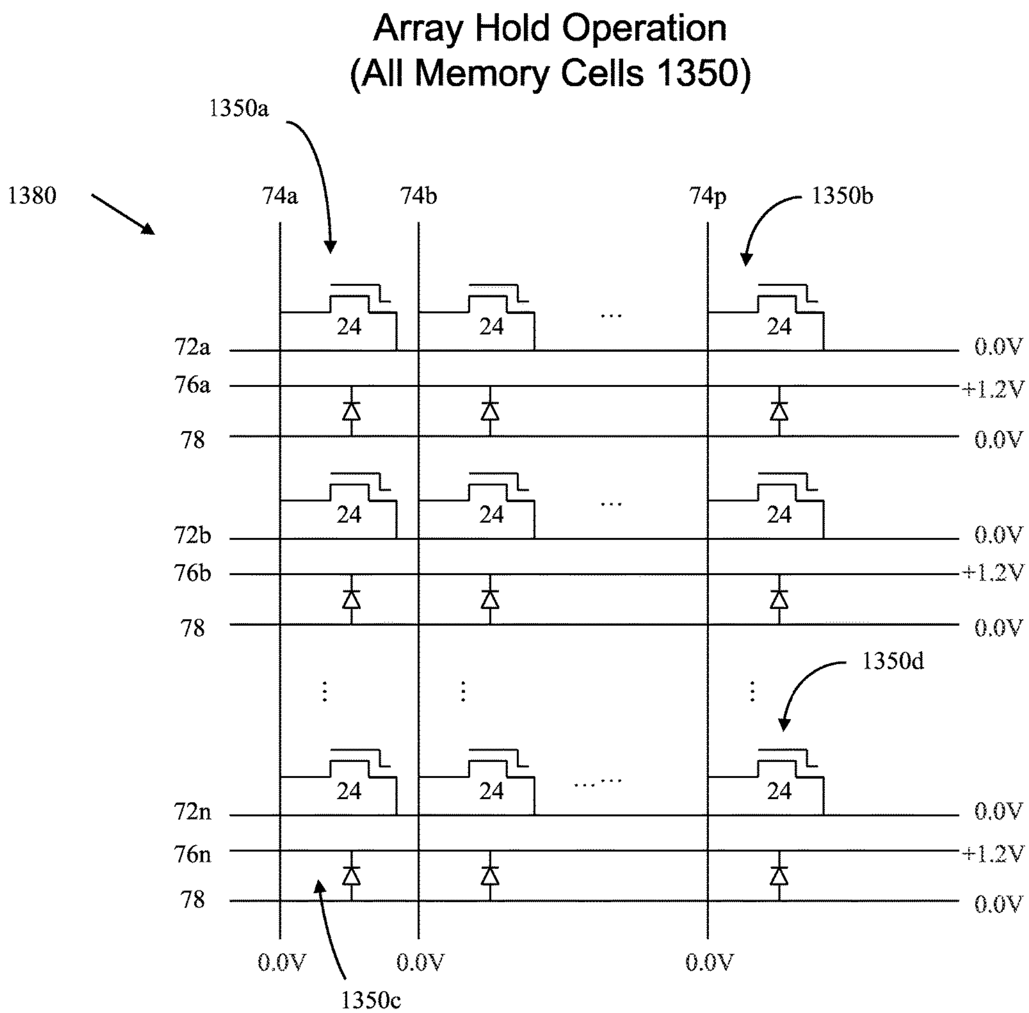

FIG. 188 illustrates a holding operation performed on an array of memory cells according to the present invention.

Figure 189A:
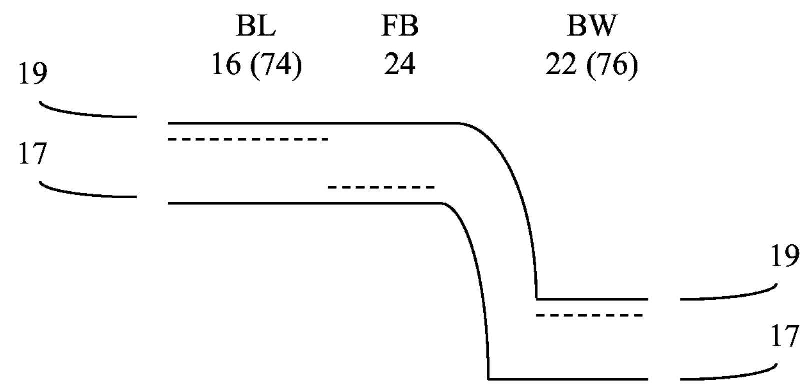
Figure 189B:
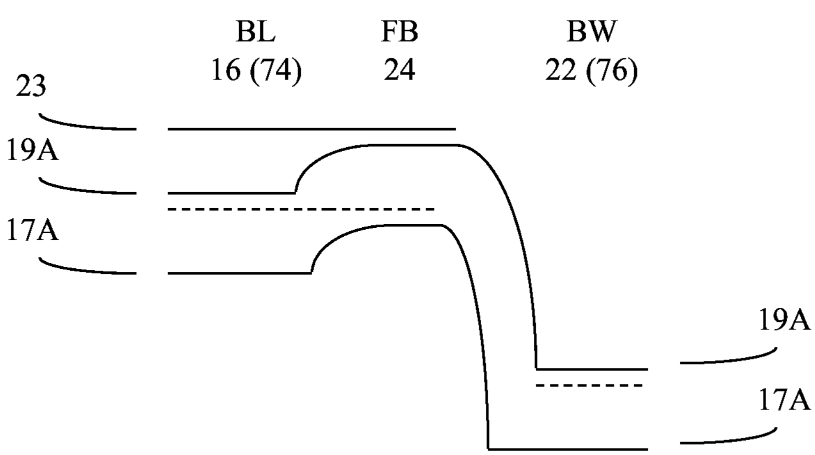

FIGS. 189A and 189B illustrate the energy band diagram of a memory device according to the present invention during holding operation.

Figure 190A:
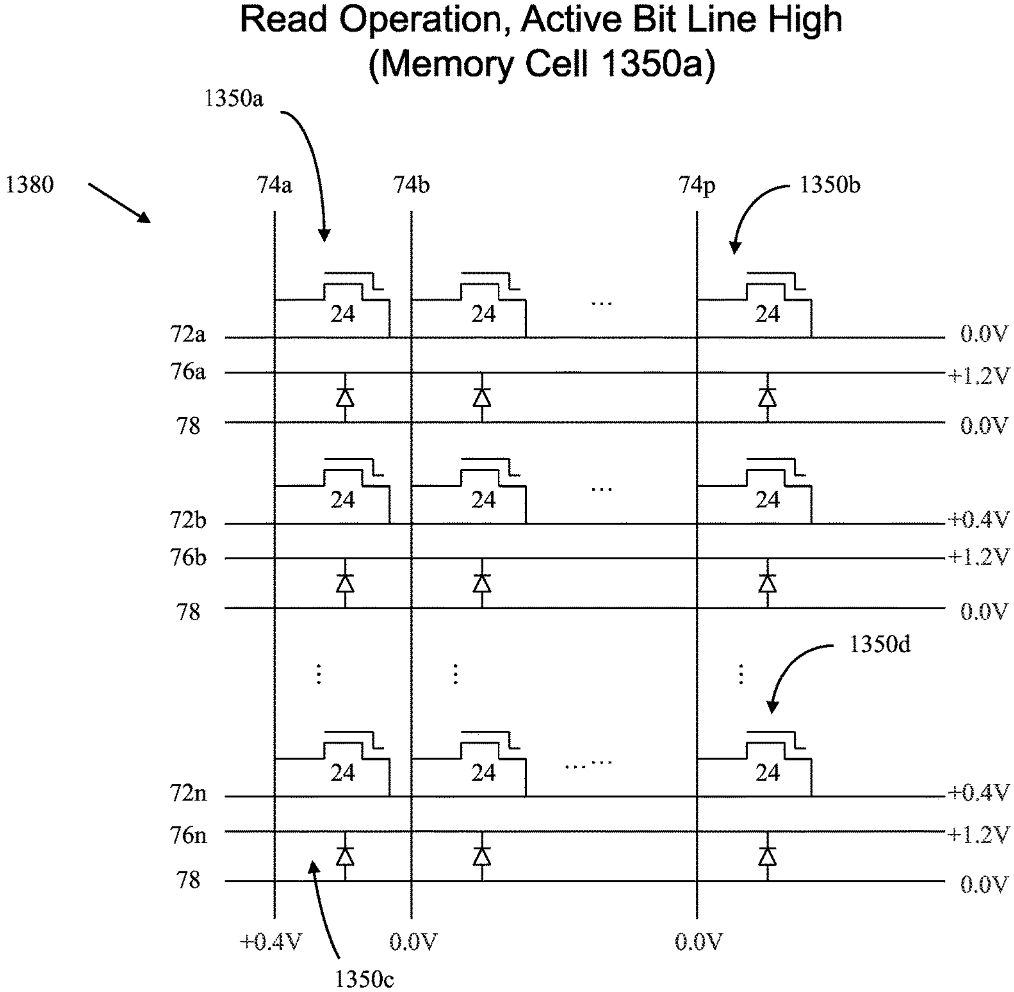
Figure 190B:
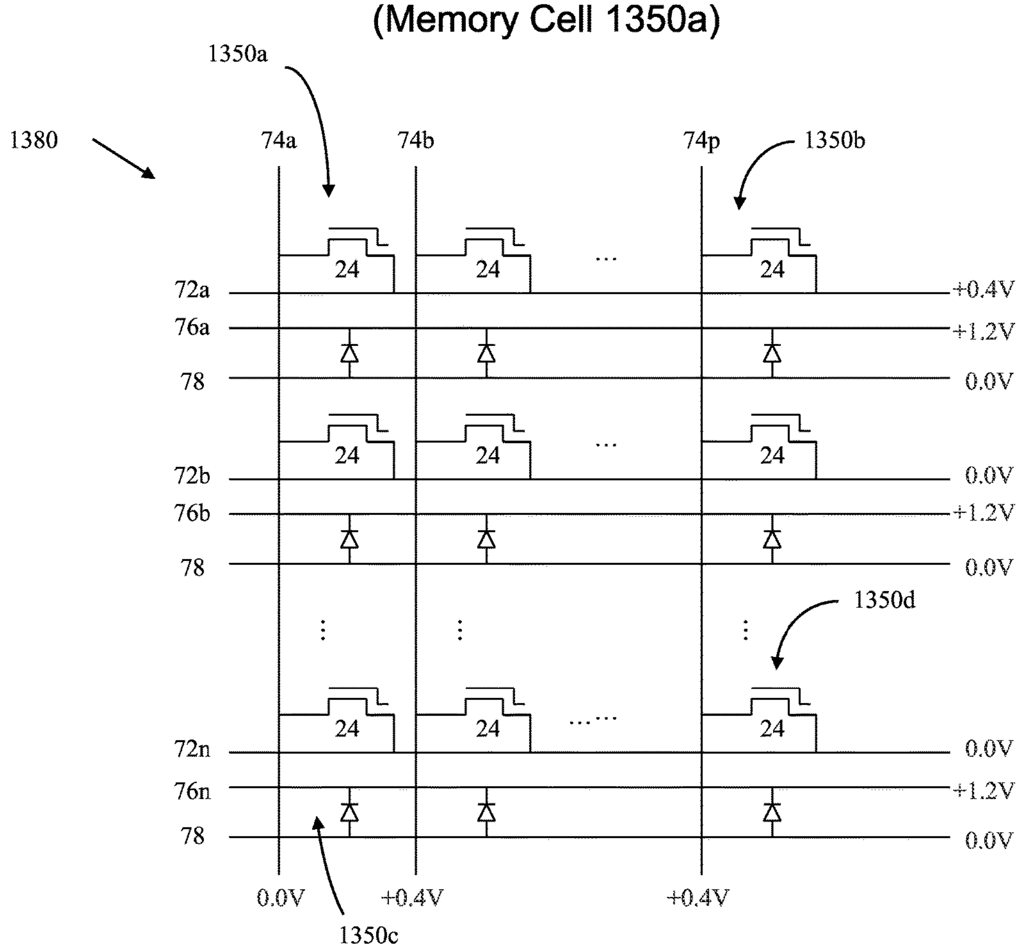

FIGS. 190A and 190B illustrate read operations performed on an array of memory cells according to the present invention.

Figure 191A:
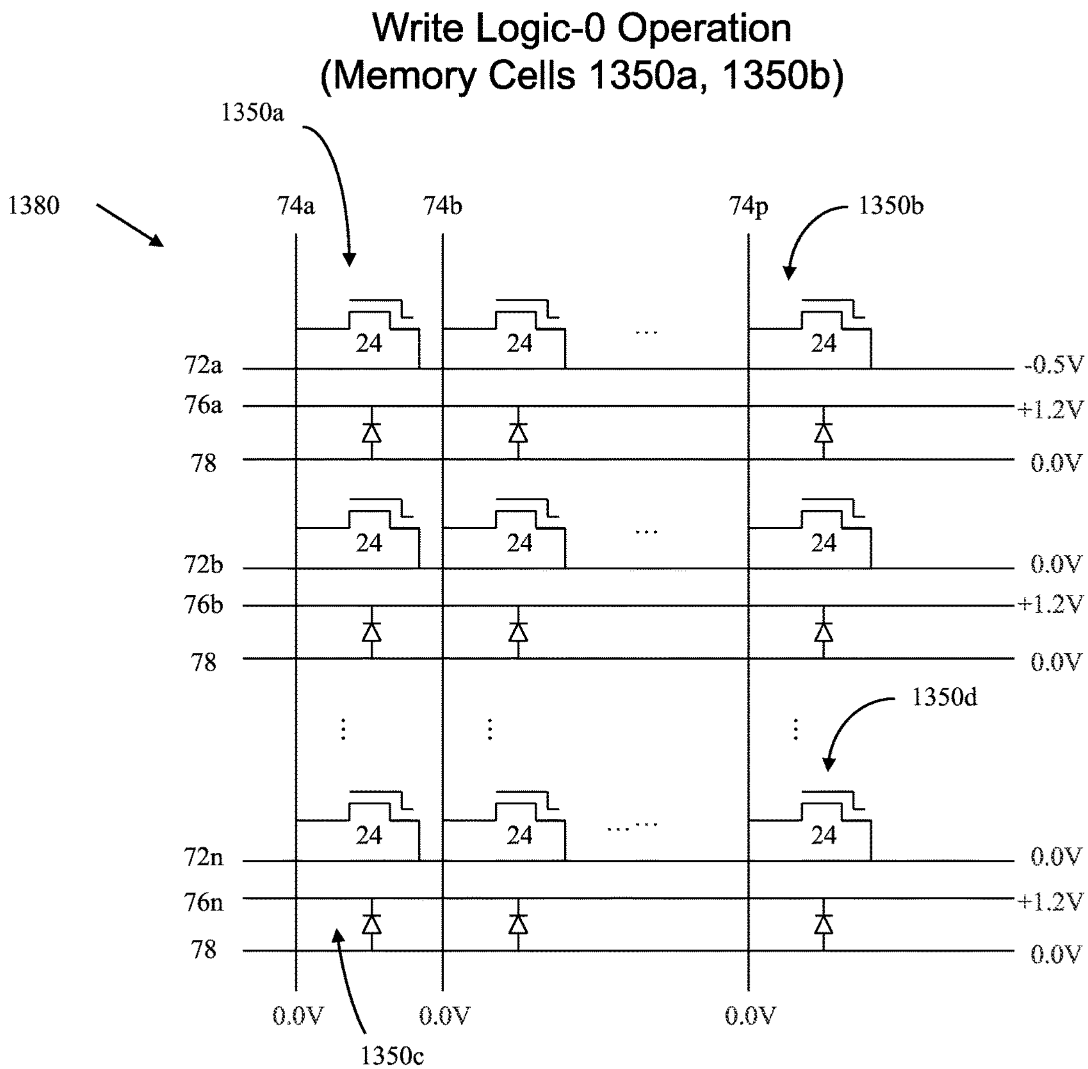
Figure 191B:
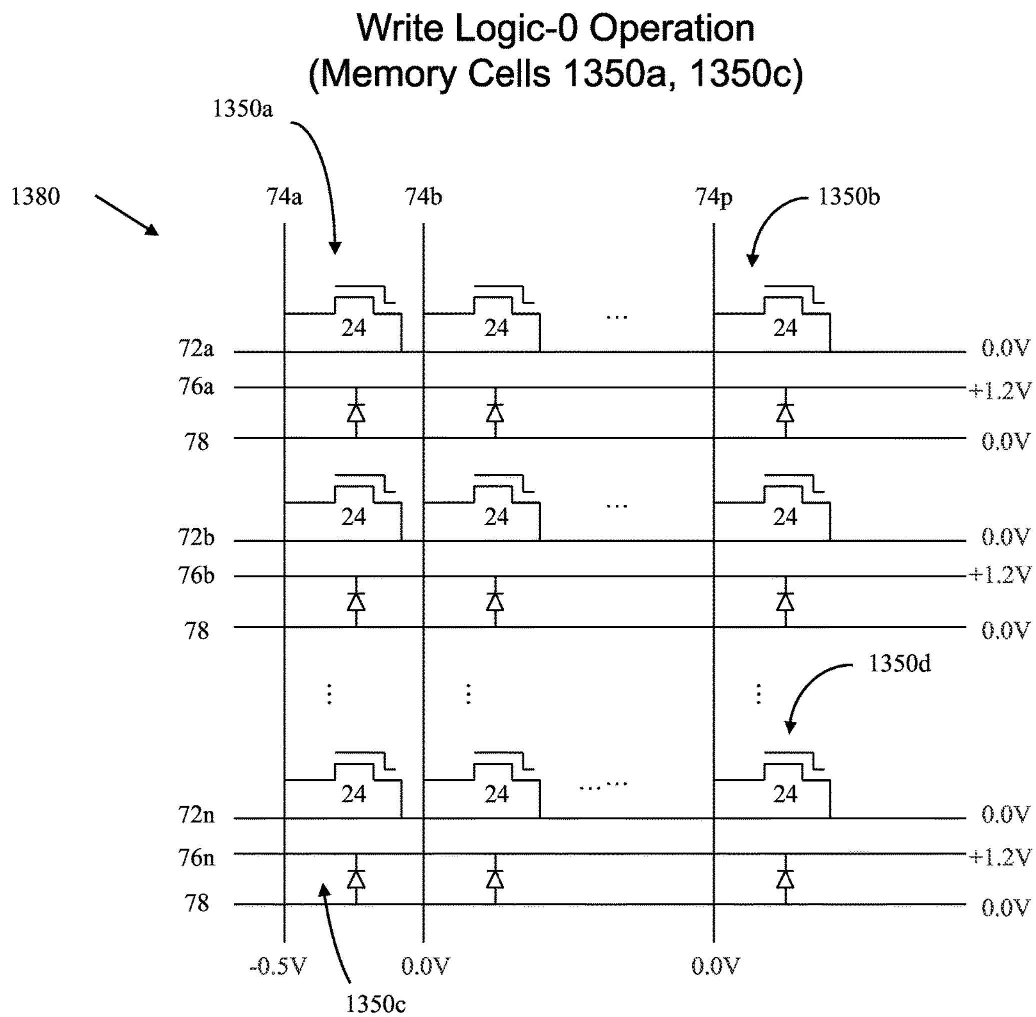

FIGS. 191A and 191B illustrate write logic-0 operations performed on an array of memory cells according to the present invention.

Figure 192A:
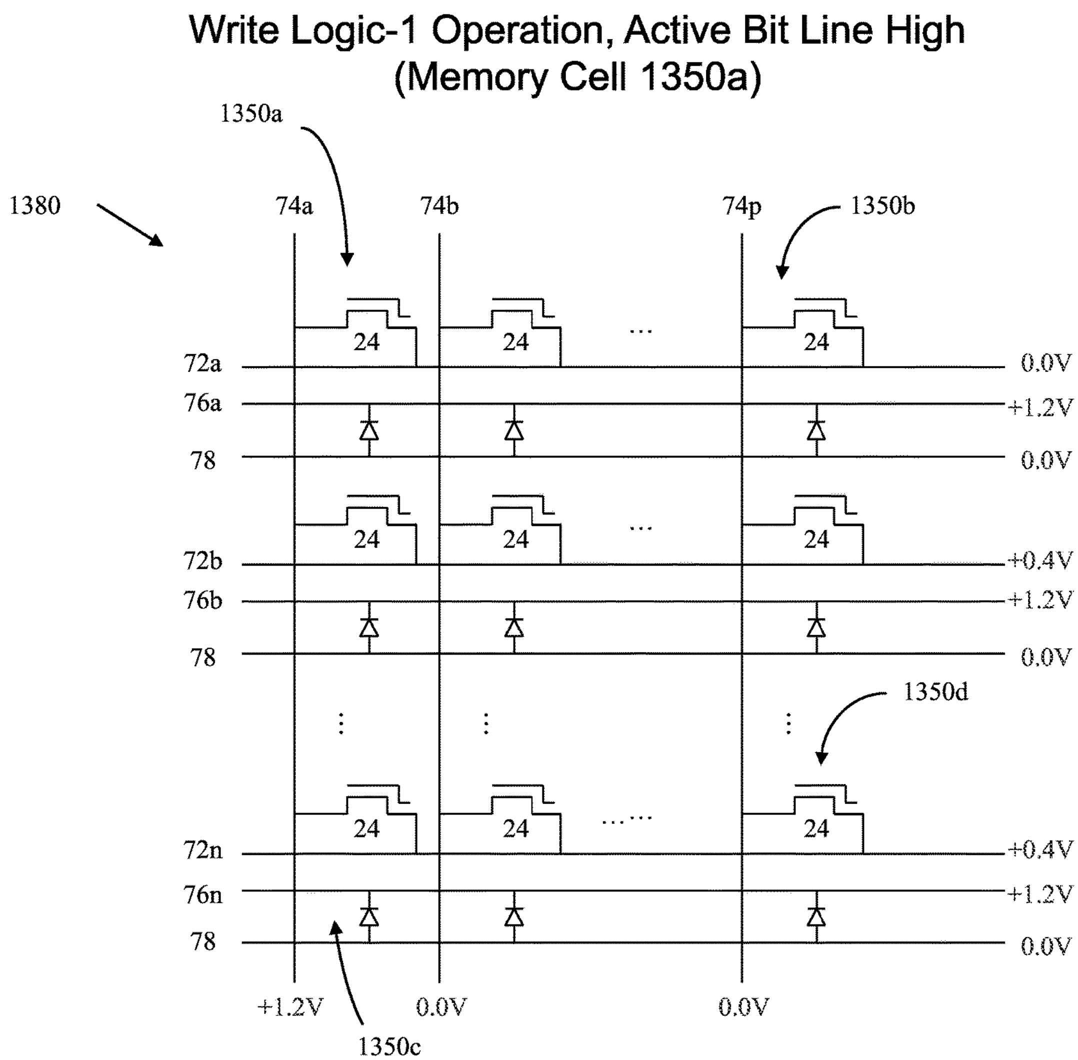
Figure 192B:
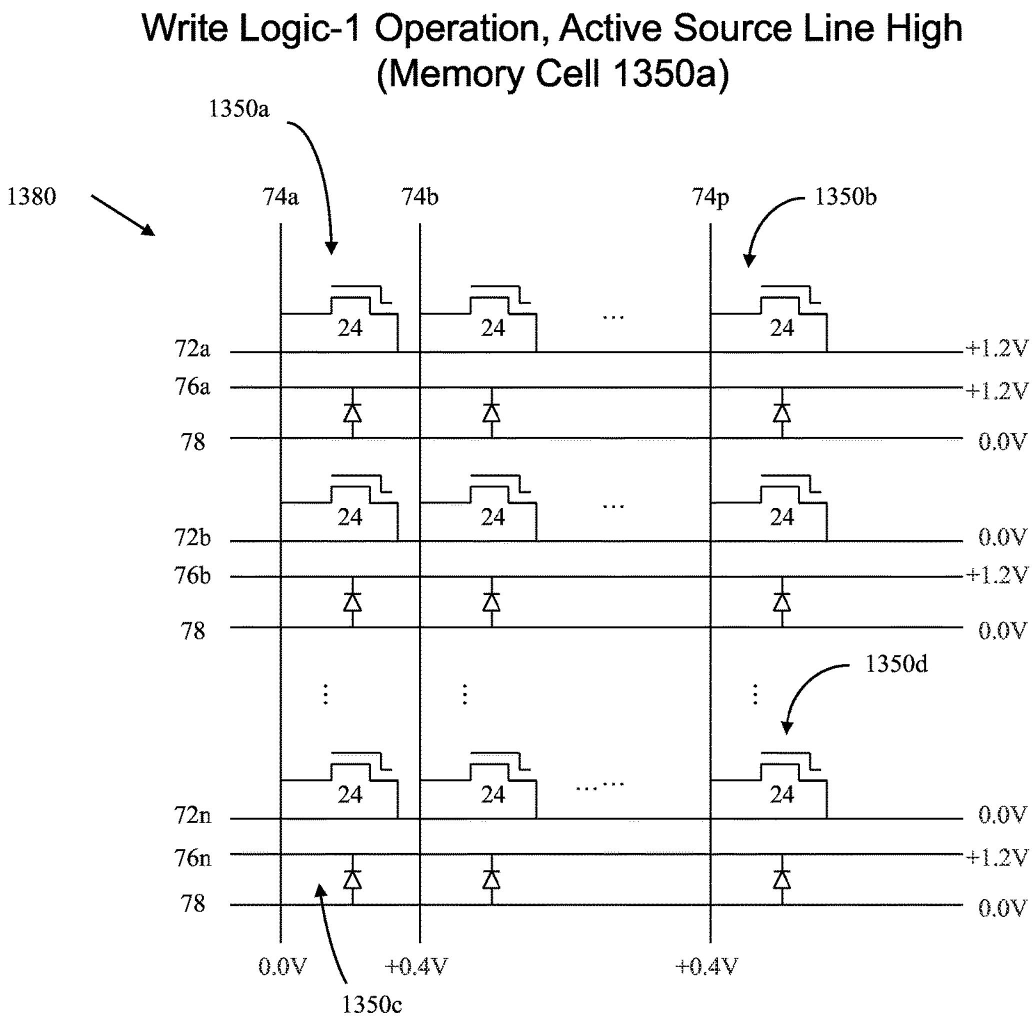

FIGS. 192A and 192B illustrate write logic-1 operations performed on an array of memory cells according to the present invention.

Figure 193A:
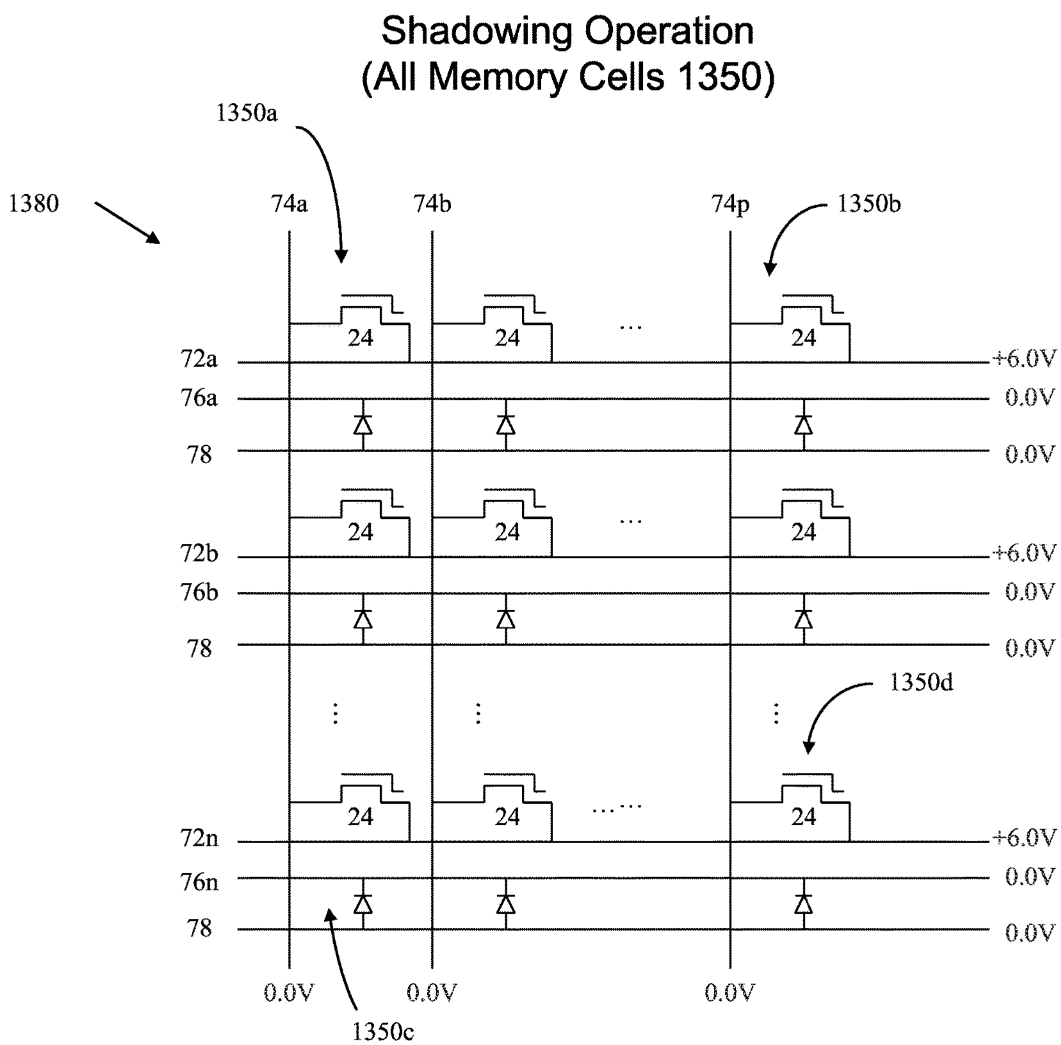
Figure 193B:
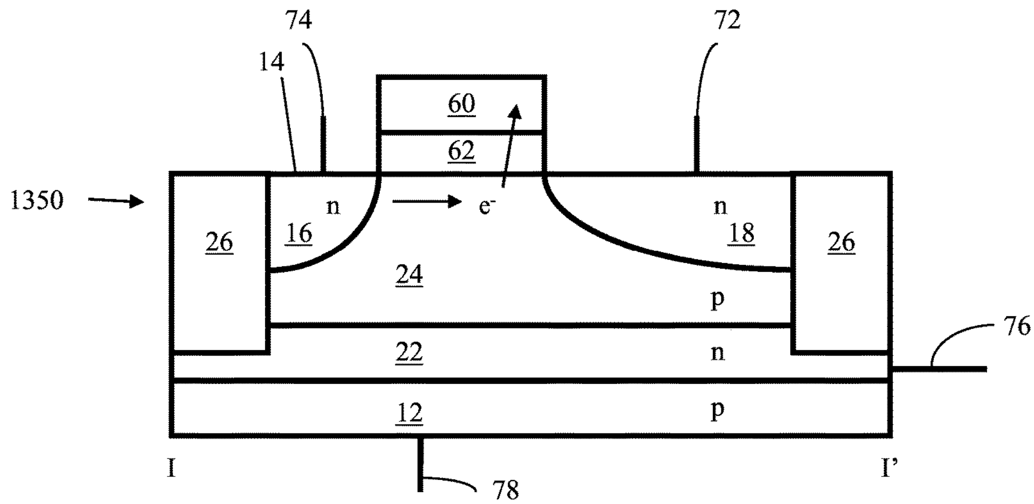
Figure 193C:
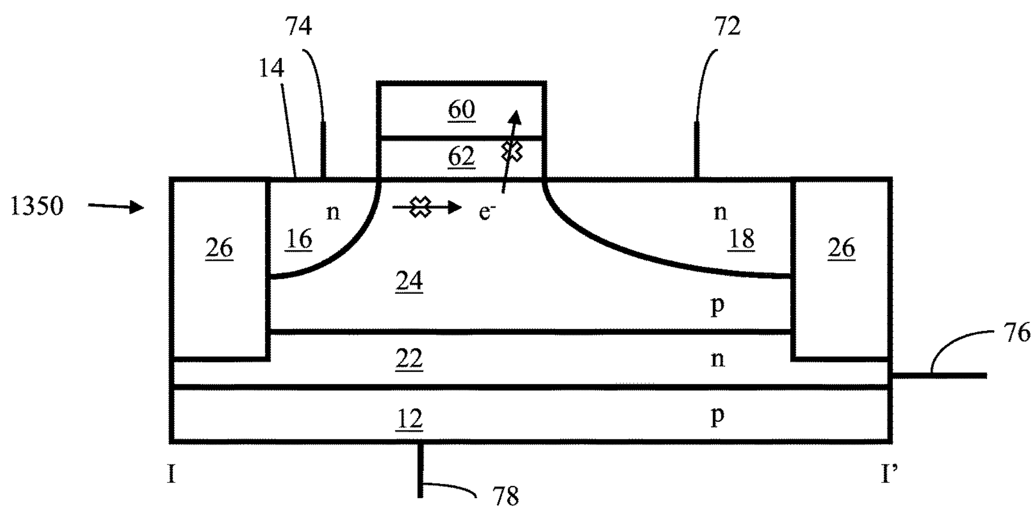

FIGS. 193A through 193C illustrate a shadowing operation performed on an array of memory cells according to the present invention.

Figure 194A:
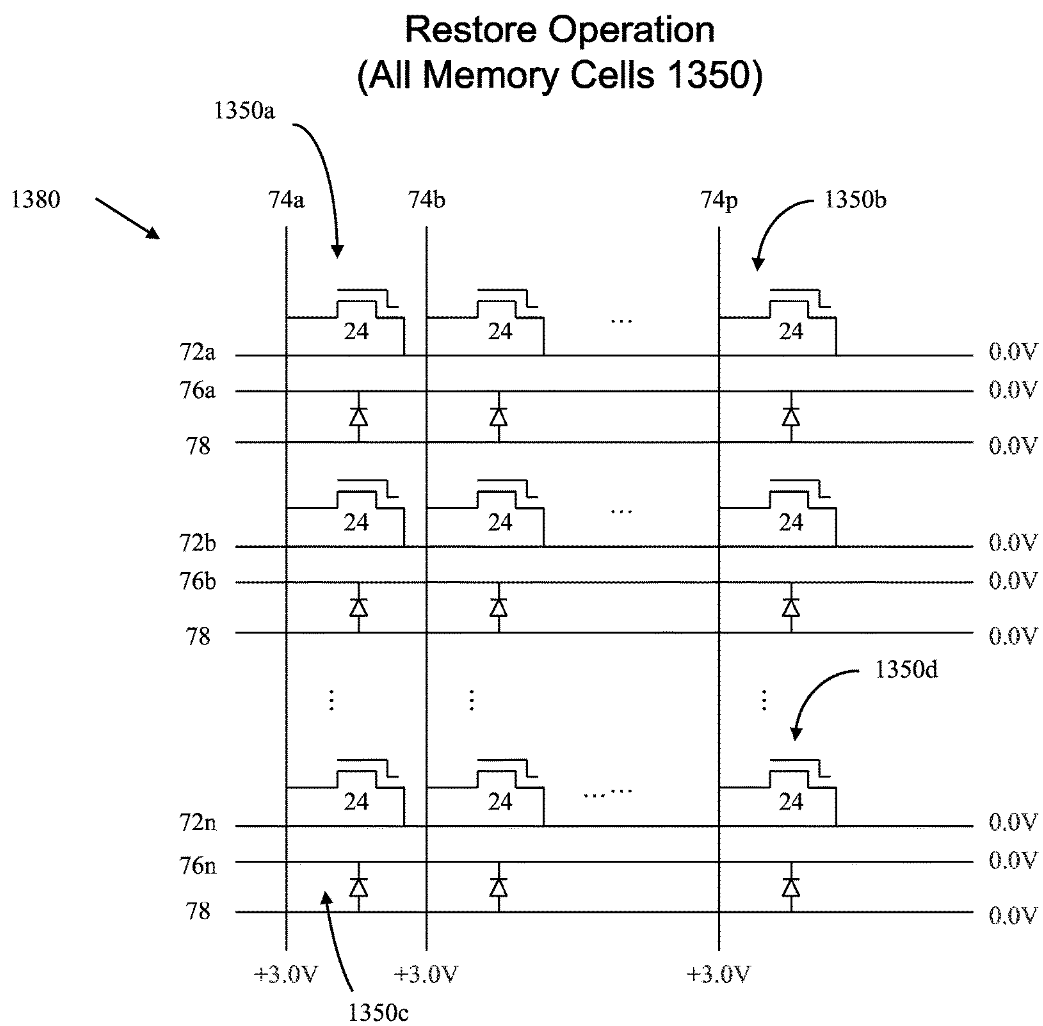
Figure 194B:
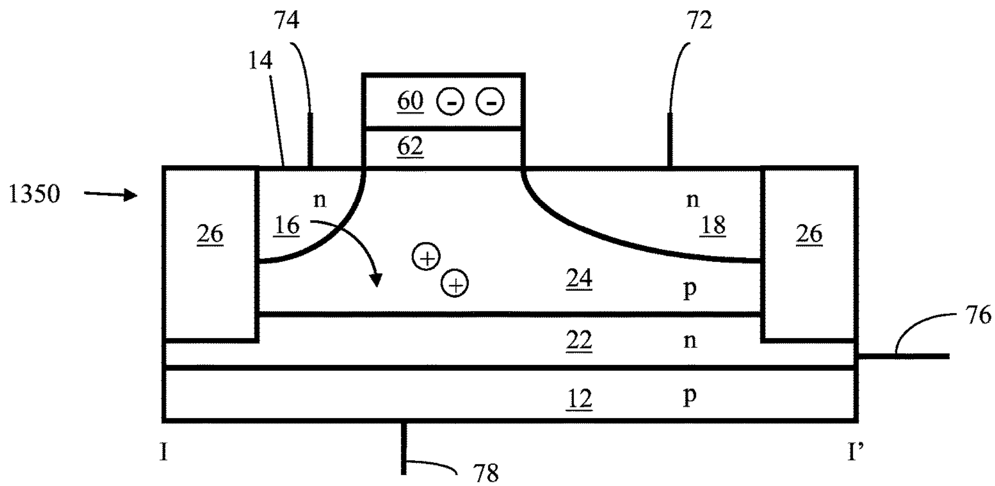
Figure 194C:
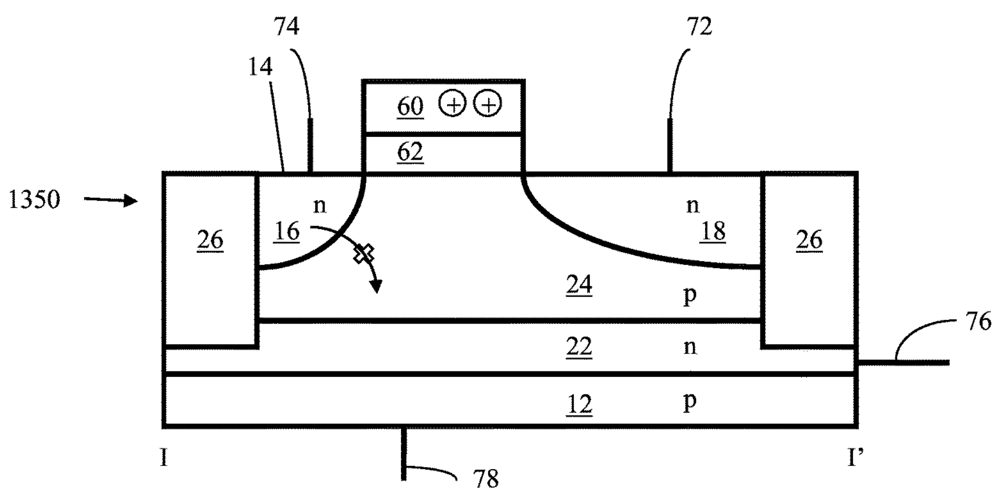

FIGS. 194A through 194C illustrate a restore operation performed on an array of memory cells according to the present invention.

Figure 195:
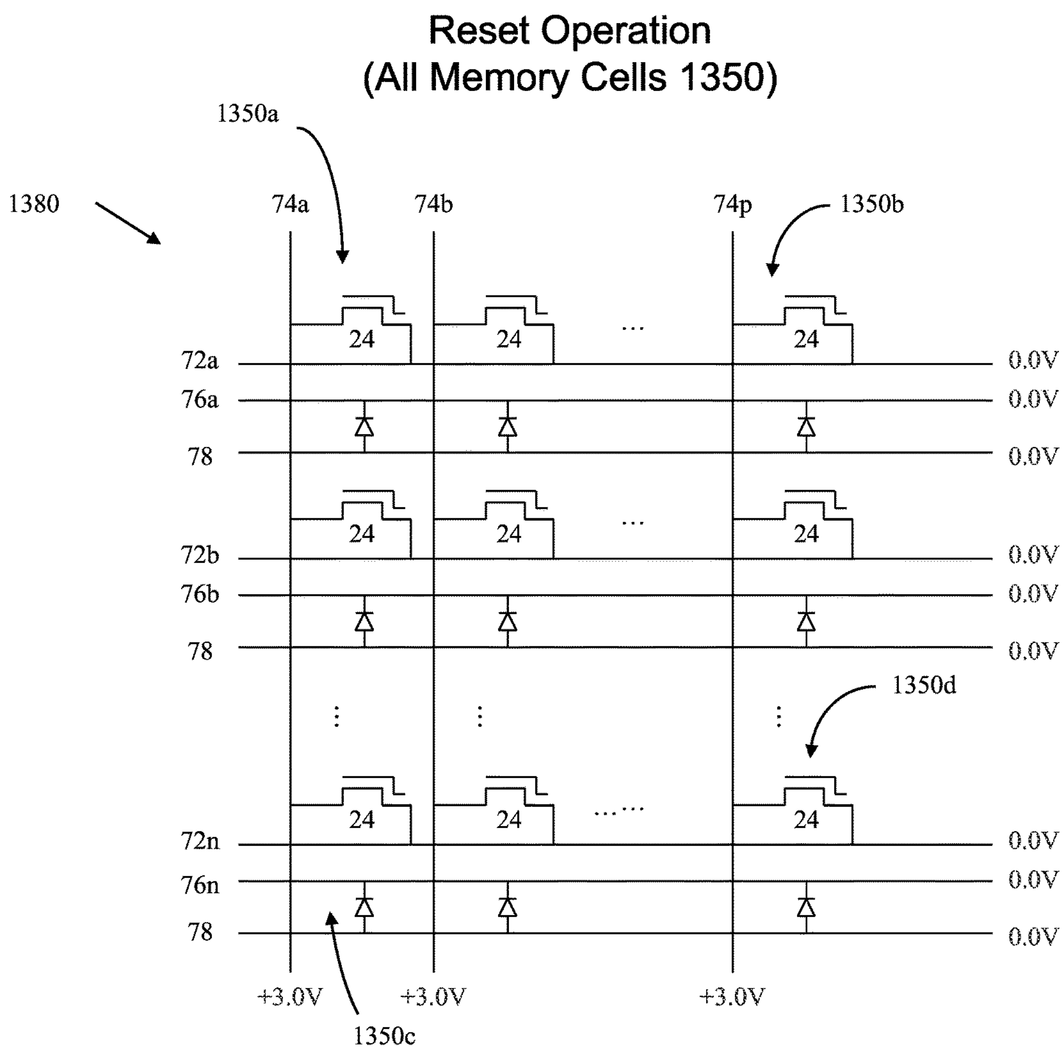

FIG. 195 illustrates a reset operation performed on an array of memory cells according to the present invention.

Figure 196A:
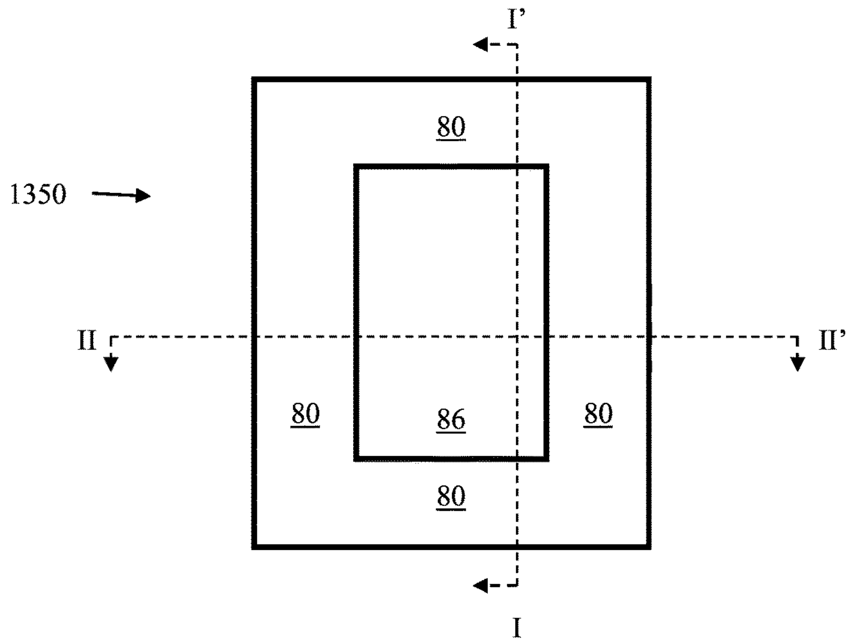
Figure 196B:
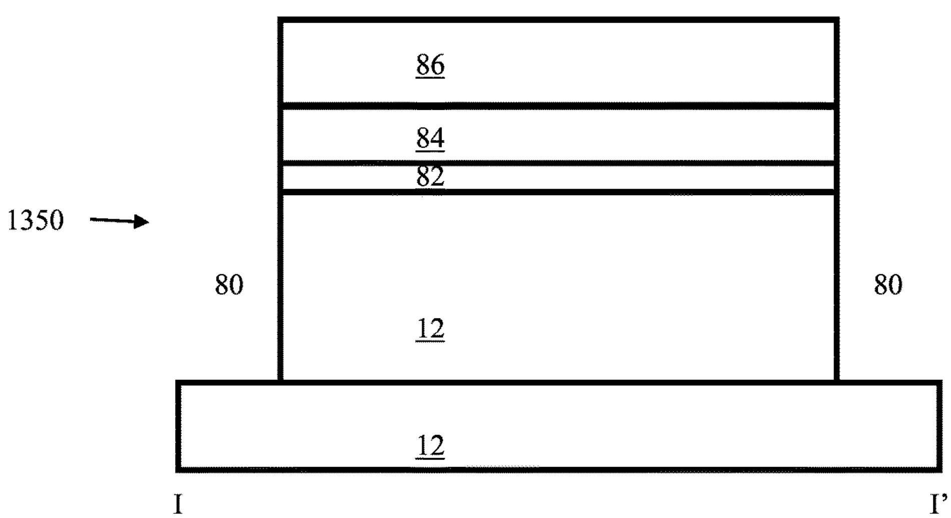
Figure 196C:
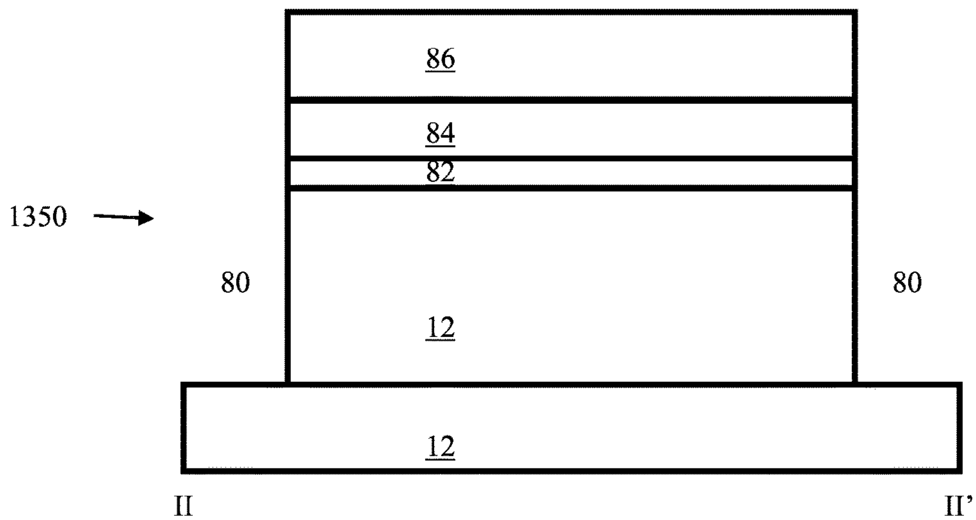
Figure 196D:
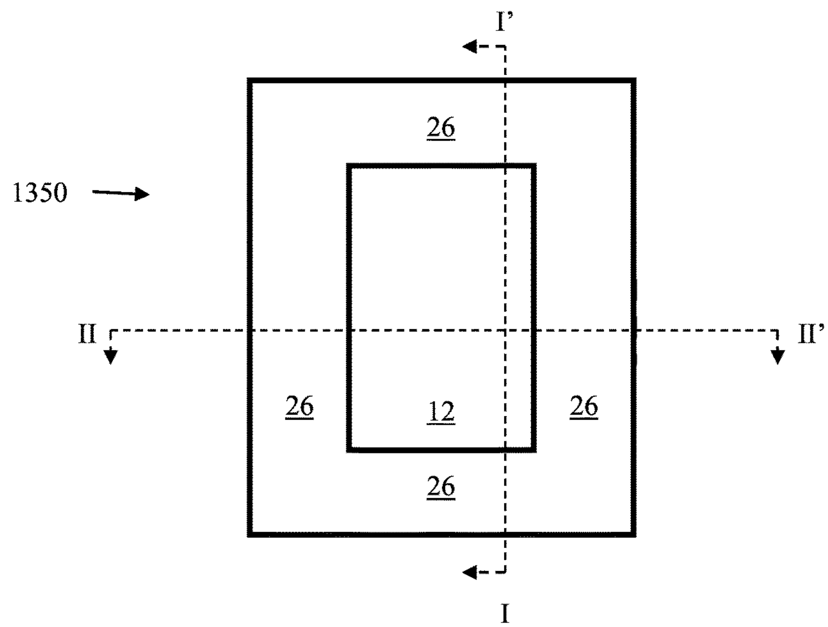
Figure 196E:
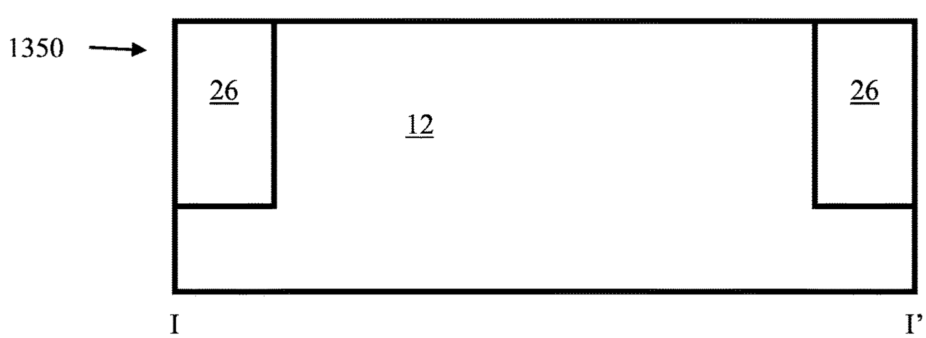
Figure 196F:
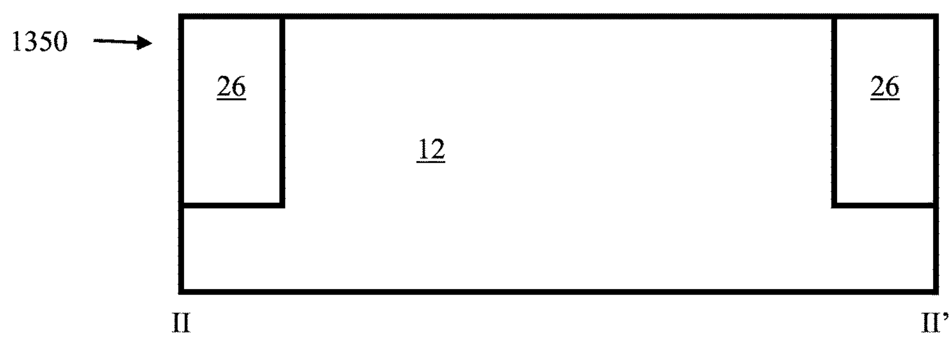
Figure 196G:
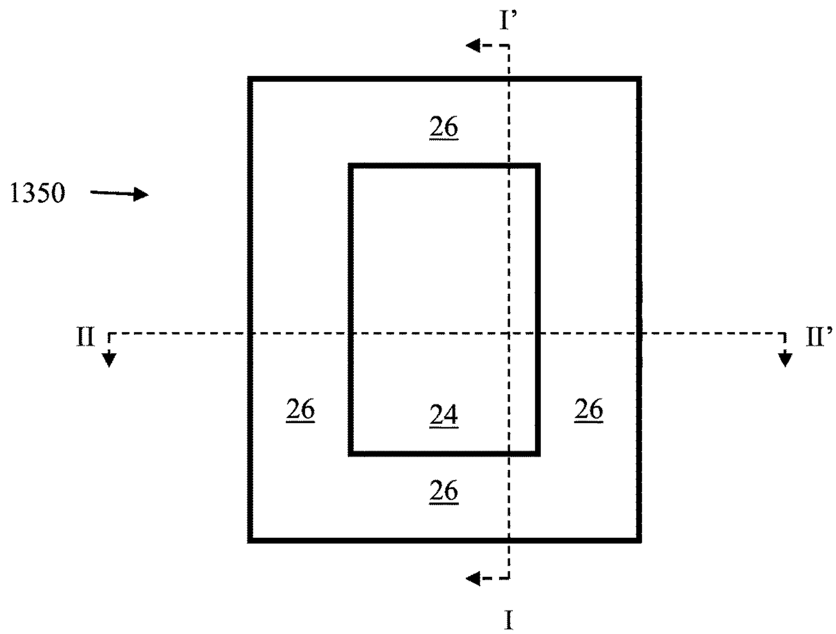
Figure 196H:
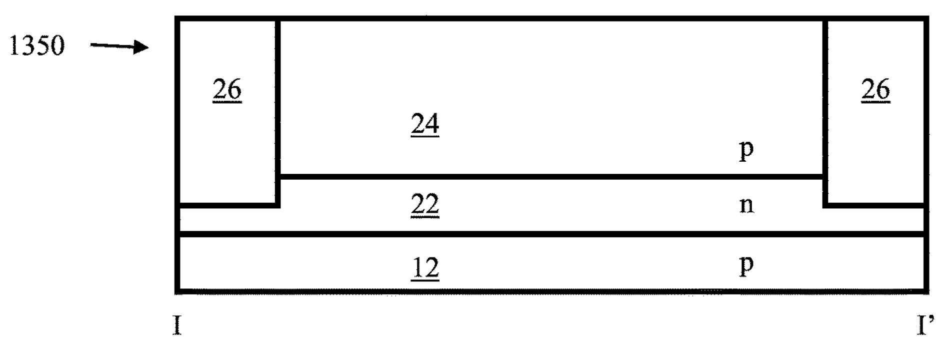
Figure 196I:
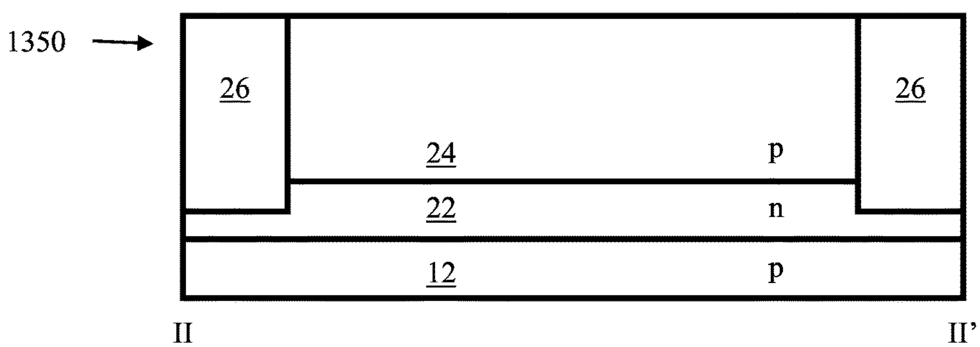
Figure 196J:
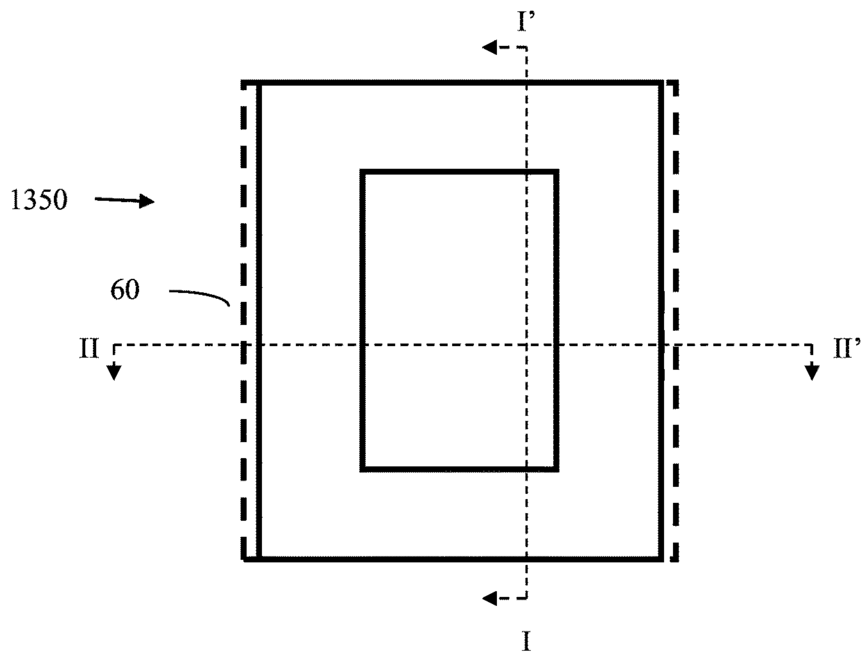
Figure 196K:
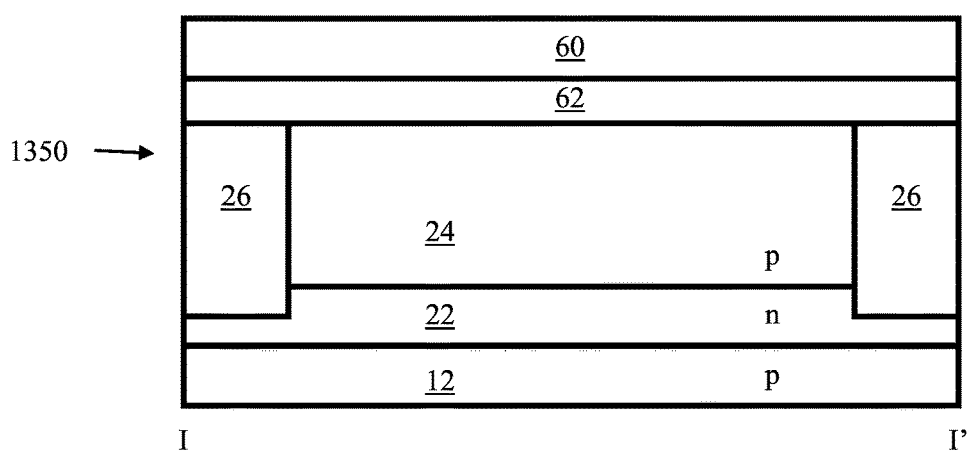
Figure 196L:
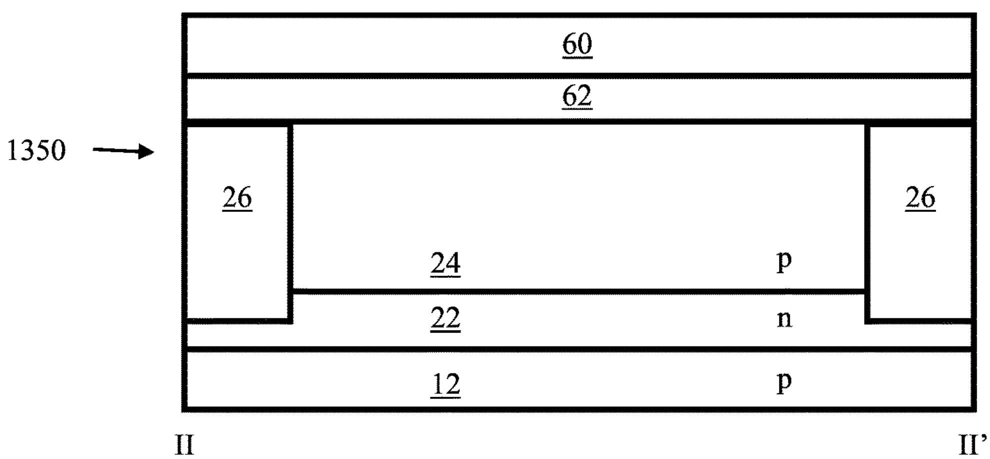
Figure 196M:
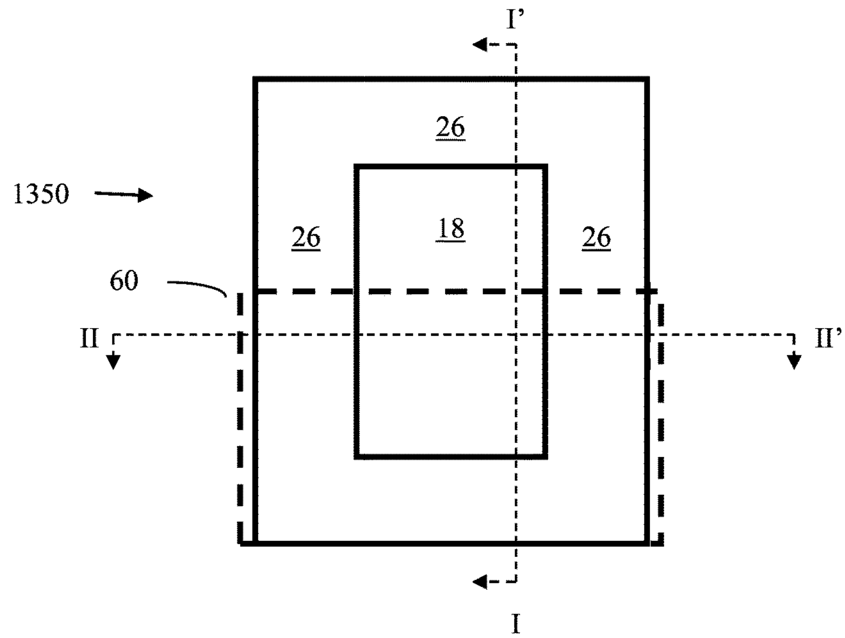
Figure 196N:
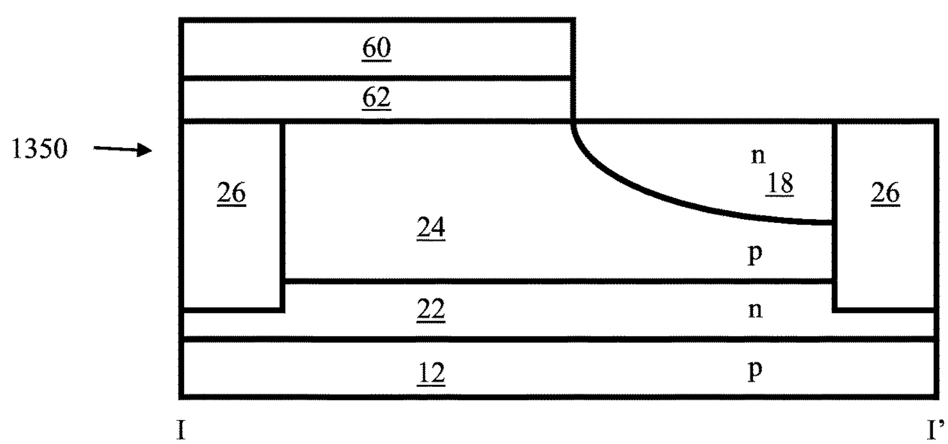
Figure 196O:
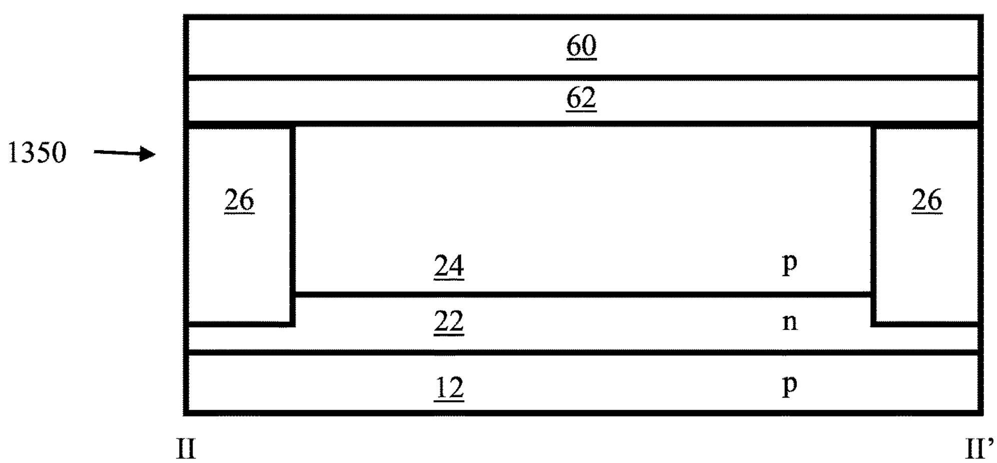
Figure 196P:
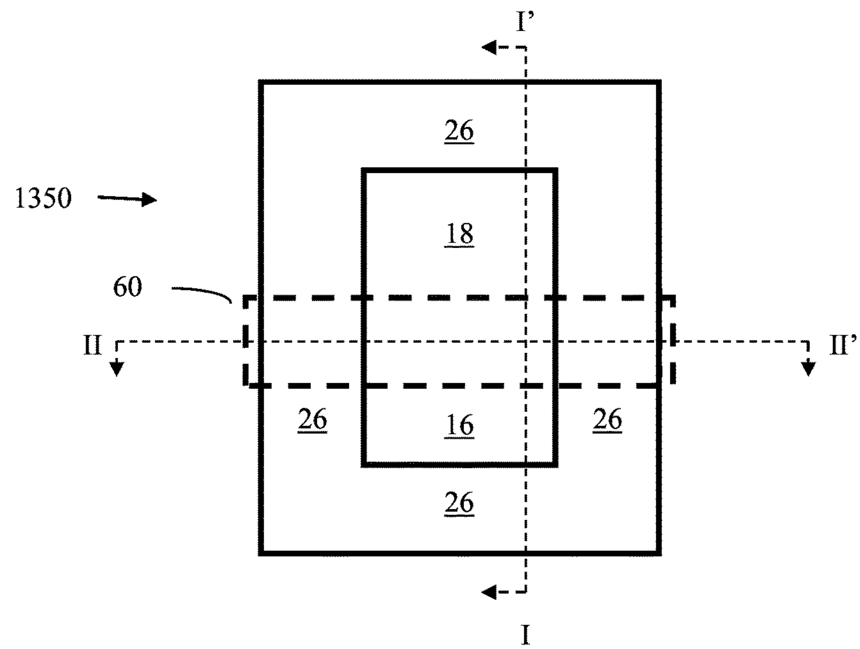
Figure 196Q:
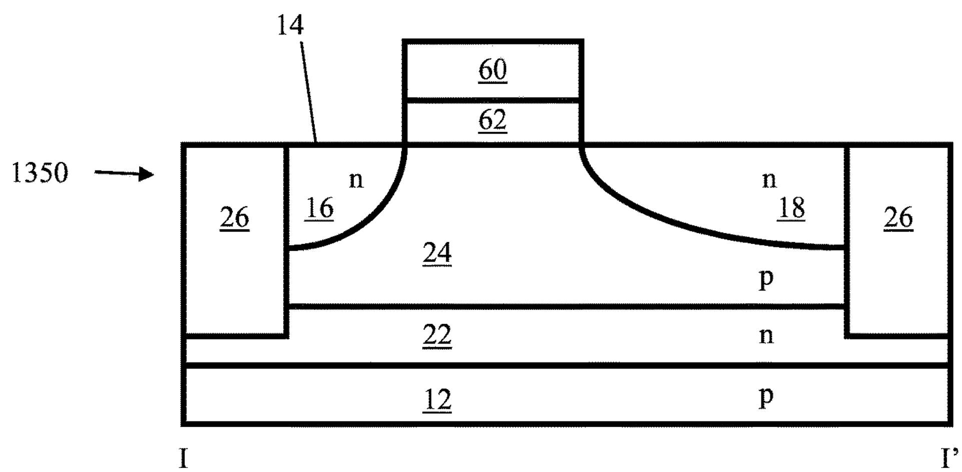
Figure 196R:
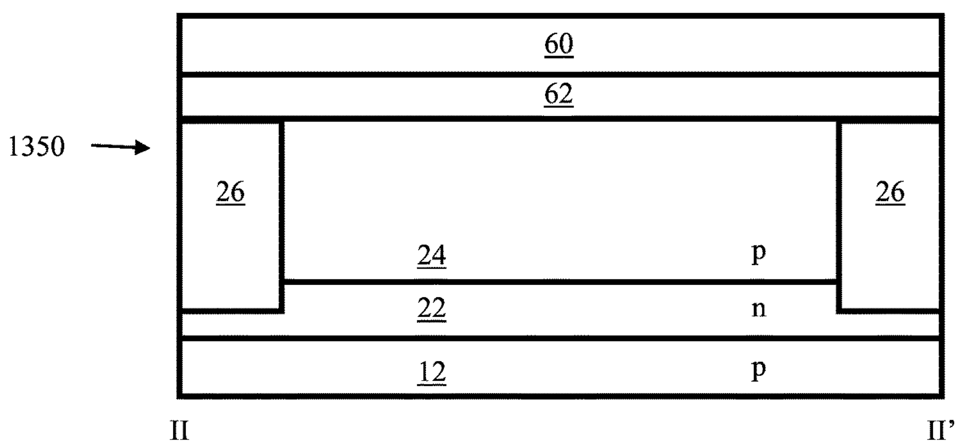

FIGS. 196A through 196R illustrate a method of manufacturing a memory cell according to the present invention.

Figure 197A:
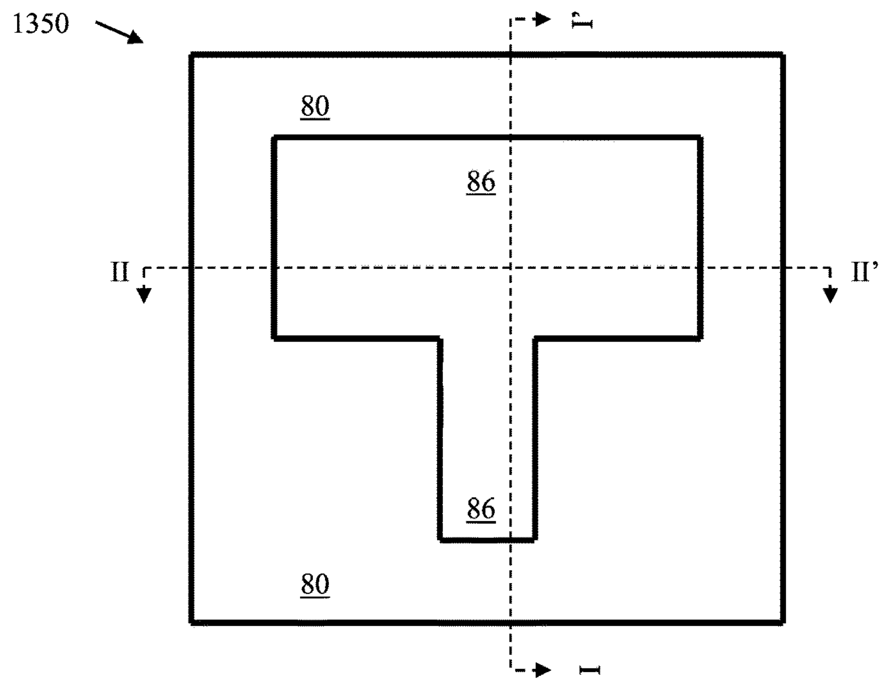
Figure 197B:
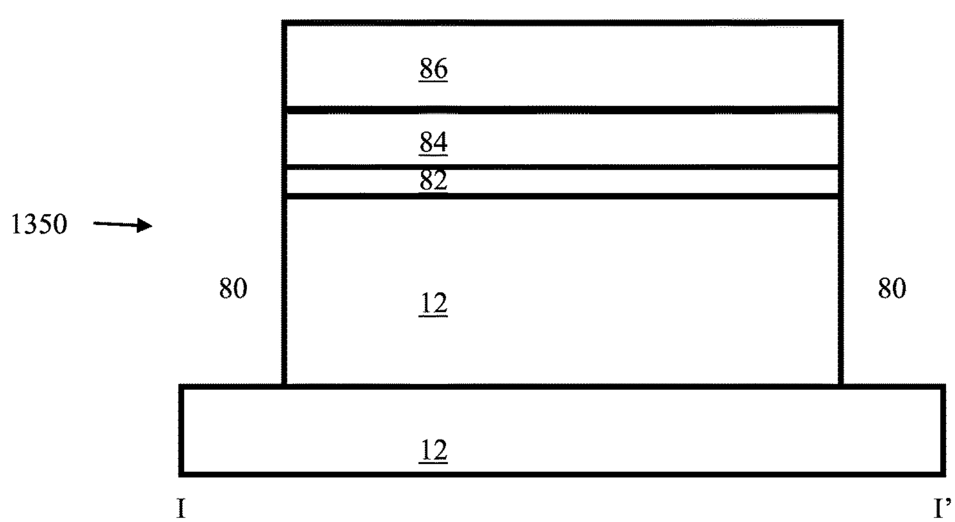
Figure 197C:
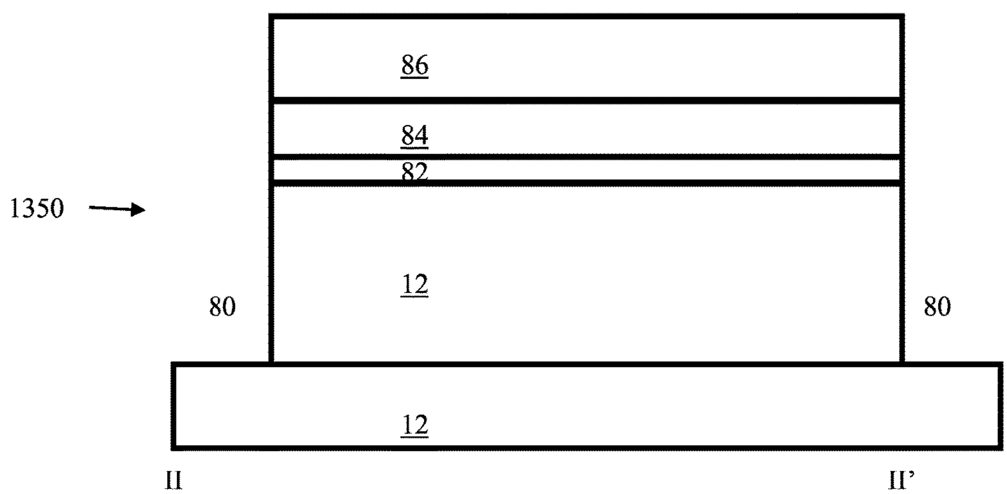
Figure 197D:
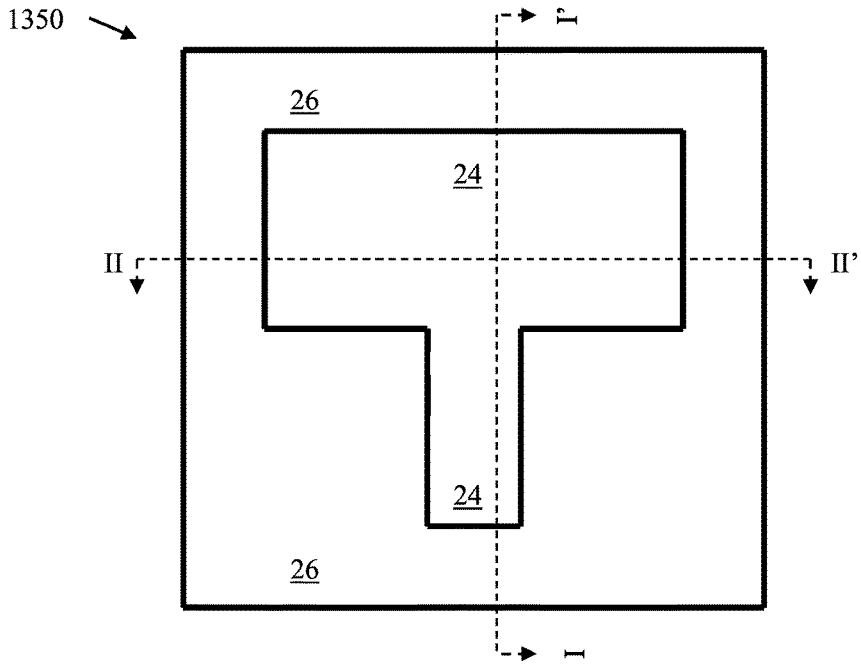
Figure 197E:
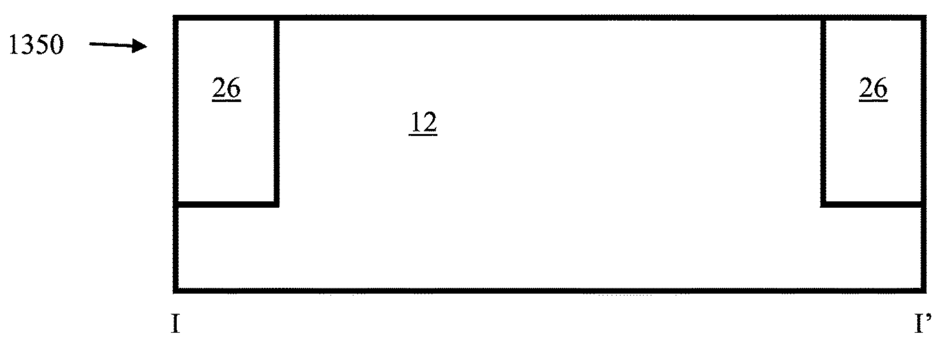
Figure 197F:
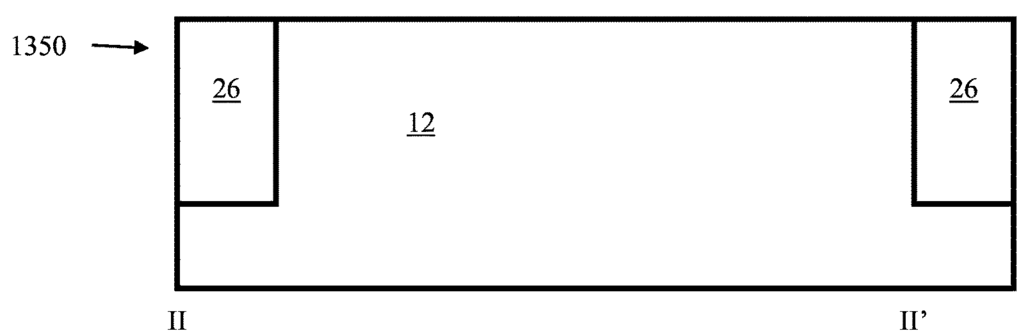
Figure 197G:
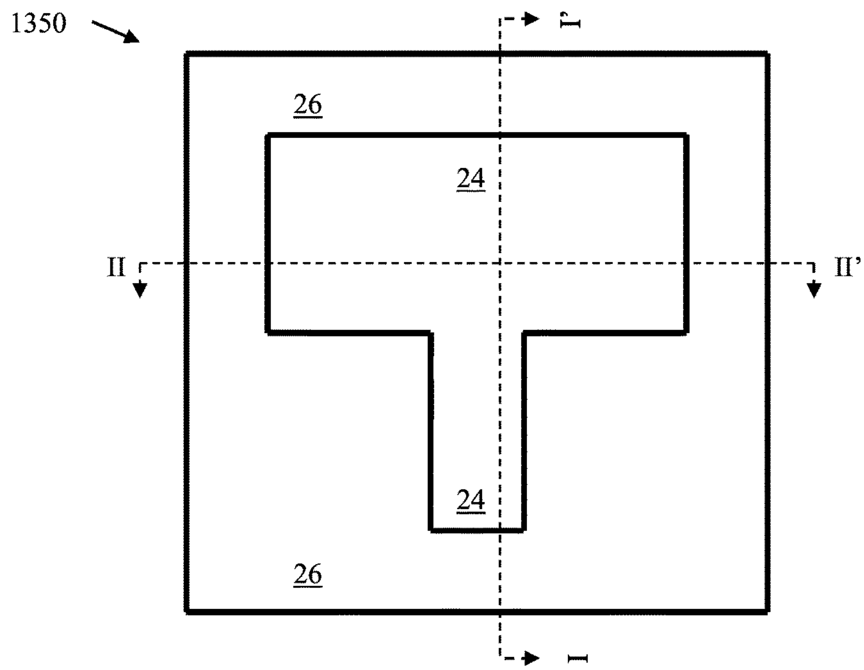
Figure 197H:
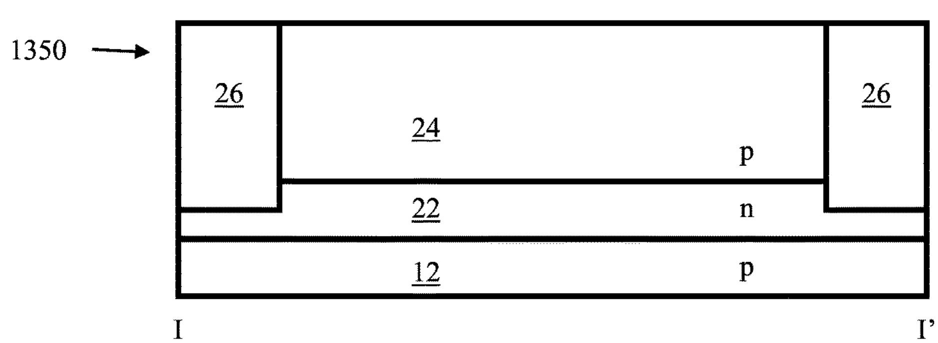
Figure 197I:
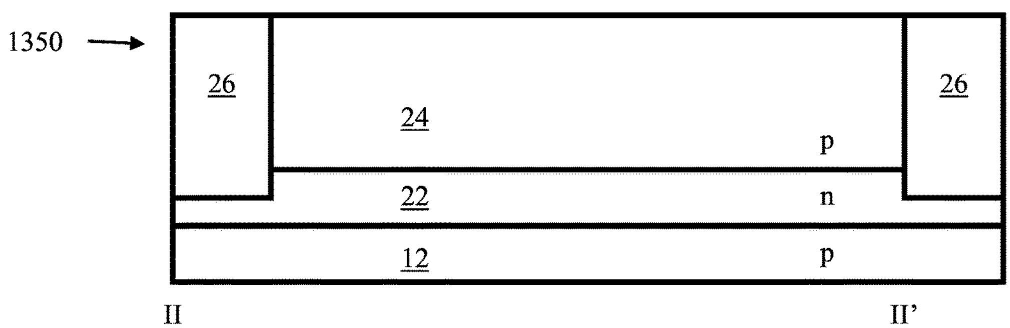
Figure 197J:
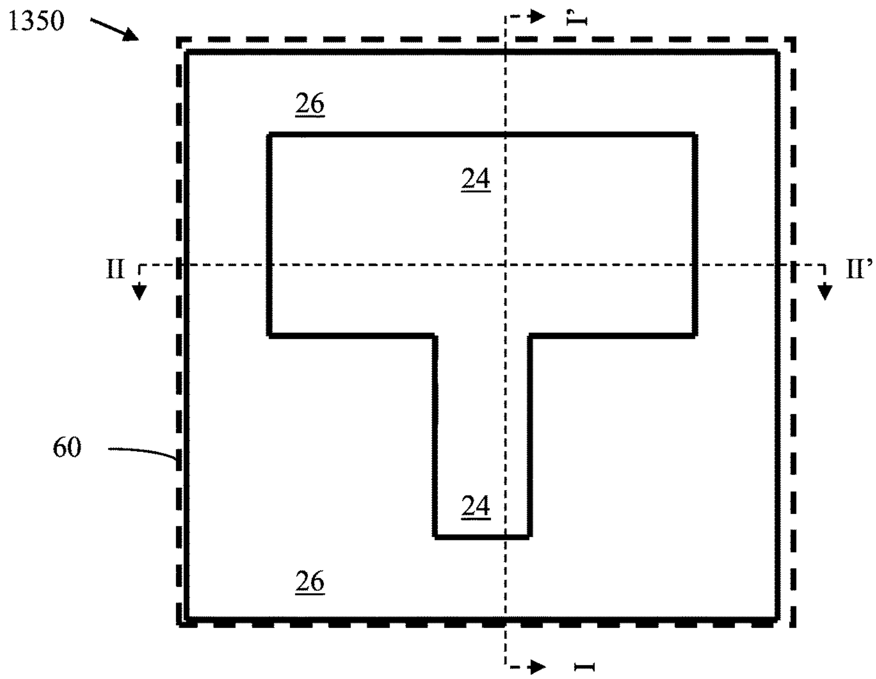
Figure 197K:
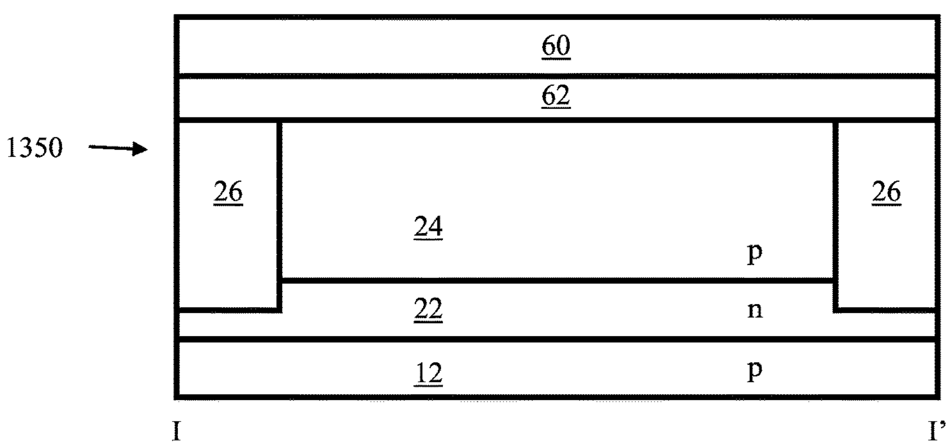
Figure 197L:
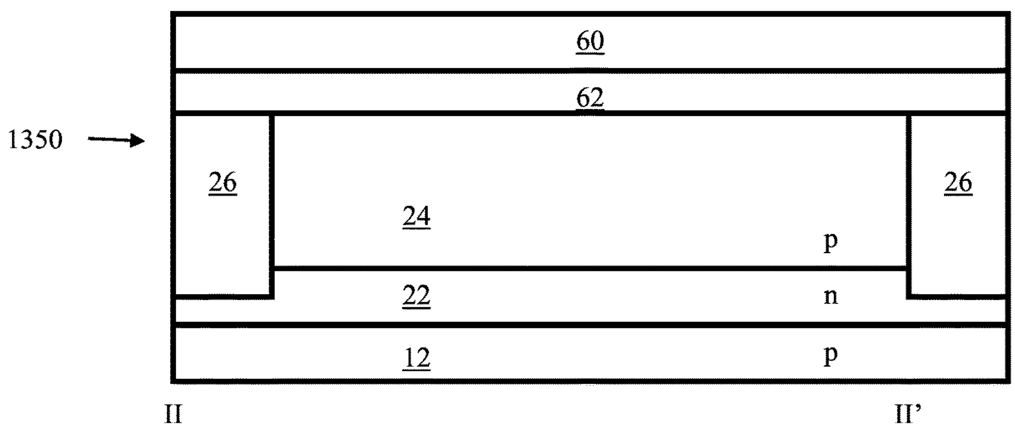
Figure 197M:
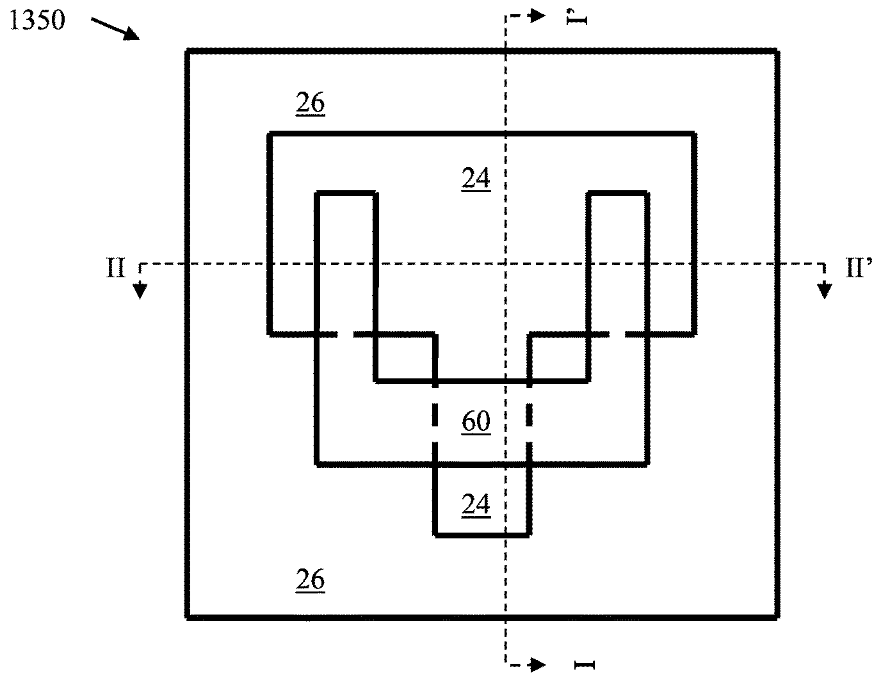
Figure 197N:
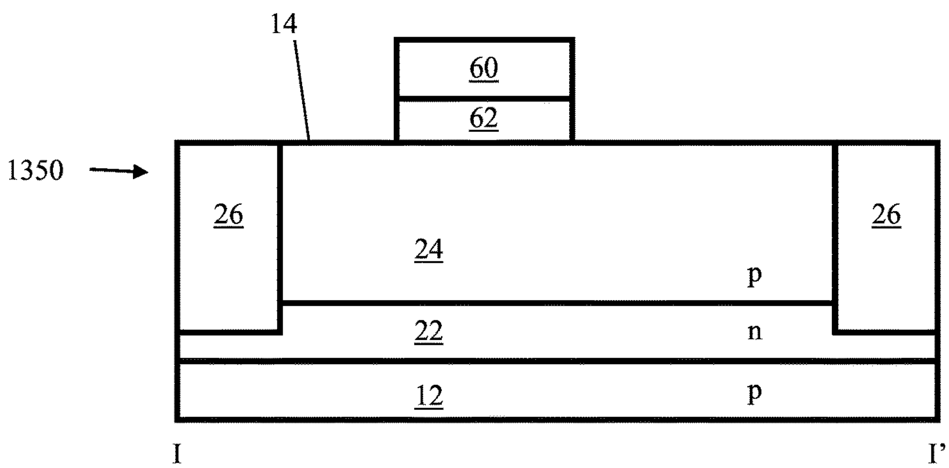
Figure 197O:
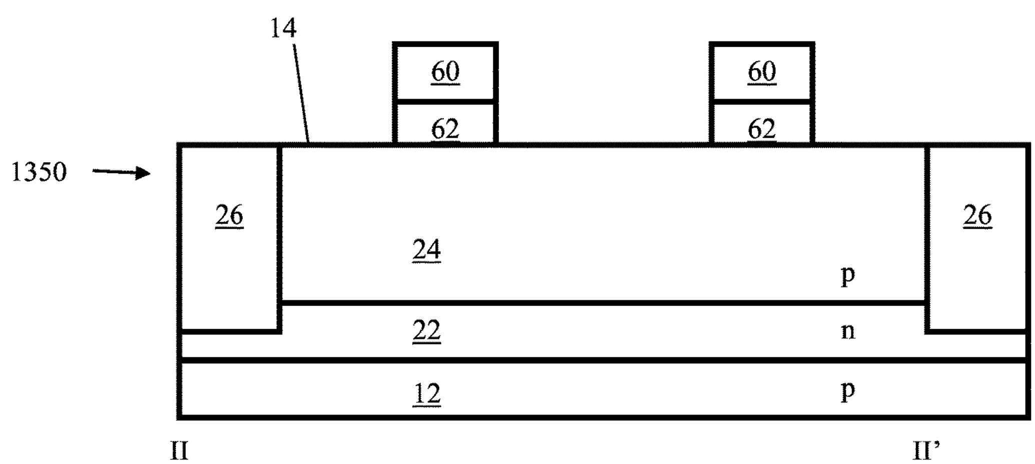
Figure 197P:
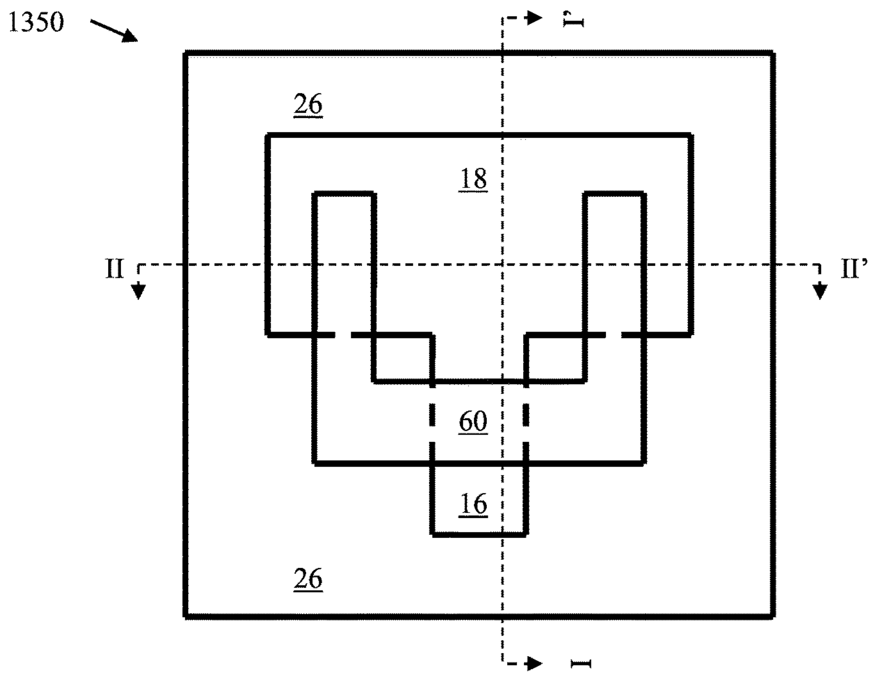
Figure 197Q:
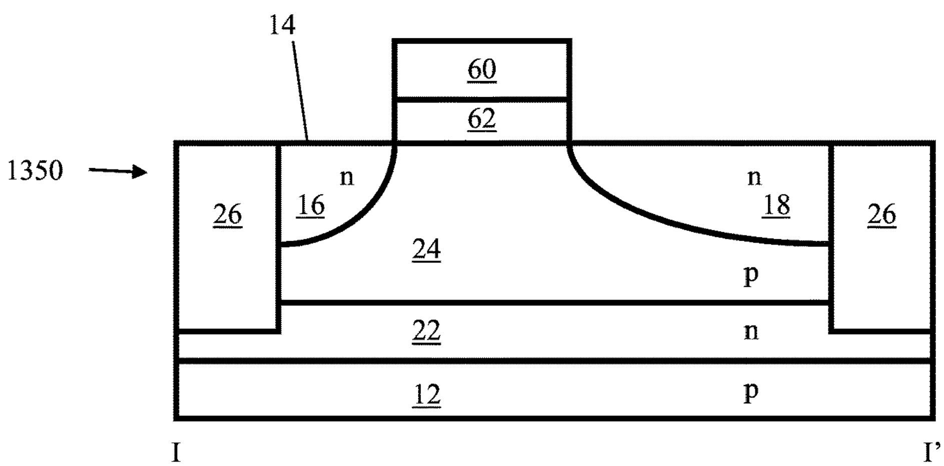
Figure 197R:
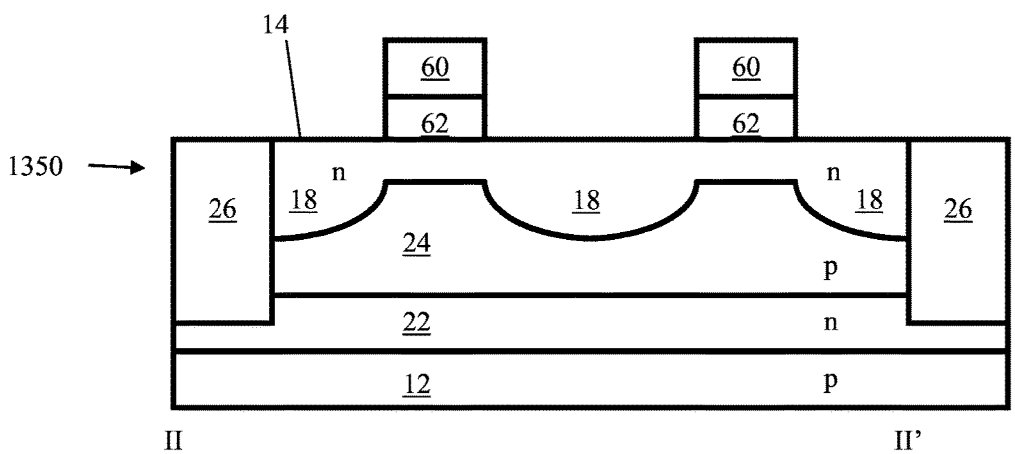

FIGS. 197A through 197R illustrate an alternative method of manufacturing a memory cell according to the present invention.

Figure 198:
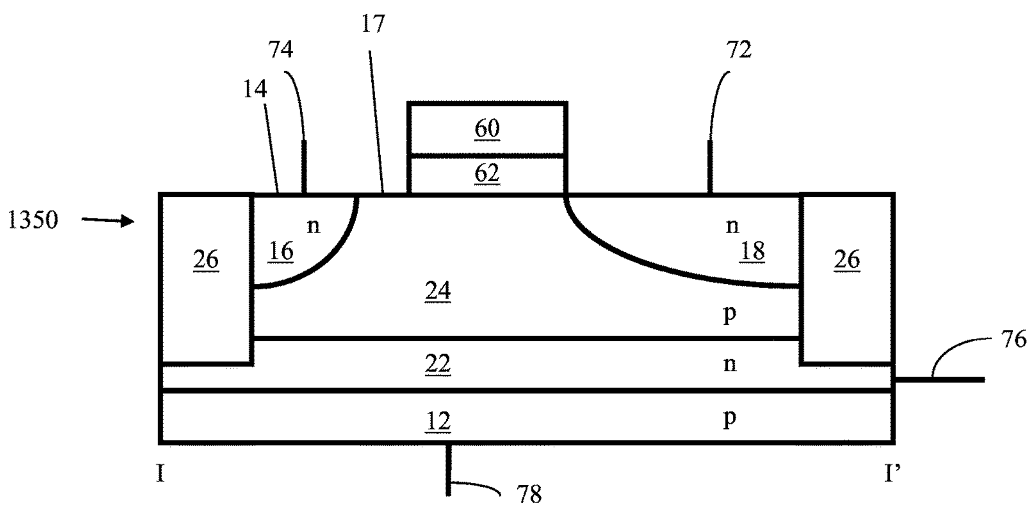

FIG. 198 illustrates a cross-sectional view of an alternative memory device according to the present invention.

Figure 199A:
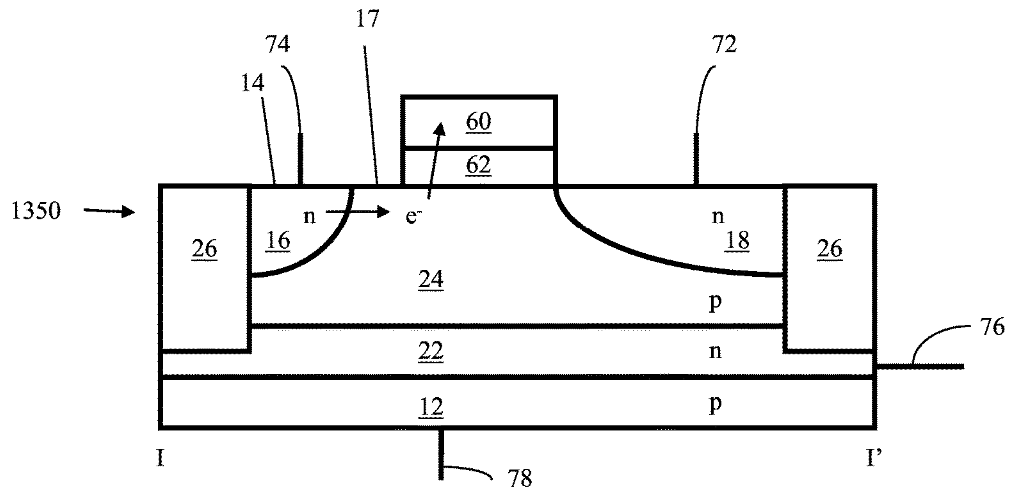
Figure 199B:
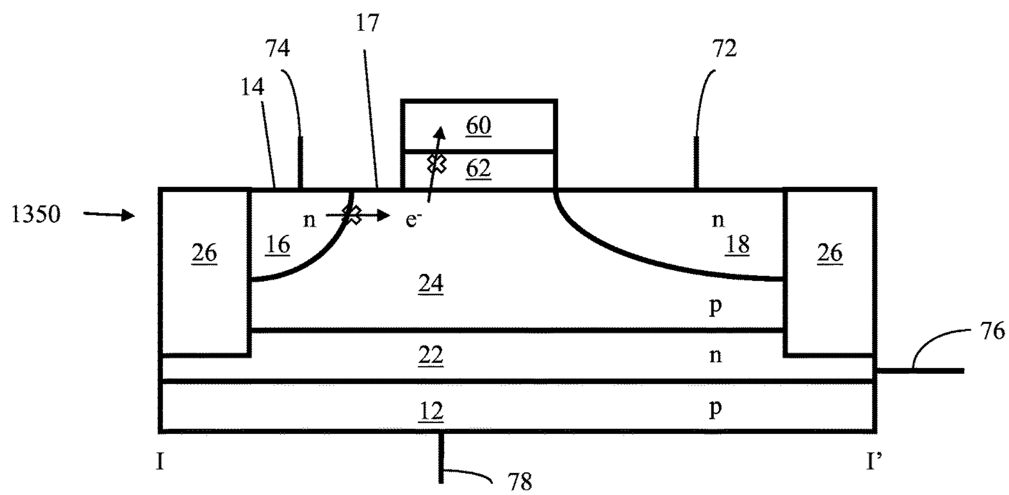

FIGS. 199A and 199B illustrate a shadowing operation performed on an array of memory cells according to the present invention.

Figure 200A:
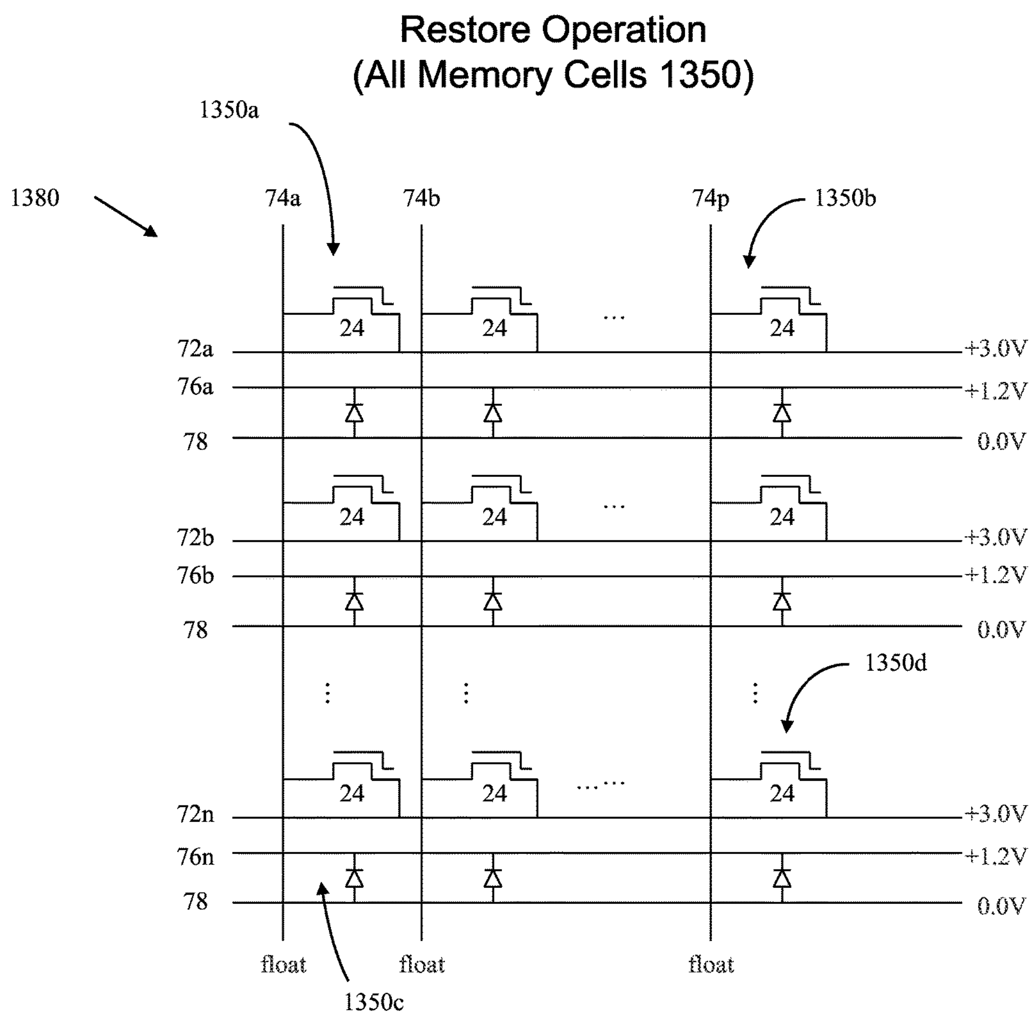
Figure 200B:
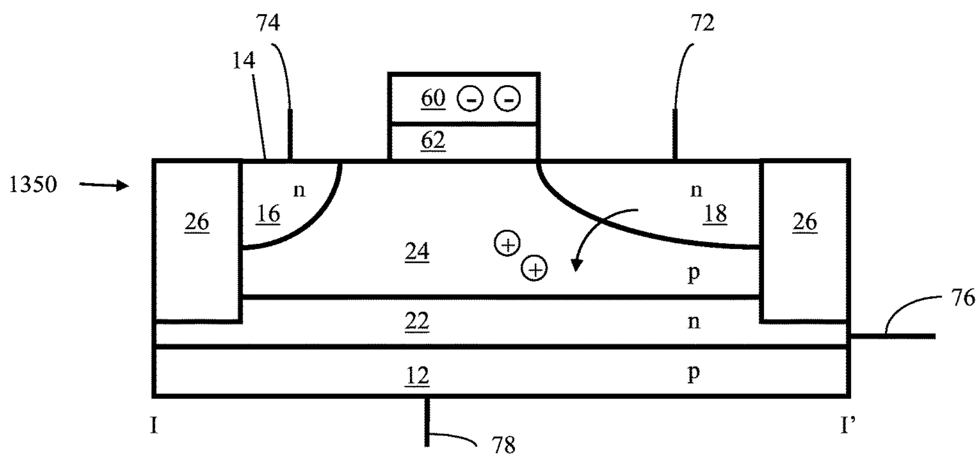
Figure 200C:
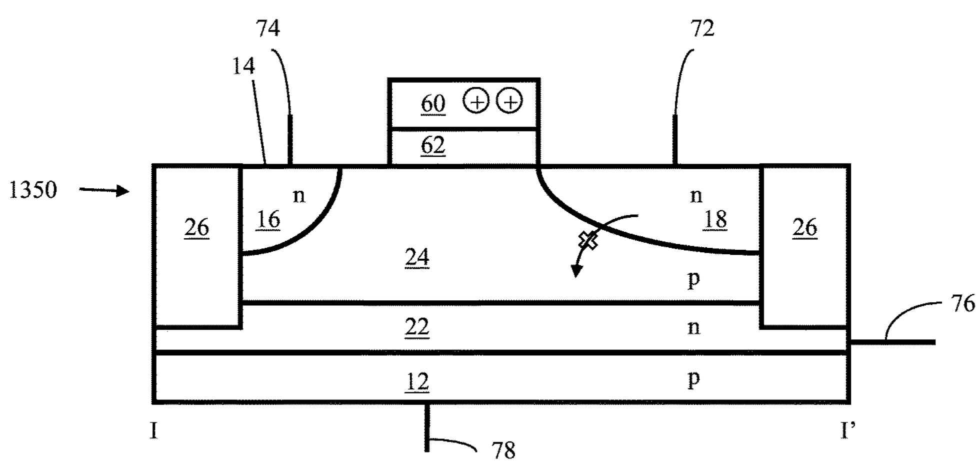

FIGS. 200A through 200C illustrate a restore operation performed on an array of memory cells according to the present invention.

Figure 201:
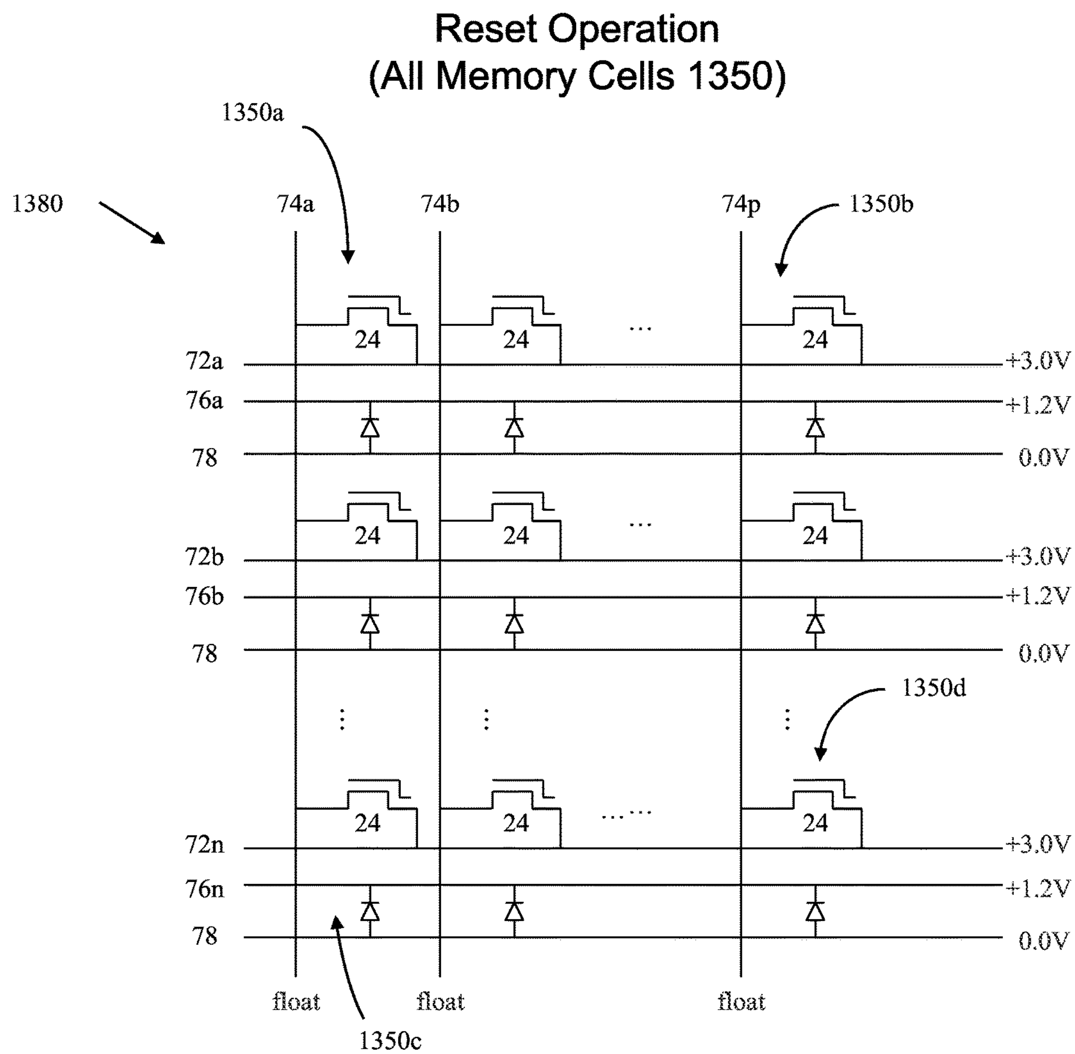

FIG. 201 illustrates a reset operation performed on an array of memory cells according to the present invention.

Figure 202A:
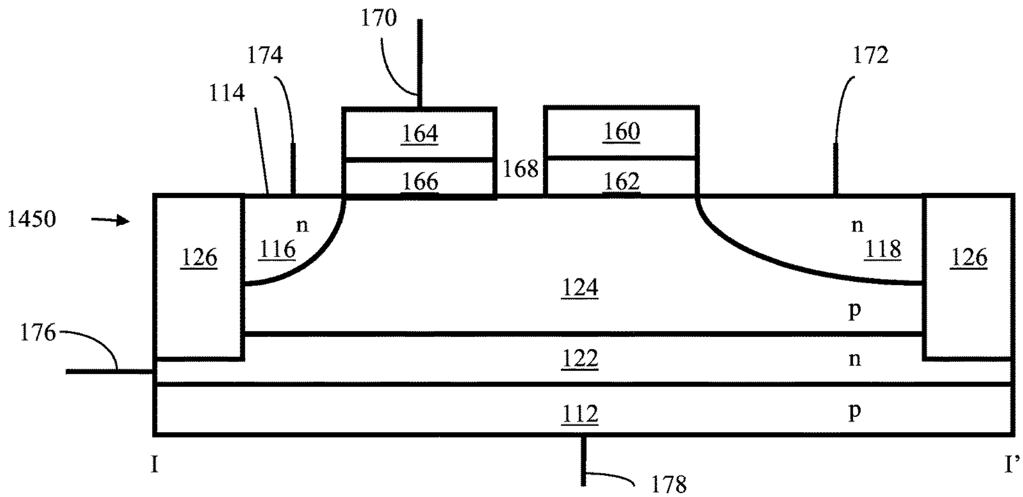
Figure 202B:
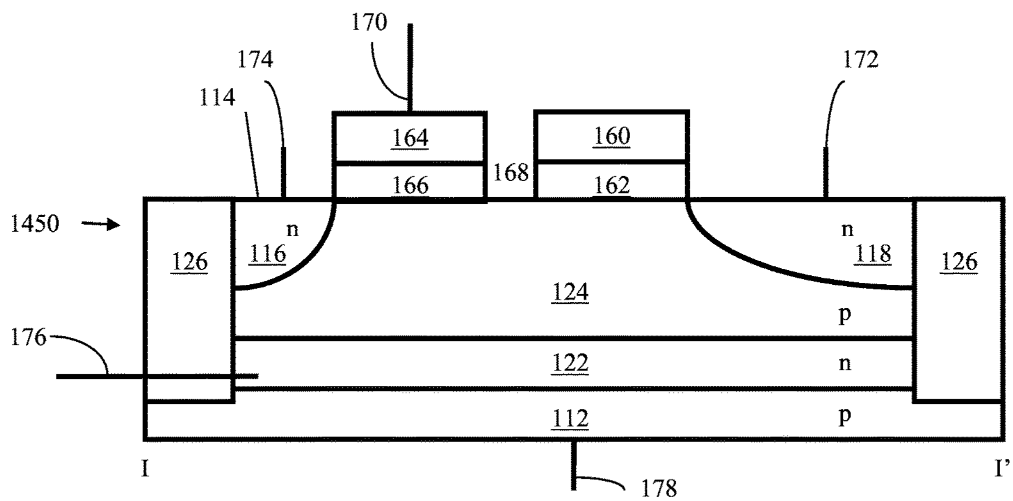

FIGS. 202A and 202B illustrate cross-sectional views of alternative memory devices according to the present invention.

Figure 203:
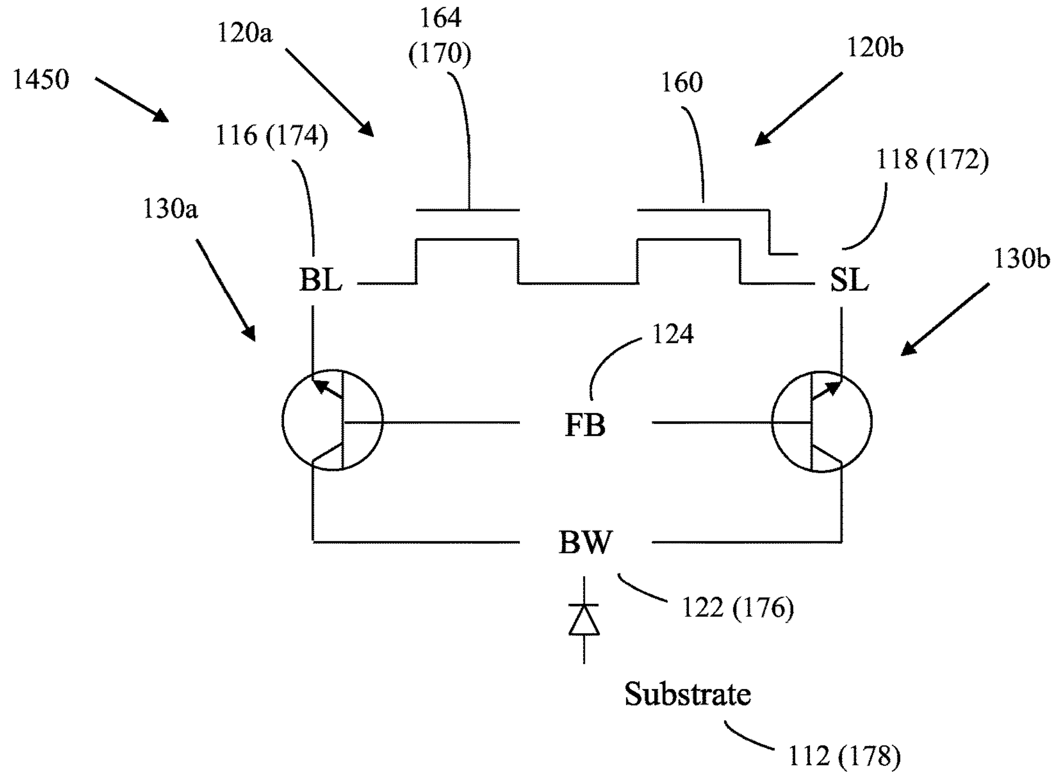

FIG. 203 illustrates an equivalent circuit representation of memory devices shown in FIGS. 202A and 202B.

Figure 204:
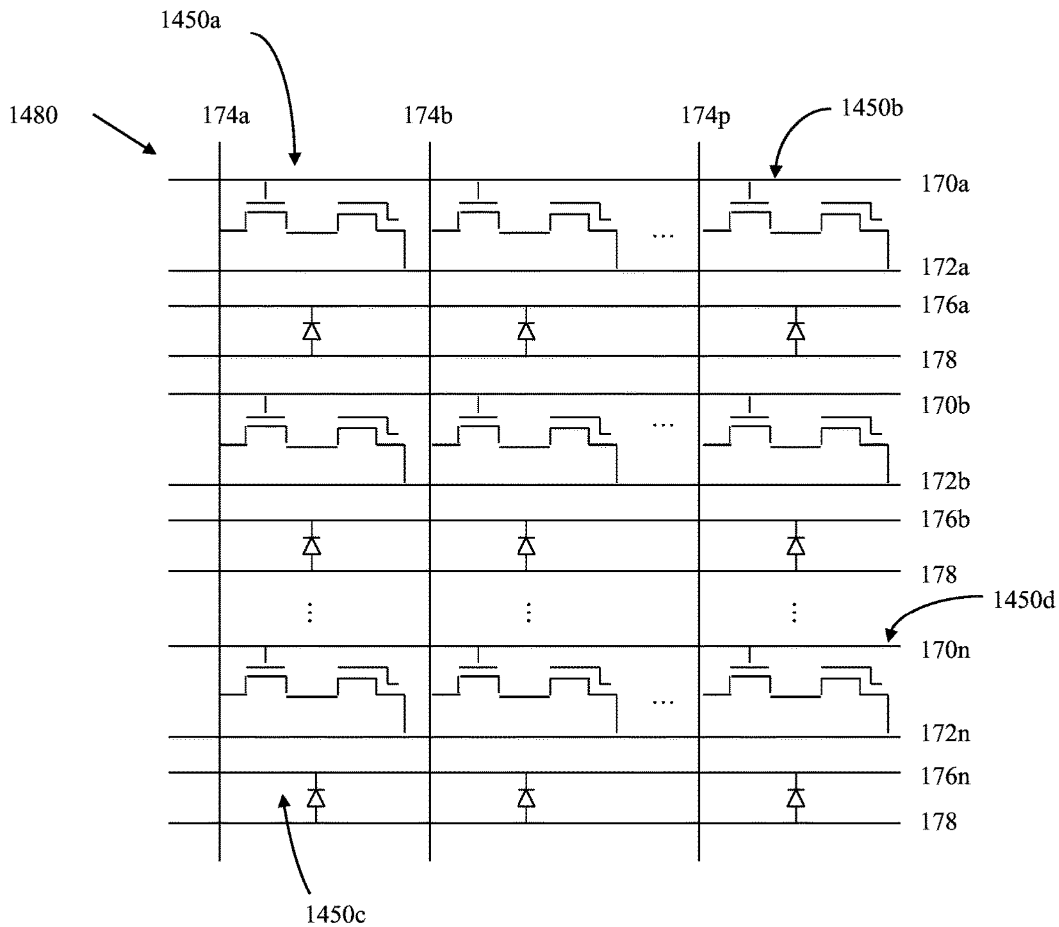

FIG. 204 illustrates an exemplary array of memory devices according to the present invention.

Figure 205:
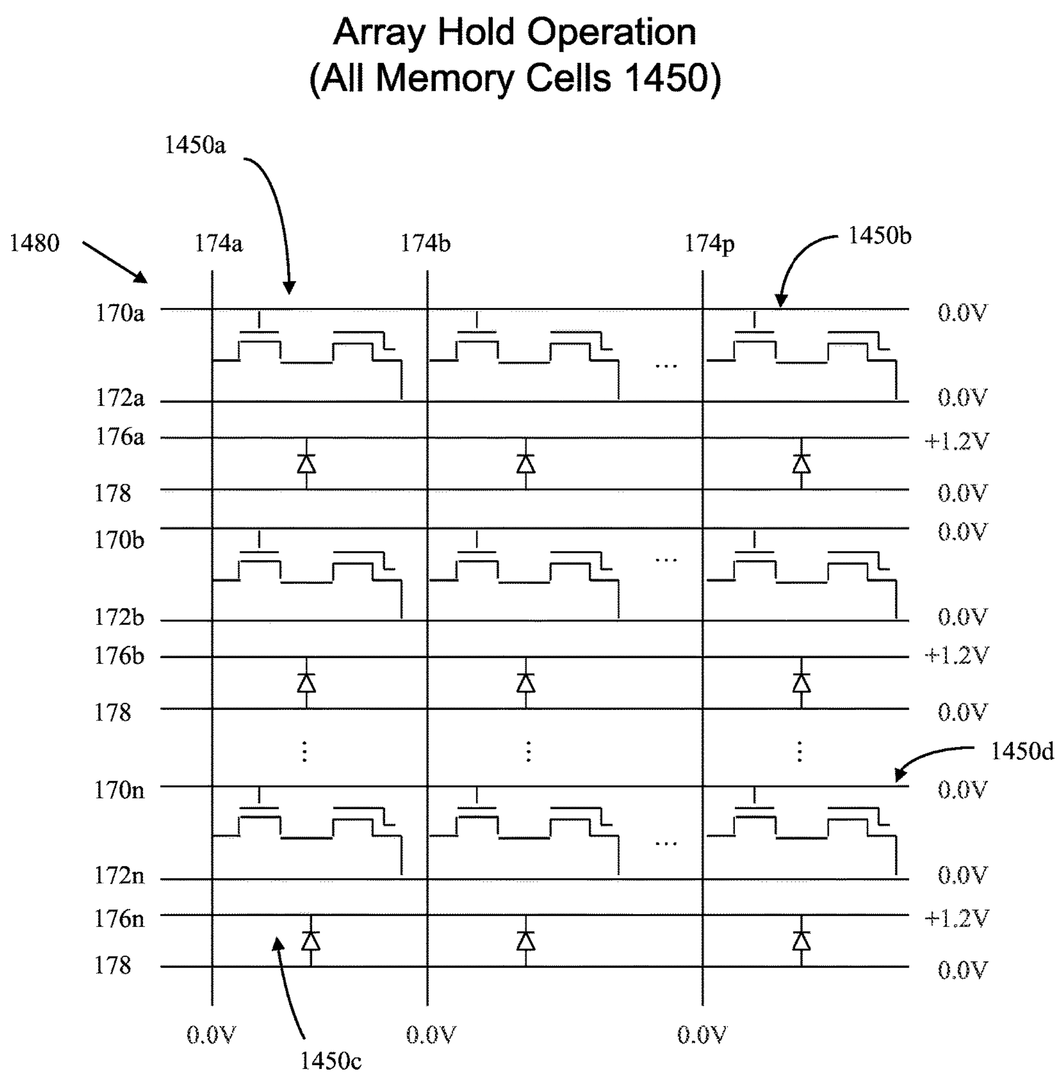

FIG. 205 illustrates a holding operation performed on an array of memory cells according to the present invention.

Figure 206:
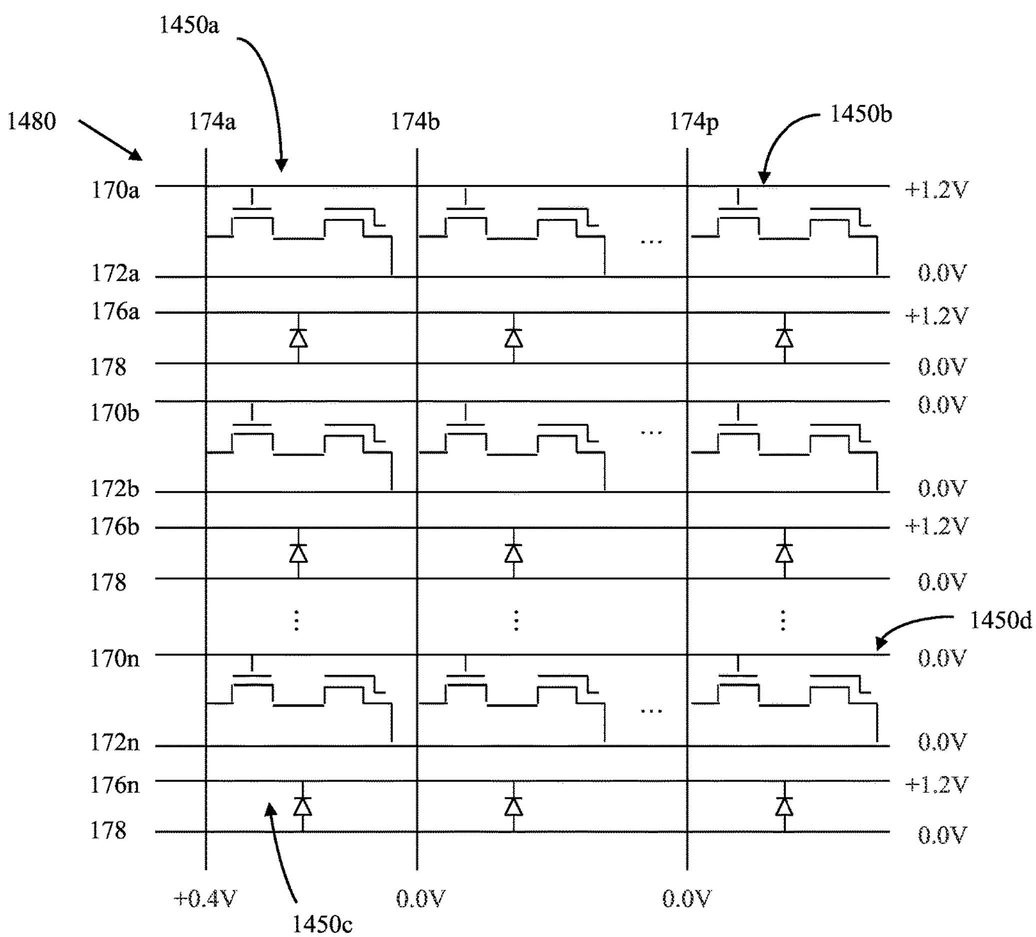

FIG. 206 illustrates a read operation performed on an array of memory cells according to the present invention.

Figure 207A:
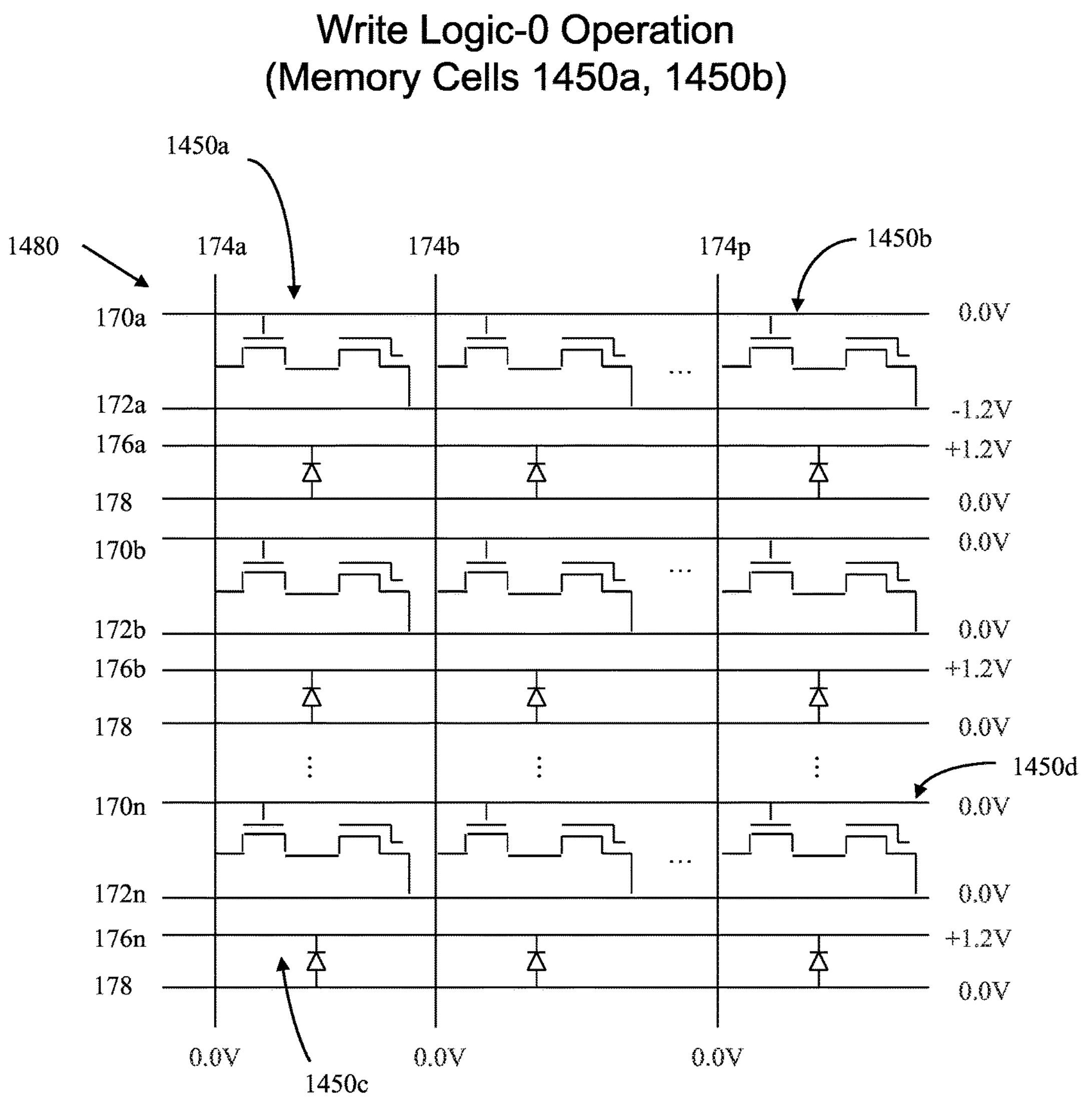
Figure 207B:
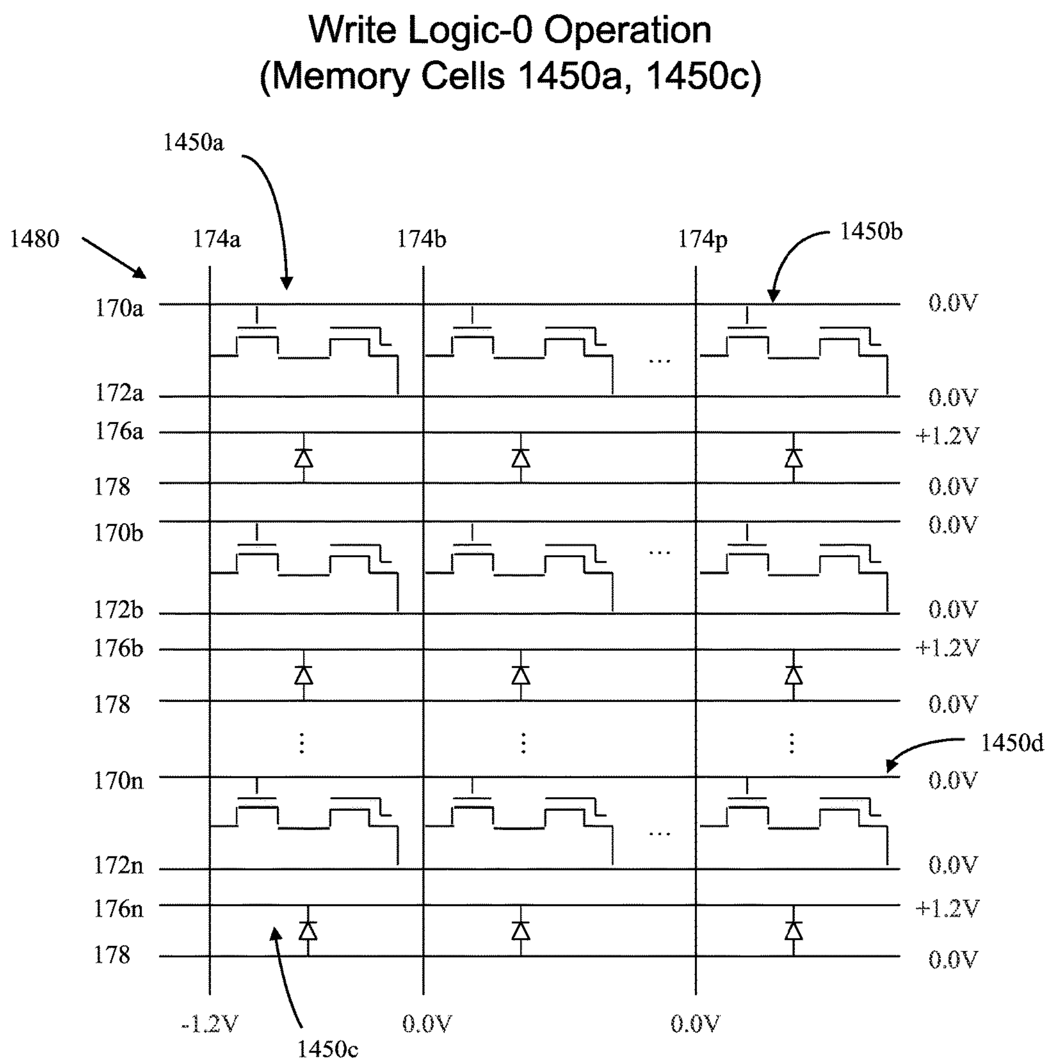
Figure 207C:
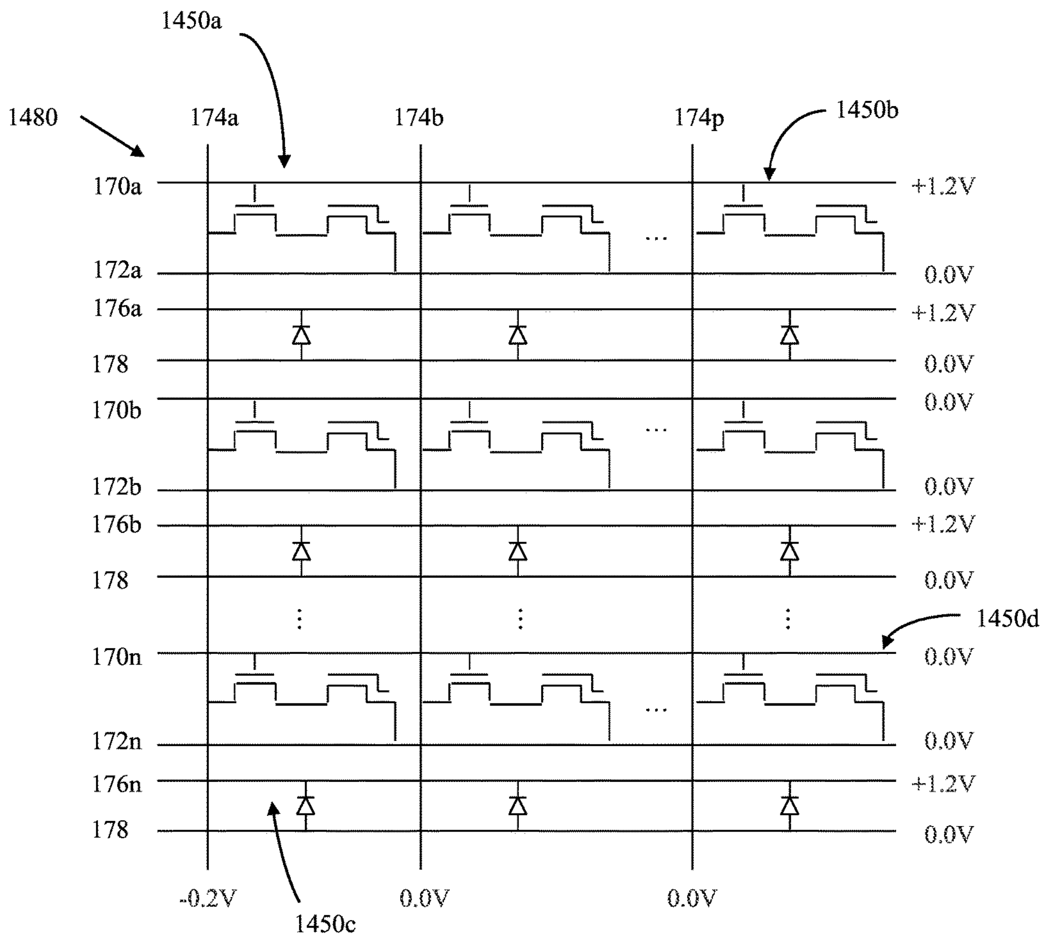

FIGS. 207A through 207C illustrate write logic-0 operations performed on an array of memory cells according to the present invention.

Figure 208A:
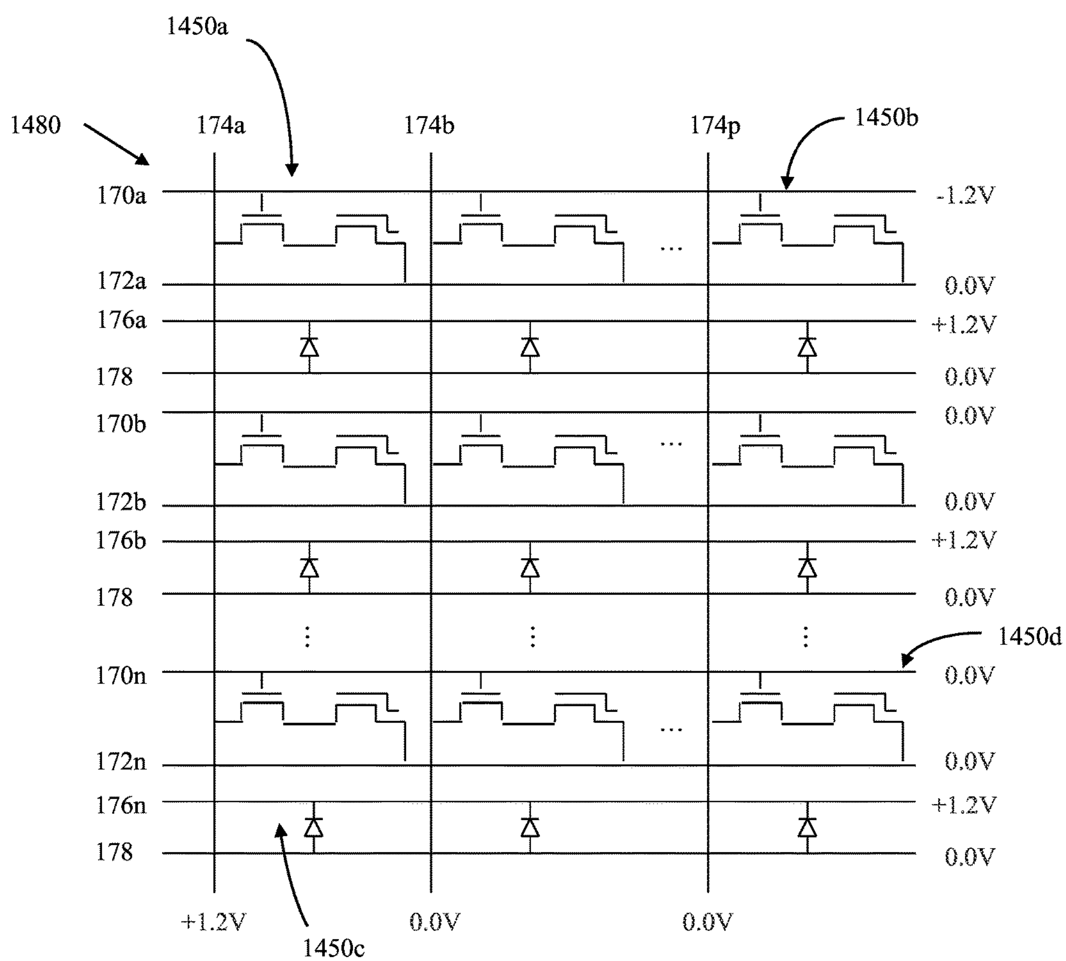
Figure 208B:
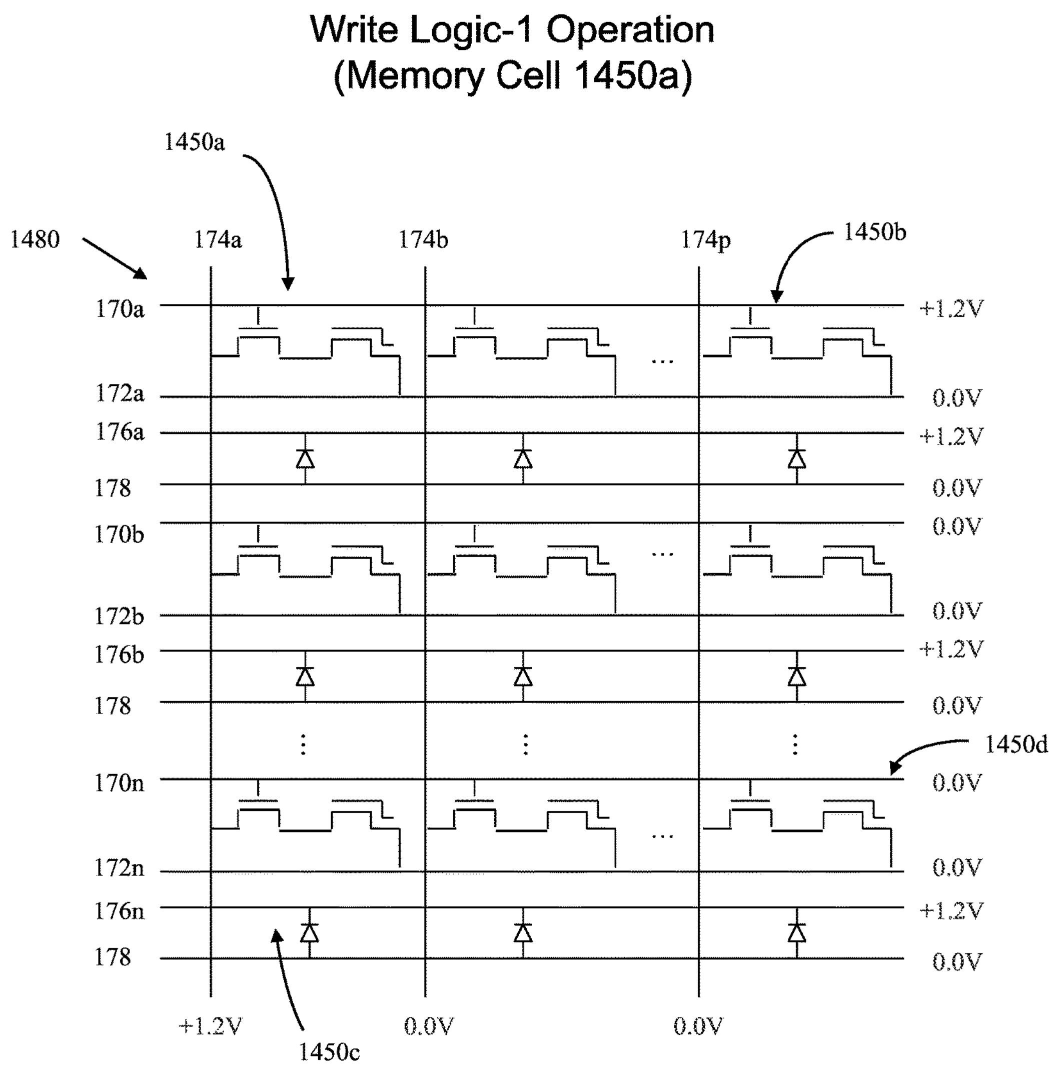

FIGS. 208A and 208B illustrate write logic-1 operations performed on an array of memory cells according to the present invention.

Figure 209:
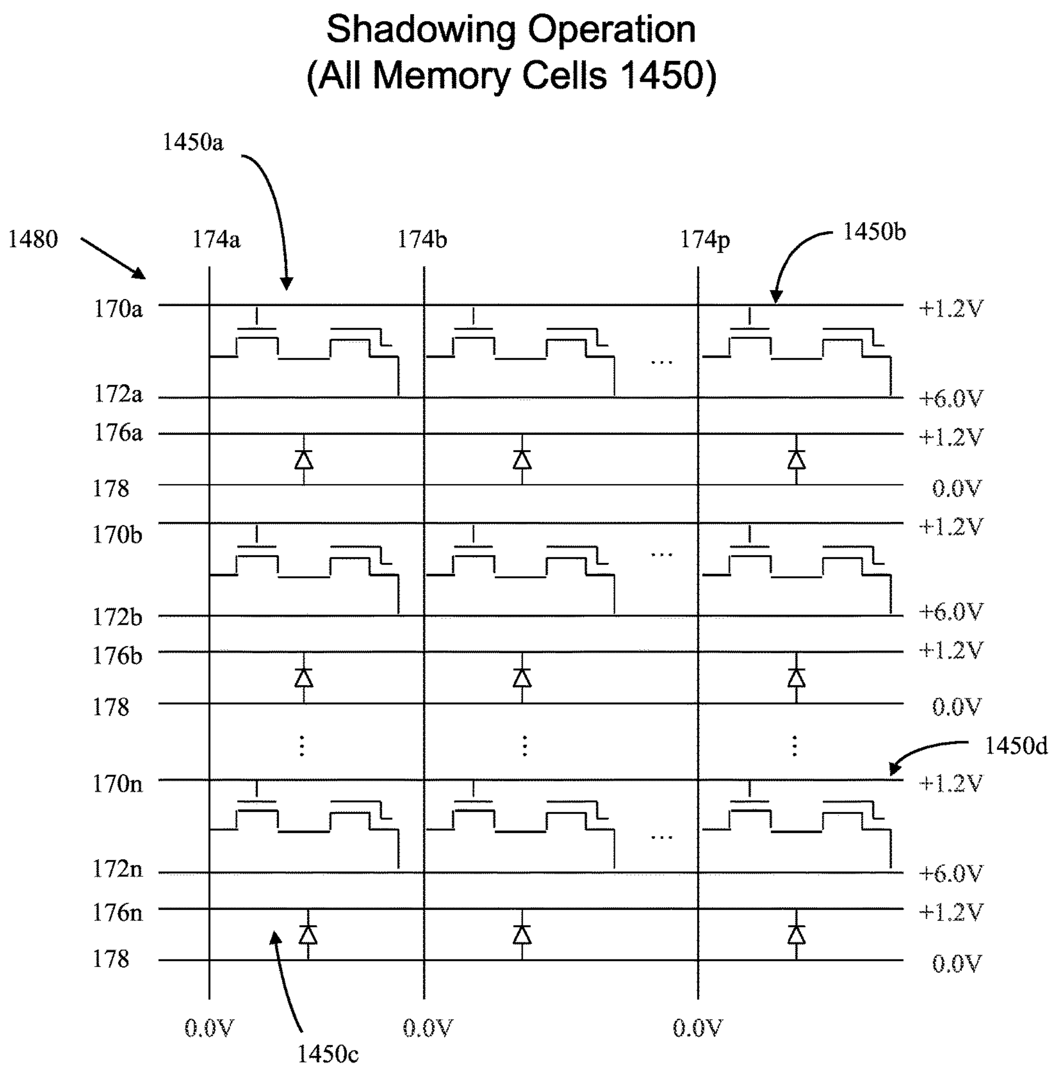
Figure 210A:
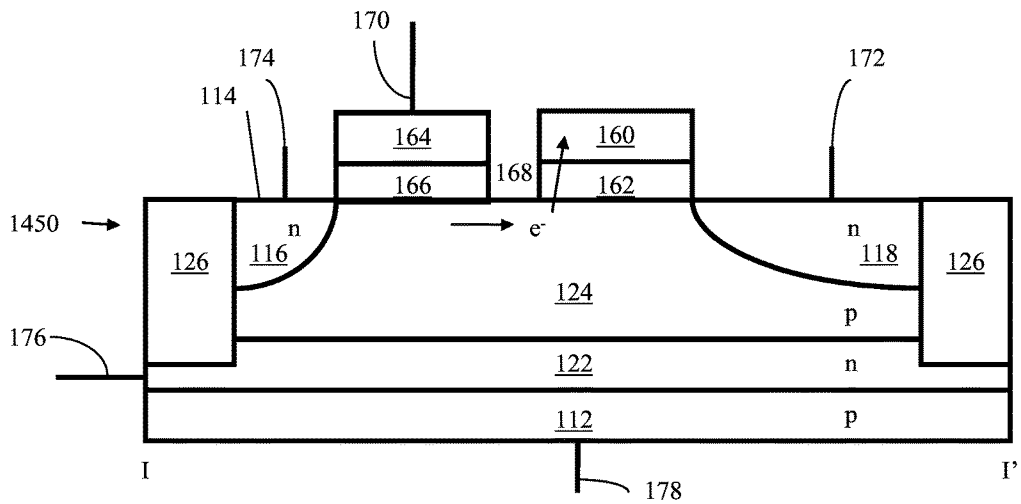
Figure 210B:
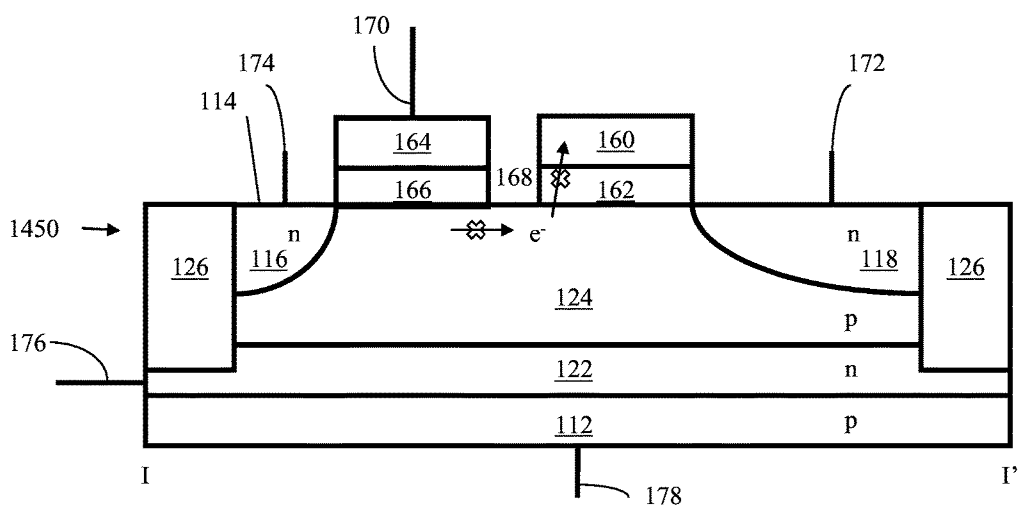

FIGS. 209, 210A through 210B illustrate a shadowing operation performed on an array of memory cells according to the present invention.

Figure 211:
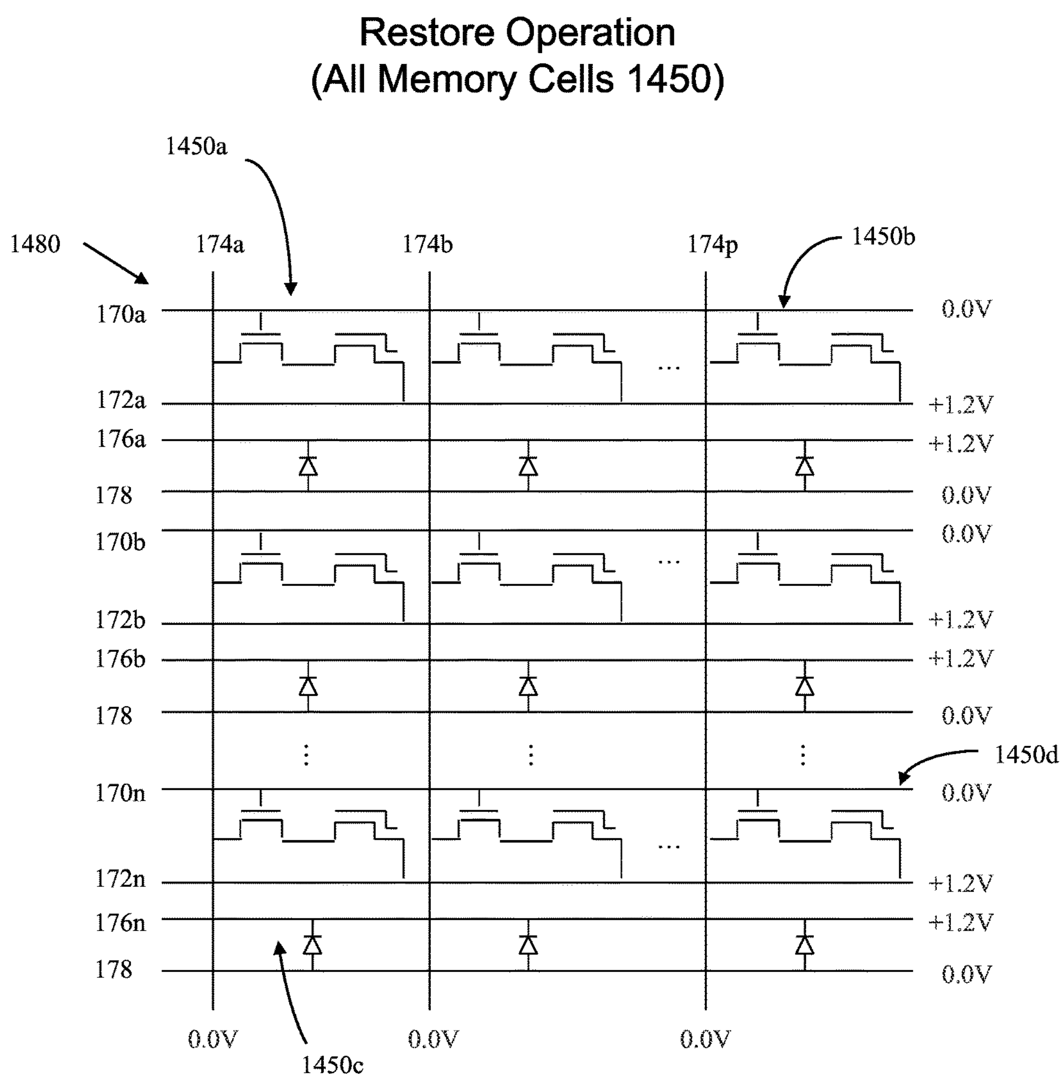
Figure 212A:
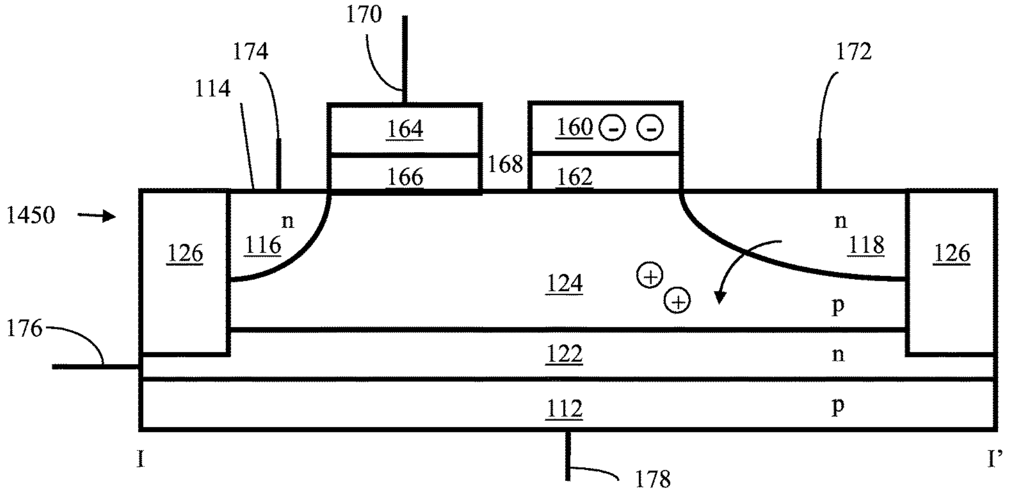
Figure 212B:
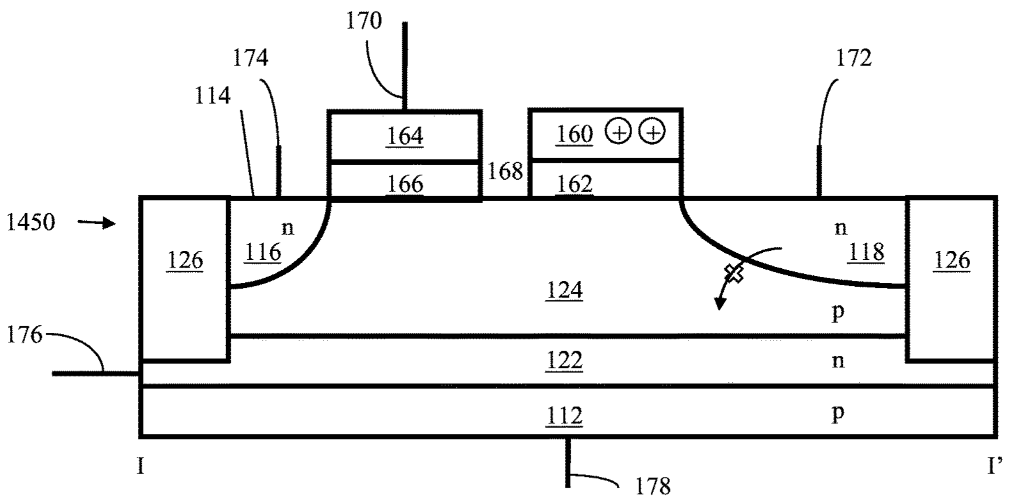

FIGS. 211, 212A through 212B illustrate a restore operation performed on an array of memory cells according to the present invention.

Figure 213A:
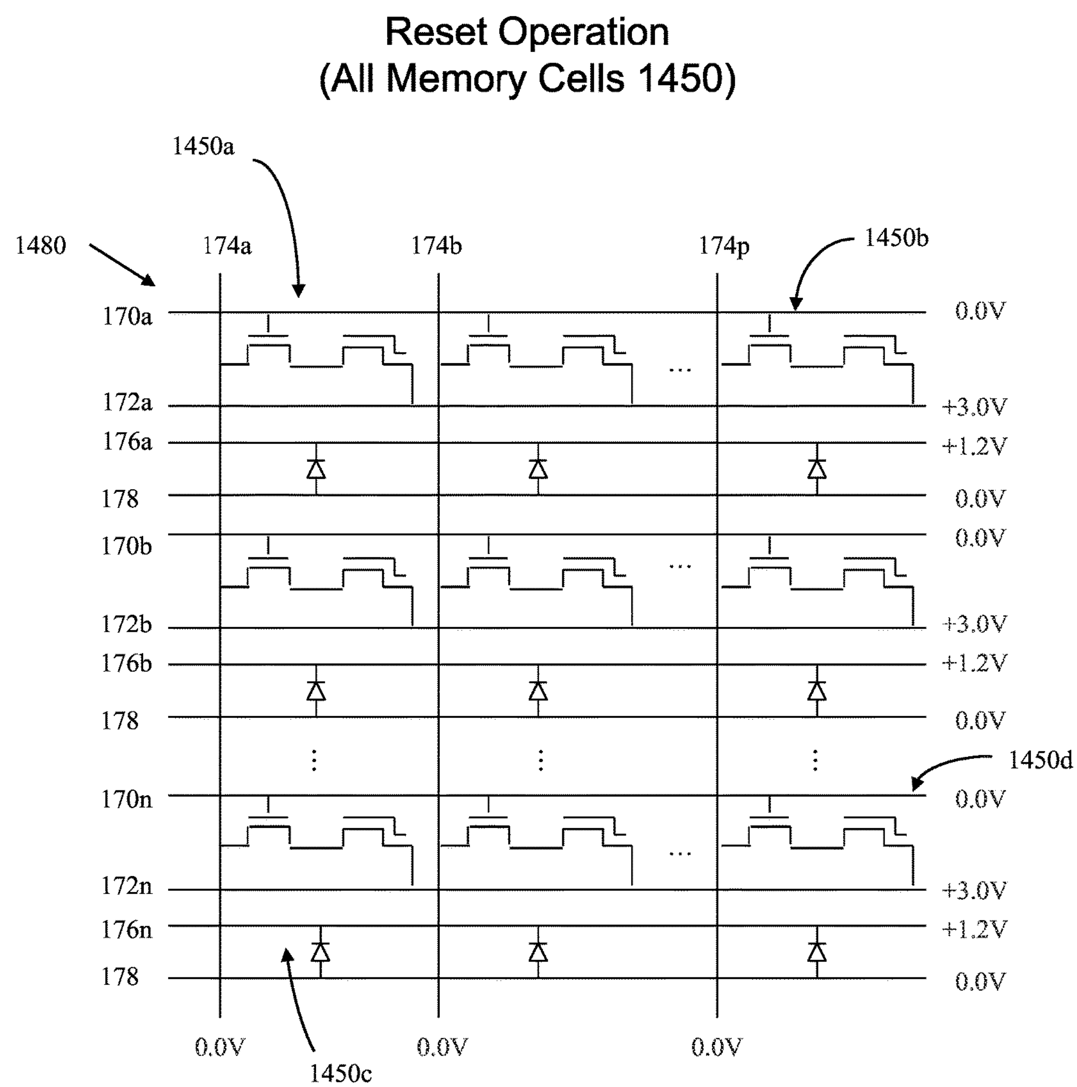
Figure 213B:
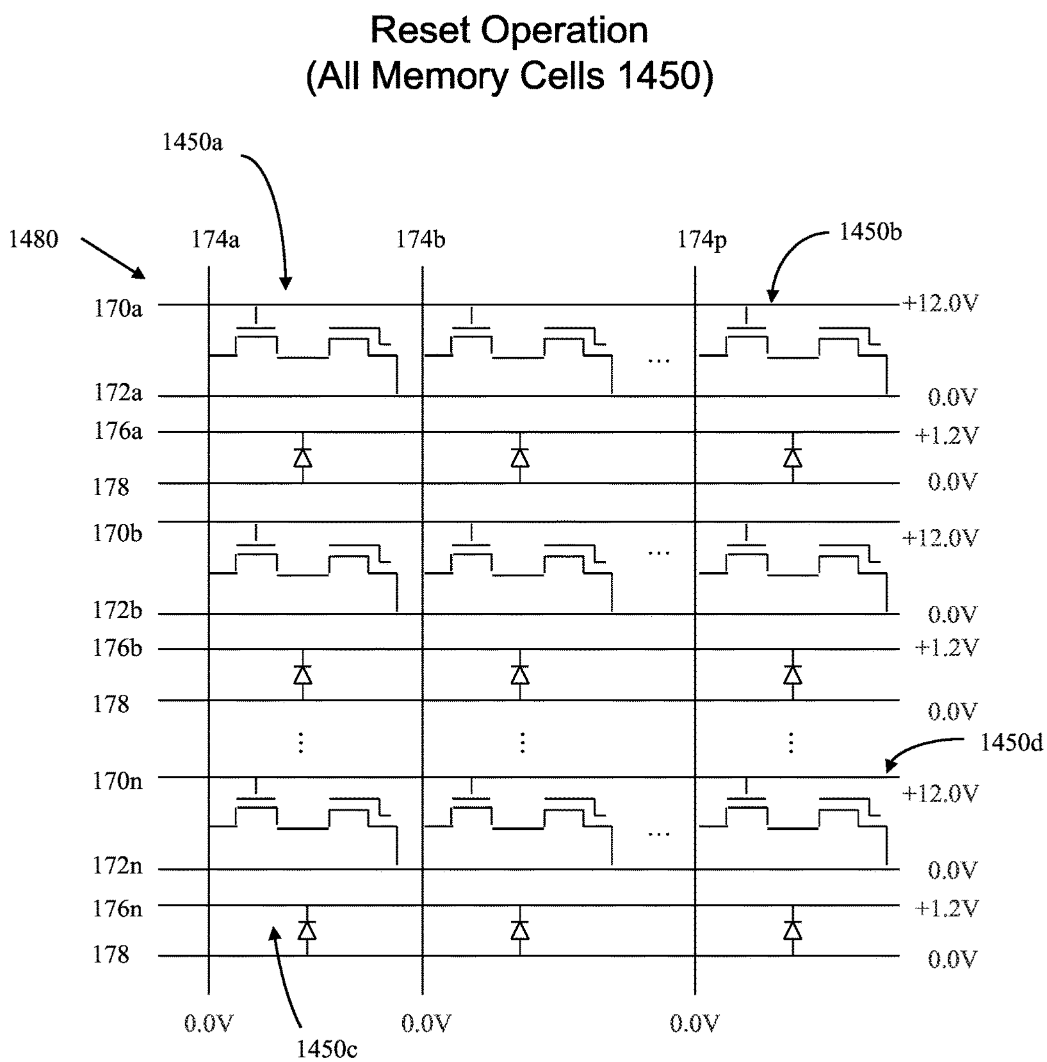

FIGS. 213A and 213B illustrate reset operations performed on an array of memory cells according to the present invention.

Figure 214:
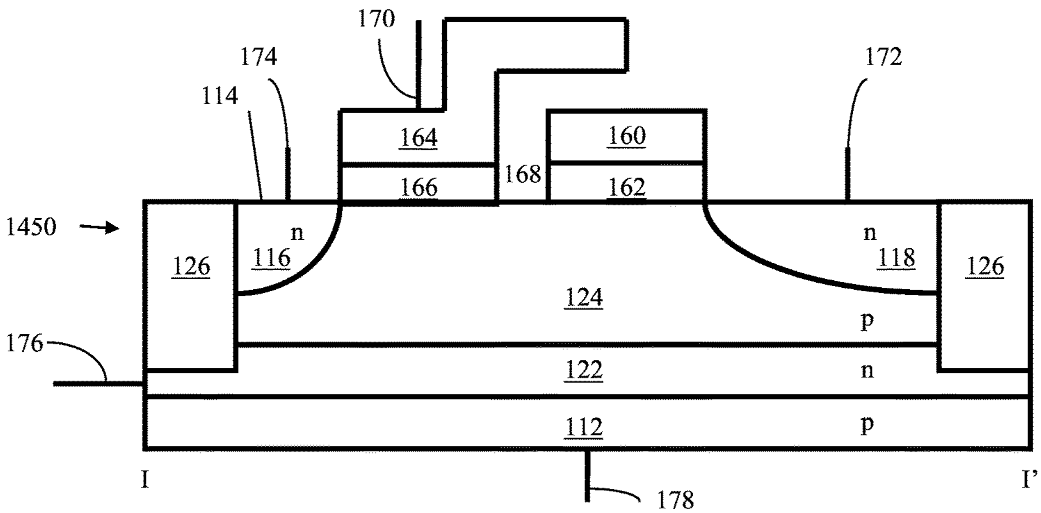
Figure 215A:
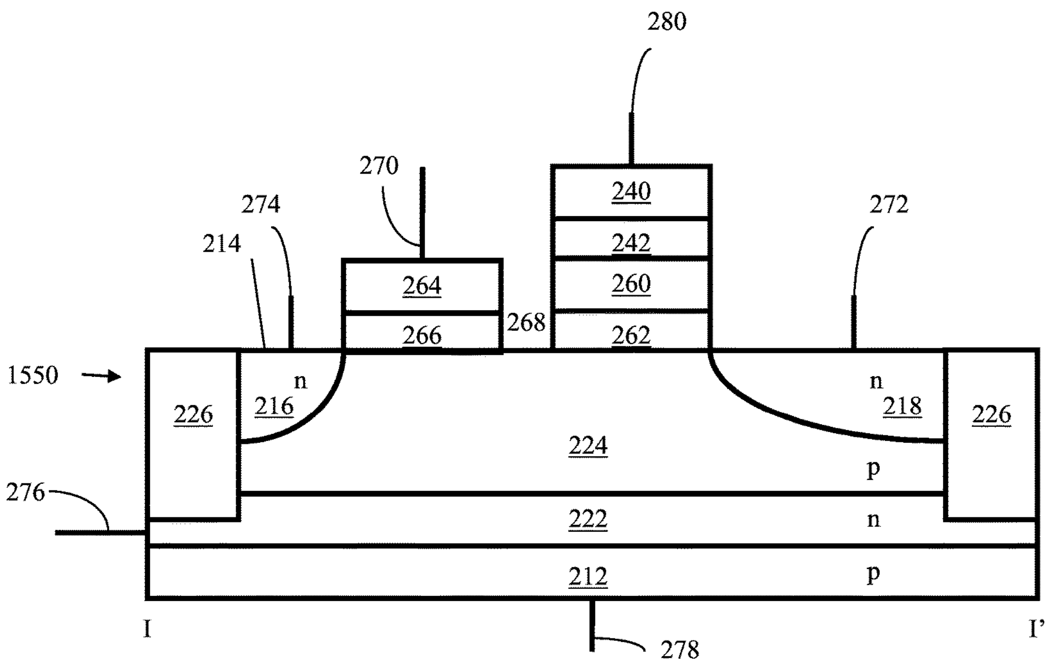
Figure 215B:
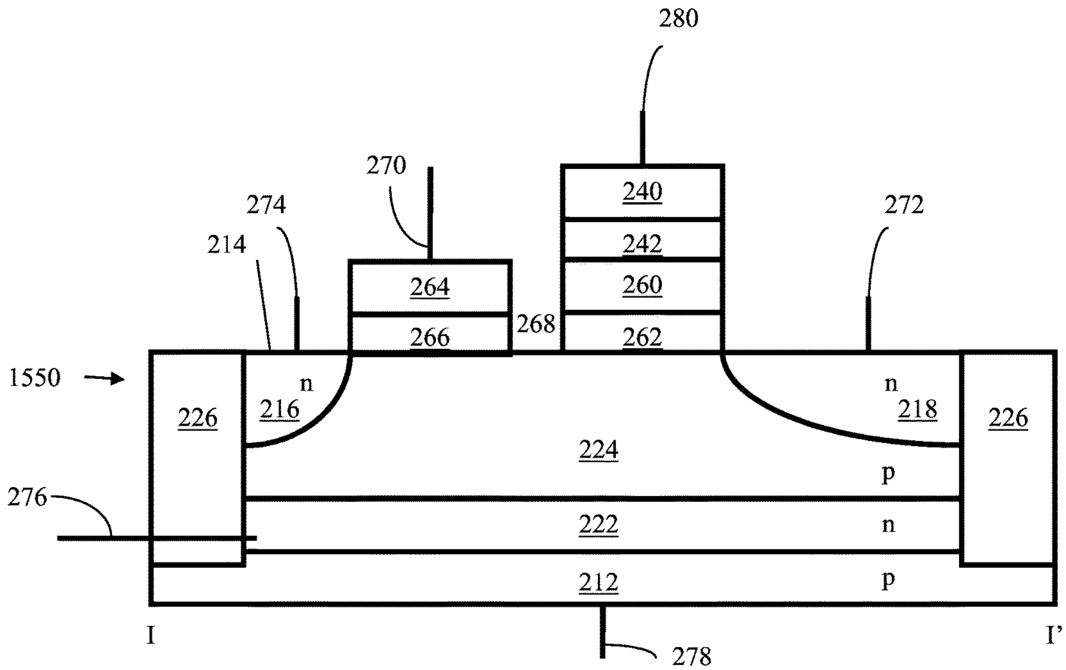

FIGS. 214 and 215A-215B illustrate cross-sectional views of alternative memory devices according to the present invention.

Figure 216:
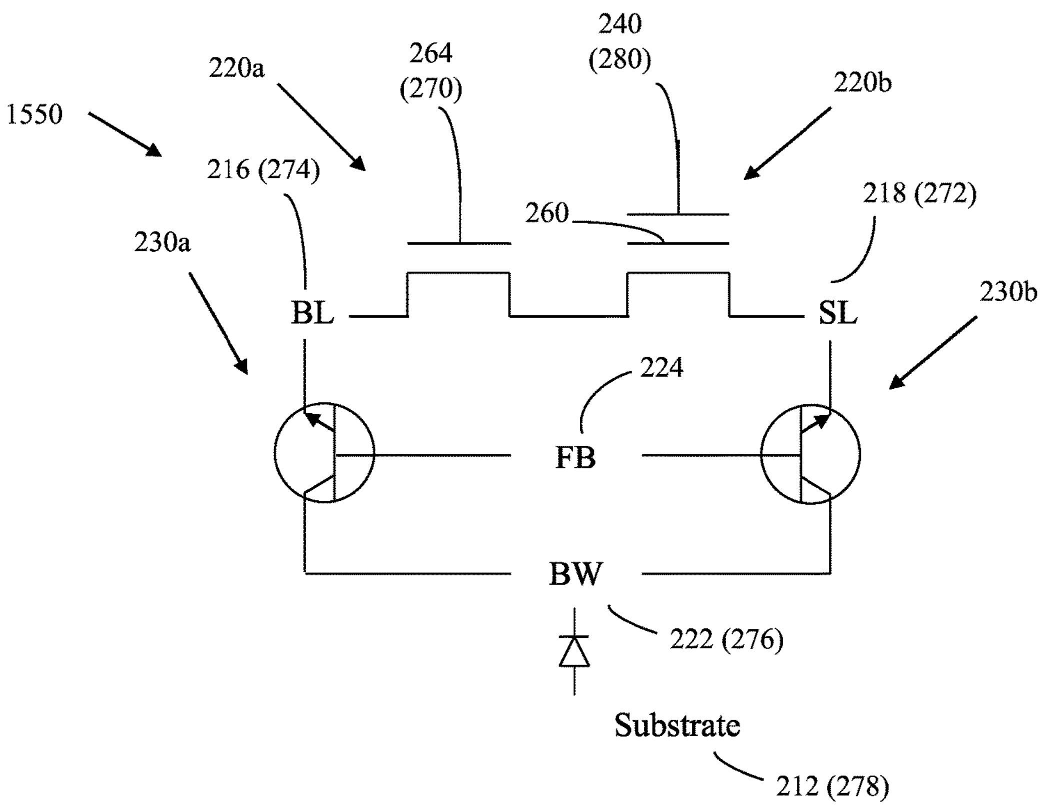

FIG. 216 illustrates an equivalent circuit representation of memory devices shown in FIGS. 215A-215B.

Figure 217:
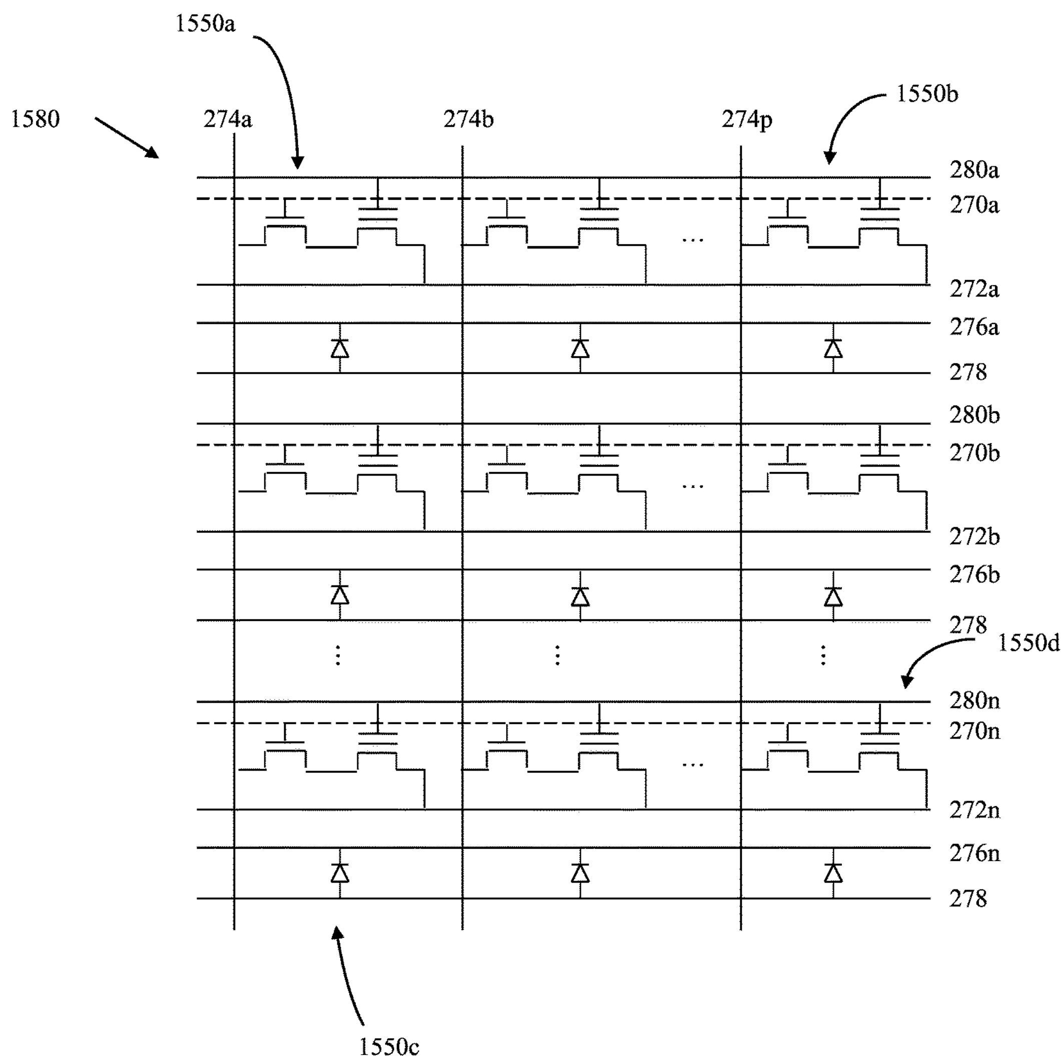

FIG. 217 illustrates an exemplary array of memory devices according to the present invention.

Figure 218:
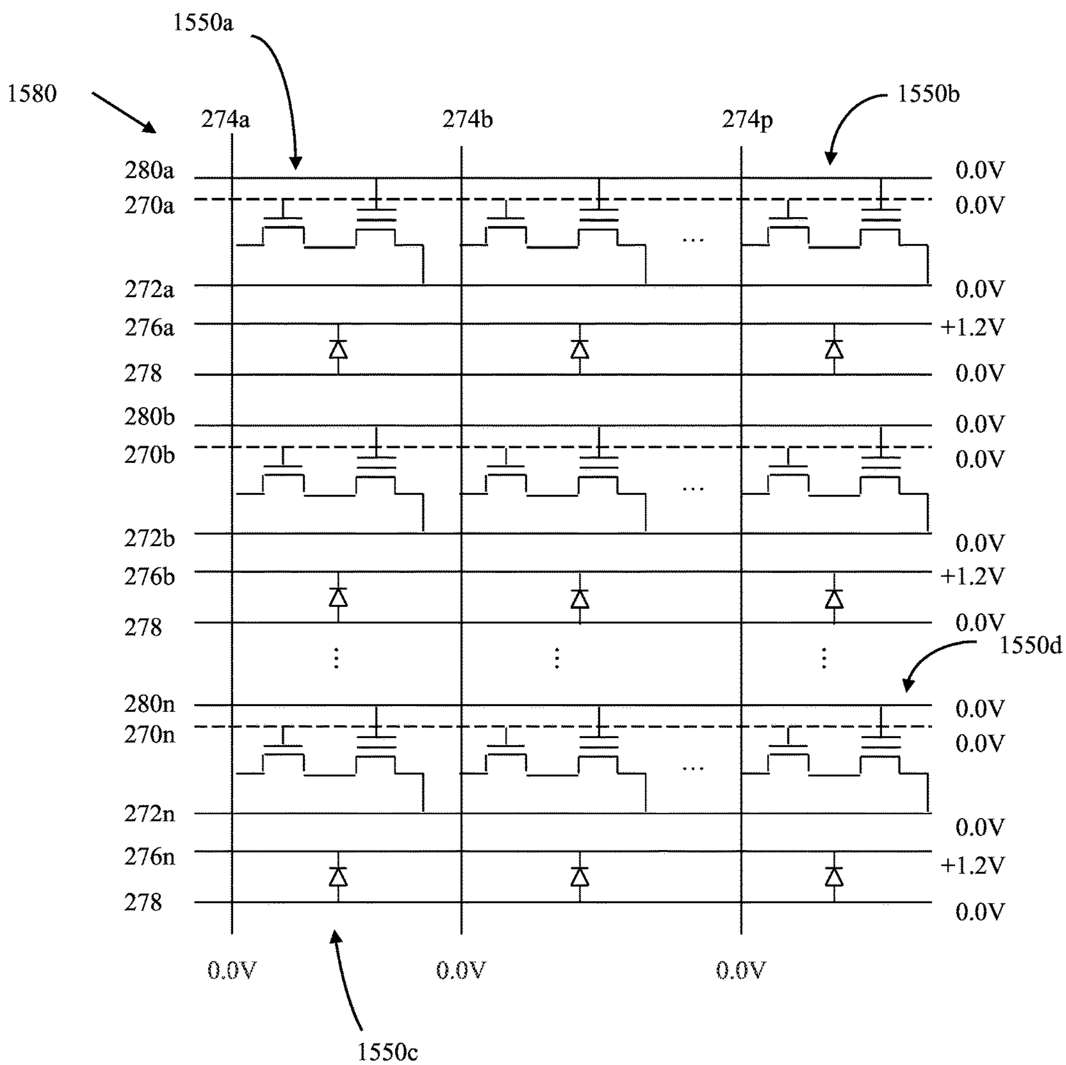

FIG. 218 illustrates a holding operation performed on an array of memory cells according to the present invention.

Figure 219:
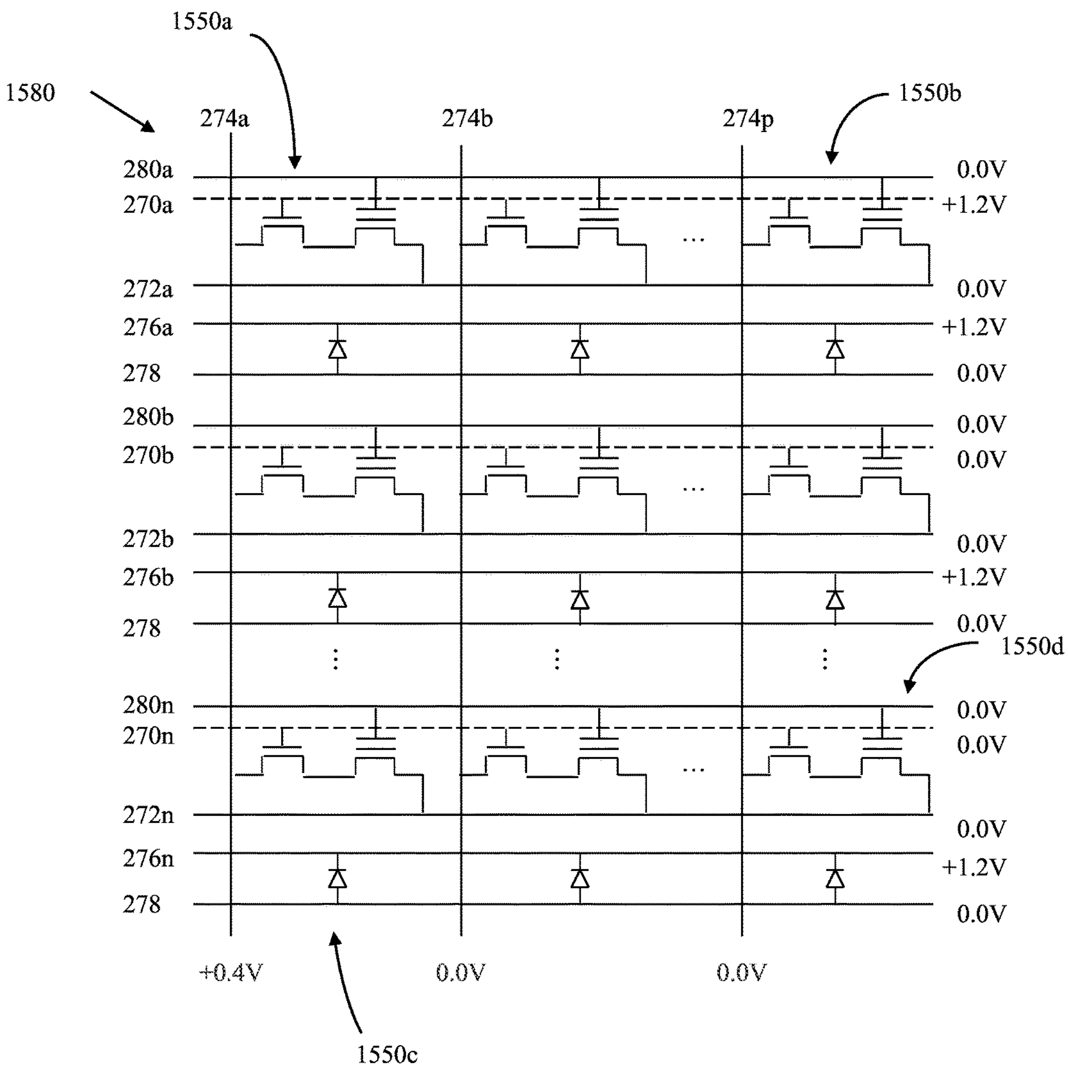

FIG. 219 illustrates a read operation performed on an array of memory cells according to the present invention.

Figure 220A:
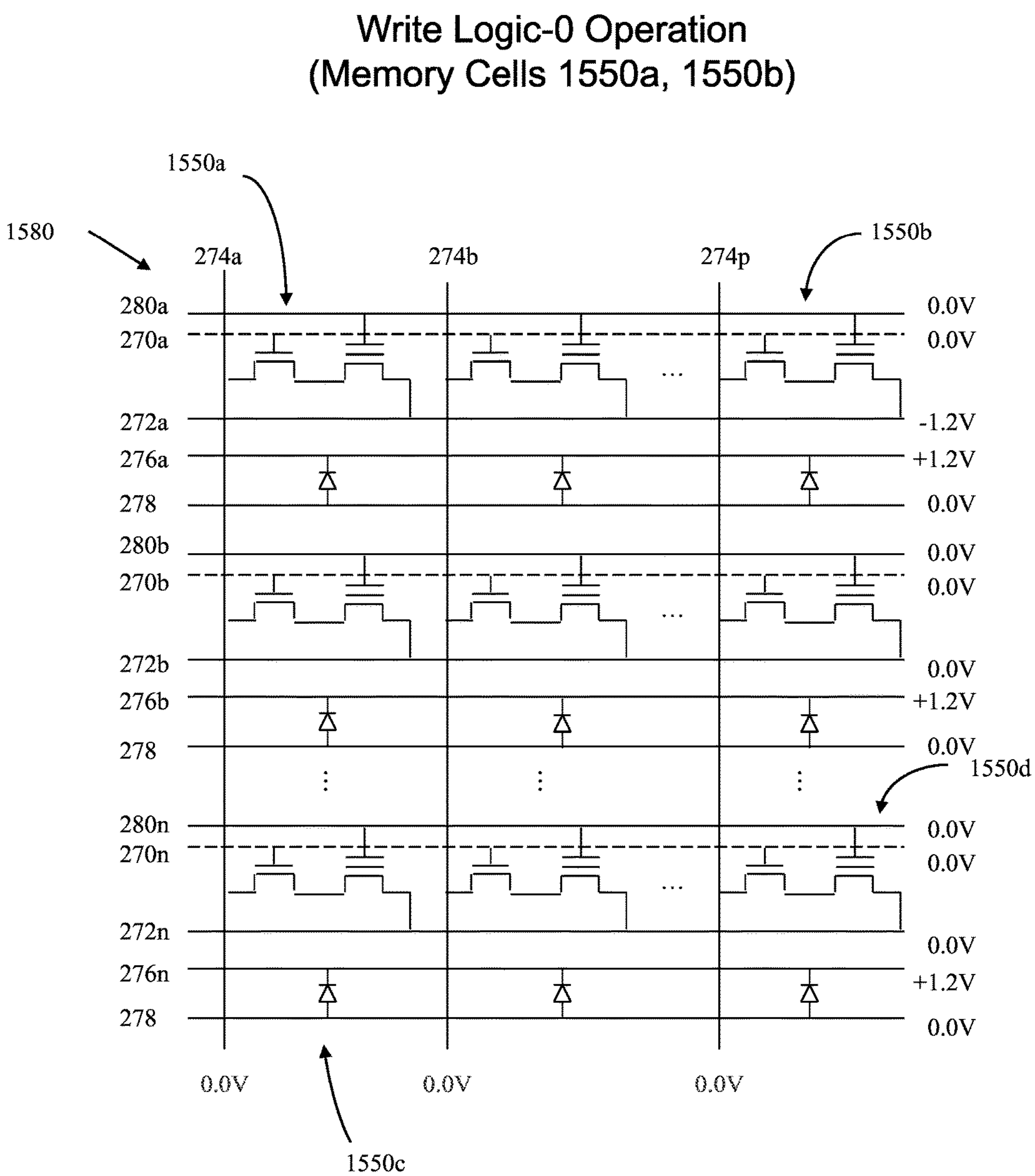
Figure 220B:
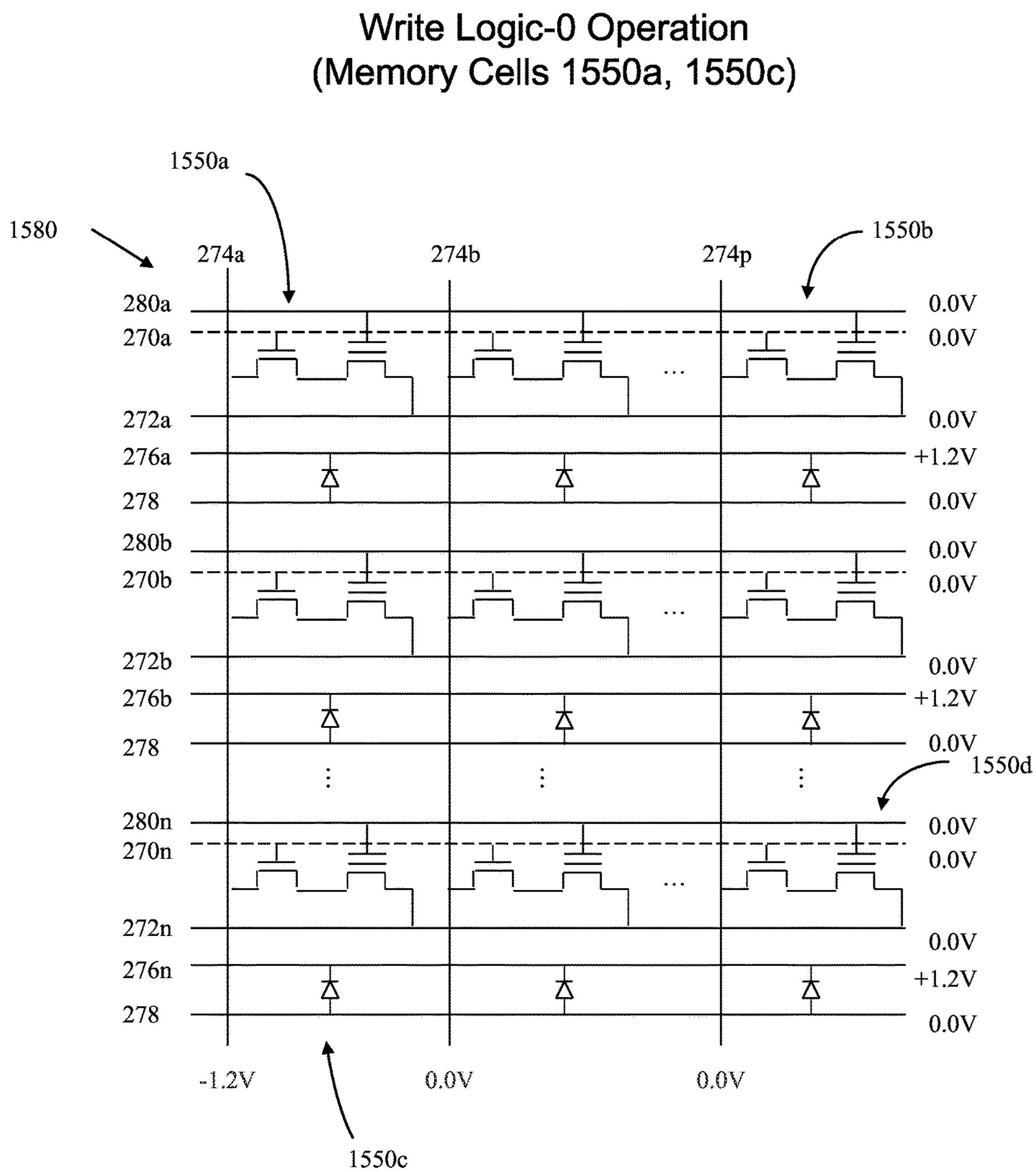
Figure 221:
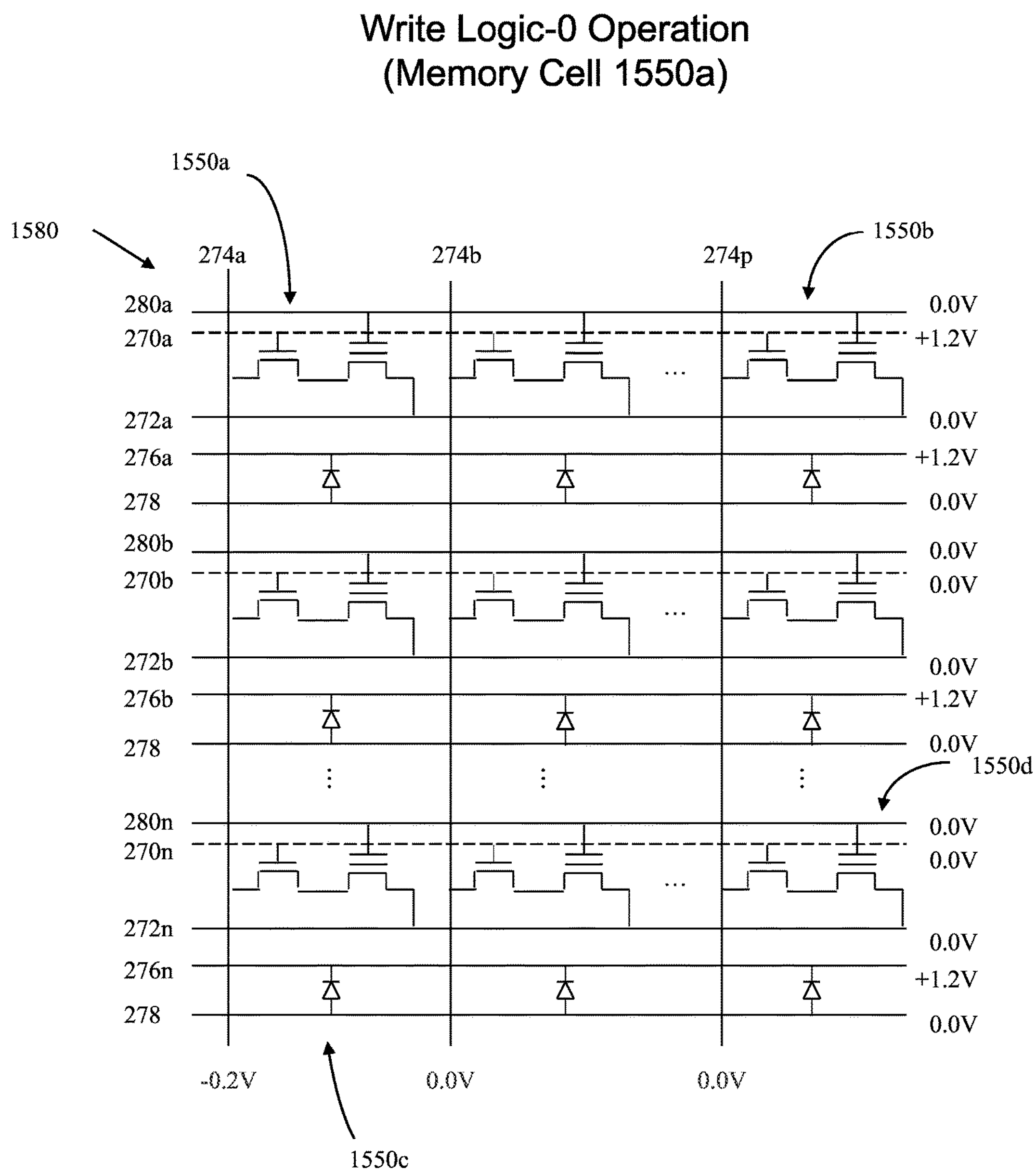

FIGS. 220A, 220B, and 221 illustrate write logic-0 operations performed on an array of memory cells according to the present invention.

Figure 222A:
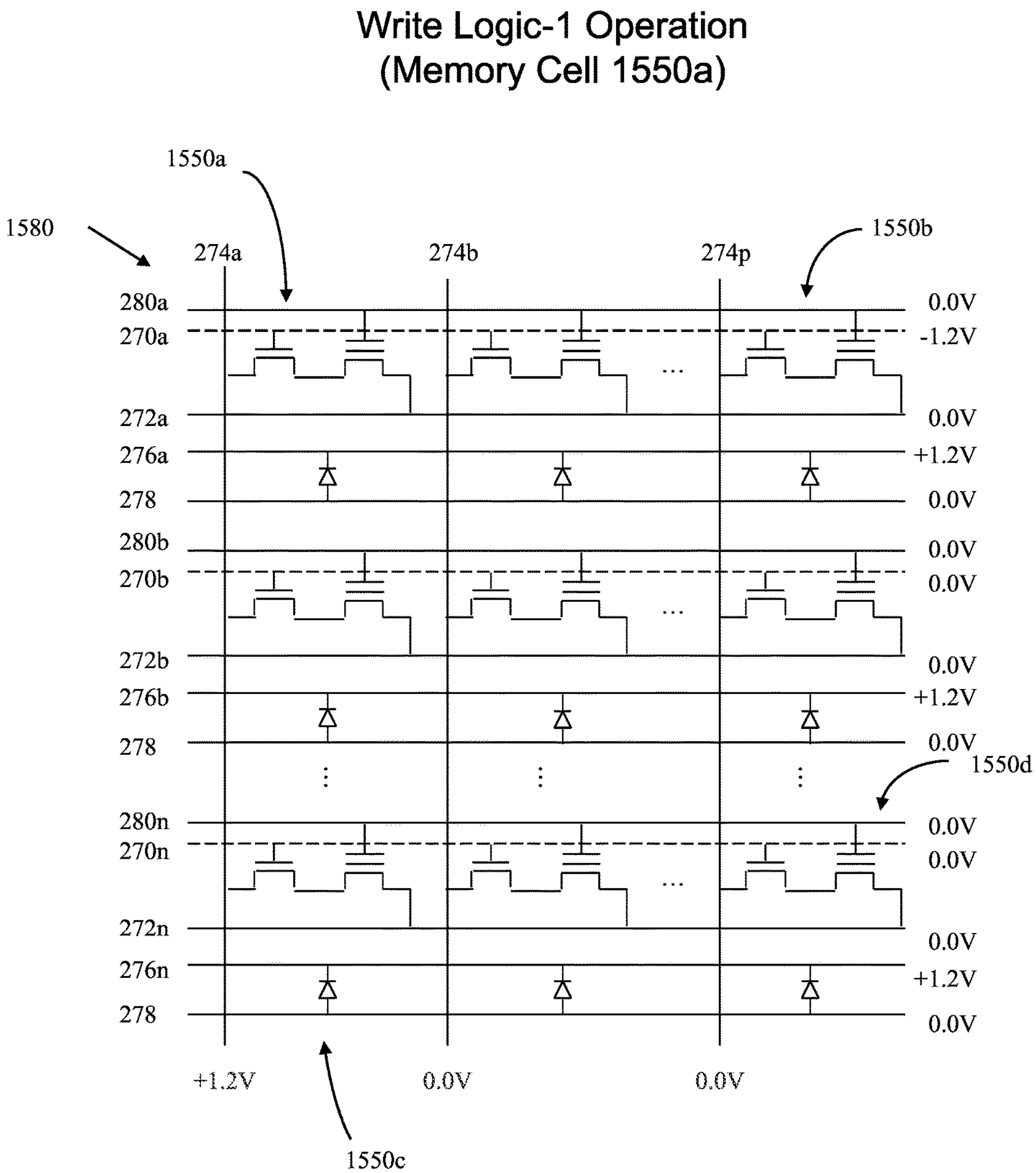
Figure 222B:
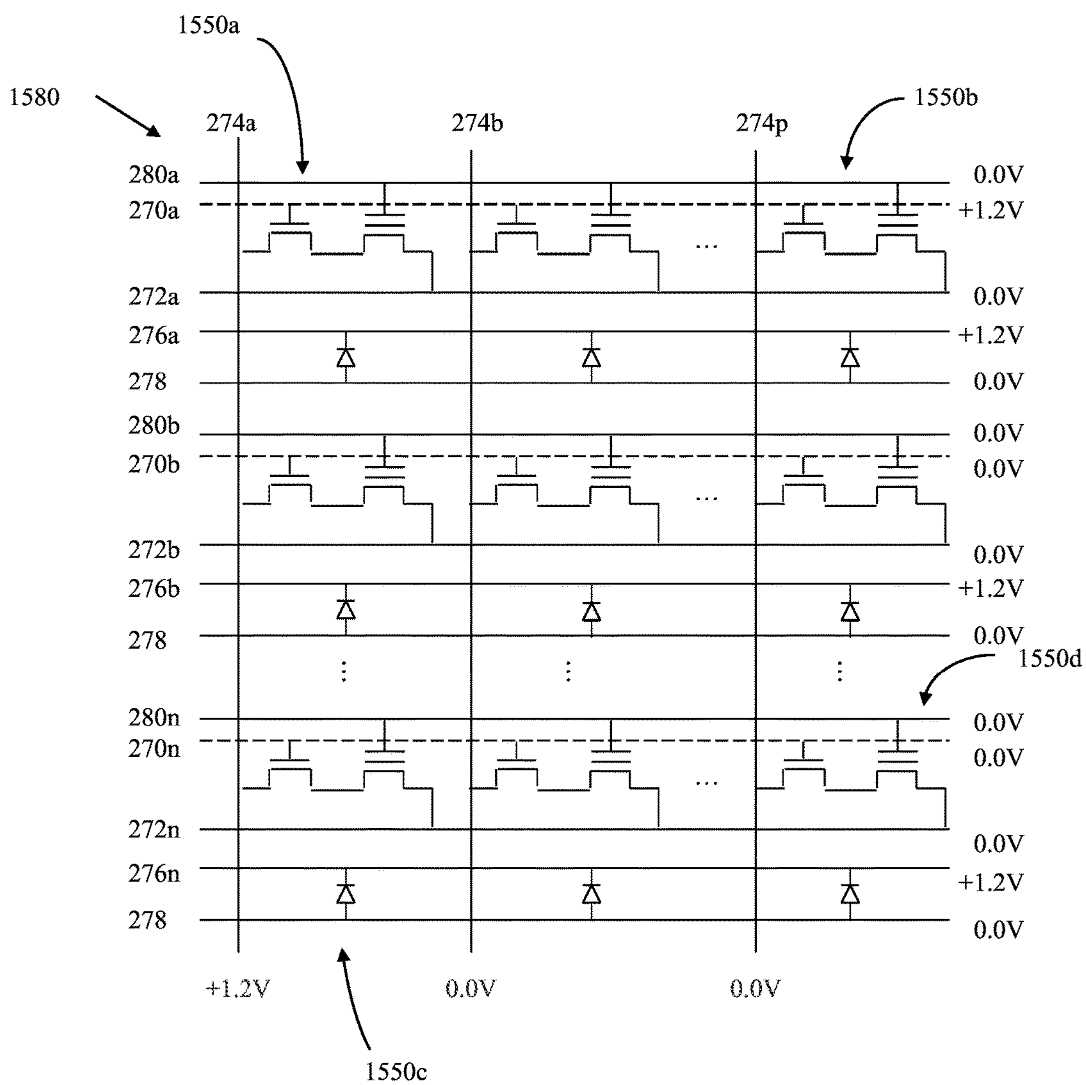

FIGS. 222A and 222B illustrate write logic-1 operations performed on an array of memory cells according to the present invention.

Figure 223A:
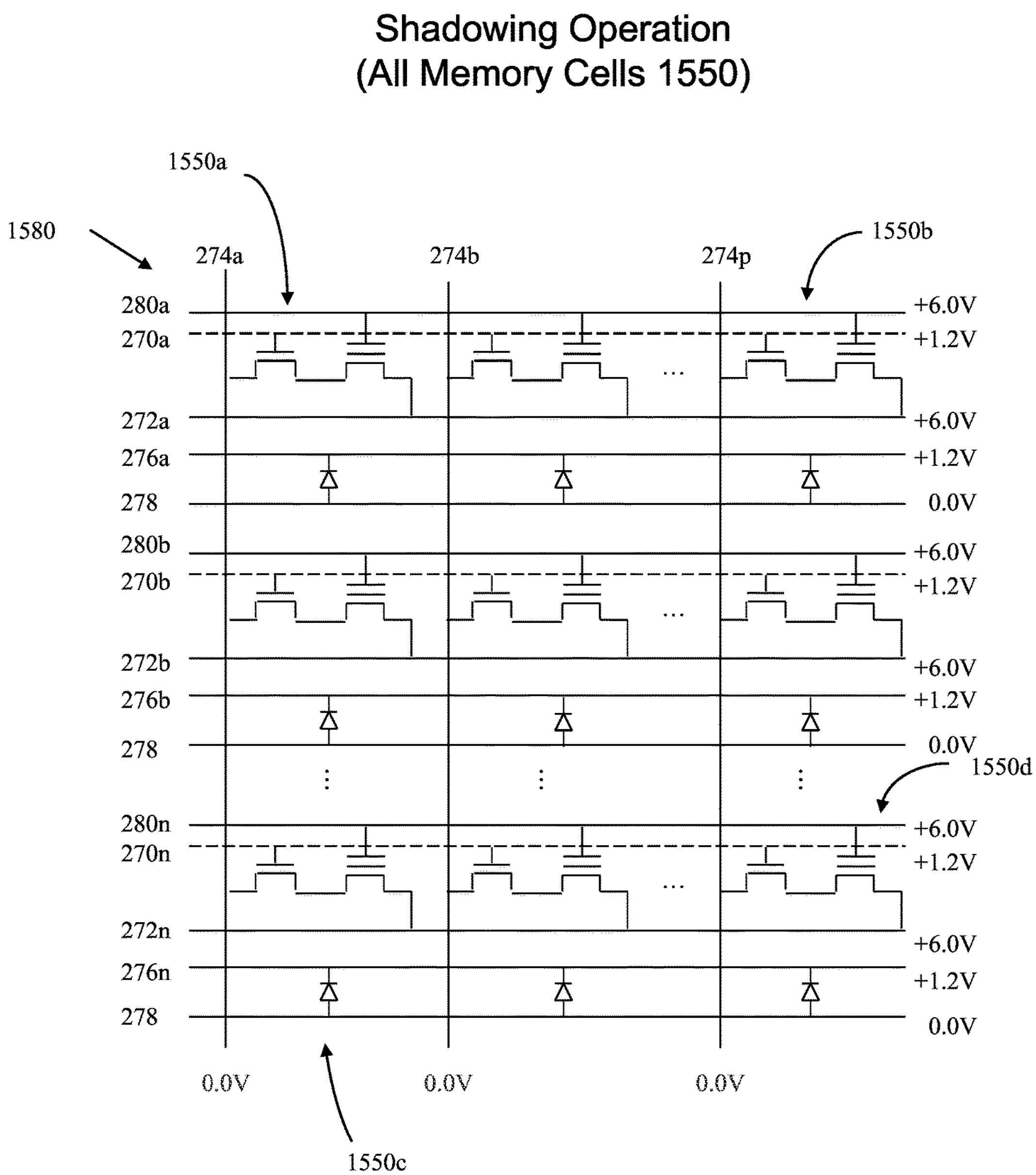
Figure 223B:
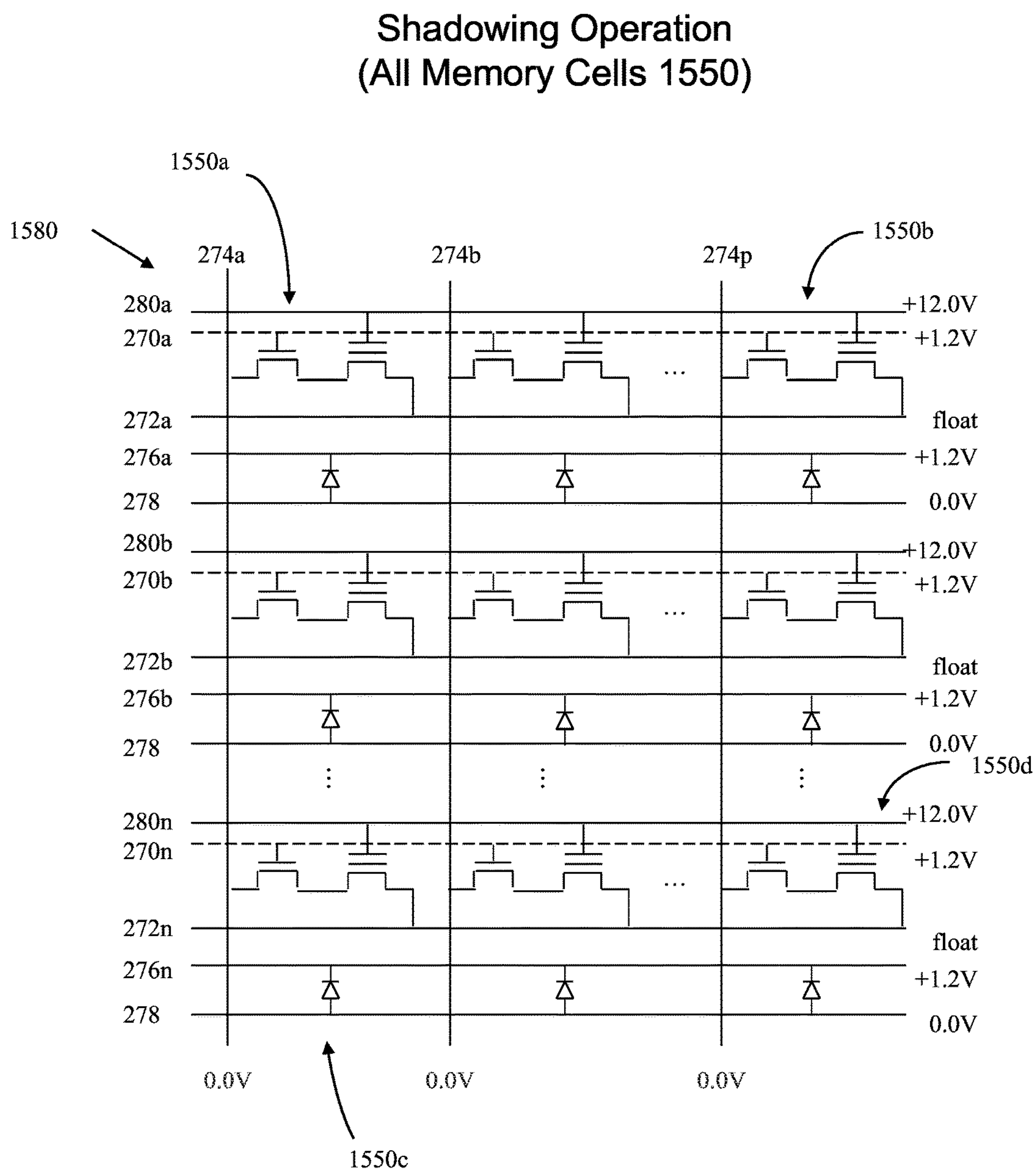

FIGS. 223A and 223B illustrate a shadowing operation performed on an array of memory cells according to the present invention.

Figure 224:
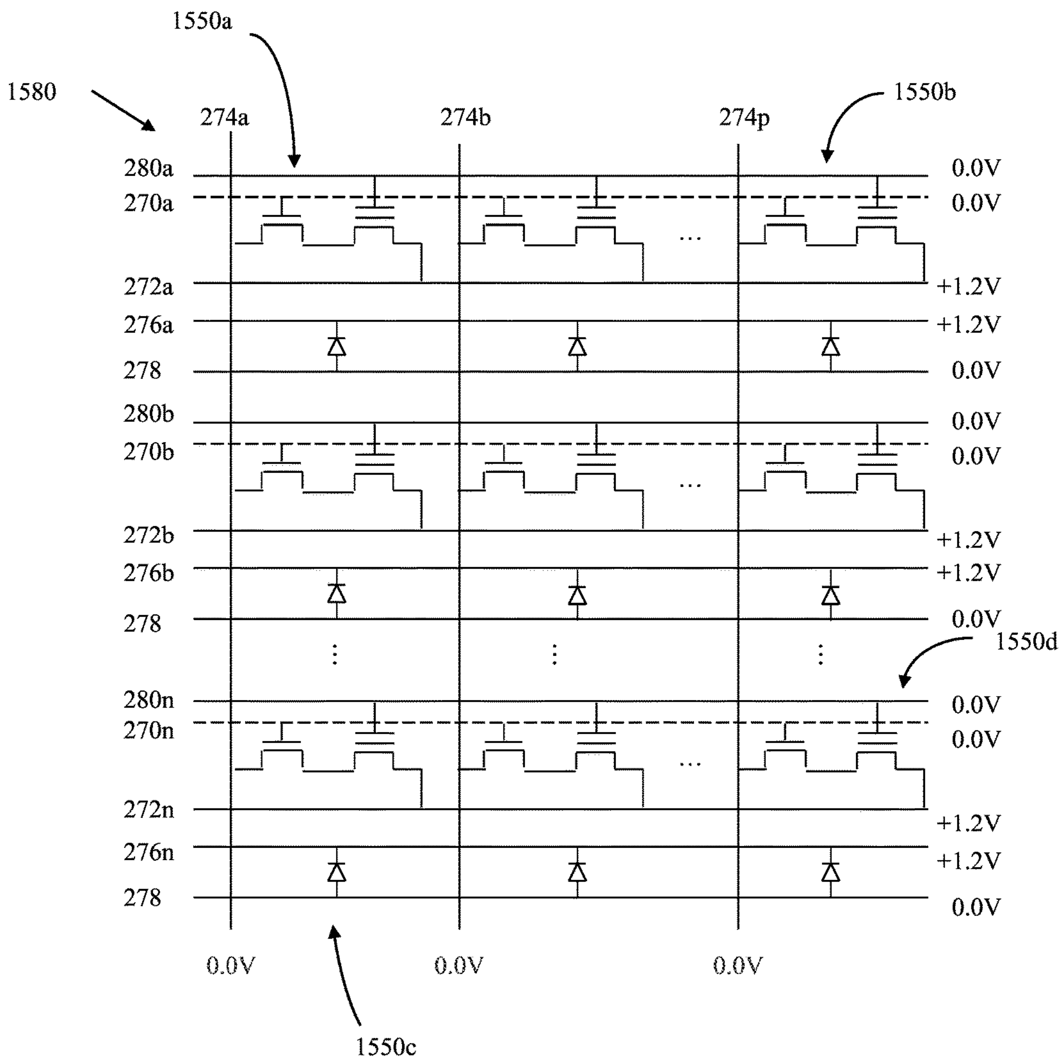

FIG. 224 illustrates a restore operation performed on an array of memory cells according to the present invention.

Figure 225A:
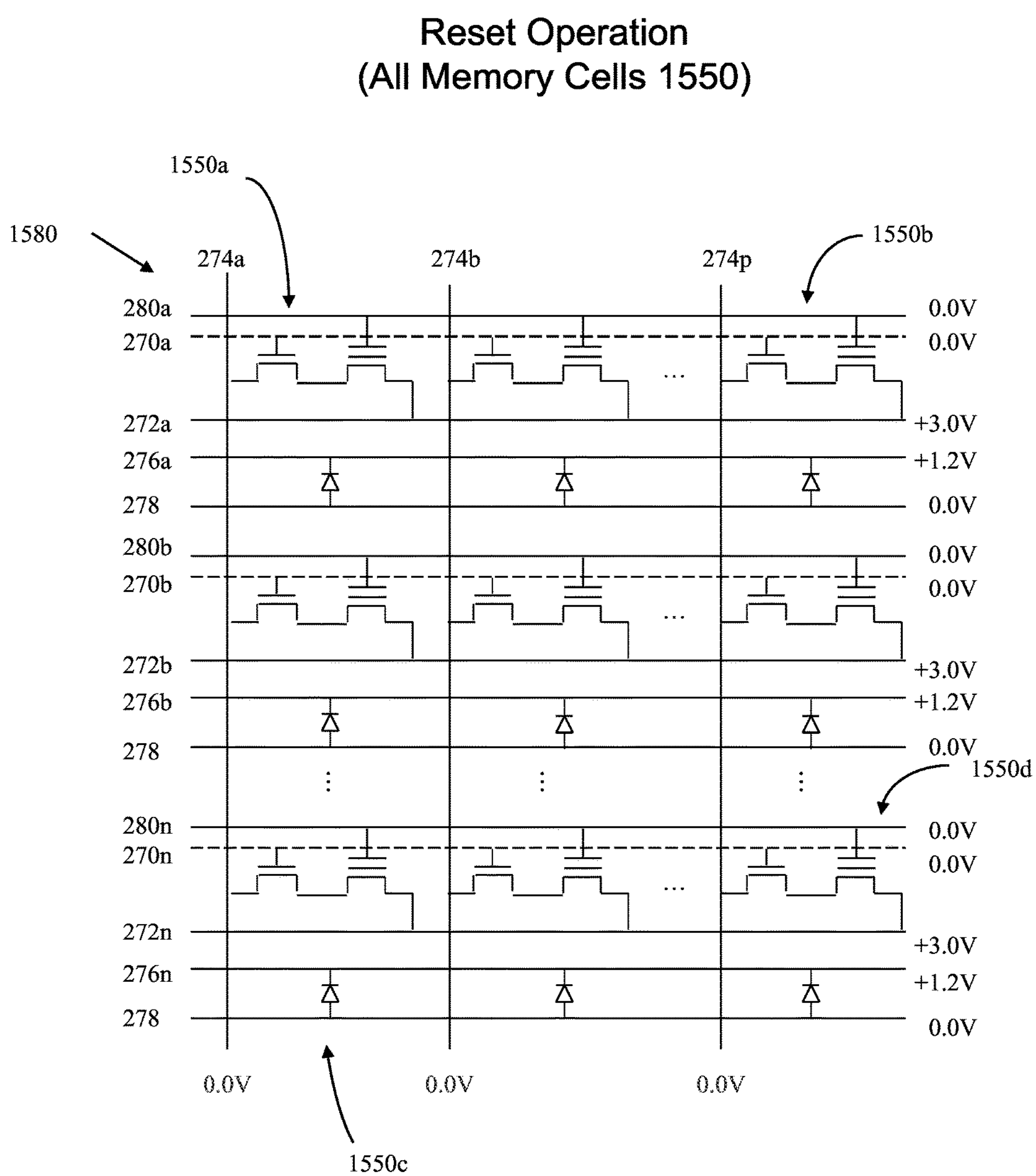
Figure 225B:
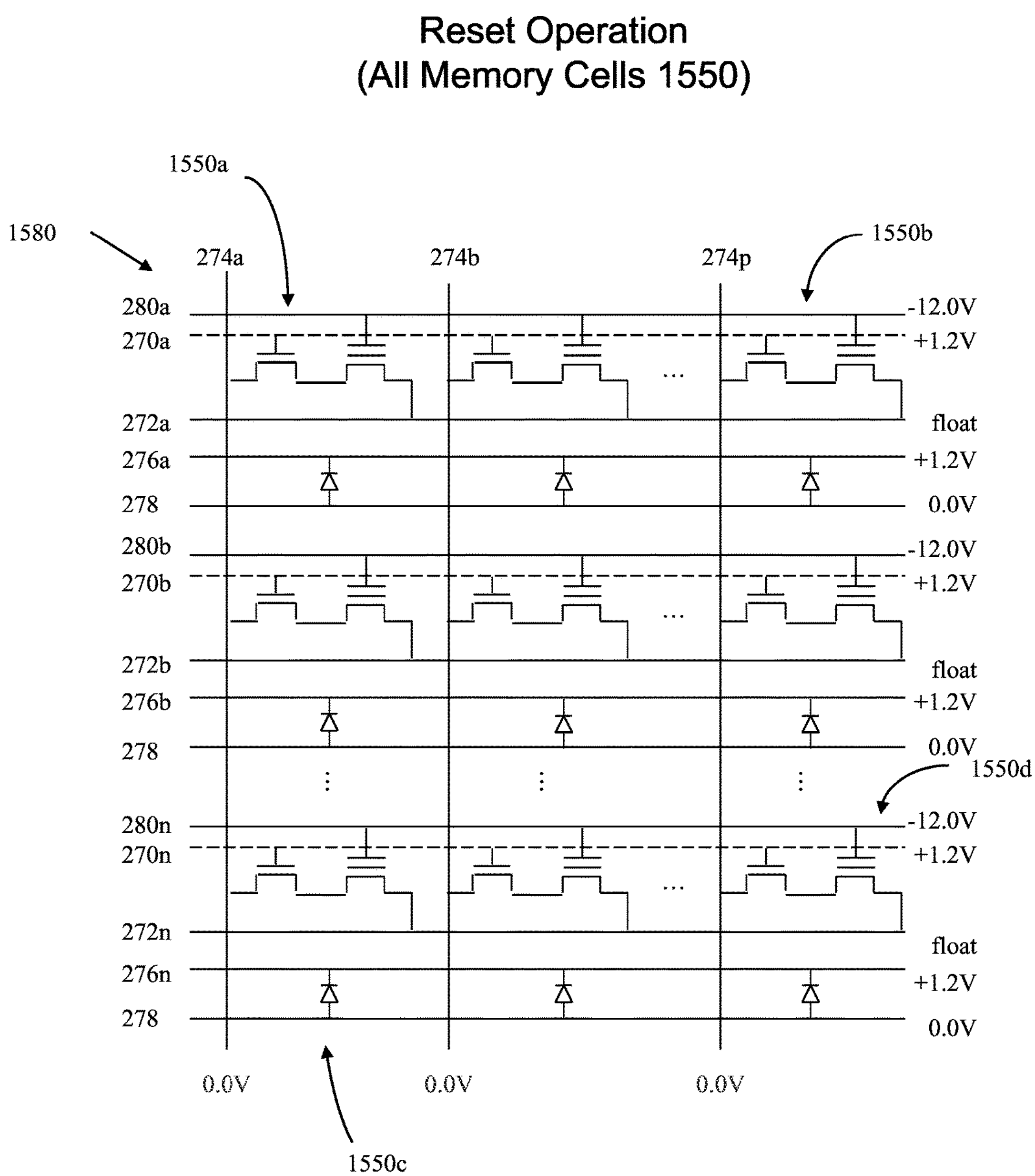

FIGS. 225A and 225B illustrate reset operations performed on an array of memory cells according to the present invention.

Figure 226:
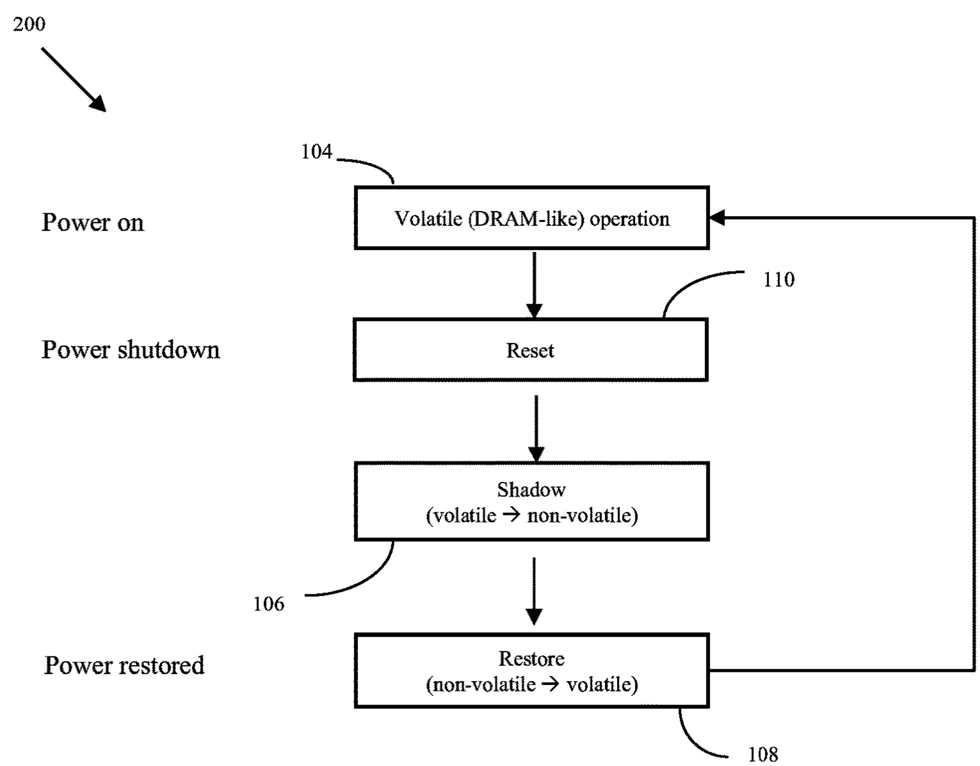

FIG. 226 is a flowchart illustrating an alternative operation of a memory device according to the present invention.

Figure 227:
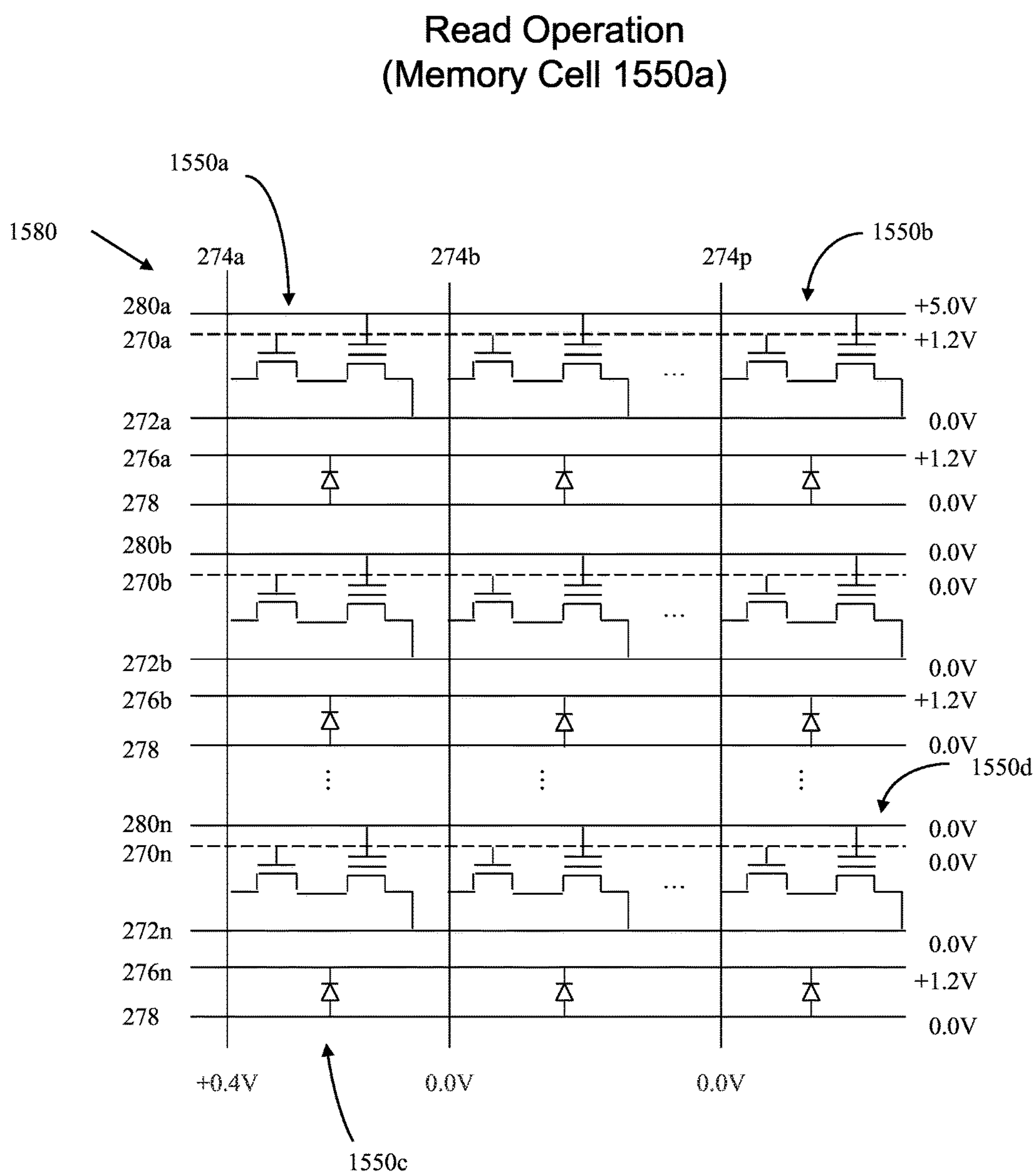

FIG. 227 illustrates a read operation performed on an array of memory cells according to the present invention.

Figure 228:
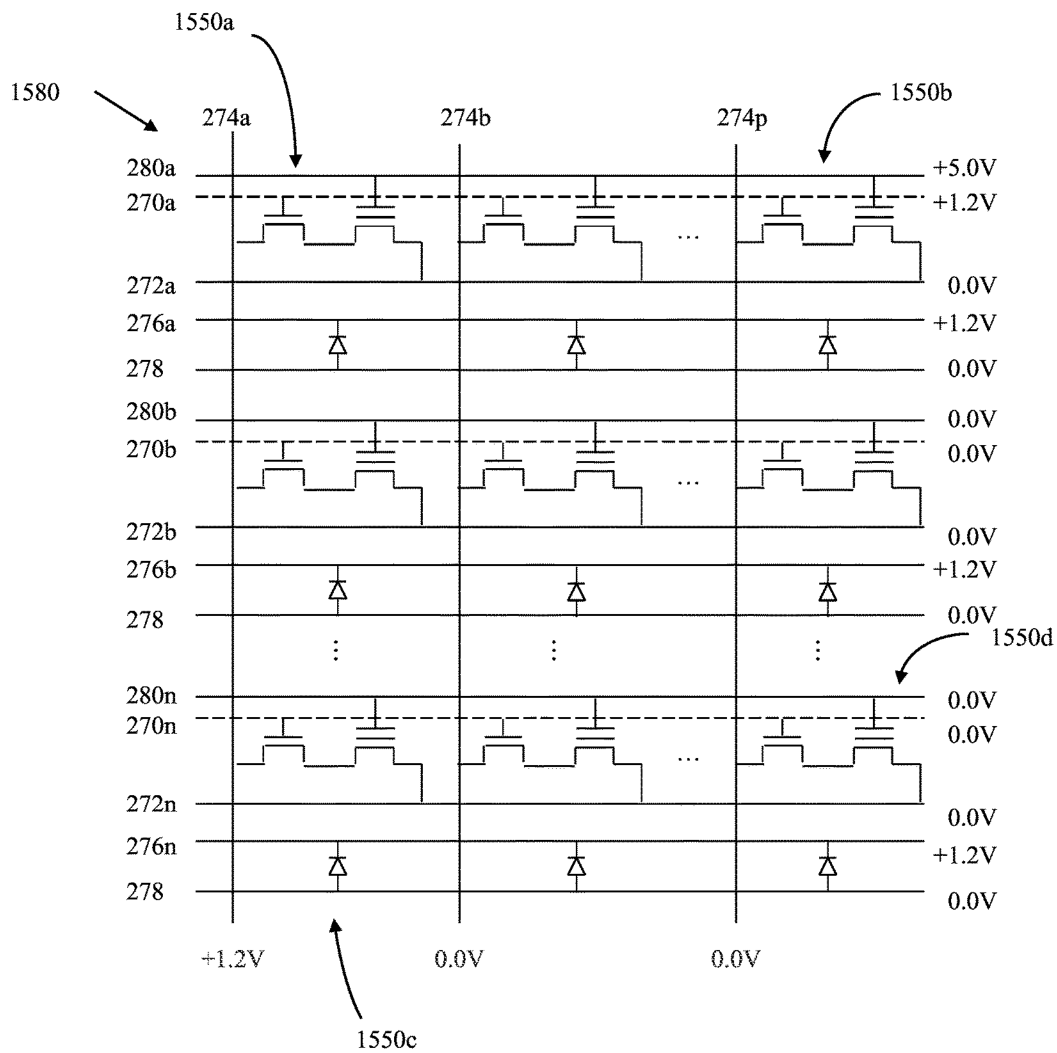

FIG. 228 illustrates a write logic-1 operation performed on an array of memory cells according to the present invention.

Figure 229A:
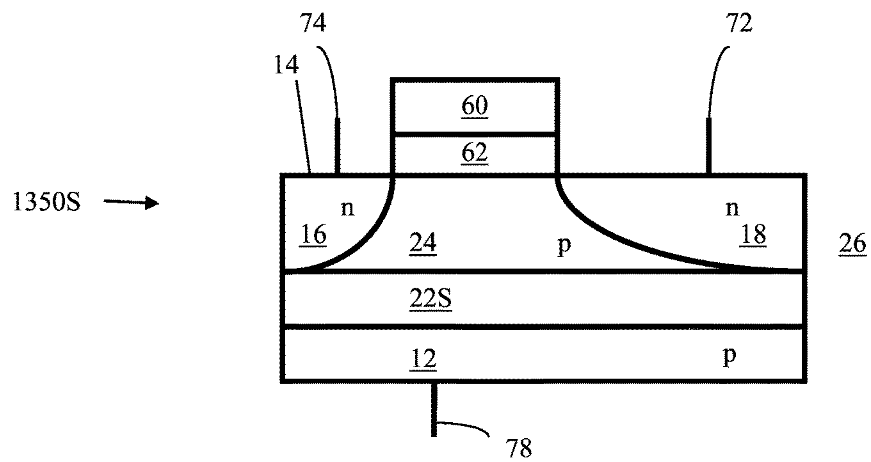
Figure 229B:
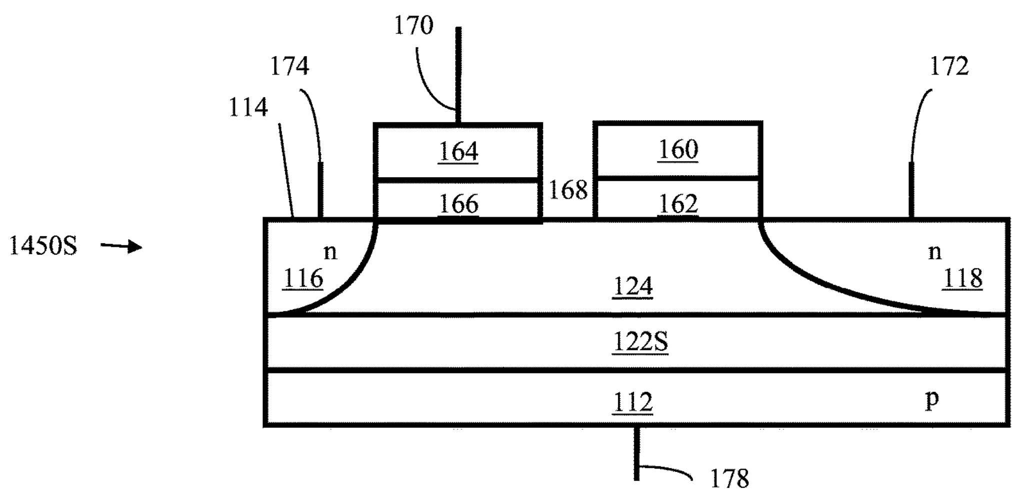
Figure 229C:
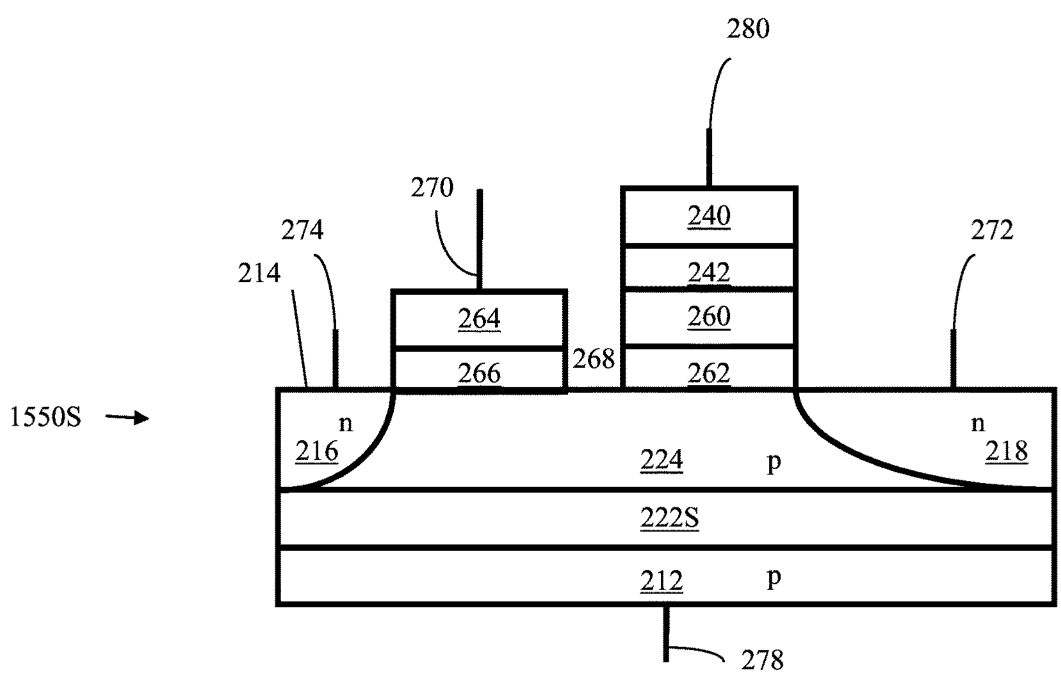

FIGS. 229A through 229C illustrate cross sectional views of alternative memory devices according to the present invention, fabricated on silicon-on-insulator (SOI) substrate.

FIGS. 230A through 230E illustrate cross-sectional views and top view of alternative memory devices according to the present invention, comprising of fin structures.

DETAILED DESCRIPTION OF THE INVENTION

Before the present systems, devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the terminal" includes reference to one or more terminals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

A "holding operation", "standby operation" or "holding/standby operation", as used herein, refers to a process of sustaining a state of a memory cell by maintaining the stored charge. Maintenance of the stored charge may be facilitated by applying a back bias to the cell in a manner described herein.

A "a multi-level write operation" refers to a process that includes an ability to write more than more than two different states into a memory cell to store more than one bit per cell.

A "write-then-verify" "write and verify" or "alternating write and verify" algorithm or operation refers to a process where alternating write and read operations to a memory cell are employed to verify whether a desired memory state of the memory cell has been achieved during the write operation.

A "read verify operation" refers to a process where a read operation is performed to verify whether a desired memory state of a memory cell has been achieved.

A "read while programming" operation refers to a process where simultaneous write and read operations can be performed to write a memory cell state.

A "back bias terminal" refers to a terminal at the back side of a semiconductor transistor device, usually at the opposite side of the gate of the transistor. A back bias terminal is also commonly referred to as a "back gate terminal". Herein, the back bias terminal refers to the substrate terminal or the buried well terminal, depending upon the embodiment being described.

The term "back bias" refers to a voltage applied to a back bias terminal.

A "memory cell" as used herein, refers to a semiconductor memory cell comprising an electrically floating body as the data storage element.

A "contactless memory cell" as used herein, refers to a memory cell which does not have a contact (or contacts) forming a direct connection(s) to a control line (or control lines). Contactless memory cells are typically connected in series when formed in a string or in parallel when formed in a link.

A "memory string" or "string" as used herein, refers to a set of interconnected memory cells connected in series, where conductive regions at the surfaces of adjacent memory cells are shared or electrically connected. In a series connection, the same current flows through each of the memory cells.

A "link" as used herein, refers to a set of interconnected memory cells connected in parallel, where conductive regions at the surfaces of adjacent memory cells are electrically connected. In a parallel connection, the voltage drop across each of the memory cells is the same.

A "memory array" or "memory cell array" as used herein, refers to a plurality of memory cells typically arranged in rows and columns. The plurality of memory cells may further be connected in strings or links within the memory array.

The terms "shadowing" "shadowing operation" and "shadowing process" refer to a process of copying the contents of volatile memory to non-volatile memory.

"Restore", "restore operation", or "restore process", as used herein, refers to a process of copying the contents of non-volatile memory to volatile memory.

"Reset", "reset operation", or "reset process", as used herein, refers to a process of setting non-volatile memory to a predetermined state.

"Permanent data" as used herein, is referred to data that typically will not be changed during the operation of a system employing a memory cell device as described herein, and thus can be stored indefinitely in non-volatile memory. Examples of such "permanent data" include, but are not limited to program files, application files, music files, video files, operating systems, etc.

The term "single polysilicon" flash memory refers to a non-volatile memory cell that has only one polysilicon gate, for example where the polysilicon is a floating gate used to store non-volatile data. As a result, single polysilicon flash memory is compatible with typical complementary metal oxide semiconductor (CMOS) processes. The polysilicon materials can be deposited and formed in conjunction with the gates of logic transistors.

The term "stacked gate" flash memory refers to a non-volatile memory cell that has multiple polysilicon layers/gates, for example where a second polysilicon gate (e.g., a control gate) is stacked above a polysilicon floating gate used to store the non-volatile data (see for example FIG. 4.6 on p. 197 in "Nonvolatile Semiconductor Memory Technology", W. D. Brown and J. E. Brewer "Brown"), which is hereby incorporated herein, in its entirety, by reference thereto. Such stacked gate memory cells typically require dual (or more) polysilicon layer processing, where the first polysilicon layer (e.g. floating gate) is deposited and formed, followed by the formation of a second polysilicon (e.g. control gate) layer.

DETAILED DESCRIPTION

Figure 1:
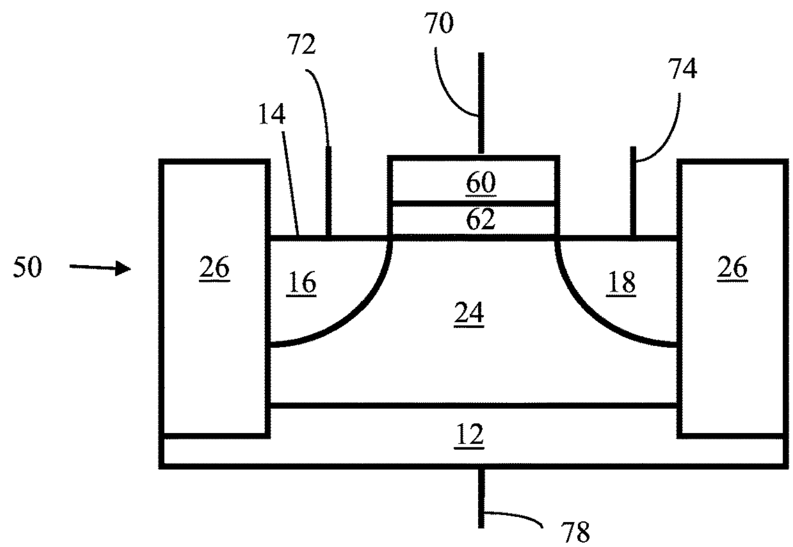
FIG. 1 is a schematic illustration of a memory cell according to an embodiment of the present invention.

Referring now to FIG. 1, a memory cell 50 according to an embodiment of the present invention is shown. The cell 50 includes a substrate 12 of a first conductivity type, such as n-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a first conductivity type, such as n-type, for example, is provided in substrate 12 and which is exposed at surface 14. A second region 18 having the first conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art. Alternatively, a solid state diffusion process can be used to form first and second regions 16 and 18.

Figure 2:
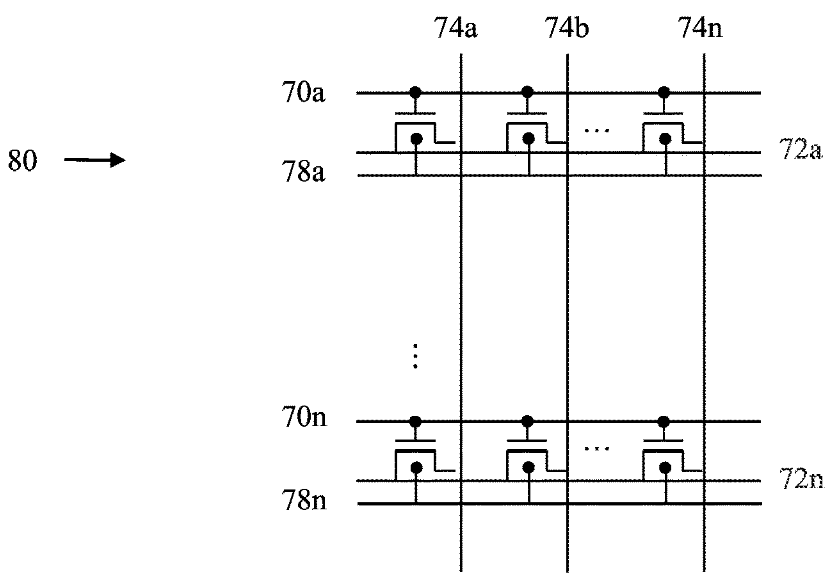
FIG. 2 schematically illustrates multiple cells joined in an array to make a memory device according to an embodiment of the present invention.

A floating body region 24 having a second conductivity type different from the first conductivity type, such as p-type conductivity type when the first conductivity type is n-type conductivity type, is bounded by surface 14, first and second regions 16, 18, insulating layers 26, and substrate 12. The floating body region 24 can be formed by an implantation process formed on the material making up substrate 12, or can be grown epitaxially. Insulating layers 26 (e.g. shallow trench isolation (STI)), may be made of silicon oxide, for example. Insulating layers 26 insulate cell 50 from neighboring cells 50 when multiple cells 50 are joined in an array 80 to make a memory device as illustrated in FIG. 2. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Cell 50 further includes word line (WL) terminal 70 electrically connected to gate 60, source line (SL) terminal 72 electrically connected to one of regions 16 and 18 (connected to 16 as shown, but could, alternatively, be connected to 18), bit line (BL) terminal 74 electrically connected to the other of regions 16 and 18 (connected to 18 as shown, but could, alternatively, be connected to 16 when 72 is connected to 18), and substrate terminal 78 electrically connected to substrate 12. Alternatively, contact to substrate region 12 could be made through a region having a first conductivity type, which is electrically connected to substrate region 12 (not shown).

In another embodiment, the memory cell 50 has a p-type conductivity type as the first conductivity type and n-type conductivity type as the second conductivity type, as noted above.

The operation of a memory cell 50 has been described for example in "Scaled 1T-Bulk Devices Built with CMOS 90 nm Technology for Low-cost eDRAM Applications", R. Ranica, et al., pp. 38-41, Tech. Digest, Symposium on VLSI Technology, 2005, which is hereby incorporated herein, in its entirety, by reference thereto. The memory cell states are represented by the charge in the floating body 24. If cell 50 has holes stored in the floating body region 24, then the memory cell 50 will have a lower threshold voltage (gate voltage where transistor is turned on) compared to when cell 50 does not store holes in floating body region 24.

Figure 3:
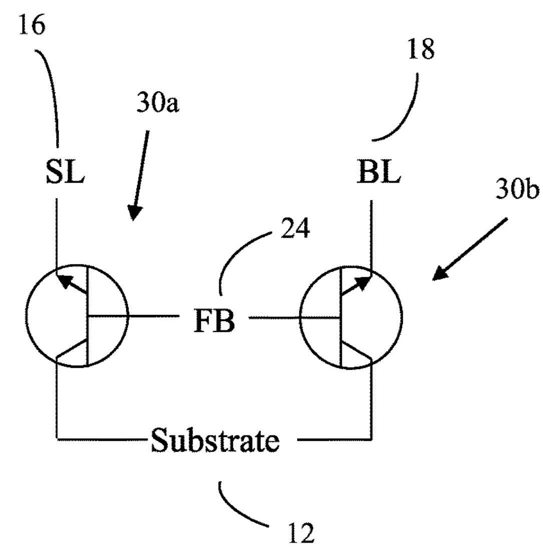
FIG. 3 schematically illustrates n-p-n bipolar devices that are inherently formed in a memory cell according to an embodiment of the present invention.

The positive charge stored in the floating body region 24 will decrease over time due to the p-n diode leakage formed by floating body 24 and regions 16, 18, and substrate 12 and due to charge recombination. A unique capability of the invention is the ability to perform the holding operation in parallel to all memory cells 50 of the array 80. The holding operation can be performed by applying a positive back bias to the substrate terminal 78 while grounding terminal 72 and/or terminal 74. The positive back bias applied to the substrate terminal will maintain the state of the memory cells 50 that it is connected to. The holding operation is relatively independent of the voltage applied to terminal 70. As shown in FIG. 3, inherent in the memory cell 50 are n-p-n bipolar devices 30*a* and 30*b* formed by substrate region 12, floating body 24, and SL and BL regions 16, 18. If floating body 24 is positively charged (i.e. in a state "1"), the bipolar transistor 30*a* formed by SL region 16, floating body 24, and substrate region 12 and bipolar transistor 30*b* formed by BL region 18, floating body 24, and substrate region 12 will be turned on.

A fraction of the bipolar transistor current will then flow into floating region 24 (usually referred to as the base current) and maintain the state "1" data. The efficiency of the holding operation can be enhanced by designing the bipolar device formed by substrate 12, floating region 24, and regions 16, 18 to be a low-gain bipolar device, where the bipolar gain is defined as the ratio of the collector current flowing out of substrate terminal 78 to the base current flowing into the floating region 24.

For memory cells in state "0" data, the bipolar devices 30*a*, 30*b* will not be turned on, and consequently no base hole current will flow into floating region 24. Therefore, memory cells in state "0" will remain in state "0".

Figure 4A:
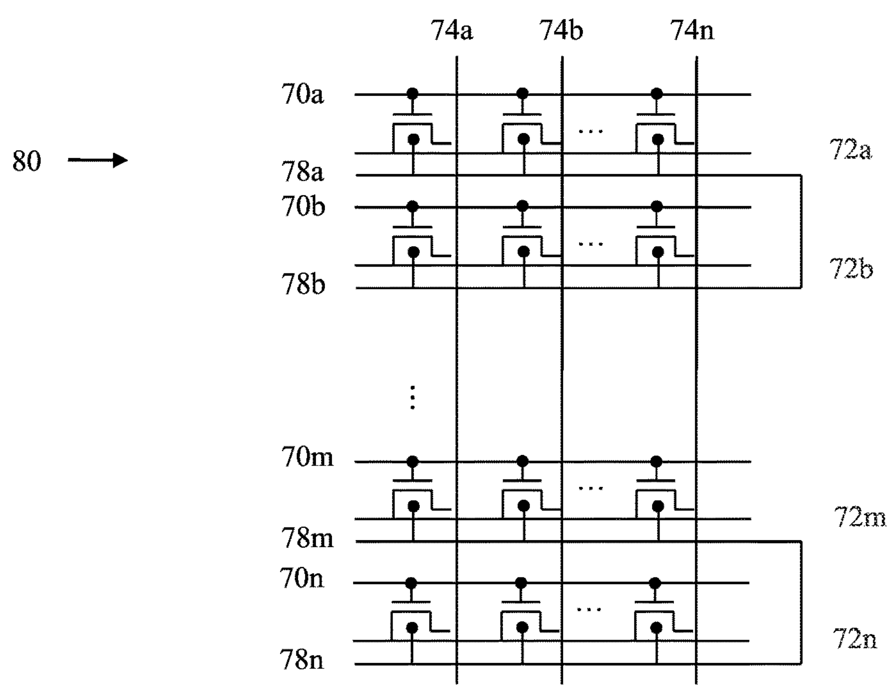
FIG. 4A illustrates segmenting of substrate terminals in an array according to an embodiment of the present invention.

As can be seen, the holding operation can be performed in mass, parallel manner as the substrate terminal 78 (e.g., 78*a*, 78*b*, 78*n*) is typically shared by all the cells 50 in the memory array 80. The substrate terminal 78 can also be segmented to allow independent control of the applied bias on the selected portion of the memory array as shown in FIG. 4A, where substrate terminal 78*a*, 78*b* is shown segmented from substrate terminal 78*m*, 78*n*, for example. Also, because substrate terminal 78 is not used for memory address selection, no memory cell access interruption occurs due to the holding operation.

Figure 4B:
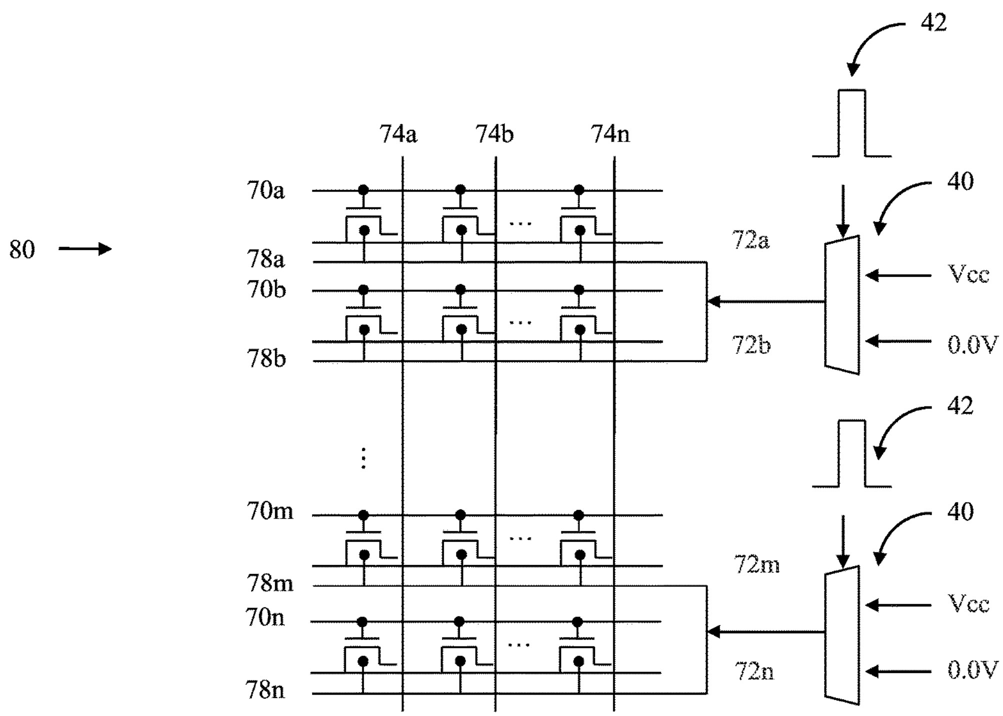
FIG. 4B schematically illustrates multiplexers used to determine the biases applied to segmented substrate terminals according to an embodiment of the present invention.

In another embodiment, a periodic pulse of positive voltage can be applied to substrate terminal 78, as opposed to applying a constant positive bias, in order to reduce the power consumption of the memory cell 50. The state of the memory cell 50 can be maintained by refreshing the charge stored in floating body 24 during the period over which the positive voltage pulse is applied to the back bias terminal (i.e., substrate terminal 78). FIG. 4B further shows multiplexers 40 that determine the bias applied to substrate terminal 78 where the control signal could be the clock signal 42 or as will be described later, determined by different operating modes. The positive input signals could be the power supply voltage Vcc (FIG. 4B) or a different positive bias could be generated by voltage generator circuitry 44 (see FIG. 4C).

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG.

5. The increase in the maximum charge stored in the floating body 24 results in a larger memory window.

The holding/standby operation can also be used for multi-bit operations in memory cell 50. To increase the memory density without increasing the area occupied by the memory cell 50, a multi-level operation is typically used. This is done by dividing the overall memory window into different levels. In floating body memory, the different memory states are represented by different charges in the floating body 24, as described for example in "The Multistable Charge-Controlled Memory Effect in SOI Transistors at Low Temperatures", Tack et al., pp. 1373-1382, IEEE Transactions on Electron Devices, vol. 37, May 1990 and U.S. Pat. No. 7,542,345 "Multi-bit memory cell having electrically floating body transistor, and method of programming and reading same", each of which is hereby incorporated herein, in its entirety, by reference thereto. However, since the state with zero charge in the floating body 24 is the most stable state, the floating body 24 will, over time, lose its charge until it reaches the most stable state. In multi-level operations, the difference of charge representing different states is smaller than that for a single-level operation. As a result, a multi-level memory cell is more sensitive to charge loss, as less charge loss is required to change states.

FIG. 6 shows the floating body 24 relative net current for different floating body 24 potentials as a function of the voltage applied to substrate terminal 78 with BL, SL, and WL terminals 72, 74, and 70, grounded. When zero voltage is applied to substrate terminal 78, no bipolar current is flowing into the floating body 24 and as a result, the stored charge will leak over time. When a positive voltage is applied to substrate terminal 78, hole current will flow into floating body 24 and balance the junction leakage current to regions 16 and 18. The junction leakage current is determined by the potential difference between the floating body 24 and regions 16 and 18, while the bipolar current flowing into floating body 24 is determined by both the substrate terminal 78 potential and the floating body 24 potential. As indicated in FIG. 6, for different floating body potentials, at a certain substrate terminal 78 potential $V_{HOLD}$, the current flowing into floating body 24 is balanced by the junction leakage between floating body 24 and regions 16 and 18. The different floating body 24 potentials represent different charges used to represent different states of memory cell 50. This shows that different memory states can be maintained by using the holding/standby operation described here.

An example of the bias condition for the holding operation is hereby provided: zero voltage is applied to BL terminal 74, zero voltage is applied to SL terminal 72, zero or negative voltage is applied to WL terminal 70, and a positive voltage is applied to the substrate terminal 78. In one particular non-limiting embodiment, about 0.0 volts is applied to terminal 72, about 0.0 volts is applied to terminal 74, about 0.0 volts is applied to terminal 70, and about +1.2 volts is applied to terminal 78. However, these voltage levels may vary.

The charge stored in the floating body 24 can be sensed by monitoring the cell current of the memory cell 50. If cell 50 is in a state "1" having holes in the floating body region 24, then the memory cell will have a lower threshold voltage (gate voltage where the transistor is turned on), and consequently a higher cell current, compared to if cell 50 is in a state "0" having no holes in floating body region 24. A sensing circuit/read circuitry 90 typically connected to BL terminal 74 of memory array 80 (e.g., see read circuitry 90 in FIG. 18A) can then be used to determine the data state of the memory cell. Examples of the read operation is described in "A Design of a Capacitorless 1T-DRAM Cell Using Gate-Induced Drain Leakage (GIDL) Current for Low-power and High-speed Embedded Memory", and Yoshida et al., pp. 913-918, International Electron Devices Meeting, 2003 and U.S. Pat. No. 7,301,803 "Bipolar reading technique for a memory cell having an electrically floating body transistor", both of which are hereby incorporated herein, in their entireties, by reference thereto. An example of a sensing circuit is described in "An 18.5 ns 128 Mb SOI DRAM with a Floating body Cell", Ohsawa et al., pp. 458-459, 609, IEEE International Solid-State Circuits Conference, 2005, which is hereby incorporated herein, in its entirety, by reference thereto.

Figure 7:
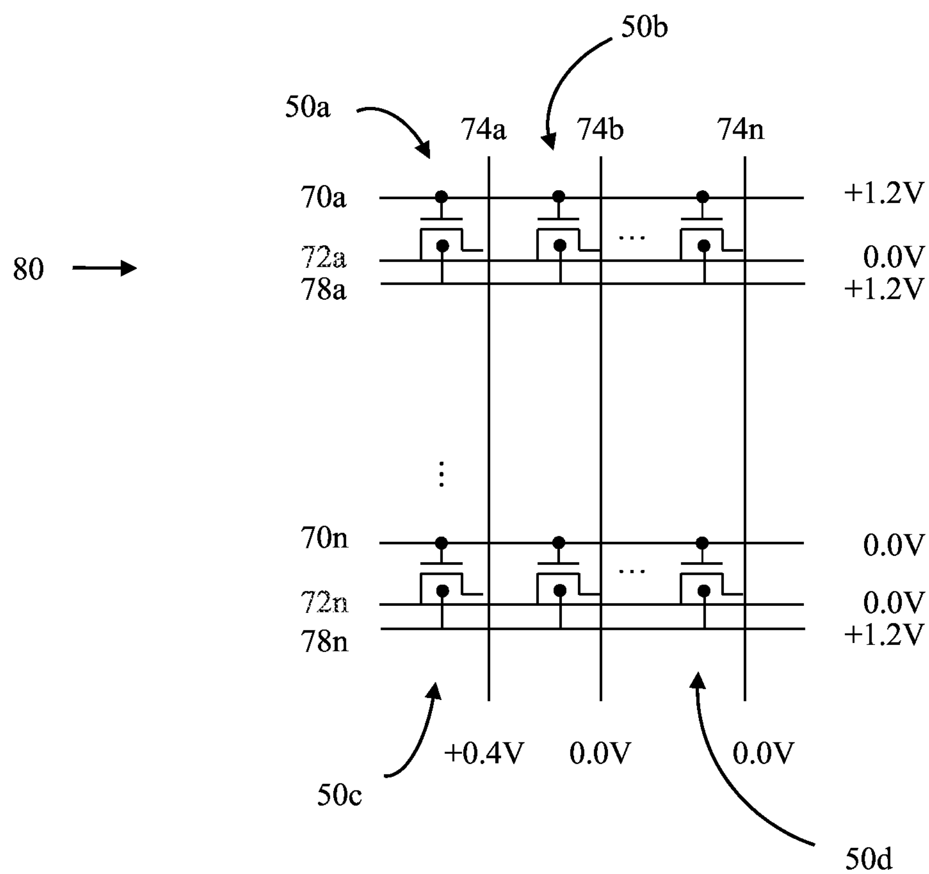
FIG. 7 shows bias conditions for a selected memory cell and unselected memory cells in a memory array according to an embodiment of the present invention.

The read operation can be performed by applying the following bias condition: a positive voltage is applied to the substrate terminal 78, zero voltage is applied to SL terminal 72, a positive voltage is applied to the selected BL terminal 74, and a positive voltage greater than the positive voltage applied to the selected BL terminal 74 is applied to the selected WL terminal 70. The unselected BL terminals will remain at zero voltage and the unselected WL terminals will remain at zero or negative voltage. In one particular non-limiting embodiment, about 0.0 volts is applied to terminal 72, about +0.4 volts is applied to the selected terminal 74, about +1.2 volts is applied to the selected terminal 70, and about +1.2 volts is applied to terminal 78. The unselected terminals 74 remain at 0.0 volts and the unselected terminals 70 remain at 0.0 volts. FIG. 7 shows the bias conditions for the selected memory cell 50*a* and unselected memory cells 50*b*, 50*c*, and 50*d* in memory array 80. However, these voltage levels may vary.

Figure 8A:
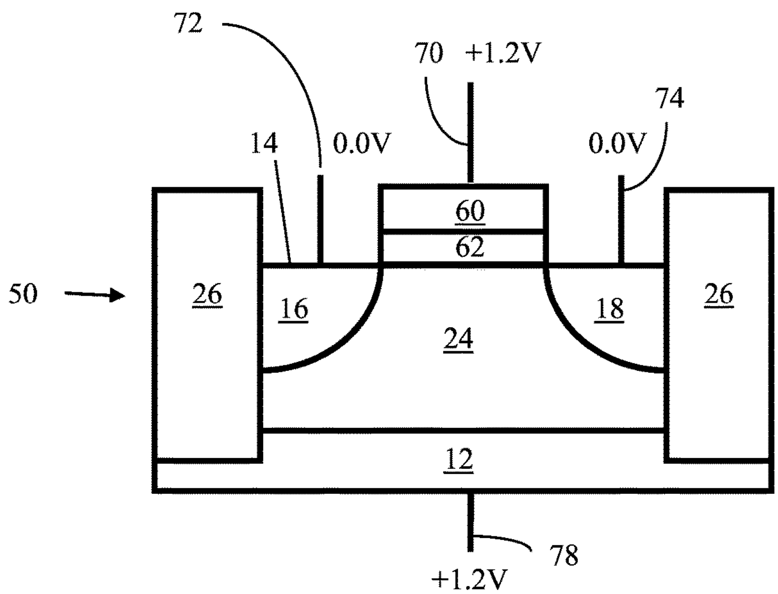
FIG. 8A illustrates an unselected memory cell sharing the same row as a selected memory cell during a read operation of the selected memory cell according to an embodiment of the present invention.
Figure 8B:
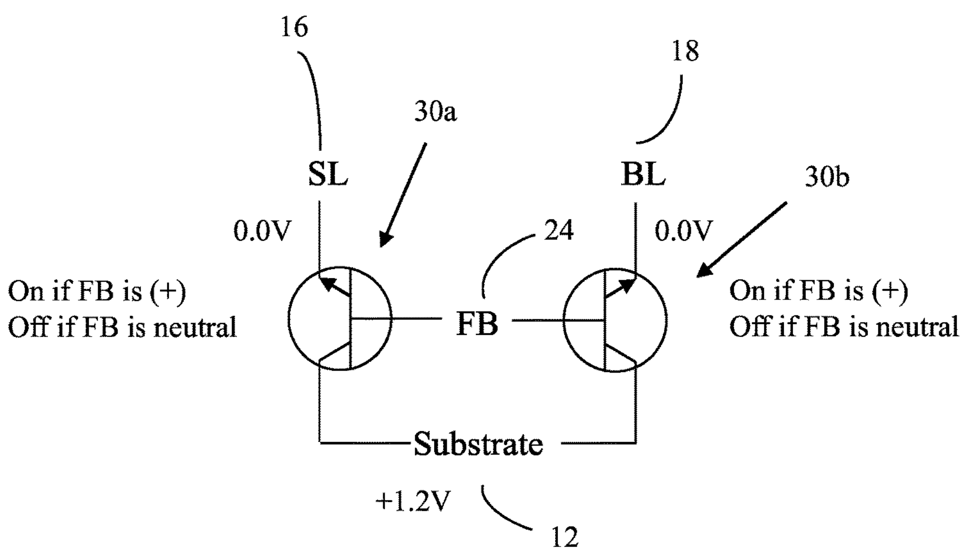
FIG. 8B illustrates the states of the n-p-n bipolar devices of the unselected memory cell of FIG. 8A during the read operation of the selected memory cell according to the embodiment of FIG. 8A.
Figure 8C:
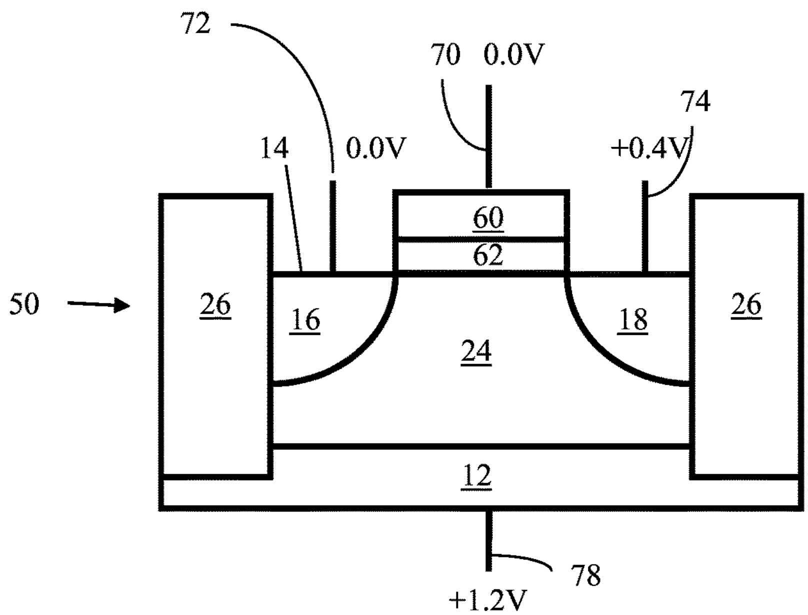
FIG. 8C illustrates an unselected memory cell sharing the same column as a selected memory cell during a read operation of the selected memory cell according to the embodiment of FIG. 8A.
Figure 8D:
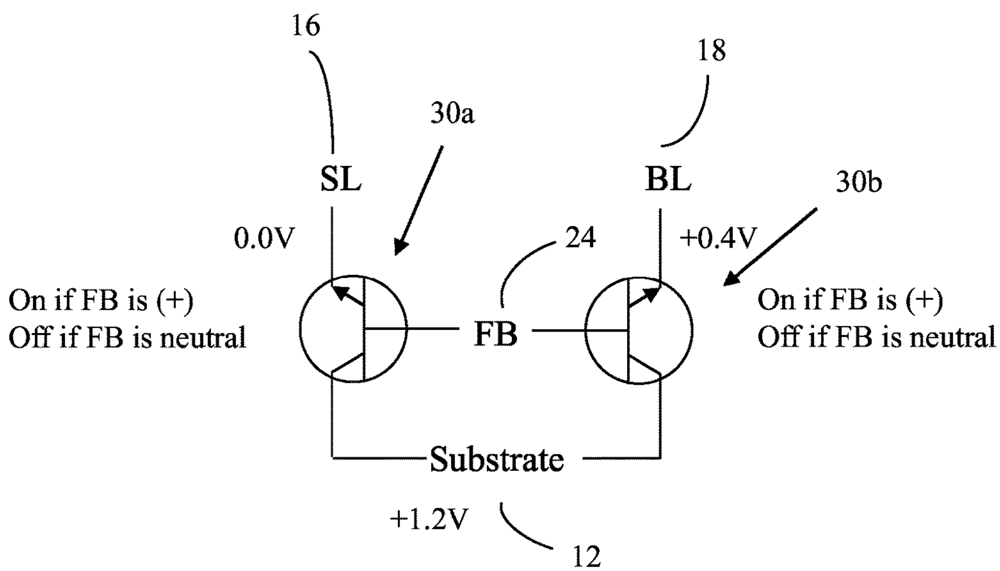
FIG. 8D illustrates the states of the n-p-n bipolar devices of the unselected memory cell of FIG. 8C during the read operation of the selected memory cell according to the embodiment of FIG. 8A.
Figure 8E:
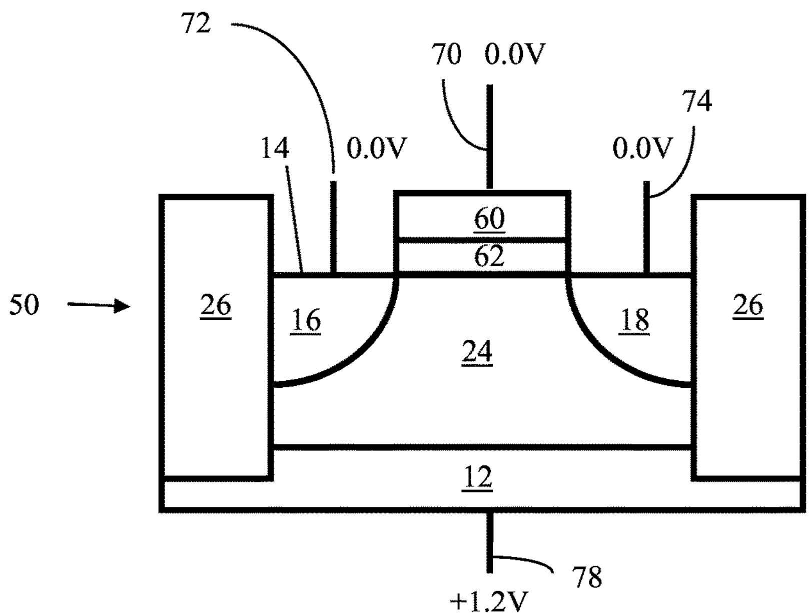
FIG. 8E illustrates an unselected memory cell that shares neither the same row nor the same column as a selected memory cell during a read operation of the selected memory cell according to the embodiment of FIG. 8A.
Figure 8F:
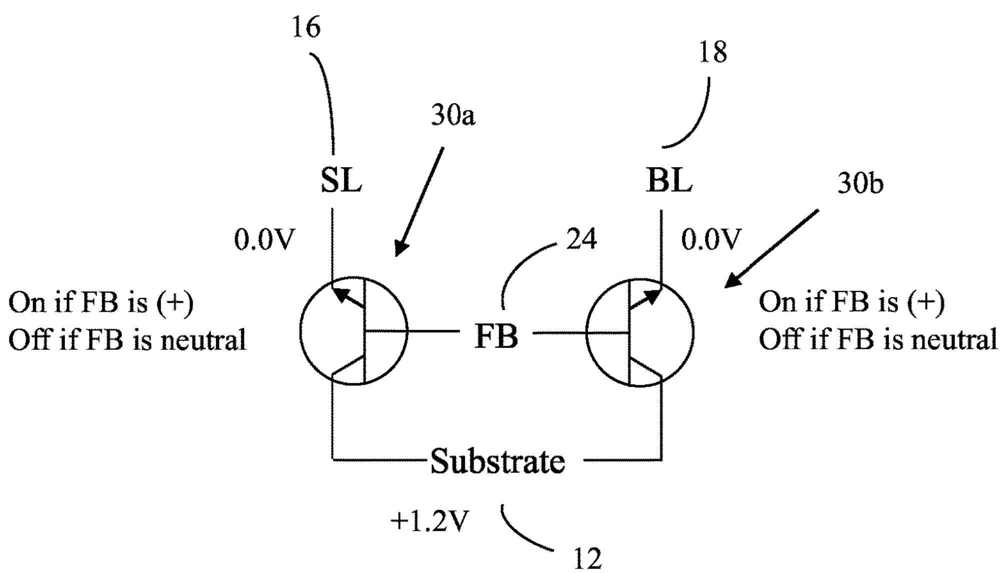
FIG. 8F illustrates the states of the n-p-n bipolar devices of the unselected memory cell of FIG. 8E during the read operation of the selected memory cell according to the embodiment of FIG. 8A.

The unselected memory cells 50 during read operations are shown in FIGS. 8A, 8C and 8E, with illustration of the states of the n-p-n bipolar devices 30*a*, 30*b* inherent in the cells 50 of FIGS. 8A, 8C and 8E in FIGS. 8B, 8D and 8F, respectively. The bias conditions for memory cells 50 sharing the same row (e.g. memory cell 50*b*) and those sharing the same column (e.g. memory cell 50*c*) as the selected memory cell 50*a* are shown in FIGS. 8A-8B and FIGS. 8C-8D, respectively, while the bias condition for memory cells 50 not sharing the same row or the same column as the selected memory cell 50 (e.g. memory cell 50*d*) is shown in FIGS. 8E-8F.

For memory cells 50 sharing the same row as the selected memory cell, both the SL terminal 72 and BL terminal 74 are at about 0.0 volts (FIGS. 8A-8B). As can be seen, these cells will be at holding mode, with memory cells in state "1" and will maintain the charge in floating body 24 because the intrinsic n-p-n bipolar devices 30*a*, 30*b* will generate hole current to replenish the charge in floating body 24; while memory cells 50 in state "0" will remain in the neutral state.

For memory cells 50 sharing the same column as the selected memory cell, a positive voltage is applied to the BL terminal 74 (FIGS. 8C-8D). However, the n-p-n bipolar device 30*a* formed by substrate 12, floating body 24, and region 16 will still maintain the state of the floating body 24 as the SL terminal 72 connected to region 16 is grounded.

For memory cells 50 not sharing the same row or the same column as the selected memory cell, both the SL terminal 72 and BL terminal 74 are at about 0.0 volts (FIGS. 8E-8F). As can be seen, these cells will be at holding mode, where memory cells in state "1" will maintain the charge in floating body 24 because the intrinsic n-p-n bipolar devices 30*a*, 30*b* will generate holes current to replenish the charge in floating body 24; while memory cells in state "0" will remain in the neutral state.

From the above description, it can be seen that the holding operation does not interrupt the read operation of the memory cells 50. At the same time, the unselected memory cells 50 during a read operation will remain in a holding operation.

Figure 9:
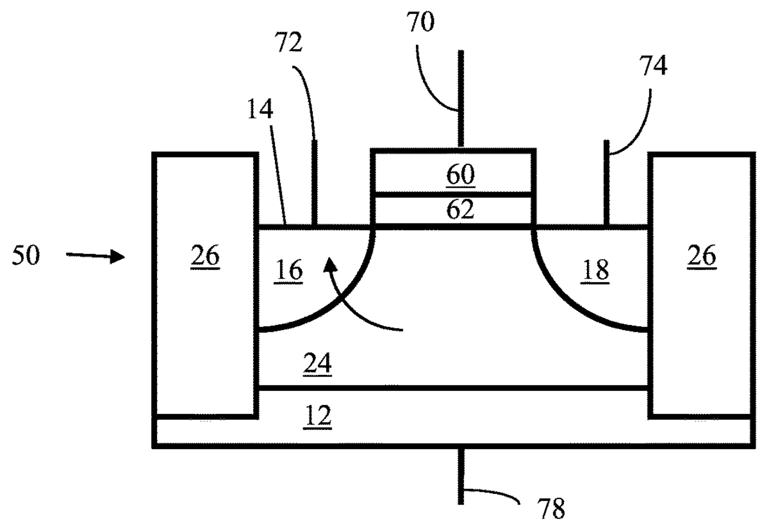
FIG. 9 is a schematic illustration of a write "0" operation to a memory cell according to an embodiment of the present invention.

Write operations of memory cell 50 are now described. A write "0" operation of the cell 50 is described with reference to FIG. 9. To write "0" to cell 50, a negative bias is applied to SL terminal 72, zero or negative voltage is applied to WL terminal 70, and zero or positive voltage is applied to substrate terminal 78. The SL terminal 72 for the unselected cells will remain grounded. Under these conditions, the p-n junction between 24 and 16 is forward-biased, evacuating any holes from the floating body 24. In one particular non-limiting embodiment, about −2.0 volts is applied to terminal 72, about 0.0 volts is applied to terminal 70, and about +1.2 volts is applied to terminal 78. However, these voltage levels may vary, while maintaining the relative relationships between the charges applied, as described above.

Figure 10:
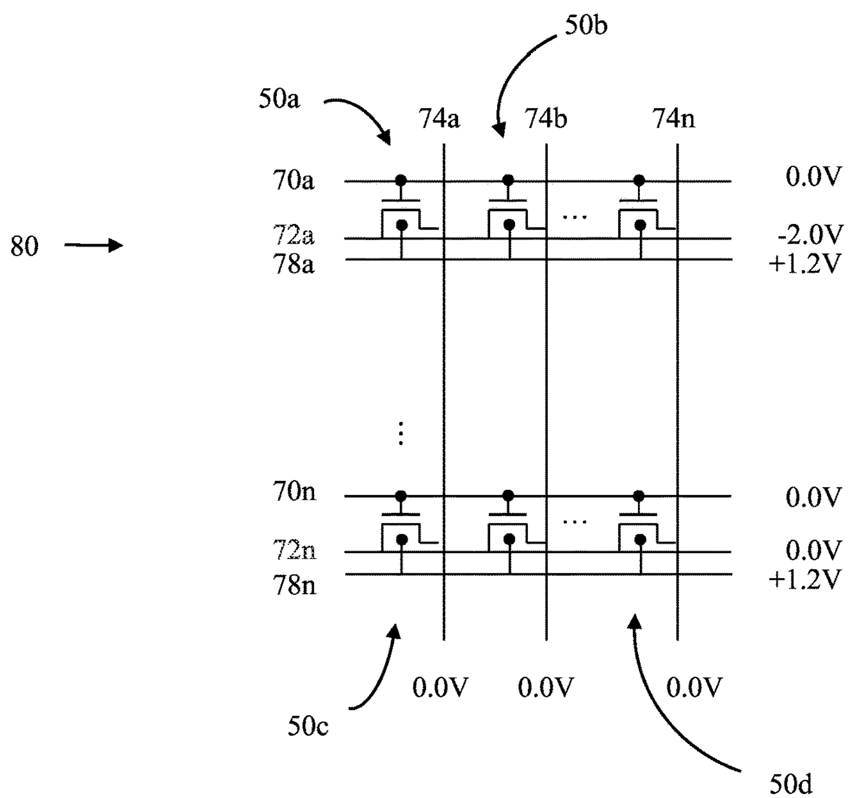
FIG. 10 shows an example of bias conditions for a selected memory cell and unselected memory cells during a write "0" operation in a memory array according to an embodiment of the present invention.

FIG. 10 shows an example of bias conditions for the selected and unselected memory cells 50 during a write "0" operation in memory array 80. For the selected memory cells, the negative bias applied to SL terminal 72 causes large potential difference between floating body 24 and region 16. Even for memory cells having a positively charged floating body 24, the hole current generated by the intrinsic n-p-n bipolar devices 30*a*, 30*b* will not be sufficient to compensate for the forward bias current of p-n diode formed by floating body 24 and junction 16.

Figure 11A:
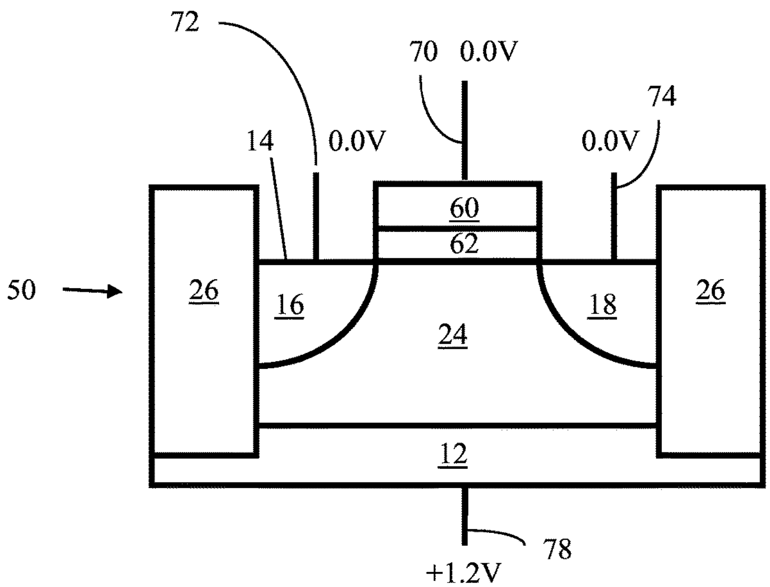
FIG. 11A illustrates an example of bias conditions on unselected memory cells during a write "0" operation according to an embodiment of the present invention.
Figure 11B:
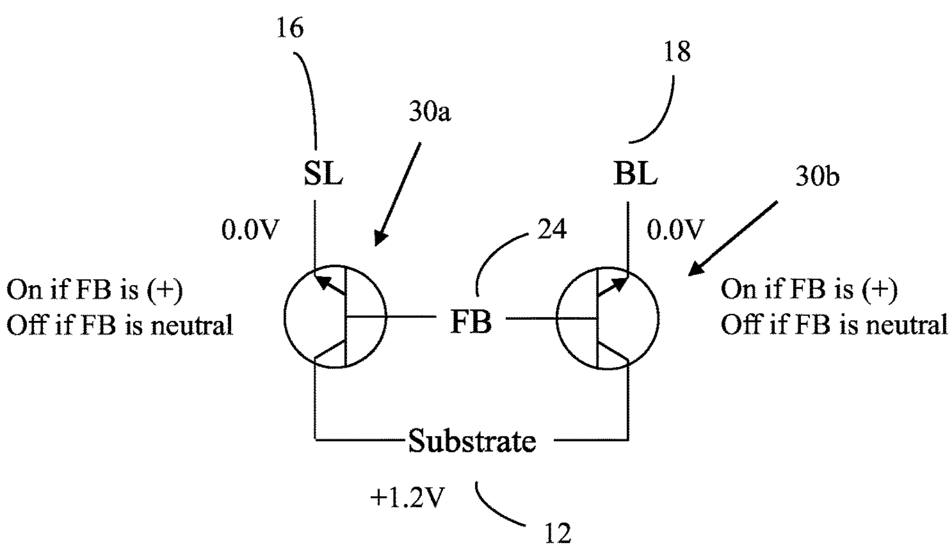
FIG. 11B shows an equivalent circuit diagram for the cell of FIG. 11A illustrating the intrinsic n-p-n bipolar devices.

An example of bias conditions and an equivalent circuit diagram illustrating the intrinsic n-p-n bipolar devices 30*a*, 30*b* of unselected memory cells 50 during write "0" operations are illustrated in FIGS. 11A-11B. Since the write "0" operation only involves applying a negative voltage to the SL terminal 72, the bias conditions for all the unselected cells are the same. As can be seen, the unselected memory cells will be in a holding operation, with both BL and SL terminals at about 0.0 volts. The positive back bias applied to the substrate terminal 78 employed for the holding operation does not interrupt the write "0" operation of the selected memory cells. Furthermore, the unselected memory cells remain in the holding operation.

The write "0" operation referred to above has a drawback in that all memory cells 50 sharing the same SL terminal will be written to simultaneously and as a result, this does not allow individual bit writing, i.e., writing to a single cell 50 memory bit. To write multiple data to different memory cells 50, write "0" is first performed on all the memory cells, followed by write "1" operations on a selected bit or selected bits.

An alternative write "0" operation that allows for individual bit writing can be performed by applying a positive voltage to WL terminal 70, a negative voltage to BL terminal 74, zero or positive voltage to SL terminal 72, and zero or positive voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and 18 is forward-biased, evacuating any holes from the floating body 24. To reduce undesired write "0" disturb to other memory cells 50 in the memory array 80, the applied potential can be optimized as follows: if the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. A positive voltage can be applied to SL terminal 72 to further reduce the undesired write "0" disturb on other memory cells 50 in the memory array. The unselected cells will remain at holding state, i.e. zero or negative voltage applied to WL terminal 70 and zero voltage applied to BL terminal 74.

Figure 12:
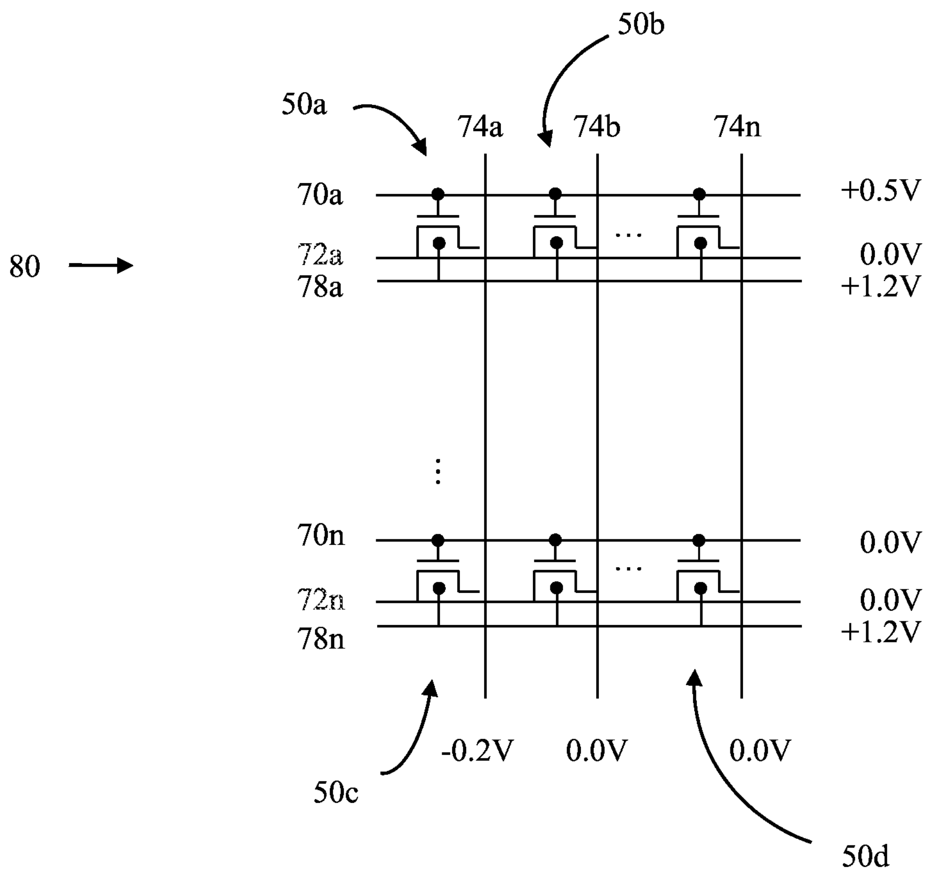
FIG. 12 shows bias conditions for selected and unselected memory cells of a memory array during a write "0" operation according to an embodiment of the present invention.

In one particular non-limiting embodiment, the following bias conditions are applied to the selected memory cell 50*a:* a potential of about 0.0 volts is applied to terminal 72, a potential of about −0.2 volts is applied to terminal 74, a potential of about +0.5 volts is applied to terminal 70, and about +1.2 volts is applied to terminal 78; while about 0.0 volts is applied to terminal 72, about 0.0 volts is applied to terminal 74, about 0.0 volts is applied to terminal 70, and about +1.2 volts is applied to terminal 78 of the unselected memory cells. FIG. 12 shows the bias conditions for the selected and unselected memory cells in memory array 80. However, these voltage levels may vary.

Figure 13A:
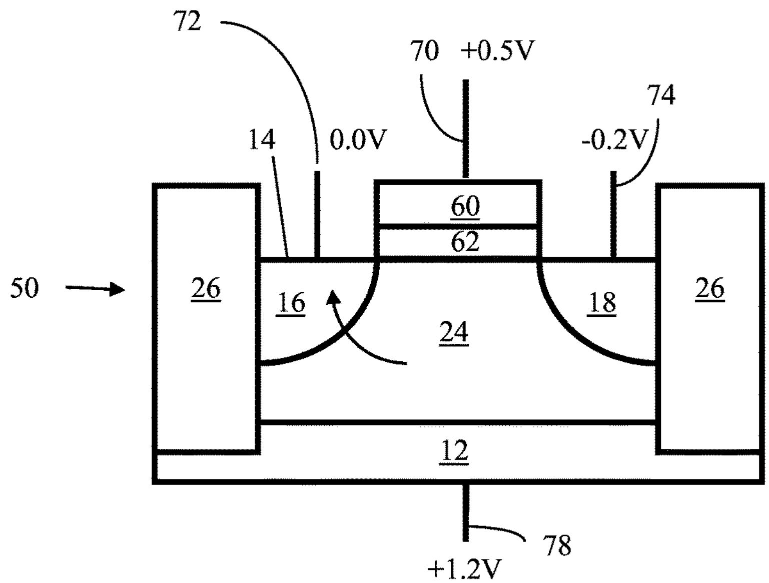
FIG. 13A illustrates an example of bias conditions on a selected memory cell during a write “0” operation according to an embodiment of the present invention.
Figure 13B:
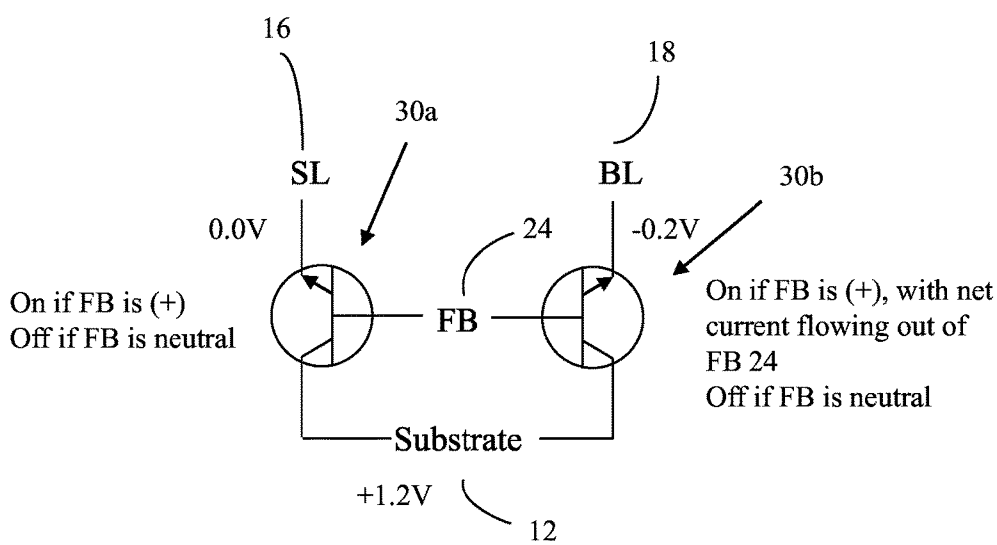
FIG. 13B shows an equivalent circuit diagram for the cell of FIG. 13A illustrating the intrinsic n-p-n bipolar devices.

The bias conditions of the selected memory cell 50*a* under write "0" operation are further elaborated and are shown in FIGS. 13A-13B. As discussed, the potential difference between floating body 24 and junction 18 (connected to BL terminal 74) is now increased, resulting in a higher forward bias current than the base hole current generated by the n-p-n bipolar devices 30*a*, 30*b* formed by substrate 12, floating body 24, and regions 16 and 18. The net result is that holes will be evacuated from floating body 24.

Figure 13C:
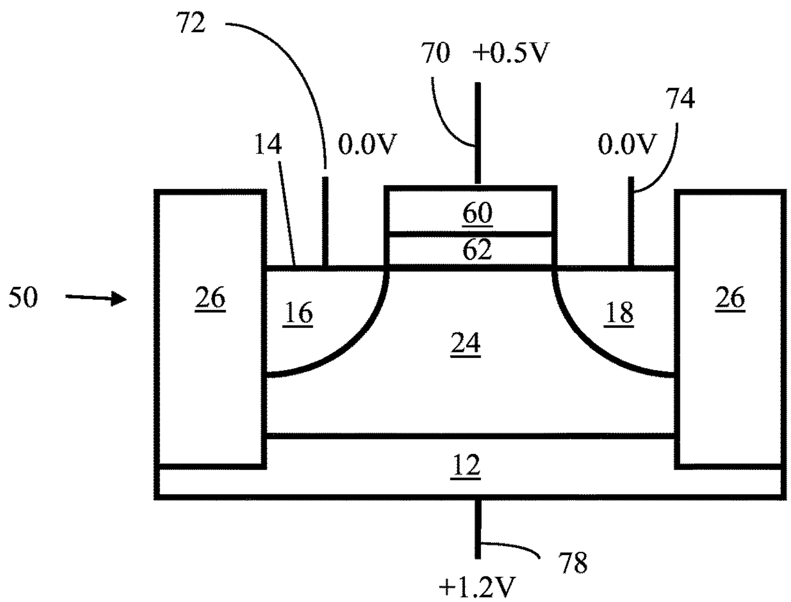
FIG. 13C illustrates an example of bias conditions on unselected memory cells sharing the same row as a selected memory cell in an array during a write “0” operation of the selected memory cell, according to the embodiment of FIG. 13A.
Figure 13D:
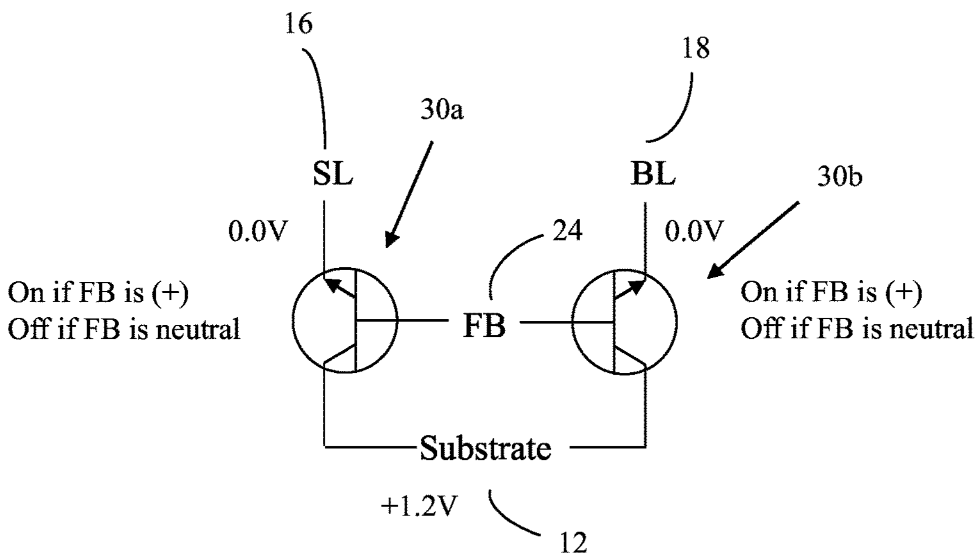
FIG. 13D shows an equivalent circuit diagram for the cell of FIG. 13C illustrating the intrinsic n-p-n bipolar devices.
Figure 13E:
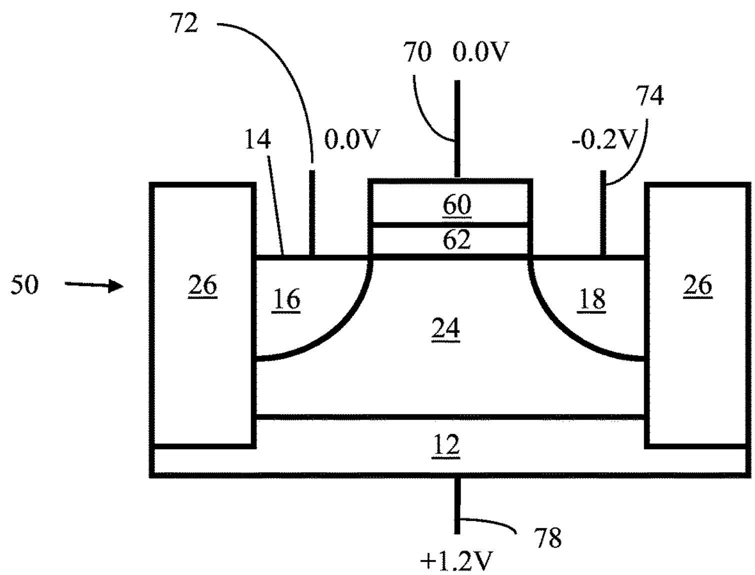
FIG. 13E illustrates an example of bias conditions on unselected memory cells sharing the same column as a selected memory cell in an array during a write “0” operation of the selected memory cell, according to the embodiment of FIG. 13A.
Figure 13F:
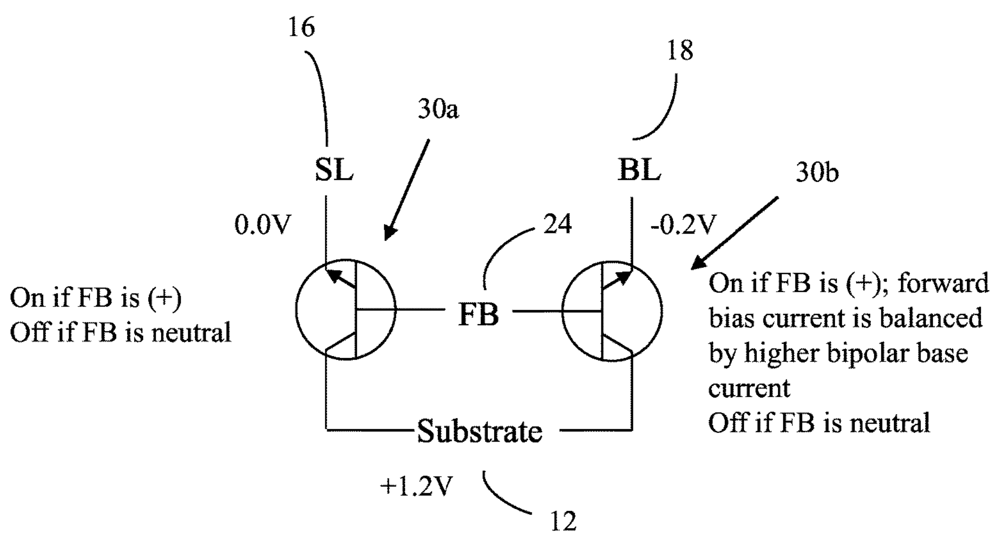
FIG. 13F shows an equivalent circuit diagram for the cell of FIG. 13E illustrating the intrinsic n-p-n bipolar devices.
Figure 13G:
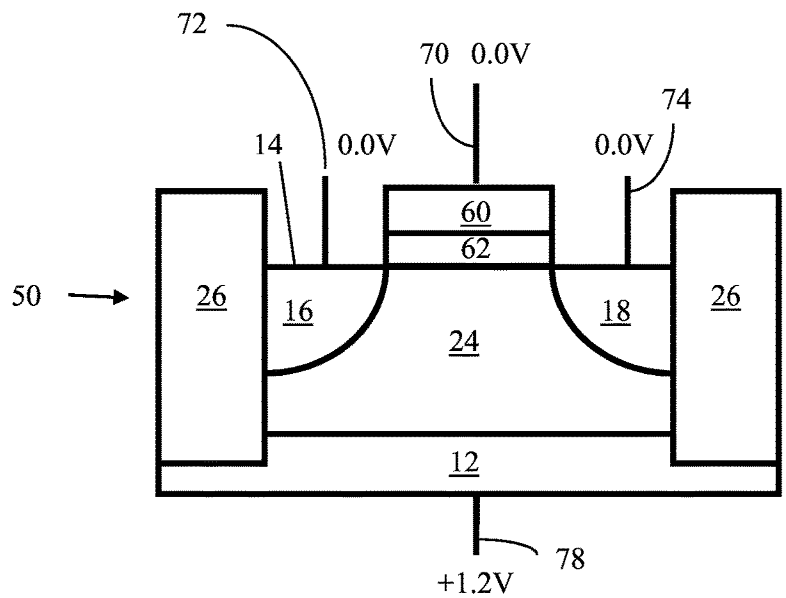
FIG. 13G illustrates an example of bias conditions on unselected memory cells that share neither the same row nor the same column as a selected memory cell in an array during a write “0” operation of the selected memory cell, according to the embodiment of FIG. 13A.
Figure 13H:
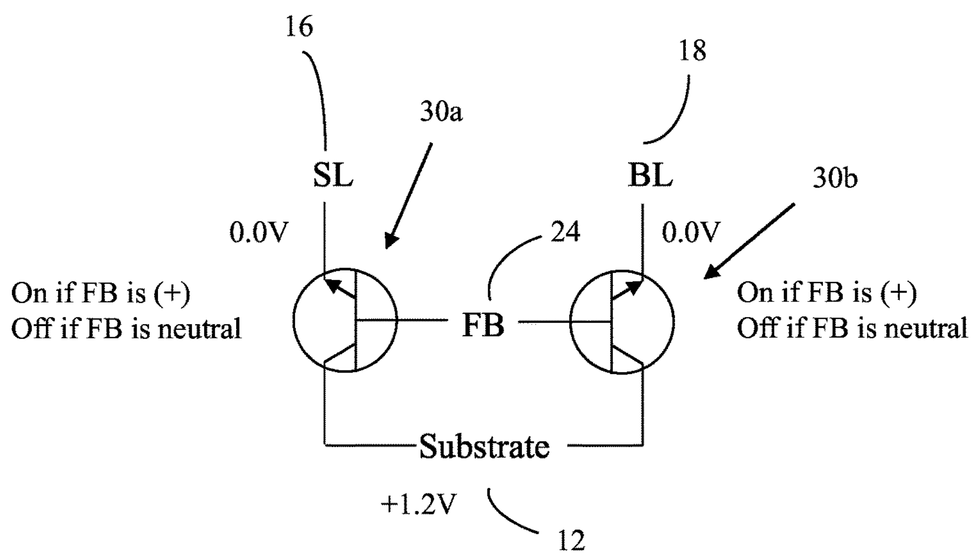
FIG. 13H shows an equivalent circuit diagram for the cell of FIG. 13G illustrating the intrinsic n-p-n bipolar devices.

The unselected memory cells 50 during write "0" operations are shown in FIGS. 13C-13H. The bias conditions for memory cells sharing the same row (e.g. memory cell 50*b*) are illustrated in FIGS. 13C-13D, and the bias conditions for memory cells sharing the same column (e.g. memory cell 50*c*) as the selected memory cell 50*a* are shown in FIGS. 13E-13F, while the bias conditions for memory cells not sharing the same row or the same column (e.g. memory cell 50*d*) as the selected memory cell 50 are shown in FIGS. 13G-13H.

For memory cells sharing the same row as the selected memory cell, both the SL terminal 72 and BL terminal 74 are at about 0.0 volts (FIGS. 13C and 13D). The floating body 24 potential of these cells will also increase due to capacitive coupling from the WL terminal 70. For memory cells in state "1", the increase in the floating body 24 potential is not sustainable as the forward bias current of the p-n diodes formed by floating body 24 and junctions 16 and 18 is greater than the base hole current generated by the n-p-n bipolar device 30 formed by substrate 12, floating body 24, and junctions 16 and 18. As a result, the floating body 24 potential will return to the initial state "1" equilibrium potential. For memory cells in state "0", if the increase in floating body 24 potential is sufficiently high (i.e., at least $V_{FB}/3$, see below), then both n-p-n bipolar devices 30*a* and 30*b* are turned on, and as a result the floating body 24 reaches a new equilibrium potential, between that of state "0" and state "1". Therefore, the WL potential needs to be optimized so that the n-p-n bipolar devices 30*a*, 30*b* will not be turned on or that the base hole current is low enough that it does not result in an increase of the floating body 24 potential over the time during which the write operation is carried out (write operation time). It has been determined by the present inventor that a floating body 24 potential increase of $V_{FB}/3$ is low enough to suppress the floating body 24 potential increase.

Accordingly, with careful design concerning the voltage applied to WL terminal 70, the states of the unselected memory cells sharing the same WL terminal (i.e. the same row) as the selected memory cells will be maintained.

For memory cells sharing the same column as the selected memory cell, a negative voltage is applied to the BL terminal 74 (see FIGS. 13E and 13F), resulting in an increase in the potential difference between floating body 24 and region 18 connected to BL terminal 74. As a result a higher forward bias current between floating body 24 and junction 18 occurs. For memory cells in state "0", the potential difference between floating body 24 and junction 18 is still sufficiently low that the p-n diode formed by floating body 24 and junction 18 is still not forward biased. Thus those memory cells will remain in state "0". For memory cells in state "1", junction leakage caused by forward bias current will increase. However, the hole current of the n-p-n bipolar device 30*b* formed by substrate 12, floating body 24, and region 18 will also increase as a result of the increase in potential difference between the substrate 12 and region 18 (the collector and emitter terminals, respectively). Hence, the floating body 24 of memory cells in state "1" will also remain positively charged (i.e., in state "1").

As to memory cells not sharing the same row or the same column as the selected memory cell, both the SL terminal 72 and BL terminal 74 are at about 0.0 volts (see FIGS. 13G and 13H). These cells will thus be in a holding mode and continue a holding operation, with memory cells in state "1" maintaining the charge in floating body 24 because the intrinsic n-p-n bipolar device 30 will generate hole current to replenish the charge in floating body 24; while memory cells in state "0" will remain in the neutral state.

Accordingly, the present invention provides for a write "0" operation that allows for bit selection. The positive bias applied to the substrate terminal 78 of the memory cells 50 is necessary to maintain the states of the unselected cells 50, especially those sharing the same row and column as the selected cells 50, as the bias conditions can potentially alter the states of the memory cells 50 without the intrinsic bipolar devices 30*a*, 30*b* (formed by substrate 12, floating body 24, and regions 16, 18, respectively) re-establishing the equilibrium condition. Also, the positive bias applied to the substrate terminal 78 employed for the holding operation does not interrupt the write "0" operation of the selected memory cell(s).

A write "1" operation can be performed on memory cell 50 through impact ionization or band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003, which was incorporated by reference above.

Figure 14:
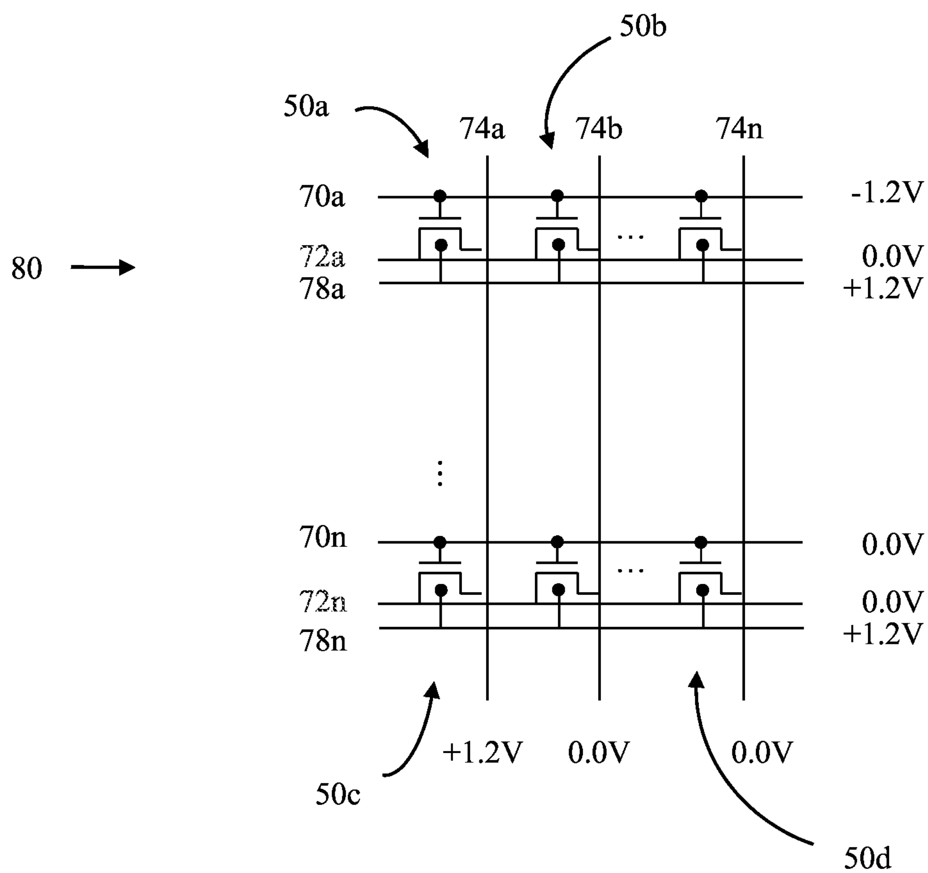
FIG. 14 illustrates an example of bias conditions of a selected memory cell and unselected memory cells in an array under a band-to-band tunneling write “1” operation of the selected cell according to an embodiment of the present invention.
Figure 15A:
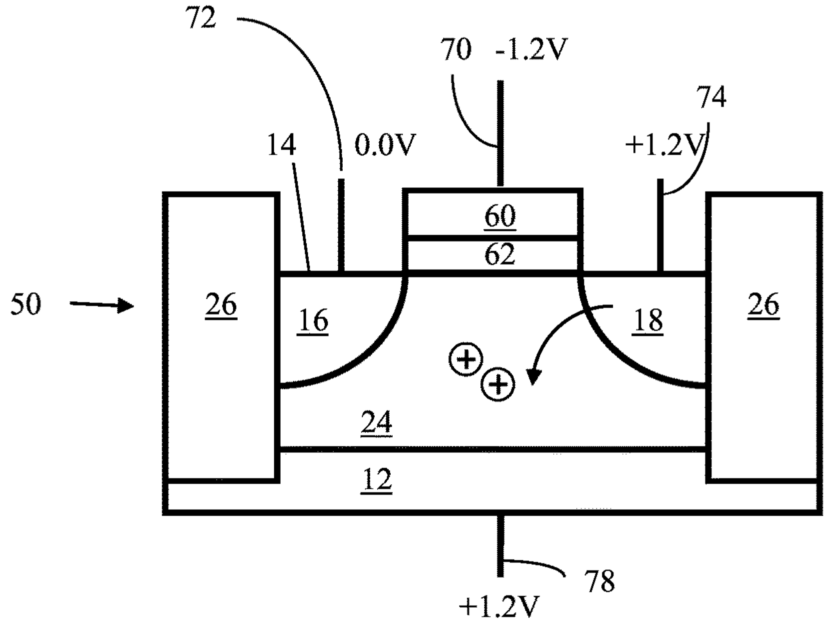
FIG. 15A illustrates an example of bias conditions on the selected memory cell of FIG. 14.
Figure 15B:
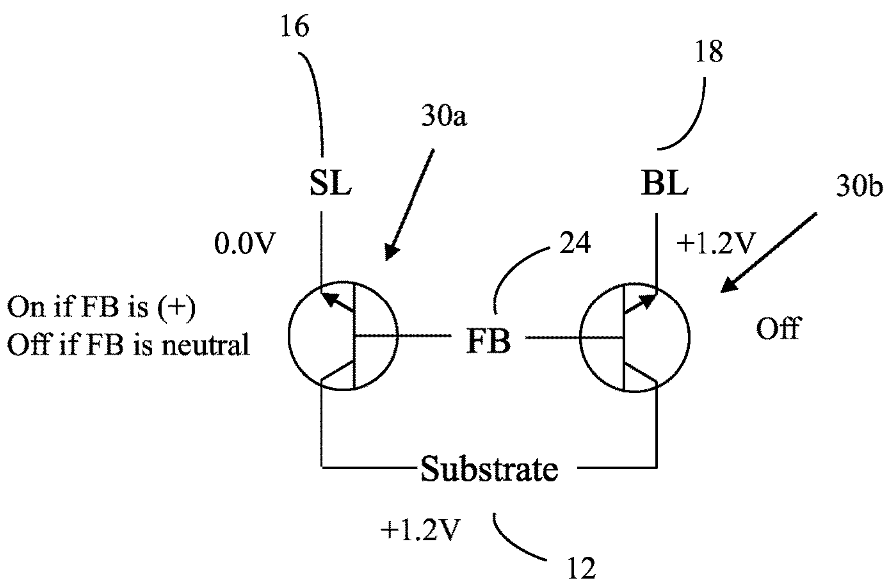
FIG. 15B shows an equivalent circuit diagram for the cell of FIG. 15A illustrating the intrinsic n-p-n bipolar devices.

An example of the bias condition of the selected memory cell 50 under band-to-band tunneling write "1" operation is illustrated in FIG. 14 and FIGS. 15A-15B. The negative bias applied to the WL terminal 70 and the positive bias applied to the BL terminal 74 results in hole injection to the floating body 24 of the selected memory cell 50. The positive bias applied to the substrate terminal 78 maintains the resulting positive charge on the floating body 24 as discussed above. The unselected cells 50 remain at the holding mode, with zero or negative voltage applied to the unselected WL terminal 70 and zero voltage is applied to the unselected BL terminal 74 to maintain the holding operation (holding mode).

In one particular non-limiting embodiment, the following bias conditions are applied to the selected memory cell 50*a*: a potential of about 0.0 volts is applied to terminal 72, a potential of about +1.2 volts is applied to terminal 74, a potential of about −1.2 volts is applied to terminal 70, and about +1.2 volts is applied to terminal 78; and the following bias conditions are applied to the unselected memory cells 50: about 0.0 volts is applied to terminal 72, about 0.0 volts is applied to terminal 74, about 0.0 volts is applied to terminal 70, and about +1.2 volts is applied to terminal 78. FIG. 14 shows the bias conditions for the selected and unselected memory cells in memory array 80. However, these voltage levels may vary.

Figure 15C:
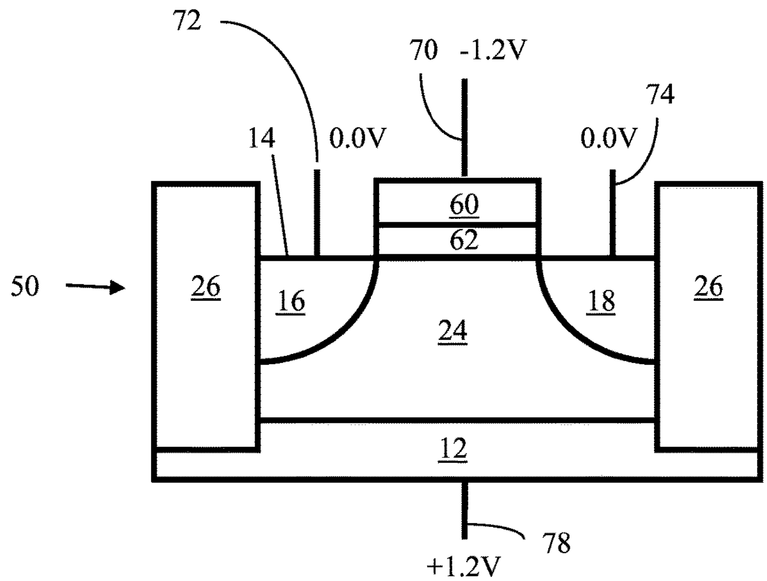
FIG. 15C illustrates an example of bias conditions on unselected memory cells sharing the same row as a selected memory cell in an array during a write “1” operation of the selected memory cell, according to the embodiment of FIG. 15A.
Figure 15D:
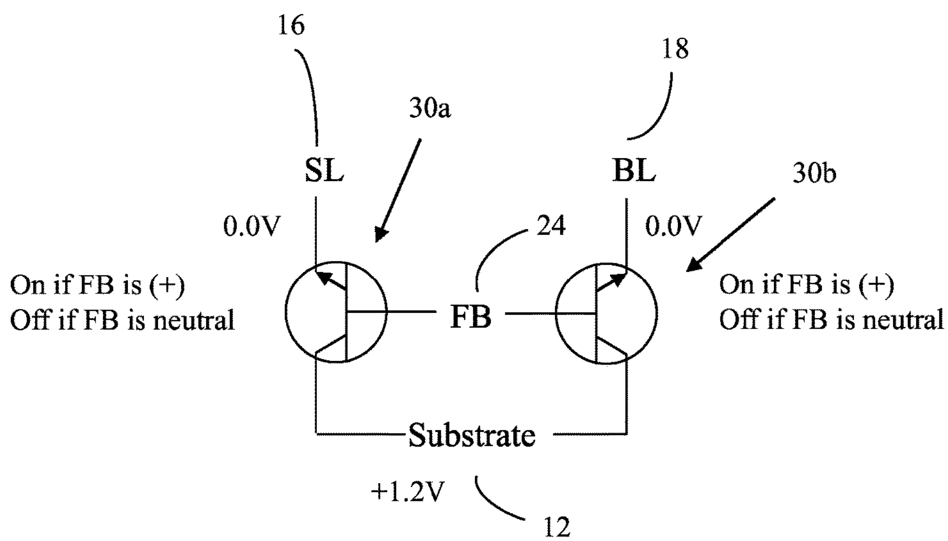
FIG. 15D shows an equivalent circuit diagram for the cell of FIG. 15C illustrating the intrinsic n-p-n bipolar devices.
Figure 15E:
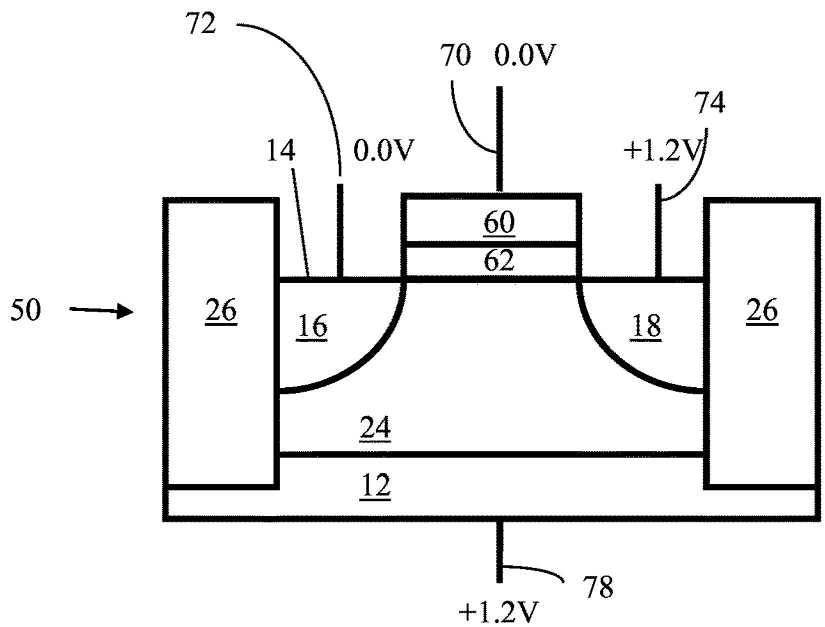
FIG. 15E illustrates an example of bias conditions on unselected memory cells sharing the same column as a selected memory cell in an array during a write “1” operation of the selected memory cell, according to the embodiment of FIG. 15A.
Figure 15F:
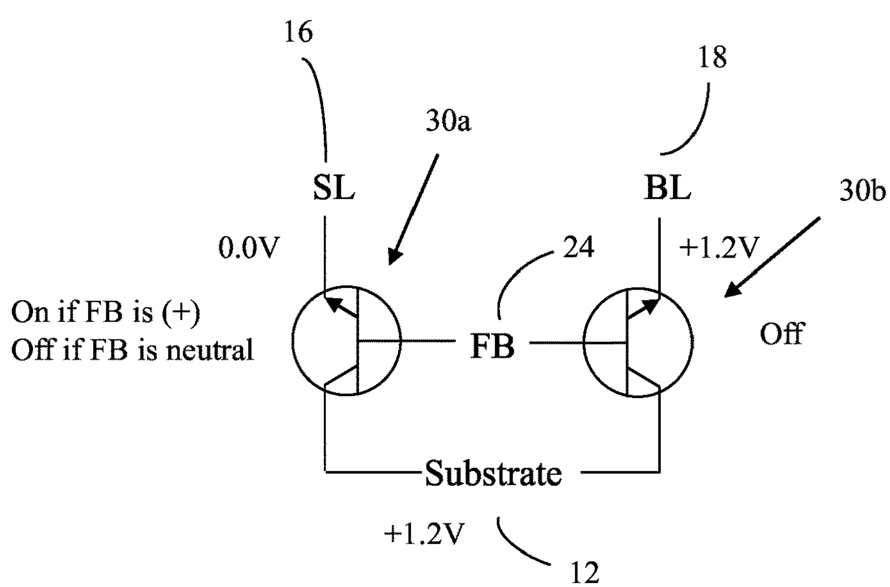
FIG. 15F shows an equivalent circuit diagram for the cell of FIG. 15E illustrating the intrinsic n-p-n bipolar devices.
Figure 15G:
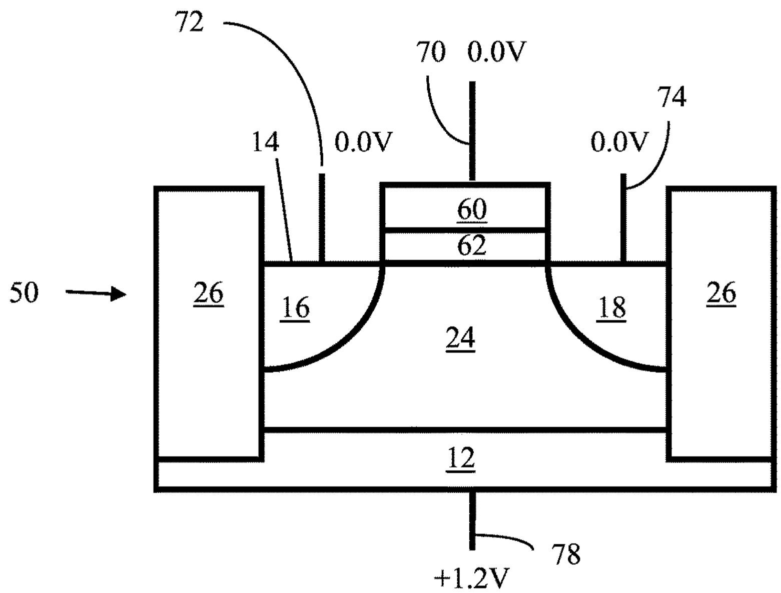
FIG. 15G illustrates an example of bias conditions on unselected memory cells that share neither the same row nor the same column as a selected memory cell in an array during a write “1” operation of the selected memory cell, according to the embodiment of FIG. 15A.
Figure 15H:
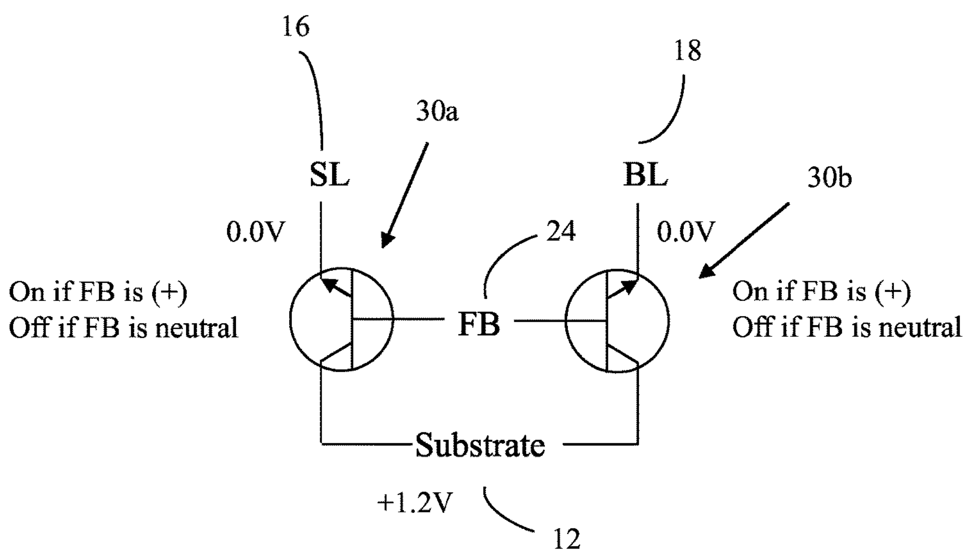
FIG. 15H shows an equivalent circuit diagram for the cell of FIG. 15G illustrating the intrinsic n-p-n bipolar devices.

The unselected memory cells during write "1" operations are shown in FIGS. 15C-15H. The bias conditions for memory cells sharing the same row (e.g. memory cell 50*b*) are shown in FIGS. 15C-15D and the bias conditions for memory cells sharing the same column as the selected memory cell 50*a* (e.g. memory cell 50*c*) are shown in FIGS. 15E-15F. The bias conditions for memory cells 50 not sharing the same row or the same column as the selected memory cell 50*a* (e.g. memory cell 50*d*) are shown in FIGS. 15G-15H.

For memory cells sharing the same row as the selected memory cell, both the SL terminal 72 and BL terminal 74 are at about 0.0 volts, with the WL terminal 70 at zero or negative voltage (FIGS. 15C-15D). Comparing with the holding operation bias condition, it can be seen that cells sharing the same row (i.e. the same WL terminal 70) are in holding mode. As a result, the states of these memory cells will remain unchanged.

For memory cells sharing the same column as the selected memory cell, a positive voltage is applied to the BL terminal 74. As a result, the bipolar device 30*b* formed by substrate 12, floating body 24, and region 18 connected to BL terminal 74 will be turned off because of the small voltage difference between the substrate terminal 78 and BL terminal 74 (the collector and emitter terminals, respectively). However, the bipolar device 30*a* formed by substrate 12, floating body 24, and region 16 connected to SL terminal 72 will still generate base hole current for memory cells in state "1" having positive charge in floating body 24. Memory cells in state "0" will remain in state "0" as this bipolar device 30*a* (formed by substrate 12, floating body 24, and region 16) is off.

For memory cells not sharing the same row or the same column as the selected memory cell, both the SL terminal 72 and BL terminal 74 are at about 0.0 volts (see FIGS. 15G-15H). As can be seen, these cells will be in a holding operation (holding mode), where memory cells in state "1" will maintain the charge in floating body 24 because the intrinsic n-p-n bipolar devices 30*a*, 30*b* will generate hole current to replenish the charge in floating body 24; while memory cells in state "0" will remain in the neutral state.

Thus the positive bias applied to the substrate terminal 78 employed for the holding operation does not interrupt the write "1" operation of the selected memory cell(s). At the same time, the unselected memory cells during write "1" operation will remain in holding operation.

A multi-level write operation can be performed using an alternating write and verify algorithm, where a write pulse is first applied to the memory cell 50, followed by a read operation to verify if the desired memory state has been achieved. If the desired memory state has not been achieved, another write pulse is applied to the memory cell 50, followed by another read verification operation. This loop is repeated until the desired memory state is achieved.

For example, using band-to-band tunneling hot hole injection, a positive voltage is applied to BL terminal 74, zero voltage is applied to SL terminal 72, a negative voltage is applied to WL terminal 70, and a positive voltage is applied to the substrate terminal 78. Positive voltages of different amplitude are applied to BL terminal 74 to write different states to floating body 24. This results in different floating body potentials 24 corresponding to the different positive voltages or the number of positive voltage pulses that have been applied to BL terminal 74. By applying positive voltage to substrate terminal 78, the resulting floating body 24 potential is maintained through base hole current flowing into floating body 24. In one particular non-limiting embodiment, the write operation is performed by applying the following bias condition: a potential of about 0.0 volts is applied to terminal 72, a potential of about −1.2 volts is applied to terminal 70, and about +1.2 volts is applied to terminal 78, while the potential applied to BL terminal 74 is incrementally raised. For example, in one non-limiting embodiment 25 millivolts is initially applied to BL terminal 74, followed by a read verify operation. If the read verify operation indicates that the cell current has reached the desired state (i.e., cell current corresponding to whichever of 00, 01, 10 or 11 is desired is achieved), then the multi write operation is commenced. If the desired state is not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary. The write operation is followed by a read operation to verify the memory state.

The write-then-verify algorithm is inherently slow since it requires multiple write and read operations. The present invention provides a multi-level write operation that can be performed without alternate write and read operations. This is accomplished by ramping the voltage applied to BL terminal 74, while applying zero voltage to SL terminal 72, a positive voltage to WL terminal 70, and a positive voltage to substrate terminal 78 of the selected memory cells. The unselected memory cells will remain in holding mode, with zero or negative voltage applied to WL terminal 70 and zero voltage applied to BL terminal 74. These bias conditions will result in a hole injection to the floating body 24 through impact ionization mechanism. The state of the memory cell 50 can be simultaneously read for example by monitoring the change in the cell current through a read circuitry 90 (FIGS. 16A-16C) coupled to the source line 72. The cell current measured in the source line direction is a cumulative cell current of all memory cells 50 which share the same source line 72 (see FIGS. 16A-16C). As a result, only one memory cell 50 sharing the same source line 72 can be written. This ensures that the change in the cumulative cell current is a result of the write operation on the selected memory cell 50.

Figure 17:
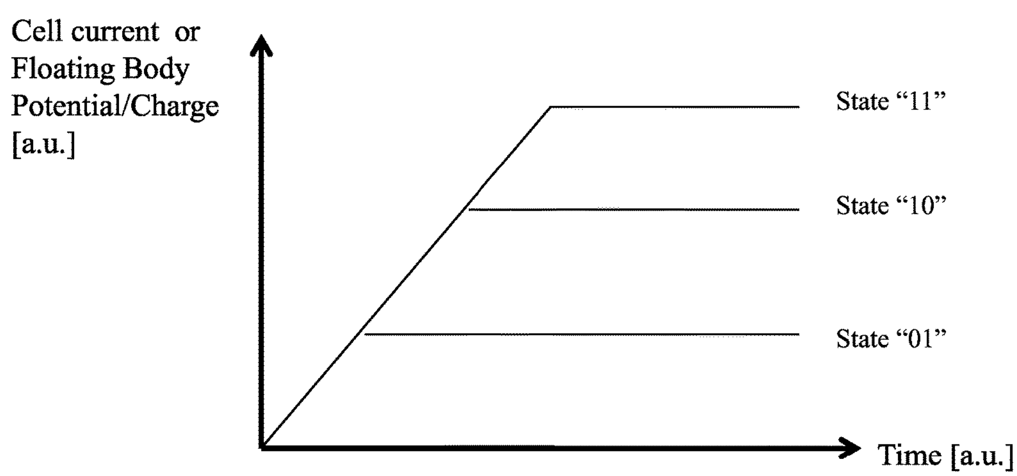
FIG. 17 graphically illustrates that the potential of the floating body of a memory cell will increase over time as bias conditions are applied that will result in hole injection to the floating body, according to an embodiment of the present invention.

As shown in FIG. 17, the potential of the floating body 24 increases over time as these bias conditions result in hole injection to floating body 24 through an impact ionization mechanism. Once the change in cell current reaches the desired level associated with a state of the memory cell 50, the voltage applied to BL terminal 74 can be removed. By applying a positive voltage (back bias) to substrate terminal 78, the resulting floating body 24 potential is maintained through base hole current flowing into floating body 24. In this manner, the multi-level write operation can be performed without alternate write and read operations.

Figure 16A:
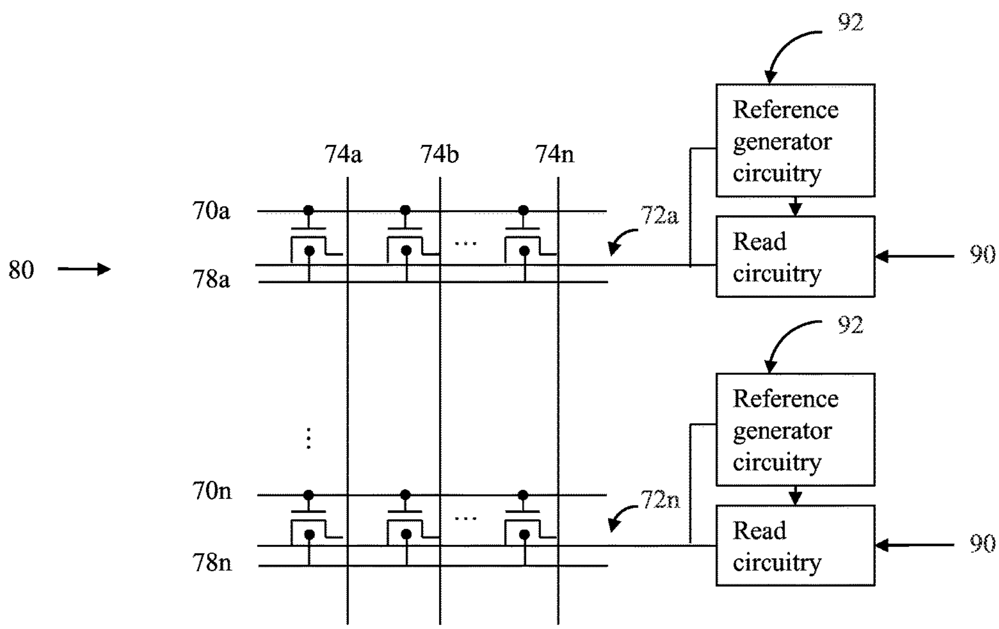
FIG. 16A shows a reference generator circuit which serves to generate the initial cumulative cell current of the memory cells sharing the same source line being written, according to an embodiment of the present invention.
Figure 16B:
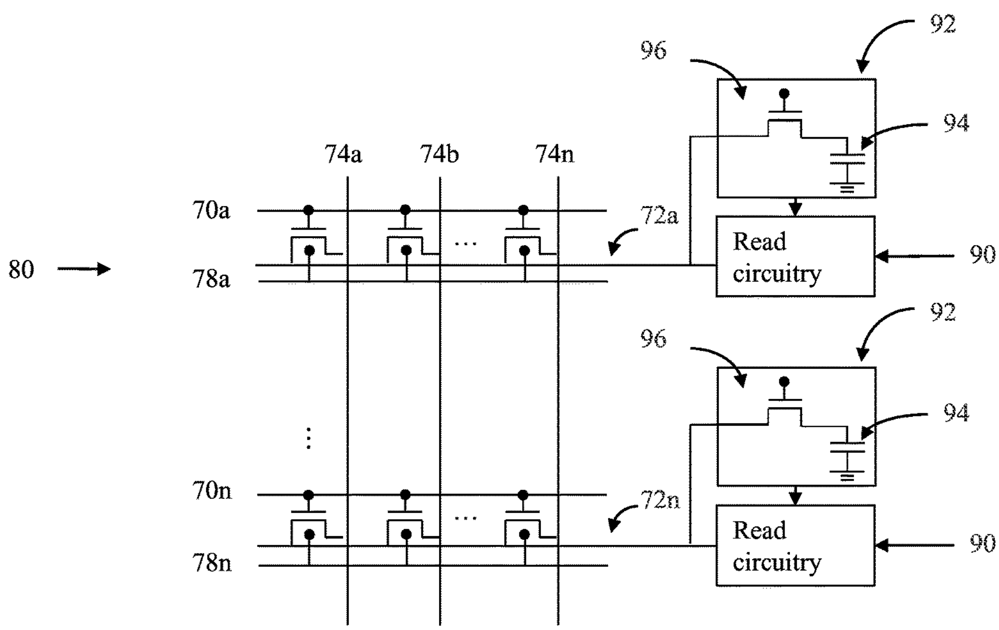
FIG. 16B shows a reference generator circuit which serves to generate the initial cumulative cell current of the memory cells sharing the same source line being written, according to another embodiment of the present invention.
Figure 16C:
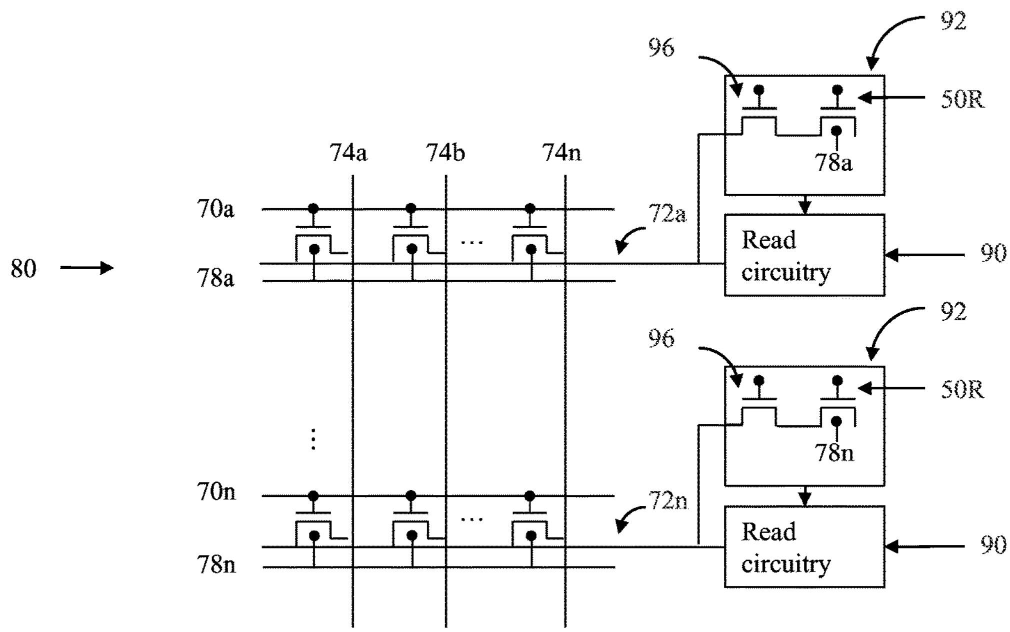
FIG. 16C shows a reference generator circuit which serves to generate the initial cumulative cell current of the memory cells sharing the same source line being written, according to another embodiment of the present invention.

FIGS. 16A-16C also show a reference generator circuit 92, which serves to generate the initial cumulative cell current of the memory cells 50 sharing the same source line 72 being written. For example, the cumulative charge of the initial state for all memory cells 50 sharing the same source line 72 can be stored in a capacitor 94 (see FIG. 16B). Transistor 96 is turned on when charge is to be written into or read from capacitor 94. Alternatively, a reference cell 50R (FIG. 16C) similar to a memory cell 50 can also be used to store the initial state. Using a similar principle, a write operation is performed on the reference cell 50R using the cumulative cell current from the source line 72. Transistor 96 is turned on when a write operation is to be performed on the reference cell 50R. A positive bias is also applied to the substrate of the reference cell to maintain its state. The size of the reference cell 50R needs to be configured such that it is able to store the maximum cumulative charge of all the memory cells 50, i.e. when all of the memory cells 50 sharing the same source line 72 are positively charged.

In a similar manner, a multi-level write operation using an impact ionization mechanism can be performed by ramping the write current applied to BL terminal 74 instead of ramping the BL terminal 74 voltage.

In yet another embodiment, a multi-level write operation can be performed through a band-to-band tunneling mechanism by ramping the voltage applied to BL terminal 74, while applying zero voltage to SL terminal 72, a negative voltage to WL terminal 70, and zero or positive voltage to substrate terminal 78 of the selected memory cells 50. The unselected memory cells 50 will remain in holding mode, with zero or negative voltage applied to WL terminal 70 and zero voltage applied to BL terminal 74. Optionally, multiple BL terminals 74 can be simultaneously selected to write multiple cells in parallel. The potential of the floating body 24 of the selected memory cell(s) 50 will increase as a result of the band-to-band tunneling mechanism. The state of the selected memory cell(s) 50 can be simultaneously read for example by monitoring the change in the cell current through a read circuitry 90 coupled to the source line. Once the change in the cell current reaches the desired level associated with a state of the memory cell, the voltage applied to BL terminal 74 can be removed. If positive voltage is applied to substrate terminal 78, the resulting floating body 24 potential is maintained through base hole current flowing into floating body 24. In this manner, the multi-level write operation can be performed without alternate write and read operations.

Similarly, the multi-level write operation using band-to-band tunneling mechanism can also be performed by ramping the write current applied to BL terminal 74 instead of ramping the voltage applied to BL terminal 74.

Figure 18A:
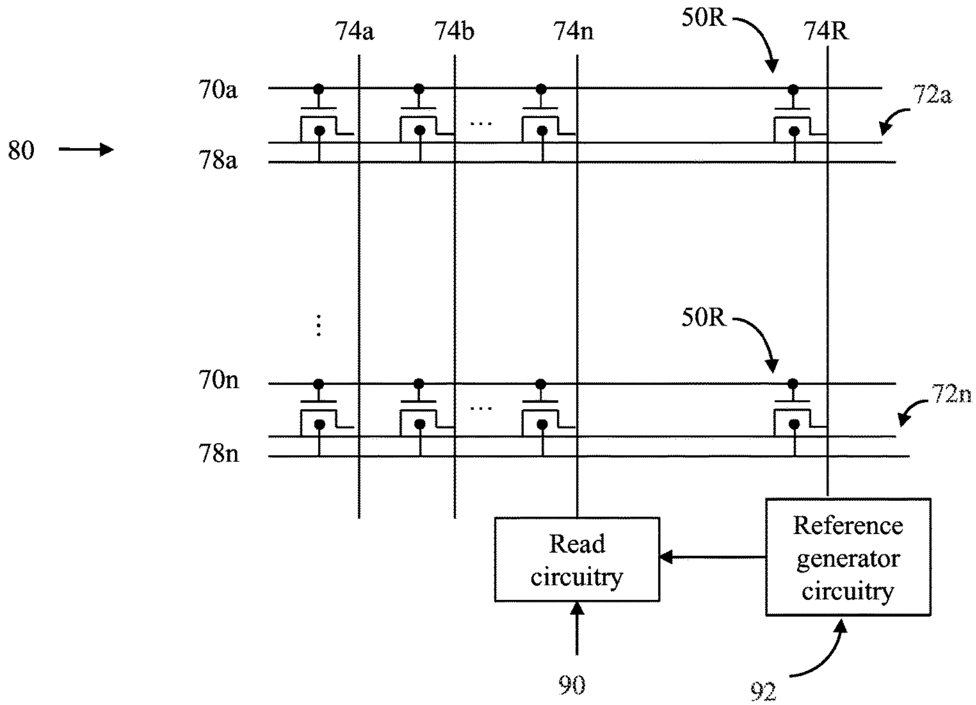
FIG. 18A schematically illustrates reference generator circuitry and read circuitry connected to a memory array according to an embodiment of the present invention.

In another embodiment, a read while programming operation can be performed by monitoring the change in cell current in the bit line direction through a reading circuitry 90 coupled to the bit line 74 as shown in FIG. 18A. Reference cells 50R representing different memory states are used to verify the state of the write operation The reference cells 50R can be configured through a write-then-verify operation for example when the memory device is first powered up.

Figure 18B:
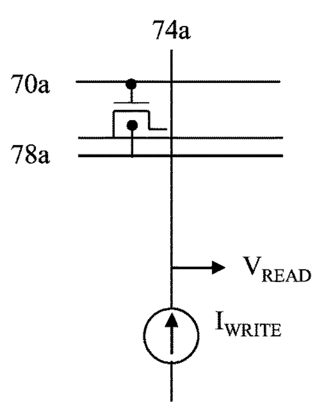
FIG. 18B shows a schematic of a voltage sensing circuitry configured to measure the voltage across the source line and the bit line terminals of a memory cell according to an embodiment of the present invention.

In the voltage ramp operation, the resulting cell current of the memory cell 50 being written is compared to the reference cell 50R current by means of the read circuitry 90. During this read while programming operation, the reference cell 50R is also being biased at the same bias conditions applied to the selected memory cell 50 during the write operation. Therefore, the write operation needs to be ceased after the desired memory state is achieved to prevent altering the state of the reference cell 50R. For the current ramp operation, the voltage at the bit line 74 can be sensed instead of the cell current. The bit line voltage can be sensed for example using a voltage sensing circuitry (see FIG. 18B) as described in "VLSI Design of Non-Volatile Memories", Campardo G. et al., 2005, which is hereby incorporated herein, in its entirety, by reference thereto.

An example of a multi-level write operation without alternate read and write operations, using a read while programming operation/scheme in the bit line direction is given, where two bits are stored per memory cell 50, requiring four states to be storable in each memory cell 50. With increasing charge in the floating body 24, the four states are referred to as states "00", "01", "10", and "11". To program a memory cell 50 to a state "01", the reference cell 50R corresponding to state "01" is activated. Subsequently, the bias conditions described above are applied both to the selected memory cell 50 and to the "01" reference cell 50R: zero voltage is applied to the source line terminal 72, a positive voltage is applied to the substrate terminal 78, a positive voltage is applied to the WL terminal 70 (for the impact ionization mechanism), while the BL terminal 74 is being ramped up, starting from zero voltage. Starting the ramp voltage from a low voltage (i.e. zero volts) ensures that the state of the reference cell 50R does not change.

The voltage applied to the BL terminal 74 is then increased. Consequently, holes are injected into the floating body 24 of the selected cell 50 and subsequently the cell current of the selected cell 50 increases. Once the cell current of the selected cell 50 reaches that of the "01" reference cell, the write operation is stopped by removing the positive voltage applied to the BL terminal 74 and WL terminal 70.

As was noted above, a periodic pulse of positive voltage can be applied to substrate terminal 78, as opposed to applying a constant positive bias, to reduce the power consumption of the memory cell 50. The memory cell 50 operations during the period where the substrate terminal 78 is being grounded are now briefly described. During the period when the substrate terminal 78 is grounded, the memory cells 50 connected to a ground substrate terminal 78 are no longer in holding mode. Therefore the period during which the substrate terminal is grounded must be shorter than the charge retention time period of the floating body, to prevent the state of the floating body from changing when the substrate terminal is grounded. The charge lifetime (i.e., charge retention time period) of the floating body 24 without use of a holding mode has been shown to be on the order of milliseconds, for example, see "A Scaled Floating Body Cell (FBC) Memory with High-k+Metal Gate on Thin-Silicon and Thin-BOX for 16-nm Technology Node and Beyond", Ban et al., pp. 92-92, Symposium on VLSI Technology, 2008, which is hereby incorporated herein, in its entirety, by reference thereto. The state of the memory cell 50 can be maintained by refreshing the charge stored in floating body 24 during the period over which the positive voltage pulse is applied to the back bias terminal (i.e., substrate terminal 78).

Figure 19:
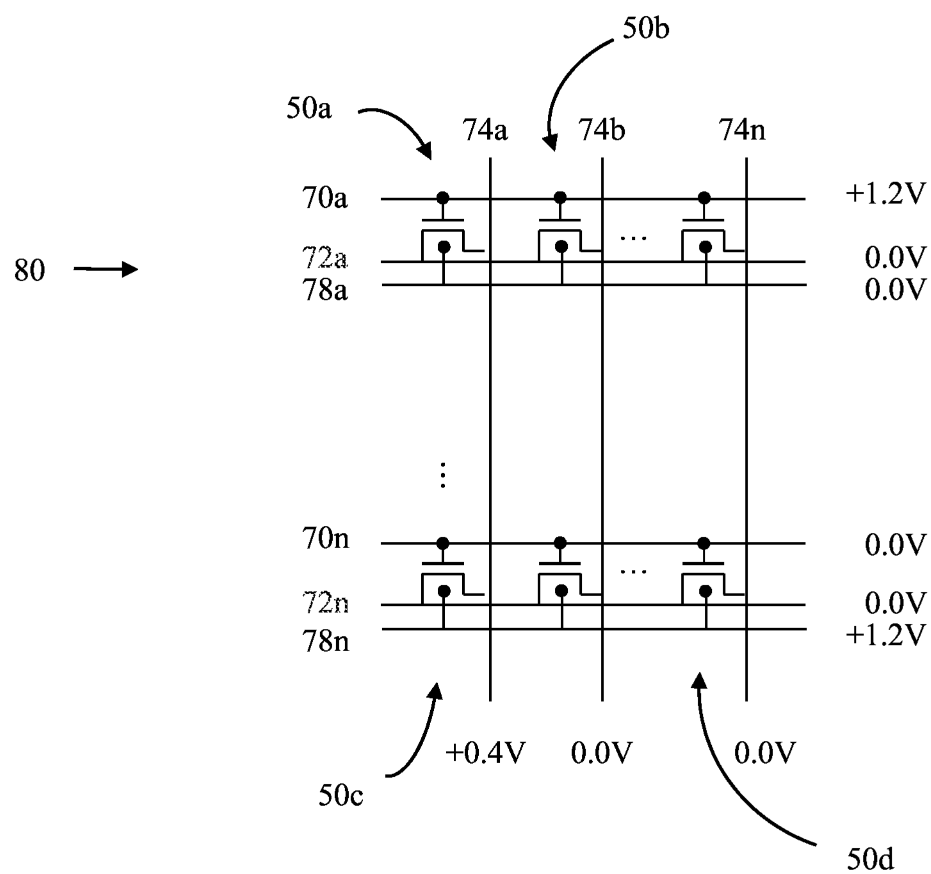
FIG. 19 illustrates bias conditions on a selected cell and unselected cells of an array during a read operation on the selected cell according to an embodiment of the present invention.

A read operation can be performed by applying the following bias conditions: zero voltage is applied to the substrate terminal 78, zero voltage is applied to SL terminal 72, a positive voltage is applied to the selected BL terminal 74, and a positive voltage greater than the positive voltage applied to the selected BL terminal 74 is applied to the selected WL terminal 70. The unselected BL terminals 74 will remain at zero voltage and the unselected WL terminals 70 will remain at zero or negative voltage. If the substrate terminals 78 are segmented (as for example shown in FIGS. 4A-4C), a positive voltage can be applied to the unselected substrate terminals 78. In one particular non-limiting embodiment, about 0.0 volts is applied to terminal 72, about +0.4 volts is applied to the selected terminal 74, about +1.2 volts is applied to the selected terminal 70, and about 0.0 volts is applied to terminal 78. The unselected terminals 74 remain at 0.0 volts and the unselected terminals 70 remain at 0.0 volts. The unselected terminals 78 (in the case where the substrate terminals 78 are segmented as in FIGS. 4A and 4B) can remain at +1.2 volts (see FIG. 19). Because the read operation is carried out over a time period on the order of nanoseconds, it is of a much shorter duration than the charge lifetime (charge retention time period) of the floating body 24 unassisted by a holding operation. Accordingly, the performance of a read operation does not affect the states of the memory cells connected to the terminal 78 as it is momentarily (on the order of nanoseconds) grounded.

Figure 20:
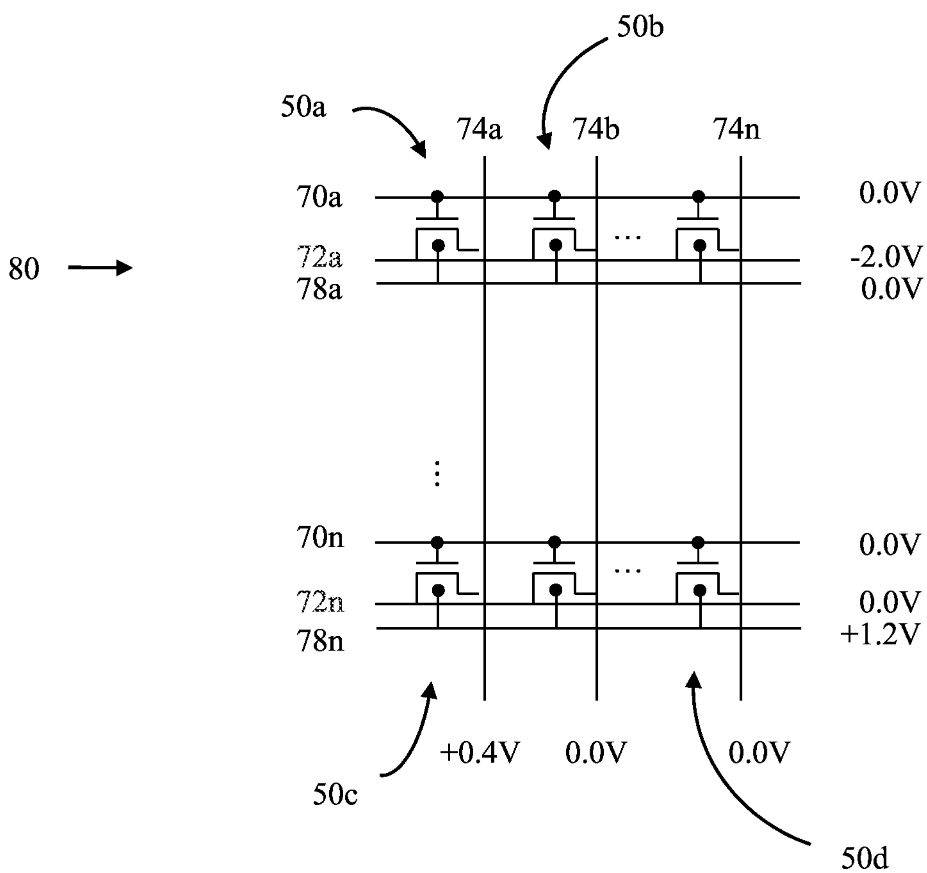
FIG. 20 illustrates bias conditions on a selected cell and unselected cells of an array during a write “0” operation on the selected cell according to an embodiment of the present invention.

A write "0" operation of the cell 50 can be performed by applying the following bias conditions: a negative bias is applied to SL terminal 72, zero or negative voltage is applied to WL terminal 70, and zero voltage is applied to substrate terminal 78. The SL terminal 72 for the unselected cells will remain grounded. If the substrate terminals 78 are segmented (as for example shown in FIGS. 4A-4C), a positive voltage can be applied to the unselected substrate terminals 78. Under these conditions, the p-n junction between 24 and 16 is forward-biased, evacuating any holes from the floating body 24. In one particular non-limiting embodiment, about −2.0 volts is applied to terminal 72, about 0.0 volts is applied to terminal 70, and about 0.0 volts is applied to terminal 78. The unselected terminals 78 (in the case where the substrate terminals 78 are segmented as in FIGS. 4A and 4B) can remain at +1.2 volts. With the substrate terminal 78 being grounded, there is no bipolar hole current flowing to the floating body 24. As a result, the write "0" operation will also require less time. Because the write "0" operation is brief, occurring over a time period on the order of nanoseconds, it is of much shorter duration than the charge retention time period of the floating body 24, unassisted by a holding operation. Accordingly, the write "0" operation does not affect the states of the unselected memory cells 50 connected to the terminal 78 being momentarily grounded to perform the write "0" operation. The bias conditions applied to the memory array 80 are shown in FIG. 20. However, these voltage levels may vary, while maintaining the relative relationships between the charges applied, as described above.

Figure 21:
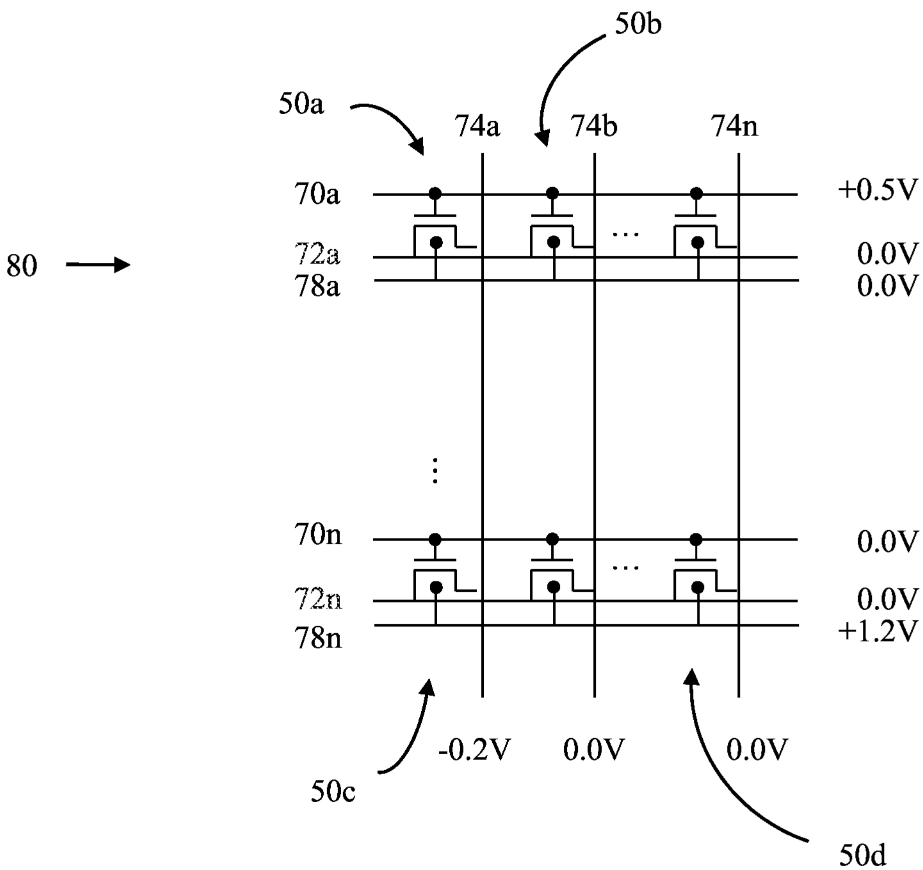
FIG. 21 illustrates bias conditions on a selected cell and unselected cells of an array during a write “0” operation on the selected cell according to another embodiment of the present invention.

An example of the bias conditions for an alternative write "0" operation which allows for individual bit write is shown in FIG. 21. The following conditions are applied to selected memory cell 50: a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and 18 is forward-biased, evacuating any holes from the floating body 24. To reduce undesired write "0" disturb to other memory cells in the memory array sharing the same row or column as the selected memory cell, the applied potential can be optimized as follows: if the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. A positive voltage can be applied to SL terminal 72 to further reduce the undesired write "0" disturb on other memory cells 50 in the memory array that do not share the same common SL terminal 72 as the selected memory cell.

Figure 4C:
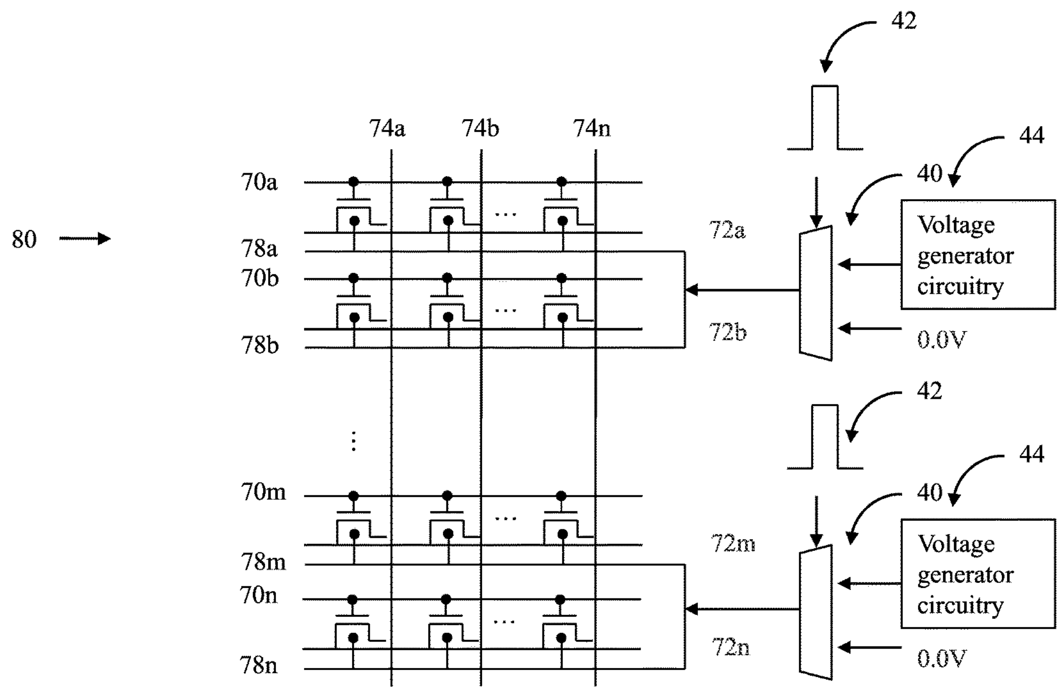
FIG. 4C schematically illustrates use of a voltage generator circuitries to input positive bias to the multiplexers according to an embodiment of the present invention.
Figure 5:
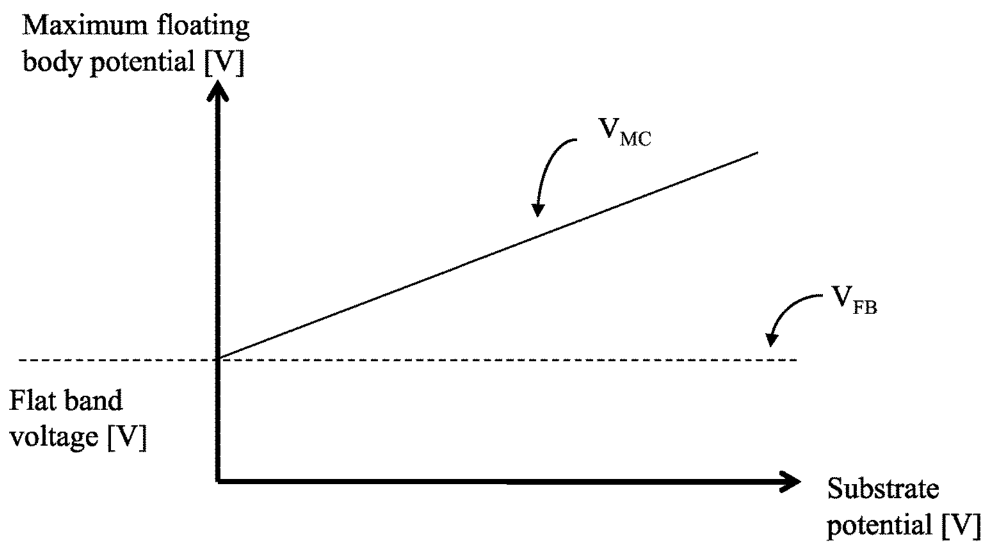
FIG. 5 graphically illustrates that the maximum charge stored in a floating body of a memory cell can be increased by applying a positive bias to the substrate terminal according to an embodiment of the present invention.

The unselected cells will remain at holding state, i.e. zero or negative voltage applied to WL terminal 70, zero voltage applied to BL terminal 74, and positive voltage applied to substrate terminal 78 (in the case the substrate terminals 78 are segmented as for example shown in FIGS. 4A-4C). Because the write "0" operation is brief, occurring over a time period on the order of nanoseconds, it is of much shorter duration than the charge retention time period of the floating body 24, unassisted by a holding operation. Accordingly, the write "0" operation does not affect the states of the unselected memory cells 50 connected to the terminal 78 being momentarily grounded to perform the write "0" operation.

Still referring to FIG. 21, in one particular non-limiting embodiment, the following bias conditions are applied to the selected memory cell 50*a:* a potential of about 0.0 volts is applied to terminal 72*a,* a potential of about −0.2 volts is applied to terminal 74*a,* a potential of about +0.5 volts is applied to terminal 70*a,* and about 0.0 volts is applied to terminal 78*a;* while about 0.0 volts is applied to terminal 72*n* and the other SL terminals not connected to the selected cell 50*a,* about 0.0 volts is applied to terminal 74*n* and the other BL terminals not connected to the selected cell 50*a,* about 0.0 volts is applied to terminal 70*n* and the other WL terminals not connected to the selected cell 50*a,* and about +1.2 volts is applied to terminal 78*n* and the other substrate terminals not connected to the selected cell 50*a*. However, these voltage levels may vary.

Figure 22:
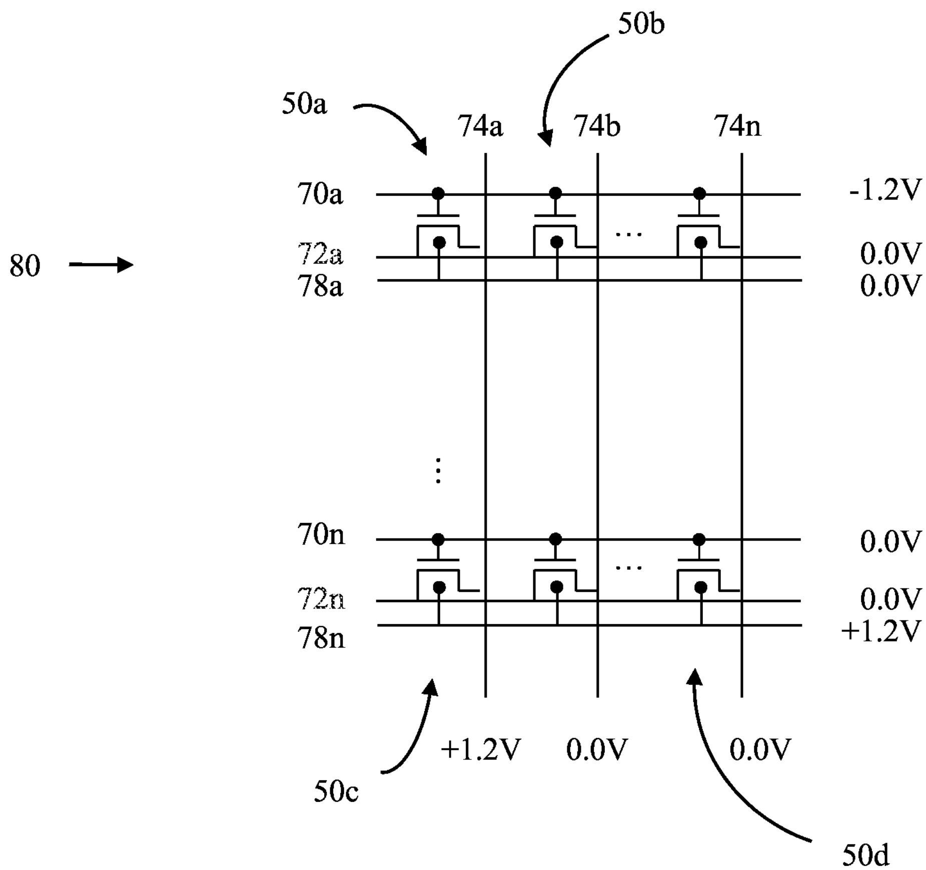
FIG. 22 illustrates bias conditions on a selected cell and unselected cells of an array during a band-to-band tunneling write “1” operation on the selected cell according to another embodiment of the present invention.

An example of the bias conditions applied to the memory array 80 under a band-to-band tunneling write "1" operation to cell 50*a* is shown in FIG. 22, where a negative bias is applied to WL terminal 70*a,* a positive bias is applied to BL terminal 74*a,* zero voltage is applied to SL terminal 72*a,* and zero voltage is applied to substrate terminal 78*a*. The negative bias applied to the WL terminal 70*a* and the positive bias applied to the BL terminal 74*a* will result in hole injection to the floating body 24 of the selected memory cell 50*a*. The unselected cells 50 will remain at the holding mode, with zero or negative voltage applied to the unselected WL terminals 70 (in this case, terminal 70*n* and any other WL terminal 70 not connected to selected cell 50*a*) and zero voltage is applied to the unselected BL terminals 74 (in this case, terminals 74*b,* 74*n* and any other BL terminal 74 not connected to selected cell 50*a*) and positive voltage applied to unselected substrate terminals 78 (in the case the substrate terminals 78 are segmented as for example shown in FIGS. 4A and 4B; and, in FIG. 22, to terminals 78*n* and any other substrate terminals 78 not connected to selected cell 50*a*).

Still referring to FIG. 22, in one particular non-limiting embodiment, the following bias conditions are applied to the selected memory cell 50*a:* a potential of about 0.0 volts is applied to terminal 72*a,* a potential of about +1.2 volts is applied to terminal 74*a,* a potential of about −1.2 volts is applied to terminal 70*a,* and about 0.0 volts is applied to terminal 78*a;* while about 0.0 volts is applied to the unselected terminals 72 (defined in the preceding paragraph), about 0.0 volts is applied to unselected terminals 74 (defined in the preceding paragraph), about 0.0 volts is applied to unselected terminals 70 (defined in the preceding paragraph), and about +1.2 volts is applied to unselected substrate terminals 78 (defined in the preceding paragraph) of the unselected memory cells. However, these voltage levels may vary.

Figure 23A:
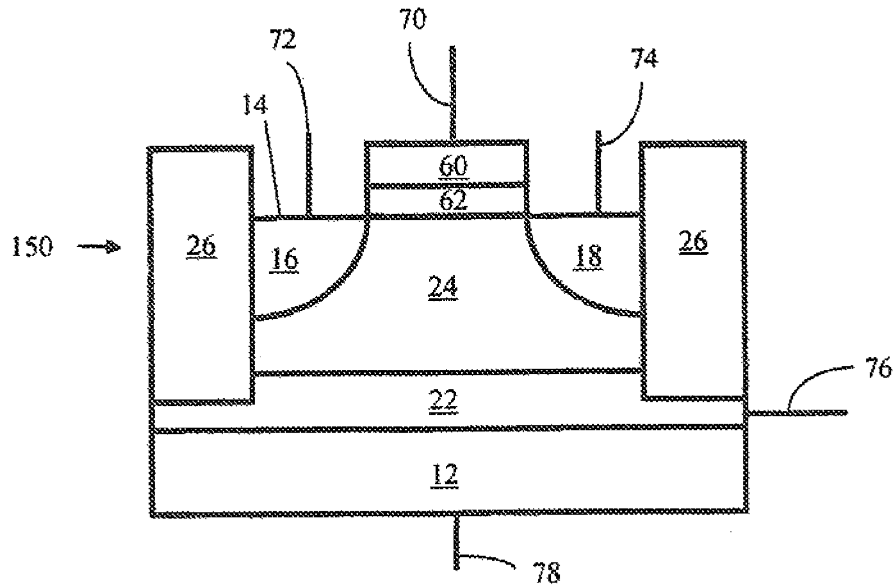
FIG. 23A is a schematic illustration of a memory cell according to another embodiment of the present invention.

FIG. 23A shows another embodiment of a memory cell 150 according to the present invention. The cell 150 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and is exposed at surface 14. A second region 18 having the second conductivity type is also provided in substrate 12, and is also exposed at surface 14. Second region 18 is spaced apart from the first region 16, as shown. First and second regions 16 and 18 may be formed by an implantation process on the material making up substrate 12, according to any of implantation processes known and typically used in the art. Alternatively, a solid state diffusion process may be used to form first and second regions 16 and 18.

Figure 24:
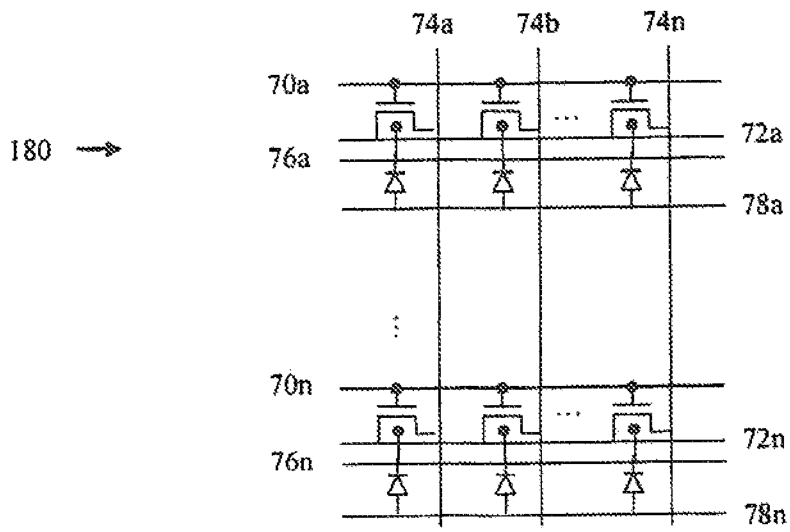
FIG. 24 schematically illustrates an array of memory cells of the type illustrated in FIGS. 23A-23B.

A buried layer 22 of the second conductivity type is also provided in the substrate 12, buried in the substrate 12, as shown. Buried layer 22 may also be formed by an ion implantation process on the material of substrate 12. Alternatively, buried layer 22 can be grown epitaxially. A floating body region 24 of the substrate 12 having a first conductivity type, such as a p-type conductivity type, is bounded by surface, first and second regions 16,18, insulating layers 26 and buried layer 22. Insulating layers 26 (e.g., shallow trench isolation (STI)), may be made of silicon oxide, for example. Insulating layers 26 insulate cell 150 from neighboring cells 150 when multiple cells 150 are joined in an array 180 to make a memory device as illustrated in FIG. 24. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Figure 23B:
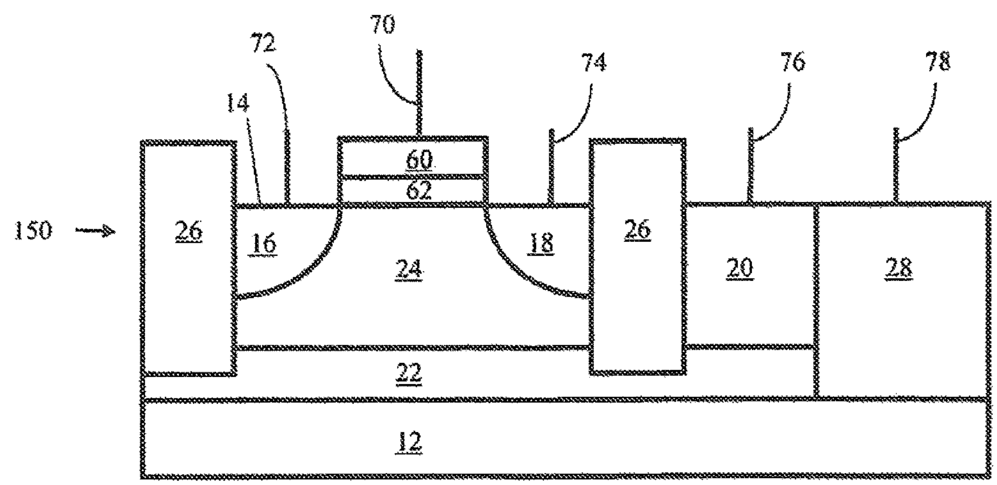
FIG. 23B is a schematic illustration of a memory cell according to another embodiment of the present invention showing contacts to the buried well and substrate regions.

Cell 150 further includes word line (WL) terminal 70 electrically connected to gate 60, source line (SL) terminal 72 electrically connected to one of regions 16 and 18 (connected to 16 as shown, but could, alternatively, be connected to 18), bit line (BL) terminal 74 electrically connected to the other of regions 16 and 18, buried well (BW) terminal 76 electrically connected to buried layer 22, and substrate terminal 78 electrically connected to substrate 12 at a location beneath buried layer 22. Contact to buried well region 22 could be made through region 20 having a second conductivity type, which is electrically connected to buried well region 22, while contact to substrate region 12 could be made through region 28 having a first conductivity type, which is electrically connected to substrate region 12, as shown in FIG. 23B In another embodiment, the memory cell 150 may be provided with p-type conductivity type as the first conductivity type and n-type conductivity type as the second conductivity type.

Figure 25:
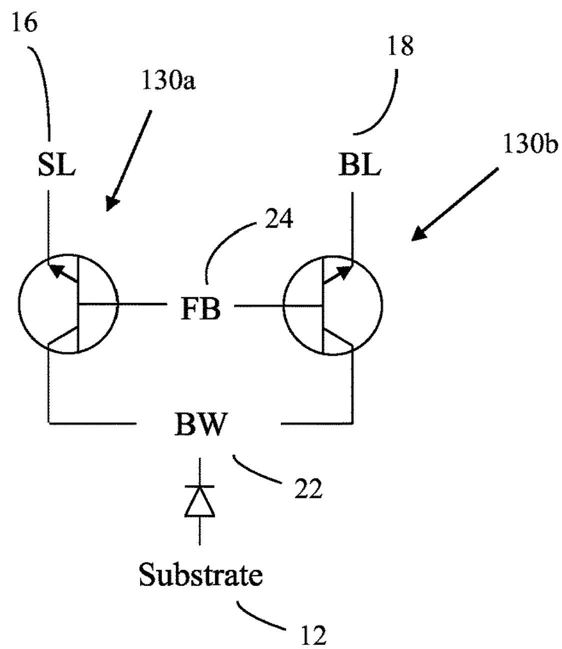
FIG. 25 schematically illustrates n-p-n bipolar devices inherent in the cell of FIGS. 23A-23B.

As shown in FIG. 25, inherent in this embodiment of the memory cell 150 are n-p-n bipolar devices 130*a,* 130*b* formed by buried well region 22, floating body 24, and SL and BL regions 16, 18. The memory cell operations will be described as follows. As will be seen, the operation principles of this embodiment of the memory cell 150 will follow the descriptions above, where the bias applied on the n-type substrate terminal 78 for the above described memory cell 50 is now applied to the n-type buried well terminal 76 of cell 150. The p-type substrate 12 of the current embodiment of the memory cell 150 will be grounded, reverse biasing the p-n junction between substrate 12 and buried well layer 22, thereby preventing any leakage current between substrate 12 and buried well layer 22.

A holding operation can be performed by applying a positive back bias to the BW terminal 76 while grounding terminal 72 and/or terminal 74. If floating body 24 is positively charged (i.e. in a state "1"), the bipolar transistor formed by SL region 16, floating body 24, and buried well region 22 and bipolar transistor formed by BL region 18, floating body 24, and buried well region 22 will be turned on.

A fraction of the bipolar transistor current will then flow into floating region 24 (usually referred to as the base current) and maintain the state "1" data. The efficiency of the holding operation can be enhanced by designing the bipolar devices 130*a*, 130*b* formed by buried well layer 22, floating region 24, and regions 16/18 to be a low-gain bipolar device, where the bipolar gain is defined as the ratio of the collector current flowing out of BW terminal 76 to the base current flowing into the floating region 24.

For memory cells in state "0" data, the bipolar devices 130*a*, 130*b* will not be turned on, and consequently no base hole current will flow into floating region 24. Therefore, memory cells in state "0" will remain in state "0".

The holding operation can be performed in mass, parallel manner as the BW terminal 76 (functioning as back bias terminal) is typically shared by all the cells 150 in the memory array 180, or at least by multiple cells 150 in a segment of the array 180. The BW terminal 76 can also be segmented to allow independent control of the applied bias on a selected portion of the memory array 180. Also, because BW terminal 76 is not used for memory address selection, no memory cell access interruption occurs due to the holding operation.

An example of the bias conditions applied to cell 150 to carry out a holding operation includes: zero voltage is applied to BL terminal 74, zero voltage is applied to SL terminal 72, zero or negative voltage is applied to WL terminal 70, a positive voltage is applied to the BW terminal 76, and zero voltage is applied to substrate terminal 78. In one particular non-limiting embodiment, about 0.0 volts is applied to terminal 72, about 0.0 volts is applied to terminal 74, about 0.0 volts is applied to terminal 70, about +1.2 volts is applied to terminal 76, and about 0.0 volts is applied to terminal 78. However, these voltage levels may vary.

Figure 26:
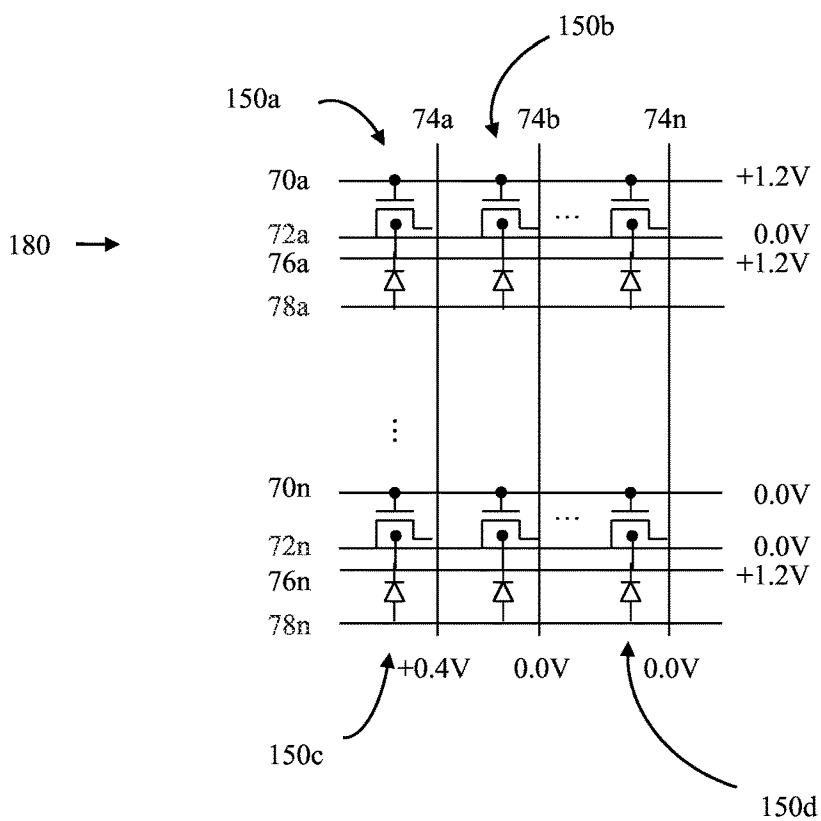
FIG. 26 illustrates an example of bias conditions on an array during performance of a read operation on a selected cell according to an embodiment of the present invention.

A read operation can be performed on cell 150 by applying the following bias conditions: a positive voltage is applied to the BW terminal 76, zero voltage is applied to SL terminal 72, a positive voltage is applied to the selected BL terminal 74, and a positive voltage greater than the positive voltage applied to the selected BL terminal 74 is applied to the selected WL terminal 70, while zero voltage is applied to substrate terminal 78. When cell 150 is in an array 180 of cells 150, the unselected BL terminals 74 (e.g., 74*b*, . . . , 74*n*) will remain at zero voltage and the unselected WL terminals 70 (e.g., 70*n* and any other WL terminals 70 not connected to selected cell 150*a*) will remain at zero or negative voltage. In one particular non-limiting embodiment, about 0.0 volts is applied to terminal 72, about +0.4 volts is applied to the selected terminal 74*a*, about +1.2 volts is applied to the selected terminal 70*a*, about +1.2 volts is applied to terminal 76, and about 0.0 volts is applied to terminal 78, as illustrated in FIG. 26. The unselected terminals 74 remain at 0.0 volts and the unselected terminal 70 remain at 0.0 volts as illustrated in FIG. 26. However, these voltage levels may vary while maintaining the relative relationships between voltage levels as generally described above. As a result of the bias conditions applied as described, the unselected memory cells (150*b*, 150*c* and 150*d*) will be at holding mode, maintaining the states of the respective floating bodies 24 thereof. Furthermore, the holding operation does not interrupt the read operation of the selected memory cell 150*a*.

To write "0" to cell 150, a negative bias is applied to SL terminal 72, zero or negative voltage is applied to WL terminal 70, zero or positive voltage is applied to BW terminal 76, and zero voltage is applied to substrate terminal 78. The SL terminal 72 for the unselected cells 150 that are not commonly connected to the selected cell 150*a* will remain grounded. Under these conditions, the p-n junctions (junction between 24 and 16 and between 24 and 18) are forward-biased, evacuating any holes from the floating body 24. In one particular non-limiting embodiment, about −2.0 volts is applied to terminal 72, about −1.2 volts is applied to terminal 70, about +1.2 volts is applied to terminal 76, and about 0.0 volts is applied to terminal 78. However, these voltage levels may vary, while maintaining the relative relationships between the charges applied, as described above.

The bias conditions for all the unselected cells are the same since the write "0" operation only involves applying a negative voltage to the SL terminal 72 (thus to the entire row). As can be seen, the unselected memory cells will be in holding operation, with both BL and SL terminals at about 0.0 volts.

Thus, the holding operation does not interrupt the write "0" operation of the memory cells. Furthermore, the unselected memory cells will remain in holding operation during a write "0" operation.

An alternative write "0" operation, which, unlike the previous write "0" operation described above, allows for individual bit write, can be performed by applying a positive voltage to WL terminal 70, a negative voltage to BL terminal 74, zero or positive voltage to SL terminal 72, zero or positive voltage to BW terminal 76, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction (junction between 24 and 16) is forward-biased, evacuating any holes from the floating body 24. The applied bias to selected WL terminal 70 and selected BL terminal 74 can potentially affect the states of the unselected memory cells 150 sharing the same WL or BL terminal as the selected memory cell 150. To reduce undesired write "0" disturb to other memory cells 150 in the memory array 180, the applied potential can be optimized as follows: If the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. This will minimize the floating body 24 potential change in the unselected cells 150 in state "1" sharing the same BL terminal as the selected cell 150 from $V_{FB1}$ to $V_{FB1}/2$. For memory cells 150 in state "0" sharing the same WL terminal as the selected cell 150, if the increase in floating body 24 potential is sufficiently high (i.e., at least $V_{FB}/3$, see below), then both n-p-n bipolar devices 130*a* and 130*b* will not be turned on or so that the base hold current is low enough that it does not result in an increase of the floating body 24 potential over the time during which the write operation is carried out (write operation time). It has been determined according to the present invention that a floating body 24 potential increase of $V_{FB}/3$ is low enough to suppress the floating body 24 potential increase. A positive voltage can be applied to SL terminal 72 to further reduce the undesired write "0" disturb on other memory cells 150 in the memory array. The unselected cells will remain at holding state, i.e. zero or negative voltage applied to WL terminal 70 and zero voltage applied to BL terminal 74. The unselected cells 150 not sharing the same WL or BL terminal as the selected cell 150 will remain at holding state, i.e., with zero or negative voltage applied to unselected WL terminal and zero voltage applied to unselected BL terminal 74.

Figure 27:
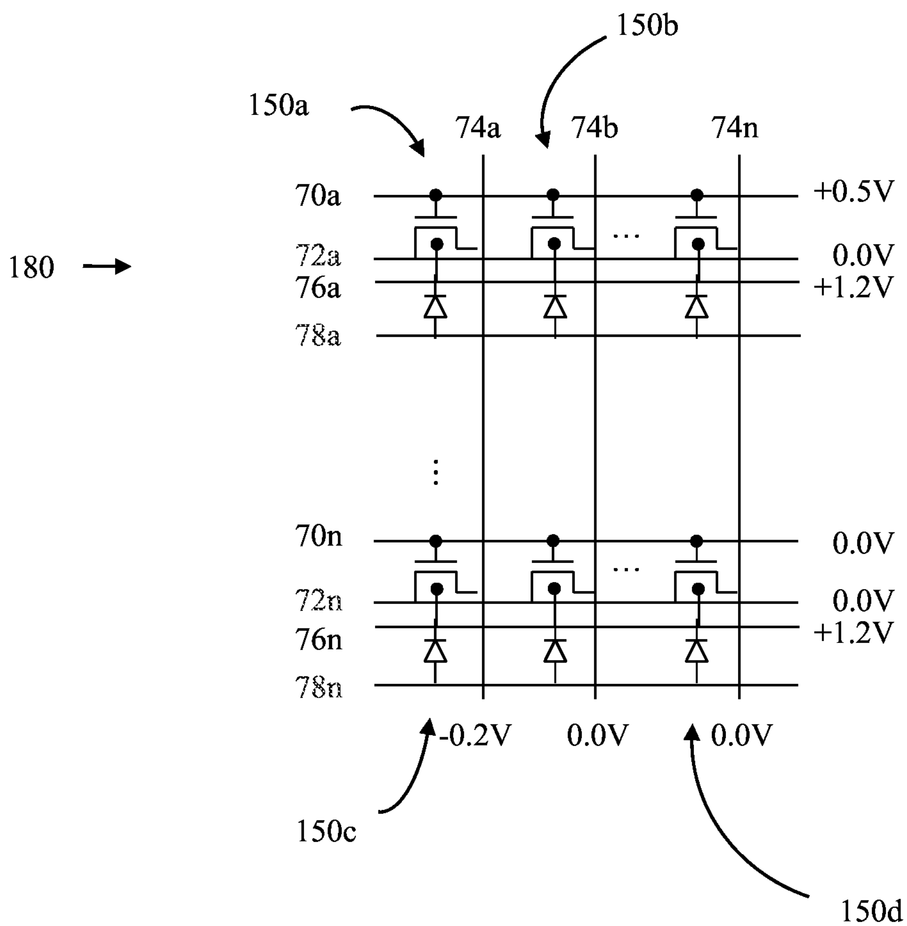
FIG. 27 illustrates bias conditions on a selected cell and unselected cells of an array during a write “0” operation on the selected cell according to an embodiment of the present invention.

In one particular non-limiting embodiment, for the selected cell 150 a potential of about 0.0 volts is applied to terminal 72, a potential of about −0.2 volts is applied to terminal 74, a potential of about +0.5 volts is applied to terminal 70, about +1.2 volts is applied to terminal 76, and about 0.0 volts is applied to terminal 78. For the unselected cells not sharing the same WL terminal or BL terminal with the selected memory cell 50, about 0.0 volts is applied to terminal 72, about 0.0 volts is applied to terminal 74, about 0.0 volts is applied to terminal 70, about +1.2 volts is applied to terminal 76, and about 0.0 volts is applied to terminal 78. FIG. 27 shows the bias conditions for the selected and unselected memory cells 150 in memory array 180. However, these voltage levels may vary.

Figure 28A:
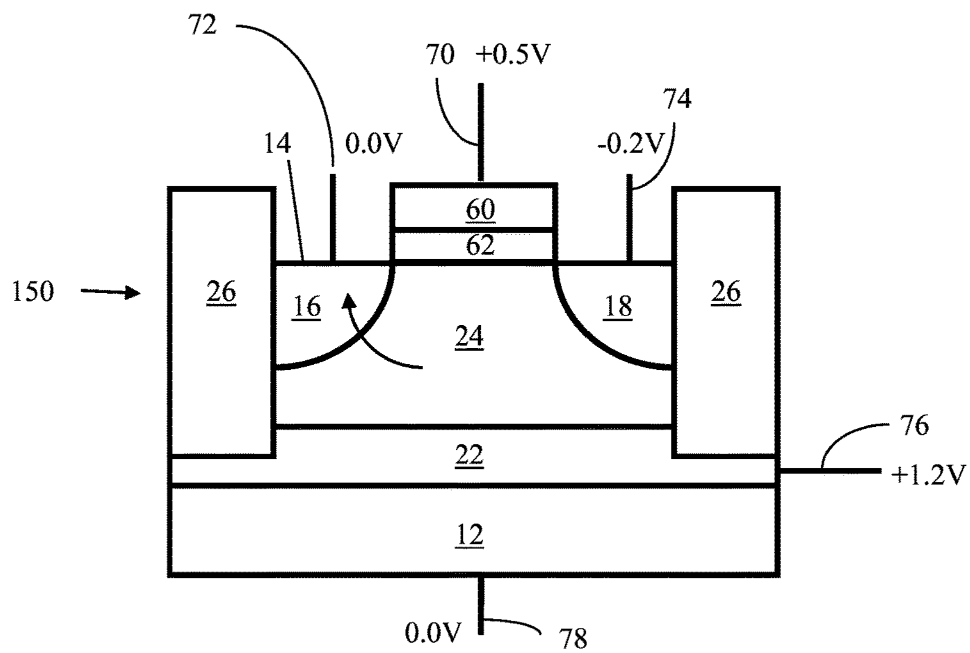
FIG. 28A illustrates an example of bias conditions on the selected memory cell of FIG. 27.
Figure 28B:
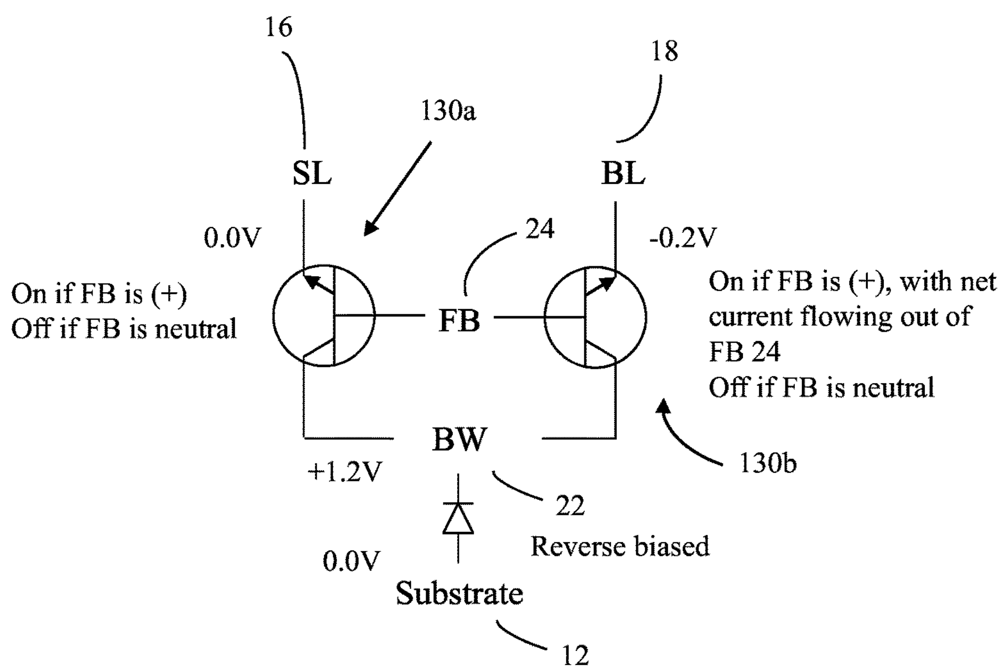
FIG. 28B shows an equivalent circuit diagram for the cell of FIG. 28A illustrating the intrinsic n-p-n bipolar devices.
Figure 28C:
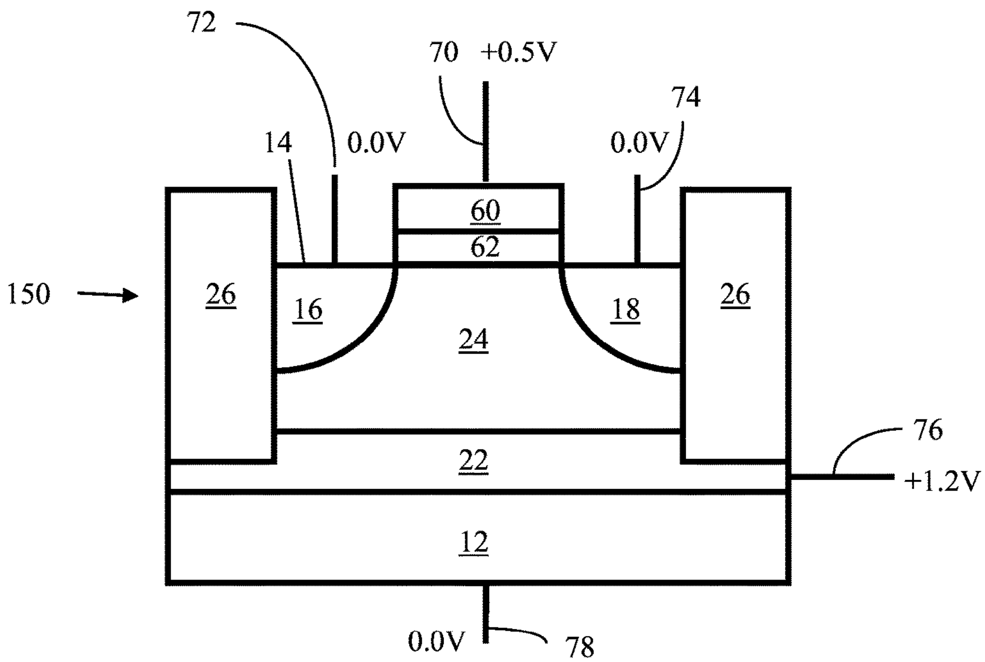
FIG. 28C illustrates an example of bias conditions on unselected memory cells sharing the same row as a selected memory cell in an array during a write “0” operation of the selected memory cell, according to the embodiment of FIG. 27.
Figure 28D:
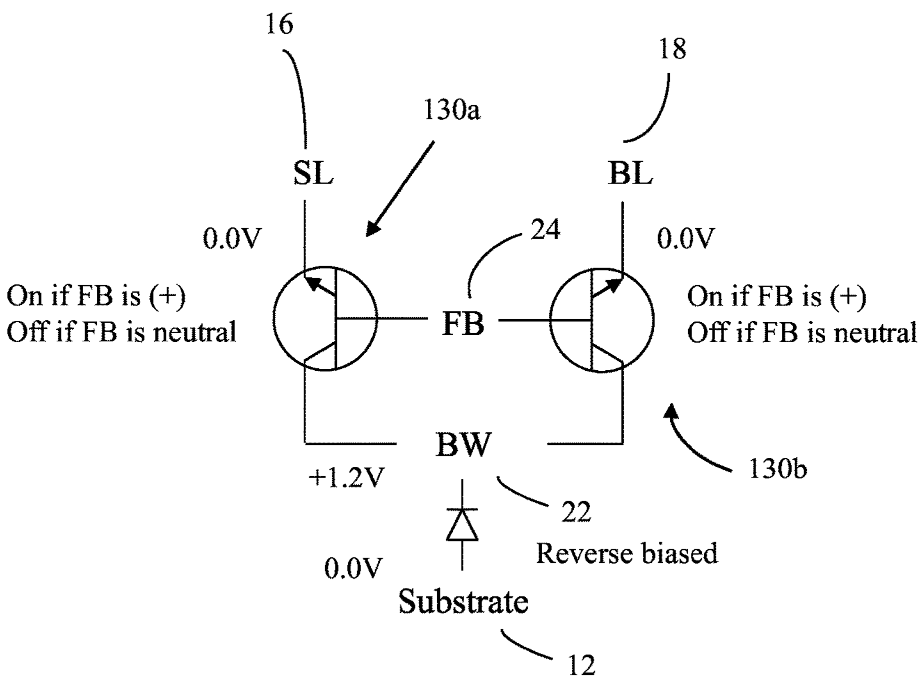
FIG. 28D shows an equivalent circuit diagram for the cell of FIG. 28C illustrating the intrinsic n-p-n bipolar devices.
Figure 28E:
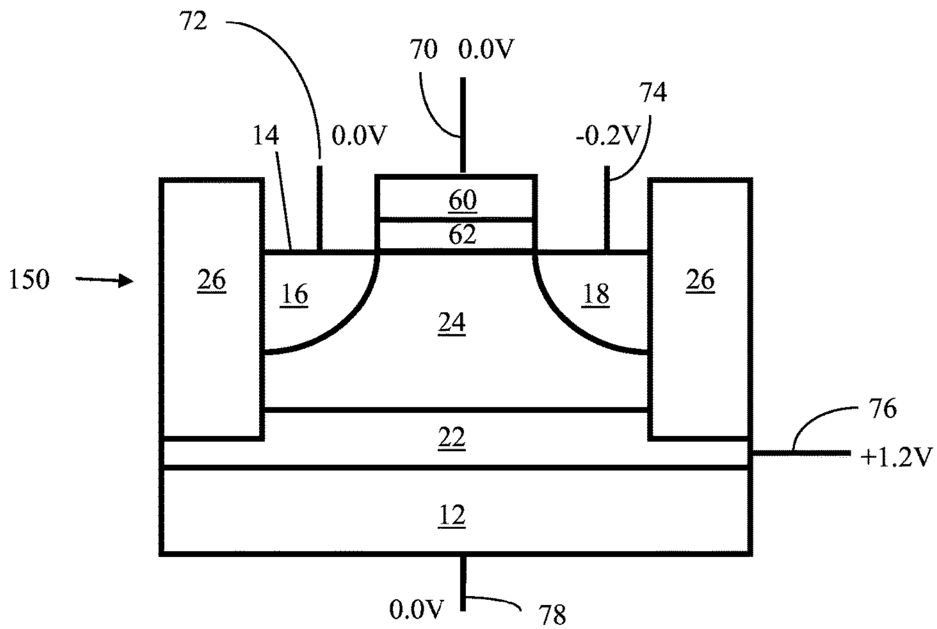
FIG. 28E illustrates an example of bias conditions on unselected memory cells sharing the same column as a selected memory cell in an array during a write “0” operation of the selected memory cell, according to the embodiment of FIG. 27.
Figure 28F:
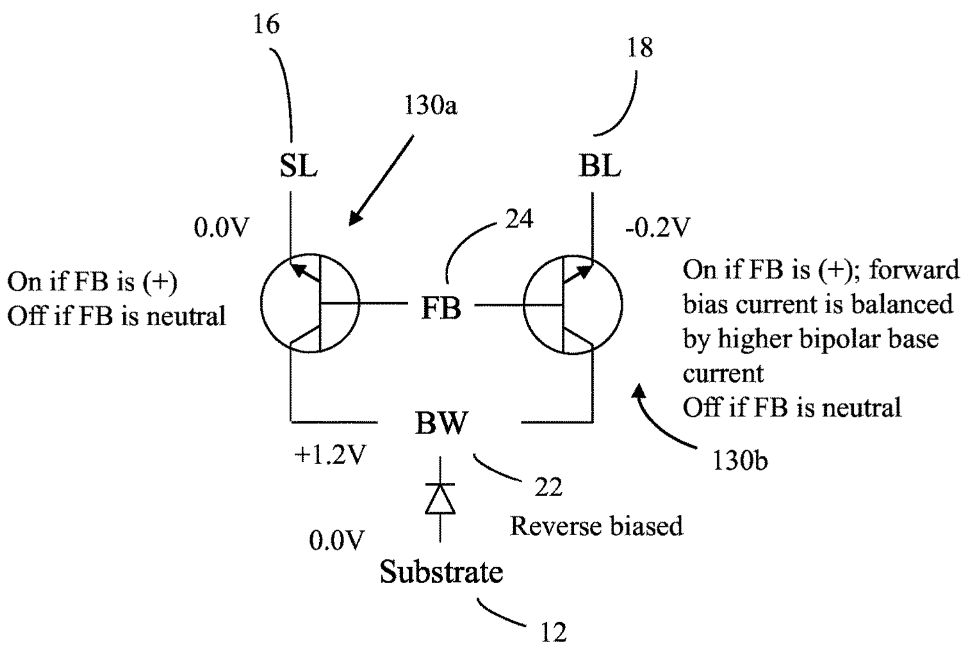
FIG. 28F shows an equivalent circuit diagram for the cell of FIG. 28E illustrating the intrinsic n-p-n bipolar devices.
Figure 28G:
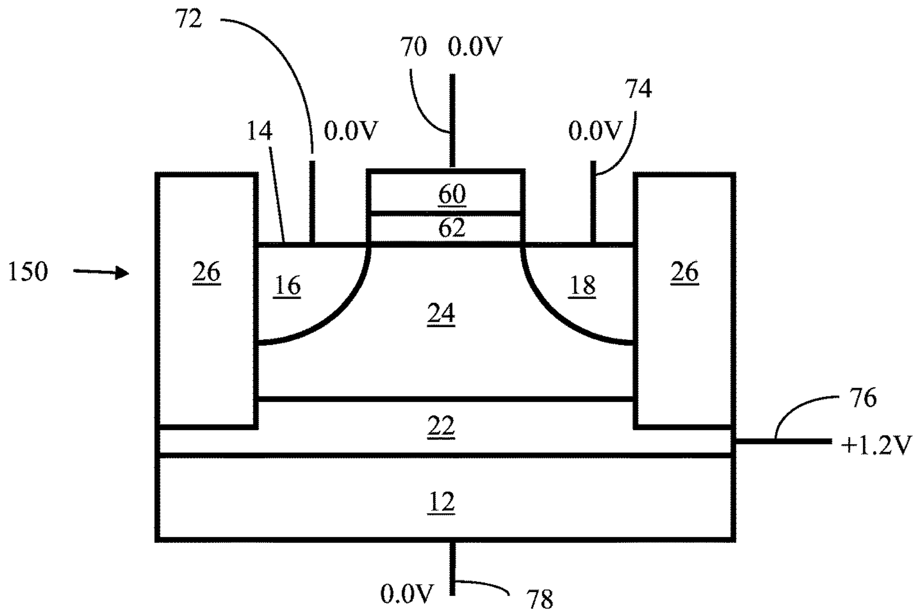
FIG. 28G illustrates an example of bias conditions on unselected memory cells that share neither the same row nor the same column as a selected memory cell in an array during a write "0" operation of the selected memory cell, according to the embodiment of FIG. 27.
Figure 28H:
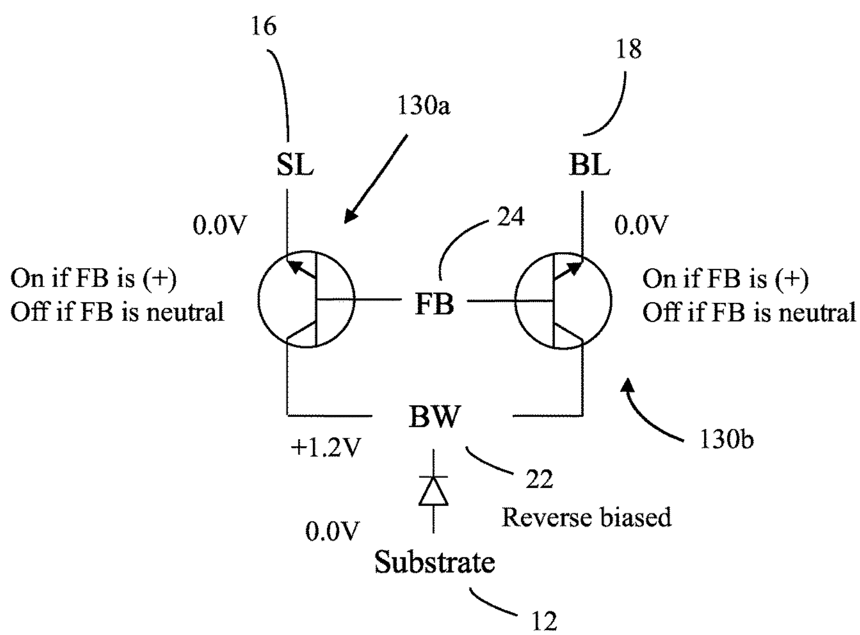
FIG. 28H shows an equivalent circuit diagram for the cell of FIG. 28G illustrating the intrinsic n-p-n bipolar devices.

An example of the bias conditions applied to a selected memory cell 150 during a write "0" operation is illustrated in FIGS. 28A-28B. An example of the bias conditions applied to the unselected memory cells 150 during write "0" operations are shown in FIGS. 28C-28H. The bias conditions for unselected memory cells 150 sharing the same row as selected memory cell 150*a* (e.g. memory cell 150*b* in FIG. 27) are shown in FIGS. 28C-28D. The bias conditions for unselected memory cells 150 sharing the same column as selected memory cell 150*a* (e.g. memory cell 150*c* in FIG. 27) are shown in FIGS. 28E-28H. The bias conditions for unselected memory cells 150 not sharing the same row or the same column as the selected memory cell 150*a* (e.g. memory cell 150*d* in FIG. 27) are shown in FIGS. 28G-28H.

During the write "0" operation (individual bit write "0" operation described above) in memory cell 150, the positive back bias applied to the BW terminal 76 of the memory cells 150 is necessary to maintain the states of the unselected cells 150, especially those sharing the same row or column as the selected cell 150*a,* as the bias condition can potentially alter the states of the memory cells 150 without the intrinsic bipolar device 130 (formed by buried well region 22, floating body 24, and regions 16, 18) re-establishing the equilibrium condition. Furthermore, the holding operation does not interrupt the write "0" operation of the memory cells 150.

A write "1" operation can be performed on memory cell 150 through an impact ionization mechanism or a band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003, which was incorporated by reference above.

Figure 29:
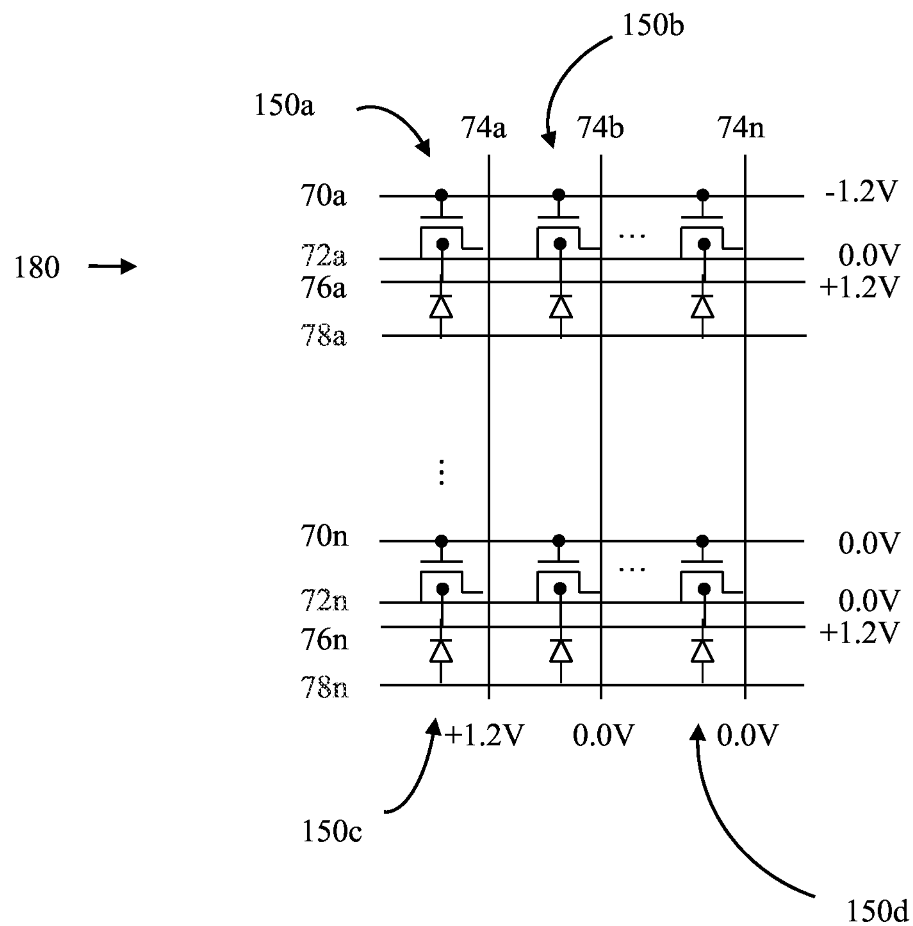
FIG. 29 illustrates an example of bias conditions applied to a selected memory cell under a band-to-band tunneling write "1" operation according to an embodiment of the present invention.

An example of bias conditions applied to selected memory cell 150*a* under a band-to-band tunneling write "1" operation is further elaborated and is shown in FIG. 29. The negative bias applied to the WL terminal 70*a* and the positive bias applied to the BL terminal 74*a* will result in hole injection to the floating body 24. The positive bias applied to the BW terminal 76*a* will maintain the resulting positive charge on the floating body 24 as discussed above. The unselected cells 150 will remain at the holding mode, with zero or negative voltage applied to the unselected WL terminal 70 (in FIG. 27, 70*n* and all other WL terminals 70 not connected to cell 150*a*) and zero voltage is applied to the unselected BL terminal 74*b,* 74*n* and all other BL terminals 74 not connected to cell 150*a*). The positive bias applied to the BW terminal 76 employed for the holding operations does not interrupt the write "1" operation of the selected memory cell(s). At the same time, the unselected memory cells 150 will remain in a holding operation during a write "1" operation on a selected memory cell 150.

Figure 6A:
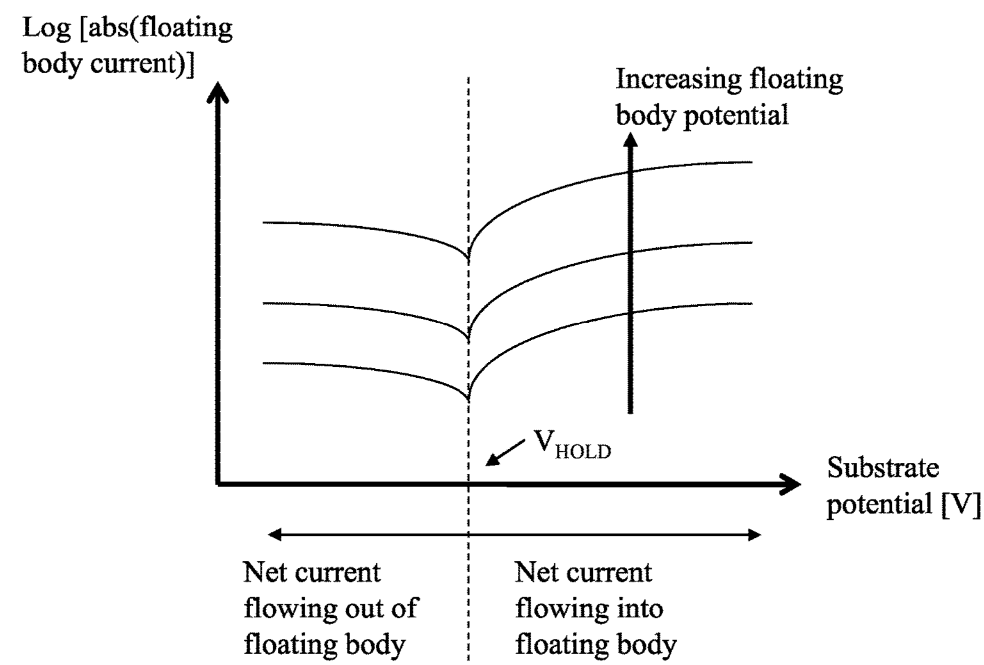
FIG. 6A graphs floating body potential as a function of floating body current and substrate potential according to an embodiment of the present invention.
Figure 6B:
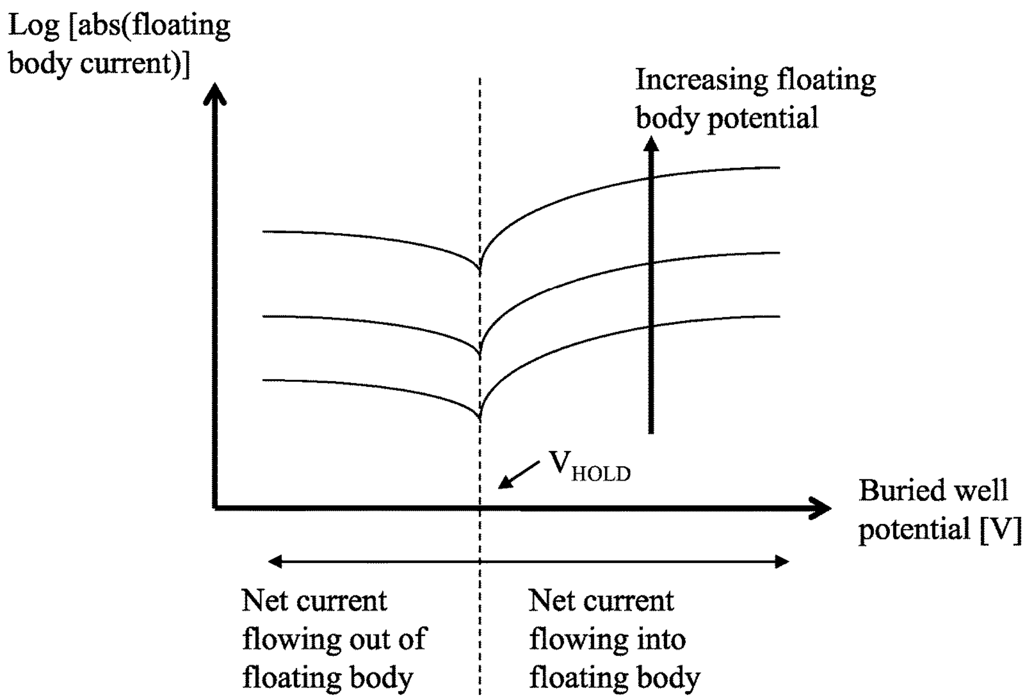
FIG. 6B graphs floating body potential as a function of floating body current and buried well potential according to an embodiment of the present invention.

A multi-level operation can also be performed on memory cell 150. A holding operation to maintain the multi-level states of memory cell 50 is described with reference to FIG. 6. The relationship between the floating body 24 current for different floating body 24 potentials as a function of the BW terminal 76 potential (FIG. 6B) is similar to that of floating body 24 current as a function of the substrate terminal 78 potential (FIG. 6A). As indicated in FIG. 6B, for different floating body potentials, at a certain BW terminal 76 potential $V_{HOLD}$, the current flowing into floating body 24 is balanced by the junction leakage between floating body 24 and regions 16 and 18. The different floating body 24 potentials represent different charges used to represent different states of memory cell 150. This shows that different memory states can be maintained by using the holding/standby operation described here.

A multi-level write operation without alternate write and read operations on memory cell 150 is now described. To perform this operation, zero voltage is applied to SL terminal 72, a positive voltage is applied to WL terminal 70, a positive voltage (back bias) is applied to BW terminal 76, and zero voltage is applied to substrate terminal 78, while the voltage of BL terminal 74 is ramped up. These bias conditions will result in a hole injection to the floating body 24 through an impact ionization mechanism. The state of the memory cell 150 can be simultaneously read for example by monitoring the change in the cell current through a read circuitry 90 coupled to the source line 72. The cell current measured in the source line direction (where source line current equals bit line current plus BW current and the currents are measured in the directions from buried well to source line and from bit line to source line) is a cumulative cell current of all memory cells 150 which share the same source line 72 (e.g. see FIGS. 16A-16C for examples of monitoring cell current in the source line direction. The same monitoring scheme can be applied to memory array 80 as well as memory array 180). As a result, only one memory cell 150 sharing the same source line 72 can be written. This ensures that the change in the cumulative cell current is a result of the write operation on the selected memory cell 150.

The applied bias conditions will result in hole injection to floating body 24 through an impact ionization mechanism. FIG. 17 shows the resulting increase of the floating body potential 24 over time. Once the change in cell current reaches the desired level associated with a state of the memory cell 150 (levels are schematically represented in FIG. 17), the voltage applied to BL terminal 74 can be removed. By applying a positive voltage to BW terminal 76, the resulting floating body 24 potential is maintained through base hole current flowing into floating body 24. In this manner, the multi-level write operation can be performed without alternate write and read operations.

In a similar manner, the multi-level write operation using impact ionization mechanism can also be performed by ramping the write current applied to BL terminal 74 instead of ramping the BL terminal 74 voltage.

In yet another embodiment, a multi-level write operation can be performed through a band-to-band tunneling mechanism by ramping the voltage applied to BL terminal 74, while applying zero voltage to SL terminal 72, a negative voltage to WL terminal 70, a positive voltage to BW terminal 76, and zero voltage to substrate terminal 78. The potential of the floating body 24 will increase as a result of the band-to-band tunneling mechanism. The state of the memory cell 50 can be simultaneously read for example by monitoring the change in the cell current through a read circuitry 90 coupled to the source line 72. Once the change in the cell current reaches the desired level associated with a state of the memory cell, the voltage applied to BL terminal 74 can be removed. If positive voltage is applied to substrate terminal 78, the resulting floating body 24 potential is maintained through base hole current flowing into floating body 24. In this manner, the multi-level write operation can be performed without alternate write and read operations.

Similarly, the multi-level write operation using band-to-band tunneling mechanism can also be performed by ramping the write current applied to BL terminal 74 instead of ramping the voltage applied to BL terminal 74.

Similarly, a read while programming operation can be performed by monitoring the change in cell current in the bit line 74 direction (where bit line current equals SL current plus BW current) through a reading circuitry 90 coupled to the bit line 74, for example as shown in FIG. 18A. For the current ramp operation, the voltage at the bit line 74 can be sensed, rather than sensing the cell current. The bit line voltage can be sensed, for example, using a voltage sensing circuitry, see FIG. 18B.

Another embodiment of memory cell 150 operations, which utilizes the silicon controlled rectifier (SCR) principle has been disclosed in U.S. patent application Ser. No. 12/533,661, filed Jul. 31, 2009, which was incorporated by reference, in its entirety, above.

Figure 30:
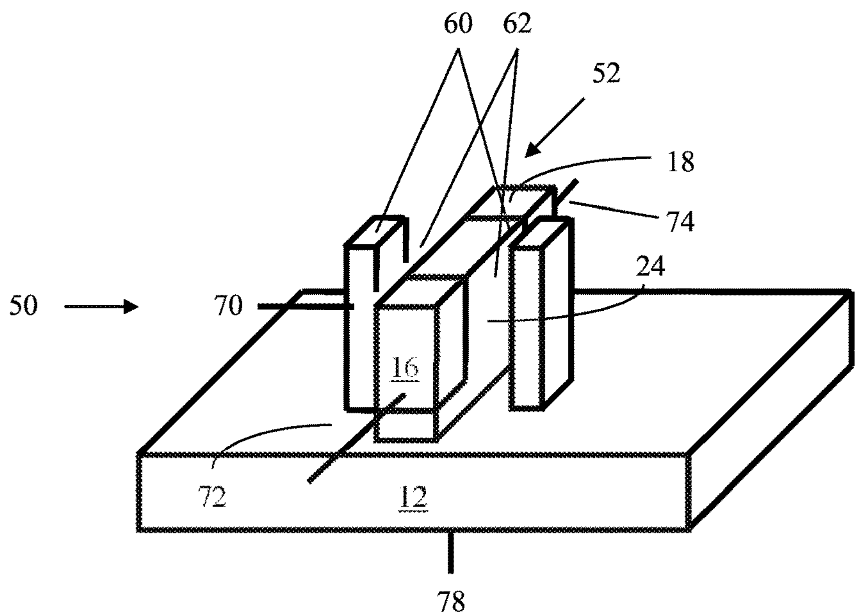
FIG. 30 is a schematic illustration of a memory cell according to another embodiment of the present invention.
Figure 31:
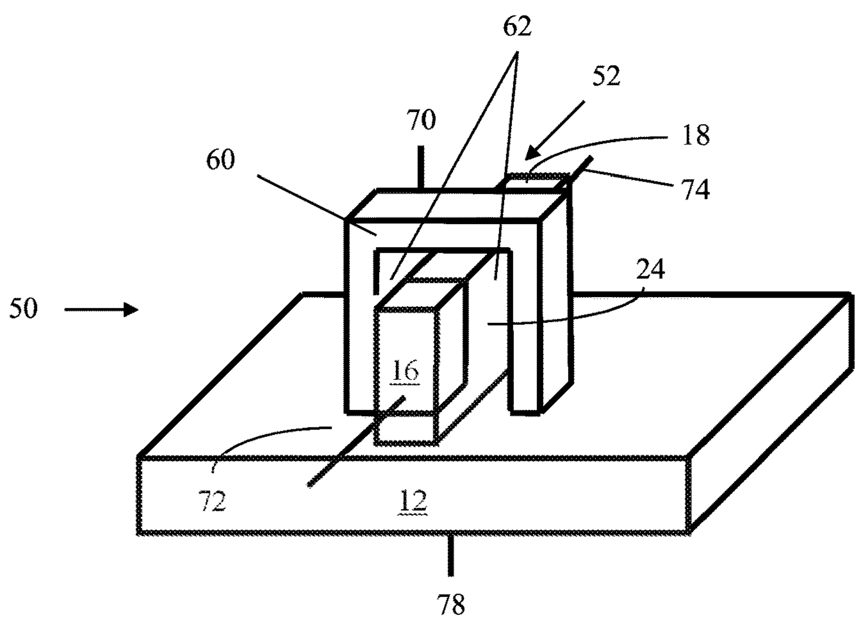
FIG. 31 is a schematic illustration of a memory cell according to another embodiment of the present invention.

FIGS. 30 and 31 show another embodiment of the memory cell 50 described in this invention. In this embodiment, cell 50 has a fin structure 52 fabricated on substrate 12 having a first conductivity type (such as n-type conductivity type) so as to extend from the surface of the substrate to form a three-dimensional structure, with fin 52 extending substantially perpendicularly to, and above the top surface of the substrate 12. Fin structure 52 includes first and second regions 16, 18 having the first conductivity type. The floating body region 24 is bounded by the top surface of the fin 52, the first and second regions 16, 18 and insulating layers 26 (insulating layers 26 can be seen in the top view of FIG. 34). Insulating layers 26 insulate cell 50 from neighboring cells 50 when multiple cells 50 are joined to make a memory device (array 80). The floating body region 24 is conductive having a second conductivity type (such as p-type conductivity type) and may be formed through an ion implantation process or may be grown epitaxially. Fin 52 is typically made of silicon, but may comprise germanium, silicon germanium, gallium arsenide, carbon nanotubes, or other semiconductor materials known in the art.

Memory cell device 50 further includes gates 60 on two opposite sides of the floating substrate region 24 as shown in FIG. 30. Alternatively, gates 60 can enclose three sides of the floating substrate region 24 as shown in FIG. 31. Gates 60 are insulated from floating body 24 by insulating layers 62. Gates 60 are positioned between the first and second regions 16, 18, adjacent to the floating body 24.

Device 50 includes several terminals: word line (WL) terminal 70, source line (SL) terminal 72, bit line (BL) terminal 74, and substrate terminal 78. Terminal 70 is connected to the gate 60. Terminal 72 is connected to first region 16 and terminal 74 is connected to second region 18. Alternatively, terminal 72 can be connected to second region 18 and terminal 74 can be connected to first region 16. Terminal 78 is connected to substrate 12.

Figure 32:
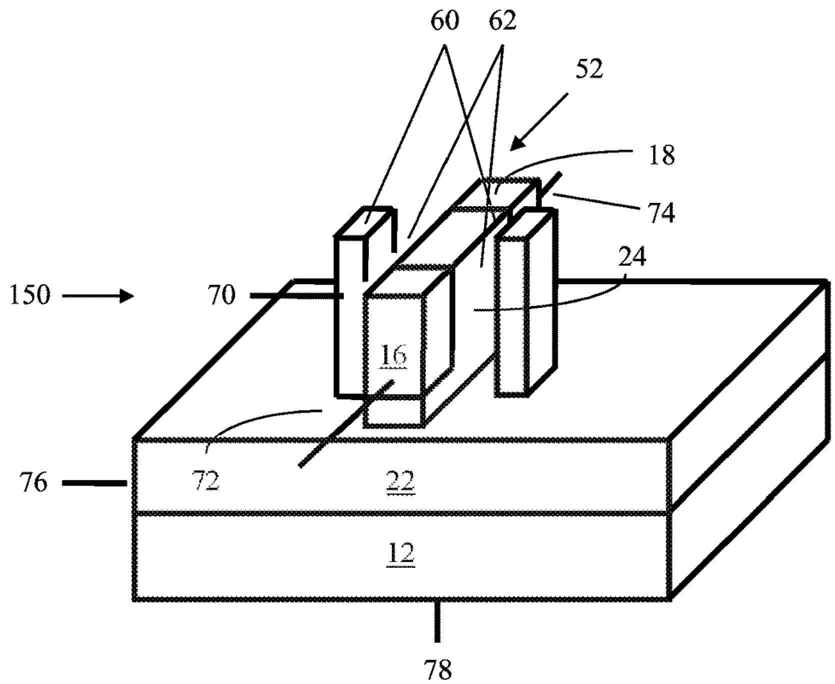
FIG. 32 is a schematic illustration of a memory cell according to another embodiment of the present invention.
Figure 33:
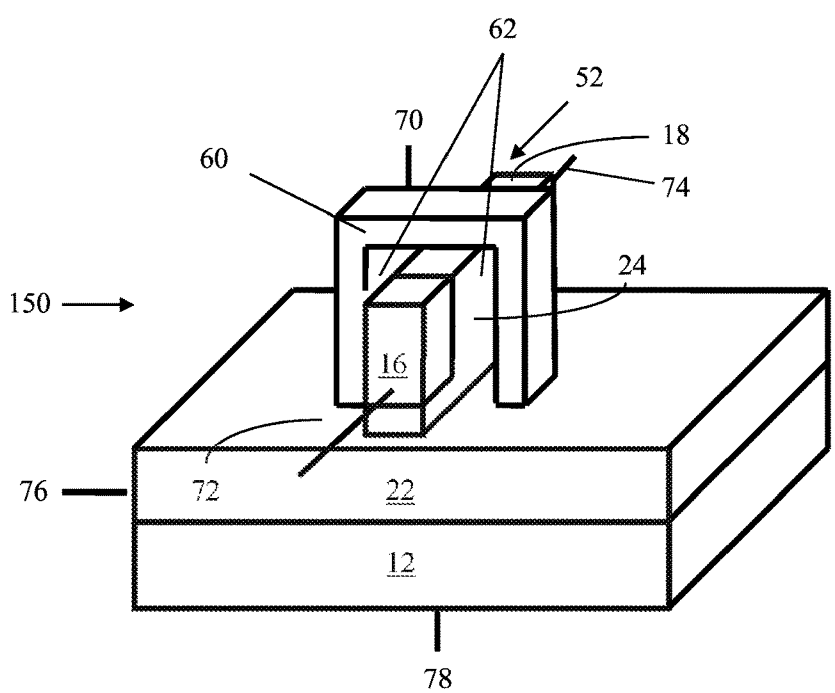
FIG. 33 is a schematic illustration of a memory cell according to another embodiment of the present invention.

FIGS. 32 and 33 show another embodiment of memory cell 150 described in this invention. In this embodiment, cell 150 has a fin structure 52 fabricated on substrate 12, so as to extend from the surface of the substrate to form a three-dimensional structure, with fin 52 extending substantially perpendicularly to, and above the top surface of the substrate 12. Fin structure 52 is conductive and is built on buried well layer 22. Region 22 may be formed by an ion implantation process on the material of substrate 12 or grown epitaxially. Buried well layer 22 insulates the floating substrate region 24, which has a first conductivity type (such as p-type conductivity type), from the bulk substrate 12. Fin structure 52 includes first and second regions 16, 18 having a second conductivity type (such as n-type conductivity type). Thus, the floating body region 24 is bounded by the top surface of the fin 52, the first and second regions 16, 18 the buried well layer 22, and insulating layers 26 (see FIG. 34). Insulating layers 26 insulate cell 150 from neighboring cells 150 when multiple cells 150 are joined to make a memory device. Fin 52 is typically made of silicon, but may comprise germanium, silicon germanium, gallium arsenide, carbon nanotubes, or other semiconductor materials known in the art.

Memory cell device 150 further includes gates 60 on two opposite sides of the floating substrate region 24 as shown in FIG. 32. Alternatively, gates 60 can enclose three sides of the floating substrate region 24 as shown in FIG. 33. Gates 60 are insulated from floating body 24 by insulating layers 62. Gates 60 are positioned between the first and second regions 16, 18, adjacent to the floating body 24.

Device 150 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 72 is connected to first region 16 and terminal 74 is connected to second region 18. Alternatively, terminal 72 can be connected to second region 18 and terminal 74 can be connected to first region 16. Terminal 76 is connected to buried layer 22 and terminal 78 is connected to substrate 12.

Figure 34:
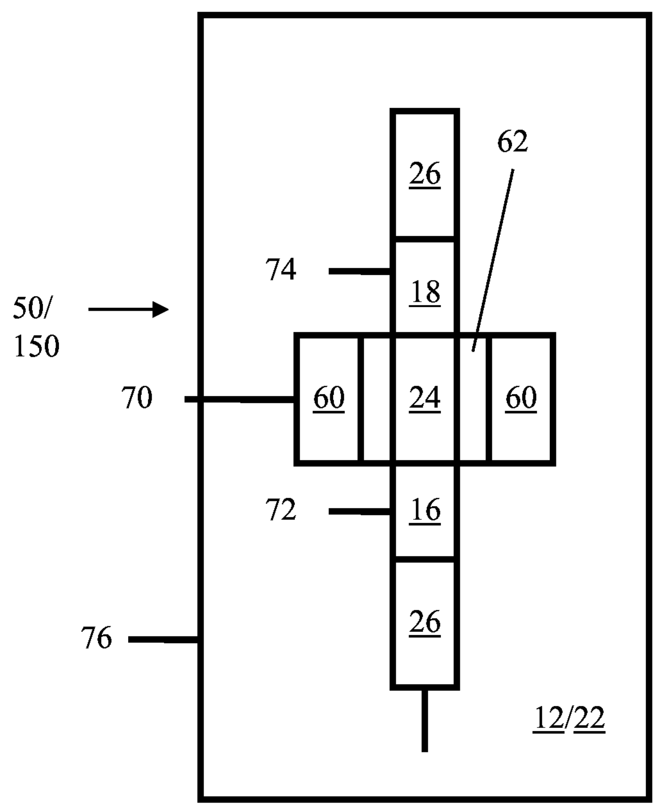
FIG. 34 is a top view, schematic illustration of a memory cell of FIGS. 30 and 32.

FIG. 34 illustrates the top view of the memory cells 50/150 shown in FIGS. 30 and 32.

From the foregoing it can be seen that with the present invention, a semiconductor memory with electrically floating body is achieved. The present invention also provides the capability of maintaining memory states or parallel non-algorithmic periodic refresh operations. As a result, memory operations can be performed in an uninterrupted manner. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In a floating body memory, the different memory states are represented by different levels of charge in the floating body. In "A Capacitor-less 1T-DRAM Cell", S. Okhonin et al., pp. 85-87, IEEE Electron Device Letters, vol. 23, no. 2, February 2002 ("Okhonin-1") and "Memory Design Using One-Transistor Gain Cell on SOI", T. Ohsawa et al., pp. 152-153, Tech. Digest, 2002 IEEE International Solid-State Circuits Conference, February 2002) ("Ohsawa-1"), a single bit (two voltage levels) in a standard MOSFET is contemplated. Others have described using more than two voltage levels stored in the floating body of a standard MOSFET allowing for more than a single binary bit of storage in a memory cell like, for example, "The Multistable Charge-Controlled Memory Effect in SOI Transistors at Low Temperatures", Tack et al., pp. 1373-1382, IEEE Transactions on Electron Devices, vol. 37, May 1990 ("Tack") which is incorporated by reference herein in its entirely, and U.S. Pat. No. 7,542,345 "Multi-bit memory cell having electrically floating body transistor, and method of programming and reading same" to Okhonin, et al ("Okhonin-2"). Tack describes obtaining more than two states in the floating body of a standard MOSFET built in SOI by manipulating the "back gate"—a conductive layer below the bottom oxide (BOX) of the silicon tub the MOSFET occupies. Okhonin-2 discloses attaining more than two voltage states in the floating body utilizing the intrinsic bipolar junction transistor (BJT) formed between the two source/drain regions of the standard MOSFET to generate read and write currents.

In memory design in general, sensing and amplifying the state of a memory cell is an important aspect of the design. This is true as well of floating body DRAM memories. Different aspects and approaches to performing a read operation are known in the art like, for example, the ones disclosed in "A Design of a Capacitor-less 1T-DRAM Cell Using Gate-Induced Drain Leakage (GIDL) Current for Low-power and High-speed Embedded Memory", Yoshida et al., pp. 913-918, International Electron Devices Meeting, 2003 ("Yoshida") which is incorporated by reference herein in its entirely; in U.S. Pat. No. 7,301,803 "Bipolar reading technique for a memory cell having an electrically floating body transistor" ("Okhonin-3") which is incorporated by reference herein in its entirely; and in "An 18.5 ns 128 Mb SOI DRAM with a Floating Body Cell", Ohsawa et al., pp. 458-459, 609, IEEE International Solid-State Circuits Conference, 2005 ("Ohsawa-2") which is incorporated by reference herein in its entirely. Both Yoshida and Okhonin-3 disclose a method of generating a read current from a standard MOSFET floating body memory cell manufactured in SOI-CMOS processes. Okhonin-3 describes using the intrinsic BJT transistor inherent in the standard MOSFET structure to generate the read current. Ohsawa-2 discloses a detailed sensing scheme for use with standard MOSFET floating body memory cells implemented in both SOI and standard bulk silicon.

Writing a logic-0 to a floating body DRAM cell known in the art is straight forward. Either the source line or the bit line is pulled low enough to forward bias the junction with the floating body removing the hole charge, if any. Writing a logic-1 typically may be accomplished using either a band-to-band tunneling method (also known as Gate Induced Drain Leakage or GIDL) or an impact ionization method In floating body DRAM cells, writing a logic-0 is straightforward (simply forward biasing either the source or drain junction of the standard MOSFET will evacuate all of the majority carriers in the floating body writing a logic-0) while different techniques have been explored for writing a logic-1. A method of writing a logic-1 through a gate induced band-to-band tunneling mechanism, as described for example in Yoshida. The general approach in Yoshida is to apply an appropriately negative voltage to the word line (gate) terminal of the memory cell while applying an appropriately positive voltage to the bit line terminal (drain) and grounding the source line terminal (source) of the selected memory cell. The negative voltage on WL terminal and the positive voltage on BL terminal creates a strong electric field between the drain region of the MOSFET transistor and the floating body region in the proximity of the gate (hence the "gate induced" portion of GIDL) in the selected memory cell. This bends the energy bands sharply upward near the gate and drain junction overlap region, causing electrons to tunnel from the valence band to the conduction band, leaving holes in the valence band. The electrons which tunnel across the energy band become the drain leakage current (hence the "drain leakage" portion of GIDL), while the holes are injected into floating body region 24 and become the hole charge that creates the logic-1 state. This process is well known in the art and is illustrated in Yoshida (specifically FIGS. 2 and 6 on page 3 and FIG. 9 on page 4).

A method of writing a logic-1 through impact ionization is described, for example, in "A New 1T DRAM Cell with Enhanced Floating Body Effect", Lin and Chang, pp. 23-27, IEEE International Workshop on Memory Technology, Design, and Testing, 2006, ("Lin") which is incorporated in its entirety by reference herein. The general approach in Lin is to bias both the gate and bit line (drain) terminals of the memory cell to be written at a positive voltage while grounding the source line (source). Raising the gate to a positive voltage has the effect of raising the voltage potential of the floating body region due to capacitive coupling across the gate insulating layer. This in conjunction with the positive voltage on the drain terminal causes the intrinsic n-p-n bipolar transistor (drain (n=collector) to floating body (p=base) to source (n=emitter)) to turn on regardless of whether or not a logic-1 or logic-0 is stored in the memory cell. In particular, the voltage across the reversed biased p-n junction between the floating body (base) and the drain (collector) will cause a small current to flow across the junction. Some of the current will be in the form of hot carriers accelerated by the electric field across the junction. These hot carriers will collide with atoms in the semiconductor lattice which will generate hole-electron pairs in the vicinity of the junction. The electrons will be swept into the drain (collector) by the electric field and become bit line (collector) current, while the holes will be swept into the floating body region, becoming the hole charge that creates the logic-1 state.

Much of the work to date has been done on SOL which is generally more expensive than a bulk silicon process. Some effort has been made to reduce costs of manufacturing floating body DRAMs by starting with bulk silicon. An example of a process to selectively form buried isolation region is described in "Silicon on Replacement Insulator (SRI) Floating Body Cell (FBC) Memory", S. Kim et al., pp. 165-166, Tech Digest, Symposium on VLSI Technology, 2010, ("S_Kim") which is incorporated in its entirety by reference herein. In S_Kim bulk silicon transistors are formed. Then the floating bodies are isolated by creating a silicon-on-replacement-insulator (SRI) structure. The layer of material under the floating body cells is selectively etched away and replaced with insulator creating an SOI type of effect. An alternate processing approach to selectively creating a gap and then filling it with an insulator is described in "A 4-bit Double SONOS Memory (DSM) with 4 Storage Nodes per Cell for Ultimate Multi-Bit Operation", Oh et al., pp. 58-59, Tech Digest, Symposium on VLSI Technology, 2006 ("Oh") which is incorporated in its entirety by reference herein.

Most work to date has involved standard lateral MOSFETs in which the source and drain are disposed at the surface of the semiconductor where they are coupled to the metal system above the semiconductor surface. A floating body DRAM cell using a vertical MOSFET has been described in "Vertical Double Gate Z-RAM technology with remarkable low voltage operation for DRAM application", J. Kim et al., pp. 163-164, Symposium of VLSI Technology, 2010, ("J_Kim") which is incorporated in its entirety by reference herein. In J_Kim, the floating body is bounded by a gate on two sides with a source region above and a buried drain region below. The drain is connected to a tap region, which allows a connection between a conductive plug at the surface to the buried drain region.

An alternate method of using a standard lateral MOSFET in a floating body DRAM cell is described in co-pending and commonly owned U.S. Patent Application Publication 2010/0034041 to Widjaja ("Widjaja"), which is incorporated in its entirety by reference herein. Widjaja describes a standard lateral MOSFET floating body DRAM cell realized in bulk silicon with a buried well and a substrate which forms a vertical silicon controlled rectifier (SCR) with a P1-N2-P3-N4 formed by the substrate, the buried well, the floating body, and the source (or drain) region of the MOSFET respectively. This structure behaves like two bipolar junction transistor (BJT) devices coupled together—one an n-p-n (N2-P3-N4) and one a p-n-p (P3-N2-P1)—which can be manipulated to control the charge on the floating body region (P3).

Figure 90A:
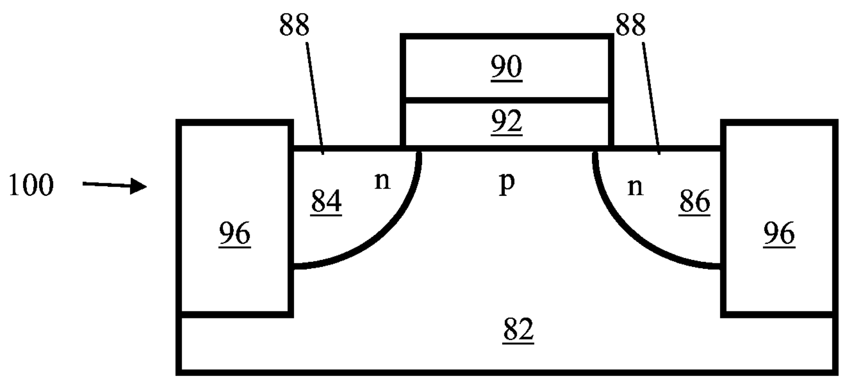

The construction and operation of standard MOSFET devices is well known in the art. An exemplary standard metal-oxide-semiconductor field effect transistor (MOSFET) device 100 is shown in FIG. 90A. MOSFET device 100 consists of a substrate region of a first conductivity type 82 (shown as p-type in the figure), and first and second regions 84 and 86 of a second conductivity type (shown as n-type) on the surface 88, along with a gate 90, separated from the semiconductor surface region by an insulating layer 92. Gate 90 is positioned in between the regions 84 and 86. Insulating layers 96 can be used to separate one transistor device from other devices on the silicon substrate 82.

Figure 90B:
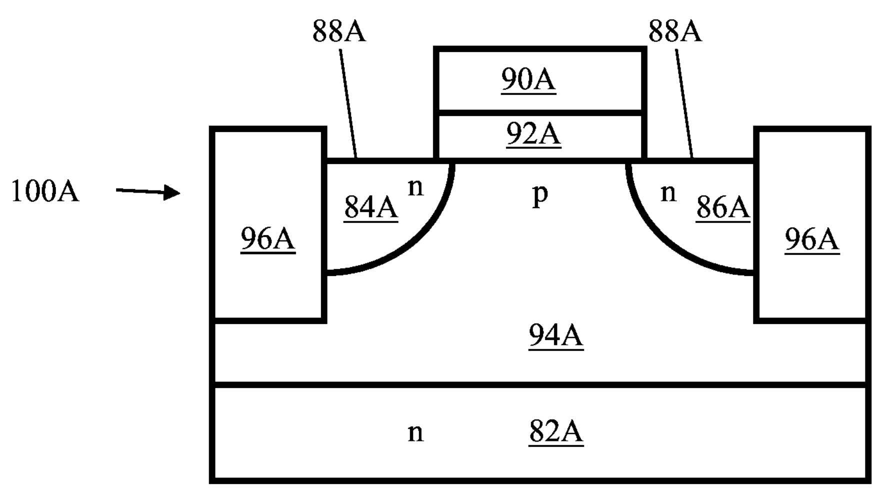

As shown in FIG. 90B, a standard MOSFET device 100A may also consist of a well region 94A of a first conductivity type (shown as p-type in the figure) in a substrate region 82A of a second conductivity type (shown as n-type in the figure), with first and second regions 84A and 86A of a second conductivity type on the surface 88A. In addition, a gate 90A, separated from the surface region 88A by an insulating layer 92A, is also present in between the first and second regions 84A and 86A. Insulating layers 96A can be used to separate one transistor device from other devices in the well region 94A. MOSFET devices 100 and 100A are both constructed in bulk silicon CMOS technology.

Figure 90C:
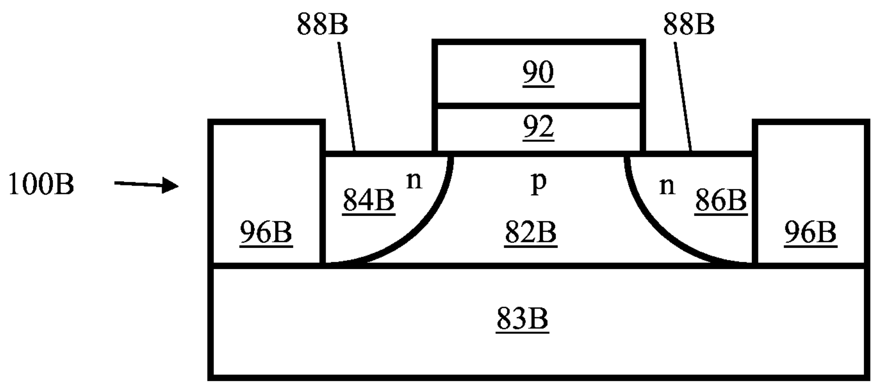

As shown in FIG. 90C, a standard MOSFET device 100B is shown constructed out of silicon-on-insulator technology. MOSFET device 100B consists of a tub region of a first conductivity type 82B (shown as p-type in the figure), and first and second regions 84B and 86B of a second conductivity type (shown as n-type) on the surface 88B, along with a gate 90B, separated from the semiconductor surface region by an insulating layer 92B. Gate 90B is positioned in between the regions 84B and 86B. The tub region 82B is isolated from other devices on the sides by insulating layers 96B and on the bottom by insulating layer 83B. Optionally, there may be a conductive layer affixed to the bottom of insulating layer 83B (not shown) which may be used as a "back gate" by coupling through the insulating layer 83B to the tub region 82B.

The transistors 100, 100A, and 100B are all called n-channel transistors because when turned on by applying an appropriate voltage to the gates 90, 90A and 90B respectively, the p-material under the gates is inverted to behave like n-type conductivity type for as long as the gate voltage is applied. This allows conduction between the two n-type regions 84 and 86 in MOSFET 100, 84A and 86A in MOSFET 100A and 84B and 86B in MOSFET 100B. As is well known in the art, the conductivity types of all the regions may be reversed (i.e., the first conductivity type regions become n-type and the second conductivity type regions become p-type) to produce p-channel transistors. In general, n-channel transistors are be preferred for use in memory cells (of all types and technologies) because of the greater mobility of the majority carrier electrons (as opposed to the majority carrier holes in p-channel transistors) allowing more read current for the same sized transistor, but p-channel transistors may be used as a matter of design choice.

The invention below describes a semiconductor memory device having an electrically floating body that utilizes a back bias region to further reduce the memory device size. One or more bits of binary information may be stored in a single memory cell. Methods of construction and of operation of the semiconductor device are also provided.

This disclosure uses the standard convention that p-type and n-type semiconductor "diffusion" layers or regions (regardless of how formed during manufacture) such as transistor source, drain or source/drain regions, floating bodies, buried layers, wells, and the semiconductor substrate as well as related insulating regions between the diffusion regions (like, for example, silicon dioxide whether disposed in shallow trenches or otherwise) are typically considered to be "beneath" or "below" the semiconductor surface—and the drawing figures are generally consistent with this convention by placing the diffusion regions at the bottom of the drawing figures. The convention also has various "interconnect" layers such as transistor gates (whether constructed of metal, p-type or n-type polysilicon or some other material), metal conductors in one or more layers, contacts between diffusion regions at the semiconductor surface and a metal layer, contacts between the transistor gates and a metal layer, vias between two metal layers, and the various insulators between them (including gate insulating layers between the gates and a diffusion at the semiconductor surface) are considered to be "above" the semiconductor surface—and the drawing figures are generally consistent with this convention placing these features, when present, near the top of the figures. One exception worth noting is that gates may in some embodiments be constructed in whole or in part beneath the semiconductor surface. Another exception is that some insulators may be partially disposed both above and below the surface. Other exceptions are possible. Persons of ordinary skill in the art will appreciate that the convention is used for ease of discussion with regards to the standard way of drawing and discussing semiconductor structures in the literature, and that a physical semiconductor in use in an application may be deployed at any angle or orientation without affecting its physical or electrical properties thereby.

The exemplary embodiments disclosed herein have at most one surface contact from the semiconductor region below the semiconductor surface to the interconnect region above the semiconductor surface within the boundary of the memory cell itself. This is in contrast to one-transistor (1T) floating body cell (FBC) DRAMs of the prior art which have two contacts—one for the source region and one for the drain region of the transistor. While some 1T FBC DRAM cells of the prior art can share the two contacts with adjacent cells resulting in an average of one contact per cell, some embodiments of the present invention can also share its contact with an adjacent cell averaging half a contact per cell.

The advantage of the present invention is in the elimination of one of the source/drain regions at the surface of the semiconductor region thereby eliminating the need to contact it at the surface. Compare, for example, FIG. 90B illustrating a prior art MOSFET with FIG. 35C illustrating an analogous cross section of one embodiment of the present invention. In any processing technology, the structure of FIG. 35C is inherently smaller than the structure of FIG. 90B. In some embodiments of the present invention, the gate terminal is removed as well further reducing the size of the memory cell. Compare, for example, the analogous cross sections of the structures in FIGS. 77C and 85C to the prior art MOSFET of FIG. 90B. This new class of memory cell is referred to as a "Half Transistor Memory Cell" as a convenient shorthand for identical, similar or analogous structures. A structure identical, similar or analogous to the structure of FIG. 35C is referred to as a "Gated Half Transistor Memory Cell." A structure identical, similar or analogous to the structures of FIGS. 77C and 85C is referred to as a "Gateless Half Transistor Memory Cell." The vertical arrangement of the diffusion regions beneath the semiconductor surface common to all half transistor memory cells—specifically a bit line region at the surface of the semiconductor (allowing coupling to a bit line disposed above the semiconductor surface), a floating body region (for storing majority charge carriers, the quantity of majority carriers determining the logical state of the data stored in memory cell), and a source line region (completely beneath the semiconductor surface within the boundary of the memory cell allowing coupling to a source line running beneath the semiconductor surface, typically running beneath and coupling to a plurality of memory cells), wherein the bit line region, the floating body, and the source line region form a vertical bipolar junction transistor that is used operatively and constructed deliberately by design for use in a floating body DRAM memory cell application—is referred to as a "Half Transistor."

Persons of ordinary skill in the art will appreciate that the following embodiments and methods are exemplary only for the purpose of illustrating the inventive principles of the invention. Many other embodiments are possible and such alternate embodiments and methods will readily suggest themselves to such skilled persons after reading this disclosure and examining the accompanying drawing. Thus the disclosed embodiments are exemplary only and the present invention is not to be limited in any way except by the appended claims.

Drawing figures in this specification, particularly diagrams illustrating semiconductor structures, are drawn to facilitate understanding through clarity of presentation and are not drawn to scale. In the semiconductor structures illustrated, there are two different conductivity types: p-type where the majority charge carriers are positively charged holes that typically migrate along the semiconductor valence band in the presence of an electric field, and n-type where the majority charge carriers are negatively charged electrons that typically migrate along the conduction band in the presence of an electric field. Dopants are typically introduced into an intrinsic semiconductor (where the quantity of holes and electrons are equal and the ability to conduct electric current is low: much better than in an insulator, but far worse than in a region doped to be conductive—hence the "semi-" in "semiconductor") to create one of the conductivity types.

When dopant atoms capable of accepting another electron (known and "acceptors") are introduced into the semiconductor lattice, the "hole" where an electron can be accepted becomes a positive charge carrier. When many such atoms are introduced, the conductivity type becomes p-type and the holes resulting from the electrons being "accepted" are the majority charge carriers. Similarly, when dopant atoms capable of donating another electron (known and "donors") are introduced into the semiconductor lattice, the donated electron becomes a negative charge carrier. When many such atoms are introduced, the conductivity type becomes n-type and the "donated" electrons are the majority charge carriers.

As is well known in the art, the quantities of dopant atoms used can vary widely over orders of magnitude of final concentration as a matter of design choice. However it is the nature of the majority carries and not their quantity that determines if the material is p-type or n-type. Sometimes in the art, heavily, medium, and lightly doped p-type material is designated p+, p and p− respectively while heavily, medium, and lightly doped n-type material is designated n+, n and n− respectively. Unfortunately, there are no precise definitions of when a "+" or a "−" is an appropriate qualifier, so to avoid overcomplicating the disclosure the simple designations p-type and n-type abbreviated "p" or "n" respectively are used without qualifiers throughout this disclosure. Persons of ordinary skill in the art will appreciate that there are many considerations that contribute to the choice of doping levels in any particular embodiment as a matter of design choice.

Numerous different exemplary embodiments are presented. In many of them there are common characteristics, features, modes of operation, etc. When like reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 35A:
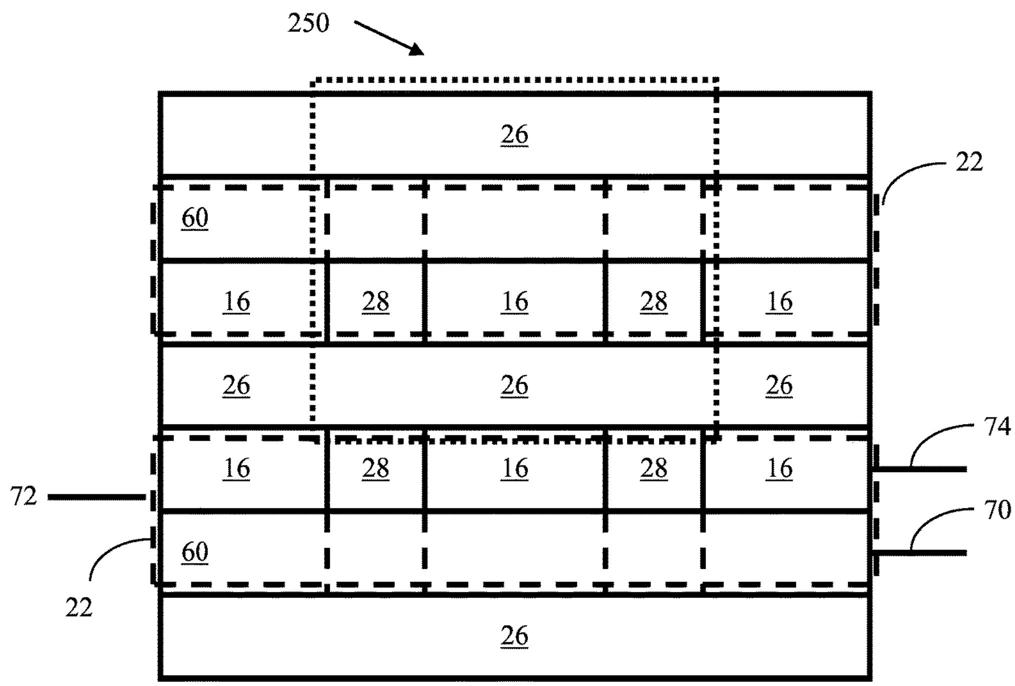
FIGS. 35A through 35E illustrate an array and details of a first exemplary memory cell according to the present invention.
Figure 35B:
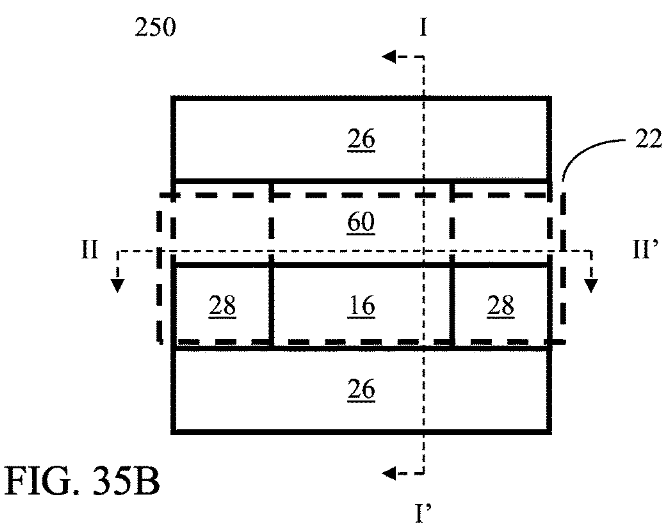
Figure 35C:
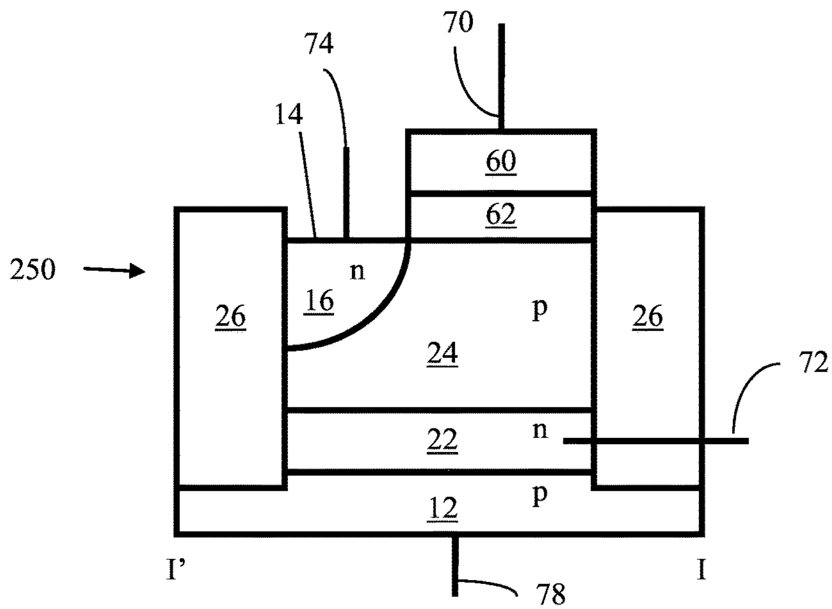
Figure 35D:
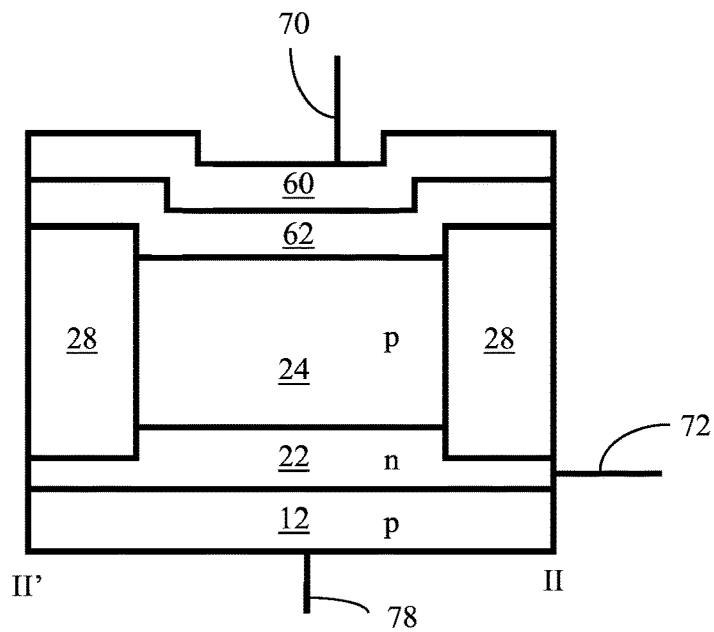
Figure 35E:
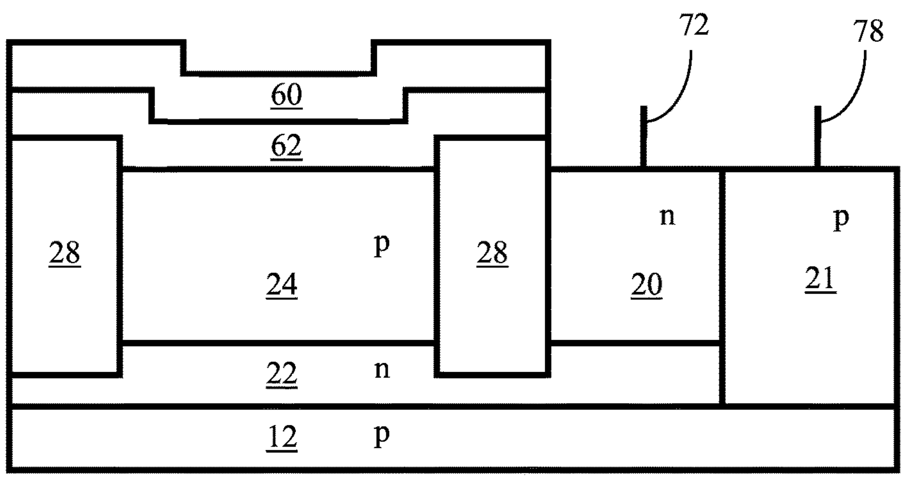

FIGS. 35A through 35E illustrate an embodiment of a gated half transistor FBC DRAM memory cell according to the present invention. FIG. 35A shows a top view of an embodiment of a partial memory array including memory cell 250 (shown by a dotted line) and FIG. 35B shows memory cell 250 in isolation. FIGS. 35C and 35D show the memory cell 250 cross sections along the I-I' line and II-II' cut lines, respectively, while FIG. 35E shows a method for electrically contacting the buried well and substrate layers beneath the cell.

Referring to FIGS. 35C and 35D together, the cell 250 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. In some embodiments of the invention, substrate 12 can be the bulk material of the semiconductor wafer. In other embodiments, substrate 12 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 12 will usually be drawn as the semiconductor bulk material as it is in FIGS. 35C and 35D.

A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by bit line region 16 and insulating layer 62, on the sides by insulating layers 26 and 28, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments, as a matter of design choice.

Figure 38A:
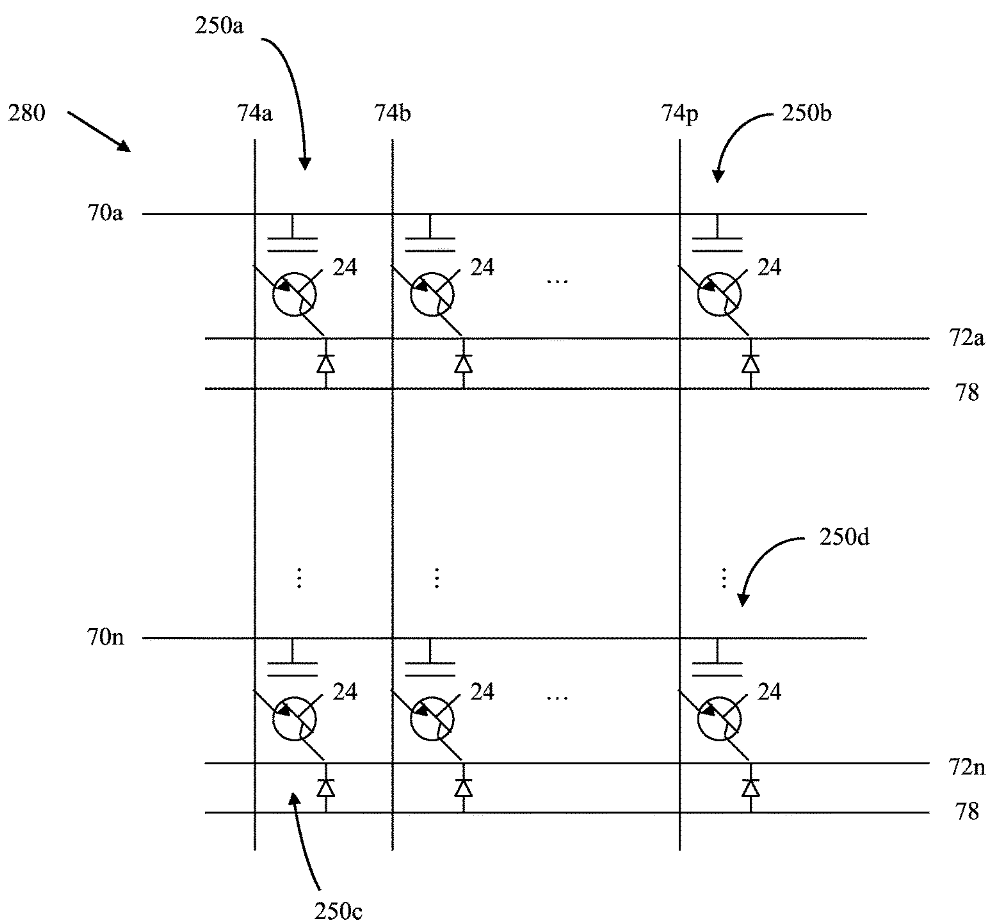
FIGS. 38A through 38D illustrate methods of maintaining the state of the data stored in an array of memory cells according to the present invention.
Figure 38B:
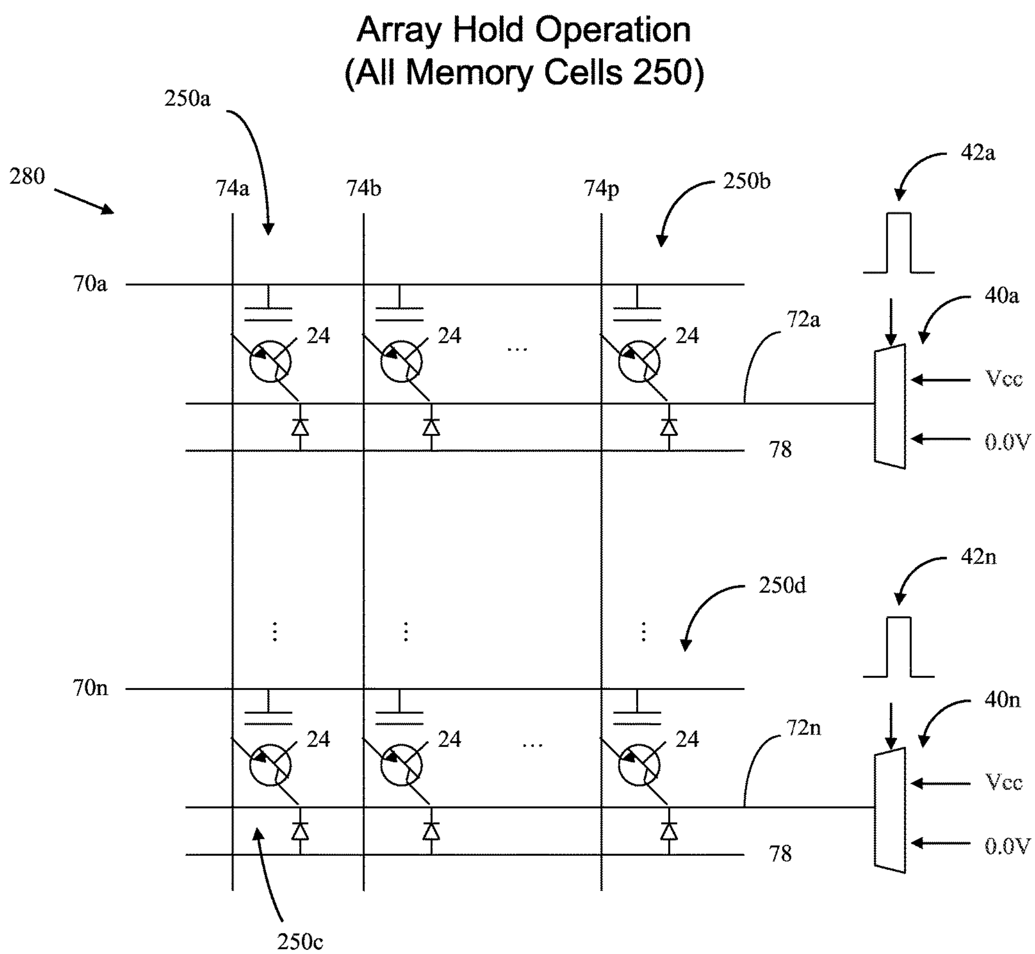
Figure 38C:
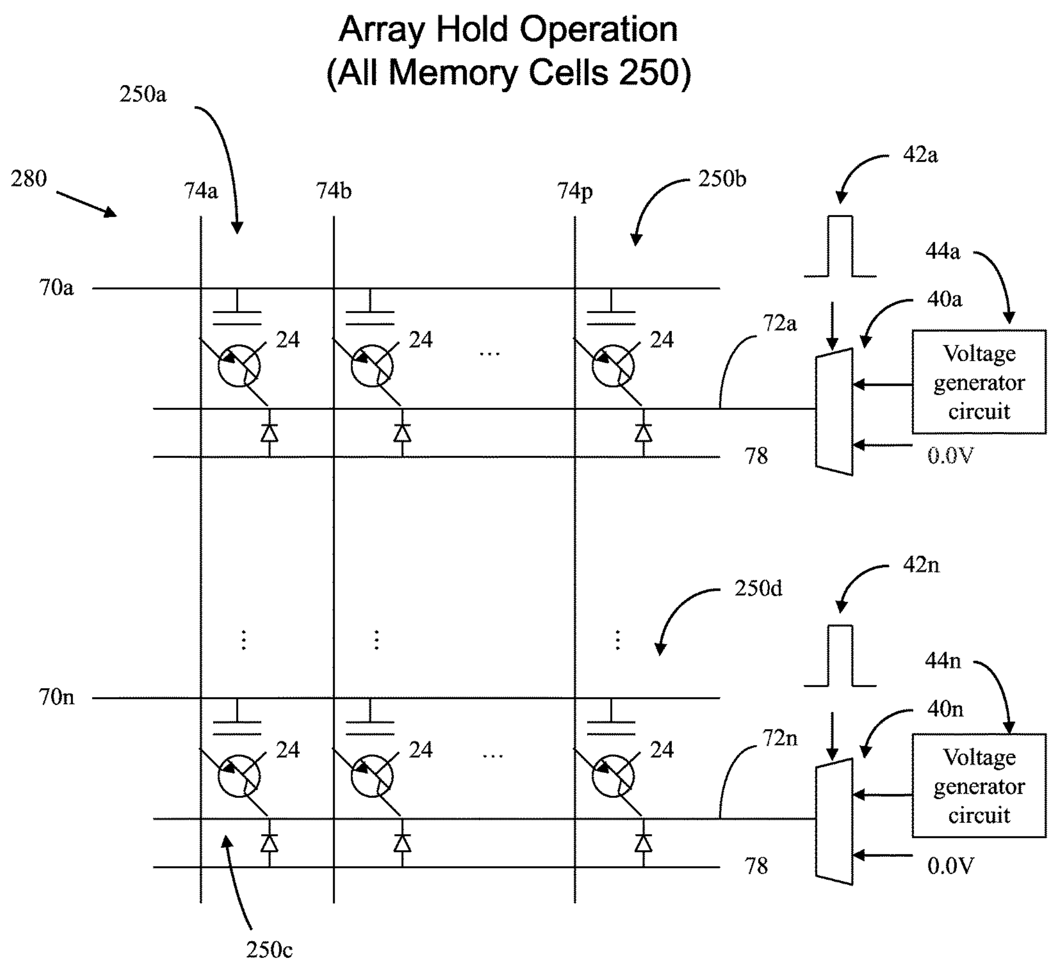

Insulating layers 26 and 28 (like, for example, shallow trench isolation (STI)), may be made of silicon oxide, for example, though other insulating materials may be used. Insulating layers 26 and 28 insulate cell 250 from neighboring cells 250 when multiple cells 250 are joined in an array 280 to make a memory device as illustrated in FIGS. 38A-38C. Insulating layer 26 insulates both body region 24 and buried region 22 of adjacent cells (see FIG. 35C), while insulating layer 28 insulates neighboring body region 24, but not the buried layer 22, allowing the buried layer 22 to be continuous (i.e. electrically conductive) in one direction (along the II-II' direction as shown in FIG. 35D). This connecting of adjacent memory cells together through buried layer 22 forming a source line beneath adjacent memory cells 250 allows the elimination of a contacted source/drain region or an adjacent contacted plug inside the memory cell required in memory cells of the prior art. As can be seen in FIGS. 35A and 35B, there is no contact to the buried layer 22 at the semiconductor surface inside the boundary of memory cell 250.

A bit line region 16 having a second conductivity type, such as n-type, for example, is provided in floating body region 24 and is exposed at surface 14. Bit line region 16 is formed by an implantation process formed on the material making up substrate 12, according to any implantation process known and typically used in the art. Alternatively, a solid state diffusion process could be used to form bit line region 16.

A gate 60 is positioned in between the bit line region 16 and insulating layer 26 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Cell 250 further includes word line (WL) terminal 70 electrically connected to gate 60, bit line (BL) terminal 74 electrically connected to bit line region 16, source line (SL) terminal 72 electrically connected to buried layer 22, and substrate terminal 78 electrically connected to substrate 12.

As shown in FIG. 35E, contact between SL terminal 72 and buried layer 22 can be made through region 20 having a second conductivity type, and which is electrically connected to buried well region 22, while contact between substrate terminal 78 and substrate region 12 can be made through region 21 having a first conductivity type, and which is electrically connected to substrate region 12.

The SL terminal 72 connected to the buried layer region 22 serves as a back bias terminal, i.e. a terminal at the back side of a semiconductor transistor device, usually at the opposite side of the gate of the transistor coupled to the body or bulk of the device corresponding to region 82 in transistor 100 of FIG. 90A or region 94A in transistor 100A in FIG. 90B. In a floating body DRAM cell, a conductive coupling to the floating body would be counterproductive since it would cease to be a floating body with such a connection. In some embodiments, the p-n junction between the floating body 24 and the buried well 22 coupled to the source line terminal 72 is forward biased to be conductive by applying a negative voltage to the source line terminal 72. In some embodiments, the SL terminal is biased to a positive voltage potential to maintain the charge in the floating body region 24. In some embodiments, the source line terminal 72 is used in a manner similar to the source line in floating body DRAM cells of the prior art. Thus in various embodiments SL terminal 72 may be used in a manner similar to a back bias terminal, or it may be used like a source line, or it may be used for another purpose entirely. In some embodiments it may be used in two or more of these ways in different operations. Thus both the terms "source line terminal" and "back bias terminal" are used interchangeably in this specification and should be deemed equivalent.

Comparing the structure of the memory device 250, for example, as shown in FIG. 35C to the structure of transistor devices 100, 100A and 100B in FIGS. 90A through 90C, it can be seen that the memory device of present invention constitutes a smaller structure relative to the MOSFET devices 100, 100A and 100B, where only one region of a second conductivity type is present at the surface of the silicon substrate. Thus, memory cell 250 of the present invention provides an advantage that it consists of only one region of second conductivity at the surface (i.e. bit line region 16 as opposed to regions 84 and 86 or regions 84A and 86A) and hence requires only one contact per memory cell 250 (i.e. to create a connection between bit line region 16 and terminal 74).

Persons of ordinary skill in the art will appreciate that in FIGS. 35A through 35E and that the first and second conductivity types can be reversed in memory cell 250 as a matter of design choice and that the labeling of regions of the first conductivity type as p-type and the second conductivity type as p-type is illustrative only and not limiting in any way. Thus the first and second conductivity types can be p-type and n-type respectively in some embodiments of memory cell 50 and be n-type and p-type respectively in other embodiments. Further, such skilled persons will realize that the relative doping levels of the various regions of either conductivity type will also vary as a matter of design choice, and that there is no significance to the absence of notation signifying higher or lower doping levels such as p+ or p− or n+ or n− in any of the diagrams.

Figure 36A:
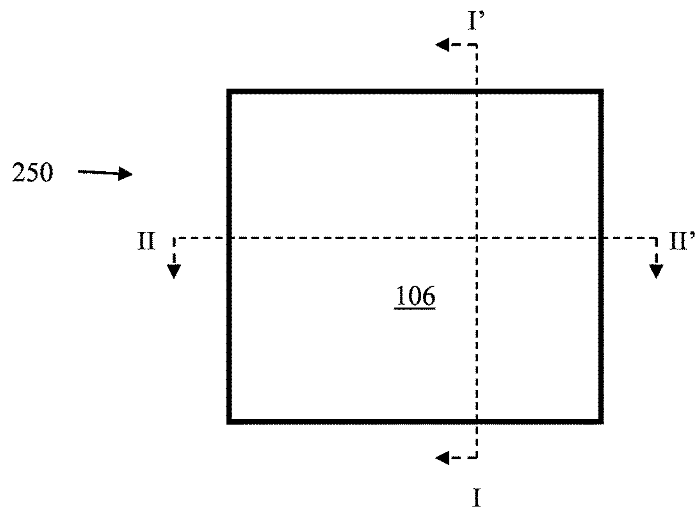
FIGS. 36A through 36U illustrate a method of manufacturing a memory cell according to the present invention.

A method of manufacturing memory cell 250 will be described with reference to FIGS. 36A through 36U. These 21 figures are arranged in groups of three related views, with the first figure of each group being a top view, the second figure of each group being a vertical cross section of the top view in the first figure of the group designated I-I', and the third figure of each group being a horizontal cross section of the top view in the first figure of the group designated Thus FIGS. 36A, 36D, 36G, 36J, 36M, 36P and 36S are a series of top views of the memory cell 50 at various stages in the manufacturing process, FIGS. 36B, 36E, 36H, 36K, 36N, 36Q and 36T are their respective vertical cross sections labeled I-I', and FIGS. 36C, 36F, 36I, 36L, 36O, 36R and 36U are their respective horizontal cross sections labeled Identical reference numbers from FIGS. 35A through 35E appearing in FIGS. 36A through 36U represent similar, identical or analogous structures as previously described in conjunction with the earlier drawing figures. Here “vertical” means running up and down the page in the top view diagram and “horizontal” means running left and right on the page in the top view diagram. In a physical embodiment of memory cell 50, both cross sections are vertical with respect to the surface of the semiconductor device.

Figure 36B:
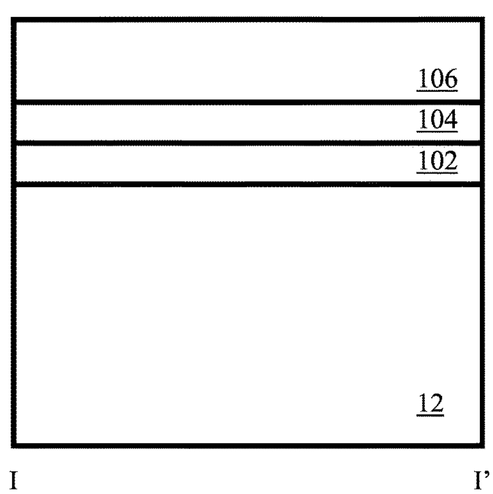
Figure 36C:
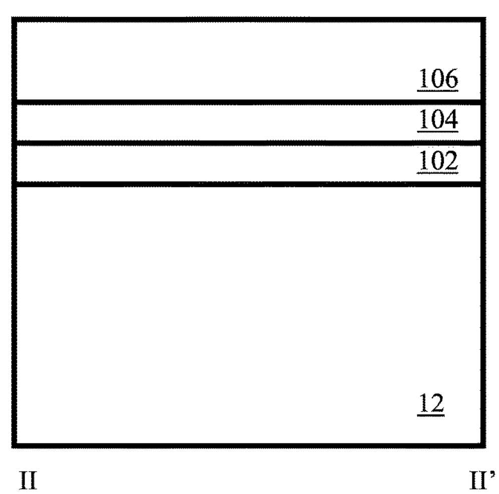

Turning now to FIGS. 36A through 36C, the first steps of the process are seen. In an exemplary 130 nanometer (nm) process a thin silicon oxide layer 102 with a thickness of about 100 A may be grown on the surface of substrate 12. This may be followed by a deposition of about 200 A of polysilicon layer 104. This in turn may be followed by deposition of about 1200 A silicon nitride layer 106. Other process geometries like, for example, 250 nm, 180 nm, 90 nm, 65 nm, etc., may be used. Similarly, other numbers of, thicknesses of, and combinations of protective layers 102, 104 and 106 may be used as a matter of design choice.

Figure 36D:
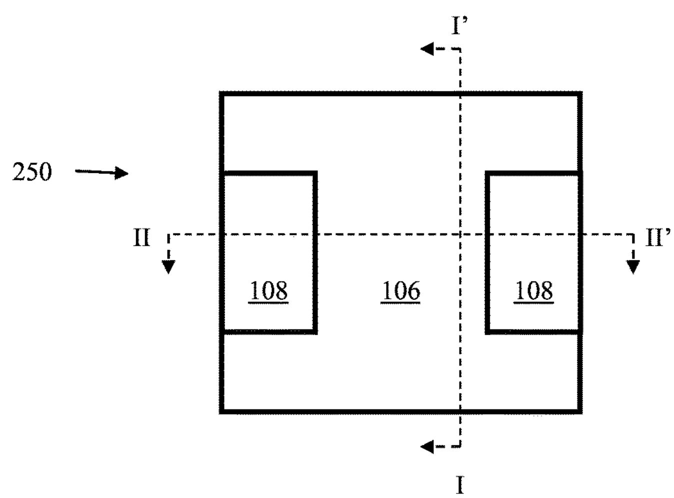
Figure 36E:
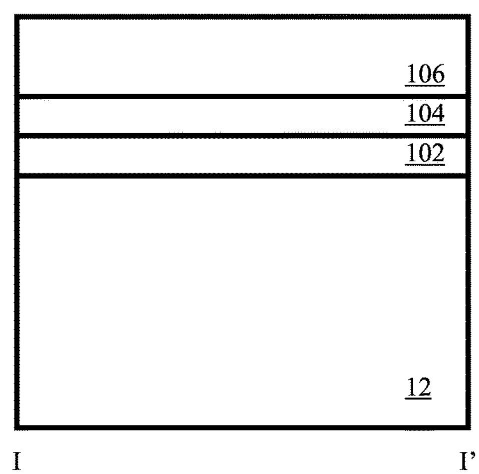
Figure 36F:
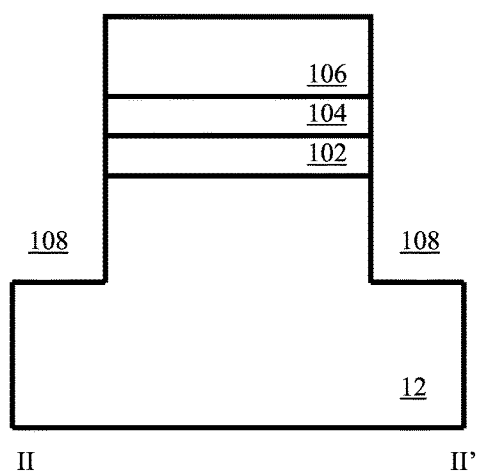

As shown in FIGS. 36D through 36F, a pattern opening the areas to become trench 108 may be formed using a lithography process. Then the silicon oxide 102, polysilicon 104, silicon nitride 106 layers may be subsequently patterned using the lithography process and then may be etched, followed by a silicon etch process, creating trench 108.

Figure 36G:
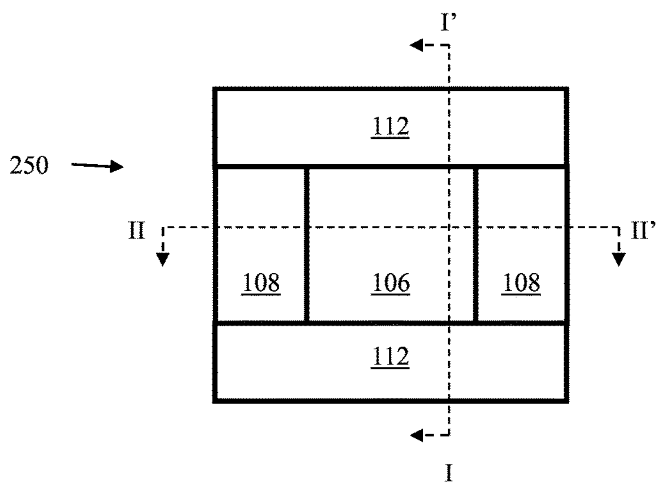
Figure 36H:
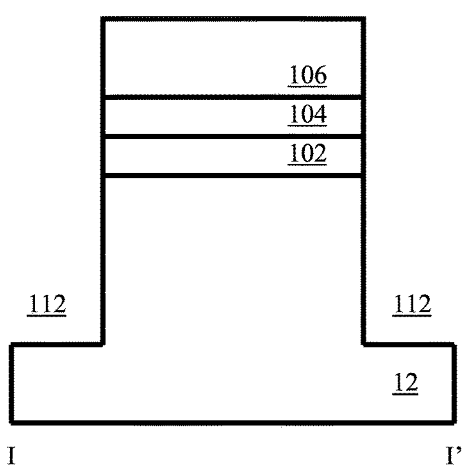
Figure 36I:
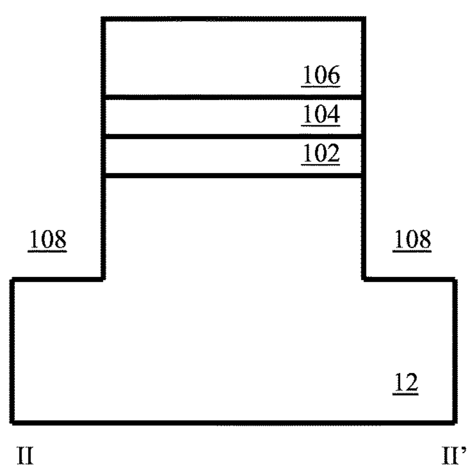

As shown in FIGS. 36G through 36I, a pattern opening the areas to become trenches 112 may be formed using a lithography process, which may be followed by etching of the silicon oxide 102, polysilicon 104, silicon nitride layers 106, and a silicon trench etch process, creating trench 112. The trench 112 is etched such that the trench depth is deeper than that of trench 108. In an exemplary 130 nm process, the trench 108 depth may be about 1000 A and the trench 112 depth may be about 2000 A. Other process geometries like, for example, 250 nm, 180 nm, 90 nm, 65 nm, etc., may be used. Similarly, other trench depths may be used as a matter of design choice.

Figure 36J:
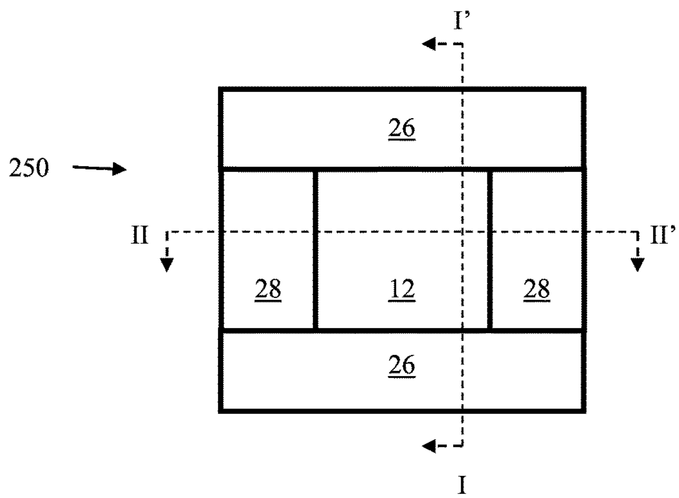
Figure 36K:
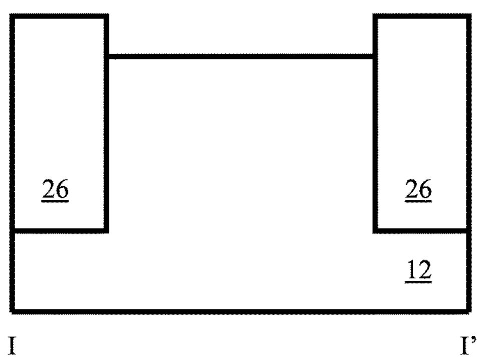
Figure 36L:
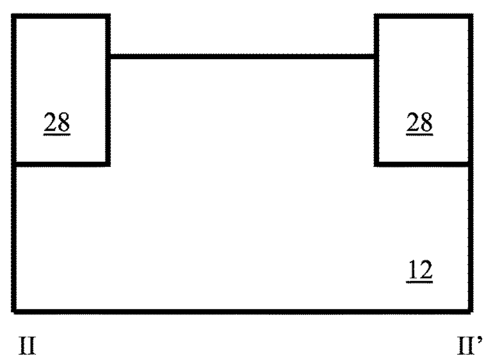

As shown in FIGS. 36J through 36L, this may be followed by a silicon oxidation step, which will grow silicon oxide films in trench 108 and trench 112 which will become insulating layers 26 and 28. In an exemplary 130 nm process, about 4000 A silicon oxide nay be grown. A chemical mechanical polishing step can then be performed to polish the resulting silicon oxide films so that the silicon oxide layer is flat relative to the silicon surface. A silicon dry etching step can then be performed so that the remaining silicon oxide layer height of insulating layers 26 and 28 may be about 300 A from the silicon surface. In other embodiments the top of insulating layers 26 and 28 may be flush with the silicon surface. The silicon nitride layer 106 and the polysilicon layer 104 may then be removed which may then be followed by a wet etch process to remove silicon oxide layer 102 (and a portion of the silicon oxide films formed in the area of former trench 108 and former trench 112). Other process geometries like, for example, 250 nm, 180 nm, 90 nm, 65 nm, etc., may be used. Similarly, other insulating layer materials, heights, and thicknesses as well as alternate sequences of processing steps may be used as a matter of design choice.

Figure 36M:
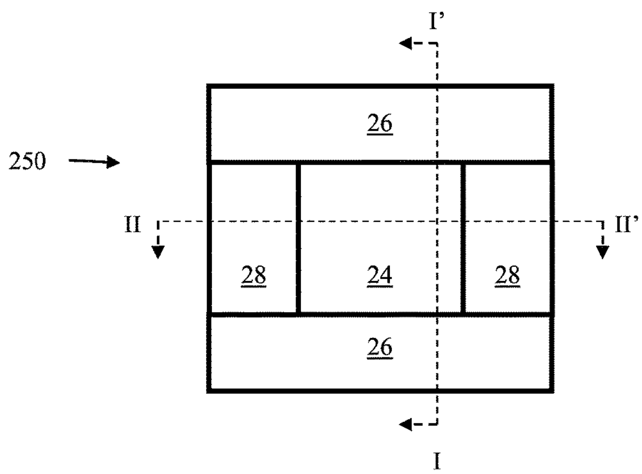
Figure 36N:
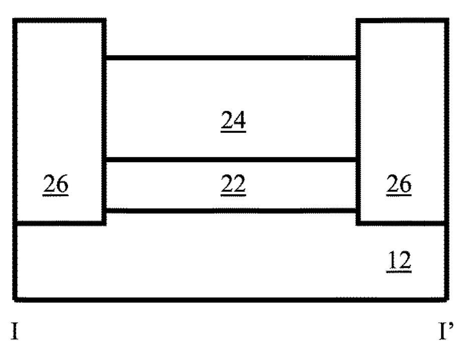
Figure 36O:
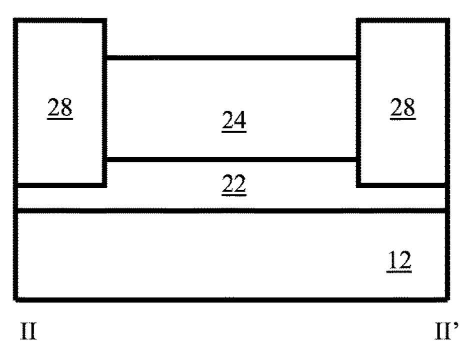

As shown in FIGS. 36M through 36O, an ion implantation step may then be performed to form the buried layer region 22 of a second conductivity (e.g. n-type conductivity). The ion implantation energy is optimized such that the buried layer region 22 is formed shallower than the bottom of the insulating layer 26 and deeper than the bottom of insulating layer 28. As a result, the insulating layer 26 isolates buried layer region 22 between adjacent cells while insulating layer 28 does not isolate buried layer region 22 between cells. This allows buried layer region 22 to be continuous in the direction of the II-II' cross section. Buried layer 22 isolates the eventual floating body region 24 of the first conductivity type (e.g., p-type) from the substrate 12.

Figure 36P:
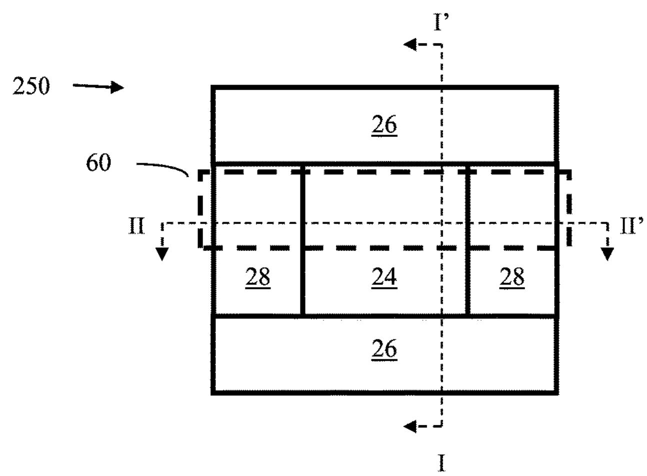
Figure 36Q:
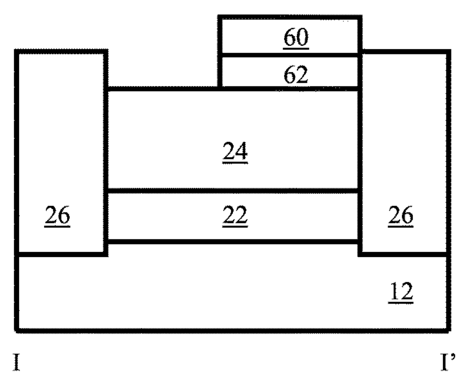
Figure 36R:
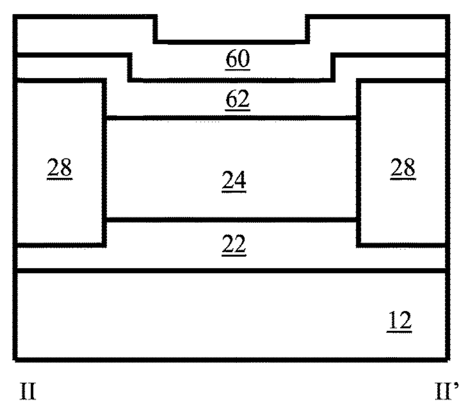

As shown in FIGS. 36P through 36R, a silicon oxide or high-dielectric material gate insulation layer 62 may then be formed on the silicon surface (e.g. about 100 A in an exemplary 130 nm process), which may then be followed by a polysilicon or metal gate 60 deposition (e.g. about 500 A in an exemplary 130 nm process). A lithography step may then be performed to pattern the layers 62 and 60, which may then be followed by etching of the polysilicon and silicon oxide layers. Other process geometries like, for example, 250 nm, 180 nm, 90 nm, 65 nm, etc., may be used. Similarly, other gate and gate insulation materials with different thicknesses may be used a matter of design choice.

Figure 36S:
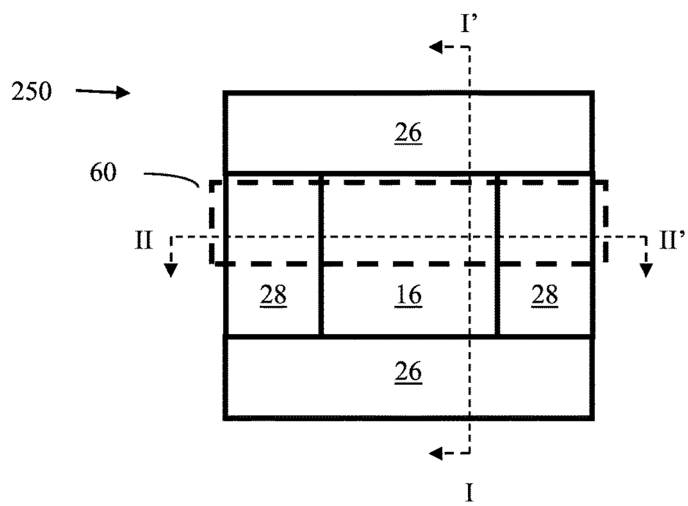
Figure 36T:
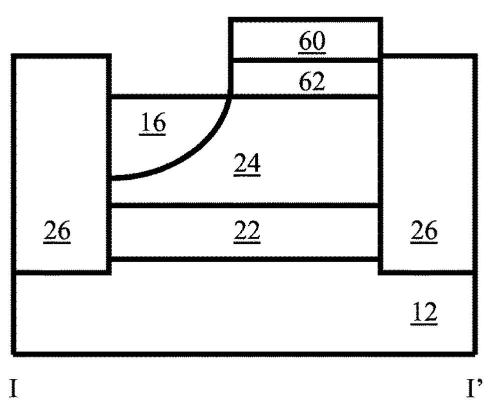
Figure 36U:
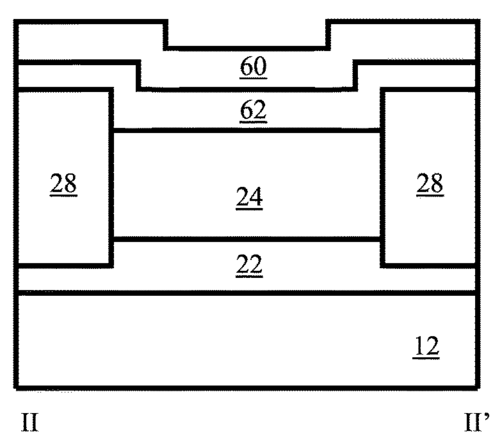

As shown in FIGS. 36S through 36U, another ion implantation step may then be performed to form the bit line region 16 of a second conductivity type (e.g. n-type conductivity). This may then be followed by backend process to form contact and metal layers (not shown in FIGS. 36A through 36U). The gate 60 and the insulating layers 26 and 28 serve as masking layer for the implantation process such that regions of second conductivity are not formed outside bit line region 16. In this and many subsequent figures, gate layer 60 and gate insulating layer 62 are shown flush with the edge of insulating layer 26. In some embodiments, gate layer 60 and gate insulating layer 62 may overlap insulating layer 16 to prevent any of the implant dopant for bit line region 16 from inadvertently implanting between gate layer 60 and gate insulating layer 62 and the adjacent insulating layer 26.

The states of memory cell 250 are represented by the charge in the floating body 24. If cell 250 is positively charged due to holes stored in the floating body region 24, then the memory cell will have a lower threshold voltage (the gate voltage where an ordinary MOSFET transistor is turned on—or in this case, the voltage at which an inversion layer is formed under gate insulating layer 62) compared to if cell 250 does not store holes in body region 24.

The positive charge stored in the floating body region 24 will decrease over time due to the diode leakage current of the p-n junctions formed between the floating body 24 and bit line region 16 and between the floating body 24 and the buried layer 22 and due to charge recombination. A unique capability of the invention is the ability to perform the holding operation in parallel to all memory cells of the array.

Figure 37A:
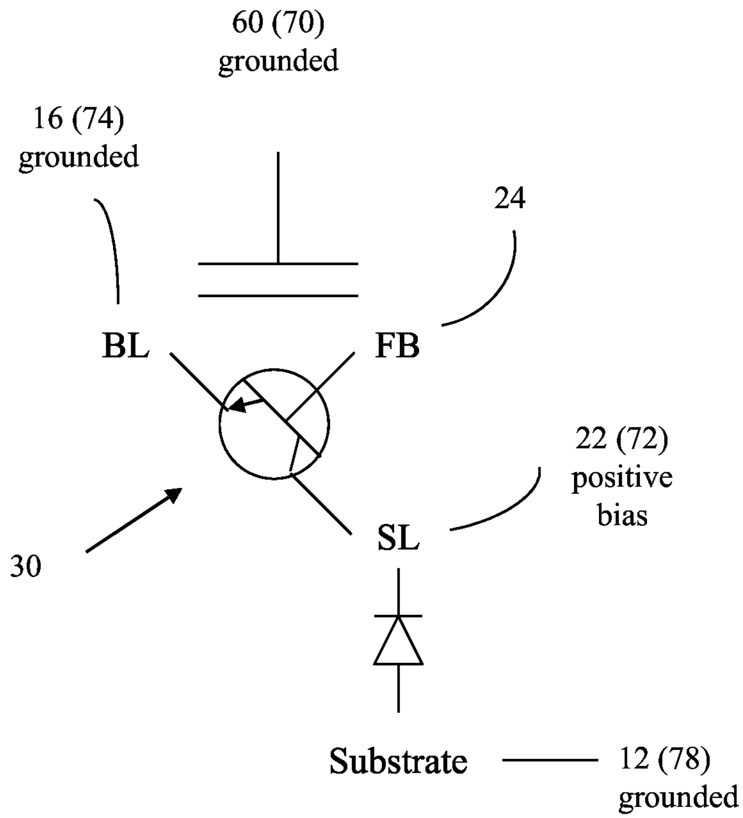
FIGS. 37A through 37C illustrate a method of maintaining the state of a memory cell according to the present invention.

As shown in FIG. 37A, the holding operation can be performed by applying a positive back bias to buried layer 22 through the SL terminal 72 while simultaneously grounding the bit line region 16 through the BL terminal 74 and grounding the substrate 12 through substrate terminal 78. The positive back bias applied to the buried layer region connected to the SL terminal will maintain the state of the memory cell 250 that it is connected to. The holding operation is relatively independent of the voltage applied to gate 60 through word line terminal 70. In some embodiments of the invention, the word line terminal may be grounded. Inherent in the memory cell 250 is n-p-n bipolar device 30 formed by buried well region 22 (the collector region), floating body 24 (the base region), and bit line region 16 (the emitter region).

If floating body 24 is positively charged, a state corresponding to logic-1, the bipolar transistor 30 formed by bit line region 16, floating body 24, and buried well region 22 will be turned on due to an impact ionization mechanism like that described with reference to Lin cited above. In particular, the voltage across the reversed biased p-n junction between the floating body 24 and the buried well region 22 will cause a small current to flow across the junction. Some of the current will be in the form of hot carriers accelerated by the electric field across the junction. These hot carriers will collide with atoms in the semiconductor lattice which will generate hole-electron pairs in the vicinity of the junction. The electrons will be swept into the buried layer region 22 by the electric field, while the holes will be swept into the floating body region 24.

The hole current flowing into the floating region 24 (usually referred to as the base current) will maintain the logic-1 state data. The efficiency of the holding operation can be enhanced by designing the bipolar device formed by buried well region 22, floating region 24, and bit line region 16 to be a low-gain bipolar device, where the bipolar gain is defined as the ratio of the collector current flowing out of SL terminal 72 to the base current flowing into the floating region 24.

Figure 37B:
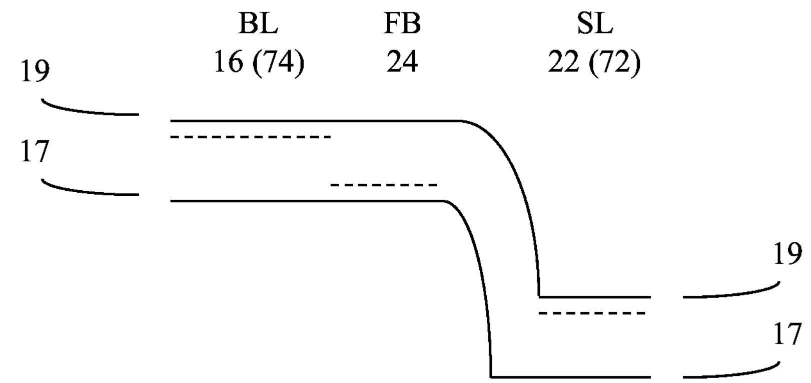

FIG. 37B shows the energy band diagram of the intrinsic n-p-n bipolar device 30 when the floating body region 24 is positively charged and a positive bias voltage is applied to the buried well region 22. The dashed lines indicate the Fermi levels in the various regions of the n-p-n transistor 30. The Fermi level is located in the band gap between the solid line 17 indicating the top of the valance band (the bottom of the band gap) and the solid line 19 indicating the bottom of the conduction band (the top of the band gap) as is well known in the art. The positive charge in the floating body region lowers the energy barrier of electron flow into the base region. Once injected into the floating body region 24, the electrons will be swept into the buried well region 22 (connected to SL terminal 72) due to the positive bias applied to the buried well region 22. As a result of the positive bias, the electrons are accelerated and create additional hot carriers (hot hole and hot electron pairs) through an impact ionization mechanism. The resulting hot electrons flow into the SL terminal 72 while the resulting hot holes will subsequently flow into the floating body region 24. This process restores the charge on floating body 24 and will maintain the charge stored in the floating body region 24 which will keep the n-p-n bipolar transistor 30 on for as long as a positive bias is applied to the buried well region 22 through SL terminal 72.

If floating body 24 is neutrally charged (the voltage on floating body 24 being equal to the voltage on grounded bit line region 16), a state corresponding to logic-0, no current will flow through the n-p-n transistor 30. The bipolar device 30 will remain off and no impact ionization occurs. Consequently memory cells in the logic-0 state will remain in the logic-0 state.

Figure 37C:
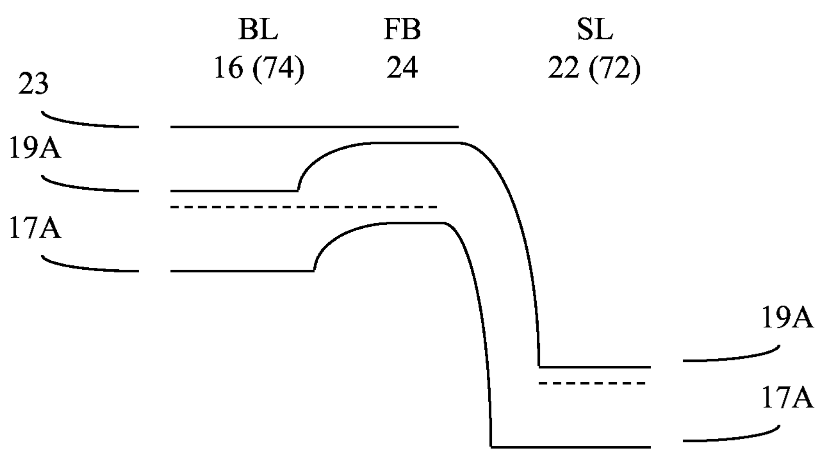

FIG. 37C shows the energy band diagram of the intrinsic n-p-n bipolar device 30 when the floating body region 24 is neutrally charged and a bias voltage is applied to the buried well region 22. In this state the energy level of the band gap bounded by solid lines 17A and 19A is different in the various regions of n-p-n bipolar device 30. Because the potential of the floating body region 24 and the bit line region 16 is equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 30 will remain off.

The difference between an impact ionization write logic-1 operation as described with reference to Lin cited above and a holding operation is that during a holding operation the gate 60 is not biased at a higher voltage than normal during a holding operation. During a write logic-1 operation, the capacitive coupling from the gate 60 to the floating body region 24 forces the n-p-n bipolar device 30 on regardless of the data stored in the cell. By contrast, without the gate boost a holding operation only generates carriers through impact ionization when a memory cell stores a logic-1 and does not generate carries through impact ionization when a memory cell stores a logic-0.

In the embodiment discussed in FIGS. 37A through 37C, bipolar device 30 has been an n-p-n transistor. Persons of ordinary skill in the art will readily appreciate that by reversing the first and second connectivity types and inverting the relative values of the applied voltages memory cell 50 could comprise a bipolar device 30 which is a p-n-p transistor. Thus the choice of an n-p-n transistor is an illustrative example for simplicity of explanation in FIGS. 37A through 37C is not limiting in any way.

FIG. 38A shows an exemplary array 280 of memory cells 250 (four exemplary instances of memory cell 250 being labeled as 250*a*, 250*b*, 250*c* and 250*d*) arranged in rows and columns. In many, but not all, of the figures where exemplary array 280 appears, representative memory cell 250*a* will be representative of a "selected" memory cell 250 when the operation being described has one (or more in some embodiments) selected memory cells 250. In such figures, representative memory cell 250*b* will be representative of an unselected memory cell 250 sharing the same row as selected representative memory cell 250*a*, representative memory cell 250*c* will be representative of an unselected memory cell 250 sharing the same column as selected representative memory cell 250*a*, and representative memory cell 250*d* will be representative of a memory cell 250 sharing neither a row or a column with selected representative memory cell 250*a*.

Present in FIG. 38A are word lines 70*a* through 70*n*, source lines 72*a* through 72*n*, bit lines 74*a* through 74*p*, and substrate terminal 78. Each of the word lines 70*a* through 70*n* is associated with a single row of memory cells 250 and is coupled to the gate 60 of each memory cell 250 in that row. Similarly, each of the source lines 72*a* through 72*n* is associated with a single row of memory cells 50 and is coupled to the buried well region 22 of each memory cell 50 in that row. Each of the bit lines 74*a* through 74*p* is associated with a single column of memory cells 50 and is coupled to the bit line region 16 of each memory cell 50 in that column. In the holding operation described in FIGS. 37A through 37C, there is no individually selected memory cell. Rather cells are selected in rows by the source lines 72*a* through 72*n* and may be selected as individual rows, as multiple rows, or as all of the rows comprising array 280.

Substrate 12 is present at all locations under array 280. Persons of ordinary skill in the art will appreciate that one or more substrate terminals 78 will be present in one or more locations as a matter of design choice. Such skilled persons will also appreciate that while exemplary array 280 is shown as a single continuous array in FIG. 38A, that many other organizations and layouts are possible like, for example, word lines may be segmented or buffered, bit lines may be segmented or buffered, source lines may be segmented or buffered, the array 280 may be broken into two or more sub-arrays, control circuits such as word decoders, column decoders, segmentation devices, sense amplifiers, write amplifiers may be arrayed around exemplary array 280 or inserted between sub-arrays of array 280. Thus the exemplary embodiments, features, design options, etc., described are not limiting in any way.

Turning now to FIG. 38B, array 280 previously discussed is shown along with multiplexers 40*a* through 40*n* and voltage waveforms 42*a* through 42*n*. A periodic pulse of positive voltage can be applied to the back bias terminals of memory cells 250 through SL terminal 72 as opposed to applying a constant positive bias to reduce the power consumption of the memory cell 250. FIG. 38B further shows multiplexers 40*a* through 40*n* each coupled to one of the source lines 72*a* through 72*n* that determine the bias voltages applied to SL terminals 72*a* through 72*n,* which will be determined by different operating modes. The pulsing of the voltage on the SL terminals may be controlled, for example, by applying pulses of logic signals like waveforms 42*a* through 42*n* to the select input of multiplexers 40*a* through 40*n* thereby selecting, for example, ground (0.0 volts) or a power supply voltage such as $V_{CC}$. Many other techniques may be used to pulse the voltage applied to SL terminals 72*a* through 72*n* like, for example, applying the waveforms 42*a* through 42*n* at different times, or applying them simultaneously, or coupling the select inputs of multiplexers 42*a* through 42*n* together and applying a single pulsed waveform to all of the multiplexers 42*a* through 42*n* simultaneously (not shown in the figure). Many other options will readily suggest themselves to persons of ordinary skill in the art. Thus the described exemplary embodiments are not limiting in any way.

FIG. 38C shows another method to provide voltage pulses to SL terminals 72*a* through 72*n* of exemplary array 280 of memory cells 250. The positive input signals to multiplexers 40*a* through 40*n* may be generated by voltage generator circuits 44*a* through 44*n* coupled to one input of each of the multiplexers 40*a* through 40*n*. Alternatively, a single voltage generator circuit may be coupled to each of the multiplexers 40*a* through 40*n* reducing the amount of overhead circuitry required to refresh the memory cells 250 of array 280. Other embodiments are possible including, for example, applying the waveforms 42*a* through 42*n* at different times, or applying them simultaneously, or coupling the select inputs of multiplexers 42*a* through 42*n* together and applying a single pulsed waveform to all of the multiplexers 42*a* through 42*n* simultaneously (not shown in the figure).

Figure 38D:
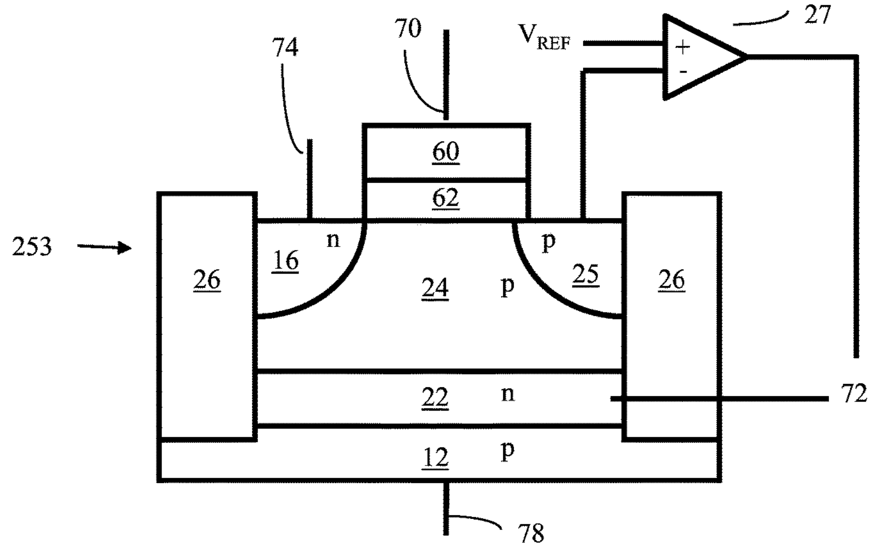
Figure 39:
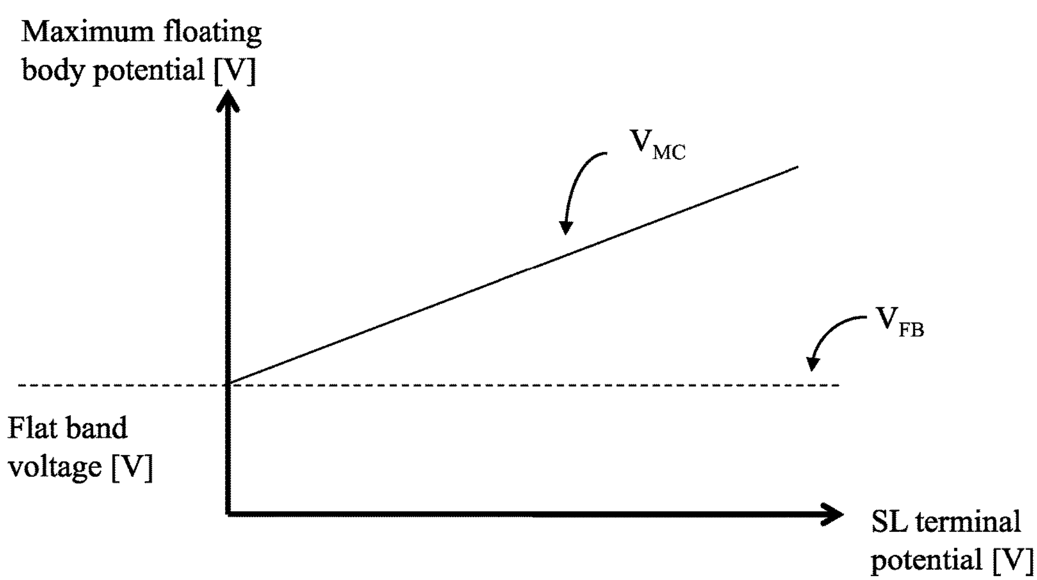
FIG. 39 is a graph of the floating body voltage in a memory cell according to the present invention.

FIG. 38D shows a reference generator circuit suitable for use as reference generator circuits 44*a* through 44*n* in FIG. 38C. The reference generator includes reference cell 53, which consists of a modified version of Gated half transistor memory cell 250 described above with region 25 of the first conductivity type (p-type conductivity). The p-type 25 region allows for a direct sensing of the floating body region 24 potential. Region 25 is drawn separately even though it has the same conductivity type as floating body region 24 because it may be doped differently to facilitate contacting it. The reference cell 53 for example can be configured to be in state logic-1 where the potential of the floating body region 24 is positive, for example at +0.5V. The potential sensed through the p-type region is then compared with a reference value $V_{REF}$, e.g. +0.5V, by operational amplifier 27. If the potential of the floating body region 24 is less than the reference value, the voltage applied to the back bias terminal 72 (which is connected to buried region 22 of the reference cell 53 and can also be connected to buried region 22 of the Gated half transistor memory cell 250) is increased by operational amplifier 27 until the potential of the floating body region 24 reaches the desired reference voltage. If the potential of the floating body 24 region is higher than that of the reference value, the voltage applied to back bias terminal 72 can be reduced by operational amplifier 27 until the potential of the floating body region 24 reaches the desired reference voltage. Reference voltage $V_{REF}$ may be generated in many different ways like, for example, using a band gap reference, a resistor string, a digital-to-analog converter, etc. Similarly alternate voltage generators of types known in the art may be used As shown in FIG. 39, the holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current from floating body 24 to bit line region 16 increases exponentially at floating body potential greater than $V_{FB}$. However, by applying a positive voltage to SL terminal 72, the bipolar action results in a hole current flowing into the floating body 24, compensating for the junction leakage current between floating body 24 and bit line region 16. As a result, the maximum charge $V_{MC}$ stored in floating body 24 can be increased by applying a positive bias to the SL terminal 72 as shown in the graph in FIG. 39. The increase in the maximum charge stored in the floating body 24 results in a larger memory window.

The holding/standby operation can also be used for multi-bit operation in memory cell 250. To increase the memory density without increasing the area occupied by the memory cell, a multi-level operation is typically used. This is done by dividing the overall memory window into more than two different levels. In one embodiment four levels representing two binary bits of data are used, though many other schemes like, for example, using eight levels to represent three binary bits of data are possible. In a floating body memory, the different memory states are represented by different charge in the floating body 24, as described, for example, in Tack and Oknonin-2 cited above. However, since the state with zero charge in the floating body 24 is the most stable state, the floating body 24 will over time lose its charge until it reaches the most stable state. In multi-level operation, the difference of charge representing different states is smaller than a single-level operation. As a result, a multi-level memory cell is more sensitive to charge loss.

Figure 40:
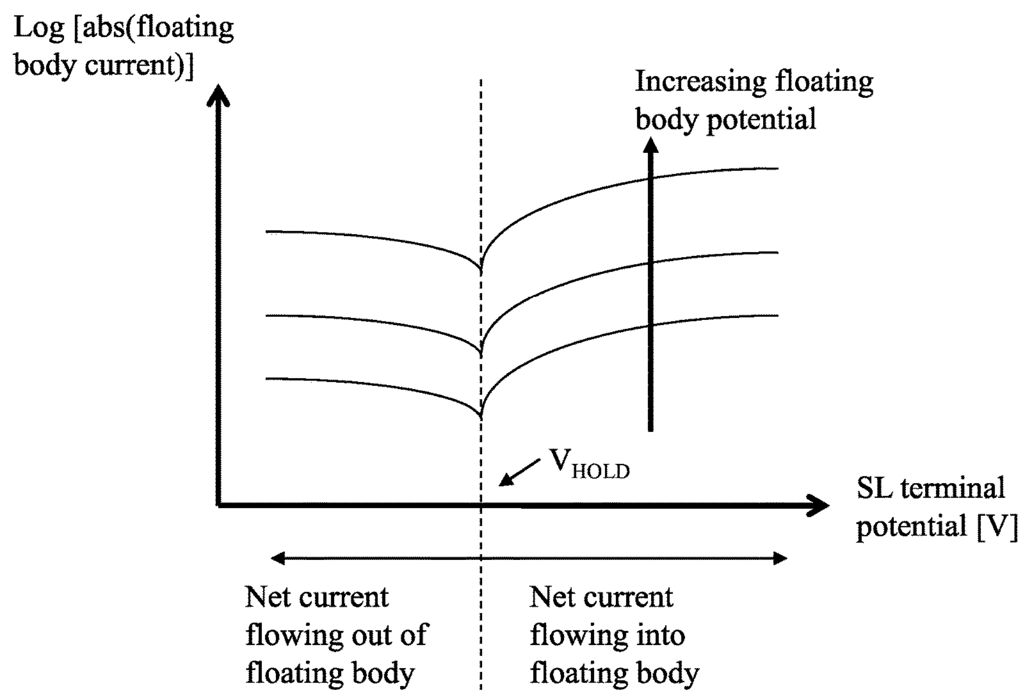
FIG. 40 is a graph of current-voltage curves of a memory cell according to the present invention.

FIG. 40 shows the floating body 24 net current for different floating body 24 potential as a function of the voltage applied to SL terminal 72 with BL, WL and substrate terminals 74, 70, and 78, grounded. When zero voltage is applied to SL terminal 72, no bipolar current is flowing into the floating body 24 and as a result, the stored charge will leak over time. When a positive voltage is applied to SL terminal 72, hole current will flow into floating body 24 and balance the junction leakage current to bit line region 16. The junction leakage current is determined by the potential difference between the floating body 24 and bit line region 16, while the bipolar current flowing into floating body 24 is determined by both the SL terminal 72 potential and the floating body 24 potential. As indicated in FIG. 40, for different floating body potentials, at a certain SL terminal 72 potential $V_{HOLD}$, the current flowing into floating body 24 is balanced by the junction leakage between floating body 24 and bit line region 16. The different floating body 24 potentials represent different charges used to represent different states of memory cell 50. This shows that different memory states can be maintained by using the holding/standby operation described here.

In one embodiment the bias condition for the holding operation for memory cell 250 is: 0 volts is applied to BL terminal 74, a positive voltage like, for example, +1.2 volts is applied to SL terminal 72, 0 volts is applied to WL terminal 70, and 0 volts is applied to the substrate terminal 78. In another embodiment, a negative voltage may be applied to WL terminal 70. In other embodiments, different voltages may be applied to the various terminals of memory cell 250 as a matter of design choice and the exemplary voltages described are not limiting in any way.

The read operation of the memory cell 250 and array 280 of memory cells will described in conjunction with FIGS. 41 and 42A through 42H. Any sensing scheme known in the art can be used with memory cell 250. Examples include, for example, the sensing schemes disclosed in Ohsawa-1 and Ohsawa-2 cited above.

The amount of charge stored in the floating body 24 can be sensed by monitoring the cell current of the memory cell 250. If memory cell 250 is in a logic-1 state having holes in the body region 24, then the memory cell will have a higher cell current (e.g. current flowing from the BL terminal 74 to SL terminal 72), compared to if cell 250 is in a logic-0 state having no holes in floating body region 24. A sensing circuit typically connected to BL terminal 74 can then be used to determine the data state of the memory cell.

A read operation may be performed by applying the following bias condition to memory cell 250: a positive voltage is applied to the selected BL terminal 74, and an even more positive voltage is applied to the selected WL terminal 70, zero voltage is applied to the selected SL terminal 72, and zero voltage is applied to the substrate terminal 78. This has the effect of operating bipolar device 30 as a backward n-p-n transistor in a manner analogous to that described for operating bipolar device 30 for a hold operation as described in conjunction with FIGS. 37A through 37C. The positive voltage applied to the WL terminal 70 boosts the voltage on the floating body region 24 by means of capacitive coupling from the gate 60 to the floating body region 24 through gate insulating layer 62. This has the effect of increasing the current in bipolar device 30 when it is on significantly more than it increases the current when it is off, thus making it easier to sense the data stored in the memory cell 250. The optimal bias voltage to apply to WL terminal 70 will vary from embodiment to embodiment and process to process. The actual voltage applied in any given embodiment is a matter of design choice.

Figure 41:
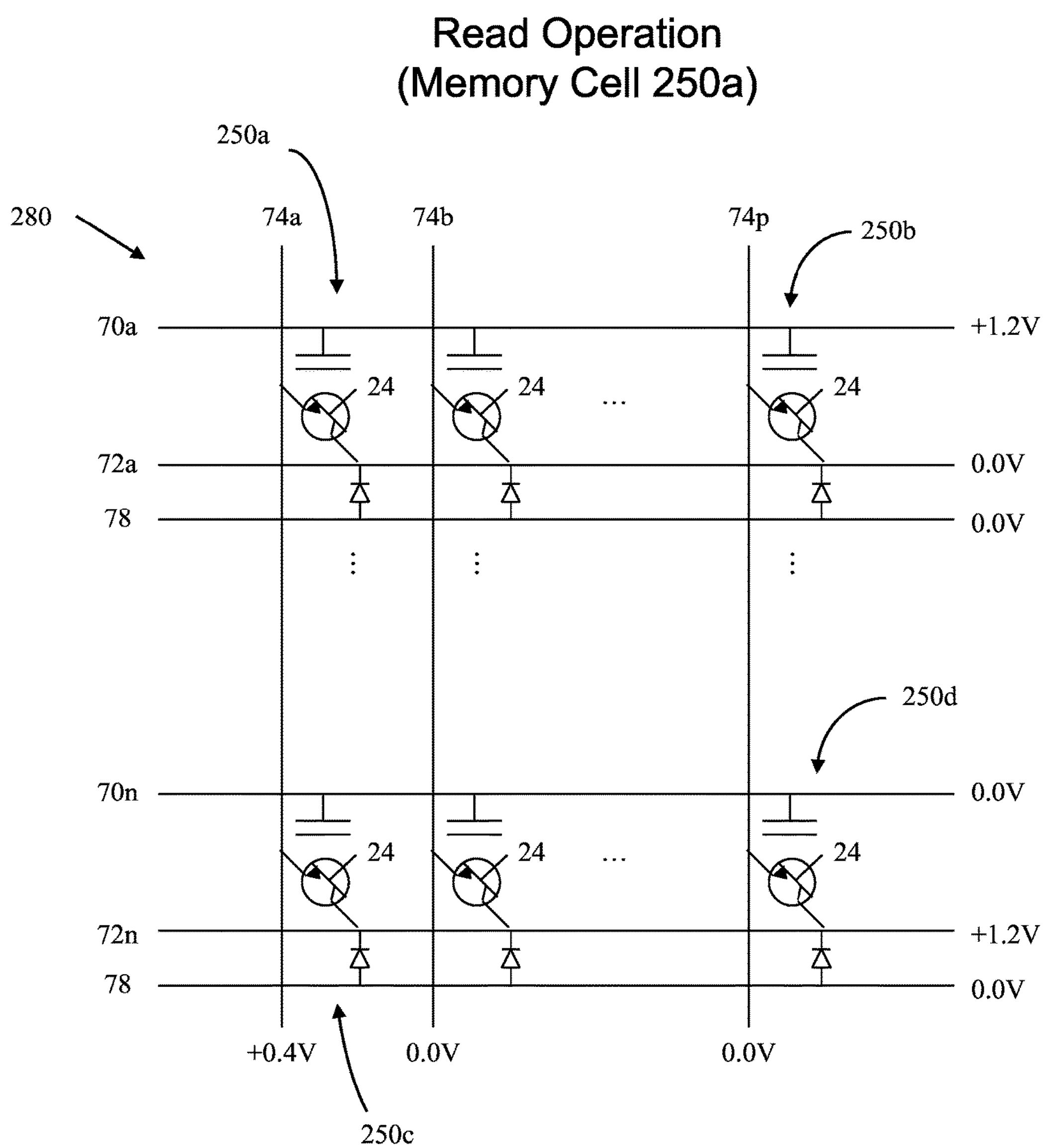
FIG. 41 illustrates a read operation performed on an array of memory cells according to the present invention.

FIG. 41 shows array 280 of memory cells 250 during a read operation in one exemplary embodiment of the present invention. Reading a memory cell 250 in array 280 is more complicated than reading a single cell as described above, since cells are coupled together along rows by word lines 70*a* through 70*n* and source lines 72*a* through 72*n* and coupled together along columns by bit lines 74*a* through 74*p*. In one exemplary embodiment, about 0.0 volts is applied to the selected SL terminal 72*a*, about +0.4 volts is applied to the selected bit line terminal 74*a*, about +1.2 volts is applied to the selected word line terminal 70*a*, and about 0.0 volts is applied to substrate terminal 78. All the unselected bit line terminals 74*b* (not shown) through 74*p* have 0.0 volts applied, the unselected word line terminals 70*b* (not shown) through 70*n* have 0.0 volts applied, and the unselected SL terminals 72*b* (not shown) have +1.2 volts applied. FIG. 41 shows the bias conditions for the selected representative memory cell 250*a* and three unselected representative memory cells 250*b*, 250*c*, and 250*d* in memory array 280, each of which has a unique bias condition. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

Figure 42A:
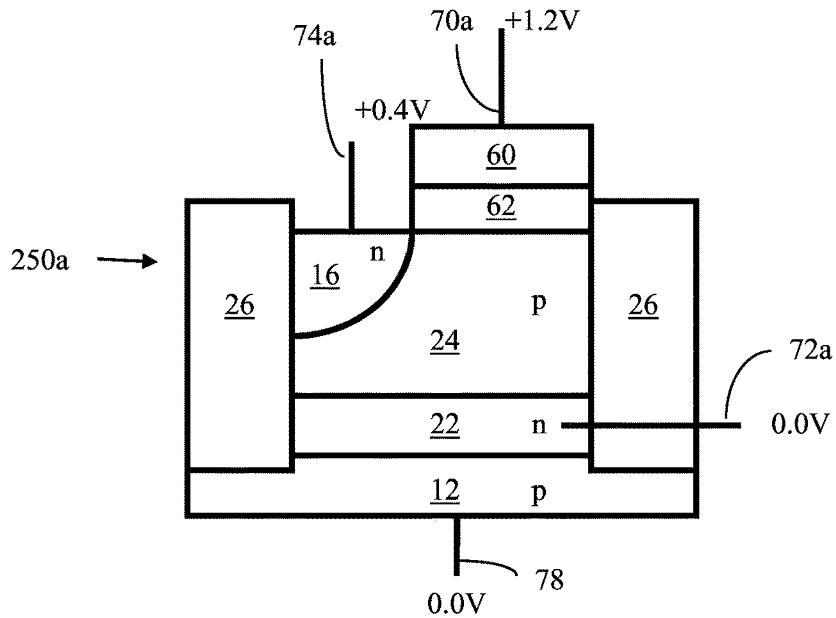
FIGS. 42A through 42H illustrate the operation of four representative memory cells of the array of FIG. 41.
Figure 42B:
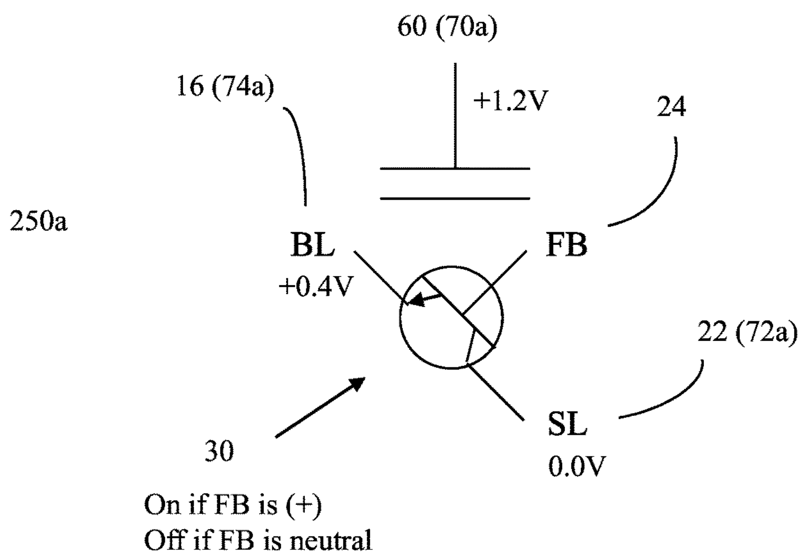

FIG. 42A also shows the bias condition of the selected representative memory cell 250*a* in cross section while FIG. 42B shows the equivalent circuit diagram illustrating the intrinsic n-p-n bipolar device 30 under the read bias conditions described above.

Figure 42C:
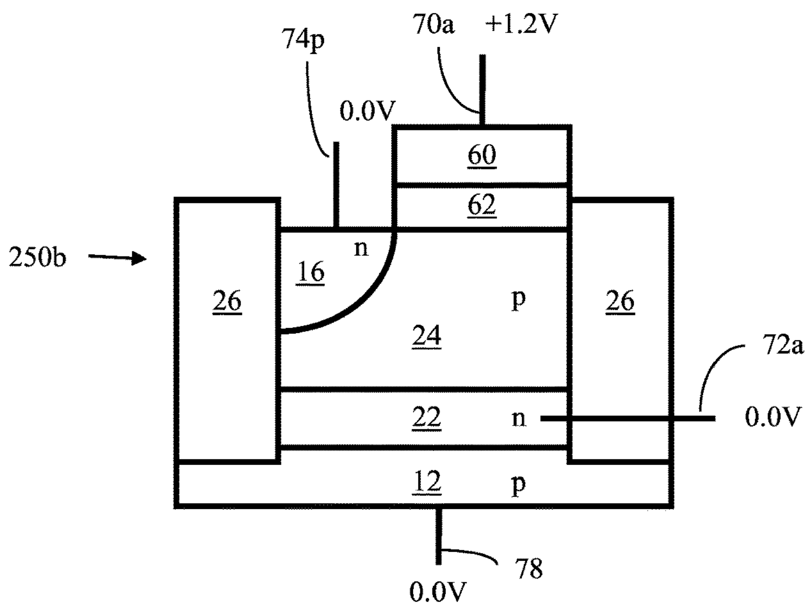
Figure 42D:
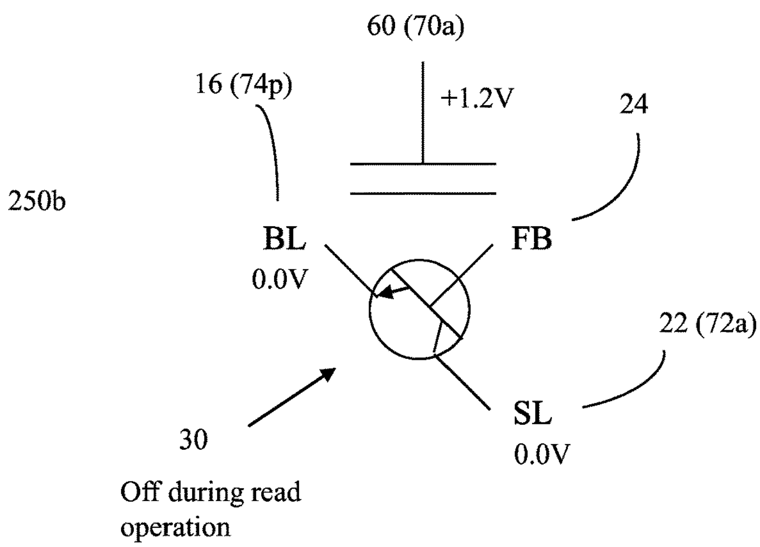
Figure 42E:
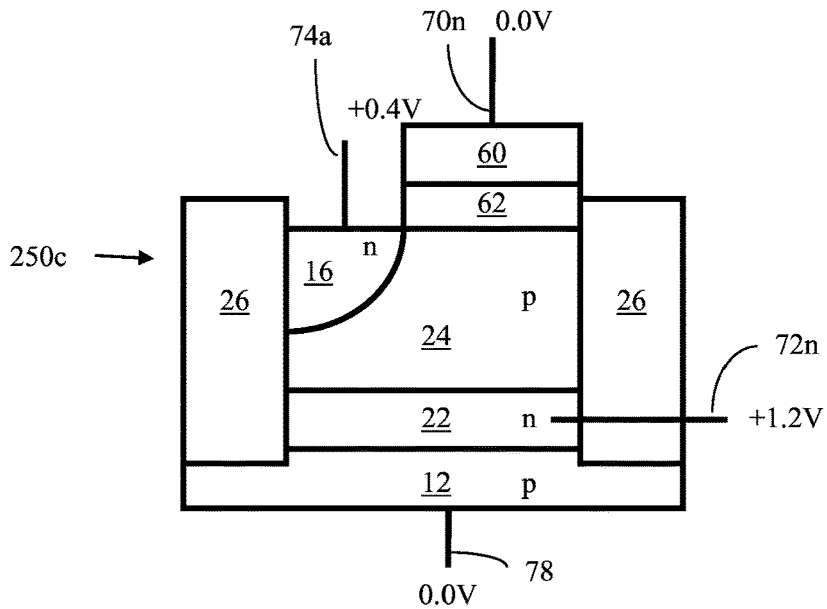
Figure 42F:
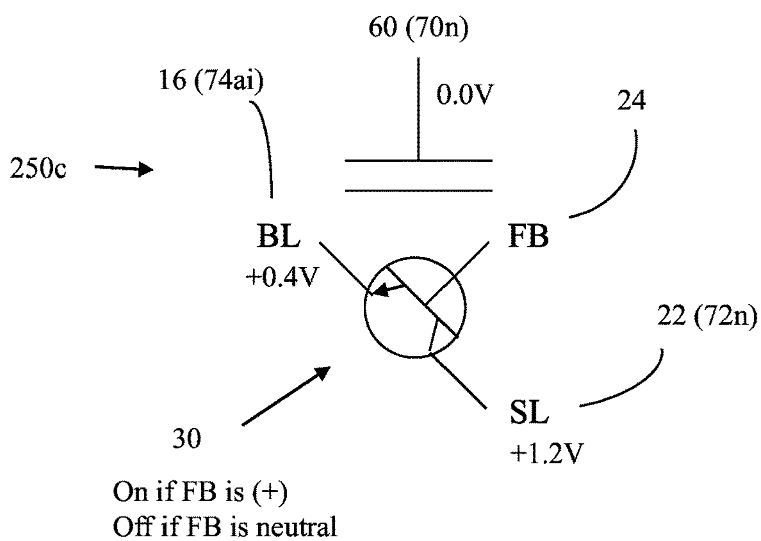
Figure 42G:
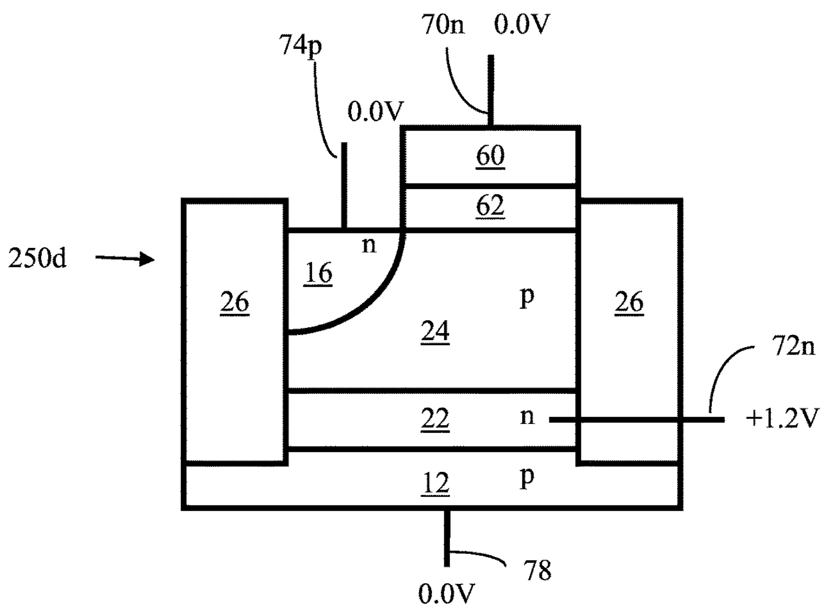
Figure 42H:
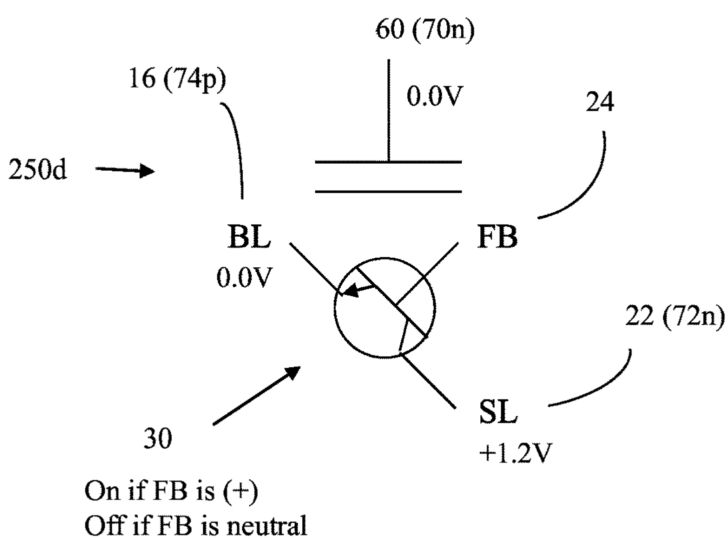

The three cases for unselected memory cells 250 during read operations are shown in FIGS. 42C, 42E, and 42G, while illustrations of the equivalent circuit diagrams are shown in FIGS. 42D, 42F, and 42H respectively. The bias conditions for memory cells 250 sharing the same row (e.g. representative memory cell 250*b*) and those sharing the same column (e.g., representative memory cell 250*c*) as the selected representative memory cell 250*a* are shown in FIGS. 42C-42D and FIGS. 42E-42F, respectively, while the bias condition for memory cells 250 not sharing the same row nor the same column as the selected representative memory cell 250*a* (e.g., representative memory cell 250*d*) is shown in FIG. 42G-42H.

As shown in FIGS. 42C and 42D, for representative memory cell 250*b* sharing the same row as the selected representative memory cell 250*a*, the SL terminal 72*a* is now grounded and consequently these cells will not be at the holding mode. However, because a read operation is accomplished much faster (on the order of nanoseconds) compared to the lifetime of the hole charge in the floating body 24 (on the order of milliseconds), it should cause little disruptions to the charge stored in the floating body.

As shown in FIGS. 42E and 42F, representative memory cell 250*c* sharing the same column as the selected memory cell 250*a*, a positive voltage is applied to the BL terminal 74*a*. Less base current will flow into the floating body 24 due to the smaller potential difference between SL terminal 72*n* and BL terminal 74*a* (i.e. the emitter and collector terminals of the n-p-n bipolar device 30). However, because read operation is accomplished much faster (on the order of nanoseconds) compared to the lifetime of the charge in the floating body 24 (on the order of milliseconds), it should cause little disruptions to the charge stored in the floating body.

As shown in FIGS. 42G and 42H, representative memory cell 250*d* sharing neither the same row nor the same column as the selected representative memory cell 250*a*, the SL terminal 72*n* will remain positively charged and the BL terminal 74*p* will remain grounded. As can be seen, these cells will be in the holding mode, where memory cells in the logic-1 state will maintain the charge in floating body 24 because the intrinsic bipolar device 30 will generate hole current to replenish the charge in floating body 24 and memory cells in the logic-0 state will remain in neutral state.

The read operation of the memory cell 250 and array 280 of memory cells have been described in conjunction with FIGS. 41 through 42H. Persons of ordinary skill in the art will realize that the drawing figures are not drawn to scale, that the various voltages described are illustrative only and will vary from embodiment to embodiment, that embodiments discussed have been illustrative only, and that many more embodiments employing the inventive principles of the invention are possible. For example, the two conductivity types may be reversed and the relative voltages of the various signals may be inverted, the memory array 280 may be built as a single array or broken into sub-arrays, the accompanying control circuits may be implemented in different ways, different relative or absolute voltage values may be applied to memory cell 250 or array 280, etc. Thus the exemplary embodiments, features, bias levels, etc., described are not limiting in any way.

Figure 43A:
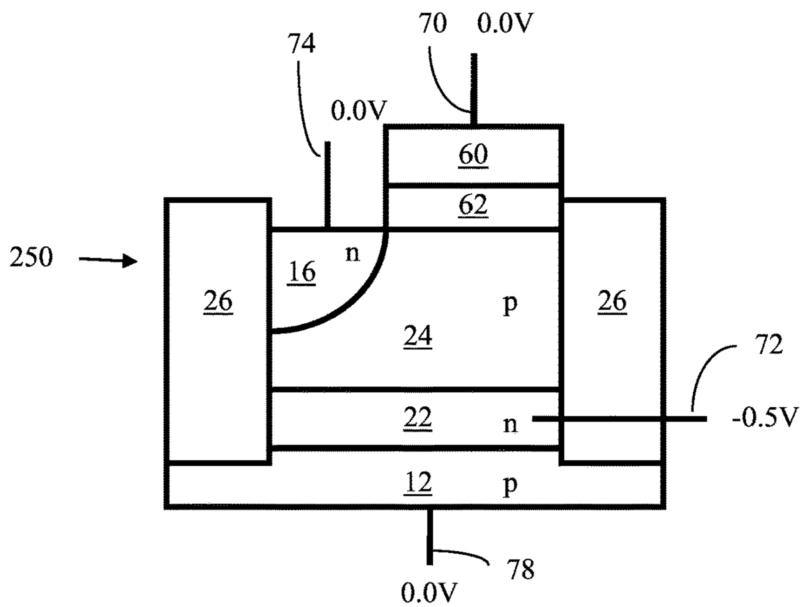
FIGS. 43A and 43B illustrates the operation of selected memory cells according to the present invention during a first type of write logic-0 operation.

A first type of write logic-0 operation of an individual memory cell 250 is now described with reference to FIGS. 43A and 43B. In FIG. 43A, a negative voltage bias is applied to the back bias terminal (i.e. SL terminal 72), a zero voltage bias is applied to WL terminal 70, a zero voltage bias is applied to BL terminal 72 and substrate terminal 78. Under these conditions, the p-n junction between floating body 24 and buried well 22 of the selected cell 250 is forward-biased, evacuating any holes from the floating body 24. In one particular non-limiting embodiment, about −0.5 volts is applied to source line terminal 72, about 0.0 volts is applied to word line terminal 70, and about 0.0 volts is applied to bit line terminal 74 and substrate terminal 78. These voltage levels are exemplary only may vary from embodiment to embodiment as a matter of design choice. Thus the exemplary embodiments, features, bias levels, etc., described are not limiting in any way.

Figure 43B:
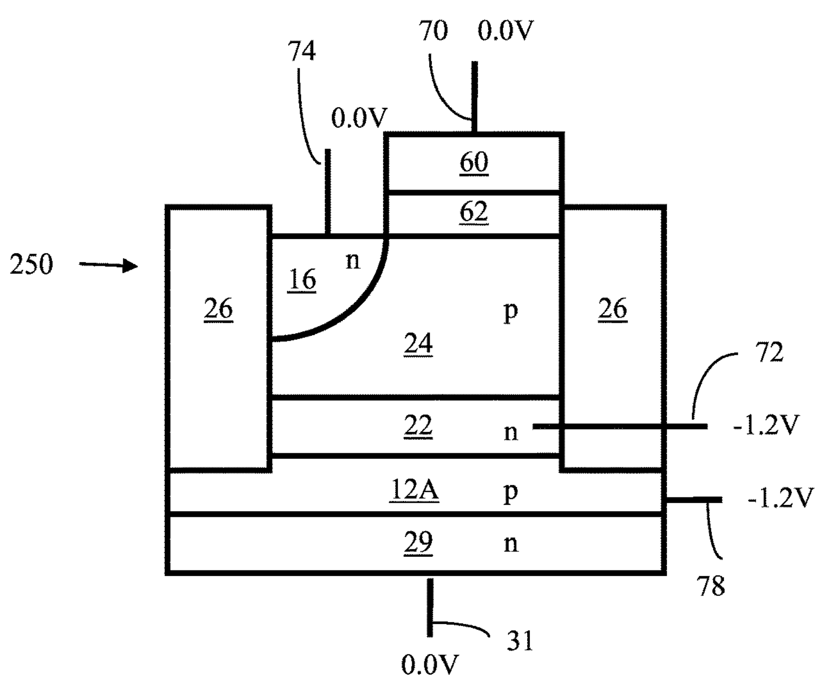

In FIG. 43B, an alternative embodiment of memory cell 250 is shown where substrate 12 is replaced by region 12A of the first conductivity type (p-type in the figure) which is a well inside substrate 29 of the second conductivity type (n-type in the figure). This arrangement overcomes an undesirable side effect of the embodiment of FIG. 43A where lowering the buried well region 22 voltage on buried well terminal 72 to approximately −0.5V to forward bias the p-n junction between buried well 22 and floating body 24 also forward biases the p-n junction between buried well 22 and substrate 12 resulting in unwanted substrate current. The embodiment of FIG. 43B allows the well 12A to be lowered by applying the same voltage to well terminal 78 as buried layer terminal 72 thus preventing the p-n diode between those regions to forward bias. The substrate 29 is preferably biased to 0.0V through substrate terminal 31 as shown in FIG. 43B. These voltage levels are exemplary only may vary from embodiment to embodiment as a matter of design choice, Thus the exemplary embodiments, features, bias levels, etc., described are not limiting in any way.

Figure 44:
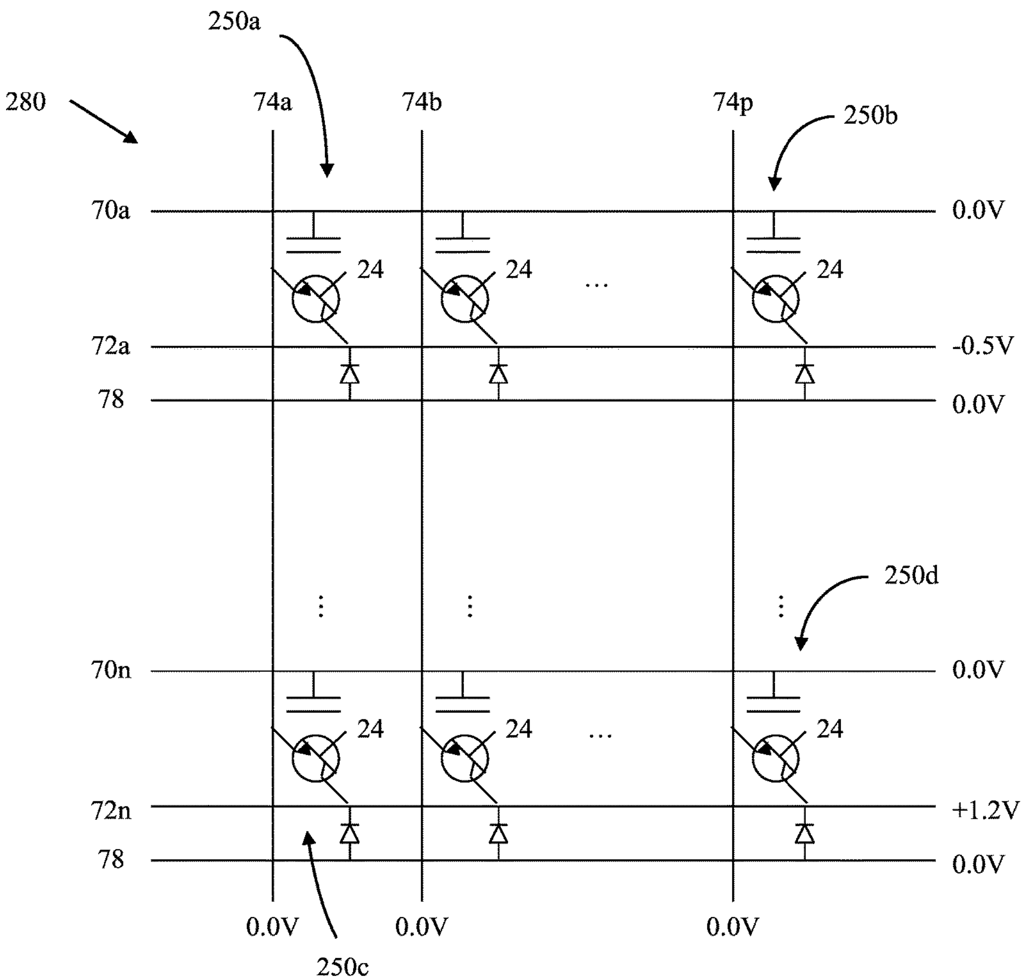
FIG. 44 illustrates an array of memory cells according to the present invention during the first type of write logic-0 operation of FIG. 43.

FIG. 44 shows an example of bias conditions for the selected and unselected memory cells 250 during the first type of write logic-0 operation (as described in FIG. 43A) in memory array 280. For the selected representative memory cells 250*a* and 250*b*, the negative bias applied to SL terminal 72*a* causes large potential difference between floating body 24 and buried well region 22. Because the buried well 22 is shared among multiple memory cells 250, logic-0 will be written into all memory cells 250 including memory cells 250*a* and 250*b* sharing the same SL terminal 72*a* simultaneously.

Figure 45A:
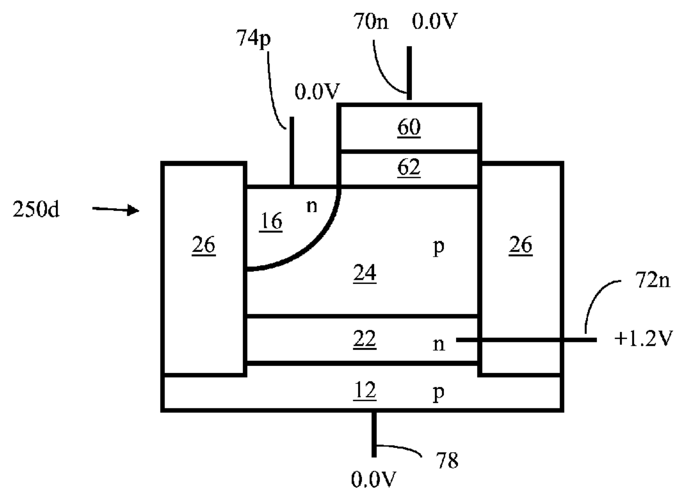
FIGS. 45A-45B illustrate the operation of unselected memory cells according to the present invention of the array of FIG. 46 during a second type of write logic-0 operation.
Figure 45B:
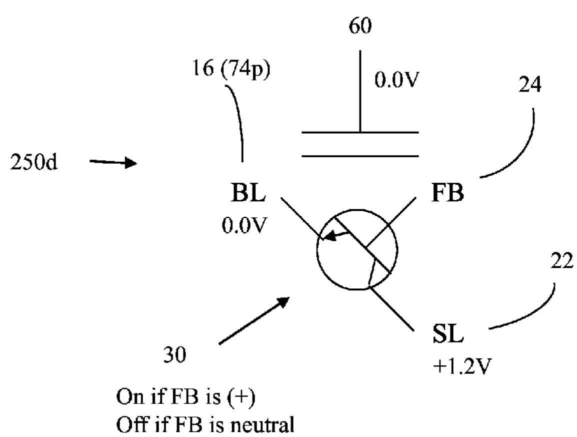

FIGS. 45A through 45B illustrate an example of bias conditions and an equivalent circuit diagram illustrating the intrinsic n-p-n bipolar devices 30 of unselected memory cells 250 like representative memory cells 250*c* and 250*d* in array 280 during the first type of logic-0 write operations. In particular representative memory cell 250*d* will be discussed for clarity of presentation though the principles apply to all unselected memory cells 250. Since the logic-0 write operation only involves a negative voltage to the selected SL terminal 72*a*, the memory cells 250 coupled to the unselected SL terminals 72*b* (not shown in FIG. 44) through 72*n* are placed in a holding operation by placing a positive bias condition on SL terminals 72*b* through 72*n*. As can be seen in FIGS. 45A and 45B, the unselected memory cells will be in a holding operation, with the BL terminal at about 0.0 volts, WL terminal at zero voltage, and the unselected SL terminal positively biased.

Figure 46:
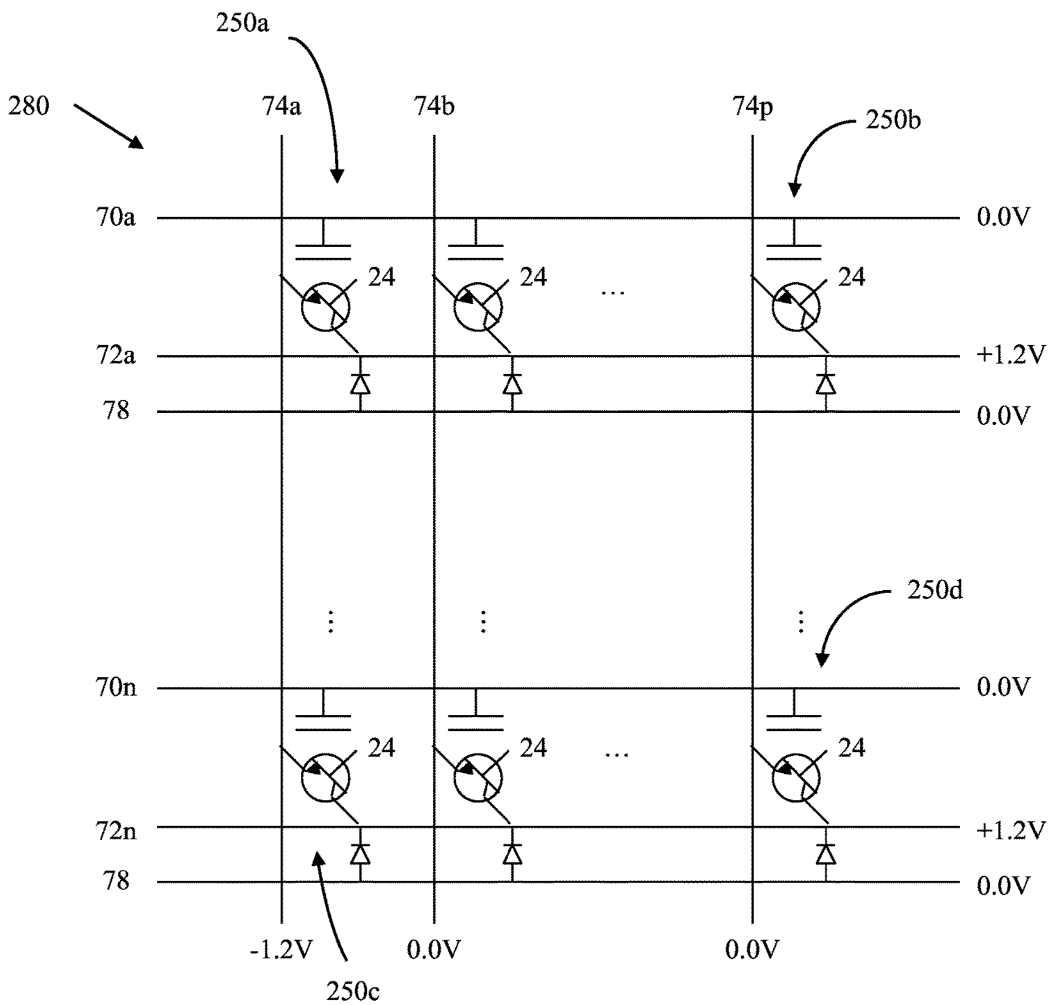
FIG. 46 illustrates an array of memory cells according to the present invention during a second type of write logic-0 operation.

As shown in FIG. 46, a second type of write logic-0 operation can also be performed by applying a negative bias to the BL terminal 74 as opposed to the SL terminal 72. In FIG. 46, the selected memory cells 250 include representative memory cells 250*a* and 250*c* and all the memory cells 250 that share the selected bit line 74*a*. The SL terminal 72 will be positively biased, while zero voltage is applied to the substrate terminal 78, and zero voltage is applied to the WL terminal 70. Under these conditions, all memory cells sharing the same BL terminal 74 will be written to the logic-0 state.

The first and second types of write logic-0 operations referred to above each has a drawback that all memory cells 250 sharing either the same SL terminal 72 (the first type—row write logic-0) or the same BL terminal 74 will (the second type—column write logic-0) be written to simultaneously and as a result, does not allow writing logic-0 to individual memory cells 250. To write arbitrary binary data to different memory cells 250, a write logic-0 operation is first performed on all the memory cells to be written followed by one or more write logic-1 operations on the bits that must be written to logic-1.

A third type of write logic-0 operation that allows for individual bit writing can be performed on memory cell 250 by applying a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and bit line region 16 is forward-biased, evacuating any holes from the floating body 24.

To reduce undesired write logic-0 disturb to other memory cells 250 in the memory array 280, the applied potential can be optimized as follows: if the floating body 24 potential of state logic-1 is referred to as $V_{FB1}$, then the voltage applied to the WL terminal 70 is configured to increase the floating body 24 potential by $V_{FB1}/2$ while $-V_{FB1}/2$ is applied to BL terminal 74. Additionally, either ground or a slightly positive voltage may also be applied to the BL terminals 74 of unselected memory cells 250 that do not share the same BL terminal 74 as the selected memory cell 250, while a negative voltage may also be applied to the WL terminals 70 of unselected memory cells 250 that do not share the same WL terminal 70 as the selected memory cell 250.

Figure 47:
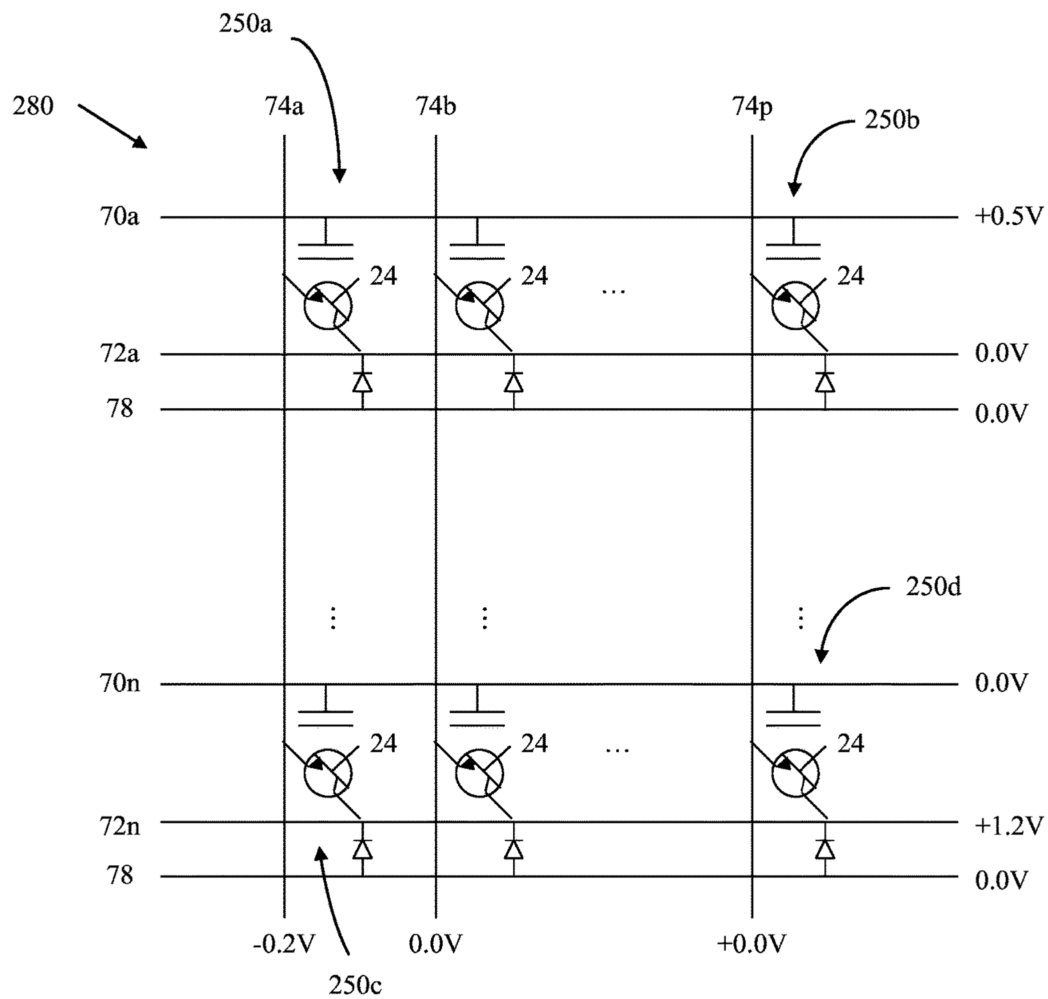
FIG. 47 illustrates an array of memory cells according to the present invention during a third type of write logic-0 operation.

As illustrated in FIG. 47, the following bias conditions are applied to the selected representative memory cell 250*a* in exemplary memory array 280 to perform an individual write logic-0 operation exclusively in representative memory cell 250*a*: a potential of about 0.0 volts to SL terminal 72*a*, a potential of about −0.2 volts to BL terminal 74*a*, a potential of about +0.5 volts is applied to word line terminal 70*a*, and about 0.0 volts is applied to substrate terminal 78. In the rest of array 280 about +1.2 volts is applied to unselected SL terminals 72 (including SL terminal 72*n*), about 0.0 volts (or possibly a slightly positive voltage) is applied to unselected BL terminals 74 (including BL terminal 74*p*), and about 0.0 volts is applied to unselected WL terminal 70 (including WL terminal 70*n*). Persons of ordinary skill in the art will appreciate that the voltage levels in FIG. 47 are illustrative only and that different embodiments will have different voltage levels as a matter of design choice.

Figure 48B:
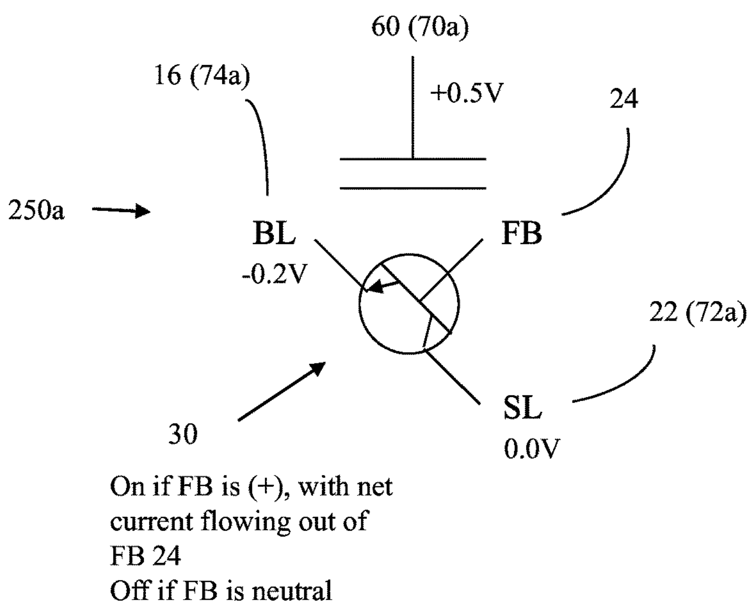

The bias conditions shown in FIG. 47 of the selected representative memory cell 250*a* in memory array 280 to perform the individual bit write logic-0 operation are further illustrated in FIGS. 48A and 48B. As discussed above, the potential difference between floating body 24 and bit line region 16 connected to BL terminal 74*a* is now increased due to the capacitive coupling from raising WL terminal 70*a* from ground to +0.5V, resulting in a higher forward bias current than the base hole current generated by the n-p-n bipolar device 30 formed by buried well region 22 connected to SL terminal 72*a*, floating body 24, and bit line region 16. The result is that holes will be evacuated from floating body 24.

Figure 48C:
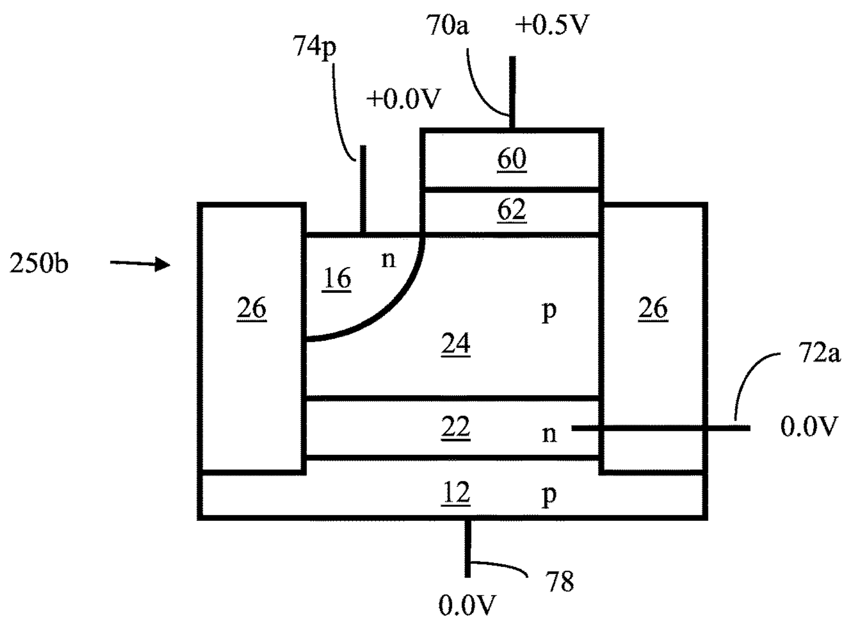
Figure 48D:
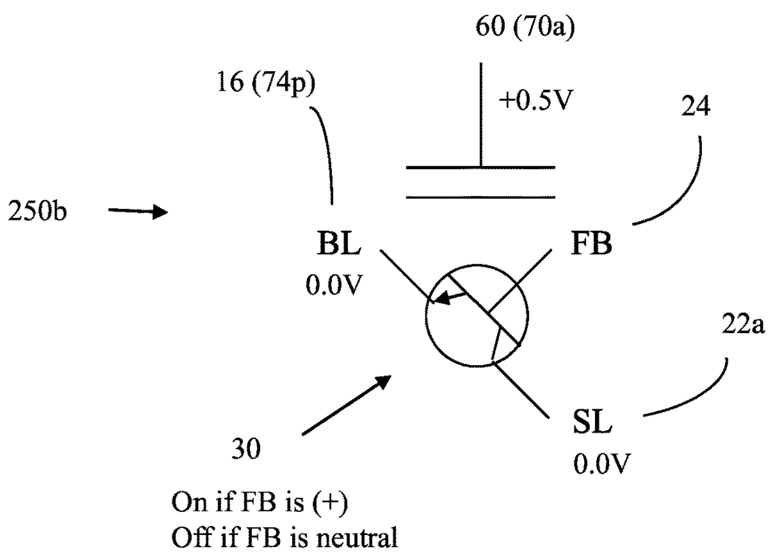
Figure 48E:
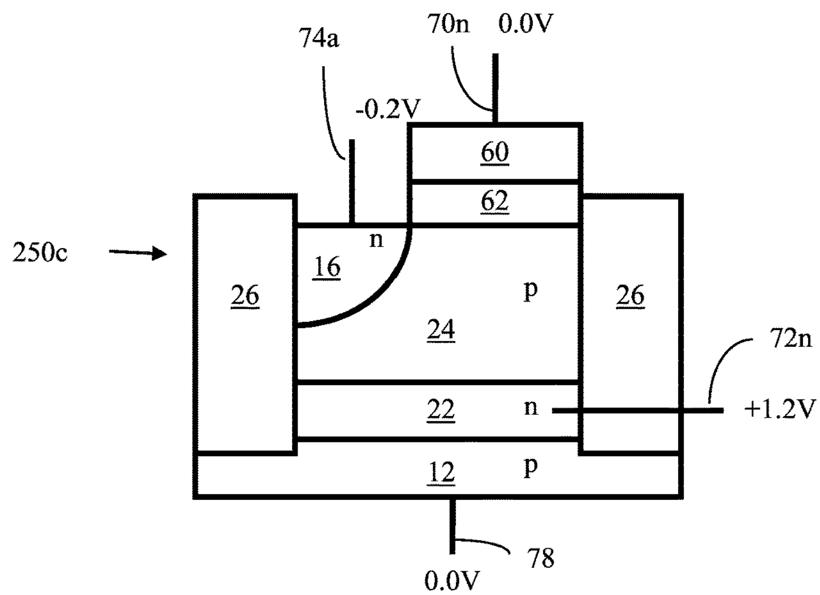
Figure 48F:
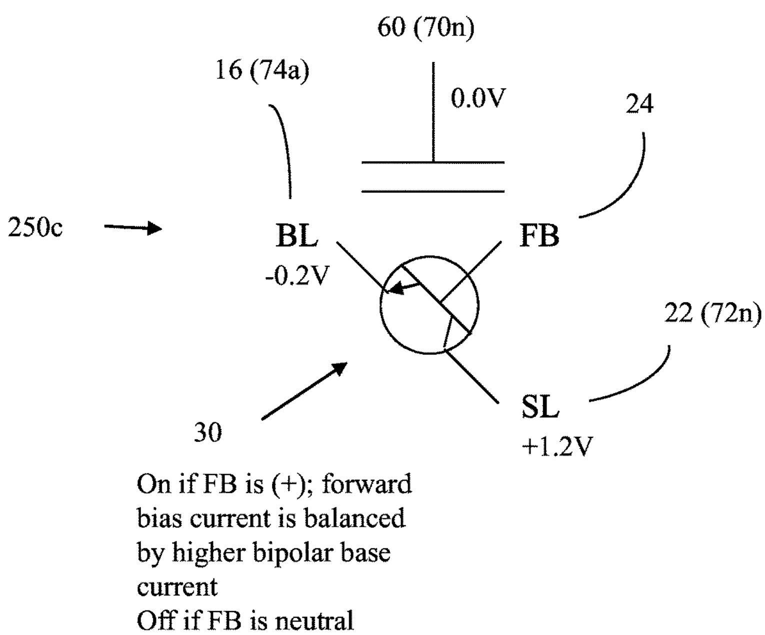
Figure 48G:
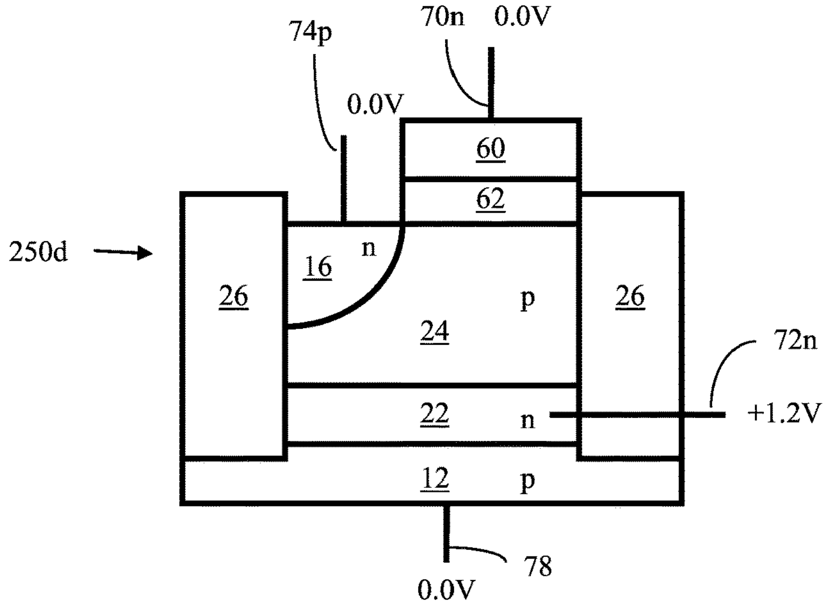
Figure 48H:
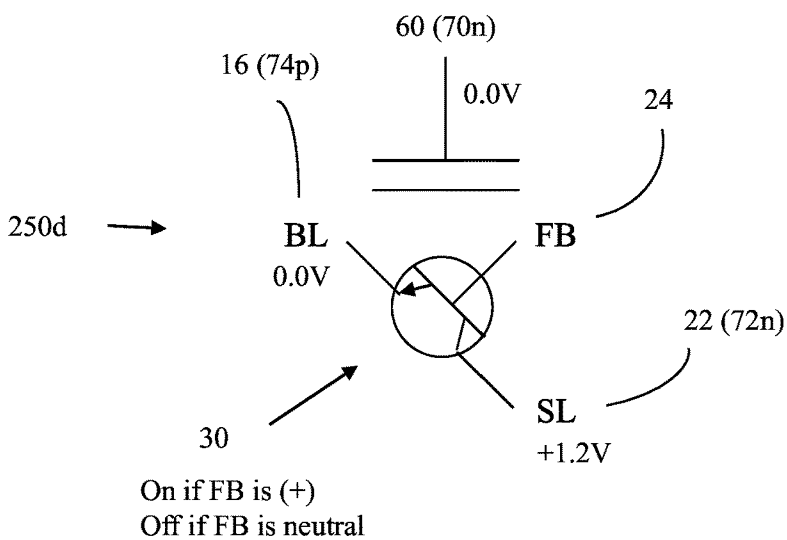

The unselected memory cells 250 in memory array 280 under the bias conditions of FIG. 47 during the individual bit write logic-0 operation are shown in FIGS. 48C through 48H. The bias conditions for memory cells sharing the same row (e.g. representative memory cell 250*b*) as the selected representative memory cell 250*a* are illustrated in FIGS. 48C and 48D, and the bias conditions for memory cells sharing the same column (e.g. representative memory cell 250*c*) as the selected representative memory cell 250*a* are shown in FIGS. 48E and 48F, and the bias conditions for memory cells sharing neither the same row nor the same column (e.g. representative memory cell 250*d*) as the selected representative memory cell 250*a* are shown in FIGS. 48G and 48H.

As shown in FIGS. 48C and 48D, the floating body 24 potential of memory cell 250*b* sharing the same row as the selected representative memory cell 250*a* will increase due to capacitive coupling from WL terminal 70 by $\Delta V_{FB}$. For memory cells in state logic-0, the increase in the floating body 24 potential is not sustainable as the forward bias current of the p-n diodes formed by floating body 24 and junction 16 will evacuate holes from floating body 24. As a result, the floating body 24 potential will return to the initial state logic-0 equilibrium potential. For memory cells in state logic-1, the floating body 24 potential will initially also increase by $\Delta V_{FB}$, which will result in holes being evacuated from floating body 24. After the positive bias on the WL terminal 70 is removed, the floating body 24 potential will decrease by $\Delta V_{FB}$. If the initial floating body 24 potential of state logic-1 is referred to as $V_{FB1}$, the floating body 24 potential after the write logic-0 operation will become $V_{FB1}$-$\Delta V_{FB}$. Therefore, the WL potential needs to be optimized such that the decrease in floating body potential of memory cells 50 in state logic-1 is not too large during the time when the positive voltage is applied to (and subsequently removed from) WL terminal 70*a*. For example, the maximum floating body potential increase due to the coupling from the WL potential cannot exceed $V_{FB1}/2$. Thus in some embodiments it may be advantageous to have a slightly positive voltage on unselected BL terminal 74*p*. This means that bipolar device 30 can only evacuate holes in reverse operation (e.g., only the p-n junction between the floating body 24 and buried well 22 will be on enough to evacuate holes from the floating body region 24) which may minimize the reduction of holes in floating body region 24 in the logic-1 state.

As shown in FIGS. 48E and 48F, for representative memory cell 250*c* sharing the same column as the selected representative memory cell 250*a*, a negative voltage is applied to the BL terminal 74*a*, resulting in an increase in the potential difference between floating body 24 and bit line region 16 connected to the BL terminal 74*a*. As a result, the p-n diode formed between floating body 24 and bit line region 16 will be forward biased. For memory cells in the logic-0 state, the increase in the floating body 24 potential will not change the initial state from logic-0 as there is initially no hole stored in the floating body 24. For memory cells in the logic-1 state, the net effect is that the floating body 24 potential after write logic-0 operation will be reduced. Therefore, the BL potential also needs to be optimized such that the decrease in floating body potential of memory cells 250 in state logic-1 is not too large during the time when the negative voltage is applied to BL terminal 74*a*. For example, the $-V_{FB1}/2$ is applied to the BL terminal 74*a*.

As shown in FIGS. 48G and 48H, memory cell 250*d* sharing neither the same row nor the same column as the selected representative memory cell 250*a*, these cells will be in a holding mode as positive voltage is applied to the SL terminal 72*n*, zero voltage is applied to the BL terminal 74*p*, and zero or negative voltage is applied to WL terminal 70*n*, and zero voltage is applied to substrate terminal 78.

Three different methods for performing a write logic-0 operation on memory cell 250 have been disclosed. Many other embodiments and component organizations are possible like, for example, reversing the first and second conductivity types while inverting the relative voltage biases applied. An exemplary array 280 has been used for illustrative purposes, but many other possibilities are possible like, for example, applying different bias voltages to the various array line terminals, employing multiple arrays, performing multiple single bit write logic-0 operations to multiple selected bits in one or more arrays or by use of decoding circuits, interdigitating bits so as to conveniently write logic-0s to a data word followed by writing logic-1s to selected ones of those bits, etc. Such embodiments will readily suggest themselves to persons of ordinary skill in the art familiar with the teachings and illustrations herein. Thus the exemplary embodiments, features, bias levels, etc., described are not limiting in any way.

A write logic-1 operation may be performed on memory cell 250 through impact ionization as described, for example, with reference to Lin cited above, or through a band-to-band tunneling mechanism (also known as Gate Induced Drain Leakage or GIDL), as described, for example with reference to Yoshida cited above. An example of a write logic-1 operation using the GIDL method is described in conjunction with FIGS. 49 and 50A through 50H while an example of a write logic-1 operation using the impact ionization method is described in conjunction with FIGS. 51 and 52A through 52H.

Figure 49:
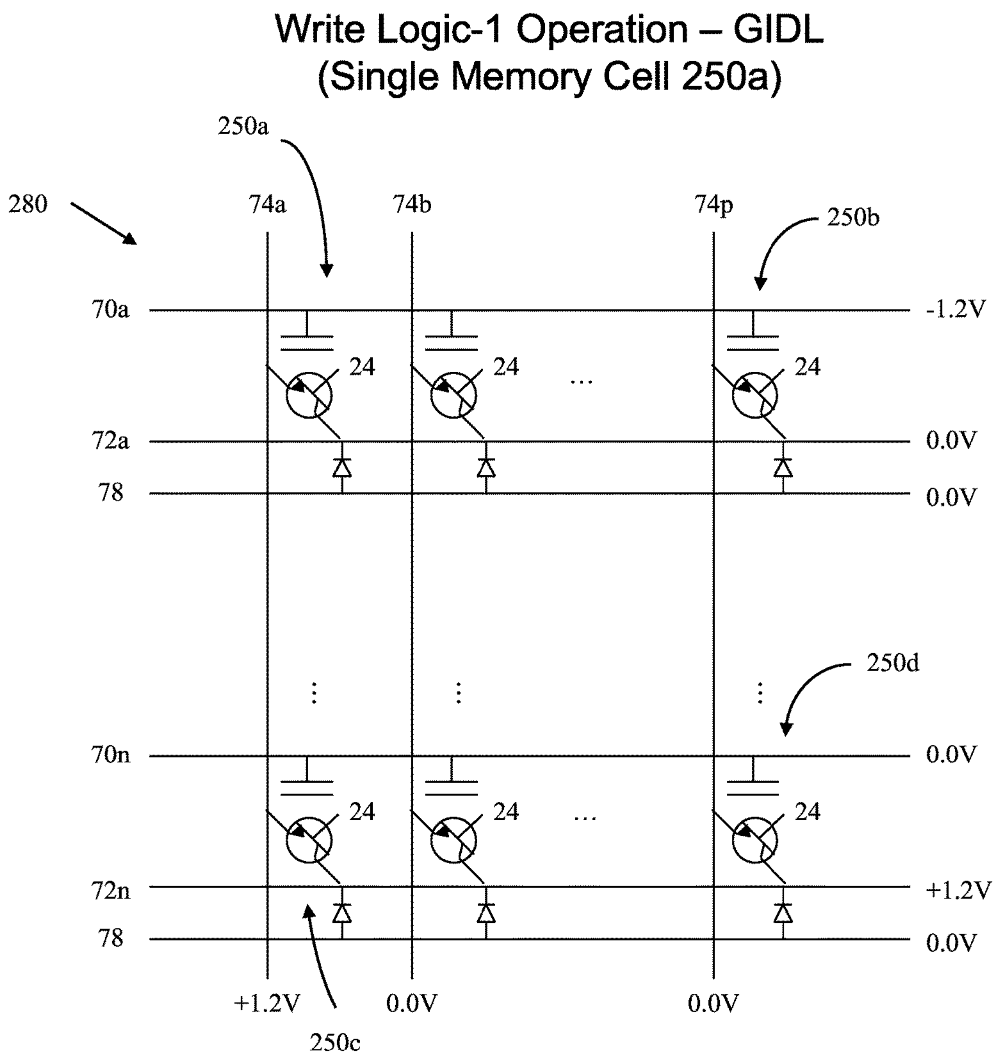
FIG. 49 illustrates an array of memory cells according to the present invention during a first type of write logic-1 operation.

In FIG. 49 an example of the bias conditions of the array 280 including selected representative memory cell 250*a* during a band-to-band tunneling write logic-1 operation is shown. The negative bias applied to the WL terminal 70*a* and the positive bias applied to the BL terminal 74*a* results in hole injection to the floating body 24 of the selected representative memory cell 250*a*. The SL terminal 72*a* and the substrate terminal 78 are grounded during the write logic-1 operation.

The negative voltage on WL terminal 70 couples the voltage potential of the floating body region 24 in representative memory cell 250*a* downward. This combined with the positive voltage on BL terminal 74*a* creates a strong electric field between the bit line region 16 and the floating body region 24 in the proximity of gate 60 (hence the "gate induced" portion of GIDL) in selected representative memory cell 250*a*. This bends the energy bands sharply upward near the gate and drain junction overlap region, causing electrons to tunnel from the valence band to the conduction band, leaving holes in the valence band. The electrons which tunnel across the energy band become the drain leakage current (hence the "drain leakage" portion of GIDL), while the holes are injected into floating body region 24 and become the hole charge that creates the logic-1 state. This process is well known in the art and is illustrated in Yoshida (specifically FIGS. 2 and 6 on page 3 and FIG. 9 on page 4) cited above.

Figure 50A:
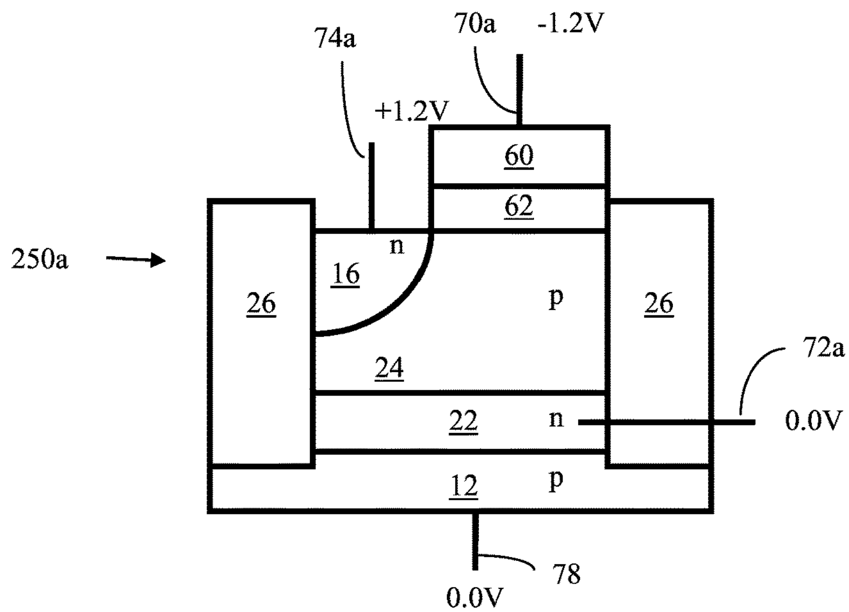
FIGS. 50A through 50H illustrate the operation of four representative memory cells of the array of FIG. 15 during the first type of write logic-1 operation.
Figure 50B:
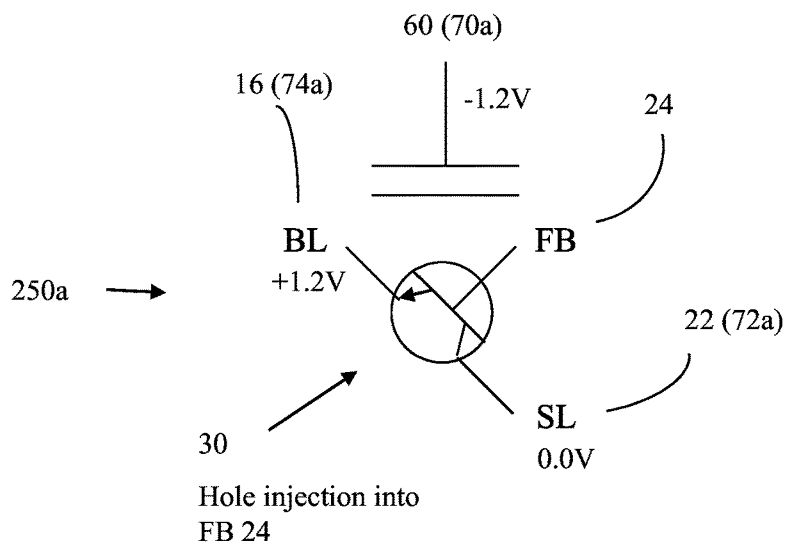

As shown in FIGS. 50A through 50B, the following bias conditions may be applied to the selected representative memory cell 250*a:* a potential of about 0.0 volts is applied to SL terminal 72*a,* a potential of about +1.2 volts is applied to BL terminal 74*a,* a potential of about −1.2 volts is applied to WL terminal 70*a,* and about 0.0 volts is applied to substrate terminal 78.

Elsewhere in array 280 the following bias conditions are applied to the terminals for unselected memory cells 250 including representative memory cells 250*b,* 250*c* and 250*d:* about +1.2 volts is applied to SL terminal 72*n,* about 0.0 volts is applied to BL terminal 74*p,* a potential of about 0.0 volts is applied to WL terminal 70*n,* and about 0.0 volts is applied to substrate terminal 78. FIG. 49 shows the bias condition for the selected and unselected memory cells in memory array 280. However, these voltage levels may vary from embodiment to embodiment of the present invention and are exemplary only and are in no way limiting.

Figure 50C:
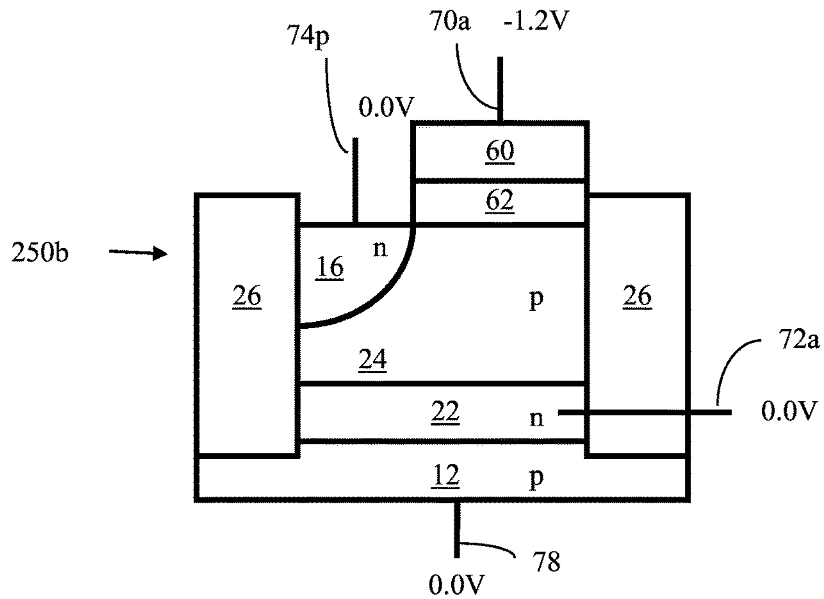
Figure 50D:
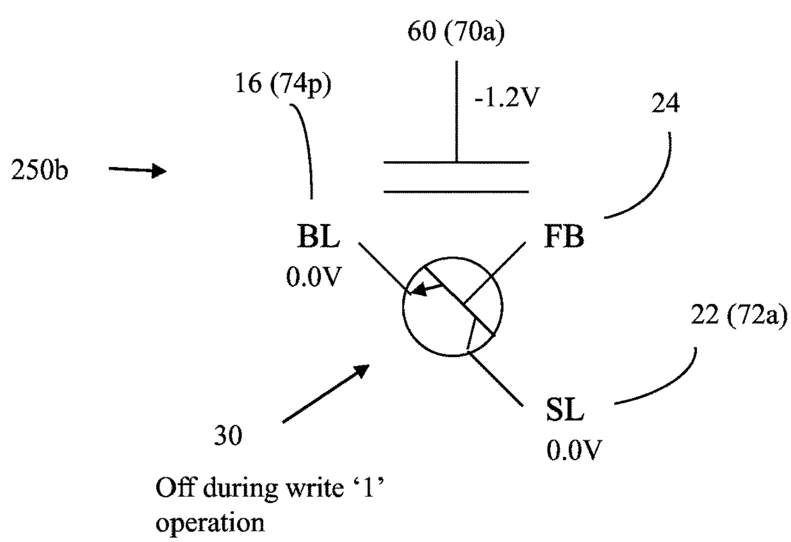
Figure 50E:
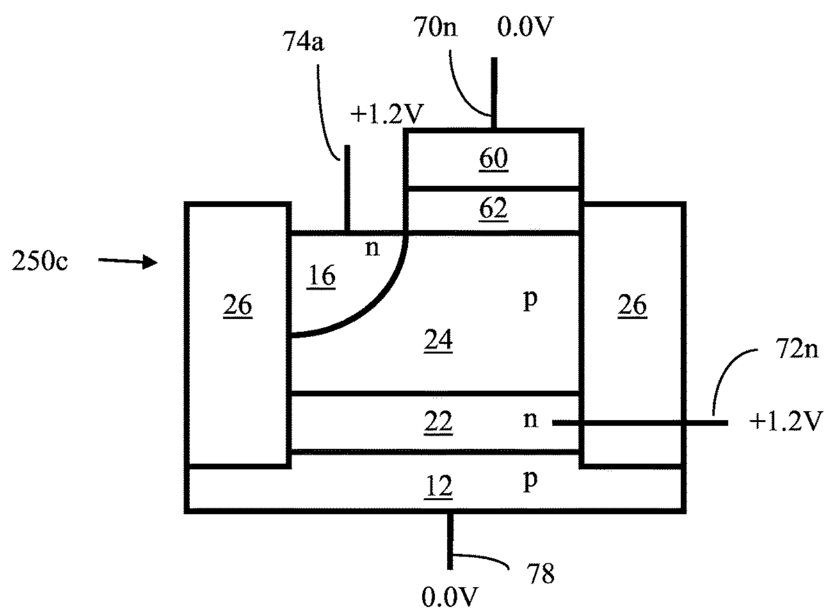
Figure 50F:
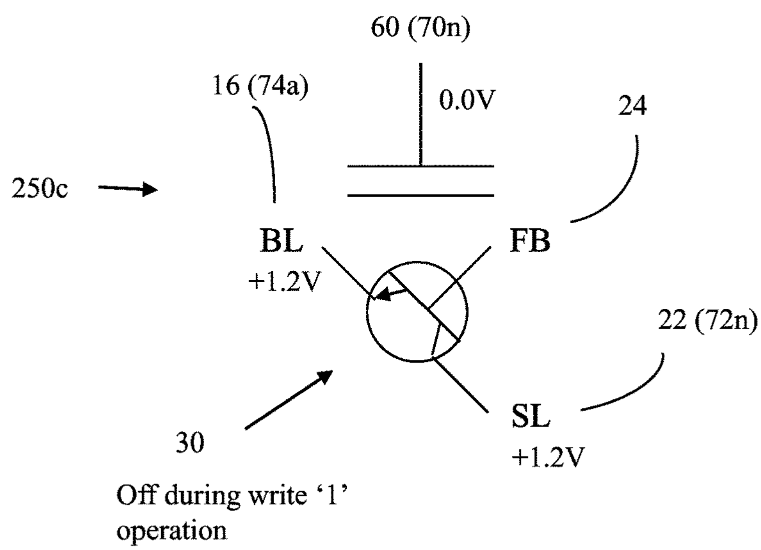
Figure 50G:
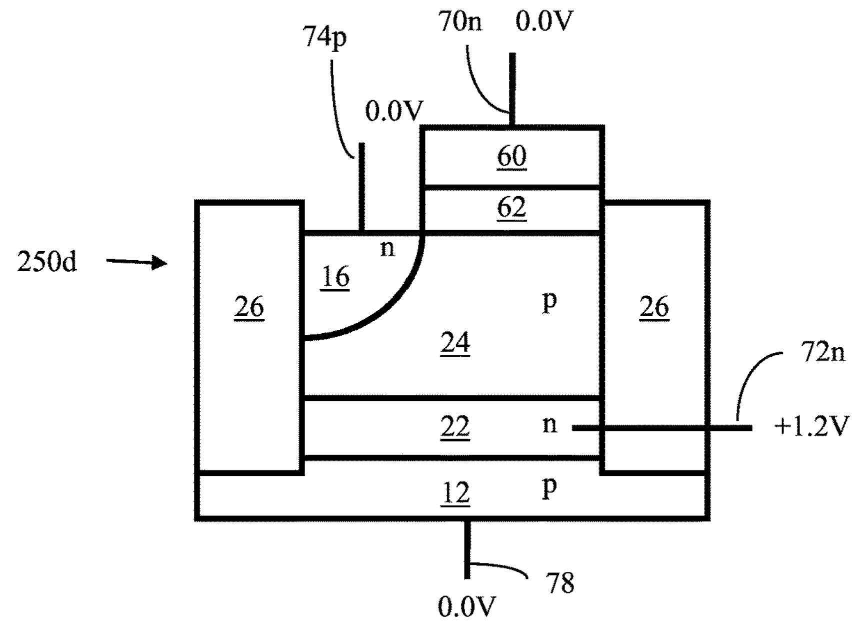
Figure 50H:
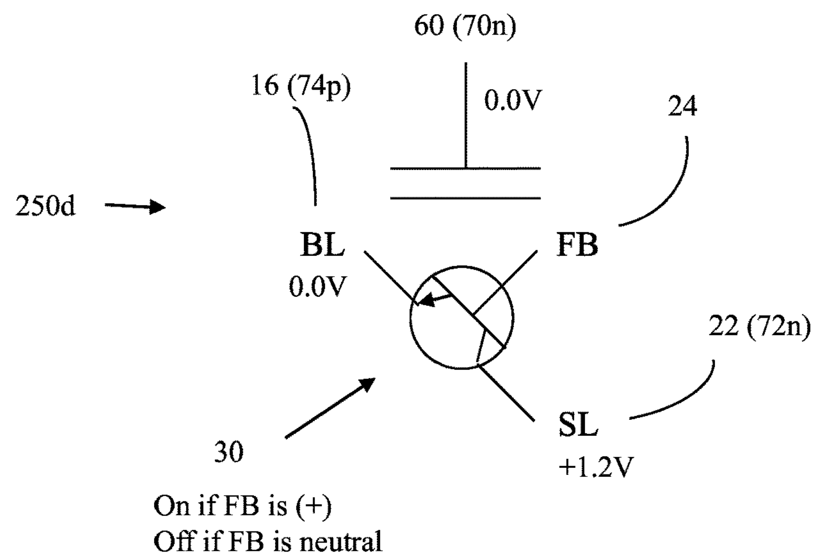

The unselected memory cells during write logic-1 operations are shown in FIGS. 50C through 50H. The bias conditions for memory cells sharing the same row (e.g. representative memory cell 250*b*) are shown in FIGS. 50C and 50D. The bias conditions for memory cells sharing the same column as the selected representative memory cell 250*a* (e.g. representative memory cell 250*c*) are shown in FIGS. 50E and 50F. The bias conditions for memory cells 250 not sharing the same row nor the same column as the selected representative memory cell 250*a* (e.g. representative memory cell 250*d*) are shown in FIGS. 50G and 50H.

As illustrated in FIGS. 50C and 50D, representative memory cell 250*b,* sharing the same row as the selected representative memory cell 250*a,* has both terminals 72*a* and 74*p* grounded, while about −1.2 volts is applied to WL terminal 70*a*. Because SL terminal 70*a* is grounded, memory cell 250*b* will not be at the holding mode since there is no voltage across between the emitter and collector terminals of the n-p-n bipolar device 30 turning it off. However, because the write logic-1 operation is accomplished much faster (on the order of nanoseconds) compared to the lifetime of the charge in the floating body 24 (on the order of milliseconds), it should cause little disruption to the charge stored in the floating body.

As illustrated in FIGS. 50E and 50F, for representative memory cell 250*c* sharing the same column as the selected memory cell, a positive voltage is applied to the BL terminal 74*n.* No base current will flow into the floating body 24 because there is no potential difference between SL terminal 72*n* and BL terminal 74*a* (i.e. there is no voltage between the emitter and collector terminals of the n-p-n bipolar device 30 turning it off). However, because a write operation is accomplished much faster (in the order of nanoseconds) compared to the lifetime of the charge in the floating body 24 (in the order of milliseconds), it should cause little disruption to the charge stored in the floating body.

As illustrated in FIGS. 50G and 50H, for memory cell 250*d* sharing neither the same row nor the same column as the selected memory cell, the SL terminal 72*n* will remain positively charged while the gate terminal 70*n* and the BL terminal 74*p* remain grounded. As can be seen, these cells will be at holding mode. Memory cells in state logic-1 will maintain the charge in floating body 24 because the intrinsic bipolar device 30*a* will generate holes current to replenish the charge in floating body 24, while memory cells in state logic-0 will remain in neutral state.

Figure 51:
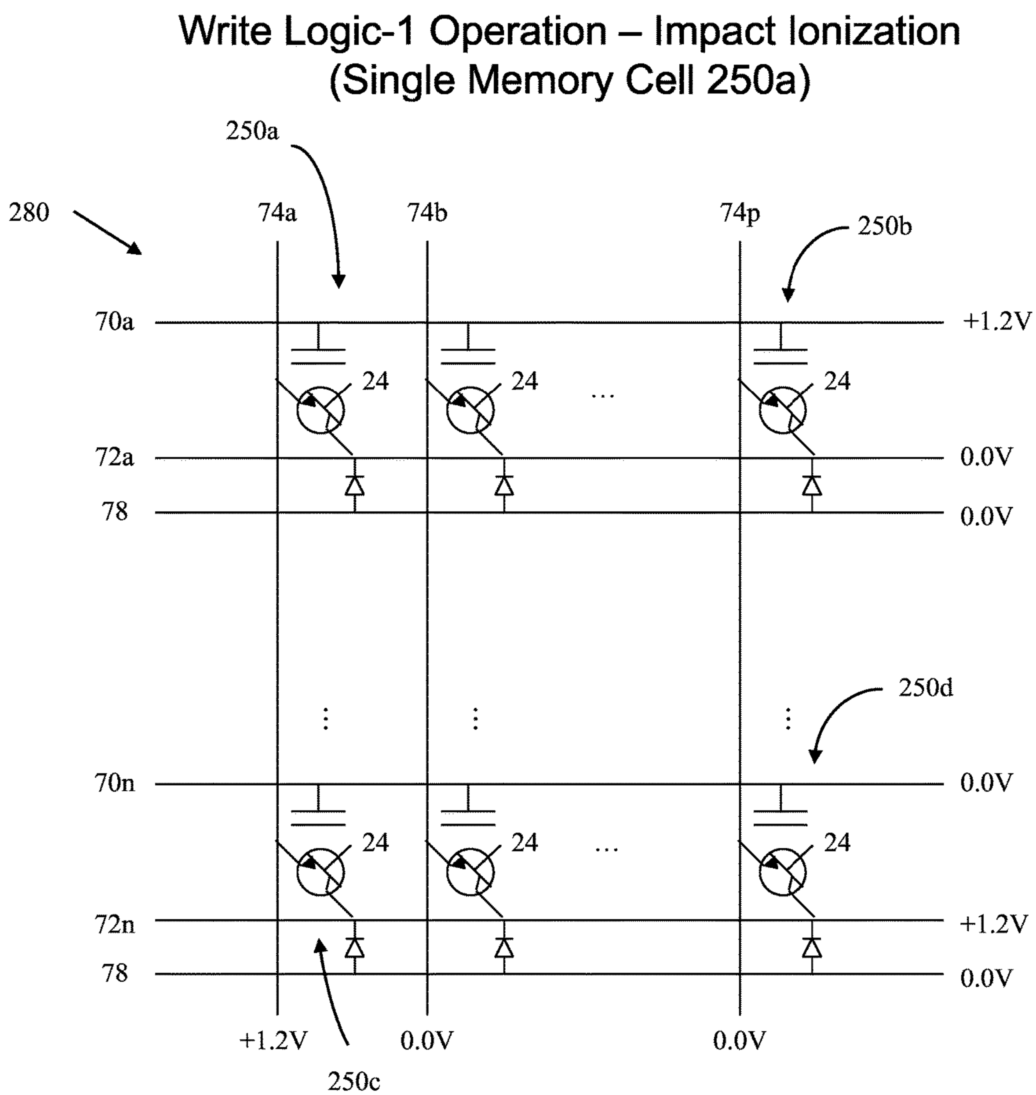
FIG. 51 illustrates an array of memory cells according to the present invention during a second type of write logic-1 operation.

FIG. 51 shows a write logic-1 operation using the impact ionization method. In this case, both the gate 60 and bit line 16 of the memory cell 250 to be written are biased at a positive voltage. This is similar to the holding operation described earlier in conjunction with FIGS. 37A through 38D which also uses impact ionization to supply hole current to the floating body 24. However in the holding operation, the n-p-n bipolar device 30 stays off when a logic-0 is stored in memory cell 250 and impact ionization current only flows when a logic-1 is stored in the cell restoring the charge level in the floating body 24 to a full logic-1 level. By contrast, in the case of a write logic-1 operation using impact ionization, the voltage on the gate terminal is positive rather than zero. The action of raising the gate 60 to a positive voltage has the effect of raising the voltage potential of the floating body region 24 due to capacitive coupling across the gate insulating layer 62 which causes the n-p-n bipolar transistor 30 to turn on regardless of whether or not a logic-1 or logic-0 is stored in memory cell 250. This causes impact ionization current to flow charging the floating body 24 to the logic-1 state regardless of the data originally stored in the cell.

In the exemplary embodiment shown in FIG. 51, the selected word line terminal 70*a* is biased at about +1.2V while the unselected word line terminals 70*b* (not shown) through 70*n* are biased at about 0.0V, the selected bit line terminal 74*a* is also biased at about +1.2V while the unselected bit line terminals 74*b* through 74*p* are biased at about 0.0V, the selected source line 72*a* is biased at about 0.0V, while the unselected source line terminals 72*b* (not shown) through 72*n* are biased at about +1.2V, and the substrate terminal 78 is biased at about 0.0V. These voltage bias levels are exemplary only and will vary from embodiment to embodiment and are thus in no way limiting.

Figure 52A:
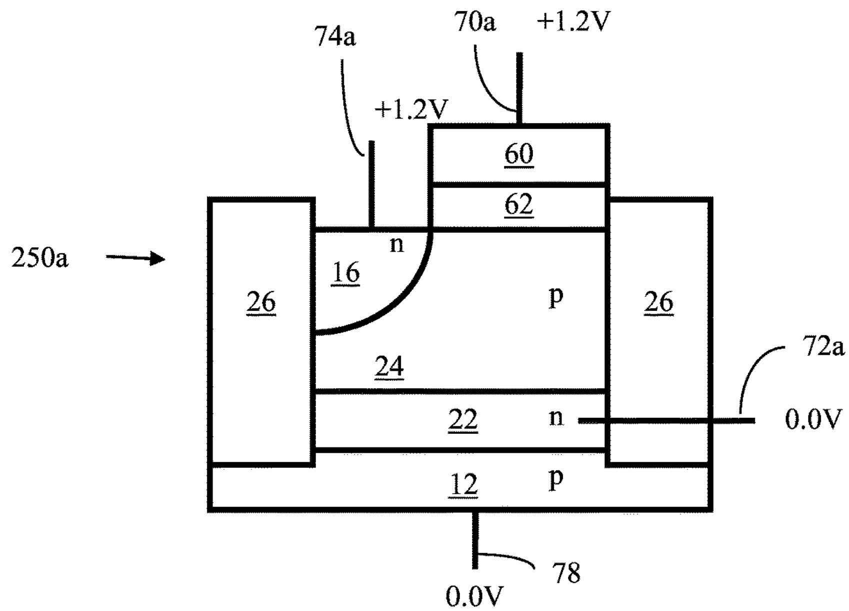
FIGS. 52A through 52H illustrate the operation of four representative memory cells of the array of FIG. 51 during the second type of write logic-1 operation.
Figure 52B:
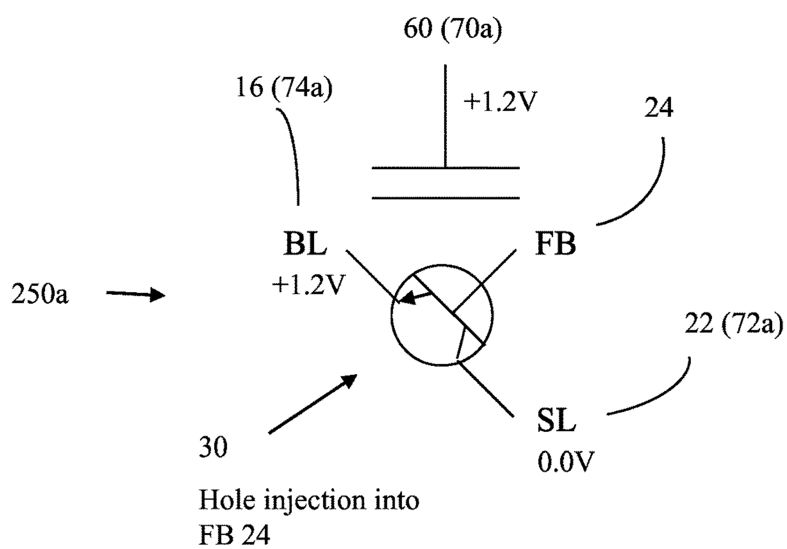

As shown in FIGS. 52A through 52B, selected representative memory cell 50*a* is shown with gate 60 coupled to WL terminal 70A biased at +1.2V, bit line region 16 coupled to BL terminal 74*a* biased at +1.2V, and buried layer 22 coupled to source line terminal 72*a* biased at 0.0V. In this state, impact ionization current flows into the cell from BL terminal 74*a* injecting holes into the floating body region 24 writing a logic-1 state into representative memory cell 250*a*.

Figure 52C:
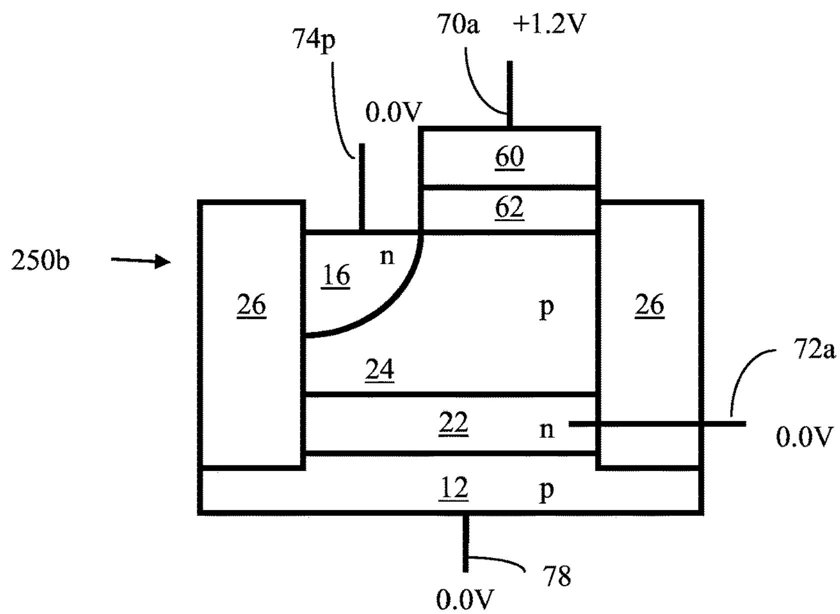
Figure 52D:
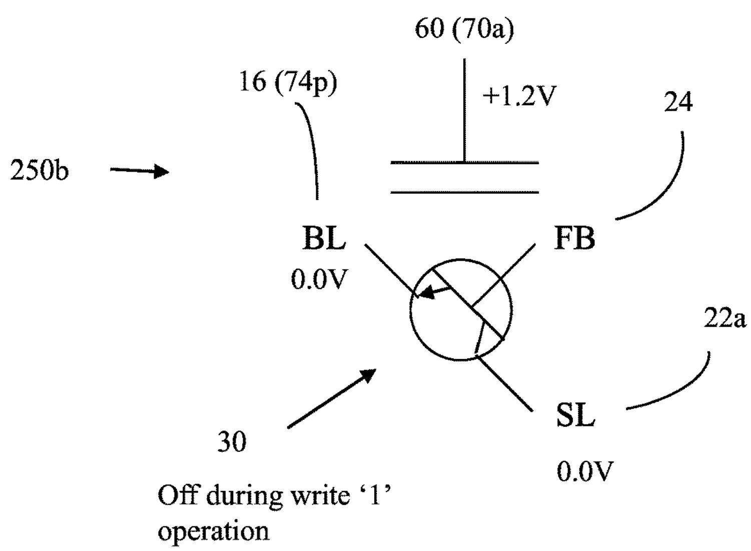

As shown in FIGS. 52C through 52D, unselected representative memory cell 250*b,* sharing a row but not a column with selected representative memory cell 250*a,* is shown with gate 60 coupled to WL terminal 70*a* biased at +1.2V, bit line region 16 coupled to BL terminal 74*p* biased at 0.0V, and buried layer 22 coupled to source line terminal 72*a* biased at 0.0V. In this state, the collector-to-emitter voltage of n-p-n bipolar device 30 is 0.0V causing the device to be off protecting the contents of representative memory cell 250*b*.

Figure 52E:
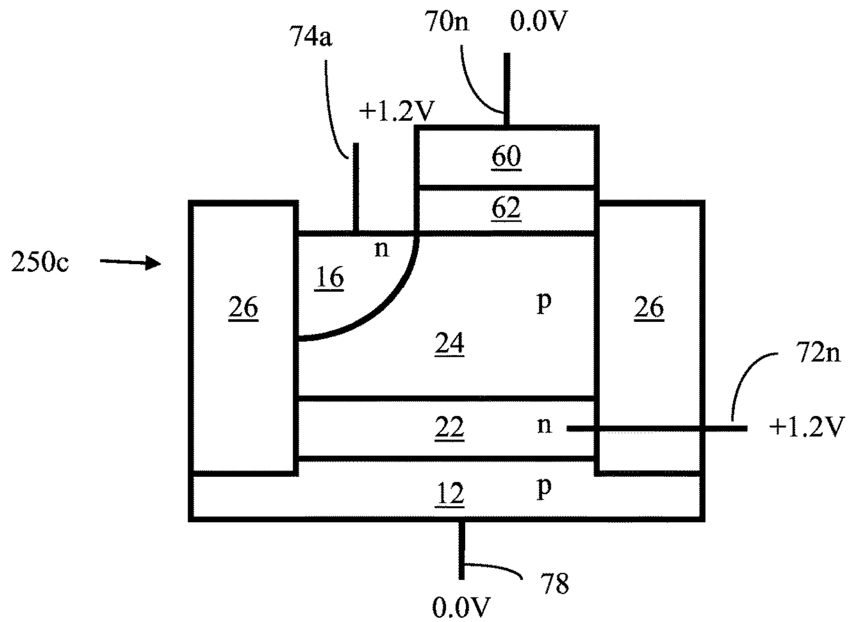
Figure 52F:
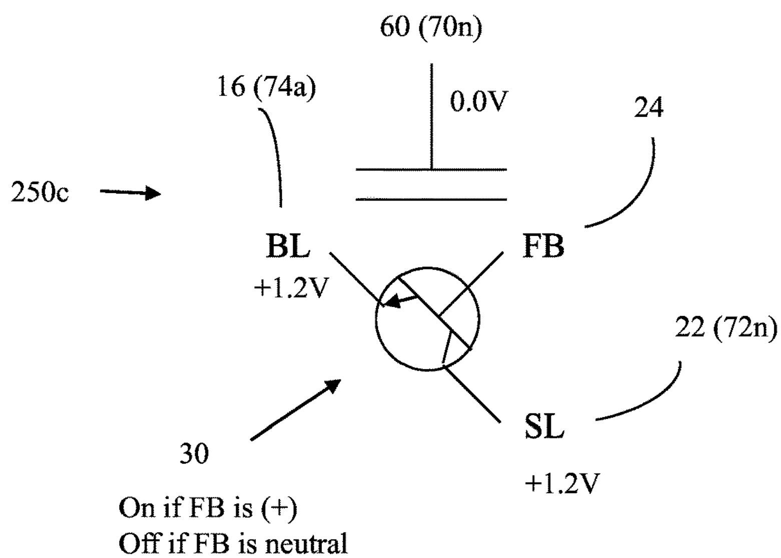

As shown in FIGS. 52E through 52F, unselected representative memory cell 250*c,* sharing a column but not a row with selected representative memory cell 250*a,* is shown with gate 60 coupled to WL terminal 70*n* biased at 0.0V, bit line region 16 coupled to BL terminal 74*a* biased at +1.2V, and buried layer 22 coupled to source line terminal 72*n* biased at +1.2V. In this state, the n-p-n bipolar device 30 will be off since there is no voltage difference between the collector and emitter terminals of n-p-n bipolar device 30.

Figure 52G:
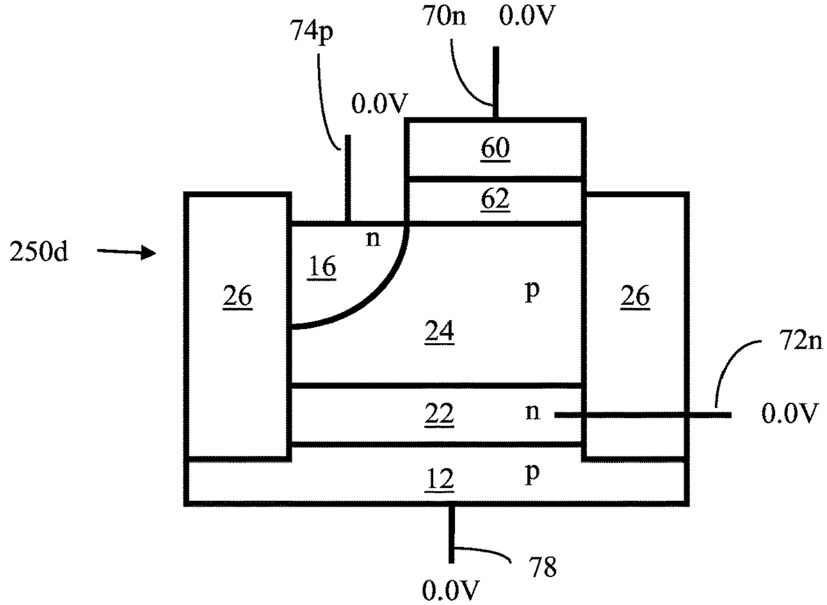
Figure 52H:
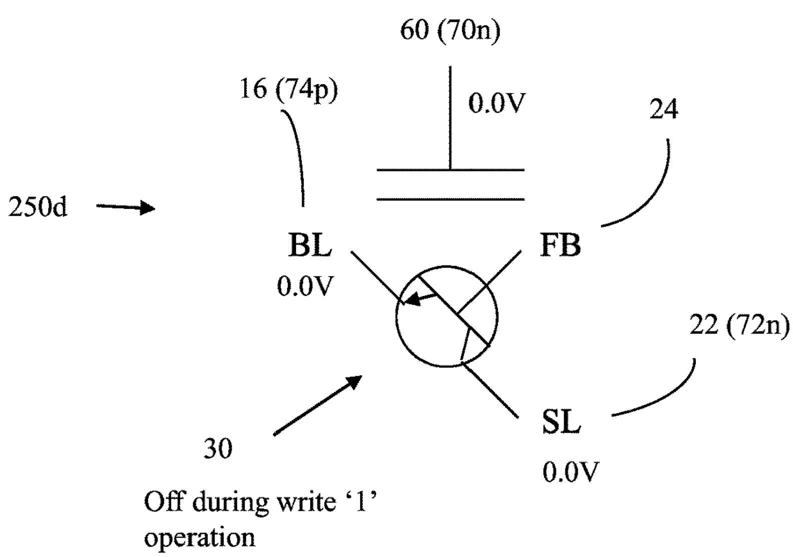

As shown in FIGS. 52G through 52H, unselected representative memory cell 250*d*, sharing neither a row nor a column with selected representative memory cell 250*a*, is shown with gate 60 coupled to WL terminal 70*n* biased at 0.0V, bit line region 16 coupled to BL terminal 74*p* biased at 0.0V, and buried layer 22 coupled to source line terminal 72*n* biased at +1.2V. As can be seen, these cells will be at holding mode. Memory cells in state logic-1 will maintain the charge in floating body 24 because the intrinsic bipolar device 30*a* will generate holes current to replenish the charge in floating body 24, while memory cells in state logic-0 will remain in neutral state.

Figure 53A:
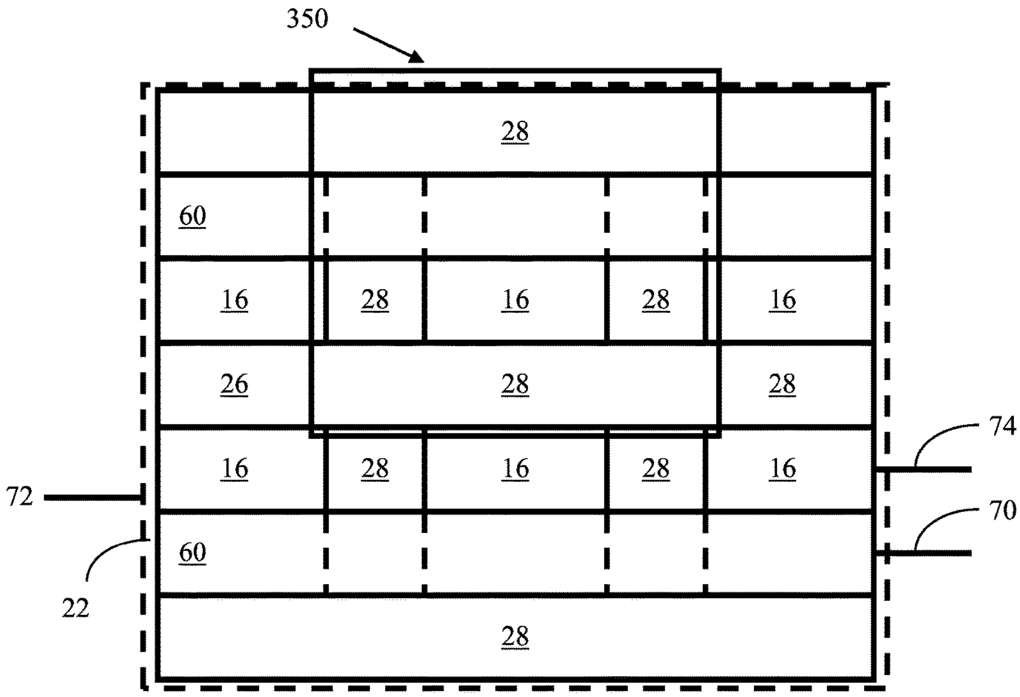
FIGS. 53A through 53E illustrate a second exemplary memory cell according to the present invention.
Figure 53B:
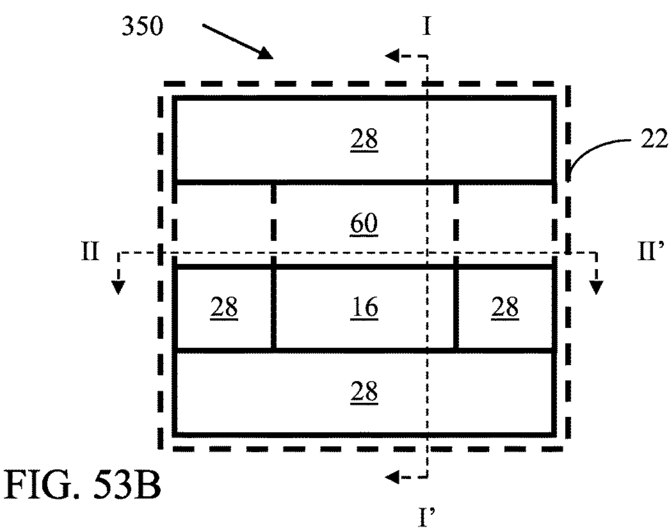
Figure 53C:
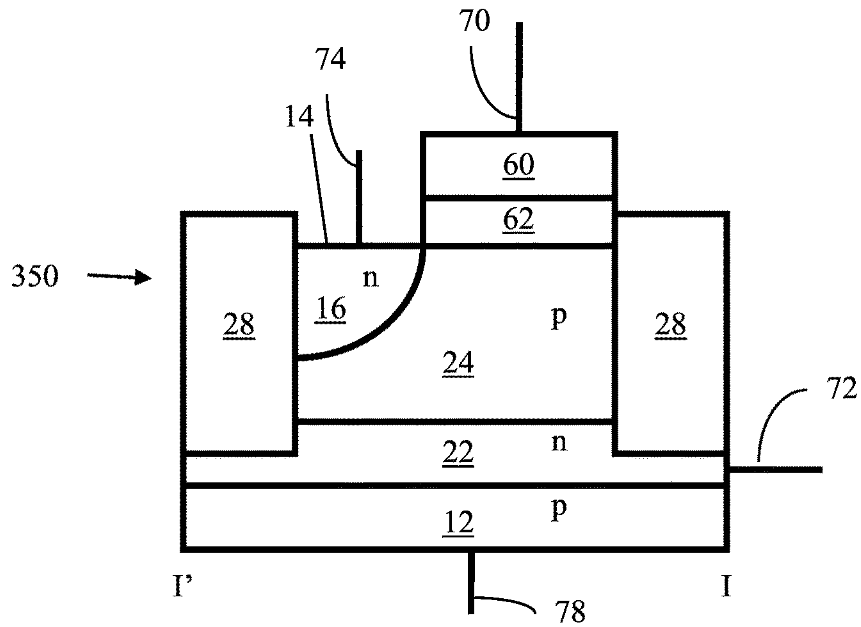
Figure 53D:
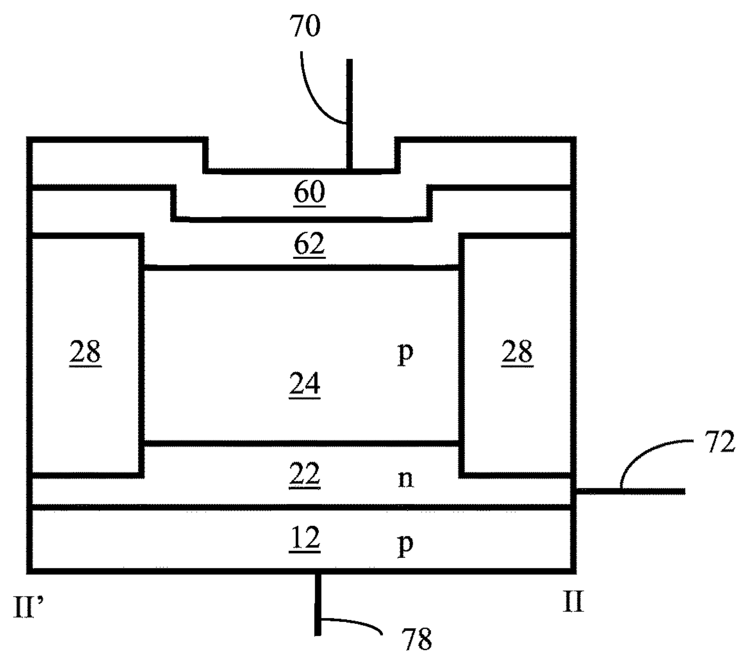
Figure 53E:
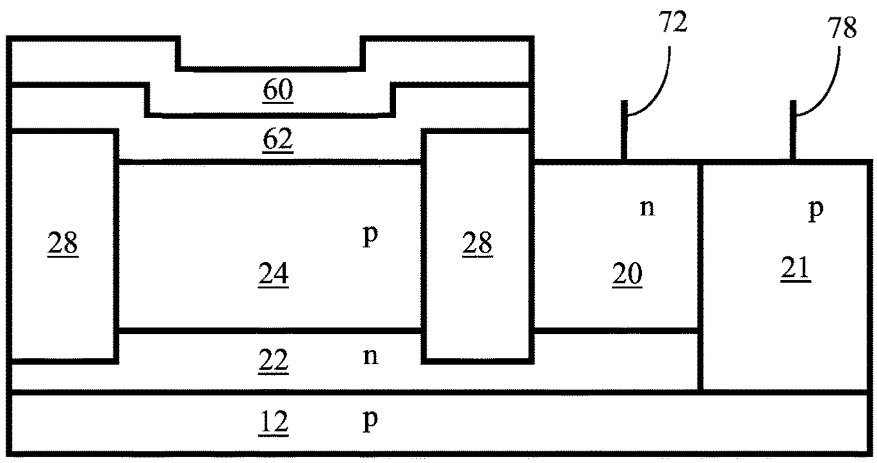

FIG. 53A shows a top view of an embodiment of a partial memory array including Gated half transistor memory cell 350 according to the present invention and FIG. 53B shows memory cell 350 in isolation. FIGS. 53C and 53D show the memory cell 350 cross sections along the I-I' line and II-II' cut lines, respectively, while FIG. 53E shows a method of contacting the buried well and substrate layers beneath the cells. FIGS. 54A through 54H show memory array 380 comprised of rows and columns of memory cell 350. The primary difference between memory cell 250 and memory cell 350 is that while insulating layers 26 isolate the buried layer 22 between memory cells in adjacent rows in memory cell 250, in memory cell 350 the regions occupied by insulating layer 26 are replaced by insulating layer 28. Thus memory cell 350 is surrounded by insulating layer 28 on all four sides and the buried layer 22 is continuously connected as a single "source line" amongst all of the memory cells 350 in memory array 380. This makes for a memory array that is very similar to memory array 280, however some operations will be different as described below in conjunction with FIGS. 54A through 54F. As was the case with memory cell 250 in memory cell 280, there is no contact to the buried layer 22 within the boundary of memory cell 350.

Referring to FIGS. 53C and 53D together, the cell 350 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. In some embodiments of the invention, substrate 12 can be the bulk material of the semiconductor wafer. In other embodiments, substrate 12 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 12 will is drawn as the semiconductor bulk material as it is in FIGS. 53C and 53D though it may also be a well in a substrate of material of the second type of conductivity.

A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by bit line region 16 an insulating layer 62, on the sides by insulating layer 28, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments, as a matter of design choice.

Insulating layers 28 (like, for example, shallow trench isolation (STI)), may be made of silicon oxide, for example, though other insulating materials may be used. Insulating layers 28 insulate cell 350 from neighboring cells 350 when multiple cells 350 are joined in an array 380 to make a memory device as illustrated in FIGS. 54A-54F. Insulating layer 28 insulates neighboring body regions 24, but not the buried layer 22, allowing the buried layer 22 to be continuous (i.e. electrically conductive) under the entire array 380.

A bit line region 16 having a second conductivity type, such as n-type, for example, is provided in floating body region 24 and is exposed at surface 14. Bit line region 16 is formed by an implantation process formed on the material making up substrate 12, according to any implantation process known and typically used in the art. Alternatively, a solid state diffusion process could be used to form bit line region 16.

A gate 60 is positioned in between the bit line region 16 and insulating layer 28 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Memory cell 350 further includes word line (WL) terminal 70 electrically connected to gate 60, bit line (BL) terminal 74 electrically connected to bit line region 16, source line (SL) terminal 72 electrically connected to buried layer 22, and substrate terminal 78 electrically connected to substrate 12.

As shown in FIG. 53E, contact between SL terminal 72 and buried layer 22 can be made through region 20 having a second conductivity type, and which is electrically connected to buried well region 22, while contact between substrate terminal 78 and substrate region 12 can be made through region 21 having a first conductivity type, and which is electrically connected to substrate region 12.

The SL terminal 72 connected to the buried layer region 22 serves as a back bias terminal, i.e. a terminal at the back side of a semiconductor transistor device, usually at the opposite side of the gate of the transistor.

Comparing the structure of the memory device 350, for example, as shown in FIG. 53C to the structure of transistor devices 100, 100A and 100B in FIGS. 90A through 90C, it can be seen that the memory device of present invention constitutes a smaller structure relative to the MOSFET devices 100, 100A and 100B, where only one region of a second conductivity type is present at the surface of the silicon substrate. Thus, memory cell 350 of the present invention provides an advantage that it consists of only one region of second conductivity at the surface (i.e. bit line region 16 as opposed to regions 84 and 86 or regions 84A and 86A) and hence requires only one contact per memory cell 350 (i.e. to create a connection between bit line region 16 and terminal 74).

Persons of ordinary skill in the art will appreciate that in FIGS. 53A through 53E and that the first and second conductivity types can be reversed in memory cell 350 as a matter of design choice and that the labeling of regions of the first conductivity type as p-type and the second conductivity type as p-type is illustrative only and not limiting in any way. Thus the first and second conductivity types can be p-type and n-type respectively in some embodiments of memory cell 350 and be n-type and p-type respectively in other embodiments. Further, such skilled persons will realize that the relative doping levels of the various regions of either conductivity type will also vary as a matter of design choice and that there is no significance to the absence of notation signifying higher or lower doping levels such as p+ or p− or n+ or n− in any of the diagrams.

Figure 54A:
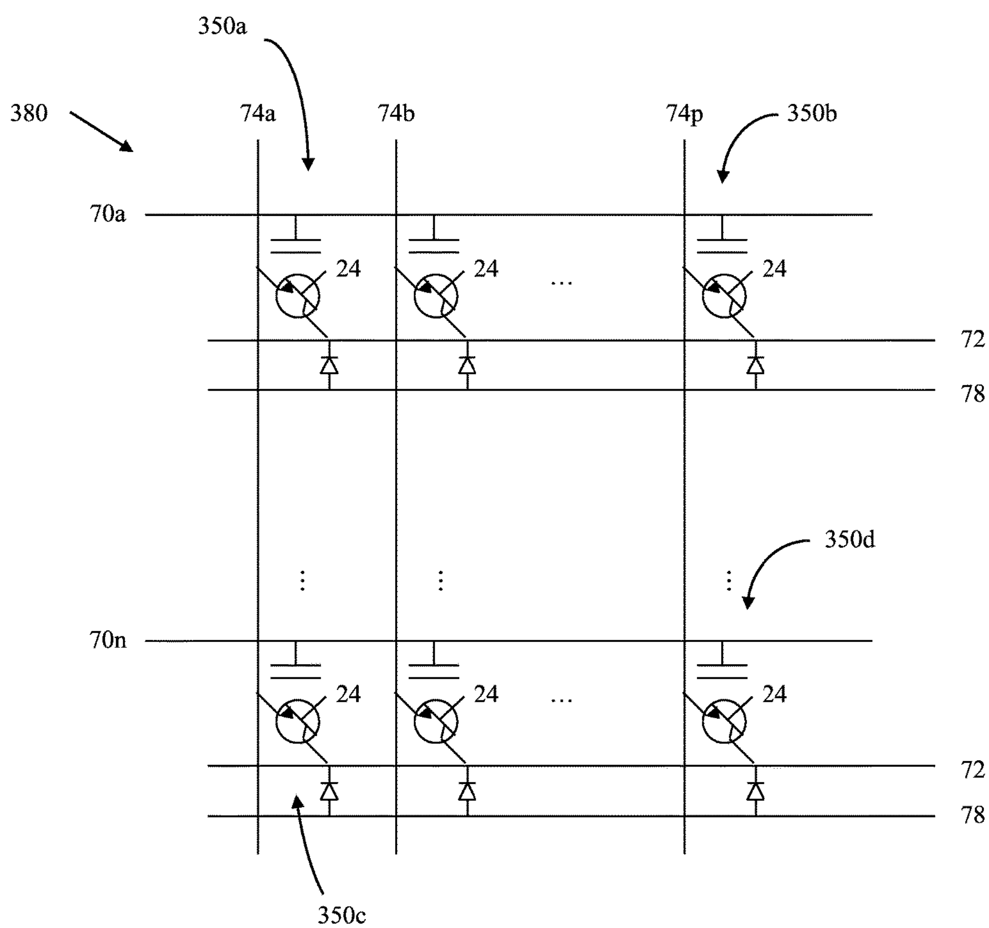
FIGS. 54A through 54H illustrate performing operations on an array of the memory cell of FIGS. 53A through 53E.

FIG. 54A shows an exemplary memory array 380 of memory cells 350 (four exemplary instances of memory cell 350 being labeled as 350*a*, 350*b*, 350*c* and 350*d*) arranged in rows and columns. In many, but not all, of the figures where exemplary memory array 380 appears, representative memory cell 350*a* will be representative of a "selected" memory cell 350 when the operation being described has one (or more in some embodiments) selected memory cells 350. In such figures, representative memory cell 350*b* will be representative of an unselected memory cell 350 sharing the same row as selected representative memory cell 350*a*, representative memory cell 350*c* will be representative of an unselected memory cell 350 sharing the same column as selected representative memory cell 350*a*, and representative memory cell 350*d* will be representative of a memory cell 350 sharing neither a row or a column with selected representative memory cell 350*a*.

Present in FIG. 54A are word lines 70*a* through 70*n*, source line terminal 72X, bit lines 74*a* through 74*p*, and substrate terminal 78. Each of the word lines 70*a* through 70*n* is associated with a single row of memory cells 350 and is coupled to the gate 60 of each memory cell 350 in that row. Each of the bit lines 74*a* through 74*p* is associated with a single column of memory cells 350 and is coupled to the bit line region 16 of each memory cell 350 in that column. It is noteworthy that while the source line terminal 72X is really no longer a control line terminal associated with the source line 72 of a row of memory cells 350 but a control terminal associated with all of the memory cells 350 in exemplary memory array 380, it will still be referred to as "source line" terminal 72X to minimize confusion since it still serves that function for each individual memory cell 350.

Substrate 12 and buried layer 22 are both present at all locations under array 380. Persons of ordinary skill in the art will appreciate that one or more substrate terminals 78 and one or more buried well terminals 72 will be present in one or more locations as a matter of design choice. Such skilled persons will also appreciate that while exemplary array 380 is shown as a single continuous array in FIG. 54A, that many other organizations and layouts are possible like, for example, word lines may be segmented or buffered, bit lines may be segmented or buffered, source lines may be segmented or buffered, the array 380 may be broken into two or more sub-arrays, control circuits such as word decoders, column decoders, segmentation devices, sense amplifiers, write amplifiers may be arrayed around exemplary array 380 or inserted between sub-arrays of array 380. Thus the exemplary embodiments, features, design options, etc., described are not limiting in any way.

Figure 54B:
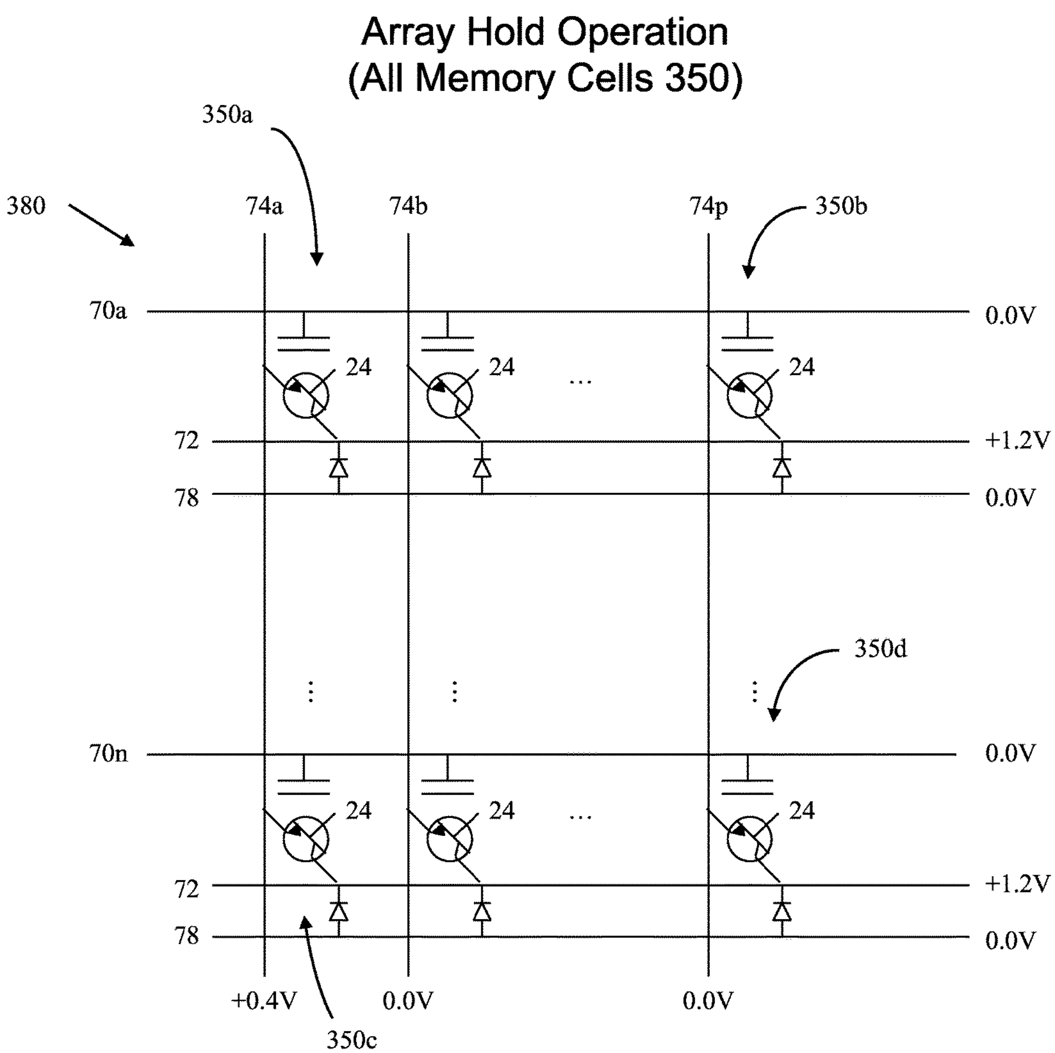

FIG. 54B illustrates an array hold operation on exemplary memory array 380. For all memory cells 350 in the array 380, the hold operation is performed simultaneously by applying about +1.2V to the source line terminal 72 while applying about 0.0V to the word line terminals 70*a* through 70*n*, the bit line terminals 74*a* through 74*p*, and the substrate terminal 78. This bias condition causes each of the memory cells 350 in the array 380 storing a logic-1 to have its intrinsic bipolar transistor 30 turned on to restore the hole charge on its floating body 24 as discussed above. Simultaneously, this bias condition causes each of the memory cells 350 in the array 380 storing a logic-0 to have its intrinsic bipolar transistor 30 turned off to retain charge neutrality in its floating body 24 as previously discussed. The voltages applied are exemplary only, may vary from embodiment to embodiment and are in no way limiting.

Figure 54C:
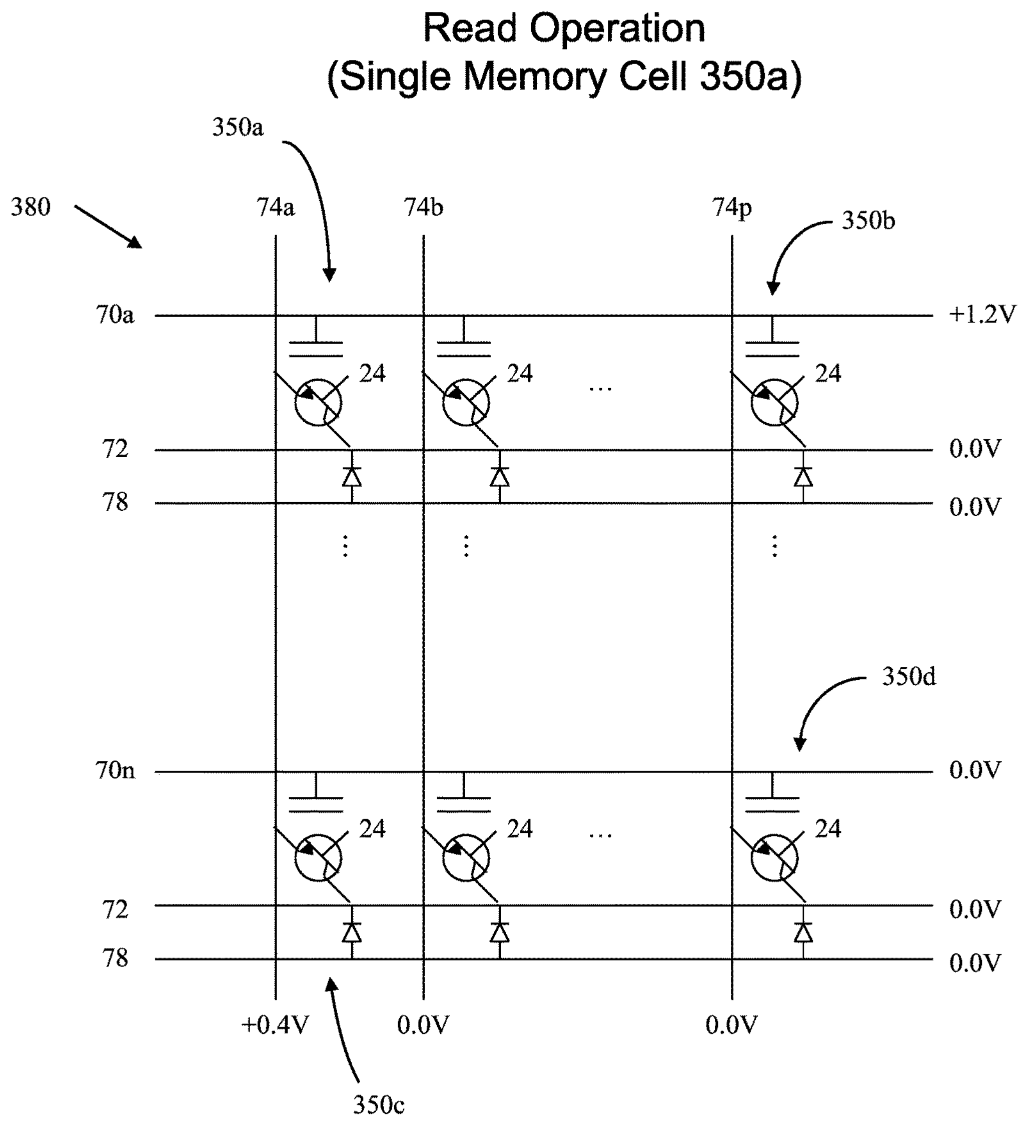

FIG. 54C illustrates a single cell read operation of selected representative memory cell 350*a* in exemplary memory array 350. To accomplish this, the selected word line terminal 70*a* is biased to approximately +1.2V while the unselected word line terminals 70*b* (not shown) through 70*n* are biased to about 0.0V, the selected bit line terminal 74*a* is biased to approximately +0.4V while the unselected bit line terminals 74*b* through 74*p* are biased to about 0.0V, the source line terminal 72 is biased to about 0.0V, and the substrate terminal is biased to about 0.0V. The voltages applied are exemplary only, may vary from embodiment to embodiment, and are in no way limiting.

This has the effect of operating bipolar device 30 as a backward n-p-n transistor in a manner analogous to that described for operating bipolar device 30 for a hold operation as described in conjunction with FIGS. 37A through 37C.

The capacitive coupling between the word line terminal 70*a* and the floating body 24 of selected memory cell 350*a* increase the differentiation in the read current between the logic-1 and logic-0 states as previously described. The optimal bias voltage to apply to WL terminal 70 will vary from embodiment to embodiment and process to process. The actual voltage applied in any given embodiment is a matter of design choice.

Unselected representative memory cell 350*b*, which shares a row with selected representative memory cell 350*a*, has its bipolar device 30 turned off because there is no voltage between the collector and emitter terminals. It retains its logic state during the short duration of the read operation.

Unselected representative memory cell 350*c*, which shares a column with selected representative memory cell 350*a*, will either be off or be in a weak version of the holding operation depending on the device characteristics of the process of any particular embodiment. It also retains its logic state during the short duration of the read operation.

Unselected representative memory cell 350*d*, which shares neither a row nor a column with selected representative memory cell 350*a*, has its bipolar device 30 turned off because there is no voltage between the collector and emitter terminals. It too retains its logic state during the short duration of the read operation.

Figure 54D:
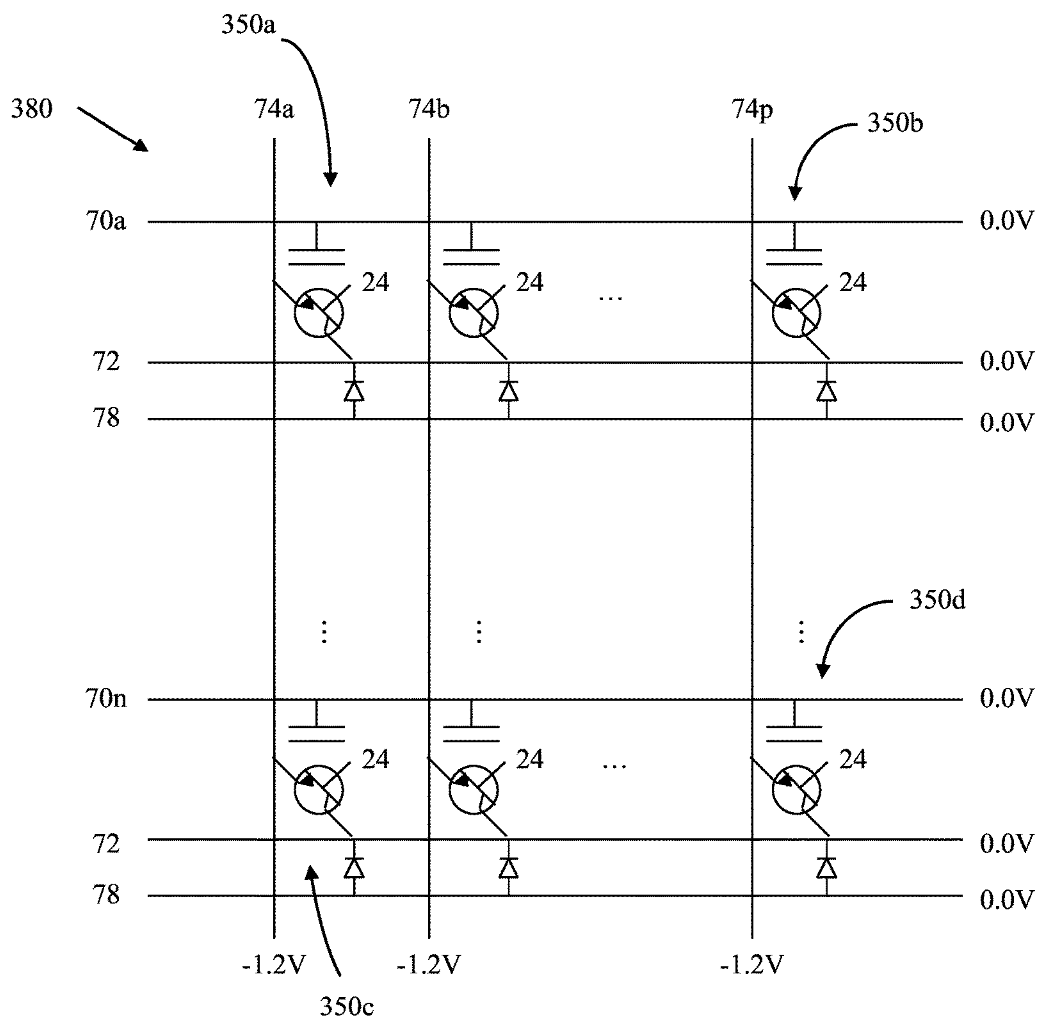

FIG. 54D illustrates an array write logic-0 operation of all the memory cells 350 in exemplary memory array 350. To accomplish this, all the word line terminals 70*a* through 70*n* are biased to approximately 0.0V, all the bit line terminals 74*a* through 74*p* are biased to approximately −1.2V, the source line terminal 72 is biased to about 0.0V, and the substrate terminal is biased to about 0.0V. The voltages applied are exemplary only, may vary from embodiment to embodiment, and are in no way limiting.

This bias condition forward biases the p-n junction between the floating body 24 and the bit line region 16 turning on the intrinsic bipolar device 30 in each of the memory cells 350 as previously described. This evacuates all of the holes in the floating body regions 24 writing a logic-0 to all of the memory cells 350 in array 380.

Figure 54E:
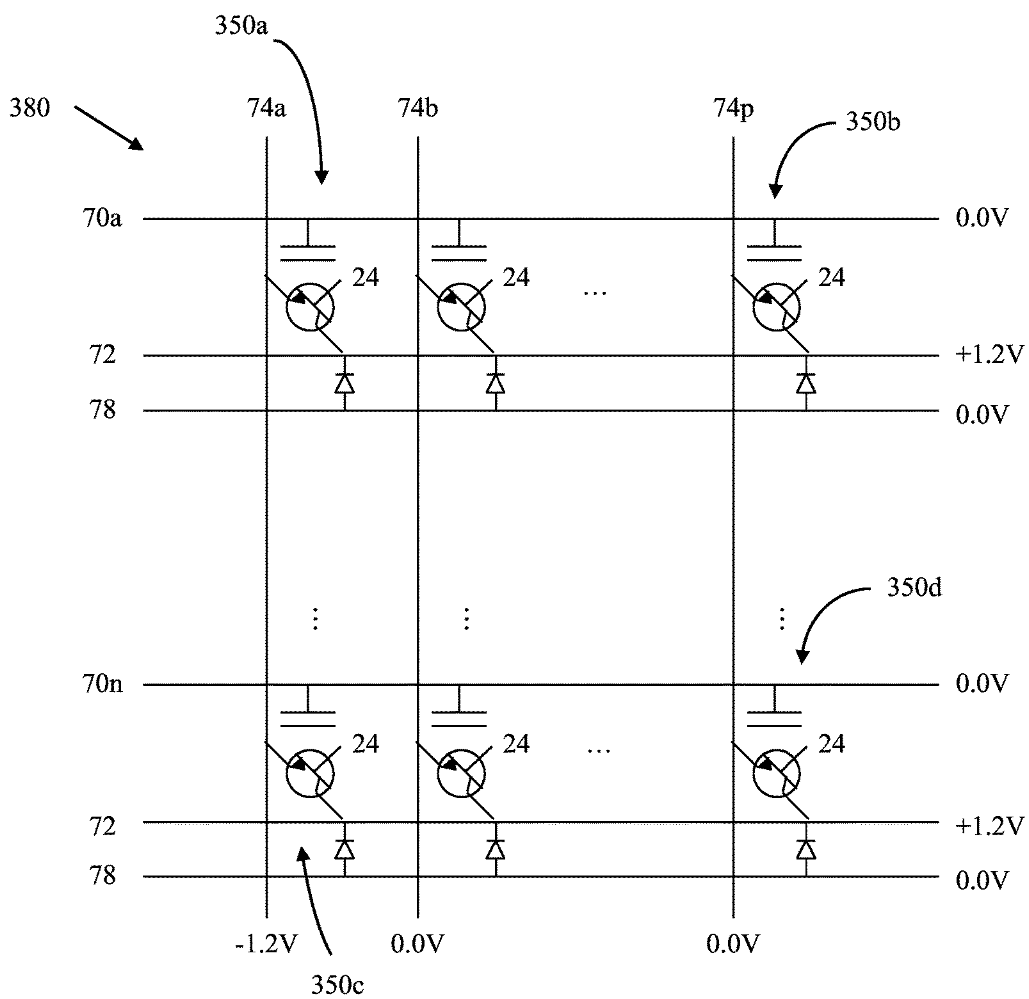

FIG. 54E illustrates a column write logic-0 operation of one column of the memory cells 350 in exemplary memory array 350. To accomplish this, all the word line terminals 70*a* through 70*n* are biased to approximately 0.0V, selected the bit line terminal 74*a* is biased to approximately −1.2V while the unselected bit line terminals 74*b* through 74*p* are biased to about 0.0V, the source line terminal 72 is biased to about +1.2V, and the substrate terminal is biased to about 0.0V. The voltages applied are exemplary only, may vary from embodiment to embodiment, and are in no way limiting.

This bias condition forward biases the p-n junction between the floating body 24 and the bit line region 16 turning on the intrinsic bipolar device 30 in each of the memory cells 350 coupled to bit line 74*a,* including representative memory cells 350*a* and 350*c,* as previously described. This evacuates all of the holes in the floating body regions 24 writing a logic-0 to all of the memory cells 350 in the selected column.

The remaining memory cells 350 in array 380, including representative memory cells 350*b* and 350*d,* are in a holding operation and will retain their logic state during the write logic-0 operation.

Figure 54F:
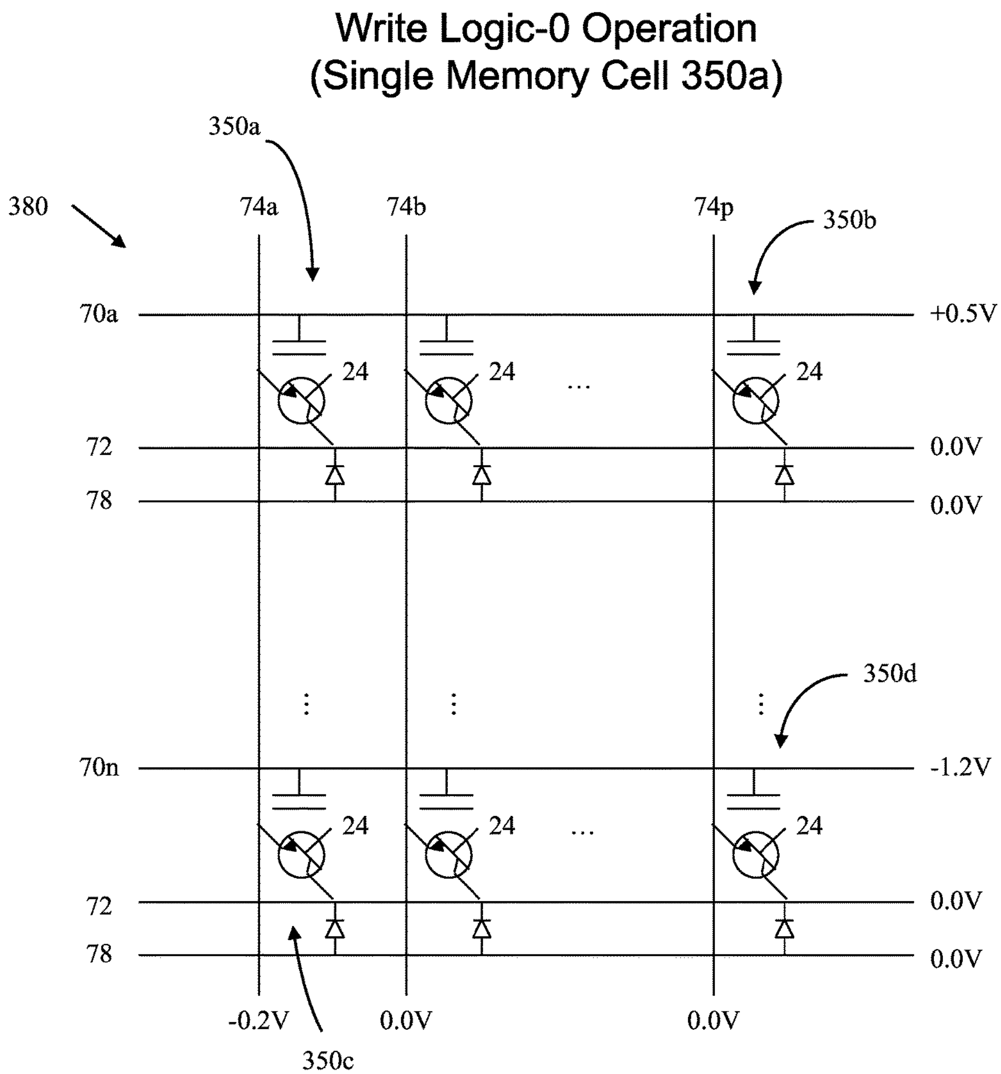

FIG. 54F illustrates a single cell write logic-0 operation of selected representative memory cell 350*a* in exemplary memory array 350. To accomplish this, the selected word line terminal 70*a* is biased to approximately +0.5V while the unselected word line terminals 70*b* (not shown) through 70*n* are biased to about −1.2V, the selected bit line terminal 74*a* is biased to approximately −0.2V while the unselected bit line terminals 74*b* through 74*p* are biased to about 0.0V, the source line terminal 72 is biased to about 0.0V, and the substrate terminal is biased to about 0.0V. The voltages applied are exemplary only, may vary from embodiment to embodiment, and are in no way limiting.

This bias condition forward biases the p-n junction between the floating body 24 and the bit line region 16 turning on the intrinsic bipolar device 30 in selected representative memory cell 350*a.* The capacitive coupling between the word line terminal 70*a* and the floating body 24 of selected memory cell 350*a* causes bipolar device 30 to turn on evacuating the holes in floating body region 24 as previously described.

Unselected representative memory cell 350*b,* which shares a row with selected representative memory cell 350*a,* has its bipolar device 30 turned off because there is no voltage between the collector and emitter terminals. It retains its logic state during the short duration of the read operation.

Unselected representative memory cell 350*c,* which shares a column with selected representative memory cell 350*a,* has the voltage potential of its floating body temporarily lowered because the negative capacitive coupling between its floating body 24 its gate 60 (coupled to word line terminal 70*n*) preventing its bipolar device 30 from turning on. It also retains its logic state during the short duration of the read operation, and the voltage potential of its floating body 24 is restored to its previous level by the positive coupling between its floating body 24 its gate 60 (coupled to word line terminal 70*n*) when the word line terminal is returned to its nominal value of about 0.0V after the operation is complete.

Unselected representative memory cell 350*d,* which shares neither a row nor a column with selected representative memory cell 350*a,* has its bipolar device 30 turned off because there is no voltage between the collector and emitter terminals. It too retains its logic state during the short duration of the read operation.

Figure 54G:
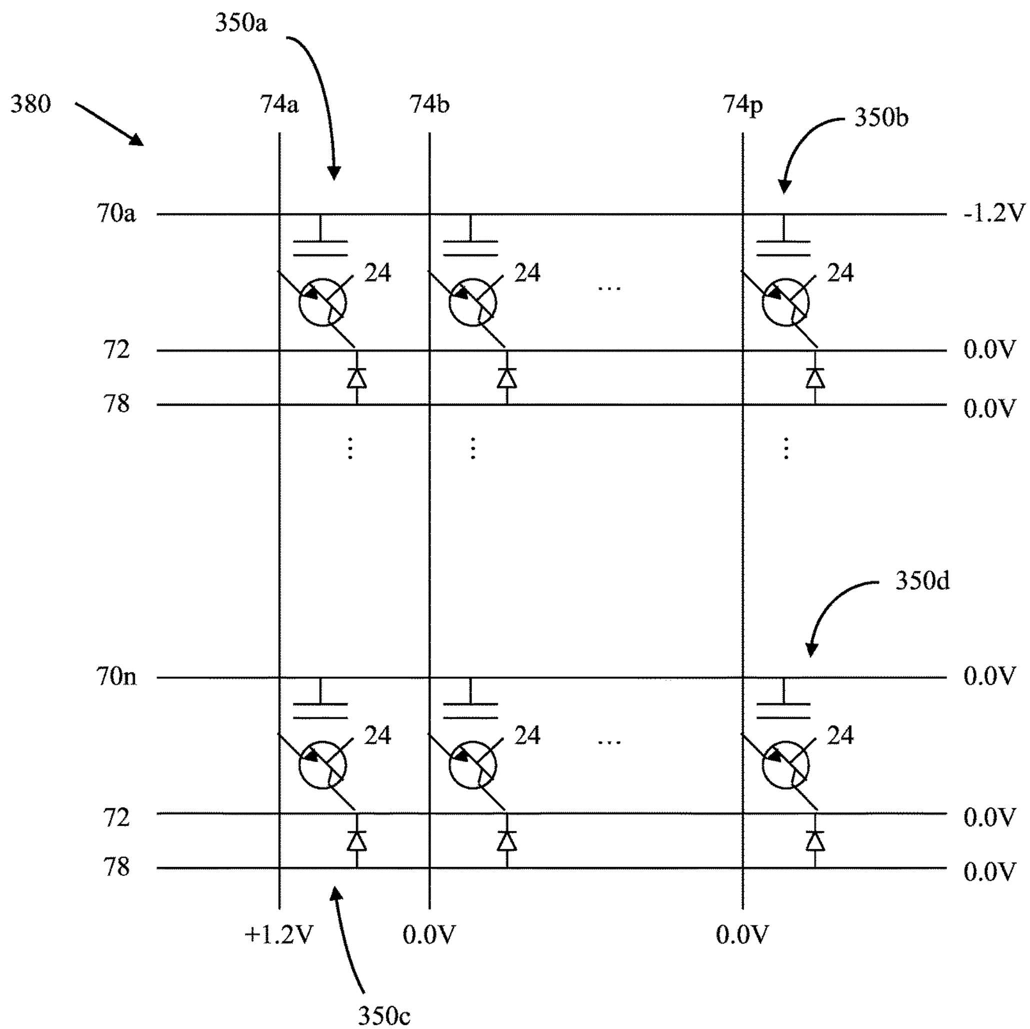

FIG. 54G illustrates a single cell write logic-1 operation using a GIDL mechanism in selected representative memory cell 350*a* in exemplary memory array 350. To accomplish this, the selected word line terminal 70*a* is biased to approximately −1.2V while the unselected word line terminals 70*b* (not shown) through 70*n* are biased to about 0.0V, the selected bit line terminal 74*a* is biased to approximately +1.2V while the unselected bit line terminals 74*b* through 74*p* are biased to about 0.0V, the source line terminal 72 is biased to about 0.0V, and the substrate terminal is biased to about 0.0V. The voltages applied are exemplary only, may vary from embodiment to embodiment, and are in no way limiting.

This bias condition causes selected representative memory cell 350*a* to conduct current due to the GIDL mechanism discussed with reference to Yoshida cited above. The combination of −1.2V on word line terminal and +1.2V on bit line terminal 74*a* creates the strong electric field necessary to produce GIDL current from bit line 74*a* into representative memory cell 350*a* generating sufficient hole charge in its floating body 24 to place it in the logic-1 state.

Unselected representative memory cell 350*b,* which shares a row with selected representative memory cell 350*a,* has its bipolar device 30 turned off because there is no voltage between the collector and emitter terminals. It retains its logic state during the short duration of the read operation.

Unselected representative memory cell 350*c,* which shares a column with selected representative memory cell 350*a,* is in the holding state. It also retains its logic state during the short duration of the write logic-1 operation.

Unselected representative memory cell 350*d,* which shares neither a row nor a column with selected representative memory cell 350*a,* has its bipolar device 30 turned off because there is no voltage between the collector and emitter terminals. It too retains its logic state during the short duration of the read operation.

Figure 54H:
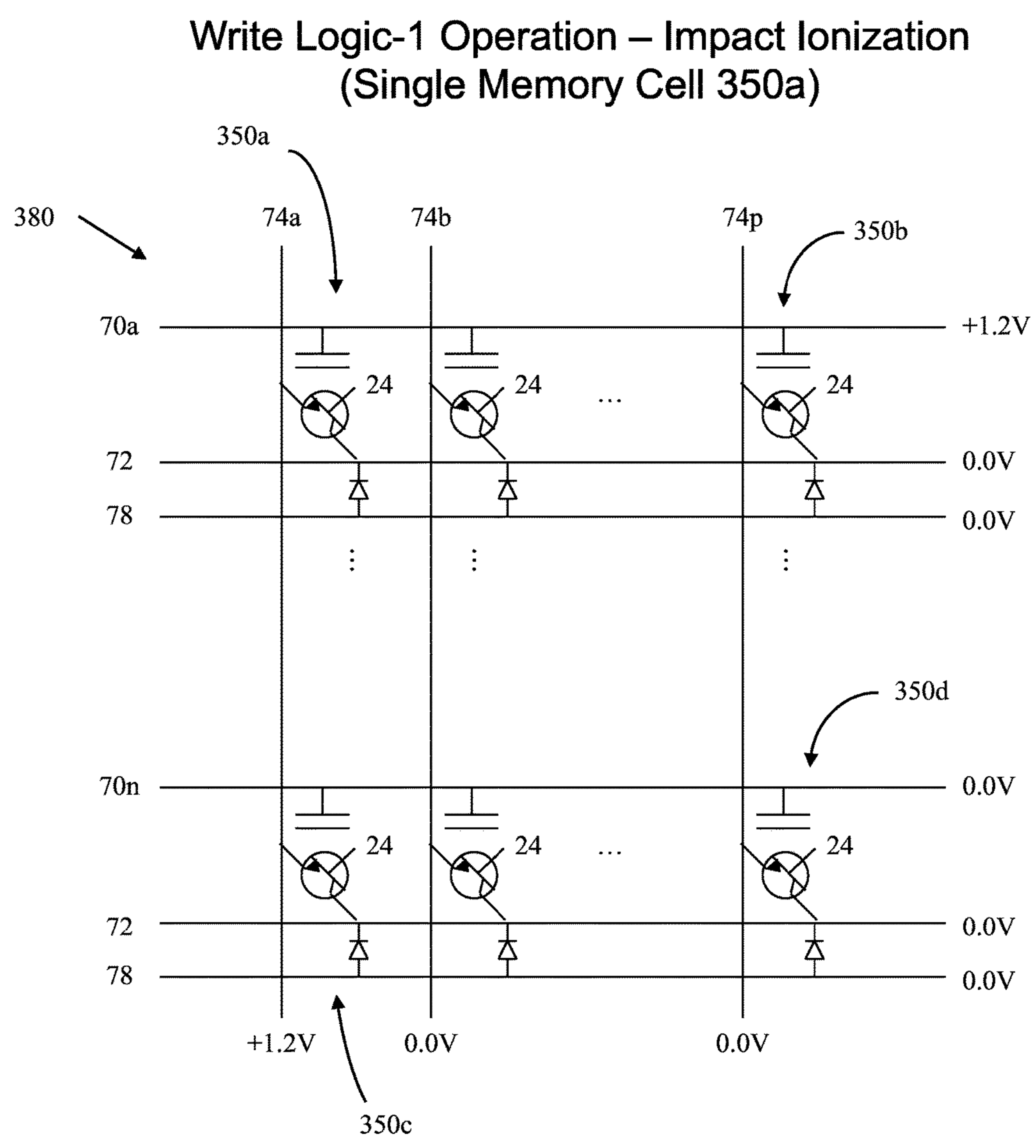

FIG. 54H illustrates a single cell write logic-1 operation using an impact ionization mechanism in selected representative memory cell 350*a* in exemplary memory array 350. To accomplish this, the selected word line terminal 70*a* is biased to approximately +1.2V while the unselected word line terminals 70*b* (not shown) through 70*n* are biased to about 0.0V, the selected bit line terminal 74*a* is biased to approximately +1.2V while the unselected bit line terminals 74*b* through 74*p* are biased to about 0.0V, the source line terminal 72 is biased to about 0.0V, and the substrate terminal is biased to about 0.0V. The voltages applied are exemplary only, may vary from embodiment to embodiment, and are in no way limiting.

This bias condition causes selected representative memory cell 350*a* to conduct current due to the impact ionization mechanism discussed with reference to Lin cited above. The combination of +1.2V on word line terminal and +1.2V on bit line terminal 74*a* turns on the bipolar device 30 in representative memory cell 350*a* regardless of its prior logic state and generating sufficient hole charge in its floating body 24 to place it in the logic-1 state.

Unselected representative memory cell 350*b,* which shares a row with selected representative memory cell 350*a,* has its bipolar device 30 turned off because there is no voltage between the collector and emitter terminals. It retains its logic state during the short duration of the read operation.

Unselected representative memory cell 350*c,* which shares a column with selected representative memory cell 350*a,* is in the holding state. It also retains its logic state during the short duration of the write logic-1 operation.

Unselected representative memory cell 350*d,* which shares neither a row nor a column with selected representative memory cell 350*a,* has its bipolar device 30 turned off because there is no voltage between the collector and emitter terminals. It too retains its logic state during the short duration of the read operation.

In the previous embodiments, a single binary bit has been written to, read from, and maintained in a single memory cell 250 or 350. While this approach makes for the simplest support circuitry, the simplest operating methods, and the largest noise margins, greater memory density may be achieved by storing two or more bits per memory cell 250 or 350 at the cost of increasing the complexity of the support circuitry and operating methods. Additionally, the noise margin is also reduced because the voltage window inside memory cell 250 or 350 is shared by more than two logic levels.

Preferably the information stored in memory cell 250 or 350 corresponds to an integer number of binary bits, meaning that the number of voltage levels stored in memory cell 50 or 350 will be equal to a power of two (e.g., 2, 4, 8, 16, etc.), though other schemes are possible within the scope of the invention. Due to the lower noise margins, it may be desirable to encode the data in memory array 80 or 380 using any error correction code (ECC) known in the art. In order to make the ECC more robust, the voltage levels inside may be encoded in a non-binary order like, for example, using a gray code to assign binary values to the voltage levels. In the case of gray coding, only one bit changes in the binary code for a single level increase or decrease in the voltage level. Thus for an example a two bit gray encoding, the lowest voltage level corresponding to the floating body region 24 voltage being neutral might be encoded as logic-00, the next higher voltage level being encoded as logic-01, the next higher voltage level after that being encoded as logic-11, and the highest voltage level corresponding to the maximum voltage level on floating body region 24 being encoded as logic-10. In an exemplary three bit gray encoding, the logic levels from lowest to highest might be ordered logic-000, logic-001, logic-011, logic-010, logic-110, logic-111, logic-101, and logic-100. Since the most likely reading error is to mistake one voltage level for one of the two immediately adjacent voltage levels, this sort of encoding ensures that a single level reading error will produce at most a single bit correction per error minimizing the number of bits needing correction for any single error in a single cell. Other encodings may be used, and this example is in no way limiting.

A multi-level write operation can be performed using an alternating write and verify algorithm, where a write pulse is first applied to the memory cell 250 or 350, followed by a read operation to verify if the desired memory state has been achieved. If the desired memory state has not been achieved, another write pulse is applied to the memory cell 250 or 350, followed by another read verification operation. This loop is repeated until the desired memory state is achieved.

For example, using band-to-band hot hole injection to write memory cell 250 or 350, initially zero voltage is applied to BL terminal 74, zero voltage is applied to SL terminal 72, a negative voltage is applied to WL terminal 70, and zero voltage is applied to the substrate terminal 78. Then positive voltages of different amplitudes are applied to BL terminal 74 to write different states to floating body 24. This results in different floating body potentials 24 corresponding to the different positive voltages or the number of positive voltage pulses that have been applied to BL terminal 74. Note that memory cell 250 or 350 must be written to the lowest voltage state on floating body region 24 prior to executing this algorithm.

In one particular non-limiting embodiment, the write operation is performed by applying the following bias condition: a potential of about 0.0 volts is applied to SL terminal 72, a potential of about −1.2 volts is applied to WL terminal 70, and about 0.0 volts is applied to substrate terminal 78, while the potential applied to BL terminal 74 is incrementally raised. For example, in one non-limiting embodiment, 25 millivolts is initially applied to BL terminal 74, followed by a read verify operation. If the read verify operation indicates that the cell current has reached the desired state (i.e. cell current corresponding to whichever binary value of 00, 01, 11 or 10 is desired is achieved), then the multi-level write operation is successfully concluded. If the desired state is not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary from embodiment to embodiment and the above voltage levels are exemplary only and in no way limiting. To write four levels to the memory cells, at least three different positive voltage pulses (which may comprise of different amplitudes) to the BL terminal 74 are required. The first pulse corresponds to writing the memory cell to the level associated with the binary value of 01, the second pulse corresponds to writing the memory cell to the level associated with the binary value of 11, and the third pulse corresponds to writing the memory cell to the level associated with the binary value of 10.

The write-then-verify algorithm is inherently slow since it requires multiple write and read operations. The present invention provides a multi-level write operation that can be performed without alternate write and read operations as described in FIGS. 55A through 55F with respect to exemplary memory array 280. Persons of ordinary skill in the art will appreciate that the principles described will apply to all of the Half Transistor memory cells within the scope of the present invention.

Figure 55A:
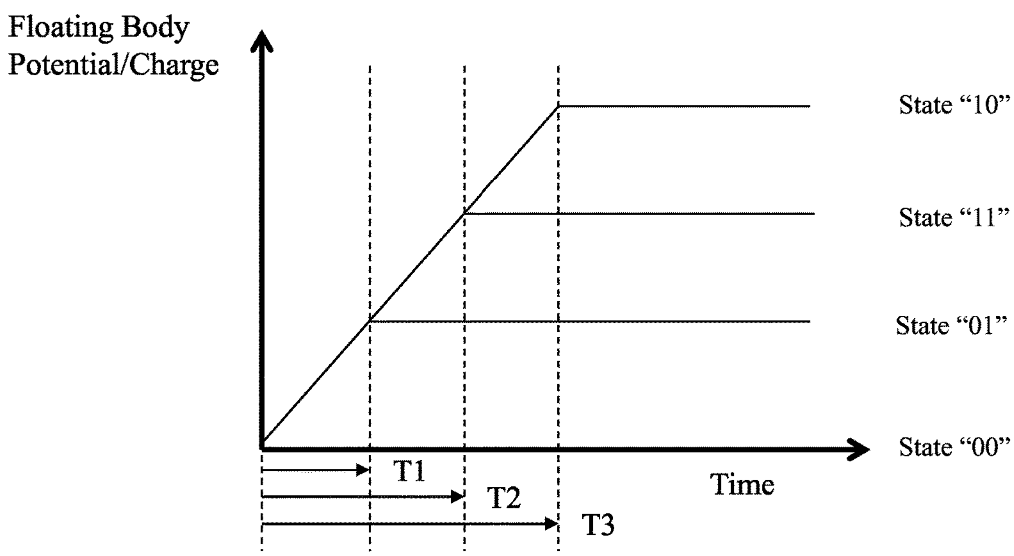
FIGS. 55A through 55F illustrate multilevel operations on a memory cell according to the present invention.

As shown in FIG. 55A, the potential of the floating body 24 increases over time as a result of hole injection to floating body 24, for example through an impact ionization mechanism. Once the change in cell current reaches the level associated with the desired state of the selected representative memory cell 250, the voltage applied to BL terminal 74 can be removed. In this manner, the multi-level write operation can be performed without alternate write and read operations by applying a voltage ramp of the correct duration. After the end of the pulse time, the applied voltage returns to the starting value like, for example, ground. Thus as shown in FIG. 55A, a voltage ramp of pulse width T1 applied to the bit line terminal 74 of memory cell 250 in the lowest (logic-00 state) potential state will increase the potential of the floating body 24 from the logic-00 level to the logic-01 level. Similarly, a voltage ramp of pulse width T2 applied to the bit line terminal 74 of memory cell 250 in the lowest (logic-00 state) potential state will increase the potential of the floating body 24 from the logic-00 level to the logic-11 level, and a voltage ramp of pulse width T3 applied to the bit line terminal 74 of memory cell 250 in the lowest (logic-00 state) potential state will increase the potential of the floating body 24 from the logic-00 level to the logic-10 level.

Figure 55B:
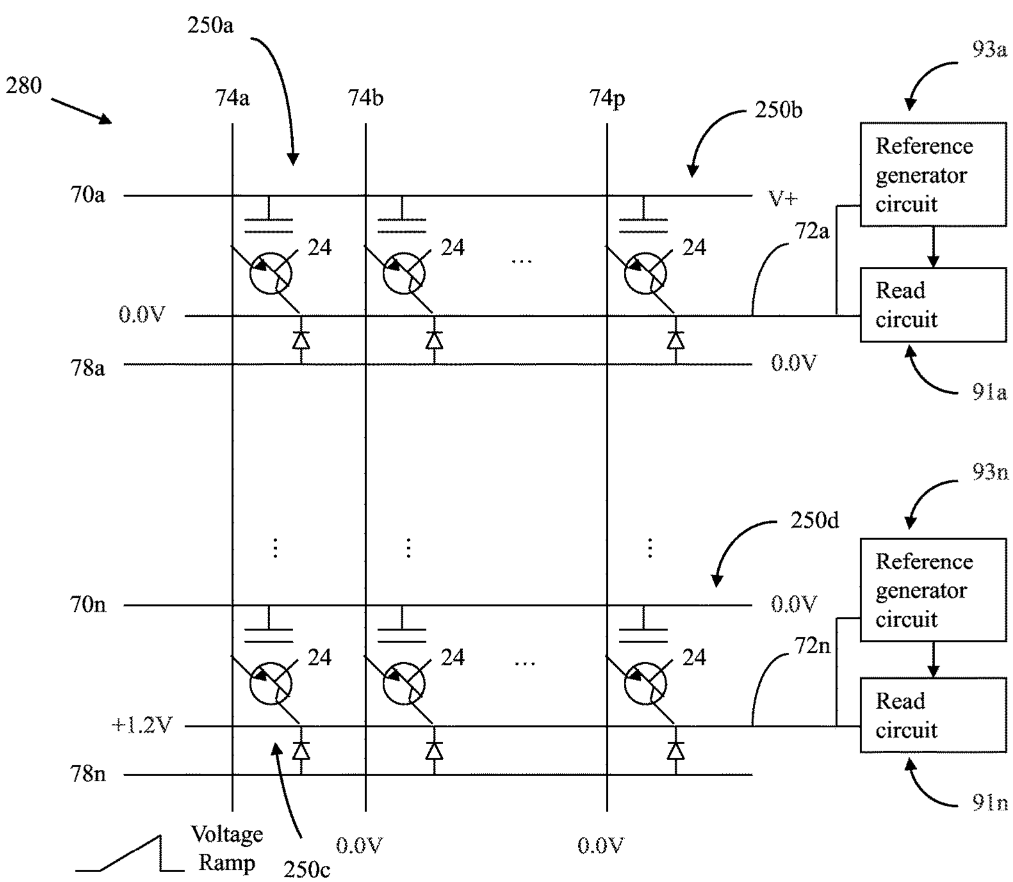

In FIG. 55B this is accomplished in selected representative memory cell 250*a* by ramping the voltage applied to BL terminal 74*a,* while applying zero voltage to SL terminal 72*a,* a positive voltage to WL terminal 70, and zero voltage to substrate terminal 78 of the selected memory cells. These bias conditions will result in a hole injection to the floating body 24 through an impact ionization mechanism. The state of the memory cell 250*a* can be simultaneously read for example by monitoring the change in the cell current through read circuitry 91*a* coupled to the source line 72*a.*

In the rest of array 280, zero voltage is applied to the unselected WL terminals 70*b* (not shown) through 70*n,* zero voltage is applied to the unselected SL terminals 72*b* (not shown) through 72*n,* and zero voltage is applied to the unselected BL terminals 74*b* through 74*p.* The cell current measured in the source line direction is the total cell current of all memory cells 250 which share the same source line 72*a,* but all of the unselected cells like representative memory cell 50*b* are biased with zero voltage across them from their bit line region 16 to their source line region 22 and do not conduct current as long as the source line terminal 72*a* is correctly biased to maintain zero volts. As a result, only one selected memory cell 50*a* sharing the same source line 72 can be written at a time.

In FIG. 55B, the unselected representative memory cell 250*b* has zero volts between the BL terminal 74*p* and the SL terminal 72*a* so no current flows and the state of the data stored in them will not change. Unselected representative memory cell 250*c* sharing BL terminal 74*a* with selected representative memory cell 250*a* has its WL terminal grounded. Thus its floating body region 24 does not get the voltage coupling boost that the floating body region 24 in selected representative memory cell 250*a* gets. A positive bias is also applied to the unselected SL terminal 72*n.* This condition substantially reduces the current in representative memory cell 250*c* which reduces the degree of hole charge its floating body region 24 receives as the voltage applied to BL terminal 74*a* is ramped up. Unselected representative memory cell 250*d,* sharing neither a row nor a column with selected representative memory cell 250*a,* is shown with gate 60 coupled to WL terminal 70*n* biased at 0.0V, bit line region 16 coupled to BL terminal 74*p* biased at 0.0V, and buried layer 22 coupled to source line terminal 72*n* biased at +1.2V. As can be seen, these cells will be at holding mode. Memory cells in state logic-1 will maintain the charge in floating body 24 because the intrinsic bipolar device 30*a* will generate holes current to replenish the charge in floating body 24, while memory cells in state logic-0 will remain in neutral state.

FIG. 55B also shows reference generator circuits 93*a* through 93*n* coupled respectively to source line terminals 72*a* through 72*n* and read circuits 91*a* through 91*n* coupled respectively to source line terminals 72*a* through 72*n* and coupled respectively to reference generator circuit 93*a* through 93*n.* Reference generator circuit 93*a* serves to store the initial total cell current of selected representative memory cell 250*a* and provide this value to read circuit 91*a* during the write operation in real time so that the change in current can be monitored and feedback (not shown in FIG. 55B) can be used to shut off the voltage ramp at the appropriate time. This function can be implemented in a variety of ways.

Figure 55C:
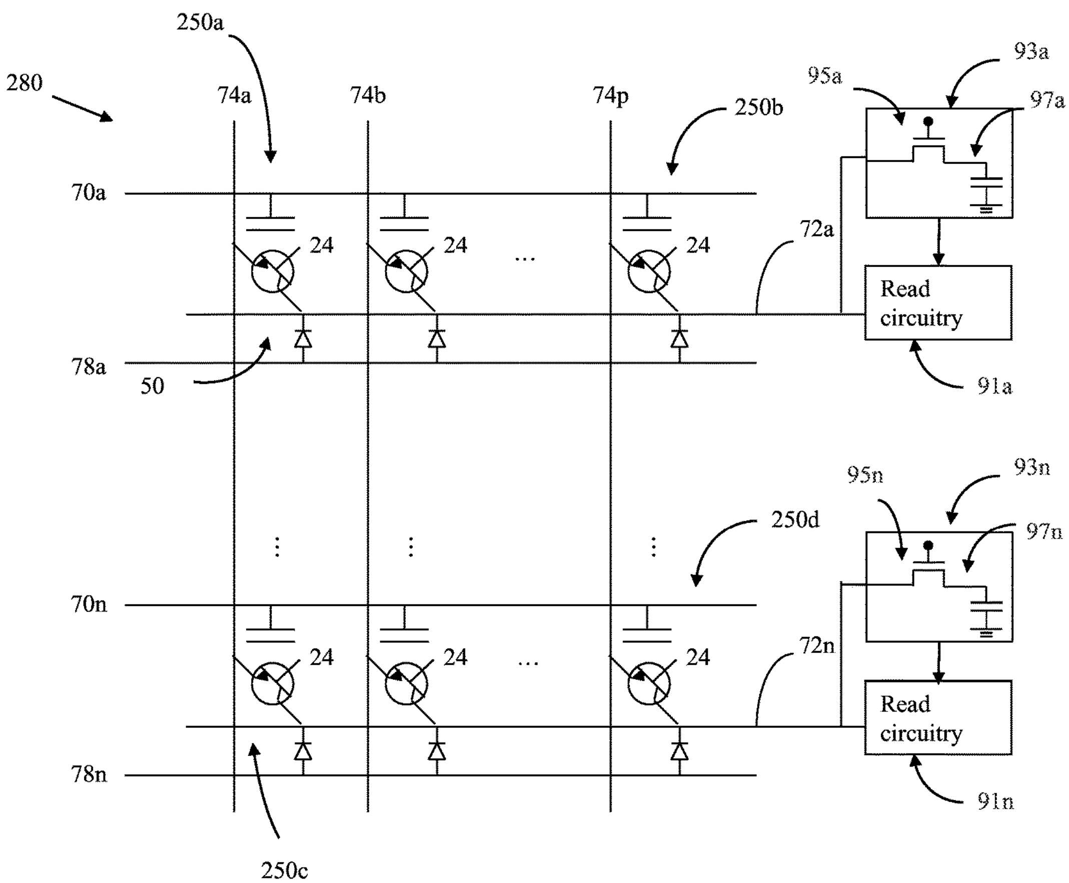

In FIG. 55C, for example, the cumulative charge of the initial state for selected memory cell 250*a* sharing the same source line 72*a* can be stored in a capacitor 97*a.* Transistor 95*a* is turned on when charge is to be written into or read from capacitor 94.

Figure 55D:
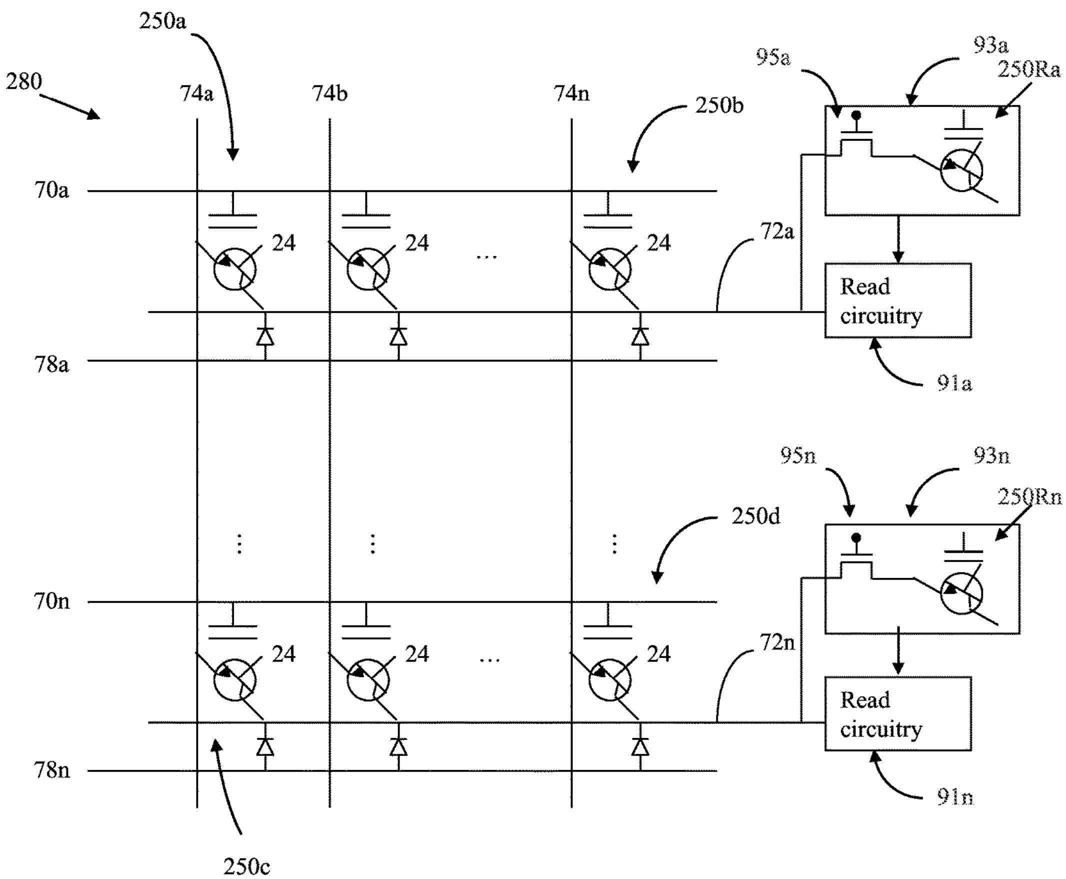

Alternatively, as shown in FIG. 55D, reference cells 250Ra through 250Rn similar to a memory cell 250 replace capacitors 97*a* through 97*n* in reference generator circuits 93*a* through 93*n.* The reference cells 250Ra through 250Rn can also be used to store the initial state of selected representative memory cell 250*a.*

In a similar manner, a multi-level write operation using an impact ionization mechanism can be performed by ramping the write current applied to BL terminal 74 instead of ramping the BL terminal 74 voltage.

In another embodiment, a multi-level write operation can be performed on memory cell 250 through a band-to-band tunneling mechanism by ramping the voltage applied to BL terminal 74, while applying zero voltage to SL terminal 72, a negative voltage to WL terminal 70, and zero voltage to substrate terminal 78 of the selected memory cells 250. The unselected memory cells 250 will remain in holding mode, with zero or negative voltage applied to WL terminal 70, zero voltage applied to BL terminal 74, and a positive voltage applied to SL terminal 72. Optionally, multiple BL terminals 74 can be simultaneously selected to write multiple cells in parallel. The potential of the floating body 24 of the selected memory cell(s) 250 will increase as a result of the band-to-band tunneling mechanism. The state of the selected memory cell(s) 250 can be simultaneously read for example by monitoring the change in the cell current through a read circuit 91 coupled to the source line. Once the change in the cell current reaches the desired level associated with a state of the memory cell, the voltage applied to BL terminal 74 can be removed. In this manner, the multi-level write operation can be performed without alternate write and read operations.

Similarly, the multi-level write operation using band-to-band tunneling mechanism can also be performed by ramping the write current applied to BL terminal 74 instead of ramping the voltage applied to BL terminal 74.

Figure 55E:
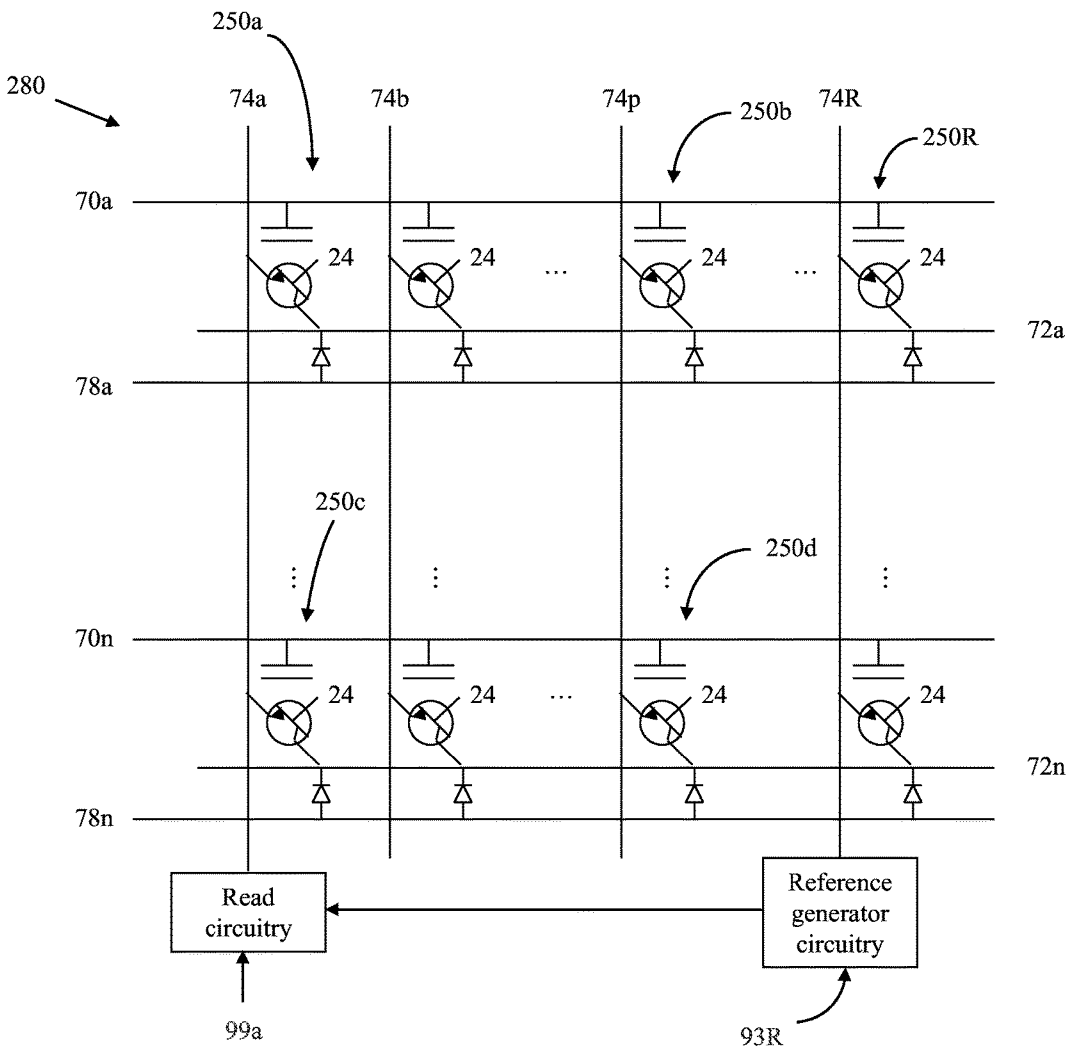

In another embodiment, as shown in FIG. 55E, a read while writing operation can be performed by monitoring the change in cell current in the bit line direction through a reading circuit 99*a* coupled to the bit line 74*a.* In some embodiments a reading circuit 99*b* through 99p (not shown in FIG. 55E) may be coupled to each bit of the other bit lines 74*b* through 74*p,* while in other embodiments reading circuit 99*a* may be shared between multiple columns using a decoding scheme (not shown).

Reference cells 250R representing different memory states are used to verify the state of the write operation. The reference cells 250R can be configured through a write-then-verify operation, for example, when the memory device is first powered up or during subsequent refresh periods. Thus while selected representative memory cell 250*a* is being written, selected reference cell 250R containing the desired voltage state (or a similar voltage) to be written is read and the value is used to provide feedback to read circuit so that the write operation may be terminated when the desired voltage level in selected representative memory cell 250*a* is reached. In some embodiments, multiple columns of reference cells containing different reference values corresponding to the different multilevel cell write values may be present (not shown in FIG. 55E).

In the voltage ramp operation, the resulting cell current of the representative memory cell 250*a* being written is compared to the reference cell 250R current by means of the read circuitry 99*a.* During this read while writing operation, the reference cell 250R is also being biased at the same bias conditions applied to the selected memory cell 250 during the write operation. Therefore, the write operation needs to be ceased after the desired memory state is achieved to prevent altering the state of the reference cell 250R.

Figure 55F:
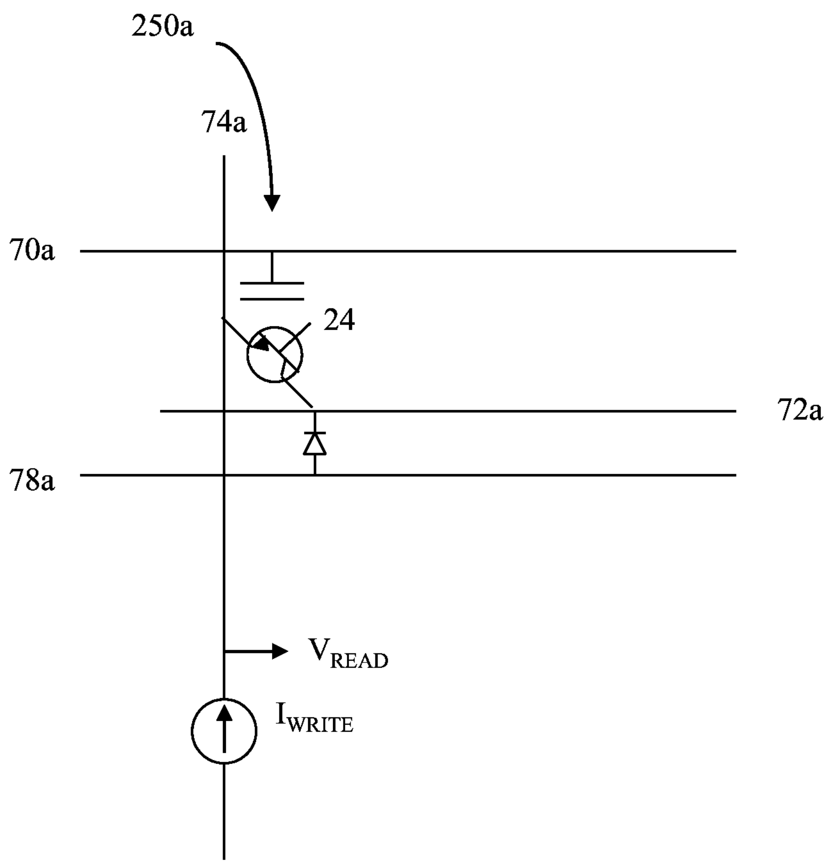

As shown in FIG. 55F, for the current ramp operation, the voltage at the bit line 74*a* can be sensed instead of the cell current. In the current ramp operation, a positive bias is applied to the source line terminal 72*a* and current is forced through the BL terminal 74*a*. The voltage of the BL terminal 74*a* will reflect the state of the memory cell 250*a*. Initially, when memory cell 250*a* is in logic-0 state, a large voltage drop is observed across the memory cell 250*a* and the voltage of the BL terminal 74*a* will be low. As the current flow through the memory cell 250*a* increases, hole injection will increase, resulting memory cell 250*a* to be in logic-1 state. At the conclusion of the logic-1 state write operation, the voltage drop across the memory cell 250*a* will decrease and an increase in the potential of BL terminal 74*a* will be observed.

An example of a multi-level write operation without alternate read and write operations, using a read while programming operation/scheme in the bit line direction is given, where two bits are stored per memory cell 250, requiring four states to be storable in each memory cell 250.

With increasing charge in the floating body 24, the four states are referred to as states "00", "01", "10", and "11". To program a memory cell 250*a* to a state "01", the reference cell 250R corresponding to state "01" is activated. Subsequently, the bias conditions described above are applied both to the selected memory cell 250 and to the "01" reference cell 250R: zero voltage is applied to the source line terminal 72, zero voltage is applied to the substrate terminal 78, a positive voltage is applied to the WL terminal 70 (for the impact ionization mechanism), while the BL terminal 74 is being ramped up, starting from zero voltage. Starting the ramp voltage from a low voltage (i.e. zero volts) ensures that the state of the reference cell 250R does not change.

The voltage applied to the BL terminal 74*a* is then increased. Consequently, holes are injected into the floating body 24 of the selected cell 50 and subsequently the cell current of the selected cell 250 increases. Once the cell current of the selected cell 250 reaches that of the "01" reference cell, the write operation is stopped by removing the positive voltage applied to the BL terminal 74 and WL terminal 70.

Unselected representative memory cell 250*b,* which shares a row with selected representative memory cell 250*a,* has its bipolar device 30 turned off because there is no voltage between the collector and emitter terminals. It retains its logic state during the short duration of the multi-level write operation.

Unselected representative memory cell 250*c,* which shares a column with selected representative memory cell 250*a,* is in the holding state. Less base current will flow into the floating body 24 due to the smaller potential difference between SL terminal 72*n* and BL terminal 74*a* (i.e. the emitter and collector terminals of the n-p-n bipolar device 30). It also retains its logic state during the short duration of the multi-level write operation.

Unselected representative memory cell 250*d,* which shares neither a row nor a column with selected representative memory cell 250*a,* is in the holding state. It too retains its logic state during the short duration of the multi-level write operation.

It is noteworthy that the holding operation for memory cell 250 in multistate mode is self-selecting. In other words, the quantity of holes injected into the floating body 24 is proportional to the quantity of holes (i.e., the charge) already present on the floating body 24. Thus each memory cell selects its own correct degree of holding current.

Figure 56:
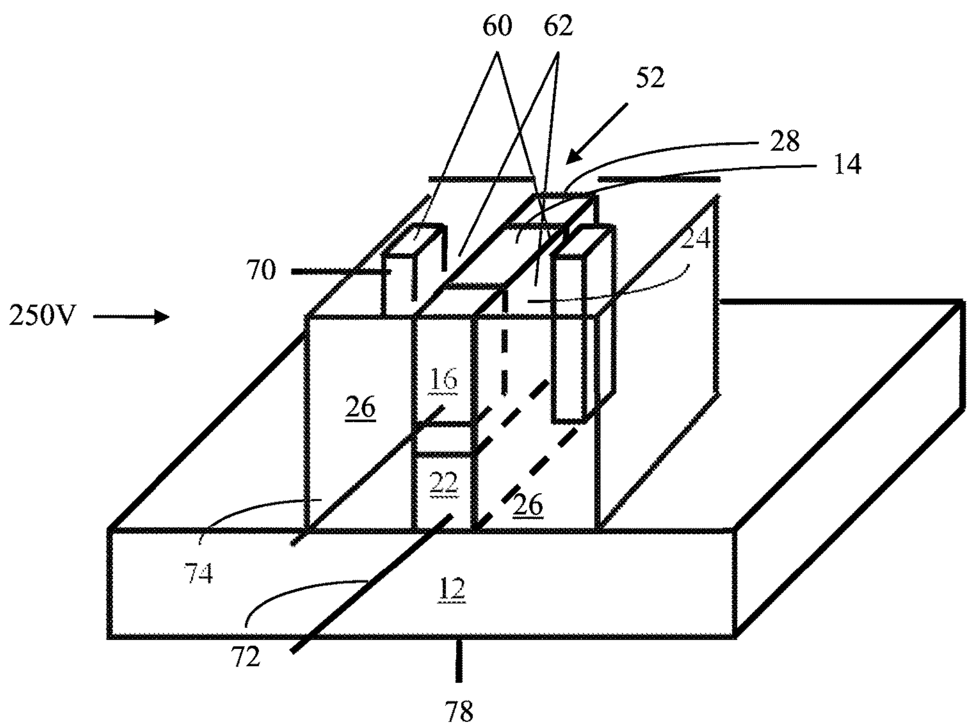
FIG. 56 illustrates an alternate memory cell according to the present invention.
Figure 57:
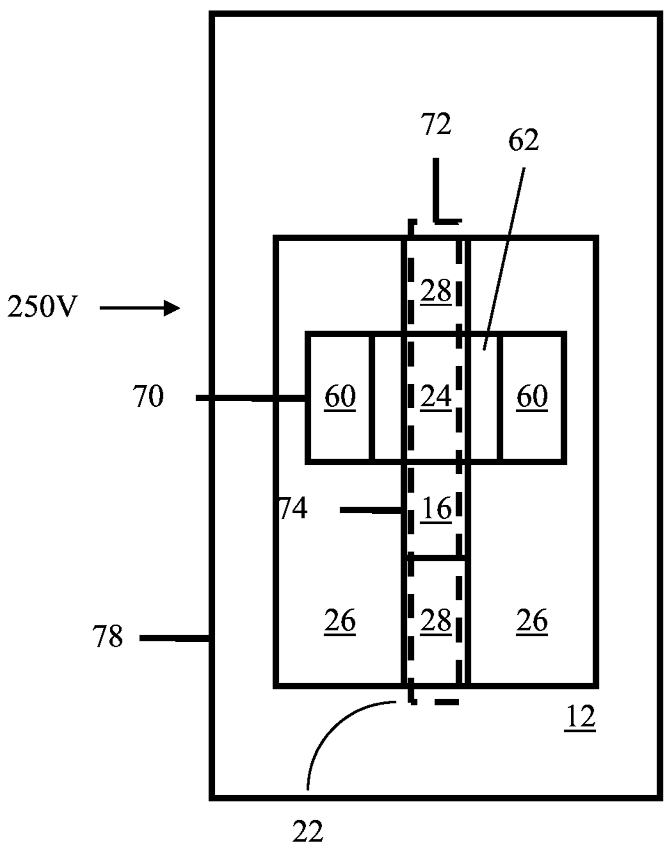
FIG. 57 illustrates a top view of the memory cell of FIG. 56.

FIGS. 56 and 57 show gated half transistor memory cell 250V with FIG. 57 showing the top view of the memory cell 250V shown in FIG. 56. Referring now to both FIGS. 56 and 57, reference numbers previously referred to in earlier drawing figures have the same, similar, or analogous functions as in the earlier described embodiments. Memory cell 250V has a fin structure 52 fabricated on substrate 12, so as to extend from the surface of the substrate to form a three-dimensional structure, with fin 52 extending substantially perpendicular to and above the top surface of the substrate 12. Fin structure 52 is conductive and is built on buried well layer 22 which is itself built on top of substrate 12. Alternatively, buried well 22 could be a diffusion inside substrate 12 with the rest of the fin 52 constructed above it, or buried well 22 could be a conductive layer on top of substrate 12 connected to all the other fin 52 structures in a manner similar to memory cell 350 described above. Fin 52 is typically made of silicon, but may comprise germanium, silicon germanium, gallium arsenide, carbon nanotubes, or other semiconductor materials known in the art.

Buried well layer 22 may be formed by an ion implantation process on the material of substrate 12 which may be followed by an etch so that buried well 22 is above the portion of substrate 12 remaining after the etch. Alternatively, buried well layer 22 may be grown epitaxially above substrate 22 and the unwanted portions may then be etched away. Buried well layer 22, which has a second conductivity type (such as n-type conductivity type), insulates the floating body region 24, which has a first conductivity type (such as p-type conductivity type), from the bulk substrate 12 also of the first conductivity type. Fin structure 52 includes bit line region 16 having a second conductivity type (such as n-type conductivity type). Memory cell 250V further includes gates 60 on two opposite sides of the floating substrate region 24 insulated from floating body 24 by insulating layers 62. Gates 60 are insulated from floating body 24 by insulating layers 62. Gates 60 are positioned between the bit line region 16 and the insulating layer 28, adjacent to the floating body 24.

Thus, the floating body region 24 is bounded by the top surface of the fin 52, the facing side and bottom of bit line region 16, top of the buried well layer 22, and insulating layers 26, 28 and 62. Insulating layers 26 and 28 insulate cell 250V from neighboring cells 250V when multiple cells 250V are joined to make a memory array. Insulating layer 26 insulates adjacent buried layer wells 22, while insulating layer 28 does not. Thus the buried layer 22 is therefore continuous (i.e. electrically conductive) in one direction. In this embodiment, the surface 14 of the semiconductor is at the level of the top of the fin structure. As in other embodiments, there is no contact to the buried layer 22 at the semiconductor surface 14 inside the boundary of memory cell 250V.

Figure 58A:
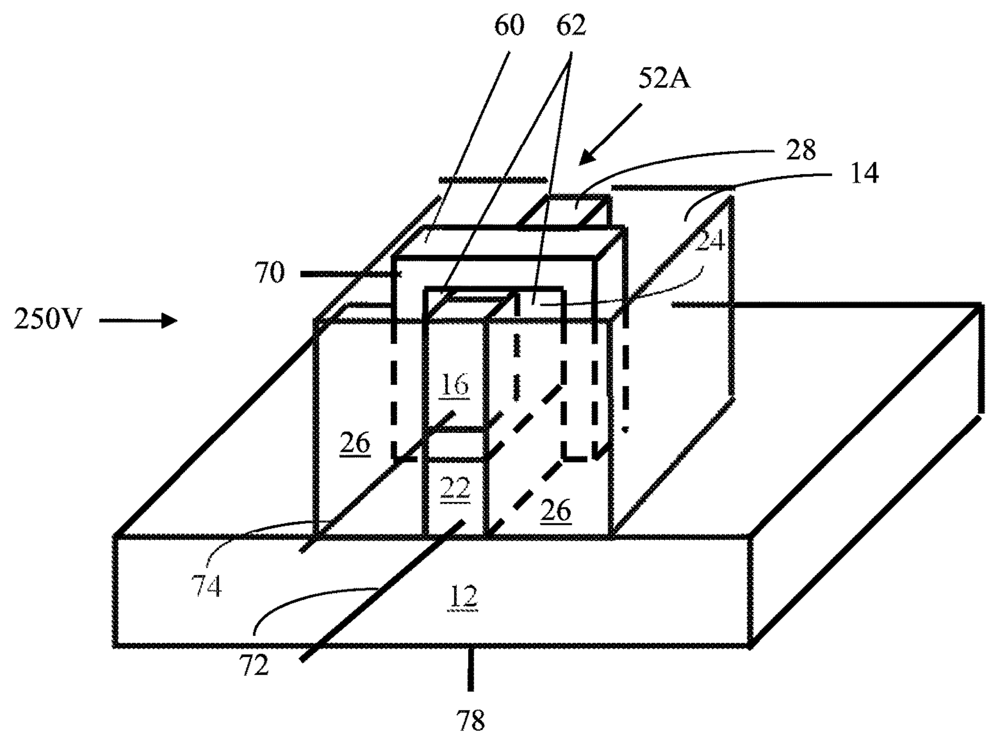
FIG. 58A illustrates another alternate memory cell according to the present invention.

As shown in FIG. 58A, an alternate fin structure 52A can be constructed. In this embodiment, gates 60 and insulating layers 62 can enclose three sides of the floating substrate region 24. The presence of the gate 60 on three sides allows better control of the charge in floating body region 24.

Memory cell 250V can be used to replace memory cell 250 in an array similar to array 280 having similar connectivity between the cells and the array control signal terminals. In such a case, the hold, read and write operations are similar to those in the lateral device embodiments described earlier for memory cell 250 in array 280. As with the other embodiments, the first and second conductivity types can be reversed as a matter of design choice. As with the other embodiments, many other variations and combinations of elements are possible, and the examples described in no way limit the present invention.

Figure 58B:
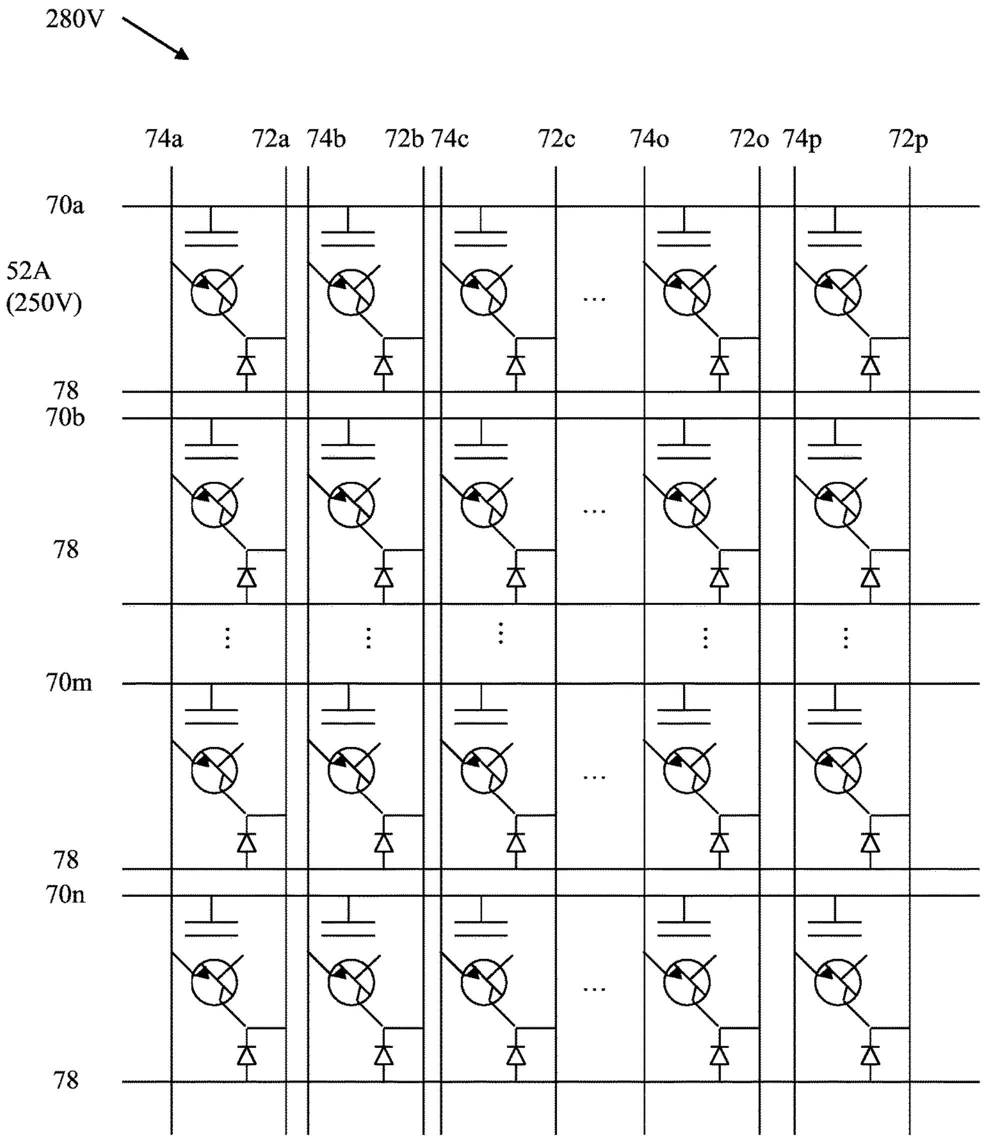
FIG. 58B illustrates an array of the memory cell of FIG. 58A.

FIG. 58B shows an array 280V of memory cells 250V. Due the nature of fin structure 52A, the most compact layout will typically be with the word lines 70 running perpendicular to the source lines 72, instead of in parallel as in memory array 280 discussed above. This leads to the structure of array 580 where the cell 250V is constructed using fin structure 52A and the source lines 72*a* through 72*p* run parallel to the bit lines 74*a* through 74*p* and orthogonal to the word lines 70*a* through 70*m*. The operation of memory array 280V is described in commonly assigned U.S. patent application entitled "COMPACT SEMICONDUCTOR MEMORY DEVICE HAVING REDUCED NUMBER OF CONTACTS, METHODS OF OPERATING AND METHODS OF MAKING," Ser. No. 12/897,528, filed on Oct. 4, 2010 and incorporated by reference above.

Figure 59A:
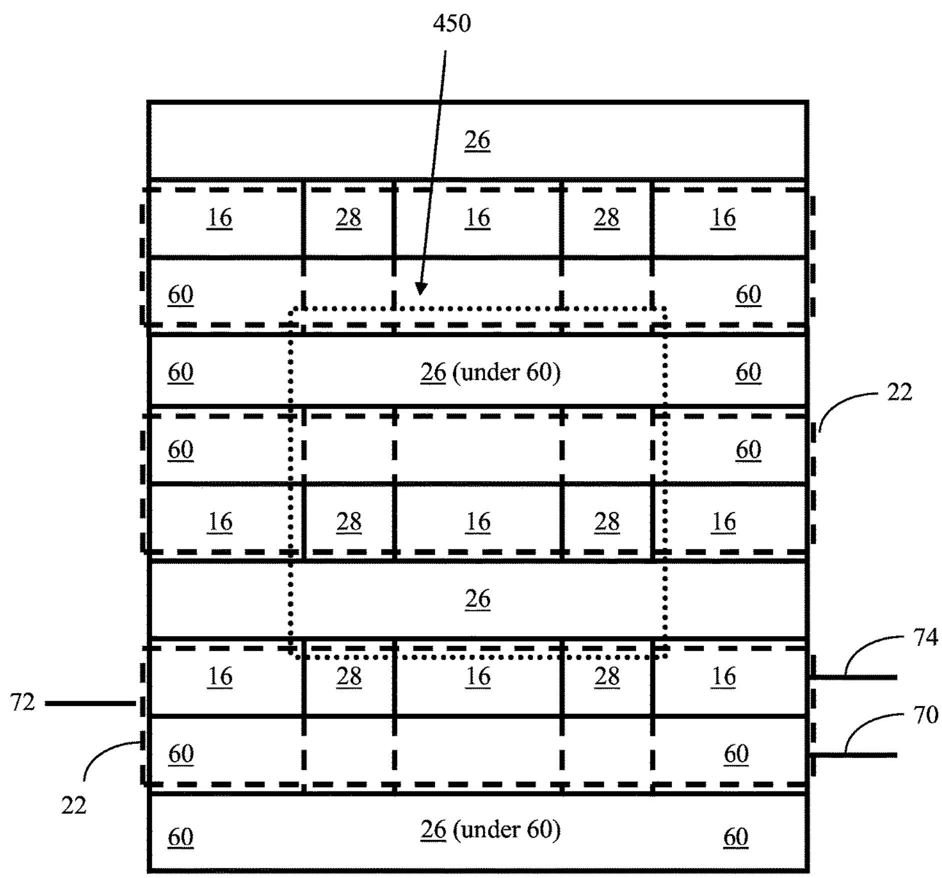
FIGS. 59A through 59F illustrate a third exemplary memory cell according to the present invention.
Figure 59B:
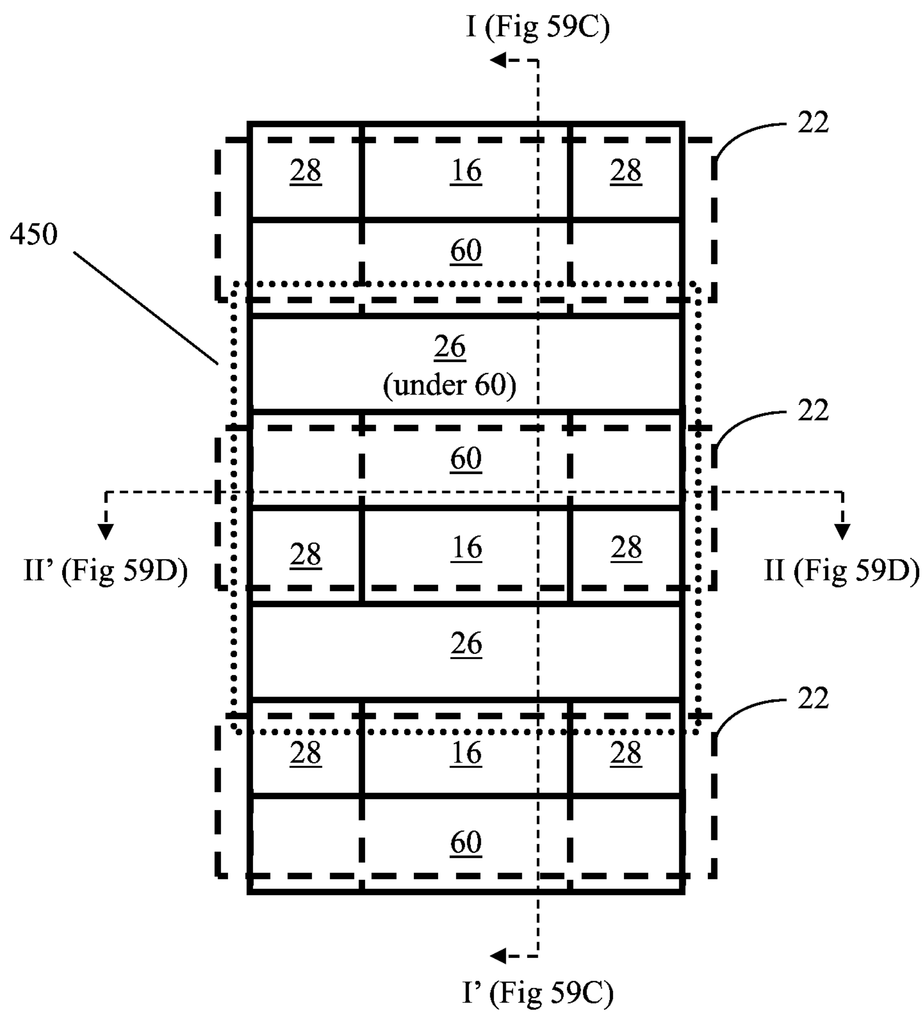

FIG. 59A shows another embodiment of a gated half transistor memory cell 450 (denoted by a dotted line) according to the present invention. FIG. 59B shows a smaller portion of FIG. 59A comprising a single memory cell 450 with two cross section lines I-I' and FIG. 23C shows the cross section designated I-I' in FIG. 59B. FIG. 59D shows the cross section designated II-II' in FIG. 59B. Present in FIGS. 59A through 59F are substrate 12, semiconductor surface 14, bit line region 16, buried well layer 22, floating body region 24, insulating layers 26 and 28, gate 60, gate insulator 62, word line terminal 70, buried well terminal 72, bit line terminal 74 and substrate terminal 78, all of which perform similar functions in the exemplary embodiments of memory cell 450 as they did in the exemplary embodiments of memory cell 250 described above.

Referring now to FIGS. 59A, 59B, 59C and 59D, the cell 450 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. A buried layer 22 of the second conductivity type is provided in the substrate 12. Buried layer 22 is also formed by an ion implantation process on the material of substrate 12. Alternatively, buried layer 22 can also be grown epitaxially.

A bit line region 16 having a second conductivity type, such as n-type, for example, is provided in floating body 24 and is exposed at surface 14. Bit line region 16 is formed by an implantation process formed on the material making up floating body 24, according to any of implantation processes known and typically used in the art. Alternatively, a solid state diffusion process could be used to form bit line region 16.

Figure 61A:
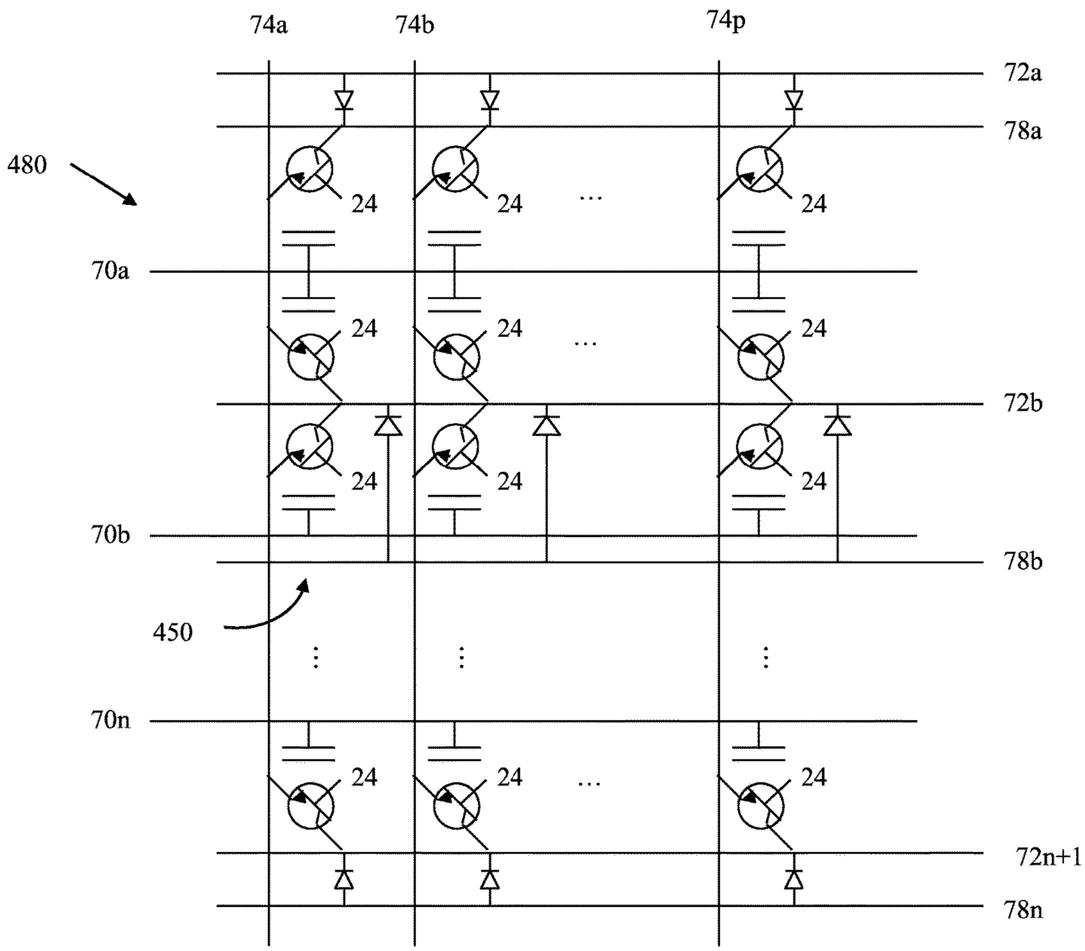
FIG. 61A illustrates an array of the memory cell of the embodiments of FIGS. 59A through 59F and FIGS. 60A through 60F.

A floating body region 24 of the substrate 12 is bounded by surface 14, bit line region 16, insulating layers 26 and 28 and buried layer 22. Insulating layers 26 and 28 (e.g., shallow trench isolation (STI)), may be made of silicon oxide, for example. Insulating layers 26 and 28 insulate cell 450 from neighboring cells 450 when multiple cells 450 are joined in an array 180 to make a memory device as illustrated in FIG. 61A. Insulating layer 26 insulates both neighboring body regions 24 and buried regions 22 of adjacent cells memory cells 450A, 450, and 450B, while insulating layer 28 insulates neighboring body regions 24, but not neighboring buried layer regions 22, allowing the buried layer 22 to be continuous (i.e. electrically conductive) in one direction in parallel with the II-II' cut line as shown in FIGS. 59B and 59D. As in other embodiments, there is no contact to the buried layer 22 at the semiconductor surface 14 inside the boundary of memory cell 450.

Figure 59C:
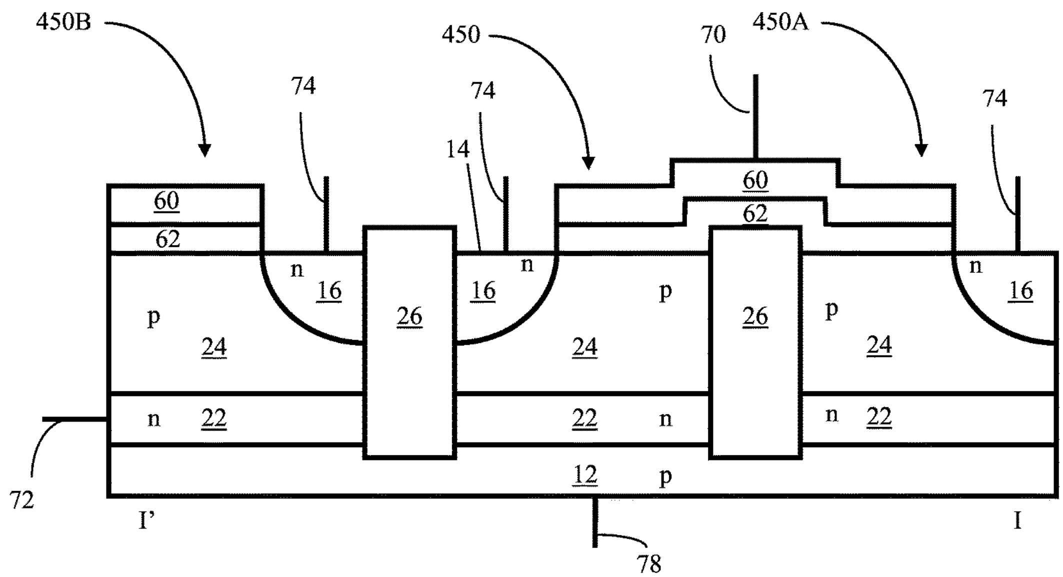
Figure 59D:
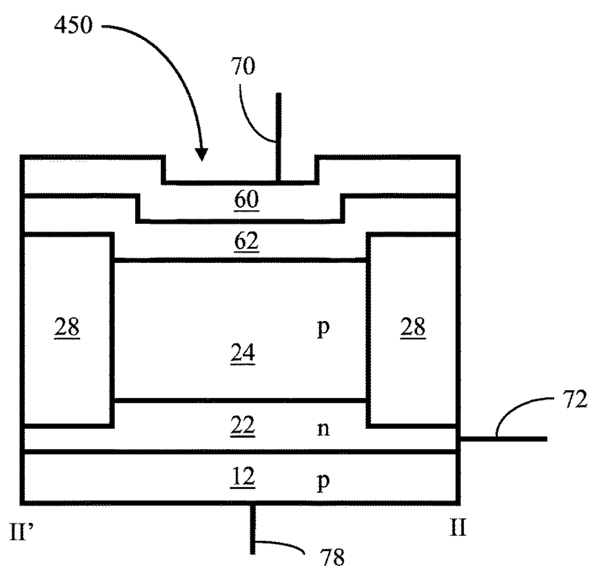

A gate 60 is positioned in between bit line regions 16 of neighboring cells 450 and 450A and above the surface 14, the floating body regions 24, and one of the adjacent insulating layers 26 as shown in FIG. 59C. In this arrangement, the gate terminal 70 is coupled to the gates 60 of both memory cells 450 and 450A. The gate 60 is insulated from surface 14 by an insulating layer 62. Insulating layer 62 may be made of silicon oxide and/or other dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides. In FIGS. 59A, 59B and 59C, the gate 60 is shown above the insulating layer 26 isolating neighboring cells 450 and 450A.

Cell 450 further includes word line (WL) terminal 70 electrically connected to gate 60, bit line (BL) terminal 74 electrically connected to bit line region 16, source line (SL) terminal 72 electrically connected to the buried layer 22, and substrate terminal 78 electrically connected to substrate 12.

Figure 59E:
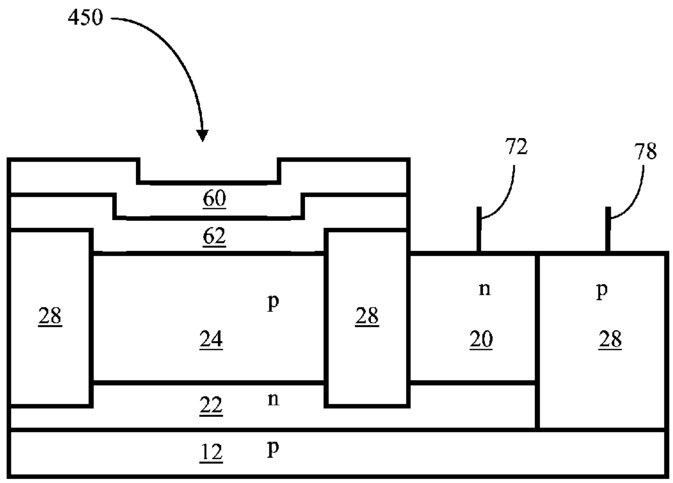

As shown in FIG. 59E, contact to buried well region 22 can be made through region 20 having a second conductivity type, and which is electrically connected to buried well region 22 and buried well terminal 72, while contact to substrate region 12 can be made through region 28 having a first conductivity type, and which is electrically connected to substrate region 12 and substrate terminal 78. The SL terminal 72 serves as the back bias terminal for the memory cell 450.

Figure 59F:
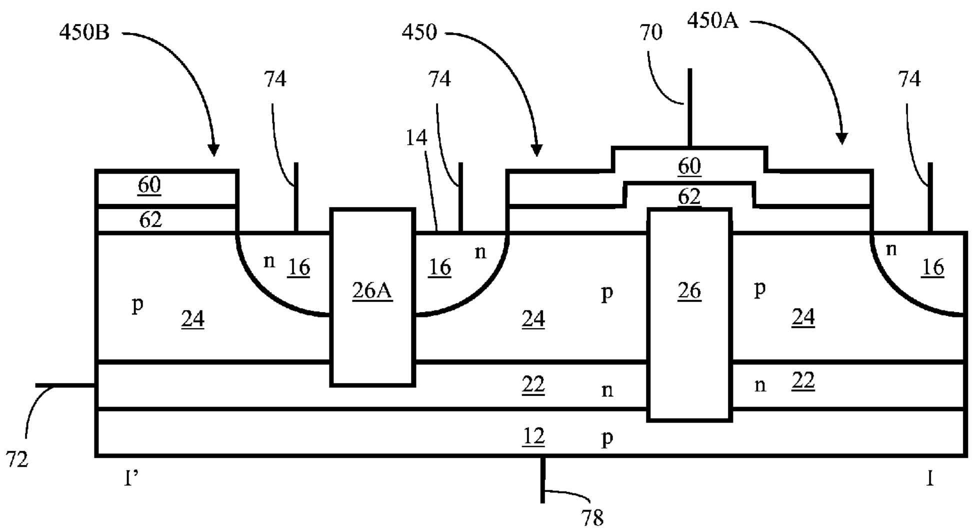

As shown in FIG. 59F, the buried well 22 (and subsequently SL terminal 72) may also be shared between two adjacent memory cells 450 and 450B not sharing the same WL terminal 70. In this embodiment, insulating layer 26A is built to a similar depth as insulating layer 28 allowing this connection to be made using buried well 22. Thus when a plurality of memory cells 450 are arranged in an array the source line terminals 72 are shared between pairs of adjacent rows of cells 450 and the word line terminals 70 are shared between pairs of adjacent rows that are offset by one row from the pairs of rows sharing source line terminal 72. Thus each memory cell 450 shares a source line terminal with one adjacent cell (e.g., 450B) and a word line terminal 70 with another adjacent cell (e.g., 450A). It is worth noting that this connectivity is possible because when memory cells 450 are mirrored in alternate rows when arrayed, while memory cell 50 is not mirrored when arrayed.

FIGS. 60A through 60E shown an alternate embodiment of memory cell 450 where a part of the gate 60 can also be formed inside a trench adjacent to the floating body regions 24 of two adjacent memory cells 450. The primary difference between this embodiment and the one described in FIGS. 59A through 59E is that the insulating layers 26 in alternate rows adjacent to the floating body regions 24 and under the gates 60 are replaced with a trench labeled 26T in FIG. 60C. This trench can be filled with gate insulator 62 and gate material 60 to form a "T" shaped structure. This allows gate 60 to be adjacent to floating body region 24 on two sides allowing better control of the charge in floating body region 24 in response to electrical signals applied to gate 60 through word line terminal 70. In particular, operations where word line terminal is driven to a positive voltage potential to provide a boost to the voltage potential of the floating body 24 by means of capacitive coupling will benefit from this arrangement since the capacitance between the gate 60 and the floating body 24 will be substantially increased.

Figure 60A:
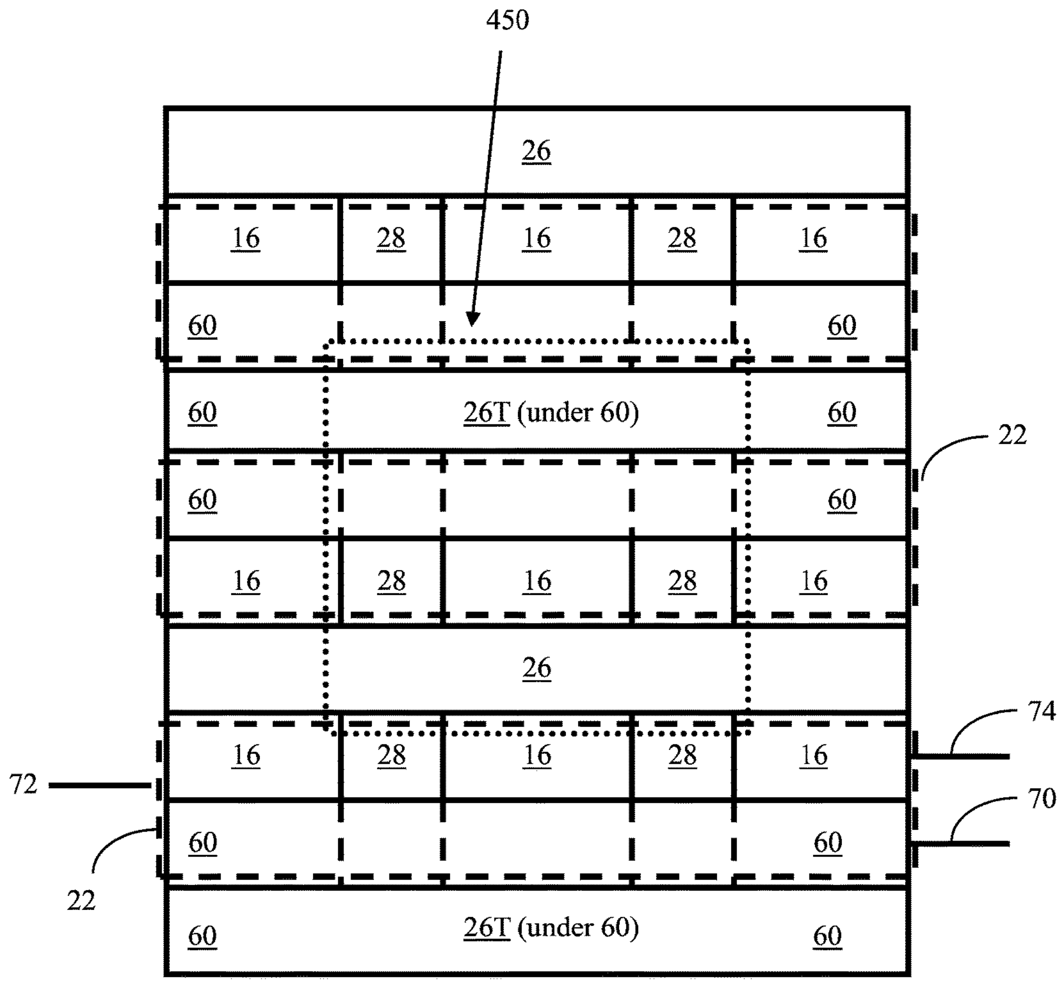
FIGS. 60A through 60F illustrate an alternate physical embodiment of the memory cell of FIGS. 59A through 59F.
Figure 60B:
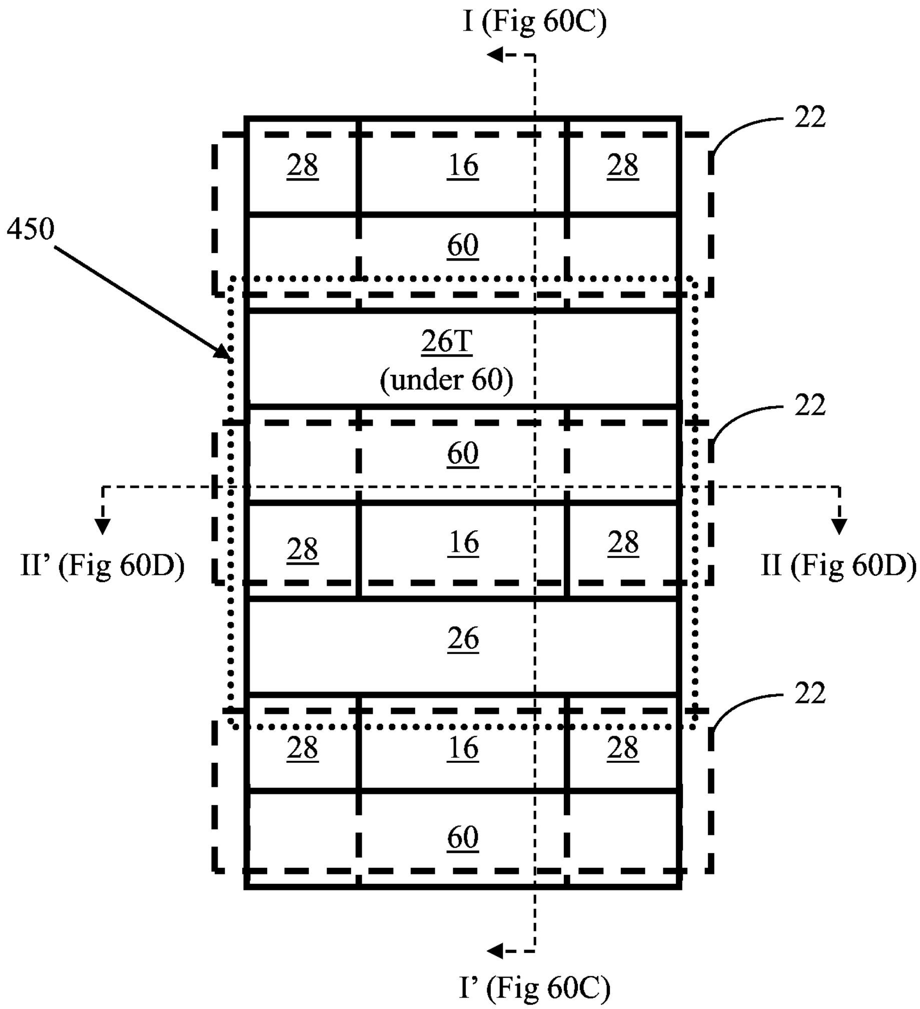
Figure 60C:
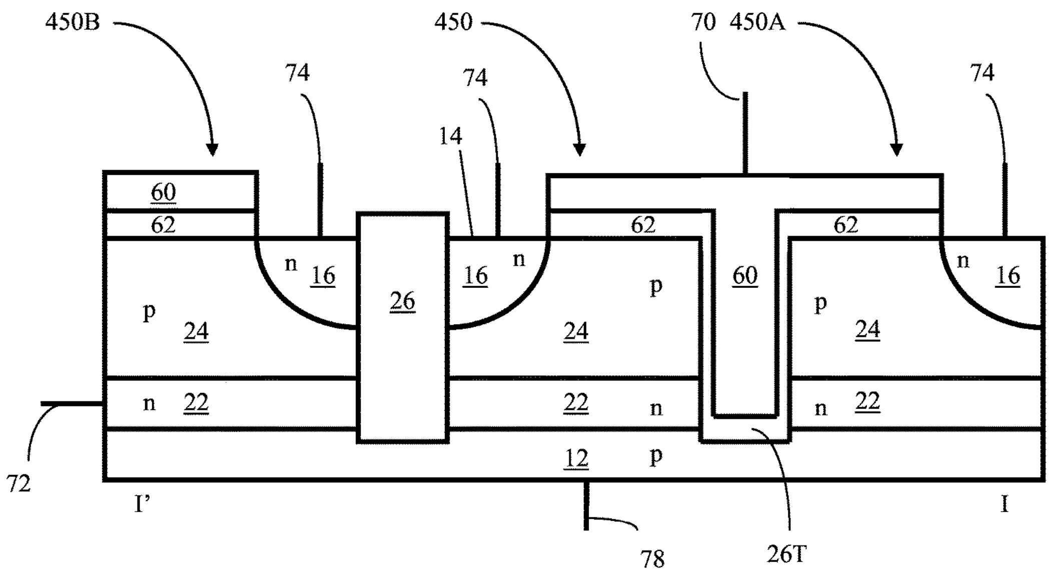
Figure 60D:
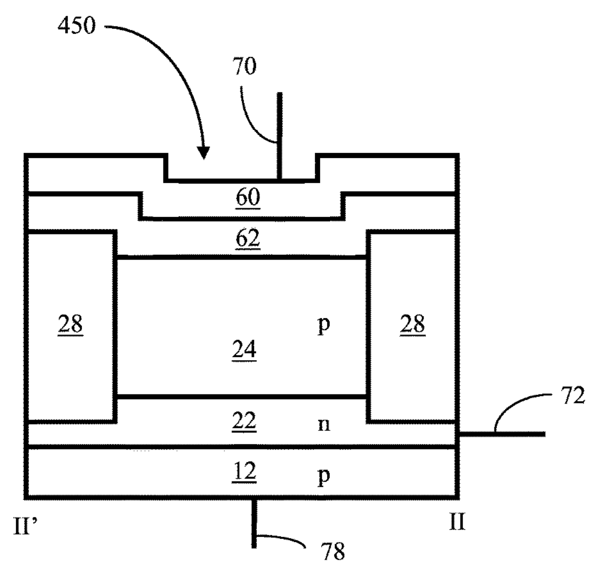

FIG. 60A shows a top view of one such embodiment of a memory cell 450 (denoted by a dotted line) according to the present invention. FIG. 60B shows a smaller portion of FIG. 60A with two cross section lines I-I' and II-II'. FIG. 60C shows the cross section designated I-I' in FIG. 60B. FIG. 60D shows the cross section designated II-II' in FIG. 60B. Present in FIGS. 60A through 60F are substrate 12, semiconductor surface 14, region 16, buried well layer 22, floating body region 24, insulating layers 26 and 28, gate 60, gate insulator 62, word line terminal 70, buried well terminal 72, bit line terminal 74 and substrate terminal 78, all of which perform similar functions in this exemplary embodiment as they did in the earlier exemplary embodiments of memory cell 450 described above.

Referring now to FIGS. 60A, 60B, 60C and 60D, the cell 450 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. A buried layer 22 of the second conductivity type is provided in the substrate 12. Buried layer 22 is also formed by an ion implantation process on the material of substrate 12. Alternatively, buried layer 22 can also be grown epitaxially.

A region 16 having a second conductivity type, such as n-type, for example, is provided in floating body 24 and is exposed at surface 14. Region 16 is formed by an implantation process formed on the material making up floating body 24, according to any of implantation processes known and typically used in the art. Alternatively, a solid state diffusion process could be used to form region 16.

A floating body region 24 of the substrate 12 is bounded by surface 14, region 16, insulating layers 26, and 28, buried layer 22, and trench 26T. Insulating layers 26 and 28 (e.g., shallow trench isolation (STI)), may be made of silicon oxide, for example. Insulating layers 26 and 28 combined with trench 26T insulate cell 450 from neighboring cells 450 when multiple cells 450 are joined in an array 480 to make a memory device as illustrated in FIG. 61A. Insulating layer 26 and trench 26T together insulate both neighboring body regions 24 and buried regions 22 of adjacent cells memory cells 450A, 450, and 450B, while insulating layer 28 insulates neighboring body regions 24, but not neighboring buried layer regions 22, allowing the buried layer 22 to be continuous (i.e. electrically conductive) in one direction in parallel with the II-II' cut line as shown in FIGS. 60B and 60D.

A gate 60 is positioned in trench 26T in between bit line regions 16 of neighboring cells 450 and 450A and above the surface 14 over the floating body regions 24 forming a "T" shaped structure as shown in FIG. 60C. In this arrangement, the gate terminal 70 is coupled to the gates 60 of both memory cells 450 and 450A. The gate 60 is insulated from floating body regions 24 by an insulating layer 62 both on surface 14 and along the walls and bottom of trench 26T. Insulating layer 62 may be made of silicon oxide and/or other dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides. The trench 26T could be formed through silicon etching process similar to the STI formation after the STI 26 and 28 have been formed. Instead of filling the trench 26T with thick oxide, gate oxide 62 could be grown after the trench etch, followed by gate 60 formation.

Cell 450 further includes word line (WL) terminal 70 electrically connected to gate 60, bit line (BL) terminal 74 electrically connected to region 16, source line (SL) terminal 72 electrically connected to the buried layer 22, and substrate terminal 78 electrically connected to substrate 12.

Figure 60E:
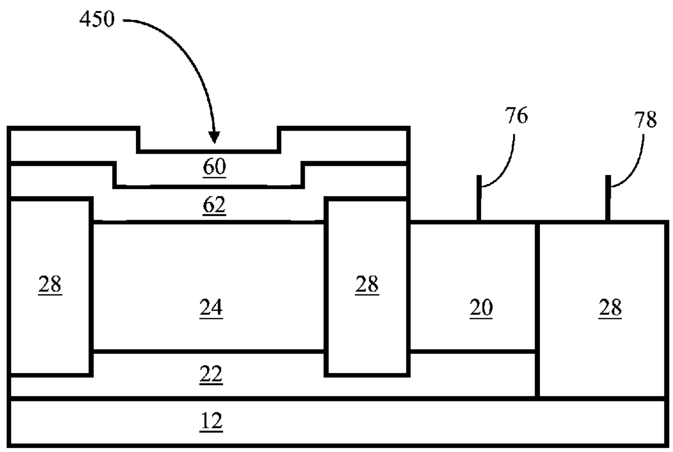

As shown in FIG. 60E, contact to buried well region 22 can be made through region 20 having a second conductivity type, and which is electrically connected to buried well region 22 and buried well terminal 72, while contact to substrate region 12 can be made through region 28 having a first conductivity type, and which is electrically connected to substrate region 12 and substrate terminal 78. The SL terminal 72 serves as the back bias terminal for the memory cell 450.

Figure 60F:
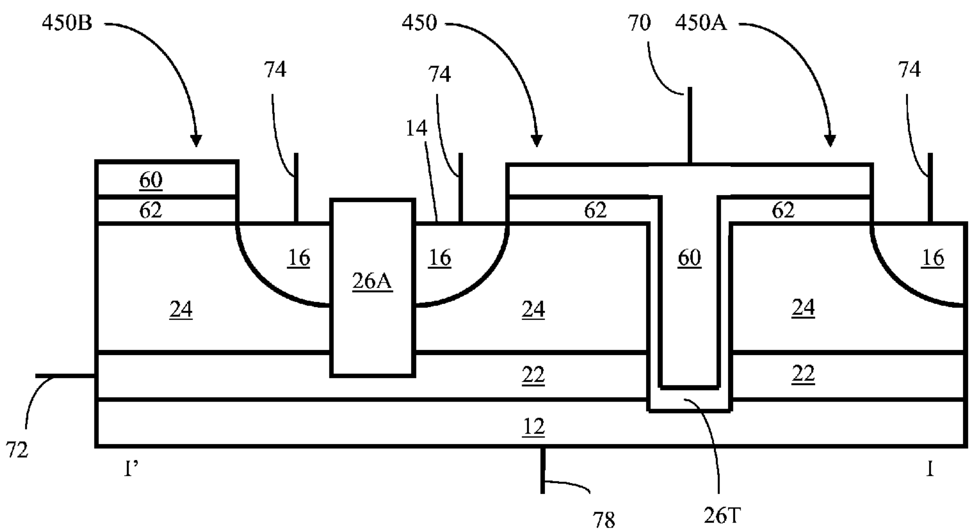

As shown in FIG. 60F, the buried well 22 (and subsequently SL terminal 72) may also be shared between two adjacent memory cells 450 and 450B not sharing the same WL terminal 70. In this embodiment, insulating layer 26A is built to a similar depth as insulating layer 28 allowing this connection to be made using buried well 22. Thus when a plurality of memory cells 450 are arranged in an array the source line terminals 72 are shared between pairs of adjacent rows of cells 450 and the word line terminals 70 are shared between pairs of adjacent rows that are offset by one row from the pairs of rows sharing source line terminal 72. Thus each memory cell 450 shares a source line terminal with one adjacent cell (e.g., 450B) and a word line terminal 70 with another adjacent cell (e.g., 450A). It is worth noting that this connectivity is possible because when memory cells 450 are mirrored in alternate rows when arrayed, while memory cell 50 is not mirrored when arrayed.

Persons of ordinary skill in the art will appreciate that many other embodiments of the memory cell 450 other than the exemplary embodiments described in conjunction with FIGS. 59A through 60F are possible. For example, the first and second conductivity types may be reversed as a matter of design choice. Other physical geometries may be used like, for example, substrate 12 may be replaced by a well placed in a substrate of the second conductivity type (not shown) as a matter of design choice. Thus the embodiments shown are in no way limiting of the present invention.

FIG. 61A shows an exemplary memory array 480 of memory cells 450. In the exemplary array 480 an embodiment of memory cell 450 is chosen where word lines 70*a* through 70*n* are shared between adjacent rows of memory cells 450 and source lines 72*a* through 72*n*+1 are shared between adjacent rows of memory cells 450 offset by one row. Thus there is one more source line 72 than there are row lines 70 because the top and bottom rows do not have an adjacent row of memory cells 450 to share source lines 72 with. Because the WL terminals 70*a* through 70*n* and source line terminals 72*a* through 72*n*+1 can be shared between neighboring memory cells, a smaller memory array 480 may be realized since the effective size of memory cell 450 is reduced due the shared features. Alternatively, the memory array 480 of memory cells 450 can be arranged with one more word line 70 than there are source lines 72 with the top and bottom rows each not sharing word line 70 with adjacent rows.

Figure 61B:
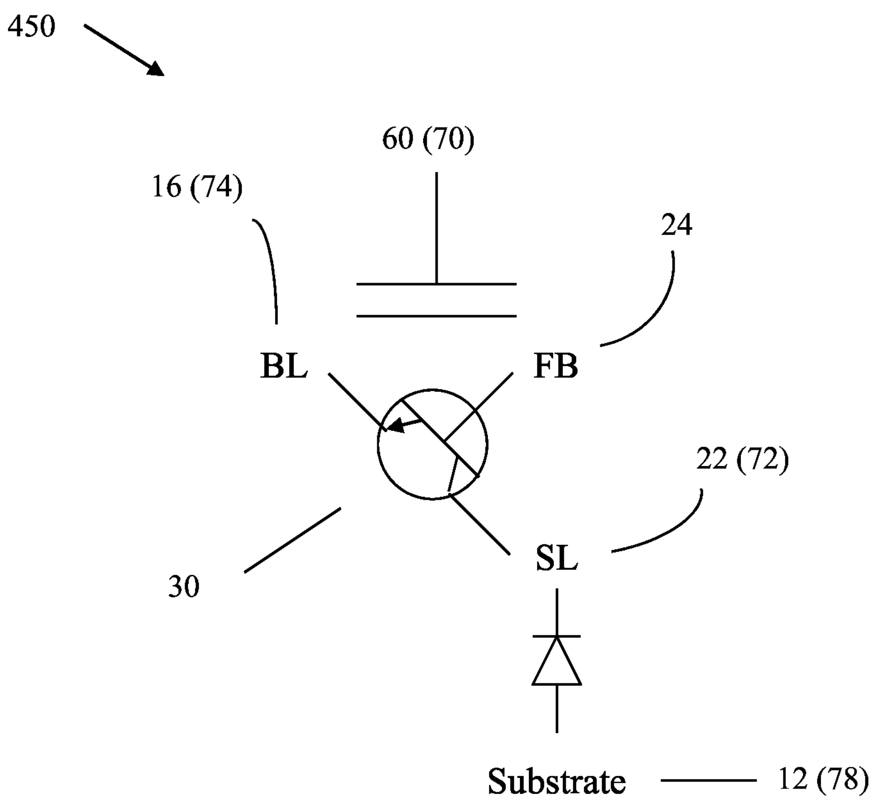
FIG. 61B illustrates a circuit schematic of an individual cell of the embodiments of FIGS. 59A through 59F and FIGS. 60A through 60F.

As shown in FIG. 61B, the circuit schematic for an individual memory cell 450 is identical to that for memory cell 250 as shown in FIG. 37A, the main differences between memory cells 250 and 450 being the physical construction, relative orientation, and the sharing of control lines. Thus the operating principles of memory cell 450 will follow the principles of the previously described memory cell 250. The memory cell operations will be described, realizing that the WL and SL terminals are now shared between neighboring memory cells. Persons of ordinary skill in the art will realize the operation of the embodiments of memory cell 450 which share word lines 70 but have separate source lines 72 can be handled identically by manipulating the non-shared source lines 72 identically or by manipulating them in an analogous manner to other rows in the memory array as a matter of design choice.

Figure 62:
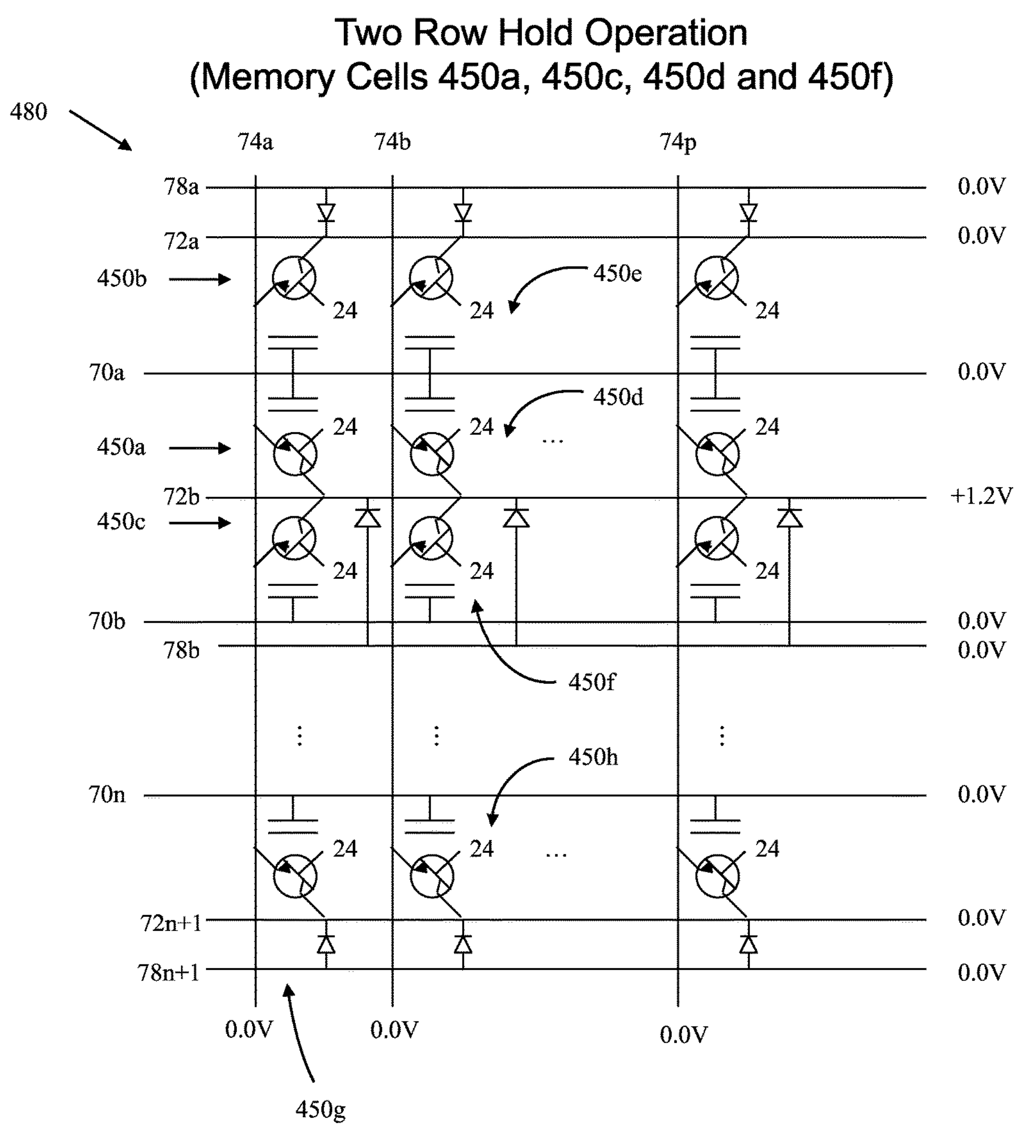
FIG. 62 illustrates a hold operation performed on the array of FIG. 61A.

As illustrated in FIG. 62, the holding operation for memory cell 450 can be performed in a similar manner to that for memory cell 250 by applying a positive bias to the back bias terminal (i.e. SL terminal 72 coupled to buried well region 22) while grounding bit line terminal 74 coupled to bit line region 16 and substrate terminal 78 coupled to substrate 12. As previously described, the holding operation is relatively independent of the voltage applied to terminal 70 which is preferably grounded in some embodiments. Inherent in the memory cell 450 is n-p-n bipolar device 30 formed by buried well region 22, floating body 24, and bit line region 16.

If floating body 24 is positively charged (i.e. in a logic-1 state), the bipolar transistor 30 formed by bit line region 16, floating body 24, and buried well region 22 will be turned on as discussed above in conjunction with FIGS. 37A through 37C above. A fraction of the bipolar transistor current will then flow into floating body region 24 (usually referred to as the base current) and maintain the logic-1 data. The efficiency of the holding operation can be enhanced by designing the bipolar device formed by buried well region 22, floating region 24, and bit line region 16 to be a low-gain bipolar device, where the bipolar gain is defined as the ratio of the collector current flowing out of SL terminal 72 to the base current flowing into the floating region 24.

For memory cells in the logic-0 state, the bipolar device will not be turned on, and consequently no base hole current will flow into floating body region 24 as discussed above in conjunction with FIGS. 37A through 37C above. Therefore, memory cells in state logic-0 will remain in state logic-0.

A periodic pulse of positive voltage can be applied to the SL terminal 72 as opposed to applying a constant positive bias to reduce the power consumption of the memory cell 450 in a manner analogous to that described in conjunction with FIGS. 38A through 38D above.

As illustrated in FIG. 62, an example of the bias condition for a two row holding operation is applied to exemplary memory array 480. In one particular non-limiting embodiment, about +1.2 volts is applied to SL terminal 72*b*, about 0.0 volts is applied to the other source line terminals 72*a* and 72*c* (not shown) through 72*n*+1, about 0.0 volts is applied to BL terminals 74*a* through 74*p*, about 0.0 volts is applied to WL terminals 70*a* through 70*n*, and about 0.0 volts is applied to substrate terminals 78*a* through 78*n*+1. This will place representative memory cells 450*a*, 450*c*, 450*d*, and 450*f* into a holding state. These voltage levels are exemplary only may vary substantially as a matter of design choice and processing technology node and are in no way limiting.

Figure 63:
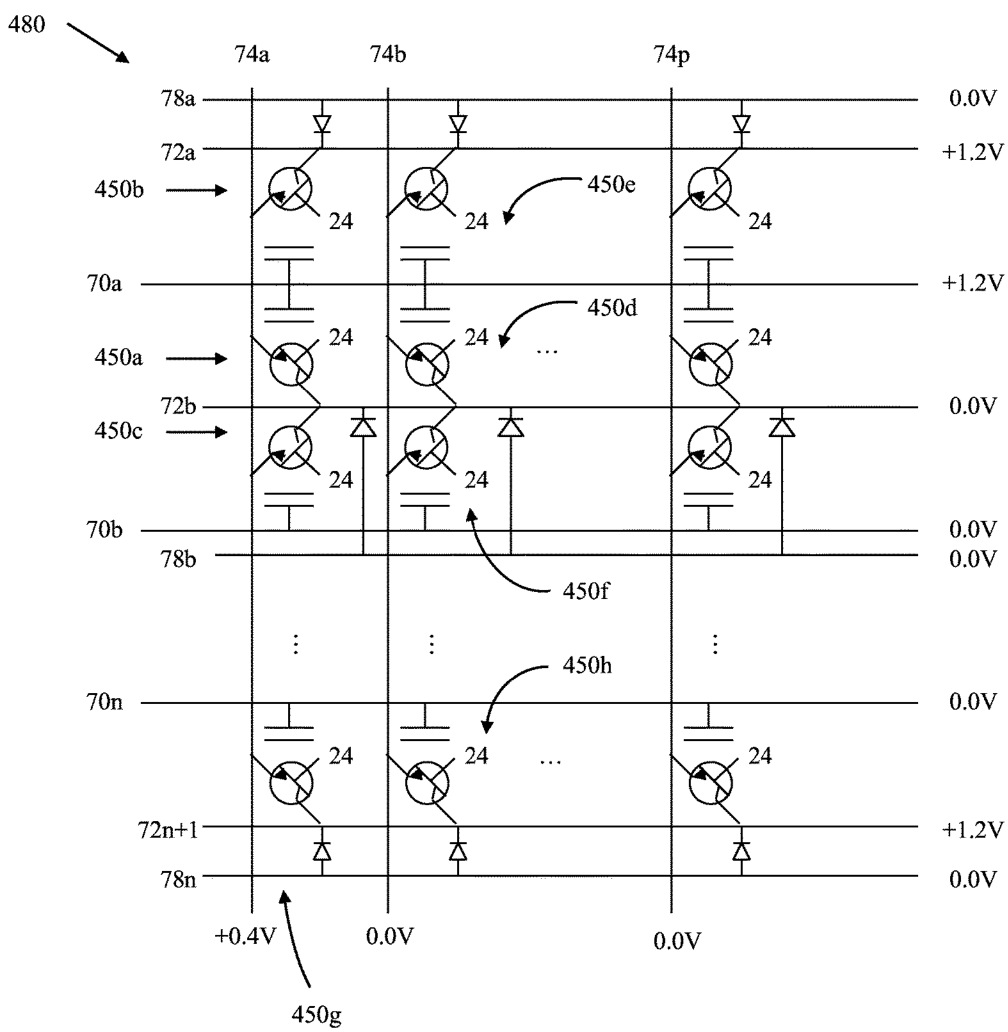
FIG. 63 illustrates a read operation performed on the array of FIG. 61A.
Figure 64A:
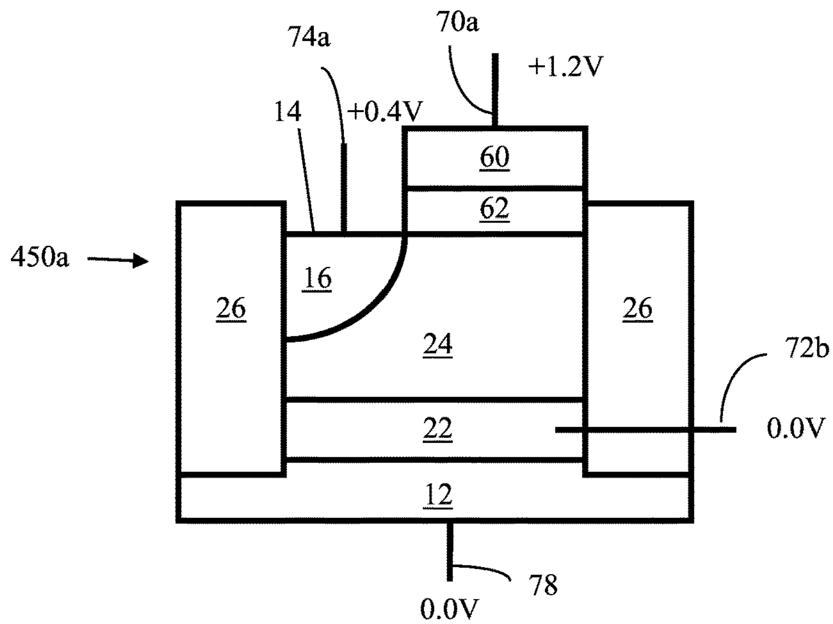
FIGS. 64A through 64P illustrate the operation of eight representative memory cells of the array of FIG. 63.
Figure 64B:
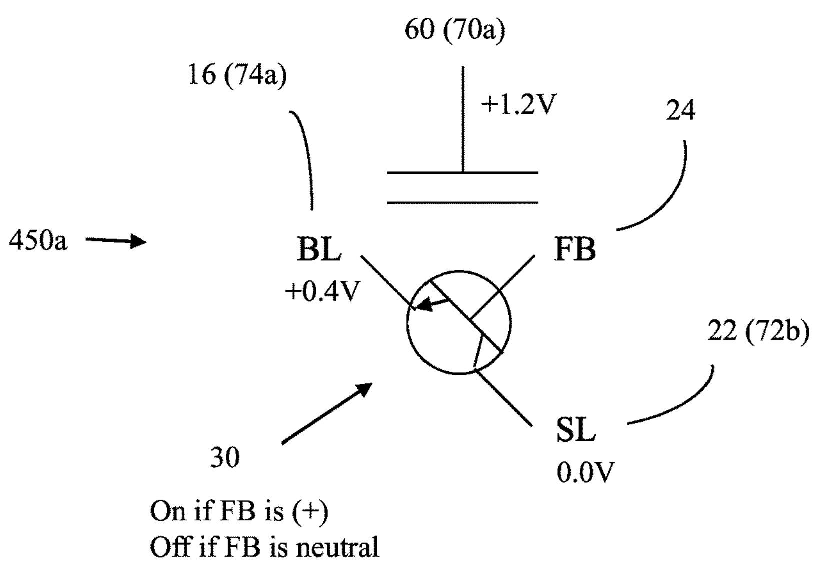
Figure 64C:
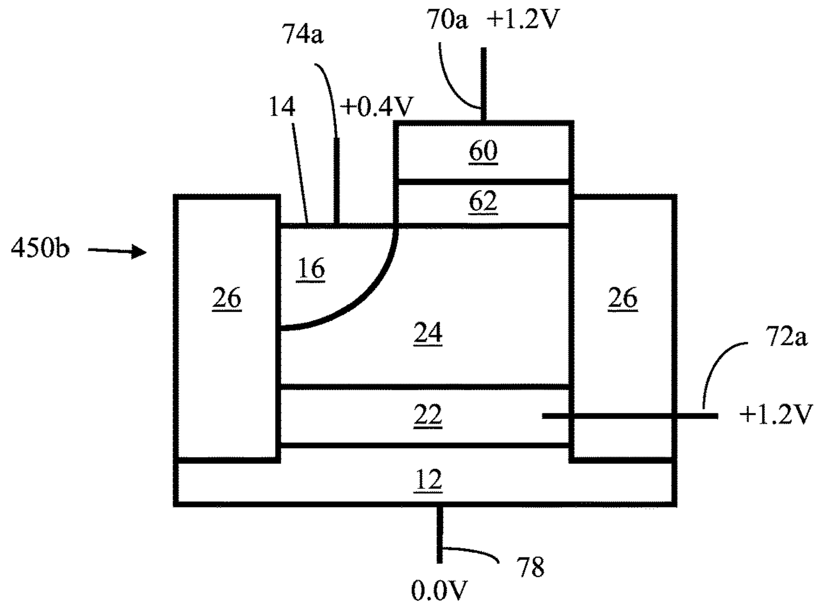
Figure 64D:
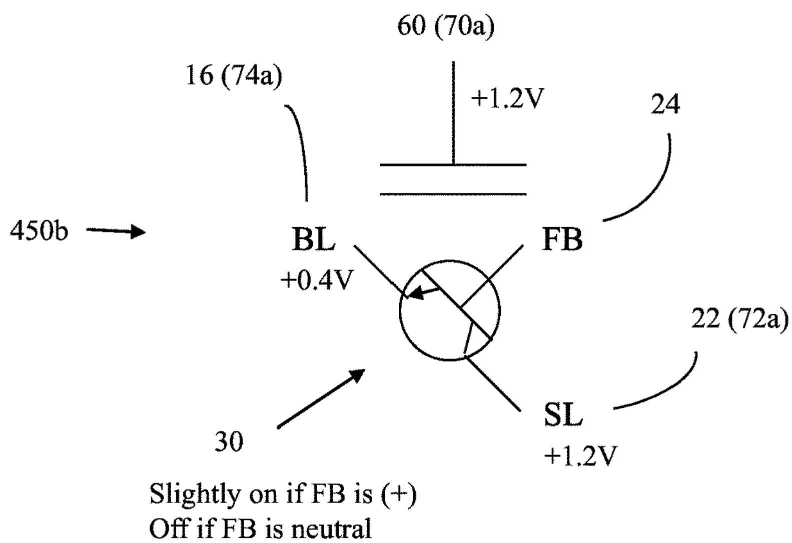
Figure 64E:
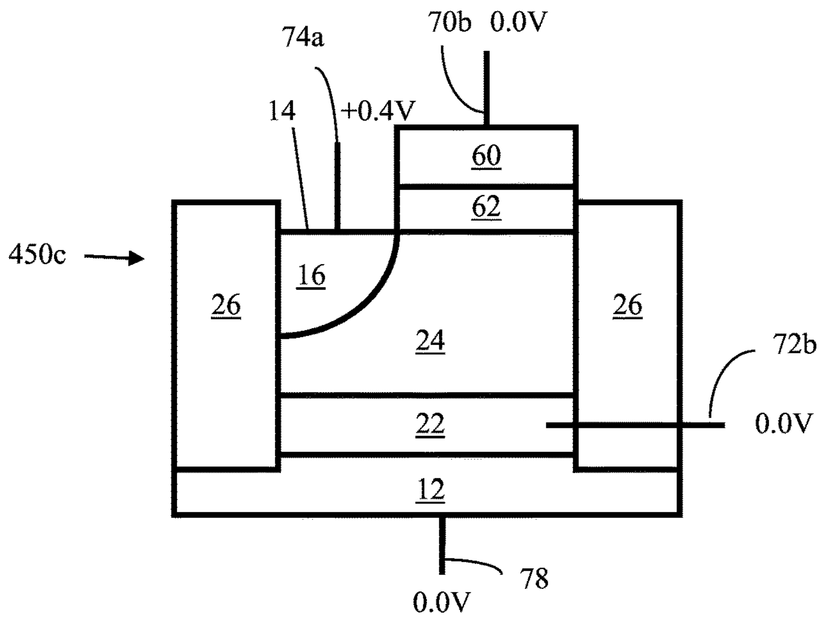
Figure 64F:
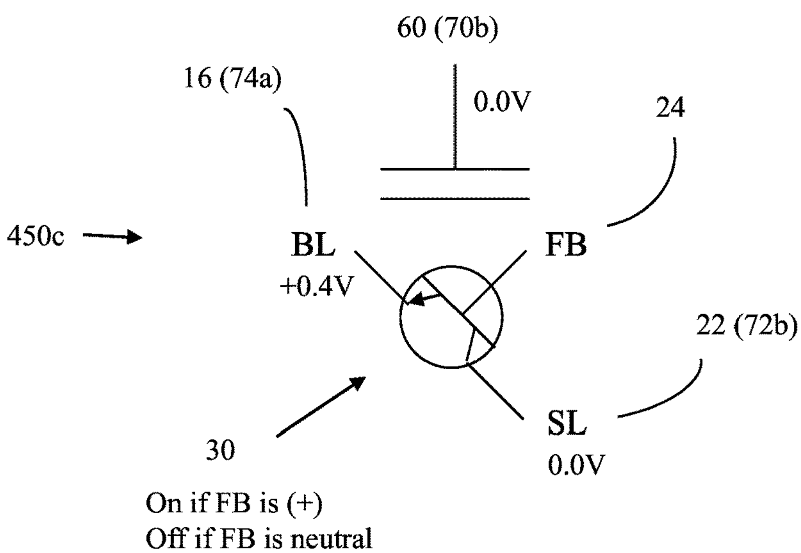
Figure 64G:
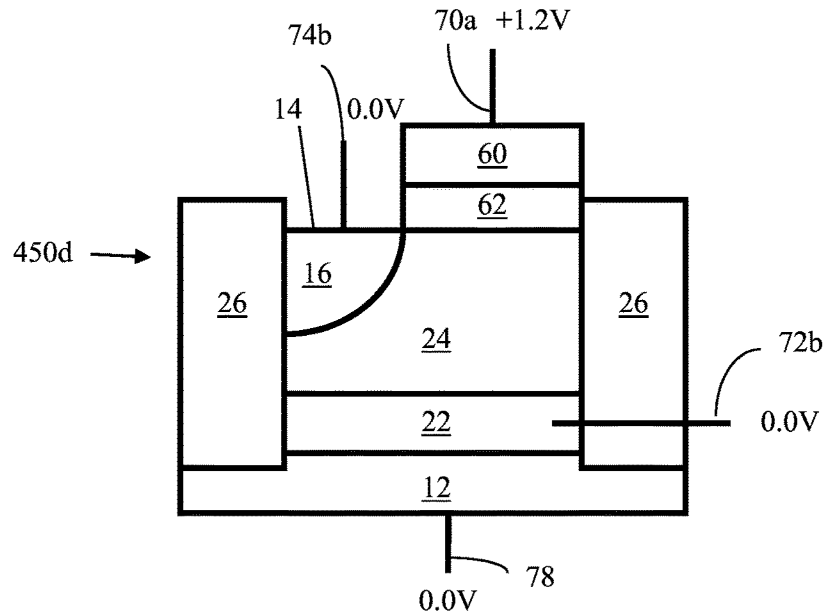
Figure 64H:
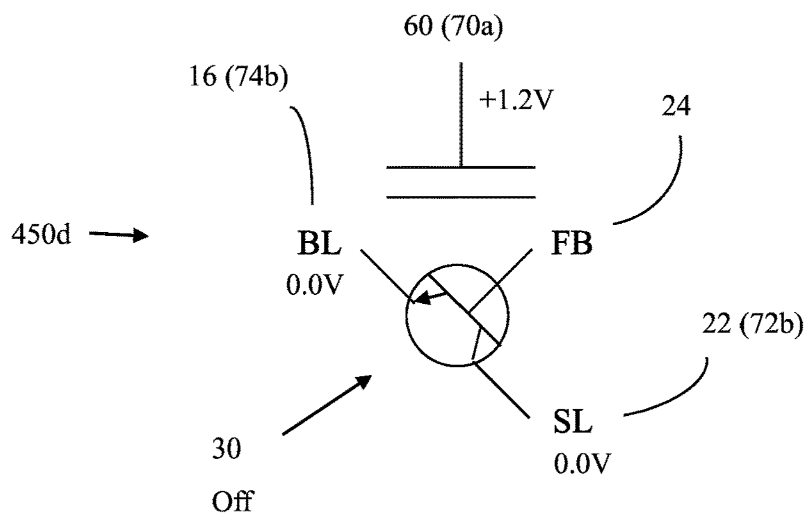
Figure 64I:
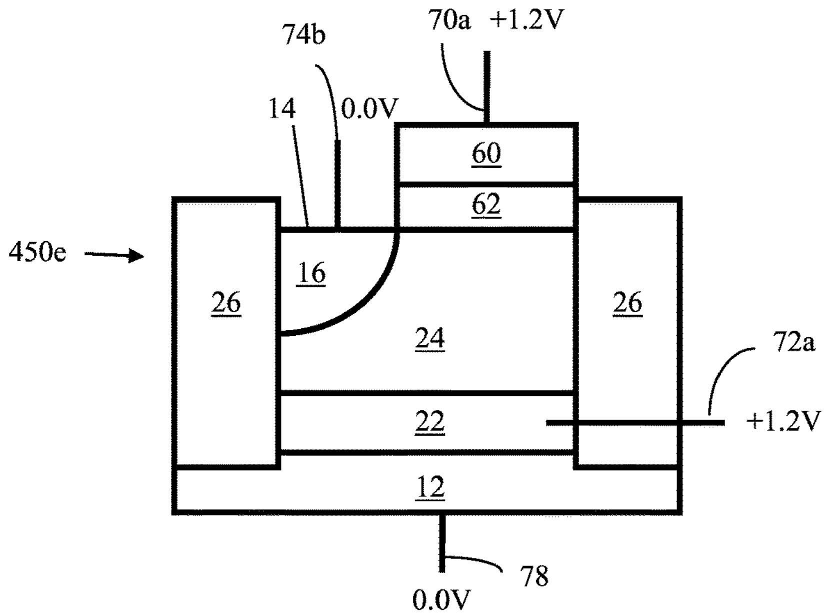
Figure 64J:
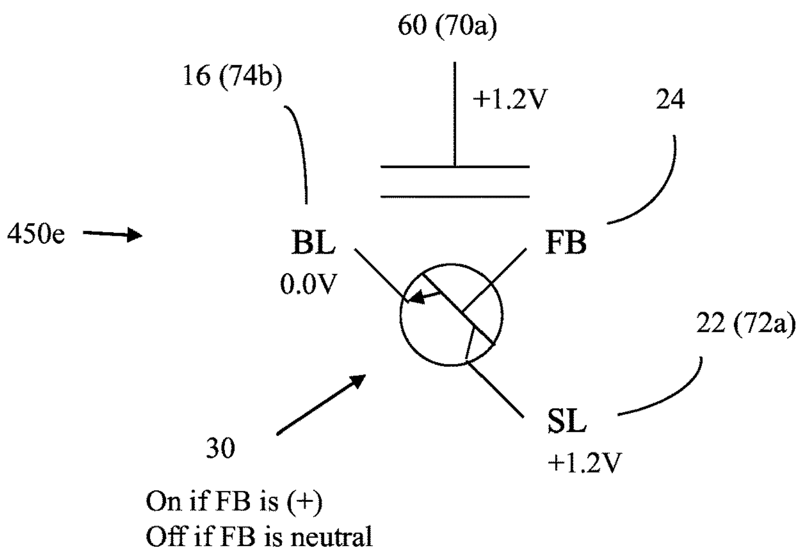
Figure 64K:
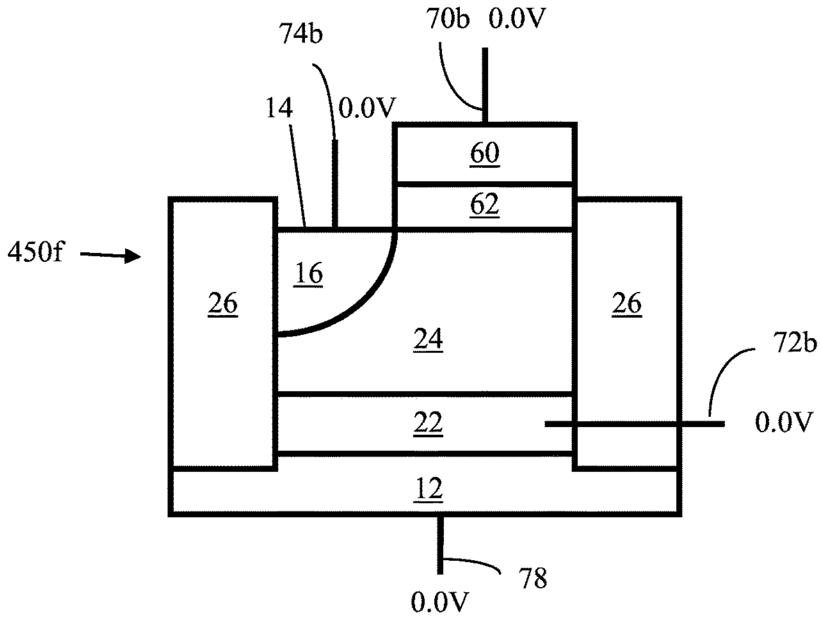
Figure 64L:
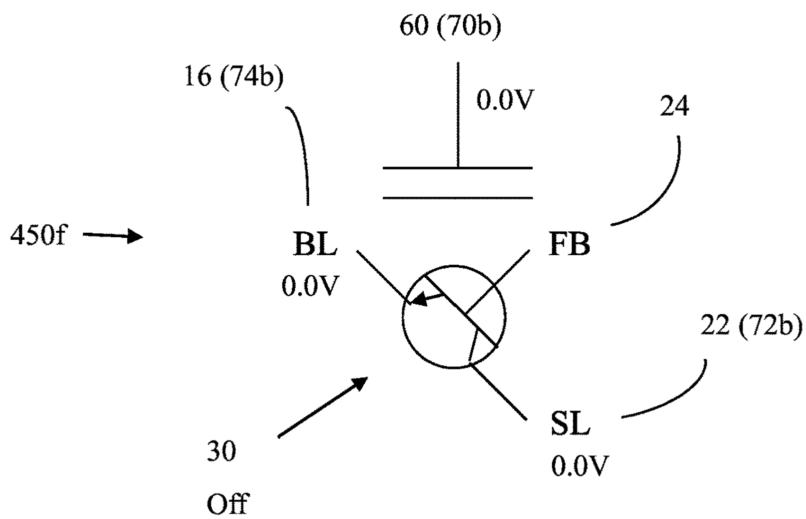
Figure 64M:
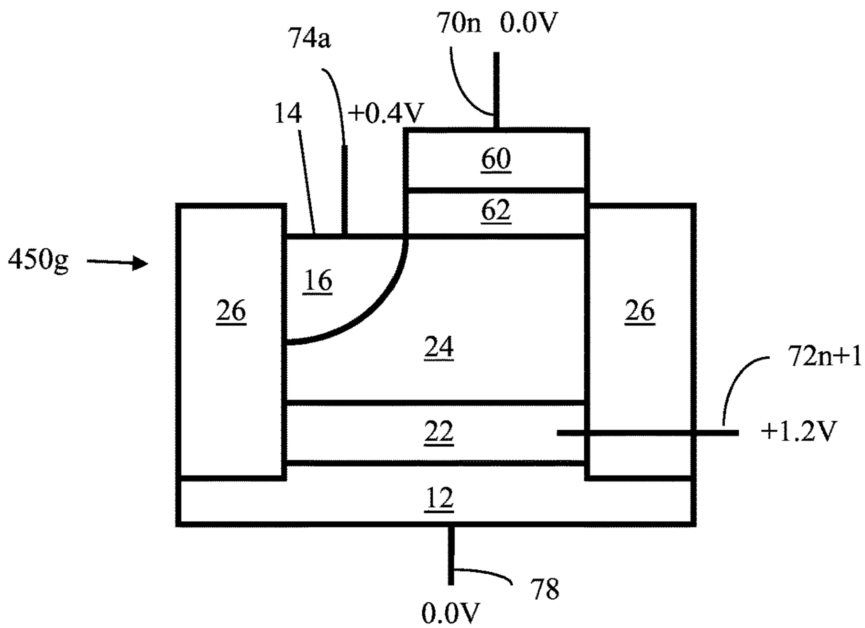
Figure 64N:
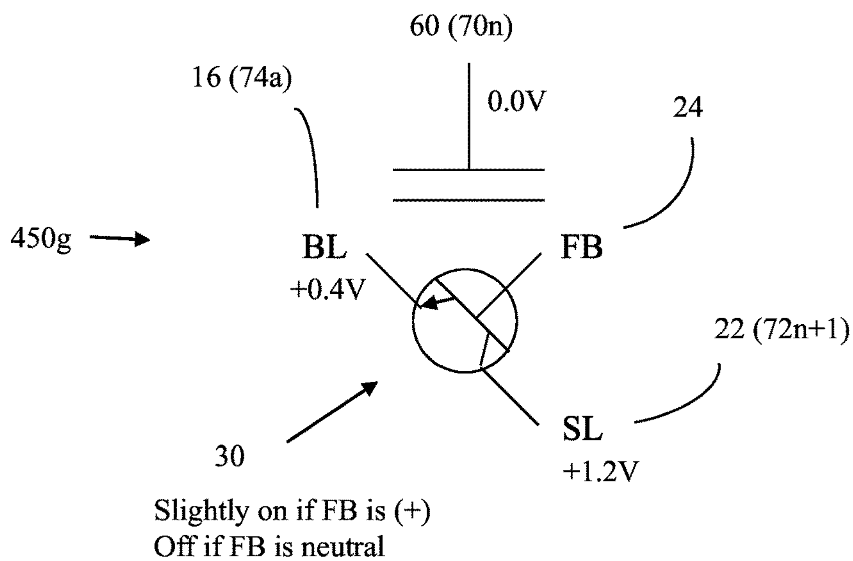
Figure 64O:
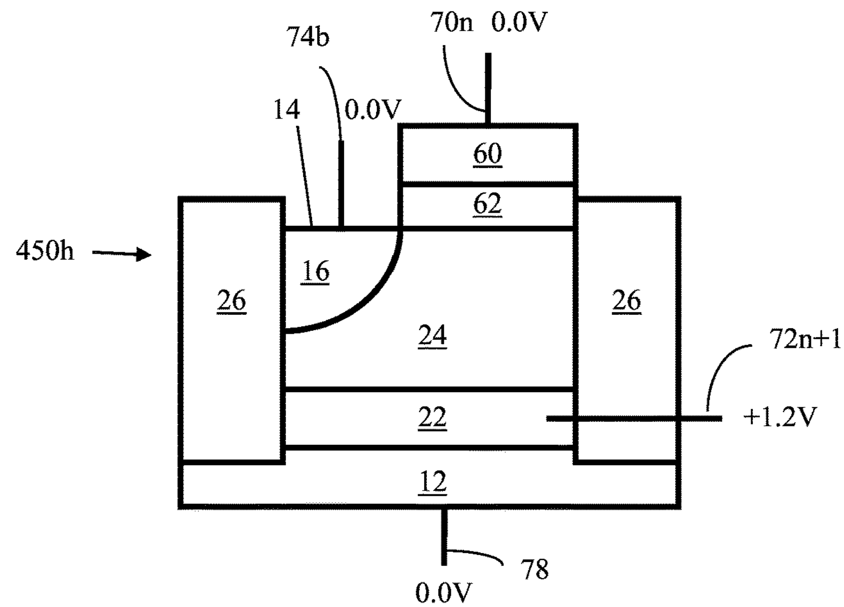
Figure 64P:
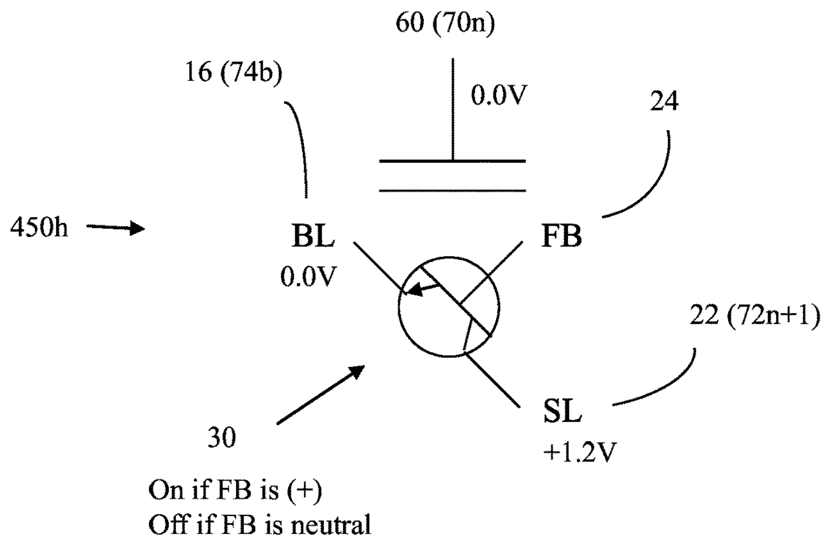

As illustrated in FIGS. 63 and 64A through 64P, the charge stored in the floating body 24 can be sensed by monitoring the cell current of the memory cell 450. If cell 450 is in a state logic-1 having holes in the body region 24, then the memory cell will have a higher cell current, compared to if cell 450 is in a state logic-0 having no holes in body region 24. A sensing circuit typically connected to BL terminal 74 of memory array 480 can then be used to determine the data state of the memory cell. Examples of the read operation are described with reference to Yoshida, Ohsawa-1, and Ohsawa-2 discussed above.

The read operation can be performed by applying the following bias condition to memory cell 450: a positive voltage is applied to the selected BL terminal 74, and a positive voltage greater than the positive voltage applied to the selected BL terminal 74 is applied to the selected WL terminal 70, zero voltage is applied to the selected SL terminal 72, and zero voltage is applied to the substrate terminal 78. The unselected BL terminals will remain at zero voltage, the unselected WL terminals will remain at zero voltage, and the unselected SL terminals will remain at positive voltage.

The bias conditions for an exemplary embodiment for a read operation for the exemplary memory array 480 are shown in FIG. 63, while the bias conditions during a read operation for selected representative memory cell 450*a* are further illustrated in FIGS. 64A through 64B and the bias conditions during a read operation for the seven cases illustrated by unselected representative memory cells 450*b* through 450*h* during read operations are further shown in FIGS. 64C through 64P. In particular, the bias conditions for unselected representative memory cell 450*b* sharing the same WL terminal 70*a* and BL terminal 74*a* but not the same SL terminal 72 as the selected representative memory cell 450*a* are shown in FIGS. 64C through 64D. The bias conditions for unselected representative memory cell 450*c* sharing the same SL terminal 72*b* and BL terminal 74*a* but not the same WL terminal 70 as the selected representative memory cell 450*a* are shown in FIGS. 64E through 64F. The bias conditions for unselected representative memory cell 450*d* sharing the same WL terminal 70*a* and SL terminal 72*b* but not the same BL terminal 74 as the selected representative memory cell 450*a* are shown in FIGS. 64G through 64H. FIGS. 64I through 64J show the bias conditions for unselected representative memory cell 450*e* sharing the same WL terminal 70*a* but neither the same SL terminal 72 nor BL terminal 74 as the selected representative memory cell 450*a*. FIGS. 64K through 64L show the bias conditions for unselected representative memory cell 450*f* sharing the same SL terminal 72*b* but neither the same WL terminal 70 nor BL terminal 74 as the selected representative memory cell 450*a*. The bias conditions for unselected representative memory cell 450*g* sharing the same BL terminal 74*a* as the selected representative memory cell 450*a* but not the same WL terminal 70 nor SL terminal 72 is shown in FIGS. 64M through 64N. The bias condition for representative memory cell 450*h* not sharing any control terminals as the selected representative memory cell 450*a* is shown in FIGS. 640 through 64P.

In one particular non-limiting and exemplary embodiment illustrated in FIGS. 63, 64A and 64B, the bias conditions for selected representative memory cell 450*a* and are shown. In particular, about 0.0 volts is applied to the selected SL terminal 72*b*, about +0.4 volts is applied to the selected bit line terminal 74*a*, about +1.2 volts is applied to the selected word line terminal 70*a*, and about 0.0 volts is applied to substrate terminal 78 (not shown in FIG. 64B).

In the remainder of exemplary array 480, the unselected bit line terminals 74*b* through 74*p* remain at 0.0 volts, the unselected word line terminals 70*b* through 70*n* remain at 0.0 volts, and the unselected SL terminals 72*a* and 72*c* (not shown in FIG. 63) through 72*n*+1 remain at +1.2 volts. FIGS. 64C through 64P show in more detail the unselected representative memory cells 450*b*-450*h* in memory array 480. It is noteworthy that these voltage levels are exemplary only may vary substantially as a matter of design choice and processing technology node, and are in no way limiting.

As shown in FIGS. 63, 64C and 64D, representative memory cell 450*b* sharing the same WL terminal 70*a* and BL terminal 74*a* but not the same SL terminal 72 as the representative selected memory cell 450*a,* both the BL and SL terminal are positively biased. The potential difference between the BL and SL terminals (i.e. the emitter and collector terminals of the bipolar device 30) is lower compared to the memory cells in the holding mode, reducing the base current flowing to the floating body 24. However, because read operation is accomplished much faster (in the order of nanoseconds) compared to the lifetime of the charge in the floating body 24 (in the order of milliseconds), it should cause little disruptions to the charge stored in the floating body.

As shown in FIGS. 63, 64E and 64F, representative memory cell 450*c* sharing the same SL terminal 72*b* and BL terminal 74*a* but not the same WL terminal 70 as the selected representative memory cell 450*a,* both the WL terminal 72*b* and the SL terminal 72 are grounded with the BL terminal positively biased. As a result, memory cell 450*c* will still be at holding mode, where memory cells in state logic-1 will maintain the charge in floating body 24 because the intrinsic bipolar device 30 will generate hole current to replenish the charge in floating body 24; while memory cells in state logic-0 will remain in neutral state.

As shown in FIGS. 63, 64G and 64H, representative memory cell 450*d* sharing the same WL terminal 70*a* and SL terminal 72*b* but not the same BL terminal 74 as the selected representative memory cell 450*a,* both the SL terminal 72*b* and BL terminal 74*b* are grounded with the WL terminal 70*a* at +1.2V. As a result, there is no potential difference between the emitter and collector terminals of the n-p-n bipolar device 30 and consequently representative memory cell 450*d* is no longer in holding mode. However, because read operation is accomplished much faster (in the order of nanoseconds) compared to the lifetime of the charge in the floating body 24 (in the order of milliseconds), it should cause little disruptions to the charge stored in the floating body.

As shown in FIGS. 63, 64I and 64J, representative memory cell 450*e* sharing the same WL terminal 70*a* but not the same SL terminal 72 nor BL terminal 74 as the selected representative memory cell 450*a,* the SL terminal remains positively biased. As a result, memory cell 450*e* will still be at holding mode, where memory cells in state logic-1 will maintain the charge in floating body 24 because the intrinsic bipolar device 30 will generate holes current to replenish the charge in floating body 24; while memory cells in state logic-0 will remain in the neutral state.

As shown in FIGS. 63, 64K and 64L, representative memory cell 450*f* sharing the same SL terminal 72*b* but not the same WL terminal 70 nor BL terminal 74 as the selected representative memory cell 450*a,* both the SL terminal 72 and BL terminal 74 are now grounded. As a result, there is no potential difference between the emitter and collector terminals of the n-p-n bipolar device 30 and consequently memory cells 450*f* is no longer in holding mode. However, because read operation is accomplished much faster (in the order of nanoseconds) compared to the lifetime of the charge in the floating body 24 (in the order of milliseconds), it should cause little disruptions to the charge stored in the floating body.

As shown in FIGS. 63, 64M and 64N, representative memory cell 450*g* sharing the same BL terminal 74*a* but not the same WL terminal 70 nor SL terminal 72 as the selected representative memory cell 450*a,* a positive voltage is applied to the BL terminal 74. Less base current will flow into the floating body 24 due to the smaller potential difference between SL terminal 72 and BL terminal 74 (i.e. the emitter and collector terminals of the n-p-n bipolar device 30). However, because read operation is accomplished much faster (in the order of nanoseconds) compared to the lifetime of the charge in the floating body 24 (in the order of milliseconds), it should cause little disruptions to the charge stored in the floating body.

As shown in FIGS. 63, 64O and 64P, representative memory cells 450*h* not sharing WL, BL, and SL terminals as the selected representative memory cell 450*a,* both the SL terminal 72 will remain positively charged and the BL terminal remain grounded (FIGS. 64O-64P). As can be seen, these cells will be at holding mode, where memory cells in state logic-1 will maintain the charge in floating body 24 because the intrinsic bipolar device 30 will generate holes current to replenish the charge in floating body 24; while memory cells in state logic-0 will remain in the neutral state.

It is noteworthy that the voltage levels described in all the different cases above are exemplary only may vary substantially from embodiment to embodiment as a matter of both design choice and processing technology node, and are in no way limiting.

A two row write logic-0 operation of the cell 450 is now described with reference to FIG. 65. A negative bias may be applied to the back bias terminal (i.e. SL terminal 72), zero potential may be applied to WL terminal 70, zero voltage may be applied to BL terminal 72 and substrate terminal 78. The unselected SL terminal 72 will remain positively biased. Under these conditions, the p-n junction between floating body 24 and buried well 22 of the selected cell 50 is forward-biased, evacuating any holes from the floating body 24. In one particular non-limiting embodiment, about −0.5 volts is applied to terminal 72, about 0.0 volts is applied to terminal 70, and about 0.0 volts is applied to terminal 74 and 78. However, these voltage levels may vary, while maintaining the relative relationship between the charges applied, as described above.

Figure 65:
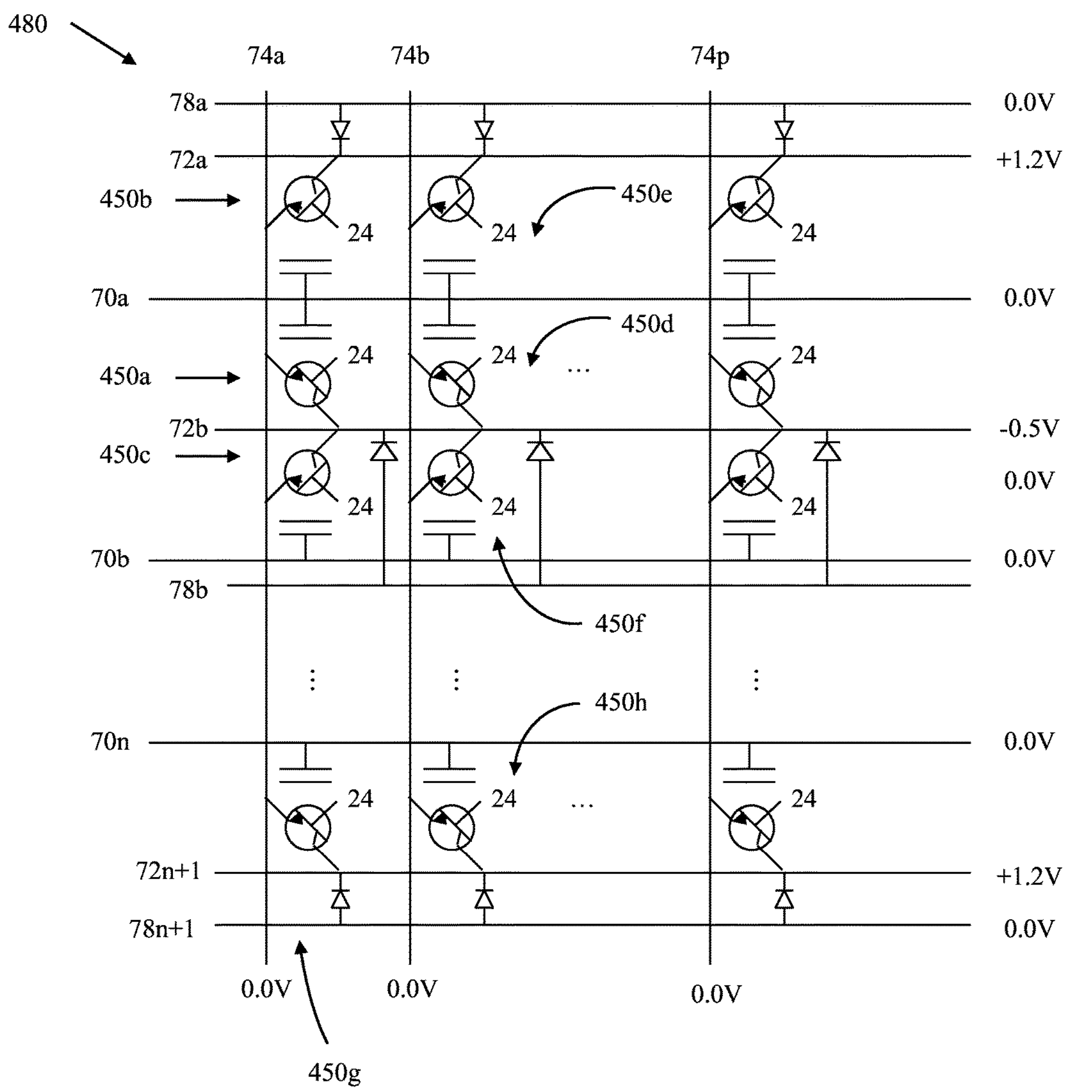
FIG. 65 illustrates a two row write logic-0 operation on the memory array of FIG. 61A.

In FIG. 65, the selected SL terminal 72*b* is biased at about −0.5V while the unselected SL terminals 72*a,* and 72*c* (not shown) through 72*n*+1 are biased at about +1.2V, the WL terminals 70*a* through 70*n* are biased at about 0.0V, the BL terminals 74*a* through 74*p* are biased at about 0.0V and the substrate terminals 78*a* through 78*n*+1 are biased at about 0.0V. In some embodiments where the substrate is really a well in another substrate (not shown), the substrate terminals may be biased at about −0.5V to avoid unwanted current from the selected SL terminal 72*b*. This condition causes all of the memory cells 450 coupled to SL terminal 72*b,* including the selected representative memory cells 450*a,* 450*c,* 450*d,* and 450*f,* to be written to the logic-0 state.

Figure 66A:
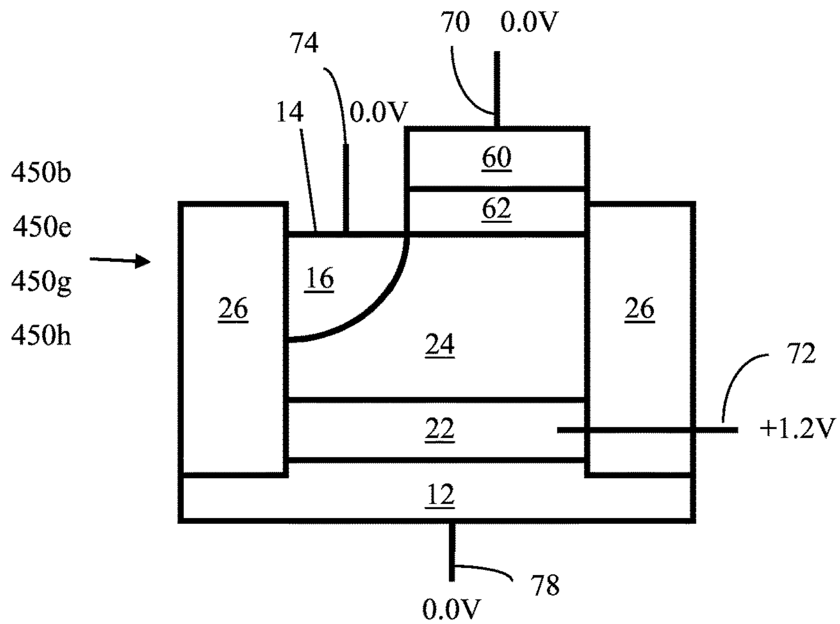
FIGS. 66A and 66B illustrate the operation of unselected memory cells in FIG. 65.
Figure 66B:
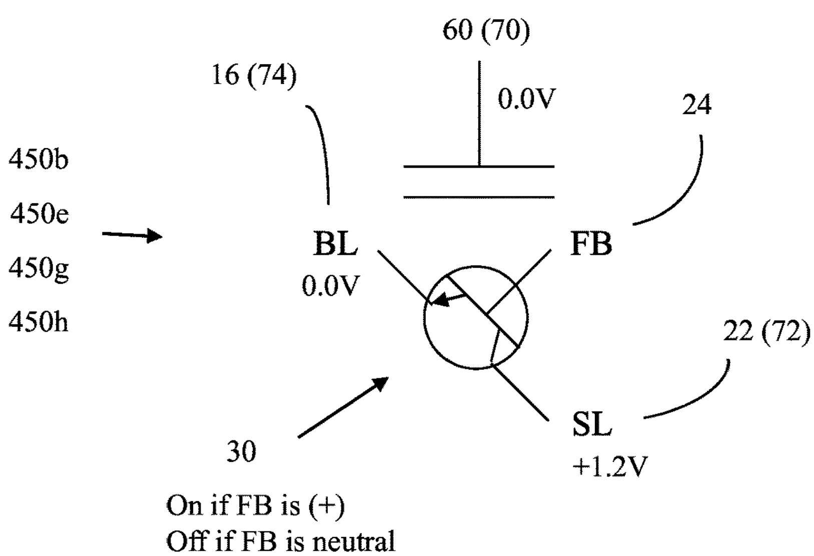

FIGS. 65, 66A and 66B show an example of bias conditions for the selected and unselected memory cells 450 during a two row write logic-0 operation in memory array 480. For the selected memory cells, including representative memory cells 450*a,* 450*c,* 450*d* and 450*f,* the negative bias applied to SL terminal 72 causes large potential difference between floating body 24 and buried well region 22. This causes the hole charge in the floating body 24 to be discharged as discussed above. Because the buried well 22 is shared among multiple memory cells 50, all memory cells 450 sharing the same SL terminal 72 will be written into state logic-0.

An example of bias conditions and an equivalent circuit diagram illustrating the intrinsic n-p-n bipolar devices 30 of unselected memory cells 450, including representative memory cells 450*b*, 450*e*, 450*g* and 450*h*, during write logic-0 operations are illustrated in FIGS. 66A through 66B. Since the write logic-0 operation only involves a negative voltage to the selected SL terminal 72, the bias conditions for all the unselected cells are the same. As can be seen, the unselected memory cells will be in a holding operation, with the BL terminal at about 0.0 volts, WL terminal at zero or negative voltage, and the unselected SL terminal positively biased.

Figure 67:
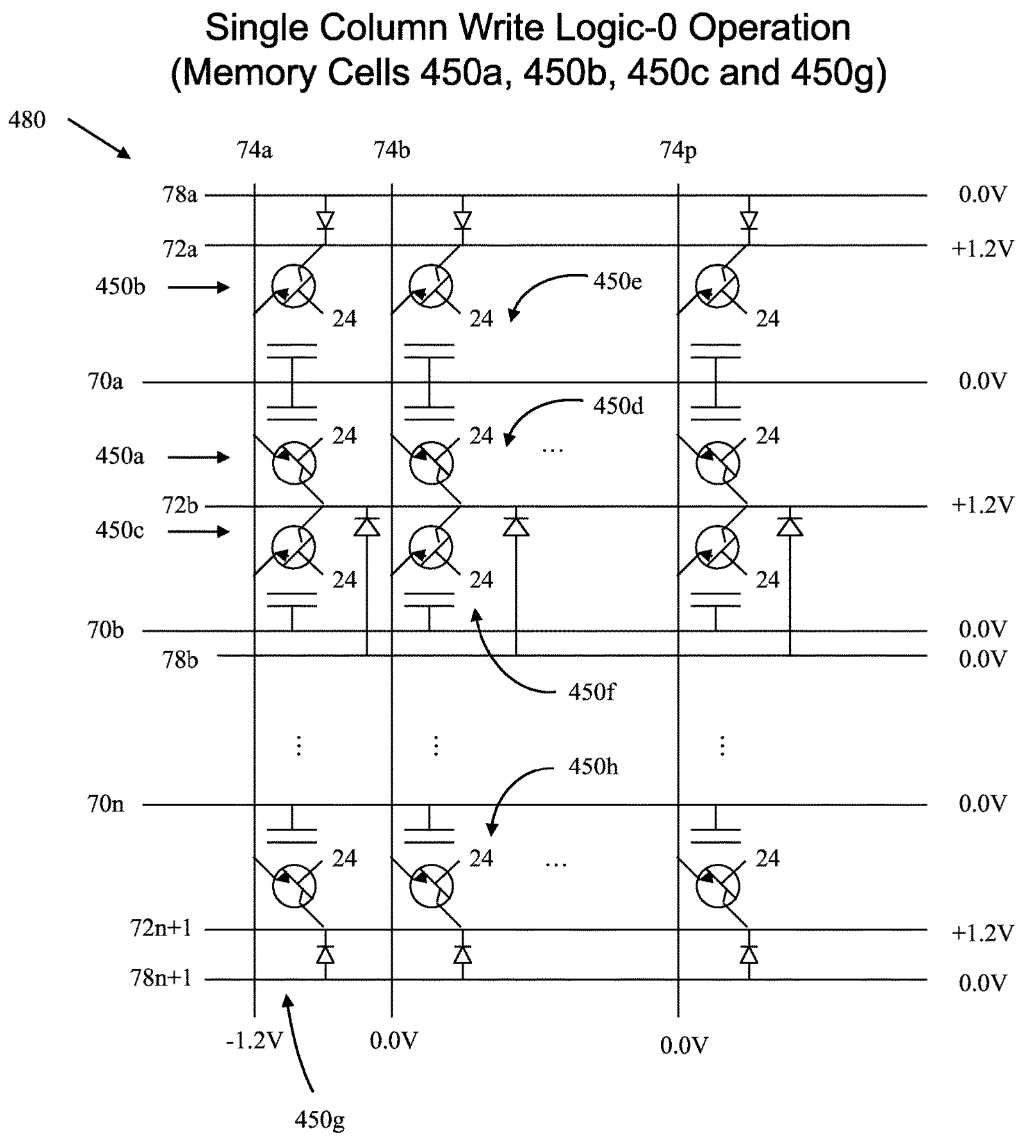
FIG. 67 illustrates a single column write logic-0 operation on the memory array of FIG. 61A.

As illustrated in FIG. 67, a single column write logic-0 operation can be performed by applying a negative bias to the BL terminal 74 as opposed to the SL terminal 72 (as in FIGS. 65, 66A, and 66B). The SL terminal 72 will be positively biased, while zero voltage is applied to the substrate terminal 78, and zero voltage is applied to the WL terminal 70. Under these conditions, all memory cells sharing the same BL terminal 74 will be written into state logic-0 while all the other memory cells 450 in the array 480 will be in the holding state.

In FIG. 67, selected BL terminal 74*a* may be biased at about −1.2V while the unselected BL terminals 74*b* through 74*p* may be biased at about 0.0V, the WL terminals 70*a* through 70*n* may be biased at about 0.0V, the source line terminals 72*a* through 27*n*+1 may be biased at +1.2V, and the substrate terminals 78*a* through 78*n*+1 may be biased at 0.0V. This condition causes all of the memory cells 450 coupled to BL terminal 74*a*, including the selected representative memory cells 450*a*, 450*b*, 450*c*, and 450*g*, to be written to the logic-0 state while the remaining memory cells 450, including unselected representative memory cells 450*d*, 450*e*, 450*f*, and 450*h*, to be in a holding operation. These voltage levels are exemplary only may vary substantially from embodiment to embodiment as a matter of design choice and processing technology node used, and are in no way limiting.

Figure 68:
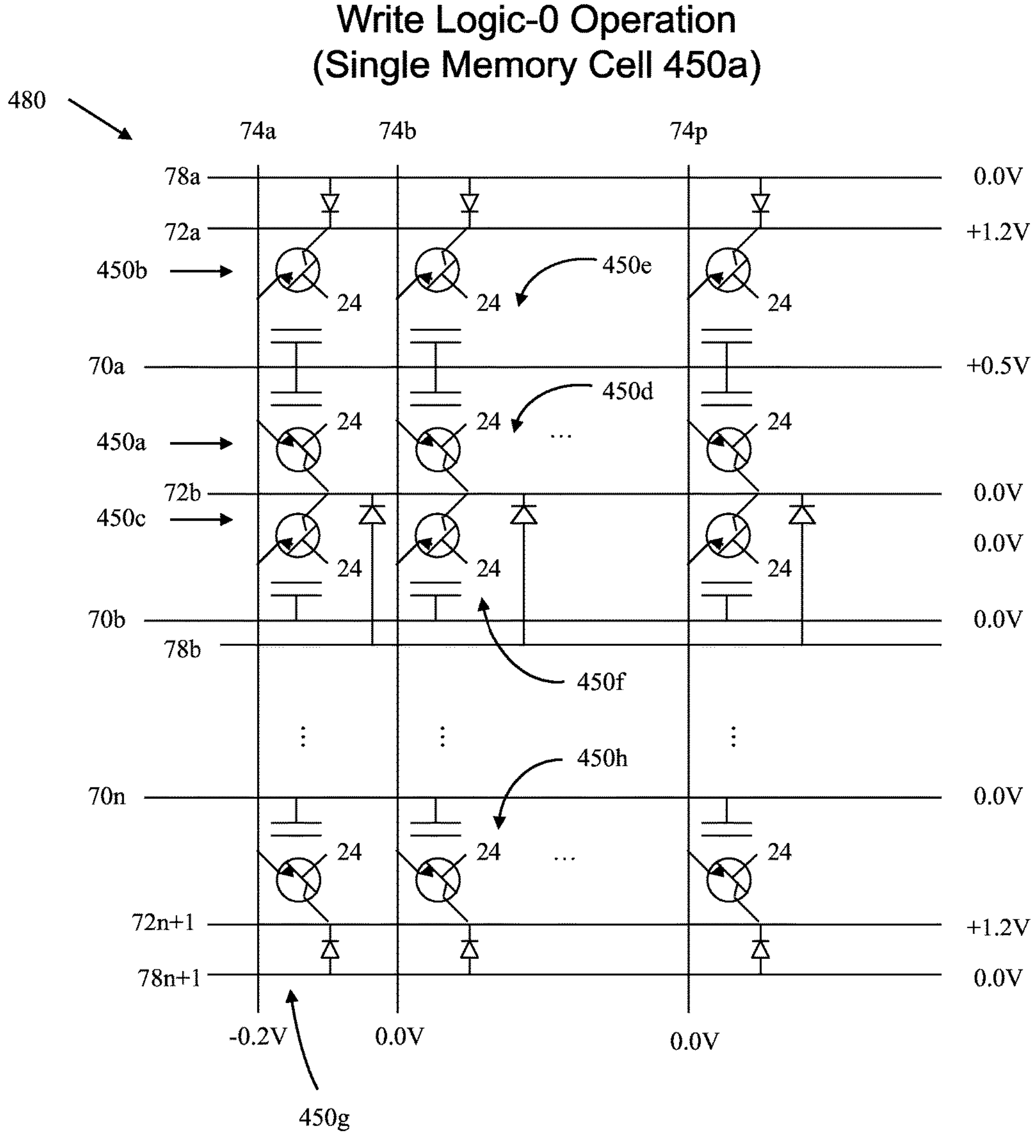
FIG. 68 illustrates a single memory cell write logic-0 operation on the memory array of FIG. 61A.
Figure 69A:
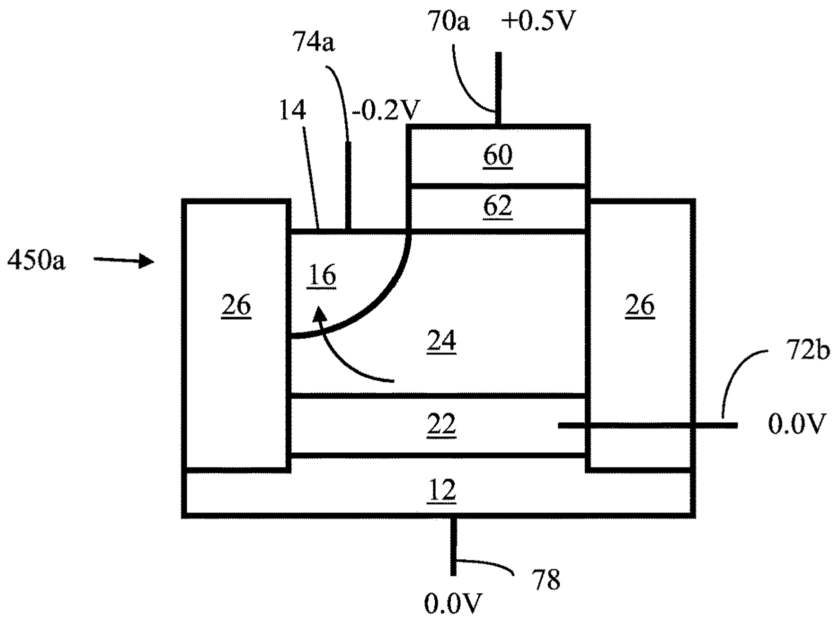
FIGS. 69A through 69P illustrate the operation of eight representative memory cells of the array of FIG. 68.
Figure 69B:
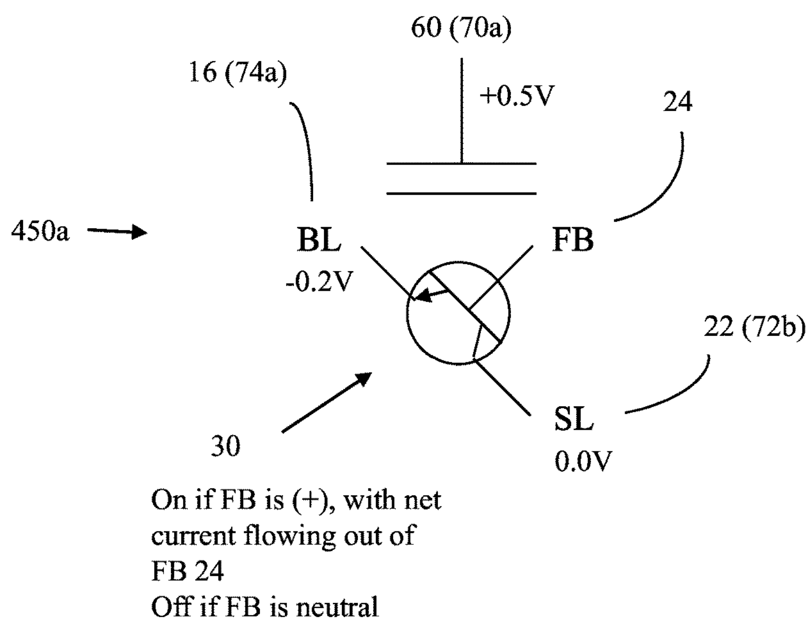
Figure 69C:
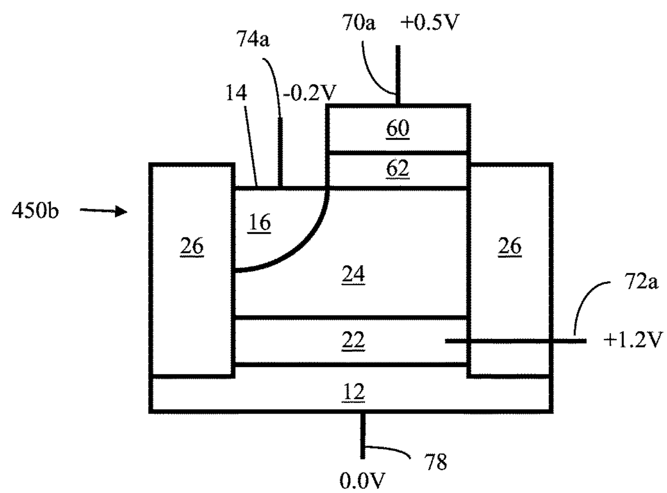
Figure 69D:
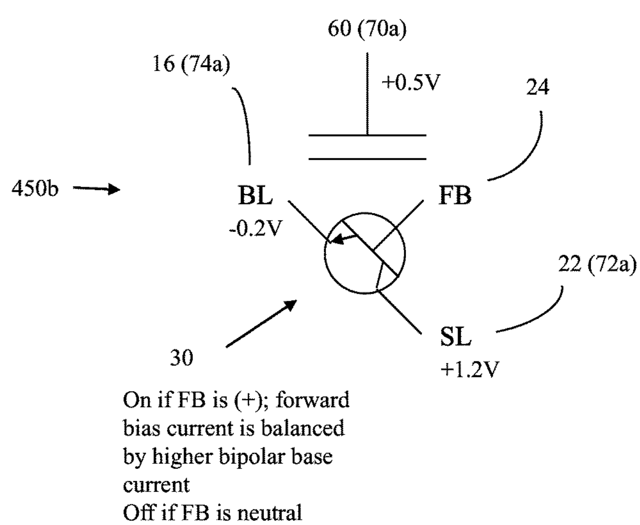
Figure 69E:
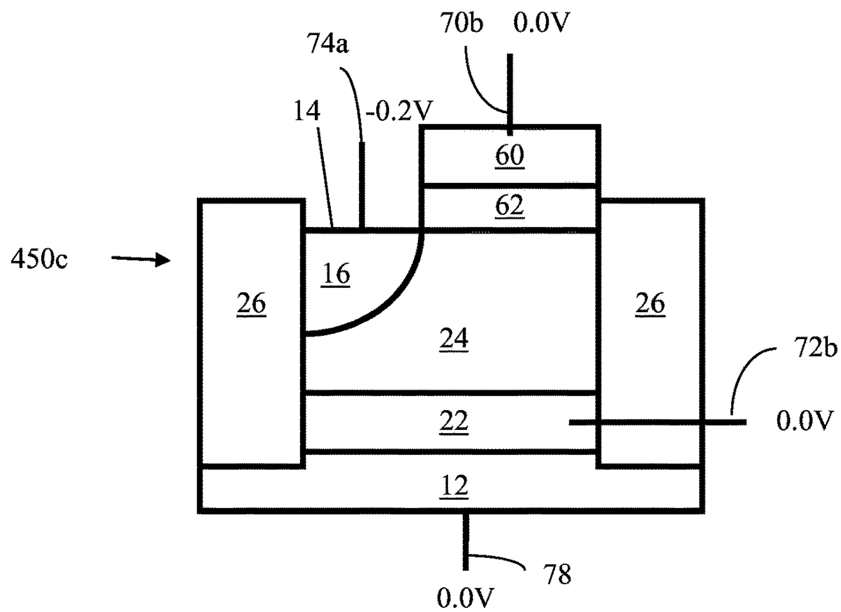
Figure 69F:
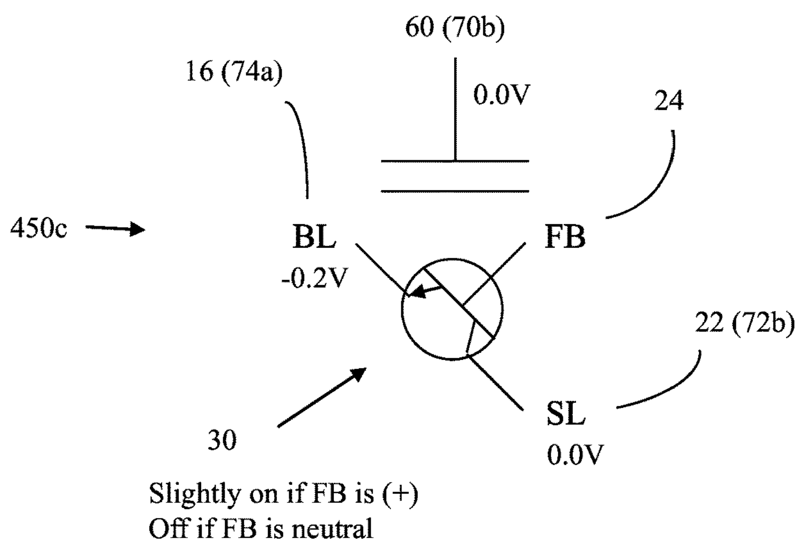
Figure 69G:
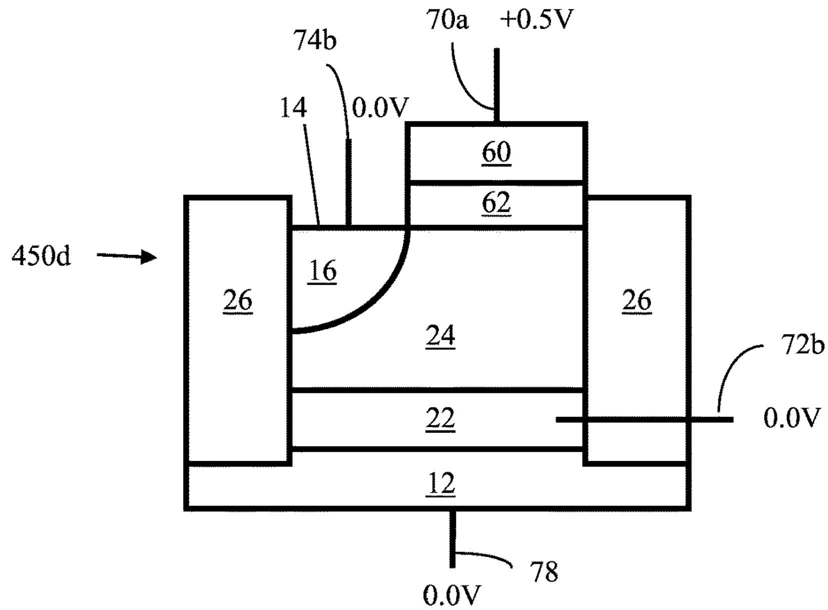
Figure 69H:
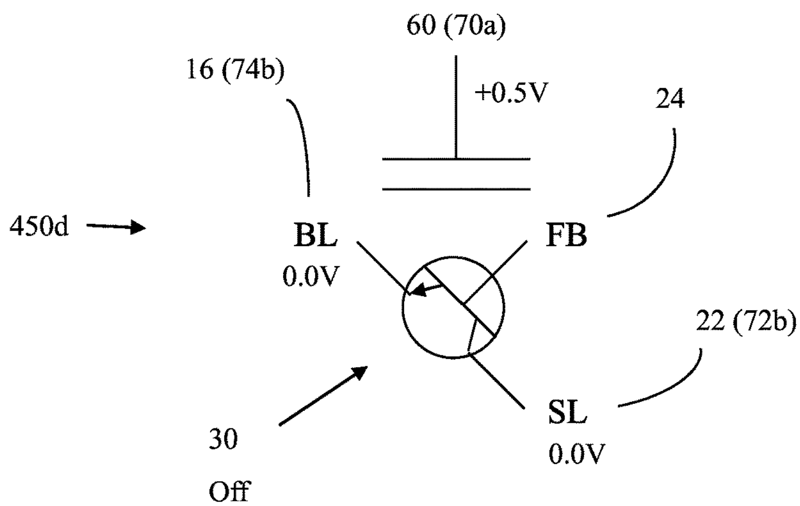
Figure 69I:
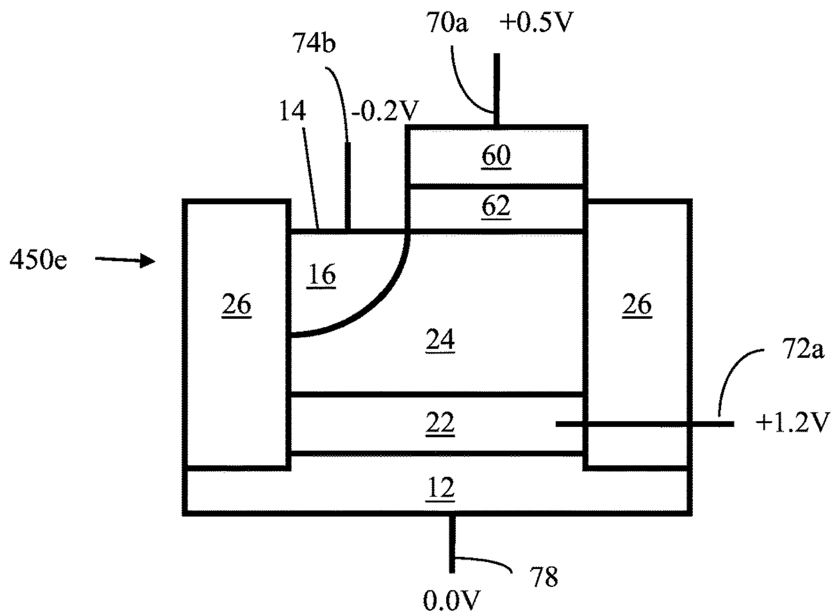
Figure 69J:
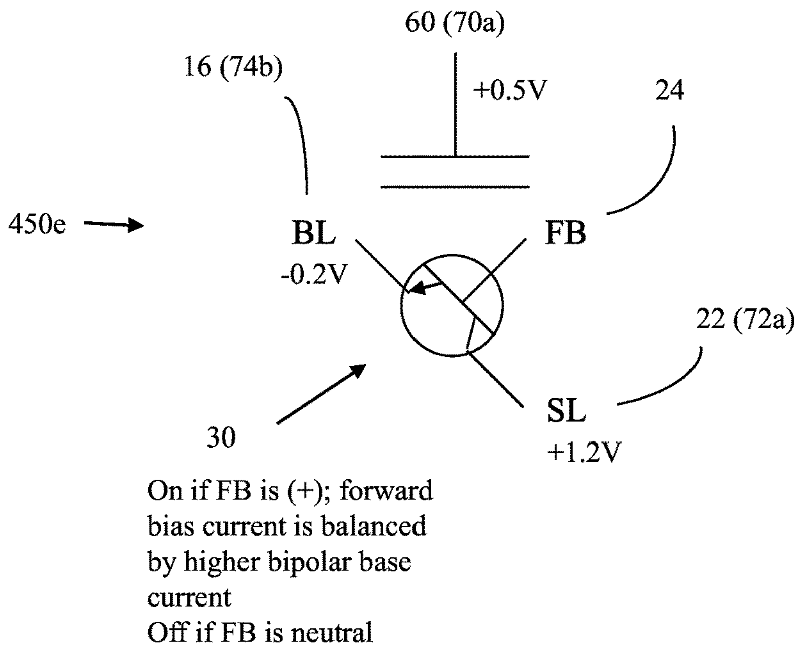
Figure 69M:
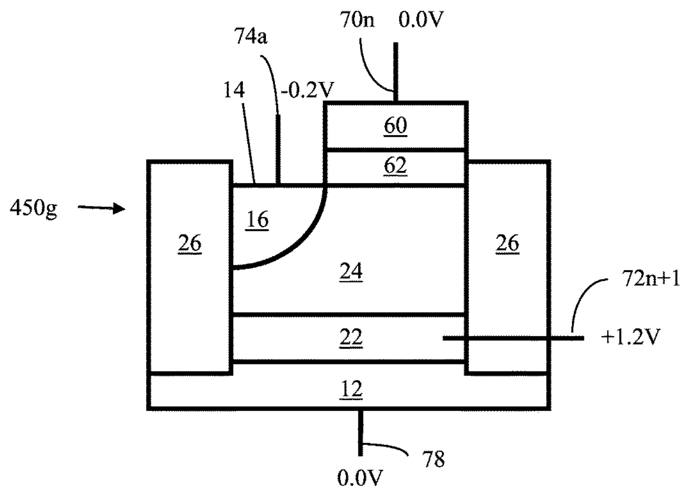
Figure 69N:
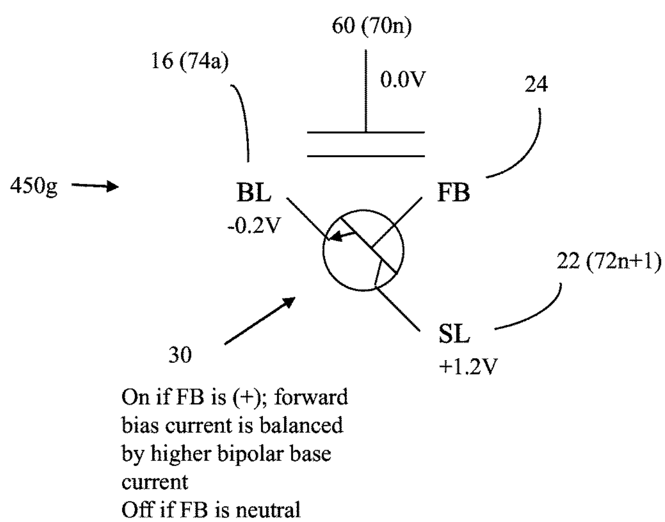
Figure 69O:
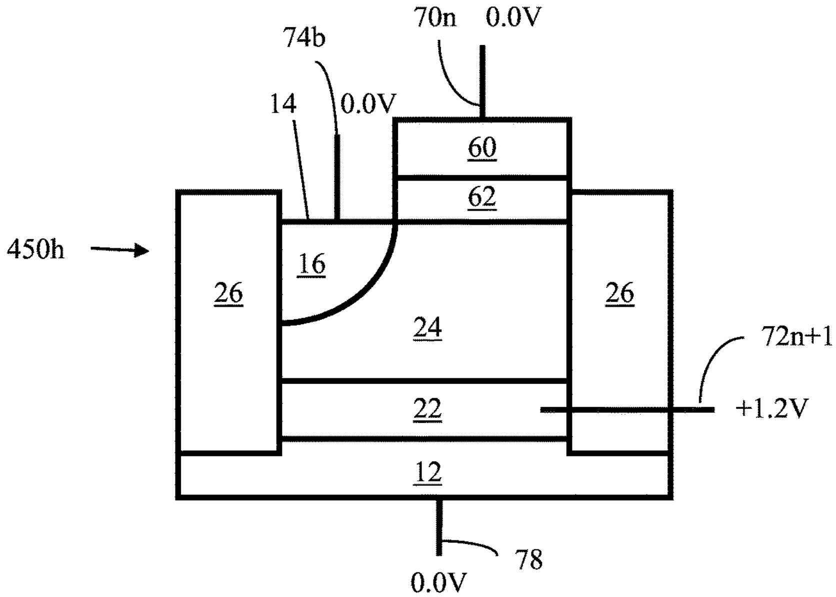
Figure 69P:
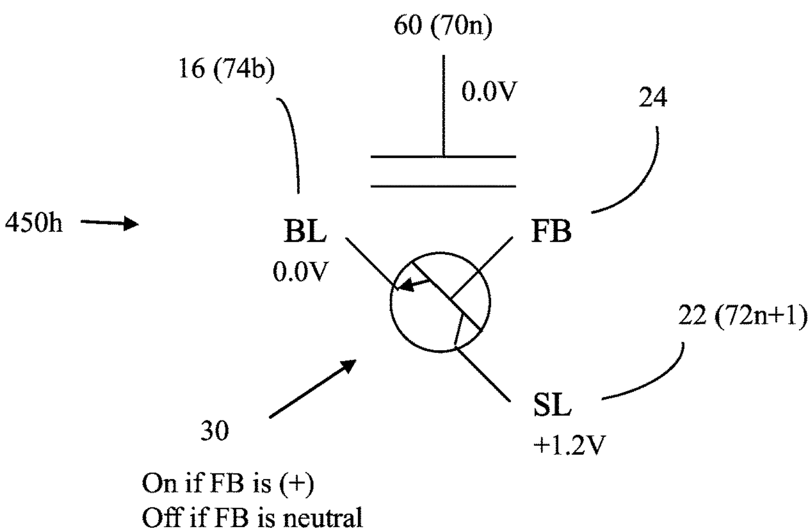

As illustrated in FIGS. 68 and 69A through 69P, a single cell write logic-0 operation that allows for individual bit writing can be performed by applying a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between floating body 24 and bit line region 16 is forward-biased, evacuating any holes from the floating body 24. To reduce undesired write logic-0 disturb to other memory cells 450 in the memory array 480, the applied potential can be optimized as follows: if the floating body 24 potential of state logic-1 is referred to $V_{FB}$, then the voltage applied to the WL terminal 70 is configured to increase the floating body 24 potential by $V_{FB1}/2$ while $-V_{FB1}/2$ is applied to BL terminal 74.

In one particular non-limiting embodiment, the following bias conditions are applied to the selected memory cell 450*a*: a potential of about 0.0 volts to SL terminal 72*b*, a potential of about −0.2 volts to BL terminal 74*a*, a potential of about +0.5 volts is applied to WL terminal 70*a*, and about 0.0 volts is applied to substrate terminals 78*a* through 78*n*+1; while about +1.2 volts is applied to unselected SL terminals 72*a* and 72*c* (not shown) through 72*n*+1, about 0.0 volts is applied to unselected BL terminals 74*b* through 74*p*, and about 0.0 volts is applied to unselected WL terminals 70*b* through 70*n*. FIG. 68 shows the bias condition for the selected and unselected memory cells 450 in memory array 480. However, these voltage levels are exemplary only may vary substantially from embodiment to embodiment as a matter of design choice and processing technology node used, and are in no way limiting.

The bias conditions of the selected representative memory cell 450*a* under write logic-0 operation are further elaborated and are shown in FIGS. 69A through 69B. As discussed above, the potential difference between floating body 24 and bit line region 16 (connected to BL terminal 74*a*) is now increased, resulting in a higher forward bias current than the base hole current generated by the n-p-n bipolar devices 30 formed by buried well region 22, floating body 24, and bit line region 16. The net result is that holes will be evacuated from floating body 24.

The unselected memory cells 450 during write logic-0 operations are shown in FIGS. 69C through 69P: The bias conditions for memory cell 450*b* sharing the same WL terminal 70*a* and BL terminal 74*a* but not the same SL terminal 72 as the selected memory cell 450*a* are shown in FIGS. 69C through 69D. The bias conditions for memory cell 450*c* sharing the same SL terminal 72*b* and BL terminal 74*a* but not the same WL terminal 70 as the selected memory cell 450*a* are shown in FIGS. 69E through 69F. The bias conditions for memory cell 450*d* sharing the same WL terminal 70*a* and SL terminal 72*b* but not the same BL terminal 74 as the selected memory cell 450 are shown in FIGS. 69G through 69H. FIGS. 69I through 69J show the bias conditions for memory cell 450*e* sharing the same WL terminal 70*a* but not the same SL terminal 72 nor BL terminal 74 as the selected memory cell 450*a*. FIGS. 69K through 69L show the bias conditions for memory cell 450*f* sharing the same SL terminal 72*b* but not the same WL terminal 70 nor BL terminal 74 as the selected memory cell 450*a*. The bias conditions for memory cells sharing the same BL terminal 74*a* as the selected memory cell 450*a* but not the same WL terminal 70 nor SL terminal 72 (e.g. memory cell 450*g*) are shown in FIGS. 69M through 69N, while the bias condition for memory cells not sharing the same WL, SL, and BL terminals 70, 72, and 74 respectively as the selected memory cell 450*a* (e.g. memory cell 450*h*) is shown in FIG. 69O through 69P.

The floating body 24 potential of memory cells sharing the WL terminal 70 as the selected memory cell will increase due to capacitive coupling from WL terminal 70 by $\Delta V_{FB}$. For memory cells in state logic-0, the increase in the floating body 24 potential is not sustainable as the forward bias current of the p-n diodes formed by floating body 24 and junction 16 will evacuate holes from floating body 24. As a result, the floating body 24 potential will return to the initial state logic-0 equilibrium potential. For memory cells in state logic-1, the floating body 24 potential will initially also increase by $\Delta V_{FB}$, which will result in holes being evacuated from floating body 24. After the positive bias on the WL terminal 70 is removed, the floating body 24 potential will decrease by $\Delta V_{FB}$. If the initial floating body 24 potential of state logic-1 is referred to as $V_{FB1}$, the floating body 24 potential after the write logic-0 operation will become $V_{FB1}$-$\Delta V_{FB}$. Therefore, the WL potential needs to be optimized such that the decrease in floating body potential of memory cells 50 in state logic-1 is not too large. For example, the maximum floating body potential due to the coupling from the WL potential cannot exceed $V_{FB1}/2$.

As shown in FIGS. 69C through 69D, for unselected representative memory cell 450*b* sharing the same WL terminal 70*a* and BL terminal 74*a* but not the same SL terminal 72 as the selected memory cell 450*a*, a negative bias is applied to the BL terminal while the SL terminal is positively biased. The potential difference between the BL and SL terminals (i.e. the emitter and collector terminals of the bipolar device 30) is greater compared to the memory cells in the holding mode. As a result, the forward bias current of the p-n diode formed by floating body 24 and bit line region 16 is balanced by higher base current of the bipolar device 30. As a result, memory cell 450*b* will still be at holding mode. Thus, when memory cell 450*b* is in state logic-1 it will maintain the charge in floating body 24 because the intrinsic bipolar device 30 will generate holes current to replenish the charge in floating body 24, and when memory cell 450*b* is in state logic-0 the bipolar device 30 will remain off leaving the floating body 24 charge level in a neutral state.

As shown in FIGS. 69E through 69F, for unselected representative memory cell 450*c* sharing the same SL terminal 72*b* and BL terminal 74A but not the same WL terminal 70 as the selected memory cell 450*a,* the SL terminal 72 is now grounded with the BL terminal now negatively biased. As a result, the p-n diode formed between floating body 24 and bit line region 16 will be forward biased. For memory cells in state logic-0, the increase in the floating body 24 potential will not change the initial state logic-0 as there is initially no hole stored in the floating body 24. For memory cells in state logic-1, the net effect is that the floating body 24 potential after write logic-0 operation will be reduced. Therefore, the BL potential also needs to be optimized such that the decrease in floating body potential of memory cells 50 in state logic-1 is not too large. For example, the $-V_{FB1}/2$ is applied to the BL terminal 74. For memory cells in the logic-0 state, the bipolar device 30 remains off leaving the cell in the logic-0 state.

As shown in FIGS. 69G through 69H, for unselected representative memory cell 450*d* sharing the same WL terminal 70*a* and SL terminal 72*b* but not the same BL terminal 74 as the selected memory cell 450*a,* both the SL terminal 72 and BL terminal 74 are now grounded. As a result, there is no potential difference between the emitter and collector terminals of the n-p-n bipolar device 30 and consequently memory cells 450*d* is no longer in holding mode. However, because write operation is accomplished much faster (in the order of nanoseconds) compared to the lifetime of the charge in the floating body 24 (in the order of milliseconds), it should cause little disruptions to the charge stored in the floating body.

As shown in FIGS. 69I through 69J, for unselected representative memory cell 450*e* sharing the same WL terminal 70*a* but not the same SL terminal 72 nor BL terminal 74 as the selected memory cell 450*a,* the SL terminal is positively biased. As a result, memory cell 450*e* will still be at holding mode, where memory cells in state logic-1 will maintain the charge in floating body 24 because the intrinsic bipolar device 30 will generate holes current to replenish the charge in floating body 24, while memory cells in state logic-0 will remain in neutral state.

As shown in FIGS. 69K through 69L, for unselected representative memory cell 450*f* sharing the same SL terminal 72*b* but not the same WL terminal 70 nor BL terminal 74 as the selected memory cell 450*a,* both the SL terminal 72 and BL terminal 74 are grounded. As a result, there is no potential difference between the emitter and collector terminals of the n-p-n bipolar device 30 and consequently memory cells 450*f* is no longer in holding mode. However, because write operation is accomplished much faster (in the order of nanoseconds) compared to the lifetime of the charge in the floating body 24 (in the order of milliseconds), it should cause little disruptions to the charge stored in the floating body.

As shown in FIGS. 69M through 69N, for unselected representative memory cell 450*g* sharing the same BL terminal 74*a* but not the same WL terminal 70 nor SL terminal 72, a negative bias is applied to the BL terminal while the SL terminal remains positively biased. The potential difference between the BL and SL terminals (i.e. the emitter and collector terminals of the bipolar device 30) is greater compared to the memory cells in the holding mode. As a result, the forward bias current of the p-n diode formed by floating body 24 and bit line region 16 is balanced by higher base current of the bipolar device 30. As a result, memory cell 450*g* will still be at holding mode. Thus memory cells in state logic-1 will maintain the charge in floating body 24 because the intrinsic bipolar device 30 will generate hole current to replenish the charge in floating body 24, while memory cells in state logic-0 will remain in neutral state.

As shown in FIGS. 69O through 69P, for unselected representative memory cell 450*h* not sharing WL, BL, and SL terminals 70, 74, and 72 respectively as the selected memory cell 450*a,* both the SL terminal 72 will remain positively charged and the BL terminal will remain grounded. As can be seen, these cells will be at holding mode, where memory cells in state logic-1 will maintain the charge in floating body 24 because the intrinsic bipolar device 30 will generate holes current to replenish the charge in floating body 24, while memory cells in state logic-0 will remain in neutral state.

Several different types of a write logic-0 operation have been described as examples illustrating the present invention. While exemplary voltage levels have been given, the actual voltages used in practice may vary substantially from embodiment to embodiment as a matter of design choice and processing technology node used, and are in no way limiting.

A write logic-1 operation can be performed on memory cell 450 by means of impact ionization as described for example with reference to Lin cited above, or by means of a band-to-band tunneling (GIDL) mechanism, as described for example with reference to Yoshida cited above.

Figure 70:
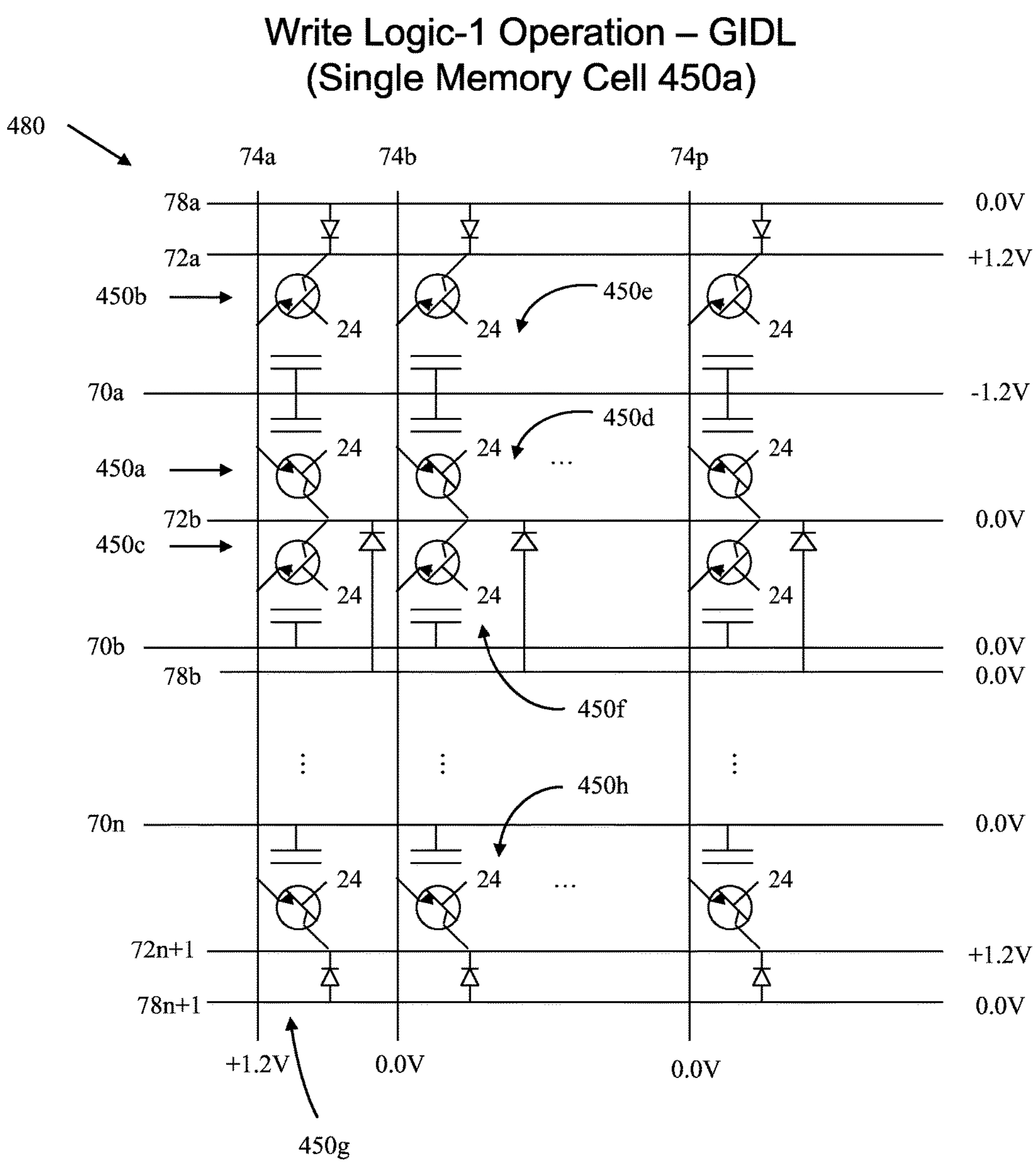
FIG. 70 illustrates a single memory cell write logic-1 operation on the memory array of FIG. 61A.

Illustrated in FIG. 70, is an example of the bias condition of the selected memory cell 450*a* in memory array 480 under a band-to-band tunneling (GIDL) write logic-1 operation. The negative bias applied to the WL terminal 70*a* and the positive bias applied to the BL terminal 74*a* of the selected representative memory cell 450*a* result in hole injection to the floating body 24 of the selected memory cell 450 as discussed above with reference to Yoshida. The SL terminal 72 and the substrate terminal 78 are grounded during the write logic-1 operation.

Figure 71A:
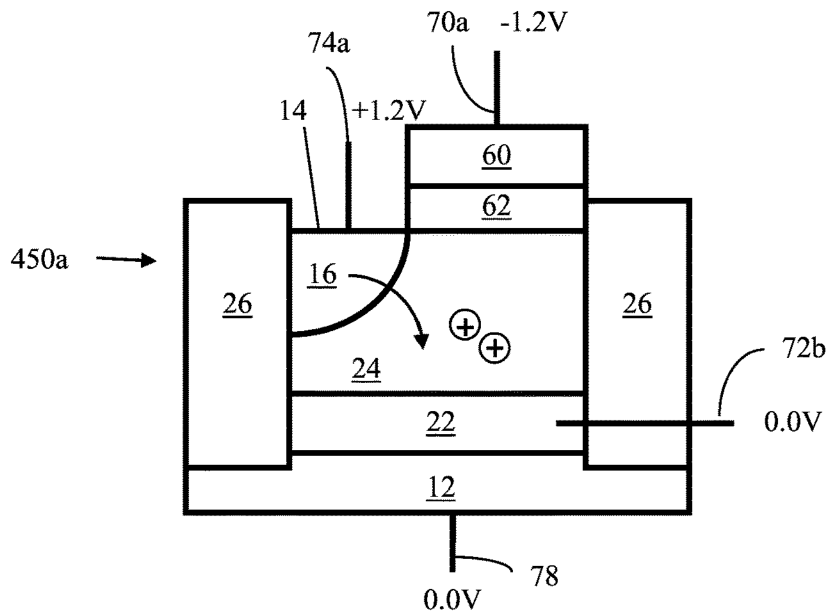
FIGS. 71A through 71P illustrate the operation of eight representative memory cells of the array of FIG. 70.
Figure 71B:
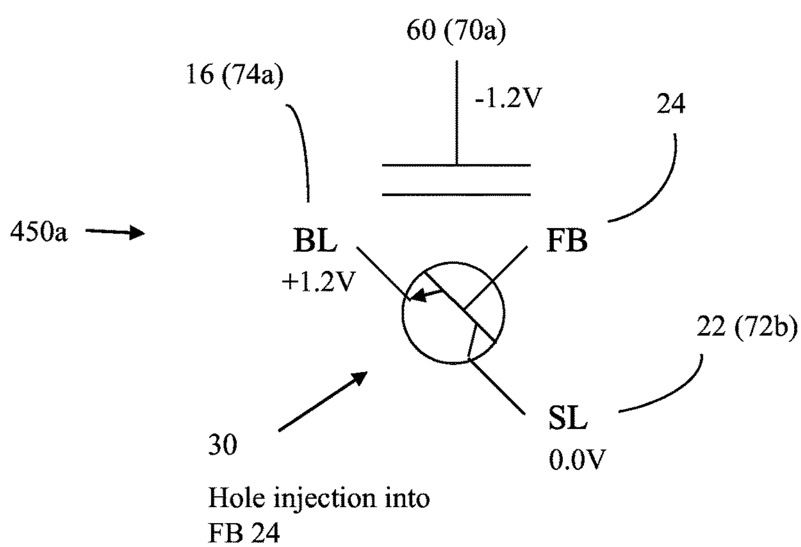

As further illustrated in FIGS. 71A and 71B, in one particular non-limiting embodiment, the following bias conditions are applied to the selected memory cell 450*a:* a potential of about 0.0 volts is applied to SL terminal 72*b,* a potential of about +1.2 volts is applied to BL terminal 74*a,* a potential of about −1.2 volts is applied to WL terminal 70*a,* and about 0.0 volts is applied to substrate terminal 78 (not shown in FIG. 71B). This bias condition bends the energy bands upward in the portion of bit line region 16 near the gate 60 in selected representative memory cell 450*a* creating GIDL current on the bit line (electrons) while injecting holes into the floating body 24 charging it up to a logic-1 level.

Also shown in FIG. 70, the following bias conditions are applied to the unselected terminals: about +1.2 volts is applied to unselected SL terminals 72*a* and 72*c* (not shown) through 72*n*+1, about 0.0 volts is applied to unselected BL terminals 74*b* through 74*p*, a potential of about 0.0 volts is applied to unselected WL terminals 70*b* through 70*n*+1, and about 0.0 volts is applied to substrate terminals 78*a* through 78*n*+1.

Figure 71C:
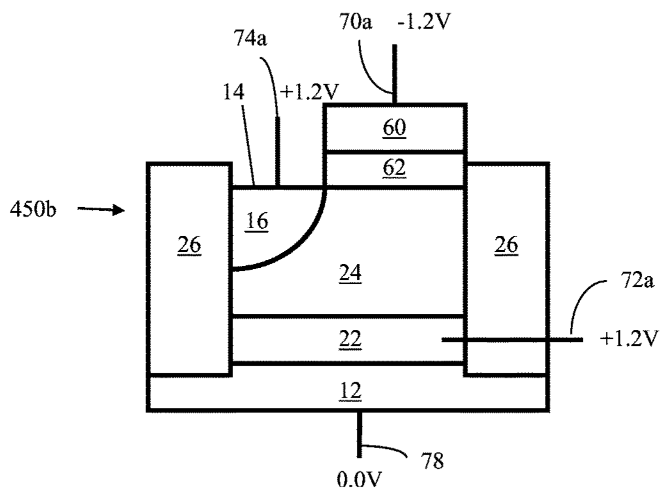
Figure 71D:
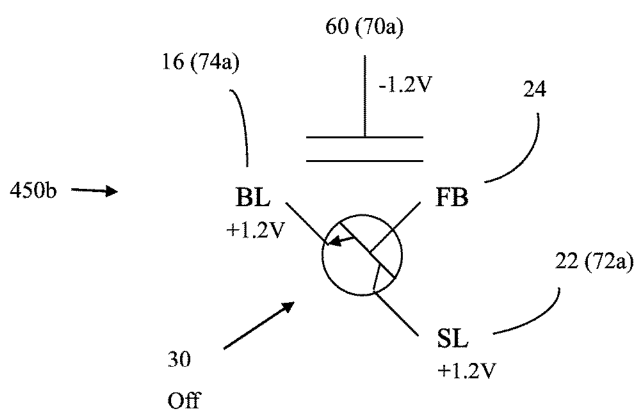
Figure 71E:
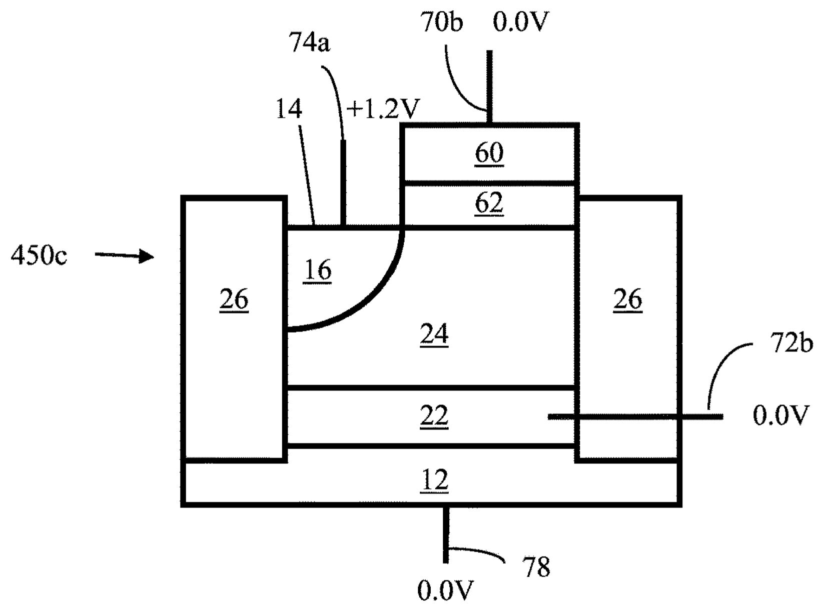
Figure 71F:
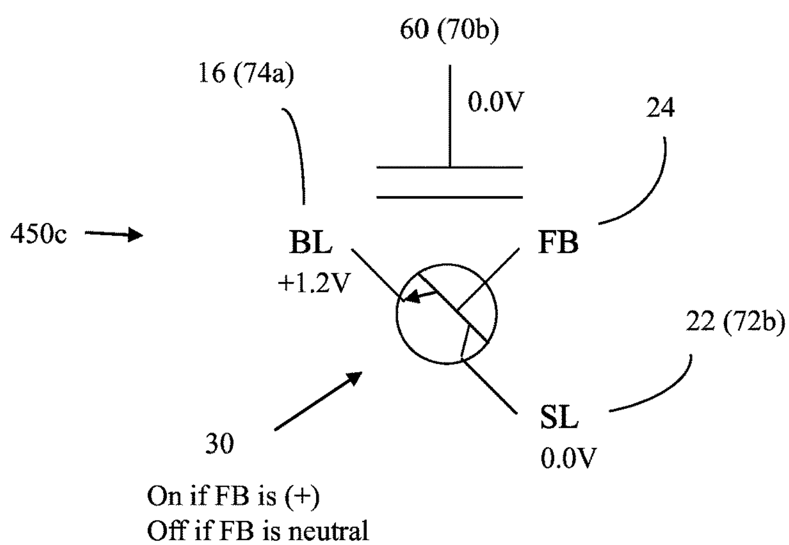
Figure 71G:
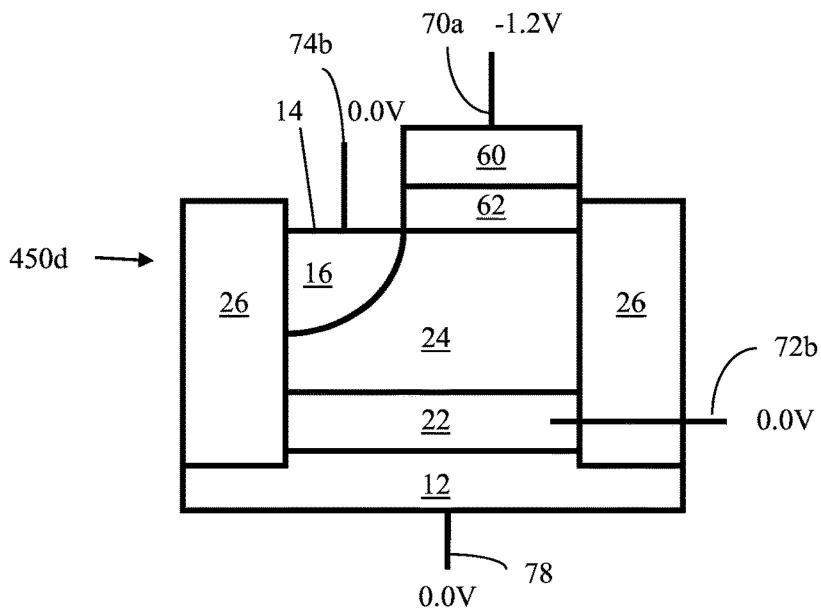
Figure 71H:
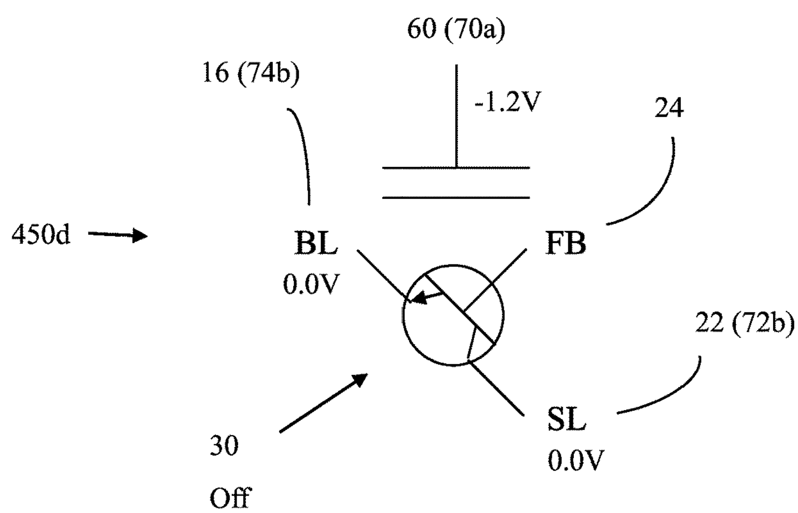
Figure 71I:
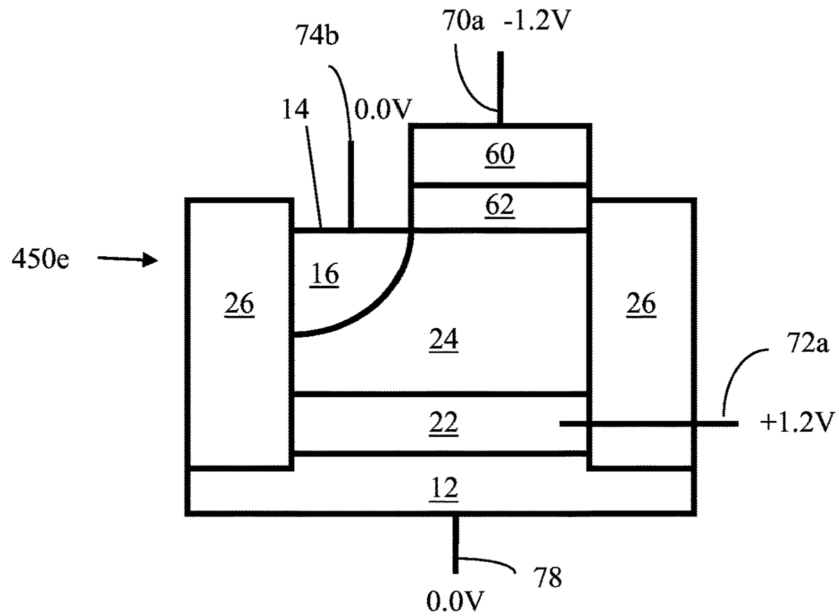
Figure 71J:
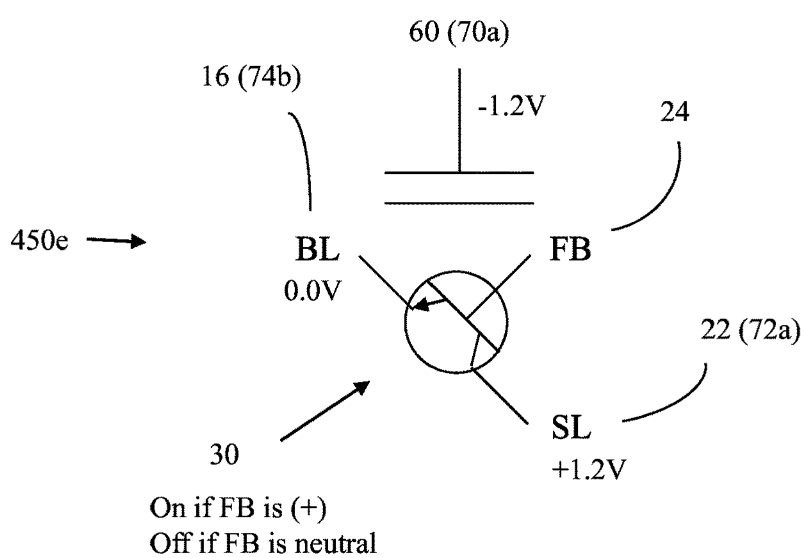
Figure 71K:
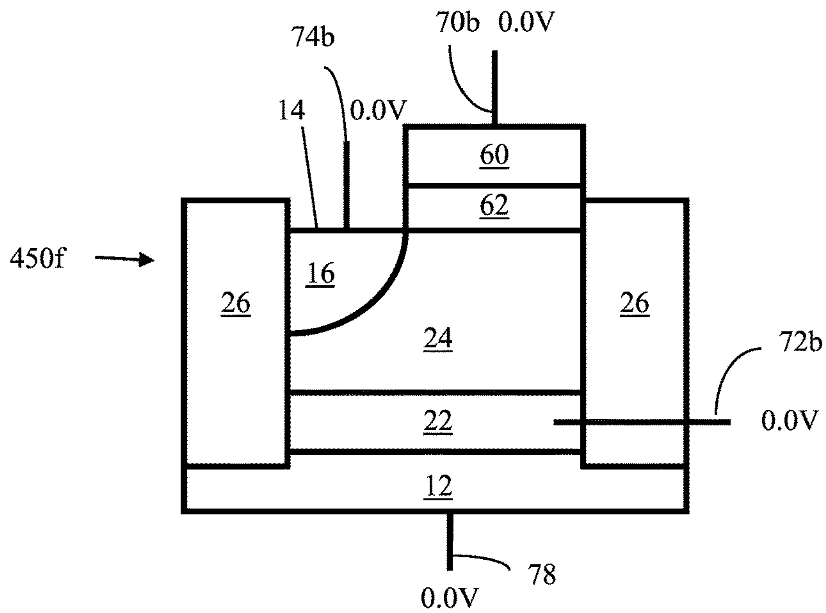
Figure 71L:
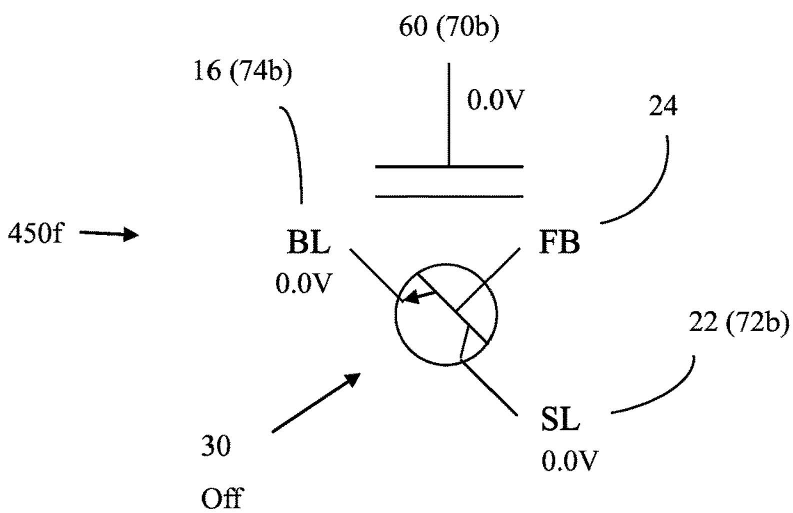
Figure 71M:
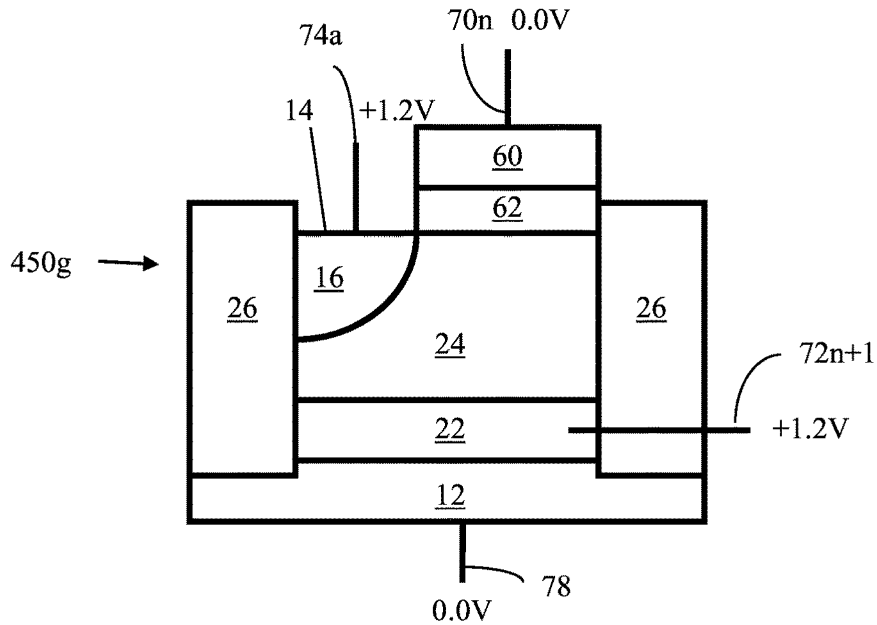
Figure 71N:
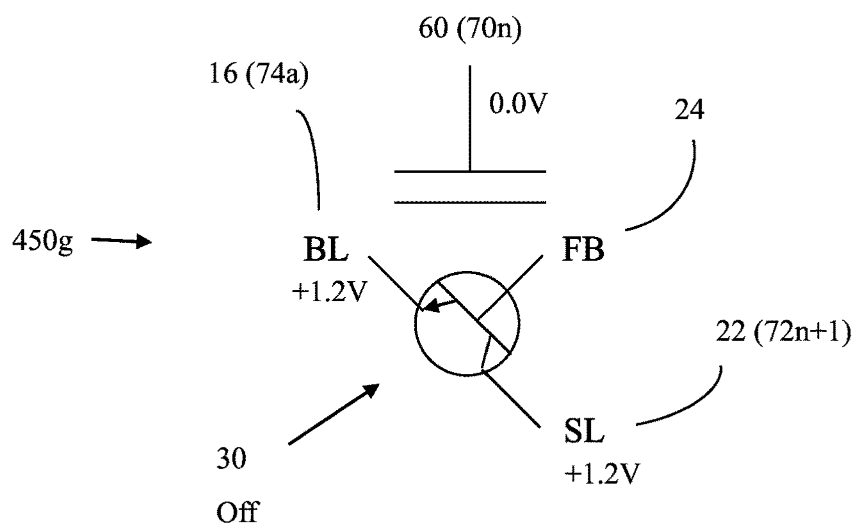

The unselected memory cells during write logic-1 operations are shown in FIGS. 71C through 71O: The bias conditions for memory cell 450*b* sharing the same WL terminal 70*a* and BL terminal 74*a* but not the same SL terminal 72 as the selected memory cell 450*a* are shown in FIGS. 71C through 71D. The bias conditions for memory cell 450*c* sharing the same SL terminal 72*b* and BL terminal 74*a* but not the same WL terminal 70 as the selected memory cell 450*a* are shown in FIGS. 71E through 71F. The bias conditions for memory cell 450*d* sharing the same WL terminal 70*a* and SL terminal 72*b* but not the same BL terminal 74 as the selected memory cell 450*a* are shown in FIGS. 71G through 71H. FIGS. 71I through 71J show the bias conditions for memory cell 450*e* sharing the same WL terminal 70*a* but not the same SL terminal 72 nor BL terminal 74 as the selected memory cell 450*a*. FIGS. 71K through 71L show the bias conditions for memory cell 450*f* sharing the same SL terminal 72*b* but not the same WL terminal 70 nor BL terminal 74 as the selected memory cell 450*a*. The bias conditions for memory cells sharing the same BL terminal 74*a* as the selected memory cell 450*a* but not the same WL terminal 70 nor SL terminal 72 (e.g. memory cell 450*g*) are shown in FIGS. 71M through 71N, while the bias condition for memory cells not sharing the WL, SL, and BL terminals 70, 72 and 74 respectively, as the selected memory cell 450*a* (e.g. memory cell 450*h*) are shown in FIG. 710 through 71P.

As shown in FIGS. 71C through 71D, for unselected representative memory cell 450*b* sharing the same WL terminal 70*a* and BL terminal 74*a* but not the same SL terminal 72 as the selected memory cell 450*a*, both BL and SL terminals are positively biased. As a result, there is no potential difference between the emitter and collector terminals of the n-p-n bipolar device 30 and consequently memory cell 450*b* is no longer in holding mode. However, because the write operation is accomplished much faster (on the order of nanoseconds) compared to the lifetime of the charge in the floating body 24 (on the order of milliseconds), it should cause little disruption to the charge stored in the floating body.

As shown in FIGS. 71E through 71F, for unselected representative memory cell 450*c* sharing the same SL terminal 72*b* and BL terminal 74*a* but not the same WL terminal 70 as the selected memory cell 450*a*, the SL terminal 72 is now grounded with the BL terminal now positively biased. As a result, memory cell 450*c* will be in a holding mode, where memory cells in state logic-1 will maintain the charge in floating body 24 because the intrinsic bipolar device 30 will generate hole current to replenish the charge in floating body 24 and memory cells in state logic-0 will remain in the neutral state.

As shown in FIGS. 71G through 71H, for unselected representative memory cell 450*d* sharing the same WL terminal 70*a* and SL terminal 72*b* but not the same BL terminal 74 as the selected memory cell 450*a*, both the SL terminal 72 and BL terminal 74 are now grounded. As a result, there is no potential difference between the emitter and collector terminals of the n-p-n bipolar device 30 and consequently memory cell 450*d* is not in a holding mode. However, because the write operation is accomplished much faster (on the order of nanoseconds) compared to the lifetime of the charge in the floating body 24 (on the order of milliseconds), it should cause little disruption to the charge stored in the floating body.

As shown in FIGS. 71I through 71J, for unselected representative memory cell 450*e* sharing the same WL terminal 70*a* but not the same SL terminal 72 nor BL terminal 74 as the selected memory cell 450*a*, the SL terminal remains positively biased. As a result, memory cell 450*e* will still be in a holding mode, where memory cells in state logic-1 will maintain the charge in floating body 24 because the intrinsic bipolar device 30 will generate holes current to replenish the charge in floating body 24, and while memory cells in state logic-0 will remain in a neutral state.

As shown in FIGS. 71K through 71L, for unselected representative memory cell 450*f* sharing the same SL terminal 72*b* but not the same WL terminal 70 nor BL terminal 74 as the selected memory cell 450*a*, both the SL terminal 72 and BL terminal 74 are now grounded. As a result, there is no potential difference between the emitter and collector terminals of the n-p-n bipolar device 30 and consequently memory cell 450*f* is no longer in a holding mode. However, because the write operation is accomplished much faster (on the order of nanoseconds) compared to the lifetime of the charge in the floating body 24 (on the order of milliseconds), it should cause little disruption to the charge stored in the floating body.

As shown in FIGS. 71M through 71N, for unselected representative memory cell 450*g* sharing the same BL terminal 74*a* but not the same WL terminal 70 nor SL terminal 72, a positive bias is applied to the BL terminal and the SL terminal. As a result, there is no potential difference between the emitter and collector terminals of the n-p-n bipolar device 30 and consequently memory cell 450*g* is no longer in a holding mode. However, because write operation is accomplished much faster (on the order of nanoseconds) compared to the lifetime of the charge in the floating body 24 (on the order of milliseconds), it should cause little disruption to the charge stored in the floating body.

Figure 71O:
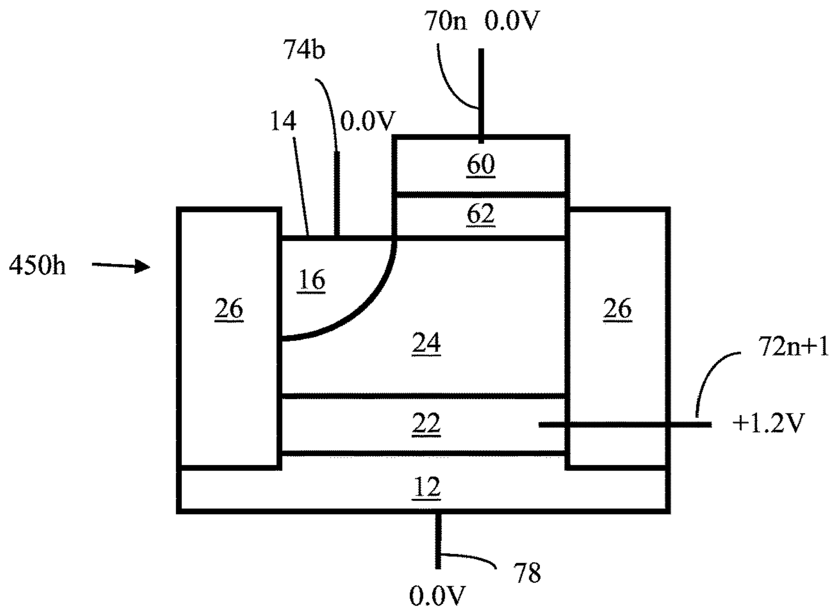
Figure 71P:
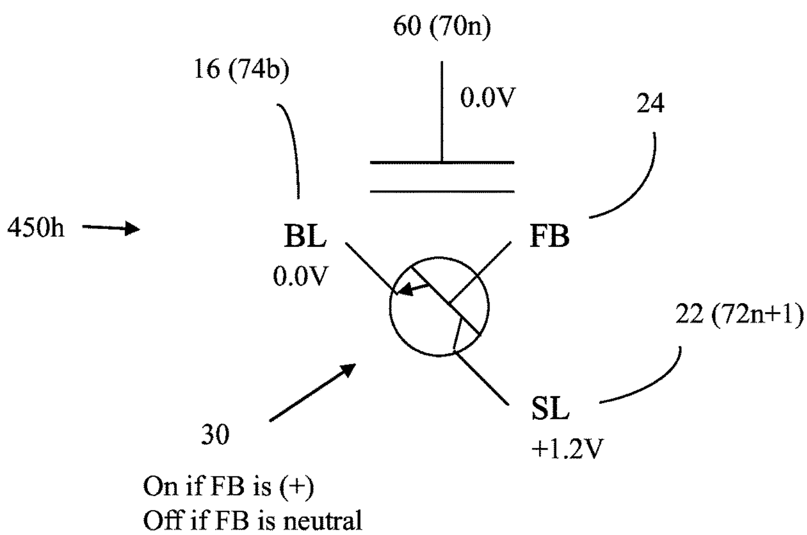

As shown in FIGS. 71O through 71P, for unselected representative memory cell 450*h* not sharing WL, BL, and SL terminals 70, 74 and 72 respectively as the selected memory cell, the SL terminal 72*n*+1 will remain positively charged and the BL terminal 74*b* and the WL terminal 70*n* are grounded. As can be seen, memory cell 450*h* will be at holding mode, where memory cells in state logic-1 will maintain the charge in floating body 24 because the intrinsic bipolar device 30 will generate hole current to replenish the charge in floating body 24, while memory cells in state logic-0 will remain in the neutral state.

Figure 72:
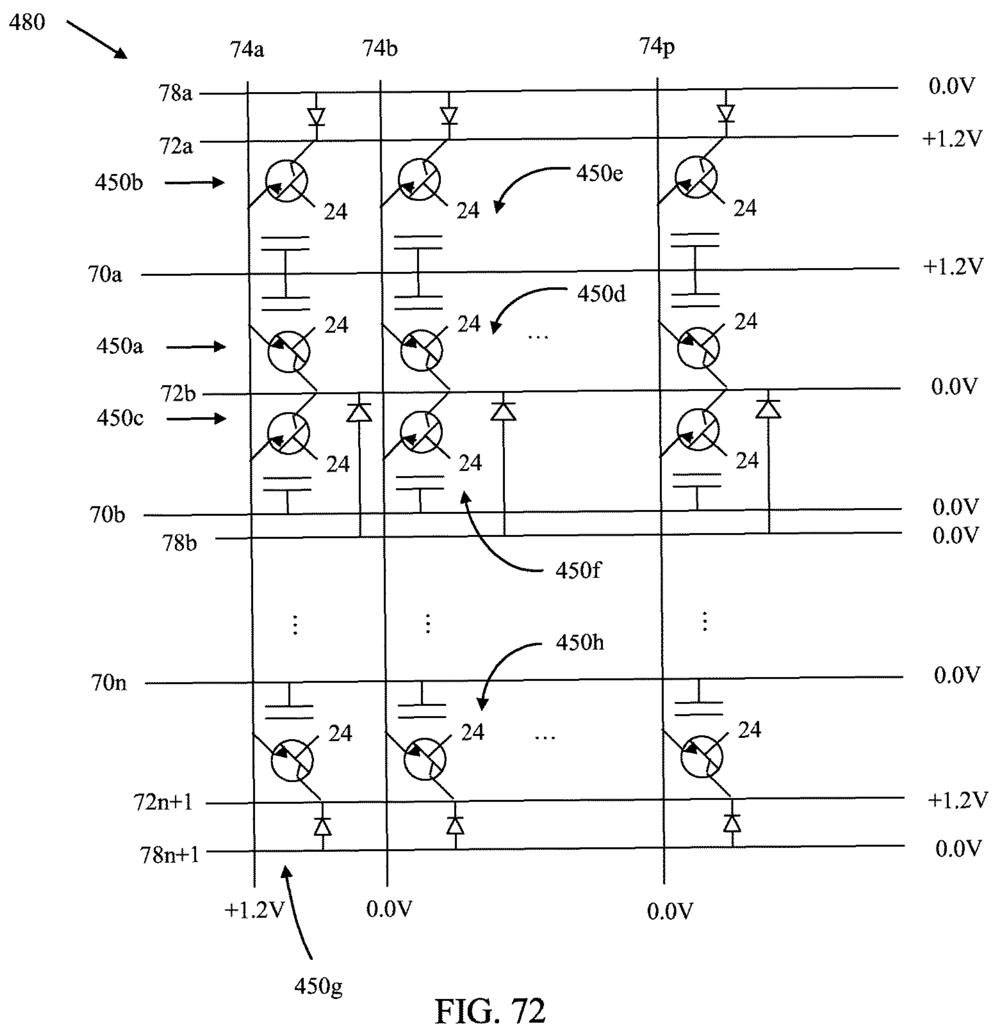
FIG. 72 illustrates an alternate single memory cell write logic-1 operation on the memory array of FIG. 61A.

Illustrated in FIG. 72, is an example of the bias condition of the selected memory cell 450*a* in memory array 480 under an impact ionization write logic-1 operation. The positive bias applied to the WL terminal 70*a* and the positive bias applied to the BL terminal 74*a* of the selected representative memory cell 450*a* results in hole injection to the floating body 24 of the selected memory cell 450 as discussed above with reference to Lin cited above. The SL terminal 72*b* and the substrate terminals 78*a* through 78*n*+1 are grounded during the write logic-1 operation.

As further illustrated in FIG. 72, in one particular non-limiting embodiment, the following bias conditions are applied to the selected memory cell 450*a*: a potential of about 0.0 volts is applied to SL terminal 72*b*, a potential of about +1.2 volts is applied to BL terminal 74*a*, a potential of about +1.2 volts is applied to WL terminal 70*a*, and about 0.0 volts is applied to substrate terminals 78*a* through 78*n*+1. This bias condition causes selected representative memory cell 450*a* to conduct current due to the impact ionization mechanism discussed with reference to Lin cited above. The combination of +1.2V on word line terminal and +1.2V on bit line terminal 74*a* turns on the bipolar device 30 in representative memory cell 450*a* regardless of its prior logic state and generating sufficient hole charge in its floating body 24 to place it in the logic-1 state.

Also shown in FIG. 72, the following bias conditions are applied to the unselected terminals: about +1.2 volts is applied to unselected SL terminals 72*a* and 72*c* (not shown) through 72*n*+1, about 0.0 volts is applied to unselected BL terminals 74*b* through 74*p*, a potential of about 0.0 volts is applied to unselected WL terminals 70*b* through 70*n*+1, and about 0.0 volts is applied to substrate terminals 78*a* through 78*n*+1.

For unselected representative memory cell 450*b* sharing the same WL terminal 70*a* and BL terminal 74*a* but not the same SL terminal 72 as the selected memory cell 450*a*, both BL and SL terminals are positively biased. As a result, there is no potential difference between the emitter and collector terminals of the n-p-n bipolar device 30 and consequently memory cell 450*b* is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 450*c* sharing the same SL terminal 72*b* and BL terminal 74*a* but not the same WL terminal 70 as the selected memory cell 450*a*, the SL terminal 72*b* is now grounded with the BL terminal now positively biased. As a result, memory cell 450*c* will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 450*d* sharing the same WL terminal 70*a* and SL terminal 72*b* but not the same BL terminal 74 as the selected memory cell 450*a*, both the SL terminal 72 and BL terminal 74 are now grounded. As a result, there is no potential difference between the emitter and collector terminals of the n-p-n bipolar device 30 and consequently memory cell 450*d* is not in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 450*e* sharing the same WL terminal 70*a* but not the same SL terminal 72 nor BL terminal 74 as the selected memory cell 450*a*, the SL terminal remains positively biased. As a result, memory cell 450*e* will still be in a holding mode, where memory cells in state logic-1 will maintain the charge in floating body 24 because the intrinsic bipolar device 30 will generate holes current to replenish the charge in floating body 24, and while memory cells in state logic-0 will remain in a neutral state. There is a possible write disturb issue with memory cell 450*e* in this case which will be discussed in more detail below in conjunction with FIGS. 73A through 73B.

For unselected representative memory cell 450*f* sharing the same SL terminal 72*b* but not the same WL terminal 70 nor BL terminal 74 as the selected memory cell 450*a*, both the SL terminal 72 and BL terminal 74 are now grounded. As a result, there is no potential difference between the emitter and collector terminals of the n-p-n bipolar device 30 and consequently memory cell 450*f* is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 450*g* sharing the same BL terminal 74*a* but not the same WL terminal 70 nor SL terminal 72, a positive bias is applied to the BL terminal 74*a* and the SL terminal 72*n*+1. As a result, there is no potential difference between the emitter and collector terminals of the n-p-n bipolar device 30 and consequently memory cell 450*g* is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

For unselected representative memory cell 450*h* not sharing WL, BL, and SL terminals 70, 74 and 72 respectively as the selected memory cell 450*a*, the SL terminal 72*n*+1 will remain positively charged and the BL terminal 74*b* and the WL terminal 70*n* are grounded. As can be seen, memory cell 450*h* will be at holding mode, where memory cells in state logic-1 will maintain the charge in floating body 24 because the intrinsic bipolar device 30 will generate holes current to replenish the charge in floating body 24; while memory cells in state logic-0 will remain in neutral state.

Figure 73A:
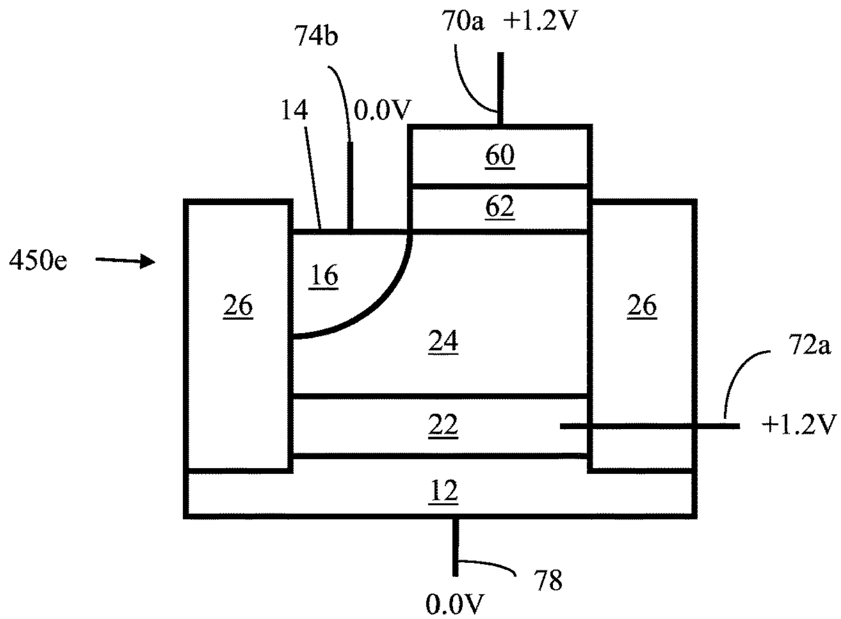
FIGS. 73A through 73B illustrates a possible write disturb condition resulting from the single memory cell write logic-1 operation of FIG. 72.
Figure 73B:
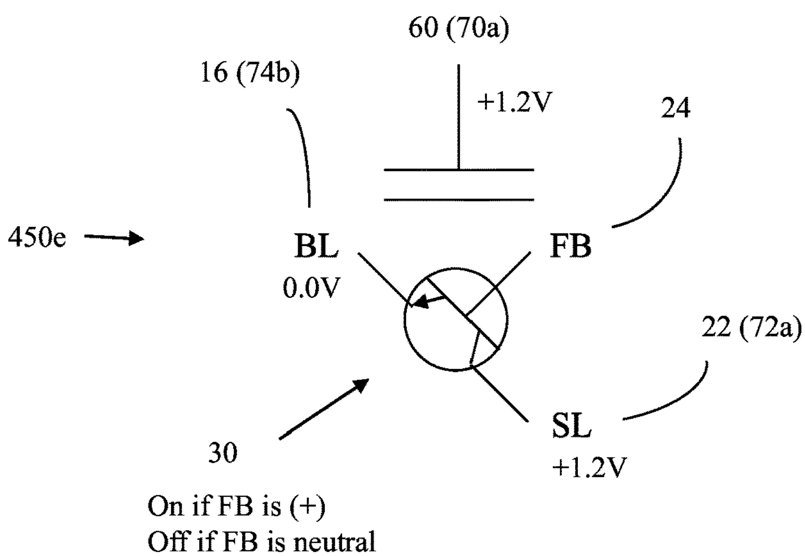

FIGS. 73A and 73B illustrate the bias conditions of representative memory cell 450*e* under the bias conditions shown in FIG. 72. Memory cell 450*e* is coupled to word line terminal 70*a* biased at +1.2V, bit line terminal 74*b* biased at 0.0V, and source line terminal 72*a* biased at +1.2V. The concern is that the floating body region 24 of memory cell 450*e* boosted by capacitive coupling from word line 70*a* while having 1.2 volts of bias across it—albeit of the opposite voltage potential of selected representative memory cell 450*a*. If bipolar device 30 were to turn on under these conditions, a write disturb condition (writing an unwanted logic-1 in an unselected memory cell) would occur with a logic-1 being written into unselected memory cell 450*e*.

One solution to the write disturb in representative memory cell 450*e* is to design memory cell 450 such that the impact ionization is less efficient at generating charge carriers when the source line terminal 72 is positively biased than it is in the case when the bit line terminal 74 is positively biased using techniques known in the art. This creates enough current to place representative memory cell 450*e* in a holding mode while generating a larger current sufficient for writing a logic-1 in memory cell 450*a*.

Alternatively, a different set of bias conditions may be used as illustrated in FIG. 37 which shows another example of writing logic-1 into selected memory cell 450*a* in memory array 480 using impact ionization. As in FIG. 72, the positive bias applied to the WL terminal 70*a* and the positive bias applied to the BL terminal 74*a* of the selected representative memory cell 450*a* results in hole injection to the floating body 24 of the selected memory cell 450 as discussed above with reference to Lin cited above. The SL terminal 72*b* and the substrate terminals 78*a* through 78*n*+1 are grounded during the write logic-1 operation. The difference in this write logic-1 operation are the bias conditions of the unselected bit lines 74*b* through 74*p* and the unselected source lines 72*a* and 72*c* (not shown) through 72*n*+1.

Figure 74:
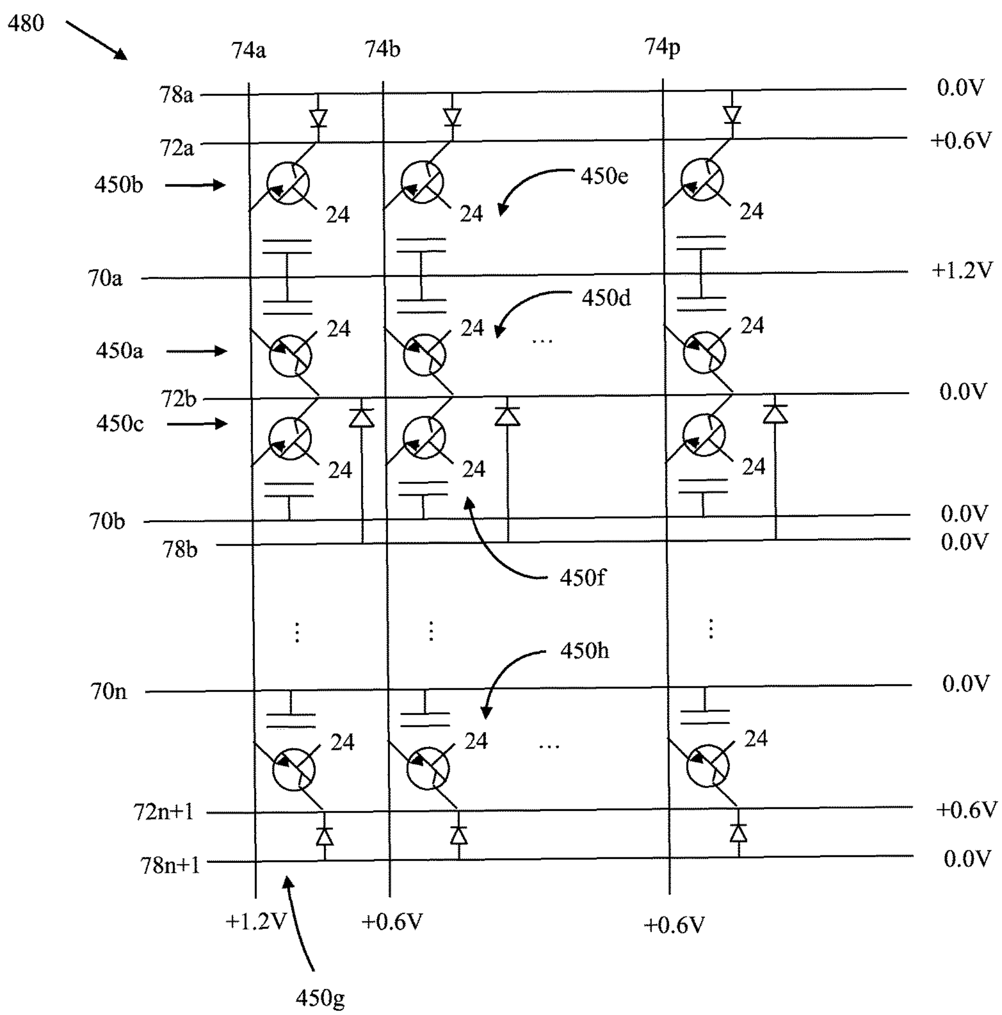
FIG. 74 illustrates another alternate single memory cell write logic-1 operation on the memory array of FIG. 61A.

As further illustrated in FIG. 74, in one particular non-limiting embodiment, the following bias conditions are applied to the selected memory cell 450*a*: a potential of about 0.0 volts is applied to SL terminal 72*b*, a potential of about +1.2 volts is applied to BL terminal 74*a*, a potential of about +1.2 volts is applied to WL terminal 70*a*, and about 0.0 volts is applied to substrate terminals 78*a* through 78*n*+1. This bias condition causes selected representative memory cell 450*a* to conduct current due to the impact ionization mechanism discussed with reference to Lin cited above. The combination of +1.2V on word line terminal and +1.2V on bit line terminal 74*a* turns on the bipolar device 30 in representative memory cell 450*a* regardless of its prior logic state and generating sufficient hole charge in its floating body 24 to place it in the logic-1 state.

Also shown in FIG. 74, the following bias conditions are applied to the unselected terminals: about +0.6 volts is applied to unselected SL terminals 72*a* and 72*c* (not shown) through 72*n*+1, about +0.6 volts is applied to unselected BL terminals 74*b* through 74*p*, a potential of about 0.0 volts is applied to unselected WL terminals 70 b through 70*n*+1, and about 0.0 volts is applied to substrate terminals 78*a* through 78*n*+1.

For unselected representative memory cell 450*b* sharing the same WL terminal 70*a* and BL terminal 74*a* but not the same SL terminal 72 as the selected memory cell 450*a*, both BL and SL terminals are positively biased with a larger bias applied to the BL than the SL. As a result, bipolar device 30 is on and memory cell 450*b* is in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 450*c* sharing the same SL terminal 72*b* and BL terminal 74*a* but not the same WL terminal 70 as the selected memory cell 450*a*, the SL terminal 72*b* is now grounded with the BL terminal now positively biased. As a result, memory cell 450*c* will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 450*d* sharing the same WL terminal 70*a* and SL terminal 72*b* but not the same BL terminal 74 as the selected memory cell 450*a*, the SL terminal 72*b* is now grounded and the BL terminal 74*b* has a slight positive bias. As a result, memory cell 450*d* will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 450*e* sharing the same WL terminal 70*a* but not the same SL terminal 72 nor BL terminal 74 as the selected memory cell 450*a*, the SL terminal 72*a* and the BL terminal 74*b* both have a slight positive bias. As a result, there is no potential difference between the emitter and collector terminals of the n-p-n bipolar device 30 and consequently memory cell 450*e* is no longer in a holding mode. However, because the write operation is accomplished much faster (in the order of nanoseconds) compared to the lifetime of the charge in the floating body 24 (in the order of milliseconds), it should cause little disruption to the charge stored in the floating body. This also eliminates the potential write disturb condition for representative memory cell 450*e* present with the bias conditions of FIGS. 35, 36A and 36B.

For unselected representative memory cell 450*f* sharing the same SL terminal 72*b* but not the same WL terminal 70 nor BL terminal 74 as the selected memory cell 450*a*, the SL terminal 72*b* is grounded and BL terminal 74*b* has a small positive bias. As a result, memory cell 450*f* will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 450*g* sharing the same BL terminal 74*a* but not the same WL terminal 70 nor SL terminal 72, a positive bias is applied to the BL terminal 74*a* and a smaller positive bias is applied to SL terminal 72*n*+1. As a result, memory cell 450*g* will be in a holding mode, where memory cells in state logic-1 will maintain the charge in floating body 24 because the intrinsic bipolar device 30 will generate hole current to replenish the charge in floating body 24, while memory cells in state logic-0 will remain in the neutral state.

For unselected representative memory cell 450*h* not sharing WL, BL, and SL terminals 70, 74 and 72 respectively as the selected memory cell 450*a*, the SL terminal 72*n*+1 and the BL terminal 74*b* will have a slight positive bias while the WL terminal 70*n* is grounded. As a result, there is no potential difference between the emitter and collector terminals of the n-p-n bipolar device 30 and consequently memory cell 450*e* is no longer in a holding mode. However, because the write operation is accomplished much faster (in the order of nanoseconds) compared to the lifetime of the charge in the floating body 24 (in the order of milliseconds), it should cause little disruption to the charge stored in the floating body.

Different structures and methods of operation have been discussed with respect to exemplary memory array 480 comprised of a plurality of memory cells 450. Many other embodiments are possible within the scope of the invention. For example, regions of the first conductivity type may be changed from p-type to n-type and regions of the second conductivity type may be changed from n-type to p-type combined with a reversal of the polarities of the bias voltages for various operations. The bias levels themselves are exemplary only and will vary from embodiment to embodiment as a matter of design choice. Memory array 480 may be altered so that the outside rows share a source line 72 with the adjacent row and have a dedicated word line 70. Many other embodiments will readily suggest themselves to persons skilled in the art, thus the invention is not to be limited in any way except by the appended claims.

It is noteworthy that memory cell 250V constructed using either of the fin structures 52 and 52A described in conjunction with FIGS. 56 through 58B can be used to replace memory cell 450 in memory array 480 with shared word lines with or without shared source lines and will function in a manner similar to that described for memory cell 450. Many other modifications may also made to array 450. For example, the first and second conductivity types may be reversed in either memory cell 450 or memory cell 250V with reversal of the relative polarities of the applied voltages. All of the voltage levels described are exemplary only and will vary from embodiment to embodiment as a matter of design choice. Thus the invention is not to be limited in any way.

Figure 75A:
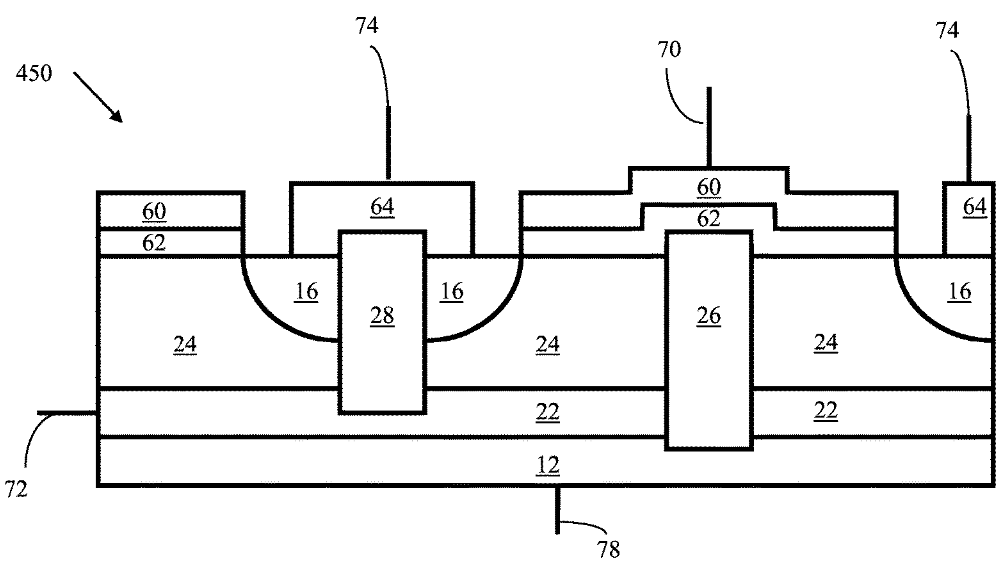
FIGS. 75A and 75B illustrates additional alternate methods of manufacturing a memory cell according to the present invention.

FIG. 75A shows another embodiment of the memory device 450, in which adjacent regions 16, which are separated by insulating layer 28, share a common connection to BL terminal 74 through contact 64. By sharing a common connection to the BL terminal 74, a more compact memory cell can be obtained as only one contact is required for each two memory cells 450.

Figure 75B:
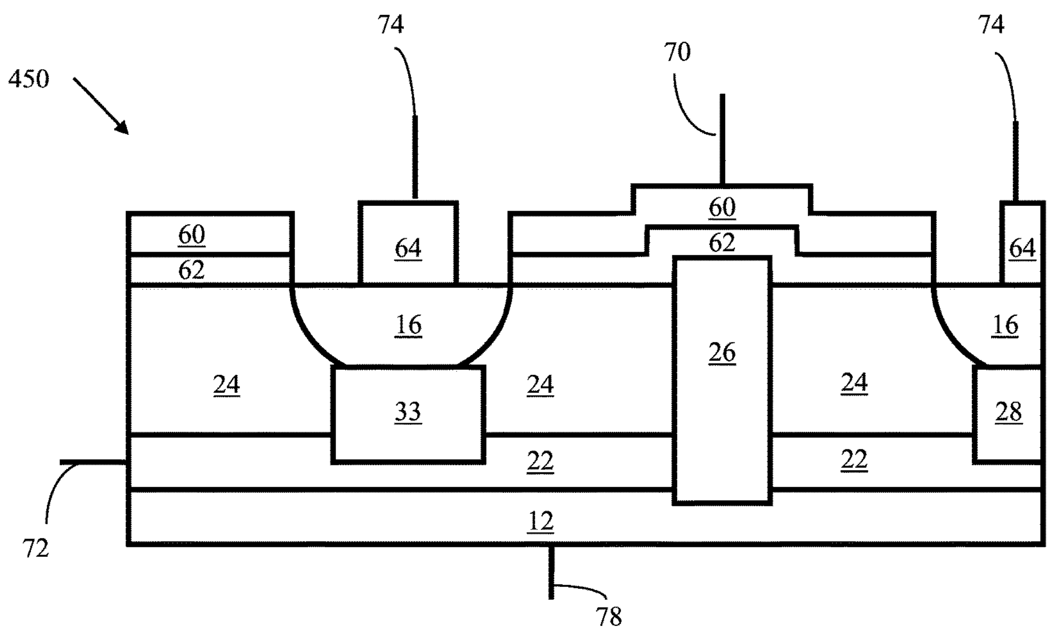

Another embodiment of memory cell 450 is shown in FIG. 75B, where bit line region 16 and contact 64 are now shared between two adjacent memory cells 450. Isolation of the adjacent floating body 24 regions of a first conductivity type is achieved through both insulating region 33 and bit line region 16 of a second conductivity type.

Figure 76A:
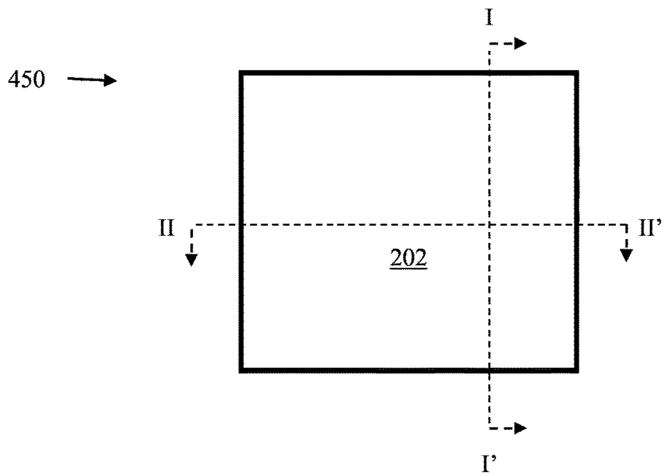
FIGS. 76A through 76AA illustrate a method of manufacturing the memory cell of FIG. 75B.
Figure 76B:
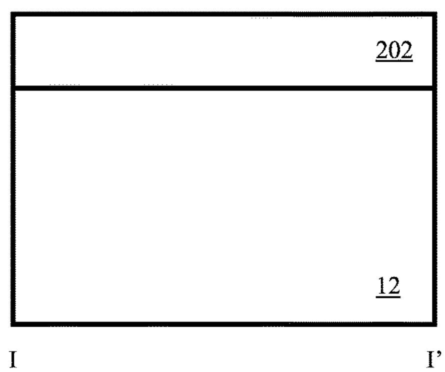
Figure 76C:
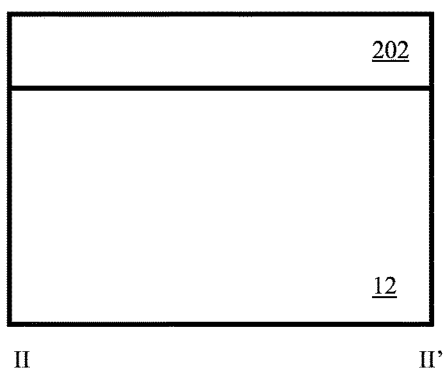
Figure 76D:
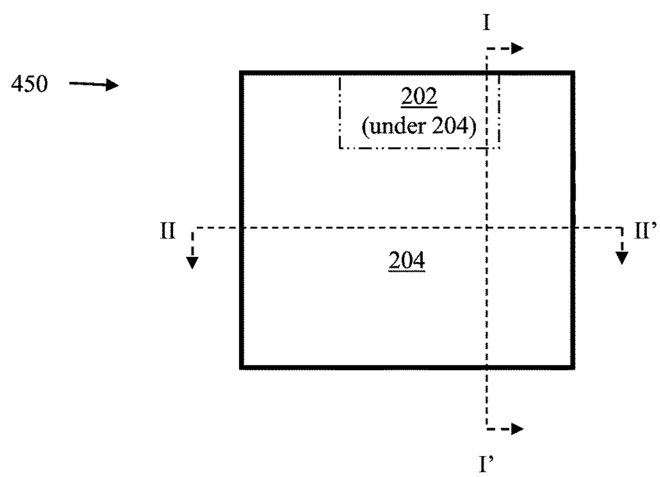
Figure 76E:
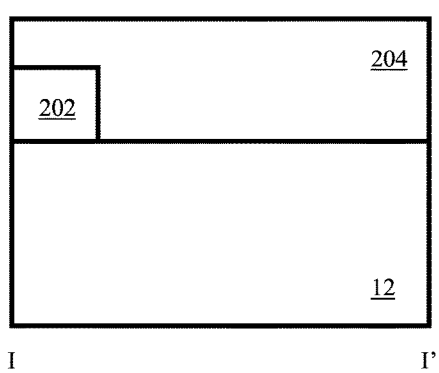
Figure 76F:
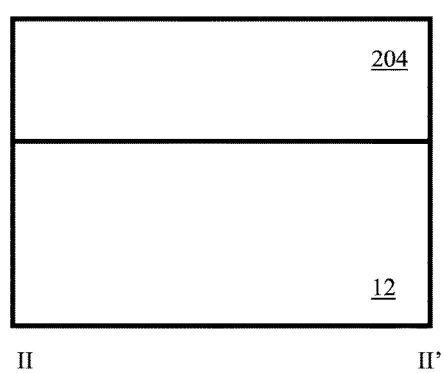
Figure 76G:
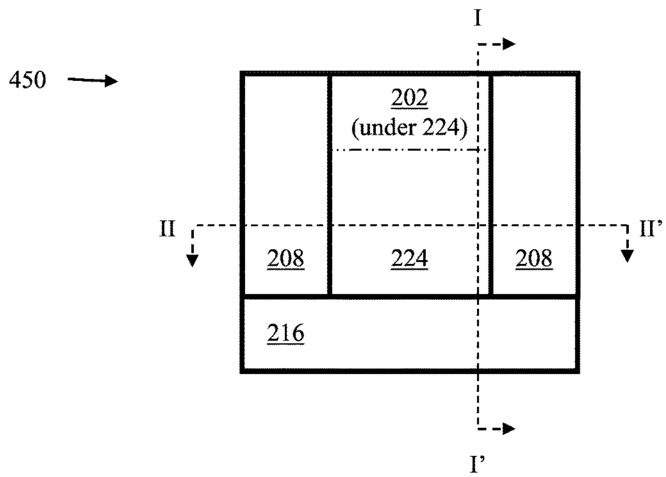
Figure 76H:
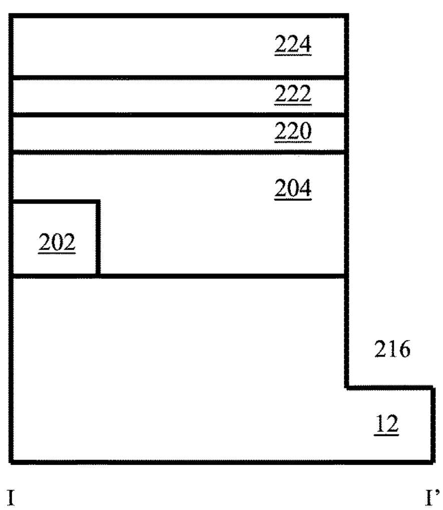
Figure 76I:
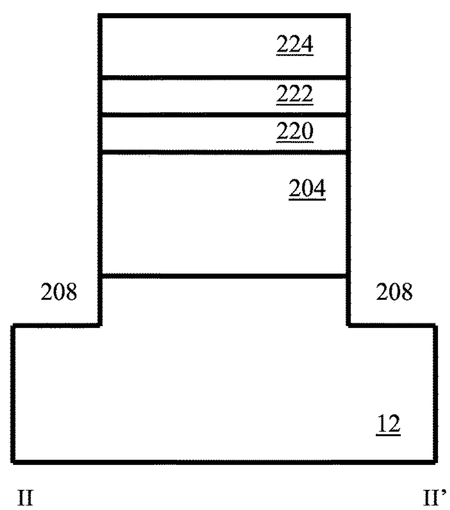
Figure 76J:
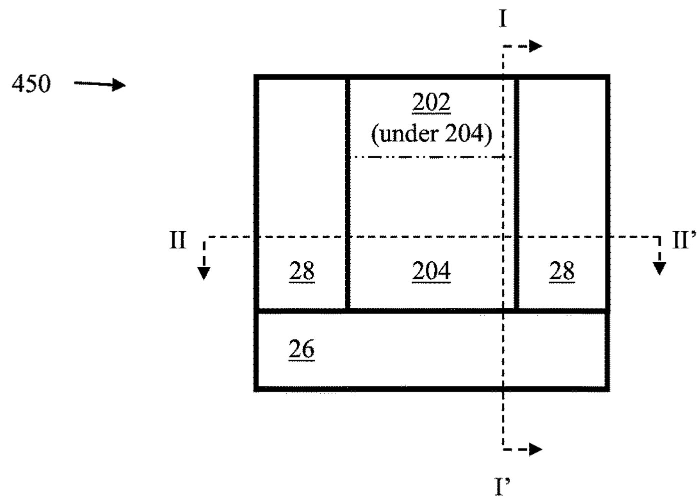
Figure 76K:
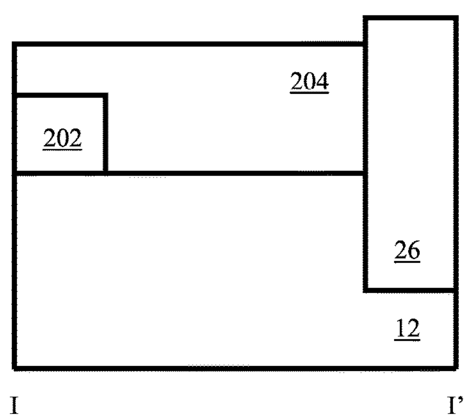
Figure 76L:
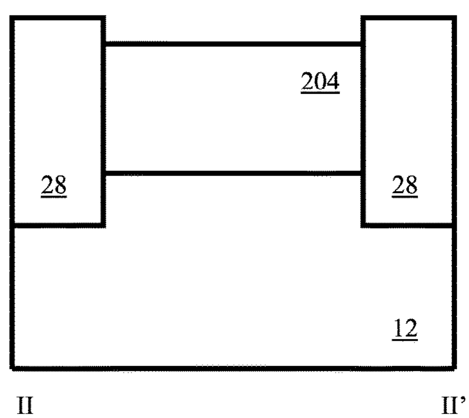
Figure 76M:
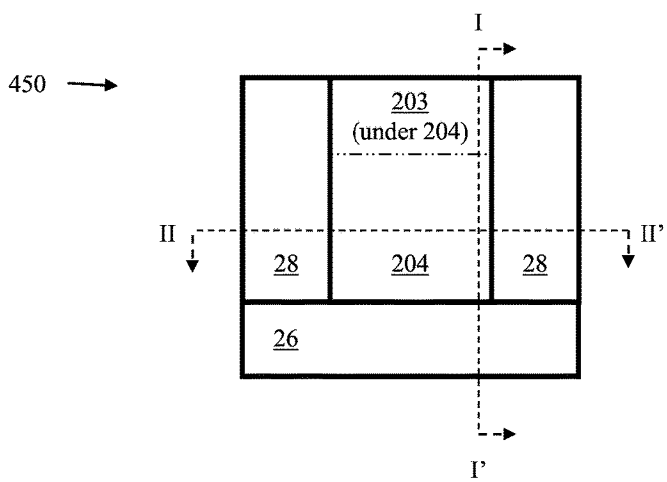
Figure 76N:
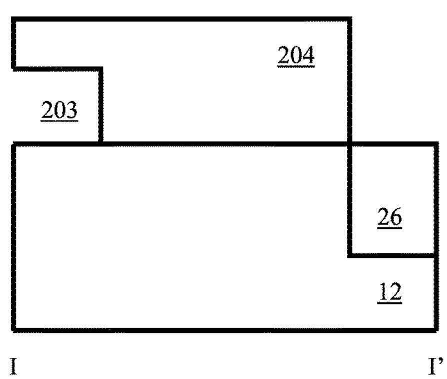
Figure 76O:
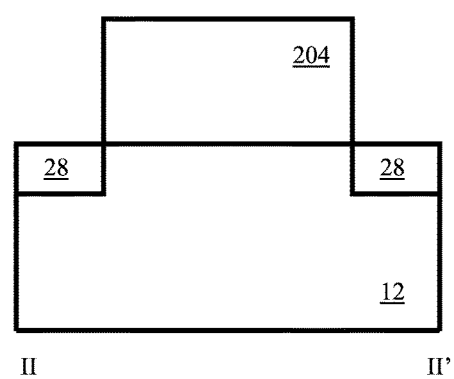

FIGS. 76A through 76O describe a method of manufacturing memory cell 450 as shown in FIG. 75B created using, in part, a replacement insulator technique like that described in S_Kim and Oh discussed above to create insulating region 33.

A method of manufacturing memory cell 450 as shown in FIG. 75B will be described with reference to FIGS. 76A through 76AA. These 27 figures are arranged in groups of three related views, with the first figure of each group being a top view, the second figure of each group being a vertical cross section of the top view in the first figure of the group designated I-I', and the third figure of each group being a horizontal cross section of the top view in the first figure of the group designated Thus FIGS. 76A, 76D, 76G, 76J, 76M, 76P, 76S, 76V, and 76Y are a series of top views of the memory cell 450 at various stages in the manufacturing process, FIGS. 76B, 76E, 76H, 76K, 76N, 76Q, 76T, 76W, and 76Z are their respective vertical cross sections labeled I-I', and FIGS. 76C, 76F, 76I, 76L, 76O, 76R, 76U, 76X, and 76AA are their respective horizontal cross sections labeled II-II'. Identical reference numbers from earlier drawing figures appearing in FIGS. 76A through 76AA represent similar, identical, or analogous structures as previously described in conjunction with the earlier drawing figures. Here "vertical" means running up and down the page in the top view diagram and "horizontal" means running left and right on the page in the top view diagram. In the physical embodiment of memory cell 450, both cross sections are "horizontal" with respect to the surface of the semiconductor device.

As illustrated in FIGS. 76A through 76C, a thin conductive region 202 (e.g. 300 A in an exemplary 130 nm process, though this will vary with embodiments in different process technologies and geometries) is grown on the surface of substrate 12. The conductive region 202 is comprised of a different material from the materials of the substrate region 12 so that it may be selectively etched away later without simultaneous unwanted etching of substrate 12. For example, the conductive region 202 could be made of silicon germanium (SiGe) material, while substrate 12 could be made of silicon.

As illustrated in FIGS. 76D through 76F, a lithography process is then performed to pattern the conductive region 202. Subsequently, layer 202 is etched, followed by another conductive region 204 growth. As an example, the thickness of region 204 is about 500 A in an exemplary 130 nm process. Region 204 may comprise of the same materials forming substrate 12, for example silicon. A planarization step can then be performed to ensure a planar surface. The resulting structure can be seen in FIGS. 76D through 76F.

As illustrated in FIGS. 76G through 76H, a trench formation process is then performed, which follows a similar sequence of steps as shown in FIGS. 2A through 2I, i.e. formation of silicon oxide 220, polysilicon 222, and silicon nitride 224 layers, followed by lithography patterning and etch processes. Trench 216 is etched such that the trench depth is deeper than that of trench 208. For example, the trench 208 depth is about 1200 A, while the trench 216 depth is about 2000 A in an exemplary 130 nm process. The resulting structures are shown in FIGS. 76G through 76I.

As illustrated in FIGS. 76J through 76L, this is then followed by silicon oxidation step, which will grow silicon oxide films in trench 208 and trench 216. For example, about 4000 A silicon oxide can be grown in an exemplary 130 nm process. A chemical mechanical polishing step can then be performed to polish the resulting silicon oxide films so that the silicon oxide layer is flat relative to the silicon surface. A silicon dry etching step can then be performed so that the remaining silicon oxide layer height is about 300 A from the silicon surface in an exemplary 130 nm process. The silicon nitride layer 224 and the polysilicon layer 222 can then be removed, followed by a wet etch process to remove silicon oxide layer 220 (and a portion of the silicon oxide films formed in the area of former trench 208 and trench 216). FIGS. 76J through 76L show the insulating layers 26 and 28 formed following these steps.

As illustrated in FIGS. 76M through 76O, an oxide etch is then performed to recess the oxide regions 26 and 28 (for example by about 1000 A) to expose the conductive region 202. A wet etch process is then performed to selectively remove region 202 leaving an gap 203 under an overhanging portion of region 204. The resulting structures following these steps are shown in FIGS. 76M through 76O.

Figure 76P:
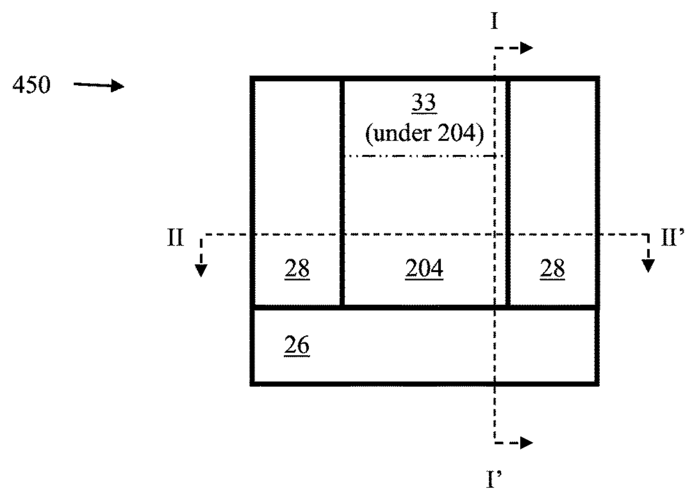
Figure 76Q:
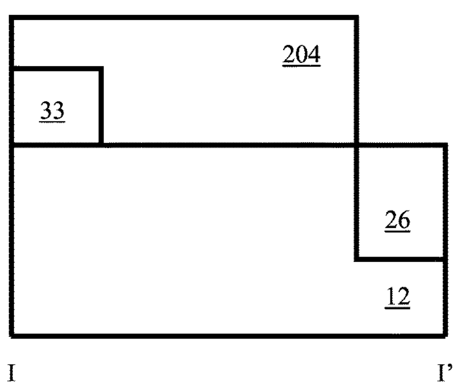
Figure 76R:
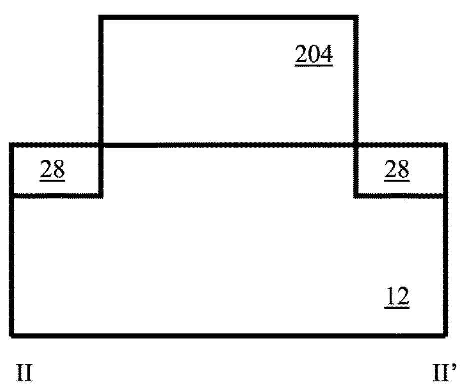

As illustrated in FIGS. 76P through 76R, the resulting gap region 203 is then oxidized to form a buried oxide region 33. Recessing insulating region 26 down to the surface of substrate 12 allows access for the etch of region 202 to form gap 203 and then subsequent oxide growth in gap 203 to form buried oxide region 33. The overhanging portion of region 204 constrains the oxide growth in gap space 203 to keep the buried oxide region 33 from growing to the surface. The resulting structures are shown in FIGS. 76P through 76R.

Figure 76S:
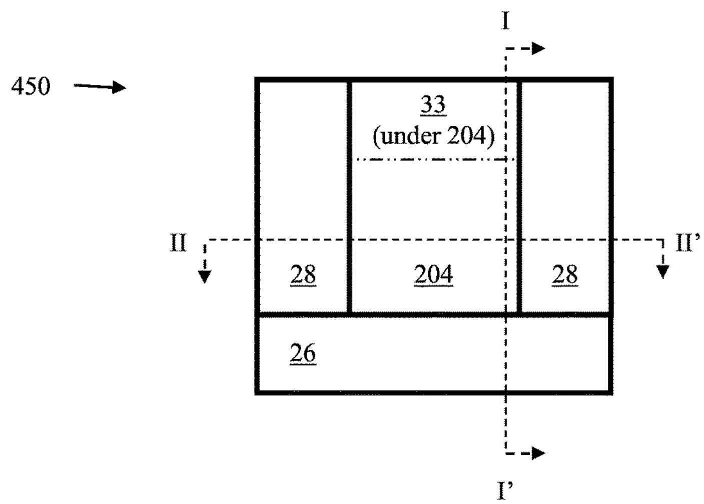
Figure 76T:
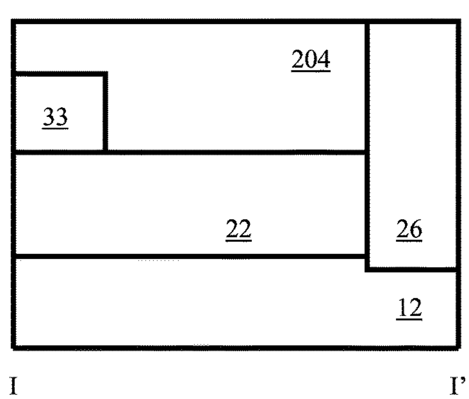
Figure 76U:
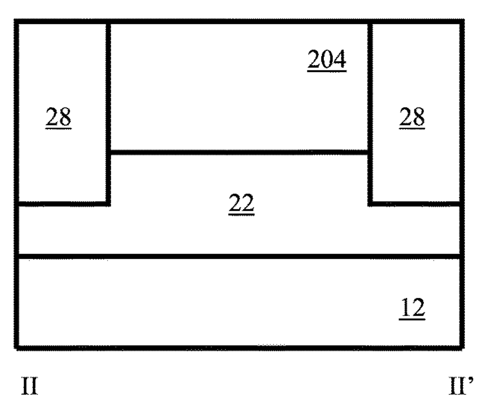

As illustrated in FIGS. 76S through 76U, an oxide deposition of about 1000 A is then performed followed by a planarization process. This is then followed by an ion implantation step to form the buried well region 22. The ion implantation energy is optimized such that the buried layer region 22 is formed shallower than the bottom of the insulating layer 26. As a result, the insulating layer 26 isolates buried layer region 22 between adjacent cells. On the other hand, the buried layer region 22 is formed such that insulating layers 28 and 33 do not isolate buried layer region 22, allowing buried layer region 22 to be continuous in the direction of II-II' cross section line. Following these steps, the resulting structures are shown in FIGS. 76S through 76U.

Figure 76V:
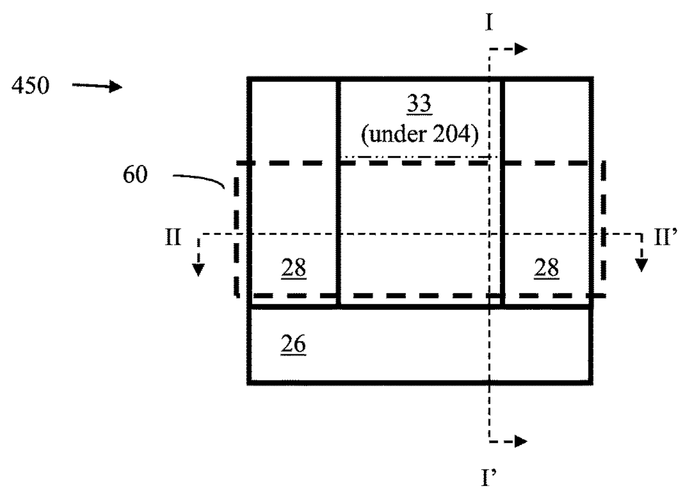
Figure 76W:
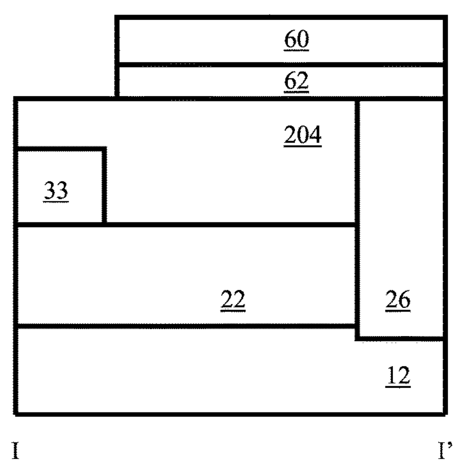
Figure 76X:
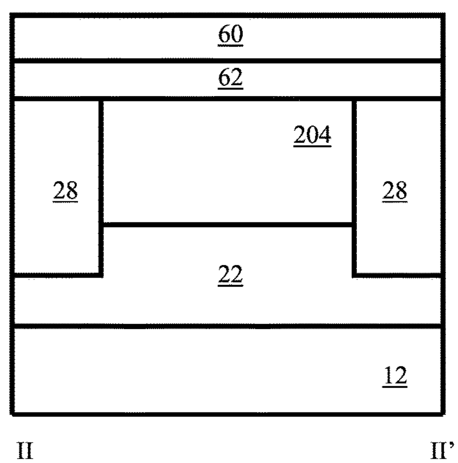

As illustrated in FIGS. 76V through 76X, a silicon oxide layer (or high-dielectric materials) 62 is then formed on the silicon surface (e.g. about 100 A in an exemplary 130 nm process), followed by a polysilicon (or metal) gate 60 deposition (e.g. about 500 A in an exemplary 130 nm process). A lithography step is then performed to form the pattern for the gate and word line, followed by etching of the polysilicon and silicon oxide layers where they are not waned. The resulting structure is shown in FIGS. 76V-76X.

Figure 76Y:
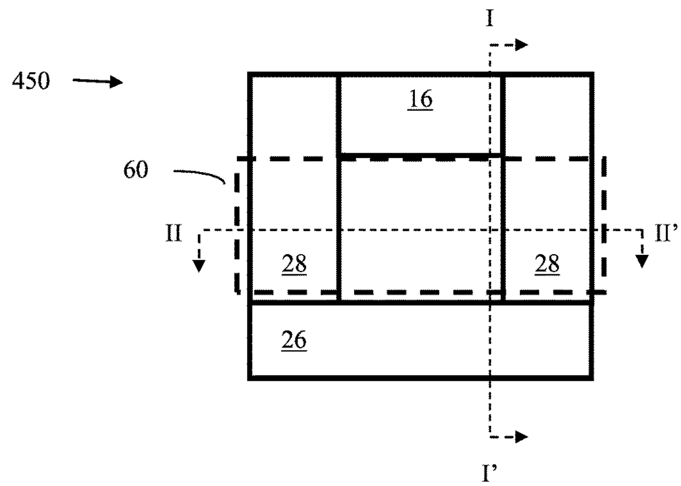
Figure 76Z:
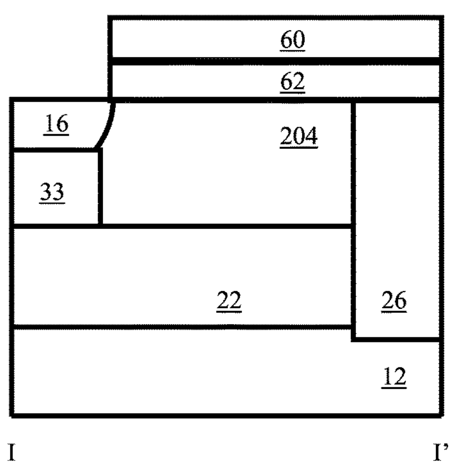
Figure 76A:
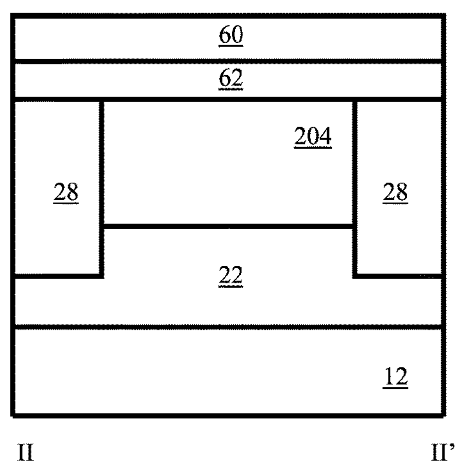

As illustrated in FIGS. 76Y through 76AA, another ion implantation step is then performed to form the bit line region 16 of a second conductivity type (e.g. n-type conductivity). The gate 60 and the insulating layers 26 and 28 serve as masking layer for the implantation process such that regions of second conductivity are not formed outside bit line region 16. This is then followed by backend process to form contact and metal layers.

FIGS. 77A through 77F illustrate an embodiment of a Gateless Half Transistor memory cell. Memory cell 550 according to the present invention eliminates the gate terminal present in earlier memory cells such as memory cell 250 allowing a more compact layout since some design rules like gate-to-contact-spacing no longer affect the minimum cell size.

Present in FIGS. 77A through 77F are substrate 12 of the first conductivity type, buried layer 22 of the second conductivity type, bit line region 16 of the second conductivity type, region of the second conductivity type 20, region of the first conductivity type 21, buried layer region 22, floating body 24 of the first conductivity type, insulating regions 26 and 28, source line terminal 72, and substrate terminal 78 all of which perform substantially similar functions in memory cell 550 as in previously discussed embodiment memory cell 250. The primary difference between memory cell 550 and memory cell 250 previously discussed is the absence of gate 60 and gate insulator 62. As in other embodiments, there is no contact to the buried layer 22 at the semiconductor surface 14 inside the boundary of memory cell 550.

The manufacturing of memory cell 550 is substantially similar to the manufacturing of memory cell 250 described in conjunction with FIGS. 36A through 36U, except that instead of a lithographic step for forming gate 60, a different lithographic step is needed to pattern bit line region 16 for implantation or diffusion.

Figure 77A:
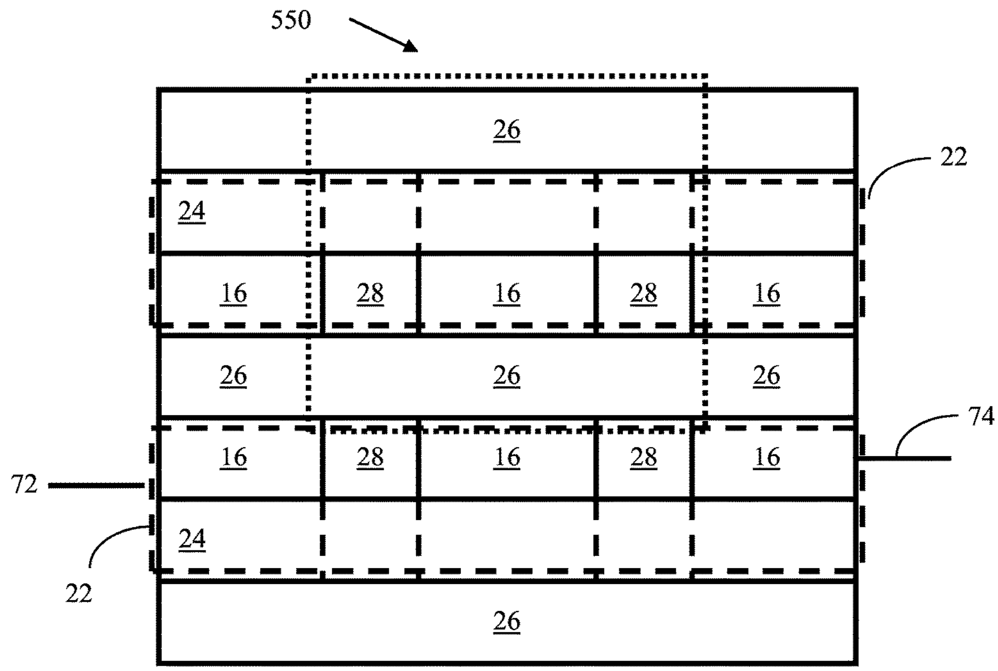
FIGS. 77A through 77F illustrate a fourth exemplary memory cell according to the present invention.

FIG. 77A illustrates a top view of memory cell 550 with several near neighbors.

Figure 77B:
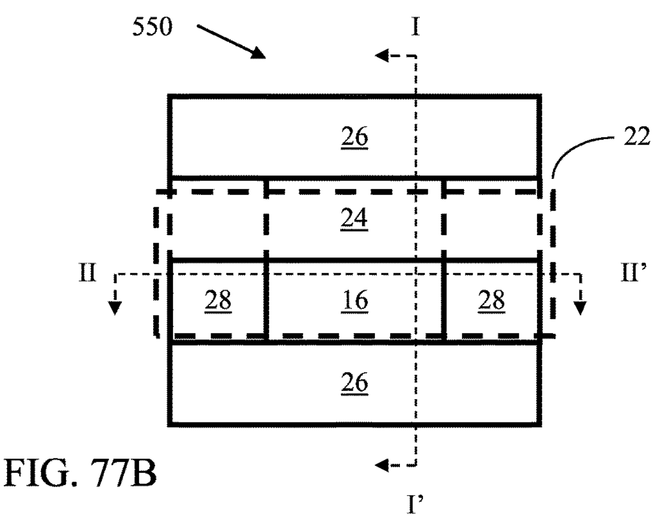
Figure 77C:
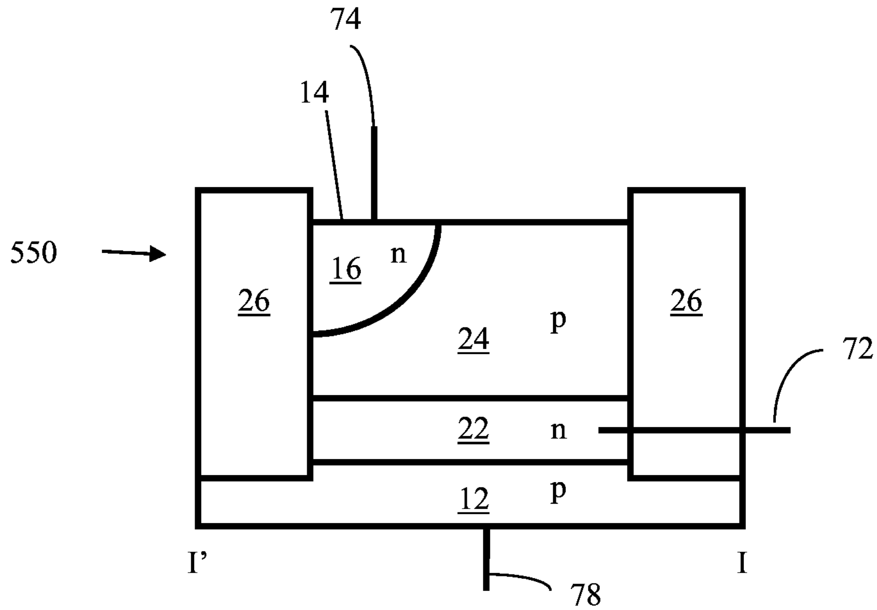
Figure 77D:
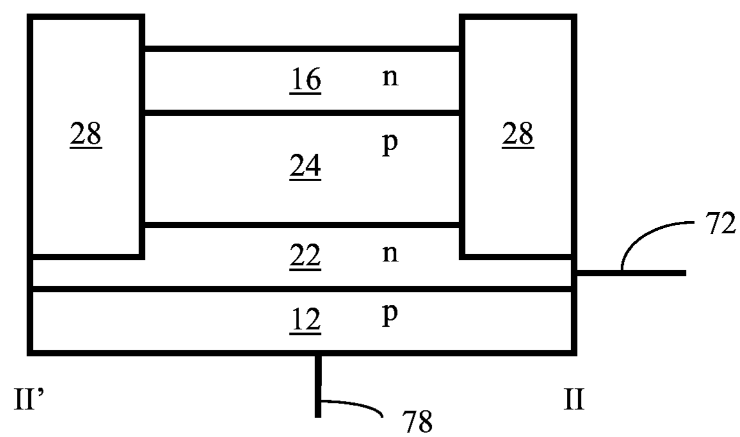

FIG. 77B illustrates a top view a single memory cell 550 with vertical cut line I-I' and horizontal cut line II-II' for the cross sections illustrated in FIGS. 77C and 77D respectively.

Figure 77E:
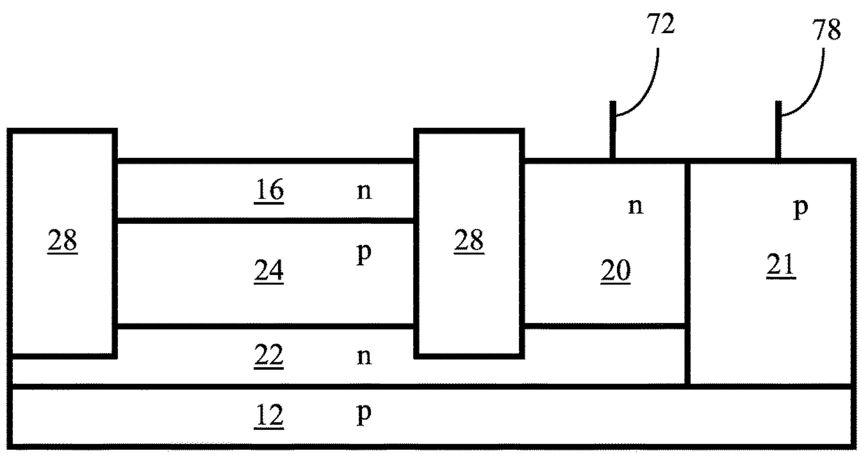

FIG. 77E shows how memory cell 550 may have its buried layer 22 coupled to source line terminal 72 through region 20 of the second conductivity type and its substrate 12 coupled to substrate terminal 78 through region of first conductivity type 21.

Figure 77F:
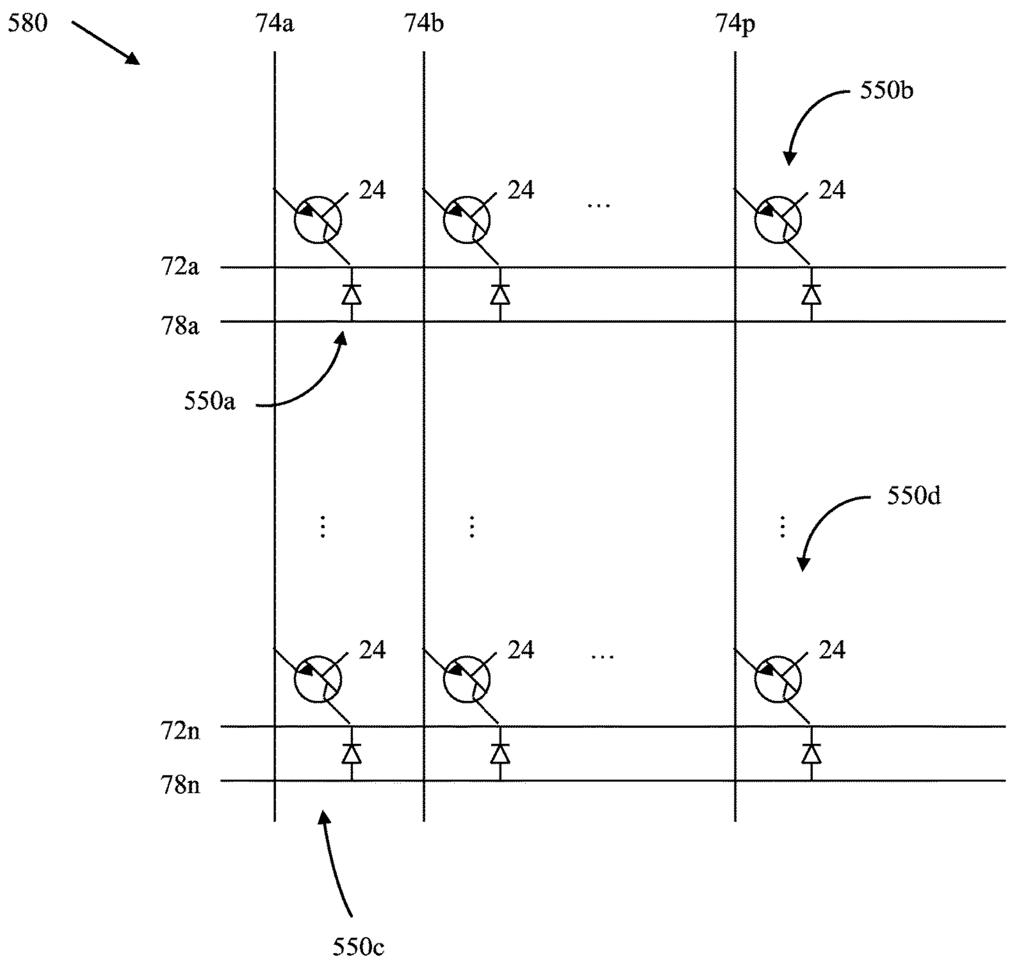

FIG. 77F shows exemplary memory array 580 which will be used in subsequent drawing figures to illustrate the various operations that may be performed on memory cell 550 when arranged in an array to create a memory device. Array 580 comprises in part representative memory cells 550*a*, 550*b*, 550*c* and 550*d*. In operations where a single memory cell is selected, representative memory cell 550*a* will represent the selected cell while the other representative memory cells 550*b*, 550*c* and 550*d* will represent the various cases of unselected memory cells sharing a row, sharing a column, or sharing neither a row or a column respectively with selected representative memory cell 550*a*. Similarly in the case of operations performed on a single row or column, representative memory cell 550*a* will always be on the selected row or column While the drawing figures show the first conductivity type as p-type and the second conductivity type as n-type, as with previous embodiments the conductivity types may be reversed with the first conductivity type becoming n-type and the second conductivity type becoming p-type as a matter of design choice in any particular embodiment.

The memory cell states are represented by the charge in the floating body 24, which modulates the intrinsic n-p-n bipolar device 230 formed by buried well region 22, floating body 24, and BL bit line region 16. If cell 550 has holes stored in the body region 24, then the memory cell will have a higher bipolar current (e.g. current flowing from BL to SL terminals during read operation) compared to if cell 550 does not store holes in body region 24.

The positive charge stored in the body region 24 will decrease over time due to the p-n diode leakage formed by floating body 24 and bit line region 16 and buried layer 22 and due to charge recombination. A unique capability of the invention is the ability to perform the holding operation in parallel to all memory cells of the array.

Figure 78A:
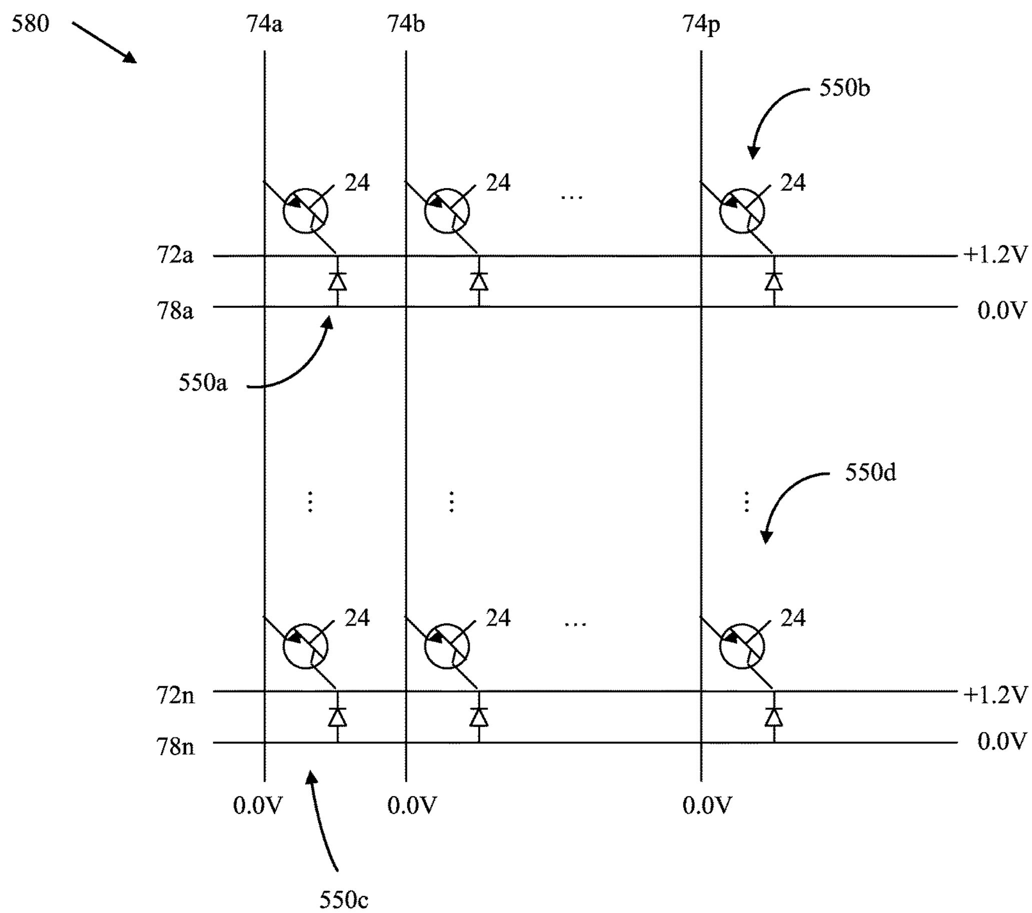
FIGS. 78A and 78B illustrate different holding operations on a memory array of the memory cells of FIGS. 77A through 77F.
Figure 78B:
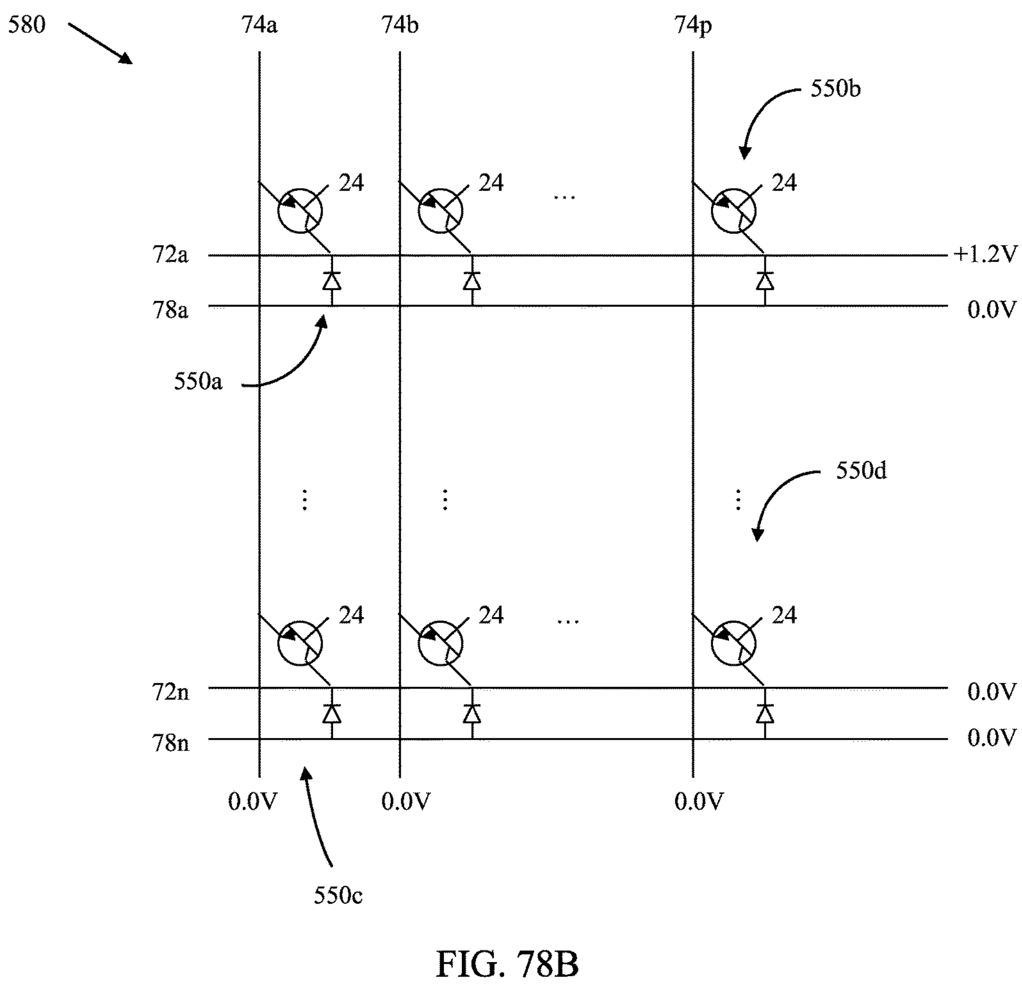

An entire array holding operation is illustrated in FIG. 78A while a single row holding operation is illustrated in FIG. 78B. The holding operation can be performed in a manner similar to the holding operation for memory cell 250 by applying a positive bias to the back bias terminal (i.e. SL terminal 72) while grounding terminal 74 and substrate terminal 78. If floating body 24 is positively charged (i.e. in a state logic-1), the n-p-n bipolar transistor 230 formed by BL bit line region 16, floating body 24, and buried well region 22 will be turned on.

A fraction of the bipolar transistor current will then flow into floating region 24 (usually referred to as the base current) and maintain the state logic-1 data. The efficiency of the holding operation can be enhanced by designing the bipolar device formed by buried well region 22, floating region 24, and bit line region 16 to be a low-gain bipolar device, where the bipolar gain is defined as the ratio of the collector current flowing out of SL terminal 72 to the base current flowing into the floating region 24.

For memory cells in state logic-0 data, the bipolar device will not be turned on, and consequently no base hole current will flow into floating region 24. Therefore, memory cells in state logic-0 will remain in state logic-0.

A periodic pulse of positive voltage can be applied to the SL terminal 72 as opposed to applying a constant positive bias to reduce the power consumption of the memory cell 550.

An example of the bias condition for the holding operation is hereby provided: zero voltage is applied to BL terminal 74, a positive voltage is applied to SL terminal 72, and zero voltage is applied to the substrate terminal 78. In one particular non-limiting embodiment, about +1.2 volts is applied to terminal 72, about 0.0 volts is applied to terminal 74, and about 0.0 volts is applied to terminal 78. However, these voltage levels may vary from embodiment to embodiment as a matter of design choice.

In the entire array holding operation of FIG. 78A, all of the source line terminals 72*a* through 72*n* are biased at +1.2V, all of the bit lines 74*a* through 74*p* are biased to 0.0V, and all of the source terminals 78*a* through 78*n* are biased to 0.0V. This places all of the cells in memory array 580 in the hold state.

In the single row hold operation of FIG. 78B, selected source line terminal 72*a* is biased at +1.2V while the unselected source line terminals 72*b* (not shown) through 72*n* are biased at 0.0V, all of the bit lines 74*a* through 74*p* are biased to 0.0V, and all of the source terminals 78*a* through 78*n* are biased to 0.0V. This places all of the selected cells in memory array 280 in the hold state.

A single memory cell read operation is illustrated in FIGS. 79 and 80A through 80H. The read operation for memory cell 550 can be performed by sensing the current of the bipolar device 230 by applying the following bias condition: a positive voltage is applied to the selected BL terminal 74, zero voltage is applied to the selected SL terminal 72, and zero voltage is applied to the substrate terminal 78. The positive voltage applied to the selected BL terminal is less than or equal to the positive voltage applied to the SL terminal during holding operation. The unselected BL terminals will remain at zero voltage and the unselected SL terminals will remain at positive voltage.

Figure 79:
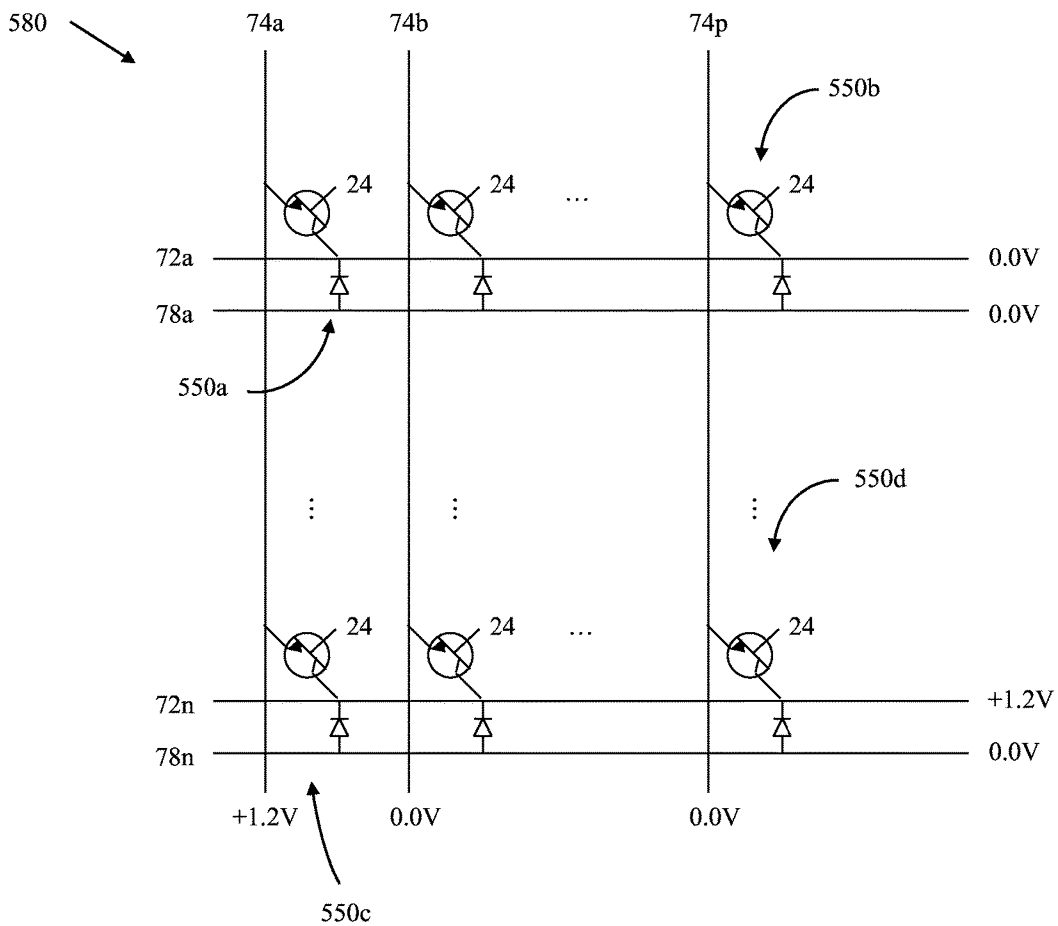
FIGS. 79 and 80A through 80H illustrate a read operation on a memory array of the memory cells of FIGS. 77A through 77F.

FIG. 79 shows the bias condition for the selected memory cell 550*a* and unselected memory cells 550*b*, 550*c*, and 550*d* in memory array 280. In this particular non-limiting embodiment, about 0.0 volts is applied to the selected SL terminal 72*a* while about 0.0V is applied to the unselected source line terminals 72*b* (not shown) through 72*n*, about +1.2 volts is applied to the selected BL terminal 74*a* while 0.0V is applied to the unselected bit line terminals 74*b* through 74*p*, and about 0.0 volts is applied to substrate terminals 78*a* through 78*n*. These voltage levels are exemplary only and may vary from embodiment to embodiment.

Figure 80A:
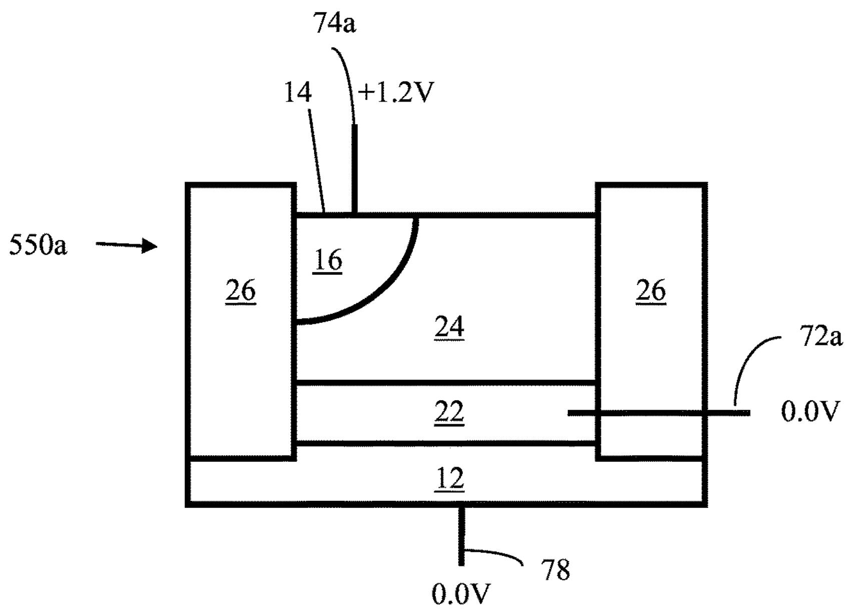
Figure 80B:
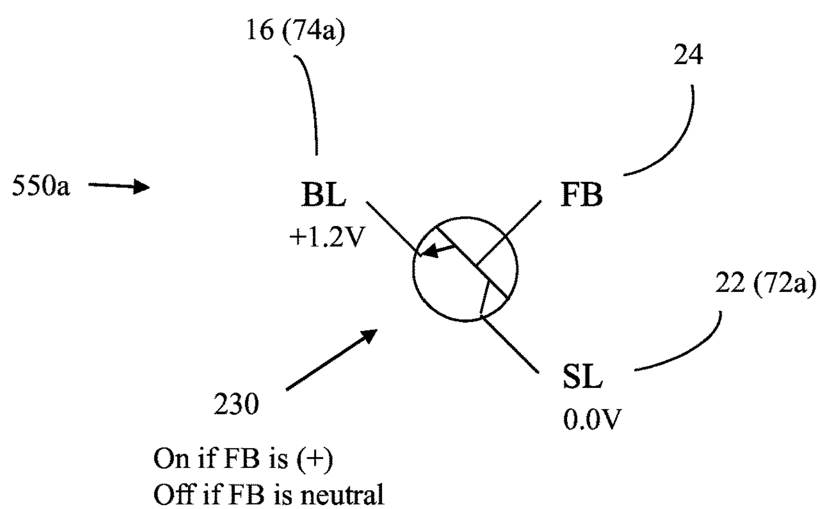

In FIGS. 80A and 80B, the bias conditions for selected representative memory cell 550*a* are shown. In this particular non-limiting embodiment, about 0.0 volts is applied to the selected SL terminal 72*a*, about +1.2 volts is applied to the selected BL terminal 74*a*, and about 0.0 volts is applied to substrate terminal 78 (not shown). This causes current to flow through intrinsic bipolar device 230 if the floating body is positively charged and no current to flow if the floating body is discharged since the bipolar device 230 is off.

Figure 80C:
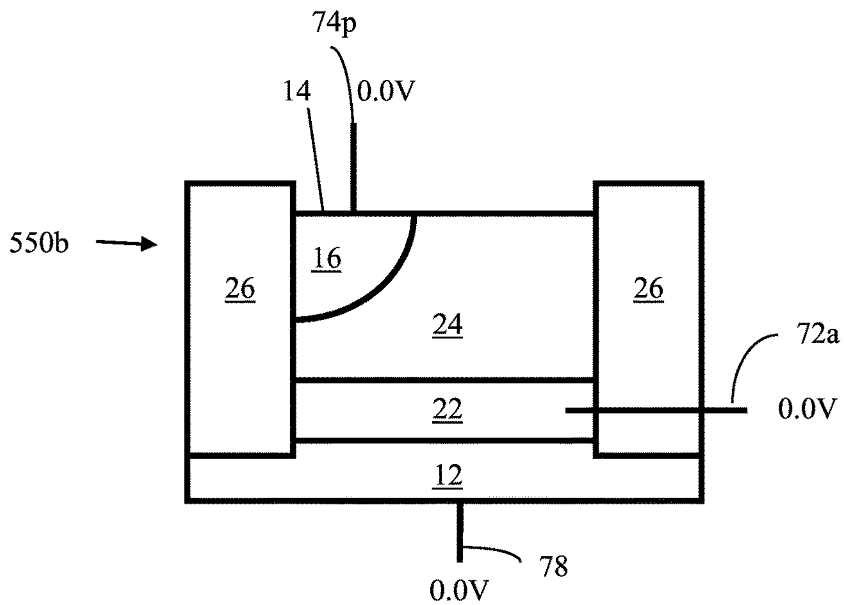
Figure 80D:
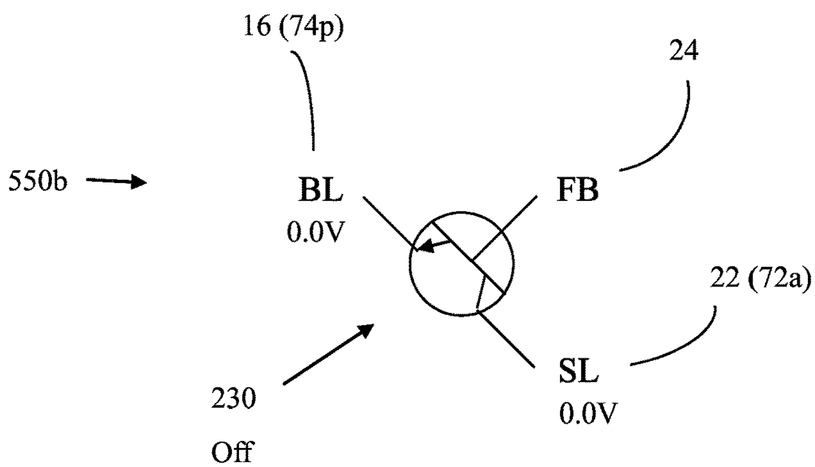
Figure 80E:
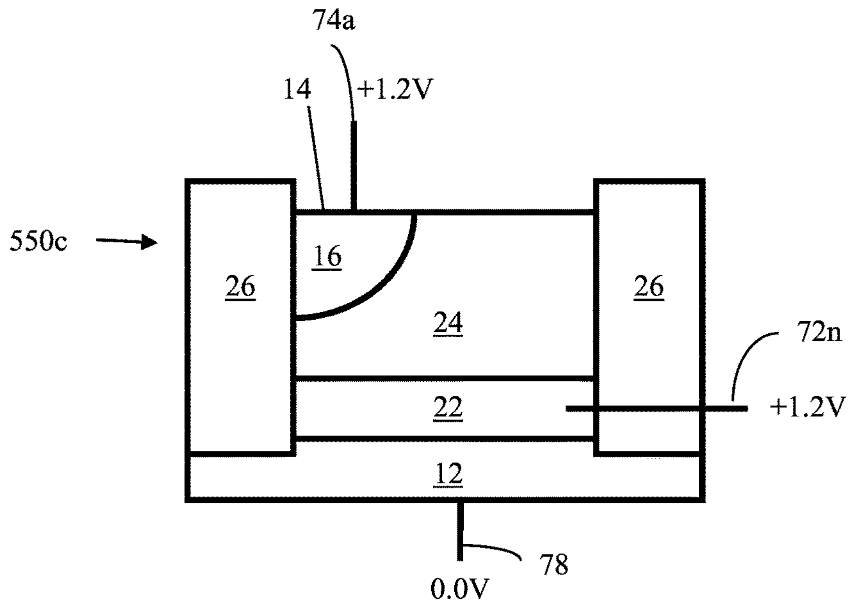
Figure 80F:
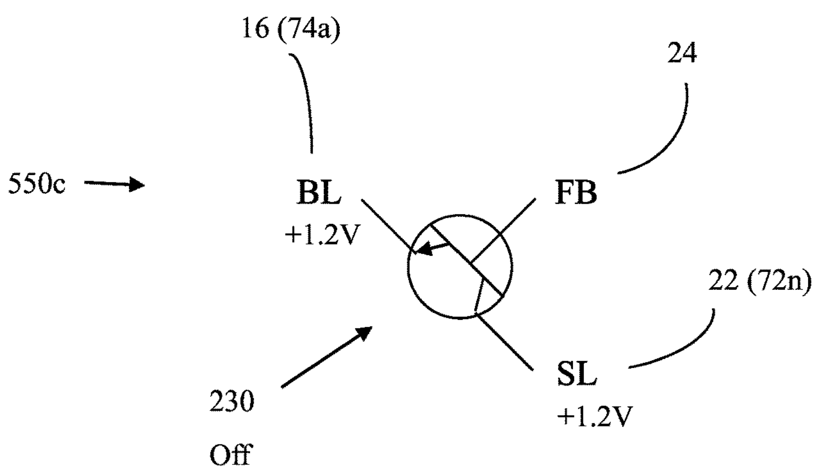
Figure 80G:
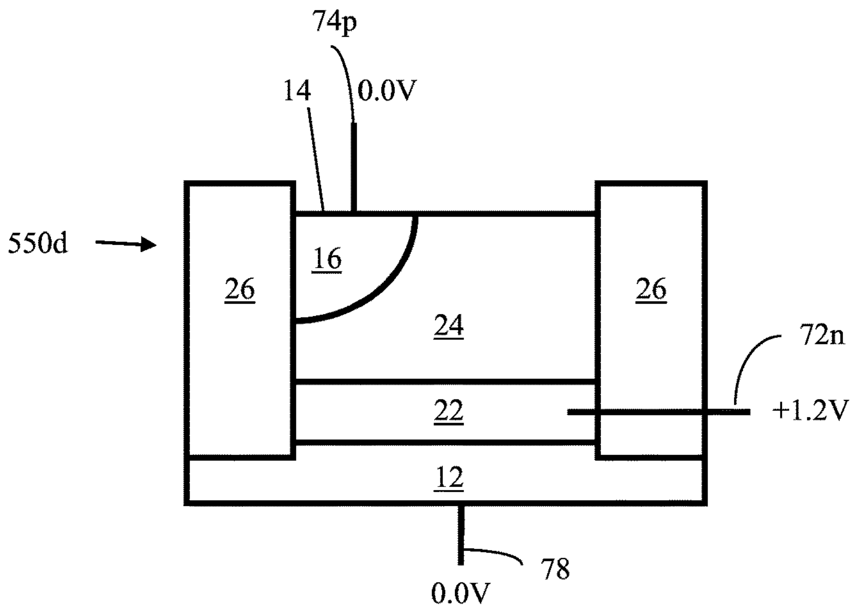
Figure 80H:
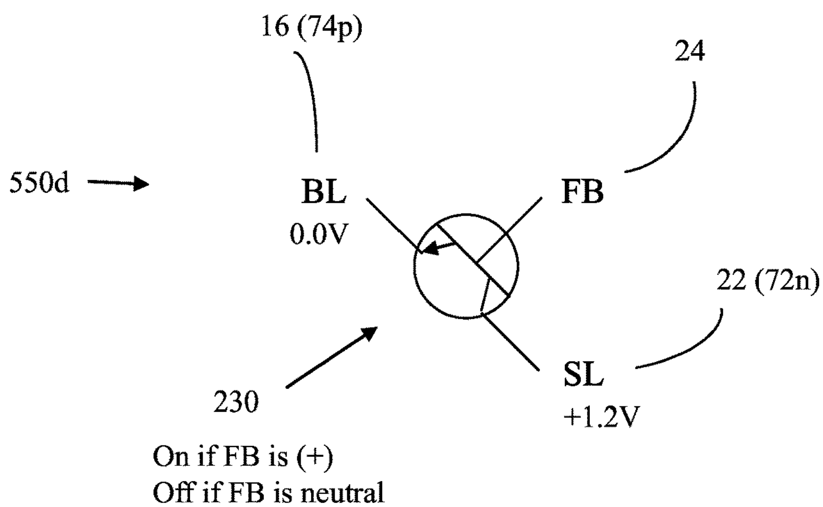

The unselected memory cells during read operations are shown in FIGS. 80C through 80H. The bias conditions for memory cells sharing the same row (e.g. memory cell 550*b*) are shown in FIGS. 80C and 80D. The bias conditions for memory cells sharing the same column (e.g. memory cell 550*c*) as the selected memory cell 550*a* are shown in FIGS. 80E and 80F. The bias conditions for memory cells sharing neither the same row nor the same column as the selected memory cell 550*a* (e.g. memory cell 550*d*) are shown in FIG. 80G-80H.

As illustrated in FIGS. 80C and 80D, for memory cell 550*b* sharing the same row as the selected memory cell 550*a*, the SL terminal 72*a* and the BL terminal 74*p* are both biased to 0.0V and consequently these cells will not be at the holding mode. However, because read operation is accomplished much faster (in the order of nanoseconds) compared to the lifetime of the charge in the floating body 24 (in the order of milliseconds), it should cause little disruption to the charge stored in the floating body.

As illustrated in FIGS. 80E and 80F, for memory cell 550*c* sharing the same column as the selected memory cell 550*a*, a positive voltage is applied to the BL terminal 74*a* and SL terminal 72*n*. No base current will flow into the floating body 24 because there is no potential difference between SL terminal 72 and BL terminal 74 (i.e. the emitter and collector terminals of the n-p-n bipolar device 230). However, because read operation is accomplished much faster (in the order of nanoseconds) compared to the lifetime of the charge in the floating body 24 (in the order of milliseconds), it should cause little disruption to the charge stored in the floating body.

As illustrated in FIGS. 80G and 80H, for memory cell 550*d* sharing neither the same row nor the same column as the selected memory cell 550*a*, both the SL terminal 72*n* will remain positively charged and the BL terminal 74*p* remain grounded. Representative memory cell 550*d* will be in the holding mode, where memory cells in state logic-1 will maintain the charge in floating body 24 because the intrinsic bipolar device 230 will generate hole current to replenish the charge in floating body 24, while memory cells in state logic-0 will remain in neutral state.

The various voltage bias levels above are exemplary only. They will vary from embodiment to embodiment as a function of both design choice and the process technology used.

Figure 81:
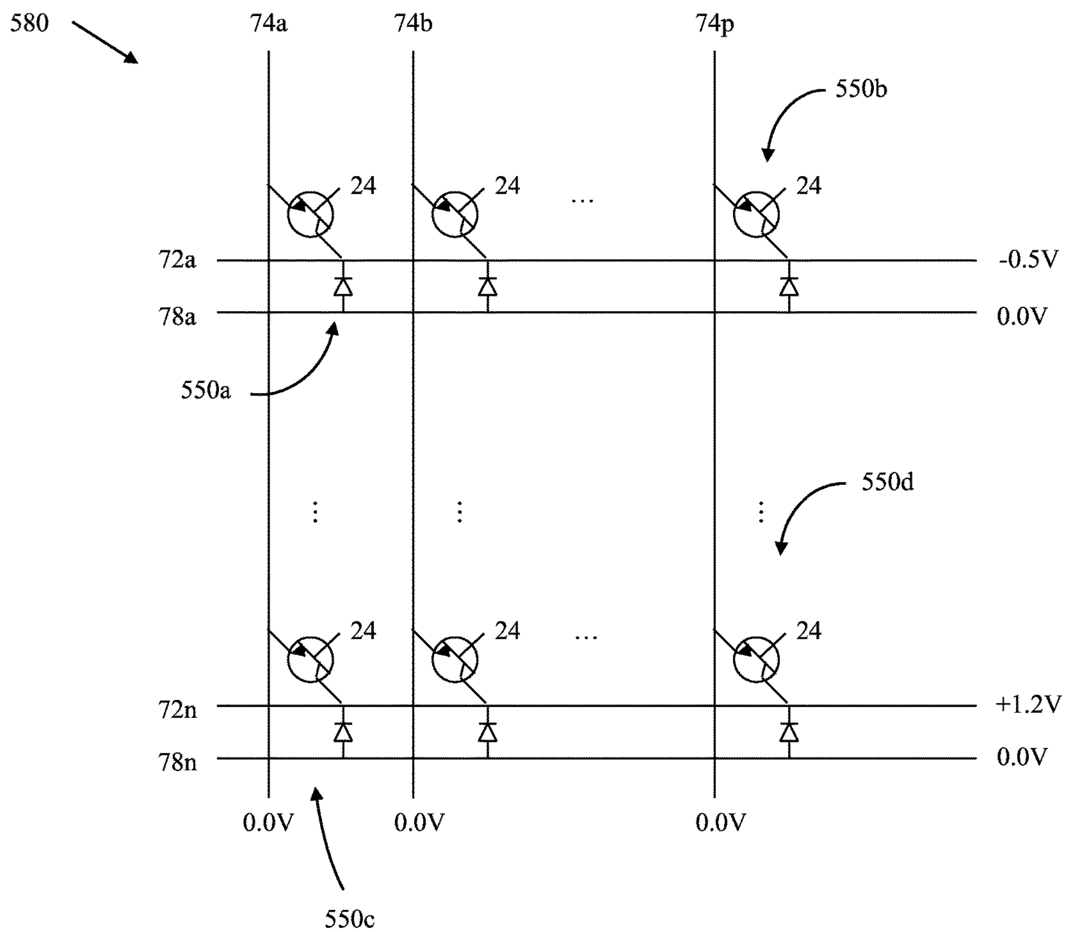
FIG. 81 illustrates a single memory cell write logic-0 operation on the memory array of FIG. 77F.
Figure 82A:
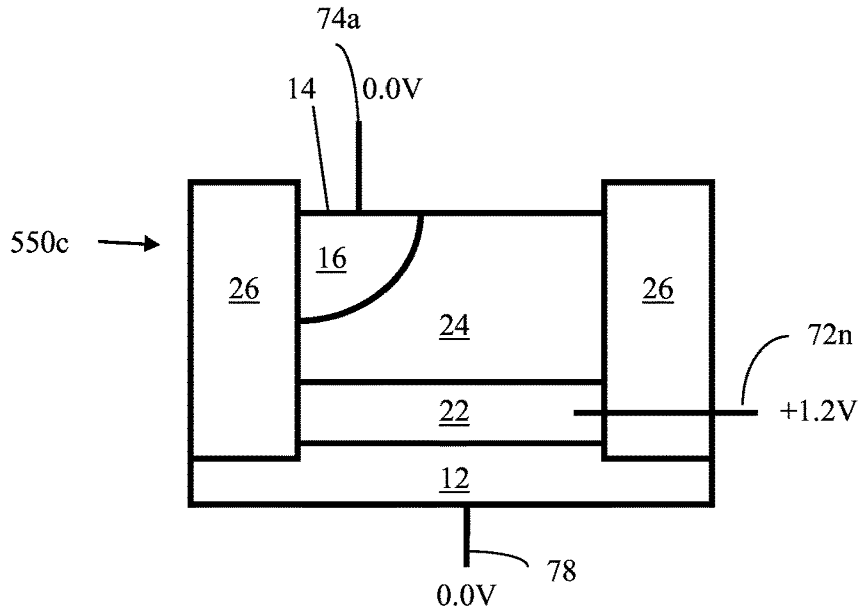
FIGS. 82A through 82B illustrate the operation of the unselected memory cells of the array of FIG. 81.
Figure 82B:
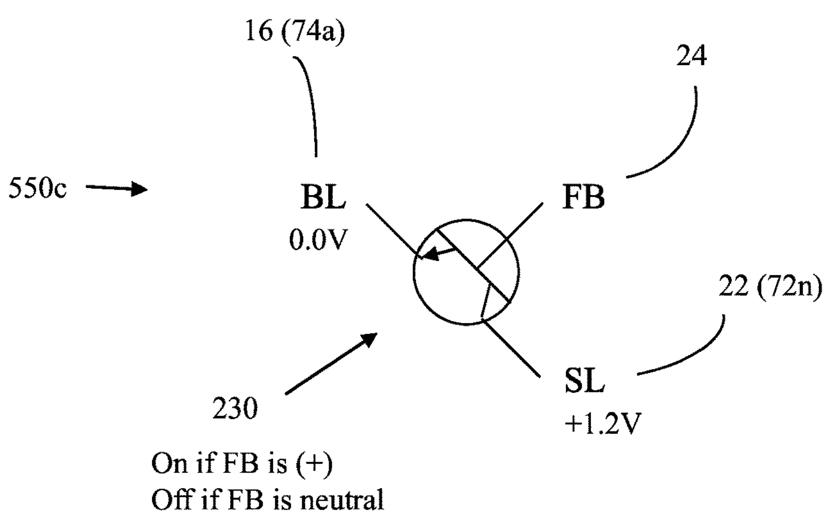

FIG. 81 illustrates a single row write logic-0 operation while FIGS. 82A and 82B illustrate the biasing conditions and operation of unselected representative memory cell 550*c*. In FIG. 81 the selected row SL terminal 72*a* is biased negatively at about −0.5V while the unselected row SL terminals 72*b* (not shown) through 72*n* are biased at about 0.0V, all the BL terminals 74*a* through 74*p* are biased at 0.0V, and all the substrate terminals 78*a* through 78*n* are biased at 0.0V. This causes the selected cells 550 like representative memory cells 550*a* and 550*b* to have their bipolar devices turn on due to forward bias on the floating body 24 to buried layer 22 junction evacuating the holes from the floating body 24.

FIGS. 82A and 82B show the operation of unselected representative memory cell 550*c* which in this case is representative of all the memory cells 550 in memory array 280 not on the selected row. Memory cell 550*c* has its SL terminal 72*n* at +1.2V and its BL terminal 74*a* at 0.0V which corresponds to the holding operation described above in conjunction with FIGS. 78A and 78B.

A write logic-0 operation can also be performed on a column basis by applying a negative bias to the BL terminal 74 as opposed to the SL terminal 72. The SL terminal 72 will be zero or positively biased, while zero voltage is applied to the substrate terminal 78. Under these conditions, all memory cells sharing the same BL terminal 74 will be written into state logic-0 and all the other cells will be in a holding operation.

The various voltage bias levels above are exemplary only. They will vary from embodiment to embodiment as a function of both design choice and the process technology used.

A write logic-1 operation can be performed on memory cell 550 through impact ionization as described for example with reference to Lin above.

Figure 83:
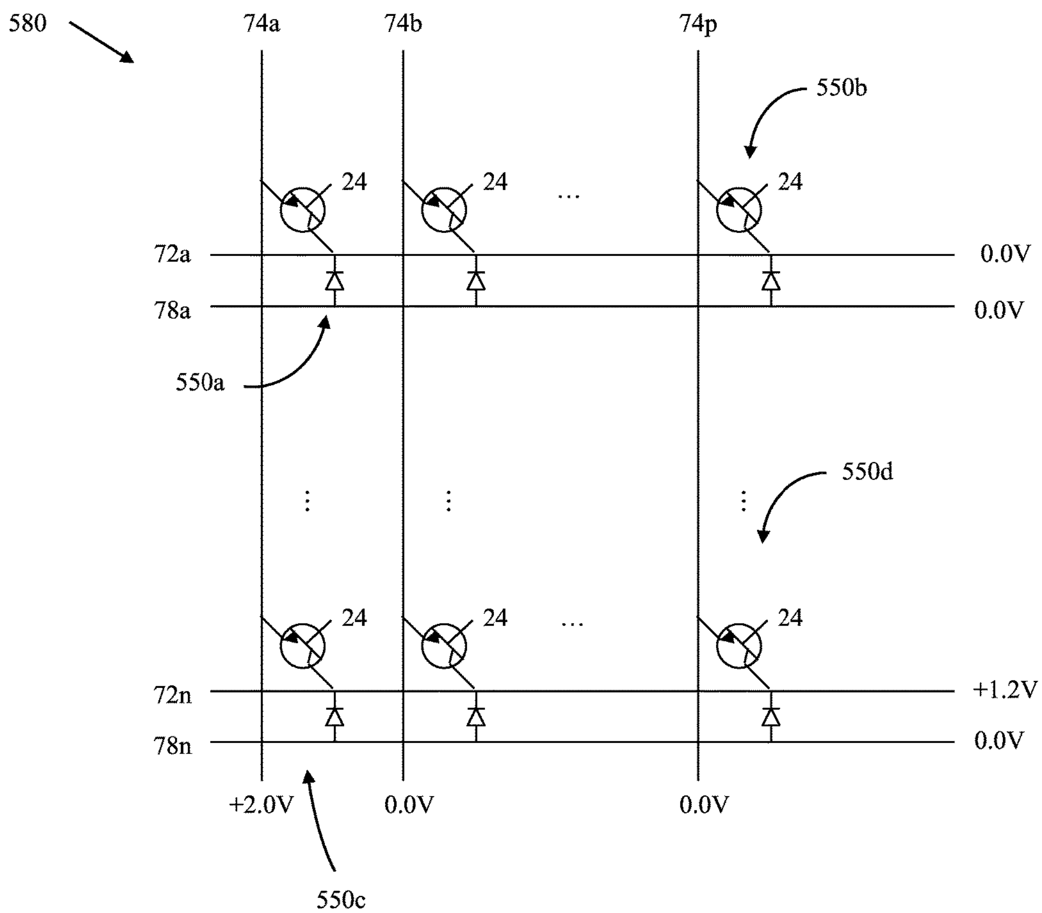
FIG. 83 illustrates a single memory cell write logic-0 operation on the memory array of FIG. 77F.
Figure 84A:
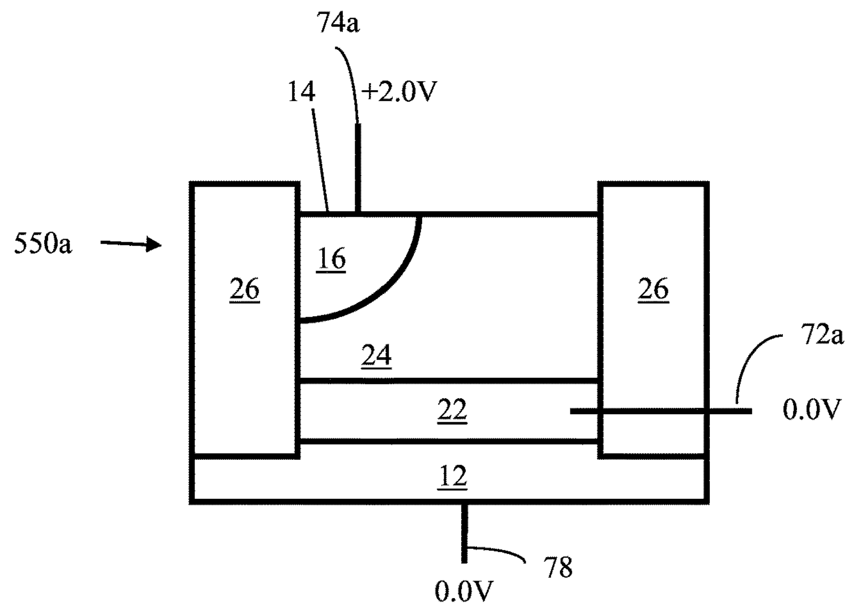
FIGS. 84A through 84H illustrate the operation of four representative memory cells of the array of FIG. 83.
Figure 84B:
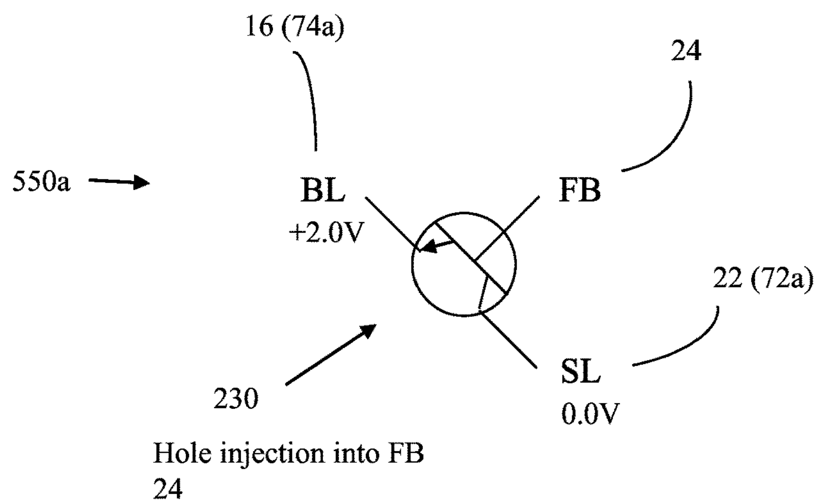

An example of the bias condition of the selected memory cell 550*a* under impact ionization write logic-1 operation is illustrated in FIG. 83 and FIGS. 84A through 84B. A positive bias is applied to the BL terminal 74, while zero voltage is applied to the selected SL terminal 72 and substrate terminal 78. The positive bias applied to the BL terminal 74 is greater than the positive voltage applied to the SL terminal 72 during holding operation. The positive bias applied to the BL terminal is large enough to turn on bipolar device 230 regardless of the initial state of the data in selected memory cell 550*a*. This results in a base hole current to the floating body 24 of the selected memory cell 550*a* charging it up to a logic-1 state.

In one particular non-limiting embodiment, the following bias conditions are applied to the selected memory cell 550*a*: a potential of about 0.0 volts is applied to selected SL terminal 72*a*, a potential of about +2.0 volts is applied to selected BL terminal 74*a*, and about 0.0 volts is applied to substrate terminals 78*a* through 78*n*. The following bias conditions are applied to the unselected terminals: about +1.2 volts is applied to SL terminals 72*b* (not shown) through 72*n*, and about 0.0 volts is applied to BL terminals 74*b* through 74*p*. FIG. 83 shows the bias condition for the selected and unselected memory cells in memory array 580. The various voltage bias levels above are exemplary only. They will vary from embodiment to embodiment as a function of both design choice and the process technology used.

Figure 84C:
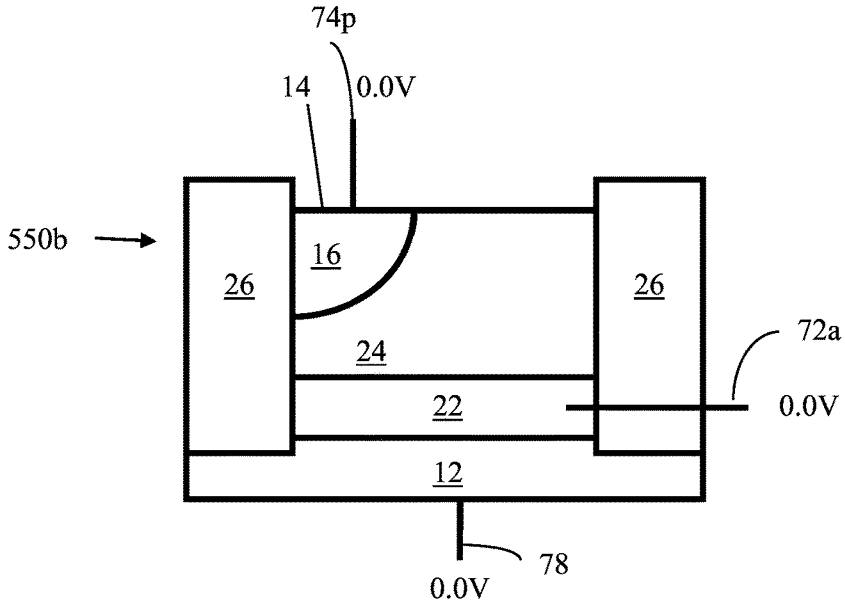
Figure 84D:
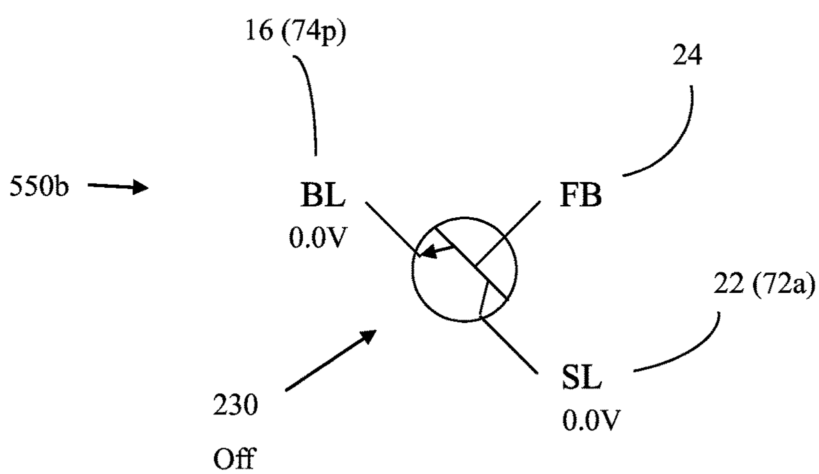

The unselected memory cells during write logic-1 operations are shown in FIGS. 84C through 84H. The bias conditions for memory cells sharing the same row (e.g. memory cell 550*b*) are shown in FIGS. 84C through 84D, the bias conditions for memory cells sharing the same column as the selected memory cell 550*a* (e.g. memory cell

Figure 84E:
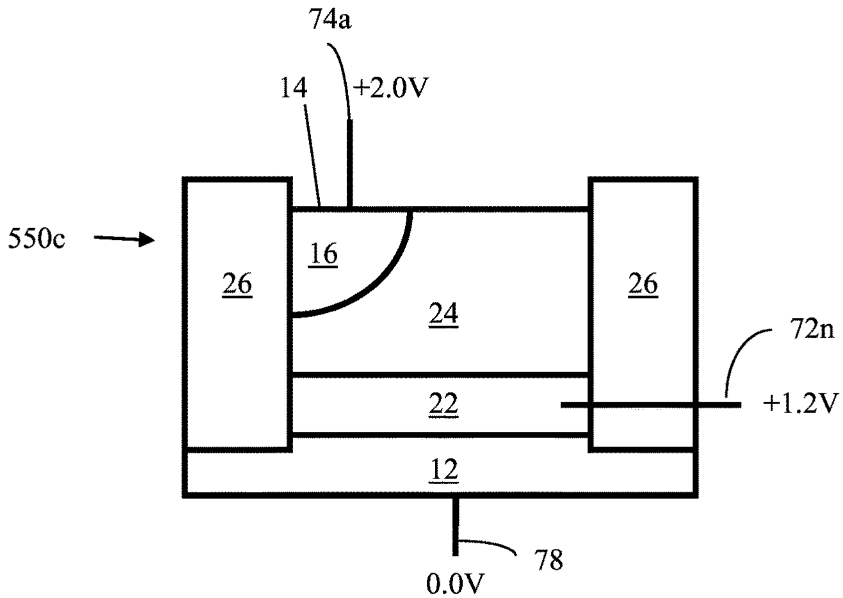
Figure 84F:
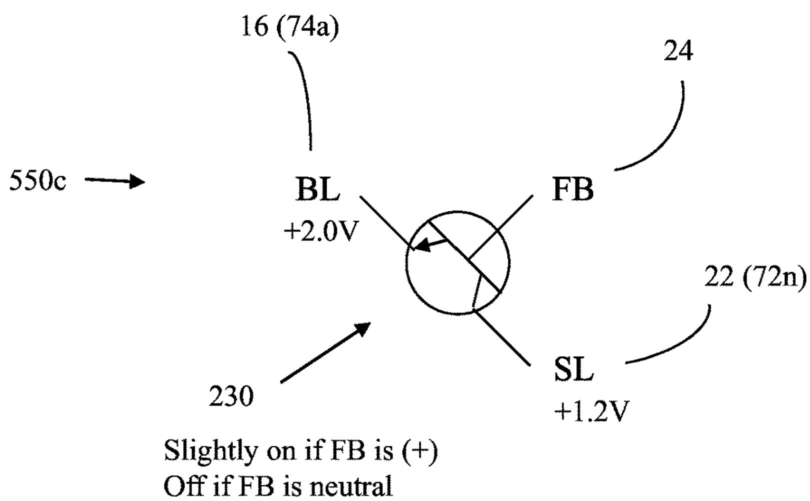
Figure 84G:
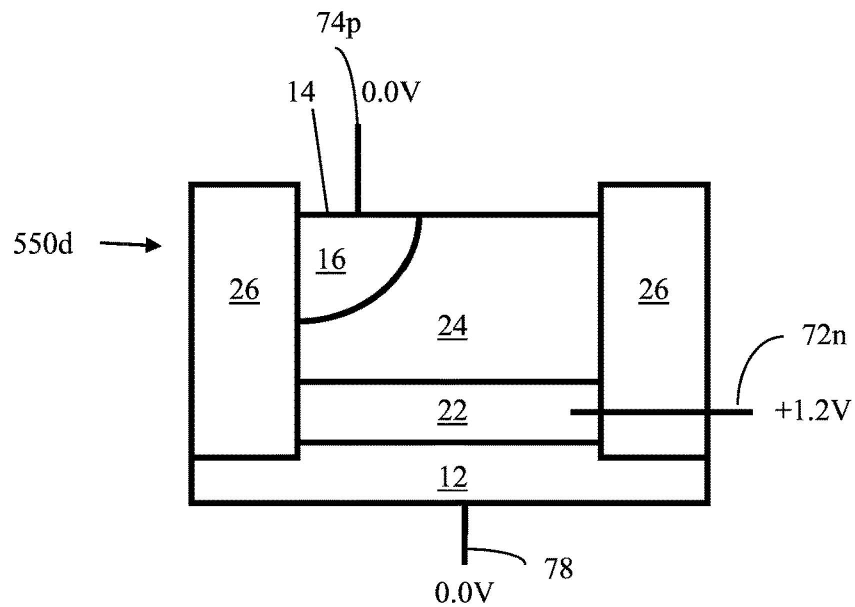
Figure 84H:
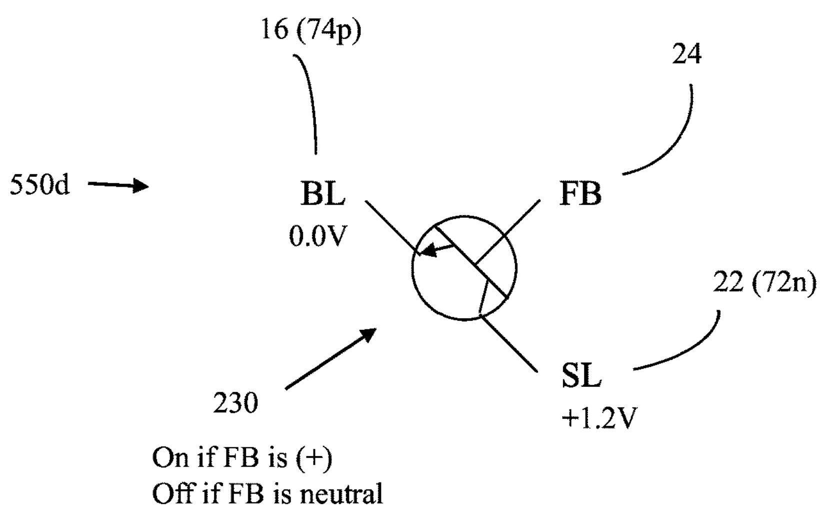

550*c*) are shown in FIGS. 84E through 84F, and the bias conditions for memory cells 550 not sharing the same row nor the same column as the selected memory cell 550*a* (e.g. memory cell 550*d*) are shown in FIGS. 84G through 84H.

As shown in FIGS. 84C and 84D, for representative memory cell 550*b* sharing the same row as the selected memory cell 550*a,* SL terminal 72*a* and BL terminal 74*p* are be grounded. Bipolar device 230 will be off and the memory cell 550*b* will not be at the holding mode. However, because write operation is accomplished much faster (in the order of nanoseconds) compared to the lifetime of the charge in the floating body 24 (in the order of milliseconds), it should cause little disruption to the charge stored in the floating body.

As shown in FIGS. 84E and 84F, for representative memory cell 550*c* sharing the same column as the selected memory cell 550*a,* a greater positive voltage is applied to the BL terminal 74*a* and a lesser positive voltage is applied to SL terminal 72*n*. Less base current will flow into the floating body 24 than in selected memory cell 550*a* because of the lower potential difference between SL terminal 72 and BL terminal 74 (i.e. the emitter and collector terminals of the n-p-n bipolar device 230). However, because write operation is accomplished much faster (in the order of nanoseconds) compared to the lifetime of the charge in the floating body 24 (in the order of milliseconds), it should cause little disruption to the charge stored in the floating body.

As shown in FIGS. 84G and 84H, for representative memory cell 550*d* sharing neither the same column nor the same row as the selected memory cell 550*a,* the SL terminal 72 is positively charged and the BL terminal is grounded. Representative memory cell 550*d* will be at holding mode, where memory cells in state logic-1 will maintain the charge in floating body 24 because the intrinsic bipolar device 230 will generate hole current to replenish the charge in floating body 24 and where memory cells in state logic-0 will remain in neutral state.

The various voltage bias levels above are exemplary only. They will vary from embodiment to embodiment as a function of both design choice and the process technology used. Also, the first conductivity type may be changed from p-type to n-type and the second conductivity type may be changed from n-type to p-type, and the polarities of the applied biases may be reversed. Thus the invention is not to be limited in any way except by the appended claims.

A vertical stack of alternating conductive regions of first conductivity type and second conductivity type has been described in J_Kim discussed above, where a gate is overlaid surrounding the body region 24 on two sides. By removing the gates, a more compact memory cell than that reported in J_Kim can be obtained as in memory cell 350 discussed below.

FIGS. 85A through 85F illustrate another embodiment of a Gateless Half Transistor memory cell. By allowing the bit line region 16 to completely cover the floating body region 24 in memory cell 650, some design rules like minimum-diffusion-to-insulator-spacing (the space from 16 to 26 in memory cell 550) no longer affects the cell size. Present in FIGS. 85A through 85F are substrate 12 of the first conductivity type, buried layer 22 of the second conductivity type, bit line region 16 of the second conductivity type, region of the second conductivity type 20, region of the first conductivity type 21, floating body 24 of the first conductivity type, buried layer region 22, insulating regions 26 and 28, source line terminal 72, and substrate terminal 78 all of which perform substantially similar functions in memory cell 650 as in previously discussed embodiment memory cell 550.

The primary difference between memory cell 650 and memory cell 550 previously discussed is that bit line region 16 completely covers a (now smaller) floating body region 24 allowing for a more compact memory cell. As in other embodiments, there is no contact to the buried layer 22 at the semiconductor surface 14 inside the boundary of memory cell 650.

The manufacturing of memory cell 650 is substantially similar to the manufacturing of memory cell 250 described in conjunction with FIGS. 36A through 36U and memory cell 550 described in conjunction with FIGS. 77A through 77F above, except that bit line region 16 may be formed by an implantation process formed on the material making up substrate 12 according to any of implantation processes known and typically used in the art. Alternatively, solid state diffusion or epitaxial growth process may also be used to form bit line region 16.

Figure 85A:
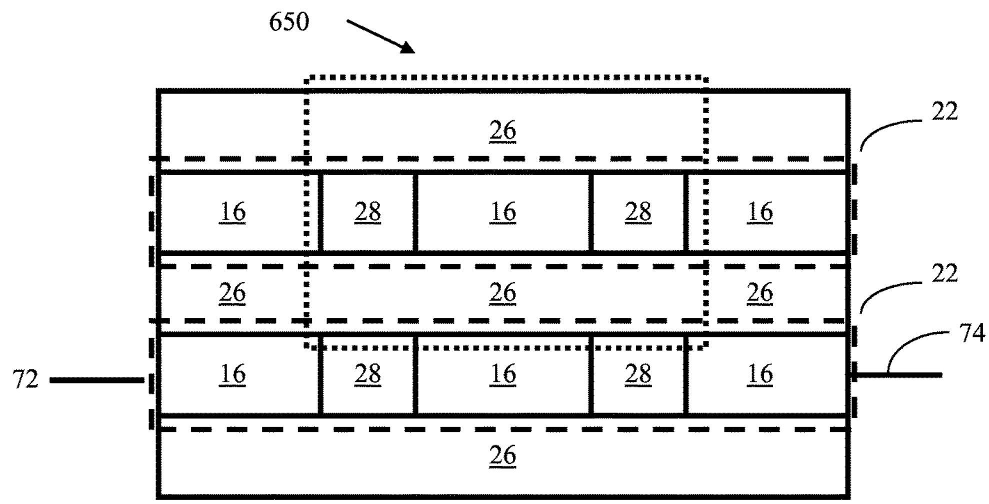

FIG. 85A illustrates a top view of memory cell 650 with several near neighbors.

Figure 85B:
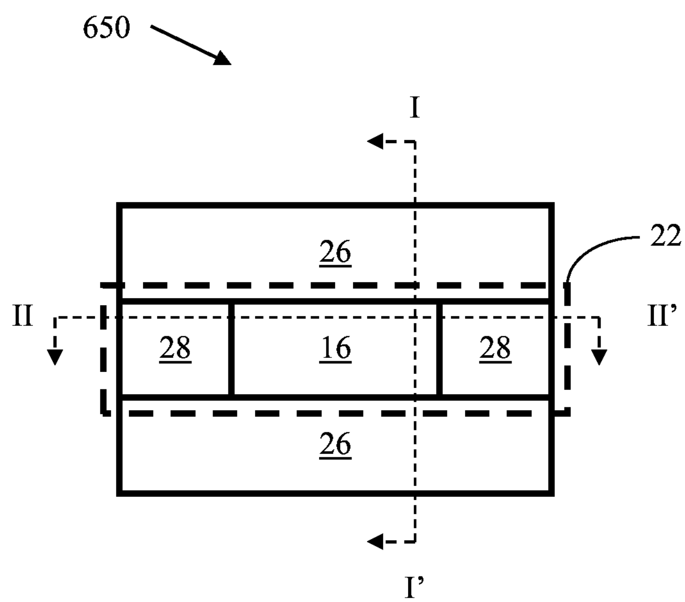
Figure 85C:
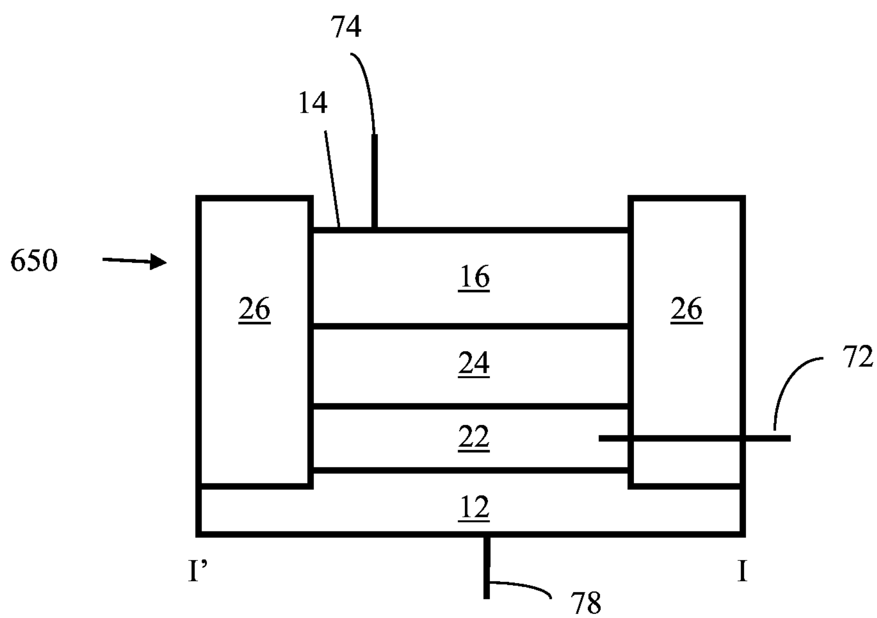
Figure 85D:
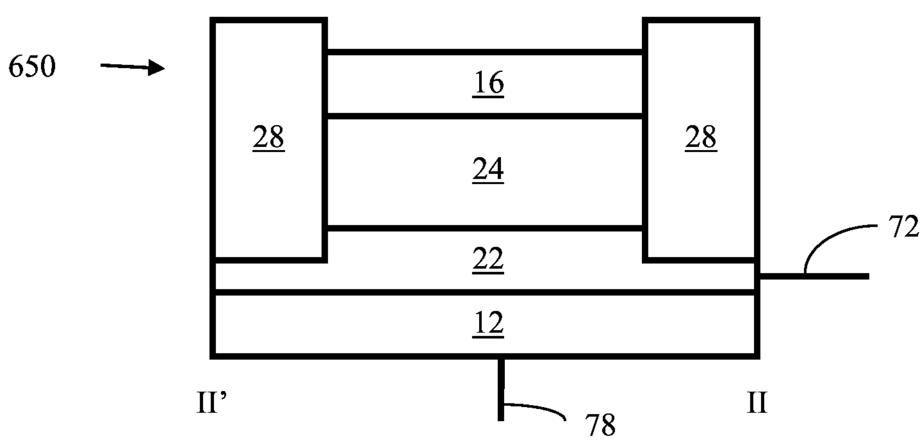

FIG. 85B illustrates a top view a single memory cell 650 with vertical cut line I-I' and horizontal cut line II-II' for the cross sections illustrated in FIGS. 85C and 85D respectively.

Figure 85E:
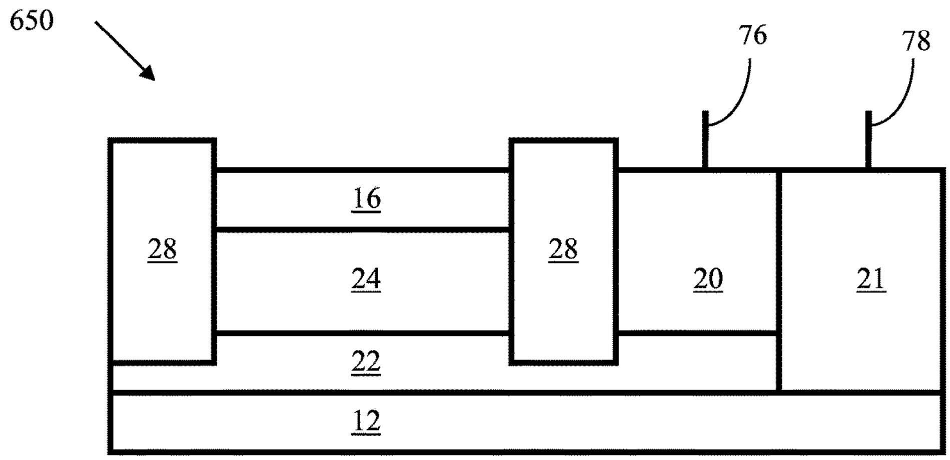
Figure 85F:
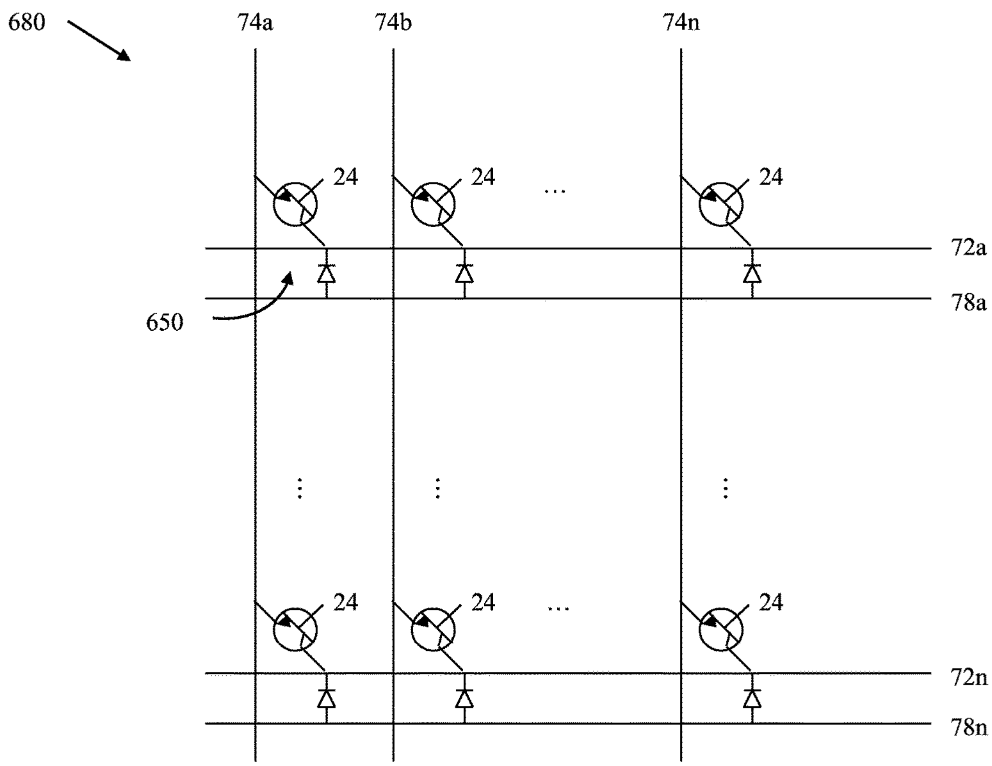

FIG. 85E shows how memory cell 650 may have its buried layer 22 coupled to source line terminal 72 through region 20 of the second conductivity type and its substrate 12 coupled to substrate terminal 78 through region 21 of the first conductivity type.

FIG. 87F shows exemplary memory array 680 comprising multiple memory cells 650 when arranged in an array to create a memory device. The circuit operation of memory cell 650 is substantially identical to that of memory cell 550 and will not be discussed further.

While the drawing figures show the first conductivity type as p-type and the second conductivity type as n-type, as with previous embodiments the conductivity types may be reversed with the first conductivity type becoming n-type and the second conductivity type becoming p-type as a matter of design choice in any particular embodiment.

An alternate method of operating memory cells 250, 350, and 450, which utilizes the silicon controlled rectifier (SCR) principle discussed above with reference to Widjaja, is now described.

Figure 86:
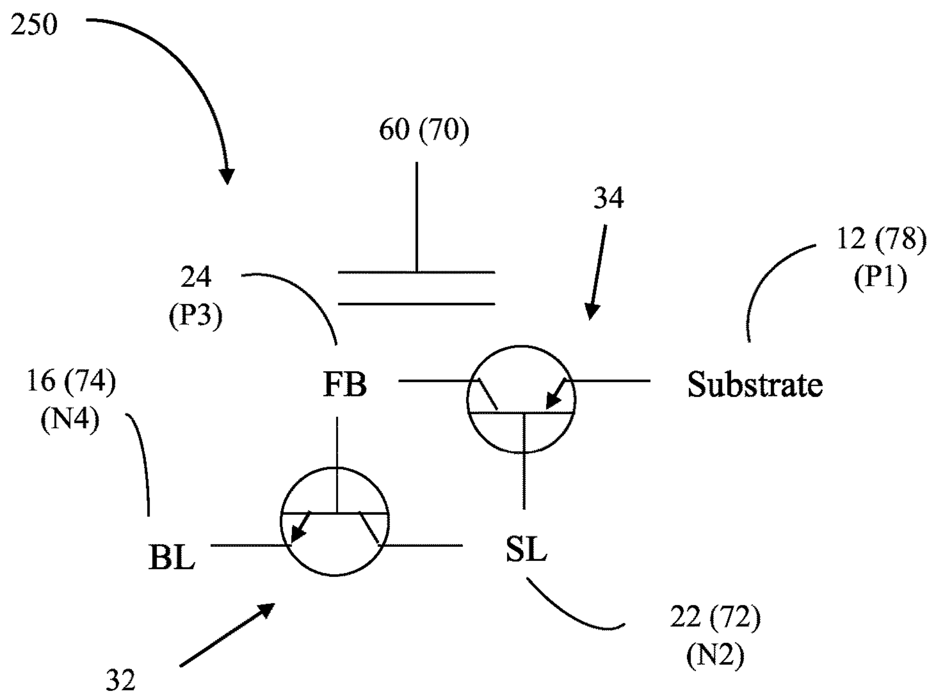

As shown in FIG. 86, inherent in memory cells 250, 350 and 450 is a P1-N2-P3-N4 silicon controlled rectifier (SCR) device formed by two interconnected bipolar devices 32 and 34, with substrate 78 functioning as the P1 region, buried layer 22 functioning as the N2 region, body region 24 functioning as the P3 region and bit line region 16 functioning as the N4 region. In this example, the substrate terminal 78 functions as the anode and terminal 74 functions as the cathode, while body region 24 functions as a p-base to turn on the SCR device. If body region 24 is positively charged, the silicon controlled rectifier (SCR) device formed by the substrate, buried well, floating body, and the BL junction will be turned on and if body region 24 is neutral, the SCR device will be turned off.

The holding operation can be performed by applying the following bias: zero voltage is applied to BL terminal 74, zero or negative voltage is applied to WL terminal 70, and a positive voltage is applied to the substrate terminal 78, while leaving SL terminal 72 floating. Under these conditions, if memory cell 250 is in memory/data state logic-1 with positive voltage in floating body 24, the SCR device of memory cell 250 is turned on, thereby maintaining the state logic-1 data. Memory cells in state logic-0 will remain in blocking mode, since the voltage in floating body 24 is not substantially positive and therefore floating body 24 does not turn on the SCR device. Accordingly, current does not flow through the SCR device and these cells maintain the state logic-0 data. Those memory cells 250 that are commonly connected to substrate terminal 78 and which have a positive voltage in body region 24 will be refreshed with a logic-1 data state, while those memory cells 250 that are commonly connected to the substrate terminal 78 and which do not have a positive voltage in body region 24 will remain in blocking mode, since their SCR device will not be turned on, and therefore memory state logic-0 will be maintained in those cells. In this way, all memory cells 250 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships there between.

Figure 87:
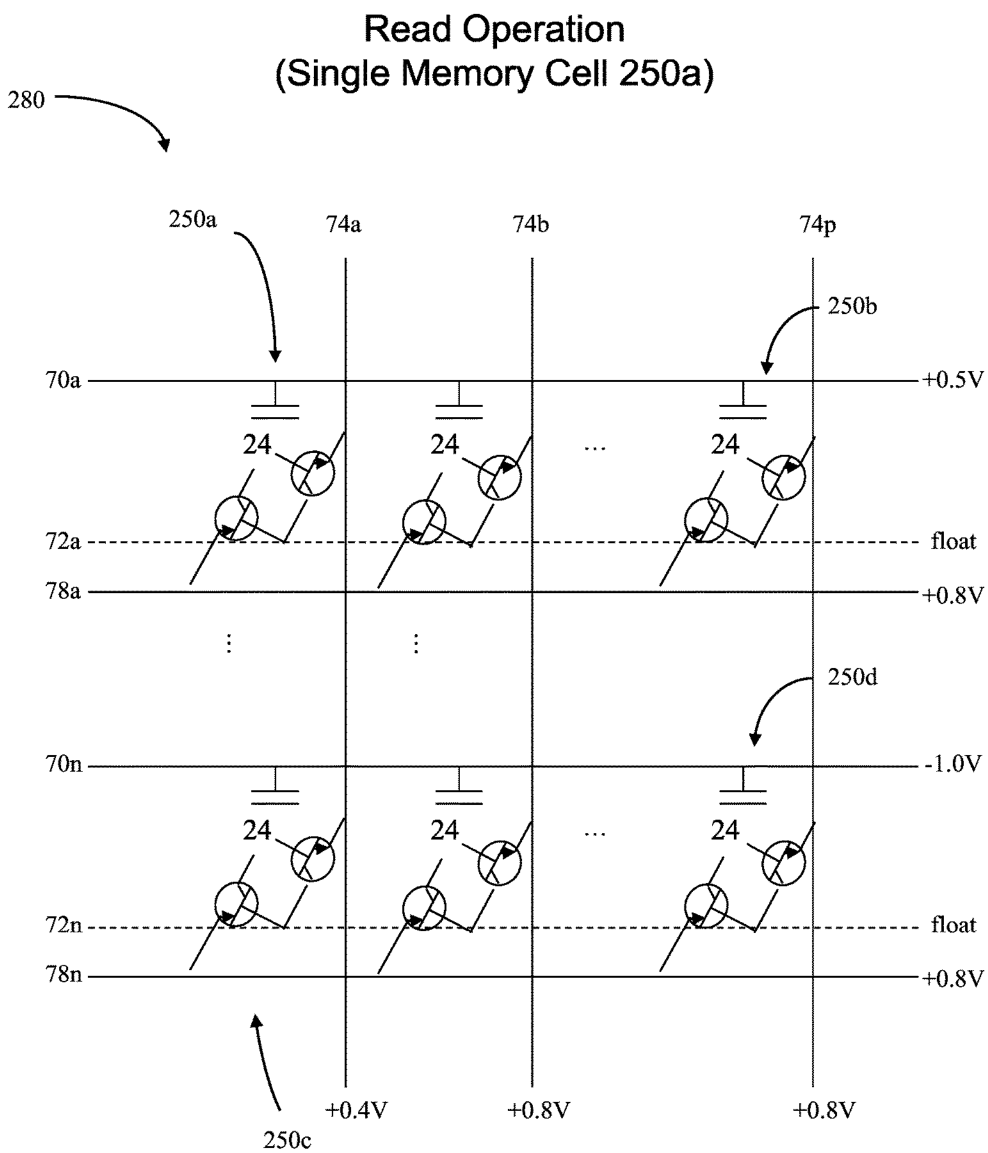

As illustrated in FIG. 87, a read operation can be performed by applying a positive voltage to the substrate terminal 78, a positive voltage (lower than the positive voltage applied to the substrate terminal 78) to BL terminal 74, a positive voltage to WL terminal 70, while leaving SL terminal 72 floating. If cell 250*a* is in a state logic-1 having holes in the body region 24, the silicon controlled rectifier (SCR) device formed by the substrate, buried well, floating body, and the BL junction will be turned on and a higher cell current (flowing from the substrate terminal 78 to the BL terminal 74) is observed compared to when cell 250 is in a state logic-0 having no holes in body region 24. A positive voltage is applied to WL terminal 70*a* to select a row in the memory cell array 80 (e.g., see FIG. 87), while negative voltage is applied to WL terminals 70*b* (not shown) through 70*n* for any unselected rows. The negative voltage applied reduces the potential of floating body 24 through capacitive coupling in the unselected rows and turns off the SCR device of each cell 250 in each unselected row. In one particular non-limiting embodiment, about +0.8 volts is applied to substrate terminals 78*a* through 78*n*, about +0.5 volts is applied to terminal 70*a* (for the selected row), and about +0.4 volts is applied to selected bit line terminal 74*a*, about −1.0 volts is applied to unselected word line terminals 70*b* (not shown) through 70*n*, and about +0.8 volts is applied to unselected bit line terminals 74*b* through 74. However, these voltage levels may vary.

For memory cells sharing the same row as the selected memory cell (e.g. cell 250*b*), both the BL and substrate terminals are positively biased and the SCR is off. Consequently these cells will not be at the holding mode. However, because read operation is accomplished much faster (in the order of nanoseconds) compared to the lifetime of the charge in the floating body 24 (in the order of milliseconds), it should cause little disruption to the charge stored in the floating body.

For memory cells sharing the same column as the selected memory cell (e.g. cell 250*c*), the substrate terminal 78 remains positively biased while the BL terminal 74 is positively biased (at lower positive bias than that applied to the substrate terminal 78). As can be seen, these cells will be at holding mode, where memory cells in state logic-1 will maintain the charge in floating body 24 while memory cells in state logic-0 will remain in neutral state.

For memory cells sharing neither the same row nor the same column as the selected memory cell (e.g. cell 250*d*), both the BL and substrate terminals are positively biased and the SCR is off. Consequently these cells will not be at the holding mode. However, because read operation is accomplished much faster (in the order of nanoseconds) compared to the lifetime of the charge in the floating body 24 (in the order of milliseconds), it should cause little disruptions to the charge stored in the floating body.

Figure 88:
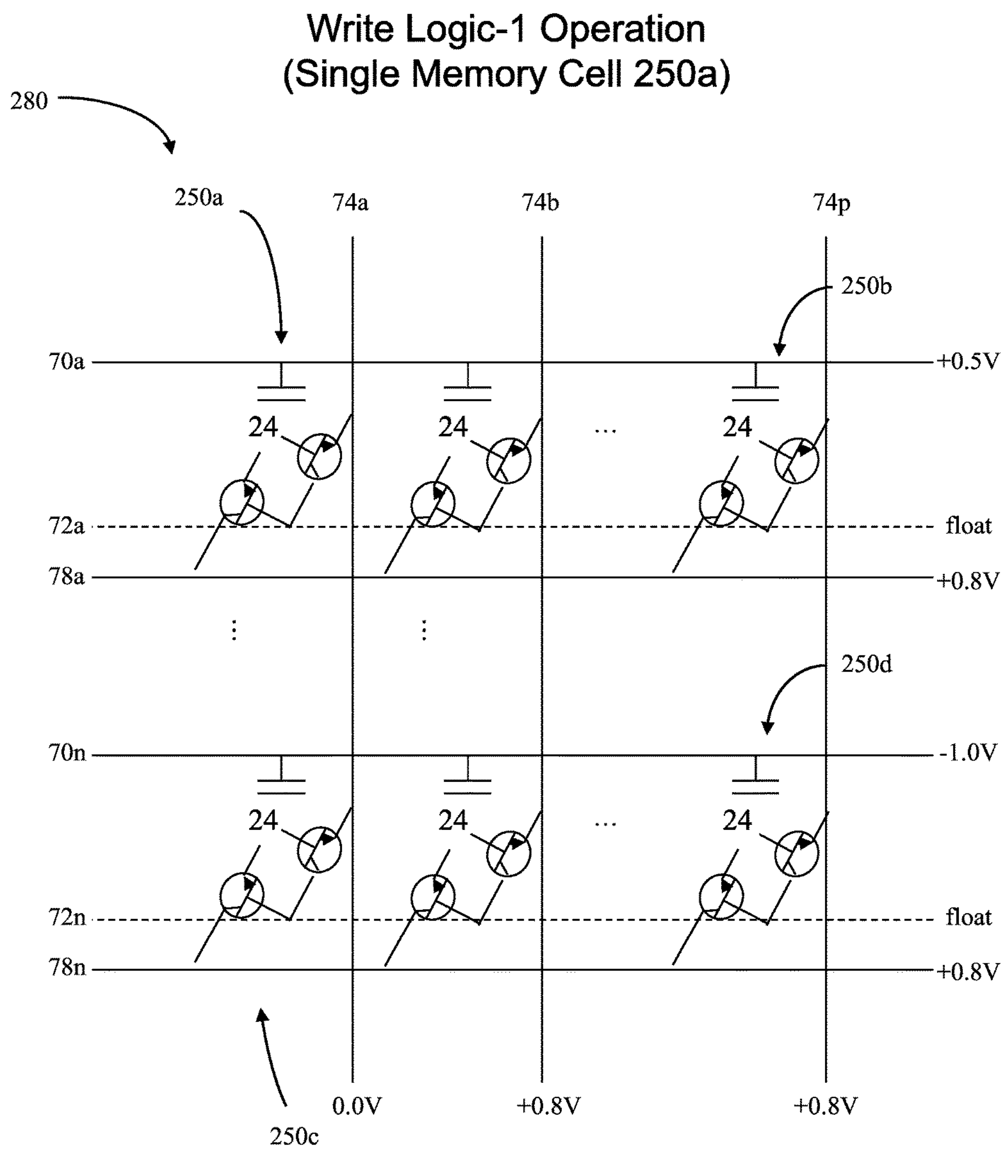

The silicon controlled rectifier device of selected memory cell 250*a* can be put into a state logic-1 (i.e., performing a write logic-1 operation) as described with reference to FIG. 88. The following bias is applied to the selected terminals: zero voltage is applied to BL terminal 74, a positive voltage is applied to WL terminal 70, and a positive voltage is applied to the substrate terminal 78, while SL terminal 72 is left floating. The positive voltage applied to the WL terminal 70 will increase the potential of the floating body 24 through capacitive coupling and create a feedback process that turns the SCR device on. Once the SCR device of cell 250 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +0.8 volts is applied to terminal 78. However, these voltage levels may vary, while maintaining the relative relationships between the voltages applied, as described above, e.g., the voltage applied to terminal 78 remains greater than the voltage applied to terminal 74.

For memory cells sharing the same row as the selected memory cell (e.g. cell 250*b*), the substrate terminal 78 is positively biased. However, because the BL terminal 74 is also positively biased, there is no potential difference between the substrate and BL terminals and the SCR is off. Consequently these cells will not be at the holding mode. However, because the write logic-1 operation is accomplished much faster (in the order of nanoseconds) compared to the lifetime of the charge in the floating body 24 (in the order of milliseconds), it should cause little disruption to the charge stored in the floating body.

For memory cells sharing the same column as the selected memory cell (e.g. cell 250*c*), the substrate terminal 78 remains positively biased while the BL terminal 74 is now grounded. As can be seen, these cells will be at holding mode, where memory cells in state logic-1 will maintain the charge in floating body 24 while memory cells in state logic-0 will remain in neutral state.

For memory cells not sharing the same row nor the same column as the selected memory cell (e.g. cell 250*d*), both the BL and substrate terminals are positively biased and the SCR is off. Consequently these cells will not be at the holding mode. However, because the write logic-1 operation is accomplished much faster (in the order of nanoseconds) compared to the lifetime of the charge in the floating body 24 (in the order of milliseconds), it should cause little disruption to the charge stored in the floating body.

Figure 89:
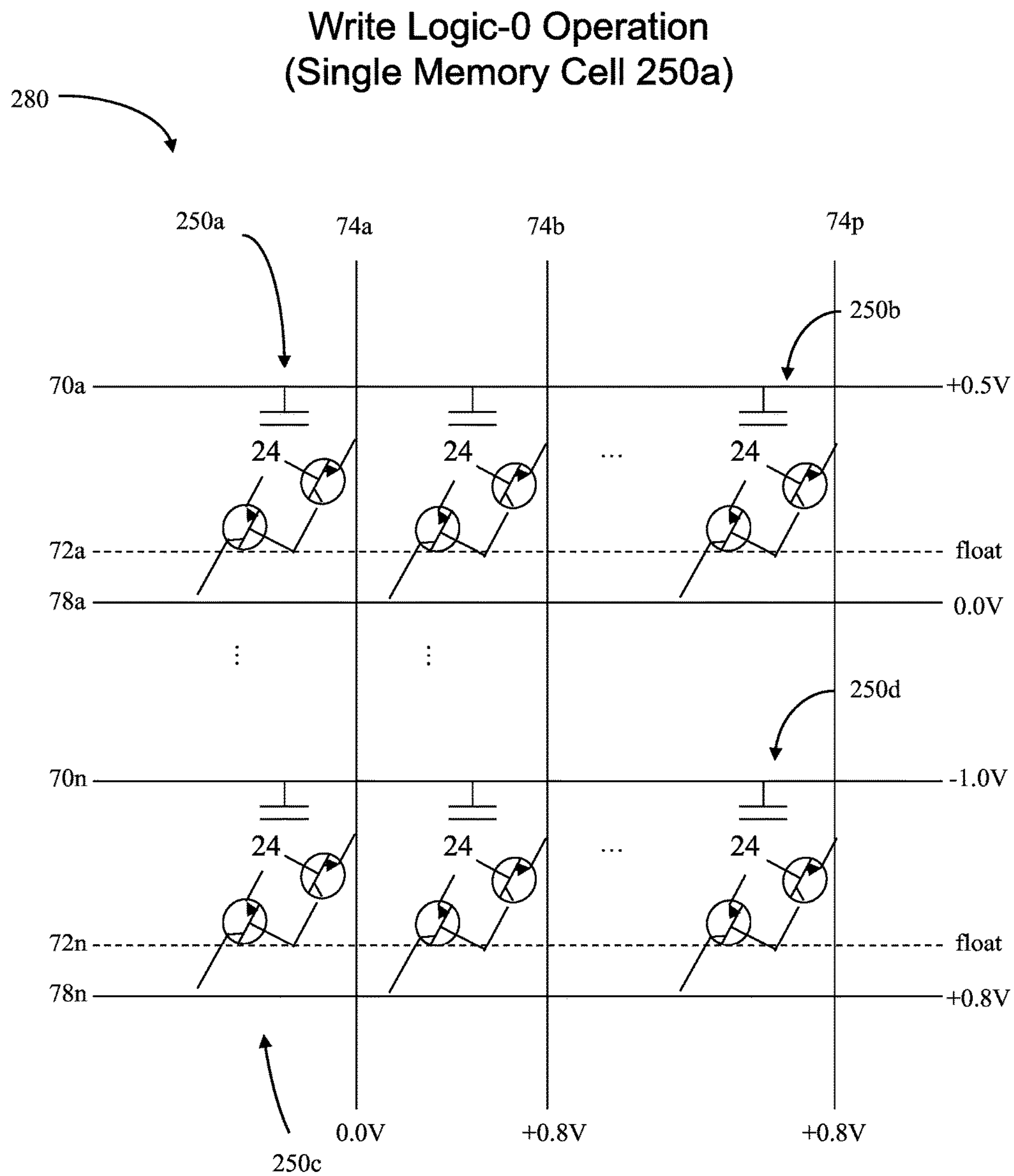

A write logic-0 operation to selected memory cell 250*a* is described with reference to FIG. 89. The silicon controlled rectifier device is set into the blocking (off) mode by applying the following bias: zero voltage is applied to BL terminal 74*a*, a positive voltage is applied to WL terminal 70*a*, and zero voltage is applied to the substrate terminal 78, while leaving SL terminal 72*a* floating. Under these conditions the voltage difference between anode and cathode, defined by the voltages at substrate terminal 78 and BL terminal 74, will become too small to maintain the SCR device in conducting mode. As a result, the SCR device of cell 250*a* will be turned off. In one particular non-limiting embodiment, a voltage of about 0.0 volts is applied to terminal 74, a voltage of about +0.5 volts is applied to terminal 70, and about 0.0 volts is applied to terminal 78. However, these voltage levels may vary, while maintaining the relative relationships between the charges applied, as described above.

For memory cells sharing the same row as the selected memory cell (e.g. cell 250*b*), the substrate terminal 78 is grounded and the SCR will be off. Consequently these cells will not be at the holding mode. However, because write operation is accomplished much faster (in the order of nanoseconds) compared to the lifetime of the charge in the floating body 24 (in the order of milliseconds), it should cause little disruption to the charge stored in the floating body.

For memory cells sharing the same column as the selected memory cell (e.g. cell 250*c*), the substrate terminal 78 is positively biased while the BL terminal 74*a* is now grounded. As can be seen, these cells will be at holding mode, where memory cells in state logic-1 will maintain the charge in floating body 24 while memory cells in state logic-0 will remain in neutral state.

For memory cells sharing neither the same row nor the same column as the selected memory cell (e.g. cell 250*d*), both the BL terminal 74*p* and substrate terminal 78 are positively biased and the SCR is off. Consequently these cells will not be at the holding mode. However, because the write logic-0 operation is accomplished much faster (in the order of nanoseconds) compared to the lifetime of the charge in the floating body 24 (in the order of milliseconds), it should cause little disruption to the charge stored in the floating body.

While one illustrative embodiment and method of use of the SCR operation of memory cell 250 has been described, other embodiments and methods are possible. For example, the first and second conductivity types may be reversed so that the first conductivity type is n-type and the second conductivity is p-type making the SCR a N1-P2-N3-P4 device and reversing the polarity of applied voltages. Voltages given in the various example operations are illustrative only and will vary from embodiment to embodiment as a matter of design choice. While substrate 12 is called a substrate for continuity of terminology and simplicity of presentation, substrate 12 may alternately be a well in either another well or a true substrate in a structure similar to that described in conjunction with FIG. 43B above. By substrate 12 being a well instead of a true substrate, manipulating the voltage level of substrate 12 as required in some SCR operations is facilitated. Many other alternative embodiments and methods are possible, thus the illustrative examples given are not limiting in any way.

A novel semiconductor memory with an electrically floating body memory cell is achieved. The present invention also provides the capability of maintaining memory states employing parallel non-algorithmic periodic refresh operation. As a result, memory operations can be performed in an uninterrupted manner Many embodiments of the present invention have been described. Persons of ordinary skill in the art will appreciate that these embodiments are exemplary only to illustrate the principles of the present invention. Many other embodiments will suggest themselves to such skilled persons after reading this specification in conjunction with the attached drawing figures.

Referring now to FIG. 91, a memory cell 750 according to an embodiment of the present invention is shown. The cell 750 is fabricated on a silicon-on-insulator (SOI) substrate 12 having a first conductivity type (such as p-type conductivity), which consists of buried oxide (BOX) layer 22.

A first region 16 having a second conductivity type, such as n-type, for example, is provided in substrate 12 and is exposed at surface 14. A second region 18 having the second conductivity type is also provided in substrate 12, and is also exposed at surface 14. Additionally, second region 18 is spaced apart from the first region 16 as shown in FIG. 1. First and second regions 16 and 18 may be formed by an implantation process formed on the material making up substrate 12, according to any of implantation processes known and typically used in the art. Alternatively, a solid state diffusion process can be used to form first and second regions 16 and 18.

A floating body region 24 having a first conductivity type, such as p-type conductivity type, is bounded by surface 14, first and second regions 16, 18, buried oxide layer 22, and substrate 12. The floating body region 24 can be formed by an implantation process formed on the material making up substrate 12, or can be grown epitaxially. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Cell 750 further includes word line (WL) terminal 70 electrically connected to gate 60, source line (SL) terminal 72 electrically connected to region 16, bit line (BL) terminal 74 electrically connected to region 18, and substrate terminal 78 electrically connected to substrate 12 at a location beneath insulator 22. A memory array 780 having a plurality of memory cells 750 is schematically illustrated in FIG. 92A.

The operation of a memory cell has been described (and also describes the operation of memory cell 750) for example in “A Capacitor-less 1T-DRAM Cell”, S. Okhonin et al., pp. 85-87, IEEE Electron Device Letters, vol. 23, no. 2, February 2002, which is hereby incorporated herein, in its entirety, by reference thereto. The memory cell states are represented by the charge in the floating body 24. If cell 750 has holes stored in the floating body region 24, then the memory cell 750 will have a lower threshold voltage (gate voltage where transistor is turned on) compared to when cell 750 does not store holes in floating body region 24.

The charge stored in the floating body 24 can be sensed by monitoring the cell current of the memory cell 750. If cell 750 is in a state “1” having holes in the floating body region 24, then the memory cell will have a lower threshold voltage (gate voltage where the transistor is turned on), and consequently a higher cell current (e.g. current flowing from BL to SL terminals), compared to if cell 750 is in a state “0” having no holes in floating body region 24. A sensing circuit/read circuitry 90 typically connected to BL terminal 74 of memory array 780 (e.g., see read circuitry 90 in FIG. 92B) can then be used to determine the data state of the memory cell. Examples of such read operations are described in Yoshida et al., “A Design of a Capacitorless 1T-DRAM Cell Using Gate-Induced Drain Leakage (GIDL) Current for Low-power and High-speed Embedded Memory”, pp. 913-918, International Electron Devices Meeting, 2003 and U.S. Pat. No. 7,301,803 “Bipolar reading technique for a memory cell having an electrically floating body transistor”, both of which are hereby incorporated herein, in their entireties, by reference thereto. An example of a sensing circuit is described in Oshawa et al., "An 18.5 ns 128 Mb SOI DRAM with a Floating body Cell", pp. 458-459, 609, IEEE International Solid-State Circuits Conference, 2005, which is hereby incorporated herein, in its entirety, by reference thereto.

A read operation can be performed by applying the following bias conditions: a positive voltage is applied to the selected BL terminal 74, and a positive voltage greater than the positive voltage applied to the selected BL terminal 74 is applied to the selected WL terminal 70, zero voltage is applied to the selected SL terminal 72, and zero voltage is applied to the substrate terminal 78. The unselected BL terminals will remain at zero voltage, the unselected WL terminals will remain at zero or negative voltage, and the unselected SL terminals will remain at zero voltage.

In one particular non-limiting embodiment, about 0.0 volts is applied to the selected SL terminal 72, about +0.4 volts is applied to the selected terminal 74, about +1.2 volts is applied to the selected terminal 70, and about 0.0 volts is applied to substrate terminal 78. The unselected terminals 74 remain at 0.0 volts, the unselected terminals 70 remain at 0.0 volts, at the unselected SL terminals 72 remain at 0.0 volts. FIG. 93 shows the bias conditions for the selected memory cell 750*a* and unselected memory cells 750*b*, 750*c*, and 750*d* in memory array 780. FIG. 94A also shows and example of bias conditions of the selected memory cell 750*a*. However, these voltage levels may vary.

The bias conditions on unselected memory cells during the exemplary read operation described above with regard to FIG. 93 are shown in FIGS. 94B-94D. The bias conditions for memory cells sharing the same row (e.g. memory cell 750*b*) and those sharing the same column (e.g. memory cell 750*c*) as the selected memory cell 750*a* are shown in FIG. 94B and FIG. 94C, respectively, while the bias condition for memory cells not sharing the same row nor the same column as the selected memory cell 750 (e.g. memory cell 750*d*) is shown in FIG. 94D.

For memory cells sharing the same row as the selected memory cell (e.g. memory cell 750*b*), the WL terminal 70 is positively biased, but because the BL terminal 74 is grounded, there is no potential difference between the BL and SL terminals and consequently these cells are turned off (see FIG. 94B).

For memory cells sharing the same column as the selected memory cell (e.g. memory cell 750*c*), a positive voltage is applied to the BL terminal 74. However, since zero or negative voltage is applied to the unselected WL terminal 70, these memory cells are also turned off (see FIG. 94C).

For memory cells 750 not sharing the same row nor the same column as the selected memory cell (e.g. memory cell 750*d*), both WL and BL terminals are grounded. As a result, these memory cells are turned off (see FIG. 94D).

An exemplary write "0" operation of the cell 750 is now described with reference to FIG. 95. A negative bias is applied to SL terminal 72, zero or negative potential is applied to WL terminal 70, zero voltage is applied to BL terminal 74 and zero voltage is applied to substrate terminal 78. The unselected SL terminal 72 remains grounded. Under these conditions, the p-n junction between floating body 24 and region 16 of the selected cell 750 is forward-biased, evacuating any holes from the floating body 24. In one particular non-limiting embodiment, about −1.2 volts is applied to terminal 72, about 0.0 volts is applied to terminal 70, and about 0.0 volts is applied to terminal 74 and 78.

However, these voltage levels may vary, while maintaining the relative relationship between the applied bias, as described above.

An example of bias conditions of the selected and unselected memory cells 750 during a write "0" operation is illustrated in FIGS. 96A-96B. Because a write "0" operation only involves a negative voltage applied to the selected SL terminal 72, the bias conditions for all the unselected cells are the same. As can be seen, the unselected memory cells will be in a holding operation, with the BL terminal at about 0.0 volts, WL terminal at zero or negative voltage, and the unselected SL terminal at about 0.0 volts.

Alternatively, a write "0" operation can be performed by applying a negative bias to the BL terminal 74 as opposed to the SL terminal 72. The SL terminal 72 will be grounded, while zero voltage is applied to the substrate terminal 78, and zero or negative voltage is applied to the WL terminal 70. Under these conditions, all memory cells sharing the same BL terminal 74 will be written into state "0" as shown in FIG. 97.

The write "0" operation referred to above with regard to FIGS. 95-97 has a drawback in that all memory cells 750 sharing either the same SL terminal 72 or the same BL terminal 74 will be written to simultaneously and as a result, does not allow individual bit writing, i.e. writing to a single cell 750 memory bit. To write multiple data to different memory cells 750, write "0" is first performed on all the memory cells, followed by write "1" operations on a selected bit or selected bits.

An alternative write "0" operation that allows for individual bit writing can be performed by applying a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and region 18 is forward-biased, evacuating any holes from the floating body 24. To reduce undesired write "0" disturb to other memory cells 750 in the memory array 780, the applied potential can be optimized as follows: if the floating body 24 potential of state "1" is referred to $V_{FB1}$, then the voltage applied to the WL terminal 70 is configured to increase the floating body 24 potential by $V_{FB1}/2$ while $-V_{FB1}/2$ is applied to BL terminal 74.

In one particular non-limiting embodiment, the following bias conditions are applied to the selected memory cell 750*a*: a potential of about 0.0 volts to SL terminal 72, a potential of about −0.2 volts to BL terminal 74, a potential of about +0.5 volts is applied to terminal 70, and about 0.0 volts is applied to substrate terminal 78; while about 0.0 volts is applied to unselected SL terminal 72, about 0.0 volts is applied to unselected BL terminal 74, about 0.0 volts is applied to unselected WL terminal 70, and about 0.0 volts is applied to unselected terminal 78. FIG. 98 shows the bias conditions in the above-described example, for the selected and unselected memory cells in memory array 780. However, these voltage levels may vary.

The bias conditions of the selected memory cell 750*a* under the write "0" operation described with regard to FIG. 98 are further elaborated and shown in FIG. 99A. As described, the potential difference between floating body 24 and region 18 (connected to BL terminal 74) is shown in FIG. 99A as having increased, resulting in a forward bias current which evacuates holes from the floating body 24.

Examples of bias conditions on the unselected memory cells 750 during write "0" operations described with regard to FIG. 8 are shown in FIGS. 99B-99D. The bias conditions for memory cells sharing the same row (e.g. memory cell 750*b*) are illustrated in FIG. 99B, and the bias conditions for memory cells sharing the same column (e.g. memory cell 750*c*) as the selected memory cell 750*a* are shown in FIG. 99C, while the bias conditions for memory cells not sharing the same row nor the same column (e.g. memory cell 750*d*) as the selected memory cell 750*a* are shown in FIG. 99D.

The floating body 24 potential of memory cells sharing the same row as the selected memory cell (see FIG. 99B) will increase by $\Delta V_{FB}$ due to capacitive coupling from WL terminal 70. For memory cells in state "0", the increase in the floating body 24 potential is not sustainable as the forward bias current of the p-n diodes formed by floating body 24 and junctions 16 and 18 will evacuate holes from floating body 24. As a result, the floating body 24 potential will return to the initial state "0" equilibrium potential. For memory cells in state "1", the floating body 24 potential will initially also increase by $\Delta V_{FB}$, which will result in holes being evacuated from floating body 24. After the positive bias on the WL terminal 70 is removed, the floating body 24 potential will decrease by $\Delta V_{FB}$. If the initial floating body 24 potential of state "1" is referred to as $V_{FB\ 1}$ the floating body 24 potential after the write "0" operation will become $V_{FB1}$-$\Delta V_{FB}$. Therefore, the WL potential needs to be optimized such that the decrease in floating body potential of memory cells 750 in state "1" is not too large. For example, the maximum floating body potential due to the coupling from the WL potential cannot exceed $V_{FB1}/2$.

For memory cells sharing the same column as the selected memory cell, a negative voltage is applied to the BL terminal 74 (see FIG. 99C), resulting in an increase in the potential difference between floating body 24 and region 18 connected to the BL terminal 74. As a result, the p-n diode formed between floating body 24 and junction 18 will be forward biased. For memory cells in state "0", the increase in the floating body 24 potential will not change the initial state "0" as there is initially no hole stored in the floating body 24. For memory cells in state "1", the net effect is that the floating body 24 potential after write "0" operation will be reduced. Therefore, the BL potential also needs to be optimized such that the decrease in floating body potential of memory cells 750 in state "1" is not too large. For example, a potential of $-V_{FB1}/2$ can be applied to the BL terminal 74.

As to memory cells not sharing the same row nor the same column as the selected memory cell, zero voltage is applied to the SL terminal 72, zero voltage is applied to the BL terminal 74, and zero or negative voltage is applied to WL terminal 70, and zero voltage is applied to substrate terminal 78 (see FIG. 99D). As a result, holes will not be evacuated from floating body region 24.

A write "1" operation can be performed on memory cell 750 through impact ionization as described, for example, in "A New 1T DRAM Cell with Enhanced Floating Body Effect", Lin and Chang, pp. 23-27, IEEE International Workshop on Memory Technology, Design, and Testing, 2006, which was incorporated by reference above, or band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003, which was incorporated by reference above.

An example of the bias conditions of the selected memory cell 750 under a write "1" operation using band-to-band tunneling is illustrated in FIGS. 100 and 101A. The negative bias applied to the WL terminal 70 and the positive bias applied to the BL terminal 74 results in electron tunneling which results in electron flow to the BL terminal 74, generating holes which subsequently are injected to the floating body 24 of the selected memory cell 750. The SL terminal 72 and the substrate terminal 78 are grounded during the write "1" operation.

In one particular non-limiting embodiment, the following bias conditions are applied to the selected memory cell 750*a:* a potential of about 0.0 volts is applied to SL terminal 72, a potential of about +1.2 volts is applied to BL terminal 74, a potential of about −1.2 volts is applied to WL terminal 70, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70, and about 0.0 volts is applied to substrate terminal 78. FIG. 100 shows the bias conditions for the selected and unselected memory cells in memory array 780. However, these voltage levels may vary.

Examples of bias conditions of the unselected memory cells during write "1" operations of the type described above with regard to FIG. 100 are shown in FIGS. 101B-101D. The bias conditions for memory cells sharing the same row (e.g. memory cell 750*b*) are shown in FIG. 101B and the bias conditions for memory cells sharing the same column as the selected memory cell 750*a* (e.g. memory cell 750*c*) are shown in FIG. 101C. The bias conditions for memory cells 750 not sharing the same row nor the same column as the selected memory cell 750*a* (e.g. memory cell 750*d*) are shown in FIG. 101D.

For memory cells sharing the same row as the selected memory cell, both terminals 72 and 74 are grounded, while about −1.2 volts is applied to WL terminal 70 (see FIG. 101B). There is no hole injection into the floating body 24 of memory cell 750*b* as there is not enough potential difference for band-to-band tunneling to occur.

For memory cells sharing the same column as the selected memory cell, a positive voltage is applied to the BL terminal 74 (see FIG. 101C). No hole injection will occur for these memory cells as the WL terminal 70 is being grounded.

For memory cells 750 not sharing the same row or the same column as the selected memory cell, both the SL terminal 72 and the BL terminal 74 remain grounded (see FIG. 101D). Consequently, no write operations will occur to these memory cells.

An example of the bias conditions of the selected memory cell 750 under a write "1" operation using an impact ionization write "1" operation is illustrated in FIGS. 102 and 103A-103D. A positive bias is applied to the selected WL terminal 70, zero voltage is applied to all SL terminals 72, a positive bias applied to the selected BL terminal 74, while the substrate terminal 78 of the selected cell is grounded. These condition cause hole injection to the floating body 24 of the selected memory cell (e.g. cell 750*a* in FIG. 103A).

Figure 103A:
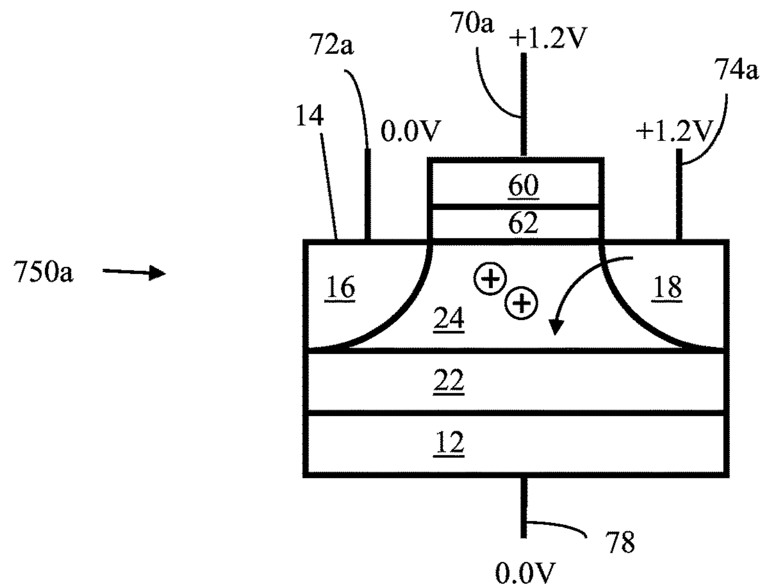
Figure 103B:
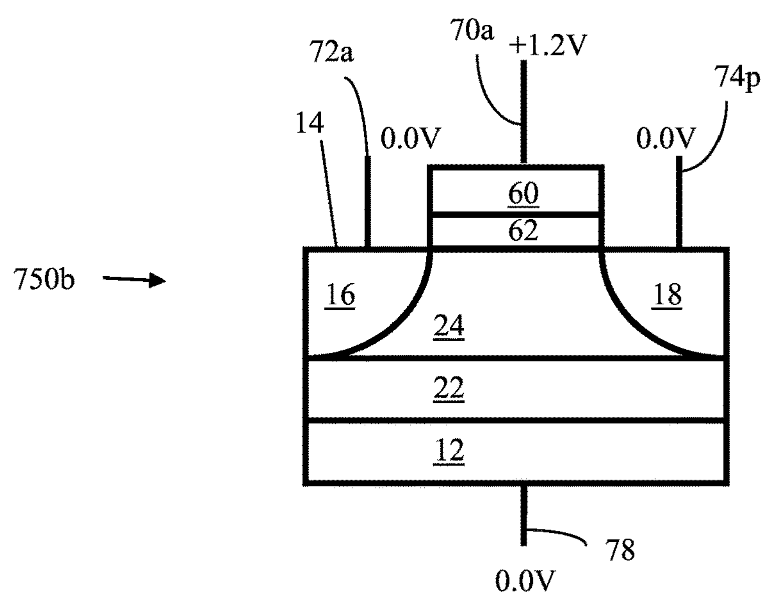
Figure 103C:
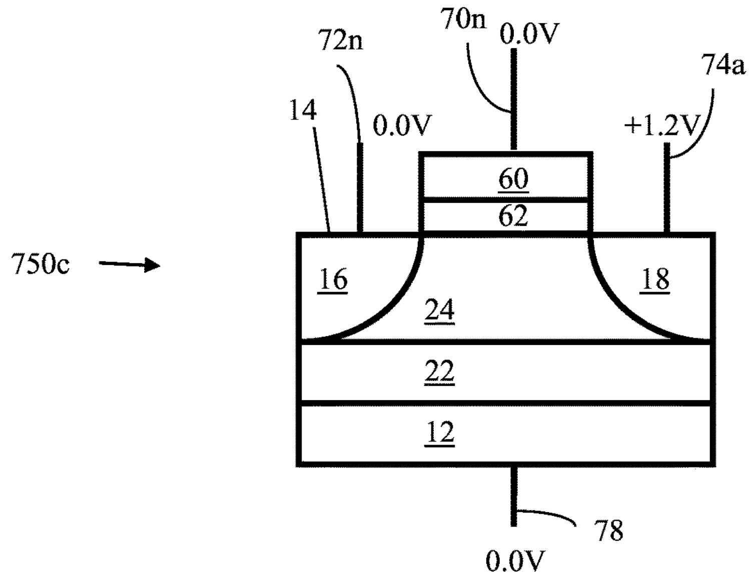
Figure 103D:
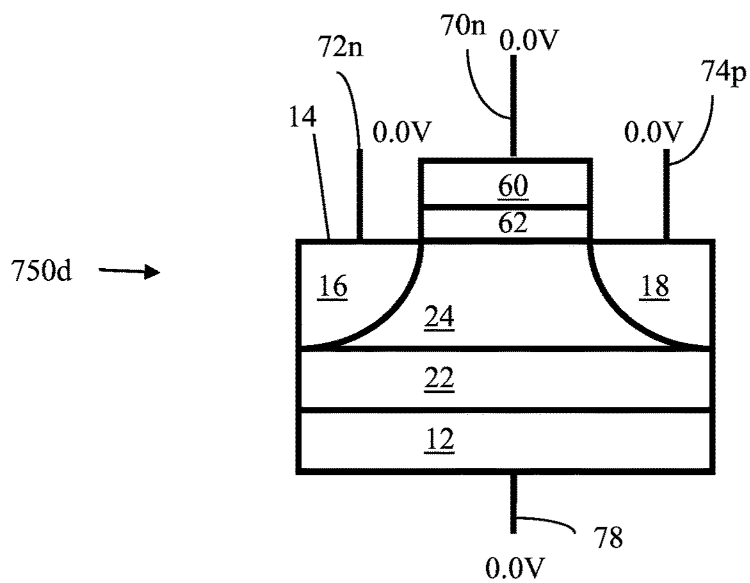

In one particular non-limiting embodiment, the following bias conditions are applied to the selected memory cell 750*a:* a potential of about 0.0 volts is applied to SL terminal 72, a potential of about +1.2 volts is applied to BL terminal 74, a potential of about +1.2 volts is applied to the selected WL terminal 70, and about 0.0 volts is applied to substrate terminal 78; while the following bias conditions are applied to the unselected terminals: about 0.0 volts is applied to unselected SL terminal 72, about 0.0 volts is applied to unselected BL terminal 74, a potential of about 0.0 volts is applied to unselected WL terminal 70, and about 0.0 volts is applied to unselected substrate terminal 78. FIG. 103A shows the bias conditions for the selected memory cell in the example described above. FIG. 103B shows the bias conditions for memory cells sharing the same row as the selected memory cell in the example described above with regard to FIG. 102. FIG. 103C shows the bias conditions for memory cells sharing the same column as the selected memory cell in the example described above with regard to FIG. 102. FIG. 103D shows the bias conditions for memory cells that share neither the same row nor the same column as the selected memory cell in the example described above with regard to FIG. 102. However, these voltage levels may vary.

If floating body region 24 stores a positive charge, the positive charge stored will decrease over time due to the diode leakage current of the p-n junctions formed between the floating body 24 and regions 16 and 18, respectively, and due to charge recombination. A positive bias can be applied to region 16 (connected to SL terminal 72) and/or to region 18 (connected to BL terminal 74), while zero or negative voltage is applied to WL terminal 70 and substrate terminal 78.

In one particular non-limiting embodiment, the following bias conditions are applied to the selected memory cell 750: a potential of about +1.2 volts is applied to SL terminal 72, a potential of about +1.2 volts is applied to BL terminal 74, a potential of 0.0 volts is applied to WL terminal 70, and 0.0 volts is applied to substrate terminal 78. Under these conditions, the p-n junctions formed between the floating body 24 and regions 16 and 18 are reverse biased, improving the lifetime of the positive charge stored in the floating body region 24.

Figure 104:
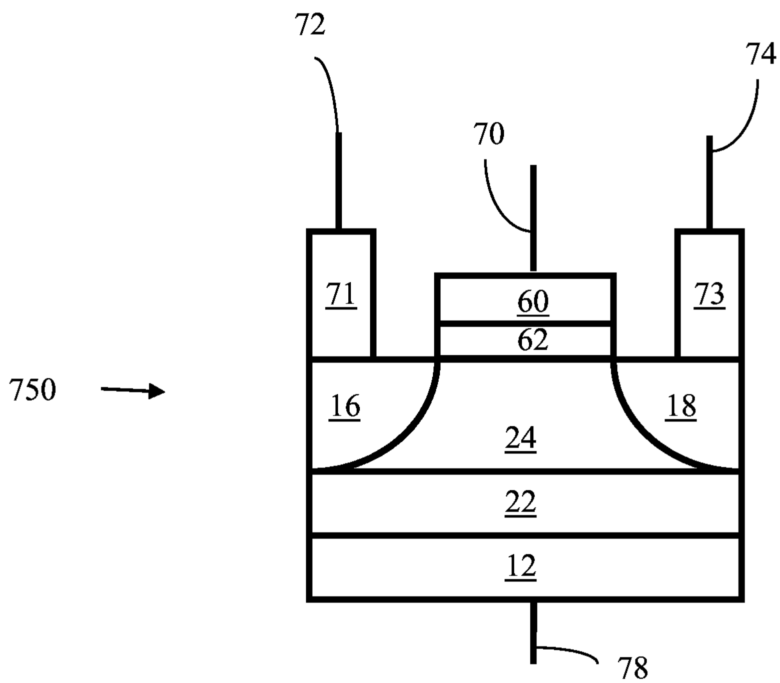

The connection between region 16 of the memory cell 750 and the SL terminal 72 and the connection between region 18 of the memory cell 750 and the BL terminal 74 are usually made through conductive contacts, which for example could be made of polysilicon or tungsten. FIG. 104 shows contact 71 connecting region 16 and the SL terminal 72 and contact 73 connecting region 18 and the BL terminal 74. Many difficulties arise with contact formation. For example, separation between the contact and other electrodes (e.g. the gate electrode or neighboring contacts) must be provided to avoid electrical shorts between neighboring conductive regions. Difficulties related to contact formation and some potential solutions are described for example in U.S. Patent Application Publication No. 2010/0109064, titled "Semiconductor Device and Manufacturing Method Thereof", which is hereby incorporated herein, in its entirety, by reference thereto.

To simplify the manufacturing of the memory cell 750 and to reduce the size of the memory 750, adjacent memory cells can be designed to share a common region 16 (and SL terminal 72) or a common region 18 (and BL terminal 74). For example, as shown in FIG. 105, U.S. Pat. No. 6,937,516, "Semiconductor Device" to Fazan and Okhonin, which is hereby incorporated herein, in its entirety, by reference thereto, shows an arrangement where adjacent memory cells share common contacts 50 and 52. This reduces the number of contacts from two contacts per memory cell (when adjacent contacts are not shared between adjacent memory cells) to where the number of contacts of memory cells in connection equals the number of memory cells plus one. For example, in FIG. 105, the number of interconnected memory cells (the cross section shows memory cells interconnected in the same column) is four and the number of contacts is five.

The present invention provides a semiconductor memory device having a plurality of floating body memory cells which are connected either in series to from a string, or in parallel to form a link. The connections between the memory cells are made to reduce the number of contacts for each memory cell. In some embodiments, connections between control lines, such as source line or bit line, to the memory cells are made at the end or ends of a string or link of several memory cells, such that memory cells not at the end are "contactless" memory cells, because no contacts are provided on these cells to connect them to control lines. Rather, they are in direct contact with other memory cells that they are immediately adjacent to. Because several memory cells are connected either in series or in parallel, a compact memory cell can be achieved.

FIG. 106A shows a cross-sectional schematic illustration of a memory string 500 that includes a plurality of memory cells 750 (750*a*-750*n* in FIG. 106A, although there may be more or fewer cells 750), while FIG. 106B shows a top view of the memory cell array 780, which shows two strings 500 of memory cells 750 between the SL terminal 72 and BL terminal 74. Each memory string 500 includes a plurality of memory cells 750 connected in a NAND architecture, in which the plurality of memory cells 750 are serially connected to make one string of memory cells. In a series connection, the same current flows through each of the memory cells 750, from the BL terminal 74 to the SL terminal 72, or vice versa. String 500 includes "n" memory cells 750, where "n" is a positive integer, which typically ranges between eight and sixty-four (although this number could be lower than eight (as low as two) or higher than sixty-four), and in at least one example, is sixteen. The region 18 of a second conductivity at one end of the memory string is connected to the BL terminal 74, while the source region 16 of a second conductivity at the other end of the memory string is connected to the SL terminal 72. Although FIG. 106B schematically illustrates an array of two strings, it should be noted that the present invention is not limited to two strings.

Each memory cell transistor 750 includes a floating body region 24 of a first conducting type, and first and second regions 20 (corresponding to first and second regions 16 and 18 in the single cell embodiments of cell 750 described above) of a second conductivity type, which are spaced apart from each other and define a channel region. A buried insulator layer 22 isolates the floating body region 24 from the bulk substrate 12. A gate 60 is positioned above the surface of floating body 24 and is in between the first and second regions 20. An insulating layer 62 is provided between gate 60 and floating body 24 to insulate gate 60 from floating body 24. As can be seen in FIGS. 106A-106B, connections to the control lines SL terminal 72 and BL terminal 74 are only made at the ends of the string 500. Connection between SL terminal 72 and region 16 is made through contact 71 and connection between BL terminal 74 and region 18 is made through contact 73. No contacts are made to the regions 20 of the memory cells 750 in memory string 500, resulting in contactless memory cells intermediate of the end memory cells. In some embodiments, the transistors at the end of the string 500 (e.g., cells 750*a* and 750*n* in FIG. 106A) may be configured as access transistors to the memory string 500, wherein the charges stored in the associated floating bodies 24 (in the FIG. 106A example, 24*a* and 24*n*) are not read.

FIG. 107 shows an equivalent circuit representation of the memory array 780 of FIG. 106B. In FIG. 107, the memory cells are arranged in a grid, with the rows of the memory array being defined by the WL terminals 70, while the columns are defined by the BL terminals 74. Within each column, multiple memory cells 750 are serially connected forming the string 500. Adjacent columns are separated by columns of isolation 26 (see FIG. 106B), such as shallow trench isolation (STI).

A read operation is described with reference to FIGS. 108 and 109A-109B. The read operation can be performed by applying the following bias conditions, where memory cell 750*c* is being selected in this example: a positive voltage is applied to the selected BL terminal 74, and a positive voltage greater than the positive voltage applied to the selected BL terminal 74 is applied to the selected WL terminal 70, zero voltage is applied to the selected SL terminal 72, and zero voltage is applied to the substrate terminal 78. The unselected BL terminals 74 will remain at zero voltage and the unselected SL terminals 72 will remain at zero voltage. A positive voltage greater than the positive voltage applied to the selected WL terminal 70*c* is applied to passing WL terminals 70*a*, 70*b*, 70*l*, 70*m*, and 70*n* (see FIGS. 108 and 109A-109B). Passing WL terminals are connected to the gates of the passing cells, i.e. the unselected cells which are serially connected to the selected memory cell 750*c* (e.g. memory cells 750*a*, 750*b*, 750*l*, 750*m*, and 750*n* in FIG. 108). The voltages applied to the gate of the passing cells are such that the passing transistors are turned on, irrespective of the potentials of their floating body regions. The passing cells need to be turned on because in a series connection, the current flows from the BL terminal 74 to SL terminal 72 (or vice versa) thereby flowing through each of the memory cells 750. As a result, the passing cells will pass the potentials applied to the SL terminal 72 and BL terminal 74 to the source and drain regions 20*b* and 20*c* of the selected cell 750*c*. For example, the memory cell 750*n* will pass the voltage applied to the BL terminal 74 to region 20*m* connected to cell 750*n* (and 750*m*), which memory cell 750*m* will subsequently pass to the region 201 connected to cell 750*l*. The adjacent passing memory cells will subsequently pass the voltage applied to BL terminal 74 until the voltage reaches region 20*c* of the selected cell 750*c*.

In one particular non-limiting embodiment, the following bias conditions are applied to the selected memory cell 750*c*: a potential of about 0.0 volts is applied to SL terminal 72, a potential of about +0.4 volts is applied to BL terminal 74, a potential of about +1.2 volts is applied to selected WL terminal 70, about +3.0 volts is applied to passing WL terminals 70, and about 0.0 volts is applied to substrate terminal 78; while the following bias conditions are applied to the unselected terminals: about 0.0 volts is applied to SL terminal 72 (i.e., unselected SL terminal 72 not shown in FIG. 109A), about 0.0 volts is applied to BL terminal 74, a potential of about 0.0 volts is applied to WL terminal 70 that are not passing WL terminals (not shown in FIG. 109A), and about 0.0 volts is applied to substrate terminal 78. FIGS. 108 and 109A-109B show bias condition for the selected and unselected memory cells in memory array 780. However, these voltage levels may vary.

Under these conditions, about +1.2 volts will be applied to the gate 60 of the selected cell 750*c* and about 0.0 volts and 0.4 volts will be passed to the regions 20*b* and 20*c* of the selected cells 750*c*, similar to the read condition described in FIG. 94A. As described, the passing cells are biased so that its channels are conducting, and therefore the current flowing from the BL terminal 74 and SL terminal 72 of the string 500 is then determined by the potential of the floating body region 24 of the selected cell 750*c*. If cell 750*c* is in a state "1" having holes in the floating body region 24, then the memory cell will have a lower threshold voltage (gate voltage where the transistor is turned on), and consequently be conducting a larger current compared to if cell 750*c* is in a state "0" having no holes in floating body region 24.

A sensing circuit/read circuitry 90 typically connected to BL terminal 74 of memory array 780 (e.g., see read circuitry 90 in FIG. 109B) can be used to determine the data state of the memory cell. An example of a sensing circuit is described in Ohsawa et al., "An 18.5 ns 128 Mb SOI DRAM with a Floating body Cell", pp. 458-459, 609, IEEE International Solid-State Circuits Conference, 2005, which is hereby incorporated herein, in its entirety, by reference thereto.

A write "0" operation is described with reference to FIGS. 110-111. Bias conditions shown include: zero voltage applied to the SL terminal 72, zero voltage applied to the WL terminals 70, and negative voltage applied to the BL terminal 74, while the substrate terminal 78 is grounded. Under these conditions, the p-n junctions between floating bodies 24 and regions 20 of the respective memory cells in string 500 are forward-biased, evacuating any holes from each floating body 24. In one particular non-limiting embodiment, about −1.2 volts is applied to terminal 74, about 0.0 volts is applied to terminal 70, about 0.0 volts is applied to terminal 72 and about 0.0 volts is applied to terminal 78. Alternatively, a positive voltage can be applied to the WL terminals 70 to ensure that the negative voltage applied to the BL terminal 74 is passed to all the memory cells in string 500. However, these voltage levels may vary, while maintaining the relative relationship between the charges applied, as described above.

An alternative write "0" operation that allows for individual bit writing is shown in FIGS. 112A-112B. This write "0" operation can be performed by applying a negative voltage to BL terminal 74, zero voltage to SL terminal 72, zero voltage to substrate terminal 78, and a positive voltage to passing WL terminals. The selected WL terminal is initially grounded until the voltages applied to SL terminal 72 and BL terminal 74 reach the regions 20*b* and 20*c*, respectively, of the selected memory cell 750*c*. Subsequently, the potential of the selected WL terminal 70 (70*c* in this example) is raised to a positive voltage higher than the positive voltage applied to passing WL terminals. Under these conditions, a positive voltage will be applied to the gate of the selected memory cell (e.g. memory cell 750*c* in FIGS. 112A-112B) and consequently the floating body 24 potential will increase through capacitive coupling from the positive voltage applied to the WL terminal 70. The passing cells (e.g. memory cell 750*l*, 750*m*, and 750*n*) will pass the negative voltage applied to the BL terminal 74 to the region 20*c* of the memory cell 750*c*, while passing cells 750*a* and 750*b* will pass zero voltage applied to the SL terminal 72 to the region 20*b* of the memory cell 750*c*. Under these conditions, the bias conditions of the selected memory cell 750*c* will be similar to the conditions described in FIG. 99A. As a result of the floating body 24 potential increase and the negative voltage applied to the BL terminal 74, the p-n junction between 24*c* and region 20*c* is forward-biased, evacuating any holes from the floating body 24. To reduce undesired write "0" disturb to other memory cells 750 in the memory array 780, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74. The voltage applied to WL terminal of the passing cells is optimized such that it is high enough to pass the negative voltage applied to the BL terminal 74, but cannot be too high to prevent the potential of the floating body 24 of the passing cells becoming too high, which will result in holes being evacuated from the passing cells that are in state "1". A higher positive voltage can be applied to passing WL terminals passing zero voltage applied to the SL terminal 72 (e.g. passing WL terminals to the left of selected WL terminal 70*c*, i.e. 70*a* and 70*b* in FIG. 112A) than the voltage applied to passing WL terminals passing negative voltage applied to the BL terminal 74 (e.g. passing WL terminals to the right of selected WL terminal 70*c*). This is because the higher voltage applied to terminal 72 (compared to the negative voltage applied to terminal 74) may require a higher passing gate voltage for the passing transistors to be turned on.

In one particular non-limiting embodiment, the following bias conditions are applied to the memory string 500: a potential of about 0.0 volts is applied to SL terminal 72, a potential of about −0.2 volts is applied to BL terminal 74, a potential of about +0.5 volts is applied to selected terminal 70, a potential of about +0.2 volts is applied to passing WL terminals 70 and about 0.0 volts is applied to substrate terminal 78; while about 0.0 volts is applied to unselected SL terminal 72, about 0.0 volts is applied to unselected BL terminal 74, about 0.0 volts is applied to unselected (but not passing) WL terminal 70, and about 0.0 volts is applied to unselected terminal 78. FIG. 112A shows the bias conditions for the selected and passing memory cells in selected memory string 500, while FIG. 112B shows the bias conditions for selected and unselected memory cells in memory array 780 where memory cell 750*c* is the selected cell. However, these voltage levels may vary.

Under these bias conditions, a positive voltage will be applied to the gate 60 of the selected cell 750*c*, while a negative voltage applied to the BL terminal 74 will be passed to the region 20*c* of the selected cell 750*c*, and zero voltage applied to the SL terminal 72 will be passed to the region 20*b* of the selected cell 750*c*. This condition is similar to the condition described in FIG. 99A, which will result in hole evacuation out of the floating body 24 of the cell 750*c*.

A write "1" operation can be performed on memory cell 750 through impact ionization as described for example in Lin et al., "A New IT DRAM Cell with Enhanced Floating Body Effect", pp. 23-27, IEEE International Workshop on Memory Technology, Design, and Testing, 2006, which was incorporated by reference above, or by a band-to-band tunneling mechanism, as described for example in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003, which was incorporated by reference above.

An example of bias conditions of a selected memory cell 750 during a band-to-band tunneling write "1" operation is illustrated in FIGS. 113A and 113B. A negative bias is applied to the selected WL terminal 70, a positive voltage is applied to the passing WL terminals 70, zero voltage is applied to the SL terminal 72 (and to all SL terminals 72), and a positive bias is applied to the selected BL terminal 74 (zero voltage is applied to unselected BL terminals 74), while the substrate terminal 78 is grounded. These conditions cause hole injection to the floating body 24 of the selected memory cell (e.g. cell 750*c* in FIGS. 113A-113B).

In one particular non-limiting embodiment, the following bias conditions are applied to the selected memory string 500: a potential of about 0.0 volts is applied to SL terminal 72, a potential of about +1.2 volts is applied to BL terminal 74, a potential of about −1.2 volts is applied to the selected WL terminal 70, about +3.0 volts is applied to the passing WL terminals 70, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to unselected (but not passing) WL terminal 70 (not shown in FIG. 113B), and about 0.0 volts is applied to substrate terminal 78. FIG. 113A shows the bias conditions for the selected and passing memory cells in selected memory string 500, while FIG. 113B shows the bias conditions for the selected and unselected memory cells in memory array 780, where memory cell 750*c* is the selected cell. However, these voltage levels may vary.

Under these bias conditions, a negative voltage will be applied to the gate 60 of the selected cell 750*c*, while a positive voltage applied to the BL terminal 74 will be passed to the region 20*c* of the selected cell 750*c*, and zero voltage applied to the SL terminal 72 will be passed to the region 20*b* of the selected cell 750*c*. This condition is similar to the condition described in FIG. 101A, which will result in hole injection to the floating body 24 of the cell 750*c*.

An example of the bias conditions of the selected memory cell 750 under an impact ionization write "1" operation is illustrated in FIGS. 114A-114B. A positive bias is applied to the selected WL terminal 70, a positive voltage more positive than the positive voltage applied to the selected WL terminal 70 is applied to the passing WL terminals 70, zero voltage is applied to the SL terminal 72 (both the selected SL terminal 72 as well as all other SL terminals 72), and a positive bias is applied to the selected BL terminal 74 (zero voltage is applied to the unselected BL terminals 74), while the substrate terminal 78 is grounded. These conditions cause hole injection to the floating body 24 of the selected memory cell (e.g. cell 750*c* in FIGS. 114A-114B).

In one particular non-limiting embodiment, the following bias conditions are applied to the selected memory string 500: a potential of about 0.0 volts is applied to SL terminal 72, a potential of about +1.2 volts is applied to BL terminal 74, a potential of about +1.2 volts is applied to the selected WL terminal 70, about +3.0 volts is applied to the passing WL terminals 70, and about 0.0 volts is applied to substrate terminal 78; while the following bias conditions are applied to the unselected terminals (i.e., terminals in strings other than the string that the selected cell is in): about 0.0 volts is applied to SL terminal 72, about 0.0 volts is applied to BL terminal 74, a potential of about 0.0 volts is applied to WL terminal 70 (not shown in FIG. 114B), and about 0.0 volts is applied to substrate terminal 78. FIG. 114A shows the bias conditions for the selected and passing memory cells in selected memory string 500, while FIG. 114B shows bias conditions for selected and unselected memory cells in memory array 780 (with memory cell 750*c* as the selected cell). However, these voltage levels may vary.

A multi-level write operation can be performed using an alternating write and verify algorithm, where a write pulse is first applied to the memory cell 750, followed by a read operation to verify if the desired memory state has been achieved. If the desired memory state has not been achieved, another write pulse is applied to the memory cell 750, followed by another read verification operation. This loop is repeated until the desired memory state is achieved.

For example, using band-to-band hot hole injection, a positive voltage is applied to BL terminal 74, zero voltage is applied to SL terminal 72, a negative voltage is applied to the selected WL terminal 70, a positive voltage is applied to the passing WL terminals, and zero voltage is applied to the substrate terminal 78. Positive voltages of different amplitudes are applied to BL terminal 74 to write different states to floating body 24. This results in different floating body potentials 24 corresponding to the different positive voltages or the number of positive voltage pulses that have been applied to BL terminal 74. In one particular non-limiting embodiment, the write operation is performed by applying the following bias conditions: a potential of about 0.0 volts is applied to SL terminal 72, a potential of about −1.2 volts is applied to the selected WL terminal 70, about +3.0 volts is applied to the passing WL terminals, and about 0.0 volts is applied to substrate terminal 78, while the potential applied to BL terminal 74 is incrementally raised. For example, in one non-limiting embodiment, 25 millivolts is initially applied to BL terminal 74, followed by a read verify operation. If the read verify operation indicates that the cell current has reached the desired state (i.e. cell current corresponding to whichever state of states 00, 01, 10 or 11 is desired is achieved), then the multi write operation is concluded. If the desired state is not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary. The write operation is followed by a read operation to verify the memory state.

The string 500 may be provided as planar cells, such as the embodiments described above with reference to FIGS. 91 and 106A, or may be provided as fin-type, three-dimensional cells, such as those illustrated in FIGS. 115A-115B, for example. Other variations, modifications and alternative cells 750 may be provided without departing from the scope of the present invention and its functionality.

Referring now to FIG. 23 above, a memory cell 150 according to an embodiment of the present invention is shown. The cell 150 is fabricated on a bulk substrate 12 having a first conductivity type (such as p-type conductivity). A buried layer 22 of a second conductivity type (such as n-type conductivity) is also provided in the substrate 12 and buried in the substrate 12, as shown. Buried layer 22 may be formed by an ion implantation process on the material of substrate 12. Alternatively, buried layer 22 can be grown epitaxially.

A first region 16 having the second conductivity type is provided in substrate 12 and first region 16 is exposed at surface 14. A second region 18 having the second conductivity type is also provided in substrate 12, is also exposed at surface 14 and is spaced apart from the first region 16. First and second regions 16 and 18 may be formed by an implantation process formed on the material making up substrate 12, according to any of implantation processes known and typically used in the art. Alternatively, a solid state diffusion process can be used to form first and second regions 16 and 18.

A floating body region 24 having a first conductivity type, such as p-type conductivity type, is bounded by surface 14, first and second regions 16, 18, insulating layers 26, and buried layer 22. Insulating layers 26 (e.g., shallow trench isolation (STI)), may be made of silicon oxide, for example. Insulating layers 26 insulate cell 150 from neighboring cells 150 when multiple cells 150 are joined in an array 180. The floating body region 24 can be formed by an implantation process formed on the material making up substrate 12, or can be grown epitaxially. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Cell 150 further includes word line (WL) terminal 70 electrically connected to gate 60, source line (SL) terminal 72 electrically connected to region 16, bit line (BL) terminal 74 electrically connected to region 18, buried well (BW) terminal 76 connected to buried layer 22, and substrate terminal 78 electrically connected to substrate 12 at a location beneath insulator 22.

The operation of a memory cell 150 has been described for example in Ranica et al., "Scaled 1T-Bulk Devices Built with CMOS 90 nm Technology for Low-cost eDRAM Applications", pp. 38-41, Tech. Digest, Symposium on VLSI Technology, 2005 and application Ser. No. 12/797,334, titled "Method of Maintaining the State of Semiconductor Memory Having Electrically Floating Body Transistor", both of which are hereby incorporated herein, in their entireties, by reference thereto.

Memory cell states are represented by the charge in the floating body 24. If cell 150 has holes stored in the floating body region 24, then the memory cell 150 will have a lower threshold voltage (gate voltage where transistor is turned on) compared to when cell 150 does not store holes in floating body region 24.

As shown in FIG. 25 above, inherent in this embodiment of the memory cell 150 are n-p-n bipolar devices 130*a*, 130*b* formed by buried well region 22, floating body 24, and SL and BL regions 16, 18. A holding operation can be performed by utilizing the properties of the n-p-n bipolar devices 130*a*, 130*b* through the application of a positive back bias to the BW terminal 76 while grounding terminal 72 and/or terminal 74. If floating body 24 is positively charged (i.e. in a state "1"), the bipolar transistor 130*a* formed by SL region 16, floating body 24, and buried well region 22 and bipolar transistor 130*b* formed by BL region 18, floating body 24, and buried well region 22 will be turned on.

A fraction of the bipolar transistor current will then flow into floating region 24 (usually referred to as the base current) and maintain the state "1" data. The efficiency of the holding operation can be enhanced by designing the bipolar devices 130*a*, 130*b* formed by buried well layer 22, floating region 24, and regions 16/18 to be a low-gain bipolar device, where the bipolar gain is defined as the ratio of the collector current flowing out of BW terminal 76 to the base current flowing into the floating region 24.

For memory cells in state "0" data, the bipolar devices 130*a*, 130*b* will not be turned on, and consequently no base hole current will flow into floating region 24. Therefore, memory cells in state "0" will remain in state "0".

An example of the bias conditions applied to cell 150 to carry out a holding operation includes: zero voltage is applied to BL terminal 74, zero voltage is applied to SL terminal 72, zero or negative voltage is applied to WL terminal 70, a positive voltage is applied to the BW terminal 76, and zero voltage is applied to substrate terminal 78. In one particular non-limiting embodiment, about 0.0 volts is applied to terminal 72, about 0.0 volts is applied to terminal 74, about 0.0 volts is applied to terminal 70, about +1.2 volts is applied to terminal 76, and about 0.0 volts is applied to terminal 78. However, these voltage levels may vary.

FIG. 116A shows an energy band diagram of the intrinsic n-p-n bipolar device 130 when the floating body region 24 is positively charged and a positive bias voltage is applied to the buried well region 22. The dashed lines indicate the Fermi levels in the various regions of the n-p-n transistor 130. The Fermi levels are located in the band gap between the solid line 17 indicating the top of the valance band (the bottom of the band gap) and the solid line 19 indicating the bottom of the conduction band (the top of the band gap). The positive charge in the floating body region 24 lowers the energy barrier of electron flow into the floating body region 24 (i.e., the base region of the n-p-n bipolar device). Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. This process restores the charge on floating body 24 to its maximum level and will maintain the charge stored in the floating body region 24 which will keep the n-p-n bipolar transistor 130 on for as long as a positive bias is applied to the buried well region 22 through BW terminal 76.

If floating body 24 is neutrally charged (the voltage on floating body 24 being equal to the voltage on grounded bit line region 16), a state corresponding to state "0", the bipolar device will not be turned on, and consequently no base hole current will flow into floating region 24. Therefore, memory cells in the state "0" will remain in the state "0".

FIG. 116B shows an energy band diagram of the intrinsic n-p-n bipolar device 130 when the floating body region 24 is neutrally charged and a bias voltage is applied to the buried well region 22. In this state the energy level of the band gap bounded by solid lines 17A and 19A is different in the various regions of n-p-n bipolar device 130. Because the potential of the floating body region 24 and the bit line region 16 are equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 130 will remain off.

Although the embodiment discussed in FIGS. 25, 116A and 116B refers to bipolar devices 130 as n-p-n transistors, persons of ordinary skill in the art will readily appreciate that by reversing the first and second connectivity types and inverting the relative values of the applied voltages memory cell 150 could include a bipolar device 130 which is a p-n-p transistor. Thus the choice of an n-p-n transistor as an illustrative example for simplicity of explanation in FIGS. 25, 116A and 116B is not limiting in any way. In addition, the discussions in regard to FIGS. 25, 116A and 116B use bipolar device 130*b* formed by bit line region 18, floating body region 24, and buried well region 22, and the same principles also apply to bipolar device 130*a* formed by source line region 16, floating body region 24 and buried well region 22.

The charge stored in the floating body 24 can be sensed by monitoring the cell current of the memory cell 150. If cell 150 is in a state "1" having holes in the floating body region 24, then the memory cell will have a lower threshold voltage (gate voltage where the transistor is turned on), and consequently a higher cell current (e.g. current flowing from BL to SL terminals), compared to if cell 150 is in a state "0" having no holes in floating body region 24. Examples of the read operation is described in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003; Ohsawa et al., "An 18.5 ns 128 Mb SOI DRAM with a Floating body Cell", pp. 458-459, 609, IEEE International Solid-State Circuits Conference, 2005; and U.S. Pat. No. 7,301,803 "Bipolar reading technique for a memory cell having an electrically floating body transistor", which are hereby incorporated herein, in their entireties, by reference thereto.

A read operation can be performed on cell 150 by applying the following bias conditions: zero voltage is applied to the BW terminal 76, zero voltage is applied to SL terminal 72, a positive voltage is applied to the selected BL terminal 74, and a positive voltage greater than the positive voltage applied to the selected BL terminal 74 is applied to the selected WL terminal 70, while zero voltage is applied to substrate terminal 78. When cell 150 is in an array 180 of cells 150 (e.g., see FIG. 117), the unselected BL terminals 74 will remain at zero voltage and the unselected WL terminals 70 will remain at zero or negative voltage. In one particular non-limiting embodiment, about 0.0 volts is applied to terminal 72, about +0.4 volts is applied to the selected terminal 74*a*, about +1.2 volts is applied to the selected terminal 70*a*, about 0.0 volts is applied to terminal 76, and about 0.0 volts is applied to terminal 78, as illustrated in FIG. 117.

A write "0" operation of the cell 150 is now described with reference to FIG. 118. In this example, to write "0" to cell 150, a negative bias is applied to SL terminal 72, zero voltage is applied to BL terminal 74, zero or negative voltage is applied to WL terminal 70, zero or positive voltage is applied to BW terminal 76, and zero voltage is applied to substrate terminal 78. The SL terminal 72 for the unselected cells 150 that are not commonly connected to the selected cell 150*a* will remain grounded. Under these conditions, the p-n junctions (junction between 24 and 16) are forward-biased, evacuating any holes from the floating body 24. In one particular non-limiting embodiment, about −1.2 volts is applied to terminal 72, about 0.0 volts is applied to terminal 74, about 0.0 volts is applied to terminal 70, about 0.0 volts is applied to terminal 76, and about 0.0 volts is applied to terminal 78. However, these voltage levels may vary, while maintaining the relative relationships between the charges applied, as described above. Under these conditions, all memory cells sharing the same SL terminal 72 will be written into state "0".

A write "0" operation can also be performed by applying a negative bias to the BL terminal 74 as opposed to the SL terminal 72. The SL terminal 72 will be grounded, while zero or positive voltage is applied to BW terminal 76, zero voltage is applied to the substrate terminal 78, and zero or negative voltage is applied to the WL terminal 70. Under these conditions, all memory cells sharing the same BL terminal 74 will be written into state "0".

The write "0" operations referred to above with regard to FIG. 118 have a drawback in that all memory cells 150 sharing either the same SL terminal 72 or the same BL terminal 74 will be written to simultaneously and as a result, these operations do not allow individual bit writing, i.e. writing to a single cell 150 memory bit. To write multiple data to different memory cells 150, write "0" is first performed on all the memory cells, followed by write "1" operations on a selected bit or selected bits.

An alternative write "0" operation, which, unlike the previous write "0" operations described above with regard to FIG. 118, allows for individual bit write, can be performed by applying a positive voltage to WL terminal 70, a negative voltage to BL terminal 74, zero or positive voltage to SL terminal 72, zero or positive voltage to BW terminal 76, and zero voltage to substrate terminal 78, an example of which is illustrated in FIG. 119. Under these conditions, the floating body 24 potential will increase through capacitive coupling from the positive voltage applied to the WL terminal 70. As a result of the floating body 24 potential increase and the negative voltage applied to the BL terminal 74, the p-n junction (junction between 24 and 18) is forward-biased, evacuating any holes from the floating body 24. The applied bias to selected WL terminal 70 and selected BL terminal 74 can potentially affect the states of the unselected memory cells 150 sharing the same WL or BL terminal as the selected memory cell 150. To reduce undesired write "0" disturb to other memory cells 150 in the memory array 180, the applied potential can be optimized as follows: if the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. This will minimize the floating body 24 potential change in the unselected cells 150 in state "1" sharing the same BL terminal as the selected cell 150 from $V_{FB1}$ to $V_{FB1}/2$. For memory cells 150 in state "0" sharing the same WL terminal as the selected cell 150, unless the increase in floating body 24 potential is sufficiently high (i.e., at least $V_{FB}/3$, see below), then both n-p-n bipolar devices 130*a* and 130*b* will not be turned on, or so that the base hold current is low enough that it does not result in an increase of the floating body 24 potential over the time during which the write operation is carried out (write operation time). It has been determined according to the present invention that a floating body 24 potential increase of $V_{FB}/3$ is low enough to suppress the floating body 24 potential increase. A positive voltage can be applied to SL terminal 72 to further reduce the undesired write "0" disturb on other memory cells 150 in the memory array. The unselected cells will remain at holding state, i.e. zero or negative voltage applied to WL terminal 70 and zero voltage applied to BL terminal 74.

In one particular non-limiting embodiment, for the selected cell 150 a potential of about 0.0 volts is applied to terminal 72, a potential of about −0.2 volts is applied to terminal 74, a potential of about +0.5 volts is applied to terminal 70, about 0.0 volts is applied to terminal 76, and about 0.0 volts is applied to terminal 78. For the unselected cells not sharing the same WL terminal or BL terminal with the selected memory cell 150, about 0.0 volts is applied to terminal 72, about 0.0 volts is applied to terminal 74, about 0.0 volts is applied to terminal 70, about 0.0 volts is applied to terminal 76, and about 0.0 volts is applied to terminal 78. FIG. 119 shows the aforementioned bias conditions for the selected memory cell 150 and other cells 150 in the array 180. However, these voltage levels may vary.

A write "1" operation can be performed on memory cell 150 through impact ionization as described for example in Lin et al., "A New 1T DRAM Cell with Enhanced Floating Body Effect", pp. 23-27, IEEE International Workshop on Memory Technology, Design, and Testing, 2006, which was incorporated by reference above, or a band-to-band tunneling mechanism, as described for example in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003, which was incorporated by reference above.

An example of the bias conditions of the selected memory cell 150 under a band-to-band tunneling write "1" operation is illustrated in FIG. 120A. The negative bias applied to the WL terminal 70 (70*a* in FIG. 120A) and the positive bias applied to the BL terminal 74 (74*a* in FIG. 120A) results in hole injection to the floating body 24 of the selected memory cell 150 (150*a* in FIG. 120A). The SL terminal 72 (72*a* in FIG. 120A) and the substrate terminal 78 (78*a* in FIG. 120A) are grounded during the write "1" operation, while zero or positive voltage can be applied to BW terminal 76 (76*a* in FIG. 120A) (positive voltage can be applied to maintain the resulting positive charge on the floating body 24 as discussed in the holding operation above). The unselected WL terminals 70 (70*n* in FIG. 31A) and unselected BL terminals 74 (74*n* in FIG. 120A) will remain grounded.

In one particular non-limiting embodiment, the following bias conditions are applied to the selected memory cell 150*a*: a potential of about 0.0 volts is applied to SL terminal 72, a potential of about +1.2 volts is applied to BL terminal 74, a potential of about −1.2 volts is applied to WL terminal 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70, about 0.0 volts is applied to BW terminal 76 (or +1.2 volts so that unselected cells are in the holding operation) and about 0.0 volts is applied to substrate terminal 78. FIG. 120A shows the bias condition for the selected memory cell 150. However, these voltage levels may vary.

FIG. 120B shows bias conditions of the selected (150*a*) and unselected (150*b*, 150*c*, 150*d*) memory cells 150 during an impact ionization write "1" operation. A positive voltage is applied to the selected WL terminal 70 (i.e., 70*a* in FIG. 120B) and a positive voltage is applied to the selected BL terminal 74 (i.e., 74*a* in FIG. 120B), with the SL terminal 72 (i.e., 72*a* in FIG. 120B), the BW terminal 76 (i.e., 76*a* in FIG. 120B), and the substrate terminal 78 (i.e., 78*a* in FIG. 120B) are grounded. This condition results in a lateral electric field in the channel region sufficient to create hot electrons, which subsequently create electron and hole pairs, with the holes being subsequently injected to the floating body region 24 of the selected memory cell. The unselected WL terminals 70 and unselected BL terminals 74 are grounded, while the unselected BW terminal can be grounded or a positive voltage can be applied thereto to maintain the states of the unselected cells.

In one particular non-limiting embodiment, the following bias conditions are applied to the selected memory cell 150*a*: a potential of about 0.0 volts is applied to SL terminal 72, a potential of about +1.2 volts is applied to BL terminal 74, a potential of about +1.2 volts is applied to WL terminal 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70, about 0.0 volts is applied to BW terminal 76 (or +1.2 volts so that unselected cells are in the holding operation) and about 0.0 volts is applied to substrate terminal 78. FIG. 120B shows the bias conditions for the selected memory cell 150. However, these voltage levels may vary.

FIG. 121A shows a cross-sectional schematic illustration of a memory string 520 that includes a plurality of memory cells 150 connected in series, while FIG. 121B shows a top view of a memory cell array 180, which shows two strings of memory cells 520 between the SL terminal 72 and BL terminal 74. Although FIG. 121B schematically illustrates an array of two strings, it should be noted that the present invention is not limited to two strings, as one string, or more than two string can be made in the same manner as described. Each memory string 520 includes a plurality of memory cells 150 connected in a NAND architecture, in which the plurality of memory cells 150 are serially connected to make one string of memory cells. In a series connection, the same current flows through each of the memory cells 150, from the BL terminal 74 to the SL terminal 72, or vice versa. String 520 includes "n" memory cells 150, where "n" is a positive integer, which typically ranges between 8 and 64, and in at least one example, is 16. However, string 520 could have less than eight cells (as low as two) or greater than sixty-four cells. The region 18 of a second conductivity at one end of the memory string is connected to the BL terminal 74, while the source region 16 of a second conductivity at the other end of the memory string is connected to the SL terminal 72.

Each memory cell transistor 150 includes a floating body region 24 of a first conducting type, and first and second regions 20 (corresponding to first and second regions 16 and 18 in the single cell embodiments of cell 150 described above) of a second conductivity type, which are spaced apart from each other and define a channel region. Regions 20 of adjacent memory cells within a string 520 are connected together by the conducting region 64.

A buried layer 22 isolates the floating body region 24 from the bulk substrate 12, while insulating layers 26 isolate the floating body region 24 between adjacent memory cells 150. A gate 60 is positioned above the surface of floating body 24 and is in between the first and second regions 20. An insulating layer 62 is provided between gate 60 and floating body 24 to insulate gate 60 from floating body 24.

FIG. 121C shows an equivalent circuit representation of a memory array 180 that includes strings 520*a* and 520*b* as well as additional strings. In FIG. 121C, the memory cells are arranged in a grid, with the rows of the memory array 180 being defined by the WL terminals 70, while the columns are defined by the BL terminals 74. Within each column, multiple memory cells 150 are serially connected forming the string 520. Adjacent columns are separated by columns of isolation, such as shallow trench isolation (STI).

The memory cell operations of memory string 520 will be described as follows. As will be seen, the operation principles of this embodiment of the memory string 520 will follow the operation principles of memory string 500 described above, where the back bias terminal 76 available in memory string 520 can be used to perform holding operation. In some embodiments, the transistors at the end of the string 520 (e.g., cells 150*a* and 150*n* in FIG. 121A) may be configured as access transistors to the memory string 520, wherein the charges stored in the associated floating bodies 24 (floating bodies 24*a* and 24*n* in the example of FIG. 121A) are not read.

A read operation is described with reference to FIGS. 122, 123A and 123B. The read operation can be performed by applying the following bias conditions, where memory cell 150*c* within the memory string 520*a* is being selected (as shown in FIG. 122): a positive voltage is applied to the selected BL terminal 74, and a positive voltage greater than the positive voltage applied to the selected BL terminal 74 is applied to the selected WL terminal 70, zero voltage is applied to the selected SL terminal 72, zero or positive voltage is applied to BW terminal 76, and zero voltage is applied to the substrate terminal 78. The unselected BL terminals 74 will remain at zero voltage and the unselected SL terminals 72 will remain at zero voltage as shown in FIG. 123A. A positive voltage greater than the positive voltage applied to the selected WL terminal 70*c* is applied to passing WL terminals 70*a*, 70*b*, 70*l*, 70*m*, and 70*n* (see FIGS. 122 and 123A-123B). Passing WL terminals are connected to the gates of the passing cells, i.e. the unselected cells which are serially connected to the selected memory cell 150*c* (e.g. memory cells 150*a*, 150*b*, 150*l*, 150*m*, and 150*n* in FIG. 122). The voltages applied to the gates of the passing cells are such that the passing transistors are turned on, irrespective of the potentials of their floating body regions. The passing cells need to be turned on because in a series connection, the current flows from the BL terminal 74 to the SL terminal 72 (or vice versa) wherein current flows through each of the memory cells 150. As a result, the passing cells will pass the potentials applied to the SL terminal 72 and BL terminal 74 to the source and drain regions 20*b* and 20*c* of the selected cell 150*c*. For example, the memory cell 150*n* will pass the voltage applied to the BL terminal 74 to region 20*m* connected to cell 150*n* (and 150*m*), which memory cell 150*m* will subsequently pass to the region 201 connected to cell 150*l*, etc. The adjacent passing memory cells sequentially pass the voltage applied to BL terminal 74 until it reaches region 20*c* of the selected memory cell 50*c*.

In one particular non-limiting embodiment, the following bias conditions are applied to the selected memory cell 150: a potential of about 0.0 volts is applied to SL terminal 72, a potential of about +0.4 volts is applied to BL terminal 74, a potential of about +1.2 volts is applied to selected WL terminal 70, about +3.0 volts is applied to passing WL terminals 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70 (but not passing WL terminal), about 0.0 volts is applied to BW terminal 76 (or +1.2 volts is applied to BW terminal 76 to maintain the states of the unselected memory cells), and about 0.0 volts is applied to substrate terminal 78. FIGS. 123A-123B show the bias conditions for the selected and unselected memory cells in memory array 180. However, these voltage levels may vary.

Under these conditions, about +1.2 volts will be applied to the gate 60*c* and about 0.0 volts and 0.4 volts will be passed to the regions 20*b* and 20*c* of the selected cell 150*c*, similar to the read condition described in FIG. 117. As described, the passing cells are biased so that their channels are conducting, and therefore the current flowing from the BL terminal 74 and SL terminal 72 of the string 520 is then determined by the potential of the floating body region 24 of the selected cell 150*c*. If cell 150*c* is in a state "1" having holes in the floating body region 24, then the memory cell will have a lower threshold voltage (gate voltage where the transistor is turned on), and consequently be conducting a larger current compared to if cell 150 is in a state "0" having no holes in floating body region 24.

The current flow from the BL terminal 74 to SL terminal 72 can then be measured or sensed using a read circuitry 90 attached to BL terminal 74 as illustrated in FIG. 123B. The memory state can then be determined by comparing it with a reference value generated by a reference generator circuitry 92 coupled to a reference cell in memory string 520R as shown in FIG. 123B.

A write "0" operation is described with reference to FIGS. 124-125, where the following bias conditions are applied: zero voltage to the SL terminal 72, zero voltage to the WL terminals 70, and negative voltage to the BL terminal 74, while the BW terminal 76 and substrate terminal 78 are grounded. Under these conditions, the p-n junctions between floating body 24 and regions 20 of the memory cells in string 520 are forward-biased, evacuating any holes from the floating bodies 24. In one particular non-limiting embodiment, about −1.2 volts is applied to terminal 74, about 0.0 volts is applied to terminal 70, and about 0.0 volts is applied to terminals 72, 76, and 78. A positive voltage can also be applied to the WL terminals 70 to ensure that the negative voltage applied to the BL terminal 74 is passed to all the memory cells in string 520. However, these voltage levels may vary, while maintaining the relative relationships between the charges applied, as described above.

An alternative write "0" operation that allows for individual bit writing is illustrated in FIGS. 126-127 and can be performed by applying a negative voltage to BL terminal 74, zero voltage to SL terminal 72, zero voltage to BW terminal 76, zero voltage to substrate terminal 78, and a positive voltage to passing WL terminals. The selected WL terminal is initially grounded until the voltages applied to SL terminal 72 and BL terminal 74 reach the regions 20*b* and 20*c*, respectively, of selected memory cell 150*c*. Subsequently, the potential of the selected WL terminal 70 is raised to a positive voltage higher than the positive voltage applied to passing WL terminals. Under these conditions, a positive voltage will be applied to the gate of the selected memory cell (e.g. memory cell 150*c* in FIGS. 126-127) and consequently the floating body 24 potential will increase through capacitive coupling from the positive voltage applied to the WL terminal 70. The passing cells (e.g. memory cell 150*l*, 150*m*, and 150*n*) will pass the negative voltage applied to the BL terminal 74 to the region 20*c* of the memory cell 150*c*, while passing cells 150*a* and 150*b* will pass zero voltage applied to the SL terminal 72 to the region 20*b* of the memory cell 150*c*, similar to the conditions described in regard to FIG. 119. As a result of the floating body 24 potential increase and the negative voltage applied to the BL terminal 74, the p-n junction between floating body region 24*c* and region 20*c* is forward-biased, evacuating any holes from the floating body 24. To reduce undesired write "0" disturb to other memory cells 150 in the memory array 180, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74. The voltage applied to WL terminal of the passing cells is optimized such that it is high enough to pass the negative voltage applied to the BL terminal 74, but cannot be too high to prevent the potential of the floating body 24 of the passing cells becoming too high, which will result in holes being evacuated from the passing cells that are in state "1". A higher positive voltage can be applied to passing WL terminals passing zero voltage applied to the SL terminal 72 (e.g. passing WL terminals to the left of selected WL terminal 70*c*, i.e. 70*a* and 70*b* in FIG. 126) than the voltage applied to passing WL terminals passing negative voltage applied to the BL terminal 74 (e.g. passing WL terminals to the right of selected WL terminal 70*c*). This is because the higher voltage applied to terminal 72 (compared to the negative voltage applied to terminal 74) may require a higher passing gate voltage for the passing transistors to be turned on.

In one particular non-limiting embodiment, the following bias conditions are applied to the memory string 520: a potential of about 0.0 volts to SL terminal 72, a potential of about −0.2 volts to BL terminal 74, a potential of about +0.5 volts is applied to selected terminal 70, a potential of about +0.2 volts is applied to passing WL terminals 70, about 0.0 volts is applied to BW terminal 76, and about 0.0 volts is applied to substrate terminal 78; while about 0.0 volts is applied to unselected SL terminal 72, about 0.0 volts is applied to unselected BL terminal 74, about 0.0 volts is applied to BW terminal 76 (or +1.2 volts is applied to BW terminal 76 to maintain the states of the unselected memory cells), about 0.0 volts is applied to unselected (but not passing) WL terminal 70, and about 0.0 volts is applied to unselected terminal 78. FIGS. 126-127 show the bias conditions for the selected and unselected memory cells in memory array 180 where memory cell 150*c* is the selected cell. However, these voltage levels may vary.

Under these bias conditions, a positive voltage will be applied to the gate 60 of the selected cell 150*c*, while a negative voltage applied to the BL terminal 74 will be passed to the region 20*c* of the selected cell 150*c*, and zero voltage applied to the SL terminal 72 will be passed to the region 20*b* of the selected cell 150*c*. This condition is similar to the condition described in regard to FIG. 119, and results in hole evacuation out of the floating body 24*c* of the cell 150*c*.

A write "1" operation can be performed on memory cell 150 through impact ionization as described for example in Lin et al., "A New 1T DRAM Cell with Enhanced Floating Body Effect", pp. 23-27, IEEE International Workshop on Memory Technology, Design, and Testing, 2006, which was incorporated by reference above, or a write "1" operation can be performed through a band-to-band tunneling mechanism, as described for example in Yoshida et al., "A Design of a Capacitorless 1T-DRAM Cell Using Gate-Induced Drain Leakage (GIDL) Current for Low-power and High-speed Embedded Memory", pp. 913-918, International Electron Devices Meeting, 2003, which was incorporated by reference above.

An example of bias conditions on a selected memory cell 150 under a band-to-band tunneling write "1" operation is illustrated in FIGS. 128 and 129. A negative bias is applied to the selected WL terminal 70, a positive voltage is applied to the passing WL terminals 70, zero voltage is applied to the SL terminal 72, and a positive bias applied to the BL terminal 74, zero voltage is applied to the BW terminal 76, while the substrate terminal 78 is grounded. This condition results in hole injection to the floating body 24 of the selected memory cell (e.g. cell 150*c* in FIGS. 128-129).

In one particular non-limiting embodiment, the following bias conditions are applied to the selected memory cell 150*c*: a potential of about 0.0 volts is applied to SL terminal 72, a potential of about +1.2 volts is applied to BL terminal 74, a potential of about −1.2 volts is applied to the selected WL terminal 70, about +3.0 volts is applied to the passing WL terminals 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70 (but not passing WL terminal), about 0.0 volts is applied to BW terminal 76 (or +1.2 volts is applied to maintain the states of the unselected memory cells), and about 0.0 volts is applied to substrate terminal 78. FIG. 129 shows the bias conditions for the selected and unselected memory cells in memory array 180 where memory cell 150*c* is the selected cell. However, these voltage levels may vary.

Under these bias conditions, a negative voltage will be applied to the gate 60 of the selected cell 150*c,* while a positive voltage applied to the BL terminal 74 will be passed to the region 20*c* of the selected cell 150*c,* and zero voltage applied to the SL terminal 72 will be passed to the region 20*b* of the selected cell 150*c*. This condition is similar to the condition described in FIG. 120A, and results in hole injection to the floating body 24*c* of the cell 150*c*.

An example of the bias conditions on the selected memory cell 150 under an impact ionization write "1" operation is illustrated in FIGS. 130A-130B. A positive bias is applied to the selected WL terminal 70, a positive voltage more positive than the positive voltage applied to the selected WL terminal 70 is applied to the passing WL terminals 70, zero voltage is applied to the SL terminal 72, a positive bias is applied to the BL terminal 74, and zero voltage is applied to BW terminal 76, while the substrate terminal 78 is grounded. These conditions result in hole injection to the floating body 24 of the selected memory cell (e.g. cell 150*c* in FIGS. 130A-130B).

In one particular non-limiting embodiment, the following bias conditions are applied to the selected memory cell 150*c:* a potential of about 0.0 volts is applied to SL terminal 72, a potential of about +1.2 volts is applied to BL terminal 74, a potential of about +1.2 volts is applied to the selected WL terminal 70, about +3.0 volts is applied to the passing WL terminals 70, about 0.0 volts is applied to BW terminal 76, and about 0.0 volts is applied to substrate terminal 78; while the following bias conditions are applied to the unselected terminals: about 0.0 volts is applied to SL terminal 72, about 0.0 volts is applied to BL terminal 74, a potential of about 0.0 volts is applied to WL terminal 70 (but not passing WL terminal), about 0.0 volts is applied to BW terminal 76 (or +1.2 volts is applied to BW terminal 76 to maintain the states of the unselected memory cells), and about 0.0 volts is applied to substrate terminal 78. FIG. 130B shows the bias conditions for the selected and unselected memory cells in memory array 180 (with memory cell 150*c* as the selected cell). However, these voltage levels may vary.

A multi-level write operation can be performed using an alternating write and verify algorithm, where a write pulse is first applied to the memory cell 150, followed by a read operation to verify if the desired memory state has been achieved. If the desired memory state has not been achieved, another write pulse is applied to the memory cell 150, followed by another read verification operation. This loop is repeated until the desired memory state is achieved.

For example, using band-to-band hot hole injection, a positive voltage is applied to BL terminal 74, zero voltage is applied to SL terminal 72, a negative voltage is applied to the selected WL terminal 70, a positive voltage is applied to the passing WL terminals, zero voltage is applied to the BW terminal 76 and zero voltage is applied to the substrate terminal 78. Positive voltages of different amplitudes are applied to BL terminal 74 to write different states to floating body 24. This results in different floating body potentials 24 corresponding to the different positive voltages or the number of positive voltage pulses that have been applied to BL terminal 74. In one particular non-limiting embodiment, the write operation is performed by applying the following bias conditions: a potential of about 0.0 volts is applied to SL terminal 72, a potential of about −1.2 volts is applied to the selected WL terminal 70, about +3.0 volts is applied to the passing WL terminals, about 0.0 volts is applied to BW terminal 76, and about 0.0 volts is applied to substrate terminal 78, while the potential applied to BL terminal 74 is incrementally raised. For example, in one non-limiting embodiment, 25 millivolts is initially applied to BL terminal 74, followed by a read verify operation. If the read verify operation indicates that the cell current has reached the desired state (i.e. cell current corresponding to whichever state of 00, 01, 10 or 11 is the desired state has been achieved), then the multi write operation is concluded. If the desired state has not been achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary. The write operation is followed by a read operation to verify the memory state.

The string 520 may be constructed from a plurality of planar cells, such as the embodiments described above with reference to FIGS. 23 and 121A, or may be constructed from fin-type, three-dimensional cells, such as illustrated in FIGS. 32-33 above. Other variations, modifications and alternative cells 150 may be provided without departing from the scope of the present invention and its functionality.

Another embodiment of memory array 880 is described with reference to FIGS. 131A-131B, where FIG. 131A shows a top view of the memory array 880 consisting of two strings of memory cells 540 between the SL terminal 72 and BL terminal 74, and FIG. 131B shows the cross section of a memory string 540. Although FIG. 131A schematically illustrates an array of two strings, it should be noted that the present invention is not limited to two strings, as more than two, or even only one string could be provided.

Each memory string 540 of array 880 includes a plurality of memory cells 850 connected in a NAND architecture, in which the plurality of memory cells 850 are serially connected to make one string of memory cells. String 540 includes "n" memory cells 850, where "n" is a positive integer, which typically ranges between 8 and 64, and in at least one example, is 16. However, this embodiment, like the embodiment above is not limited to the stated range, as fewer than eight or more than sixty-four cells could be included in a string. The region 18 of a second conductivity at one end of the memory string is connected to the BL terminal 74 through contact 73, while the source region 16 of a second conductivity at the other end of the memory string is connected to the SL terminal 72 through contact 71. In some embodiments, the transistors at the ends of the string 540 (e.g., cells 850*a* and 850*n* in the example of FIG. 131B) may be configured as access transistors to the memory string 540, and charged stored in the associated floating bodies 24 (24*a* and 24*n* in the example of FIG. 131B) are not read.

Referring to FIG. 131B, the memory cell 850 includes a substrate 12 of a first conductivity type, such as p-type, for example. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by region 16 (or region 18 or region 20) of the second conductivity type and insulating layer 62, on the sides by region 16 (or region 18 or region 20) of the second conductivity type and insulating layers 30 and 26 (like, for example, shallow trench isolation (STI)), may be made of silicon oxide, for example. Insulating layer 30 and the region 16 (or region 18 or region 20) of the second conductivity type insulate the floating body region 24 along the I-I' direction as shown in FIG. 131B, while insulating layer 28 insulates the floating body region 24 along the II-II' direction as shown in FIG. 131A.

Regions 16, 18, and 20 having a second conductivity type, such as n-type, for example, are provided in substrate 12 and are exposed at surface 14. Regions 16, 18, and 20 may be formed by an implantation process formed on the material making up substrate 12, according to any implantation process known and typically used in the art. Alternatively, a solid state diffusion process could be used to form regions 16, 18, and 20. Although regions 16, 18, and 20 have the same conductivity type (for example n-type), the dopant concentration forming these regions can be (but need not necessarily be) different. In FIGS. 131A and 131B, regions 16 and 18 are located at the ends of the memory string 540, while regions 20 are located inside the memory string 540, isolating adjacent floating body regions 24 of adjacent memory cells 850.

A gate 60 is positioned above the surface of floating body 24 and is in between the first and second regions 20 (or between region 16 and region 20 or between region 18 and region 20). The gate 60 is insulated from floating body region 24 by an insulating layer 62.

Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Memory string 540 further includes word line (WL) terminals 70 electrically connected to gates 60, source line (SL) terminal 72 electrically connected to region 16, bit line (BL) terminal 74 electrically connected to region 18, buried layer (BW) terminal 76 connected to buried layer 22, and substrate terminal 78 electrically connected to substrate 12.

The BW terminal 76 connected to the buried layer region 22 serves as a back bias terminal, i.e. a terminal at the back side of a semiconductor transistor device, usually at the opposite side of the gate of the transistor.

A method of manufacturing memory array 880 will be described with reference to FIGS. 132A-132U. These figures are arranged in groups of three related views, with the first figure of each group being a top view of memory cell 850, the second figure of each group being a vertical cross section of the top view in the first figure of the group designated I-I', and the third figure of each group being a vertical cross section of the top view in the first figure of the group designated II-II'.

Turning now to FIGS. 132A through 132C, the first steps of the process can be seen starting with growing a thick conductive region 202 comprised of a different material from the materials forming the substrate region 12. The conductive region 202 can be selectively etched without removing the substrate region 12. For example, the conductive region 202 could be made of silicon germanium (SiGe) material, while substrate 12 could be made of silicon, although materials for both of these layers may vary.

As shown in FIGS. 132D through 132F, a pattern 30' covering the areas to become insulator region 30 (as shown in the final structures in FIGS. 132S through 132U) is formed using a lithography process. The conductive region 202 is then etched following the lithography pattern.

Referring to FIGS. 132G through 132I, a conductive region 204 comprising for example the same material forming the substrate 12 is grown (like, for example, silicon). A chemical mechanical polishing step can then be performed to polish the resulting films so that the silicon surface is flat. Subsequently, a thin layer of silicon oxide 206 is grown on the surface of film 204. This is followed by a deposition of a polysilicon layer 208 and then silicon nitride layer 210.

Next, a pattern is formed for use in opening the areas to become insulator regions 28. The pattern can be formed using a lithography process. This is then followed by dry etching of the silicon nitride layer 210, polysilicon layer 208, silicon oxide layer 206, and silicon layer 204, creating trench 212, as shown in FIGS. 132J and 132L (trenches 212 are not visible in the view of FIG. 132K).

A wet etch process that selectively removes the region 202 is then performed, leaving gaps that are mechanically supported by region 204 The resulting gap regions are then oxidized to form buried oxide regions 30 as shown in FIGS. 132N and 132O. Subsequently, the remaining silicon nitride layer 210, polysilicon layer 208, and silicon oxide layer 206 are then removed, followed by a silicon oxide deposition process and a chemical mechanical polishing step to planarize the resulting silicon oxide film, resulting in the silicon oxide insulator region 28 as shown in FIGS. 132M and 132O. Alternatively, the silicon deposition step can be performed prior to the removal of the silicon nitride layer 210, polysilicon layer 208 and silicon oxide layer 206.

Referring to FIGS. 132P through 132R, an ion implantation step is next performed to form the buried layer region 22. Subsequently a silicon oxide layer (or high-dielectric material layer) 62 is formed on the silicon surface (FIGS. 132Q-132R), followed by polysilicon (or metal) layer 214 deposition (FIGS. 132Q-132R).

A pattern covering the area to be made into gate 60 is next made, such as by using a lithography process. The pattern forming step is followed by dry etching of the polysilicon (or metal) layer 214 and silicon oxide (or high dielectric materials) layer 62. An ion implantation step is then performed to form the regions 20 of the second conductivity type (e.g. n-type). The conductive region 204 underneath the gate region 60 is protected from the ion implantation process and is now bounded by regions 20, insulating layer 30 and insulating layer 28 on the sides, and by buried layer 22 from the substrate 12, and by insulating layer 62 at the surface, forming the floating body region 24 (see FIG. 132T). This is then followed by backend process to form contact and metal layers (not shown in figures).

Another embodiment of memory array is shown as memory array 980 in FIG. 133, wherein memory array 980 comprises a link connecting a plurality of memory cells 950 in parallel. FIG. 134A shows a top view of memory cell 950 in isolation, with FIGS. 134B and 134C showing sectional views of the memory cell 950 taken along lines I-I' and II-II', respectively.

Referring to FIGS. 134B and 134C together, the cell 950 is fabricated on silicon on insulator (SOI) substrate 12 of a first conductivity type such as a p-type, for example. Substrate 12 is typically made of silicon, but may also comprise, for example, germanium, silicon germanium, gallium arsenide, carbon nanotubes, or other semiconductor materials. A buried insulator layer 22, such as buried oxide (BOX), is provided in the substrate 12.

A floating body region 24 of the first conductivity type, such as p-type, for example, is bounded on top by insulating layer 62, on the sides by regions 20 of a second conductivity type and insulating layers 26, and on the bottom by buried layer 22. Insulating layers 26 (like, for example, shallow trench isolation (STI)), may be made of silicon oxide, for example. Insulating layers 26 insulate cell 950 from neighboring cells 950 when multiple cells 950 are joined in an array 980 to make a memory device as illustrated in FIGS. 133 and 135.

Regions 20 having a second conductivity type, such as n-type, for example, are provided in substrate 12 and are exposed at surface 14. Regions 20 may be formed by an implantation process formed on the material making up substrate 12, according to any implantation process known and typically used in the art. Alternatively, a solid state diffusion process could be used to form regions 20.

A gate 60 is positioned above the floating body region 24 and regions 20. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Region 20 is continuous (electrically conductive) in the direction along the II-II' direction (referring to FIG. 134A) and can be used to connect several memory cells 950 in parallel as shown in the equivalent circuit representation of the memory array 980 in FIGS. 47 and 49 (where regions 20 are connected to bet line (BL) terminals 74. Connections between regions 20 and bit line (BL) terminals 74*a* and 74*b* can be made through contacts 73 at the edge of the parallel connections (see FIG. 133). An adjacent pair of continuous regions 20 can be used to connect a link of cells 950 in parallel. Cell 950 further includes word line (WL) terminal 70 electrically connected to gate 60 and substrate terminal 78 electrically connected to substrate 12 (see FIGS. 134B-134C). In a parallel connection, the voltage applied to the BL terminals 74 is about the same across all memory cells 950 (small differences might occur due to voltage drop along the bit lines) and the current will only flow through the selected memory cell 950.

Because it is possible to minimize the number of connections to BL terminals by making them only at the edge of the parallel connections, the number of contacts can be reduced, for example to two contacts, for each parallel connection. No contacts are made to the regions 20 of the memory cells 950 that are not at the edge of the parallel connections in memory array 980, resulting in contactless memory cells in locations that are not at the edge (end). The number of contacts can be increased to reduce the resistance of the parallel connections if desired.

A read operation is described with reference to FIGS. 136-137, where memory cell 950*b* is being selected (as shown in FIG. 136). The following bias conditions may be applied: a positive voltage is applied to BL terminal 74*b*, zero voltage is applied to BL terminal 74*c*, a positive voltage is applied to WL terminal 70*b*, and zero voltage is applied to substrate terminal 78. The unselected BL terminals (e.g. BL terminal 74*a*, 74*d*, . . . , 74*p* in FIG. 136) are left floating, the unselected WL terminals (e.g. WL terminal 70*a*, 70*m*, 70*n* in FIG. 136) will remain at zero voltage, and the unselected substrate terminal 78 will remain at zero voltage. Alternatively, the unselected BL terminals to the right of BL terminal 74*c* (where zero voltage is applied to) can be grounded. A positive voltage of the same amplitude as that applied to BL terminal 74*b* can be applied to the unselected BL terminals to the left of BL terminal 74*b*. Because the region 20*b* (connected to BL terminal 74*b*) is shared with the adjacent cell 950*a*, the unselected BL terminals to the left of BL terminal 74*b* (where a positive voltage is applied to) need to be left floating or have a positive voltage applied thereto to prevent any parasitic current flowing from BL terminal 74*b* to the BL terminals to the left of BL terminal 74*b*. Alternatively, the bias conditions on BL terminals 74*b* and 74*c* (connected to regions 20 of the selected memory cell 950*b*) may be reversed.

In one particular non-limiting embodiment, the following bias conditions are applied to the selected memory cell 950*b*: a potential of about +0.4 volts is applied to BL terminal 74*b*, a potential of about 0.0 volts is applied to BL terminal 74*c*, a potential of about +1.2 volts is applied to WL terminal 70*b*, and about 0.0 volts is applied to substrate terminal 78; while the following bias conditions are applied to the unselected terminals: about 0.0 volts is applied to unselected WL terminals, about 0.0 volts is applied to unselected substrate terminals, while the unselected BL terminals are left floating.

As shown in FIG. 137, about +1.2 volts are applied to the gate 60*b*, about 0.4 volts are applied to the region 20*b* (connected to BL terminal 74*b*), about 0.0 volts are applied to region 20*c* (connected to BL terminal 74*c*), and about 0.0 volts are applied to substrate 12 of selected memory cell 950*b*. The current flowing from BL terminal 74*b* to BL terminal 74*c* will then be determined by the potential of the floating body region 24 of the selected cell 950*b*.

If cell 950*b* is in a state “1” having holes in the floating body region 24, then the memory cell will have a lower threshold voltage (gate voltage where the transistor is turned on), and consequently be conducting a larger current compared to if cell 950*b* is in a state “0” having no holes in floating body region 24. The cell current can be sensed by, for example, a sense amplifier circuit connected to BL terminal 74*b*.

A write “0” operation is described with reference to FIGS. 138-139, where the following bias conditions are applied: zero voltage to the WL terminals 70, and negative voltage to the BL terminal 74*b*, while the substrate terminal 78 is grounded. Under these conditions, the p-n junction between floating body 24 and region 20*b* of the memory cell 950 is forward-biased, evacuating any holes from the floating body 24. The unselected BL terminals 74 can be left floating or grounded, the unselected WL terminals 70 will remain at zero voltage, and the unselected substrate terminal 78 will remain at zero voltage.

In one particular non-limiting embodiment, about −1.2 volts is applied to terminal 74*b*, about 0.0 volts is applied to terminal 70, and about 0.0 volts is applied to terminal 78. However, these voltage levels may vary, while maintaining the relative relationship between the charges applied, as described above. Because BL terminal 74*b* is connected to several memory cells 950, all memory cells connected to BL terminal 74*b* will be written to state “0”, as indicated by the memory cells inside the dashed lines in FIG. 138.

An alternative write “0” operation that allows for more selective bit writing is shown in FIGS. 140-141 and can be performed by applying a negative voltage to BL terminal 74*b*, zero voltage to substrate terminal 78, and a positive voltage to WL terminal 70*b*. The unselected WL terminals will remain at zero voltage, the unselected BL terminals will be left floating or grounded, and the unselected substrate terminal 78 will remain at zero voltage.

Under these conditions, a positive voltage will be applied to the gate of the selected memory cell (e.g. memory cell 950*a* and 950*b* in FIG. 140, see also gate 60*b* in FIG. 141) and consequently the floating body 24 potential will increase through capacitive coupling from the positive voltage applied to the WL terminal 70. As a result of the floating body 24 potential increase and the negative voltage applied to the BL terminal 74*b*, the p-n junction between 24 and region 20*b* is forward-biased, evacuating any holes from the floating body 24. To reduce undesired write "0" disturb to other memory cells 950 in the memory array 980, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74*b*. Under these conditions, memory cell 950*a* and 950*b* will be written to state "0" (compared to the previous write "0" described above, which results in all memory cells sharing the same BL terminal 74*b* to be written to state "0").

In one particular non-limiting embodiment, the following bias conditions are applied to the memory cell 950: a potential of about −0.2 volts to BL terminal 74*b*, a potential of about +0.5 volts is applied to selected WL terminal 70*b*, and about 0.0 volts is applied to substrate terminal 78; while unselected BL terminals 74 are left floating, about 0.0 volts is applied to unselected WL terminal 70, and about 0.0 volts is applied to unselected terminal 78. FIG. 140 shows the bias conditions for the selected and unselected memory cells in memory array 980 where memory cells 950*a* and 950*b* are the selected cells. However, these voltage levels may vary.

An example of the bias conditions on a selected memory cell 950*b* under an impact ionization write "1" operation is illustrated in FIGS. 142-143. A positive bias is applied to the selected WL terminal 70*b*, zero voltage is applied to the BL terminal 74*c*, a positive bias applied to the BL terminal 74*b*, while the substrate terminal 78 is grounded. This condition results in a lateral electric field sufficient to generate energetic electrons, which subsequently generate electron-hole pairs, followed by hole injection to the floating body 24 of the selected memory cell (e.g. cell 950*b* in FIGS. 142-143). The unselected WL terminals (e.g. WL terminal 70*a*, 70*c*, 70*m*, and 70*n* in FIG. 142) are grounded, the unselected BL terminals (e.g. BL terminal 74*a*, 74*d*, 74*m*, 74*n*, 74*o*, and 74*p* in FIG. 142) are left floating, and the unselected substrate terminal 78 is grounded. Alternatively, the unselected BL terminals to the right of BL terminal 74*c* (where zero voltage is applied to) can be grounded. A positive voltage of the same amplitude as that applied to BL terminal 74*b* can be applied to the unselected BL terminals to the left of BL terminal 74*b*. Because the region 20*b* (connected to BL terminal 74*b*) is shared with the adjacent cell 950*a*, the unselected BL terminals to the left of BL terminal 74*b* (where a positive voltage is applied to) need to be left floating or applied a positive voltage to prevent any parasitic current flowing from BL terminal 74*b* to the BL terminals to the left of BL terminal 74*b*, which can cause undesired write "1" operations to at least one unselected memory cell 950.

In one particular non-limiting embodiment, the following bias conditions are applied to the selected memory cell 950*b*: a potential of about 0.0 volts is applied to BL terminal 74*c*, a potential of about +1.2 volts is applied to BL terminal 74*b*, a potential of about +1.2 volts is applied to the selected WL terminal 70*b*, and about 0.0 volts is applied to substrate terminal 78; while the following bias conditions are applied to the unselected terminals: a potential of about 0.0 volts is applied to unselected WL terminals 70 (e.g. WL terminals 70*a*, 70*m*, and 70*n* in FIG. 142), about 0.0 volts is applied to substrate terminal 78, and the unselected BL terminals 74 (e.g. BL terminals 74*c*, 74*d*, 74*m*, 74*n*, 74*o*, and 74*p* in FIG. 142) are left floating. FIGS. 142-143 show the bias conditions for the selected and unselected memory cells in memory array 980 (with memory cell 950*b* as the selected cell). However, these voltage levels may vary. Alternatively, the bias conditions on BL terminals 74*b* and 74*c* (connected to regions 20 of the selected memory cell 950*b*) may be reversed.

FIG. 144 schematically illustrates a memory array according to another embodiment of the present invention. Memory array 1080 includes a plurality of memory cells 1050. FIG. 145A shows a top view of memory cell 1050 in isolation, with FIGS. 145B and 145C showing sectional views of the memory cell 1050 taken along lines I-I' and II-II' of FIG. 145A, respectively.

Referring to FIGS. 145B and 145C together, the cell 1050 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can be grown epitaxially on top of substrate 12.

A floating body region 24 of the first conductivity type, such as p-type, for example, is bounded on top by regions 20 and insulating layer 62, on the sides by insulating layers 26, and on the bottom by buried layer 22. Insulating layers 26 (like, for example, shallow trench isolation (STI)), may be made of silicon oxide, for example. Insulating layers 26 insulate cell 1050 from neighboring cells 1050 when multiple cells 1050 are joined in an array 1080 to make a memory device as illustrated in FIG. 144.

Regions 20 having a second conductivity type, such as n-type, for example, are provided in substrate 12 and are exposed at surface 14. Regions 20 are formed by an implantation process formed on the material making up substrate 12, according to any implantation process known and typically used in the art. Alternatively, a solid state diffusion process could be used to form regions 20.

A gate 60 is positioned above the floating body region 24, regions 20 and insulating layers 26. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Region 20 is continuous (electrically conductive) in the direction along the II-II' direction (referring to FIG. 145A) and can be used to connect several memory cells 1050 in parallel as shown in the equivalent circuit representation of the memory array 1080 in FIGS. 144 and 146 (where the regions 20 are connected to bit line (BL) terminals 74). Connections between regions 20 and bit line (BL) terminals 74*a* and 74*b* can be made through contacts 73 at the edge of the parallel connections (see FIG. 144). An adjacent pair of continuous regions 20 can be used to connect a link of cells 1050 in parallel. In a parallel connection, the voltage applied to the BL terminals 74 is about the same across all memory cells 1050 (small differences might occur due to voltage drop along the bit lines) and the current will only flow through the selected memory cell 1050. Cell 1050 further includes word line (WL) terminal 70 electrically connected to gate 60, buried well (BW) terminal 76 connected to buried layer 22, and substrate terminal 78 electrically connected to substrate 12 (see FIGS. 145B-145C).

Because it is possible to make connections to BL terminals only at the edge of the parallel connections, the number of contacts can be reduced, for example to two contacts, for each parallel connection. No contacts to the memory cells that are not at the edge of the parallel connection are necessary, as these are contactless memory cells that are continuously linked by regions 20. The number of contacts can be increased to reduce the resistance of the parallel connections if desired.

A read operation of the embodiment of FIGS. 144-145C is described with reference to FIGS. 147-148, where memory cell 1050*b* is being selected (as shown in FIG. 147). The following bias conditions may be applied: a positive voltage is applied to BL terminal 74*a*, zero voltage is applied to BL terminal 74*b*, a positive voltage is applied to WL terminal 70*b*, zero voltage is applied to BW terminal 76 and zero voltage is applied to substrate terminal 78. The unselected BL terminals (e.g. BL terminal 74*c*, 74*d*, . . . , 74*p* in FIG. 147) will remain at zero voltage, the unselected WL terminals (e.g. WL terminal 70*a*, 70*m*, 70*n* in FIG. 147) will remain at zero voltage, the unselected BW terminals 76 will remain at zero voltage (or a positive bias can be applied to maintain the states of the unselected memory cells), and the unselected substrate terminals 78 will remain at zero voltage. Alternatively, the bias conditions on BL terminals 74*a* and 74*b* (connected to regions 20 of the selected memory cell 1050*b*) may be reversed.

In one particular non-limiting embodiment, the following bias conditions are applied to the selected memory cell 1050*b*: a potential of about +0.4 volts is applied to BL terminal 74*a*, a potential of about 0.0 volts is applied to BL terminal 74*b*, a potential of about +1.2 volts is applied to WL terminal 70*b*, about 0.0 volts is applied to BW terminal 76 and about 0.0 volts is applied to substrate terminal 78; while the following bias conditions are applied to the unselected terminals: about 0.0 volts is applied to unselected BL terminals, about 0.0 volts is applied to unselected WL terminals, about 0.0 volts is applied to unselected BW terminals (or +1.2 volts is applied to BW terminal 76 to maintain the states of the unselected memory cells), and about 0.0 volts is applied to unselected substrate terminals.

As shown in FIG. 148, about +1.2 volts will be applied to the gate 60*b* (connected to terminal 70*b*), about 0.4 volts will be applied to the region 20*a* (connected to BL terminal 74*a*), about 0.0 volts will be applied to region 20*b* (connected to BL terminal 74*b*), about 0.0 volts will be applied to buried layer 22, and about 0.0 will be applied to substrate 12 of selected memory cell 1050*b*. The current flowing from BL terminal 74*a* to BL terminal 74*b* will then be determined by the potential of the floating body region 24 of the selected cell 1050*b*.

If cell 1050*b* is in a state "1" having holes in the floating body region 24, then the memory cell will have a lower threshold voltage (gate voltage where the transistor is turned on), and consequently be conducting a larger current compared to if cell 1050*b* is in a state "0" having no holes in floating body region 24. The cell current can be sensed by, for example, a sense amplifier circuit connected to BL terminal 74*a*.

A write "0" operation is described with reference to FIGS. 149-150, where the following bias conditions are applied: zero voltage to the BL terminal 74*b*, zero voltage to the WL terminals 70, and negative voltage to the BL terminal 74*a*, while the BW terminal 76 and substrate terminal 78 are grounded. Under these conditions, the p-n junction between floating body 24 and region 20*a* of the memory cell 1050 is forward-biased, evacuating any holes from the floating body 24. In one particular non-limiting embodiment, about −1.2 volts is applied to terminal 74*a*, about 0.0 volts is applied to terminal 70, and about 0.0 volts is applied to terminals 76 and 78. However, these voltage levels may vary, while maintaining the relative relationship between the charges applied, as described above. Alternatively, the write "0" operation can be achieved by reversing the bias conditions applied to BL terminals 74*a* and 74*b*.

An alternative write "0" operation that allows for individual bit writing are shown in FIGS. 151-152 and can be performed by applying a negative voltage to BL terminal 74*a*, zero voltage to BL terminal 74*b*, zero voltage to BW terminal 76, zero voltage to substrate terminal 78, and a positive voltage to WL terminal 70. Under these conditions, a positive voltage will be applied to the gate of the selected memory cell (e.g. memory cell 1050*b* in FIGS. 151-152) and consequently the floating body 24 potential will increase through capacitive coupling from the positive voltage applied to the WL terminal 70. As a result of the floating body 24 potential increase and the negative voltage applied to the BL terminal 74*a*, the p-n junction between 24 and region 20*a* is forward-biased, evacuating any holes from the floating body 24. To reduce undesired write "0" disturb to other memory cells 1050 in the memory array 1080, the applied potential can be optimized as follows: if the floating body 24 potential of state "1" is referred to $V_{FB1}$, then the voltage applied to the selected WL terminal 70 is configured to increase the floating body 24 potential by $V_{FB1}/2$ while $-V_{FB1}/2$ is applied to BL terminal 74*a*.

In one particular non-limiting embodiment, the following bias conditions are applied to the memory cell 1050*b*: a potential of about 0.0 volts to BL terminal 74*b*, a potential of about −0.2 volts to BL terminal 74*a*, a potential of about +0.5 volts is applied to selected WL terminal 70*b*, about 0.0 volts is applied to BW terminal 76, and about 0.0 volts is applied to substrate terminal 78; while about 0.0 volts is applied to unselected BL terminals 74, about 0.0 volts is applied to BW terminal 76 (or +1.2 volts is applied to BW terminal 76 to maintain the states of the unselected memory cells), about 0.0 volts is applied to unselected WL terminal 70, and about 0.0 volts is applied to unselected terminal 78. FIGS. 151-152 show the bias conditions for the selected and unselected memory cells in memory array 1080 where memory cell 1050*b* is the selected cell. However, these voltage levels may vary. Alternatively, the write "0" operation can be achieved by reversing the bias conditions applied to BL terminals 74*a* and 74*b*.

An example of the bias conditions on a selected memory cell 1050*b* undergoing a band-to-band tunneling write "1" operation is illustrated in FIGS. 153 and 154. A negative bias is applied to the selected WL terminal 70*b*, zero voltage is applied to the BL terminal 74*b*, a positive bias is applied to the BL terminal 74*a*, zero voltage is applied to the BW terminal 76, and the substrate terminal 78 is grounded. These conditions cause electrons flow to the BL terminal 74*a*, generating holes which subsequently are injected into the floating body region 24.

In one particular non-limiting embodiment, the following bias conditions are applied to the selected memory cell 1050*b:* a potential of about 0.0 volts is applied to BL terminal 74*b,* a potential of about +1.2 volts is applied to BL terminal 74*a,* a potential of about −1.2 volts is applied to the selected WL terminal 70*b,* about 0.0 volts is applied to BW terminal 76, and about 0.0 volts is applied to substrate terminal 78; while the following bias conditions are applied to the unselected terminals: about 0.0 volts is applied to unselected BL terminals (e.g. BL terminals 74*c,* 74*d,* 74*m,* 74*n,* 74*o,* and 74*p* in FIG. 153), a potential of about 0.0 volts is applied to unselected WL terminals 70 (e.g. WL terminals 70*a,* 70*m,* and 70*n* in FIG. 153), about 0.0 volts is applied to unselected BW terminals 76 (or +1.2 volts is applied to maintain the states of the unselected memory cells), and about 0.0 volts is applied to unselected substrate terminals 78. FIGS. 153-154 show the bias conditions for the selected and unselected memory cells in memory array 1080 where memory cell 1050*b* is the selected cell. However, these voltage levels may vary. Alternatively, the write "1" operation can be achieved by reversing the bias conditions applied to BL terminals 74*a* and 74*b.*

An example of the bias conditions on a selected memory cell 1050*b* undergoing an impact ionization write "1" operation is illustrated in FIGS. 155-156. A positive bias is applied to the selected WL terminal 70*b,* zero voltage is applied to the BL terminal 74*b,* a positive bias is applied to the BL terminal 74*a,* zero voltage is applied to BW terminal 76, and the substrate terminal 78 is grounded. These conditions cause a lateral electric field sufficient to generate energetic electrons, which subsequently generate electron-hole pairs, followed by hole injection into the floating body 24 of the selected memory cell (e.g. cell 1050*b* in FIGS. 155-156).

In one particular non-limiting embodiment, the following bias conditions are applied to the selected memory cell 1050*b:* a potential of about 0.0 volts is applied to BL terminal 74*b,* a potential of about +1.2 volts is applied to BL terminal 74*a,* a potential of about +1.2 volts is applied to the selected WL terminal 70*b,* about 0.0 volts is applied to BW terminal 76, and about 0.0 volts is applied to substrate terminal 78; while the following bias conditions are applied to the unselected terminals: about 0.0 volts is applied to unselected BL terminals 74 (e.g. BL terminals 74*c,* 74*d,* 74*m,* 74*n,* 74*o,* and 74*p* in FIG. 155), a potential of about 0.0 volts is applied to unselected WL terminals 70 (e.g. WL terminals 70*a,* 70*m,* and 70*n* in FIG. 155), about 0.0 volts is applied to BW terminal 76 (or +1.2 volts is applied to BW terminal 76 to maintain the states of the unselected memory cells), and about 0.0 volts is applied to substrate terminal 78. FIGS. 155-156 show the bias conditions for the selected and unselected memory cells in memory array 1080 (with memory cell 1050*b* as the selected cell). However, these voltage levels may vary. Alternatively, the write "1" operation can be achieved by reversing the bias conditions applied to BL terminals 74*a* and 74*b.*

FIG. 157 shows an alternative embodiment of memory array 1090, where adjacent regions 20 are connected to a common BL terminal 74 through a conductive region 64. The operation of memory array 1090 is similar to that of memory array 980 fabricated on a silicon on insulator (SOI) surface, where regions 20 are shared between two adjacent memory cells 950.

FIG. 158A shows another embodiment of a memory array, referred to as 1180. Memory array 1180 comprises a plurality of memory cells 1150. FIG. 158B shows a memory cell 1150 in isolation while FIGS. 158C and 158D show sectional views of the memory cell 1150 of FIG. 158B taken along lines I-I' and II-II' of FIG. 158B, respectively.

Memory cell 1150 includes a substrate 12 of a first conductivity type such as a p-type, for example. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can be grown epitaxially on top of substrate 12.

A floating body region 24 of the first conductivity type, such as p-type, for example, is bounded on top by region 16 and insulating layer 62, on the sides by insulating layers 26 and 28, and on the bottom by buried layer 22, see FIGS. 158C-158D. Insulating layers 26 and 28 (like, for example, shallow trench isolation (STI)), may be made of silicon oxide, for example. Insulating layers 26 and 28 insulate cell 1150 from neighboring cells 1150 when multiple cells 1150 are joined in an array 1180 to make a memory device as illustrated in FIG. 158A. Insulating layer 26 insulate both body region 24 and buried region 22 of adjacent cells (see FIG. 158C), while insulating layers 28 insulate neighboring body regions 24, but not the buried layer 22, allowing the buried layer 22 to be continuous (i.e. electrically conductive) in one direction (along the II-II' direction as shown in FIG. 158D).

A region 16 having a second conductivity type, such as n-type, for example, is provided in substrate 12 and is exposed at surface 14. Region 16 is formed by an implantation process formed on the material making up substrate 12, according to any implantation process known and typically used in the art. Alternatively, a solid state diffusion process can be used to form region 16. Region 16 is continuous (electrically conductive) in the direction along the II-II' direction (referring to FIG. 158B) and can be used to connect several memory cells 1150 in parallel like shown in the equivalent circuit representation of the memory array 1180 in FIG. 159.

A gate 60 is positioned in between the region 16 and insulating layer 26 and above the floating body region 24. The gate 60 is insulated from floating body region 24 by an insulating layer 62, see FIG. 158C. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Contact between bit line (BL) terminal 74*a* and region 16 and contact between source line (SL) terminal 72*a* and buried layer 22 can be made at the edge of the parallel connections. Cell 1150 further includes word line (WL) terminal 70 electrically connected to gate 60 and substrate terminal 78 electrically connected to substrate 12. Region 16 (connected to BL terminal 74) and buried layer 22 (connected to SL terminal 72) can be used to connect a link of cells 1150 in parallel. In a parallel connection, the voltage applied to the SL terminal 72 and BL terminal 74 is about the same for all memory cells 1150 (small differences might occur due to voltage drop along the bit lines) and the current will only flow through the selected memory cell 1150.

FIG. 159 shows an equivalent circuit representation of memory array 1180, where a plurality of memory cells 1150 are connected in parallel. Because it is possible to make connections to SL and BL terminals at only the edge of the parallel connections, the number of contacts can be reduced, for example to two contacts, for each parallel connection. No contacts are made to the regions 16 and 22 of the memory cells 1150, except for those cells 1150 at the edge of the parallel connections in memory array 1180. Thus, those cells 1150 not at the edge of the parallel connections are contactless memory cells. Of course, the number of contacts can be increased to reduce the resistance of the parallel connections if desired.

FIG. 160A shows an equivalent circuit representation of memory cell 1150, consisting of a n-p-n bipolar device 30 formed by buried well region 22, floating body 24, and region 16, with a gate 60 coupled to the floating body region 24.

A holding operation can be performed by utilizing the properties of the n-p-n bipolar devices 30 through the application of a positive back bias to the SL terminal 72 while grounding terminal 74. If floating body 24 is positively charged (i.e. in a state "1"), the bipolar transistor formed by BL region 16, floating body 24, and buried well region 22 will be turned on.

A fraction of the bipolar transistor current will then flow into floating region 24 (usually referred to as the base current) and maintain the state "1" data. The efficiency of the holding operation can be enhanced by designing the bipolar device 30 formed by buried well layer 22, floating region 24, and region 16 to be a low-gain, (i.e., as near to 1:1 as practical) bipolar device, where the bipolar gain is defined as the ratio of the collector current flowing out of SL terminal 72 to the base current flowing into the floating region 24.

For memory cells in state "0" data, the bipolar device 30 will not be turned on, and consequently no base hole current will flow into floating region 24. Therefore, memory cells in state "0" will remain in state "0".

An example of the bias conditions applied to cell 1150 to carry out a holding operation includes: zero voltage is applied to BL terminal 74, a positive voltage is applied to SL terminal 72, zero or negative voltage is applied to WL terminal 70, and zero voltage is applied to substrate terminal 78. In one particular non-limiting embodiment, about +1.2 volts is applied to terminal 72, about 0.0 volts is applied to terminal 74, about 0.0 volts is applied to terminal 70, and about 0.0 volts is applied to terminal 78. However, these voltage levels may vary.

FIG. 160B shows an energy band diagram of the intrinsic n-p-n bipolar device 30 of FIG. 160B when the floating body region 24 is positively charged and a positive bias voltage is applied to the buried well region 22. The dashed lines indicate the Fermi levels in the various regions of the n-p-n transistor 30. The Fermi level is located in the band gap between the solid line 17 indicating the top of the valance band (the bottom of the band gap) and the solid line 19 indicating the bottom of the conduction band (the top of the band gap) as is well known in the art. The positive charge in the floating body region lowers the energy barrier of electron flow into the base region. Once injected into the floating body region 24, the electrons will be swept into the buried well region 22 (connected to SL terminal 72) due to the positive bias applied to the buried well region 22. As a result of the positive bias, the electrons are accelerated and create additional hot carriers (hot hole and hot electron pairs) through an impact ionization mechanism. The resulting hot electrons flow into the SL terminal 72 while the resulting hot holes will subsequently flow into the floating body region 24. This process restores the charge on floating body 24 to its maximum level and will maintain the charge stored in the floating body region 24 which will keep the n-p-n bipolar transistor 30 on for as long as a positive bias is applied to the buried well region 22 through SL terminal 72.

If floating body 24 is neutrally charged (i.e., the voltage on floating body 24 being substantially equal to the voltage on grounded bit line region 16), a state corresponding to state "0", the bipolar device will not be turned on, and consequently no base hole current will flow into floating region 24. Therefore, memory cells in the state "0" will remain in the state "0".

FIG. 160C shows an energy band diagram of the intrinsic n-p-n bipolar device 30 of FIG. 160A when the floating body region 24 is neutrally charged and a bias voltage is applied to the buried well region 22. In this state the energy level of the band gap bounded by solid lines 17A and 19A is different in the various regions of n-p-n bipolar device 30. Because the potentials of the floating body region 24 and the bit line region 16 are substantially equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 30 will remain off.

To perform the holding operation, a periodic pulse of positive voltage can be applied to the back bias terminals of memory cells 1150 through SL terminal 72 as opposed to applying a constant positive bias, thereby reducing the power consumption of the memory cells 1150.

Although for description purposes, the bipolar devices 30 in the embodiment of FIGS. 160A through 160C have been described as n-p-n transistors, persons of ordinary skill in the art will readily appreciate that by reversing the first and second connectivity types and inverting the relative values of the applied voltages memory cell 1150 could comprise a bipolar device 30 which is a p-n-p transistor. Thus the choice of an n-p-n transistor as an illustrative example for simplicity of explanation in FIGS. 160A through 160C is not limiting in any way.

A read operation is described with reference to FIGS. 161-162, where memory cell 1150*b* is being selected (as shown in FIG. 161). The following bias conditions may be applied: a positive voltage is applied to BL terminal 74*a*, zero voltage is applied to SL terminal 72*a*, a positive voltage is applied to WL terminal 70*b*, and zero voltage is applied to substrate terminal 78. The unselected BL terminals (e.g. BL terminal 74*b*, 74*c*, . . . , 74*p* in FIG. 161) remain at zero voltage, the unselected SL terminals (e.g. SL terminals 72*b*, 72*c*, . . . , 72*p* in FIG. 161) remain at zero voltage, the unselected WL terminals (e.g. WL terminal 70*a*, 70*m*, 70*n* in FIG. 161) remain at zero voltage, and the unselected substrate terminal 78 remains at zero voltage. Alternatively, a positive voltage can be applied to the unselected BL terminals connected to the buried layer region to maintain the states of the unselected memory cells.

In one particular non-limiting embodiment, the following bias conditions are applied to the selected memory cell 1150*b*: a potential of about +0.4 volts is applied to BL terminal 74*a*, a potential of about 0.0 volts is applied to SL terminal 72*a*, a potential of about +1.2 volts is applied to WL terminal 70*b*, and about 0.0 volts is applied to substrate terminal 78; while the following bias conditions are applied to the unselected terminals: about 0.0 volts is applied to unselected BL terminals (or +1.2 volts can be applied to SL terminals connected to the buried layer region to maintain the states of the unselected memory cells), about 0.0 volts is applied to unselected WL terminals, and about 0.0 volts is applied to unselected substrate terminals.

As shown in FIG. 162, about +1.2 volts will be applied to the gate 60*b*, about 0.4 volts will be applied to the region 16 (connected to BL terminal 74*a*), about 0.0 volts will be applied to buried layer region 22 (connected to SL terminal 72*a*), about 0.0 volts will be applied to buried layer 22, and about 0.0 will be applied to substrate 12 of selected memory cell 1150*b*. The current flowing from BL terminal 74*a* to SL terminal 72*a* will then be determined by the potential of the floating body region 24 of the selected cell 1150*b*.

If cell 1150*b* is in a state “1” having holes in the floating body region 24, then the memory cell will have a lower threshold voltage (gate voltage where the transistor is turned on), and consequently will conduct a larger current compared to if cell 1150*b* is in a state “0” having no holes in floating body region 24. The cell current can be sensed by, for example, a sense amplifier circuit connected to BL terminal 74*a*.

Alternatively, the read operation can be performed by reversing the conditions applied to BL terminal 74 and SL terminal 72.

A write “0” operation is described with reference to FIGS. 163-164, where the following bias conditions are applied: zero voltage to the SL terminal 72*a*, zero voltage to the WL terminals 70, negative voltage to the BL terminal 74*a*, and the substrate terminal 78 is grounded. Under these conditions, the p-n junction between floating body 24 and region 16 of the memory cell 1150 is forward-biased, evacuating any holes from the floating body 24. All memory cells 1150 sharing the same BL terminal 74*a* will be written to state “0”. The unselected WL terminals, unselected BL terminals, unselected SL terminals, and unselected substrate terminals are grounded.

In one particular non-limiting embodiment, about −1.2 volts is applied to terminal 74*a*, about 0.0 volts is applied to SL terminal 72*a*, about 0.0 volts is applied to terminal 70, and about 0.0 volts is applied to substrate terminal 78. The unselected BL terminals 74 (e.g. BL terminals 74*b*, 74*c*, . . . , 74*o*, and 74*p*) will remain at 0.0 volts, the unselected SL terminals 74 (e.g. SL terminals 72*b*, 72*c*, . . . , 72*o*, and 72*p*) will remain at 0.0 volts, and the unselected substrate terminal 78 will remain at 0.0 volts. However, these voltage levels may vary, while maintaining the relative relationship between the charges applied, as described above.

Alternatively the write “0” operation can be achieved by reversing the bias condition applied to BL terminals 74 and SL terminals 72.

An alternative write “0” operation that allows for individual bit writing is shown in FIGS. 165-166, and can be performed by applying a negative voltage to BL terminal 74*a*, zero voltage to SL terminal 72*a*, zero voltage to substrate terminal 78, and a positive voltage to WL terminal 70. Under these conditions, a positive voltage will be applied to the gate of the selected memory cell (e.g. memory cell 1150*b* in FIGS. 165-166) and consequently the floating body 24 potential will increase through capacitive coupling from the positive voltage applied to the WL terminal 70. As a result of the floating body 24 potential increase and the negative voltage applied to the BL terminal 74*a*, the p-n junction between 24 and region 16 is forward-biased, evacuating any holes from the floating body 24. To reduce undesired write “0” disturb to other memory cells 1150 in the memory array 1180, the applied potential can be optimized as follows: if the floating body 24 potential of state “1” is referred to $V_{FB1}$, then the voltage applied to the selected WL terminal 70 is configured to increase the floating body 24 potential by $V_{FB1}/2$ while $-V_{FB1}/2$ is applied to BL terminal 74*a*.

In one particular non-limiting embodiment, the following bias conditions are applied to the memory cell 1150: a potential of about 0.0 volts to SL terminal 72*a*, a potential of about −0.2 volts to BL terminal 74*a*, a potential of about +0.5 volts is applied to selected WL terminal 70*b*, and about 0.0 volts is applied to substrate terminal 78; while about 0.0 volts is applied to unselected BL terminals 74, about 0.0 volts is applied to unselected SL terminals, about 0.0 volts is applied to unselected WL terminal 70, and about 0.0 volts is applied to unselected terminal 78. Alternatively, a positive voltage, for example of +1.2 volts, can be applied to unselected SL terminals 72 connected to the buried layer region 22 to maintain the states of the unselected memory cells. FIGS. 165-166 show the bias condition for the selected and unselected memory cells in memory array 1180 where memory cell 1150*b* is the selected cell. However, these voltage levels may vary.

Alternatively, the write “0” operation described above can be achieved by reversing the bias condition applied to BL terminals 74 and SL terminals 72.

An example of the bias condition of the selected memory cell 1150*b* under band-to-band tunneling write “1” operation is illustrated in FIGS. 167 and 168. A negative bias is applied to the selected WL terminal 70*b*, zero voltage is applied to the SL terminal 72*a*, and a positive bias applied to the BL terminal 74*a*, while the substrate terminal 78 is grounded. This condition results in electrons flow to the BL terminal 74*a*, generating holes which subsequently are injected to the floating body region 24.

In one particular non-limiting embodiment, the following bias conditions are applied to the selected memory cell 1150*b*: a potential of about 0.0 volts is applied to SL terminal 72*a*, a potential of about +1.2 volts is applied to BL terminal 74*a*, a potential of about −1.2 volts is applied to the selected WL terminal 70*b*, and about 0.0 volts is applied to substrate terminal 78; while the following bias conditions are applied to the unselected terminals: about 0.0 volts is applied to unselected BL terminals (e.g. BL terminals 74*b*, 74*c*, . . . , 74*o*, and 74*p* in FIG. 167), about 0.0 volts is applied to unselected SL terminals (e.g. SL terminals 72*b*, 72*c*, . . . , 72*o*, and 72*p* in FIG. 167), a potential of about 0.0 volts is applied to unselected WL terminal 70 (e.g. WL terminals 70*a*, 70*m*, and 70*n* in FIG. 167), and about 0.0 volts is applied to substrate terminal 78. A positive voltage of about +1.2 volts can alternatively be applied (either continuously, or intermittently in pulse fashion as described above, to reduce power consumption) to unselected SL terminals connected to the buried layer region 22 to maintain the states of the unselected memory cells). FIGS. 167-168 show the bias conditions for the selected and unselected memory cells in memory array 1180 where memory cell 1150*b* is the selected cell. However, these voltage levels may vary.

An example of the bias conditions on the selected memory cell 1150*b* under impact ionization write “1” operation is illustrated in FIGS. 169-170. A positive bias is applied to the selected WL terminal 70*b*, zero voltage is applied to the SL terminal 72*a*, a positive bias is applied to the BL terminal 74*a*, and the substrate terminal 78 is grounded. These conditions result in a lateral electric field sufficient to generate energetic electrons, which subsequently generate electron-hole pairs, followed by hole injection to the floating body 24 of the selected memory cell (e.g. cell 1150*b* in FIGS. 169-170).

In one particular non-limiting embodiment, the following bias conditions are applied to the selected memory cell 1150*b:* a potential of about 0.0 volts is applied to SL terminal 72*a,* a potential of about +1.2 volts is applied to BL terminal 74*a,* a potential of about +1.2 volts is applied to the selected WL terminal 70*b,* and about 0.0 volts is applied to substrate terminal 78; while the following bias conditions are applied to the unselected terminals: about 0.0 volts is applied to unselected BL terminals 74 (e.g. BL terminals 74*b,* 74*c,* . . . , 74*o,* and 74*p* in FIG. 169), about 0.0 volts is applied to unselected SL terminals 72 (e.g. SL terminals 72*b,* 72*c,* . . . , 72*o,* and 72*p* in FIG. 169), a potential of about 0.0 volts is applied to unselected WL terminals 70 (e.g. WL terminals 70*a,* 70*m,* and 70*n* in FIG. 169), and about 0.0 volts is applied to substrate terminal 78. A positive voltage of about +1.2 volts can alternatively (either continuously, or intermittently in pulse fashion as described above, to reduce power consumption) be applied to unselected SL terminals 72 connected to the buried layer region 22 to maintain the states of the unselected memory cells). FIGS. 169-170 show the bias conditions on the selected and unselected memory cells in memory array 1180 (with memory cell 1150*b* as the selected cell). However, these voltage levels may vary.

Alternatively, the write "1" operations under band-to-band tunneling and impact ionization mechanisms described above can be achieved by reversing the bias conditions applied to BL terminals 74 and SL terminals 72.

The array 1180 may be constructed from a plurality of planar cells, such as the embodiments described above with reference to FIGS. 158C and 158D, or, alternatively, may be constructed from fin-type, three-dimensional cells. Other variations, modifications and alternative cells may be provided without departing from the scope of the present invention and its functionality.

From the foregoing it can be seen that with the present invention, a semiconductor memory with electrically floating body is achieved. The present invention also provides the capability of maintaining memory states or parallel non-algorithmic periodic refresh operations. As a result, memory operations can be performed in an uninterrupted manner. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiments, methods, and examples, but by all embodiments and methods within the scope and spirit of the invention as claimed. While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

The present invention provides a semiconductor memory having both volatile and non-volatile functionality, which combines the properties of Flash EPROM and DRAM. When power is applied, the non-volatile DRAM operates like a regular DRAM cell. As a result, its performance (speed, power, and reliability) is comparable to a regular DRAM cell. During power shutdown (or during backup operations that can be performed at regular intervals), the content of the volatile memories is loaded into the non-volatile memories (hereto referred as the shadowing process). After power is restored, the content of the non-volatile memories is restored to the volatile memories (hereto referred as the restore process).

FIG. 171 is a flowchart 100 illustrating operation of a memory device according to an embodiment of the present invention. At event 102, when power is first applied to the memory device, the memory device is placed in an initial state, in a volatile operational mode and the nonvolatile memory is set to a predetermined state, typically set to have a positive charge. At event 104, while power is still on, the memory device of the present invention operates in the same manner as a conventional DRAM (dynamic random access memory) memory cell, i.e., operating as volatile memory. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data held in the volatile memory is lost. Shadowing can also be performed during backup operations (in which case, data held in volatile memory is not lost), which may be performed at regular intervals during DRAM operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period.

After the content of the volatile memory has been moved during a shadowing operation to nonvolatile memory, the shutdown of the memory device occurs (when it is not a backup operation, as power is no longer supplied to the volatile memory. At this time, the memory device functions like a Flash EPROM (erasable, programmable read-only memory) device in that it retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device is again set to the initial state 102 and again operates in a volatile mode, like a DRAM memory device, event 104.

In an alternative embodiment/use, a memory device of the present invention can restore the content of the non-volatile memory to the volatile memory upon power restoration and operate in a volatile mode, without first resetting the memory device. In this alternative embodiment, the volatile operation is performed independent of the non-volatile memory data. FIG. 172 shows another operation flow chart 200 of the memory device according to an embodiment of the present invention. At event 202, while power is on, the memory device of the present invention operates in the same manner as a volatile memory cell. During power shutdown, or when power is inadvertently lost, or any other event that discontinues or upsets power to the memory device of the present invention, the non-volatile memory is reset to a predetermined state at event 204. This is then followed by the shadowing operation 206, where the content of the volatile memory is loaded into non-volatile memory.

After the content of the volatile memory has been moved during a shadowing operation to nonvolatile memory, the shutdown of the memory device occurs (unless the shadowing process performed was a backup operation, as power is no longer supplied to the volatile memory. At this time, the memory device functions like a Flash EPROM (erasable, programmable read-only memory) device in that it retains the stored data in the nonvolatile memory.

Upon restoring power at event 208, the content of the nonvolatile memory is restored by transferring the content of the non-volatile memory to the volatile memory in a process referred to herein as the "restore" process, after which, the memory device again operates in a volatile mode, like a DRAM memory device, event 202.

In an alternative embodiment/use, the non-volatile memory reset operation is not performed. This is useful, for example, in the case where the non-volatile memory is used to store "permanent data", which is data that does not change in value during routine use. For example, the non-volatile storage bits can be used to store applications, programs, etc. and/or data that is not frequently modified, such as an operating system image, multimedia files, etc.

FIG. 173A schematically illustrates an embodiment of a memory cell 1250 according to the present invention. The cell 1250 includes a substrate 12 of a first conductivity type, such as a p-type conductivity type, for example. Substrate 12 is typically made of silicon, but may comprise germanium, silicon germanium, gallium arsenide, or other semiconductor materials known in the art. The substrate 12 has a surface 14. A first region 16 having a second conductivity type, such as n-type, for example, is provided in substrate 12 and is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 is also formed by an ion implantation process on the material of substrate 12. A body region 24 of the substrate 12 is bounded by surface 14, first and second regions 16,18 and insulating layers 26 (e.g. shallow trench isolation (STI)), which may be made of silicon oxide, for example. Insulating layers 26 insulate cell 1250 from neighboring cells 1250 when multiple cells 1250 are joined to make a memory device. A trapping layer 60 is positioned in between the regions 16 and 18, and above the surface 14. Trapping layer 60 may be made of silicon nitride, silicon nanocrystal, or high-K dielectric materials or other dielectric materials. The trapping layer 60 functions to store non-volatile memory data. Trapping layer 60 allows having multiple physically separated storage locations 62*a*, 62*b* per cell, resulting in a multi-bit non-volatile functionality. This can be accomplished by applying a first charge via region 16 to store non-volatile data at storage location 62*a* and by applying a second charge via region 18 to store non-volatile data at storage location 62*b*, as described in detail below.

A control gate 64 is positioned above trapping layer 60 such that trapping layer 60 is positioned between control gate 64 and surface 14, as shown. Control gate 64 is typically made of polysilicon material or metal gate electrode, such as tungsten, tantalum, titanium and their nitrides.

Cell 1250 includes five terminals: word line (WL) terminal 70, source line (SL) terminal 72, bit line (BL) terminal 74, buried well (BW) terminal 76, and substrate terminal 78. Terminal 70 is connected to control gate 64. Terminal 72 is connected to first region 16 and terminal 74 is connected to second region 18. Alternatively, terminal 72 can be connected to second region 18 and terminal 74 can be connected to first region 16. Terminal 76 is connected to buried layer 22. Terminal 78 is connected to substrate 12.

FIG. 173B shows an exemplary array 1280 of memory cells 1250 arranged in rows and columns. Alternatively, a memory cell device according to the present invention may be provided in a single row or column of a plurality of cells 1250, but typically both a plurality of rows and a plurality of columns are provided. Present in FIG. 173B are word lines 70A through 70*n*, source lines 72*a* through 72*n*, bit lines 74*a* through 74*p*, and substrate terminal 78. Each of the word lines 70*a* through 70*n* is associated with a single row of memory cells 1250 and is coupled to the gate 64 of each memory cell 1250 in that row. Similarly, each of the source lines 72*a* through 72*n* is associated with a single row of memory cells 1250 and is coupled to the region 16 of each memory cell 1250 in that row. Each of the bit lines 74*a* through 74*p* is associated with a single column of memory cells 1250 and is coupled to the region 18 of each memory cell 1250 in that column Buried well terminal 76 and substrate terminal 78 are present at all locations under array 1280. Persons of ordinary skill in the art will appreciate that one or more substrate terminals 78 may be present in one or more locations as a matter of design choices. Such persons of ordinary skill in the art will also appreciate that that while exemplary array 1280 is shown as a single continuous array in FIG. 173B, that many other organizations and layouts may alternatively be created. For example, word lines may be segmented or buffered, bit lines may be segmented or buffered, source lines may be segmented or buffered, the array 1280 may be broken into two or more sub-arrays and/or control circuits such as word decoders, column decoders, segmentation devices, sense amplifiers, and/or write amplifiers may be arrayed around exemplary array 1280 or insert4ed between sub-arrays of array 1280. Thus the exemplary embodiments, features, design options, etc. described herein are not limiting in any way.

FIG. 173C shows another example of array architecture 1280*b* of a memory cell device according to the present invention, wherein memory cells 1250 are arranged in a plurality of rows and columns. Memory cells 1250 are connected such that within each row, all of the control gates 64 are connected in common word line terminals 70 (e.g., 70, 70*b*, . . . 70*n*). Within each column, all first and second regions 16, 18 of cells 1250 in that column are connected in common source and bit line terminals 72 (e.g., 72*a*, 72*b*, . . . , 72*h*) and 74 (e.g., 74*a*, 74*b*, . . . , 74*h*), respectively.

FIG. 174 illustrates alternative write state "1" operations that can be carried out on cell 1250, by performing band-to-band tunneling hot hole injection or impact ionization hot hole injection. To write state "1" using a band-to-band tunneling mechanism, the following voltages are applied to the terminals: a positive voltage is applied to BL terminal 74, a neutral voltage is applied to the SL terminal 72, a negative voltage is applied to WL terminal 70, a positive voltage less than the positive voltage applied to the BL terminal 74 is applied to BW terminal 76, and a neutral voltage is applied to substrate terminal 78. Under these conditions, holes are injected from BL terminal 74 into the floating body region 24, leaving the body region 24 positively charged. The positive voltage applied to BL terminal 74 creates a depletion region that shields the effects of any charges that are stored in storage location 62*b*. As a result, the write state "1" operation can be performed regardless of the charge stored in the storage location 62*b*.

In one particular non-limiting embodiment, a potential of about +2.0 volts is applied to terminal 74, a potential of about 0.0 volts is applied to terminal 72, a potential of about −1.2 volts is applied to terminal 70, a potential of about +0.6 volts is applied to terminal 76, and about 0.0 volts is applied to terminal 78. However, these voltage levels may vary, while maintaining the relative relationships between the charges applied, as described above. Further, the voltages applied to terminals 72 and 74 may be reversed, and still obtain the same result. However the depletion region would instead be formed near storage location 62*a*, rather than 62*b*.

Alternatively, to write a state "1" using an impact ionization mechanism, the following voltages are applied: a positive voltage is applied to BL terminal 74, a neutral voltage is applied to SL terminal 72, a positive voltage is applied to WL terminal 70 and a positive voltage is applied to BW terminal 76, while a neutral voltage is applied to the substrate terminal 78. Under these conditions, holes are injected from BL terminal 74 into the floating body region 24, leaving the body region 24 positively charged. The positive voltage applied to BL terminal 74 creates a depletion region that shields the effects of any charges that are stored in storage location 62*b*.

In one particular non-limiting embodiment, a potential of about +2.0 volts is applied to terminal 74, a potential of about 0.0 volts is applied to terminal 72, a potential of about +1.2 volts is applied to terminal 70, a potential of about +0.6 volts is applied to terminal 76, and about 0.0 volts is applied to terminal 78. However, these voltage levels may vary, while maintaining the relative relationships between the charges applied, as described above. Further, the voltages applied to terminals 72 and 74 may be reversed, and still obtain the same result. However the depletion region would instead be formed near storage location 62*a*, rather than 62*b*.

Alternatively, the silicon controlled rectifier (SCR) device of cell 1250 can be put into a state "1" (i.e., by performing a write "1" operation) by applying the following bias: a neutral voltage is applied to BL terminal 74, a positive voltage is applied to WL terminal 70, and a positive voltage greater than the positive voltage applied to terminal 70 is applied to the substrate terminal 78, while SL terminal 72 and BW terminal 76 are left floating. The positive voltage applied to the WL terminal 70 will increase the potential of the floating body 24 through capacitive coupling and create a feedback process that turns the SCR device on. Once the SCR device of cell 1250 is in conducting mode (i.e., has been "turned on") the SCR becomes "latched on" and the voltage applied to WL terminal 70 can be removed without affecting the "on" state of the SCR device. In one particular non-limiting embodiment, a voltage of about 0.0 volts is applied to terminal 74, a voltage of about +0.5 volts is applied to terminal 70, and about +0.8 volts is applied to terminal 78. However, these voltage levels may vary, while maintaining the relative relationships between the voltages applied, as described above, e.g., the voltage applied to terminal 78 remains greater than the voltage applied to terminal 74. This write state "1" operation can be performed regardless of the charge stored in storage location 62*a* or 62*b*.

FIG. 175 illustrates a write state "0" operation that can be carried out on cell 1250. To write a state "0" into floating body region 24, a negative voltage is applied to SL terminal 72, a negative voltage less negative than the negative voltage applied to terminal 72 is applied to WL terminal 70, 0.0 volts is applied to BL terminal 74 and a positive voltage is applied to BW terminal 76, while neutral voltage is applied to substrate terminal 78. Under these conditions, the p-n junction (junction between 24 and 16) is forward-biased, evacuating any holes from the floating body 24. In one particular non-limiting embodiment, about −2.0 volts is applied to terminal 72, about −1.2 volts is applied to terminal 70, about +0.6 volts is applied to terminal 76, and about 0.0 volts is applied to terminals 72 and 78. However, these voltage levels may vary, while maintaining the relative relationships between the charges applied, as described above. Further, the voltages applied to terminals 72 and 74 may be reversed, and still obtain the same result. As can be seen, the write state "0" operation can be performed regardless of the charge stored in storage location 62*a* or 62*b*.

Alternatively, a write "0" operation can be performed by putting the silicon controlled rectifier device into the blocking mode. This can be performed by applying the following bias: a positive voltage is applied to BL terminal 74, a positive voltage is applied to WL terminal 70, and a positive voltage greater than the positive voltage applied to terminal 74 is applied to the substrate terminal 78, while leaving SL terminal 72 and BW terminal 76 floating. Under these conditions the voltage difference between anode and cathode, defined by the voltages at substrate terminal 78 and BL terminal 74, will become too small to maintain the SCR device in conducting mode. As a result, the SCR device of cell 1250 will be turned off. In one particular non-limiting embodiment, a voltage of about +0.8 volts is applied to terminal 74, a voltage of about +0.5 volts is applied to terminal 70, and about +0.8 volts is applied to terminal 78. However, these voltage levels may vary, while maintaining the relative relationships between the charges applied, as described above. As can be seen, the write state "0" operation can be performed regardless of the charged stored in storage location 62*a* or 62*b*.

A read operation of the cell 1250 is now described with reference to FIG. 176. To read cell 1250, a positive voltage is applied to BL terminal 74, a neutral voltage is applied to SL terminal 72, a positive voltage that is more positive than the positive voltage applied to terminal 74 is applied to WL terminal 70 and a positive voltage is applied to BW terminal 76, while substrate terminal 78 is grounded. If cell 1250 is in a state "1" having holes in the body region 24, then a lower threshold voltage (gate voltage where the transistor is turned on) is observed compared to the threshold voltage observed when cell 1250 is in a state "0" having no holes in body region 24. The positive voltage applied to BL terminal 74 forms a depletion region around junction 18 that shields the effects of any charges that are stored in storage location 62*b*. As a result, the volatile state read operation can be performed regardless of the charge stored in the non-volatile storage (in this example, the charge stored in storage location 62*b*). In one particular non-limiting embodiment, about +0.4 volts is applied to terminal 74, about +0.0 volts is applied to terminal 72, about +1.2 volts is applied to terminal 70, about +0.6 volts is applied to terminal 76, and about 0.0 volts is applied to terminal 78. However, these voltage levels may vary, while maintaining the relative relationships between the charges applied, as described above.

The read operation can also be performed when a positive voltage is applied to BL terminal 74, a neutral voltage is applied to SL terminal 72, a positive voltage that is less positive than the positive voltage applied to terminal 74 is applied to WL terminal 70 and a positive voltage is applied to BW terminal 76, while substrate terminal 78 is grounded. If cell 1250 is in a state "1" having holes in the body region 24, then a parasitic bipolar transistor formed by the SL terminal 72, floating body 24, and BL terminal 74 will be turned on and a higher cell current is observed compared to when cell 1250 is in a state "0" having no holes in body region 24. The positive voltage applied to BL terminal 74 forms a depletion region around junction 18 that shields the effects of any charges that are stored in storage location 62*b*. As a result, the volatile state read operation can be performed regardless (i.e., independently) of the charge stored in the non-volatile storage (in this example, the charge stored in storage location 62*b*). In one particular non-limiting embodiment, about +3.0 volts is applied to terminal 74, about 0.0 volts is applied to terminal 72, about +0.5 volts is applied to terminal 70, about +0.6 volts is applied to terminal 76, and about 0.0 volts is applied to terminal 78. However, these voltage levels may vary, while maintaining the relative relationships between the voltages applied, as described above.

Alternatively, a positive voltage is applied to the substrate terminal 78, a substantially neutral voltage is applied to BL terminal 74, and a positive voltage is applied to WL terminal 70. Terminals 72 and 76 are left floating. Cell 1250 provides a P1-N2-P3-N4 silicon controlled rectifier device, with substrate 78 functioning as the P1 region, buried layer 22 functioning as the N2 region, body region 24 functioning as the P3 region and region 16 or 18 functioning as the N4 region. The functioning of the silicon controller rectifier device is described in further detail in application Ser. No. 12/533,661 filed Jul. 31, 2009 and titled "Methods of Operating Semiconductor Memory Device with Floating Body Transistor Using Silicon Controlled Rectifier Principle". application Ser. No. 12/533,661 is hereby incorporated herein, in its entirety, by reference thereto. In this example, the substrate terminal 78 functions as the anode and terminal 72 or terminal 74 functions as the cathode, while body region 24 functions as a p-base to turn on the SCR device. If cell 1250 is in a state "1" having holes in the body region 24, the silicon controlled rectifier (SCR) device formed by the substrate, buried well, floating body, and the BL junction will be turned on and a higher cell current is observed compared to when cell 1250 is in a state "0" having no holes in body region 24. A positive voltage is applied to WL terminal 70 to select a row in the memory cell array, while negative voltage is applied to WL terminal 70 for any unselected rows. The negative voltage applied reduces the potential of floating body 24 through capacitive coupling in the unselected rows and turns off the SCR device of each cell 1250 in each unselected row. Thus the read operation can be performed regardless of the charge stored in the non-volatile storage. In one particular non-limiting embodiment, about +0.8 volts is applied to terminal 78, about +0.5 volts is applied to terminal 70 (for the selected row), and about 0.0 volts is applied to terminal 72, while terminals 74 and 76 are left floating. However, these voltage levels may vary.

A holding or standby operation is described with reference to FIG. 177. Such holding or standby operation is implemented to enhance the data retention characteristics of the memory cells 1250. The holding operation can be performed by applying the following bias: a substantially neutral voltage is applied to BL terminal 74, a neutral or negative voltage is applied to WL terminal 70, and a positive voltage is applied to the substrate terminal 78, while leaving SL terminal 72 and BW terminal 76 floating. Under these conditions, if memory cell 1250 is in memory/data state "1" with positive voltage in floating body 24, the SCR device of memory cell 1250 is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 1250 can be refreshed by periodically applying a positive voltage pulse through substrate terminal 78. Those memory cells 1250 that are commonly connected to substrate terminal 78 and which have a positive voltage in body region 24 will be refreshed with a "1" data state, while those memory cells 1250 that are commonly connected to the substrate terminal 78 and which do not have a positive voltage in body region 24 will remain in blocking mode, since their SCR device will not be turned on, and therefore memory state "0" will be maintained in those cells. In this way, all memory cells 1250 commonly connected to the substrate terminal will be maintained/refreshed to accurately hold their data states. This process occurs automatically, upon application of voltage to the substrate terminal 78, in a parallel, non-algorithmic, efficient process. In addition, it can be seen that the holding operation can be performed regardless of the charge stored in the non-volatile storage. In one particular non-limiting embodiment, a voltage of about 0.0 volts is applied to terminal 74, a voltage of about −1.0 volts is applied to terminal 70, and about +0.8 volts is applied to terminal 78. However, these voltage levels may vary, while maintaining the relative relationships therebetween. Alternatively, the voltage described above as being applied to terminal 74 may be applied to terminal 72 and terminal 74 may be left floating.

Alternatively, the holding operation can be performed by applying the following bias: substantially neutral voltage is applied to the BL terminal 74, a positive voltage is applied to SL terminal 72, a positive voltage is applied to BW terminal 76, and zero or negative voltage is applied to WL terminal 70. The substrate terminal 78 can be left floating or grounded. Under these conditions, the parasitic bipolar device formed by region 16, the floating body region 24, and region 18 will be turned on. If the floating body 24 is in state "1' having positive charge in the body region 24, the positive voltage applied to the SL terminal 72 will result in impact ionization, which will generate electron-hole pairs. The holes will then diffuse into floating body 24, hence replenishing the positive charge in body region 24 and maintain the "1" data state. If the floating body 24 is in state "0", the bipolar device formed by region 16, the floating body region 24, and region 18 will not be turned on and therefore state "0" will be maintained in those cells. In this way, all memory cells 1250 commonly connected to the substrate terminal will be maintained/refreshed to accurately hold their data states. This mechanism is governed by the potential or charge stored in the floating body region 24 and is independent of the potential applied to the WL terminal 70. This process occurs automatically, upon application of voltage to the SL terminal 72, in a parallel, non-algorithmic, efficient process. As can be seen, the holding operation can be performed regardless of the charge stored in the non-volatile storage. In one particular non-limiting embodiment, a voltage of about 0.0 volts is applied to terminal 74, a voltage of about −1.0 volts is applied to terminal 70, about +0.8 volts is applied to terminal 72, and about +0.6 is applied to terminal 76. However, these voltage levels may vary, while maintaining the relative relationships therebetween. Alternatively, the voltage described above as being applied to terminal 72 may be applied to terminal 74 and terminal 72 is grounded.

Alternatively, the holding operation can be performed by applying the following bias: zero or negative voltage is applied to WL terminal 70, substantially neutral voltage is applied to both BL terminal 74 and SL terminal 72, and a positive voltage is applied to BW terminal 76. The substrate terminal 78 can be left floating or grounded. Under these conditions, the parasitic bipolar device formed by region 16 or 18, the floating body region 24 and buried layer 22 will be turned on. If the floating body 24 is in state "1' having positive charge in the body region 24, the positive voltage applied to BW terminal 76 will result in impact ionization, which will generate electron-hole pairs. The holes will then diffuse into floating body 24, hence replenishing the positive charge in body region 24 and maintaining the "1" data state. If the floating body 24 is in state "0", the bipolar device formed by region 16 or 18, the floating body region 24 and buried layer 22 will not be turned on and therefore state "0" will be maintained in those cells. In this way, all memory cells 1250 commonly connected to the substrate terminal will be maintained/refreshed to accurately hold their data states. This mechanism is governed by the potential or charge stored in the floating body region 24 and is independent of the potential applied to the WL terminal 70. This process occurs automatically, upon application of voltage to the BW terminal 76, in a parallel, non-algorithmic, efficient process. As can be seen, the holding operation can be performed regardless of the charge stored in the non-volatile storage. In one particular non-limiting embodiment, a voltage of about 0.0 volts is applied to terminals 72 and 74, a voltage of about −1.0 volts is applied to terminal 70, about +1.2 volts is applied to terminal 76, and about 0.0 volts is applied to terminal 78. However, these voltage levels may vary, while maintaining the relative relationships therebetween.

When power down is detected, e.g., when a user turns off the power to cell 1250, or the power is inadvertently interrupted, or for any other reason, power is at least temporarily discontinued to cell 1250, or due to any specific commands by the user such as during backup operation, data stored in the floating body region 24 is transferred to trapping layer 60 through hot electron injection. This operation is referred to as "shadowing" and is described with reference to FIGS. 178A-178B. The shadowing process can be performed to store data in the floating body region 24 to either storage location 62*a* or 62*b*. To perform a shadowing process to the storage location 62*a*, a high positive voltage is applied to SL terminal 72 and a neutral or positive voltage less positive than that applied to terminal 72 is applied to BL terminal 74. A positive voltage is applied to terminal 70 and a positive voltage is applied to terminal 76. A high voltage in this case is a voltage greater than or equal to about +3 volts. In one example, a voltage in the range of about +3 to about +6 volts is applied, although it is possible to apply a higher voltage. When floating body 24 has a positive charge/voltage, the NPN bipolar junction formed by source drain regions 16 and 18 and the floating body 24 is on and electrons flow through the memory transistor. The application of the high voltage to terminal 72 energizes/accelerates electrons traveling through the floating body 24 to a sufficient extent that they can "jump into" the storage location in the trapping layer 62*a* near the SL terminal 72, as indicated by the arrow into storage location 62*a* in FIG. 178A. Accordingly, the storage location 62*a* in the trapping layer 60 becomes negatively charged by the shadowing process, when the volatile memory of cell 1250 is in state "1" (i.e., floating body 24 is positively charged), as shown in FIG. 178A.

When volatile memory of cell 1250 is in state "0", i.e., floating body 24 has a negative or neutral charge/voltage, the NPN junction is off and electrons do not flow in the floating body 24, as illustrated in FIG. 178B. Accordingly, when voltages are applied to the terminals as described above, in order to perform the shadowing process, the high positive voltage applied to terminal 72 does not cause an acceleration of electrons in order to cause hot electron injection into trapping layer 60, since electrons are not flowing. Accordingly, no charge injection occurs to the trapping layer 60 and it retains its charge at the end of the shadowing process, when the volatile memory of cell 1250 is in state "0" (i.e., floating body 24 is neutral or negatively charged), as shown in FIG. 178B. As will be described in the description of reset operation, the storage locations 62 in trapping layer 60 are initialized or reset to have a positive charge during the reset operation. As a result, if the volatile memory of cell 1250 is in state "0", the storage location 62*a* will have a positive charge at the end of the shadowing process.

Note that the charge state of the storage location 62*a* terminal is complementary to the charge state of the floating body 24 after completion of the shadowing process. Thus, if the floating body 24 of the memory cell 1250 has a positive charge in volatile memory, the trapping layer 60 will become negatively charged by the shadowing process, whereas if the floating body of the memory cell 1250 has a negative or neutral charge in volatile memory, the storage location 62*a* will be positively charged at the end of the shadowing operation. The charges/states of the storage location 62*a* near SL terminal 72 are determined non-algorithmically by the states of the floating bodies, and shadowing of multiple cells occurs in parallel, therefore the shadowing process is very fast.

In one particular non-limiting example of the shadowing process according to this embodiment, about +6 volts are applied to terminal 72, about 0.0 volts are applied to terminal 74, about +1.2 volts are applied to terminal 70, and about +0.6 volts are applied to terminal 76. However, these voltage levels may vary, while maintaining the relative relationships between the charges applied, as described above.

A shadowing operation to storage location 62*b* near BL terminal 74 can be performed in a similar manner by reversing the voltages applied to terminals 72 and 74.

In another embodiment of the shadowing operation, the following bias conditions are applied. To perform a shadowing process to the storage location 62*a*, a high positive voltage is applied to SL terminal 72, a positive voltage is applied to WL terminal 70 and a neutral voltage or a positive voltage less positive than positive voltage applied to SL terminal 72 is applied to BW terminal 76, while the BL terminal 74 is left floating. Under this bias condition, when floating body 24 has a positive charge/voltage, the NPN bipolar junction formed by region 16, the floating body 24, and the buried well region 22 is on and electrons flow through the memory transistor. The application of the high voltage to terminal 72 energizes/accelerates electrons traveling through the floating body 24 to a sufficient extent that they can "jump into" the storage location in the trapping layer 62*a* near the SL terminal 72. Accordingly, the storage location 62*a* in the trapping layer 60 becomes negatively charged by the shadowing process, when the volatile memory of cell 1250 is in state "1" (i.e., floating body 24 is positively charged).

When volatile memory of cell 1250 is in state "0", i.e., floating body 24 has a negative or neutral charge/voltage, the NPN junction is off and electrons do not flow in the floating body 24. Accordingly, when voltages are applied to the terminals as described above, electrons are not flowing and consequently no hot electron injection into the trapping layer 60 occurs. The storage location 62*a* in trapping layer 60 will retain its charge at the end of the shadowing process when the volatile memory of cell 1250 is in state "0". As will be described in the description of reset operation, the storage locations 62 in trapping layer 60 are initialized or reset to have a positive charge during the reset operation. As a result, if the volatile memory of cell 1250 is in state "0", the storage location 62*a* will have a positive charge at the end of the shadowing process.

A shadowing operation to storage location 62*b* near BL terminal 74 can be performed in a similar manner by reversing the voltages applied to terminals 72 and 74.

When power is restored to cell 1250, the state of the cell 1250 as stored on trapping layer 60 is restored into floating body region 24. The restore operation (data restoration from non-volatile memory to volatile memory) is described with reference to FIGS. 179A and 179B. Prior to the performing the restore operation/process, the floating body 24 is set to a neutral or negative charge, i.e., a "0" state is written to floating body 24.

In the embodiment of FIGS. 179A-179B, to perform the restore operation of non-volatile data stored in storage location 62*a,* terminal 72 is set to a substantially neutral voltage, a positive voltage is applied to terminal 74, a negative voltage is applied to terminal 70 and a positive voltage is applied to terminal 76, while the substrate terminal 78 is grounded. The positive voltage applied to terminal 74 will create a depletion region, shielding the effects of charge stored in storage location 62*b*. If the storage location 62*a* is negatively charged, as illustrated in FIG. 179A, this negative charge enhances the driving force for the band-to-band hot hole injection process, whereby holes are injected from the n-region 18 into floating body 24, thereby restoring the "1" state that the volatile memory cell 1250 had held prior to the performance of the shadowing operation. If the trapping layer 62*a* is not negatively charged, such as when the trapping layer 62*a* is positively charged as shown in FIG. 179B or is neutral, the hot band-to-band hole injection process will not occur, as illustrated in FIG. 179B, resulting in memory cell 1250 having a "0" state, just as it did prior to performance of the shadowing process. Accordingly, if storage location 62*a* has a positive charge after shadowing is performed, the volatile memory of floating body 24 will be restored to have a negative charge ("0" state), but if the trapping layer 62*a* has a negative or neutral charge, the volatile memory of floating body 24 will be restored to have a positive charge ("1" state).

A restore operation of non-volatile data stored in storage location 62*b* can be performed in a similar manner to that described above with regard to storage location 62*a,* by reversing the voltages applied to terminals 72 and 74, and by applying all other conditions the same.

After the restore operation is completed, the state of the trapping layers 60 can be reset to an initial state. The reset operation of non-volatile storage location 62*a* is described with reference to FIG. 180. A high negative voltage is applied to terminal 70, a neutral or positive voltage is applied to terminal 72, a positive voltage is applied to terminal 76, and zero voltage is applied to substrate terminal 78, while terminal 74 is left floating. Under these conditions, electrons will tunnel from storage location 62*a* to the $n^+$ junction region 16. As a result, the storage location 62*a* will be positively charged.

In one particular non-limiting example of the reset process according to this embodiment, about −18 volts are applied to terminal 70, about 0.0 volts are applied to terminal 72, about +0.6 volts are applied to terminal 76, and about 0.0 volts are applied to terminal 78, while terminal 74 is left floating. However, these voltage levels may vary, while maintaining the relative relationships between the charges applied, as described above.

A reset operation on non-volatile storage location 62*b* can be performed in a similar manner to that described above with regard to storage location 62*a,* by reversing the voltages applied to terminals 72 and 74, and by applying all other conditions the same.

A reset operation can be performed simultaneously on both storage locations 62*a* and 62*b* by applying a high negative voltage to terminal 70, a neutral or positive voltage to terminals 72 and 74, and a positive voltage to terminal 76, while grounding terminal 78.

In one particular non-limiting example of the reset process according to this embodiment, about −18 volts are applied to terminal 70, about 0.0 volts are applied to terminals 72, 74 and 78, and about +0.6 volts are applied to terminal 76. However, these voltage levels may vary, while maintaining the relative relationships between the charges applied, as described above.

In another embodiment of the memory cell operation, the trapping charge is reset/reinitialized to a negative initial state. To reset the storage location 62*a,* the following bias conditions are applied: a high positive voltage is applied to WL terminal 70, a neutral voltage is applied to terminal 72, a positive voltage is applied BW terminal 76, and zero voltage is applied to terminal 78, while terminal 74 is left floating. Under these conditions, electrons will tunnel from the $n^+$ junction region 16 to storage location 62*a*. As a result, the storage location 62*a* will be negatively charged.

In one particular non-limiting example of the reset process according to this embodiment, about +18 volts are applied to terminal 70, about 0.0 volts are applied to terminals 72 and 78, about +0.6 volts are applied to terminal 76, while terminal 74 is left floating. However, these voltage levels may vary, while maintaining the relative relationships between the charges applied, as described above.

A reset operation on non-volatile storage location 62*b* can be performed in a similar manner to that described above with regard to storage location 62*a,* by reversing the voltages applied to terminals 72 and 74, and by applying all other conditions the same.

A reset operation can be performed simultaneously on both storage locations 62*a* and 62*b* by applying a high positive voltage to terminal 70, a neutral or positive voltage to terminals 72 and 74, a positive voltage to BW terminal 76, and zero voltage to terminal 78.

In one particular non-limiting example of the reset process according to this embodiment, about +18 volts are applied to terminal 70, about 0.0 volts are applied to terminals 72, 74 and 78, and about +0.6 volts are applied to terminal 76. However, these voltage levels may vary, while maintaining the relative relationships between the charges applied, as described above.

In another embodiment of the shadowing operation according to the present invention, the following bias conditions are applied. To perform a shadowing process to the storage location 62*a,* a high positive voltage is applied to SL terminal 72, a neutral or positive voltage is applied to BL terminal 74, a negative voltage is applied to WL terminal 70, a neutral voltage is applied to BW terminal 76, and a neutral voltage is applied to substrate terminal 78. Under these bias conditions, when floating body 24 has a positive charge/voltage, the NPN bipolar junction formed by regions 16 and 18 and the floating body 24 is on and electrons flow through the memory transistor. The application of the high voltage to terminal 72 energizes/accelerates electrons traveling through the floating body 24, creating electron-hole pairs through impact ionization. The negative voltage applied to the WL terminal 70 creates an attractive electric field for hot holes injection to the storage location 62*a* near the SL terminal 72. Accordingly, the storage location 62*a* in the trapping layer 60 becomes positively charged by the shadowing process, when the volatile memory of cell 1250 is in state "1" (i.e., floating body 24 is positively charged).

When volatile memory of cell 1250 is in state "0", i.e., floating body 24 has a negative or neutral charge/voltage, the NPN junction is off and electrons do not flow in the floating body 24. Accordingly, when voltages are applied to the terminals as described above, electrons are not flowing and consequently no hot holes injection into the trapping layer 60 occurs. The storage location 62*a* in trapping layer 60 will retain the negative charge at the end of the shadowing process when the volatile memory of cell 1250 is in state "0".

Accordingly, if floating body 24 has a positive charge, the storage location 62*a* will have a positive charge after the shadowing operation is performed. Conversely, if floating body 24 has a negative charge, the storage location 62*a* will have a negative charge after the shadowing operation is performed.

A shadowing operation to storage location 62*b* near BL terminal 74 can be performed in a similar manner to that described above with regard to storage location 62*a,* by reversing the voltages applied to terminals 72 and 74, and by applying all other conditions the same.

In another embodiment of the shadowing operation, the following bias conditions are applied. To perform a reset process to the storage location 62*a,* a high positive voltage is applied to SL terminal 72, a negative voltage is applied to WL terminal 70 and zero voltage is applied to BW terminal 76, while the BL terminal 74 is left floating and the substrate terminal 78 is grounded. Under these bias conditions, when floating body 24 has a positive charge/voltage, the NPN bipolar junction formed by region 16, the floating body 24, and the buried well region 22 is on and electrons flow through the memory transistor. The application of the high voltage to terminal 72 energizes/accelerates electrons traveling through the floating body 24, creating electron-hole pairs through impact ionization. The negative voltage applied to the WL terminal 70 creates an attractive electric field for hot holes injection to the storage location 62*a* near the SL terminal 72. Accordingly, the storage location 62*a* in the trapping layer 60 becomes positively charged by the shadowing process, when the volatile memory of cell 1250 is in state "1" (i.e., floating body 24 is positively charged).

When volatile memory of cell 1250 is in state "0", i.e., floating body 24 has a negative or neutral charge/voltage, the NPN junction is off and electrons do not flow in the floating body 24. Accordingly, when voltages are applied to the terminals as described above, electrons are not flowing and consequently no hot holes injection into the trapping layer 60 occurs. The storage location 62*a* in trapping layer 60 will retain the negative charge at the end of the shadowing process when the volatile memory of cell 1250 is in state "0".

Accordingly, if floating body 24 has a positive charge, the storage location 62*a* will have a positive charge after the shadowing operation is performed. Conversely, if floating body 24 has a negative charge, the storage location 62*a* will have a negative charge.

A shadowing operation to storage location 62*b* near BL terminal 74 can be performed in a similar manner to that described above with regard to storage location 62*a,* by reversing the voltages applied to terminals 72 and 74, and by applying all other conditions the same.

In another embodiment of the restore operation, terminal 72 is set to a substantially neutral voltage, a positive voltage is applied to terminal 74, a positive voltage less positive than positive voltage applied to terminal 74 is applied to terminal 70, a positive voltage is applied to terminal 76 and zero voltage is applied to terminal 78. The positive voltage applied to terminal 74 will create a depletion region, shielding the effects of charge stored in storage location 62*b.* If the storage location 62*a* is positively charged, this positive charge enhances the driving force for the impact ionization process to create hot hole injection from the n-region 18 into floating body 24, thereby restoring the "1" state that the volatile memory cell 1250 had held prior to the performance of the shadowing operation. If the trapping layer 62*a* is not positively charged, no impact ionization process will occur, resulting in memory cell 1250 having a "0" state, just as it did prior to performance of the shadowing process. Accordingly, if storage location 62*a* has a positive charge after shadowing is performed, the volatile memory of floating body 24 will be restored to have a positive charge ("1" state), but if the trapping layer 62*a* has a negative charge, the volatile memory of floating body 24 will be restored to have a neutral charge ("0" state).

A restore operation of non-volatile data stored in storage location 62*b* can be performed in a similar manner to that described above with regard to storage location 62*a,* by reversing the voltages applied to terminals 72 and 74, and by applying all other conditions the same.

FIG. 181A schematically illustrates another embodiment of a memory cell 1250S according to the present invention. The cell 1250S includes a substrate 112 of a first conductivity type, such as a p-type conductivity type, for example. Substrate 112 is typically made of silicon, but may comprise germanium, silicon germanium, gallium arsenide, or other semiconductor materials known in the art. The substrate 112 has a surface 114. A first region 116 having a second conductivity type, such as n-type, for example, is provided in substrate 112 and is exposed at surface 114. A second region 118 having the second conductivity type is also provided in substrate 112, which is exposed at surface 114 and which is spaced apart from the first region 116. First and second regions 116 and 118 are formed by an implantation process formed on the material making up substrate 112, according to any of implantation processes known and typically used in the art.

A buried insulator layer 122, such as buried oxide (BOX) is also provided in the substrate 112, buried in the substrate 112, as shown. A body region 124 of the substrate 112 is bounded by surface 114, first and second regions 116, 118, and the buried insulator layer 122. A trapping layer 160 is positioned in between the regions 116 and 118, and above the surface 114. Trapping layer 160 may be made of silicon nitride, silicon nanocrystal, or high-K dielectric materials or other dielectric materials. The trapping layer 160 functions to store non-volatile memory data. Trapping layer 160 allows having two physically separated storage locations 162*a*, 162*b* per cell, resulting in a multi-bit non-volatile functionality.

A control gate 164 is positioned above trapping layer 160 such that trapping layer 160 is positioned between control gate 164 and surface 114, as shown. Control gate 164 is typically made of polysilicon material or metal gate electrode, such as tungsten, tantalum, titanium and their nitrides.

Cell 1250S includes four terminals: word line (WL) terminal 170, bit line (BL) terminals 172 and 174, and substrate terminal 178. Terminal 170 is connected to control gate 164. Terminal 172 is connected to first region 116 and terminal 174 is connected to second region 118. Alternatively, terminal 172 can be connected to second region 118 and terminal 174 can be connected to first region 116.

FIG. 181B shows an example of an array architecture 1280S of a memory cell device according to an embodiment of the present invention, wherein memory cells 1250S are arranged in a plurality of rows and columns. Alternatively, a memory cell device according to the present invention may be provided in a single row or column of a plurality of cells 1250S, but typically, both a plurality of rows and a plurality of columns are provided. Memory cells 1250S are connected such that within each row, all of the control gates 164 are connected in a common word line terminal 170 (e.g., 170*a*, 170*b*, . . . , 170*n*, depending upon which row is being referred to). Within each column, all first and second regions 116, 118 of cells 1250S in that column are connected in common bit line terminals 172 (e.g., 172*a*, 172*b*, . . . , 172*e*) and 174 (e.g., 174*a*, 174*b*, etc.).

Because each cell 1250S is provided with a buried insulator layer 122 that, together with regions 116 and 118, bound the lower and side boundaries of floating body 124, insulating layers 26 are not required to bound the sides of the floating body 24, in contrast to that of the embodiment of FIG. 173A. Because insulating layers 26 are not required by cells 1250S, less terminals are required for operation of the memory cells 1250S in an array of such cells 1250S assembled into a memory cell device. Because the adjacent cells 1250S are not isolated by insulating layer 26, adjacent regions 116, 118 are also not isolated by insulating layer 26. Accordingly a single terminal 172 or 174 can be used to function as terminal 174 for region 118 of one of a pair of adjacent cells 1250S, and, by reversing the polarity thereof, can also be used to function as terminal 172 for regions 116 of the other of the pair of adjacent cells 1250S, wherein region 118 of the first cell 1250S of the pair contacts region 116 of the second cell 1250S of the pair. For example, in FIG. 181B, terminal 174*a* can be operated to function as terminal 174 for region 118 of cell 1250Sa with voltage applied according to a first polarity. By reversing the polarity of the voltage applied to terminal 174*a*, terminal 174*a* can be operated to function as terminal 172 for region 116 of cell 1250Sb. By reducing the number of terminals required in a memory cell device, as allowed by this described arrangement, a memory device according to this embodiment of the present invention can be manufactured to have a smaller volume, relative to a memory cell device of the same capacity that requires a pair of terminals 172, 174 for each cell that is separate and distinct from the terminals 172, 174 of adjacent cells in the row.

FIGS. 182-184 show another embodiment of memory cell 1250V according to the present invention. In this embodiment, cell 1250V has a fin structure 252 fabricated on substrate 212, so as to extend from the surface of the substrate to form a three-dimensional structure, with fin 252 extending substantially perpendicularly to, and above the top surface of the substrate 212. Fin structure 252 is conductive and is built on buried well layer 222. Region 222 is also formed by an ion implantation process on the material of substrate 212. Buried well layer 222 insulates the floating substrate region 224, which has a first conductivity type, from the bulk substrate 212. Fin structure 252 includes first and second regions 216, 218 having a second conductivity type. Thus, the floating body region 224 is bounded by the top surface of the fin 252, the first and second regions 216, 218 the buried well layer 222, and insulating layers 226 (see insulating layers 226 in FIG. 184). Insulating layers 226 insulate cell 1250V from neighboring cells 1250V when multiple cells 50 are joined to make a memory device. Fin 252 is typically made of silicon, but may comprise germanium, silicon germanium, gallium arsenide, carbon nanotubes, or other semiconductor materials known in the art.

Device 1250V further includes gates 264 on two opposite sides of the floating substrate region 224 as shown in FIG. 182. Alternatively, gates 264 can enclose three sides of the floating substrate region 224 as shown in FIG. 183. Gates 264 are insulated from floating body 224 by trapping layer 260. Gates 264 are positioned between the first and second regions 16, 18, adjacent to the floating body 24.

Device 1250V includes several terminals: word line (WL) terminal 70, source line (SL) terminal 72, bit line (BL) terminal 74, buried well (BW) terminal 76 and substrate terminal 78. Terminal 70 is connected to the gate 264. Terminal 72 is connected to first region 216 and terminal 74 is connected to second region 218. Alternatively, terminal 72 can be connected to second region 218 and terminal 74 can be connected to first region 216. Terminal 76 is connected to buried layer 222 and terminal 78 is connected to substrate 212. FIG. 184 illustrates the top view of the memory cell 1250V shown in FIG. 182.

Up until this point, the descriptions of cells 1250, 1250S, 1250V have been in regard to binary cells in which the data memories, both volatile (e.g., 24, 124, 224) and non-volatile (e.g., 62*a*, 62*b*, 162*a*, 162*b*, 262*a* and 262*b* are binary, meaning that each memory storage location either stores a state "1" or a state "0". In alternative embodiments, any of the memory cells 1250, 1250S, 1250V can be configured to function as multi-level cells, so that more than one bit of data can be stored in one storage location of a cell. Thus, for example, one or more of volatile memory 24, 124, 224; non-volatile memory 62*a*, 162*a*, 262*a*; and/or non-volatile memory 62*b*, 162*b*, 262*b* can be configured to store multiple bits of data.

FIG. 185A illustrates the states of a binary memory storage, relative to threshold voltage, wherein a threshold voltage less than or equal to a predetermined voltage (in one example, the predetermined voltage is 0 volts, but the predetermined voltage may be a higher or lower voltage) in memory cell 1250, 1250S, 1250V is interpreted as state "1", and a voltage greater than the predetermined voltage in memory cell 1250, 1250S or 1250V is interpreted as state "0".

FIG. 185B illustrates an example of voltage states of a multi-level storage wherein two bits of data can be stored in any or each of storage locations 24, 124, 224, 62*a*, 62*b*, 162*a*, 162*b*, 262*a*, 262*b*. In this case, a threshold voltage less than or equal to a first predetermined voltage (e.g., 0 volts or some other predetermined voltage) and greater than a second predetermined voltage that is less than the first predetermined voltage (e.g., about −0.5 volts or some other voltage less than the first predetermined voltage) in memory cell 1250, 1250S, 1250V is interpreted as state "10", a voltage less than or equal to the second predetermined voltage is interpreted as state "11", a voltage greater than the first predetermined voltage and less than or equal to a third predetermined voltage that is greater than the first predetermined voltage (e.g., about +0.5 volts or some other predetermined voltage that is greater than the first predetermined voltage) is interpreted to be state "01" and a voltage greater than the third predetermined voltage is interpreted as state "00". Further details about multi-level operation can be found in co-pending, commonly owned application Ser. No. 11/996,311 filed Nov. 29, 2007. application Ser. No. 11/996, 311 is hereby incorporated herein, in its entirety, by reference thereto.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

Figure 186A:
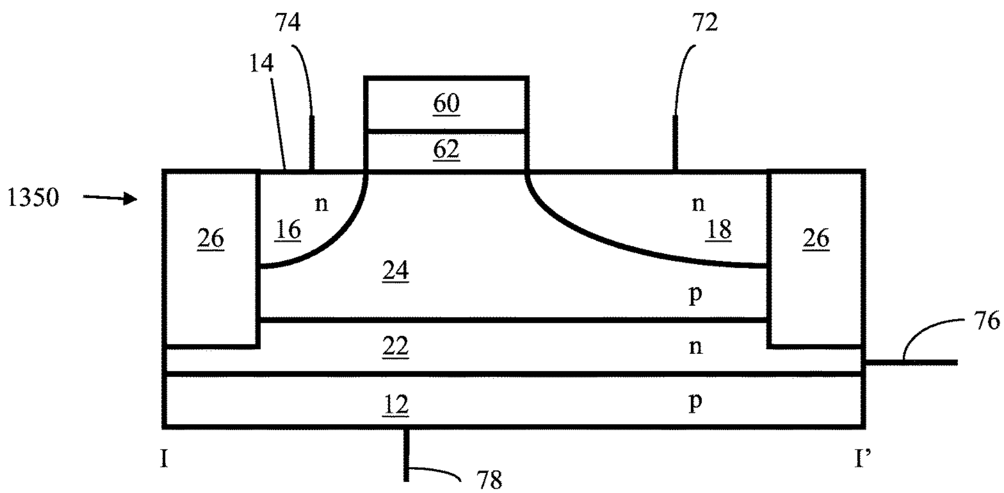
Figure 186B:
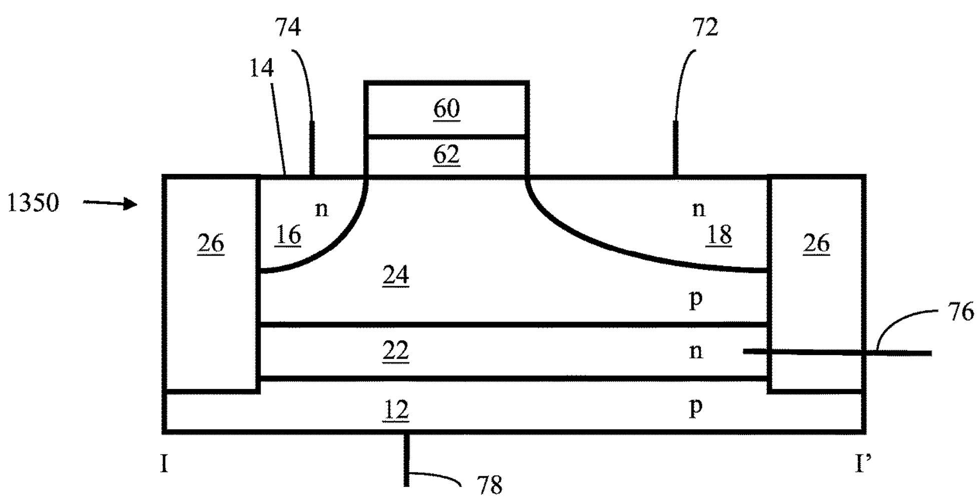

FIG. 186A illustrates the schematic cross-sectional view of memory cell 1350 according to the present invention, respectively. Memory cell 1350 includes a substrate 12 of a first conductivity type such as p-type, for example. Substrate 12 is typically made of silicon, but may also comprise, for example, germanium, silicon germanium, gallium arsenide, carbon nanotubes, or other semiconductor materials. In some embodiments of the invention, substrate 12 can be the bulk material of the semiconductor wafer. In other embodiments, substrate 12 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 12 will usually be drawn as the semiconductor bulk material as it is in FIG. 186A.

A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by bit line region 16, source line region 18, and insulating layer 62, on the sides by insulating layers 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments, as a matter of design choice.

Insulating layers 26 (like, for example, shallow trench isolation (STI)), may be made of silicon oxide, for example, though other insulating materials may be used. Insulating layers 26 insulates cell 1350 from neighboring cells 1350 when multiple cells 1350 are joined in an array 1380 to make a memory device. The bottom of insulating layer 26 may reside inside the buried region 22 allowing buried region 22 to be continuous as shown in FIG. 186A. Alternatively, the bottom of insulating layer 26 may reside below the buried region 22 as shown in the cross-sectional view of another embodiment of memory cell 1350 in FIG. 186B. This requires a shallower insulating layer 28, which insulates the floating body region 24, but allows the buried layer 22 to be continuous in the perpendicular direction of the cross-sectional view shown in FIG. 186B. For simplicity, only memory cell 1350 with continuous buried region 22 in all directions will be shown from hereon.

A bit line region 16 having a second conductivity type, such as n-type, for example, is provided in floating body region 24 and is exposed at surface 14. Bit line region 16 is formed by an implantation process formed on the material making up substrate 12, according to any implantation process known and typically used in the art. Alternatively, a solid state diffusion process could be used to form bit line region 16.

A source line region 18 having a second conductivity type, such as n-type, for example, is also provided in floating body region 24 and is exposed at surface 14. Source line region 18 is formed by an implantation process formed on the material making up substrate 12, according to any implantation process known and typically used in the art. Alternatively, a solid state diffusion process could be used to form source line region 18.

Memory cell 1350 is asymmetric in that the area of source line region 18 is larger than that of bit line region 16. The larger source line region 18 results in a higher coupling between the source line region 18 and floating gate 60, as compared to the coupling between the bit line region 16 and the floating gate 60.

A floating gate 60 is positioned in between the bit line region 16 and source line region 18 and above the floating body region 24. The floating gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The floating gate 60 may be made of, for example, polysilicon material or metal gate electrode, such as tungsten, tantalum, titanium and their nitrides.

Cell 1350 is a single polysilicon floating gate memory cell. As a result, cell 1350 is compatible with typical complementary metal oxide semiconductor (CMOS) processes. The floating gate 60 polysilicon materials can be deposited and formed in conjunction with the gates of logic transistors. This is compared for example with stacked gate Flash memory device, where a second polysilicon gate (e.g. a control gate) is stacked above a polysilicon floating gate (see for example FIG. 4.6 on p. 197 in "Nonvolatile Semiconductor Memory Technology", W. D. Brown and J. E. Brewer "Brown"), which is hereby incorporated herein, in its entirety, by reference thereto. Such stacked gate memory cell typically require dual (or more) polysilicon layer processing, where the first polysilicon (e.g. floating gate) is deposited and formed, followed by the formation of a second polysilicon (e.g. control gate) layer.

Cell 1350 includes several terminals: bit line (BL) terminal 74 electrically connected to bit line region 16, source line (SL) terminal 72 electrically connected to source line region 18, buried well (BW) terminal 76 electrically connected to buried layer 22, and substrate terminal 78 electrically connected to the substrate 12. There is no electrical connection to floating gate 60. As a result, floating gate 60 is floating and is used as the non-volatile storage region.

Figure 186C:
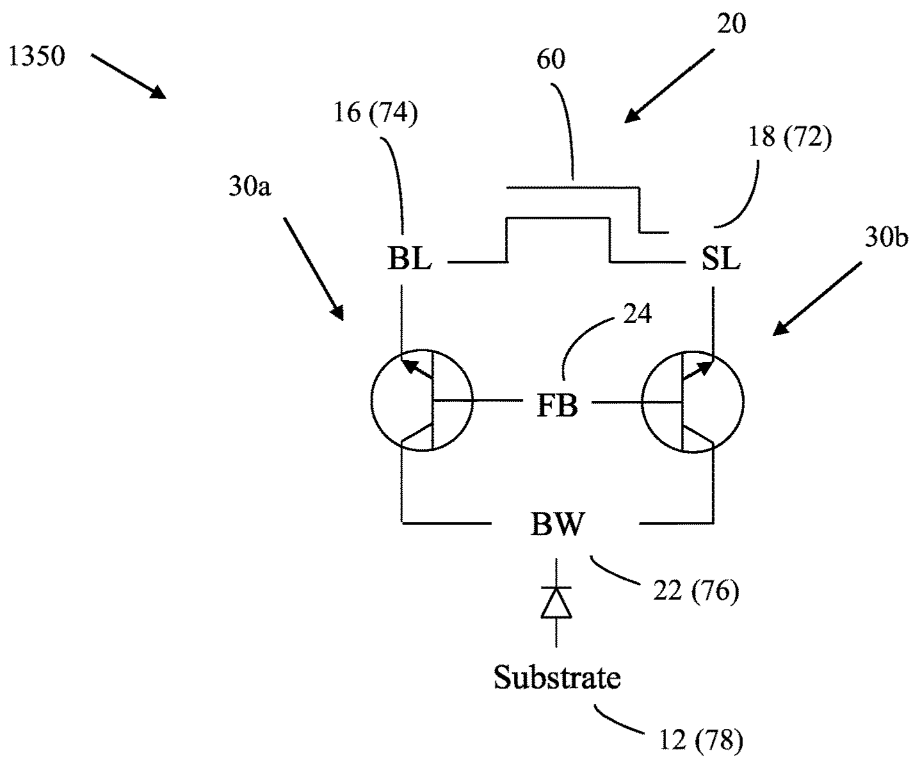
Figure 186D:
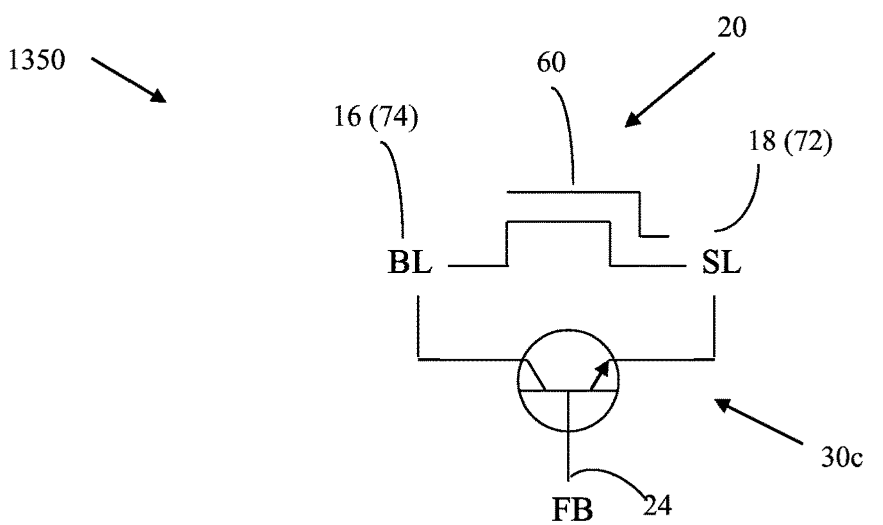

FIG. 186C illustrates the equivalent circuit representation of memory cell 1350. Inherent in memory cell 1350 are metal-oxide-semiconductor (MOS) transistor 20, formed by bit line region 16, floating gate 60, source line region 18, and floating body region 24, and bipolar devices 30*a* and 30*b*, formed by buried well region 22, floating body region 24, and bit line region 16 or source line region 18, respectively.

Also inherent in memory device 1350 is bipolar device 30*c*, formed by bit line region 16, floating body 24, and source line region 18. For drawings clarity, bipolar device 30*c* is shown separately in FIG. 186D.

Figure 186E:
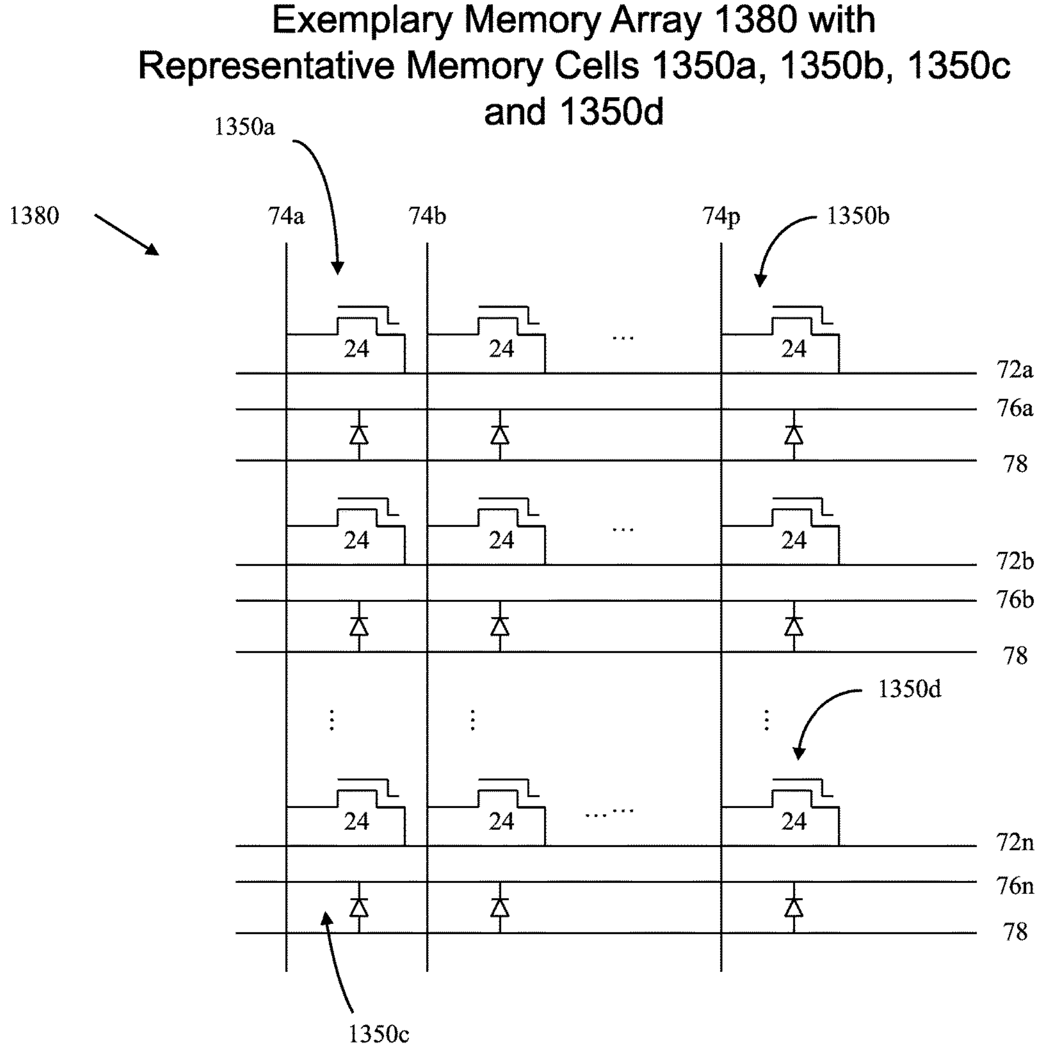

FIG. 186E illustrates an exemplary memory array 1380 of memory cells 1350 (four exemplary instances of memory cell 1350 being labeled as 1350*a*, 1350*b*, 1350*c* and 1350*d*) arranged in rows and columns. In many, but not necessarily all, of the figures where exemplary array 1380 appears, representative memory cell 1350*a* will be representative of a "selected" memory cell 1350 when the operation being described has one (or more in some embodiments) selected memory cells 1350. In such figures, representative memory cell 1350*b* will be representative of an unselected memory cell 1350 sharing the same row as selected representative memory cell 1350*a*, representative memory cell 1350*c* will be representative of an unselected memory cell 1350 sharing the same column as selected representative memory cell 1350*a*, and representative memory cell 1350*d* will be representative of a memory cell 1350 sharing neither a row or a column with selected representative memory cell 1350*a*.

Present in FIG. 186E are source lines 72*a* through 72*n*, bit lines 74*a* through 74*p*, buried well terminals 76*a* through 76*n*, and substrate terminal 78. Each of the source lines 72*a* through 72*n* is associated with a single row of memory cells 1350 and is coupled to the source line region 18 of each memory cell 1350 in that row. Each of the bit lines 74*a* through 74*p* is associated with a single column of memory cells 1350 and is coupled to the bit line region 16 of each memory cell 1350 in that column.

Substrate 12 is present at all locations under array 1380. Persons of ordinary skill in the art will appreciate that one or more substrate terminals 78 may be present in one or more locations as a matter of design choice. Such skilled persons will also appreciate that while exemplary array 1380 is shown as a single continuous array in FIG. 186E, that many other organizations and layouts are possible. For example, word lines may be segmented or buffered, bit lines may be segmented or buffered, source lines may be segmented or buffered, the array 1380 may be broken into two or more sub-arrays, and/or control circuits such as word decoders, column decoders, segmentation devices, sense amplifiers, write amplifiers may be arrayed around exemplary array 1380 or inserted between sub-arrays of array 1380. Thus the exemplary embodiments, features, design options, etc., described are not limiting in any way.

FIG. 187 shows a flowchart 100 describing the operation of the memory device 1350. At event 102, when power is first applied to the memory device, the memory device is placed in an initial state, where the nonvolatile memory portion of the device is set to a predetermined state. At event 104, the memory device 1350 operates in the volatile operational mode. During power shutdown, or when power is inadvertently lost, or any other event that discontinues or upsets power to the memory device 1350, the content of the volatile memory is loaded into the non-volatile memory portion at event 106, during a process which is referred to here as "shadowing". A shadowing operation can also be performed during backup operations, which may be performed at regular intervals during volatile operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period that is longer than the time period required to perform the shadowing process with careful consideration of the non-volatile memory reliability.

After the content of the volatile memory has been moved during a shadowing operation, the shutdown of the memory device 1350 occurs, as power is no longer supplied to the volatile memory. At this time, the memory device retains the stored data in the nonvolatile memory. Upon restoring power at event 108, the content of the nonvolatile memory is restored by transferring the content of the nonvolatile memory to the volatile memory in a process referred to herein as the "restore" process, after which, upon resetting the memory device at event 110, the memory device 1350 may be reset to the initial state 102 and again operates in a volatile mode at event 104.

In one embodiment, the non-volatile memory (e.g. the floating gate 60) is initialized to have a positive charge at event 102. When power is applied to cell 1350, cell 1350 stores the memory information (i.e. data that is stored in memory) as charge in the floating body 24 of the memory device 1350. The presence of the electrical charge in the floating body 24 modulates the current flow through the memory device 1350 (from the BL terminal 74 to the SL terminal 72). The current flowing through the memory device 1350 can be used to determine the state of the cell 1350. Because the non-volatile memory element (e.g. the floating gate 60) is initialized to have a positive charge, any cell current differences are attributed to the differences in charge of the floating body 24.

Several operations can be performed to memory cell 1350 during volatile mode: holding, read, write logic-1 and write logic-0 operations.

FIG. 188 shows the holding operation on memory array 1380, which consists of a plurality of memory cells 1350. The holding operation is performed by applying a positive back bias to the BW terminal 76, and zero bias on the BL terminal 74 and SL terminal 72. The positive back bias applied to the buried layer region connected to the BW terminal will maintain the state of the memory cell 1350 that it is connected to.

From the equivalent circuit representation of memory cell 1350 shown in FIG. 186C, inherent in the memory cell 1350 is n-p-n bipolar devices 30*a* and 30*b* formed by buried well region 22 (the collector region), floating body 24 (the base region), and bit line region 16 or source line region 18 (the emitter region), respectively.

FIG. 189A shows the energy band diagram of the intrinsic n-p-n bipolar device 30*a* when the floating body region 24 is positively charged and a positive bias voltage is applied to the buried well region 22. The energy band diagram of the n-p-n device 30*b* is similar to the one shown in FIG. 189A, with the source line region 18 (connected to SL terminal 72) replacing the bit line region 16 (connected to BL terminal 74). The dashed lines indicate the Fermi levels in the various regions of the n-p-n transistor 30*a*. The Fermi level is located in the band gap between the solid line 17 indicating the top of the valence band (the bottom of the band gap) and the solid line 19 indicating the bottom of the conduction band (the top of the band gap) as is well known in the art. If floating body 24 is positively charged, a state corresponding to logic-1, the bipolar transistors 30*a* and 30*b* will be turned on as the positive charge in the floating body region lowers the energy barrier of electron flow into the base region. Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. This process restores the charge on floating body 24 and will maintain the charge stored in the floating body region 24 which will keep the n-p-n bipolar transistors 30*a* and 30*b* on for as long as a positive bias is applied to the buried well region 22 through BW terminal 76.

If floating body 24 is neutrally charged (the voltage on floating body 24 being equal to the voltage on grounded bit line region 16), a state corresponding to logic-0, no current will flow through the n-p-n transistors 30*a* and 30*b*. The bipolar devices 30*a* and 30*b* will remain off and no impact ionization occurs. Consequently memory cells in the logic-0 state will remain in the logic-0 state.

FIG. 189B shows the energy band diagram of the intrinsic n-p-n bipolar device 130*a* when the floating body region 24 is neutrally charged and a bias voltage is applied to the buried well region 22. In this state the energy level of the band gap bounded by solid lines 17A and 19A is different in the various regions of n-p-n bipolar device 30*a*. Because the potential of the floating body region 24 and the bit line region 16 is equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 30 will remain off.

In the holding operation described in FIG. 188, there is no individually selected memory cell. Rather cells are selected in rows by the buried well terminals 76*a* through 76*n* and may be selected as individual rows, as multiple rows, or as all of the rows comprising array 1380.

In one embodiment the bias condition for the holding operation for memory cell 1350 is: 0 volts is applied to BL terminal 74, 0 volts is applied to SL terminal 72, a positive voltage like, for example, +1.2 volts is applied to BW terminal 76, and 0 volts is applied to the substrate terminal 78. In other embodiments, different voltages may be applied to the various terminals of memory cell 1350 as a matter of design choice and the exemplary voltages described are therefore not limiting.

The read operation of the memory cell 1350 and array 1380 of memory cells will described in conjunction with FIGS. 190A and 190B. Any sensing scheme known in the art can be used with memory cell 1350. Examples include, for example, the sensing schemes disclosed in "Memory Design Using One-Transistor Gain Cell on SOI", T. Ohsawa et al., pp. 152-153, Tech. Digest, 2002 IEEE International Solid-State Circuits Conference, February 2002) ("Ohsawa-1") and "An 18.5 ns 128 Mb SOI DRAM with a Floating Body Cell", Ohsawa et al., pp. 458-459, 609, IEEE International Solid-State Circuits Conference, 2005 ("Ohsawa-2"), both of which are hereby incorporated herein, in their entireties, by reference thereto.

The amount of charge stored in the floating body 24 can be sensed by monitoring the cell current of the memory cell 1350. If memory cell 1350 is in a logic-1 state having holes in the body region 24, then the memory cell will have a higher cell current (e.g. current flowing from the BL terminal 74 to SL terminal 72), compared to if cell 1350 is in a logic-0 state having no holes in floating body region 24. A sensing circuit typically connected to BL terminal 74 can then be used to determine the data state of the memory cell.

A read operation may be performed through an active bit line high (see FIG. 190A) or an active source line high (see FIG. 190B) scheme. In an active bit line high, a positive bias is applied to the selected BL terminal 74, zero voltage is applied to the selected SL terminal 72, zero or positive voltage is applied to the selected BW terminal 76 and zero voltage is applied to the substrate terminal 78.

In one exemplary embodiment, about 0.0 volts is applied to the selected SL terminal 72*a,* about +0.4 volts is applied to the selected bit line terminal 74*a,* about +1.2 volts is applied to the selected buried well terminal 76*a,* and about 0.0 volts is applied to substrate terminal 78. All unselected bit line terminals 74*b* through 74*p* have 0.0 volts applied or left floating, the unselected SL terminals 72*b* through 72*p* have +0.4 volts applied or left floating, while the unselected BW terminals 76*b* through 76*p* can be grounded or have +1.2 volts applied to maintain the states of the unselected cells 1350, and 0.0 volts is applied to the substrate terminal 78. FIG. 190A shows the bias conditions for the selected representative memory cell 1350*a* and three unselected representative memory cells 1350*b,* 1350*c,* and 1350*d* in memory array 1380, each of which has a unique bias condition. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

In an active source line high, a positive bias is applied to the selected SL terminal 72, zero voltage is applied to the selected BL terminal 74, zero or positive voltage is applied to the selected BW terminal 76 and zero voltage is applied to the substrate terminal 78.

In one exemplary embodiment, about +0.4 volts is applied to the selected SL terminal 72*a,* about 0.0 volts is applied to the selected bit line terminal 74*a,* about +1.2 volts is applied to the selected buried well terminal 76*a,* and about 0.0 volts is applied to substrate terminal 78. All unselected bit line terminals 74*b* through 74*p* have +0.4 volts applied or left floating, the unselected SL terminals 72*b* through 72*p* have 0.0 volts applied or left floating, while the unselected BW terminals 76*b* through 76*p* can be grounded or have +1.2 volts applied to maintain the states of the unselected cells 1350, and 0.0 volts is applied to the substrate terminal 78. FIG. 190B shows the bias conditions for the selected representative memory cell 1350*a* and three unselected representative memory cells 1350*b,* 1350*c,* and 1350*d* in memory array 1380, each of which has a unique bias condition. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

A write logic-0 operation of an individual memory cell 1350 is now described with reference to FIGS. 191A and 191B. In FIG. 191A, a negative voltage bias is applied to the SL terminal 72, a zero voltage bias is applied to BL terminal 74, zero or positive voltage is applied to the selected BW terminal 76 and zero voltage is applied to the substrate terminal 78. Under these conditions, the p-n junction between floating body 24 and source line region 18 of the selected cell 1350 is forward-biased, evacuating any holes from the floating body 24. Because the SL terminal 72 is shared among multiple memory cells 1350, logic-0 will be written into all memory cells 1350 including memory cells 1350*a* and 1350*b* sharing the same SL terminal 72*a* simultaneously.

In one particular non-limiting embodiment, about −0.5 volts is applied to source line terminal 72, about 0.0 volts is applied to bit line terminal 74, about 0.0 volts or +1.2 volts is applied to BW terminal 76, and about 0.0 volts is applied to substrate terminal 78. These voltage levels are exemplary only may vary from embodiment to embodiment as a matter of design choice. Thus the exemplary embodiments, features, bias levels, etc., described are not limiting in any way.

In FIG. 191B, a negative voltage bias is applied to the BL terminal 74, a zero voltage bias is applied to SL terminal 72, zero or positive voltage is applied to the selected BW terminal 76 and zero voltage is applied to the substrate terminal 78. Under these conditions, the p-n junction between floating body 24 and bit line region 16 of the selected cell 1350 is forward-biased, evacuating any holes from the floating body 24. Because the BL terminal 74 is shared among multiple memory cells 1350 in memory array 1380, logic-0 will be written into all memory cells 1350 including memory cells 1350*a* and 1350*c* sharing the same BL terminal 74*a* simultaneously.

In one particular non-limiting embodiment, about −0.5 volts is applied to bit line terminal 74, about 0.0 volts is applied to source line terminal 72, about 0.0 volts or +1.2 volts is applied to BW terminal 76, and about 0.0 volts is applied to substrate terminal 78. These voltage levels are exemplary only may vary from embodiment to embodiment as a matter of design choice. Thus the exemplary embodiments, features, bias levels, etc., described are not limiting in any way.

Both write logic-0 operations referred to above each has a drawback that all memory cells 1350 sharing either the same SL terminal 72 (the first type—row write logic-0) or the same BL terminal 74 will (the second type—column write logic-0) be written to simultaneously and as a result, does not allow writing logic-0 to individual memory cells 1350. To write arbitrary binary data to different memory cells 1350, a write logic-0 operation is first performed on all the memory cells to be written followed by one or more write logic-1 operations on the bits that must be written to logic-1.

FIGS. 192A and 192B describe write logic-1 operations using active bit line high scheme and active source line high scheme, respectively. Under active bit line high scheme, the following bias condition is applied: a positive voltage is applied to the selected BL terminal 74, zero voltage is applied to the selected SL terminal 72, zero or positive voltage is applied to the selected BW terminal 76 and zero voltage is applied to the substrate terminal 78. A positive voltage less than the positive voltage applied to the selected BL terminal 74 is applied to the unselected SL terminals 72 (e.g. SL terminals 72*b* through 72*n* in FIG. 192A), while zero voltage is applied to the unselected BL terminals 74 (e.g. BL terminals 74*b* through 74*p* in FIG. 192A). Alternatively, the unselected SL and BL terminals can be left floating.

Because the floating gate 60 is positively charged, electrons will flow through the selected memory cell 1350*a* from the SL terminal 72*a* to the BL terminal 74*a*. The bias conditions on the selected terminals are configured such that the MOS device 20 of the selected cell 1350*a* is in saturation (i.e. the voltage applied to the BL terminal 74 is greater than the difference between the voltage floating gate 60 and the threshold voltage of the MOS device 20). As a result, electrons will be accelerated in the pinch-off region of the MOS device 20, creating hot carriers in the vicinity of the bit line region 16. The generated holes will then flow into the floating body 24, putting the cell 1350*a* to the logic-1 state.

In one particular non-limiting embodiment, about +1.2 volts is applied to the selected bit line terminal 74, about 0.0 volts is applied to source line terminal 72, about 0.0 volts or +1.2 volts is applied to BW terminal 76, and about 0.0 volts is applied to substrate terminal 78; while about 0.0 volts is applied to the unselected bit line terminal 74 and about +0.4 volts is applied to the unselected source line terminal 72. These voltage levels are exemplary only may vary from embodiment to embodiment as a matter of design choice. Thus the exemplary embodiments, features, bias levels, etc., described are not limiting in any way.

For memory cells sharing the same row as the selected memory cell (e.g. cell 1350*b*), both the BL and SL terminals are grounded and no current will flow through. These cells will be at the holding mode with a positive voltage applied to the BW terminal 76.

For memory cells sharing the same column as the selected memory cell (e.g. cell 1350*c*), the positive bias applied to the unselected SL terminal will turn off the MOS device 20 of these cells. Consequently, no current will flow through. A smaller holding current will flow through these cells because of the smaller difference between the BW terminal 76 and the SL terminal 72. However, because write operation is accomplished much faster (in the order of nanoseconds) compared to the lifetime of the charge in the floating body 24 (in the order of milliseconds), it should cause little disruptions to the charge stored in the floating body.

For memory cells sharing neither the same row nor the same column as the selected memory cell (e.g. cell 1350*d*), the SL terminal is positively biased while the BL terminal is grounded. However, the positive bias applied to the SL terminal is kept low enough so that no impact ionization occurs. These cells will be at the holding mode, where memory cells in state logic-1 will maintain the charge in floating body 24 while memory cells in state logic-0 will remain in neutral state.

FIG. 192B illustrates the write logic-1 operation under the active source line high scheme, where the following bias condition is applied: a positive voltage is applied to the selected SL terminal 72, zero voltage is applied to the selected BL terminal 74, zero or positive voltage is applied to the selected BW terminal 76 and zero voltage is applied to the substrate terminal 78. A positive voltage less than the positive voltage applied to the selected SL terminal 72 is applied to the unselected BL terminals 74 (e.g. BL terminals 74*b* through 74*p* in FIG. 192B), while zero voltage is applied to the unselected SL terminals 72 (e.g. SL terminals 72*b* through 72*n* in FIG. 192B). Alternatively, the unselected SL and BL terminals can be left floating.

The positive charge on the floating gate 60 combined with the capacitive coupling from the source line region 18 will turn on the MOS device 20 of the selected cell 1350*a*. As a result, electrons will flow through the selected memory cell 1350*a* from the BL terminal 74*a* to the SL terminal 72*a*. The bias conditions on the selected terminals are configured such that the MOS device 20 of the selected cell 1350*a* is in saturation (i.e. the voltage applied to the SL terminal 72 is greater than the difference between the voltage floating gate 60 and the threshold voltage of the MOS device 20). As a result, electrons will be accelerated in the pinch-off region of the MOS device 20, creating hot carriers in the vicinity of the source line region 18. The generated holes will then flow into the floating body 24, putting the cell 1350*a* to the logic-1 state.

In one particular non-limiting embodiment, about +1.2 volts is applied to the selected source line terminal 72, about 0.0 volts is applied to the selected bit line terminal 74, about 0.0 volts or +1.2 volts is applied to BW terminals 76, and about 0.0 volts is applied to substrate terminal 78; while about 0.0 volts is applied to the unselected source line terminals 72 and about +0.4 volts is applied to the unselected bit line terminals 74. These voltage levels are exemplary only may vary from embodiment to embodiment as a matter of design choice. Thus the exemplary embodiments, features, bias levels, etc., described are not limiting.

For memory cells sharing the same row as the selected memory cell (e.g. cell 1350*b*), the positive bias applied to the unselected BL terminal will turn off the MOS device 20 of these cells. Consequently, no current will flow through. A smaller holding current will flow through these cells because of the smaller difference between the BW terminal 76 and the SL terminal 72. However, because the write operation is accomplished much faster (in the order of nanoseconds) compared to the lifetime of the charge in the floating body 24 (in the order of milliseconds), it should cause little disruptions to the charge stored in the floating body.

For memory cells sharing the same column as the selected memory cell (e.g. cell 1350*c*), both the BL and SL terminals are grounded and no current will flow through. These cells will be at the holding mode with a positive voltage applied to the BW terminal 76.

For memory cells sharing neither the same row nor the same column as the selected memory cell (e.g. cell 1350*d*), the BL terminal is positively biased while the SL terminal is grounded. However, the positive bias applied to the BL terminal is kept low enough so that no impact ionization occurs. These cells will be at the holding mode, where memory cells in state logic-1 will maintain the charge in floating body 24 while memory cells in state logic-0 will remain in neutral state.

When power down is detected, e.g., when a user turns off the power to cell 1350, or the power is inadvertently interrupted, or for any other reason, power is at least temporarily discontinued to cell 1350, data stored in the floating body region 24 is transferred to floating gate 60. This operation is referred to as "shadowing" and is described with reference to FIGS. 193A-193C.

FIGS. 193A-193C illustrate an embodiment of operation of cell 1350 to perform a volatile to non-volatile shadowing process, which operates by a hot electron injection process. To perform a shadowing process, the following bias conditions are applied: a positive voltage is applied to the SL terminal 72, zero voltage is applied to the BL terminal 74, zero or positive voltage is applied to the BW terminal 76, and zero voltage is applied to the substrate terminal 78.

In one particular non-limiting embodiment, about +6.0 volts is applied to the source line terminal 72, about 0.0 volts is applied to bit line terminal 74, about 0.0 volts or +1.2 volts is applied to BW terminal 76, and about 0.0 volts is applied to substrate terminal 78. These voltage levels are exemplary only may vary from embodiment to embodiment as a matter of design choice. Thus the exemplary embodiments, features, bias levels, etc., described are not limiting in any way.

FIG. 193B illustrates the cross section of cell 1350 during a shadowing process when floating body 24 is positively charged. When floating body 24 has a positive charge/voltage, the MOS device 20 and the bipolar device 30*c* are on, and electrons flow from the bit line region 16 to the source line region 18 (in the direction of the arrow shown in FIG. 193B). The application of the positive voltage to terminal 72 at source line region 18 energizes/accelerates electrons traveling through the floating body 24 to a sufficient extent that they can "jump over" the oxide barrier between floating body 24 and floating gate 60, so that electrons enter floating gate 60 (as indicated by the arrow into floating gate 60 in FIG. 193B). Accordingly, floating gate 60 becomes negatively charged by the shadowing process, when the volatile memory of cell 1350 is in logic-1 state (i.e., floating body 24 is positively charged), as shown in FIG. 193B.

FIG. 193C illustrates the cross section of cell 1350 during a shadowing process when floating body 24 is neutral. When floating body 24 is neutral, the MOS device 20 and the bipolar device 30*c* are off, and no electrons flow through the cell 1350. Accordingly, floating gate 60 retains its positive charge at the end of the shadowing process, when the volatile memory of cell 1350 is in logic-0 state (i.e., floating body 24 is neutral), as shown in FIG. 193C.

A positive voltage less than the positive voltage on the SL terminal 72 can also be applied to the BL terminal 74 to ensure that only memory cells 1350 with positive floating body 24 is conducting current during shadowing operation.

Note that upon the completion of the shadowing operation, the charge state of the floating gate 60 is complementary to that of the floating body 24. Thus, if the floating body 24 of the memory cell 1350 has a positive charge in volatile memory, the floating gate 60 will become negatively charged by the shadowing process, whereas if the floating body 24 of the memory cell 1350 has a negative or neutral charge in volatile memory, the floating gate layer 60 will be positively charged at the end of the shadowing operation. The charges/states of the floating gates 60 are determined non-algorithmically by the states of the floating bodies, and shadowing of multiple cells occurs in parallel, therefore the shadowing process is very fast.

When power is restored to cell 1350, the state of the cell 1350 as stored on floating gate 60 is restored into floating body region 24. The restore operation (data restoration from non-volatile memory to volatile memory) is described with reference to FIGS. 194A-194C. Prior to the restore process, the floating bodies 24 are set to neutral state, which is the state of the floating bodies when power is removed from the memory device 1350. To perform the restore process, the following bias conditions are applied: a positive voltage is applied to the BL terminal 74, zero voltage is applied to the SL terminal 72, zero or positive voltage is applied to the BW terminal 76, and zero voltage is applied to the substrate terminal 78.

In one particular non-limiting embodiment, about +3.0 volts is applied to the bit line terminal 74, about 0.0 volts is applied to source line terminal 72, about 0.0 volts or +1.2 volts is applied to BW terminal 76, and about 0.0 volts is applied to substrate terminal 78. These voltage levels are exemplary only may vary from embodiment to embodiment as a matter of design choice. Thus the exemplary embodiments, features, bias levels, etc., described are not limiting in any way.

FIG. 194B illustrates the cross section of cell 1350 during restore process when floating gate 60 is negatively charged. The negative charge on the floating gate 60 and the positive voltage on BL terminal 74 create a strong electric field between the bit line region 16 and the floating body region 24 in the proximity of floating gate 60. This bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state. This process is well known in the art as band-to-band tunneling or gate induced drain leakage (GIDL) mechanism and is illustrated in for example in "A Design of a Capacitor-less 1T-DRAM Cell Using Gate-Induced Drain Leakage (GIDL) Current for Low-power and High-speed Embedded Memory", Yoshida et al., pp. 913-918, International Electron Devices Meeting, 2003 ("Yoshida") (specifically FIGS. 2 and 6 on page 3 and FIG. 9 on page 4), which is hereby incorporated herein, in its entirety, by reference thereto.

FIG. 194C illustrates the cross section of cell 1350 during restore process when floating gate 60 is positively charged. The positive charge on the floating gate 60 and the bit line region 16 do not result in strong electric field to drive hole injection into the floating body 24. Consequently, the floating body 24 will remain in neutral state.

It can be seen that if floating gate 60 has a positive charge after shadowing is performed, the volatile memory of floating body 24 will be restored to have a neutral charge (logic-0 state), but if the floating gate 60 has a negative charge, the volatile memory of floating body 24 will be restored to have a positive charge (logic-1 state), thereby restoring the original state of the floating body 24 prior to the shadowing operation. Note that this process occurs non-algorithmically, as the state of the floating gate 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention.

After restoring the memory cell(s) 1350, the floating gate(s) 60 is/are reset to a predetermined state, e.g., a positive state, so that each floating gate 60 has a known state prior to performing another shadowing operation. The reset process operates by the mechanism of band-to-band tunneling hole injection to the floating gate(s) 60, as illustrated in FIG. 195.

The reset mechanism follows a similar mechanism as the restore process. A negatively charged floating gate 60 will result in an electric field generating hot holes. The majority of the resulting hot holes are injected into the floating body 24 and a smaller portion will be injected into the floating gate 60. The hole injection will only occur in cells 1350 with negatively charged floating gate 60. As a result, all floating gates 60 will be initialized to have a positive charge by the end of the reset process.

In one particular non-limiting embodiment, about +3.0 volts is applied to the bit line terminal 74, about 0.0 volts is applied to source line terminal 72, about 0.0 volts or +1.2 volts is applied to BW terminal 76, and about 0.0 volts is applied to substrate terminal 78. These voltage levels are exemplary only may vary from embodiment to embodiment as a matter of design choice. Thus the exemplary embodiments, features, bias levels, etc., described are not limiting in any way. The bias condition is similar to that of the restore operation. However, because the amount of holes injected into the floating gate 60 is a smaller portion than those injected into the floating body 24, the reset operation proceeds more slowly than the restore operation. A negative voltage can also be applied to either source line terminal 72 or buried well terminal 76 to ensure that no holes are accumulated in memory cells 1350 with positively charged floating gate 60.

The memory cell 1350 can be manufactured in several manners. FIGS. 196 and 197 provide examples of manufacturing processes to obtain memory cell 1350. The figures are arranged in groups of three related views, with the first figure of each group being a top view, the second figure of each group being a vertical cross section of the top view in the first figure of the group designated I-I', and the third figure of each group being a horizontal cross section of the top view in the first figure of the group designated II-II'. Thus FIGS. 196A, 196D, 196G, 196J, 196M, 196P and 197A, 197D, 197G, 197J, 197M and 197P are a series of top views of the memory cell 1350 at various stages in the manufacturing process, FIGS. 196B, 196E, 196H, 196K, 196N and 196Q and 197B, 197E, 197H, 197K, 197N and 197Q are their respective vertical cross sections labeled I-I', and FIGS. 196C, 196F, 196I, 196L, 196O and 196R and 197C, 197F, 197I, 197L, 197O and 197R are their respective horizontal cross sections labeled II-II'. Identical reference numbers from FIGS. 186 through 195 appearing in FIGS. 196 and 197 represent similar, identical or analogous structures as previously described in conjunction with the earlier drawing figures. Here "vertical" means running up and down the page in the top view diagram and "horizontal" means running left and right on the page in the top view diagram. In a physical embodiment of memory cell 1350, both cross sections are vertical with respect to the surface of the semiconductor device.

FIGS. 196A through 196C show the first steps of the process. In an exemplary 130 nanometer (nm) process a thin silicon oxide layer 82 with a thickness of about 100 A may be grown on the surface of substrate 12. This may be followed by a deposition of about 200 A of polysilicon layer 84. This in turn may be followed by deposition of about 1200 A silicon nitride layer 86. Other process geometries like, for example, 250 nm, 180 nm, 90 nm, 65 nm, etc., may be used. Similarly, other numbers of, thicknesses of, and combinations of protective layers 82, 84 and 86 may be used as a matter of design choice. A pattern opening the areas to become trench 80 may be formed using a lithography process. Then the silicon oxide 82, polysilicon 84, silicon nitride 86 layers may be subsequently patterned using the lithography process and then may be etched, followed by a silicon etch process, creating trench 80.

As shown in FIGS. 196D through 196F, this may be followed by a silicon oxidation step, which will grow silicon oxide films in trench 80 which will become insulating layer 26. In an exemplary 130 nm process, about 4000 A silicon oxide may be grown. A chemical mechanical polishing step can then be performed to polish the resulting silicon oxide films so that the silicon oxide layer is flat relative to the silicon surface. In other embodiments the top of insulating layer 26 may have different height relative to the silicon surface. The silicon nitride layer 86 and the polysilicon layer 84 may then be removed which may then be followed by a wet etch process to remove silicon oxide layer 82 (and a portion of the silicon oxide films formed in the area of former trench 80). Other process geometries like, for example, 250 nm, 180 nm, 90 nm, 65 nm, etc., may be used. Similarly, other insulating layer materials, heights, and thicknesses as well as alternate sequences of processing steps may be used as a matter of design choice.

As shown in FIGS. 196G through 196I, an ion implantation step may then be performed to form the buried layer region 22 of a second conductivity (e.g. n-type conductivity). The ion implantation energy is optimized such that the bottom of the buried layer region 22 is formed deeper than the bottom of the insulating layer 26. Buried layer 22 isolates the eventual floating body region 24 of the first conductivity type (e.g., p-type) from the substrate 12.

As shown in FIGS. 196J through 196L, a silicon oxide or high-dielectric material gate insulation layer 62 may then be formed on the silicon surface (e.g. about 100 A in an exemplary 130 nm process), which may then be followed by a polysilicon or metal gate 60 deposition (e.g. about 500 A in an exemplary 130 nm process).

As shown in FIGS. 196M through 196O, a lithography step may then be performed to pattern the layers 62 and 60 to open the areas to become source line region 18. This may then be followed by etching of the polysilicon and silicon oxide layers. An ion implantation step may then be performed to form the source line region 18 or a second conductivity (e.g. n-type conductivity). Other process geometries like, for example, 250 nm, 180 nm, 90 nm, 65 nm, etc., may be used. Similarly, other gate and gate insulation materials with different thicknesses may be used a matter of design choice.

As shown in FIGS. 196P through 196R, another lithography step may then be performed to pattern the layers 62 and 60 to open the areas to become bit line region 16. This may then be followed by etching of the polysilicon and silicon oxide layers. An ion implantation step may then be performed to form the bit line region 16 or a second conductivity (e.g. n-type conductivity). Other process geometries like, for example, 250 nm, 180 nm, 90 nm, 65 nm, etc., may be used. Similarly, other gate and gate insulation materials with different thicknesses may be used a matter of design choice.

An alternative manufacturing process of cell 1350 is provided in FIGS. 197A through 197R. The process sequence depicted in FIGS. 197A through 197R involves only one lithography patterning and etching sequence to define the floating gate 60 of the memory cell 1350. Therefore, this process sequence is compatible with the standard complementary metal-oxide-semiconductor (CMOS) process. The higher capacitive coupling between the source line region 18 and the floating gate 60 is achieved through the extension of the floating gate 60 into the area of source line region 18 as shown in the final structure of cell 1350 in FIGS. 197P through 197R. As will be observed, the width of the floating gate 60 extension into the source line region 18 is configured such that subsequent implant processes will result in a continuous channel region under the gate 60. Roizin cited above teaches an example of a CMOS-compatible process sequence to manufacture a floating gate non-volatile memory cell.

The initial steps of the alternative process are similar to the sequence shown in FIGS. 196A through 196C. FIGS. 197A through 197C show the first steps of the process. In an exemplary 130 nanometer (nm) process a thin silicon oxide layer 82 with a thickness of about 100 A may be grown on the surface of substrate 12. This may be followed by a deposition of about 200 A of polysilicon layer 84. This in turn may be followed by deposition of about 1200 A silicon nitride layer 86. Other process geometries like, for example, 250 nm, 180 nm, 90 nm, 65 nm, etc., may be used. Similarly, other numbers of, thicknesses of, and combinations of protective layers 82, 84 and 86 may be used as a matter of design choice. A pattern opening the areas to become trench 80 may be formed using a lithography process. Then the silicon oxide 82, polysilicon 84, silicon nitride 86 layers may be subsequently patterned using the lithography process and then may be etched, followed by a silicon etch process, creating trench 80.

As shown in FIGS. 197D through 197F, this may be followed by a silicon oxidation step, which will grow silicon oxide films in trench 80 which will become insulating layer 26. In an exemplary 130 nm process, about 4000 A silicon oxide nay be grown. A chemical mechanical polishing step can then be performed to polish the resulting silicon oxide films so that the silicon oxide layer is flat relative to the silicon surface. In other embodiments the top of insulating layer 26 may have different height relative to the silicon surface. The silicon nitride layer 86 and the polysilicon layer 84 may then be removed which may then be followed by a wet etch process to remove silicon oxide layer 82 (and a portion of the silicon oxide films formed in the area of former trench 80). Other process geometries like, for example, 250 nm, 180 nm, 90 nm, 65 nm, etc., may be used. Similarly, other insulating layer materials, heights, and thicknesses as well as alternate sequences of processing steps may be used as a matter of design choice.

As shown in FIGS. 197G through 197I, an ion implantation step may then be performed to form the buried layer region 22 of a second conductivity (e.g. n-type conductivity). The ion implantation energy is optimized such that the bottom of the buried layer region 22 is formed deeper than the bottom of the insulating layer 26. Buried layer 22 isolates the eventual floating body region 24 of the first conductivity type (e.g., p-type) from the substrate 12.

As shown in FIGS. 197J through 197L, a silicon oxide or high-dielectric material gate insulation layer 62 may then be formed on the silicon surface (e.g. about 100 A in an exemplary 130 nm process), which may then be followed by a polysilicon or metal gate 60 deposition (e.g. about 500 A in an exemplary 130 nm process). Other process geometries like, for example, 250 nm, 180 nm, 90 nm, 65 nm, etc., may be used. Similarly, other gate and gate insulation materials with different thicknesses may be used a matter of design choice.

As shown in FIGS. 197M through 197O, a lithography step may then be performed to pattern the layers 62 and 60 to open the areas to become bit line region 16 and source line region 18. This may then be followed by etching of the polysilicon and silicon oxide layers. Contrary to the previous process sequence shown in FIGS. 196A through 196R, only one lithography and etch sequence is required as the areas of both bit line region 16 and source line region 18 are defined simultaneously.

FIGS. 197P through 197R show the subsequent ion implantation steps of a second conductivity type (e.g. n-type conductivity). In the area around the bit line region 16, because the floating gate region 60 is relatively long, the ion implant does not penetrate into the area under the floating gate 60 (see FIG. 197Q). In the area around the source line region 18, because the floating gate 60 region is relatively narrow, the ion implant will penetrate into the area under the floating gate 60, resulting in a continuous source line region 18 under the floating gate 60 (see FIG. 197R). As a result, a metal-oxide-semiconductor (MOS) capacitor is formed in the floating gate 60 extension region into the source line region 18.

FIG. 198 shows a cross section of an alternative embodiment of memory cell 1350. The cell 1350 is similar to that shown in FIGS. 186A or 186B, with a gap region 17 formed near the area of bit line region 16. As a result, there is no overlap between the floating gate 60 and the bit line region 16. The operation of the cell 1350 is similar to what has already been described in FIGS. 187 through 195. The volatile memory operation proceeds in the same manner, where the charge in the floating body 24 modulating the properties of cell 1350 during volatile operation. However, the efficiency of the shadowing process can be increased due to the presence of the gap 17. "Optimization of a Source-Side-Injection FAMOS Cell for Flash EPROM Applications", D. K. Y. Liu et al., pp. 315-318, Technical Digest, International Electron Device Meeting 1991 ("Liu"), for example, describes an improvement of hot electron injection efficiency into a floating gate in a non-volatile memory cell.

As described in FIGS. 193A through 193C, the following bias conditions are applied to perform a shadowing operation: a positive voltage is applied to the SL terminal 72, zero voltage is applied to the BL terminal 74, zero or positive voltage is applied to the BW terminal 76, and zero voltage is applied to the substrate terminal 78.

In one particular non-limiting embodiment, about +6.0 volts is applied to the source line terminal 72, about 0.0 volts is applied to bit line terminal 74, about 0.0 volts or +1.2 volts is applied to BW terminal 76, and about 0.0 volts is applied to substrate terminal 78. These voltage levels are exemplary only may vary from embodiment to embodiment as a matter of design choice. Thus the exemplary embodiments, features, bias levels, etc., described are not limiting in any way.

When floating body 24 has a positive charge/voltage, the MOS device 20 and the bipolar device 30*c* are on, and electrons flow from the bit line region 16 to the source line region 18 (in the direction of the arrow shown in FIG. 199A). Because of the gap 17 in the area of the bit line region 16, a large lateral electric field—which results from the voltage difference applied between the source line region 18 and bit line region 16—will be developed. This lateral electric field will energize/accelerate electrons traveling through the floating body 24 to a sufficient extent that they can "jump over" the oxide barrier between floating body 24 and floating gate 60. A large vertical field—resulting from the potential difference between floating gate 60, which partly is due to the coupling from the source line region 18, and the surface 14—also exist. As a result, electrons enter floating gate 60 (as indicated by the arrow into floating gate 60 in FIG. 199A). Accordingly, floating gate 60 becomes negatively charged by the shadowing process, when the volatile memory of cell 1350 is in logic-1 state (i.e., floating body 24 is positively charged), as shown in FIG. 199A.

FIG. 199B illustrates the cross section of cell 1350 during shadowing process when floating body 24 is neutral. When floating body 24 is neutral, the MOS device 20 and the bipolar device 30*c* are off, and no electrons flow through the cell 1350. Accordingly, floating gate 60 retains its positive charge at the end of the shadowing process, when the volatile memory of cell 1350 is in logic-0 state (i.e., floating body 24 is neutral), as shown in FIG. 199B.

Upon the completion of the shadowing operation, the charge state of the floating gate 60 is complementary to that of the floating body 24. Thus, if the floating body 24 of the memory cell 1350 has a positive charge in volatile memory, the floating gate 60 will become negatively charged by the shadowing process, whereas if the floating body 24 of the memory cell 1350 has a negative or neutral charge in volatile memory, the floating gate layer 60 will be positively charged at the end of the shadowing operation. The charges/states of the floating gates 60 are determined non-algorithmically by the states of the floating bodies, and shadowing of multiple cells occurs in parallel, therefore the shadowing process is very fast.

FIGS. 200A-200C describe the restore operation when power is restored to cell 1350. The restore operation restores the state of the cell 1350 from the floating gate 60 into floating body region 24. Prior to the restore process, the floating bodies 24 are set to neutral state, which is the state of the floating bodies when power is removed from the memory device 1350. To perform the restore process, the following bias conditions are applied: a positive voltage is applied to the SL terminal 72, zero or positive voltage is applied to the BW terminal 76, and zero voltage is applied to the substrate terminal 78, while the BL terminal 74 is left floating.

In one particular non-limiting embodiment, about +3.0 volts is applied to the source line terminal 72, about 0.0 volts or +1.2 volts is applied to BW terminal 76, and about 0.0 volts is applied to substrate terminal 78, while the bit line terminal 74 is left floating. These voltage levels are exemplary only may vary from embodiment to embodiment as a matter of design choice. For example, a positive voltage can be applied to bit line terminal 74 to prevent any current flow through the channel region of cell 1350 during restore operation. Thus the exemplary embodiments, features, bias levels, etc., described are not limiting in any way.

FIG. 200B illustrates the cross section of cell 1350 during a restore process when floating gate 60 is negatively charged. The negative charge on the floating gate 60 and the positive voltage on SL terminal 72 create a strong electric field between the source line region 18 and the floating body region 24 in the proximity of floating gate 60. This bends the energy band sharply upward near the gate and source line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state. This process is well known in the art as band-to-band tunneling or gate induced drain leakage (GIDL) mechanism and is illustrated in for example in Yoshida (specifically FIGS. 2 and 6 on page 3 and FIG. 9 on page 4) cited above. The BL terminal 74 is left floating or a positive voltage is applied thereto to prevent current from flowing through the channel region of cell 1350, which may result in impact ionization in all cells 1350 when not prevented.

FIG. 200C illustrates the cross section of cell 1350 during restore process when floating gate 60 is positively charged. The positive charge on the floating gate 60 and the bit line region 16 do not result in strong electric field to drive hole injection into the floating body 24. Consequently, the floating body 24 will remain in neutral state.

It can be seen that if floating gate 60 has a positive charge after shadowing is performed, the volatile memory of floating body 24 will be restored to have a neutral charge (logic-0 state), but if the floating gate 60 has a negative charge, the volatile memory of floating body 24 will be restored to have a positive charge (logic-1 state), thereby restoring the original state of the floating body 24 prior to the shadowing operation. Note that this process occurs non-algorithmically, as the state of the floating gate 60 does not have to be read, interpreted, or otherwise measured to determine what state to restore the floating body 24 to. Rather, the restoration process occurs automatically, driven by electrical potential differences. Accordingly, this process is orders of magnitude faster than one that requires algorithmic intervention.

After restoring the memory cell(s) 1350, the floating gate(s) 60 is/are reset to a predetermined state, e.g., a positive state, so that each floating gate 60 has a known state prior to performing another shadowing operation. The reset process operates by the mechanism of band-to-band tunneling hole injection to the floating gate(s) 60, as illustrated in FIG. 201.

The reset mechanism follows a similar mechanism as the restore process. A negatively charged floating gate 60 will result in an electric field generating hot holes. The majority of the resulting hot holes are injected into the floating body 24 and a smaller portion will be injected into the floating gate 60. The hole injection will only occur in cells 1350 with negatively charged floating gate 60. As a result, all floating gates 60 will be initialized to have a positive charge by the end of the reset process.

In one particular non-limiting embodiment, about +3.0 volts is applied to the source line terminal 72, about 0.0 volts or +1.2 volts is applied to BW terminal 76, and about 0.0 volts is applied to substrate terminal 78, while the bit line terminal 74 is left floating. These voltage levels are exemplary only may vary from embodiment to embodiment as a matter of design choice. Thus the exemplary embodiments, features, bias levels, etc., described are not limiting in any way. The bias condition is similar to that of the restore operation. However, because the amount of holes injected into the floating gate 60 is a smaller portion than those injected into the floating body 24, the reset operation proceeds more slowly than the restore operation. A negative voltage can also be applied to the buried well terminal 76 to ensure that no holes are accumulated in memory cells 1350 with positively charged floating gate 60, while a positive voltage can also be applied to the bit line terminal 74 to prevent current to flow through the channel region of cell 1350.

FIG. 202 illustrates a cross-sectional view of memory cell 1450 according to another embodiment of the present invention. Memory cell 1450 includes a substrate 112 of a first conductivity type such as p-type, for example. Substrate 112 is typically made of silicon, but may also comprise, for example, germanium, silicon germanium, gallium arsenide, carbon nanotubes, or other semiconductor materials. In some embodiments of the invention, substrate 112 can be the bulk material of the semiconductor wafer. In other embodiments, substrate 112 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 112 will usually be drawn as the semiconductor bulk material as it is in FIG. 202.

A buried layer 122 of a second conductivity type such as n-type, for example, is provided in the substrate 112. Buried layer 122 may be formed by an ion implantation process on the material of substrate 112. Alternatively, buried layer 122 can also be grown epitaxially on top of substrate 112.

A floating body region 124 of the first conductivity type, such as p-type, for example, is bounded on top by bit line region 116, source line region 118, and insulating layers 162 and 166, on the sides by insulating layers 126, and on the bottom by buried layer 122. Floating body 124 may be the portion of the original substrate 112 above buried layer 122 if buried layer 122 is implanted. Alternatively, floating body 124 may be epitaxially grown. Depending on how buried layer 122 and floating body 124 are formed, floating body 124 may have the same doping as substrate 112 in some embodiments or a different doping, if desired in other embodiments, as a matter of design choice.

Insulating layers 126 (like, for example, shallow trench isolation (STI)), may be made of silicon oxide, for example, though other insulating materials may be used. Insulating layers 126 insulate cell 1450 from neighboring cells 1450 when multiple cells 1450 are joined in an array 1480 to make a memory device. The bottom of insulating layer 126 may reside inside the buried region 122 allowing buried region 122 to be continuous as shown in FIG. 202A. Alternatively, the bottom of insulating layer 126 may reside below the buried region 22 as shown in FIG. 202B. This requires a shallower insulating layer 128, which insulates the floating body region 124, but allows the buried layer 122 to be continuous in the perpendicular direction of the cross-sectional view shown in FIG. 202B. For simplicity, only memory cell 1450 with continuous buried region 122 in all directions will be shown from hereon.

A bit line region 116 having a second conductivity type, such as n-type, for example, is provided in floating body region 124 and is exposed at surface 114. Bit line region 116 is formed by an implantation process formed on the material making up substrate 112, according to any implantation process known and typically used in the art. Alternatively, a solid state diffusion process could be used to form bit line region 116.

A source line region 118 having a second conductivity type, such as n-type, for example, is also provided in floating body region 124 and is exposed at surface 114. Source line region 118 is formed by an implantation process formed on the material making up substrate 112, according to any implantation process known and typically used in the art. Alternatively, a solid state diffusion process could be used to form bit line region 118.

Memory cell 1450 is asymmetric in that the area of source line region 118 is larger than that of bit line region 116. The larger source line region 118 results in a higher coupling between the source line region 118 and floating gate 160, compared to if the area of the source line region 118 is about the same as that of the bit line region 116.

A floating gate 160 is positioned in between the source line region 118 and the insulating gap region 168, and above the floating body region 124. The floating gate 160 is insulated from floating body region 124 by an insulating layer 162. Insulating layer 162 may be made of silicon oxide and/or other dielectric materials, including high-K dielectric materials, such as, but not limited to, tantalum peroxide, titanium oxide, zirconium oxide, hafnium oxide, and/or aluminum oxide. The floating gate 160 may be made of, for example, polysilicon material or metal gate electrode, such as tungsten, tantalum, titanium and their nitrides.

A select gate 164 is positioned in between the bit line region 116 and the insulating gap region 168, and above the floating body region 124. The select gate 164 is insulated from floating body region 124 by an insulating layer 166. Insulating layer 166 may be made of silicon oxide and/or other dielectric materials, including high-K dielectric materials, such as, but not limited to, tantalum peroxide, titanium oxide, zirconium oxide, hafnium oxide, and/or aluminum oxide. The select gate 164 may be made of, for example, polysilicon material or metal gate electrode, such as tungsten, tantalum, titanium and their nitrides.

Cell 1450 is another example of single polysilicon floating gate memory cell because both select gate 164 and floating gate 160 may be formed in a single polysilicon deposition step during fabrication process, along with the formation of logic transistors gate. The formation of the gap 168 may require additional processing steps as the dimension of the gap is typically smaller than what can be resolved by lithography tools.

Cell 1450 includes several terminals: word line (WL) terminal 170 electrically connected to select gate 164, bit line (BL) terminal 174 electrically connected to bit line region 116, source line (SL) terminal 172 electrically connected to source line region 118, buried well (BW) terminal 176 electrically connected to buried layer 122, and substrate terminal 178 electrically connected to substrate 112. There is no electrical connection to floating gate 160. As a result, floating gate 160 is floating and is used as the non-volatile storage region.

FIG. 203 illustrates the equivalent circuit representation of memory cell 1450. Inherent in memory cell 1450 are metal-oxide-semiconductor (MOS) transistor 120*a* in series with MOS transistor 120*b*, formed by bit line region 116, select gate 164, floating gate 160, source line region 118, and floating body region 124. Select gate 164 and floating gate 160 control the channel region of cell 1450 underneath the respective gates. Also present in memory cell 1450 are bipolar devices 130*a* and 130*b*, formed by buried well region 122, floating body region 124, and bit line region 116 or source line region 118, respectively.

FIG. 204 illustrates an exemplary memory array 1480 of memory cells 1450 (four exemplary instances of memory cell 1450 being labeled as 1450*a*, 1450*b*, 1450*c* and 1450*d*) arranged in rows and columns. In many, but not necessarily all, of the figures where exemplary array 1480 appears, representative memory cell 1450*a* will be representative of a "selected" memory cell 1450 when the operation being described has one (or more in some embodiments) selected memory cells 1450. In such figures, representative memory cell 1450*b* will be representative of an unselected memory cell 1450 sharing the same row as selected representative memory cell 1450*a*, representative memory cell 1450*c* will be representative of an unselected memory cell 1450 sharing the same column as selected representative memory cell 1450*a*, and representative memory cell 1450*d* will be representative of a memory cell 1450 sharing neither a row or a column with selected representative memory cell 1450*a*.

Present in FIG. 204 are word lines 170*a* through 170*n*, source lines 172*a* through 172*n*, bit lines 174*a* through 174*p*, buried well terminals 176*a* through 176*n*, and substrate terminal 178. Each of the word lines 170*a* through 170*n* and source lines 172*a* through 172*n* is associated with a single row of memory cells 1450 and is coupled to the select gate 164 and source line region 118 of each memory cell 1450 in that row, respectively. Each of the bit lines 174*a* through 174*p* is associated with a single column of memory cells 1450 and is coupled to the bit line region 116 of each memory cell 1450 in that column.

Substrate 112 is present at all locations under array 1480. Persons of ordinary skill in the art will appreciate that one or more substrate terminals 178 may be present in one or more locations as a matter of design choice. Such skilled persons will also appreciate that while exemplary array 1480 is shown as a single continuous array in FIG. 204, that many other organizations and layouts are possible, For example, word lines may be segmented or buffered, bit lines may be segmented or buffered, source lines may be segmented or buffered, the array 1480 may be broken into two or more sub-arrays, and/or control circuits such as word decoders, column decoders, segmentation devices, sense amplifiers, write amplifiers may be arrayed around exemplary array 1480 or inserted between sub-arrays of array 1480. Thus the exemplary embodiments, features, design options, etc., described are not limiting in any way.

The operation of memory device 1450 is similar to that of memory device 1350 shown in FIG. 187. At event 102, when power is first applied to the memory device, the memory device is placed in an initial state, where the nonvolatile memory portion of the device is set to a predetermined state. At event 104, the memory device 1450 operates in the volatile operational mode, where the state of the cell 1450 is stored in the floating body 124. During power shutdown, or when power is inadvertently lost, or any other event that discontinues or upsets power to the memory device 1450, the content of the volatile memory is "shadowed" into the non-volatile memory portion at event 106. At this time, the memory device retains the stored data in the nonvolatile memory. Upon restoring power at event 108, the content of the nonvolatile memory is "restored" by transferring the content of the nonvolatile memory to the volatile memory, followed by resetting the memory device at event 110.

In one embodiment, the non-volatile memory (e.g. the floating gate 160) is initialized to have a positive charge at event 102. When power is applied to cell 1450, cell 1450 stores the memory information (i.e. data that is stored in memory) as charge in the floating body 124 of the memory device 1450. The presence of the electrical charge in the floating body 124 modulates the current flow through the memory device 1450 (from the BL terminal 174 to the SL terminal 172). The current flowing through the memory device 1450 can be used to determine the state of the cell 1450. Because the non-volatile memory element (e.g. the floating gate 160) is initialized to have a positive charge, any cell current differences are attributed to the differences in charge of the floating body 124.

Several operations can be performed to memory cell 1450 during volatile mode: holding, read, write logic-1 and write logic-0 operations.

FIG. 205 shows the holding operation on memory array 1480, which consists of a plurality of memory cells 1450. The holding operation is performed by applying a positive back bias to the BW terminal 176, and zero bias on the WL terminal 170, SL terminal 172, BL terminal 174, and the substrate terminal 178. The positive back bias applied to the buried layer region connected to the BW terminal will maintain the state of the memory cell 1450 that it is connected to.

From the equivalent circuit representation of memory cell 1450 shown in FIG. 203, inherent in the memory cell 1450 is n-p-n bipolar devices 130*a* and 130*b* formed by buried well region 122 (the collector region), floating body 124 (the base region), and bit line region 116 or source line region 118 (the emitter region), respectively.

The principle of the holding operation for cell 1450 is similar to that of cell 1350. If floating body 124 is positively charged, a state corresponding to logic-1, the bipolar transistors 130*a* and 130*b* will be turned on as the positive charge in the floating body region lowers the energy barrier of electron flow into the base region. Once injected into the floating body region 124, the electrons will be swept into the buried well region 122 (connected to BW terminal 176) due to the positive bias applied to the buried well region 122. As a result of the positive bias, the electrons are accelerated and create additional hot carriers (hot hole and hot electron pairs) through an impact ionization mechanism. The resulting hot electrons flow into the BW terminal 176 while the resulting hot holes will subsequently flow into the floating body region 124. This process restores the charge on floating body 124 and will maintain the charge stored in the floating body region 124 which will keep the n-p-n bipolar transistors 130*a* and 130*b* on for as long as a positive bias is applied to the buried well region 122 through BW terminal 176.

If floating body 124 is neutrally charged (the voltage on floating body 124 being equal to the voltage on grounded bit line region 116 or source line region 118), a state corresponding to logic-0, no current will flow through the n-p-n transistors 130*a* and 130*b*. The bipolar devices 130*a* and 130*b* will remain off and no impact ionization occurs. Consequently memory cells in the logic-0 state will remain in the logic-0 state.

In the holding operation described in FIG. 205, there is no individually selected memory cell. Rather cells are selected in rows by the buried well terminals 176*a* through 176*n* and may be selected as individual rows, as multiple rows, or as all of the rows comprising array 1480.

In one embodiment the bias conditions for the holding operation for memory cell 1450 are: 0 volts is applied to WL terminal 170, SL terminal 172, BL terminal 174, and substrate terminal 178, and a positive voltage like, for example, +1.2 volts is applied to BW terminal 176. In other embodiments, different voltages may be applied to the various terminals of memory cell 1450 as a matter of design choice and the exemplary voltages described are not limiting in any way.

FIG. 206 illustrates a read operation performed on selected memory cell 1450*a*. The read operation may be performed by applying the following bias conditions: a positive bias is applied to the selected WL terminal 170*a*, a positive voltage is applied to the selected BL terminal 174*a*, zero voltage is applied to the SL terminals 172, a positive voltage is applied to the BW terminals 176, and zero voltage is applied to the substrate terminal 178.

In one exemplary embodiment, about +1.2 volts is applied to the selected WL terminal 170*a*, about 0.0 volts is applied to the selected SL terminal 172*a*, about +0.4 volts is applied to the selected bit line terminal 174*a*, about +1.2 volts is applied to the selected buried well terminal 176, and about 0.0 volts is applied to substrate terminal 178. All unselected word line terminals 170*b* through 170*n* have 0.0 volts applied, bit line terminals 174*b* through 174*p* have 0.0 volts applied, the unselected SL terminals 172*b* through 172*p* have 0.0 volts applied, while the unselected BW terminals 176*b* through 176*n* can be grounded or have +1.2 volts applied to maintain the states of the unselected cells 1450, and 0.0 volts is applied to the substrate terminal 178. FIG. 206 shows the bias conditions for the selected representative memory cell 1450*a* and three unselected representative memory cells 1450*b*, 1450*c*, and 1450*d* in memory array 1480, each of which has a unique bias condition. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

If the floating body region 124 of the selected cell 1450*a* is positively charged (i.e. the cell 1450*a* is in logic-1 state), the threshold voltage of the MOS transistor 120*a* and 120*b* of selected cell 1450*a* will be lower (compared to if the floating body region 124 is neutral), and a higher current will flow from the bit line region 116 to the source line region 118 of the selected cell 1450*a*. Because the floating gate 160 is positively charged during volatile operation, the observed cell current difference between cells in logic-0 and logic-1 states will originate from the difference in the potential of the floating body 124.

For memory cells sharing the same row as the selected memory cell (e.g. cell 1450*b*), both the BL and SL terminals are grounded and no current will flow through. These cells will be at the holding mode with a positive voltage applied to the BW terminal 176.

For memory cells sharing the same column as the selected memory cell (e.g. cell 1450*c*), the zero voltage applied to the unselected WL terminal will turn off the MOS transistor 120*a* of these cells. Consequently, no current will flow through. A smaller holding current will flow through these cells because of the smaller difference between the BW terminal 176 and the BL terminal 174. However, because write operation is accomplished much faster (on the order of nanoseconds) compared to the lifetime of the charge in the floating body 124 (on the order of milliseconds), it should cause little disruption to the charge stored in the floating body.

For memory cells sharing neither the same row nor the same column as the selected memory cell (e.g. cell 1450*d*), the WL, BL, and SL terminals are grounded. These cells will be at the holding mode, where memory cells in state logic-1 will maintain the charge in floating body 124 while memory cells in state logic-0 will remain in neutral state.

A write logic-0 operation of an individual memory cell 1450 is now described with reference to FIGS. 207A through 207C. In FIG. 207A, a negative voltage bias is applied to the selected SL terminal 172 (i.e., 172*a* in FIG. 207A), a zero voltage bias is applied to WL terminal 170 and BL terminal 174, zero or positive voltage is applied to the selected BW terminal 176 and zero voltage is applied to the substrate terminal 178. Under these conditions, the p-n junction between floating body 124 and source line region 118 of the selected cell 1450 is forward-biased, evacuating any holes from the floating body 124. Because the SL terminal 172 is shared among multiple memory cells 1450, logic-0 will be written into all memory cells 1450 including memory cells 1450*a* and 1450*b* sharing the same SL terminal 172*a* simultaneously.

In one particular non-limiting embodiment, about −1.2 volts is applied to the selected source line terminal 172, about 0.0 volts is applied to word line terminal 170 and bit line terminal 174, about 0.0 volts or +1.2 volts is applied to BW terminal 176, and about 0.0 volts is applied to substrate terminal 178. These voltage levels are exemplary only may vary from embodiment to embodiment as a matter of design choice. Thus the exemplary embodiments, features, bias levels, etc., described are not limiting in any way.

In FIG. 207B, a negative voltage bias is applied to the selected BL terminal 174 (i.e., 174*a* in FIG. 207B), a zero voltage bias is applied to WL terminal 170 and SL terminal 172, zero or positive voltage is applied to the selected BW terminal 176 and zero voltage is applied to the substrate terminal 178. Under these conditions, the p-n junction between floating body 124 and bit line region 116 of the selected cell 1450 is forward-biased, evacuating any holes from the floating body 124. Because the BL terminal 174 is shared among multiple memory cells 1450 in memory array 1480, logic-0 will be written into all memory cells 1450 including memory cells 1450*a* and 1450*c* sharing the same BL terminal 174*a* simultaneously.

In one particular non-limiting embodiment, about −1.2 volts is applied to the selected bit line terminal 174, about 0.0 volts is applied to word line terminal 170 and source line terminal 172, about 0.0 volts or +1.2 volts is applied to BW terminal 176, and about 0.0 volts is applied to substrate terminal 178. These voltage levels are exemplary only may vary from embodiment to embodiment as a matter of design choice. Thus the exemplary embodiments, features, bias levels, etc., described are not limiting in any way.

Both write logic-0 operations referred to above have a drawback that all memory cells 1450 sharing either the same SL terminal 172 (the first type—row write logic-0) or the same BL terminal 174 will (the second type—column write logic-0) are written to simultaneously and as a result, do not allow writing logic-0 to individual memory cells 1450. To write arbitrary binary data to different memory cells 1450, a write logic-0 operation is first performed on all the memory cells to be written followed by one or more write logic-1 operations on the bits that must be written to logic-1.

A third type of write logic-0 operation that allows for individual bit writing is illustrated in FIG. 207C and can be performed on memory cell 1450 by applying a positive voltage to WL terminal 170, a negative voltage to the selected BL terminal 174, zero voltage to SL terminal 172, zero or positive voltage to BW terminal 176, and zero voltage to substrate terminal 178. Under these conditions, the floating body 124 potential will increase through capacitive coupling from the positive voltage applied to the selected WL terminal 170. As a result of the floating body 124 potential increase and the negative voltage applied to the selected BL terminal 174, the p-n junction between 124 and bit line region 116 is forward-biased, evacuating any holes from the floating body 124.

To reduce undesired write logic-0 disturb to other memory cells 1450 in the memory array 1480, the applied potential can be optimized as follows: if the floating body 124 potential of state logic-1 is referred to as $V_{FB1}$, then the voltage applied to the WL terminal 170 is configured to increase the floating body 124 potential by $V_{FB1}/2$ while $-V_{FB1}/2$ is applied to BL terminal 174. Additionally, either ground or a slightly positive voltage may also be applied to the BL terminals 174 of unselected memory cells 1450 that do not share the same BL terminal 174 as the selected memory cell 1450, while a negative voltage may also be applied to the WL terminals 170 of unselected memory cells 1450 that do not share the same WL terminal 170 as the selected memory cell 1450.

As illustrated in FIG. 207C, the following bias conditions are applied to the selected representative memory cell 1450*a* in exemplary memory array 1480 to perform an individual write logic-0 operation exclusively in representative memory cell 1450*a:* a potential of about 0.0 volts to SL terminal 172*a,* a potential of about −0.2 volts to BL terminal 174*a,* a potential of about +1.2 volts is applied to word line terminal 170*a,* a potential of about +1.2 volts is applied to buried well terminal 176*a,* and about 0.0 volts is applied to substrate terminal 178. In the rest of array 1480, about 0.0 volts is applied to unselected WL terminals (including WL terminals 170*b* and 170*n*), about 0.0 volts (or possibly a slightly higher positive voltage) is applied to unselected BL terminals 174 (including BL terminal 174*b* and 174*p*), about 0.0 volts is applied to unselected SL terminals 172 (including SL terminal 172*b* and 172*n*), and about +1.2 volts is applied to unselected BW terminals 176 (including BW terminal 176*b* and 176*n*). Persons of ordinary skill in the art will appreciate that the voltage levels in FIG. 207C are illustrative only and that different embodiments will have different voltage levels as a matter of design choice.

A write logic-1 operation may be performed on memory cell 1450 through impact ionization as described, for example in "A New 1T DRAM Cell with Enhanced Floating Body Effect", Lin and Chang, pp. 23-27, IEEE International Workshop on Memory Technology, Design, and Testing, 2006, ("Lin") which is hereby incorporated herein, in its entirety, by reference thereto, or through a band-to-band tunneling mechanism (also known as Gate Induced Drain Leakage or GIDL), as described, for example with reference to Yoshida cited above. An example of a write logic-1 operation using the GIDL method is described in conjunction with FIG. 208A while an example of a write logic-1 operation using the impact ionization method is described in conjunction with FIG. 208B.

In FIG. 208A, an example of the bias conditions of the array 1480 including selected representative memory cell 1450*a* during a band-to-band tunneling write logic-1 operation is shown. The negative bias applied to the WL terminal 170*a* and the positive bias applied to the BL terminal 174*a* results in hole injection to the floating body 124 of the selected representative memory cell 1450*a.* The SL terminal 172*a* and the substrate terminal 178 are grounded during the write logic-1 operation while a positive bias is applied to the BW terminal 176*a* to maintain holding operation to the unselected cells.

The negative voltage on WL terminal 170 couples the voltage potential of the floating body region 124 in representative memory cell 1450*a* downward. This combined with the positive voltage on BL terminal 174*a* creates a strong electric field between the bit line region 116 and the floating body region 124 in the proximity of gate 160 (hence the "gate induced" portion of GIDL) in selected representative memory cell 1450*a.* This bends the energy bands sharply upward near the gate and drain junction overlap region, causing electrons to tunnel from the valence band to the conduction band, leaving holes in the valence band. The electrons which tunnel across the energy band become the drain leakage current (hence the "drain leakage" portion of GIDL), while the holes are injected into floating body region 124 and become the hole charge that creates the logic-1 state. This process is well known in the art and is illustrated in Yoshida (specifically FIGS. 2 and 6 on page 3 and FIG. 9 on page 4) cited above.

In one particular non-limiting embodiment, about −1.2 volts is applied to word line terminal 170*a,* about +1.2 volts is applied to bit line terminal 174*a,* about 0.0 volts is applied to source line terminal 172*a,* about 0.0 volts or +1.2 volts is applied to BW terminal 176, and about 0.0 volts is applied to substrate terminal 178. These voltage levels are exemplary only may vary from embodiment to embodiment as a matter of design choice. Thus the exemplary embodiments, features, bias levels, etc., described are not limiting in any way.

FIG. 208B shows a write logic-1 operation using the impact ionization method. In this case, both the gate 160 and bit line 116 of the memory cell 1450 to be written are biased at a positive voltage. This causes impact ionization current to flow charging the floating body 124 to the logic-1 state regardless of the data originally stored in the cell.

In the exemplary embodiment shown in FIG. 208B, the selected word line terminal 170*a* is biased at about +1.2V while the unselected word line terminals 170*b* through 170*n* are biased at about 0.0V, the selected bit line terminal 174*a* is also biased at about +1.2V while the unselected bit line terminals 174*b* through 174*p* are biased at about 0.0V, the selected source line 172*a* is biased at about 0.0V, the buried well terminals 176 are biased at about 0.0V or +1.2V (to maintain the states of the unselected cells), and the substrate terminal 178 is biased at about 0.0V. These voltage bias levels are exemplary only and will vary from embodiment to embodiment and are thus in no way limiting.

The following bias conditions to perform a shadowing operation are illustrated in FIG. 209: a positive voltage is applied to the selected SL terminal 172, a positive voltage is applied to the selected WL terminal 170, zero voltage is applied to the selected BL terminal 174, zero or positive voltage is applied to the BW terminal 176, and zero voltage is applied to the substrate terminal 178.

In one particular non-limiting embodiment, about +6.0 volts is applied to the source line terminal 172, about +1.2 volts is applied to WL terminal 170, about 0.0 volts is applied to bit line terminal 174, about 0.0 volts or +1.2 volts is applied to BW terminal 176, and about 0.0 volts is applied to substrate terminal 178. These voltage levels are exemplary only may vary from embodiment to embodiment as a matter of design choice. Thus the exemplary embodiments, features, bias levels, etc., described are not limiting in any way.

FIG. 210A shows a cross section of the memory cell when floating body 124 is positively charged during a shadowing operation. When floating body 124 has a positive charge/voltage, the MOS device 120*a* is turned on. The surface potential under the MOS device 120*a* will be equal to the smaller of the voltage applied to the BL terminal 174 and the difference between the gate voltage applied to the WL terminal 170 and the threshold voltage of the MOS device 120*a*. The positive voltage applied to the source line 118 (through the SL terminal 172) will be capacitively coupled to the floating gate 160. As a result, the surface potential under the MOS device 120*b* will increase and depending on the positive charge stored in the floating gate 160, will be close to the potential applied to the source line region 118. Consequently, a strong lateral electric field will be developed around the gap region 168. This lateral electric field will energize/accelerate electrons traveling from the bit line region 116 to the source line region 118 (both the MOS devices 120*a* and 120*b* are turned on) to a sufficient extent that they can "jump over" the oxide barrier between floating body 124 and floating gate 160. A large vertical field—resulting from the potential difference between floating gate 160, which is due partly to the coupling from the source line region 118, and the surface 114—also exist. As a result, electrons enter floating gate 160 (as indicated by the arrow into floating gate 160 in FIG. 210A). Accordingly, floating gate 160 becomes negatively charged by the shadowing process, when the volatile memory of cell 1450 is in logic-1 state (i.e., floating body 124 is positively charged), as shown in FIG. 210A.

FIG. 210B illustrates a cross section of cell 1450 during a shadowing process when floating body 124 is neutral. When floating body 124 is neutral, the threshold voltage of the MOS device 120*a* is higher (compared to when the floating body 124 is positively charged) and the MOS device 120*a* is turned off. Therefore, no electrons flow through the cell 1450. Accordingly, floating gate 160 retains its positive charge at the end of the shadowing process, when the volatile memory of cell 1450 is in logic-0 state (i.e., floating body 124 is neutral), as shown in FIG. 210B.

Upon the completion of the shadowing operation, the charge state of the floating gate 160 is complementary to that of the floating body 124. Thus, if the floating body 124 of the memory cell 1450 has a positive charge in volatile memory, the floating gate 160 will become negatively charged by the shadowing process, whereas if the floating body 124 of the memory cell 1450 has a negative or neutral charge in volatile memory, the floating gate layer 160 will be positively charged at the end of the shadowing operation. The charges/states of the floating gates 160 are determined non-algorithmically by the states of the floating bodies, and shadowing of multiple cells occurs in parallel, therefore the shadowing process is very fast.

FIG. 211 describes a restore operation when power is restored to cell 1450. The restore operation restores the state of the cell 1450 from the floating gate 160 into floating body region 124. Prior to the restore process, the floating bodies 124 are set to neutral state, which is the state of the floating bodies when power is removed from the memory device 1450. To perform the restore process, the following bias conditions are applied: a positive voltage is applied to the SL terminal 172, zero voltage is applied to the WL terminal 170 and BL terminal 174, zero or positive voltage is applied to the BW terminal 176, and zero voltage is applied to the substrate terminal 178.

In one particular non-limiting embodiment, about +1.2 volts is applied to the source line terminal 172, about 0.0 volts is applied to the word line terminal 170 and bit line terminal 174, about 0.0 volts or +1.2 volts is applied to BW terminal 176, and about 0.0 volts is applied to substrate terminal 178. These voltage levels are exemplary only may vary from embodiment to embodiment as a matter of design choice. For example, a positive voltage can be applied to bit line terminal 174 or a negative voltage can be applied to word line 170 to ensure that no current flows through the channel region of cell 1450 during restore operation. Thus the exemplary embodiments, features, bias levels, etc., described are not limiting in any way.

FIG. 212A illustrates a cross section of cell 1450 during a restore process when floating gate 160 is negatively charged. The negative charge on the floating gate 160 and the positive voltage on SL terminal 172 create a strong electric field between the source line region 118 and the floating body region 124 in the proximity of floating gate 160. This bends the energy band sharply upward near the gate and source line junction overlap region, causing electrons to tunnel from the valence band to the conduction band, leaving holes in the valence band. The electrons which tunnel across the energy band become the drain leakage current, while the holes are injected into floating body region 124 and become the hole charge that creates the logic-1 state. This process is well known in the art as band-to-band tunneling or gate induced drain leakage (GIDL) mechanism and is illustrated in for example in Yoshida (specifically FIGS. 2 and 6 on page 3 and FIG. 9 on page 4) cited above. The BL terminal 174 is grounded or applied a positive voltage to prevent current to flow through the channel region of cell 1450.

FIG. 212B illustrates a cross section of cell 1450 during a restore process when floating gate 160 is positively charged. The positive charge on the floating gate 160 and the source line region 118 do not result in strong electric field to drive hole injection into the floating body 124. Consequently, the floating body 124 will remain in neutral state.

It can be seen that if floating gate 160 has a positive charge after shadowing is performed, the volatile memory of floating body 124 will be restored to have a neutral charge (logic-0 state), but if the floating gate 160 has a negative charge, the volatile memory of floating body 124 will be restored to have a positive charge (logic-1 state), thereby restoring the original state of the floating body 124 prior to the shadowing operation. Note that this process occurs non-algorithmically, as the state of the floating gate 160 does not have to be read, interpreted, or otherwise measured to determine what state to restore the floating body 124 to.

Rather, the restoration process occurs automatically, driven by electrical potential differences. Accordingly, this process is orders of magnitude faster than one that requires algorithmic intervention.

After restoring the memory cell(s) 1450, the floating gate(s) 160 is/are reset to a predetermined state, e.g., a positive state as illustrated in FIGS. 213A and 213B, so that each floating gate 160 has a known state prior to performing another shadowing operation. The reset process operates by the mechanism of band-to-band tunneling hole injection to the floating gate(s) 160, as illustrated in FIG. 213A, or by electron tunneling from the floating gate(s) 160 as illustrated in FIG. 213B.

The reset mechanism illustrated in FIG. 213A follows a similar mechanism as the restore process. A negatively charged floating gate 160 will result in an electric field generating hot holes. The majority of the resulting hot holes are injected into the floating body 124 and a smaller portion will be injected into the floating gate 160. A higher potential can be applied to the SL terminal 172 to increase the speed of the reset operation if desired. The hole injection will only occur in cells 1450 with negatively charged floating gate 160. As a result, all floating gates 160 will be initialized to have a positive charge by the end of the reset process.

In one particular non-limiting embodiment (see FIG. 213A), about +3.0 volts is applied to the source line terminal 172, about 0.0 volts is applied to word line terminal 170 and bit line terminal 174, about 0.0 volts or +1.2 volts is applied to BW terminal 176, and about 0.0 volts is applied to substrate terminal 178. These voltage levels are exemplary only may vary from embodiment to embodiment as a matter of design choice. Thus the exemplary embodiments, features, bias levels, etc., described are not limiting in any way. The bias condition is similar to that of the restore operation. However, because the amount of holes injected into the floating gate 160 is smaller than the amount injected into the floating body 124, the reset operation proceeds more slowly than the restore operation. A negative voltage can also be applied to the buried well terminal 176 to ensure that no holes are accumulated in memory cells 1450 with positively charged floating gate 160, while a positive voltage can also be applied to the bit line terminal 174 to prevent current to flow through the channel region of cell 1450.

FIG. 213B illustrates a reset operation by means of electron tunneling from the floating gate 160 to the select gate 164. A positive voltage is applied to the WL terminal 170, while zero voltage is applied to the BL terminal 174 and SL terminal 172, zero voltage or a positive voltage may be applied to the BW terminal 176, and zero voltage is applied to the substrate terminal 178. The positive voltage applied to the select gate 164 (through the WL terminal 170) will result in high electric field across the select gate 164 and the floating gate 160, resulting in electron tunneling from the floating gate(s) 160 to the select gate(s) 164.

In one particular non-limiting embodiment (see FIG. 213B), about +12.0 volts is applied to the WL terminal 170, about 0.0 volts is applied to the BL terminal 174, SL terminal 172, and substrate terminal 178, and 0.0 volts or +1.2 volts is applied to the BW terminal 176. These voltage levels are exemplary only may vary from embodiment to embodiment as a matter of design choice. Thus the exemplary embodiments, features, bias levels, etc., described are not limiting.

FIG. 214 shows another embodiment of memory cell 1450. Here, the select gate 164 may have overlap (partially or complete) with the floating gate 160. This can result in, for example, a shorter effective channel length of the MOS device 120*a,* which in turn increases the current that may flow through the cell 1450. Because of the overlap, the shorter channel length can be obtained without resorting to patterning and etching a smaller geometry during the gate patterning process, for example the process steps shown in FIGS. 197M through 197O.

FIG. 215A illustrates a cross-sectional view of another embodiment of memory cell 1550 according to the present invention, which includes a control gate 240. Memory cell 1550 includes a substrate 212 of a first conductivity type such as p-type, for example. Substrate 212 is typically made of silicon, but may also comprise, for example, germanium, silicon germanium, gallium arsenide, carbon nanotubes, or other semiconductor materials. In some embodiments of the invention, substrate 212 can be the bulk material of the semiconductor wafer. In other embodiments, substrate 212 can be a well of the first conductivity type embedded in either a well of the second conductivity type or, alternatively, in the bulk of the semiconductor wafer of the second conductivity type, such as n-type, for example, (not shown in the figures) as a matter of design choice. To simplify the description, the substrate 212 will usually be drawn as the semiconductor bulk material as it is in FIG. 215.

A buried layer 222 of a second conductivity type such as n-type, for example, is provided in the substrate 212. Buried layer 222 may be formed by an ion implantation process on the material of substrate 212. Alternatively, buried layer 222 can also be grown epitaxially on top of substrate 212.

A floating body region 224 of the first conductivity type, such as p-type, for example, is bounded on top by bit line region 216, source line region 218, and insulating layers 262 and 266, on the sides by insulating layers 226, and on the bottom by buried layer 222. Floating body 224 may be the portion of the original substrate 212 above buried layer 222 if buried layer 222 is implanted. Alternatively, floating body 224 may be epitaxially grown. Depending on how buried layer 222 and floating body 224 are formed, floating body 224 may have the same doping as substrate 212 in some embodiments or a different doping, if desired in other embodiments, as a matter of design choice.

Insulating layers 226 (like, for example, shallow trench isolation (STI)), may be made of silicon oxide, for example, though other insulating materials may be used. Insulating layers 226 insulate cell 1550 from neighboring cells 1550 when multiple cells 1550 are joined in an array 1580 to make a memory device. The bottom of insulating layer 226 may reside inside the buried region 222 allowing buried region 222 to be continuous as shown in FIG. 215A. Alternatively, the bottom of insulating layer 226 may reside below the buried region 222 as shown in FIG. 215B. This requires a shallower insulating layer 228, which insulates the floating body region 224, but allows the buried layer 222 to be continuous in the perpendicular direction of the cross-sectional view shown in FIG. 215B. For simplicity, only memory cell 1550 with continuous buried region 222 in all directions will be shown from hereon.

A bit line region 216 having a second conductivity type, such as n-type, for example, is provided in floating body region 224 and is exposed at surface 214. Bit line region 216 may be formed by an implantation process formed on the material making up substrate 212, according to any implantation process known and typically used in the art. Alternatively, a solid state diffusion process could be used to form bit line region 216.

A source line region 218 having a second conductivity type, such as n-type, for example, is also provided in floating body region 224 and is exposed at surface 214. Source line region 218 may be formed by an implantation process formed on the material making up substrate 212, according to any implantation process known and typically used in the art. Alternatively, a solid state diffusion process could be used to form bit line region 218.

Unlike memory cells 1350 and 1450, memory cell 1550 is not necessarily asymmetric as a coupling to the floating gate 260 can be obtained through the control gate 240.

A floating gate 260 is positioned in between the source line region 218 and the insulating gap region 268, and above the floating body region 224. The floating gate 260 is insulated from floating body region 224 by an insulating layer 262. Insulating layer 262 may be made of silicon oxide and/or other dielectric materials, including high-K dielectric materials, such as, but not limited to, tantalum peroxide, titanium oxide, zirconium oxide, hafnium oxide, and/or aluminum oxide. The floating gate 260 may be made of, for example, polysilicon material or metal gate electrode, such as tungsten, tantalum, titanium and their nitrides.

A select gate 264 is positioned in between the bit line region 216 and the insulating gap region 268, and above the floating body region 224. The select gate 264 is insulated from floating body region 224 by an insulating layer 266. Insulating layer 266 may be made of silicon oxide and/or other dielectric materials, including high-K dielectric materials, such as, but not limited to, tantalum peroxide, titanium oxide, zirconium oxide, hafnium oxide, and/or aluminum oxide. The select gate 264 may be made of, for example, polysilicon material or metal gate electrode, such as tungsten, tantalum, titanium and their nitrides.

A control gate 240 is positioned above floating gate 260 and insulated therefrom by insulating layer 242 such that floating gate 260 is positioned between insulating layer 262 and surface 214 underlying floating gate 260, and insulating layer 242 and control gate 240 positioned above floating gate 260, as shown. Control gate 240 is capacitively coupled to floating gate 260. Control gate 240 is typically made of polysilicon material or metal gate electrode, such as tungsten, tantalum, titanium and their nitrides. The relationship between the floating gate 260 and control gate 240 is similar to that of a nonvolatile stacked gate floating gate/trapping layer memory cell. The floating gate 260 functions to store non-volatile memory data and the control gate 240 is used for memory cell selection.

Cell 1550 includes several terminals: word line (WL) terminal 270 electrically connected to select gate 264, bit line (BL) terminal 274 electrically connected to bit line region 216, source line (SL) terminal 272 electrically connected to source line region 218, control gate (CG) terminal 280 electrically connected to control gate 240, buried well (BW) terminal 276 electrically connected to buried layer 222, and substrate terminal 278 electrically connected to substrate 212.

FIG. 216 illustrates the equivalent circuit representation of memory cell 1550. Inherent in memory cell 1550 are metal-oxide-semiconductor (MOS) transistor 220*a* in series with MOS transistor 220*b*, formed by bit line region 216, select gate 264, floating gate 260 and control gate 240, source line region 218, and floating body region 224. Select gate 264 controls the channel region of cell 1550 underneath the select gate while floating gate 260 and control gate 240 control the channel region underneath the floating gate 260. Also present in memory cell 1550 are bipolar devices 230*a* and 230*b*, formed by buried well region 222, floating body region 224, and bit line region 216 or source line region 218, respectively. The coupling of the source line region 218 to the floating gate 260 (typically shown by the extension of the floating gate 260 into the source line region 218) is not shown in FIG. 216 as the cell 1550 may or may not require additional coupling to the floating gate 260 for its operation. For drawing simplicity, the floating gate 260 extension into the source line region 218 is not drawn.

FIG. 217 illustrates an exemplary memory array 1580 of memory cells 1550 (four exemplary instances of memory cell 1550 being labeled as 1550*a*, 1550*b*, 1550*c* and 1550*d*) arranged in rows and columns. In many, but not necessarily all, of the figures where exemplary array 1580 appears, representative memory cell 1550*a* will be representative of a "selected" memory cell 1550 when the operation being described has one (or more in some embodiments) selected memory cells 1550. In such figures, representative memory cell 1550*b* will be representative of an unselected memory cell 1550 sharing the same row as selected representative memory cell 1550*a*, representative memory cell 1550*c* will be representative of an unselected memory cell 1550 sharing the same column as selected representative memory cell 1550*a*, and representative memory cell 1550*d* will be representative of a memory cell 1550 sharing neither a row or a column with selected representative memory cell 1550*a*.

Present in FIG. 217 are word line terminals 270*a* through 270*n*, source line terminals 272*a* through 272*n*, bit line terminals 274*a* through 274*p*, control gate terminals 280*a* through 280*n*, buried well terminals 276*a* through 276*n*, and substrate terminal 278. Each of the word line terminals 270*a* through 270*n*, source line terminals 272*a* through 272*n*, and control gate terminals 280*a* through 280*n* are associated with a single row of memory cells 1550 and are coupled to the select gate 264, source line region 218, and control gates 240 of each memory cell 1550 in that row, respectively. Each of the bit line terminals 274*a* through 274*p* is associated with a single column of memory cells 1550 and is coupled to the bit line region 216 of each memory cell 1550 in that column, respectively.

Substrate 212 is present at all locations under array 1580. Persons of ordinary skill in the art will appreciate that one or more substrate terminals 278 will be present in one or more locations as a matter of design choice. Such skilled persons will also appreciate that while exemplary array 1580 is shown as a single continuous array in FIG. 217, that many other organizations and layouts are possible. For example, word lines may be segmented or buffered, bit lines may be segmented or buffered, source lines may be segmented or buffered, the array 1580 may be broken into two or more sub-arrays, and/or control circuits such as word decoders, column decoders, segmentation devices, sense amplifiers, write amplifiers may be arrayed around exemplary array 1580 or inserted between sub-arrays of array 1580. Thus the exemplary embodiments, features, design options, etc., described are not limiting.

One embodiment of memory device 1550 operation is similar to that of memory device 1350 shown in FIG. 187. At event 102, when power is first applied to the memory device, the memory device is placed in an initial state, where the nonvolatile memory portion of the device is set to a predetermined state. At event 104, the memory device 1550 operates in the volatile operational mode, where the state of the cell 1550 is stored in the floating body 224. During power shutdown, or when power is inadvertently lost, or any other event that discontinues or upsets power to the memory device 1550, the content of the volatile memory is "shadowed" into the non-volatile memory portion at event 106. At this time, the memory device retains the stored data in the nonvolatile memory. Upon restoring power at event 108, the content of the nonvolatile memory is "restored" by transferring the content of the nonvolatile memory to the volatile memory, followed by resetting the memory device at event 110.

In one embodiment, the non-volatile memory (e.g. the floating gate 260) is initialized to have a positive charge at event 102. When power is applied to cell 1550, cell 1550 stores the memory information (i.e. data that is stored in memory) as charge in the floating body 224 of the memory device 1550. The presence of the electrical charge in the floating body 224 modulates the current flow through the memory device 1550 (from the BL terminal 274 to the SL terminal 272). The current flowing through the memory device 1550 can be used to determine the state of the cell 1550. Because the non-volatile memory element (e.g. the floating gate 260) is initialized to have a positive charge, any cell current differences are attributed to the differences in charge of the floating body 224.

Several operations can be performed to memory cell 1550 during volatile mode: holding, read, write logic-1 and write logic-0 operations.

FIG. 218 shows a holding operation on memory array 1580, which comprises a plurality of memory cells 1550. The holding operation is performed by applying a positive back bias to the BW terminal 276, and zero bias on the WL terminal 270, SL terminal 272, BL terminal 274, CG terminal 280, and the substrate terminal 278. The positive back bias applied to the buried layer region connected to the BW terminal will maintain the state of the memory cell 1550 that it is connected to.

From the equivalent circuit representation of memory cell 1550 shown in FIG. 216, inherent in the memory cell 1550 is n-p-n bipolar devices 230*a* and 230*b* formed by buried well region 222 (the collector region), floating body 224 (the base region), and bit line region 216 or source line region 218 (the emitter region), respectively.

The principle of the holding operation for cell 1550 is similar to that of cell 1350. If floating body 224 is positively charged, a state corresponding to logic-I, the bipolar transistors 230*a* and 230*b* will be turned on as the positive charge in the floating body region lowers the energy barrier of electron flow into the base region. Once injected into the floating body region 224, the electrons will be swept into the buried well region 222 (connected to BW terminal 276) due to the positive bias applied to the buried well region 222. As a result of the positive bias, the electrons are accelerated and create additional hot carriers (hot hole and hot electron pairs) through an impact ionization mechanism. The resulting hot electrons flow into the BW terminal 276 while the resulting hot holes will subsequently flow into the floating body region 224. This process restores the charge on floating body 224 and will maintain the charge stored in the floating body region 224 which will keep the n-p-n bipolar transistors 230*a* and 230*b* on for as long as a positive bias is applied to the buried well region 222 through BW terminal 276.

If floating body 224 is neutrally charged (the voltage on floating body 224 being equal to the voltage on grounded bit line region 216 or source line region 218), a state corresponding to logic-0, no current will flow through the n-p-n transistors 230*a* and 230*b*. The bipolar devices 230*a* and 230*b* will remain off and no impact ionization occurs. Consequently memory cells in the logic-0 state will remain in the logic-0 state.

In the holding operation described in FIG. 218, there is no individually selected memory cell. Rather cells are selected in rows by the buried well terminals 276*a* through 276*n* and may be selected as individual rows, as multiple rows, or as all of the rows comprising array 1580.

In one embodiment the bias conditions for the holding operation on memory cell 1550 is: 0 volts is applied to WL terminal 270, SL terminal 272, BL terminal 274, CG terminal 280, and substrate terminal 278, and a positive voltage like, for example, +1.2 volts is applied to BW terminal 276. In other embodiments, different voltages may be applied to the various terminals of memory cell 1550 as a matter of design choice and the exemplary voltages described are not limiting.

FIG. 219 illustrates a read operation performed on selected memory cell 1550*a*. The read operation may be performed by applying the following bias condition: A positive bias is applied to the selected WL terminal 270*a*, a positive voltage is applied to the selected BL terminal 274*a*, zero voltage is applied to CG terminals 280, zero voltage is applied to the SL terminals 272, a positive voltage is applied to the BW terminals 276, and zero voltage is applied to the substrate terminal 278.

In one exemplary embodiment, about +1.2 volts is applied to the selected WL terminal 270*a*, about 0.0 volts is applied to the selected SL terminal 272*a*, about +0.4 volts is applied to the selected bit line terminal 274*a*, about 0.0 volts is applied to the selected CG terminal 280*a*, about +1.2 volts is applied to the selected buried well terminal 276, and about 0.0 volts is applied to substrate terminal 278. All unselected word line terminals 270*b* through 270*n* have 0.0 volts applied, bit line terminals 274*b* through 274*p* have 0.0 volts applied, the unselected SL terminals 272*b* through 272*p* have 0.0 volts applied, the unselected CG terminals 280*b* through 280*n* have 0.0 volts applied, while the unselected BW terminals 276*b* through 276*n* can be grounded or have +1.2 volts applied to maintain the states of the unselected cells 1550, and 0.0 volts is applied to the substrate terminal 278. FIG. 219 shows the bias conditions for the selected representative memory cell 1550*a* and three unselected representative memory cells 1550*b*, 1550*c*, and 1550*d* in memory array 1580, each of which has a unique bias condition. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

If the floating body region 224 of the selected cell 1550*a* is positively charged (i.e. the cell 1550*a* is in logic-1 state), the threshold voltage of the MOS transistor 220*a* and 220*b* of selected cell 1550*a* will be lower (compared to if the floating body region 224 is neutral), and a higher current will flow from the bit line region 216 to the source line region 218 of the selected cell 1550*a*. Because the floating gate 260 is positively charged during volatile operation, the observed cell current difference between cells in logic-0 and logic-1 states will originate from the difference in the potential of the floating body 224.

For memory cells sharing the same row as the selected memory cell (e.g. cell 1550*b*), both the BL and SL terminals are grounded and no current will flow through. These cells will be at the holding mode with a positive voltage applied to the BW terminal 276.

For memory cells sharing the same column as the selected memory cell (e.g. cell 1550*c*), the zero voltage applied to the unselected WL terminal will turn off the MOS transistor 220*a* of these cells. Consequently, no current will flow through. A smaller holding current will flow through these cells because of the smaller difference between the BW terminal 276 and the BL terminal 274. However, because the write operation is accomplished much faster (on the order of nanoseconds) compared to the lifetime of the charge in the floating body 224 (on the order of milliseconds), it should cause little disruption to the charge stored in the floating body.

For memory cells sharing neither the same row nor the same column as the selected memory cell (e.g. cell 1550*d*), the WL, CG, BL, and SL terminals are grounded. These cells will be at the holding mode, where memory cells in state logic-1 will maintain the charge in floating body 224 while memory cells in state logic-0 will remain in neutral state.

A write logic-0 operation of an individual memory cell 1550 is now described with reference to FIGS. 220A, 220B and 221. In FIG. 220A, a negative voltage bias is applied to the selected SL terminal 272, a zero voltage bias is applied to WL terminal 270, BL terminal 274, CG terminal 280, zero or positive voltage is applied to the selected BW terminal 276 and zero voltage is applied to the substrate terminal 278. Under these conditions, the p-n junction between floating body 224 and source line region 218 of the selected cell 1550 is forward-biased, evacuating any holes from the floating body 224. Because the selected SL terminal 272 is shared among multiple memory cells 1550, logic-0 will be written into all memory cells 1550 including memory cells 1550*a* and 1550*b* sharing the same SL terminal 272*a* simultaneously.

In one particular non-limiting embodiment, about −1.2 volts is applied to source line terminal 272*a,* about 0.0 volts is applied to word line terminal 270, bit line terminal 274, control gate terminal 280, about 0.0 volts or +1.2 volts is applied to BW terminal 276, and about 0.0 volts is applied to substrate terminal 278. These voltage levels are exemplary only may vary from embodiment to embodiment as a matter of design choice. Thus the exemplary embodiments, features, bias levels, etc., described are not limiting in any way.

In FIG. 220B, a negative voltage bias is applied to the selected BL terminal 274, a zero voltage bias is applied to WL terminal 270, SL terminal 272, and CG terminal 280, zero or positive voltage is applied to the selected BW terminal 276 and zero voltage is applied to the substrate terminal 278. Under these conditions, the p-n junction between floating body 224 and bit line region 216 of the selected cell 1550 is forward-biased, evacuating any holes from the floating body 224. Because the selected BL terminal 274 is shared among multiple memory cells 1550 in memory array 1580, logic-0 will be written into all memory cells 1550 including memory cells 1550*a* and 1550*c* sharing the same BL terminal 174*a* simultaneously.

In one particular non-limiting embodiment, about −1.2 volts is applied to bit line terminal 274*a,* about 0.0 volts is applied to word line terminal 270, source line terminal 272, and control gate terminal 280, about 0.0 volts or +1.2 volts is applied to BW terminal 276, and about 0.0 volts is applied to substrate terminal 278. These voltage levels are exemplary only may vary from embodiment to embodiment as a matter of design choice. Thus the exemplary embodiments, features, bias levels, etc., described are not limiting in any way.

Both write logic-0 operations referred to above have a drawback that all memory cells 1550 sharing either the same SL terminal 272 (the first type—row write logic-0) or the same BL terminal 274 will (the second type—column write logic-0) are written to simultaneously and as a result, do not allow writing logic-0 to individual memory cells 1550. To write arbitrary binary data to different memory cells 1550, a write logic-0 operation is first performed on all the memory cells to be written followed by one or more write logic-1 operations on the bits that must be written to logic-1.

A third type of write logic-0 operation that allows for individual bit writing is illustrated in FIG. 221 and can be performed on memory cell 1550 by applying a positive voltage to WL terminal 270, a negative voltage to BL terminal 274, zero voltage to SL terminal 272, zero voltage to CG terminal 280, zero or positive voltage to BW terminal 276, and zero voltage to substrate terminal 278. Under these conditions, the floating body 224 potential will increase through capacitive coupling from the positive voltage applied to the WL terminal 270. As a result of the floating body 224 potential increase and the negative voltage applied to the BL terminal 274, the p-n junction between 224 and bit line region 216 is forward-biased, evacuating any holes from the floating body 224.

To reduce undesired write logic-0 disturb to other memory cells 1550 in the memory array 1580, the applied potential can be optimized as follows: if the floating body 224 potential of state logic-1 is referred to as $V_{FB1}$, then the voltage applied to the WL terminal 270 is configured to increase the floating body 224 potential by $V_{FB1}/2$ while $-V_{FB1}/2$ is applied to BL terminal 274. Additionally, either ground or a slightly positive voltage may also be applied to the BL terminals 274 of unselected memory cells 1550 that do not share the same BL terminal 274 as the selected memory cell 1550, while a negative voltage may also be applied to the WL terminals 270 of unselected memory cells 1550 that do not share the same WL terminal 270 as the selected memory cell 1550.

As illustrated in FIG. 221, the following bias conditions are applied to the selected representative memory cell 1550*a* in exemplary memory array 1580 to perform an individual write logic-0 operation exclusively in representative memory cell 1550*a:* a potential of about 0.0 volts to SL terminal 272*a,* a potential of about −0.2 volts to BL terminal 274*a,* a potential of about +1.2 volts is applied to word line terminal 270*a,* a potential of about 0.0 volts is applied to control gate terminal 280*a,* a potential of about +1.2 volts is applied to buried well terminal 276*a,* and about 0.0 volts is applied to substrate terminal 278. In the rest of array 1580, about 0.0 volts is applied to unselected WL terminals (including WL terminals 270*b* and 270*n*), about 0.0 volts (or possibly a slightly higher positive voltage) is applied to unselected BL terminals 274 (including BL terminal 274*b* and 274*p*), about 0.0 volts is applied to unselected SL terminals 272 (including SL terminal 272*b* and 272*n*), about 0.0 volts is applied to unselected CG terminals 280 (including CG terminal 280*b* and 280*n*), and about +1.2 volts is applied to unselected BW terminals 276 (including BW terminal 276*b* and 276*n*). Persons of ordinary skill in the art will appreciate that the voltage levels in FIG. 221 are illustrative only and that different embodiments will have different voltage levels as a matter of design choice.

A write logic-1 operation may be performed on memory cell 1550 through impact ionization as described, for example, with reference to Lin cited above, or through a band-to-band tunneling mechanism (also known as Gate Induced Drain Leakage or GIDL), as described, for example with reference to Yoshida cited above. An example of a write logic-1 operation using the GIDL method is described in conjunction with FIG. 222A while an example of a write logic-1 operation using the impact ionization method is described in conjunction with FIG. 222B.

In FIG. 222A, an example of the bias conditions of the array 1580 including selected representative memory cell 1550*a* during a band-to-band tunneling write logic-1 operation is shown. The negative bias applied to the WL terminal 270*a* and the positive bias applied to the BL terminal 274*a* results in hole injection to the floating body 224 of the selected representative memory cell 1550*a*. The SL terminal 272*a*, the CG terminal 280*a*, and the substrate terminal 278 are grounded during the write logic-1 operation while a positive bias is applied to the BW terminal 276*a* to maintain holding operation to the unselected cells.

The negative voltage on WL terminal 270*a* couples the voltage potential of the floating body region 224 in representative memory cell 1550*a* downward. This combined with the positive voltage on BL terminal 274*a* creates a strong electric field between the bit line region 216 and the floating body region 224 in the proximity of select gate 264 (hence the "gate induced" portion of GIDL) in selected representative memory cell 1550*a*. This bends the energy bands sharply upward near the gate and drain junction overlap region, causing electrons to tunnel from the valence band to the conduction band, leaving holes in the valence band. The electrons which tunnel across the energy band become the drain leakage current (hence the "drain leakage" portion of GIDL), while the holes are injected into floating body region 224 and become the hole charge that creates the logic-1 state. This process is well known in the art and is illustrated in Yoshida (specifically FIGS. 2 and 6 on page 3 and FIG. 9 on page 4) cited above.

In one particular non-limiting embodiment, about −1.2 volts is applied to word line terminal 270*a*, about +1.2 volts is applied to bit line terminal 274*a*, about 0.0 volts is applied to source line terminal 272*a* and control gate terminal 280*a*, about 0.0 volts or +1.2 volts is applied to BW terminal 276*a*, and about 0.0 volts is applied to substrate terminal 278. These voltage levels are exemplary only may vary from embodiment to embodiment as a matter of design choice. Thus the exemplary embodiments, features, bias levels, etc., described are not limiting in any way.

FIG. 222B shows a write logic-1 operation using the impact ionization method. In this case, both the select gate 264 and bit line 216 of the memory cell 1550 to be written are biased at a positive voltage. This causes impact ionization current to flow charging the floating body 224 to the logic-1 state regardless of the data originally stored in the cell.

In the exemplary embodiment shown in FIG. 222B, the selected word line terminal 270*a* is biased at about +1.2V while the unselected word line terminals 270*b* through 270*n* are biased at about 0.0V, the selected bit line terminal 274*a* is also biased at about +1.2V while the unselected bit line terminals 274*b* through 274*p* are biased at about 0.0V, the selected source line 272*a* is biased at about 0.0V, while the unselected source line terminals 272*b* through 272*n* are biased at about 0.0V, all of the control gate terminals 280 are biased at 0.0V, the buried well terminals 276 are biased at about 0.0V or +1.2V (to maintain the states of the unselected cells), and the substrate terminal 278 is biased at about 0.0V. These voltage bias levels are exemplary only and will vary from embodiment to embodiment and are thus in no way limiting.

An embodiment of a shadowing operation performed on cell 1550 is illustrated in FIG. 223A: a positive voltage is applied to the SL terminal 272*a*, a positive voltage is applied to the WL terminal 270*a*, zero voltage is applied to the BL terminal 274*a*, a positive voltage is applied to the CG terminal 280*a*, zero or positive voltage is applied to the BW terminal 276*a*, and zero voltage is applied to the substrate terminal 278.

In one particular non-limiting embodiment, about +6.0 volts is applied to the source line terminal 272, about +1.2 volts is applied to word line terminal 270, about 0.0 volts is applied to bit line terminal 274, about +6.0 volts is applied to control gate terminal 280, about 0.0 volts or +1.2 volts is applied to BW terminal 276, and about 0.0 volts is applied to substrate terminal 278. These voltage levels are exemplary only may vary from embodiment to embodiment as a matter of design choice. Thus the exemplary embodiments, features, bias levels, etc., described are not limiting in any way.

When floating body 224 has a positive charge/voltage, the MOS device 220*a* is turned on. The surface potential under the MOS device 220*a* will be equal to the smaller of the voltage applied to the BL terminal 274 or the difference between the gate voltage applied to the WL terminal 270 and the threshold voltage of the MOS device 220*a*. The positive voltage applied to the control gate 240 (through the CG terminal 280) will be capacitively coupled to the floating gate 260. As a result, the surface potential under the MOS device 220*b* will increase and depending on the positive charge stored in the floating gate 260, will be close to the potential applied to the source line region 218. Consequently, a strong lateral electric field will be developed around the gap region 268. This lateral electric field will energize/accelerate electrons traveling from the bit line region 216 to the source line region 218 (both the MOS devices 220*a* and 220*b* are turned on) to a sufficient extent that they can "jump over" the oxide barrier between floating body 224 and floating gate 260. A large vertical field—resulting from the potential difference between floating gate 260, which partly is due to the coupling from the control gate 240 and the source line region 218, and the surface 214—also exists. As a result, electrons enter floating gate 260. Accordingly, floating gate 260 becomes negatively charged by the shadowing process, when the volatile memory of cell 1550 is in logic-1 state (i.e., floating body 224 is positively charged).

When floating body 224 is neutral, the threshold voltage of the MOS device 220*a* is higher (compared to when the floating body 224 is positively charged) and the MOS device 220*a* is turned off. Therefore, no electrons flow through the cell 1550. Accordingly, floating gate 260 retains its positive charge at the end of the shadowing process, when the volatile memory of cell 1550 is in logic-0 state (i.e., floating body 224 is neutral).

Upon the completion of the shadowing operation, the charge state of the floating gate 260 is complementary to that of the floating body 224. Thus, if the floating body 224 of the memory cell 1550 has a positive charge in volatile memory, the floating gate 260 will become negatively charged by the shadowing process, whereas if the floating body 224 of the memory cell 1550 has a negative or neutral charge in volatile memory, the floating gate layer 260 will be positively charged at the end of the shadowing operation. The charges/states of the floating gates 260 are determined non-algorithmically by the states of the floating bodies, and shadowing of multiple cells occurs in parallel, therefore the shadowing process is very fast.

Another embodiment of a shadowing operation performed on cell 1550 is illustrated in FIG. 223B: a positive voltage is applied to the CG terminals 280, a positive voltage is applied to the WL terminals 270, zero voltage is applied to the BL terminals 274, zero or positive voltage is applied to the BW terminals 276, zero voltage is applied to the substrate terminal 278, while the SL terminals 272 are left floating.

In one particular non-limiting embodiment, about +12.0 volts is applied to the control gate terminal 280, about +1.2 volts is applied to word line terminal 270, about 0.0 volts is applied to bit line terminal 274, about 0.0 volts or +1.2 volts is applied to BW terminal 276, about 0.0 volts is applied to substrate terminal 278, and the source line terminal 272 is left floating. These voltage levels are exemplary only may vary from embodiment to embodiment as a matter of design choice. Thus the exemplary embodiments, features, bias levels, etc., described are not limiting in any way.

When floating body 224 has a positive charge/voltage, the MOS device 220*a* is turned on and will pass the zero voltage applied to the BL terminal 274. If the bias applied to the control gate 240 is large enough, a fringing electric field—for example as described in "A 64-Cell NAND Flash Memory with Asymmetric S/D Structure for Sub-40 nm Technology and Beyond", K-T. Park et al., pp. 19-20, Digest of Technical Papers, 2006 Symposium on VLSI Technology, 2006 (which is hereby incorporated herein, in its entirety, by reference thereto, and which henceforth is referred to as "Park")—will create an inversion region in the gap region 268. As a result, the zero voltage applied to the BL terminal 274 will also be passed to the channel region of the MOS device 220*b* underneath the floating gate 260. Due to the coupling from the control gate 240 to the floating gate 260, this results in a strong vertical electric field between the floating gate 260 and the channel region underneath it. The strong vertical electric field will induce electron tunneling from the channel region to the floating gate 260. Accordingly, floating gate 260 becomes negatively charged by the shadowing process, when the volatile memory of cell 1550 is in logic-1 state (i.e., floating body 224 is positively charged).

When floating body 224 is neutral, the threshold voltage of the MOS device 220*a* is higher (compared to when the floating body 224 is positively charged) and the MOS device 220*a* is turned off. As a result, the channel region underneath the floating gate 260 will be floating. The positive voltage applied to the control gate 240 will in turn increase the channel potential underneath the floating gate 260, and consequently the electric field build-up is not sufficient to result in electron tunneling to the floating gate 260. Accordingly, floating gate 260 retains its positive charge at the end of the shadowing process, when the volatile memory of cell 1550 is in logic-0 state (i.e., floating body 224 is neutral).

Upon the completion of the shadowing operation, the charge state of the floating gate 260 is complementary to that of the floating body 224. Thus, if the floating body 224 of the memory cell 1550 has a positive charge in volatile memory, the floating gate 260 will become negatively charged by the shadowing process, whereas if the floating body 224 of the memory cell 1550 has a negative or neutral charge in volatile memory, the floating gate layer 260 will be positively charged at the end of the shadowing operation. The charges/states of the floating gates 260 are determined non-algorithmically by the states of the floating bodies, and shadowing of multiple cells occurs in parallel, therefore the shadowing process is very fast.

FIG. 224 illustrates a restore operation carried out when power is restored to cell 1550. The restore operation restores the state of the cell 1550 from the floating gate 260 into floating body region 224. Prior to the restore process, the floating bodies 224 are set to neutral state, which is the state of the floating bodies when power is removed from the memory device 1580. To perform the restore process, the following bias conditions are applied: a positive voltage is applied to the SL terminals 272, zero voltage is applied to the WL terminals 270, CG terminals 280, and BL terminals 274, zero or positive voltage is applied to the BW terminals 276, and zero voltage is applied to the substrate terminal 278.

In one particular non-limiting embodiment, about +1.2 volts is applied to the source line terminals 272, about 0.0 volts is applied to the word line terminals 270, control gate terminals 280, and bit line terminals 274, about 0.0 volts or +1.2 volts is applied to BW terminals 276, and about 0.0 volts is applied to substrate terminal 278. These voltage levels are exemplary only may vary from embodiment to embodiment as a matter of design choice. For example, a positive voltage can be applied to bit line terminal 274 or a negative voltage can be applied to word line 270 to ensure that no current flows through the channel region of cell 1550 during restore operation. Thus the exemplary embodiments, features, bias levels, etc., described are not limiting.

When floating gate 260 is negatively charged, the negative charge on the floating gate 260 and the positive voltage on SL terminal 272 create a strong electric field between the source line region 218 and the floating body region 224 in the proximity of floating gate 260. This bends the energy band sharply upward near the gate and source line junction overlap region, causing electrons to tunnel from the valence band to the conduction band, leaving holes in the valence band. The electrons which tunnel across the energy band become the drain leakage current, while the holes are injected into floating body region 224 and become the hole charge that creates the logic-1 state. This process is well known in the art as band-to-band tunneling or gate induced drain leakage (GIDL) mechanism and is illustrated in for example in Yoshida (specifically FIGS. 2 and 6 on page 3 and FIG. 9 on page 4) cited above. The BL terminal 274 is grounded or a positive voltage is applied thereto to prevent current to flow through the channel region of cell 1550.

When floating gate 260 is positively charged, the positive charge on the floating gate 260 and the source line region 218 do not result in strong electric field to drive hole injection into the floating body 224. Consequently, the floating body 224 will remain in neutral state.

It can be seen that if floating gate 260 has a positive charge after shadowing is performed, the volatile memory of floating body 224 will be restored to have a neutral charge (logic-0 state), but if the floating gate 260 has a negative charge, the volatile memory of floating body 224 will be restored to have a positive charge (logic-1 state), thereby restoring the original state of the floating body 224 prior to the shadowing operation. Note that this process occurs non-algorithmically, as the state of the floating gate 260 does not have to be read, interpreted, or otherwise measured to determine what state to restore the floating body 224 to. Rather, the restoration process occurs automatically, driven by electrical potential differences. Accordingly, this process is orders of magnitude faster than one that requires algorithmic intervention.

After restoring the memory cell(s) 1550, the floating gate(s) 260 is/are reset to a predetermined state, e.g., a positive state as illustrated in FIGS. 225A and 225B, so that each floating gate 260 has a known state prior to performing another shadowing operation. The reset process operates by the mechanism of band-to-band tunneling hole injection to the floating gate(s) 260, as illustrated in FIG. 225A, or by electron tunneling from the floating gate(s) 260 as illustrated in FIG. 225B.

The reset mechanism illustrated in FIG. 225A follows a similar mechanism as the restore process. A negatively charged floating gate 260 will result in an electric field generating hot holes. The majority of the resulting hot holes are injected into the floating body 224 and a smaller portion will be injected into the floating gate 260. A higher potential can be applied to the SL terminal 272 to increase the speed of the reset operation if desired. The hole injection will only occur in cells 1550 with negatively charged floating gate 260. As a result, all floating gates 260 will be initialized to have a positive charge by the end of the reset process.

In one particular non-limiting embodiment, about +3.0 volts is applied to the source line terminal 272, about 0.0 volts is applied to word line terminal 270, control gate terminal 280, and bit line terminal 274, about 0.0 volts or +1.2 volts is applied to BW terminal 276, and about 0.0 volts is applied to substrate terminal 278. These voltage levels are exemplary only may vary from embodiment to embodiment as a matter of design choice. Thus the exemplary embodiments, features, bias levels, etc., described are not limiting in any way. The bias condition is similar to that of the restore operation. However, because the amount of holes injected into the floating gate 260 is smaller than the amount injected into the floating body 224, the reset operation proceeds more slowly than the restore operation. A negative voltage can also be applied to the buried well terminal 276 to ensure that no holes are accumulated in memory cells 1550 with positively charged floating gate 260, while a positive voltage can also be applied to the bit line terminal 274 to prevent current to flow through the channel region of cell 1550.

FIG. 225B illustrates a reset operation by means of electron tunneling from the floating gate 260 to the select gate 264. A positive voltage is applied to the WL terminal 270, a negative voltage is applied to the CG terminal 280, while zero voltage is applied to the BL terminal 274, SL terminal 272 is left floating, zero voltage or a positive voltage may be applied to the BW terminal 276, and zero voltage is applied to the substrate terminal 278. The positive voltage applied to the select gate 264 (through the WL terminal 270) and the negative voltage applied to the control gate 240 (through the CG terminal 280) will result in high electric field across the select gate 264 and the floating gate 260, resulting in electron tunneling from the floating gate(s) 260 to the select gate(s) 264.

In one particular non-limiting embodiment, about +1.2 volts is applied to the WL terminal 270, about −12.0 volts is applied to the CG terminal 280, about 0.0 volts is applied to the BL terminal 274, SL terminal 272 is left floating, about 0.0 volts or +1.2 volts is applied to the BW terminal 276, and about 0.0 volts is applied to the substrate terminal 278. These voltage levels are exemplary only may vary from embodiment to embodiment as a matter of design choice. For example, the BL terminal 274 may also be left floating. Thus the exemplary embodiments, features, bias levels, etc., described are not limiting in any way.

An alternative embodiment of the memory device 1550, operation 200 is illustrated in FIG. 226. The control gate 240 of the cell 1550 can be used to "shield" the charge stored in the floating gate 260. As a result, the volatile operation 104 can be performed without first resetting the state of the floating gate 260. During power shutdown, a reset operation 110 is first performed, followed by the shadowing operation to transfer the state of the floating body 224 to the floating gate 260. Upon restoring power at event 108, the content of the nonvolatile memory is "restored" to the volatile memory, and the memory device can immediately be placed into the volatile memory operation 104. This reduces the "start-up" time of the memory device 1550, i.e. the time between power up and when the memory device 1550 is available for volatile memory operation, by moving the reset operation 110 to the power shutdown operation.

To "shield" the charge stored in the floating gate 260, a positive bias is applied to the control gate 240 (through the CG terminal 280) during volatile mode operations, for example during the volatile read operation and write logic-1 operation using the impact ionization mechanism.

FIG. 227 illustrates an example of bias conditions for an alternative read operation performed on selected memory cell 1550*a*. The read operation may be performed by applying the following bias conditions: a positive voltage is applied to the selected WL terminal 270*a*, a positive voltage is applied to the selected BL terminal 274*a*, a positive voltage is applied to CG terminal 280*a*, zero voltage is applied to the SL terminals 272, a positive voltage is applied to the BW terminals 276, and zero voltage is applied to the substrate terminal 278.

In one exemplary embodiment, about +1.2 volts is applied to the selected WL terminal 270*a*, about 0.0 volts is applied to the selected SL terminal 272*a*, about +0.4 volts is applied to the selected bit line terminal 274*a*, about +5.0 volts is applied to the selected CG terminal 280*a*, about +1.2 volts is applied to the selected buried well terminal 276, and about 0.0 volts is applied to substrate terminal 278. All unselected word line terminals 270*b* through 270*n* have 0.0 volts applied, bit line terminals 274*b* through 274*p* have 0.0 volts applied, the unselected SL terminals 272*b* through 272*p* have 0.0 volts applied, the unselected CG terminals 280*b* through 280*n* have 0.0 volts applied, while the unselected BW terminals 276*b* through 276*n* can be grounded or have +1.2 volts applied to maintain the states of the unselected cells 1550, and 0.0 volts is applied to the substrate terminal 278. Persons of ordinary skill in the art will appreciate that other embodiments of the invention may employ other combinations of applied bias voltages as a matter of design choice. Such skilled persons will also realize that the first and second conductivity types may be reversed and the relative bias voltages may be inverted in other embodiments.

The positive voltage applied on the selected CG terminal 280 will create an inversion region underneath the floating gate 260, regardless of the charge stored in the floating gate 260. As a result, the MOS device 220*b* will be on, and the memory cell 1550 conductance will be determined by the MOS device 220*a*. The threshold voltage of the MOS device 220*a* will in turn be modulated by the charge stored in the floating body 224. A positively charged floating body 224 will result in a lower threshold voltage of the MOS device 220*a* compared to if the floating body is neutral.

FIG. 228 shows an alternative write logic-1 operation using the impact ionization method. In this case, a positive bias is applied to the control gate 240 (through the CG terminal 280). This causes impact ionization current to flow charging the floating body 224 to the logic-1 state regardless of the stored in the floating gate 260.

In the exemplary embodiment shown in FIG. 228, the selected word line terminal 270*a* is biased at about +1.2V while the unselected word line terminals 270*b* through 270*n* are biased at about 0.0V, the selected bit line terminal 274*a* is also biased at about +1.2V while the unselected bit line terminals 274*b* through 274*p* are biased at about 0.0V, the selected source line 272*a* and unselected source lines 272*b* through 272*n* are each biased at about 0.0V, the control gate terminals 280*a* is biased at +5.0V while the unselected control gate terminals 280*b* through 280*n* are biased at about 0.0V, the buried well terminals 276 are biased at about 0.0V or +1.2V (to maintain the states of the unselected cells), and the substrate terminal 278 is biased at about 0.0V. These voltage bias levels are exemplary only and may vary from embodiment to embodiment and are thus not limiting.

Other volatile mode operations performed on memory cell 1550 are relatively independent of the charge stored on floating gate 260. For example, the write logic-0 operations largely depends on the potential difference between the floating body 224 and the bit line region 216 (or the source line region 218). In these operations, the control gate may be grounded, or a positive bias may also be applied similar to the read and write logic-1 operations described in FIGS. 227 and 228, respectively.

In another embodiment of memory cell 1550, alternative non-volatile storage material can be used. The descriptions above use floating gate polysilicon as the non-volatile storage material. Charge trapping material, for example made of silicon nanocrystal or silicon nitride, may also be used as non-volatile storage material. Whether a floating gate 260 or a trapping layer 260 is used, the function is the same, in that they hold data in the absence of power and the mode of operations described above may be performed. The primary difference between the floating gate 260 and the trapping layer 260 is that the floating gate 260 is a conductor, while the trapping layer 260 is an insulator layer.

The memory cells 1350, 1450, and 1550 described above can also be fabricated on a silicon-on-insulator (SOI) substrate. FIGS. 229A through 229C illustrate memory cells 1350S, 1450S, and 1550S, in which the floating bodies are bounded at the bottom by an insulator region 22S, 122S, and 222S, respectively.

FIG. 229A illustrates a schematic cross-sectional view of memory cell 1350S. Memory cell 1350S includes a silicon-on-insulator (SOI) substrate 12 of a first conductivity type such as p-type, for example. Substrate 12 is typically made of silicon, but may also comprise, for example, germanium, silicon germanium, gallium arsenide, carbon nanotubes, or other semiconductor materials. Substrate 12 consists of a buried insulator 22S, such as buried oxide (BOX).

A floating body region 24 of the first conductivity type, such as p-type, for example, is bounded on top by bit line region 16, source line region 18, and insulating layer 62, and on the bottom by buried insulator 22S.

A bit line region 16 having a second conductivity type, such as n-type, for example, is provided in floating body region 24 and is exposed at surface 14. Bit line region 16 may be formed by an implantation process formed on the material making up substrate 12, according to any implantation process known and typically used in the art. Alternatively, a solid state diffusion process could be used to form bit line region 16.

A source line region 18 having a second conductivity type, such as n-type, for example, is also provided in floating body region 24 and is exposed at surface 14. Source line region 18 may be formed by an implantation process formed on the material making up substrate 12, according to any implantation process known and typically used in the art. Alternatively, a solid state diffusion process could be used to form bit line region 18.

A fully-depleted SOI substrate, such as shown in FIG. 229A, eliminates the need of an insulator layer to insulate cell 1350S from neighboring cells 1350S when multiple cells 1350S are joined in an array to make a memory device. The bit line region 16 and the source line region 18 are shared with neighboring cells 1350S. In a partially-depleted SOI surface (not shown), an insulator, such as shallow trench isolation (STI), may be used to insulate cell 1350S from neighboring cells 1350S.

The operation of the memory cell 1350S is similar to that of the memory cell 1350. However, due to the absence of the buried well region in cell 1350S, a holding operation (performed by applying a positive bias on the buried well terminal on cell 1350) cannot be performed on cell 1350S. A periodic refresh operation, to refresh the state of the cell 1350S, can be performed by applying a positive bias on the source line region 18, such as described in "Autonomous Refresh of Floating Body Cell (FBC)", T. Ohsawa et al., pp. 1-4, IEEE International Electron Devices Meeting 2008 ("Ohsawa-2"), which is hereby incorporated herein, in its entirety, by reference thereto.

FIGS. 229B and 229C illustrate cell 1450S and 1550S fabricated on a silicon-on-insulator substrate, where buried insulator 122S/222S, such as for example buried oxide (BOX), bound the floating body substrate 124/224 at the bottom. Most of the descriptions regarding cells 1450/1550 also apply to the cells 1450S/1550S. Similarly, due to the absence of the buried well region in cells 1450S/1550S, a holding operation (performed by applying a positive bias on the buried well terminal on cell 1450/1550) cannot be performed on cell 1450S/1550S. A periodic refresh operation, to refresh the state of the cell 1450S/1550S, can be performed by applying a positive bias on the source line region 118/218.

Figure 230A:
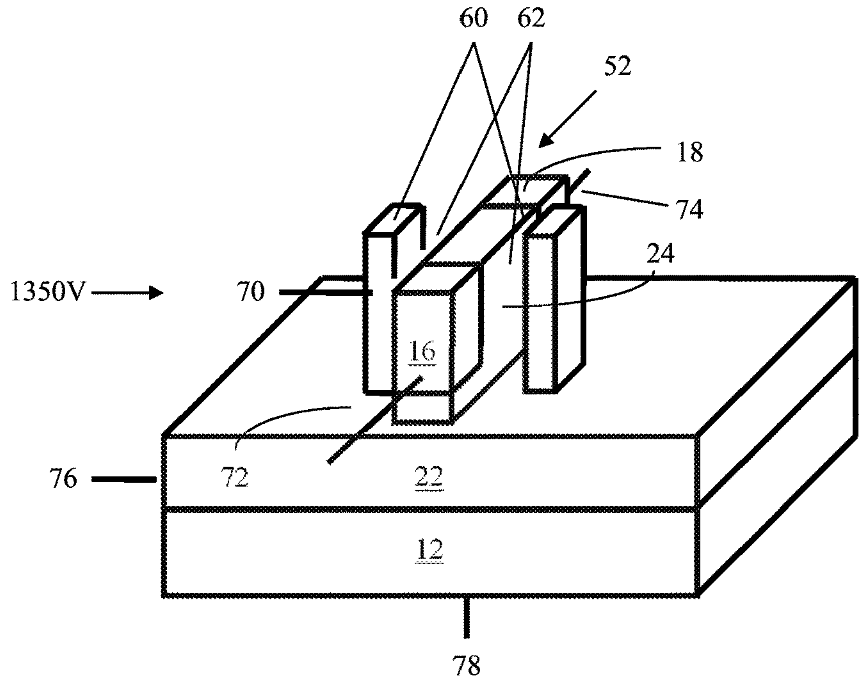
Figure 230B:
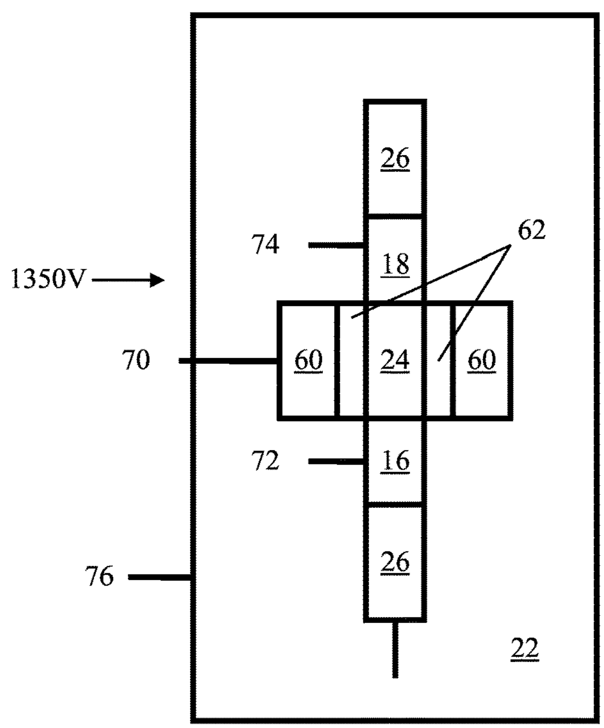
Figure 230C:
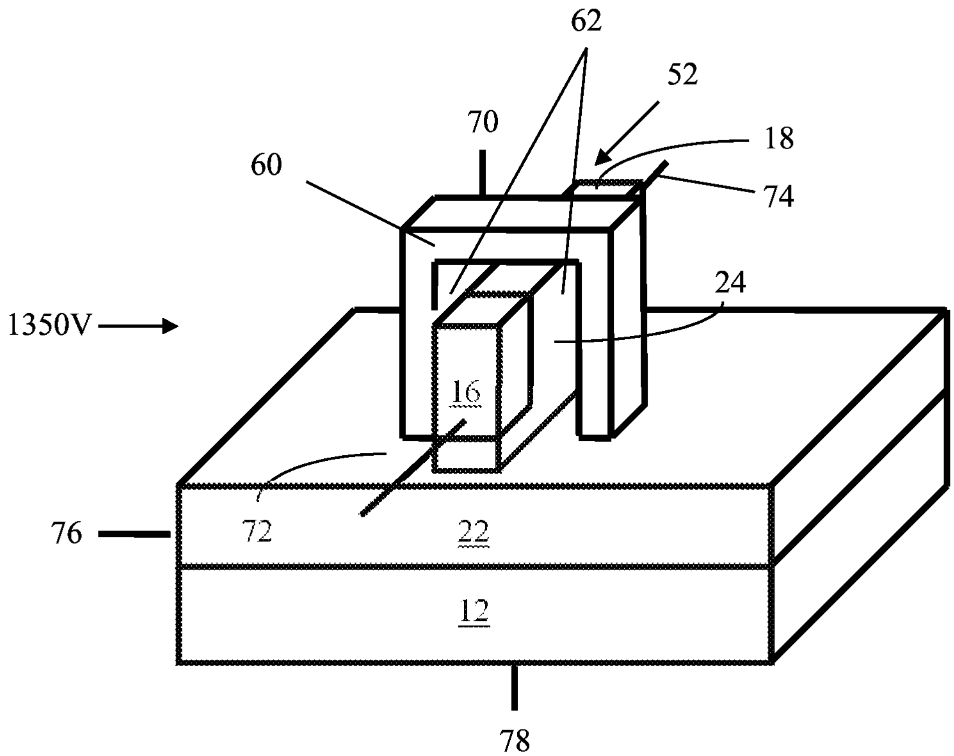

Memory cells 1350, 1450, and 1550 may also comprise a fin structure as shown in FIGS. 230A through 230C. Similarly, memory cells 1350S, 1450S and 1550S may also alternatively comprise a fin structure.

FIG. 230A illustrates a schematic cross-sectional view of memory cell 1350V. Memory cell 1350V has a fin structure 52 fabricated on substrate 12, so as to extend from the surface of the substrate to form a three-dimensional structure, with fin 52 extending substantially perpendicular to and above the top surface of the substrate 12. Fin structure 52 is conductive and is built on buried well layer 22 which is itself built on top of substrate 12. Alternatively, buried well 22 could be a diffusion inside substrate 12 with the rest of the fin 52 constructed above it, or buried well 22 could be a conductive layer on top of substrate 12 connected to all the other fin 52 structures in a manner similar to memory cell 1350 described above. Fin 52 is typically made of silicon, but may comprise germanium, silicon germanium, gallium arsenide, carbon nanotubes, or other semiconductor materials known in the art.

Buried well layer 22 may be formed by an ion implantation process on the material of substrate 12. Alternatively, buried well layer 22 may be grown epitaxially above substrate 22. Buried well layer 22, which has a second conductivity type (such as n-type conductivity type), insulates the floating body region 24, which has a first conductivity type (such as p-type conductivity type), from the bulk substrate 12 also of the first conductivity type. Fin structure 52 includes bit line region 16 and source line region 18 having a second conductivity type (such as n-type conductivity type). Similar to memory cell 1350, cell 1350V is also asymmetric, for example by having a higher capacitive coupling from the source line region 18 to the floating gates 60. Memory cell 1350V further includes floating gates 60 on two opposite sides of the floating substrate region 24 insulated from floating body 24 by insulating layers 62. Floating gates 60 are positioned between the bit line region 16 and the source line region 18, adjacent to the floating body 24.

Thus, the floating body region 24 is bounded by the top surface of the fin 52, the facing side and bottom of bit line region 16 and source line region 18, top of the buried well layer 22, and insulating layers 26 (as shown in the schematic top-view of cell 1350V in FIG. 230B) and 62. Insulating layers 26 insulate cell 1350V from neighboring cells 1350V when multiple cells 1350V are joined to make a memory array.

As shown in FIG. 230C, an alternate fin structure 1350V can be constructed. In this embodiment, floating gates 60 and insulating layers 62 can enclose three sides of the floating substrate region 24. The presence of the floating gate 60 on three sides allows better control of the charge in floating body region 24.

Memory cell 1350V can be used to replace memory cell 1350 in an array similar to array 1380 having similar connectivity between the cells and the array control signal terminals. In such a case, the hold, read and write operations are similar to those in the lateral device embodiments described earlier for memory cell 1350 in array 1380. As with the other embodiments, the first and second conductivity types can be reversed as a matter of design choice. As with the other embodiments, many other variations and combinations of elements are possible, and the examples described in no way limit the present invention. In addition, memory cell 1350V may also be fabricated on a silicon-on-insulator (SOI) substrate.

Figure 230D:
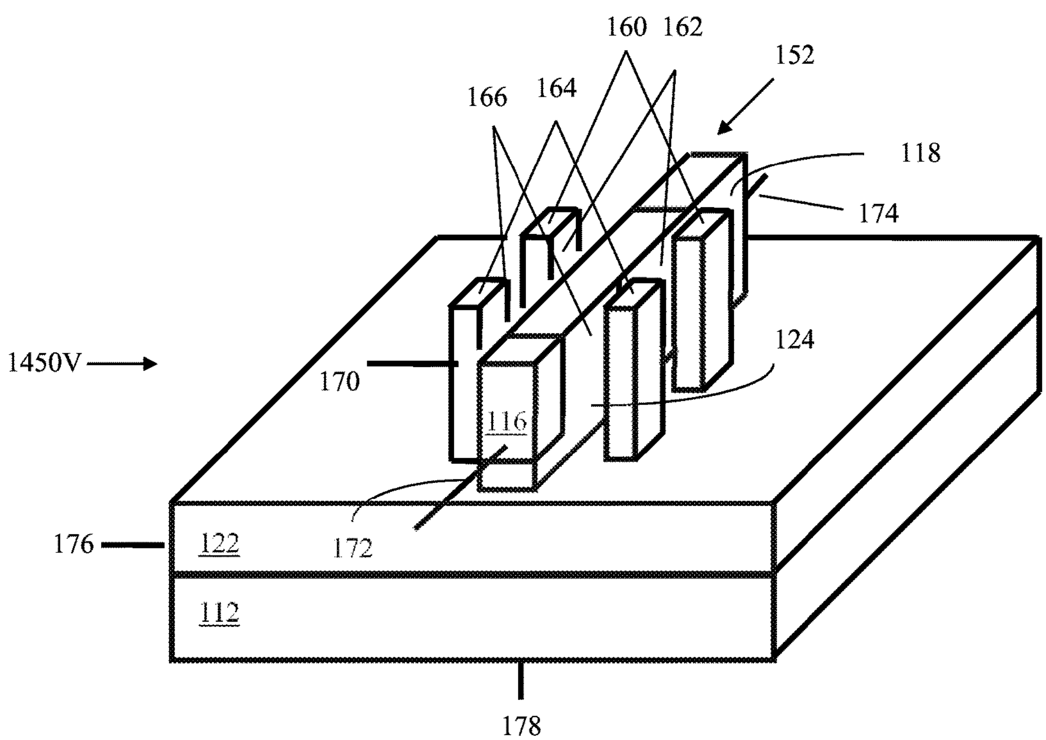
Figure 230E:
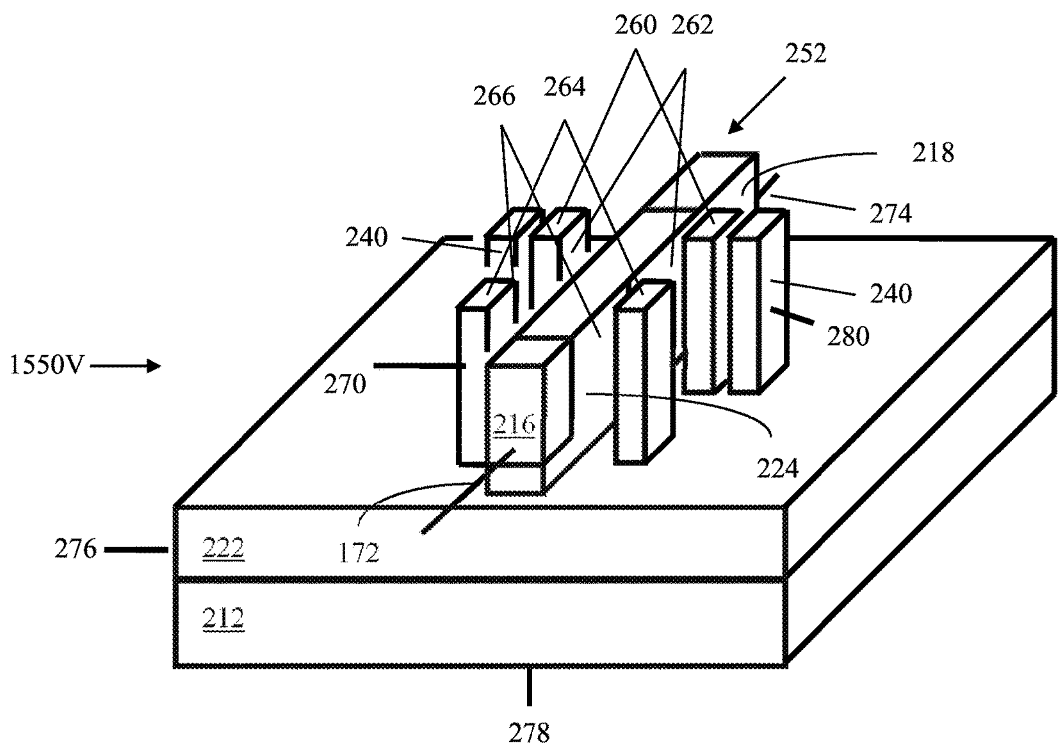

FIGS. 230D and 230E illustrate cell 1450V and 1550V comprising fins 152/252. Most of the descriptions regarding cells 1450/1550 also apply to the cells 1450V/1550V. Reference numbers previously referred to in earlier drawing figures have the same, similar, or analogous functions as in the earlier described embodiments. The select gates, floating gates, and control gates on cells 1450V/1550V may also enclose all sides of the floating substrate regions 124/224. In addition, memory cells 1450V/1550V may also be fabricated on silicon-on-insulator (SOI) substrates.

A novel semiconductor memory having both volatile and non-volatile functionality is achieved. Many embodiments of the present invention have been described. Persons of ordinary skill in the art will appreciate that these embodiments are exemplary only to illustrate the principles of the present invention. Many other embodiments will suggest themselves to such skilled persons after reading this specification in conjunction with the attached drawing figures. For example:

The first and second conductivity types may be reversed and the applied voltage polarities inverted while staying within the scope of the present invention.

While many different exemplary voltage levels were given for various operations and embodiments, these may vary from embodiment to embodiment as a matter of design choice while staying within the scope of the present invention.

The invention may be manufactured using any process technology at any process geometry or technology node and be within the scope of the invention. Further, it should be understood that the drawing figures are not drawn to scale for ease of understanding and clarity of presentation, and any combination of layer composition, thickness, doping level, materials, etc. may be used within the scope of the invention.

While exemplary embodiments typically showed a single memory array for the purpose of simplicity in explaining the operation of the various memory cells presented herein, a memory device employing the memory cells of the presentation may vary in many particulars in terms of architecture and organization as a matter of design choice while staying within the scope of the invention. Such embodiments may, without limitation, include features such as multiple memory arrays, segmentation of the various control lines with or without multiple levels of decoding, simultaneously performing multiple operations in multiple memory arrays or in the same arrays, employing many different voltage or current sensing circuits to perform read operations, using a variety of decoding schemes, using more than one type of memory cell, employing any sort of interface to communicate with other circuitry, and/or employing many different analog circuits known in the art to generate voltage or currents for use in performing the various operations on the memory array or arrays. Such analog circuits may without limitation be, for example, digital-to-analog converters (DACs), analog-to-digital converters (ADCs), operational amplifiers (Op Amps), comparators, voltage reference circuits, current mirrors, analog buffers, etc.

Thus the invention should not be limited in any way except by the appended claims.

That which is claimed is:

1. A semiconductor memory array comprising a plurality of semiconductor memory cells arranged in a plurality of rows and a plurality of columns, each said semiconductor memory cell comprising:

a substrate;

a floating body region exposed at a surface of said substrate and configured to store volatile memory;

a buried layer buried in a bottom portion of said substrate;

wherein applying a bias to said buried layer results in at least two stable floating body region charge levels;

a single polysilicon floating gate configured to store nonvolatile data;

an insulating region insulating said floating body region from said single polysilicon floating gate; and first and second regions exposed at said surface at locations other than where said floating body region is exposed;

wherein said floating gate is configured to receive transfer of data stored by the volatile memory; and wherein said buried layer is commonly connected to at least two of said memory cells.

2. The semiconductor memory array of claim 1, wherein said first and second regions are asymmetric, wherein a first area defines an area over which said first region is exposed at said surface and a second area defines an area over which said second region is exposed at said surface, and wherein said first area is unequal to said second area.

3. The semiconductor memory array of claim 1, wherein one of said first and second regions at the surface has a higher coupling to said floating gate relative to a coupling of the other of said first and second regions to said floating gate.

4. The semiconductor memory array of claim 1, wherein said buried layer has a conductivity type that is different from a conductivity type of said floating body region.

5. The semiconductor memory array of claim 1, wherein said floating body is bounded by said surface, said first and second regions and said buried layer.

6. The semiconductor memory array of claim 1, further comprising insulating layers bounding side surfaces of said substrate.

7. The semiconductor memory array of claim 1, wherein said floating gate overlies an area of said floating body exposed at said surface, and wherein a gap is located between said area overlaid and one of said first and second regions.

8. The semiconductor memory array of claim 1, further comprising a select gate positioned adjacent to said single polysilicon floating gate.

9. The semiconductor memory array of claim 3, wherein said first and second regions are asymmetric, wherein a first area defines an area over which said first region is exposed at said surface and a second area defines an area over which said second region is exposed at said surface, and wherein said first area is unequal to said second area.

10. The semiconductor memory array of claim 8, wherein said select gate overlaps said floating gate.

11. A semiconductor memory array comprising a plurality of semiconductor memory cells arranged in a plurality of rows and a plurality of columns, each said semiconductor memory cell comprising:

a substrate;

a floating body region for storing data as volatile memory, said floating body region having a first conductivity type;

a buried layer buried in a bottom portion of said substrate;

wherein applying a bias to said buried layer results in at least two stable floating body region charge levels; and a single polysilicon floating gate for storing data as non-volatile memory;

wherein said floating body region stores the data stored as volatile memory independently of said data stored as non-volatile memory, and said single polysilicon floating gate stores said data stored as non-volatile memory independently of said data stored as volatile memory; and wherein said buried layer is commonly connected to at least two of said memory cells.

12. The semiconductor memory array of claim 11, wherein said buried layer comprises a second conductivity type different from said first conductivity type.

13. The semiconductor memory array of claim 12, wherein said first conductivity type is "p" type and said second conductivity type is "n" type.

14. The semiconductor memory array of claim 11, further comprising insulating layers bounding side surfaces of said substrate.

15. The semiconductor memory array of claim 11, wherein operations can be performed on said data stored as volatile memory regardless of a state of said data stored as non-volatile memory.

16. The semiconductor memory array of claim 15, wherein said operations include read, write, hold, reset and shadow.

17. The semiconductor memory array of claim 11, wherein operations can be performed on said data stored as non-volatile memory regardless of a state of said data stored as volatile memory.

* * * * *